US012120949B2

(12) United States Patent
Han et al.

(10) Patent No.: US 12,120,949 B2
(45) Date of Patent: Oct. 15, 2024

(54) ORGANIC LIGHT EMITTING DIODE

(71) Applicant: LG CHEM, LTD., Seoul (KR)

(72) Inventors: Miyeon Han, Daejeon (KR); Sung Kil Hong, Daejeon (KR); Jungoh Huh, Daejeon (KR); Dong Uk Heo, Daejeon (KR); Jae Tak Lee, Daejeon (KR); Junghoon Yang, Daejeon (KR)

(73) Assignee: LG Chem, Ltd., Seoul (KR)

( * ) Notice: Subject to any disclaimer, the term of this patent is extended or adjusted under 35 U.S.C. 154(b) by 833 days.

(21) Appl. No.: 17/269,331

(22) PCT Filed: Nov. 27, 2019

(86) PCT No.: PCT/KR2019/016440
§ 371 (c)(1),
(2) Date: Feb. 18, 2021

(87) PCT Pub. No.: WO2020/111762
PCT Pub. Date: Jun. 4, 2020

(65) Prior Publication Data

US 2021/0288260 A1 Sep. 16, 2021

(30) Foreign Application Priority Data

Nov. 27, 2018 (KR) ........................ 10-2018-0148350

(51) Int. Cl.
*H10K 85/60* (2023.01)
*H10K 50/11* (2023.01)
(Continued)

(52) U.S. Cl.
CPC ........... *H10K 85/626* (2023.02); *H10K 85/40* (2023.02); *H10K 85/615* (2023.02);
(Continued)

(58) Field of Classification Search
None
See application file for complete search history.

(56) References Cited

U.S. PATENT DOCUMENTS

| | | | |
|---|---|---|---|
| 11,239,425 B2 * | 2/2022 | Suh | H10K 99/00 |
| 2004/0251816 A1 | 12/2004 | Leo et al. | |

(Continued)

FOREIGN PATENT DOCUMENTS

| | | |
|---|---|---|
| EP | 3524660 A1 | 8/2019 |
| KR | 20090086015 A | 8/2009 |

(Continued)

OTHER PUBLICATIONS

Sakanoue, K. et al., "A Molecular Orbital Study on the Hole Transport Property of Organic Amine Compounds," J. Phys. Chem. A 103:5551-5556 (1999).

*Primary Examiner* — Alexander G Ghyka
(74) *Attorney, Agent, or Firm* — Bryan Cave Leighton Paisner LLP

(57) ABSTRACT

Provided is an organic light emitting device including a first organic material layer that comprises a compound of Formula 1:

(Continued)

Formula 1

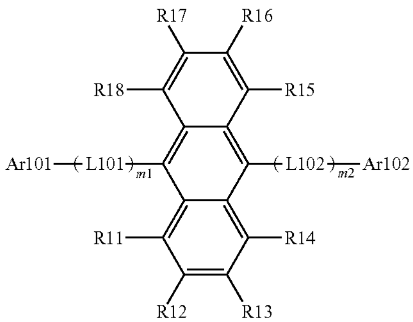

and a second organic material layer comprising a compound of Formula 2:

Formula 2

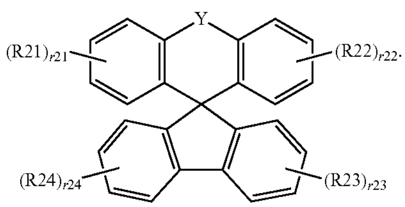

17 Claims, 2 Drawing Sheets

(51) Int. Cl.

| | |
|---|---|
| ***H10K 85/40*** | (2023.01) |
| ***H10K 101/10*** | (2023.01) |

(52) U.S. Cl.

CPC ....... *H10K 85/654* (2023.02); *H10K 85/6572* (2023.02); *H10K 85/6574* (2023.02); *H10K 85/6576* (2023.02); *H10K 50/11* (2023.02); *H10K 2101/10* (2023.02)

(56) References Cited

U.S. PATENT DOCUMENTS

| | | | |
|---|---|---|---|
| 2013/0264561 | A1 | 10/2013 | Dobbs et al. |
| 2014/0246657 | A1 | 9/2014 | Kim et al. |
| 2017/0186975 | A1 | 6/2017 | Kim et al. |
| 2017/0217992 | A1 | 8/2017 | Jun et al. |
| 2018/0301629 | A1 | 10/2018 | Hatakeyama et al. |
| 2019/0214571 | A1 | 7/2019 | Huh et al. |
| 2019/0296243 | A1 | 9/2019 | Suh et al. |
| 2019/0367477 | A1 | 12/2019 | Kim et al. |

FOREIGN PATENT DOCUMENTS

| | | | |
|---|---|---|---|
| KR | 20100069216 | | 6/2010 |
| KR | 20110076376 | A | 7/2011 |
| KR | 20120135501 | A | 12/2012 |
| KR | 20130124775 | A | 11/2013 |
| KR | 10-2014-0015298 | | 2/2014 |
| KR | 10-2016-0018406 | | 2/2016 |
| KR | 10-2017-0078977 | | 7/2017 |
| KR | 20170130434 | | 11/2017 |
| KR | 10-2018-0037695 | | 4/2018 |
| KR | 10-2018-0057109 | | 5/2018 |
| KR | 10-2018-0069423 | | 6/2018 |
| KR | 10-2018-0077887 | | 7/2018 |
| KR | 10-2018-0103021 | | 9/2018 |
| KR | 10-2018-0111558 | | 10/2018 |
| WO | 2003-012890 | | 2/2003 |
| WO | 2018164510 | A1 | 9/2018 |

* cited by examiner

[Figure 1]
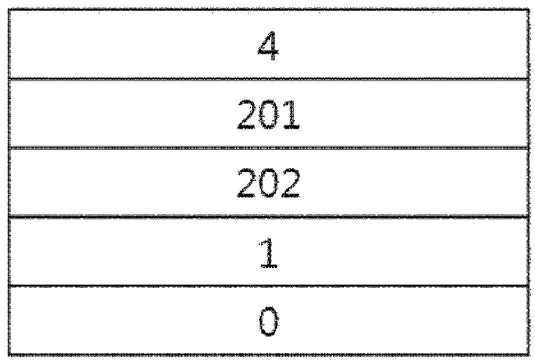
[Figure 2]
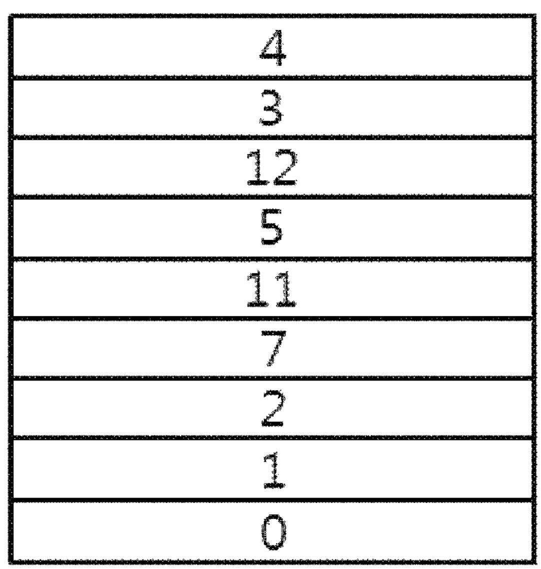

[Figure 3]
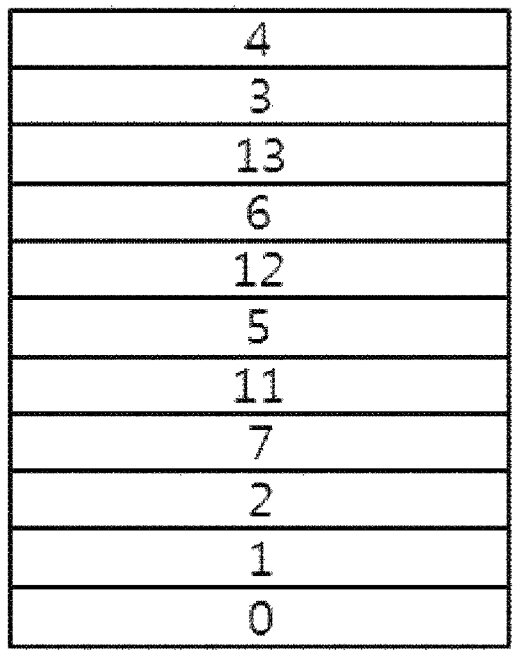
[Figure 4]
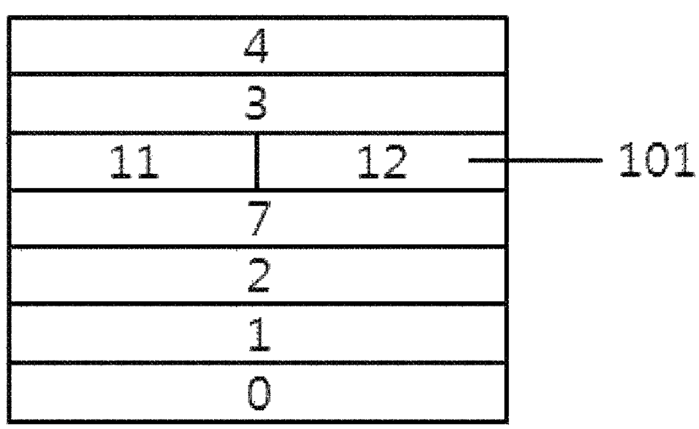

ORGANIC LIGHT EMITTING DIODE

CROSS-REFERENCE TO RELATED APPLICATIONS

This application is a National Stage Application of International Application No. PCT/KR2019/016440 filed on Nov. 27, 2019, which claims priority to and the benefit of Korean Patent Application No. 10-2018-0148350 filed in the Korean Intellectual Property Office on Nov. 27, 2018, the entire contents of which are incorporated herein by reference.

TECHNICAL FIELD

The present specification relates to an organic light emitting device.

BACKGROUND ART

In general, an organic light emitting phenomenon refers to a phenomenon in which electric energy is converted into light energy by using an organic material. An organic light emitting device using the organic light emitting phenomenon usually has a structure including a positive electrode, a negative electrode, and an organic material layer interposed therebetween. Here, the organic material layer can have a multi-layered structure composed of different materials in order to improve the efficiency and stability of the organic light emitting device in many cases, and for example, can be composed of a hole injection layer, a hole transporting layer, a light emitting layer, an electron transporting layer, an electron injection layer, and the like. In such a structure of the organic light emitting device, if a voltage is applied between the two electrodes, holes are injected from the positive electrode into the organic material layer and electrons are injected from the negative electrode into the organic material layer, and when the injected holes and electrons meet each other, an exciton is formed, and light is emitted when the exciton falls down again to a ground state.

There is a continuous need for developing a new material for the aforementioned organic light emitting device.

PRIOR ART (Patent Document 1) International Patent Application Laid-Open Publication No. WO2003/012890

(Non-Patent Document 1) Kei Sakanoue, J. Phys. Chem. A 1999, 103, 5551-5556.

BRIEF DESCRIPTION

Technical Problem

The present specification has been made in an effort to provide an organic light emitting device having a low driving voltage or a high efficiency or excellent service life characteristics or high color purity by including a compound of Formula 1 in a first organic material layer and a compound of Formula 2 in a second organic material layer.

Technical Solution

The present specification provides an organic light emitting device including: a positive electrode; a negative electrode; and a first organic material layer and a second organic material layer provided between the positive electrode and the negative electrode, in which the first organic material layer includes a compound of the following Formula 1, and the second organic material layer includes a compound of the following Formula 2:

Formula 1

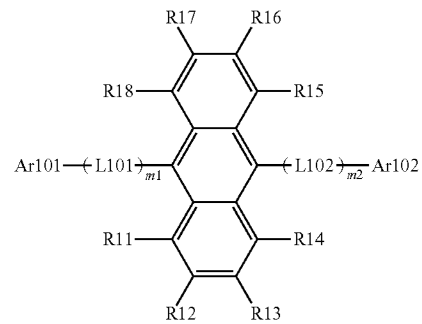

wherein in Formula 1:

L101 and L22 are the same as or different from each other, and are each independently a direct bond, a substituted or unsubstituted arylene group, or a substituted or unsubstituted heteroarylene group;

R11 to R18 are the same as or different from each other, and are each independently hydrogen, deuterium, a substituted or unsubstituted alkyl group, a substituted or unsubstituted cycloalkyl group, a substituted or unsubstituted silyl group, a substituted or unsubstituted aryl group, or a substituted or unsubstituted heteroaryl group, or adjacent substituents are bonded to each other to form a substituted or unsubstituted ring;

Ar101 and Ar102 are the same as or different from each other, and are each independently a substituted or unsubstituted aryl group or a substituted or unsubstituted heteroaryl group, or are linked to an adjacent substituent to form a substituted or unsubstituted ring;

m1 and m2 are each an integer from 0 to 5;

when m1 is 2 or higher, the L1010s are the same as or different from each other;

when m2 is 2 or higher, the L102s are the same as or different from each other; and the compound of Formula 1 is at least 40% or more deuterated;

Formula 2

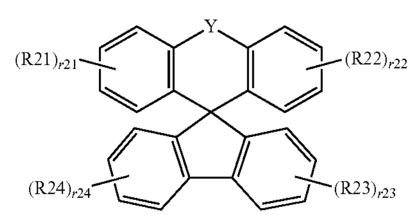

wherein in Formula 2:

Y is O or S;

R21 to R24 are the same as or different from each other, and are each independently hydrogen, deuterium, a nitrile group, a substituted or unsubstituted alkyl group, a substituted or unsubstituted aryl group, or a substituted or unsubstituted heterocyclic group, or are the following Formula 3, or adjacent substituents are bonded to each other to form a substituted or unsubstituted ring;

at least one of R21 and R22 is the following Formula 3;

r21 to r24 are the same as or different from each other, and are each independently an integer from 0 to 4, and when r21 is 2 or higher, the R21s are the same as or different from each other, and when r22 is 2 or higher, the R22s are the same as or different from each other, and when r23 is 2 or higher, the R23s are the same as or different from each other, and when r24 is 2 or higher, the R24s are the same as or different from each other;

Formula 3

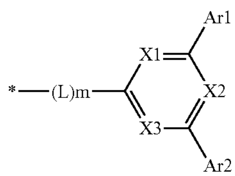

wherein in Formula 3:

X1 is N or C(R31), X2 is N or C(R32), X3 is N or C(R33), and one or more of X1 to X3 are N;

R31, R32, and R33 are the same as or different from each other, and are each independently hydrogen, deuterium, a substituted or unsubstituted aryl group, or a substituted or unsubstituted heterocyclic group, or are bonded to Ar1 or Ar2 to form a substituted or unsubstituted aromatic hydrocarbon ring or a substituted or unsubstituted hetero ring;

Ar1 and Ar2 are the same as or different from each other, and are each independently an aryl group which is unsubstituted or substituted with R41, or a heterocyclic group which is unsubstituted or substituted with R42, or are bonded to R31, R32, or R33 to form a substituted or unsubstituted aromatic hydrocarbon ring or a substituted or unsubstituted hetero ring;

R41 and R42 are the same as or different from each other, and are each independently one selected from the group consisting of deuterium, a halogen group, a nitrile group, an alkyl group, a haloalkyl group, an alkoxy group, a silyl group, an aryl group, and a heterocyclic group, or a group to which two or more substituents are linked;

L is a direct bond, a substituted or unsubstituted arylene group, or a substituted or unsubstituted divalent heterocyclic group;

m is an integer from 0 to 4, and when m is 2 or higher, the Ls are the same as or different from each other; and

* is a moiety bonded to Formula 2.

Advantageous Effects

An organic light emitting device according to an exemplary embodiment of the present specification includes a compound of Formula 1 and a compound of Formula 2, and thus is excellent in long service life characteristics, and has a high efficiency feature, and low driving voltage.

BRIEF DESCRIPTION OF DRAWINGS

FIGS. 1 to 4 illustrate an example of the organic light emitting device of the present invention.

EXPLANATION OF REFERENCE NUMERALS AND SYMBOLS

0: Substrate
1: Negative electrode
2: Electron transport layer
3: Hole transport layer
4: Positive electrode
5: Organic material layer
6: Organic material layer
7: Hole blocking layer or electron adjusting layer
11: First light emitting layer
12: Second light emitting layer
13: Third light emitting layer
101: Light emitting layer
201: First organic material layer
202: Second organic material layer

DETAILED DESCRIPTION

Hereinafter, the present specification will be described in more detail. However, the following description relates to an exemplary embodiment of the present invention, and includes all the substitutable ranges within an equivalent range.

First, some terms of the present specification will be clarified.

When one part "includes" one constituent element in the present specification, unless otherwise specifically described, this does not mean that another constituent element is excluded, but means that another constituent element can be further included.

In the present specification, Cn refers to n carbon atoms.

In the present specification, Cn1-Cn2 refers to n1 to n2 carbon atoms.

In the present specification, Dn refers to n deuteriums.

Examples of the substituents in the present specification will be described below, but are not limited thereto.

The term "substitution" means that a hydrogen atom bonded to a carbon atom of a compound is changed into another substituent, and a position to be substituted is not limited as long as the position is a position at which the hydrogen atom is substituted, that is, a position at which the substituent can be substituted, and when two or more are substituted, the two or more substituents can be the same as or different from each other.

In the present specification, the term "substituted or unsubstituted" means being substituted with one or two or more substituents selected from the group consisting of deuterium, a halogen group, a nitrile group, an alkyl group, a haloalkyl group, an alkoxy group, a haloalkoxy group, a cycloalkyl group, a silyl group, an alkenyl group, an amine group, an arylamine group, an aryl group, and a heterocyclic group including one or more of N, O, S, Se, and Si atoms, being substituted with a substituent to which two or more substituents among the substituents exemplified above are linked, or having no substituent. For example, "the substituent to which two or more substituents are linked" can be a biphenyl group. That is, the biphenyl group can also be an aryl group, and can be interpreted as a substituent to which two phenyl groups are linked.

In the present specification, the fact that two or more substituents are linked indicates that a location containing a hydrogen of any one substituent is linked to another substituent. For example, an isopropyl group and a phenyl group can be linked to each other to become a substituent of

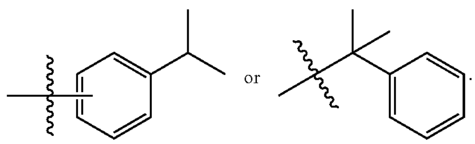

In the present specification, the case where three substituents are linked to one another includes not only a case where (Substituent 1)-(Substituent 2)-(Substituent 3) are consecutively linked to one another, but also a case where (Substituent 2) and (Substituent 3) are linked to (Substituent 1). For example, two phenyl groups and an isopropyl group can be linked to each other to become a substituent of

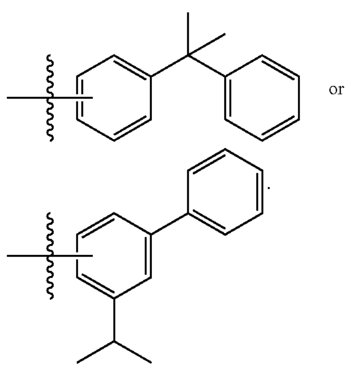

The same also applies to the case where four or more substituents are linked to each other.

In the present specification, * or

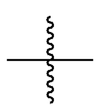

means a moiety bonded to another substituent or a bonding portion.

In an exemplary embodiment of the present specification, the "substituted or unsubstituted" refers to being substituted with one or two or more substituents selected from the group consisting of deuterium, a halogen group, a nitrile group, a C1-C20 alkyl group, a C1-C20 haloalkyl group, a C1-C20 alkoxy group, a C1-C20 haloalkoxy group, a C3-C20 cycloalkyl group, a C1-C50 silyl group, a C2-C20 alkenyl group, an amine group, a C6-C50 arylamine group, a C6-C30 aryl group, and a C2-C30 heterocyclic group including one or more of N, O, S, Se, and Si atoms, being substituted with a substituent to which two or more substituents are linked, or having no substituent.

In an exemplary embodiment of the present specification, the "substituted or unsubstituted" refers to being substituted with a substituent to which one or two or more substituents selected from the group consisting of deuterium, a C1-C10 alkyl group, a C6-C30 aryl group, and a C2-C30 heterocyclic group is or are linked, or having no substituent.

In the present specification, examples of a halogen group include fluorine, chlorine, bromine or iodine.

In the present specification, an alkyl group can be straight-chained or branched, and the number of carbon atoms thereof is not particularly limited, but is preferably 1 to 30, 1 to 20, 1 to 10, or 1 to 5. Specific examples thereof include methyl, ethyl, propyl, n-propyl, isopropyl, butyl, n-butyl, isobutyl, tert-butyl, sec-butyl, 1-methyl-butyl, 1-ethylbutyl, pentyl, n-pentyl, isopentyl, neopentyl, tert-pentyl, hexyl, n-hexyl, 1-methylpentyl, 2-methylpentyl, 3,3-dimethylbutyl, 2-ethylbutyl, heptyl, n-heptyl, 1-methyl-hexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethylpropyl, 1,1-dimethyl-propyl, isohexyl, 4-methylhexyl, 5-methylhexyl, and the like, but are not limited thereto.

In the present specification, a haloalkyl group can be straight-chained or branched, and refers to a group in which hydrogen of the above-described alkyl group is substituted with one or two or more halogen groups. The number of carbon atoms thereof is not particularly limited, but is preferably 1 to 30, 1 to 20, 1 to 10, or 1 to 5. The description on the above-described alkyl group can be applied to the alkyl group. Specific examples of the haloalkyl group include a fluoromethyl group, a difluoromethyl group, a trifluoromethyl group, a chloromethyl group, a dichloromethyl group, a trichloromethyl group, a bromomethyl group, a dibromomethyl group, a tribromomethyl group, and the like, but are not limited thereto.

In the present specification, a cycloalkyl group is not particularly limited, but the number of carbon atoms thereof is preferably 3 to 60, and more preferably 3 to 30; 3 to 15; or 3 to 6. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethyl-cyclohexyl, 4-tert-butylcyclohexyl, cycloheptyl, cyclooctyl, and the like, but are not limited thereto.

In the present specification, an alkoxy group, which is a group in which an alkyl group is linked to an oxygen atom, can be straight-chained, branched, or cyclic. The number of carbon atoms of the alkoxy group is not particularly limited, but is preferably 1 to 30, 1 to 20, 1 to 10, or 1 to 5. Specific examples thereof include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethyl-butyloxy, 2-ethylbutyloxy, n-octyloxy, n-nonyloxy, n-decyloxy, benzyloxy, p-methylbenzyloxy, and the like, but are not limited thereto.

In the present specification, an alkenyl group can be straight-chained or branched, and the number of carbon atoms thereof is not particularly limited, but is preferably 2 to 30, 2 to 20, 2 to 10, or 2 to 5. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl) vinyl-1-yl, 2,2-bis(diphenyl-1-yl) vinyl-1-yl, a stilbenyl group, a styrenyl group, and the like, but are not limited thereto.

In the present specification, a silyl group can be of —SiRaRbRc, and Ra, Rb, and Rc can be each hydrogen, a substituted or unsubstituted alkyl group, or a substituted or unsubstituted aryl group. Specific examples of the silyl group include a trimethyl-silyl group, a triethylsilyl group, a tert-butyldimethyl-silyl group, a vinyldimethylsilyl group, a propyldimethyl-silyl group, a triphenylsilyl group, a diphenylsilyl group, a phenylsilyl group, and the like, but are not limited thereto.

In the present specification, an amine group can be of —NRfRg, and Rf and Rg can be each hydrogen, deuterium, a substituted or unsubstituted alkyl group, a substituted or unsubstituted cycloalkyl group, a substituted or unsubstituted aryl group, or a substituted or unsubstituted heterocyclic group. The amine group can be selected from the group consisting of an alkylamine group, an arylalkylamine group, an arylamine group, an arylheteroarylamine group, an alkylheteroarylamine group, and a heteroarylamine group, and can be more specifically a dimethylamine group, a diphenylamine group, and the like, but is not limited thereto.

In the present specification, an aryl group means a monovalent aromatic hydrocarbon or a monovalent group of an aromatic hydrocarbon derivative. In the present specification, an aromatic hydrocarbon means a compound in which pi electrons are completely conjugated and containing a planar ring, and a group derived from an aromatic hydrocarbon means a structure in which an aromatic hydrocarbon or a cyclic aliphatic hydrocarbon is fused with an aromatic hydrocarbon. Further, in the present specification, an aryl group intends to include a monovalent group in which two or more aromatic hydrocarbons or derivatives of an aromatic hydrocarbon are linked to each other. The aryl group is not particularly limited, but preferably has 6 to 50 carbon atoms, 6 to 30 carbon atoms, 6 to 25 carbon atoms, 6 to 20 carbon atoms, 6 to 18 carbon atoms, or 6 to 13 carbon atoms, and the aryl group can be monocyclic or polycyclic. Specific examples of the monocyclic aryl group include a phenyl group, a biphenyl group, a terphenyl group, and the like, but are not limited thereto. Specific examples of the polycyclic aryl group include a naphthyl group, an anthracenyl group, a phenanthryl group, a triphenyl group, a pyrenyl group, a perylenyl group, a chrysenyl group, a fluorenyl group, and the like, but are not limited thereto.

In the present specification, the fluorenyl group can be substituted, and adjacent substituents can be bonded to each other to form a ring.

In the present specification, when it is said that a fluorenyl group can be substituted, the substituted fluorenyl group includes all the compounds in which substituents of a pentagonal ring of fluorene are spiro-bonded to each other to form an aromatic hydrocarbon ring. Examples of the substituted fluorenyl group include 9,9'-spirobifluorene, spiro[cyclopentane-1,9'-fluorene], spiro[benzo[c]fluorene-7,9-fluorene], and the like, but are not limited thereto.

In the present specification, a heteroaryl group means a monovalent aromatic hetero ring. Here, the aromatic hetero ring is a monovalent group of an aromatic ring or a derivative of the aromatic ring, and means a group including one or more of N, O, S, and Si as a heteroatom in the ring. The derivative of the aromatic ring includes a structure in which an aromatic ring or an aliphatic ring is fused with an aromatic ring. Further, in the present specification, the heteroaryl group intends to include a monovalent group in which an aromatic ring including two or more heteroatoms or derivatives of an aromatic ring including a heteroatom are linked to each other. The number of carbon atoms of the heteroaryl group is preferably 2 to 50, 2 to 30, 2 to 20, 2 to 18, or 2 to 13.

Examples of the heteroaryl group include a thiophene group, a furan group, a pyrrole group, an imidazole group, a thiazole group, an oxazole group, an oxadiazole group, a triazole group, a pyridine group, a bipyridine group, a pyrimidine group, a triazine group, an acridine group, a pyridazine group, a pyrazine group, a quinoline group, a quinazoline group, a quinoxaline group, a phthalazine group, a pteridine group, a pyridopyrimidine group, a pyridopyrazine group, a pyrazinopyrazine group, an isoquinoline group, an indole group, a pyridoindole group, indenopyrimidine (5H-indenopyrimidine), a carbazole group, a benzoxazole group, a benzimidazole group, a benzothiazole group, a benzocarbazole group, a benzothiophene group, a dibenzothiophene group, a benzofuran group, a dibenzofuran group, a dibenzosilole group, a phenanthroline group, a thiazolyl group, an isoxazolyl group, an oxadiazolyl group, a thiadiazolyl group, and the like, but are not limited thereto.

In the present specification, an arylene group means a group having two bonding positions in an aryl group, that is, a divalent group. The above-described description on the aryl group can be applied to the arylene group, except for a divalent arylene group.

In the present specification, a heteroarylene group means a group having two bonding positions in a heteroaryl group, that is, a divalent group. The above-described description on the heteroaryl group can be applied to the heteroarylene group, except for a divalent heteroarylene group.

In the present specification, the "adjacent" group can mean a substituent substituted with an atom directly linked to an atom in which the corresponding substituent is substituted, a substituent disposed to be sterically closest to the corresponding substituent, or another substituent substituted with an atom in which the corresponding substituent is substituted. For example, two substituents substituted at the ortho position in a benzene ring and two substituents substituted with the same carbon in an aliphatic ring can be interpreted as groups which are "adjacent" to each other.

In the present specification, in a substituted or unsubstituted ring formed by bonding adjacent groups, the "ring" means a substituted or unsubstituted hydrocarbon ring, or a substituted or unsubstituted hetero ring.

In the present specification, a hydrocarbon ring can be an aromatic ring, an aliphatic ring, or a fused ring of the aromatic ring and the aliphatic ring, and can be selected from the examples of the cycloalkyl group or the aryl group, except for the hydrocarbon ring which is not monovalent. Examples of the fused ring of the aromatic ring and the aliphatic ring include a 1, 2, 3, 4-tetrahydro-naphthalene group, a 2,3-dihydro-1H-indene group, and the like, but are not limited thereto.

In the present specification, an aromatic ring can be monocyclic or polycyclic, and can be selected from the examples of the aryl group, except for the aromatic ring which is not monovalent.

In the present specification, a hetero ring includes one or more atoms other than carbon, that is, one or more heteroatoms, and specifically, the heteroatom can include one or more atoms selected from the group consisting of O, N, S, Si, and the like. The hetero ring can be monocyclic or polycyclic, can be an aromatic ring, an aliphatic ring, or a fused ring of the aromatic ring and the aliphatic ring, and can be selected from the examples of the heteroaryl group, except for the hetero ring which is not monovalent.

In Formulae 1 and 2 of the present specification, the hetero ring includes those substituted with deuterium even when the substituted substituent is not specified.

Hereinafter, an organic light emitting device according to an exemplary embodiment of the present specification and a compound included in the same will be described.

The present specification provides an organic light emitting device including: a positive electrode; a negative electrode; and a first organic material layer and a second organic material layer provided between the positive electrode and the negative electrode, in which the first organic material layer includes the compound of Formula 1 and the second organic material layer includes the compound of Formula 2.

The compound of Formula 1 includes deuterium. When hydrogen is replaced with deuterium, chemical properties of the compound are rarely changed. However, since the atomic weight of deuterium is twice that of hydrogen, physical properties of a deuterated compound can be changed. As an example, a compound substituted with deuterium has a lower level of vibrational energy. The compound substituted with deuterium can prevent a decrease in quantum efficiency caused by a decrease in intermolecular Van der Waals force or a collision due to intermolecular vibration. Further, the C-D bond can improve stability of a compound. Thus, the compound of Formula 1 can include deuterium to improve the efficiency and service life of a device.

In the present specification, the "deuterated" means that hydrogen is substituted with deuterium. An N % deuterated compound or group means that N % of available hydrogen is substituted with deuterium. The fact that N % of hydrogen of any group is substituted with deuterium means that No of the total number of substitutable hydrogens is substituted with deuterium (D) except for the position where the substituent is linked to the core structure. For example, the fact that 20% of hydrogen of a phenyl group is substituted with deuterium means that one, which is 20% of 5 substitutable hydrogens of the phenyl group, is substituted with deuterium (D). The fact that 33% of hydrogen of a biphenyl group is substituted with deuterium refers to the fact that 33% of hydrogen of the biphenyl group is substituted with 3 deuteriums.

In an exemplary embodiment of the present specification, a deuterated compound can be prepared by a publicly-known deuteration reaction. According to an exemplary embodiment of the present specification, the compound of Formula 1 can be formed using a deuterated compound as a precursor, or deuterium can also be introduced into a compound via a hydrogen-deuterium exchange reaction in the presence of an acid catalyst using a deuterated solvent.

In the present specification, the degree of deuteration can be confirmed by a publicly-known method such as nuclear magnetic resonance spectroscopy ($^1$H NMR) or GC/MS.

The compound of Formula 2 has a structure in which a hetero ring including one or more N is linked to a spiro-type ring including O or S. Due to the spiro-type ring including O or S, a steric hindrance occurs to the compound. The steric hindrance can allow a layer to be stably formed even at high deposition temperature by preventing crystallization during the formation of a film and increasing thermal stability. In an exemplary embodiment, when the compound of Formula 2 is used in the organic material layer, an effect of enhancing the service life of the device can be expected due to high thermal stability and processability. Further, since the compound has a hetero ring including one or more N as a substituent, a high efficiency of the device can be expected.

In the compound of Formula 2, the structure is not a symmetric structure (that is, a structure in which R21 and R22; or R23 and R24 simultaneously have a structure of Formula 3). That is, the compound asymmetrically has the structure of Formula 3. In this case, due to the asymmetric structure of Formula 2, the dipole moment of the molecule is improved. Thus, when the compound included as Formula 2 is included in an organic material layer (for example, an electron transport layer) between the negative electrode and the light emitting layer, the injection rate of electrons into the light emitting layer is increased, so that the driving voltage of the organic light emitting device can be lowered. Further, due to the asymmetric structure, the crystallization degree in a solution state is decreased, so that an economic effect can be expected in terms of time and/or cost when an organic material layer is formed.

The compound of Formula 2 according to an exemplary embodiment of the present specification has a dipole moment value of 0.6 debye or more. The aforementioned dipole moment value can result from a structural feature.

The dipole moment in the present specification is a physical quantity which indicates the degree of polarity, and can be calculated by the following Equation 1.

$$p(r) = \int_V \rho(r_0)(r_0 - r)d^3r_0 \qquad \langle\text{Equation 1}\rangle$$

$\rho(r_0)$: molecular density
V: volume
r: the point of observation
$d^3r_0$: an elementary volume The value of the dipole moment can be obtained by calculating the molecular density in Equation 1. For example, the molecular density can be obtained by obtaining the charge and dipole of each atom using a method called Hirshfeld Charge Analysis, and then calculating the value according to the following equation.

Weight Function $$W_\alpha = \rho_\alpha(r - R_\alpha)\left[\sum_\beta \rho_\beta(r - R_\beta)\right]^{-1}$$

$\rho_\alpha(r-R_\alpha)$: spherically averaged ground-state atomic density
$\Sigma_\beta\rho_\beta(r-R_\beta)$: promolecule density Deformation Density $$\rho_d(r) = \rho(r)\sum_\alpha \rho_\alpha(r - R_\alpha)$$

$\rho(r)$: molecular density
$\rho_\alpha(r-R_\alpha)$: density of the free atom $\alpha$ located at coordinates $R_\alpha$ Atomic Charge $$q(\alpha) = -\int \rho_d(r) W_\alpha(r) d^3r$$

$W_\alpha(r)$: weight function

As described above, the compound of Formula 2 is a material having an excellent electron injection effect due to the asymmetric structure. When the compound of Formula 1 is used as a host of a light emitting layer, an ability to accept electrons is excellent, so that stability is improved. Accordingly, the efficiency and service life of an organic light emitting device including the compound of Formula 1 and the compound of Formula 2 are excellent.

In an exemplary embodiment of the present specification, the compound of Formula 1 is at least 40% deuterated. In an exemplary embodiment, the compound of Formula 1 is at least 50% deuterated. In an exemplary embodiment, the compound of Formula 1 is at least 60% deuterated. In an exemplary embodiment, the compound of Formula 1 is at least 70% deuterated. In an exemplary embodiment, the compound of Formula 1 is at least 80% deuterated. In an exemplary embodiment, the compound of Formula 1 is at least 90% deuterated. In an exemplary embodiment, the compound of Formula 1 is 100% deuterated.

In an exemplary embodiment of the present specification, Formula 1 includes at least one hydrogen.

In an exemplary embodiment of the present specification, L101 and L102 are the same as or different from each other, and are each independently a direct bond, a substituted or unsubstituted arylene group, or a substituted or unsubstituted heteroarylene group.

In an exemplary embodiment of the present specification, L101 and L102 are the same as or different from each other, and are each independently a direct bond, a substituted or unsubstituted C6-C30 arylene group, or a C2-C30 heteroarylene group.

In an exemplary embodiment of the present specification, L101 and L102 are the same as or different from each other, and are each independently a direct bond, a C6-C20 arylene group, or a C2-C20 heteroarylene group including N, O, or S. The arylene group or heteroarylene group is unsubstituted or substituted with a C1-C10 alkyl group, a C6-C20 aryl group, or a C2-C20 heteroaryl group.

In an exemplary embodiment of the present specification, L101 and L102 are the same as or different from each other, and are each independently a direct bond, a C6-C20 arylene group which is unsubstituted or substituted with a C1-C10 alkyl group, or a C2-C20 heteroarylene group including N, O, or S.

In an exemplary embodiment of the present specification, L101 and L102 are the same as or different from each other, and are each independently a direct bond, a substituted or unsubstituted phenylene group, a substituted or unsubstituted biphenylene group, a substituted or unsubstituted terphenylene group, a substituted or unsubstituted naphthylene group, a substituted or unsubstituted fluorenylene group, a substituted or unsubstituted anthracenylene group, a substituted or unsubstituted phenanthrenylene group, a substituted or unsubstituted spirobifluorenylene group, a substituted or unsubstituted divalent carbazole group, a substituted or unsubstituted divalent dibenzofuran group, a substituted or unsubstituted divalent dibenzothiophene group, a substituted or unsubstituted divalent quinoline group, a substituted or unsubstituted divalent pyridine group, a substituted or unsubstituted divalent pyrimidine group, or a substituted or unsubstituted divalent triazine group. In another exemplary embodiment, the "substituted or unsubstituted" refers to being substituted with an alkyl group having 1 to 5 carbon atoms, an aryl group having 6 to 20 carbon atoms, or a heterocyclic group having 2 to 20 carbon atoms, or having no substituent.

In an exemplary embodiment of the present specification, L101 and L102 are the same as or different from each other, and are each independently a direct bond, a substituted or unsubstituted phenylene group, a substituted or unsubstituted biphenylene group, a substituted or unsubstituted naphthylene group, a substituted or unsubstituted divalent dibenzofuran group, a substituted or unsubstituted divalent dibenzothiophene group, a substituted or unsubstituted divalent pyridine group, a substituted or unsubstituted divalent quinoline group, or a substituted or unsubstituted divalent isoquinoline group.

In an exemplary embodiment of the present specification, L101 and L102 are the same as or different from each other, and are each independently a direct bond or a C6-C20 arylene group which is unsubstituted or substituted with a C1-C10 alkyl group.

In an exemplary embodiment of the present specification, L101 and L102 are the same as or different from each other, and are each independently a direct bond or a C6-C20 arylene group.

In an exemplary embodiment of the present specification, L101 and L102 are the same as or different from each other, and are each independently a direct bond, a phenylene group which is unsubstituted or substituted with a propyl group, a biphenylene group, a naphthylene group, a divalent dibenzofuran group, a divalent pyridine group, or a divalent quinoline group.

In an exemplary embodiment of the present specification, L101 and L102 are different from each other.

In an exemplary embodiment of the present specification, L101 is 40% or more, 50% or more, 60% or more, 70% or more, 80% or more, 90% or more, or 100% deuterated.

In an exemplary embodiment of the present specification, L102 is 40% or more 50% or more 60% or more 70% or more 80% or more 90% or more or 100% deuterated.

In an exemplary embodiment of the present specification, one of L101 and L102 is a direct bond, and the other is a substituted or unsubstituted C6-C20 arylene group.

In an exemplary embodiment of the present specification, L101 and L102 are each a direct bond.

In an exemplary embodiment of the present specification, R11 to R18 are the same as or different from each other, and are each independently hydrogen, deuterium; a substituted or unsubstituted alkyl group, a substituted or unsubstituted cycloalkyl group, a substituted or unsubstituted silyl group, a substituted or unsubstituted aryl group, or a substituted or unsubstituted heteroaryl group.

In an exemplary embodiment of the present specification, R11 to R18 are the same as or different from each other, and are each independently hydrogen, deuterium; a substituted or unsubstituted C1-C10 alkyl group, a substituted or unsubstituted C3-C10 cycloalkyl group, a substituted or unsubstituted C1-C60 silyl group, a substituted or unsubstituted C6-C30 aryl group, or a substituted or unsubstituted C2-C30 heteroaryl group.

In an exemplary embodiment of the present specification, R11 to R18 are the same as or different from each other, and are each independently hydrogen, deuterium, a substituted or unsubstituted C1-C8 alkyl group, a substituted or unsubstituted C3-C6 cycloalkyl group, a substituted or unsubstituted C1-C40 silyl group, a substituted or unsubstituted C6-C20 aryl group, or a substituted or unsubstituted C2-C20 heteroaryl group.

In an exemplary embodiment of the present specification, R11 to R18 are the same as or different from each other, and are each independently hydrogen, deuterium, a methyl group, an ethyl group, a propyl group, an isopropyl group, a butyl group, a tert-butyl group, an octyl group, a phenyl group, a biphenyl group, a terphenyl group, a naphthyl group, a fluorenyl group, an anthracenyl group, a phenanthrenyl group, a carbazole group, a dibenzofuran group, a dibenzothiophene group, a quinoline group, a pyridine group, a pyrimidine group, or a triazine group. In another exemplary embodiment, the substituent is unsubstituted or substituted with a C1-C6 alkyl group, a substituted or unsubstituted C6-C20 aryl group, or a substituted or unsubstituted C2-C20 heteroaryl group.

In an exemplary embodiment of the present specification, R11 to R18 are the same as or different from each other, and are each independently hydrogen, deuterium, an octyl group, or a phenyl group.

In an exemplary embodiment of the present specification, R11, R14, R15, and R18 are the same as or different from each other, and are each independently bonded to adjacent Ar101 or Ar102 to form a substituted or unsubstituted ring.

In an exemplary embodiment of the present specification, R11 is bonded to Ar101 to form a substituted or unsubstituted ring.

In an exemplary embodiment of the present specification, R14 is bonded to Ar102 to form a substituted or unsubstituted ring.

In an exemplary embodiment of the present specification, R15 is bonded to Ar102 to form a substituted or unsubstituted ring.

In an exemplary embodiment of the present specification, R18 is bonded to Ar101 to form a substituted or unsubstituted ring.

In an exemplary embodiment of the present specification, R11 is bonded to Ar101 to form a pentagonal ring.

In an exemplary embodiment of the present specification, R14 is bonded to Ar102 to form a pentagonal ring.

In an exemplary embodiment of the present specification, R15 is bonded to Ar102 to form a pentagonal ring.

In an exemplary embodiment of the present specification, R18 is bonded to Ar101 to form a pentagonal ring.

In an exemplary embodiment of the present specification, at least one of R12, R13, R16, and R17 is a C1-C10 alkyl group or a C6-C20 aryl group, and the others are hydrogen or deuterium.

In an exemplary embodiment of the present specification, at least one of R12, R13, R16, and R17 is an octyl group or a phenyl group, and the others are hydrogen or deuterium.

In an exemplary embodiment of the present specification, four or more of R11 to R18 are deuterium.

In an exemplary embodiment of the present specification, R11 to R18 are each deuterium.

In an exemplary embodiment of the present specification, one or more of R11 to R18 are deuterium, and the others are hydrogen.

In an exemplary embodiment of the present specification, four or more of R11 to R18 are deuterium, and the others are hydrogen.

In an exemplary embodiment of the present specification, R12 is an octyl group or a phenyl group.

In an exemplary embodiment of the present specification, R13 is an octyl group or a phenyl group.

In an exemplary embodiment of the present specification, R16 is an octyl group or a phenyl group.

In an exemplary embodiment of the present specification, R17 is an octyl group or a phenyl group.

In an exemplary embodiment of the present specification, R11 is 40% or more, 50% or more, 60% or more, 70% or more, 80% or more, 90% or more, or 100% deuterated.

In an exemplary embodiment of the present specification, R12 is 40% or more, 50% or more, 60% or more, 70% or more, 80% or more, 90% or more, or 100% deuterated.

In an exemplary embodiment of the present specification, R13 is 40% or more, 50% or more, 60% or more, 70% or more, 80% or more, 90% or more, or 100% deuterated.

In an exemplary embodiment of the present specification, R14 is 40% or more, 50% or more, 60% or more, 70% or more, 80% or more, 90% or more, or 100% deuterated.

In an exemplary embodiment of the present specification, R15 is 40% or more, 50% or more, 60% or more, 70% or more, 80% or more, 90% or more, or 100% deuterated.

In an exemplary embodiment of the present specification, R16 is 40% or more, 50% or more, 60% or more, 70% or more, 80% or more, 90% or more, or 100% deuterated.

In an exemplary embodiment of the present specification, R17 is 40% or more, 50% or more, 60% or more, 70% or more, 80% or more, 90% or more, or 100% deuterated.

In an exemplary embodiment of the present specification, R18 is 40% or more, 50% or more, 60% or more, 70% or more, 80% or more, 90% or more, or 100% deuterated.

In an exemplary embodiment of the present specification, Ar101 and Ar102 are the same as or different from each other, and are each independently a substituted or unsubstituted aryl group or a substituted or unsubstituted heteroaryl group, or adjacent substituents are bonded to each other to form a substituted or unsubstituted ring.

In an exemplary embodiment of the present specification, Ar101 and Ar102 are the same as or different from each other, and are each independently a substituted or unsubstituted C6-C50 aryl group or a substituted or unsubstituted C2-C50 heteroaryl group, or adjacent substituents are bonded to each other to form a substituted or unsubstituted C2-C50 ring.

In an exemplary embodiment of the present specification, Ar101 and Ar102 are the same as or different from each other, and are each independently a substituted or unsubstituted C6-C30 aryl group or a substituted or unsubstituted C2-C30 heteroaryl group, or adjacent substituents are bonded to each other to form a substituted or unsubstituted C2-C30 ring.

In an exemplary embodiment of the present specification, Ar101 and Ar102 are the same as or different from each other, and are each independently a substituted or unsubstituted C6-C20 aryl group or a substituted or unsubstituted C2-C20 heteroaryl group, or adjacent substituents are bonded to each other to form a substituted or unsubstituted C2-C20 ring. The aryl group, heteroaryl group or ring is unsubstituted or substituted with a C1-C10 alkyl group or a C6-C20 aryl group.

In an exemplary embodiment of the present specification, Ar101 and Ar102 are the same as or different from each other, and are each independently a C6-C30 aryl group which is unsubstituted or substituted with a C1-C10 alkyl group; or a C2-C30 heteroaryl group which is unsubstituted or substituted with a C6-C20 aryl group, or form a C2-C30 ring with adjacent R11, R14, R15, or R18.

In an exemplary embodiment of the present specification, Ar101 and Ar102 are the same as or different from each other, and are each independently a substituted or unsubstituted C6-C20 aryl group or a substituted or unsubstituted C2-C20 heteroaryl group.

In an exemplary embodiment of the present specification, Ar101 and Ar102 are the same as or different from each other, and are each independently a C6-C30 aryl group which is unsubstituted or substituted with a C1-C10 alkyl group; or a C2-C30 heteroaryl group which is unsubstituted or substituted with a C6-C20 aryl group.

In an exemplary embodiment of the present specification, at least one or more of Ar101 and Ar102 is or are a substituted or unsubstituted heteroaryl group.

In an exemplary embodiment of the present specification, one of Ar101 and Ar102 is a substituted or unsubstituted heteroaryl group, and the other is a substituted or unsubstituted aryl group.

In an exemplary embodiment of the present specification, at least one or more of Ar101 and Ar102 are a substituted or unsubstituted O-containing heteroaryl group or a substituted or unsubstituted S-containing heteroaryl group.

In an exemplary embodiment of the present specification, one of Ar101 and Ar102 is a substituted or unsubstituted O-containing heteroaryl group or a substituted or unsubstituted S-containing heteroaryl group, and the other is a substituted or unsubstituted aryl group.

In an exemplary embodiment of the present specification, one of Ar101 and Ar102 is an O-containing heteroaryl group which is unsubstituted or substituted with an aryl group, or an S-containing heteroaryl group which is unsubstituted or substituted with an aryl group, and the other is a substituted or unsubstituted aryl group.

In an exemplary embodiment of the present specification, one of Ar101 and Ar102 is a substituted or unsubstituted C2-C20 heteroaryl group, and the other is a substituted or unsubstituted C6-C20 aryl group.

In an exemplary embodiment of the present specification, one of Ar101 and Ar102 is an O-containing C2-C20 heteroaryl group which is unsubstituted or substituted with a C6-C30 aryl group, or an S-containing C2-C20 heteroaryl group which is unsubstituted or substituted with a C6-C30 aryl group, and the other is a C6-C20 aryl group.

When Formula 1 includes a heteroaryl group as Ar1 or Ar2, long service life characteristics of the device are improved compared to the case where both Ar1 and Ar2 are an aryl group.

In an exemplary embodiment of the present specification, Ar101 and Ar102 are the same as or different from each other, and are each independently a substituted or unsubstituted phenyl group, a substituted or unsubstituted biphenyl group, a substituted or unsubstituted terphenyl group, a substituted or unsubstituted naphthyl group, a substituted or unsubstituted fluorenyl group, a substituted or unsubstituted anthracenyl group, a substituted or unsubstituted phenanthrenyl group, a substituted or unsubstituted fluoranthenyl group, a substituted or unsubstituted carbazole group, a substituted or unsubstituted dibenzofuran group, a substituted or unsubstituted dibenzothiophene group, a substituted or unsubstituted naphthobenzofuran group, a substituted or unsubstituted naphthobenzothiophene group, a substituted or unsubstituted benzocarbazole group, a substituted or unsubstituted indole group, a substituted or unsubstituted furan group, a substituted or unsubstituted thiophene group, a substituted or unsubstituted quinoline group, a substituted or unsubstituted pyridine group, a substituted or unsubstituted pyrimidine group, or a substituted or unsubstituted triazine group.

In an exemplary embodiment of the present specification, Ar101 and Ar102 are the same as or different from each other, and are each independently a substituted or unsubstituted phenyl group, a substituted or unsubstituted biphenyl group, a substituted or unsubstituted naphthyl group, a substituted or unsubstituted phenanthrenyl group, a substituted or unsubstituted fluoranthenyl group, a substituted or unsubstituted dibenzofuran group, a substituted or unsubstituted dibenzothiophene group, a substituted or unsubstituted naphthobenzofuran group, a substituted or unsubstituted quinoline group, or a substituted or unsubstituted pyridine group.

In an exemplary embodiment of the present specification, Ar101 and Ar102 are the same as or different from each other, and are each independently a phenyl group, a biphenyl group, a naphthyl group, a phenanthrenyl group, a fluoranthenyl group, a dibenzofuran group, a dibenzothiophene group, a naphthobenzofuran group, a quinoline group, or pyridine group.

In an exemplary embodiment of the present specification, at least one or more of Ar101 and Ar102 are a substituted or unsubstituted dibenzofuran group, a substituted or unsubstituted dibenzothiophene group, a substituted or unsubstituted naphthobenzofuran group, a substituted or unsubstituted quinoline group, or a substituted or unsubstituted pyridine group.

In an exemplary embodiment of the present specification, at least one or more of Ar101 and Ar102 are a substituted or unsubstituted dibenzofuran group, a substituted or unsubstituted dibenzothiophene group, or a substituted or unsubstituted naphthobenzofuran group.

In an exemplary embodiment of the present specification, one of Ar101 and Ar102 is a dibenzofuran group, a dibenzothiophene group, a naphthobenzofuran group, a quinoline group, or a pyridine group, and the other is a phenyl group, a biphenyl group, a naphthyl group, a phenanthrenyl group, or a fluoranthenyl group.

In an exemplary embodiment of the present specification, Ar101 is bonded to R11 to form a substituted or unsubstituted ring.

In an exemplary embodiment of the present specification, Ar101 is bonded to R18 to form a substituted or unsubstituted ring.

In an exemplary embodiment of the present specification, Ar102 is bonded to R14 to form a substituted or unsubstituted ring.

In an exemplary embodiment of the present specification, Ar102 is bonded to R15 to form a substituted or unsubstituted ring.

In an exemplary embodiment of the present specification, Ar101 is bonded to R11 to form a pentagonal ring.

In an exemplary embodiment of the present specification, Ar101 is bonded to R18 to form a pentagonal ring.

In an exemplary embodiment of the present specification, Ar102 is bonded to R14 to form a pentagonal ring.

In an exemplary embodiment of the present specification, Ar102 is bonded to R15 to form a pentagonal ring.

In an exemplary embodiment of the present specification, Ar101 is 40% or more, 50% or more, 60% or more, 70% or more, 80% or more, 90% or more, or 100% deuterated.

In an exemplary embodiment of the present specification, Ar102 is 40% or more, 50% or more, 60% or more, 70% or more, 80% or more, 90% or more, or 100% deuterated.

In an exemplary embodiment of the present specification, m1 and m2 are an integer from 0 to 5, and when m1 is 2 or higher, the L101s are the same as or different from each other, and when m2 is 2 or higher, the L102s are the same as or different from each other.

In an exemplary embodiment of the present specification, m1 is 0, 1, or 2.

In an exemplary embodiment of the present specification, m2 is 0, 1, or 2.

In an exemplary embodiment of the present specification, m1 is 0 or 1.

In an exemplary embodiment of the present specification, m2 is 0 or 1.

In an exemplary embodiment of the present specification, $-(L101)_{m1}$-Ar101 and $-(L102)_{m2}$-Ar102 of Formula 1 are different from each other.

In an exemplary embodiment of the present specification, the compound of Formula 1 is any one selected from the following Compounds M1 to M34:

Compound M1

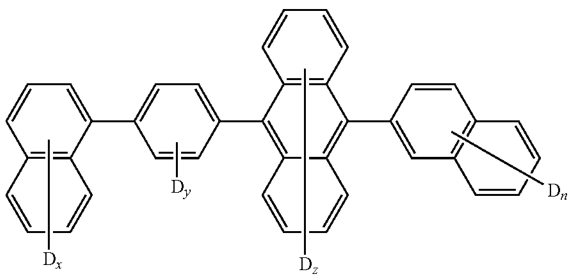

wherein in Compound M1, a value of x+y+z+n is 20 to 26;

Compound M2

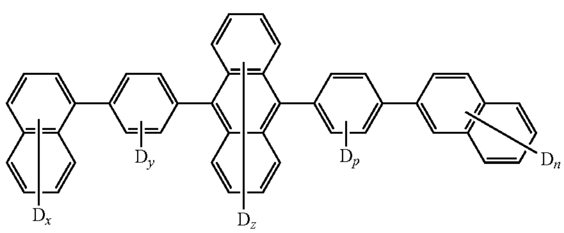

wherein in Compound M2, a value of x+y+z+p+n is 24 to 30;

Compound M3

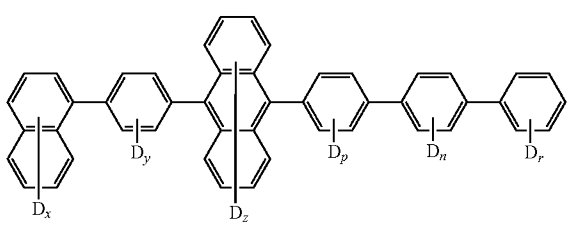

wherein in Compound M3, a value of x+y+z+p+n+r is 26 to 32;

Compound M4

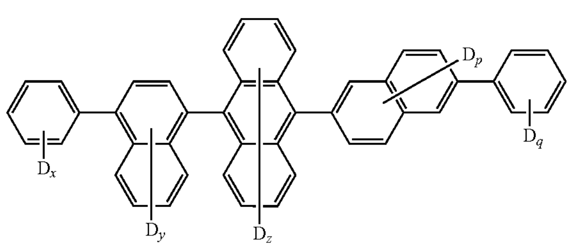

wherein in Compound M4, a value of x+y+z+q+p is 22 to 30;

Compound M5

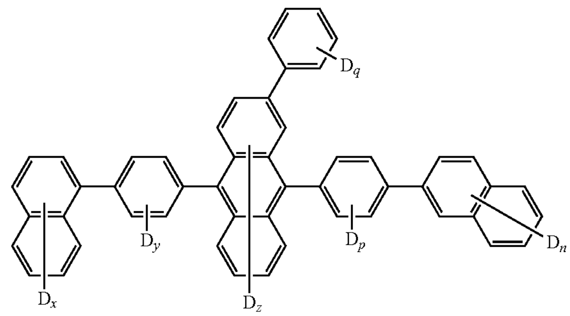

wherein in Compound M5, a value of x+y+z+p+n+q is 28 to 34;

Compound M6

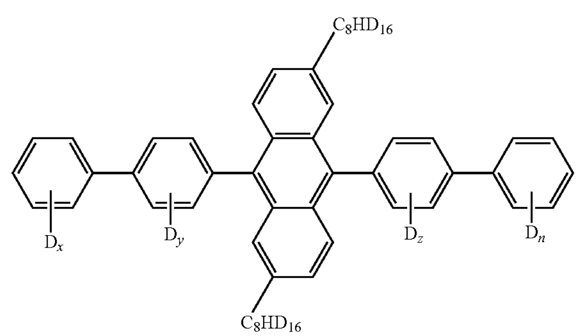

wherein in Compound M6, a value of x+y+z+n is 14 to 18;

Compound M7

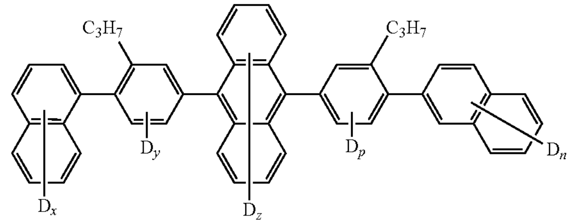

wherein in Compound M7, a value of x+y+z+p+n is 22 to 28;

Compound M8

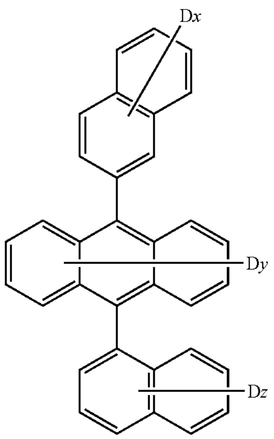

wherein in Compound M8, a value of x+y+z is 16 to 22;

Compound M9

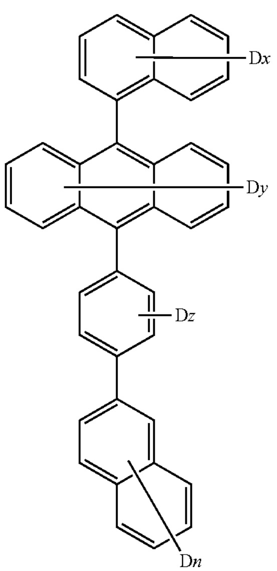

wherein in Compound M9, a value of x+y+z+n is 20 to 26;

Compound M10

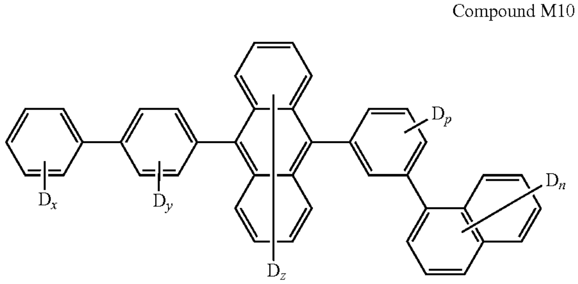

wherein in Compound M10, a value of x+y+z+p+n is 22 to 28;

Compound M11

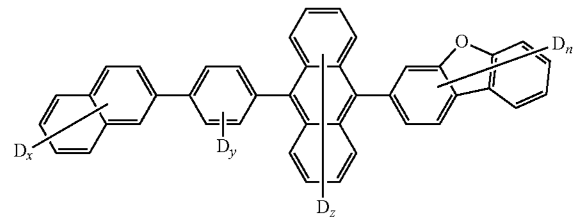

wherein in Compound M11, a value of x+y+z+n is 20 to 26;

Compound M12

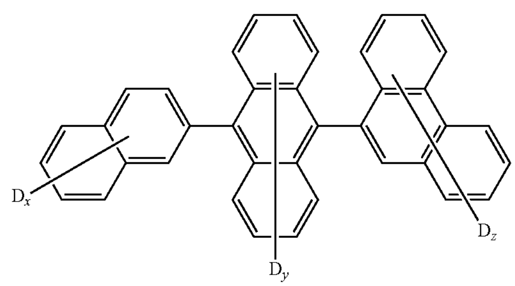

wherein in Compound M12, a value of x+y+z is 18 to 24.

Compound M13

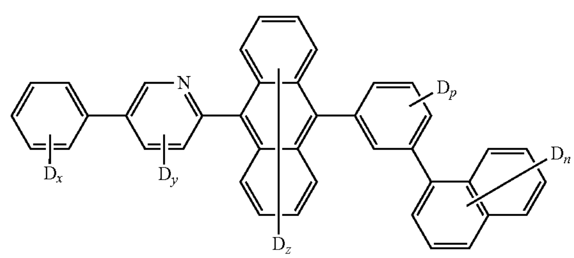

wherein in Compound M13, a value of x+y+z+p+n is 21 to 27;

Compound M14

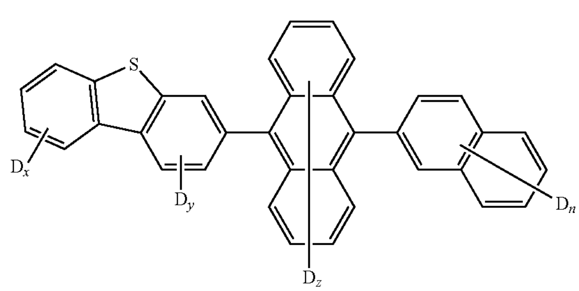

wherein in Compound M14, a value of x+y+z+n is 16 to 22;

Compound M15

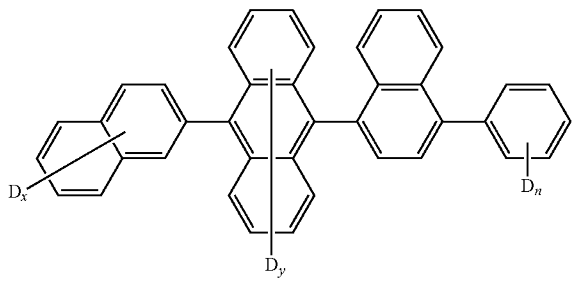

wherein in Compound M15, a value of x+y+z+n is 20 to 26;

Compound M16

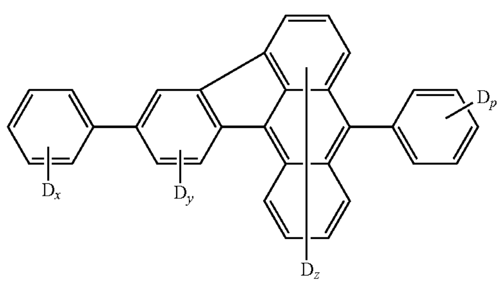

wherein in Compound M16, a value of x+y+z+p is 14 to 20;

Compound M17

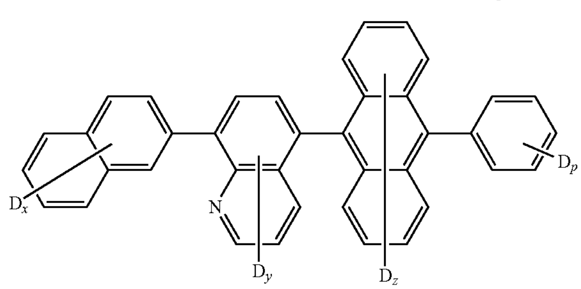

wherein in Compound M17, a value of x+y+z+p is 19 to 25;

Compound M18

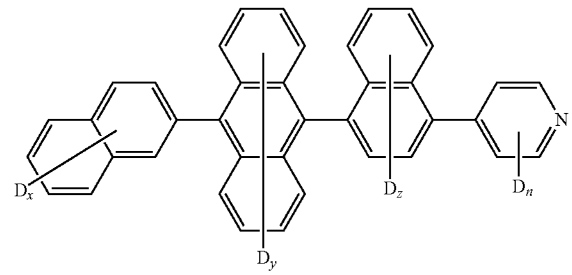

wherein in Compound M18, a value of x+y+z+n is 19 to 25;

Compound M19

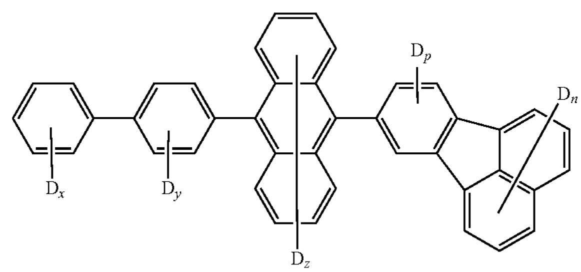

wherein in Compound M19, a value of x+y+z+p+n is 20 to 26;

Compound M20

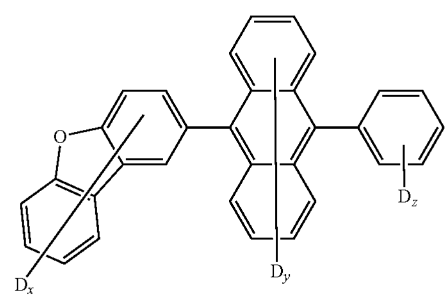

wherein in Compound M20, a value of x+y+z is 14 to 20;

Compound M21

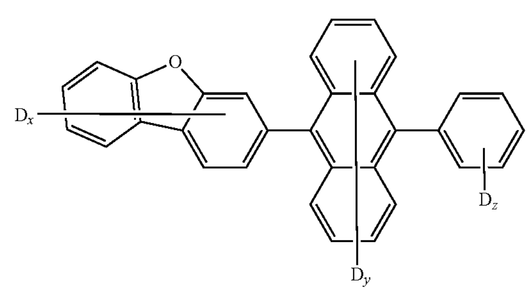

wherein in Compound M21, a value of x+y+z is 14 to 20;
Compound M22
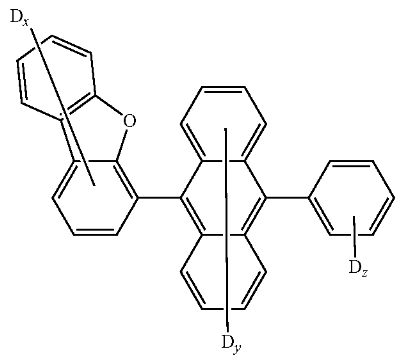
wherein in Compound M22, a value of x+y+z is 14 to 20;
Compound M23
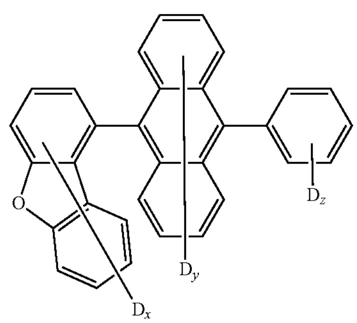
wherein in Compound M23, a value of x+y+z is 14 to 20;
Compound M24
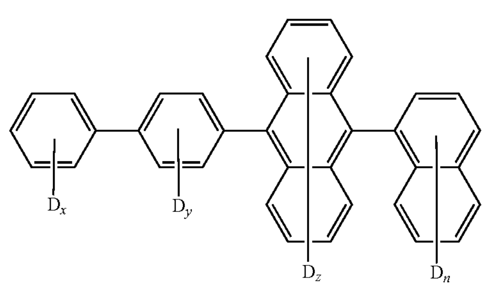
wherein in Compound M24, a value of x+y+z+n is 18 to 24;
Compound M25
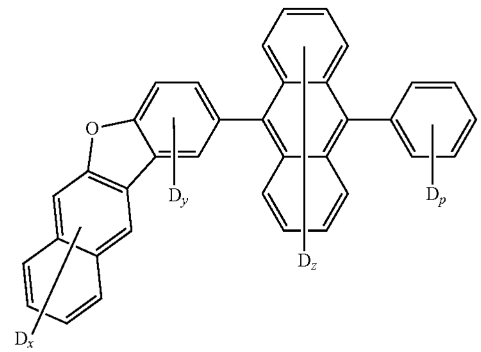
wherein in Compound M25, a value of x+y+z+p is 16 to 22;
Compound M26
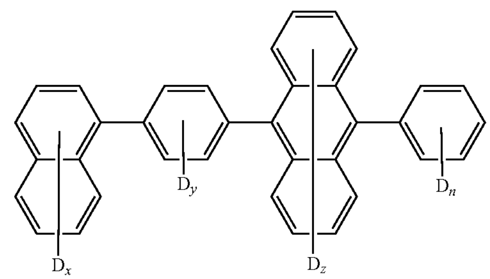
wherein in Compound M26, a value of x+y+z+n is 12 to 24;
Compound M27
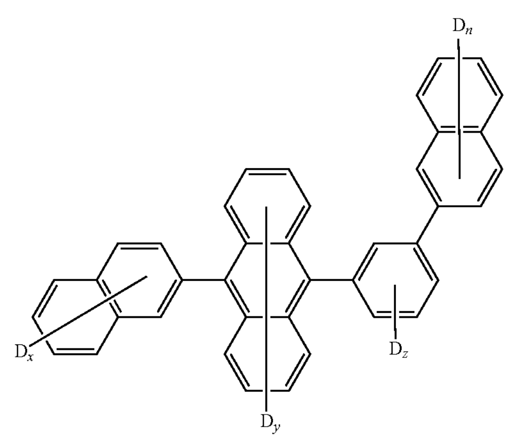

wherein in Compound M27, a value of x+y+z+n is 13 to 26;
Compound M28
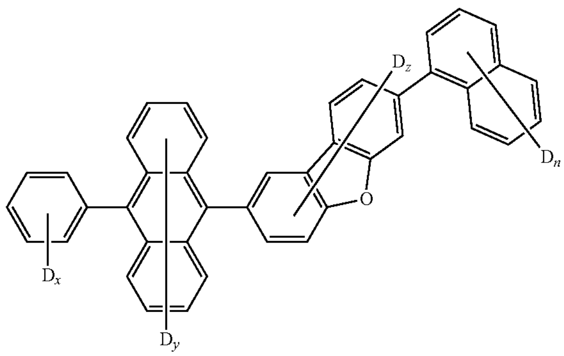
wherein in Compound M28, a value of x+y+z+n is 16 to 22;
Compound M29
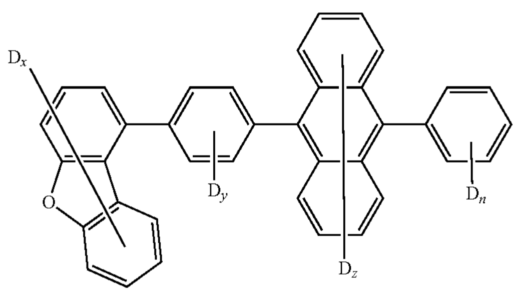
wherein in Compound M29, a value of x+y+z+n is 12 to 24;
Compound M30
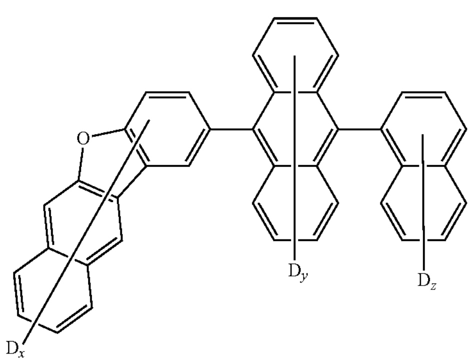
wherein in Compound M30, a value of x+y+z is 12 to 24;
Compound M31
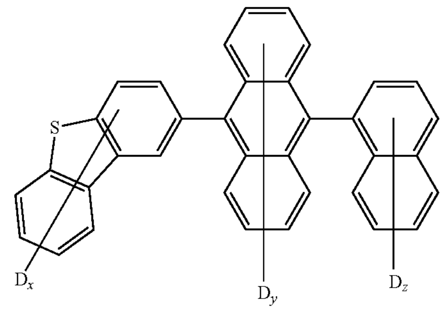
wherein in Compound M31, a value of x+y+z is 11 to 22;
Compound M32
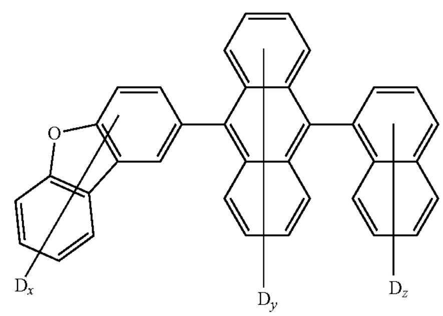
wherein in Compound M32, a value of x+y+z is 11 to 22;
Compound M33
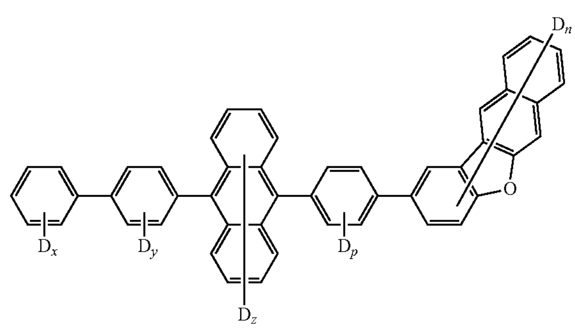

wherein in Compound M33, a value of x+y+z+p+n is 15 to 30;

Compound M34

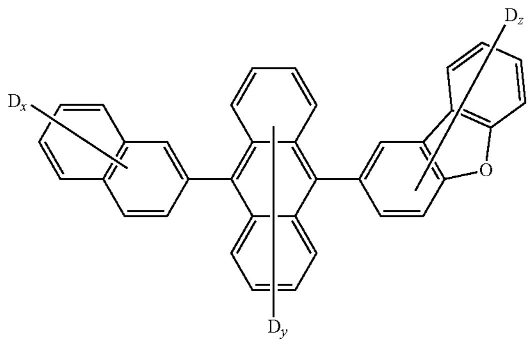

wherein in Compound M34, a value of x+y+z is 11 to 22.

In Compounds M1 to M34, x to z, n, and p mean the number of deuteriums to be substituted. In an exemplary embodiment, Compounds M1 to M34 are each at least 40% or more deuterated. In an exemplary embodiment, Compounds M1 to M34 are each at least 50% or more deuterated. In an exemplary embodiment, Compounds M1 to M34 are each at least 60% or more deuterated. In an exemplary embodiment, Compounds M1 to M34 are each at least 70% or more deuterated. In an exemplary embodiment, Compounds M1 to M34 are each at least 80% or more deuterated. In an exemplary embodiment, Compounds M1 to M34 are each at least 90% or more deuterated. In an exemplary embodiment, Compounds M1 to M34 are each 100% or more deuterated.

In an exemplary embodiment of the present specification, the compound of Formula 1 is any one compound selected from the following compounds.

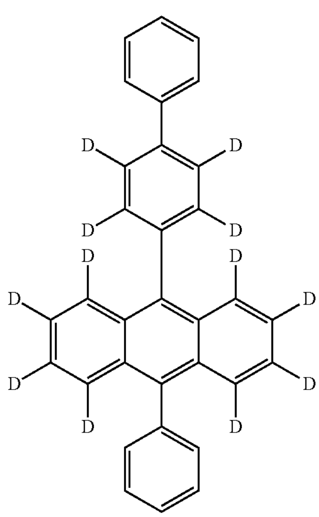

-continued

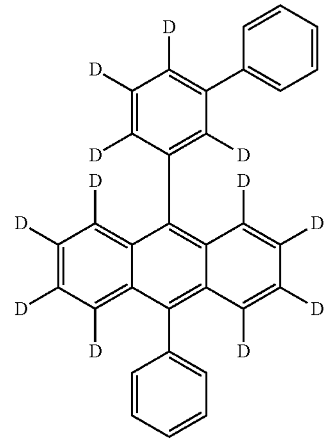

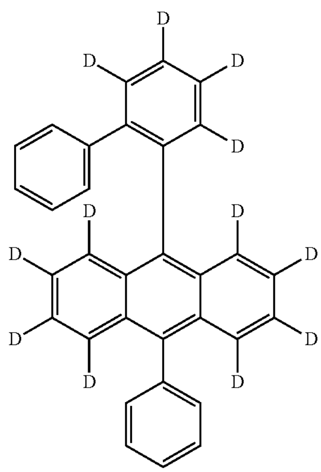

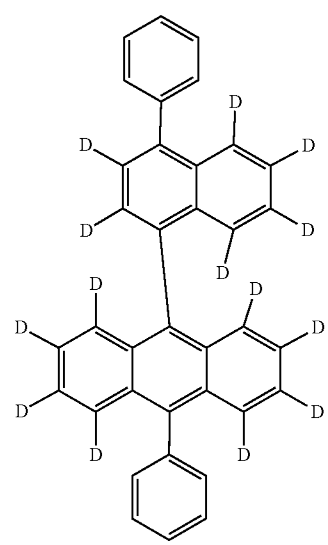

-continued
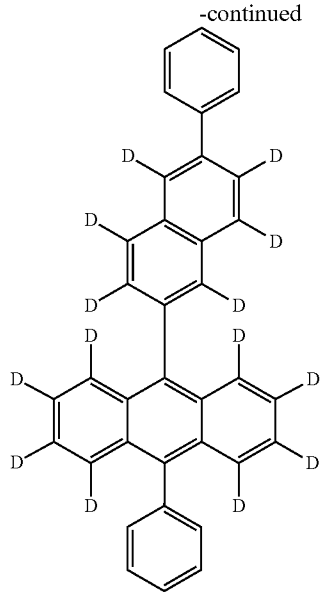
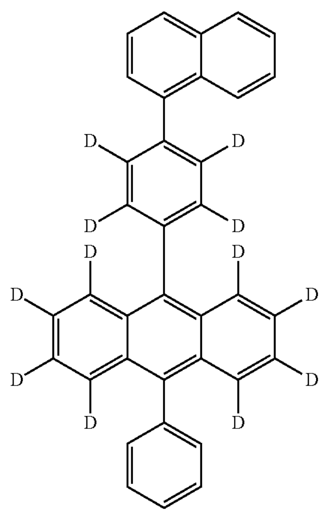
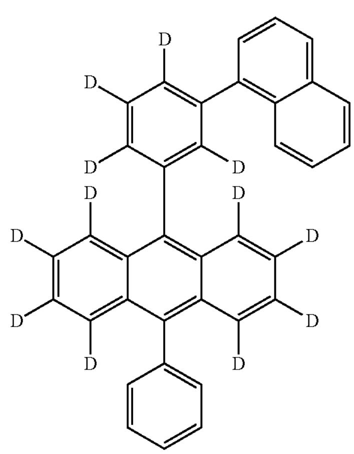
-continued
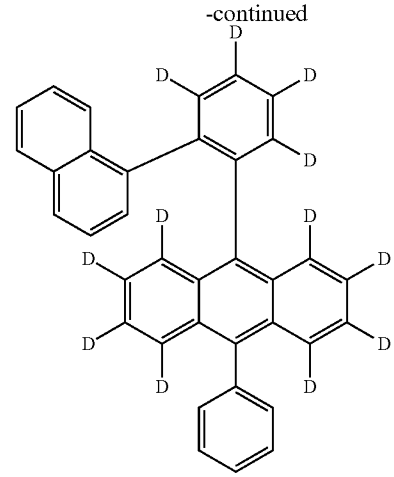
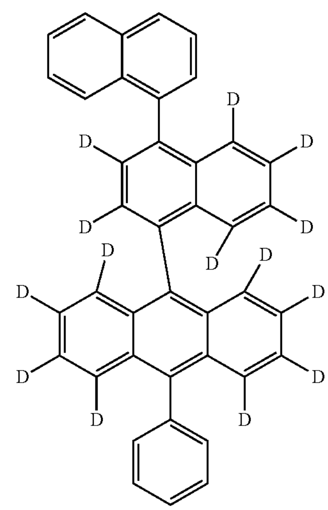
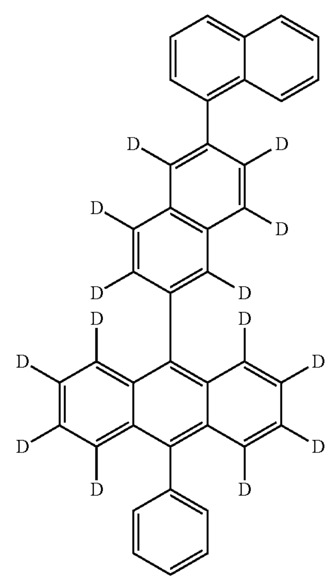

-continued
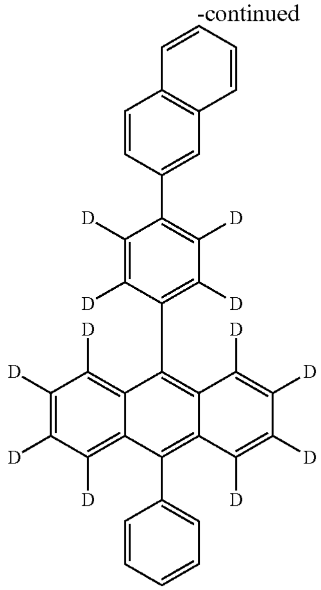
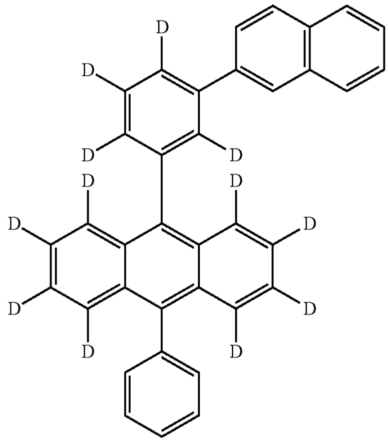
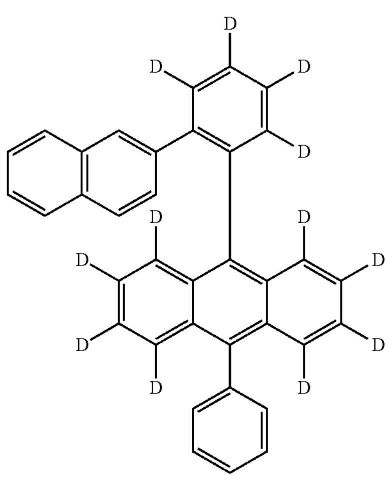
-continued
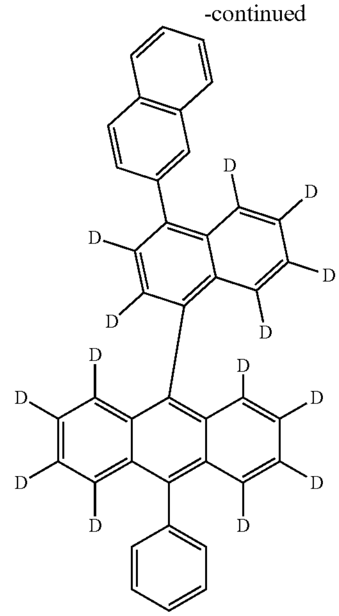
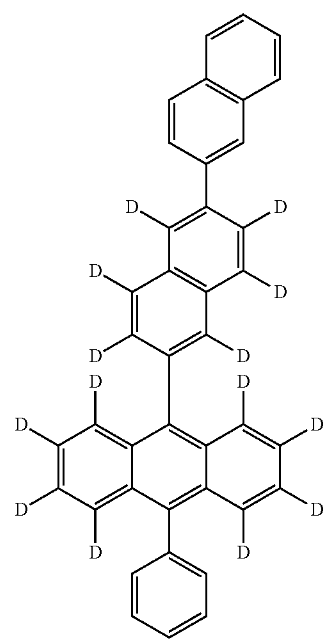

-continued
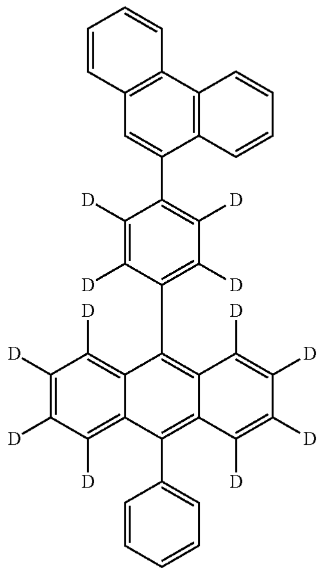
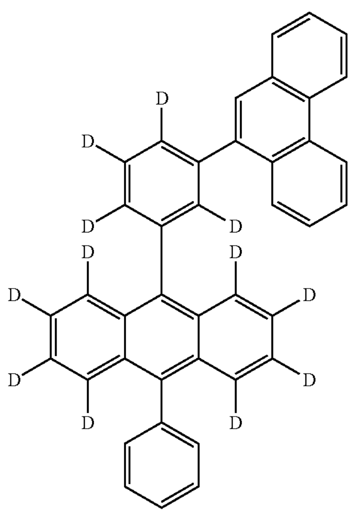
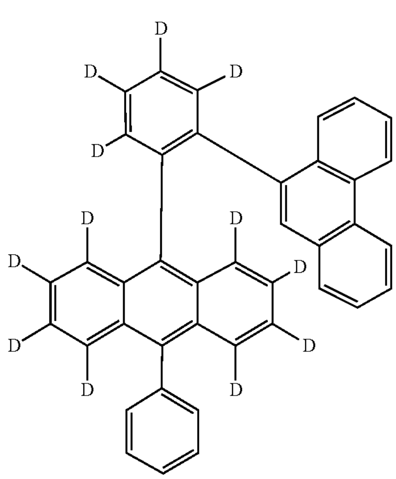
-continued
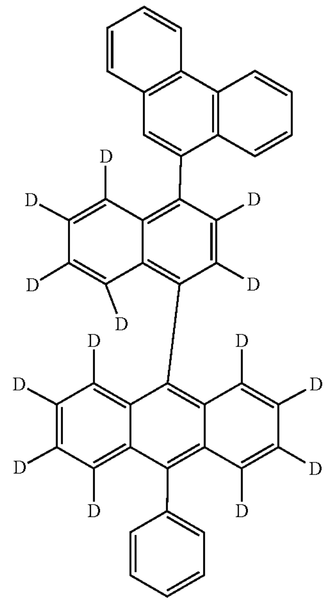
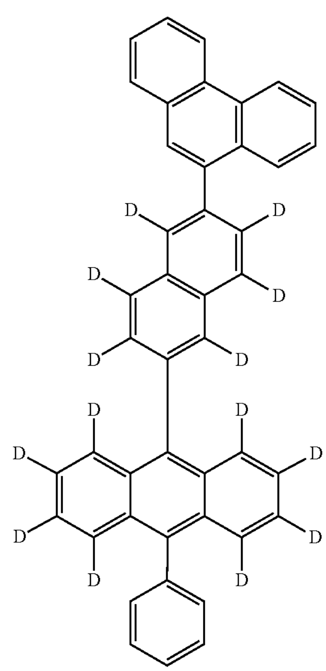

-continued
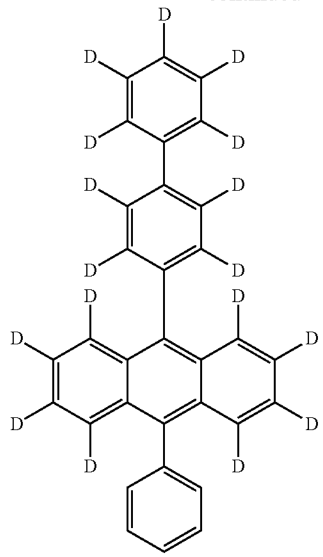
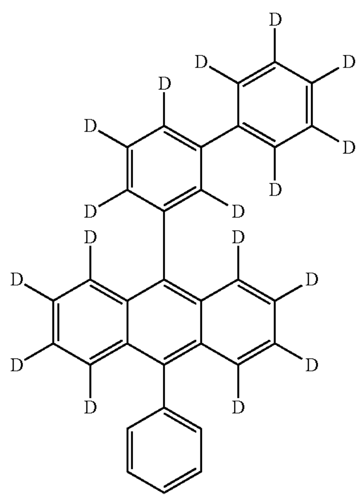
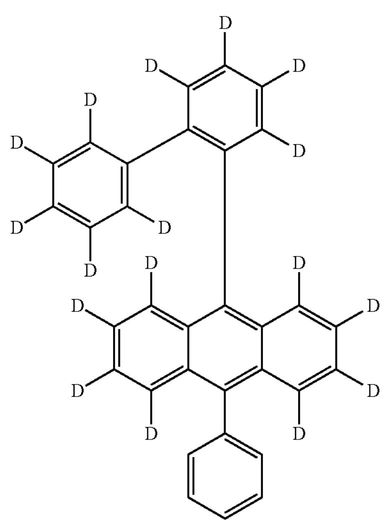
-continued
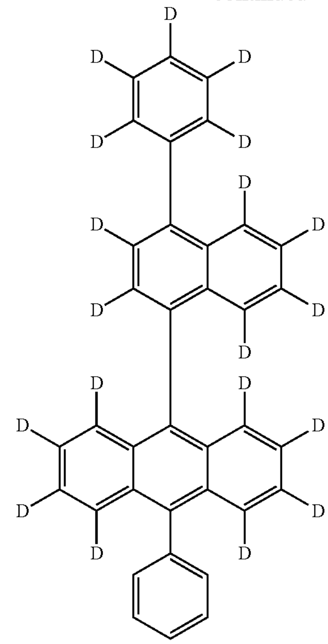
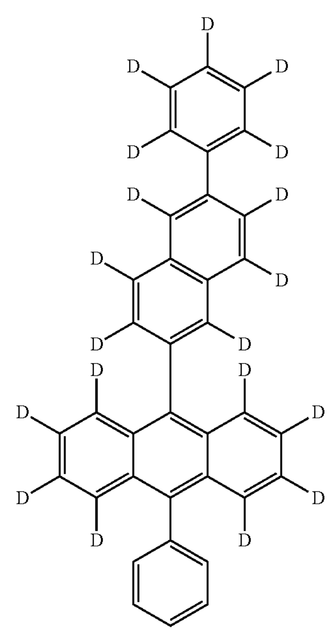

-continued
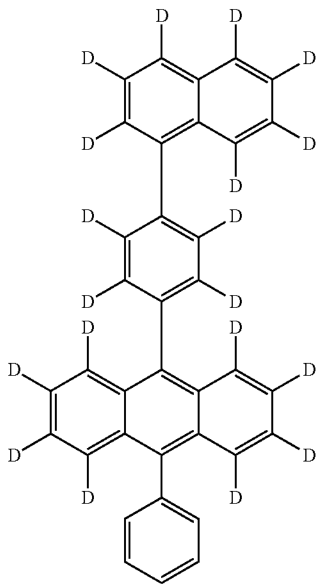
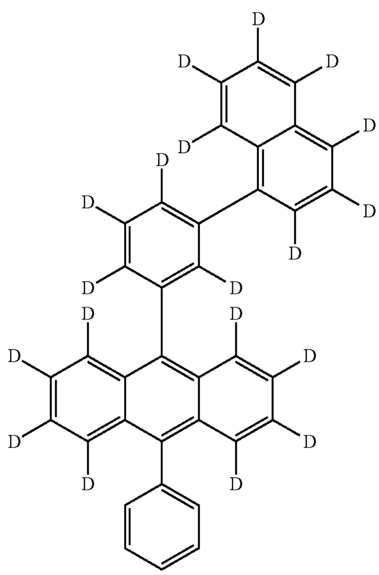
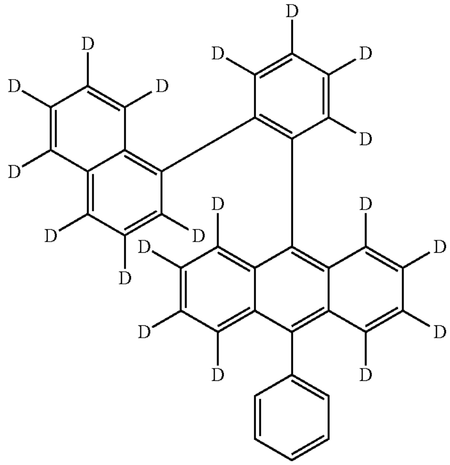
-continued
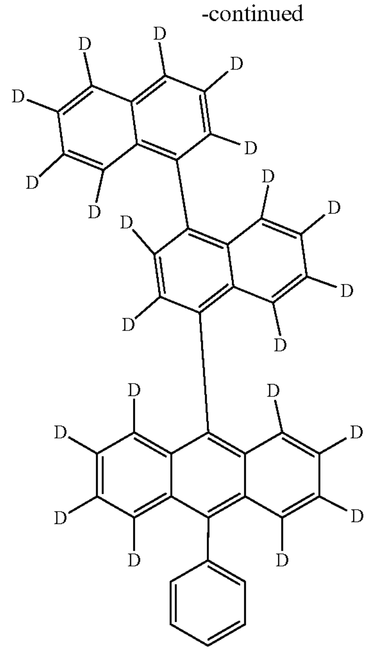
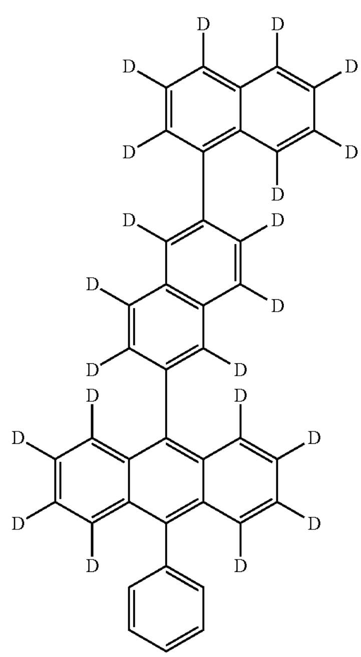

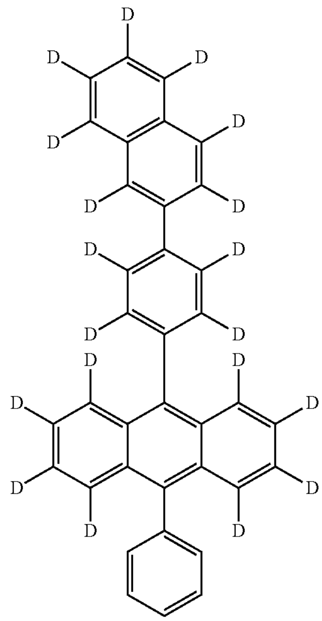
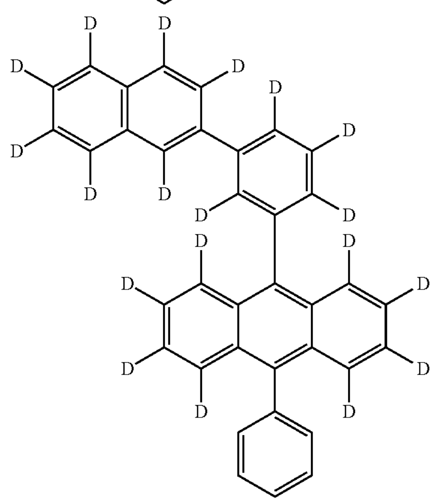
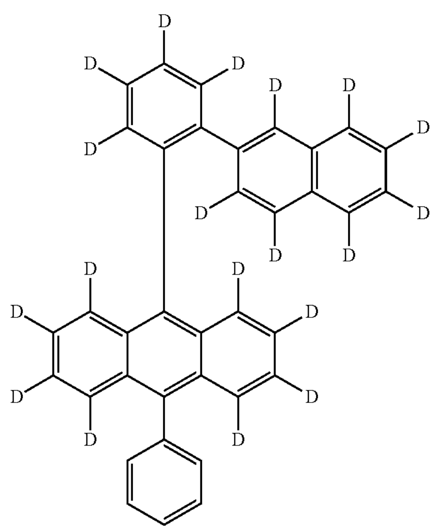
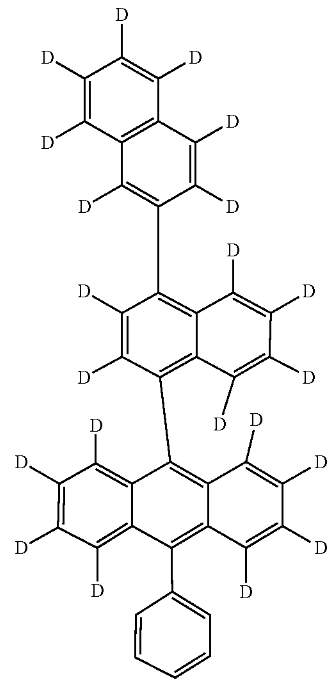
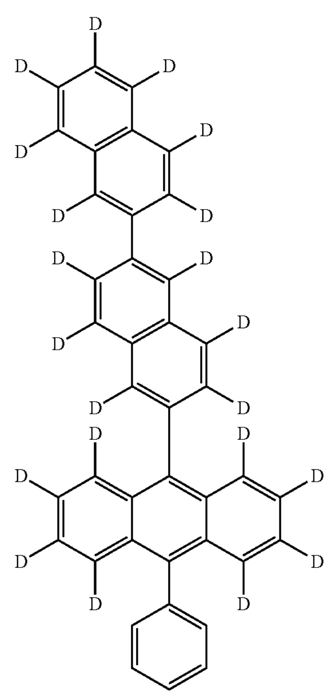

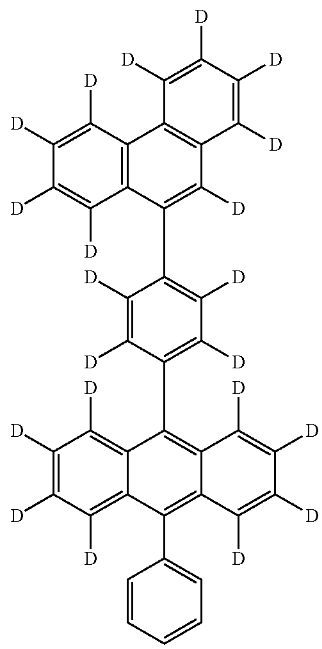
D
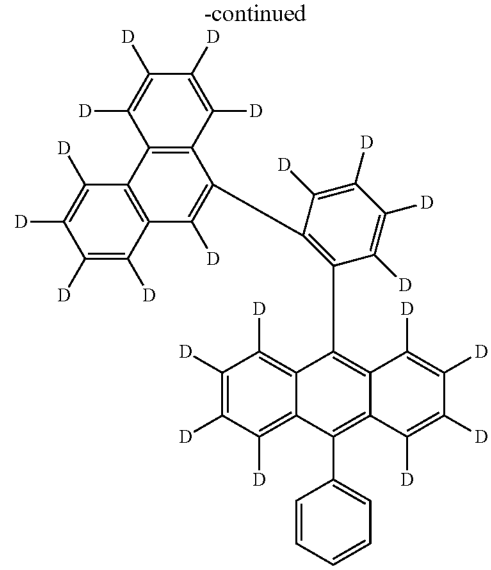
D
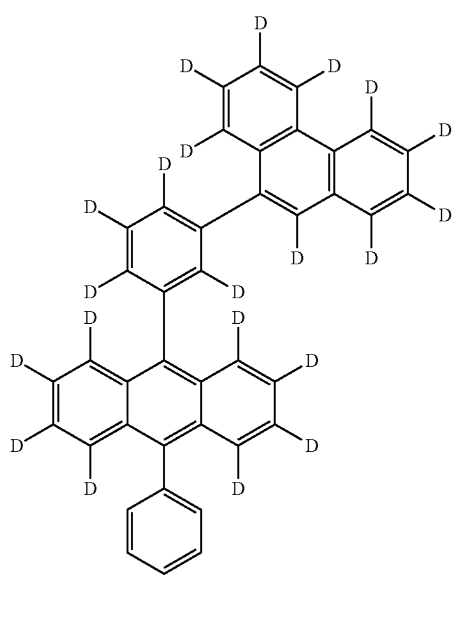
D
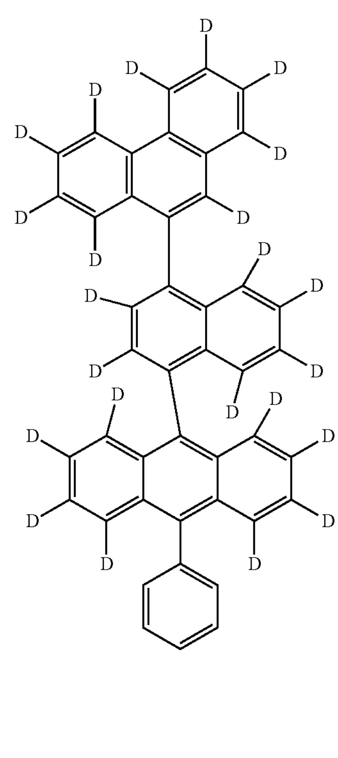
D

-continued
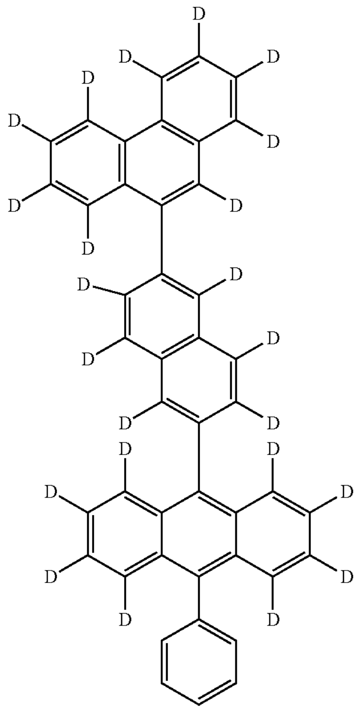
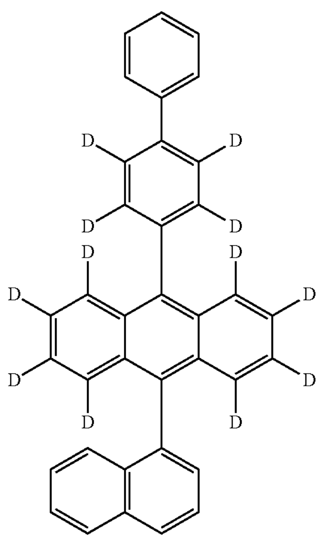
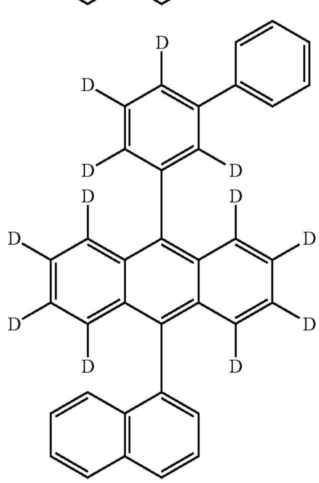
-continued
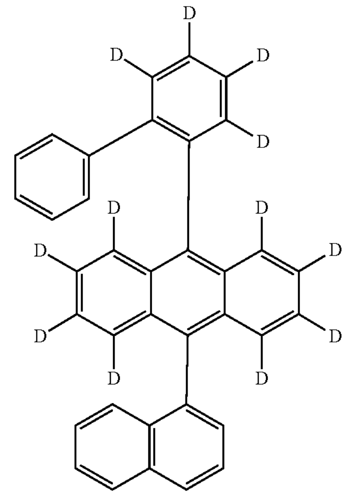
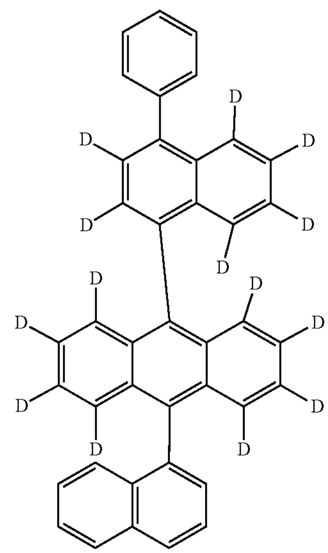
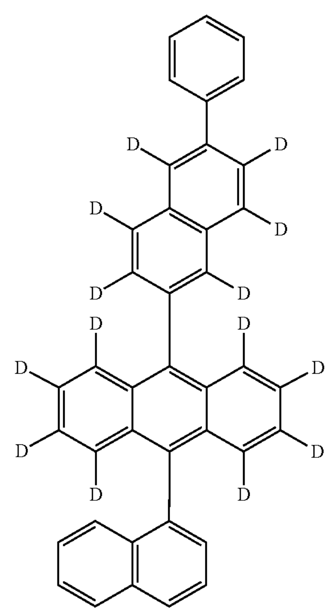

-continued
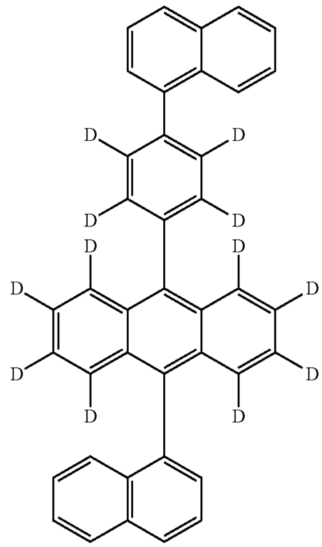
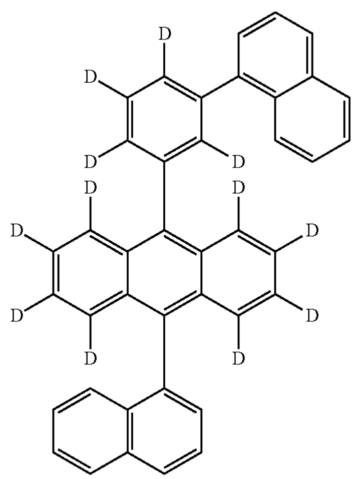
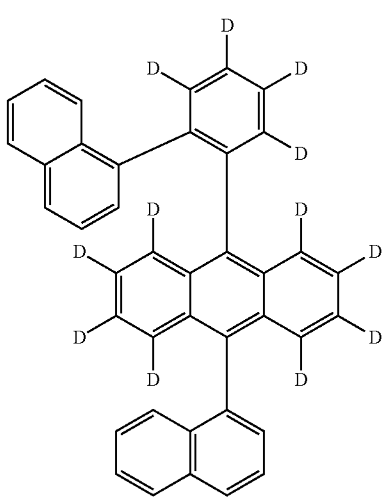
-continued
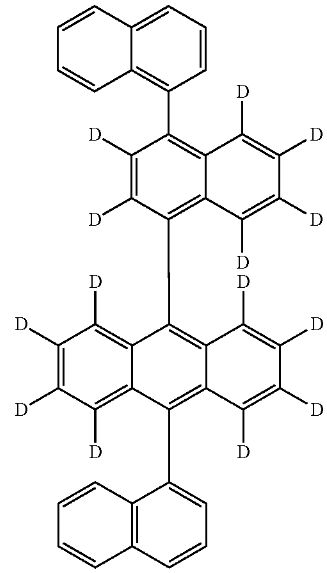
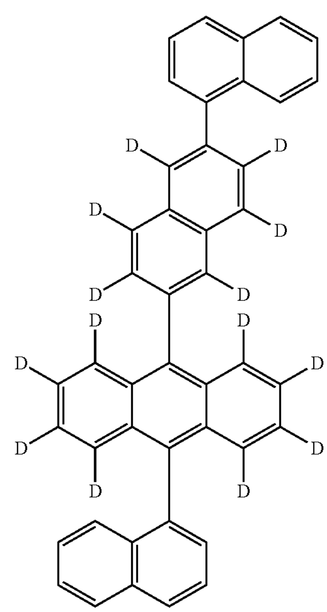

-continued
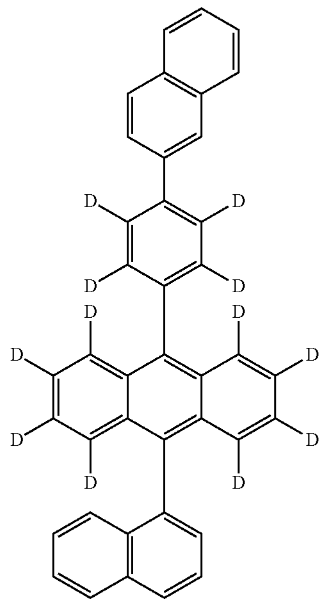
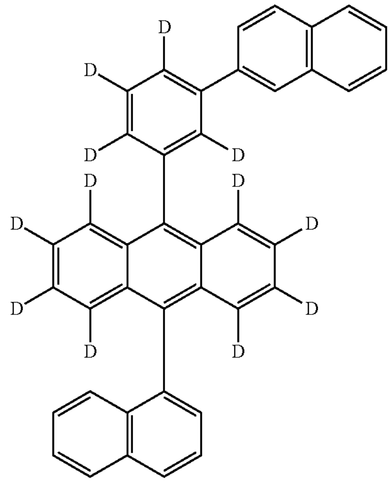
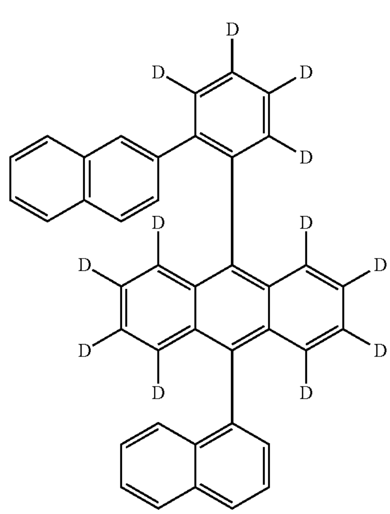
-continued
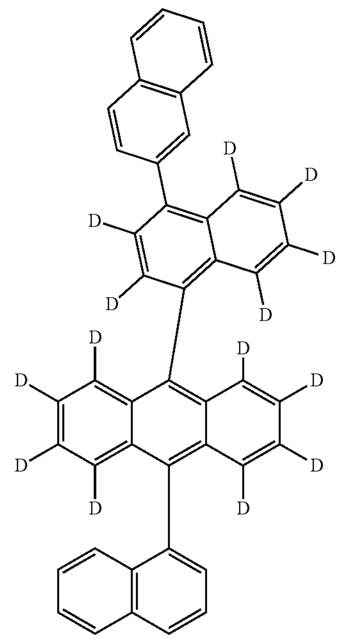
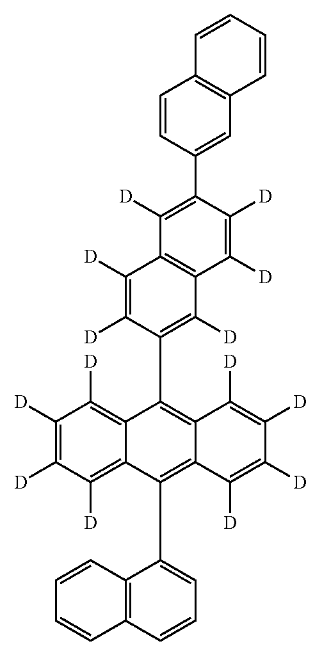

-continued
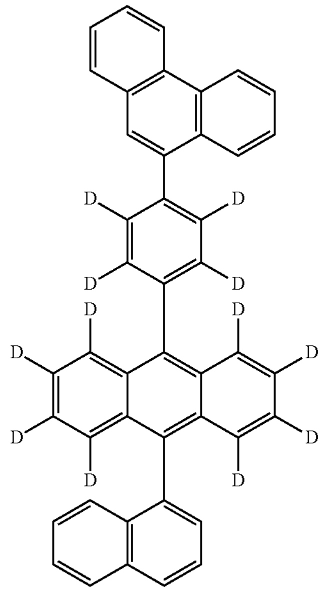
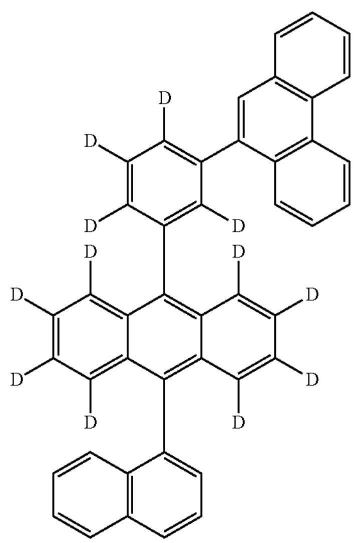
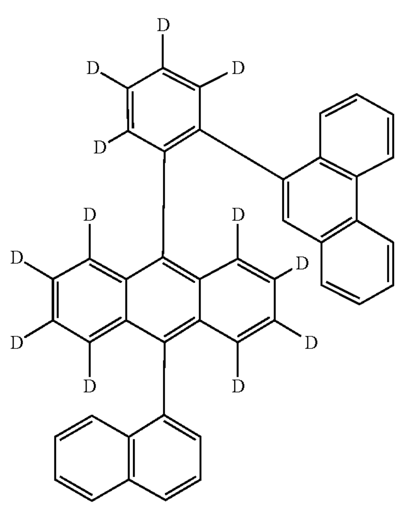
-continued
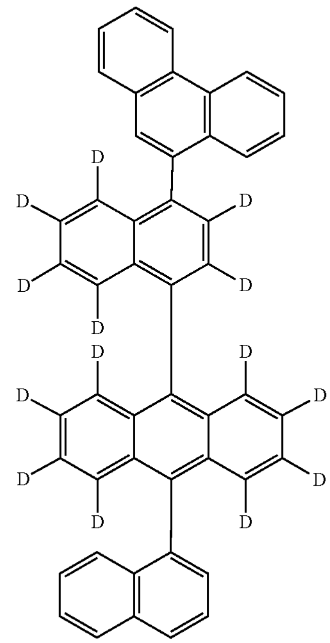
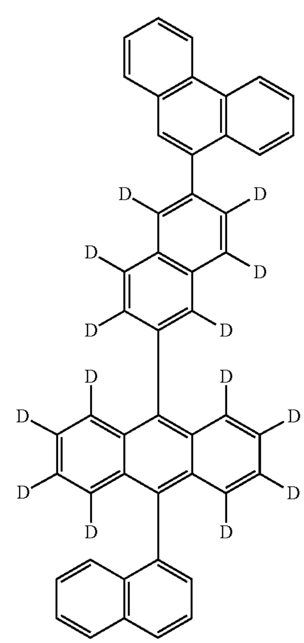

-continued
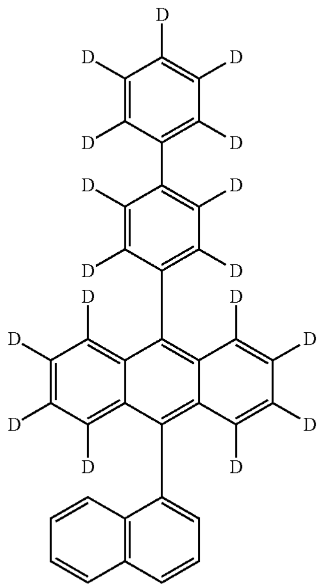
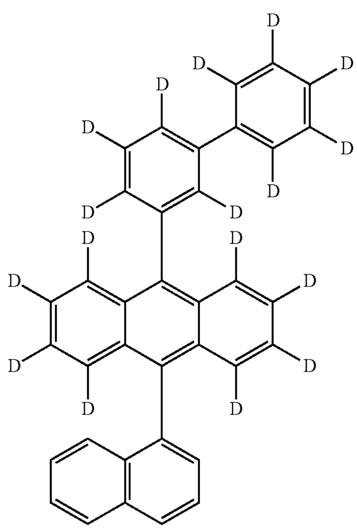
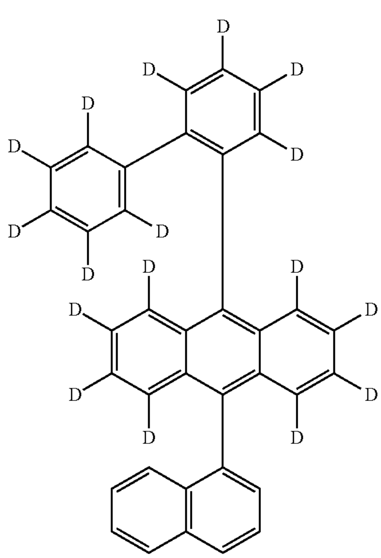
-continued
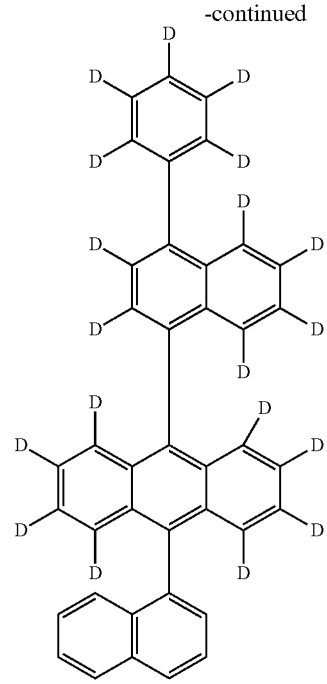
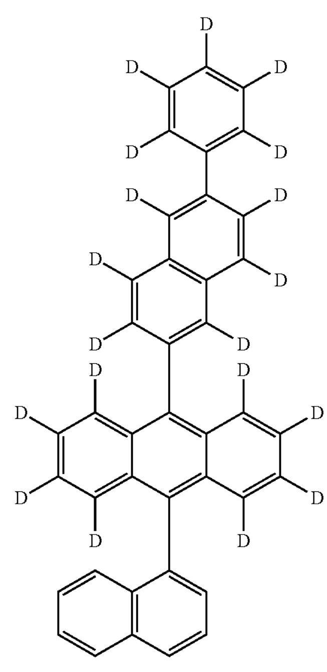

-continued
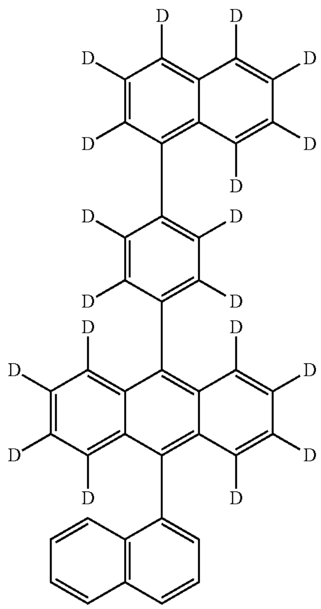
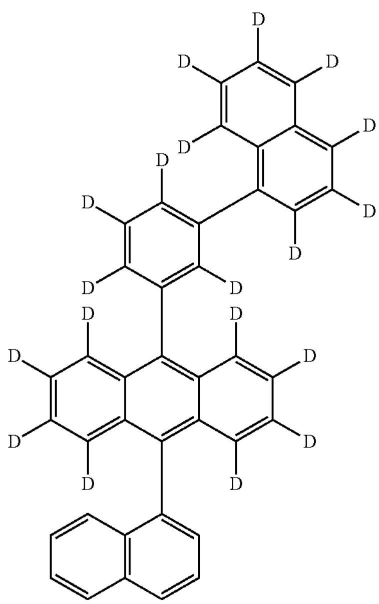
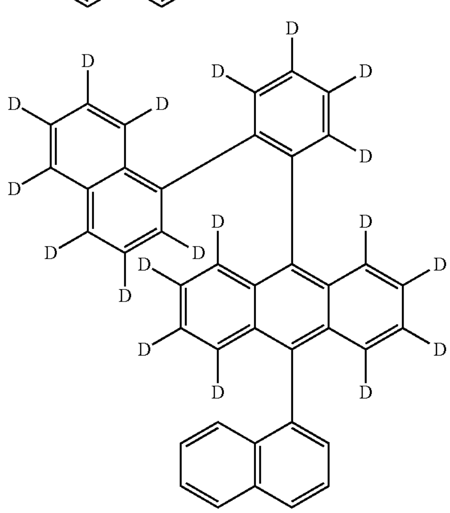
-continued
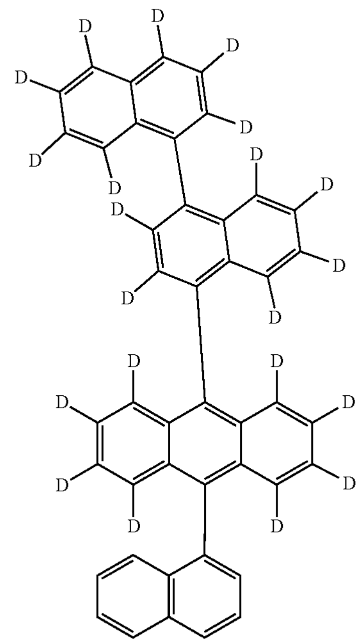
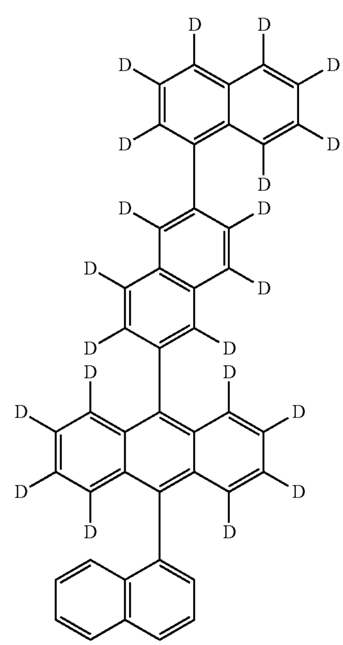

-continued
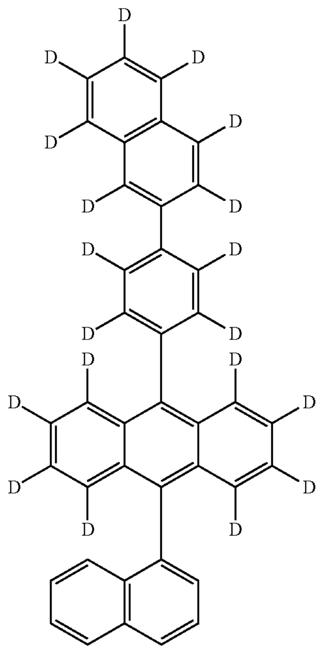
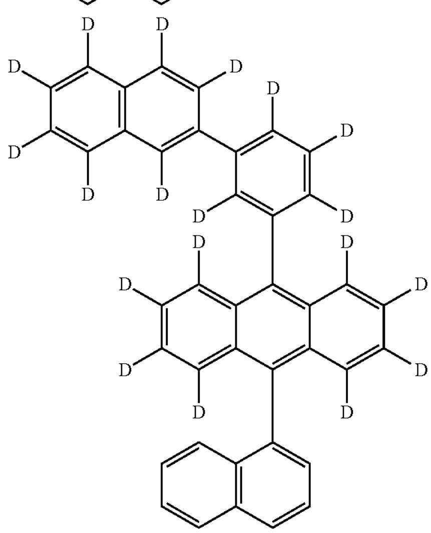
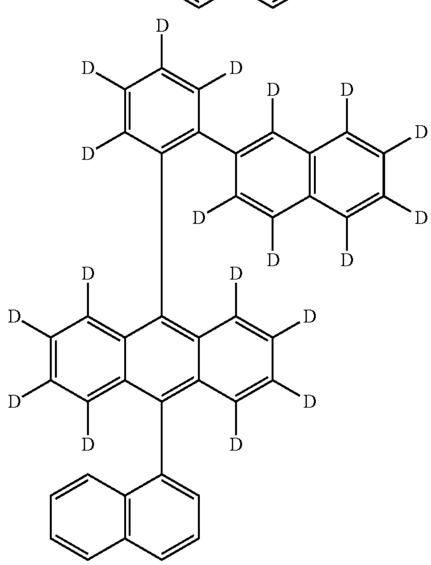
-continued
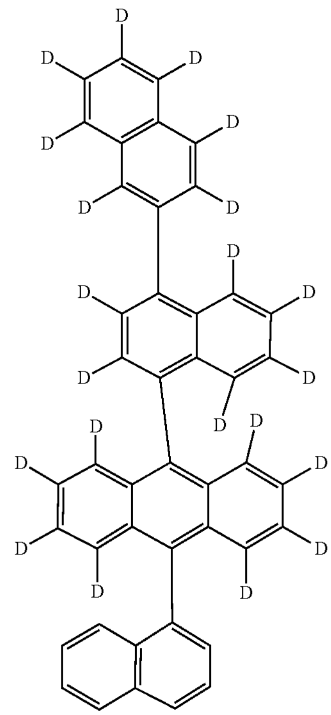
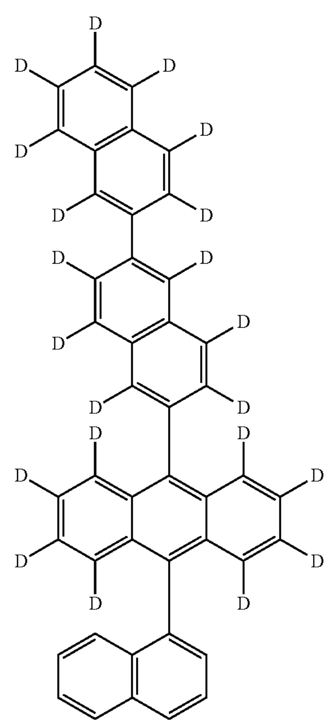

-continued
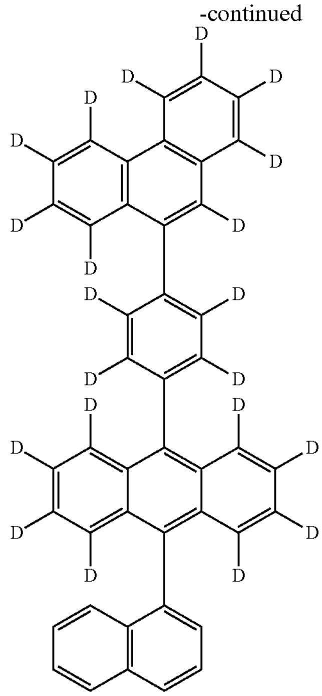
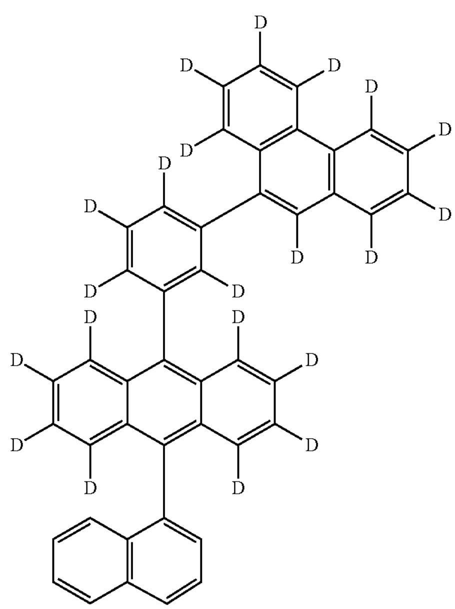
-continued
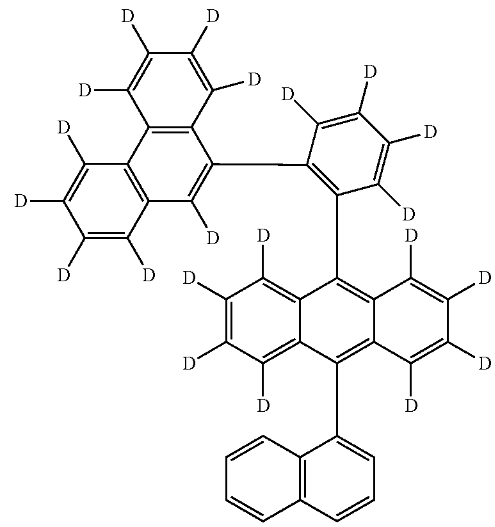
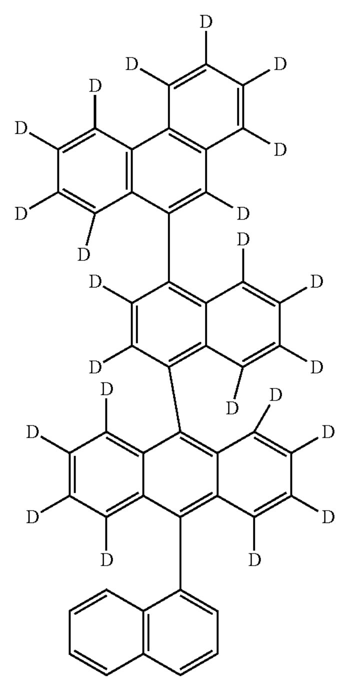

-continued
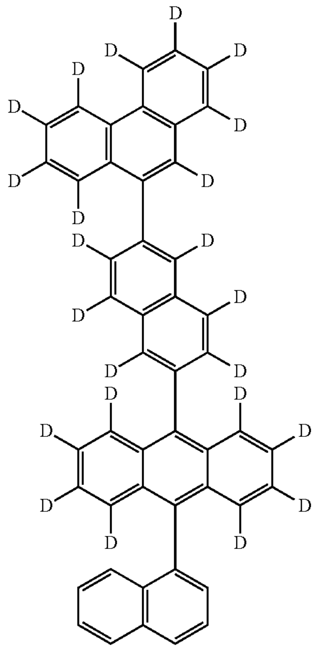
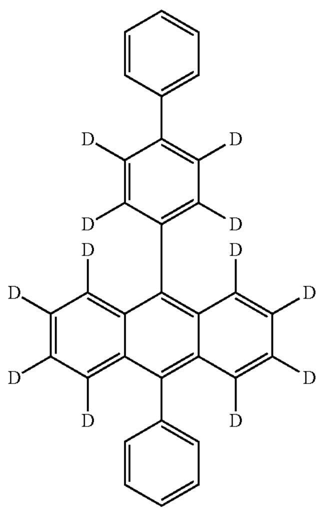
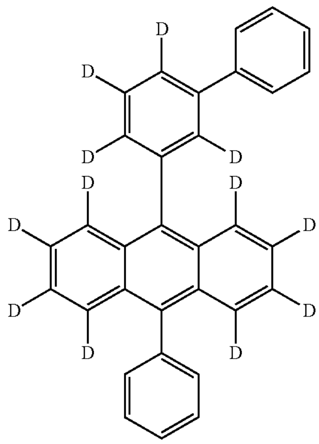
-continued
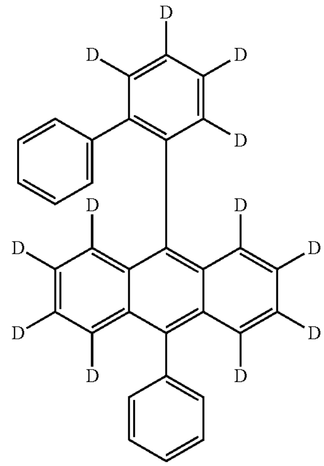
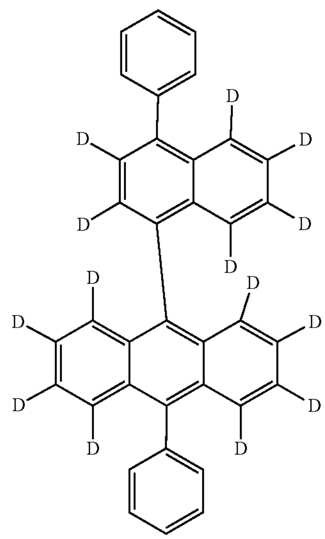
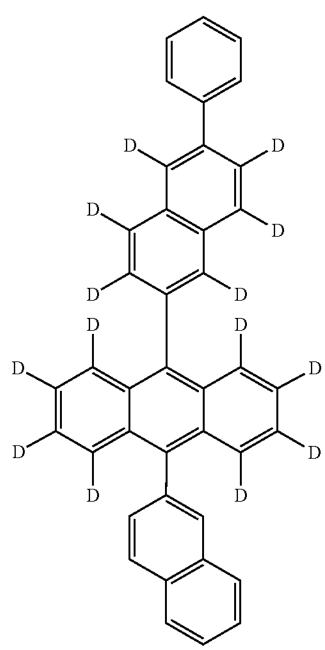

-continued
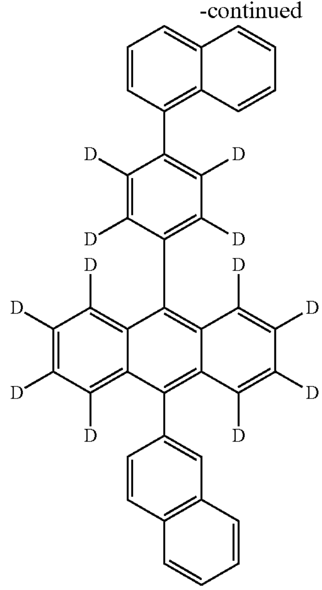
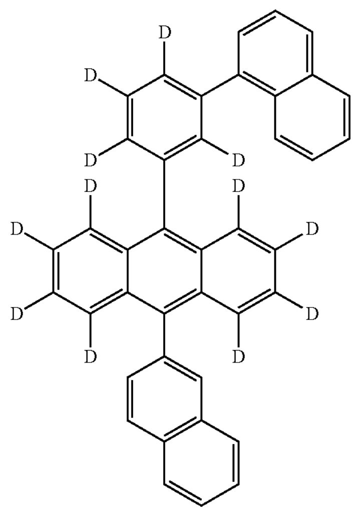
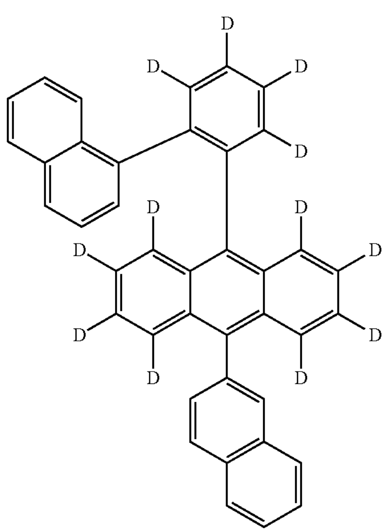
-continued
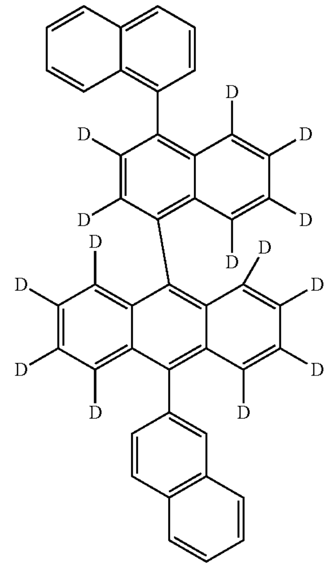
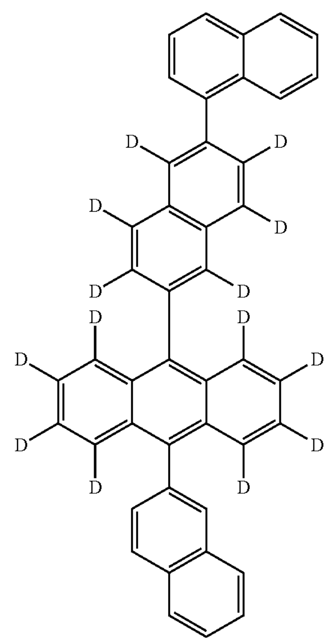

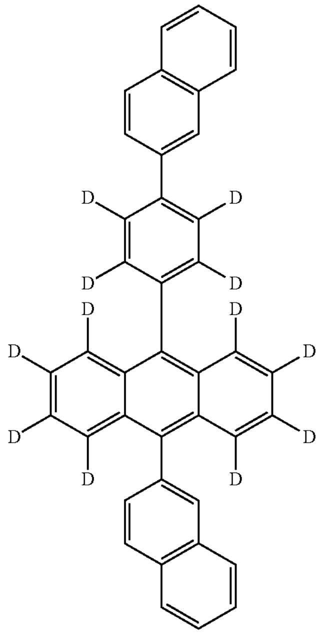
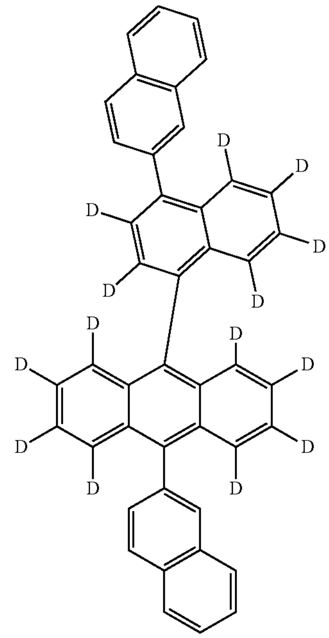
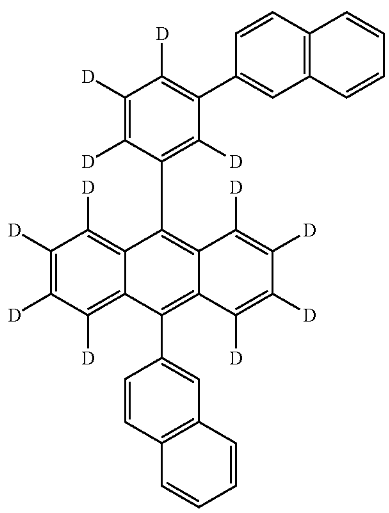
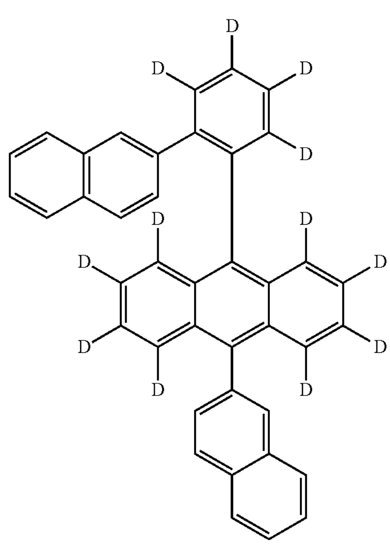
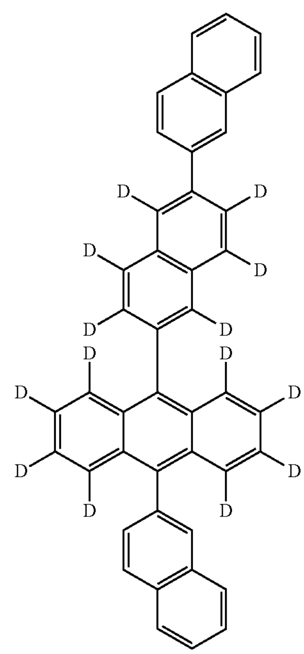

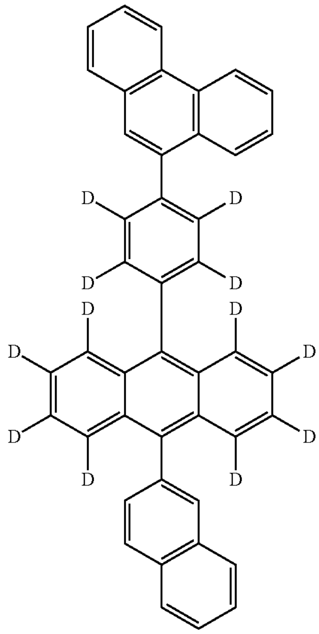
D
D
D
D
D
D
D
D
D
D
D
D
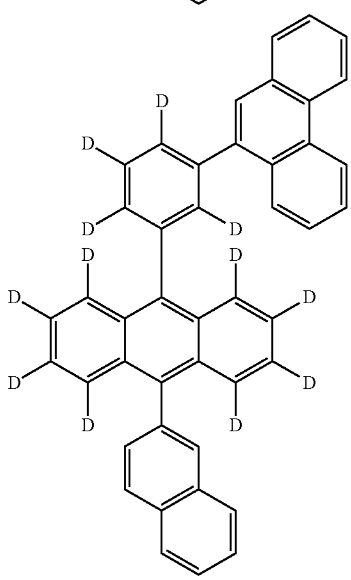
D
D
D
D
D
D
D
D
D
D
D
D
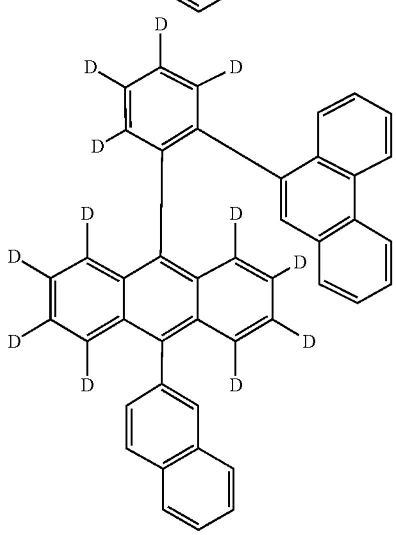
D
D
D
D
D
D
D
D
D
D
D
D
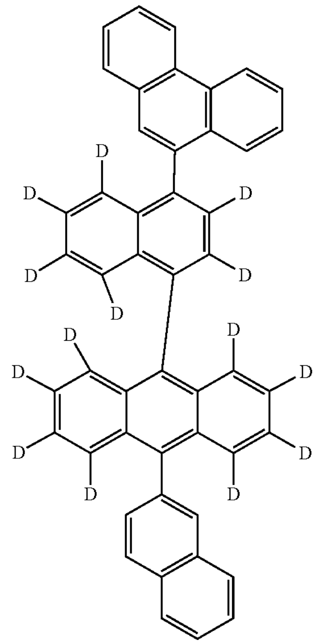
D
D
D
D
D
D
D
D
D
D
D
D
D
D
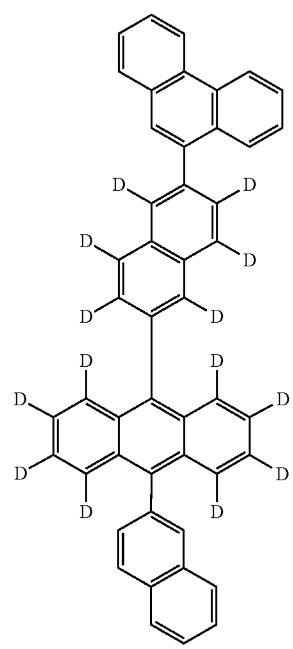
D
D
D
D
D
D
D
D
D
D
D
D
D
D -continued
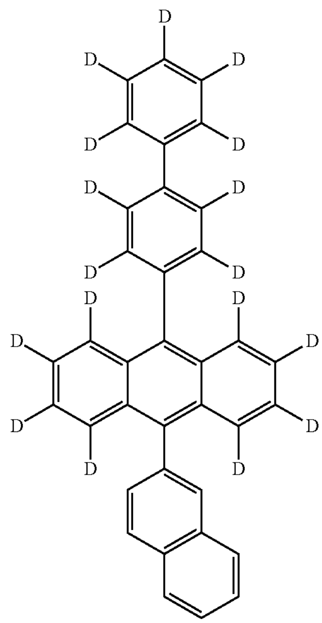
-continued
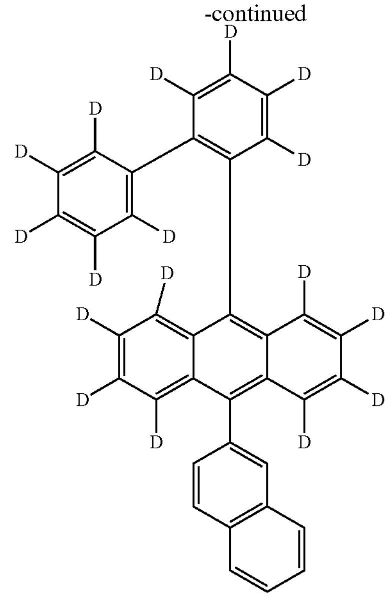
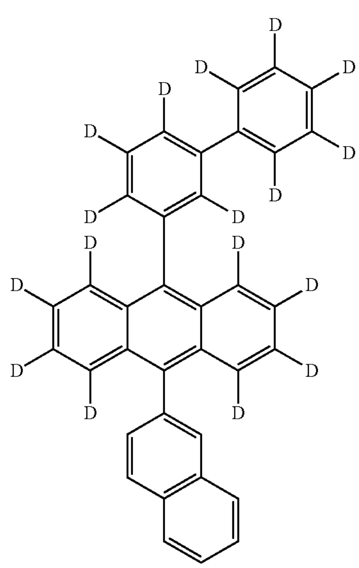
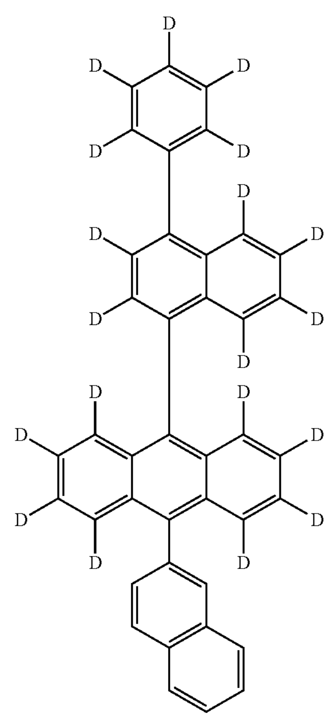

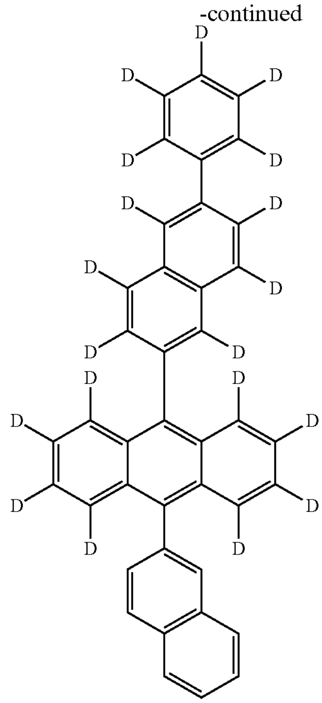
D
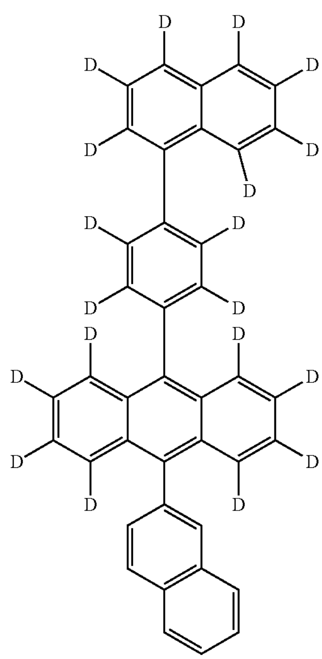
D
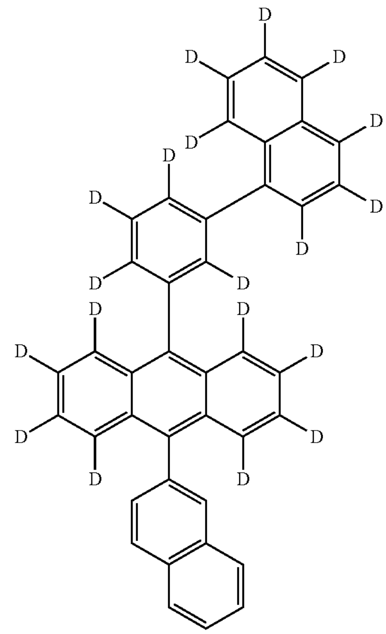
D
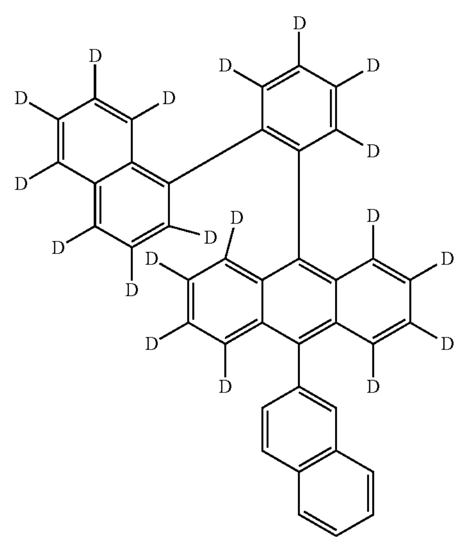
D

-continued
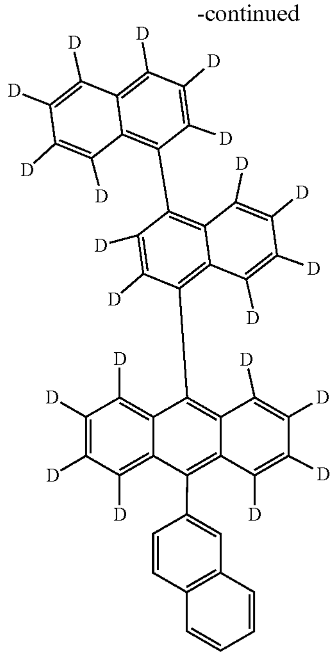
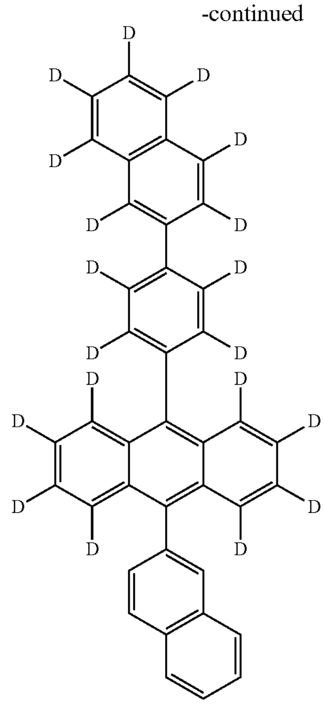
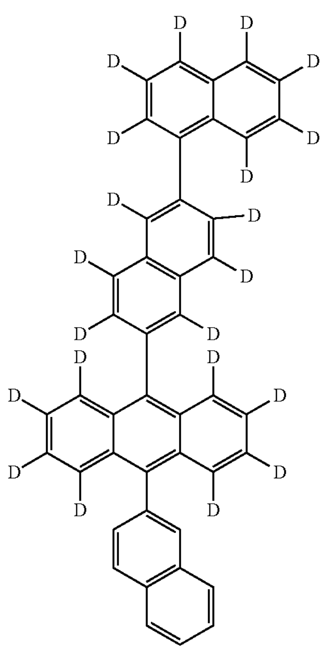
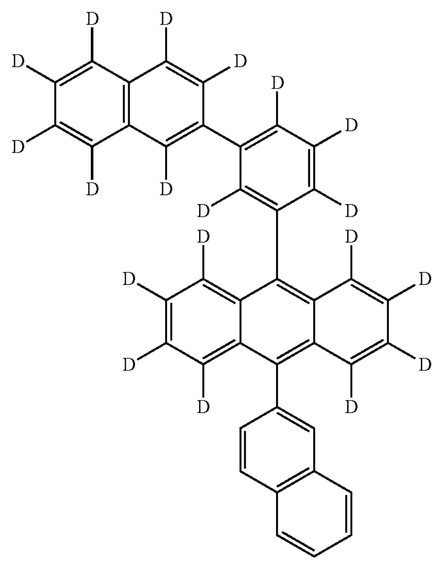
-continued

-continued
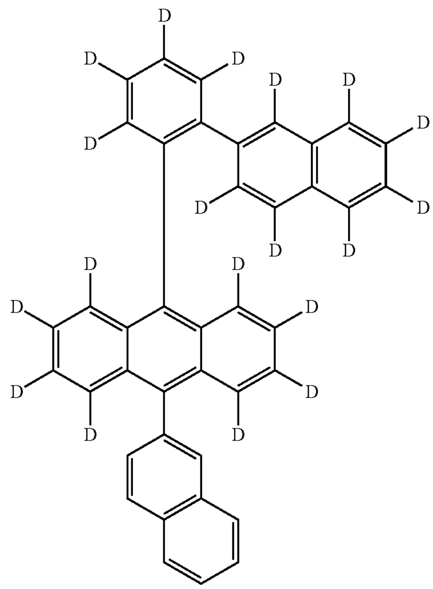
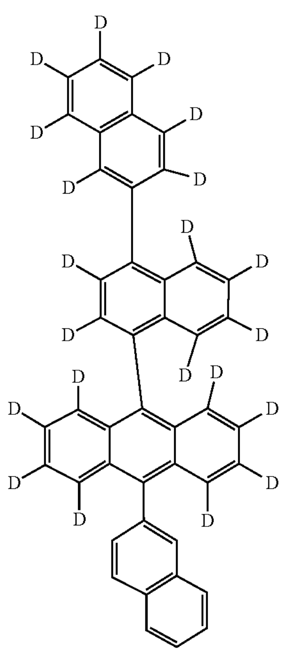
-continued
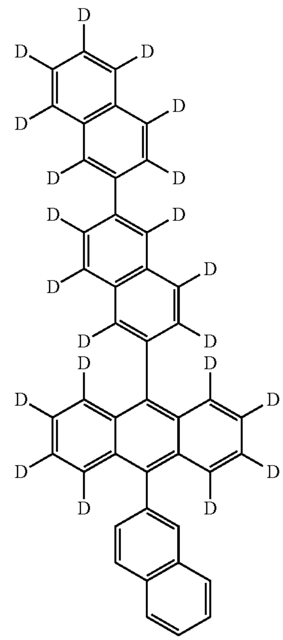
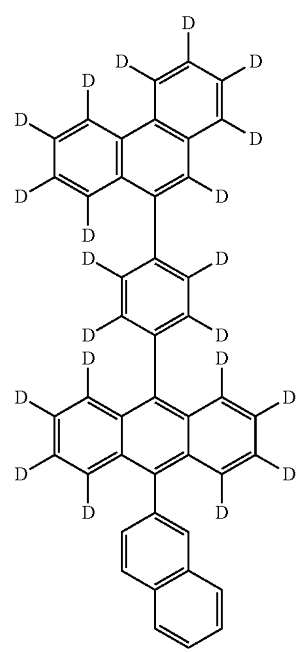

-continued
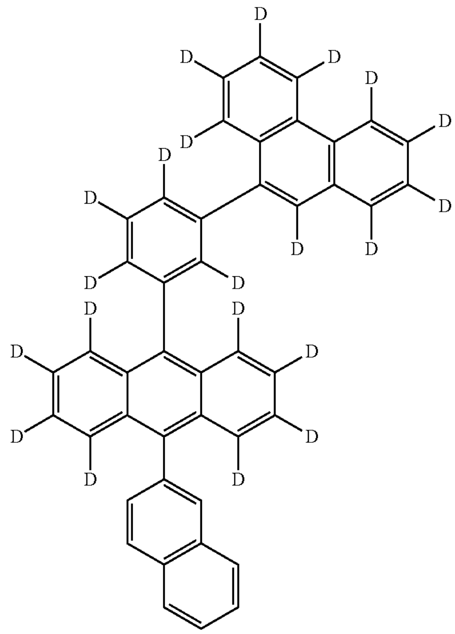
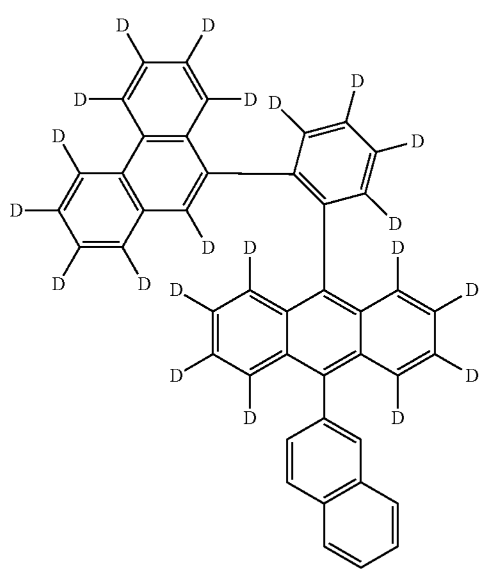
-continued
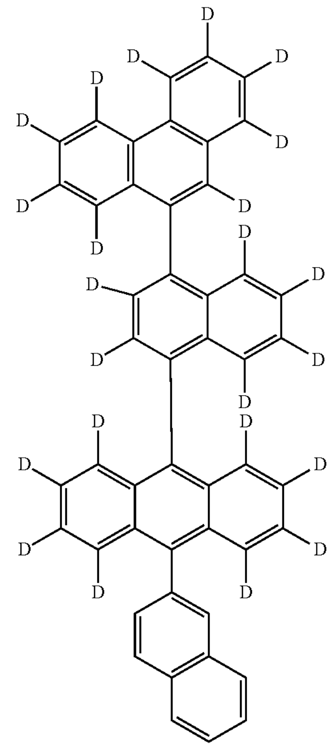
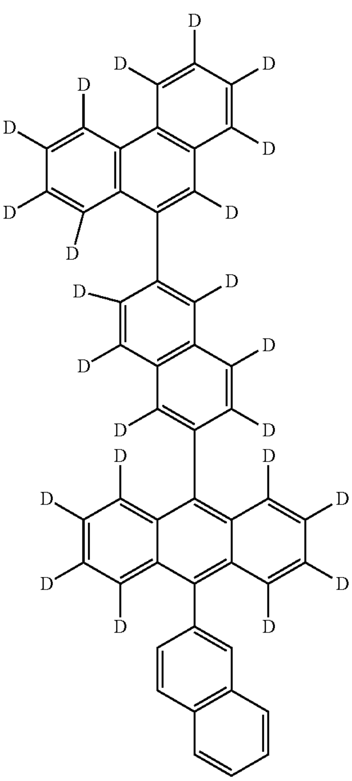

-continued
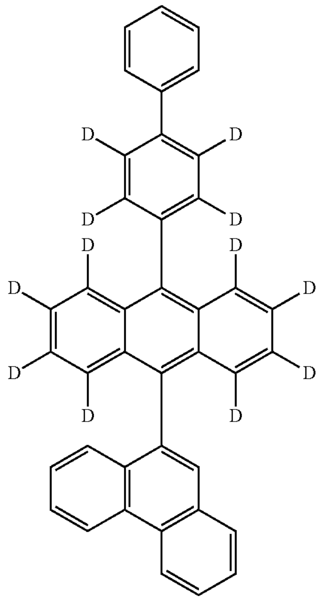
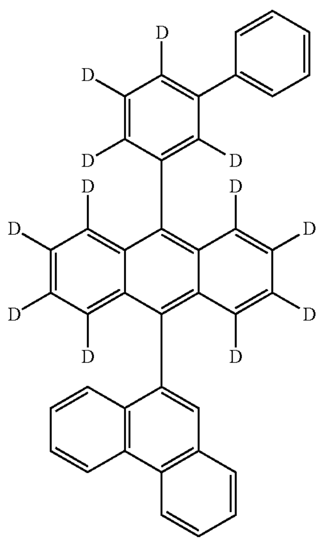
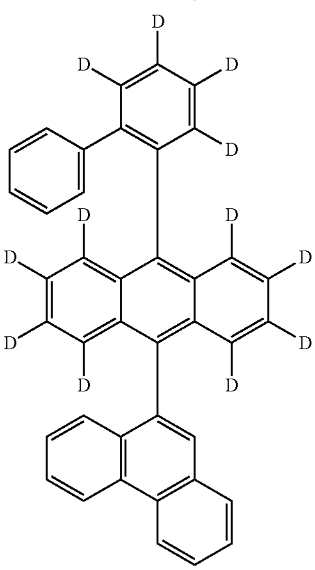
-continued
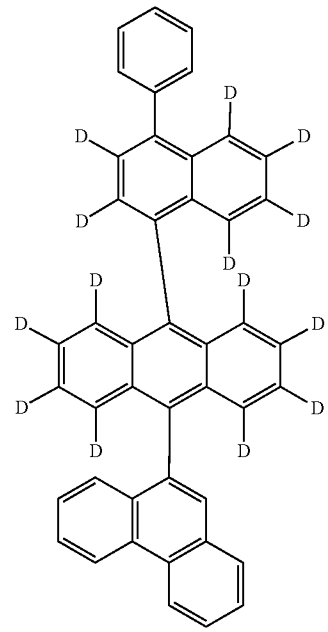
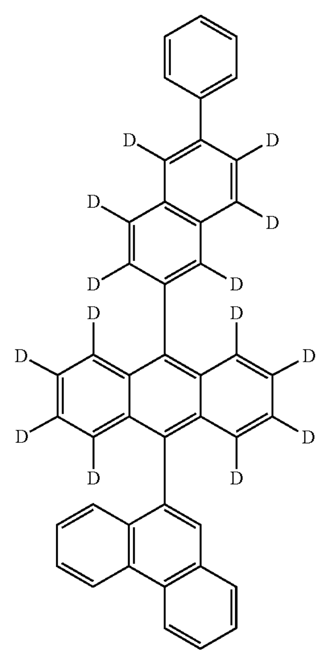

-continued
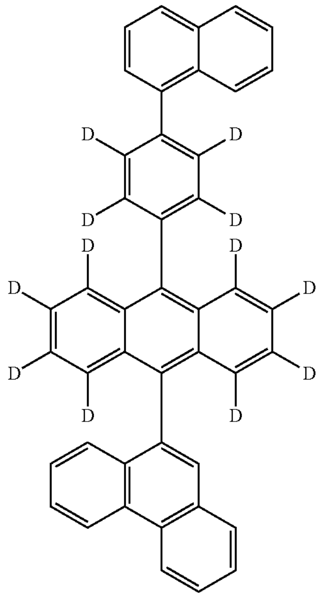
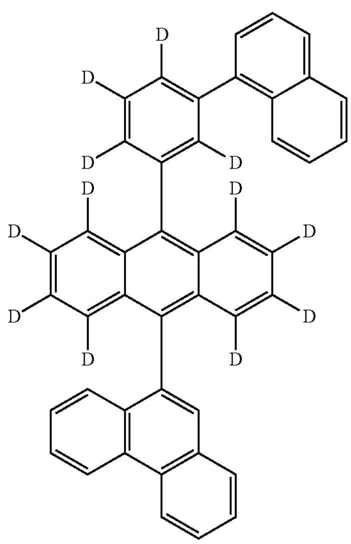
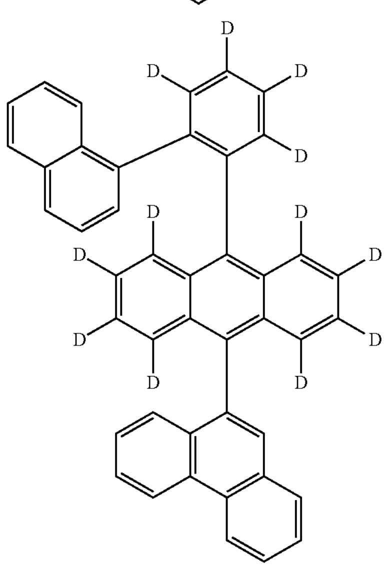
-continued
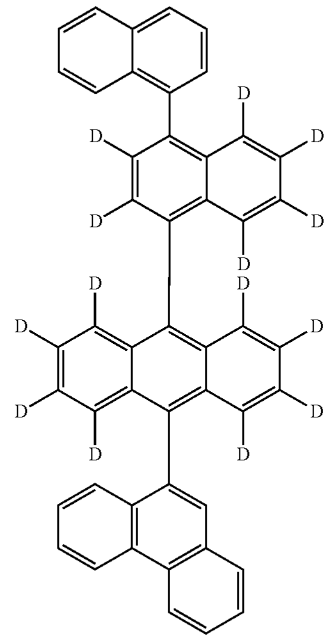
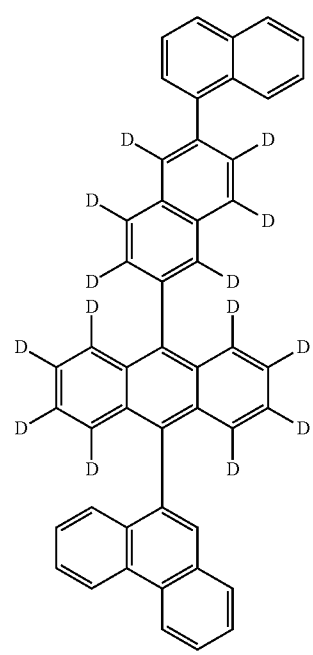

-continued
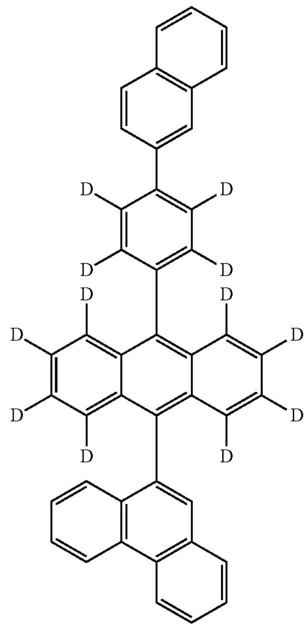
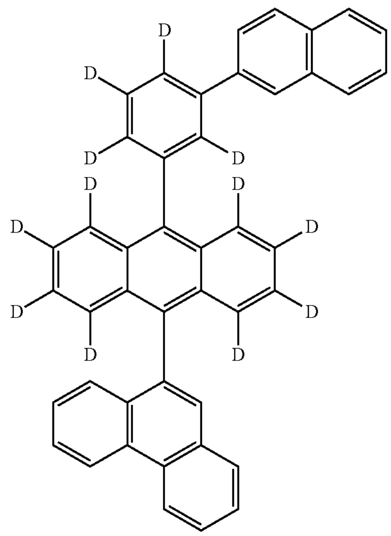
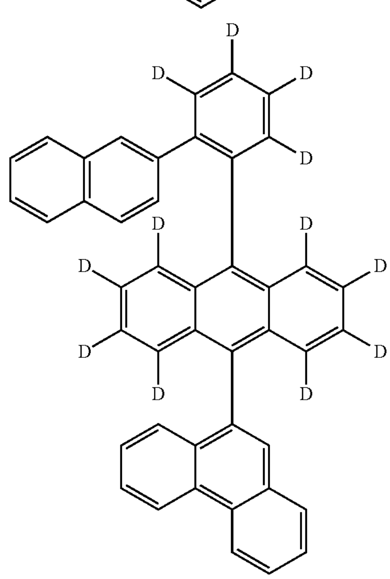
-continued
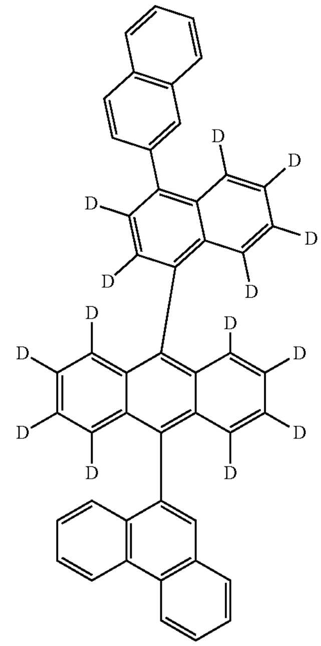
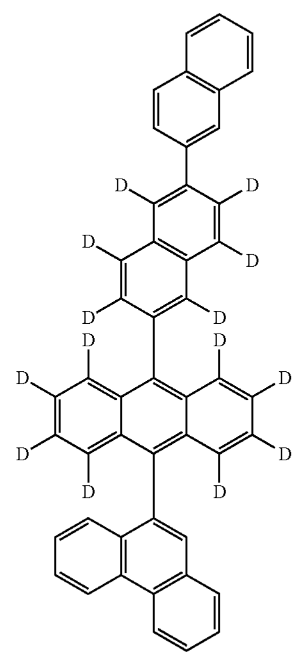

-continued
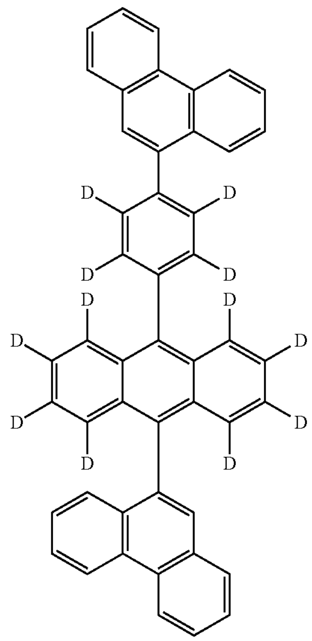
-continued
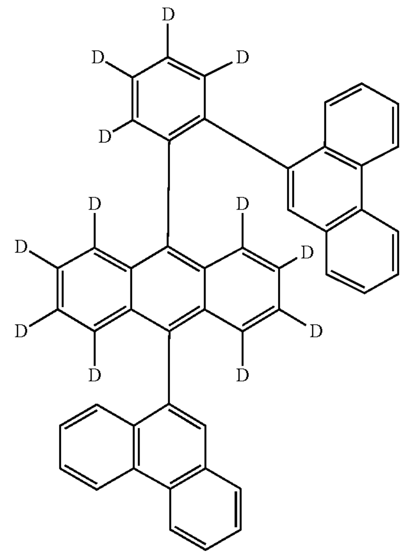
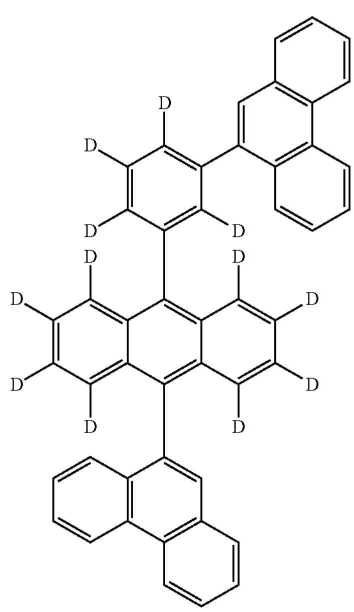
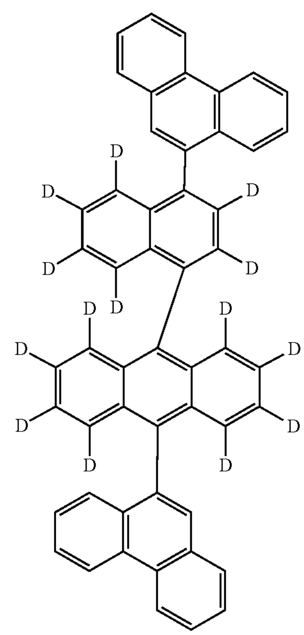

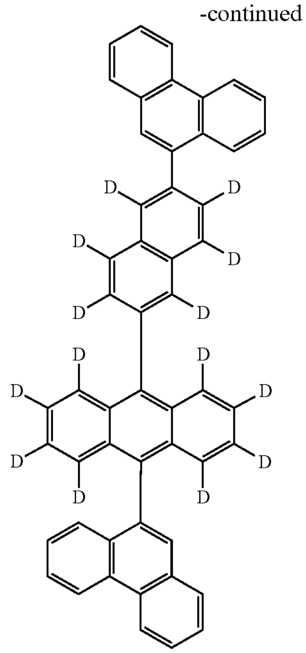
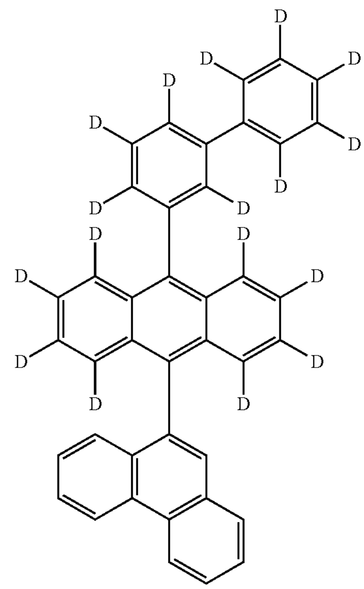
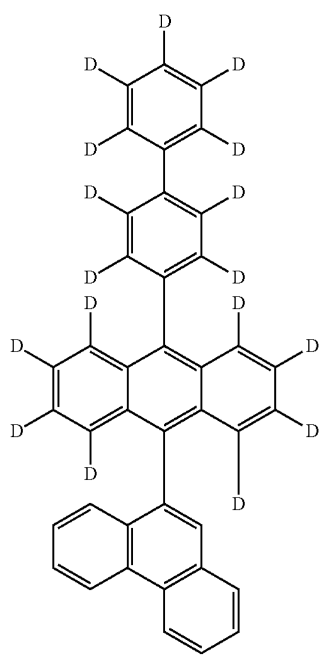
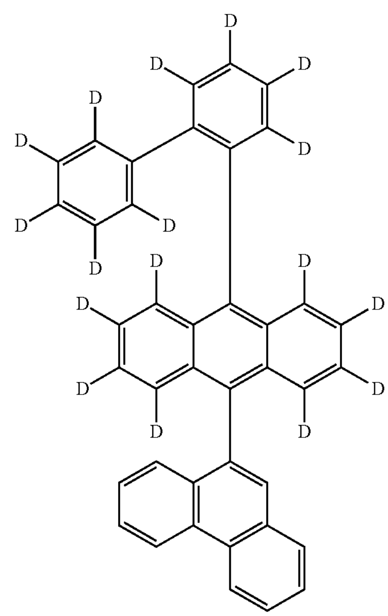

-continued
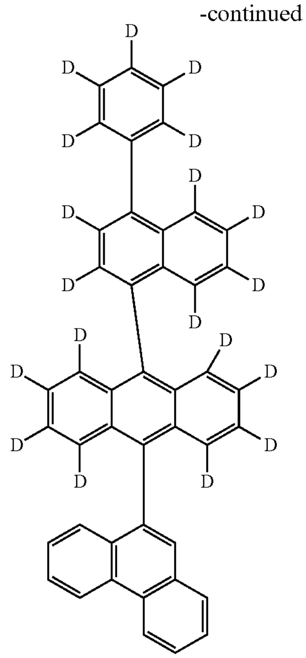
-continued
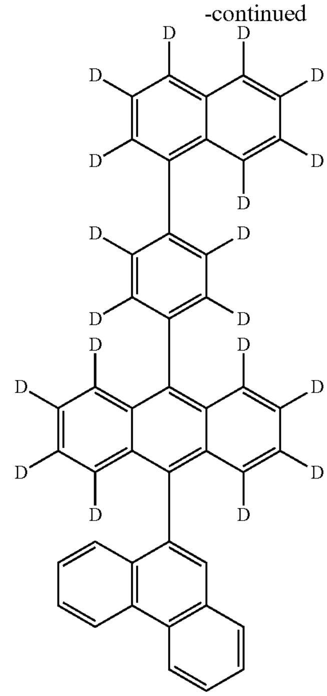
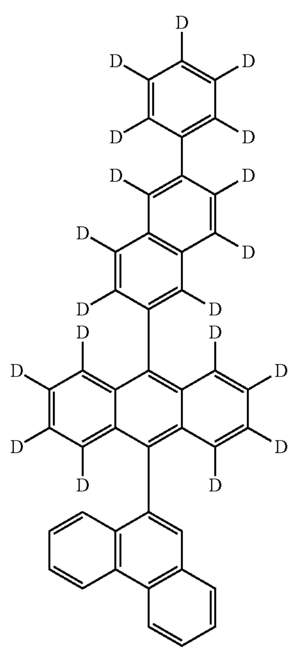
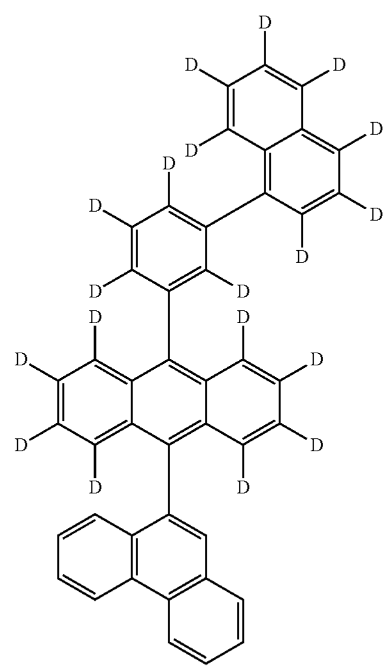

-continued
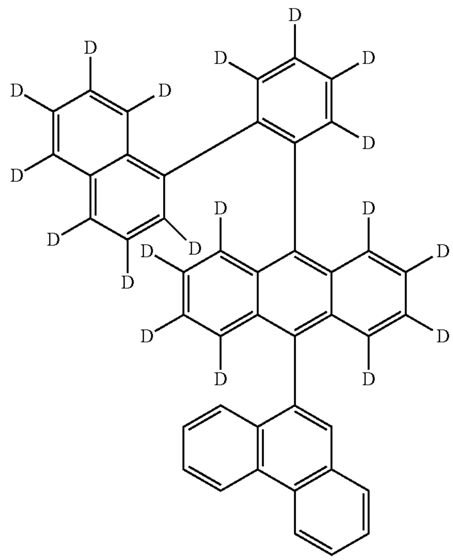
-continued
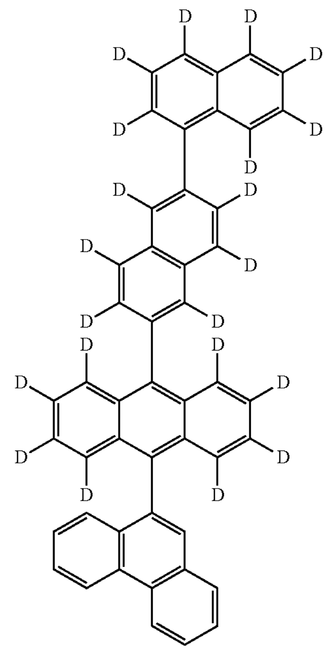
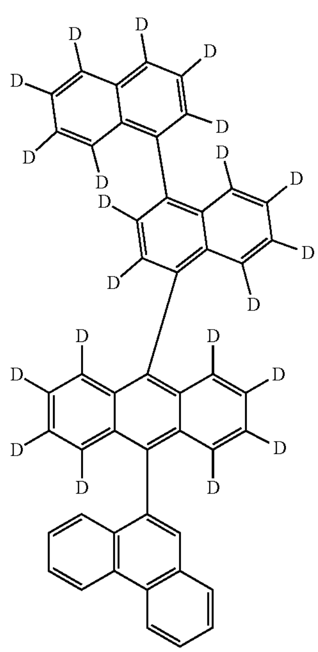
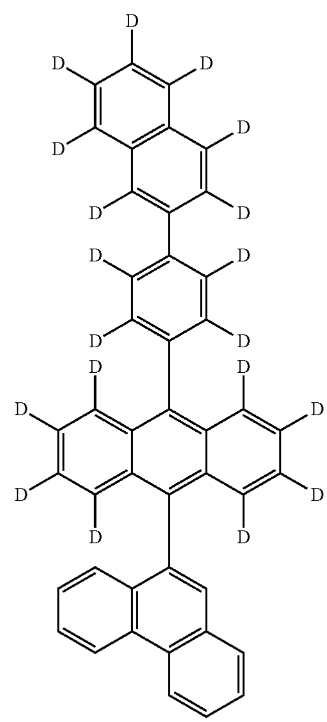

-continued
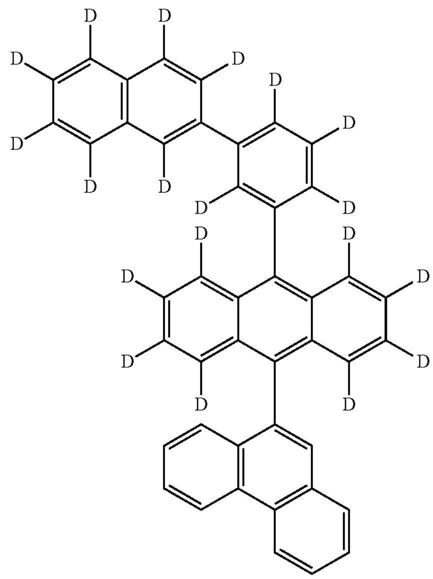
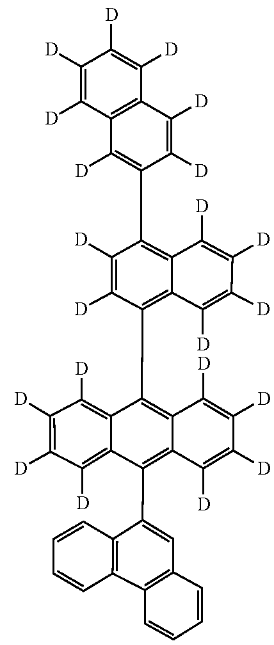
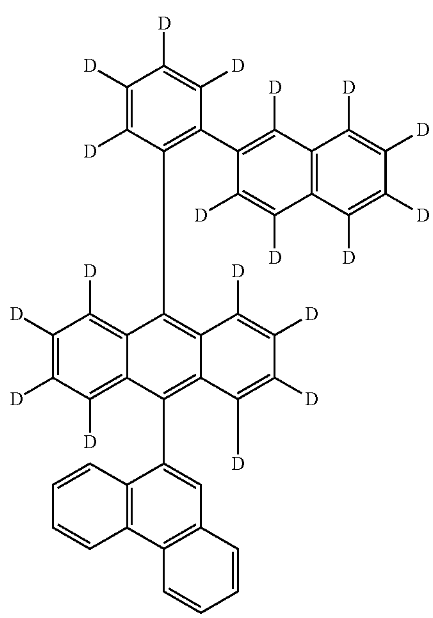
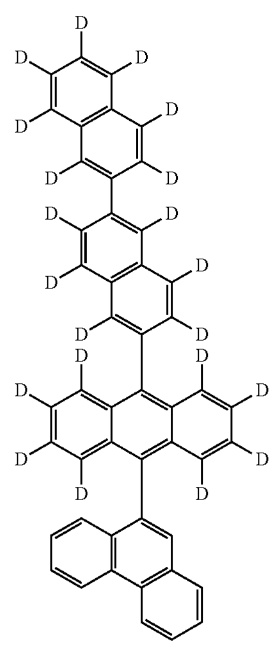

-continued
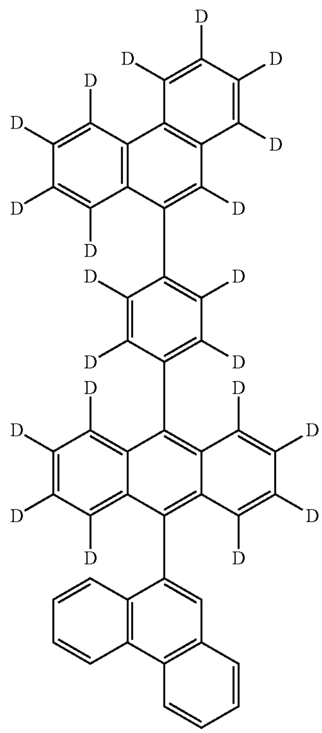
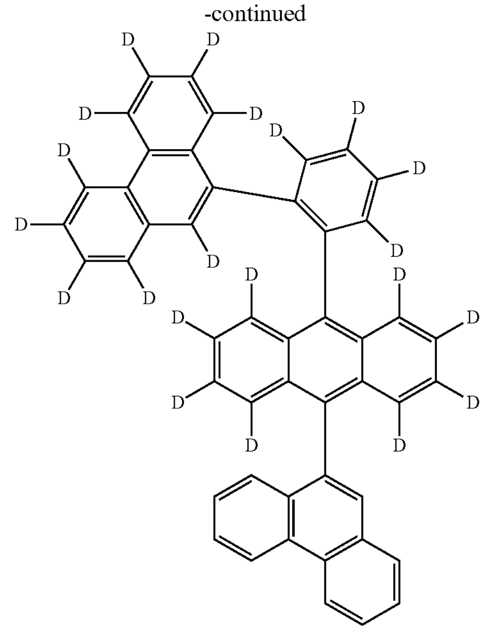
-continued
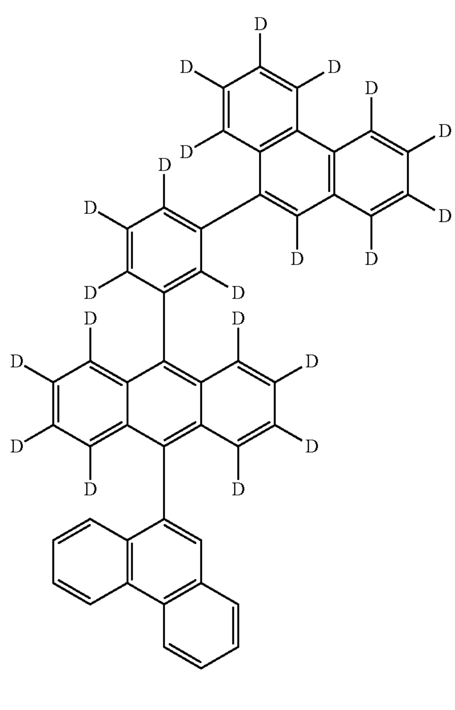
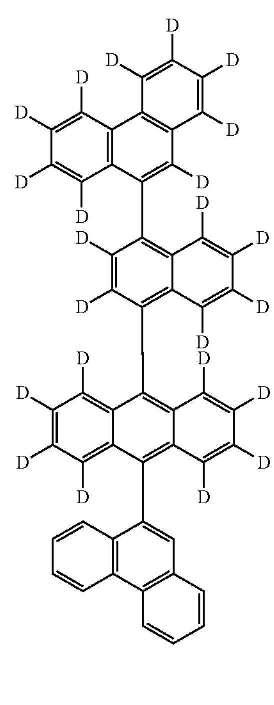

-continued
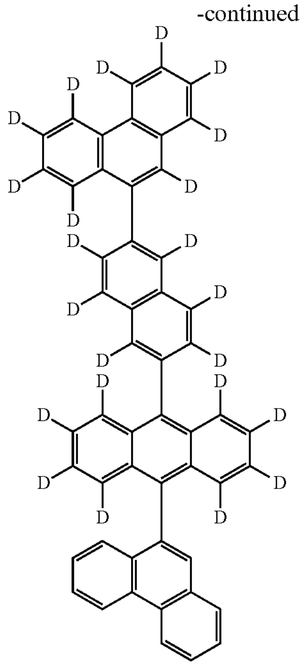
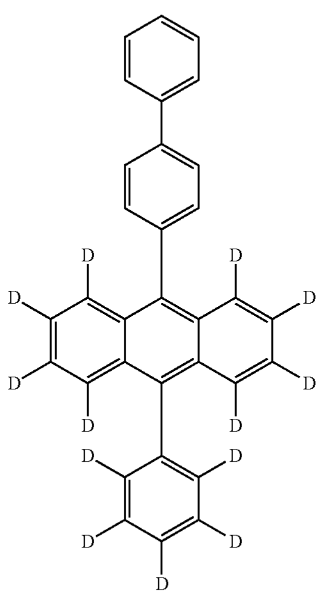
-continued
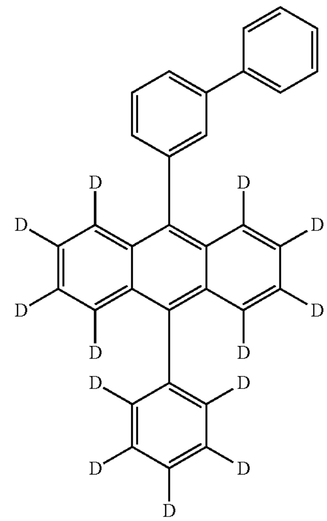
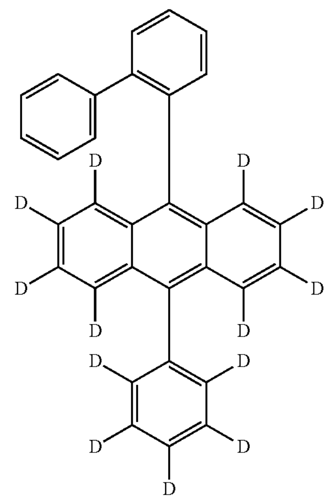
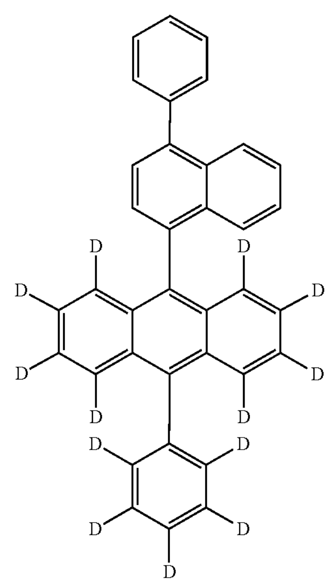

-continued
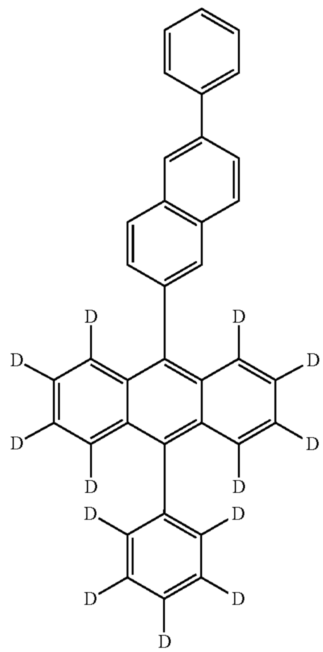
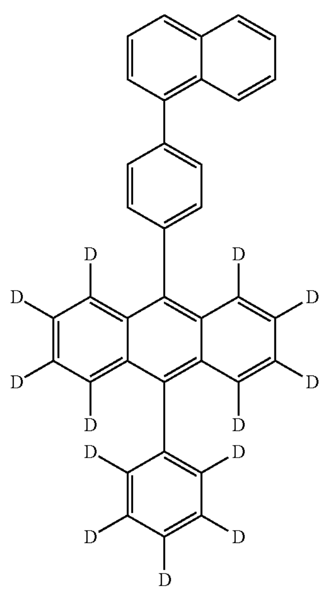
-continued
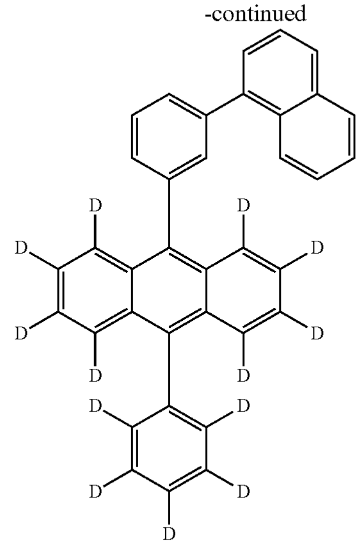
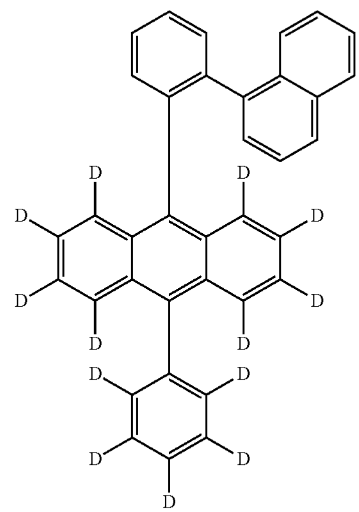
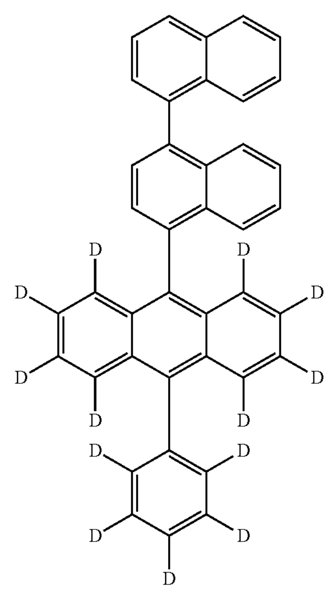

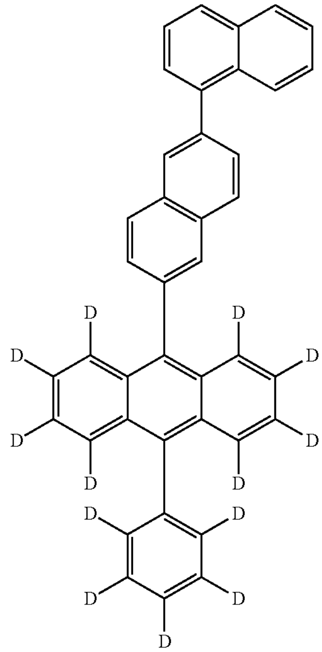
D
D
D
D
D
D
D
D
D
D
D
D
D
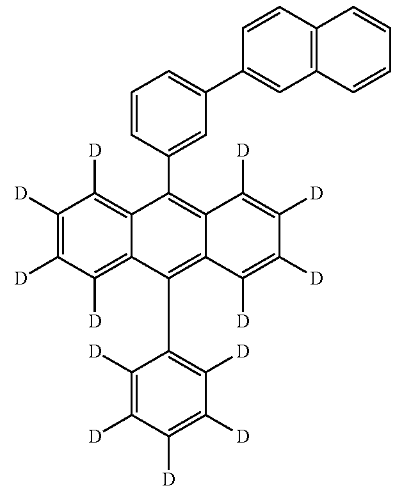
D
D
D
D
D
D
D
D
D
D
D
D
D
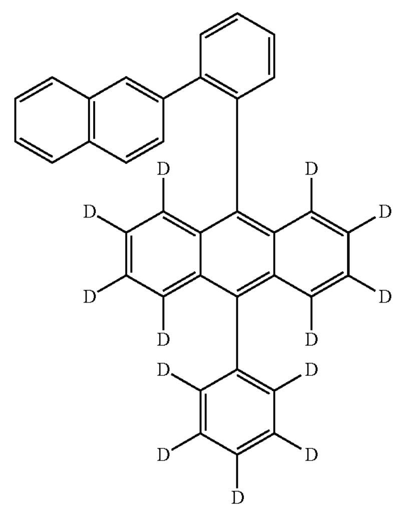
D
D
D
D
D
D
D
D
D
D
D
D
D
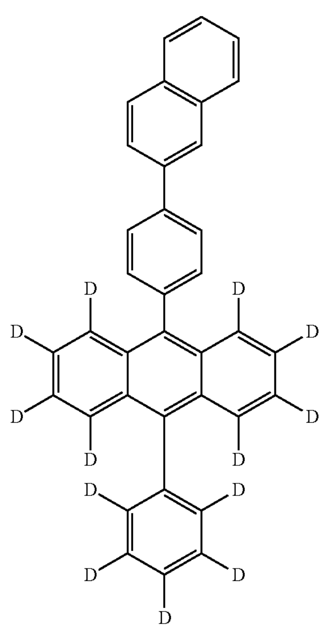
D
D
D
D
D
D
D
D
D
D
D
D
D
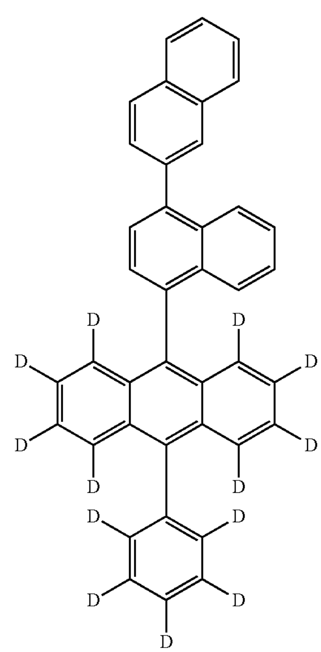
D
D
D
D
D
D
D
D
D
D
D
D
D -continued
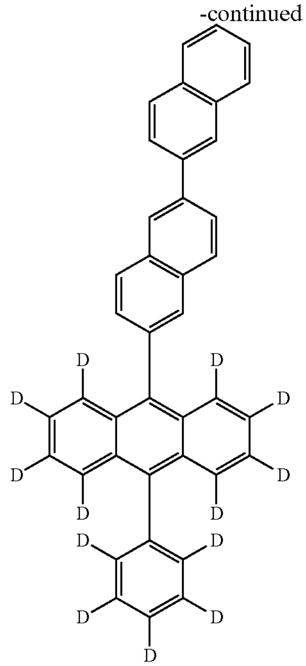
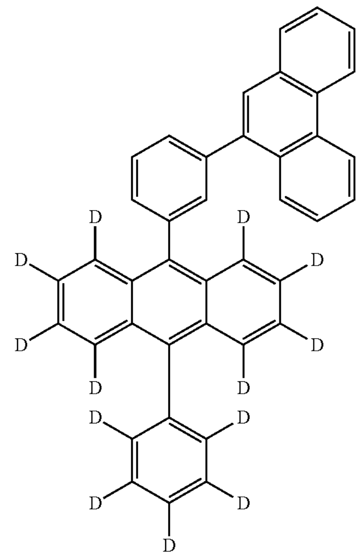
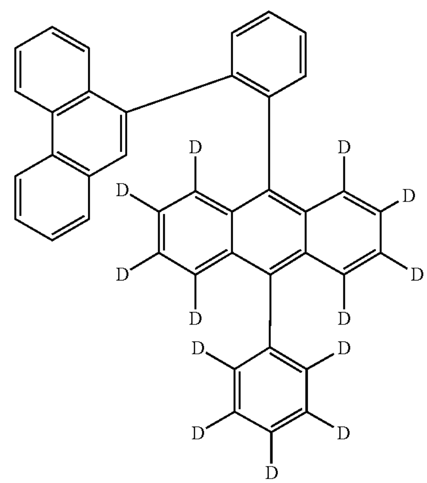
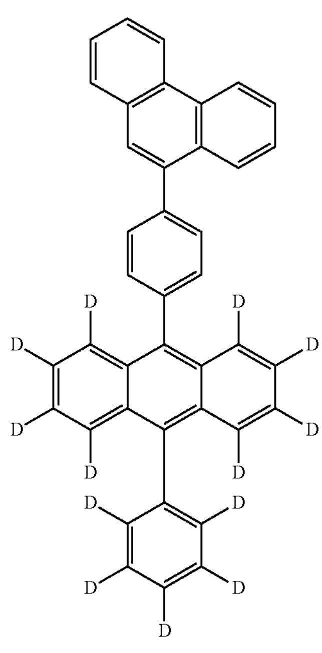
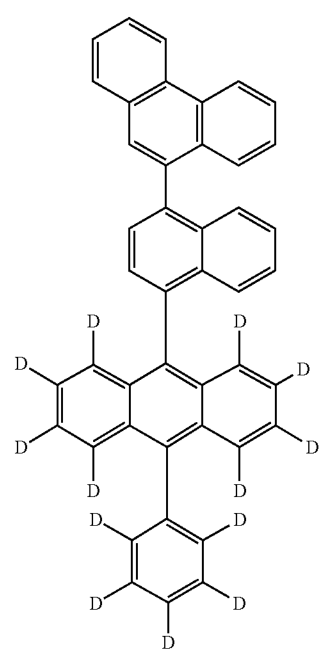

-continued
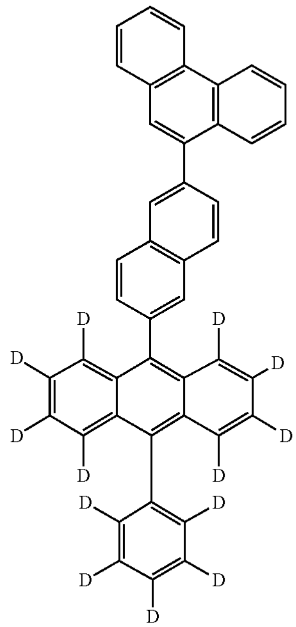
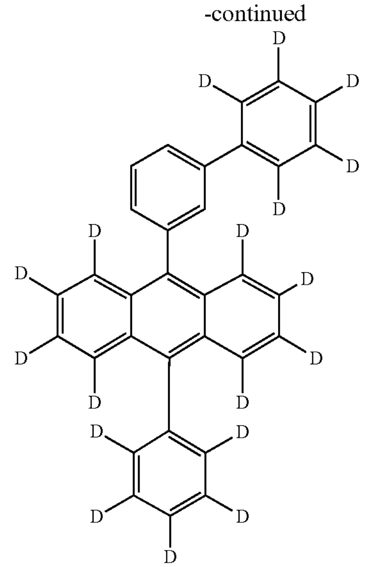
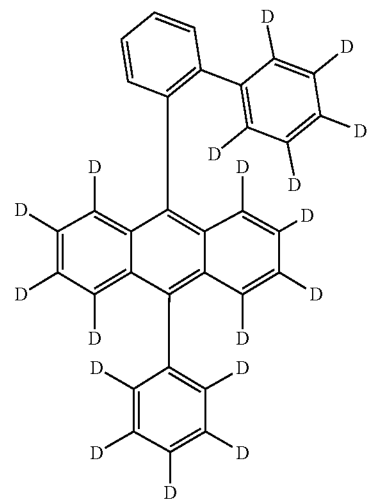
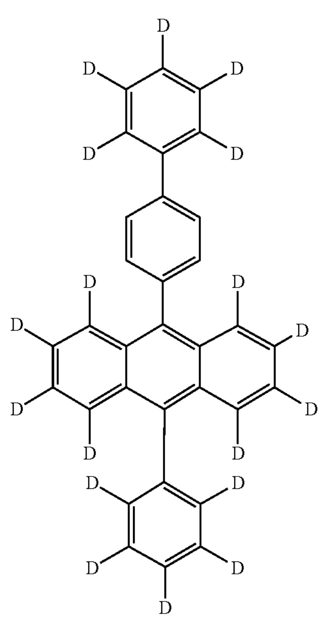
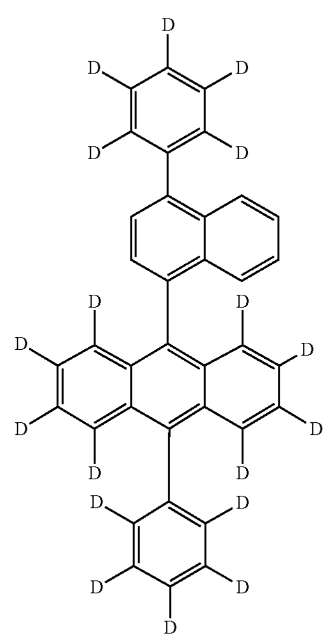

-continued
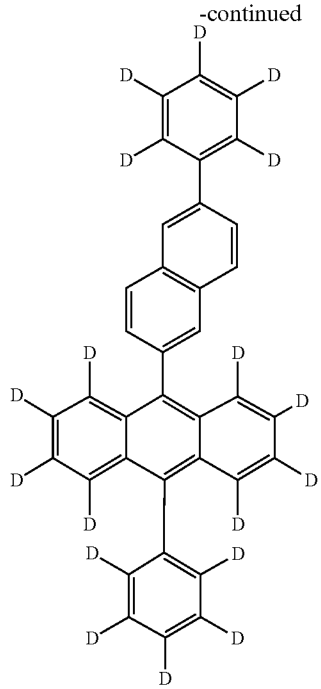
-continued
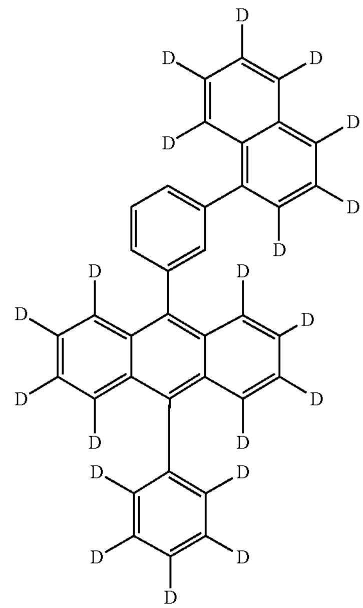
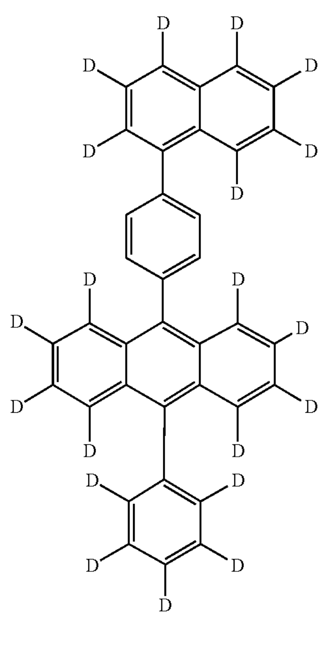
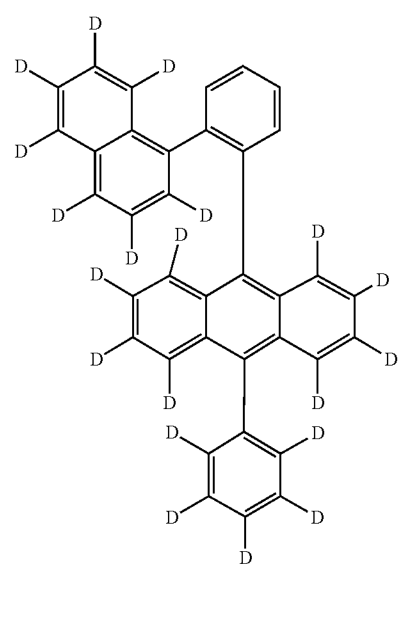

-continued
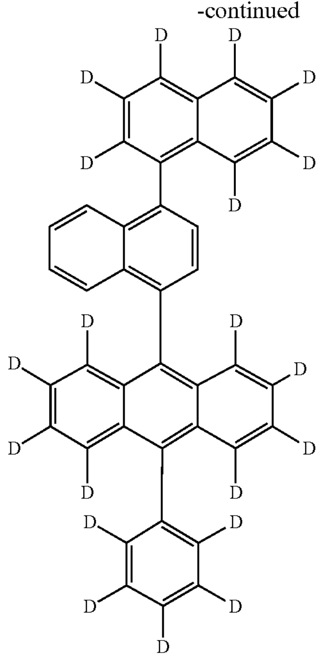
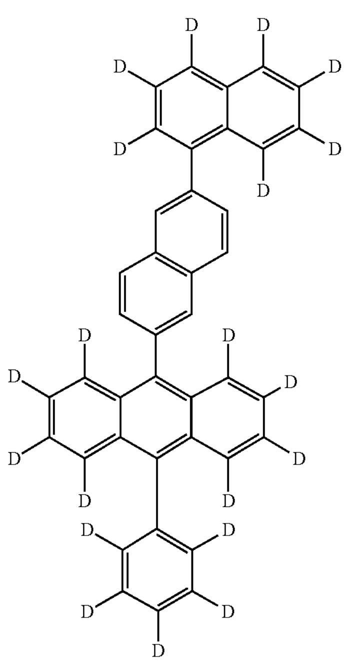
-continued
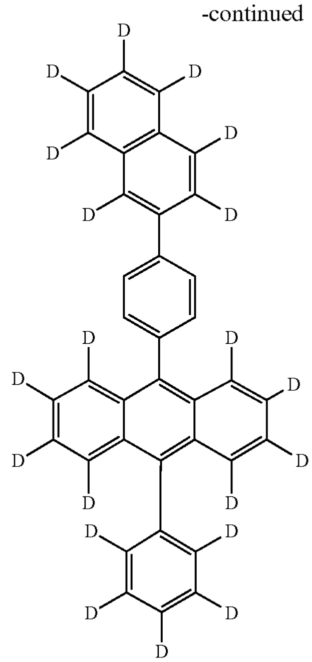
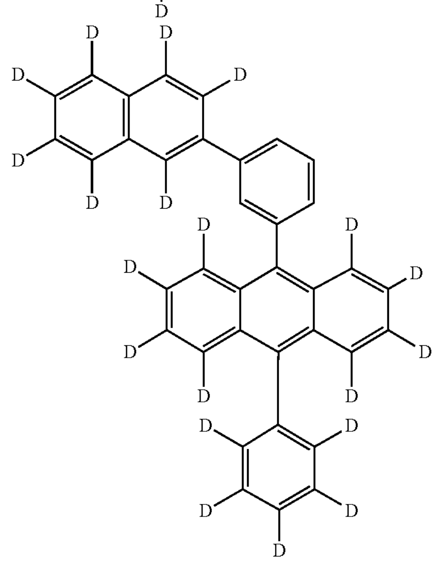
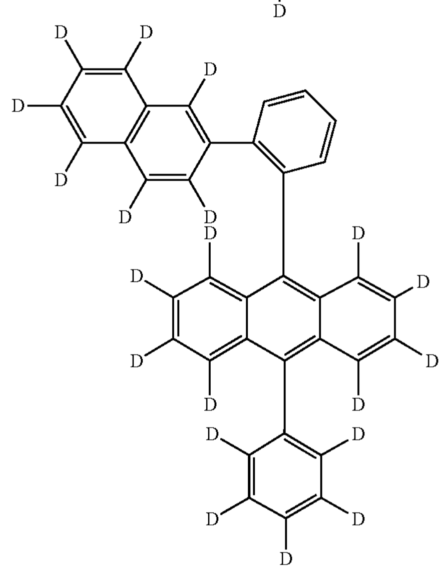

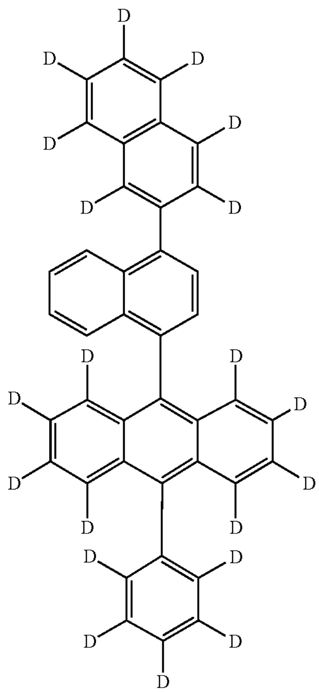
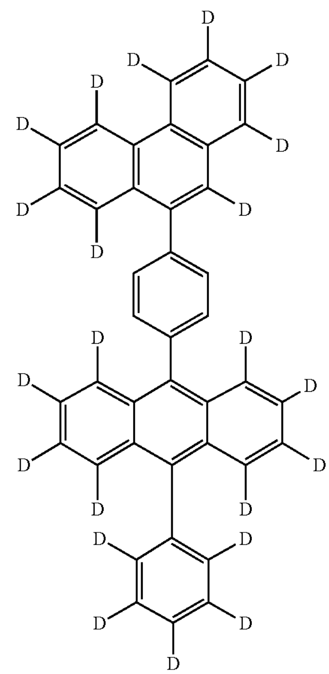
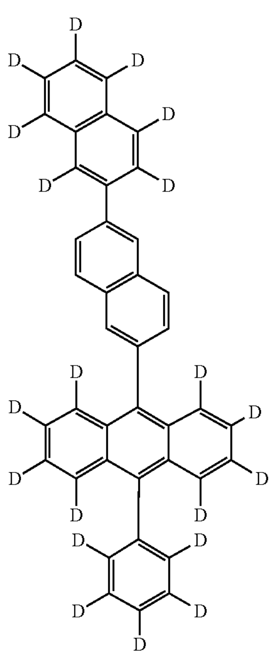
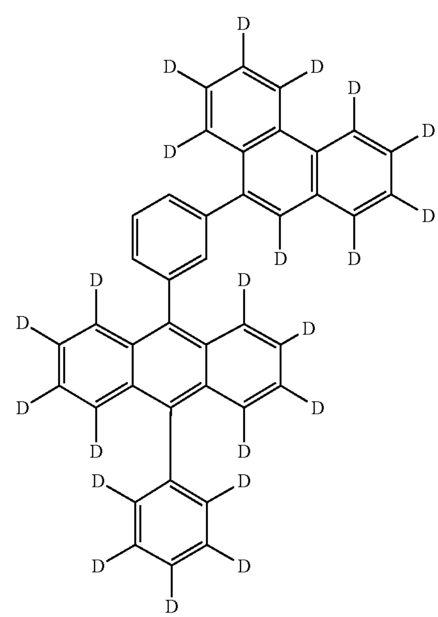

-continued
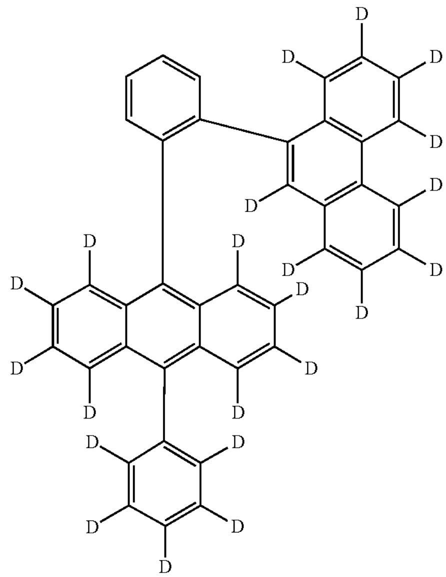
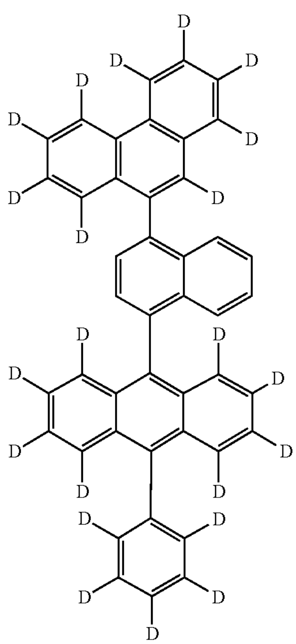
-continued
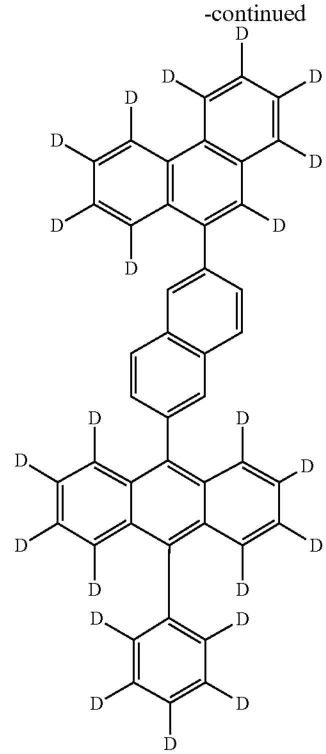
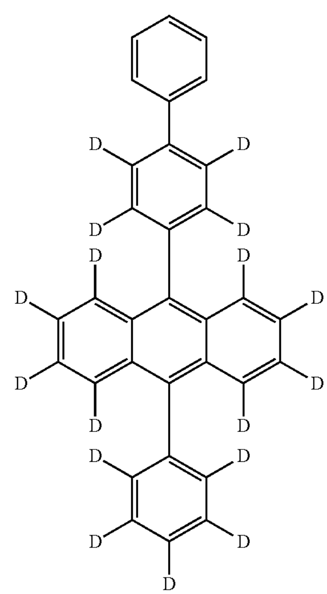

-continued
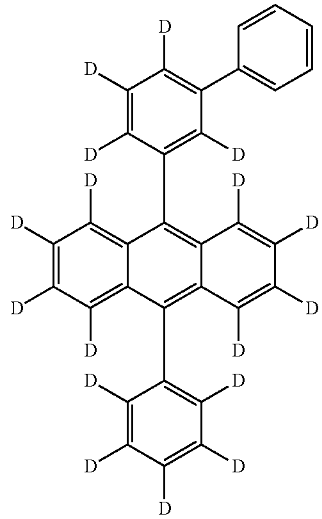
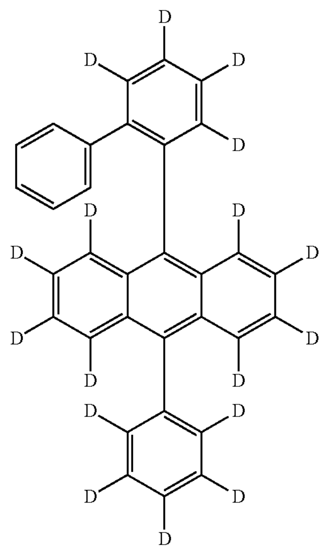
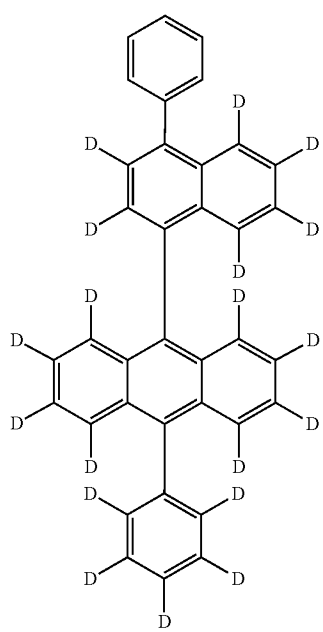
-continued
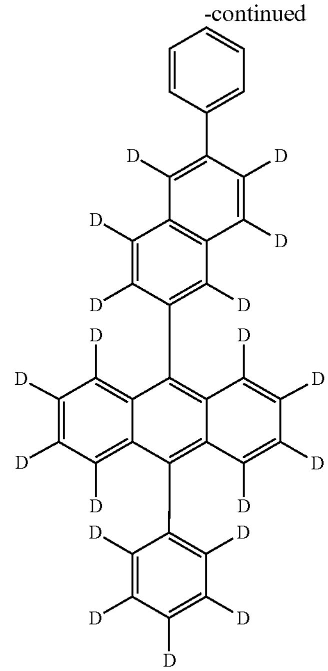
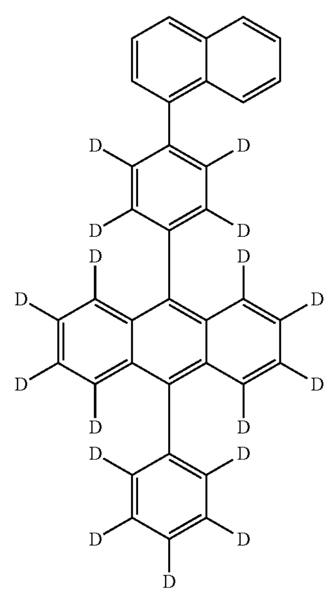

-continued
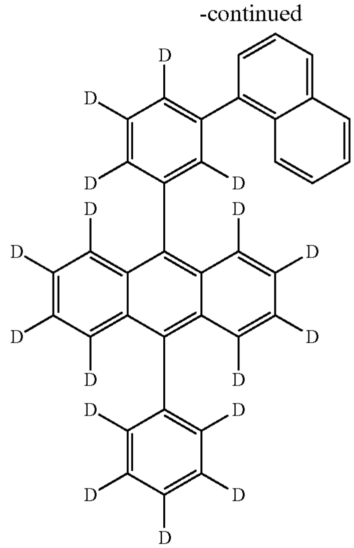
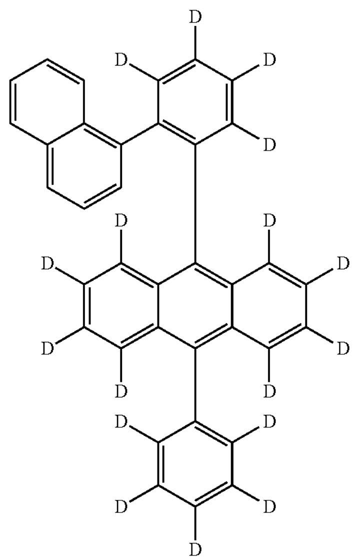
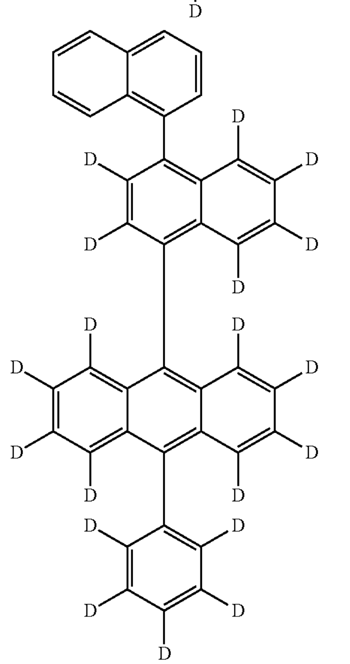
-continued
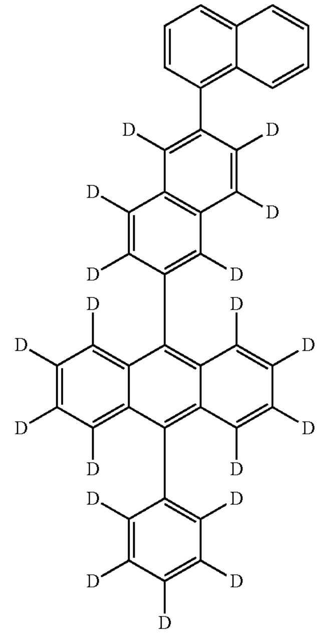
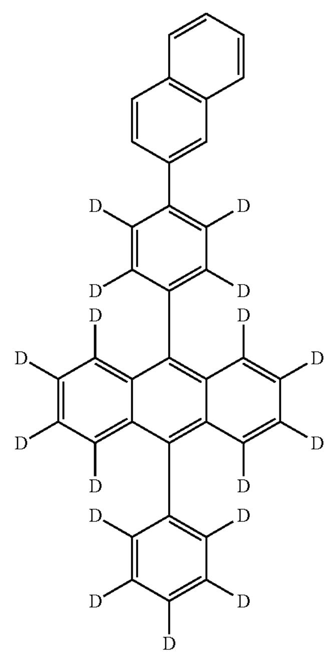

-continued
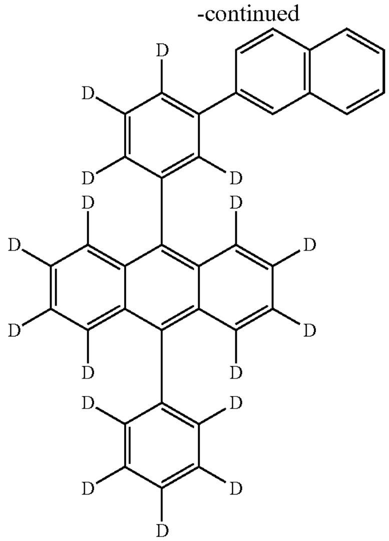
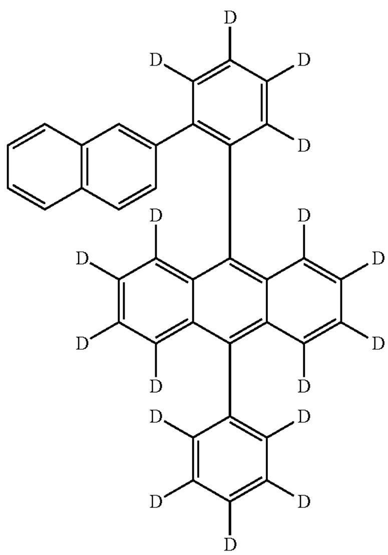
-continued
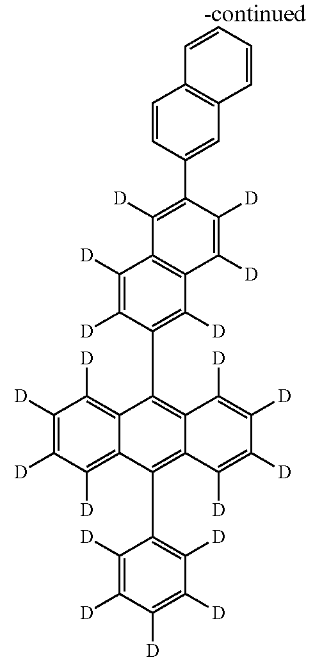
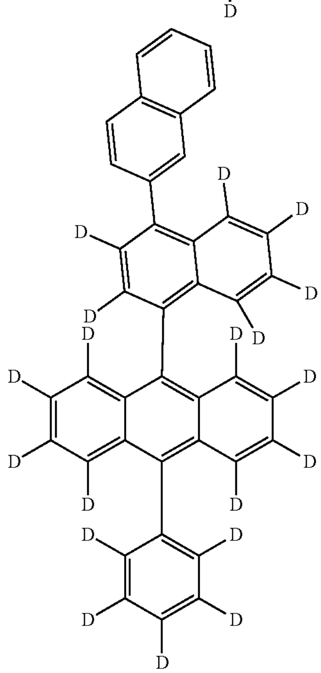
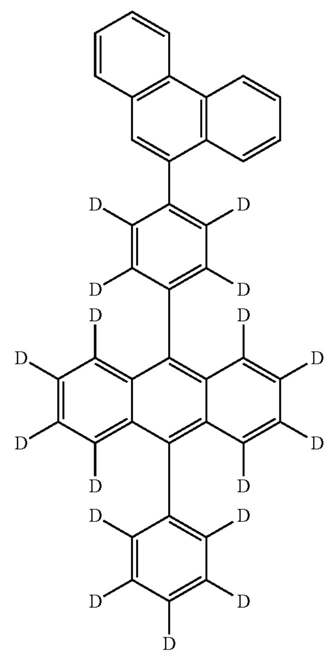

-continued
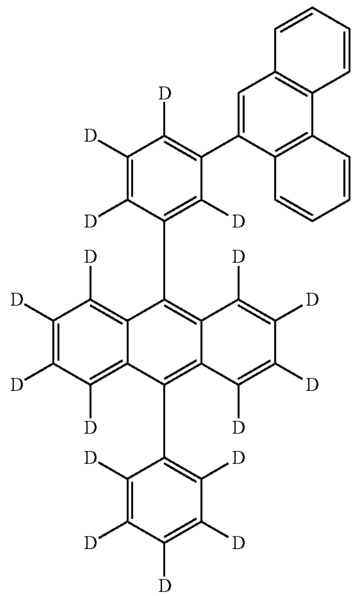
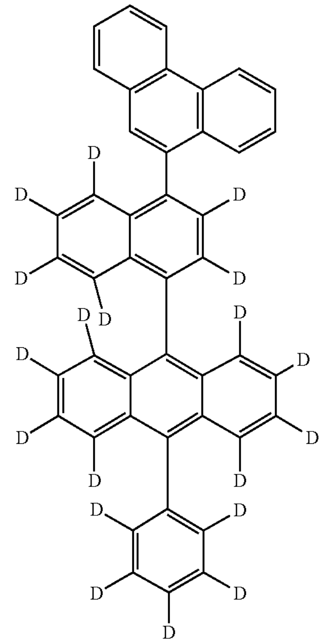
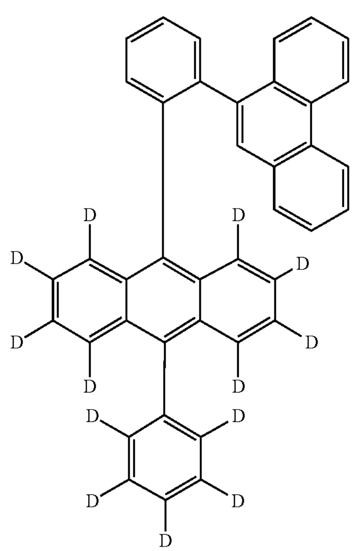
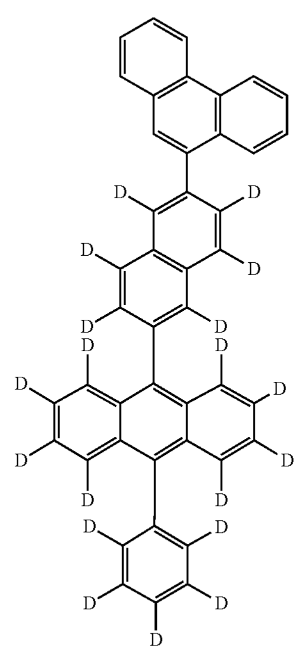

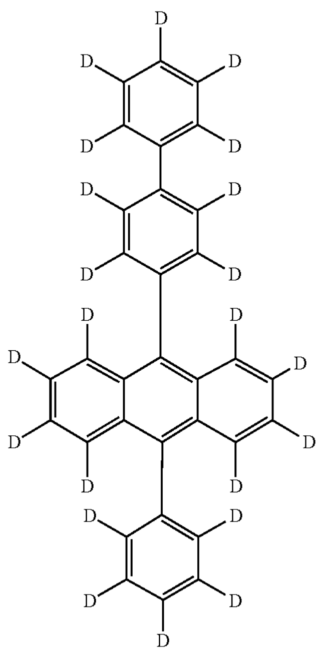
D
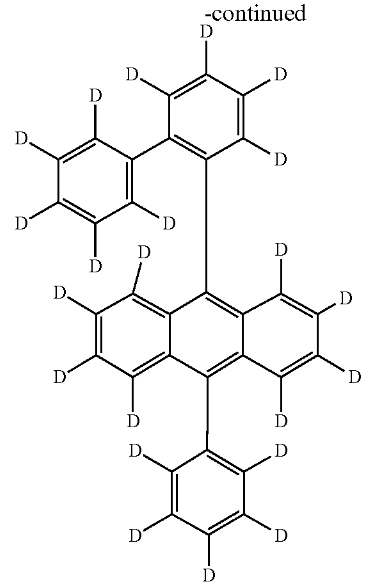
D
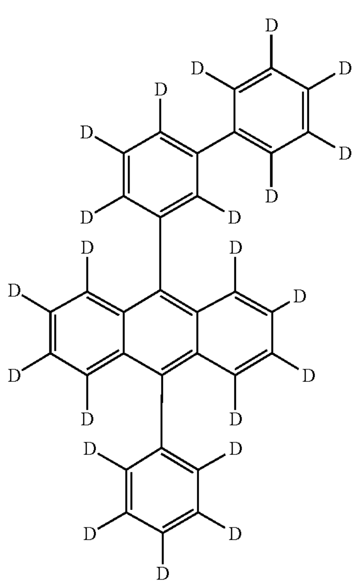
D
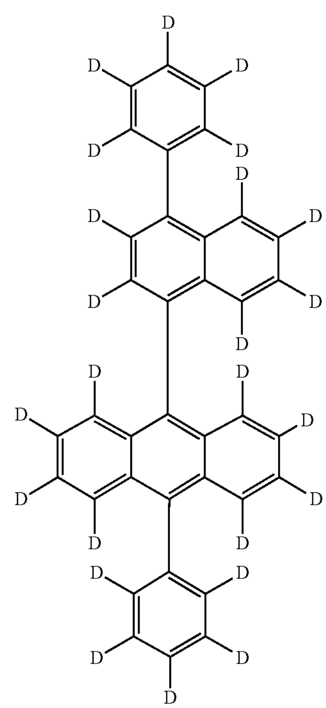
D

-continued
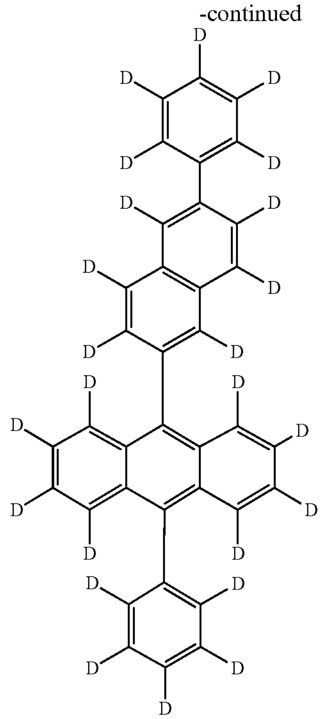
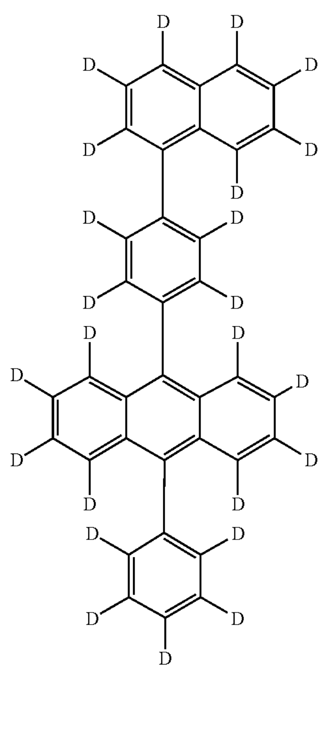
-continued
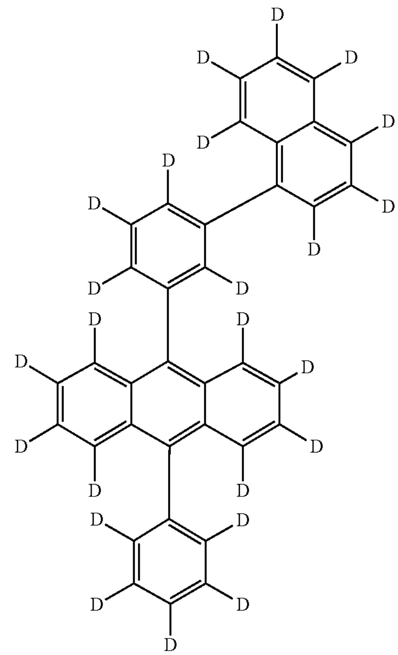
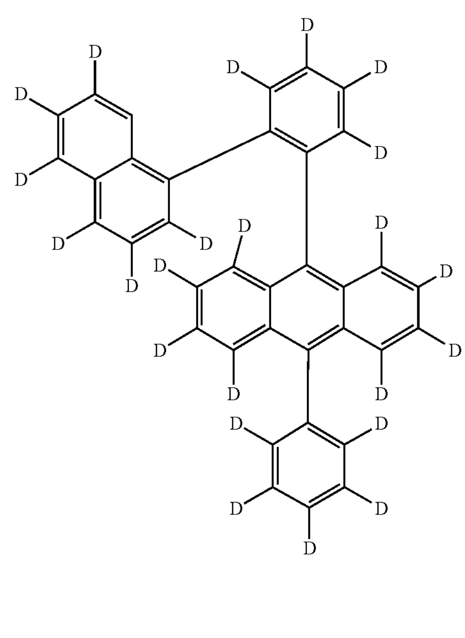

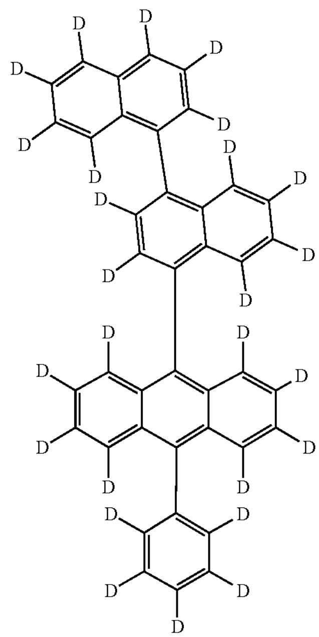
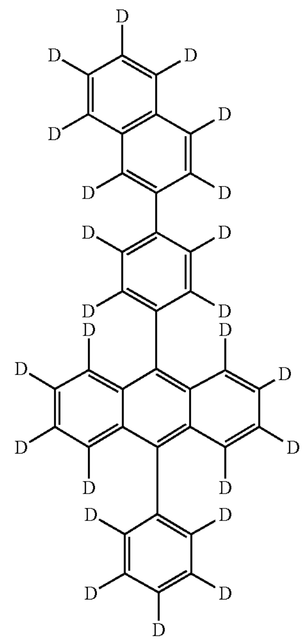
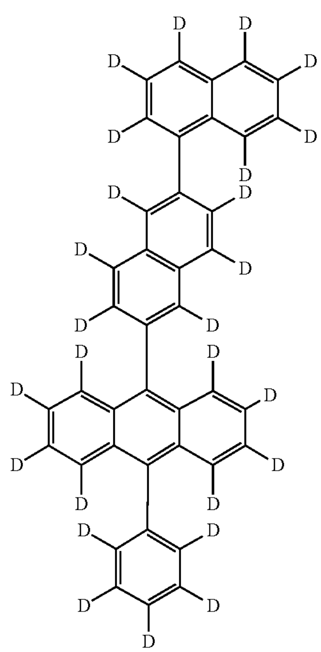
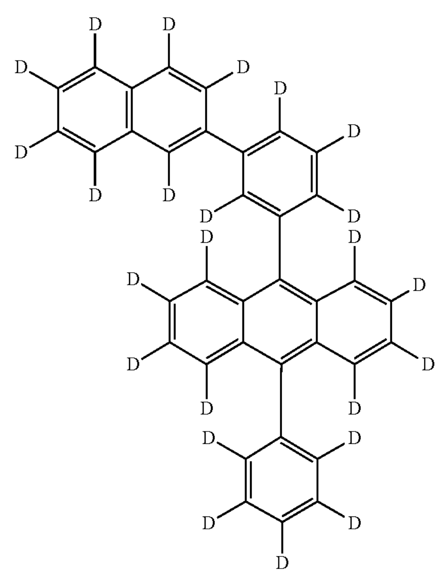

-continued
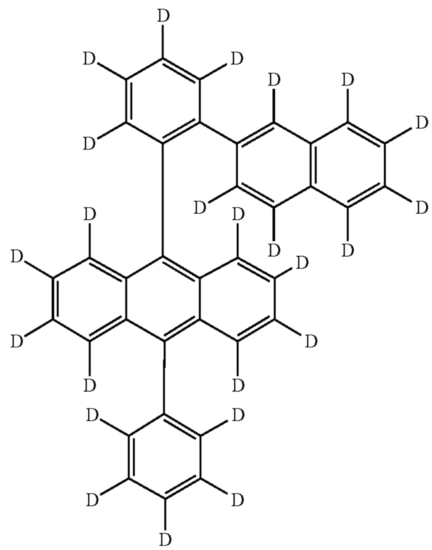
-continued
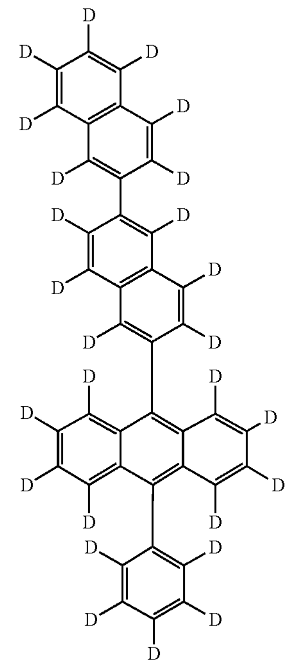
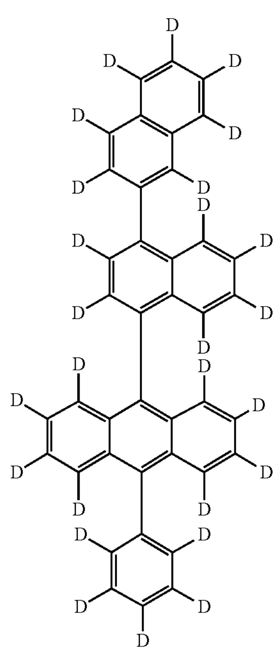
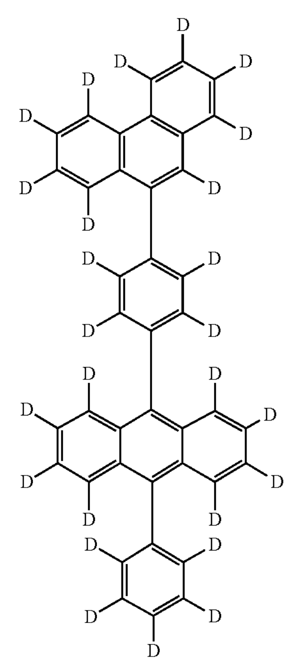

-continued
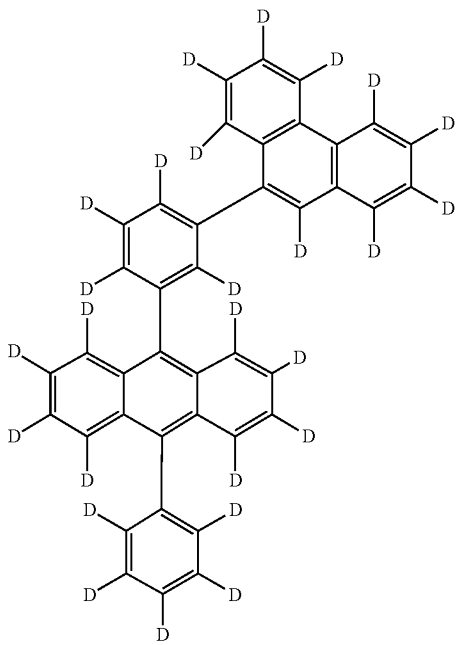
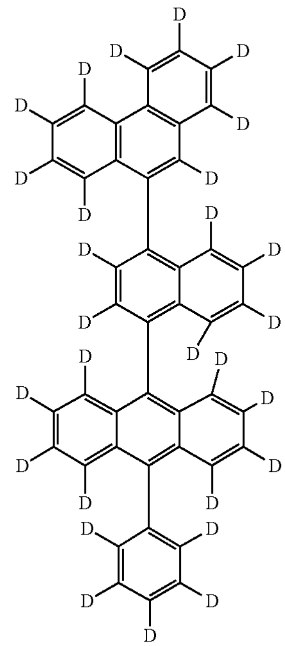
-continued
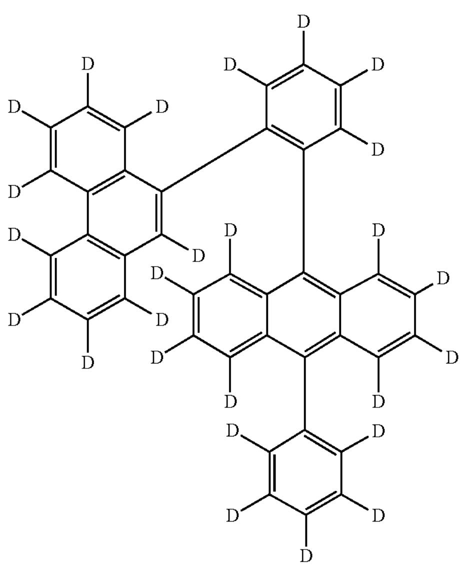
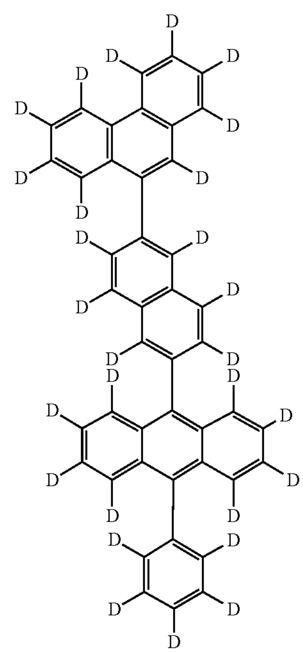

-continued
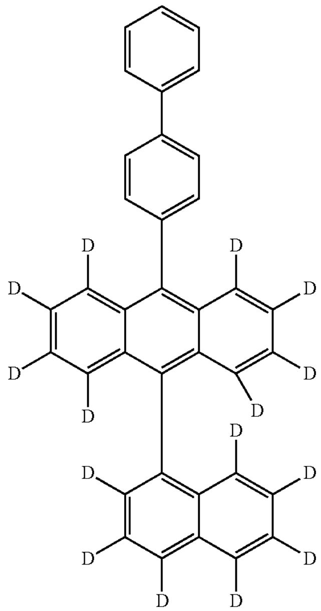
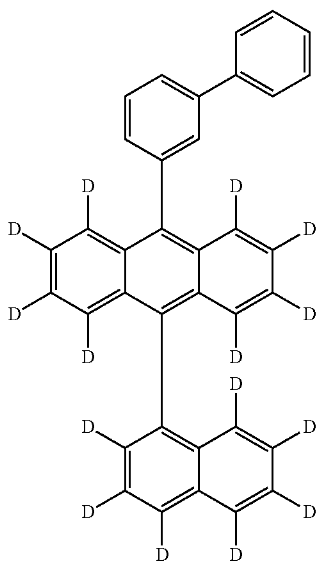
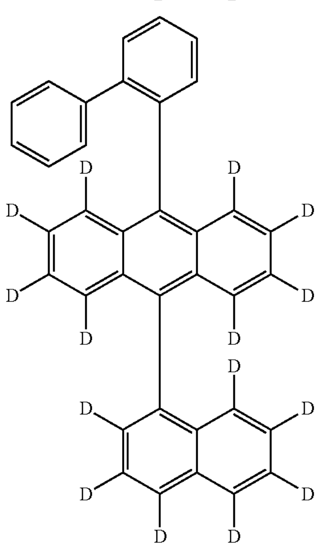
-continued
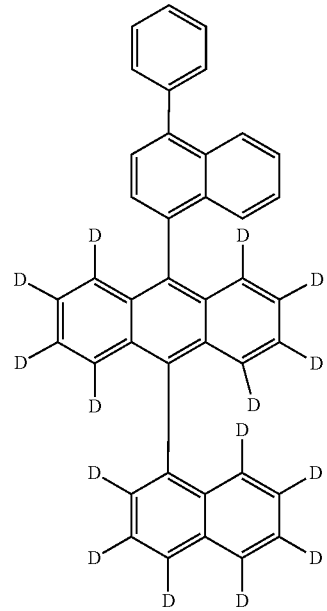
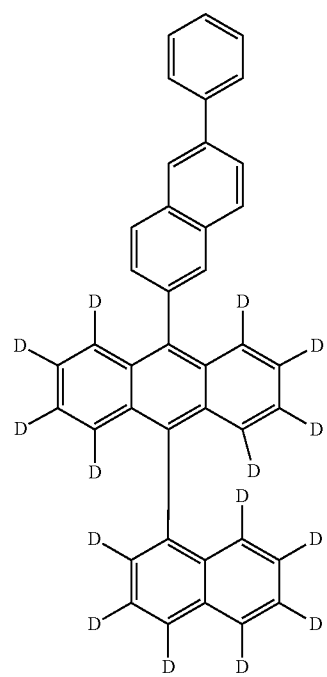

-continued
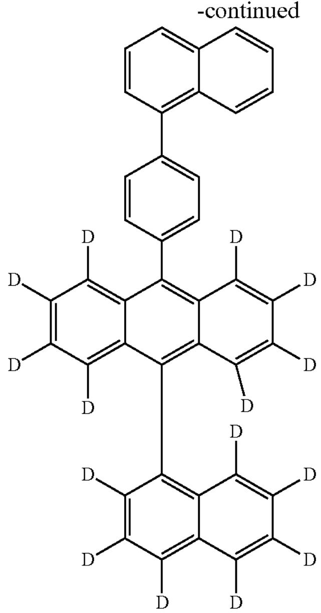
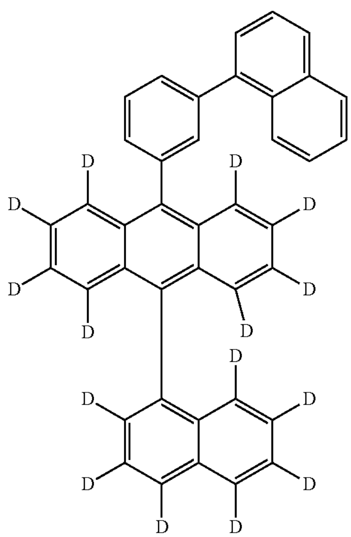
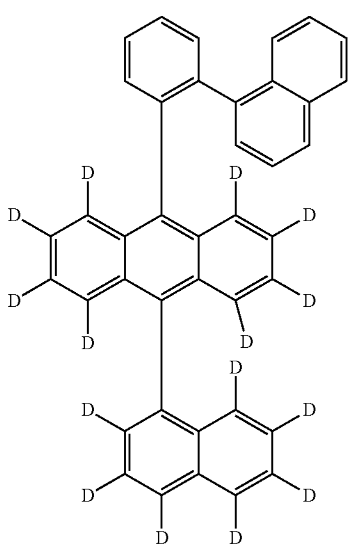
-continued
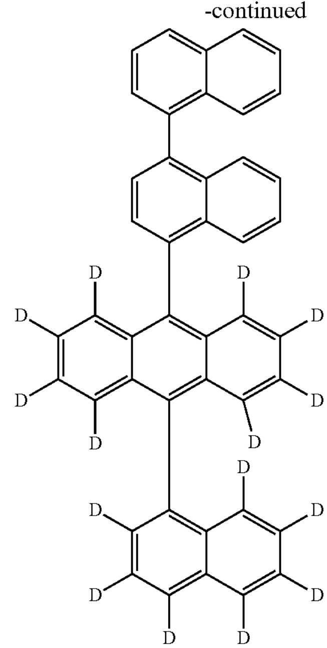
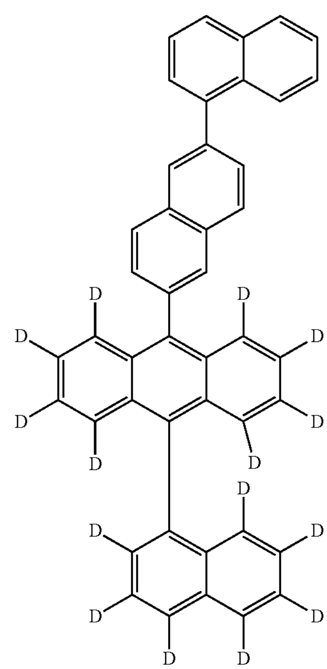

-continued
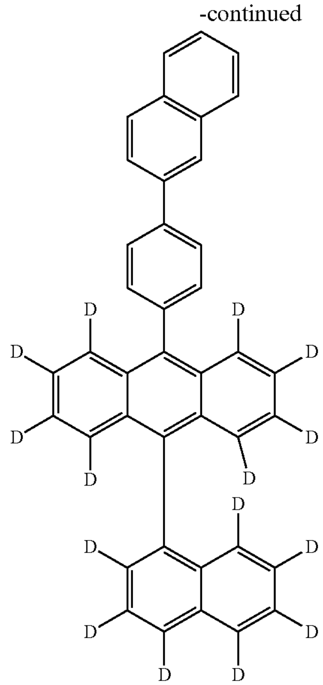
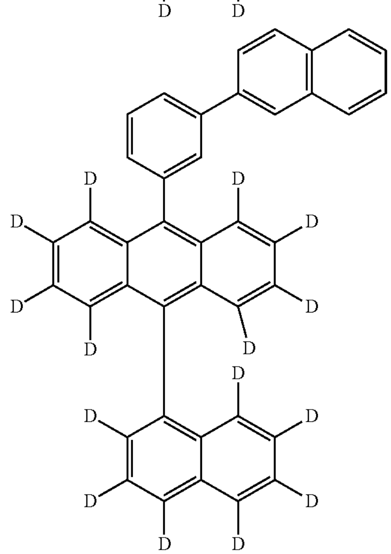
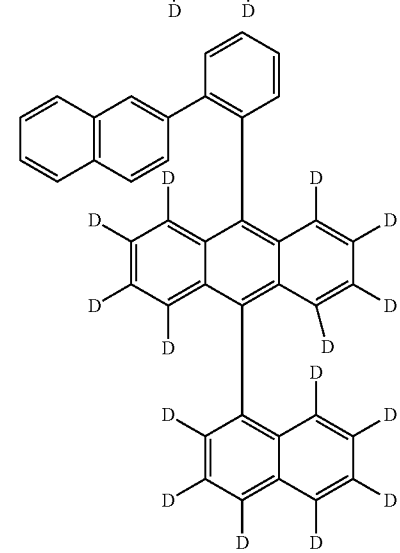
-continued
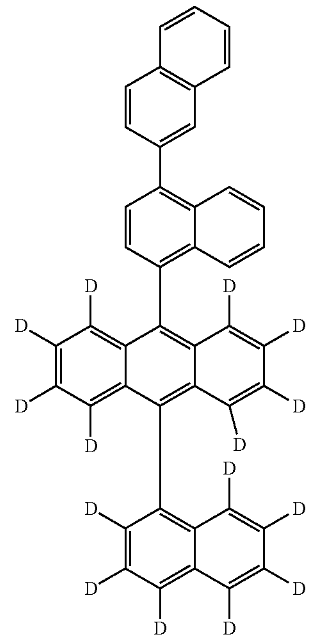
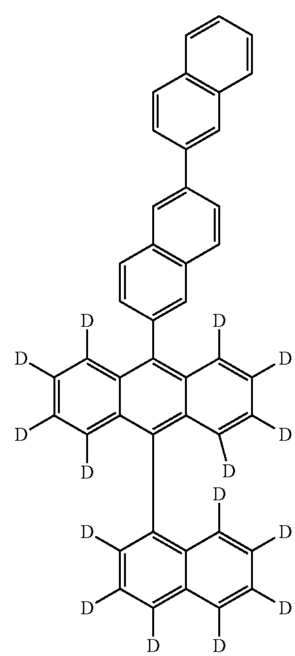

-continued
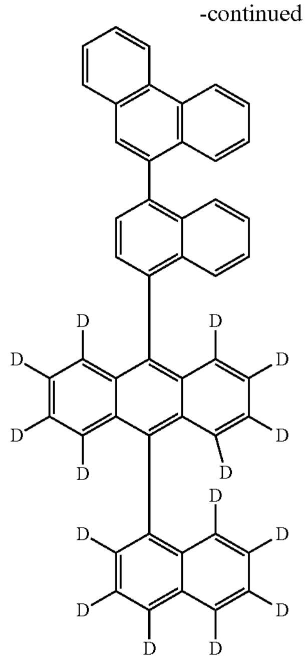
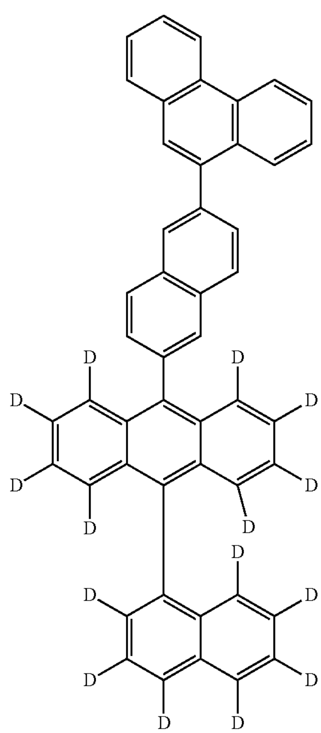
-continued
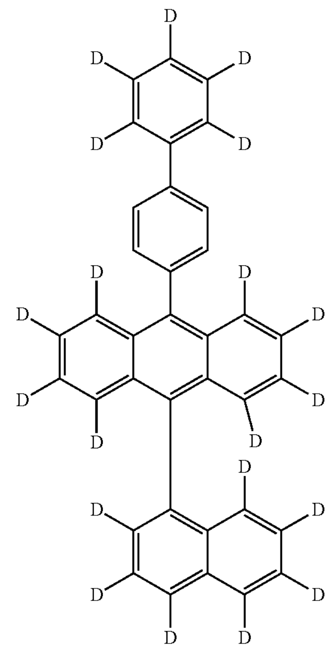
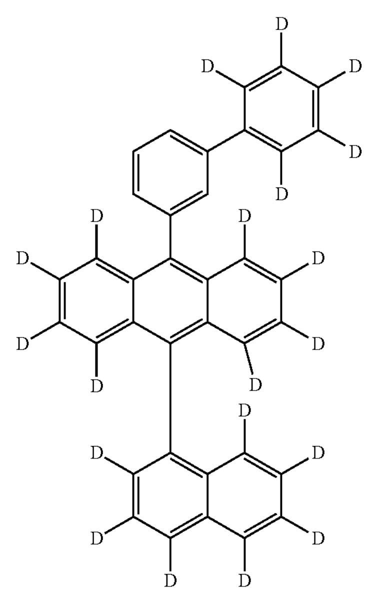

-continued
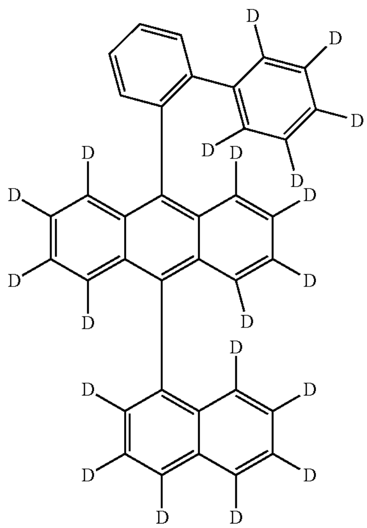
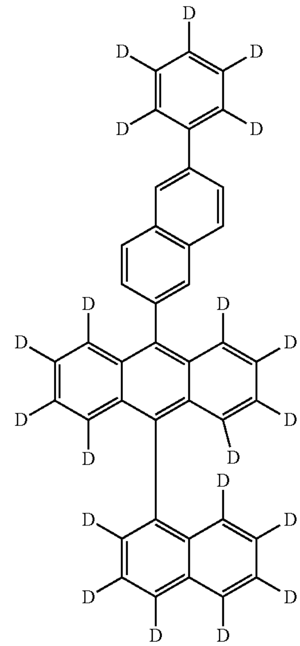
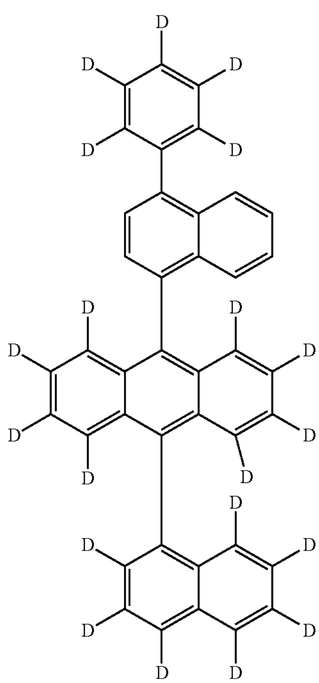
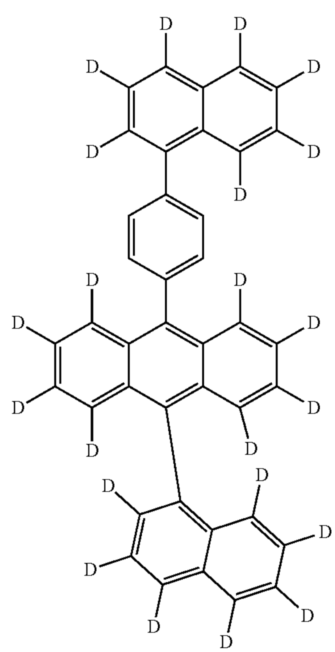

-continued
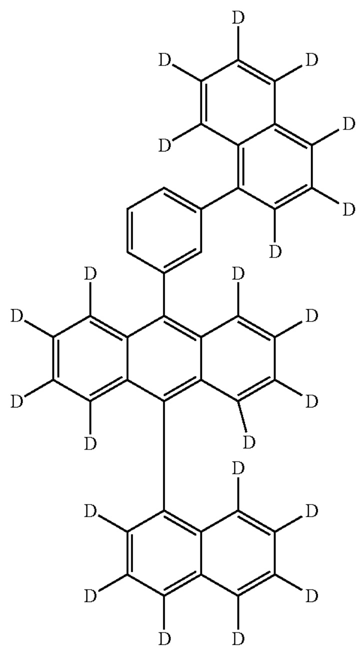
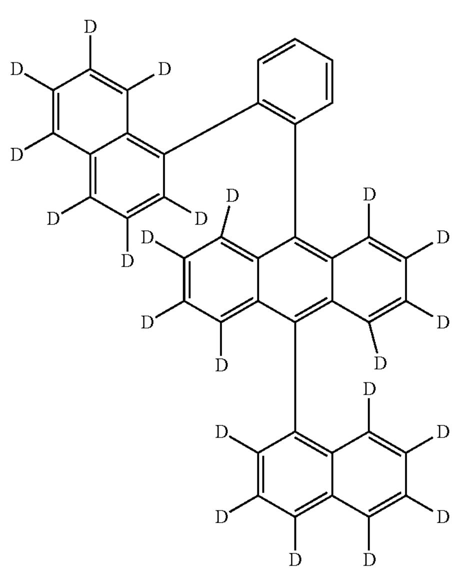
-continued
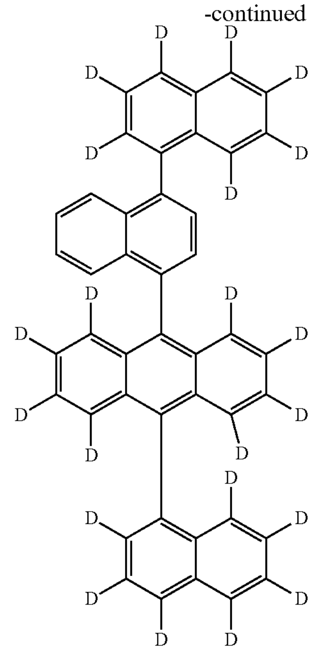
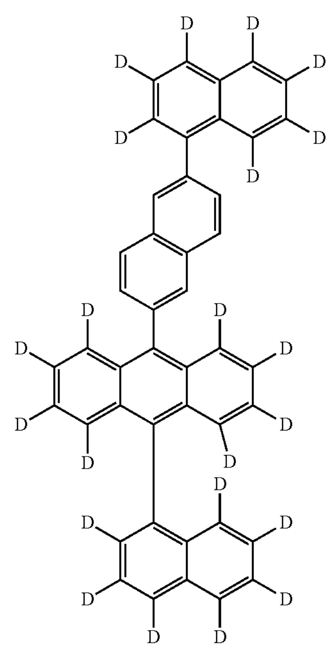

-continued
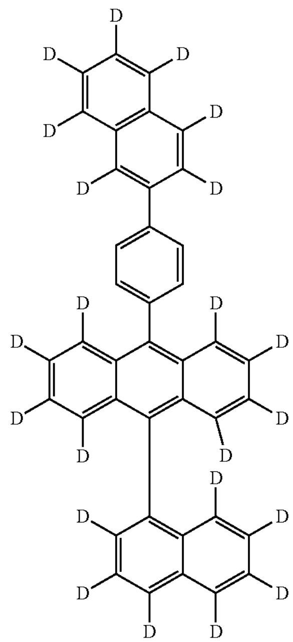
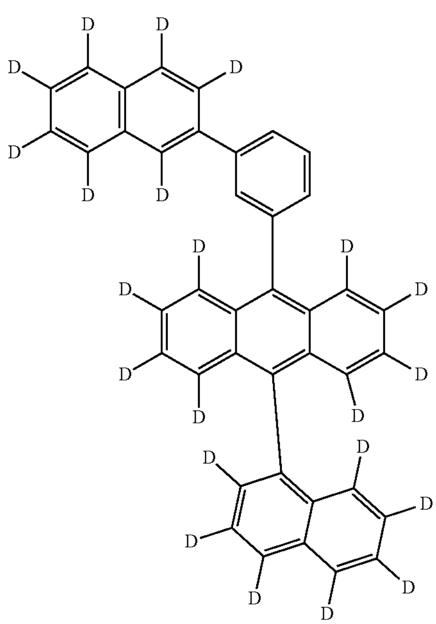
-continued
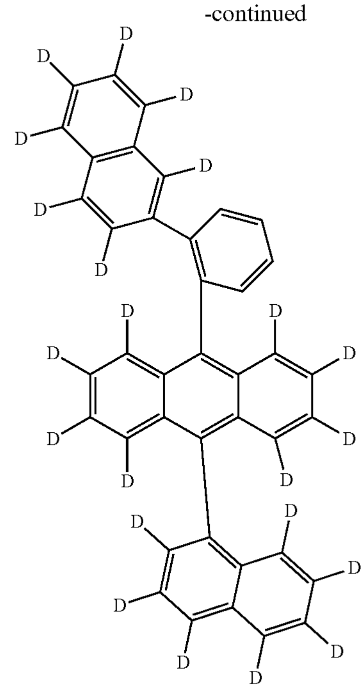
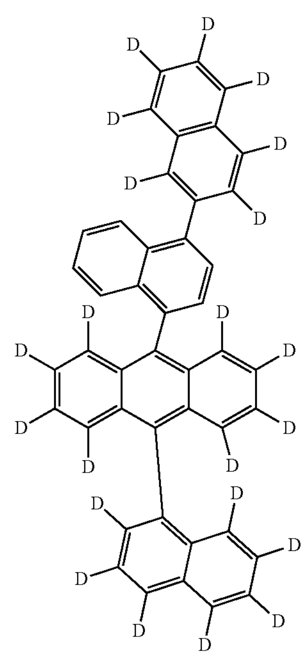

-continued
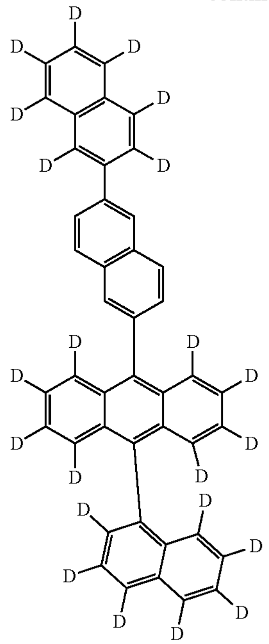
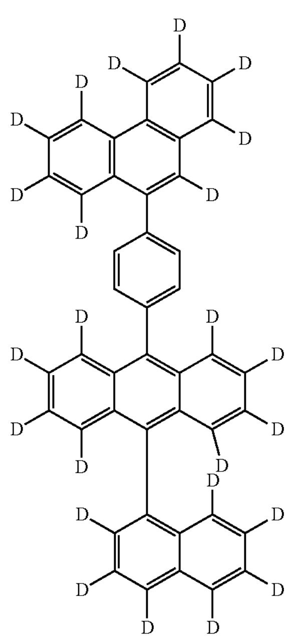
-continued
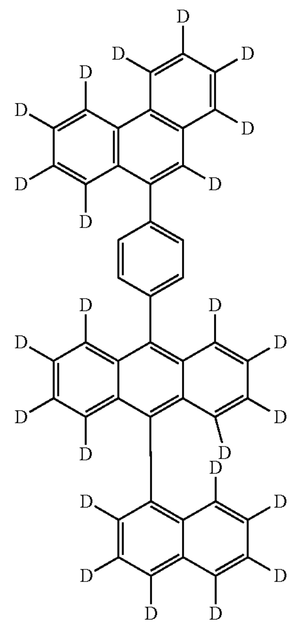
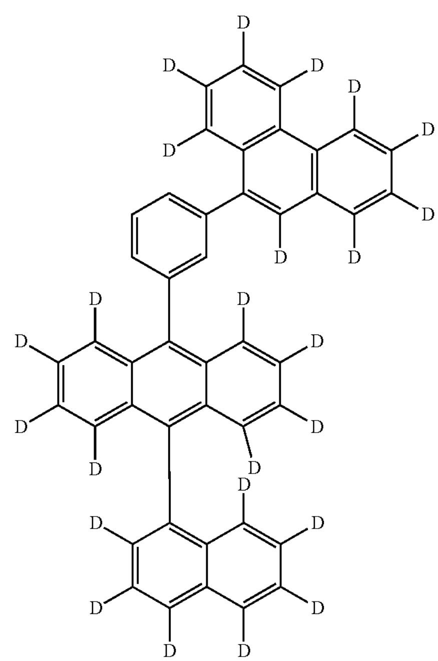

-continued
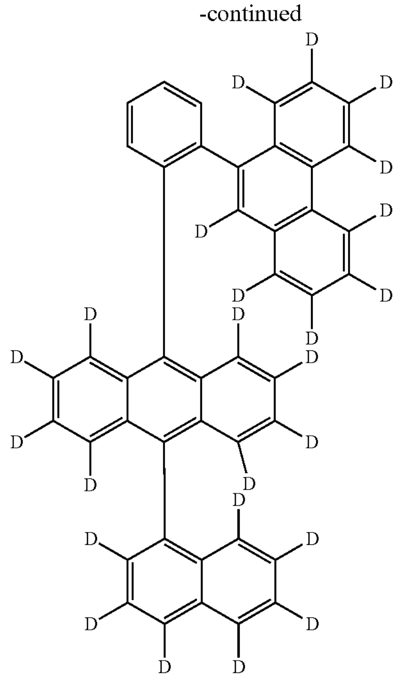
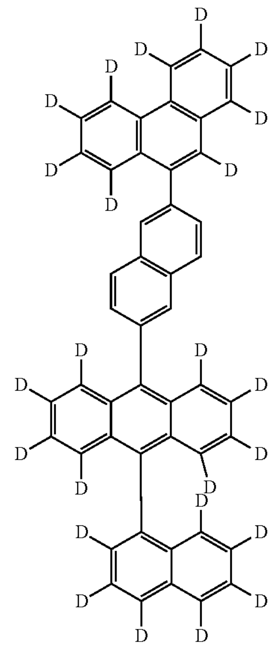 [SMILES: [2H]c1c([2H])c([2H])c2c(-c3c4c([2H])c([2H])c([2H])c([2H])c4c(-c4ccc5cc(-c6c([2H])c7c([2H])c([2H])c([2H])c([2H])c7c7c([2H])c([2H])c([2H])c([2H])c67)ccc5c4)c4c([2H])c([2H])c([2H])c([2H])c34)c([2H])c([2H])c([2H])c2c1[2H]]
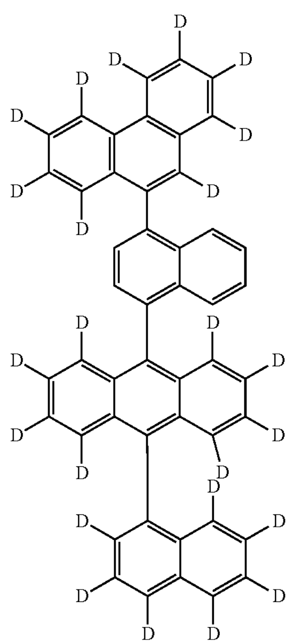
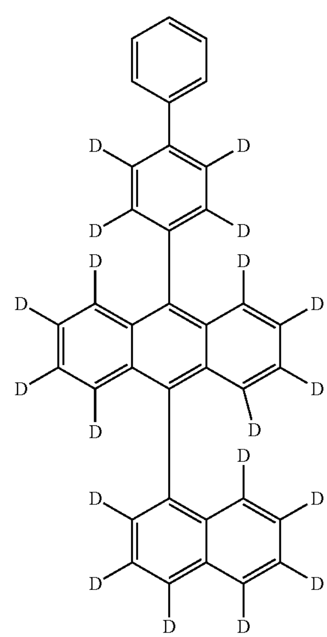

-continued
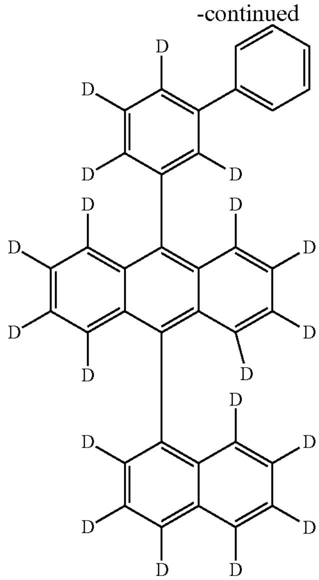
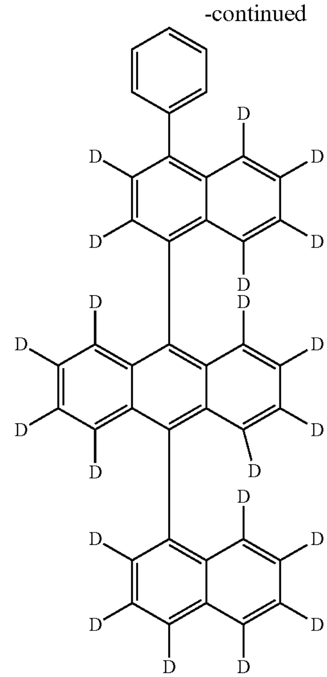
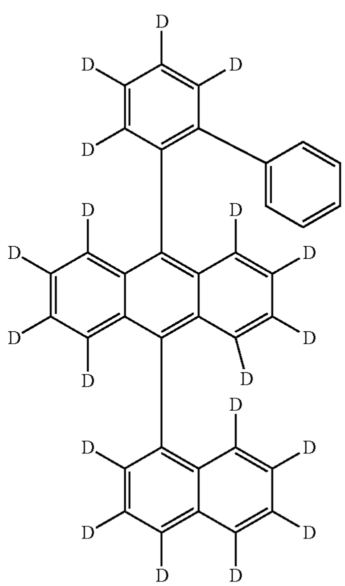
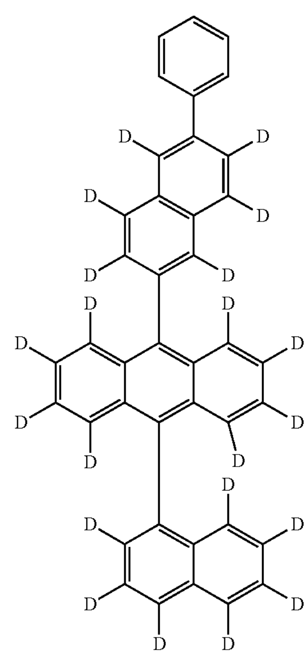

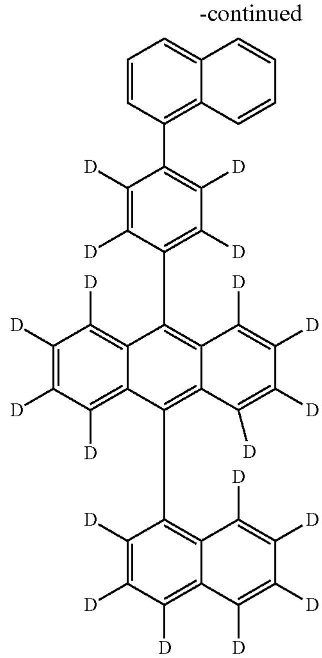
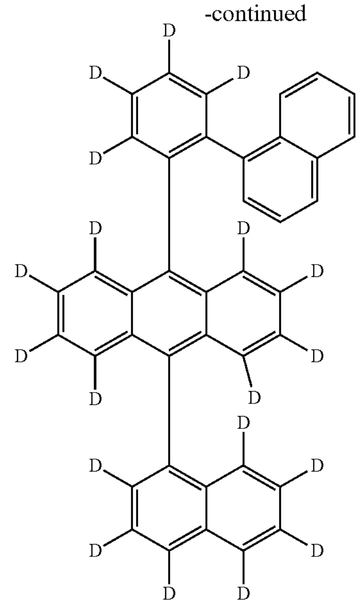
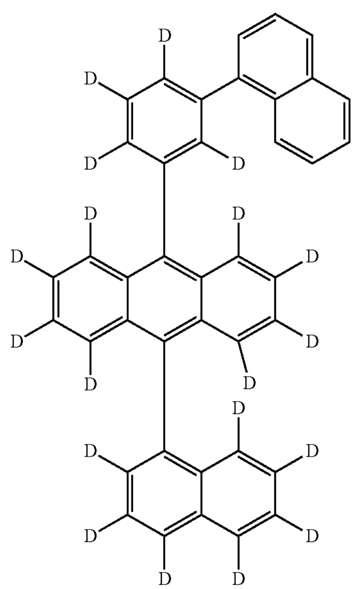
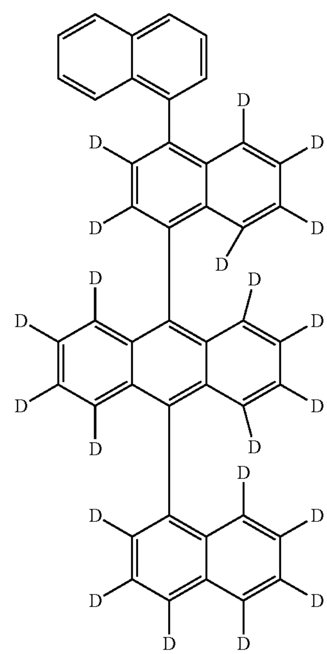

-continued
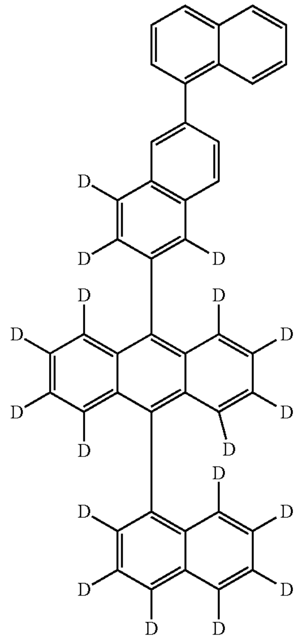
-continued
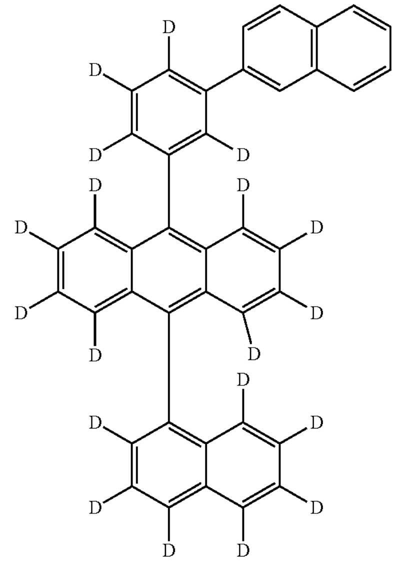
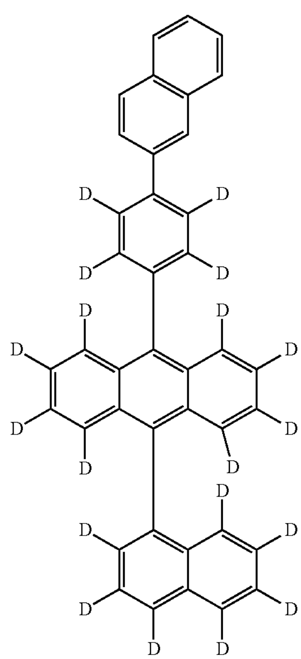
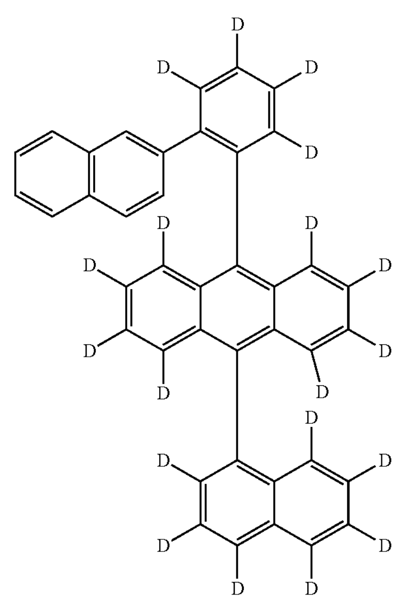

-continued
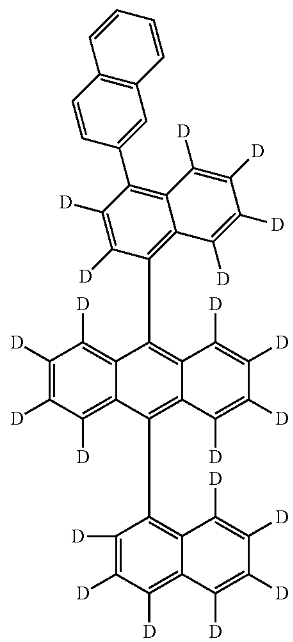
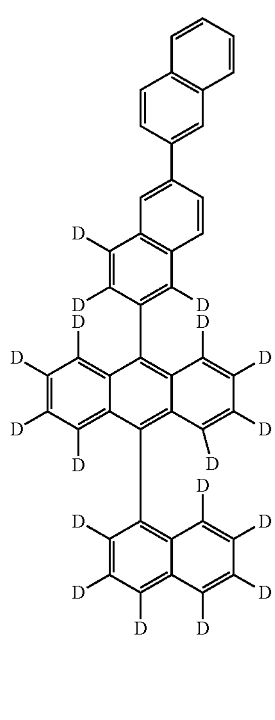
-continued
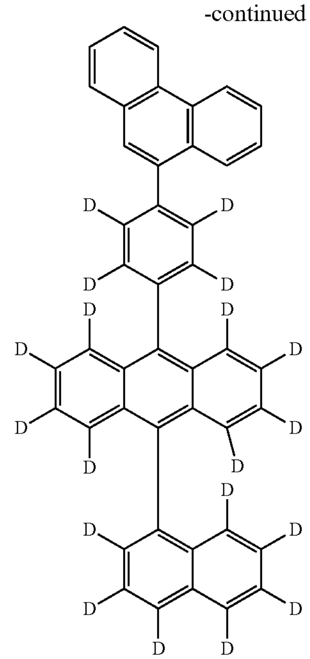
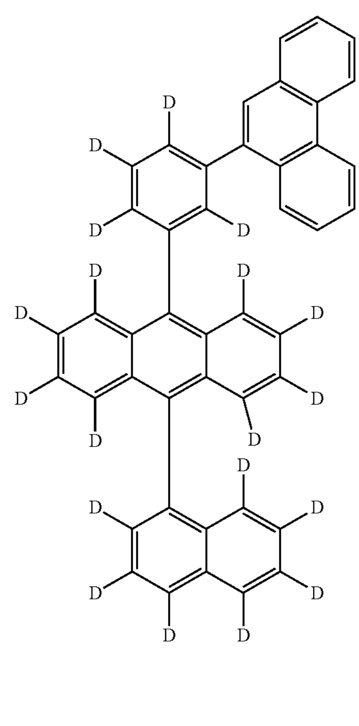

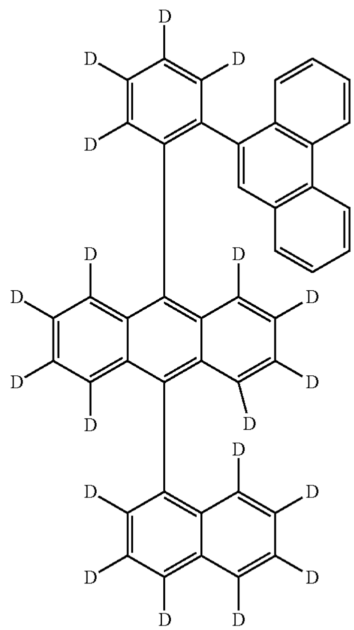
D
D
D
D
D
D
D
D
D
D
D
D
D
D
D
D
D
D
D
D
D
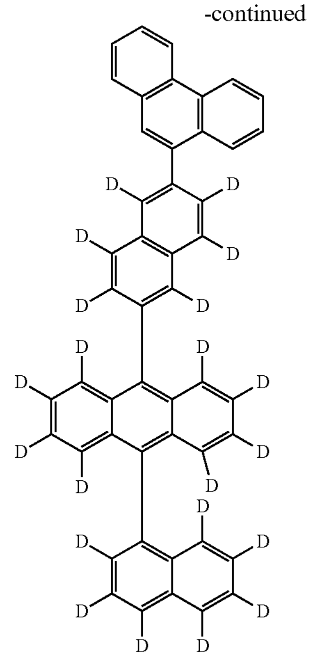
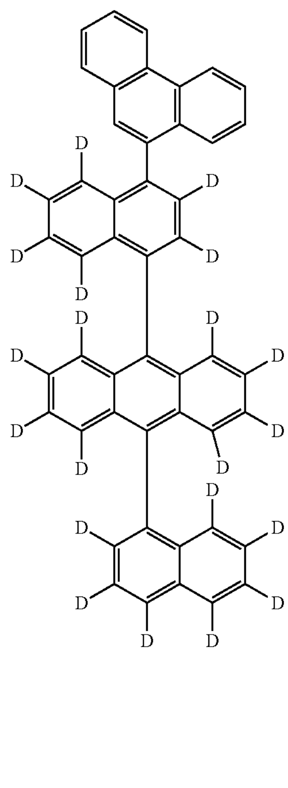
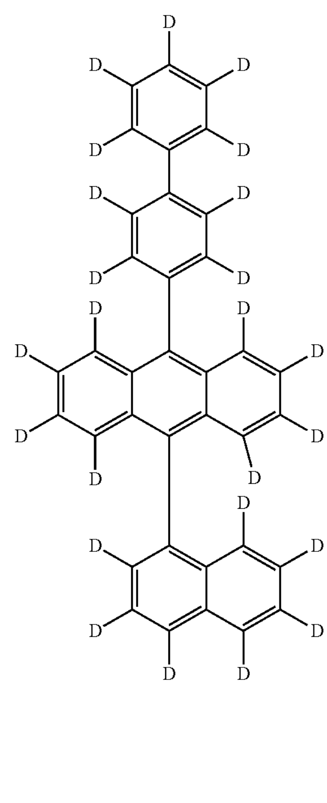

-continued
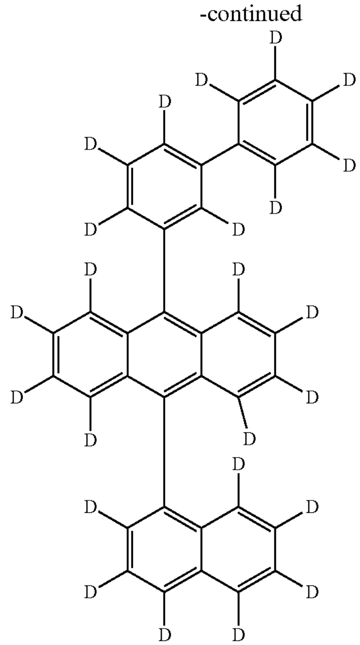
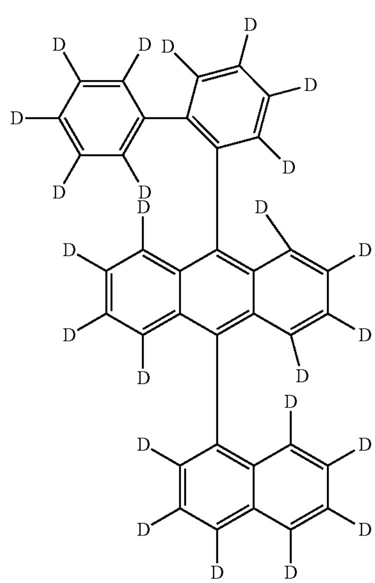
-continued
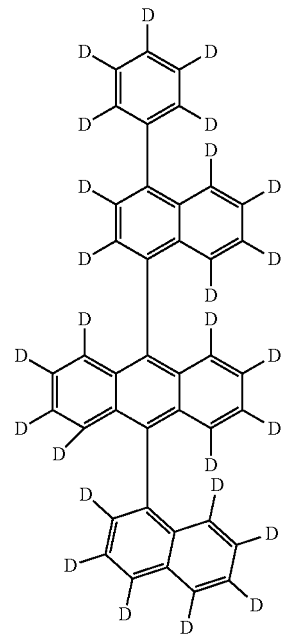
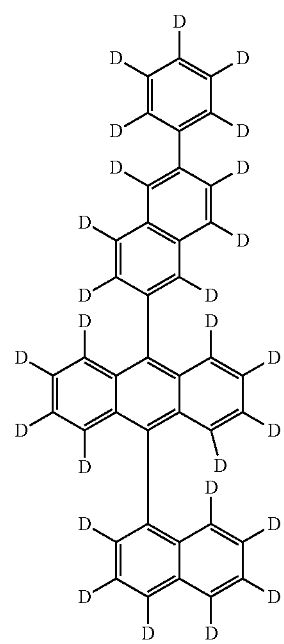

-continued
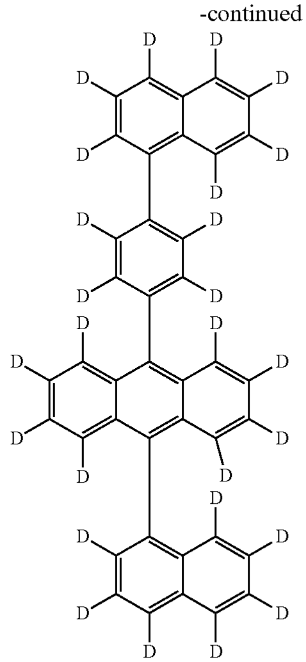
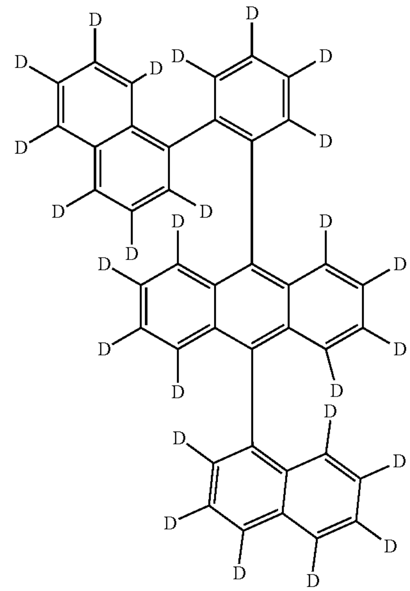
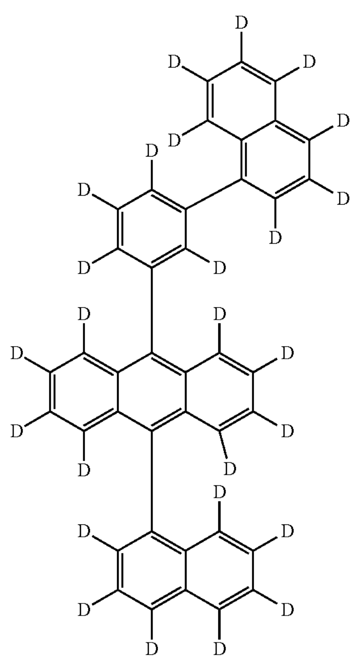
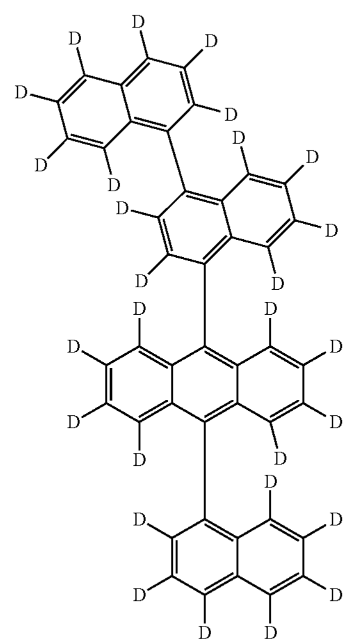

-continued
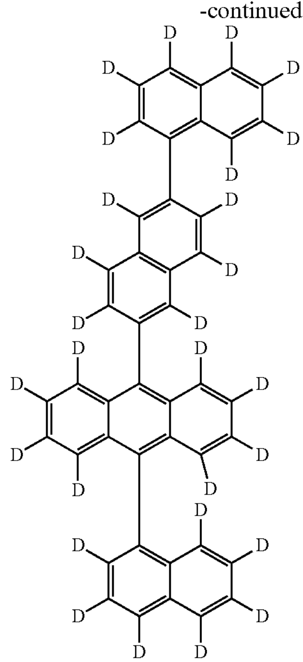
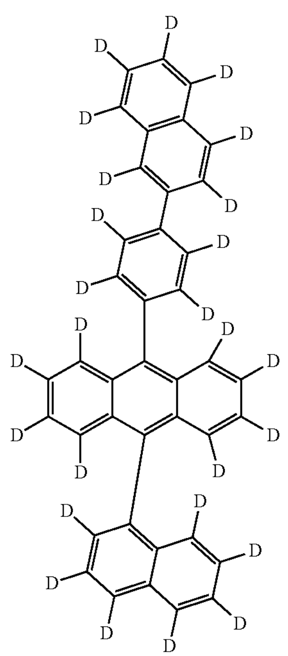
-continued
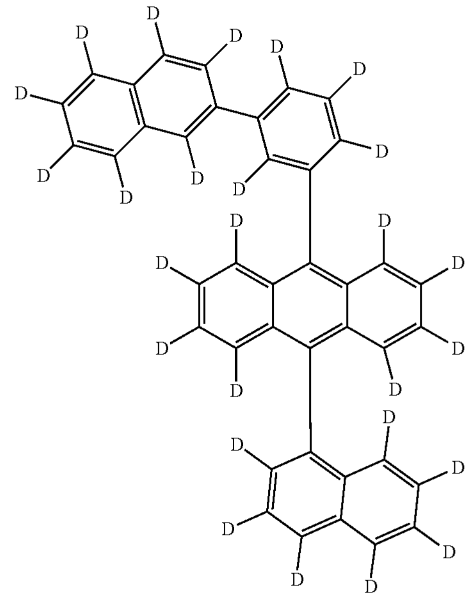
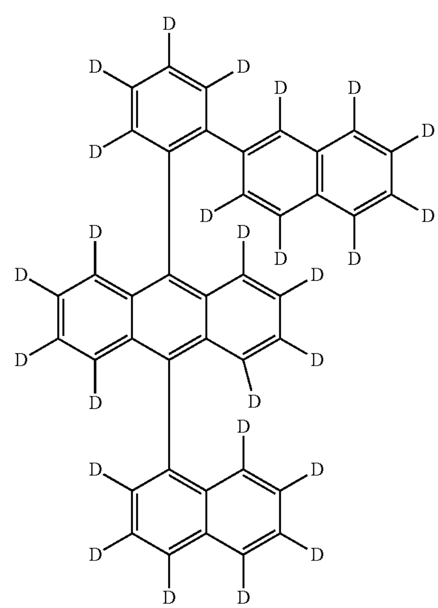

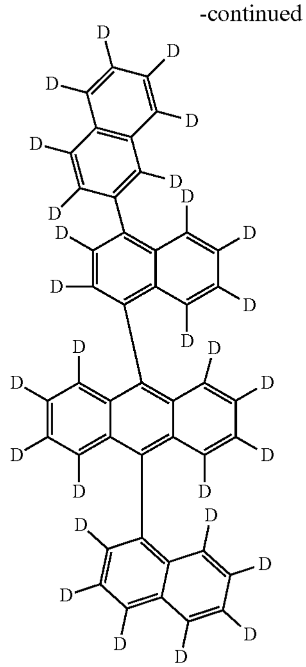
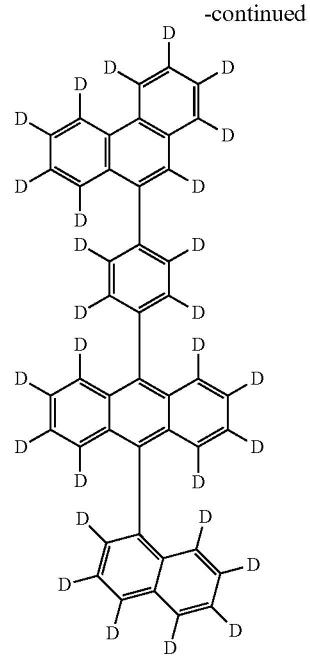
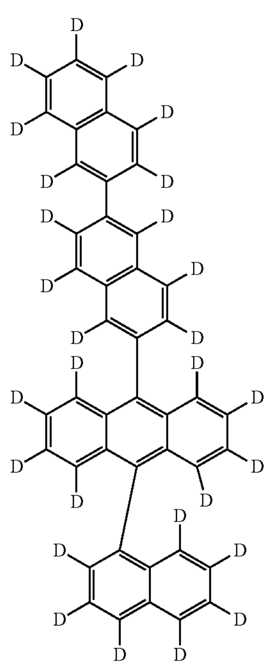
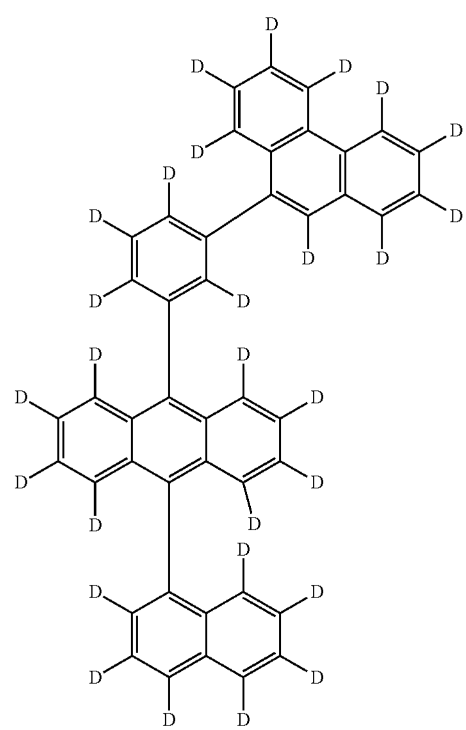

-continued
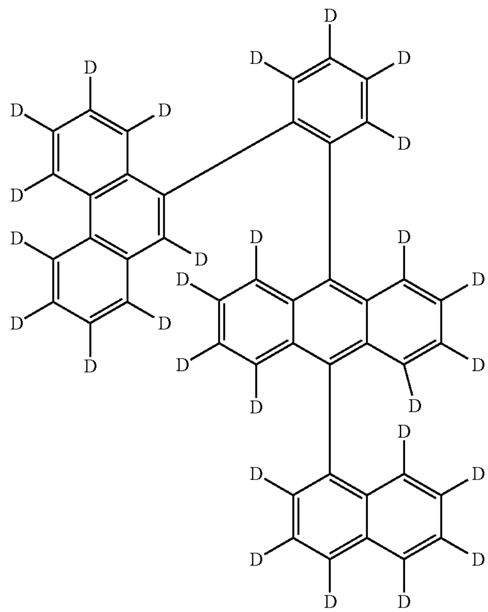
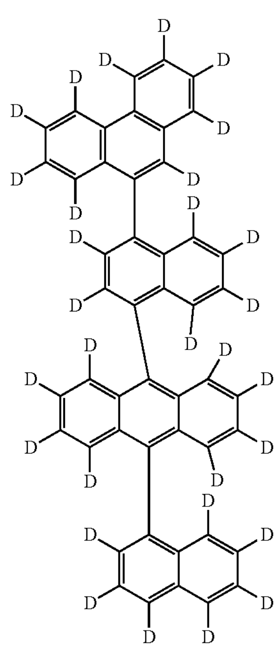
-continued
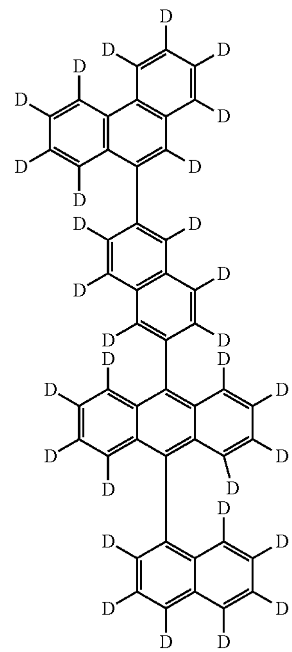
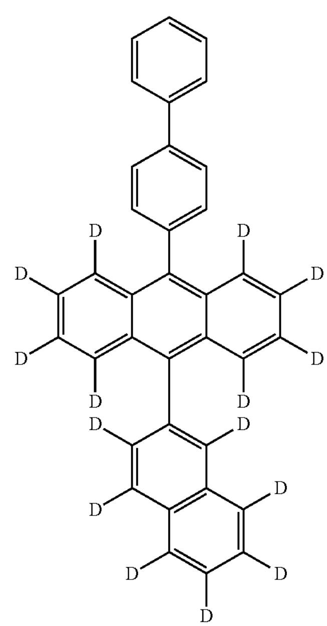

-continued
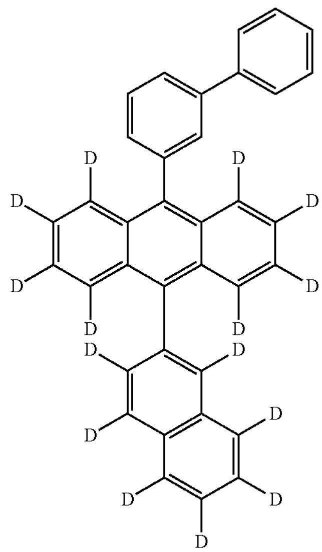
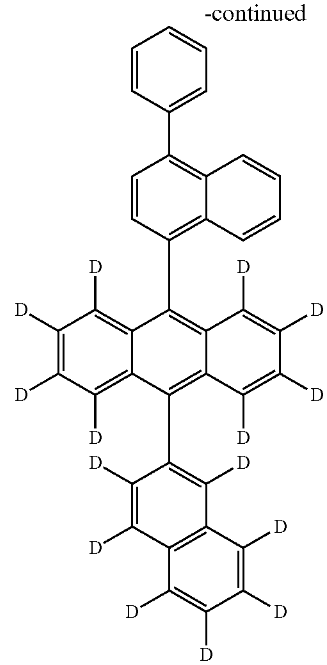
-continued
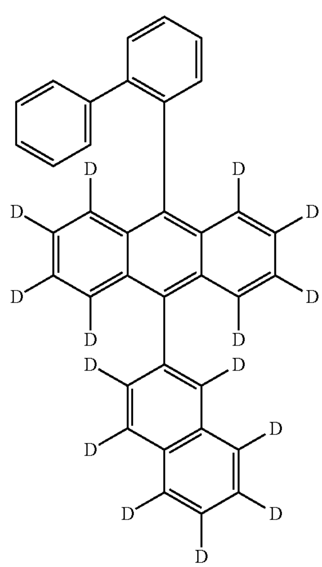
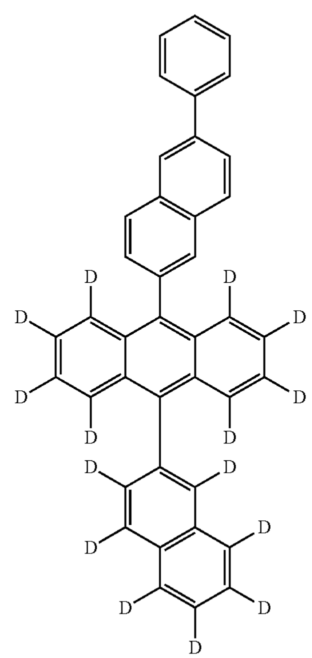

-continued
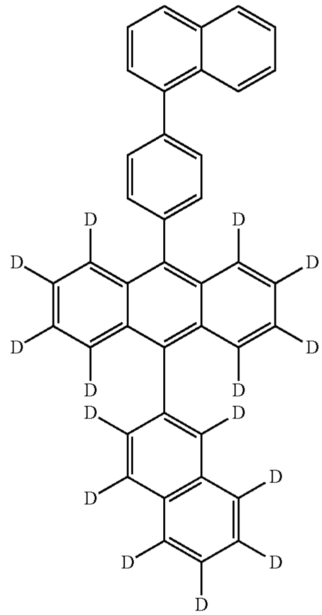
-continued
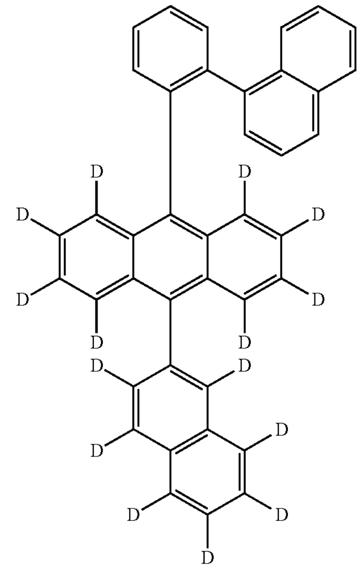
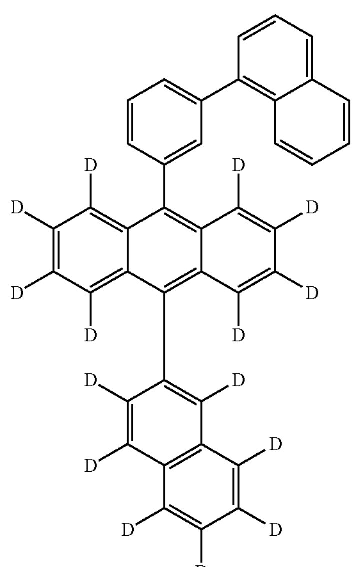
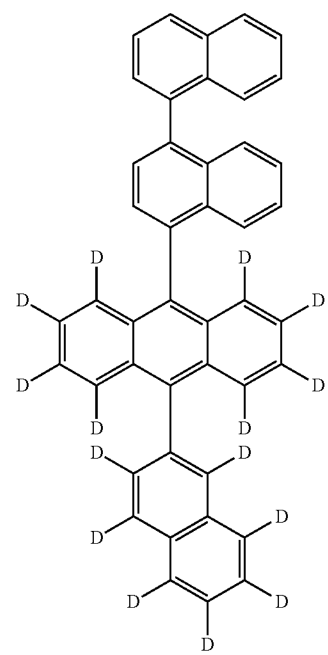

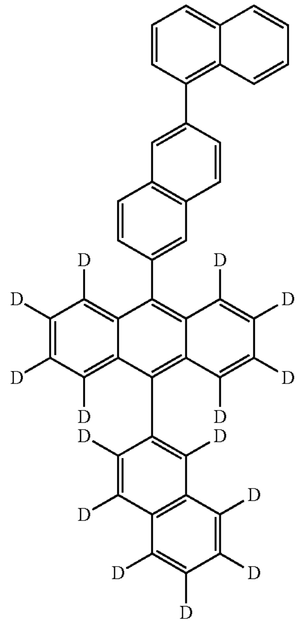
D
D
D
D
D
D
D
D
D
D
D
D
D
D
D
D
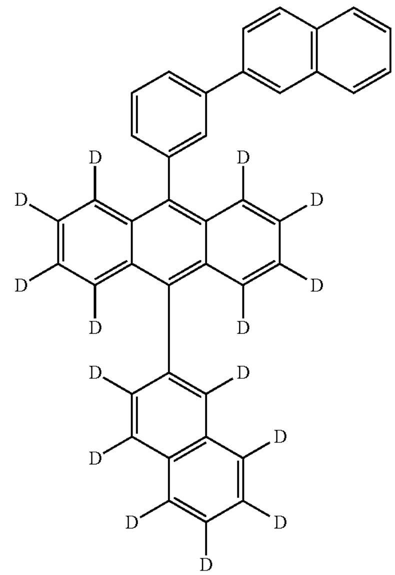
D
D
D
D
D
D
D
D
D
D
D
D
D
D
D
D
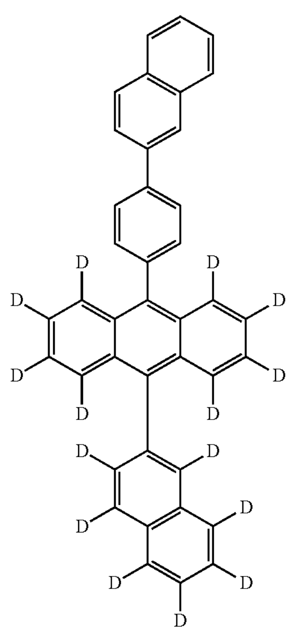
D
D
D
D
D
D
D
D
D
D
D
D
D
D
D
D
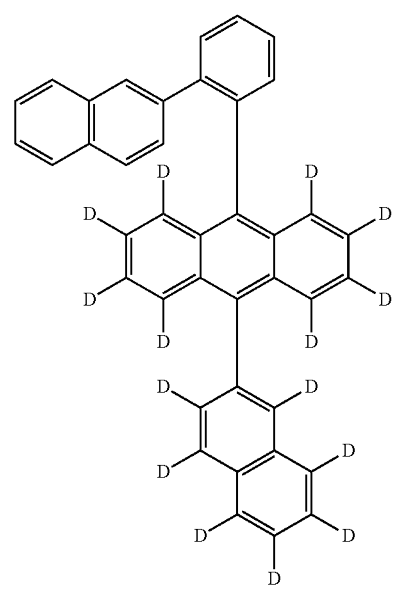
D
D
D
D
D
D
D
D
D
D
D
D
D
D
D
D

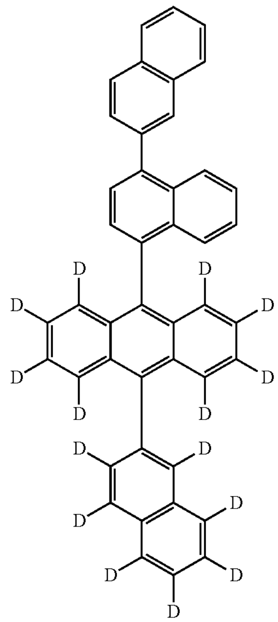
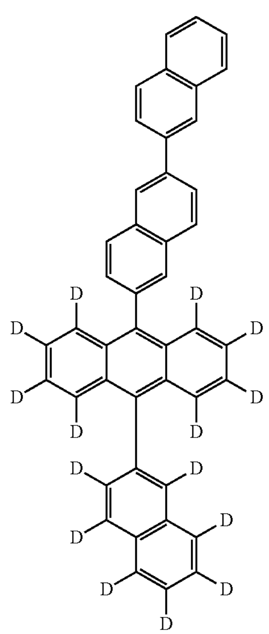
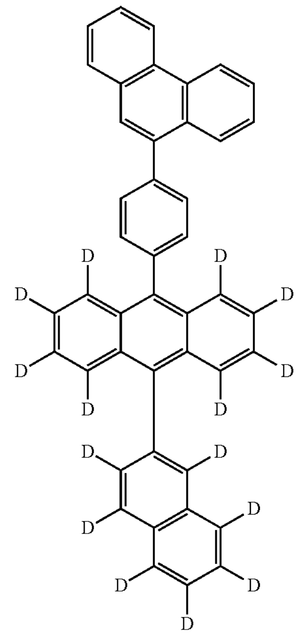
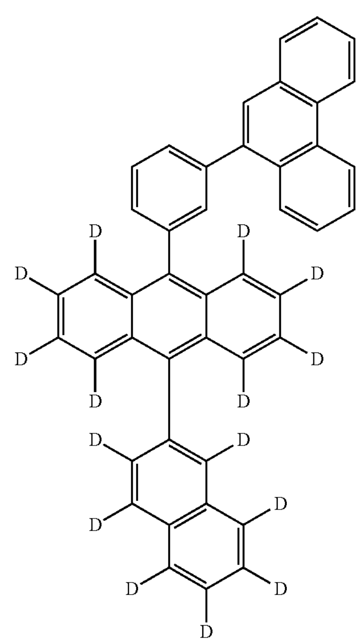

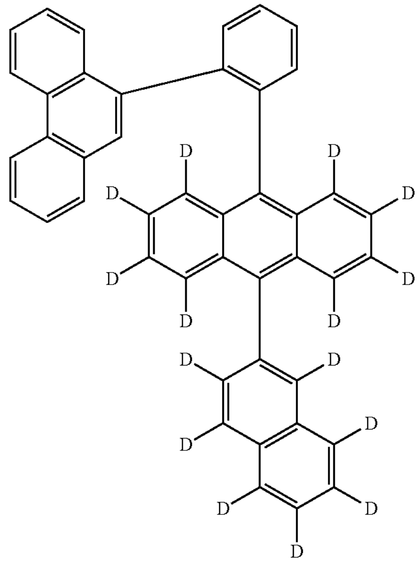
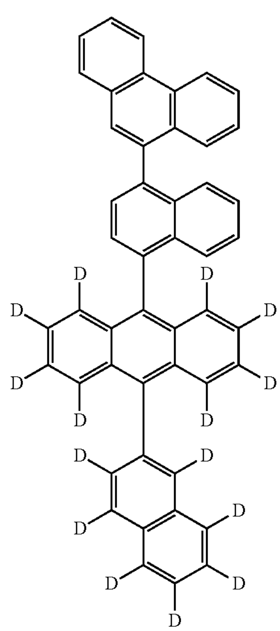
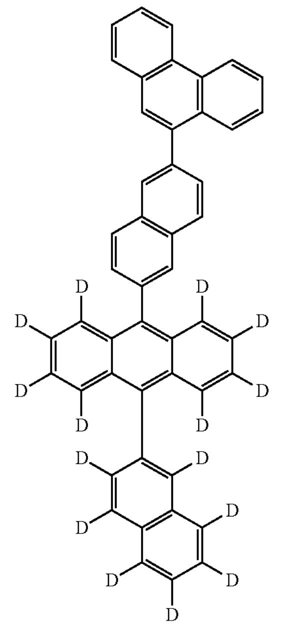
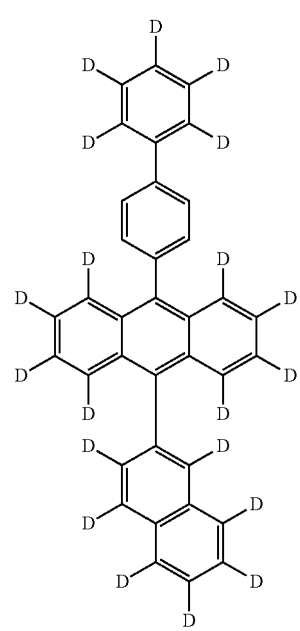

-continued
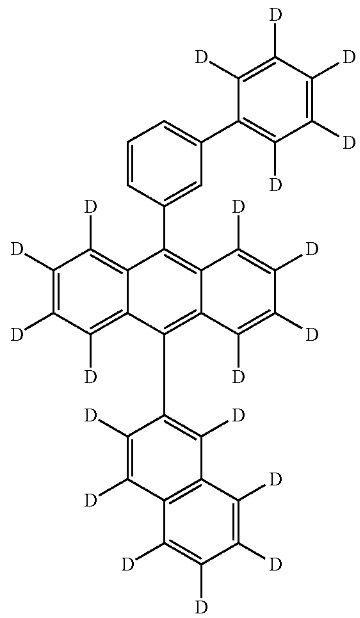
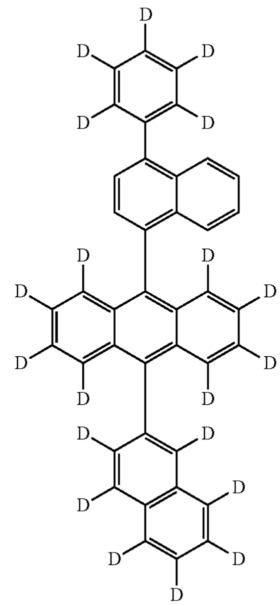
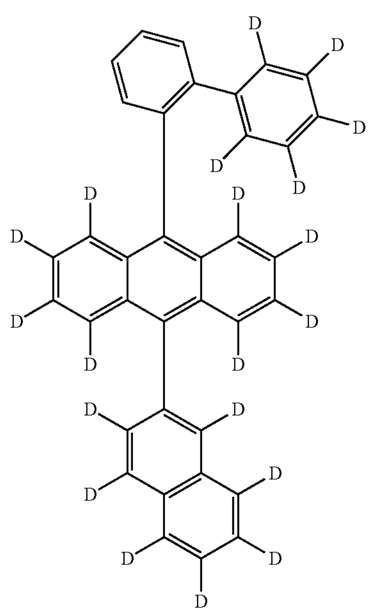
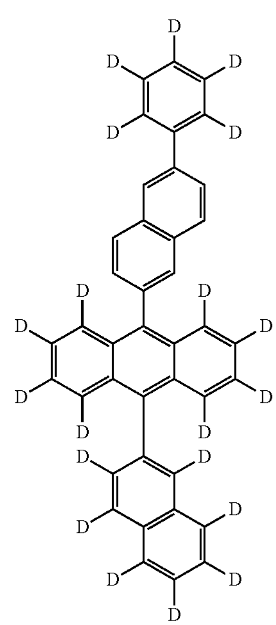

-continued
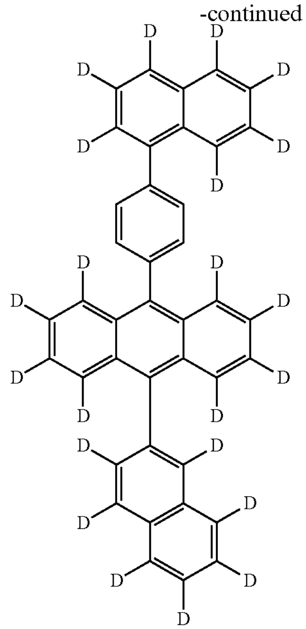
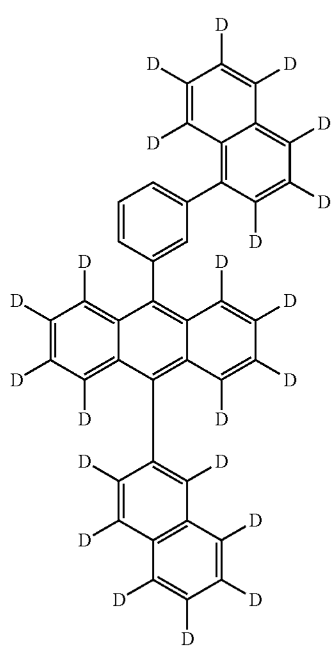
-continued
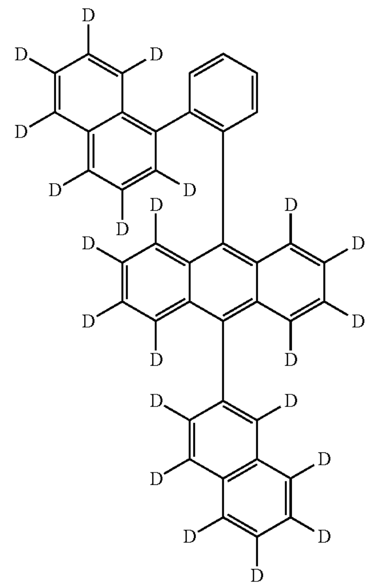
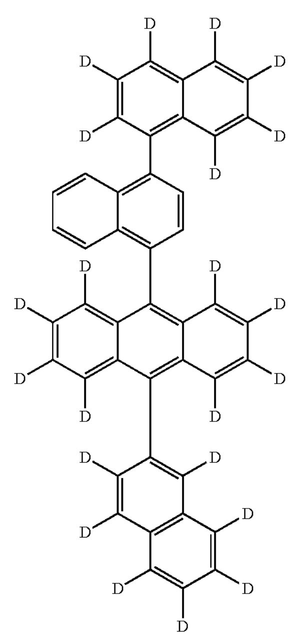

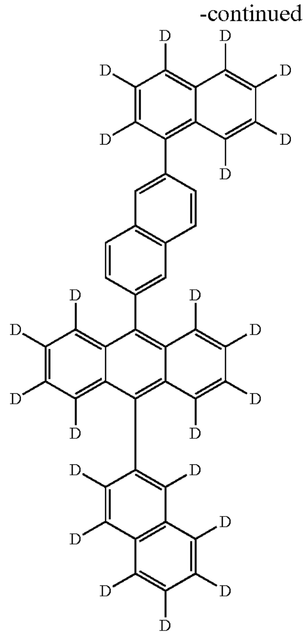
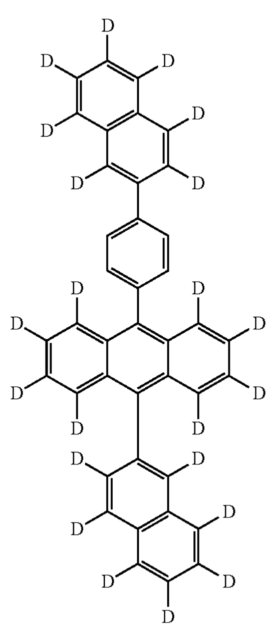
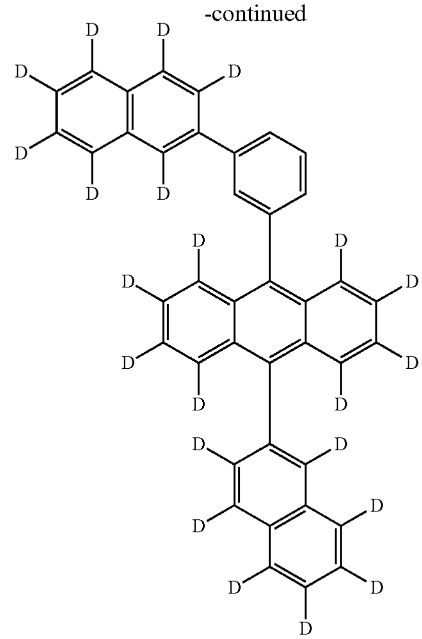
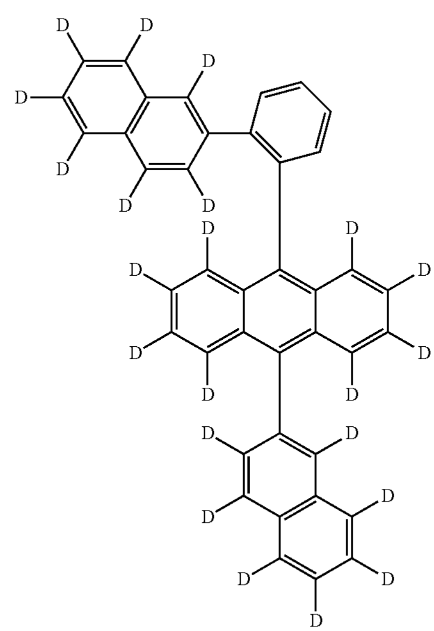

-continued
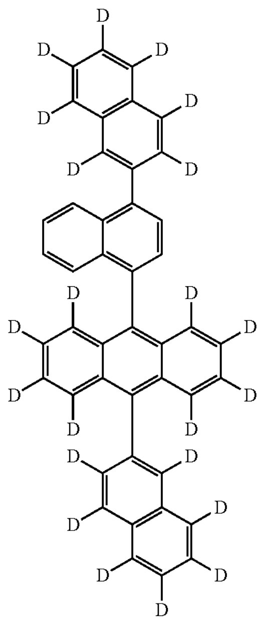
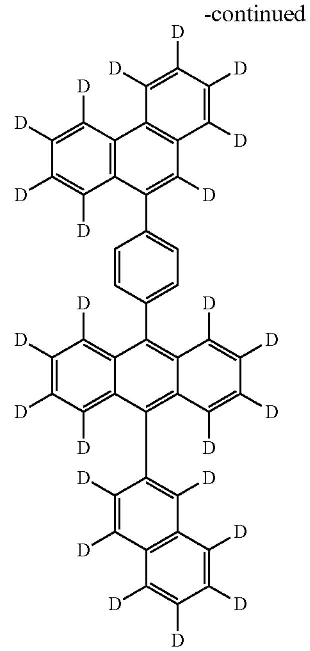
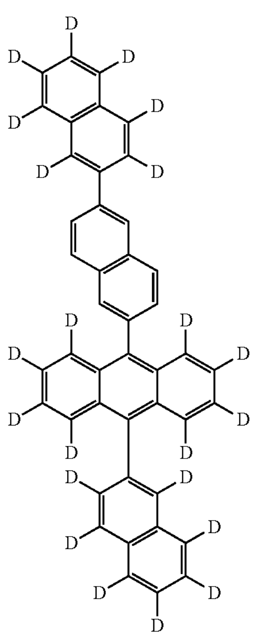
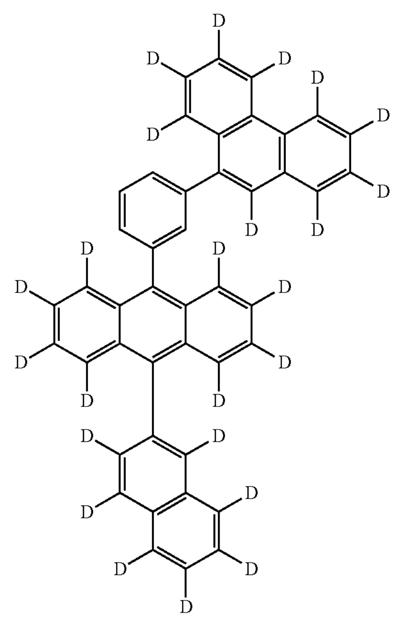
-continued

-continued
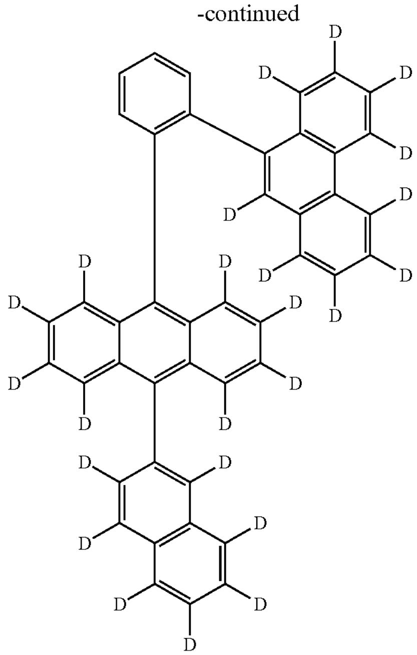
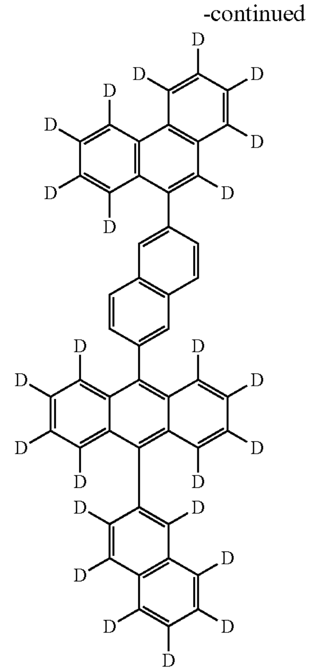
-continued
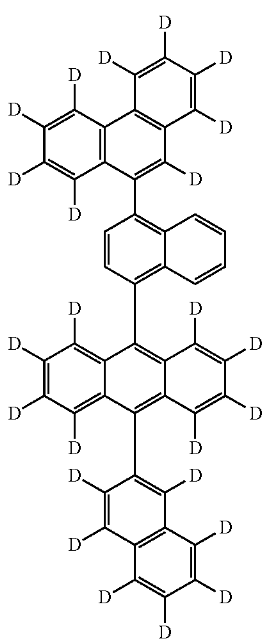
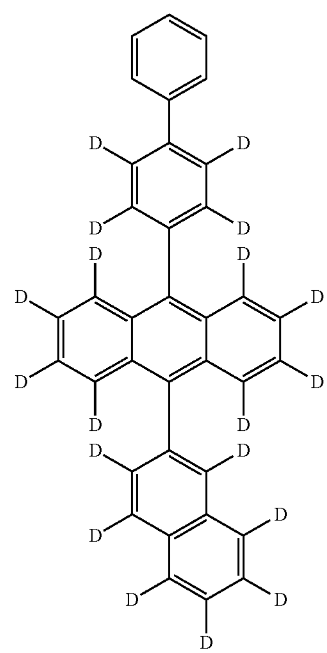

-continued
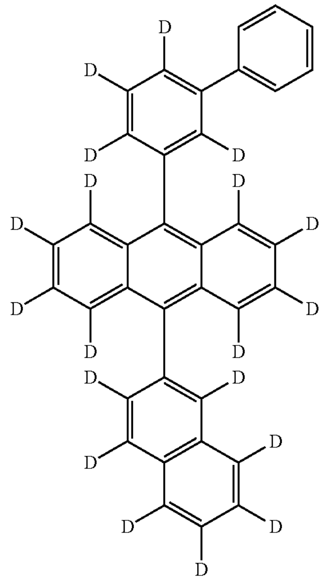
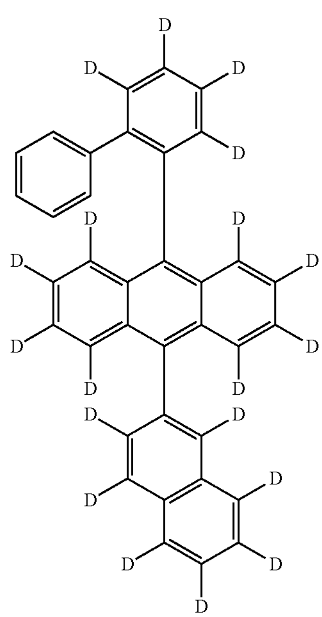
-continued
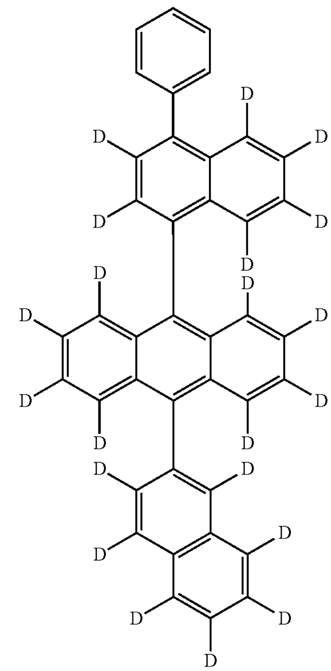
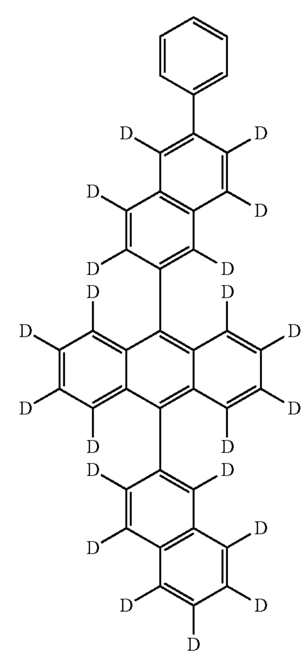

-continued
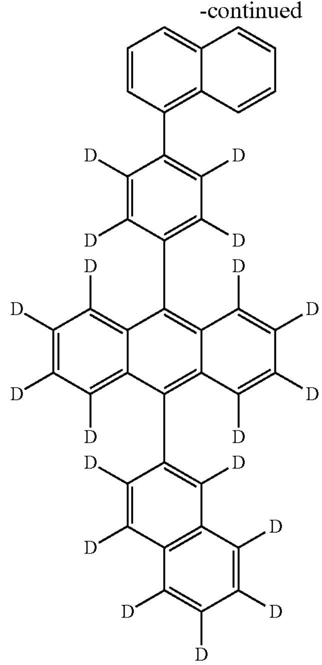
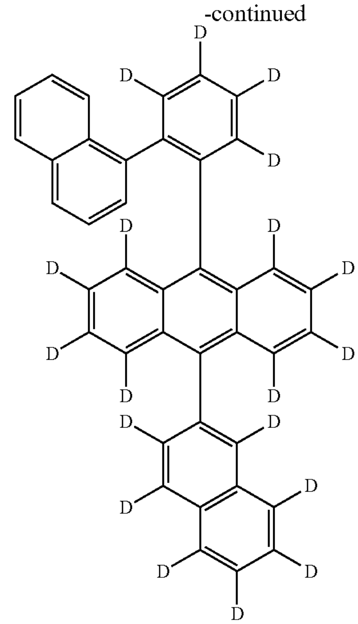
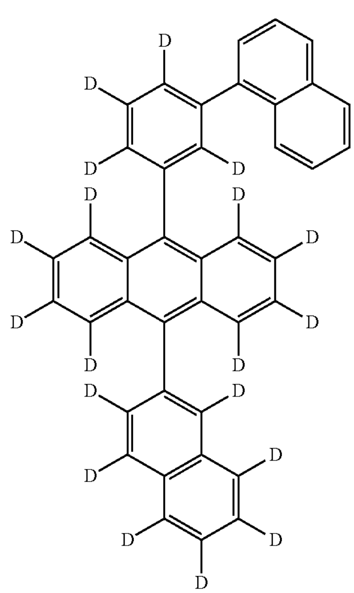
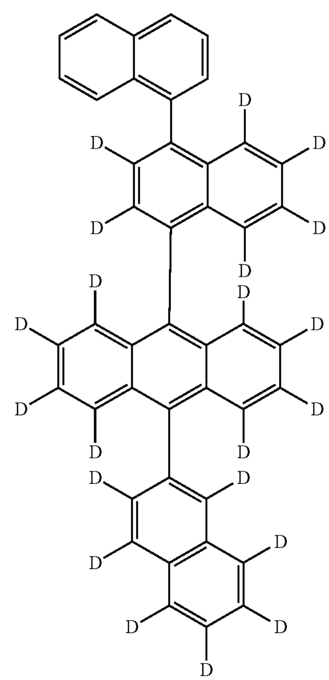

-continued
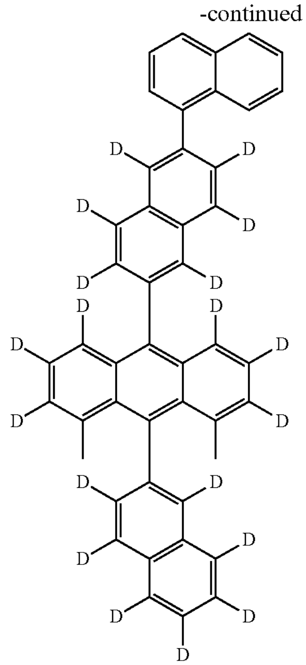
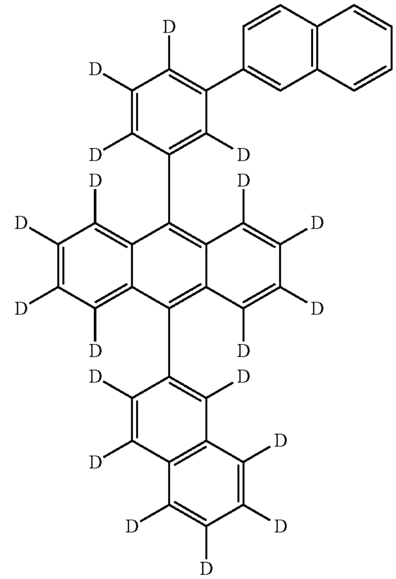
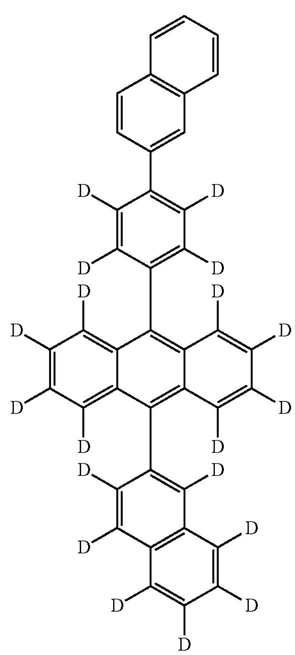
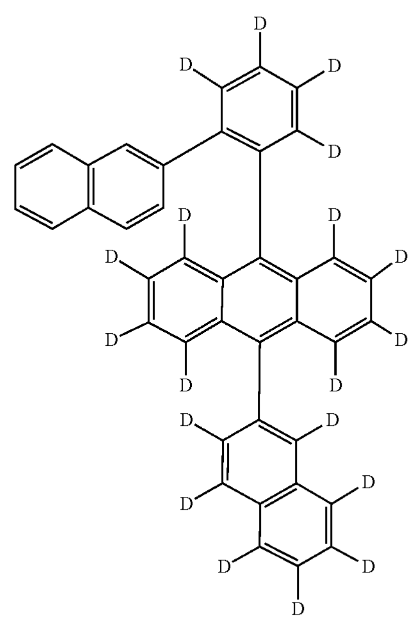

-continued
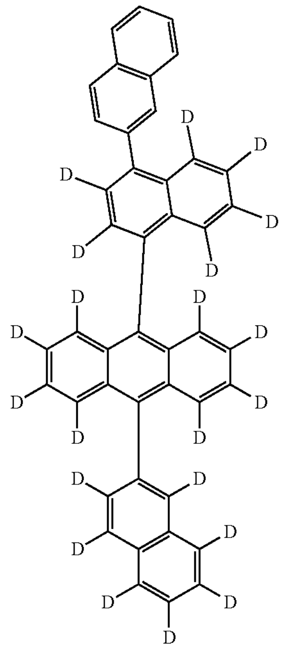
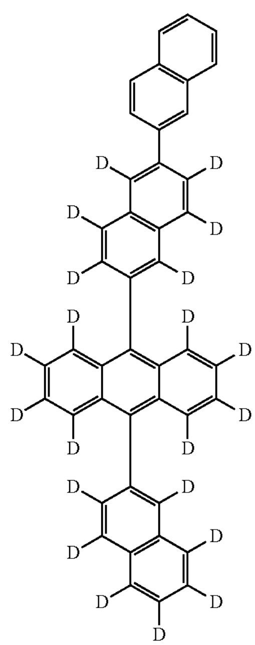
-continued
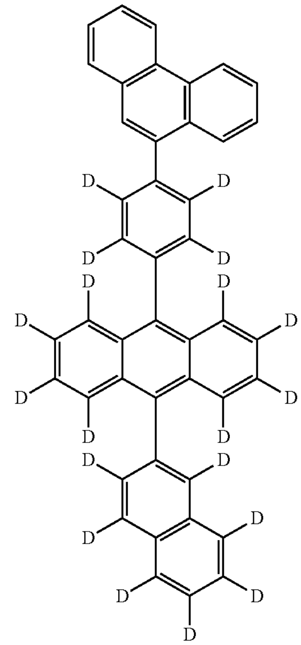
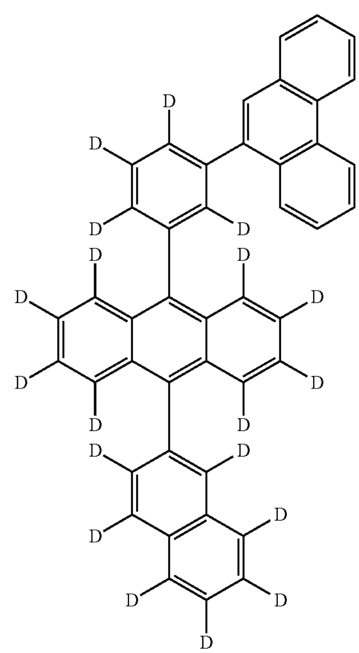

-continued
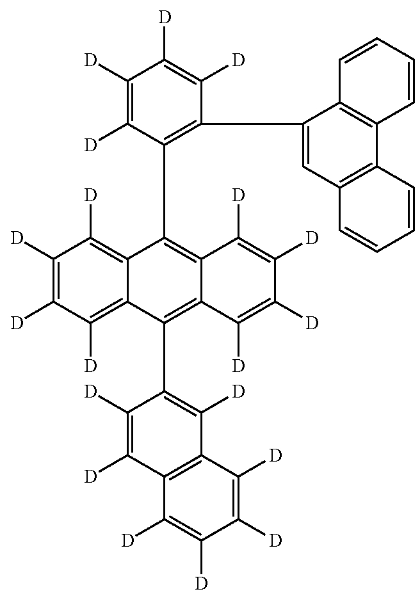
-continued
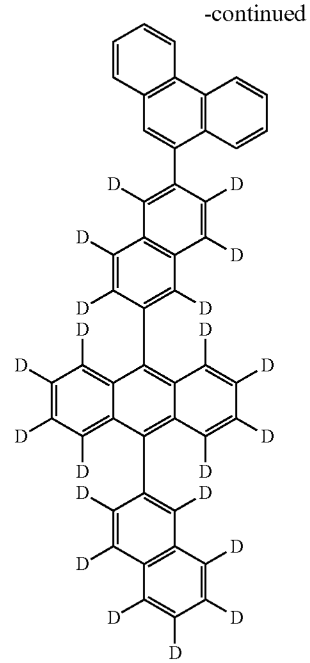
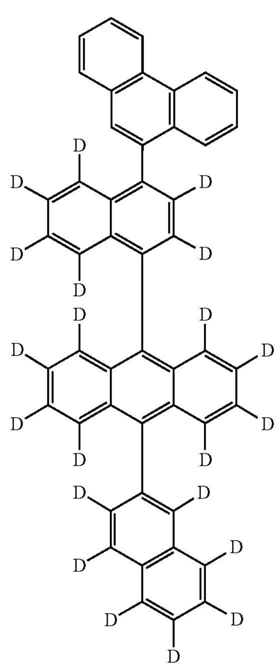
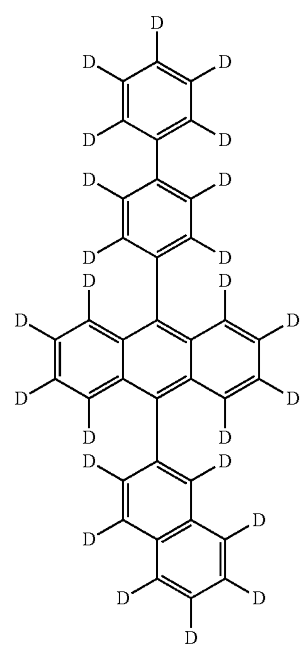

-continued
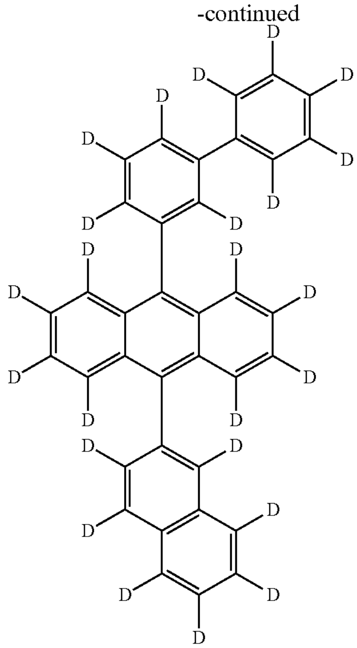
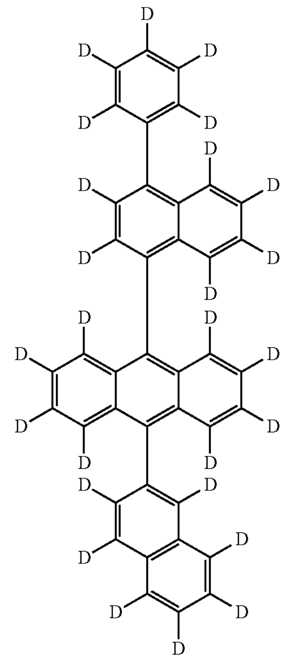
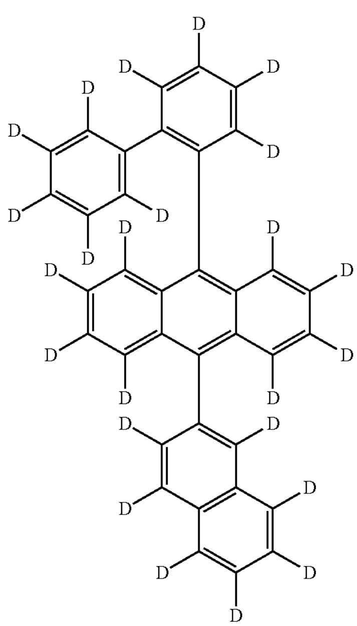
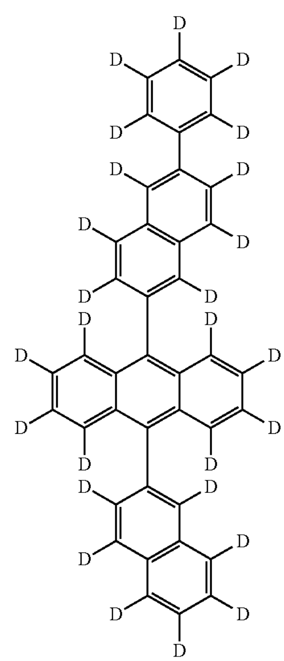

-continued
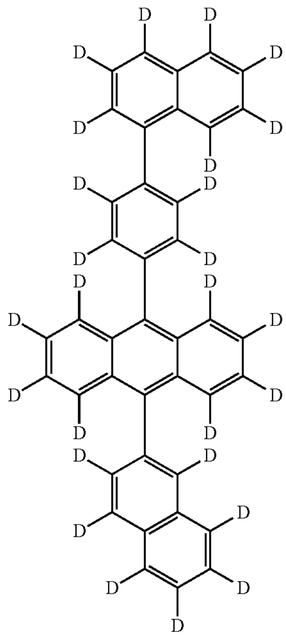
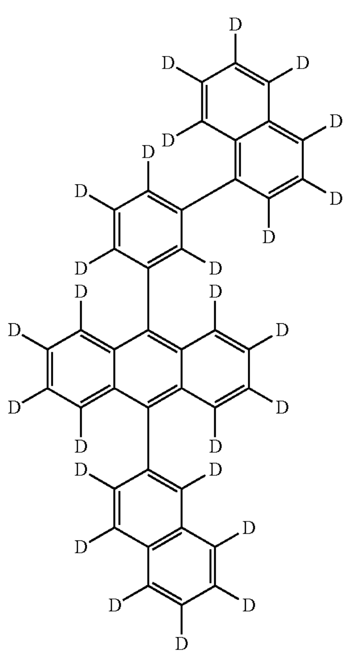
-continued
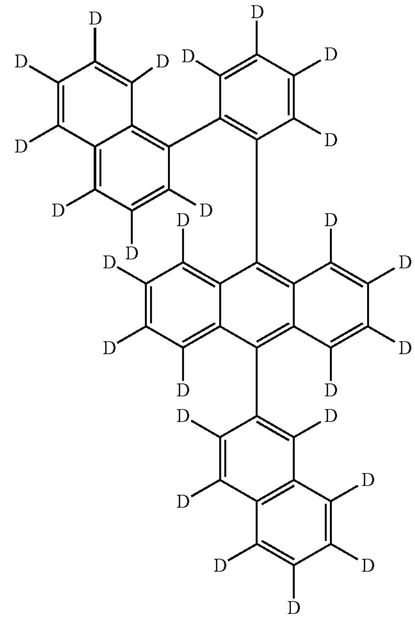
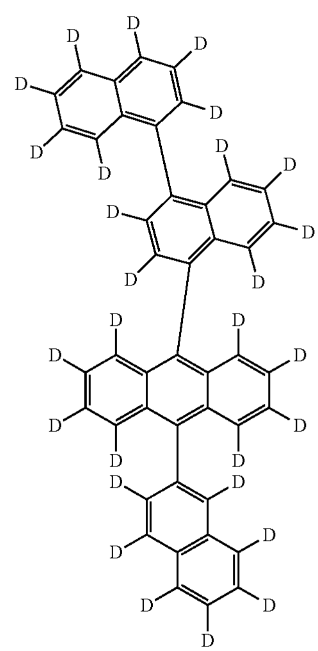

-continued
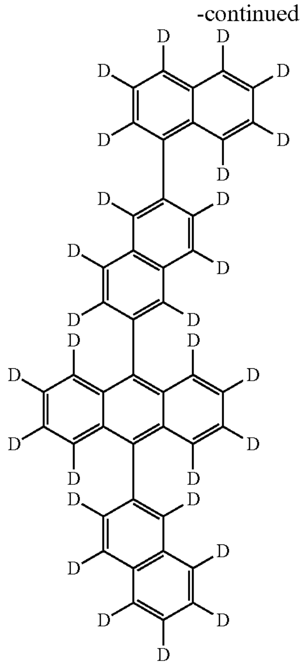
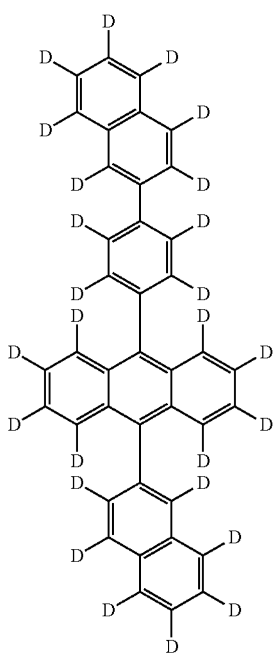
-continued
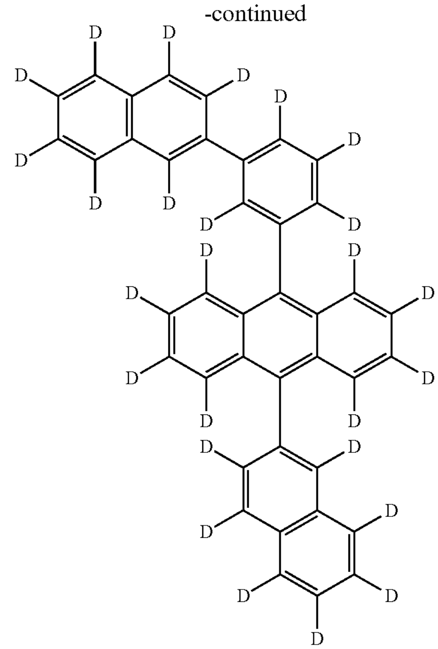
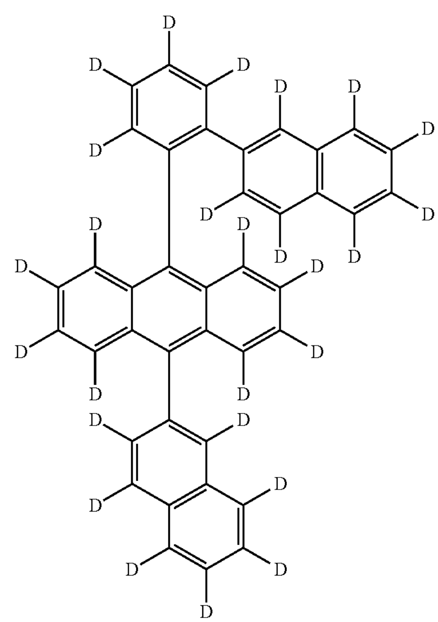

-continued
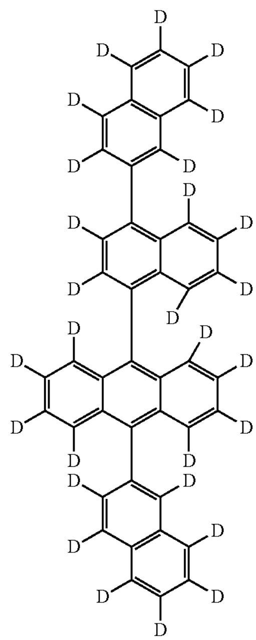
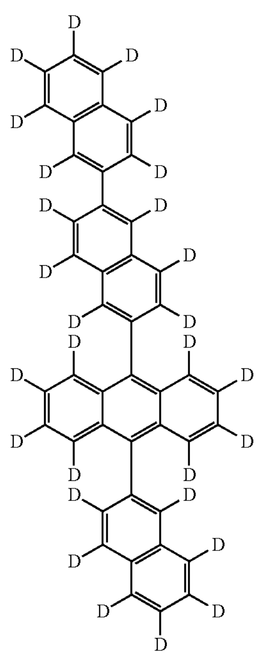
-continued
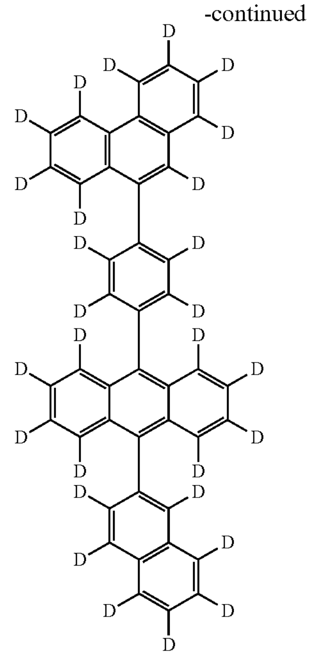
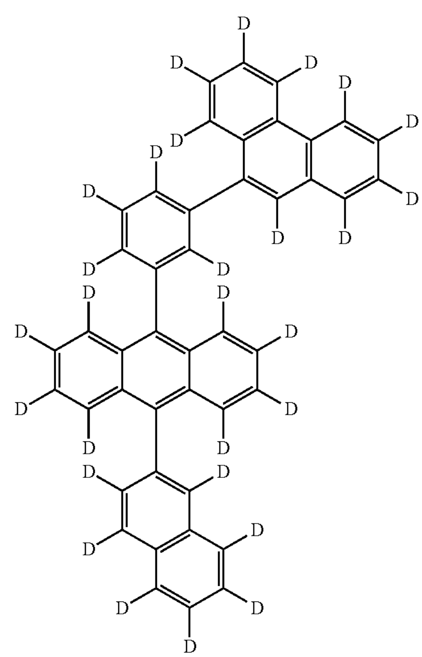

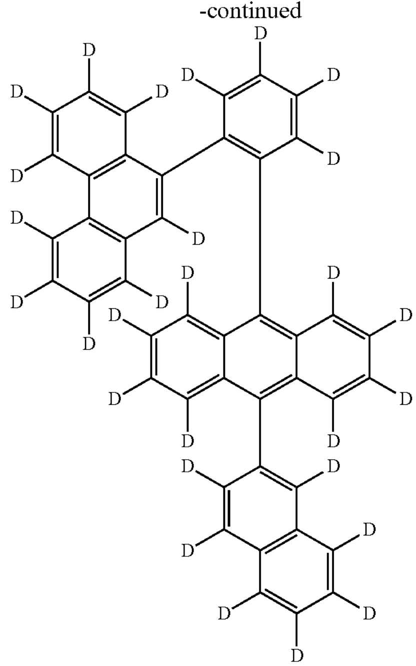
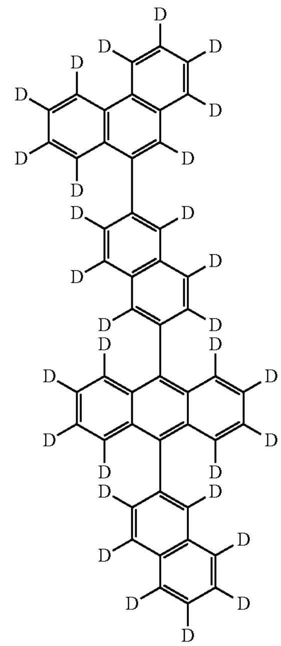
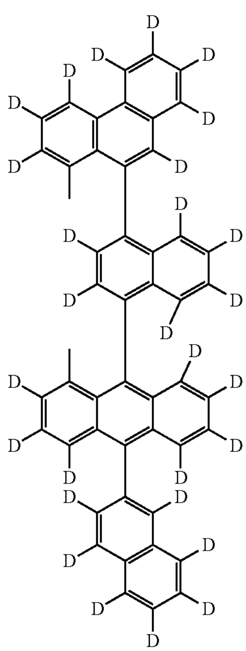
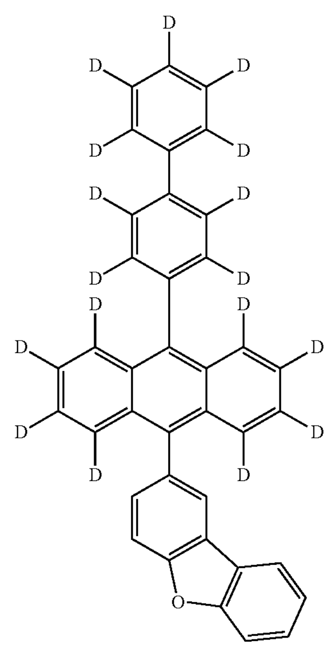

-continued
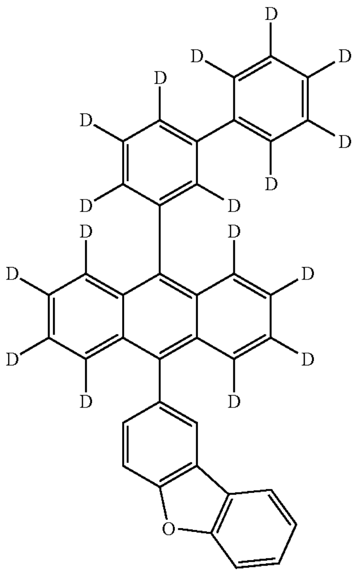
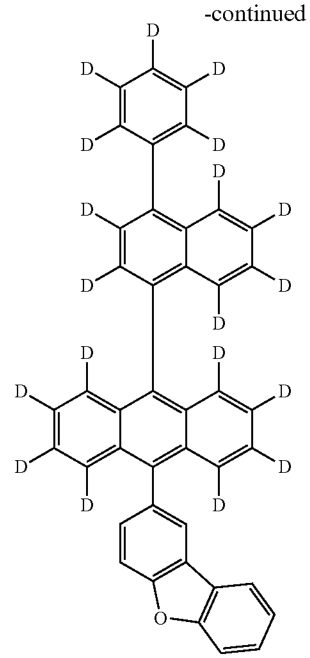
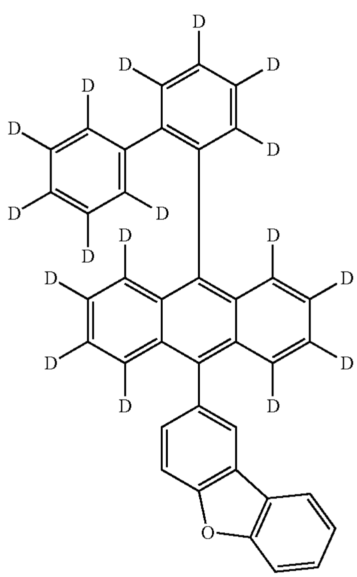
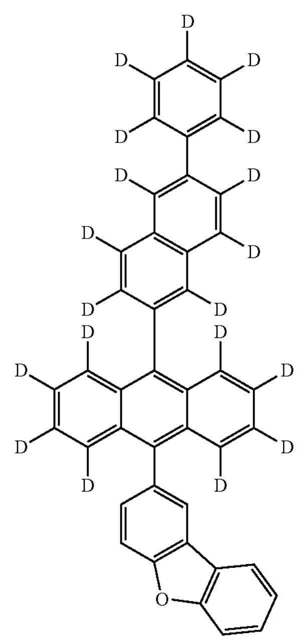

-continued
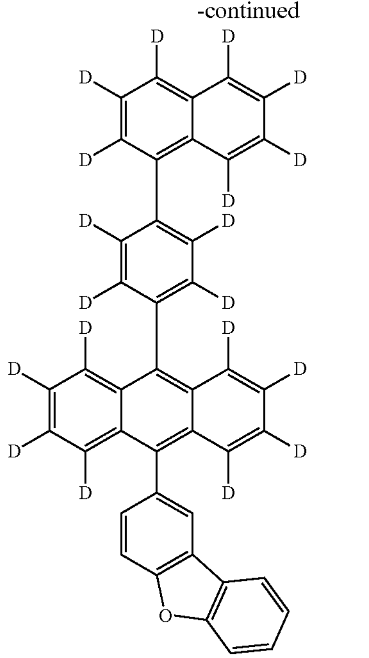
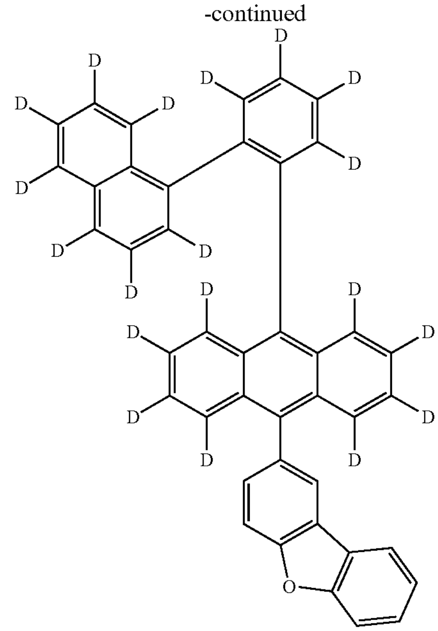
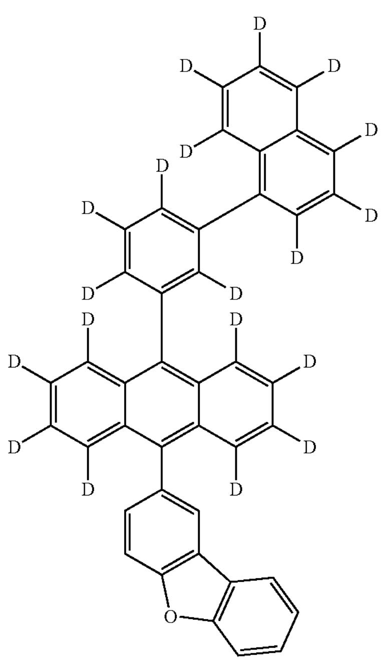
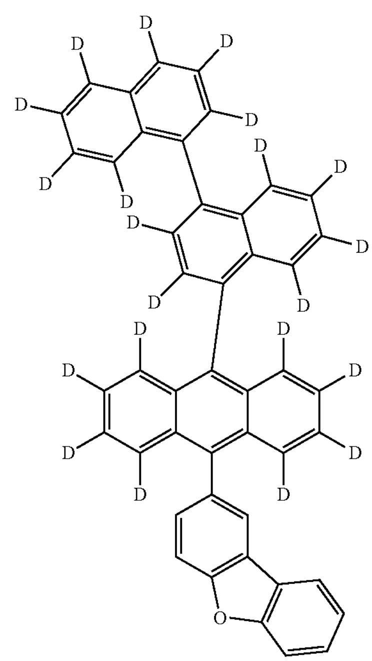
-continued

-continued
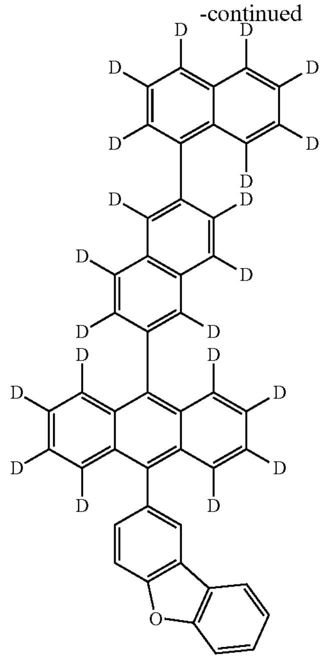
-continued
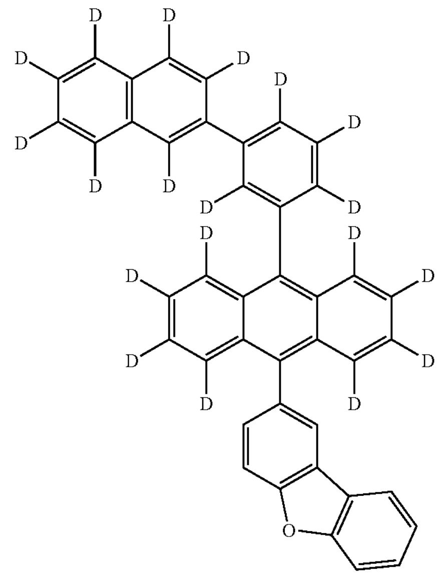
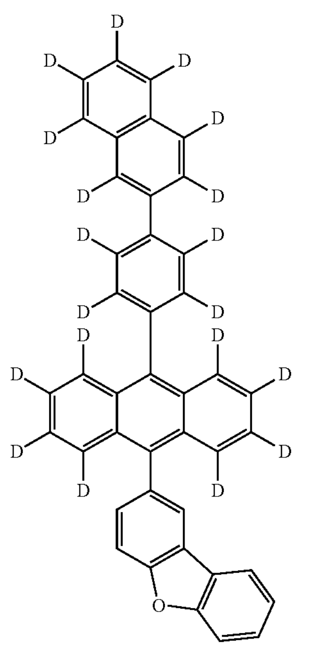
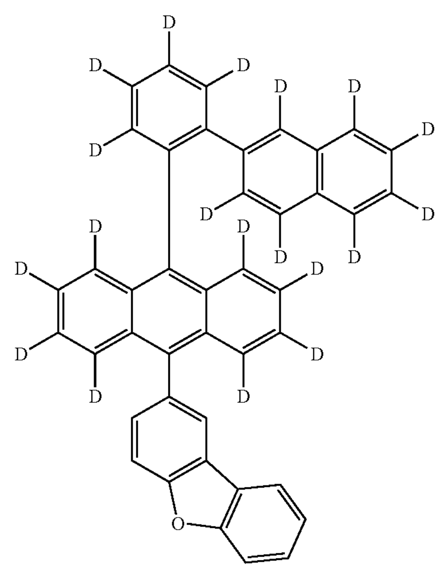

-continued
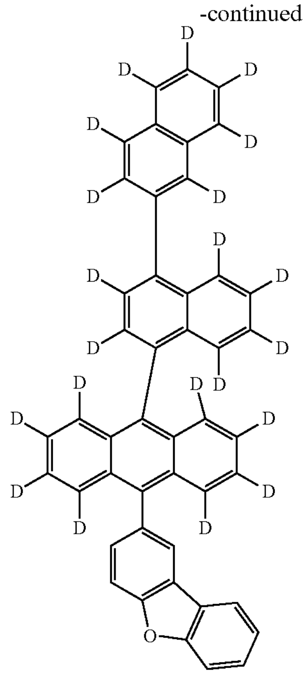
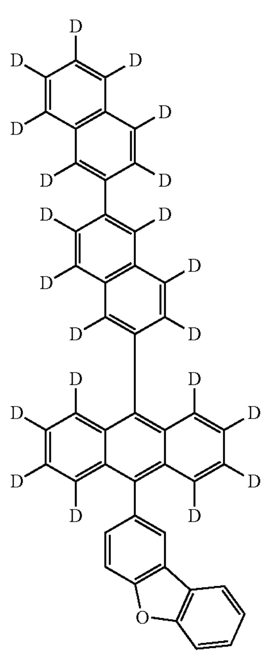
-continued
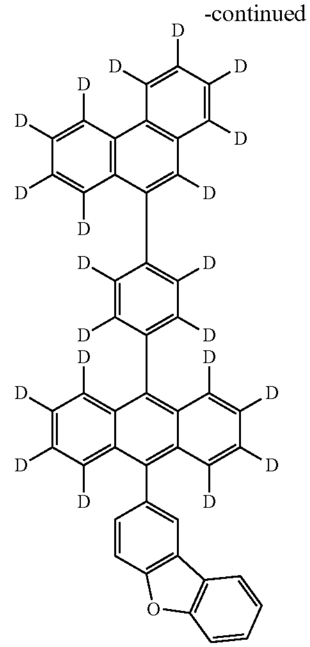
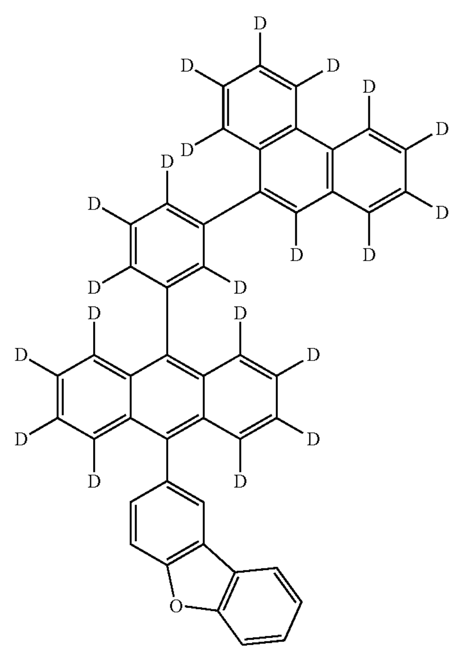

-continued
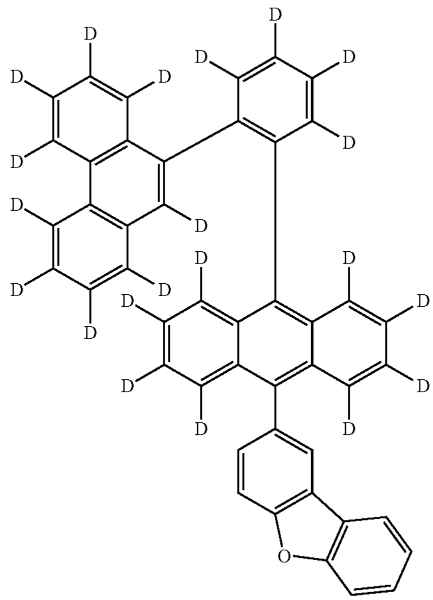
-continued
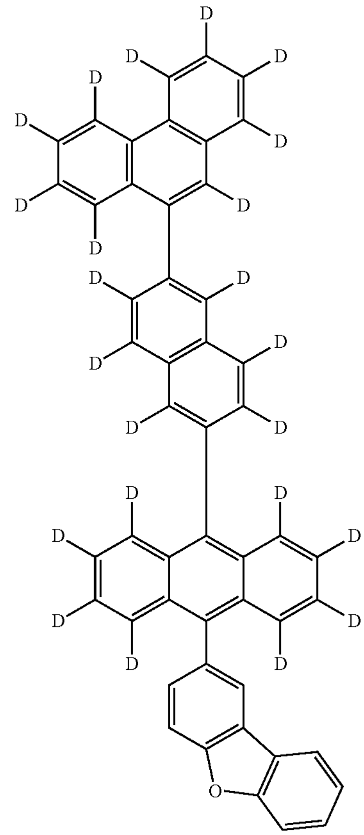
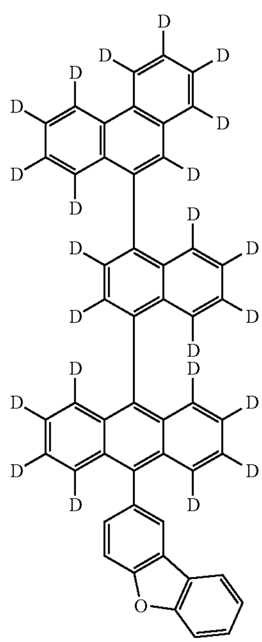
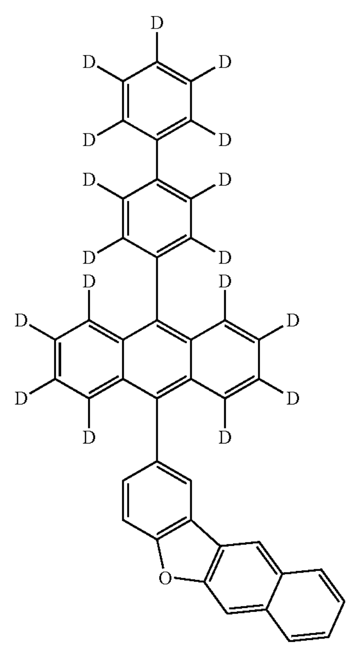

-continued
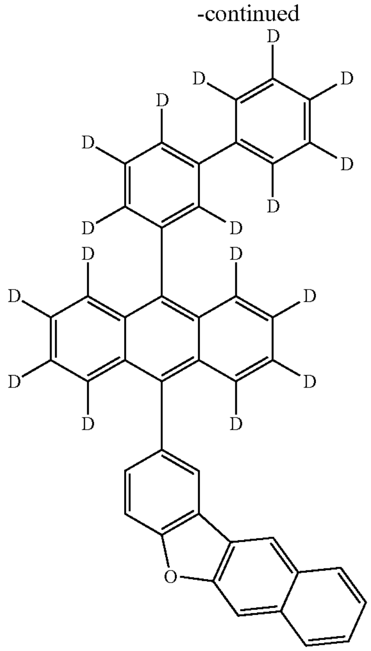
-continued
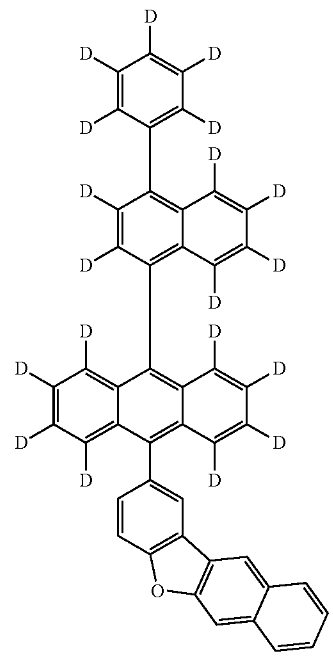
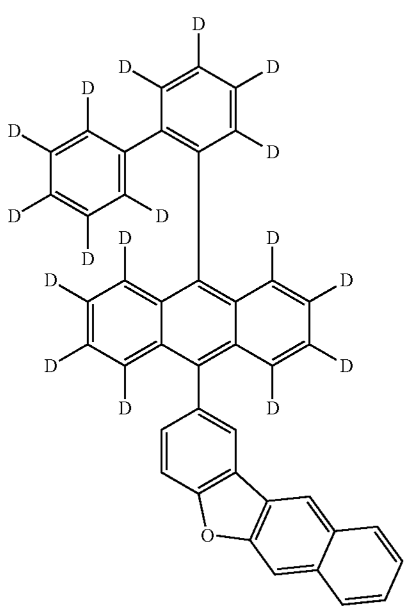
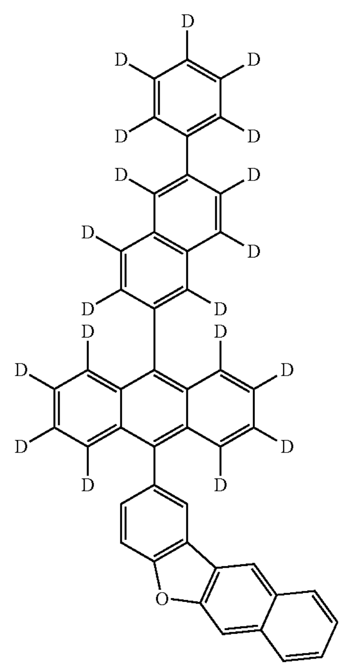

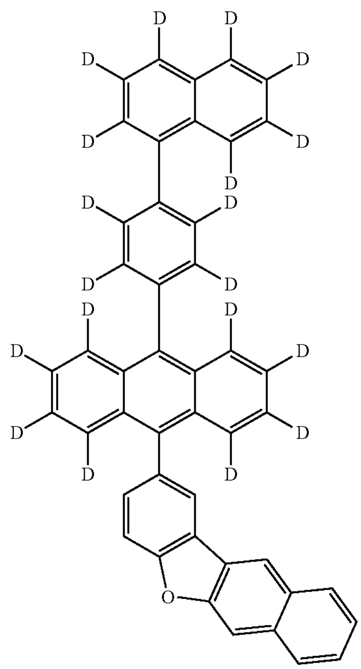
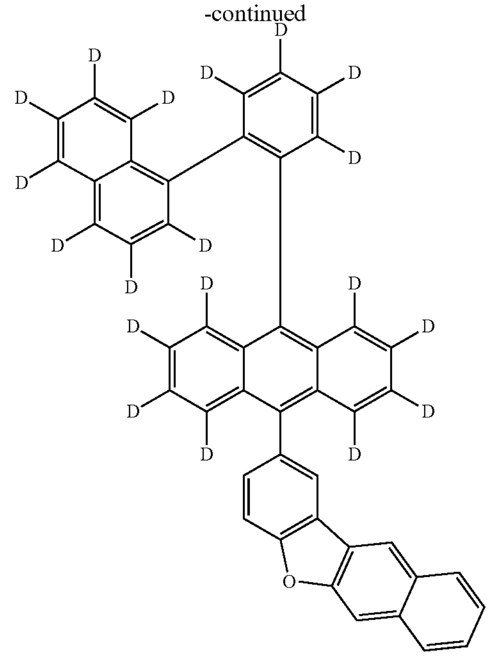
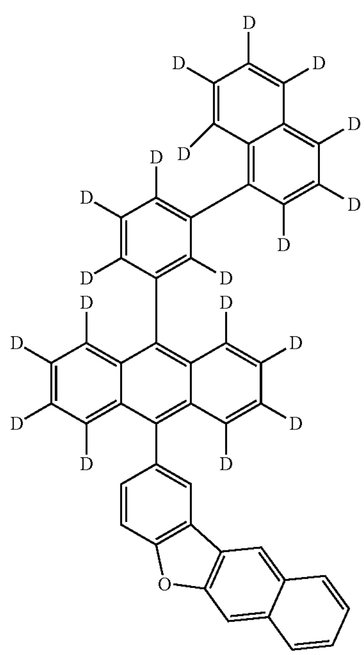
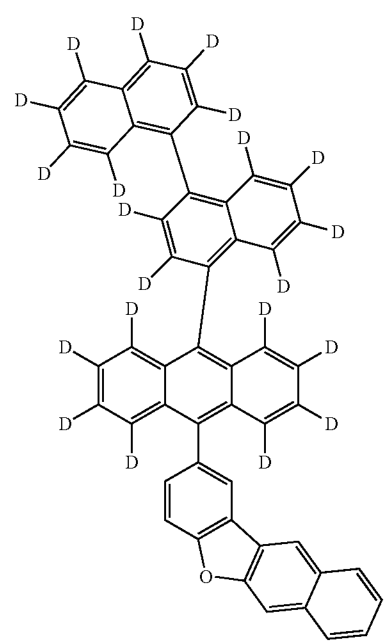

-continued
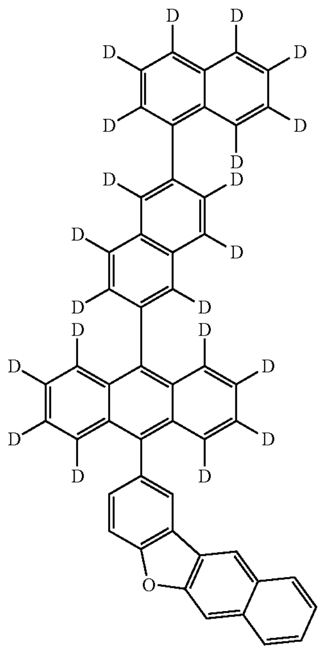
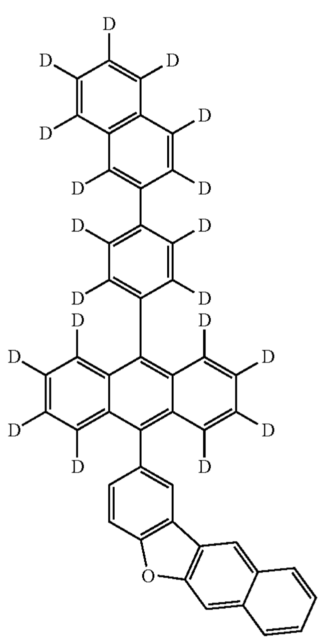
-continued
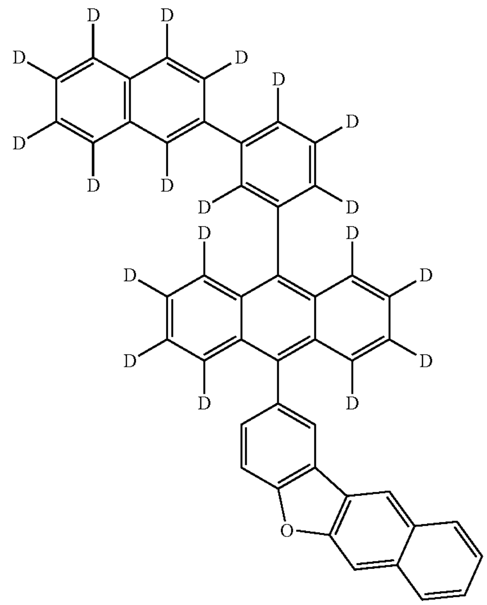
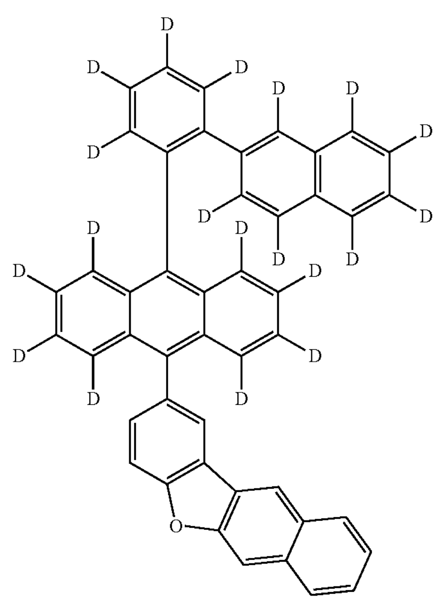

-continued
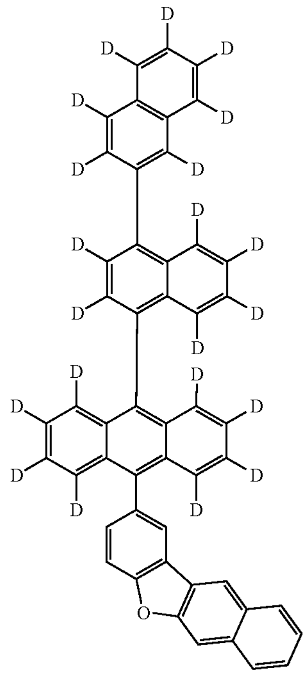
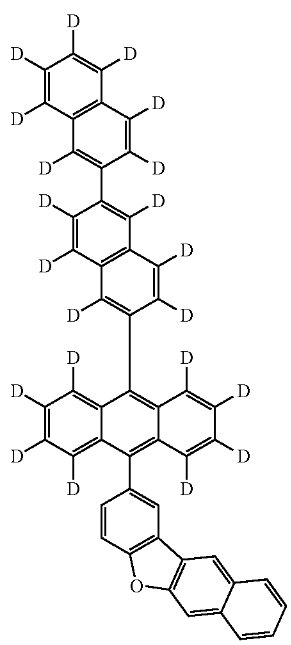
-continued
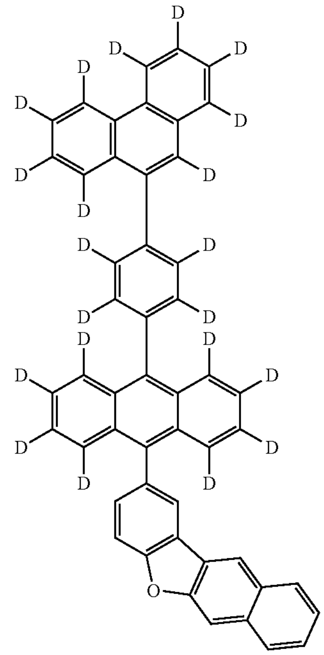
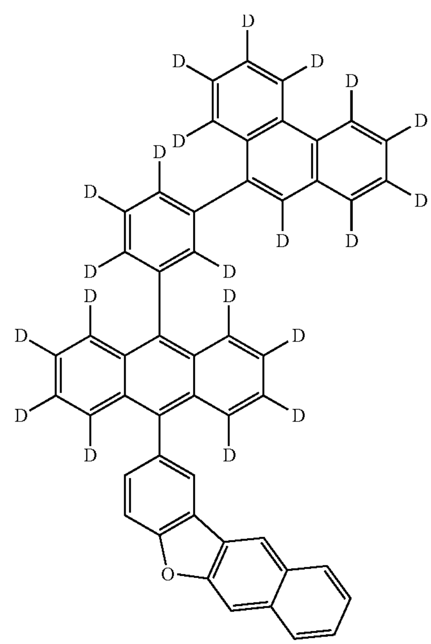

-continued
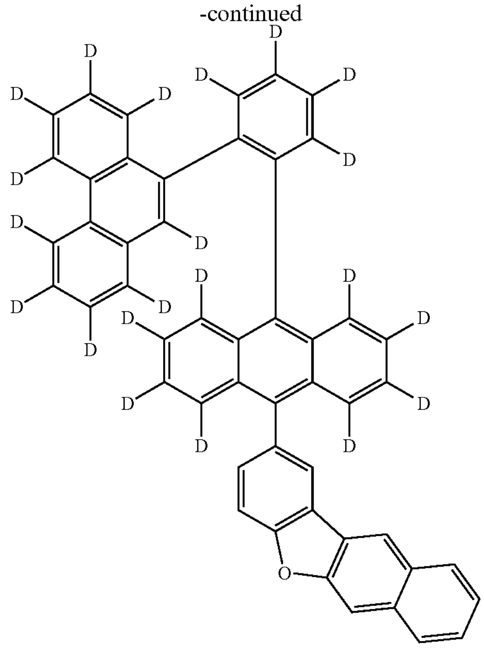
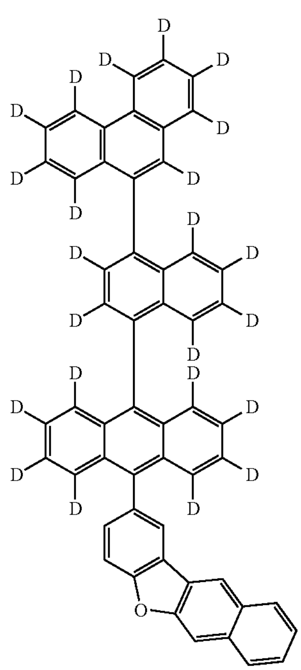
-continued
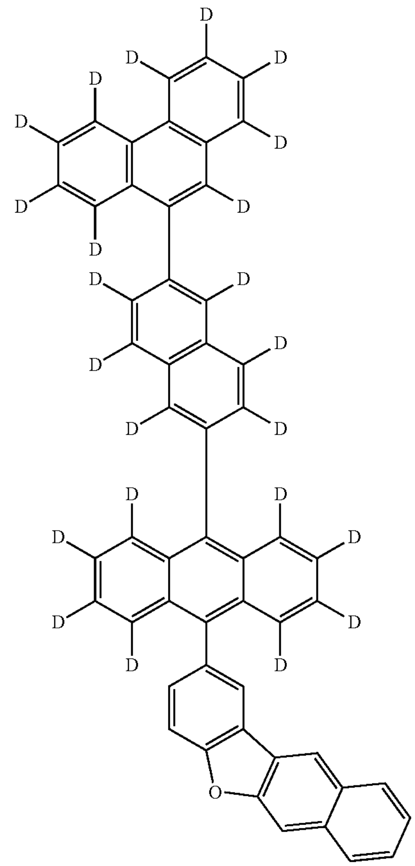
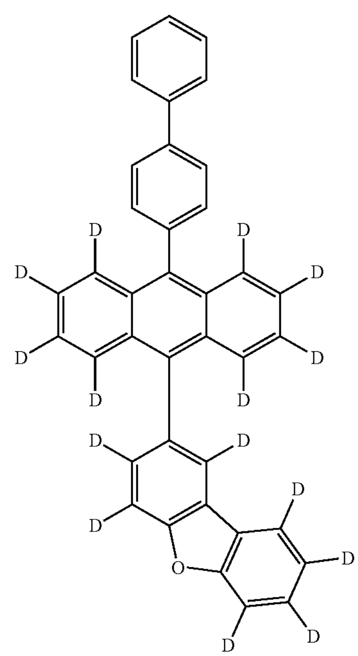

-continued
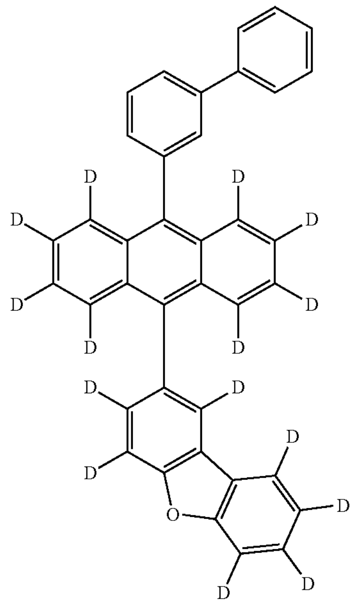
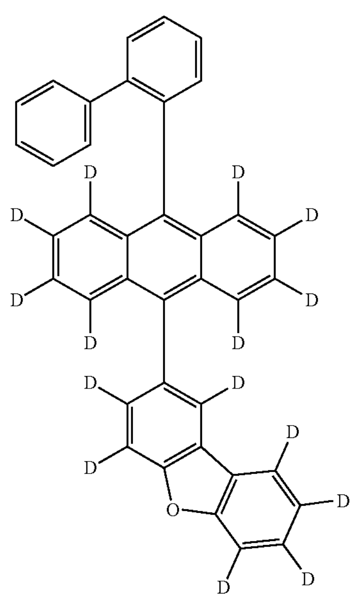
-continued
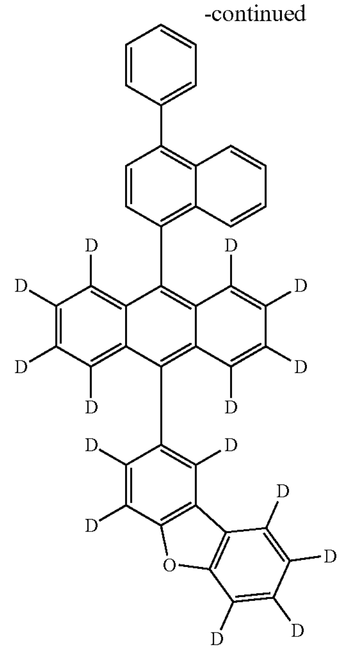
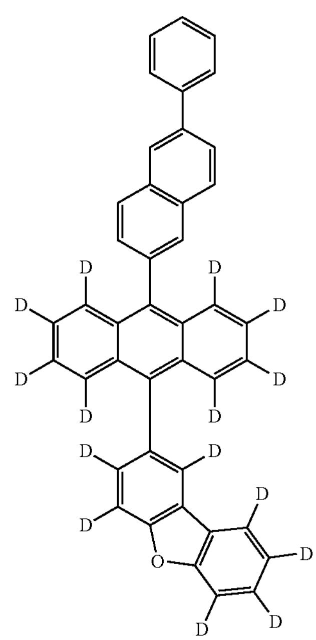

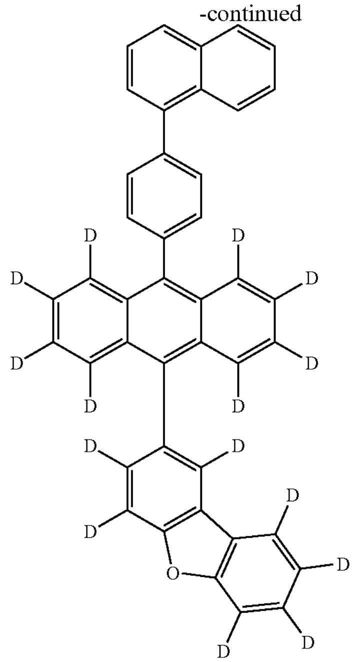
D
D
D
D
D
D
D
D
D
D
D
D
D
D
D
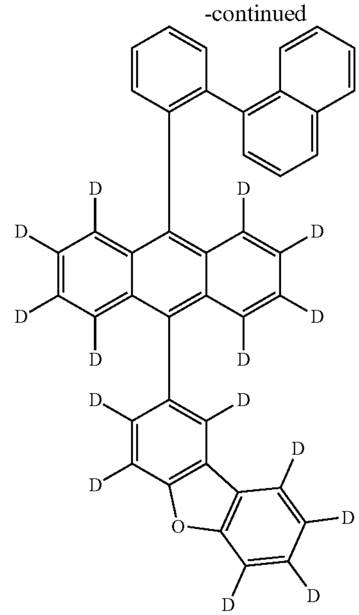
D
D
D
D
D
D
D
D
D
D
D
D
D
D
D
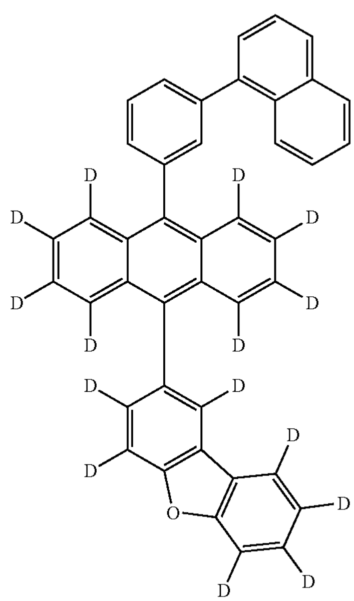
D
D
D
D
D
D
D
D
D
D
D
D
D
D
D
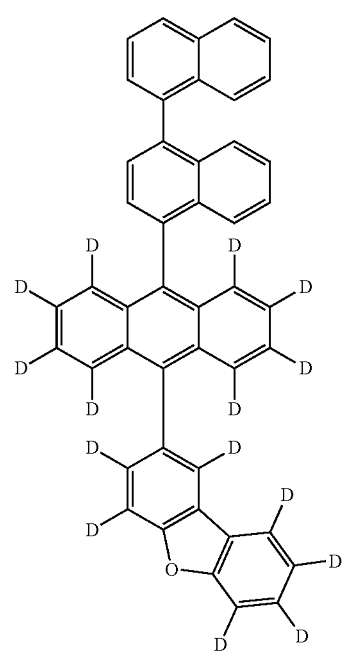
D
D
D
D
D
D
D
D
D
D
D
D
D
D
D -continued
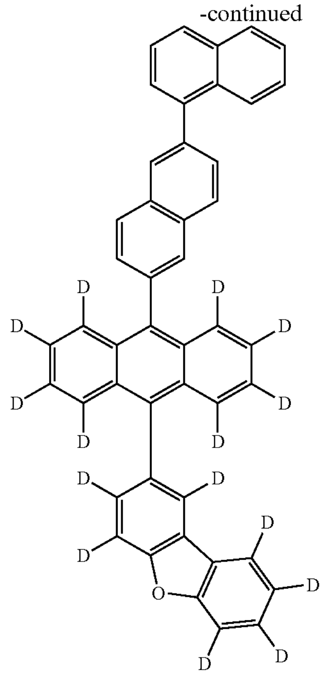
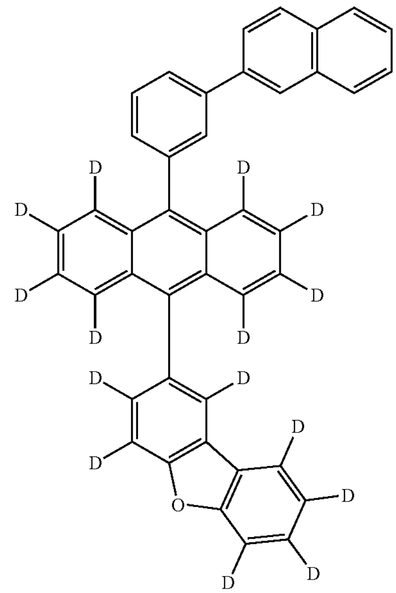
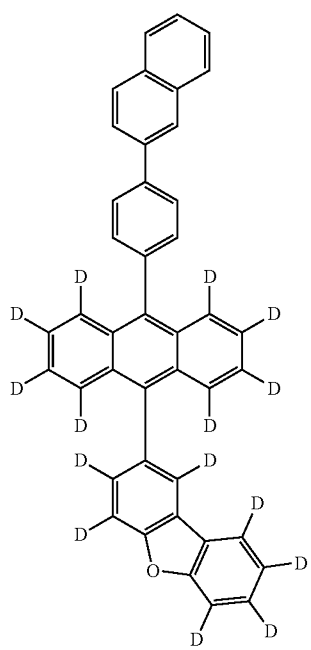
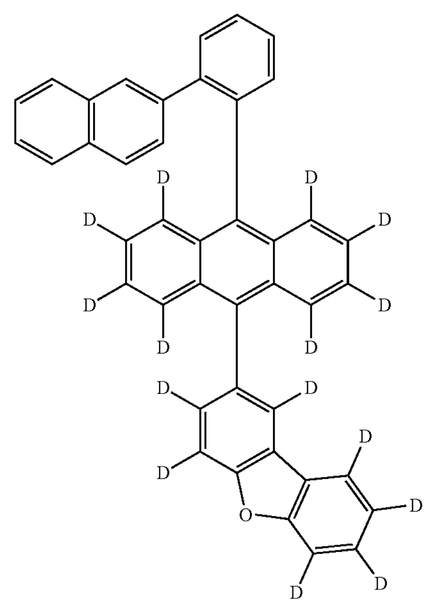

-continued
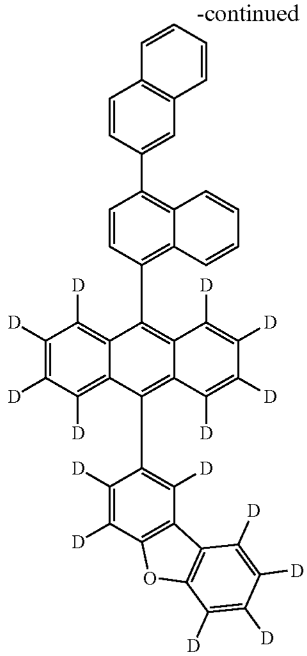
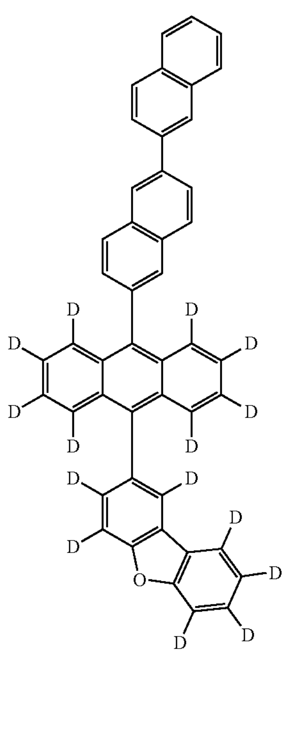
-continued
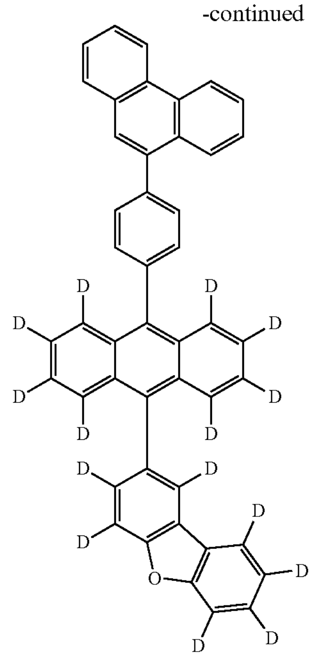
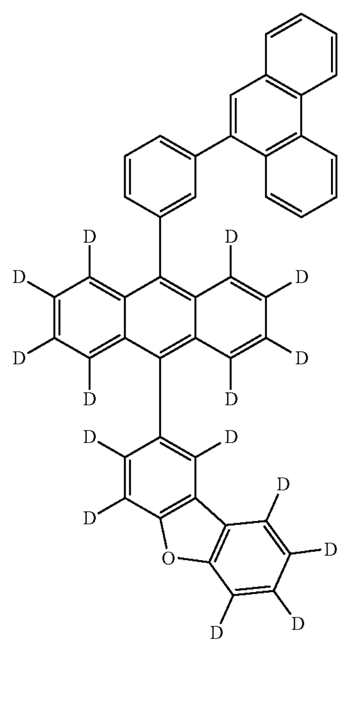

-continued
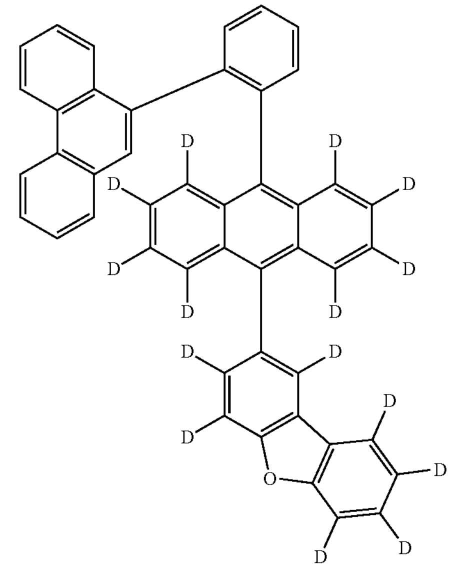
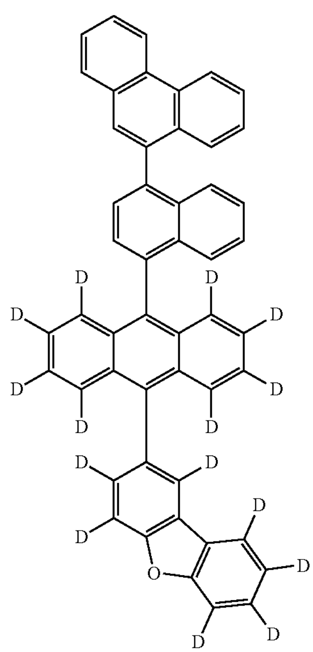
-continued
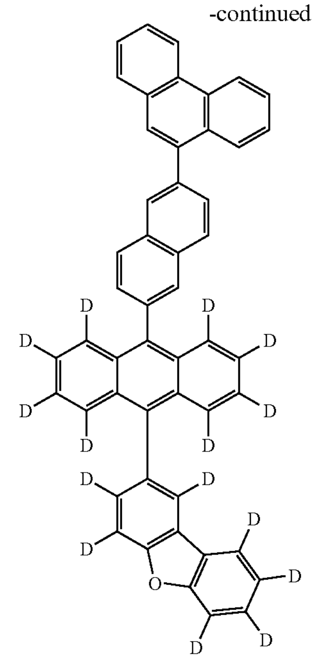
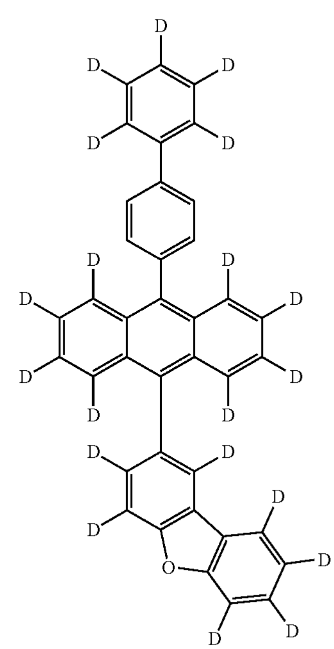

-continued
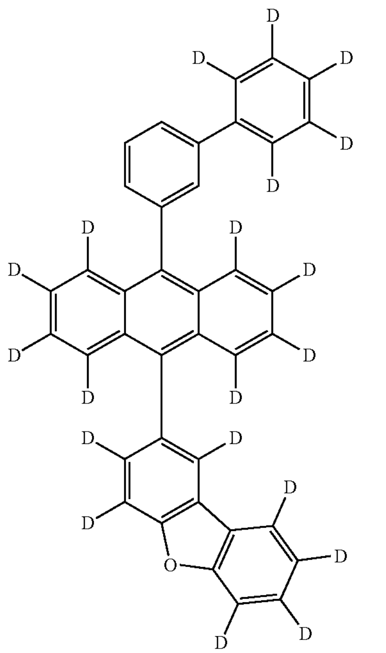
-continued
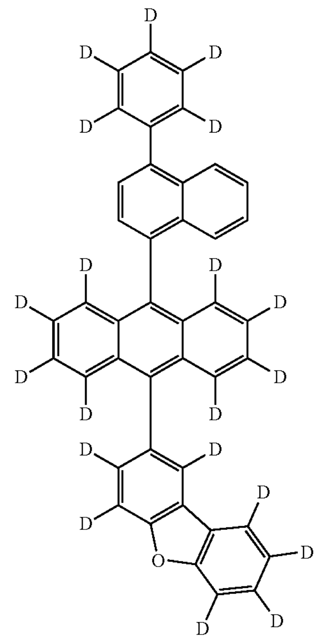
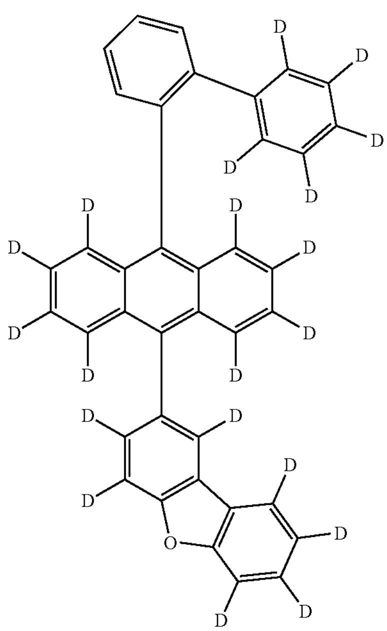
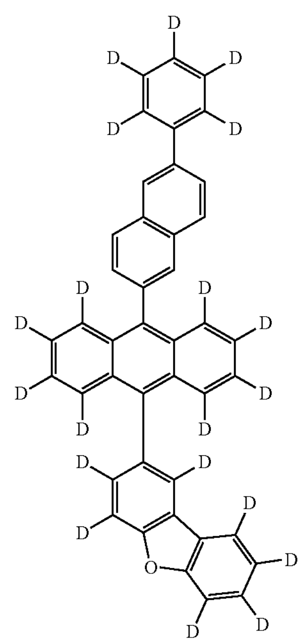

-continued
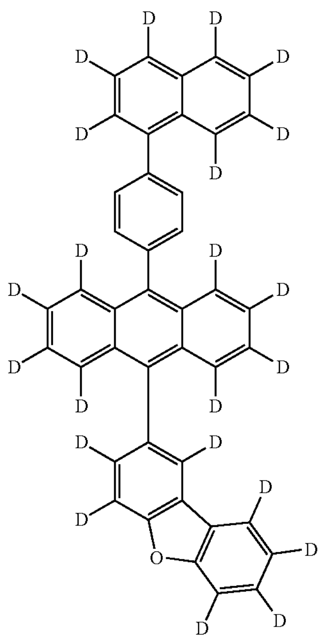
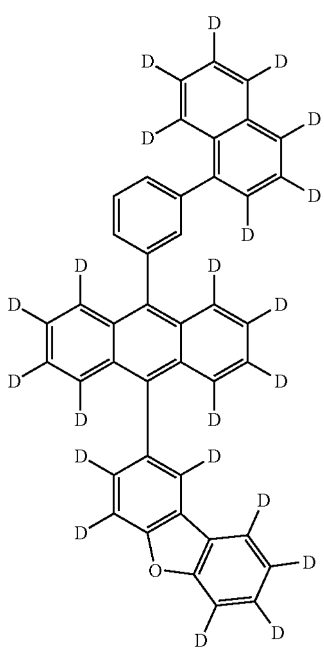
-continued
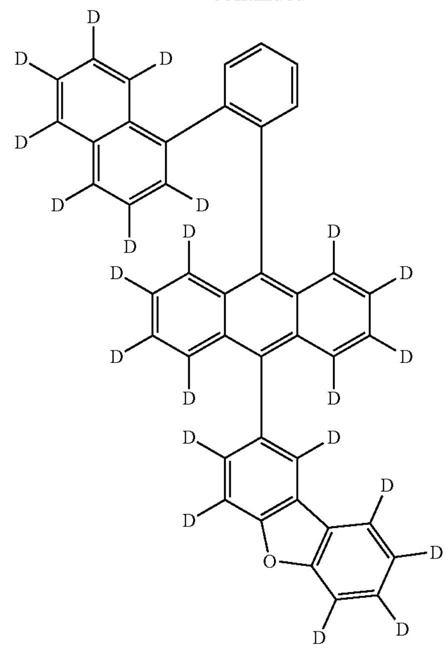
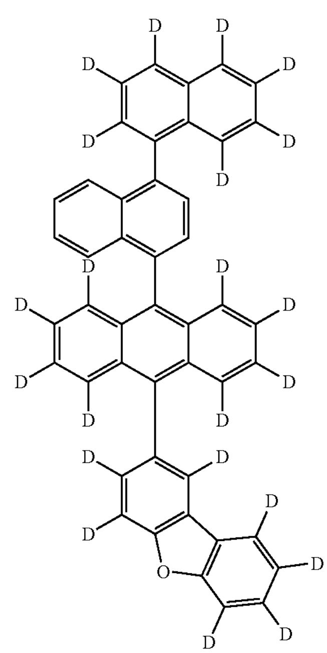

-continued
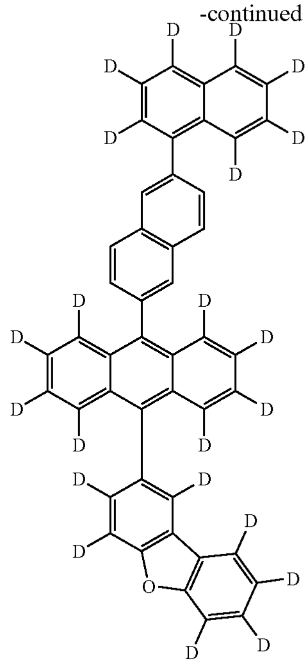
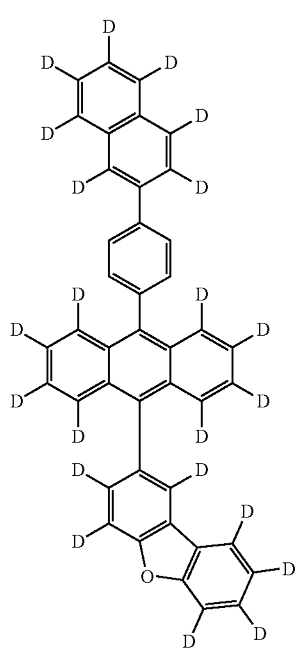
-continued
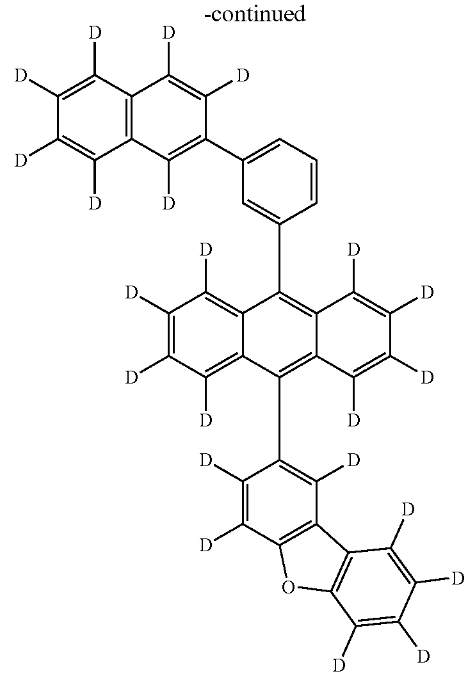
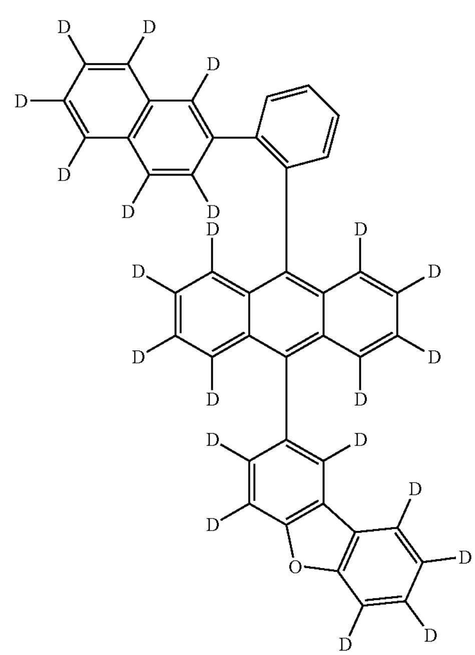

-continued
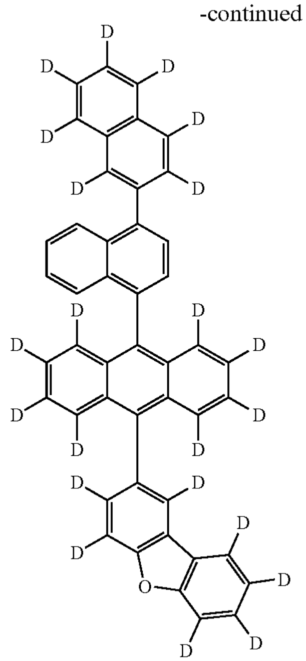
-continued
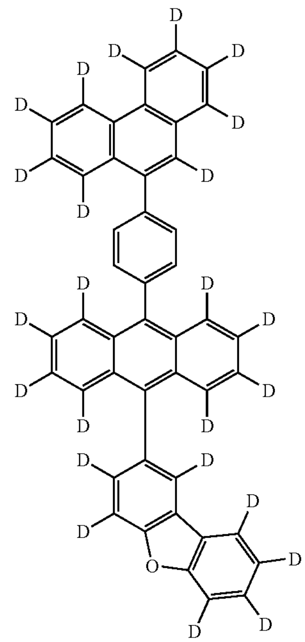
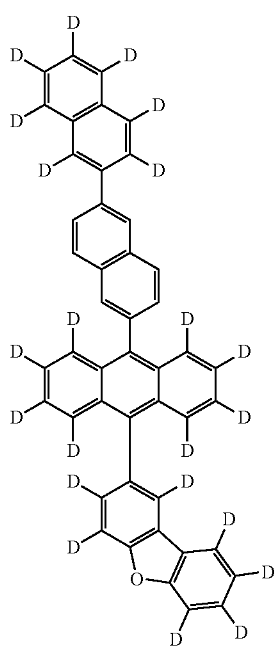
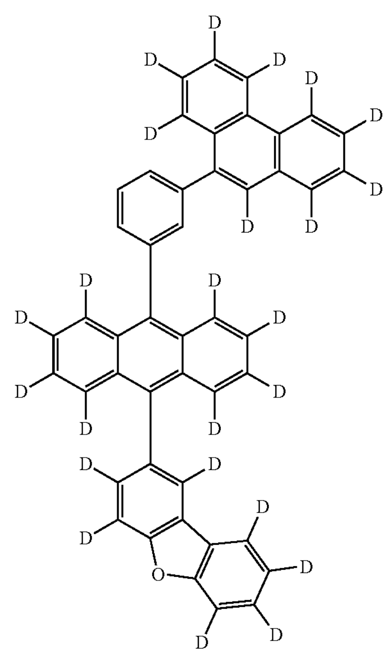

-continued
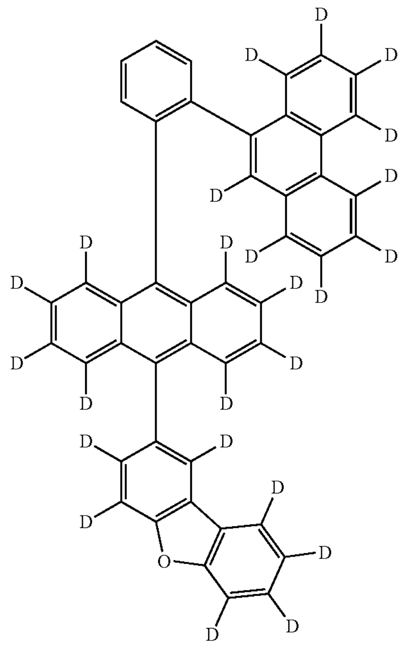
-continued
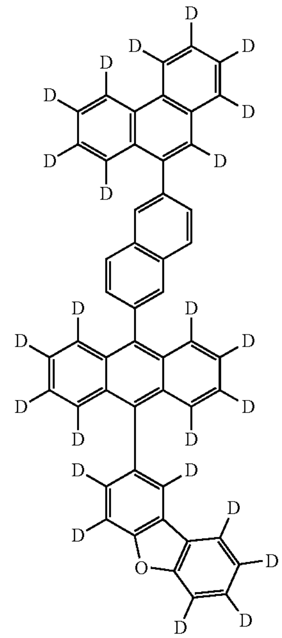
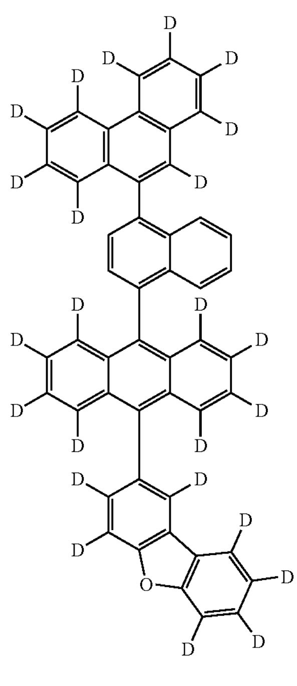
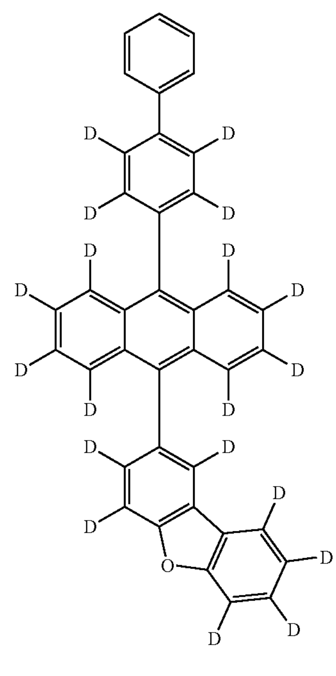

-continued
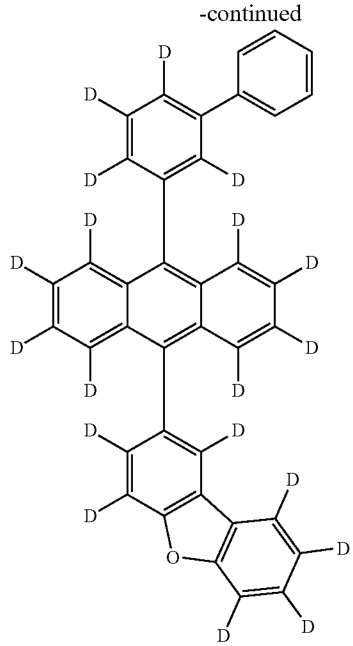
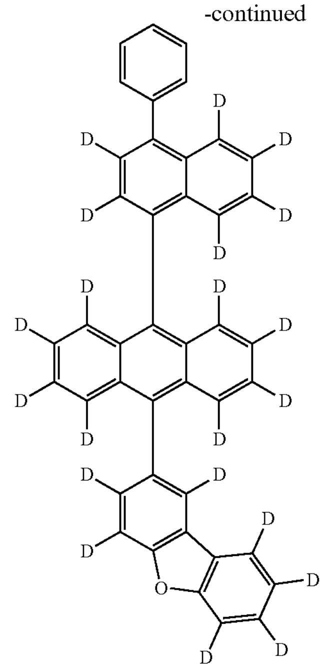
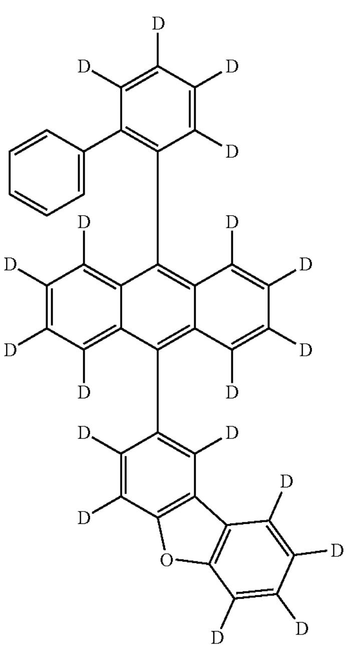
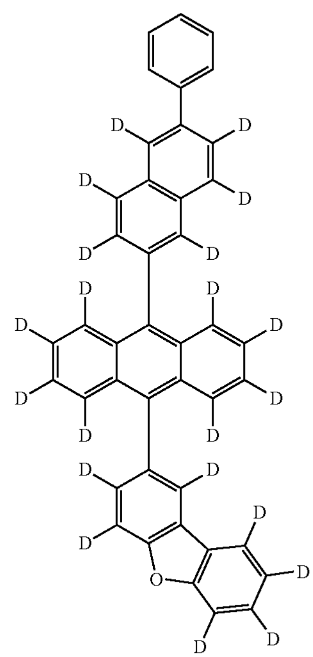

-continued
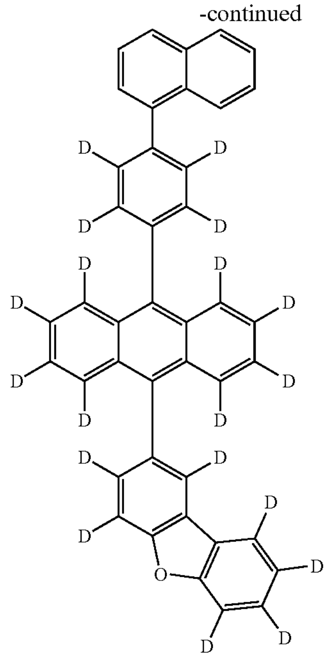
-continued
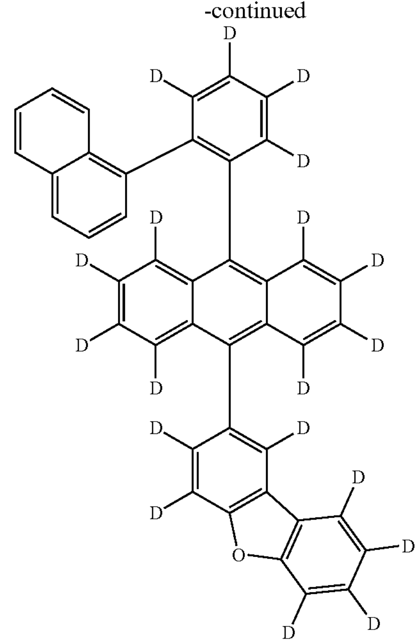
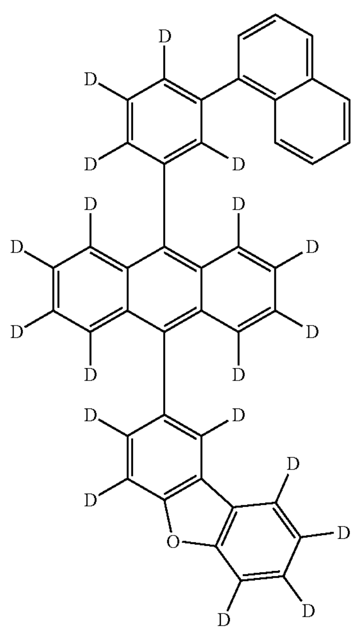
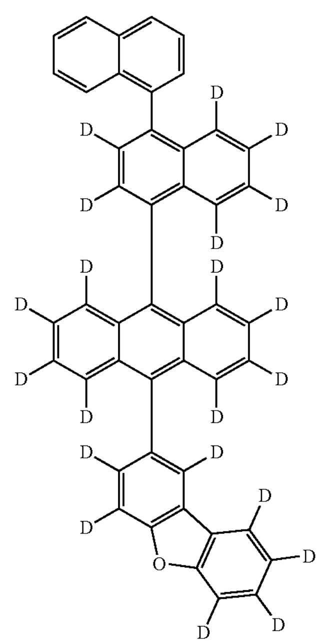

-continued
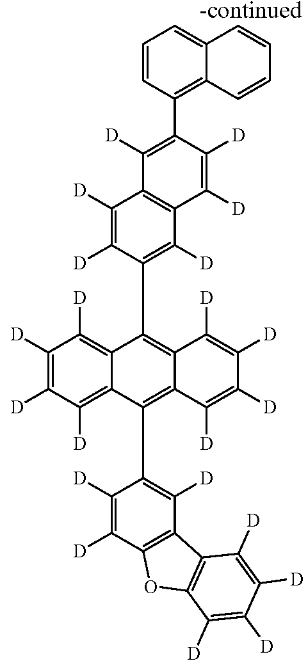
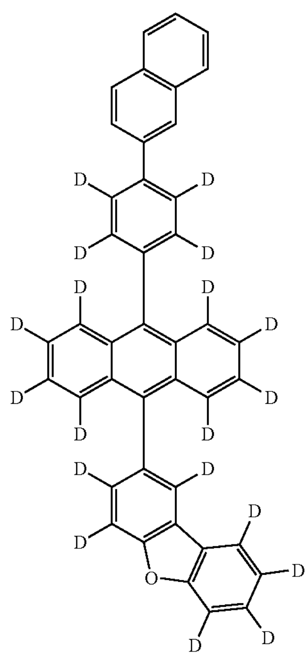
-continued
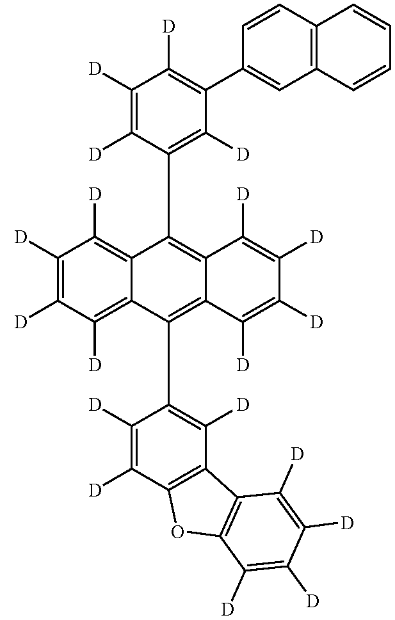
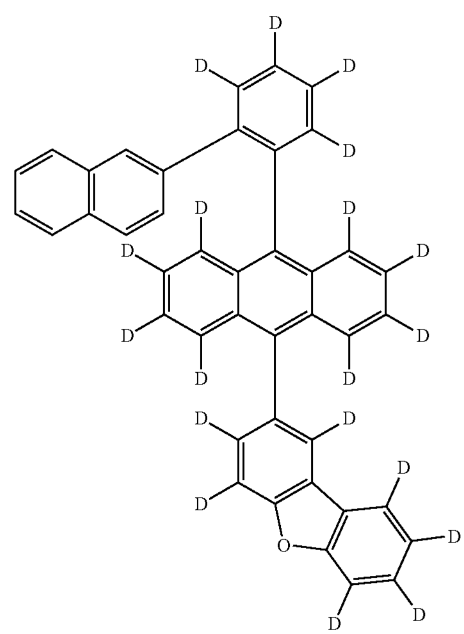

-continued
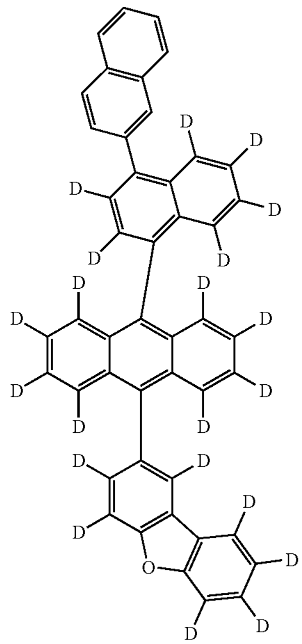
-continued
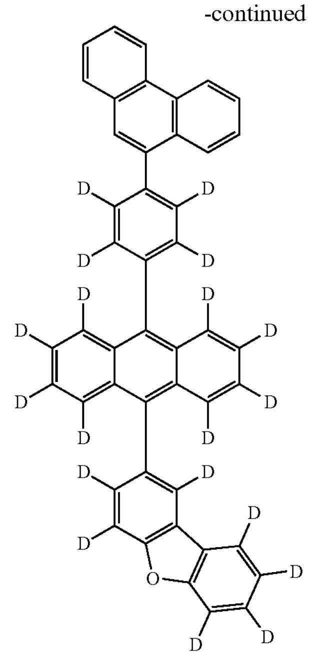
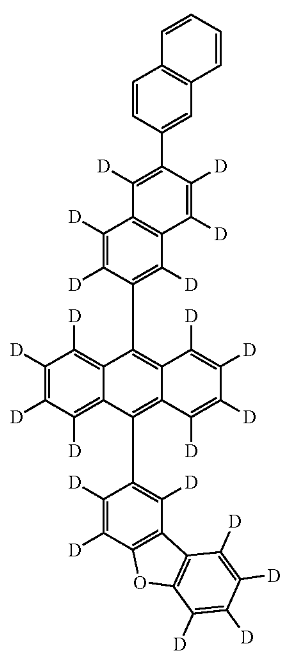
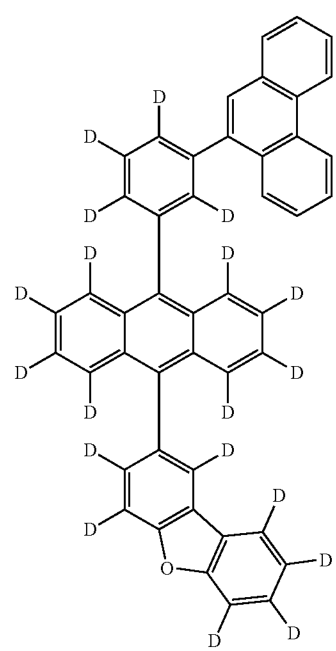

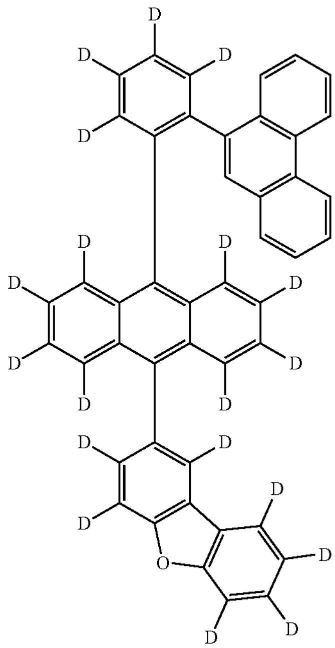
D
O
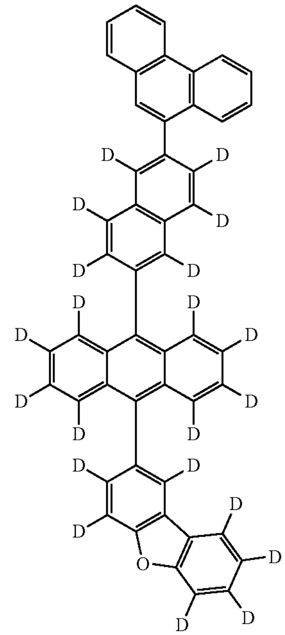
D
O
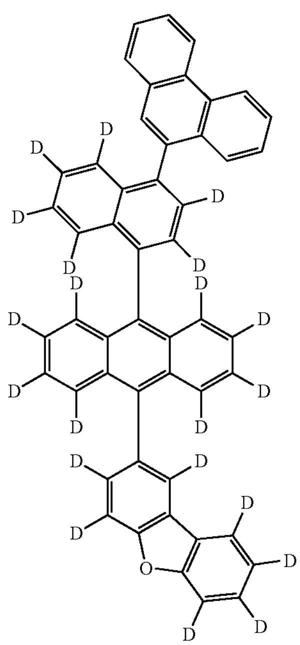
D
O
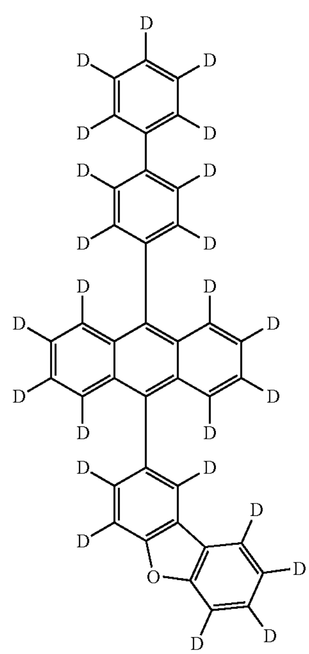
D
O

-continued
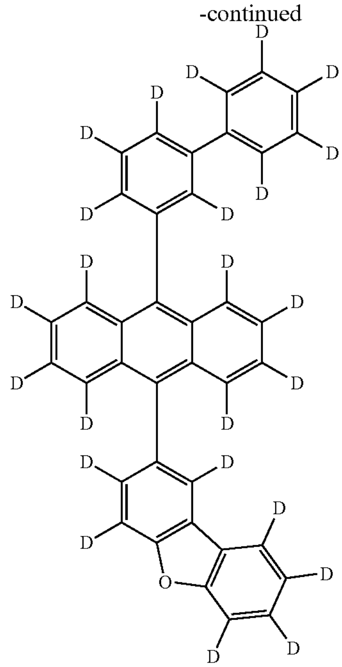
-continued
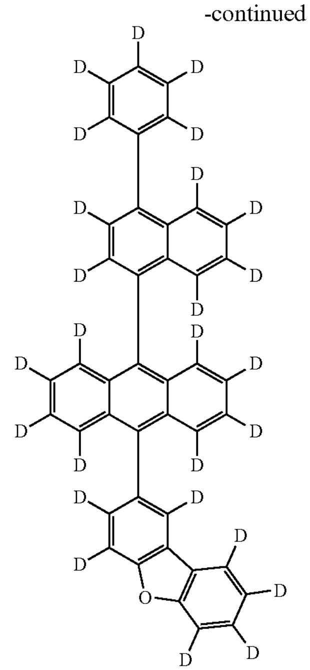
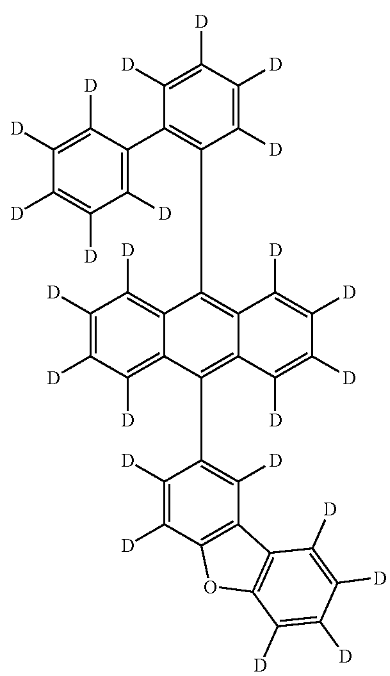
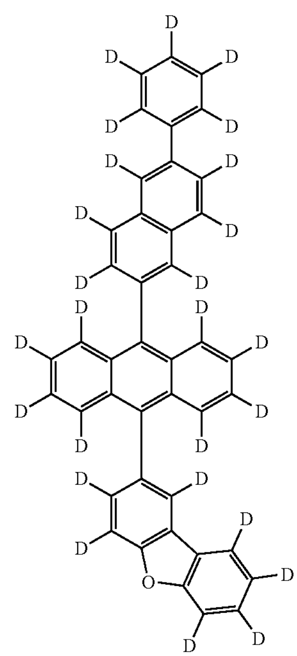

-continued
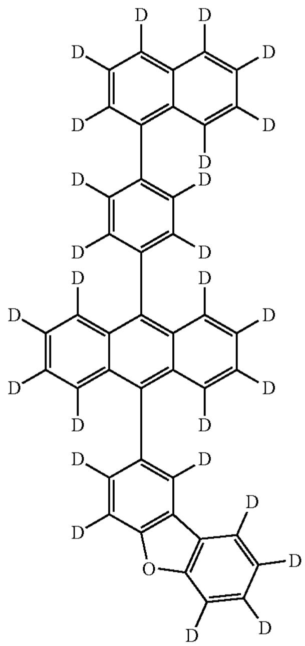
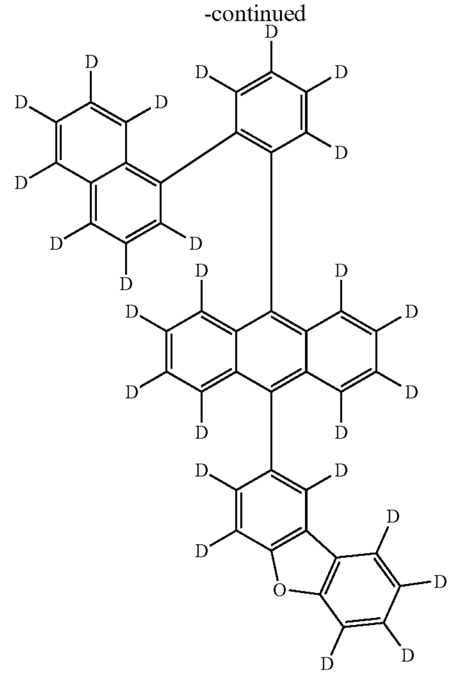
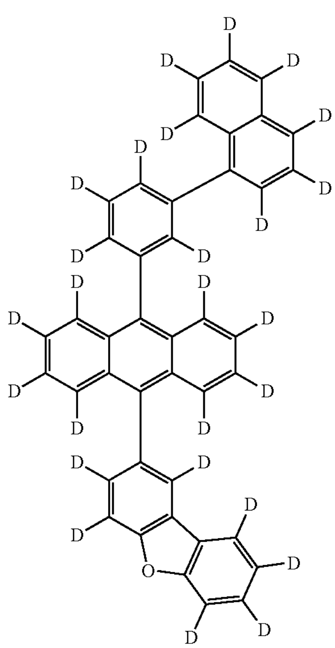
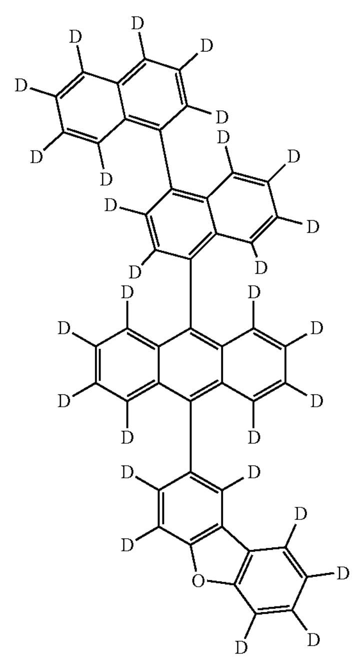

-continued
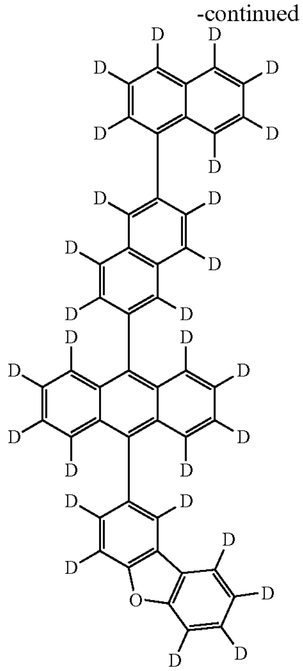
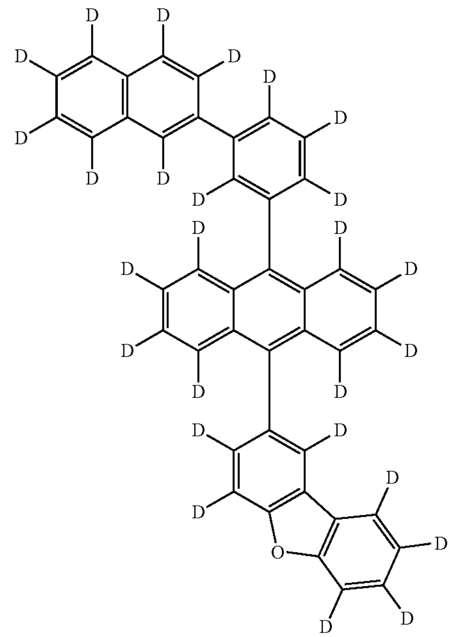
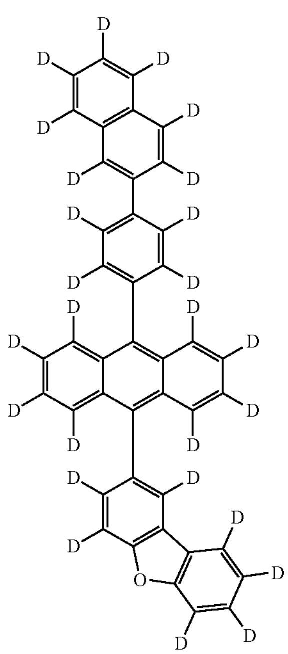
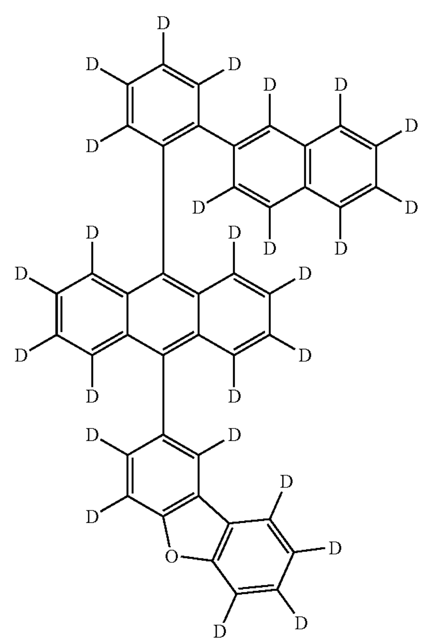

-continued
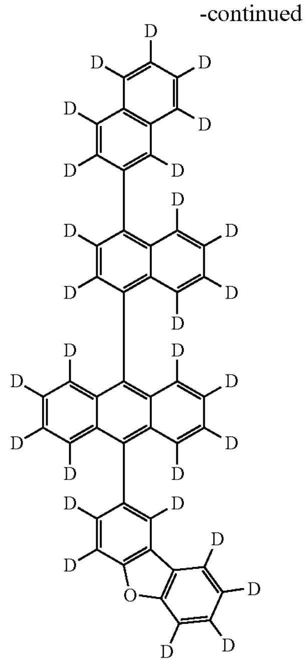
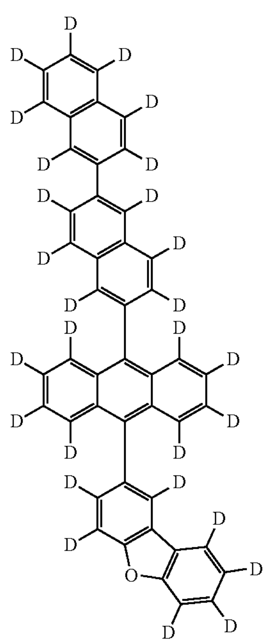
-continued
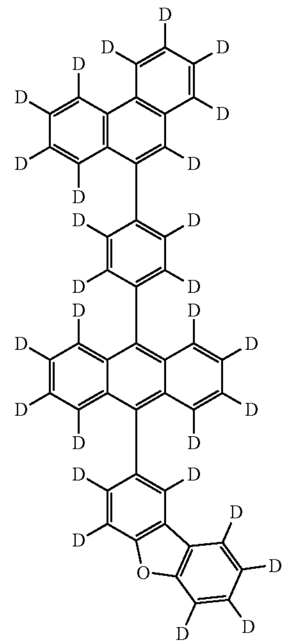
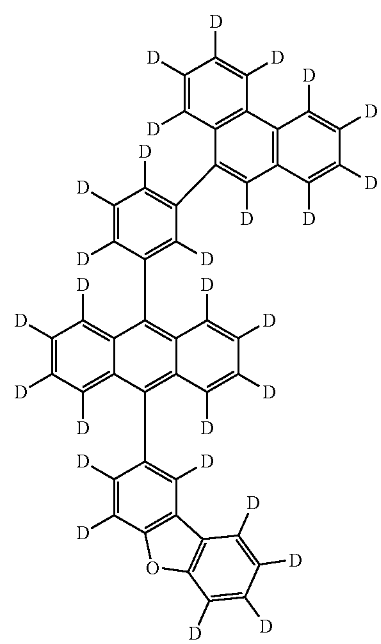

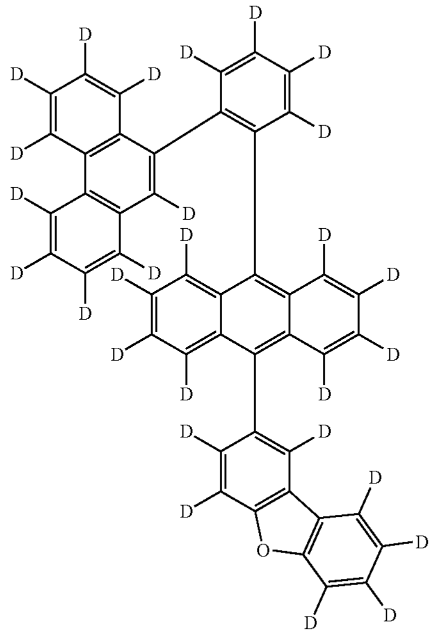
D
O
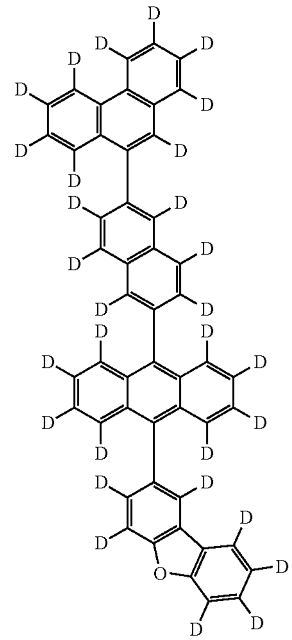
D
O
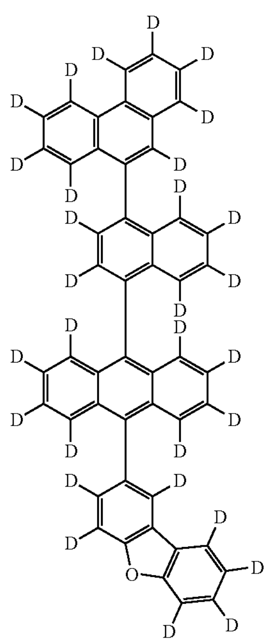
D
O
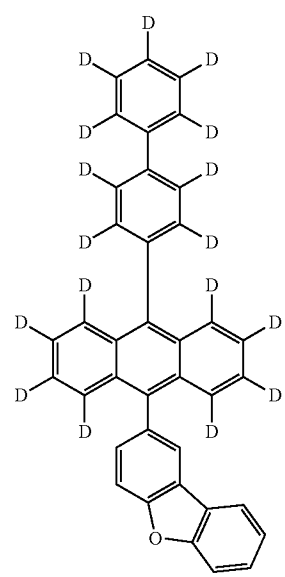
D
O

-continued
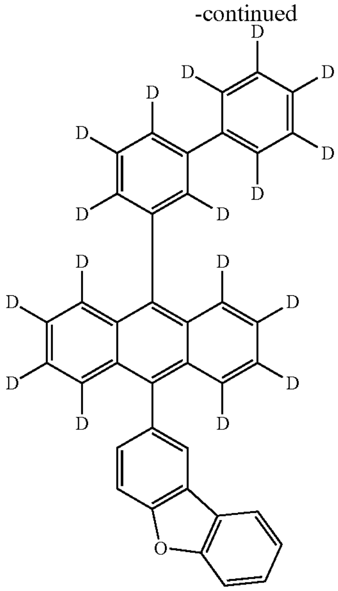
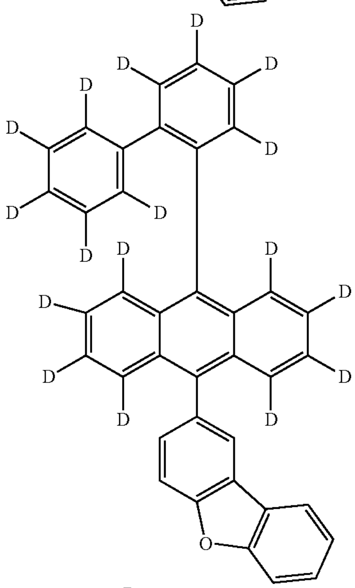
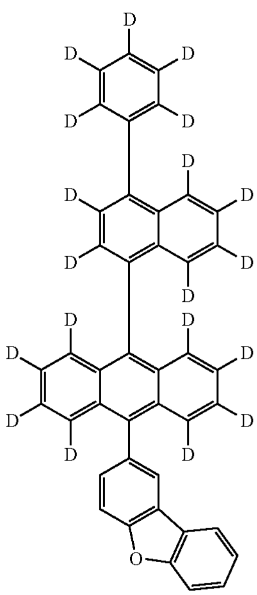
-continued
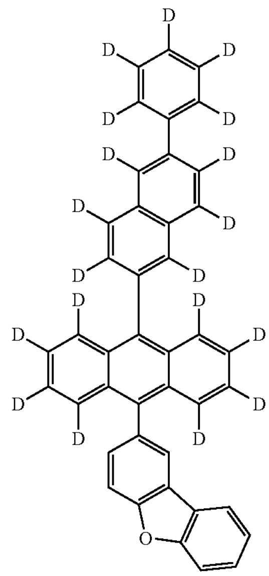
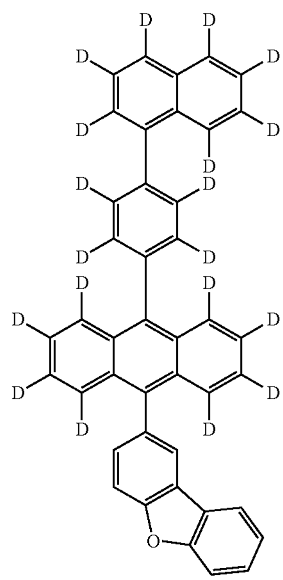
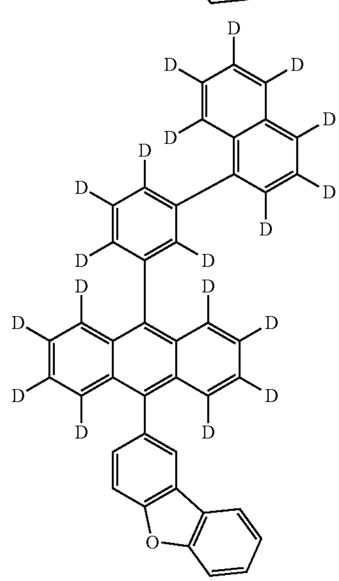

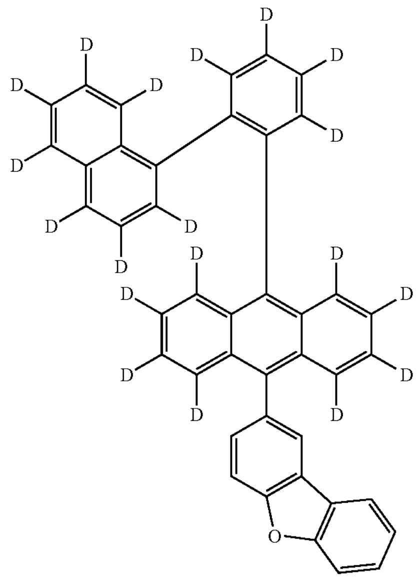
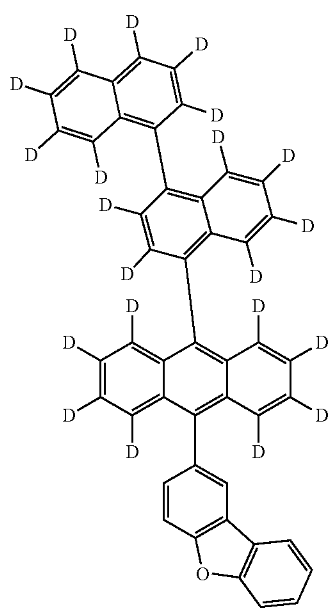
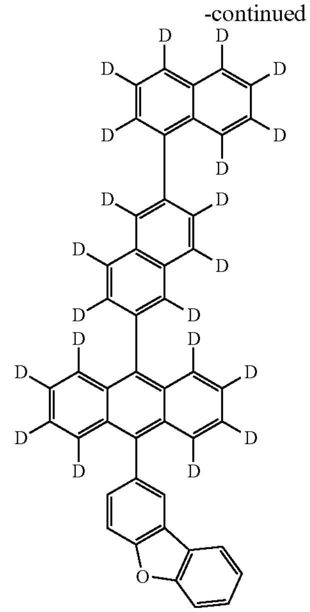
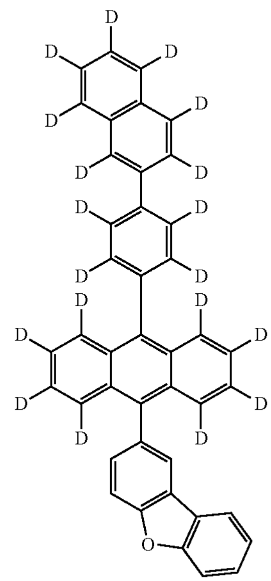
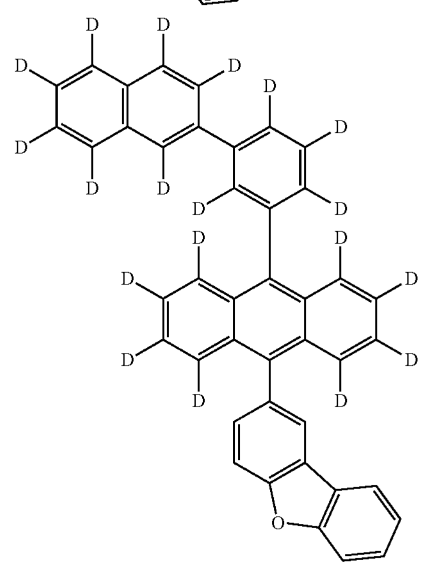

-continued
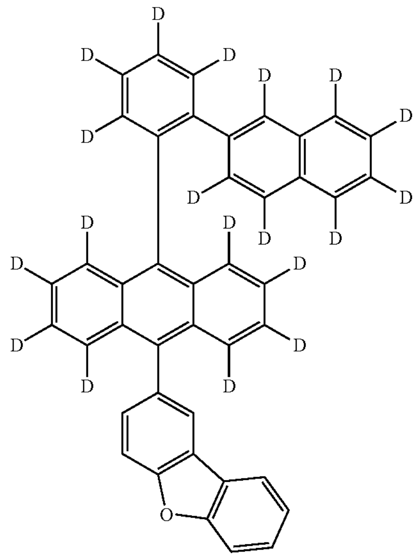
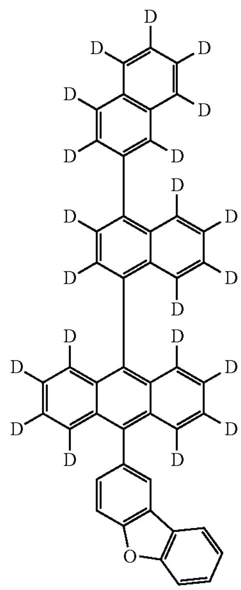
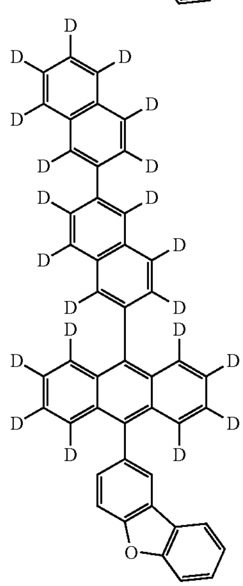
-continued
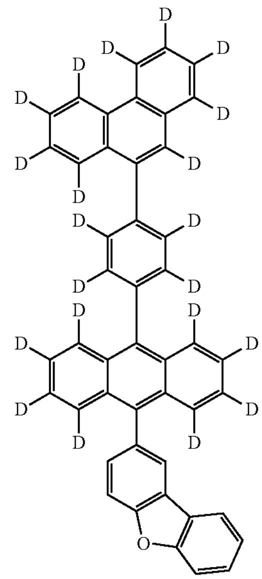
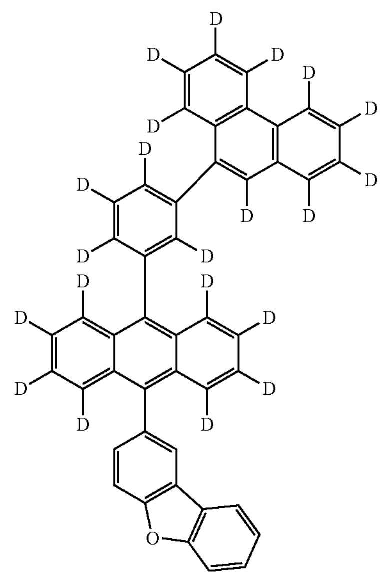
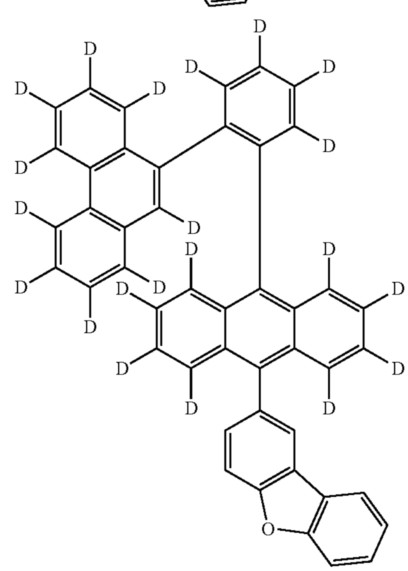

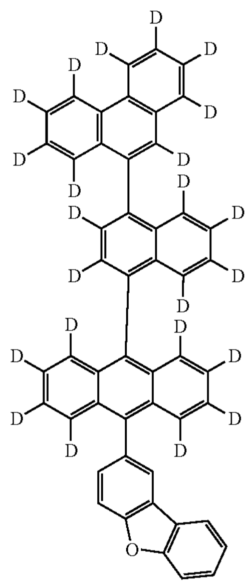
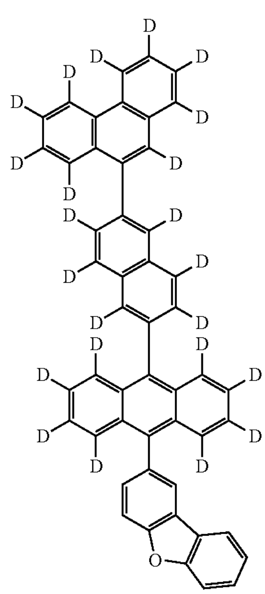
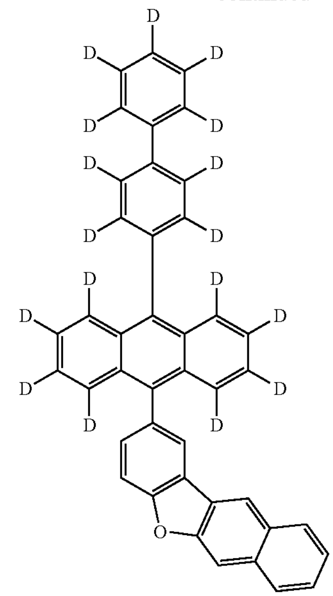
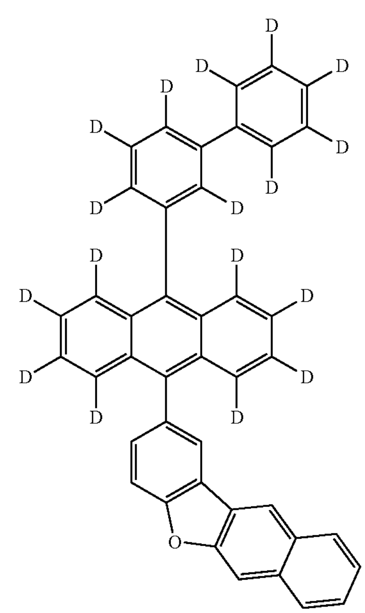

-continued
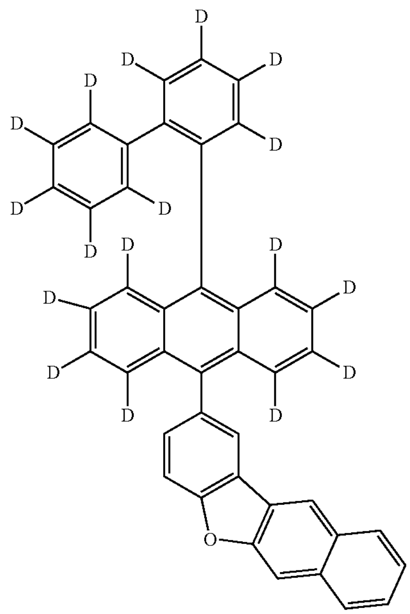
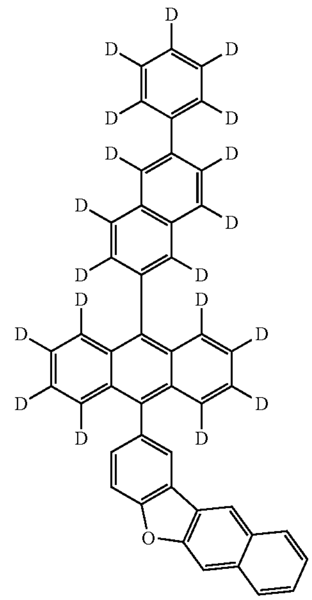
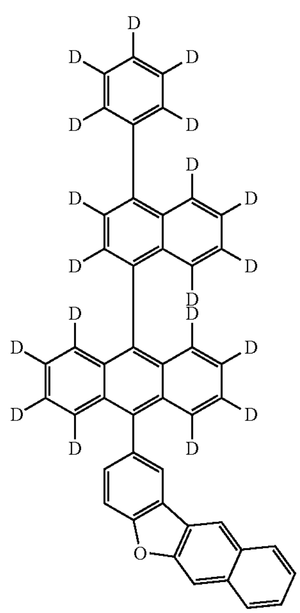
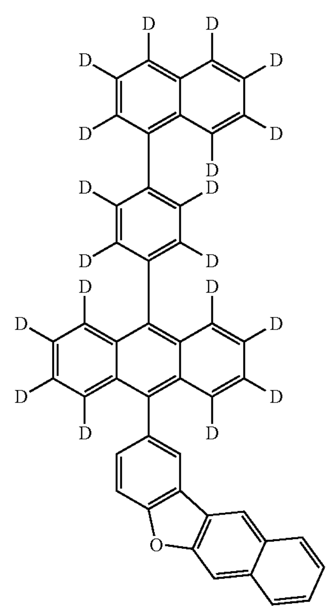

-continued
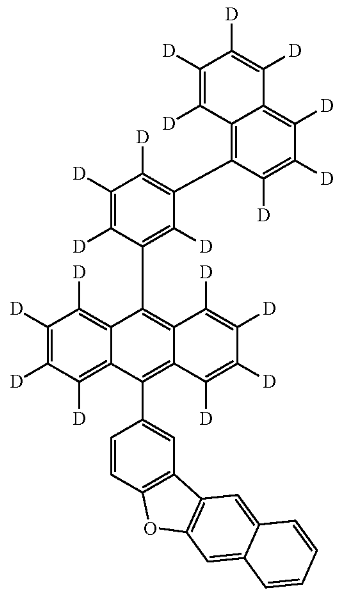
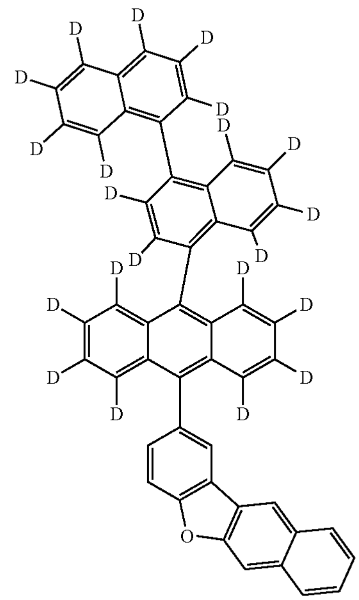
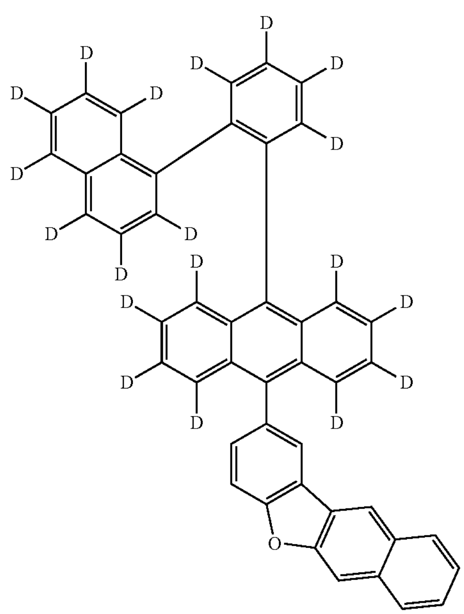
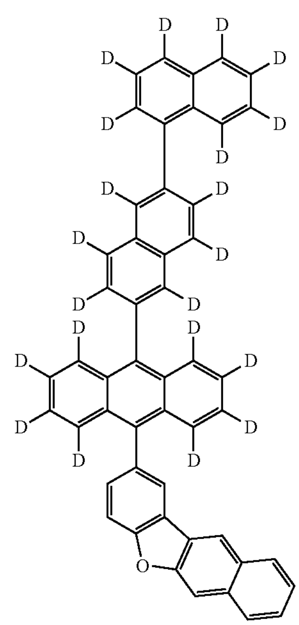
-continued

-continued
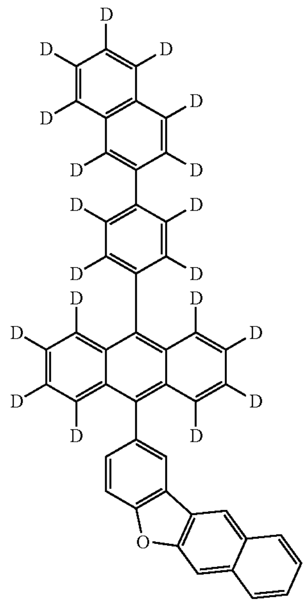
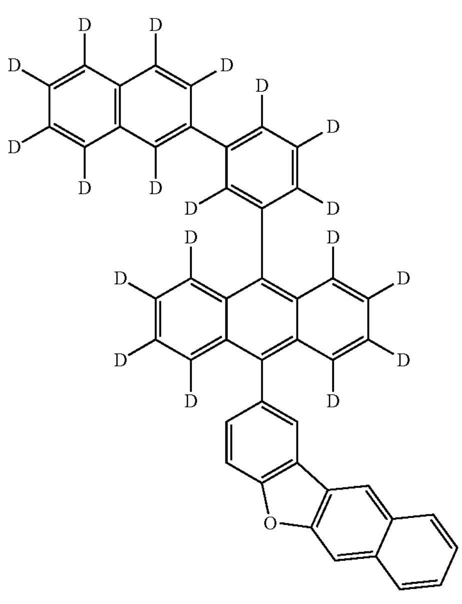
-continued
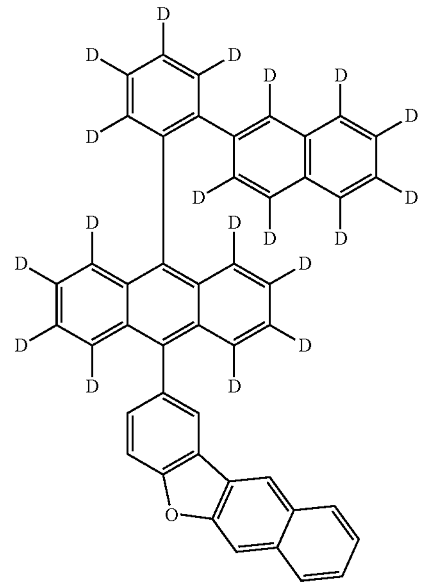
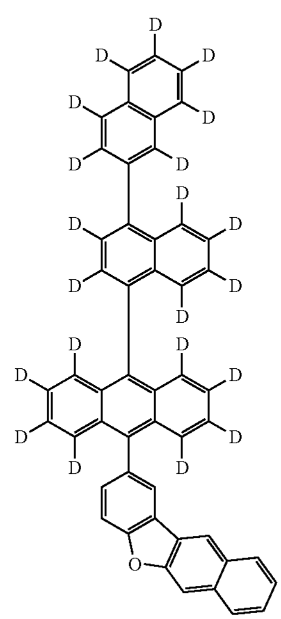

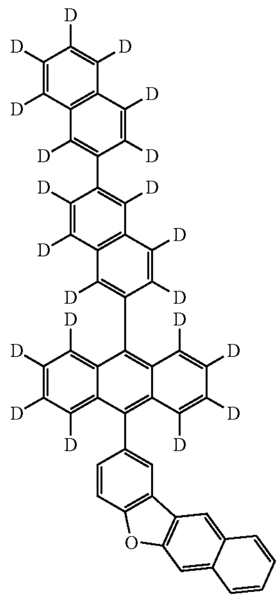
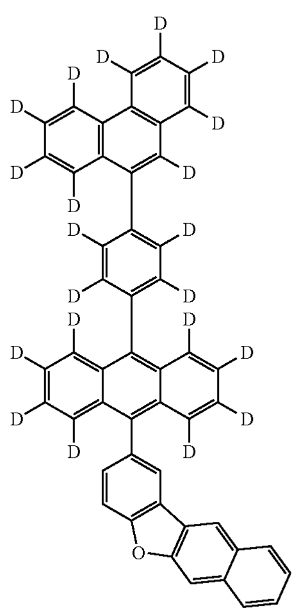
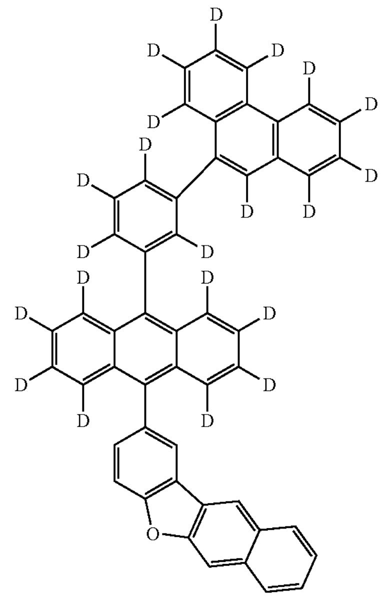
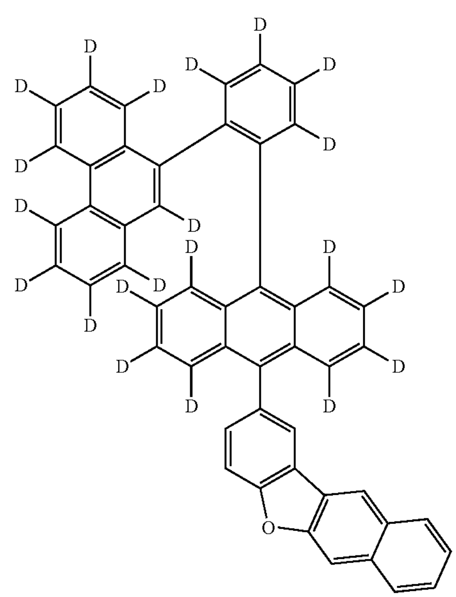

-continued
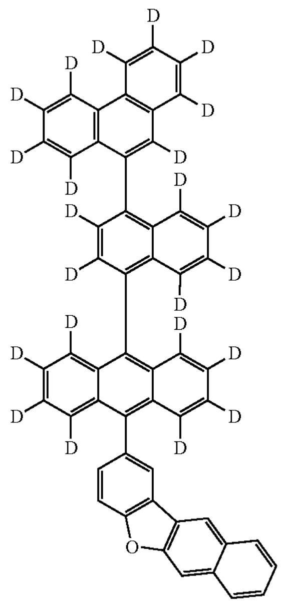
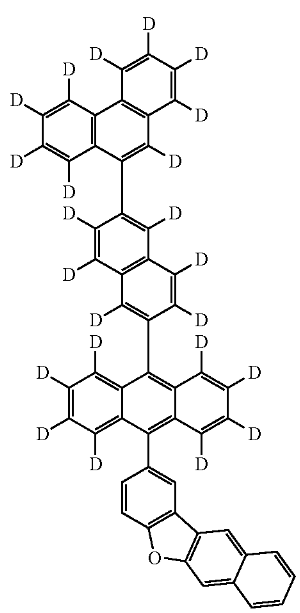
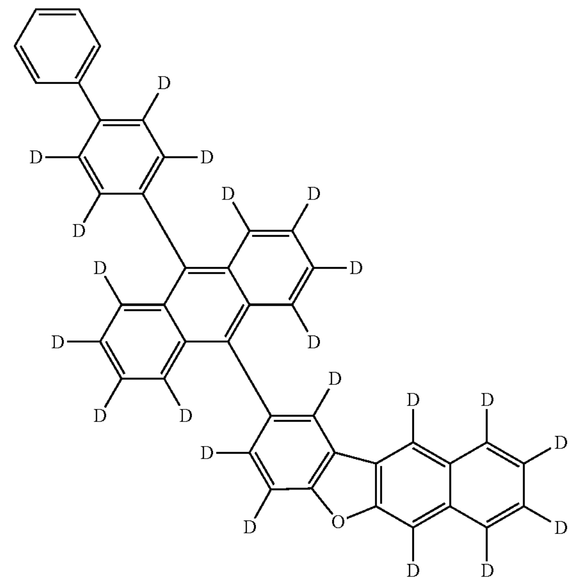
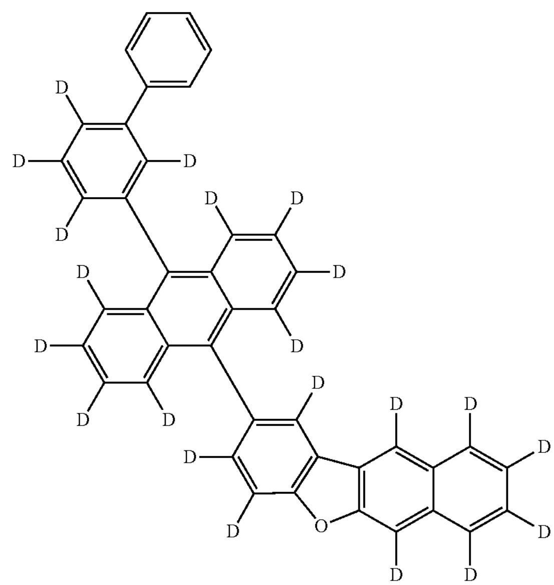
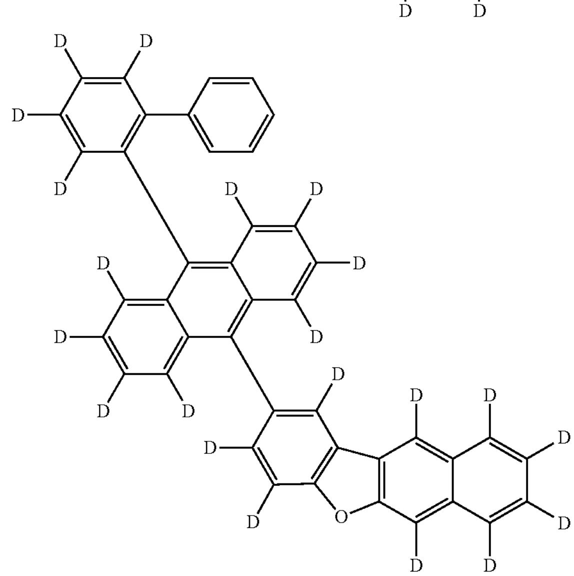

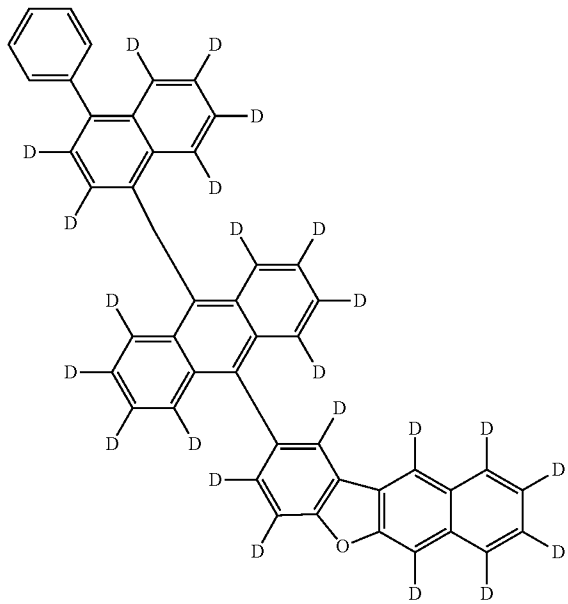
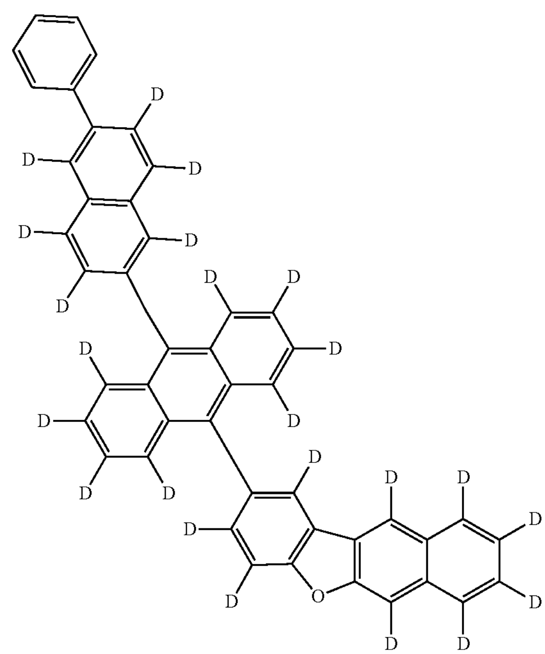
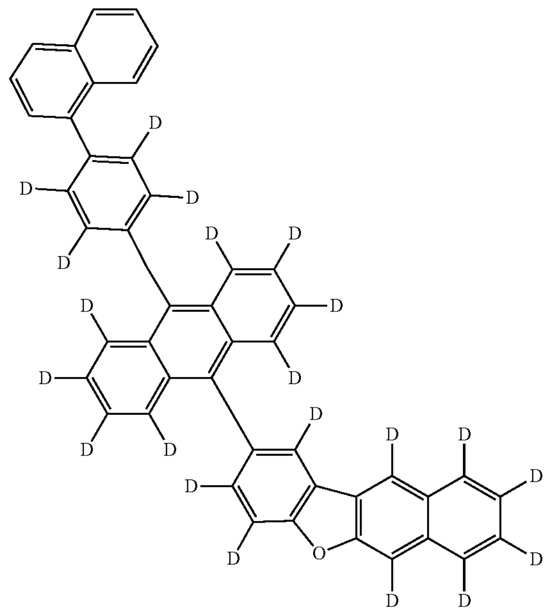
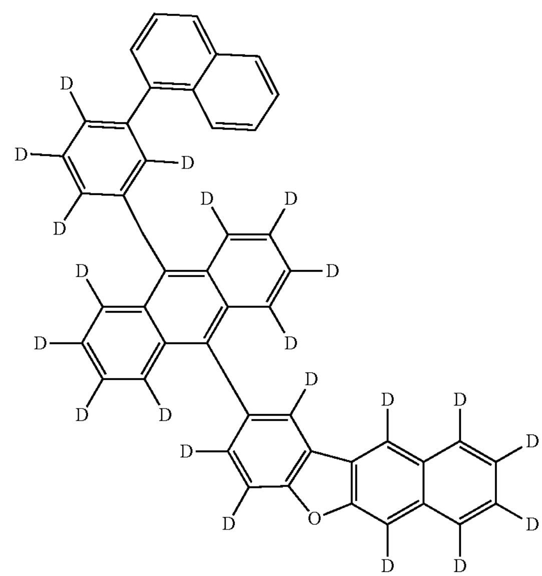

-continued
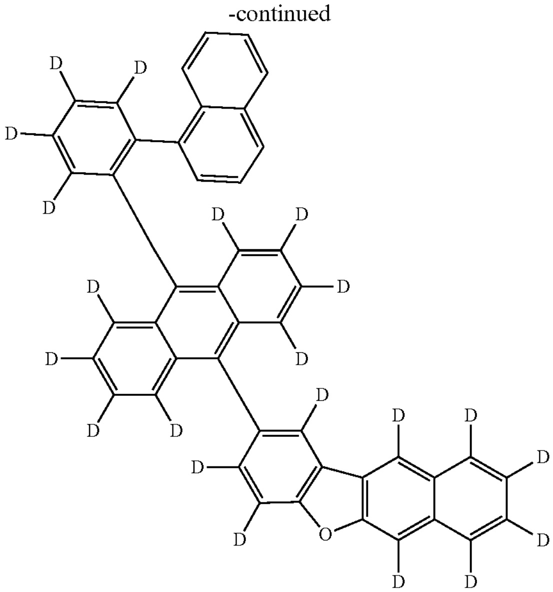
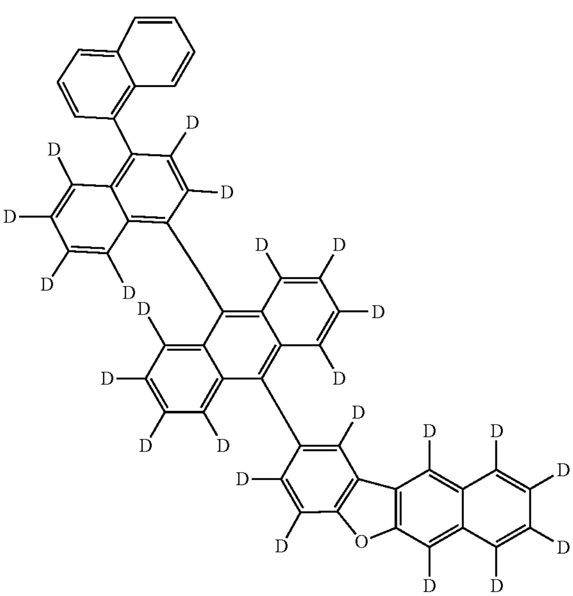
-continued
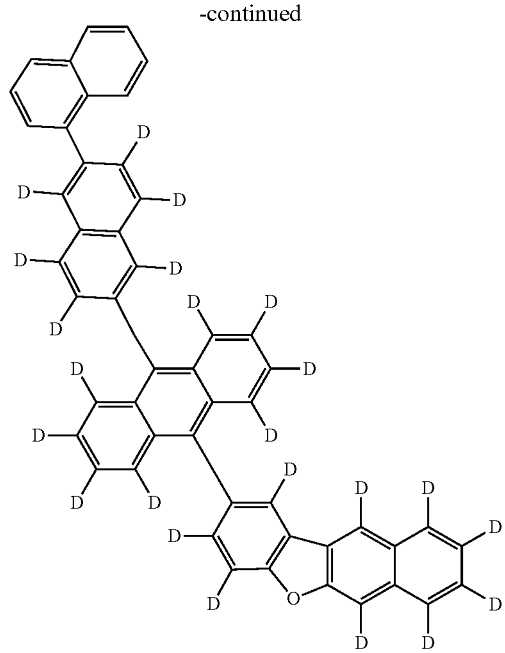
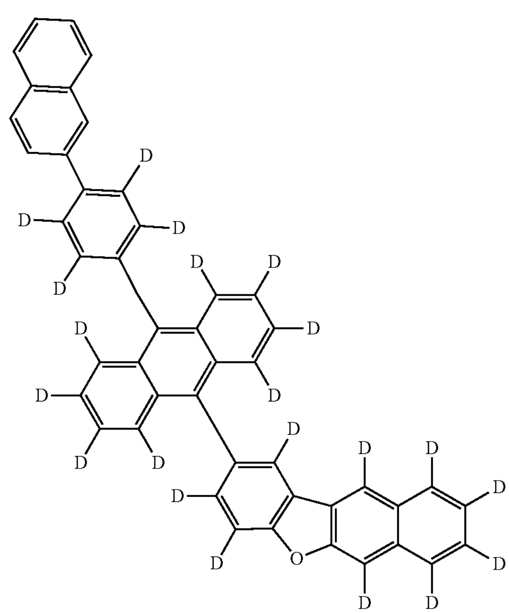

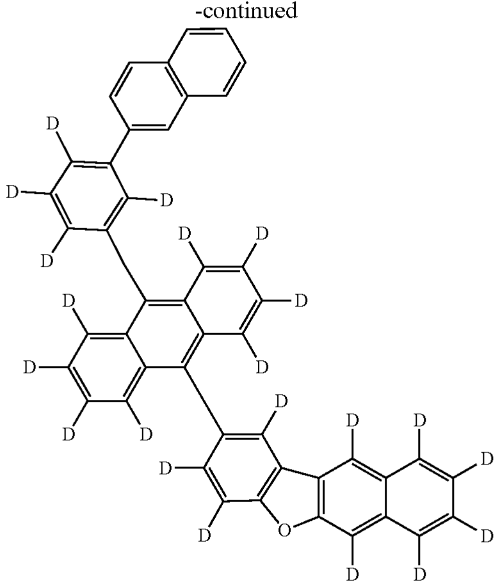
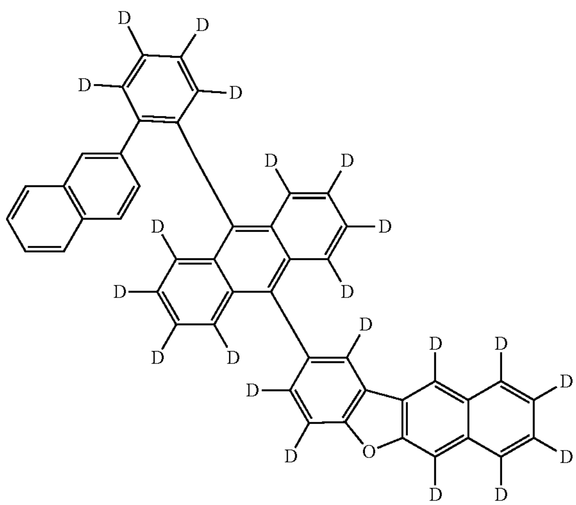
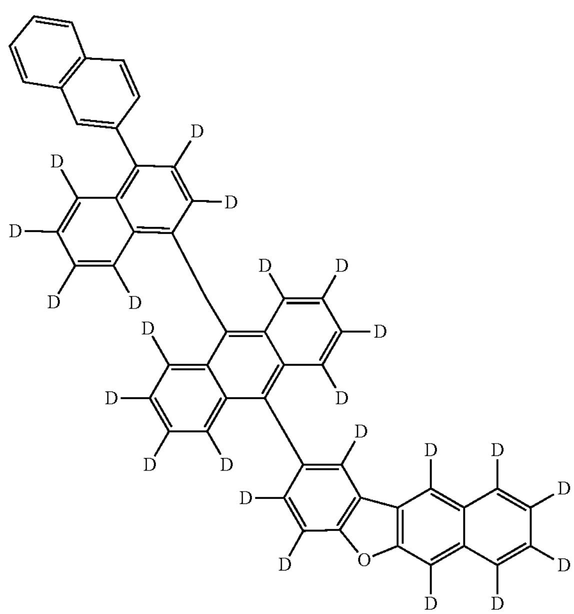
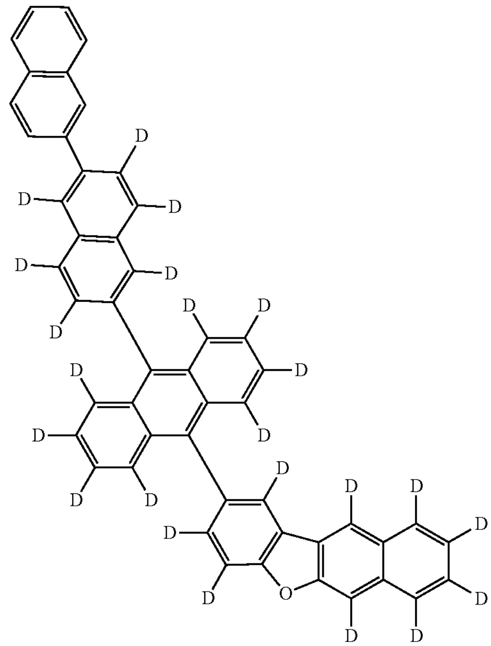
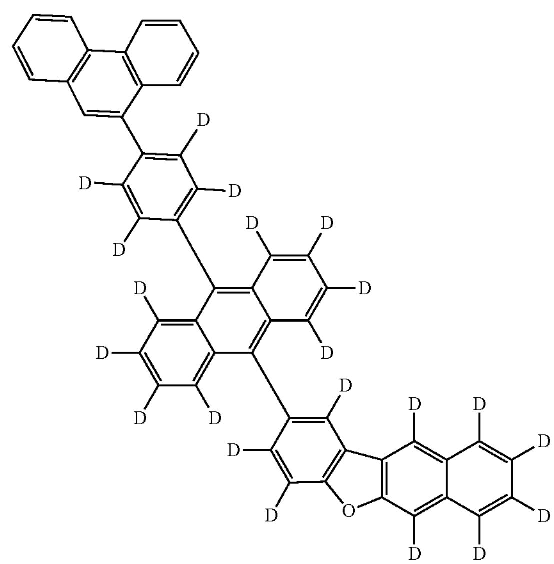

-continued
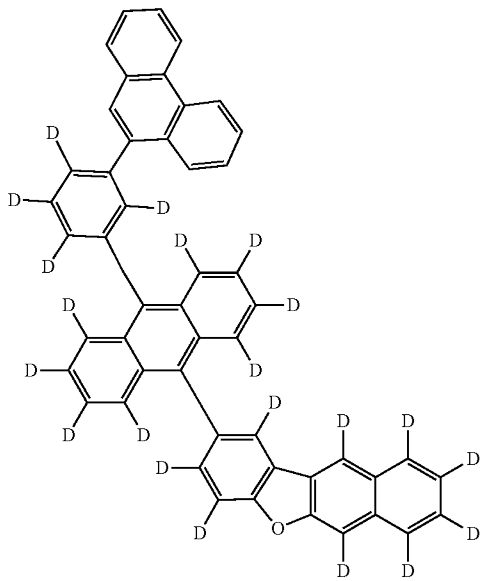
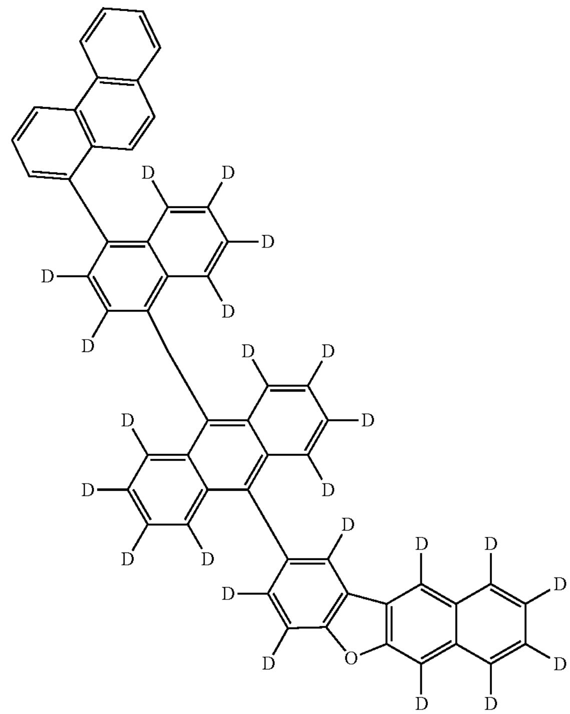
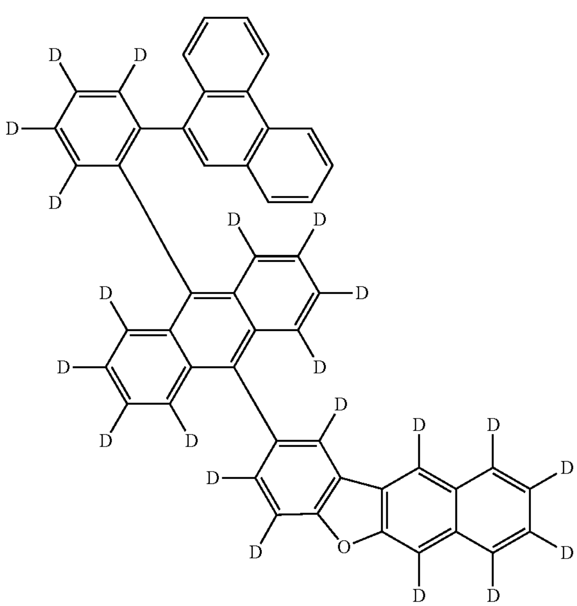
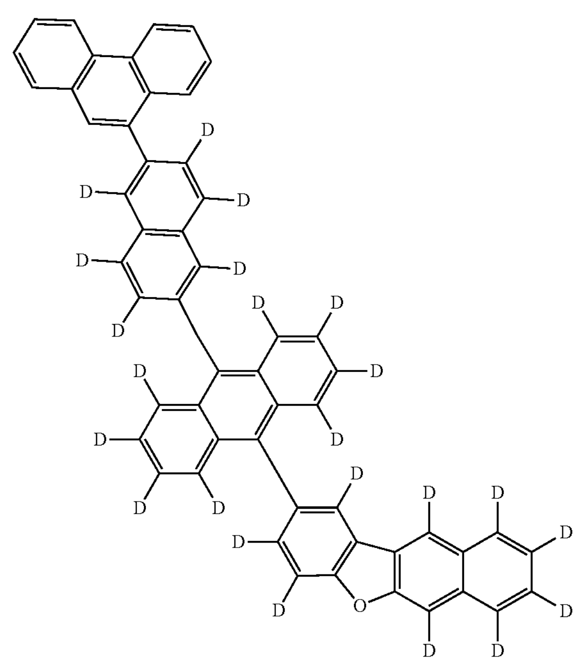 [SMILES: [2H]c1c(Cc2c3c([2H])c([2H])c([2H])c([2H])c3c(Cc3c([2H])c([2H])c4c([2H])c(-c5cc6ccccc6c6ccccc56)c([2H])c([2H])c4c3[2H])c3c([2H])c([2H])c([2H])c([2H])c23)c([2H])c2c(oc3c([2H])c4c([2H])c([2H])c([2H])c([2H])c4c([2H])c32)c1[2H]]

-continued
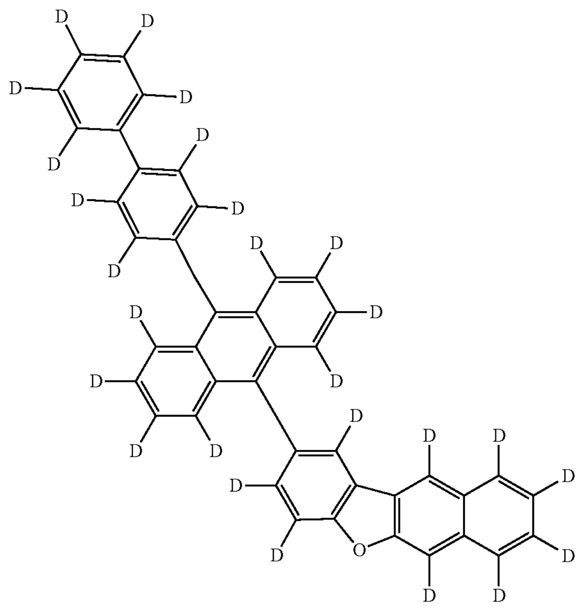
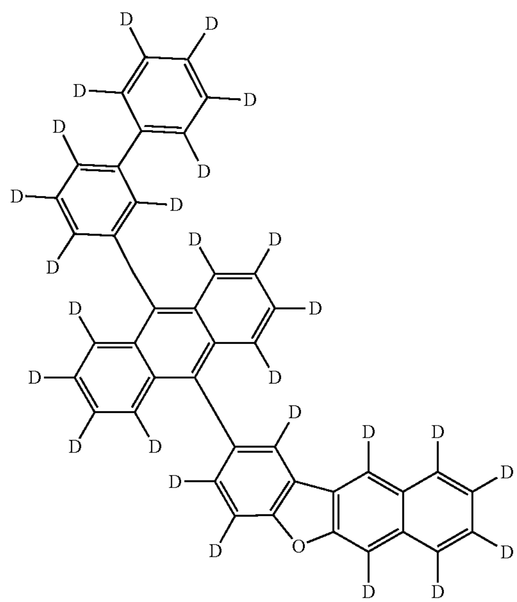
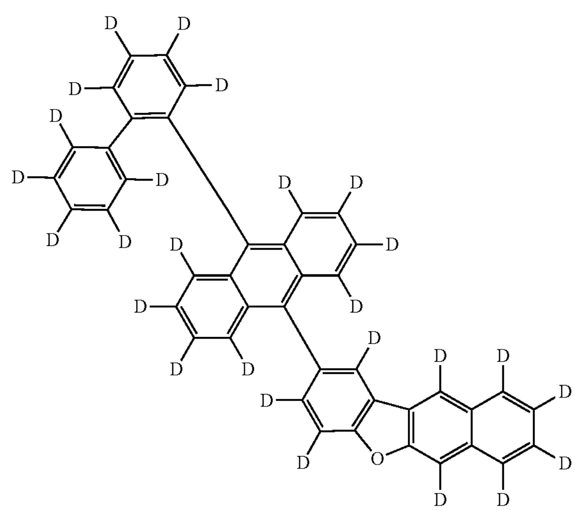
-continued
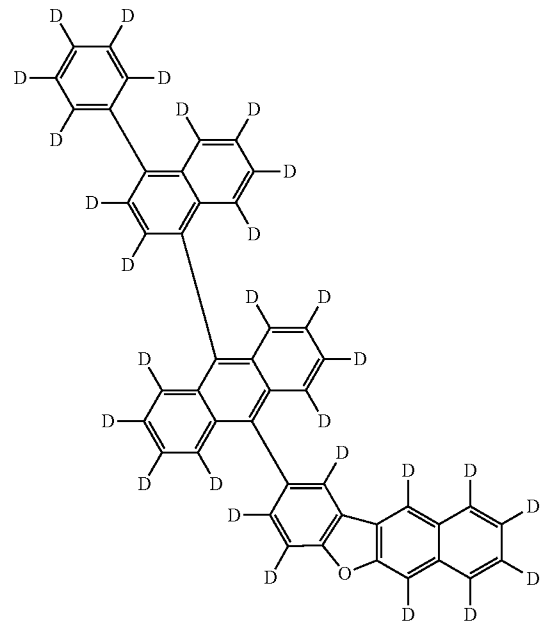
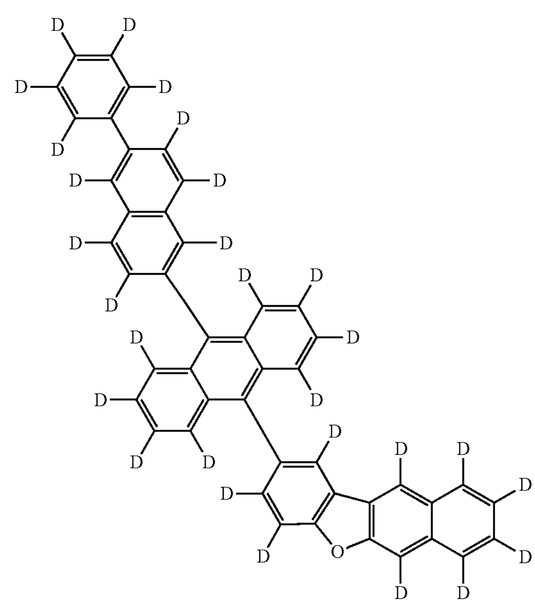

-continued
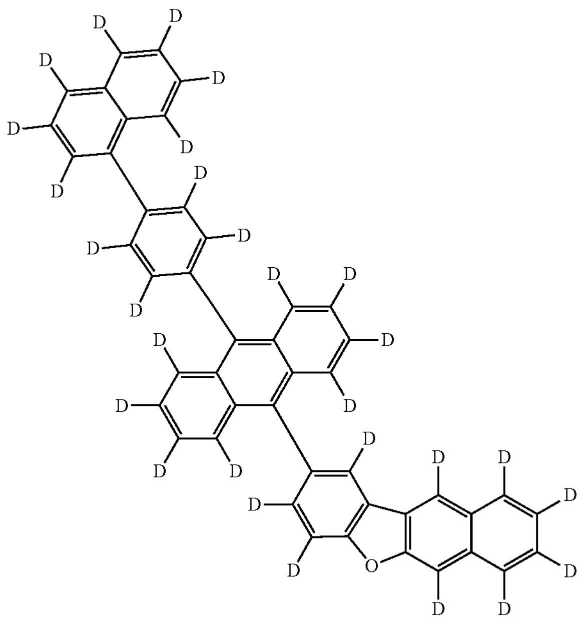
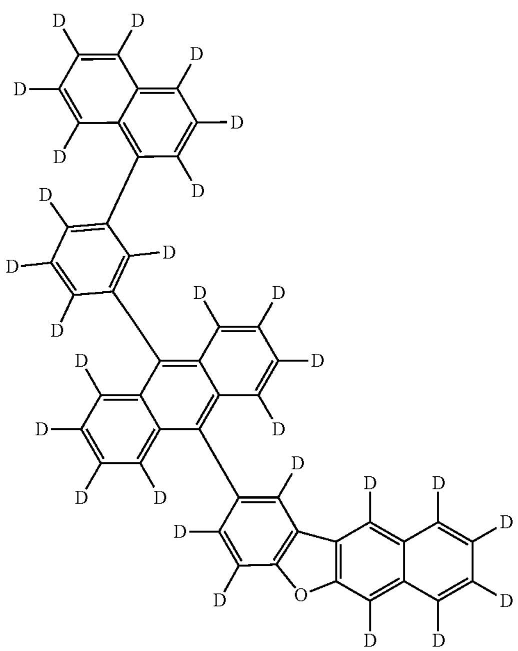
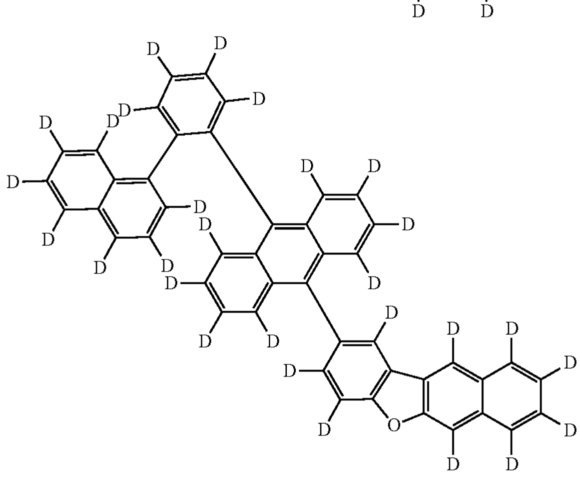
-continued
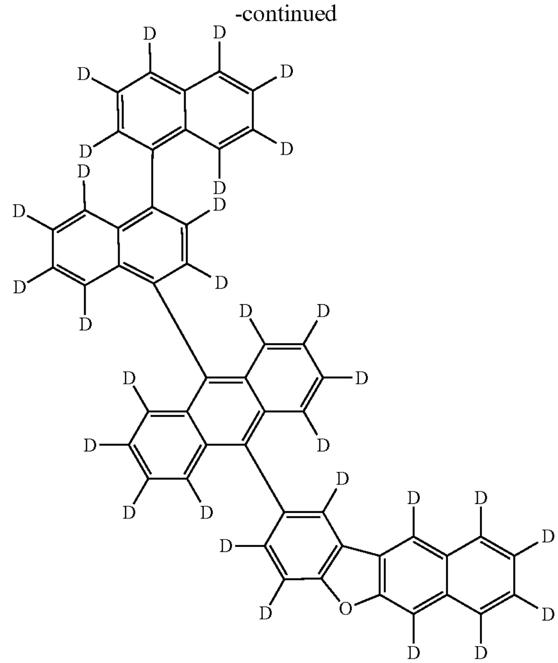
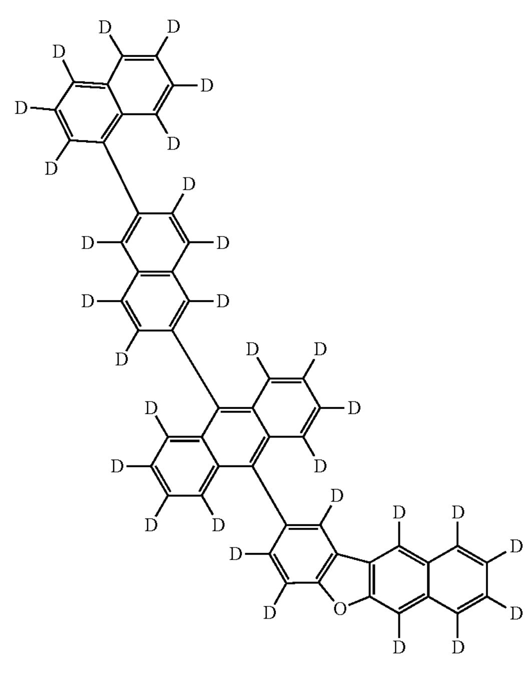

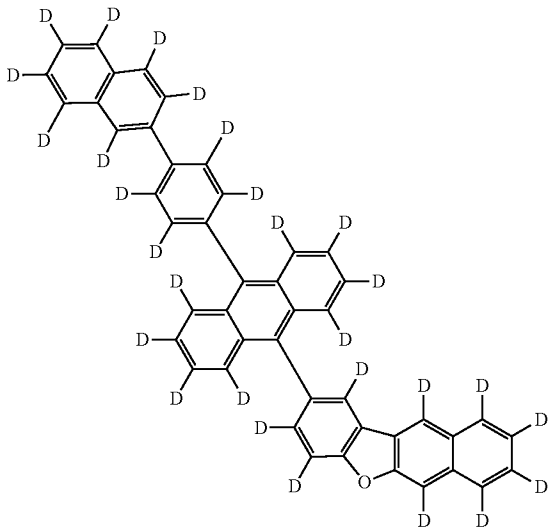
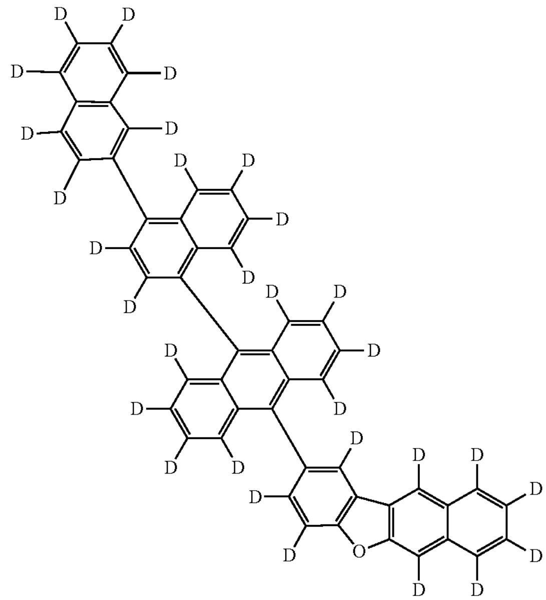 [SMILES: [2H]c1c(Cc2c3c([2H])c([2H])c([2H])c([2H])c3c(-c3c([2H])c([2H])c(-c4c([2H])c([2H])c5c([2H])c([2H])c([2H])c([2H])c5c4[2H])c4c([2H])c([2H])c([2H])c([2H])c34)c3c([2H])c([2H])c([2H])c([2H])c23)c([2H])c2c(oc3c([2H])c4c([2H])c([2H])c([2H])c([2H])c4c([2H])c32)c1[2H]]
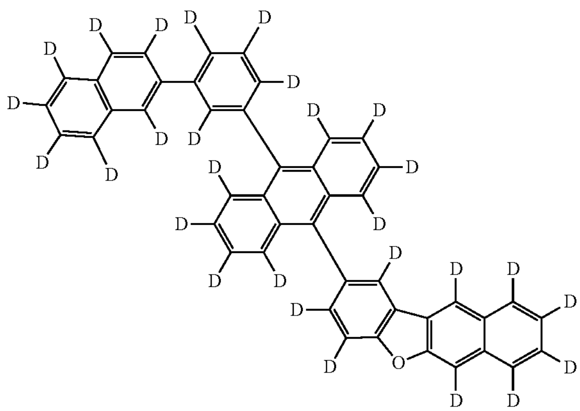
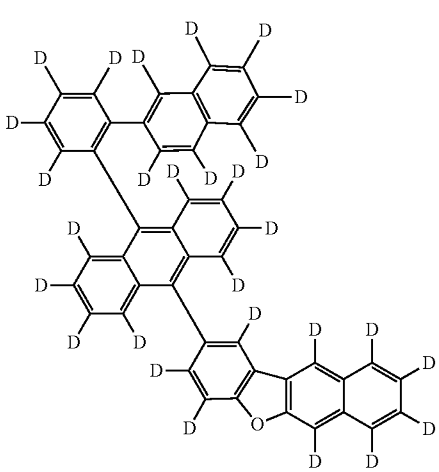
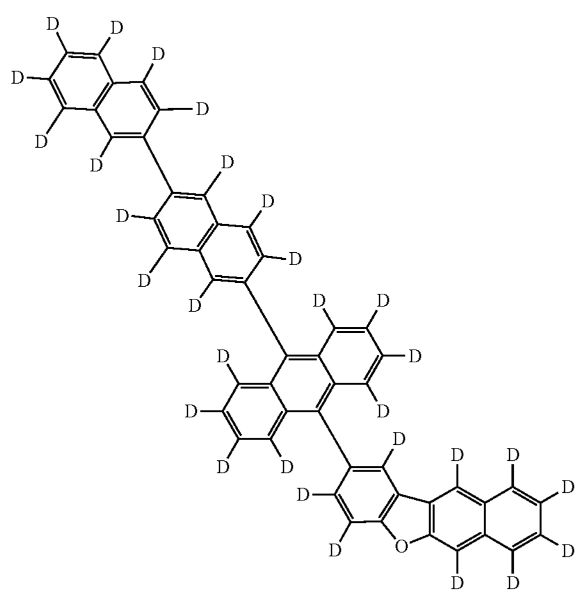

-continued
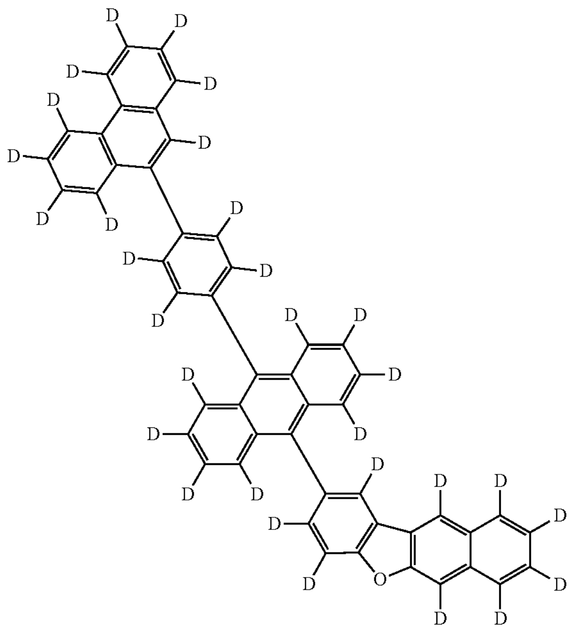
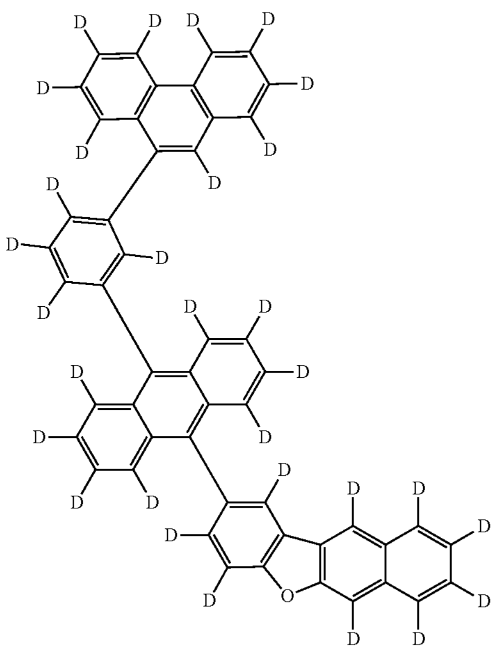
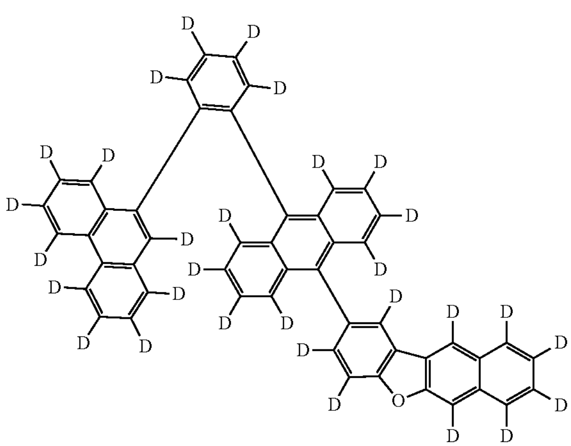
-continued
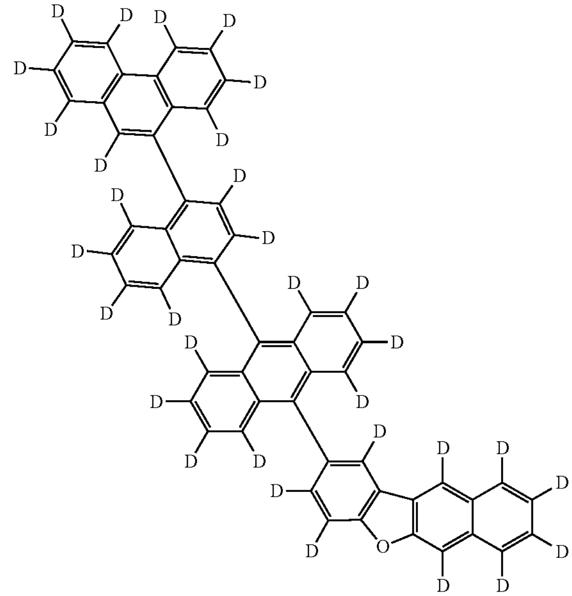
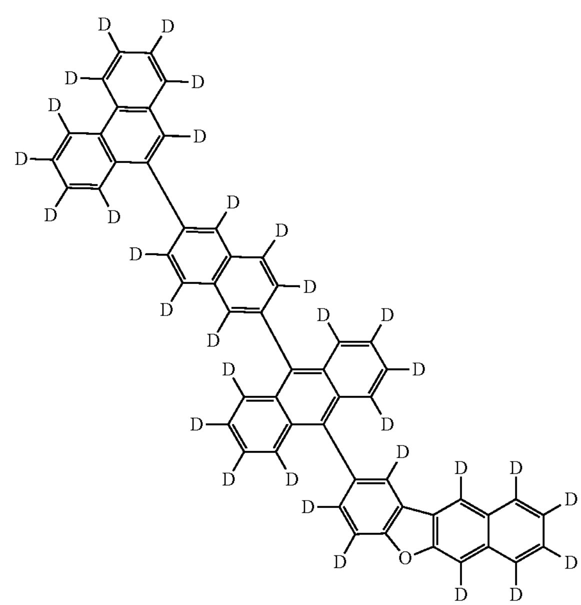

-continued
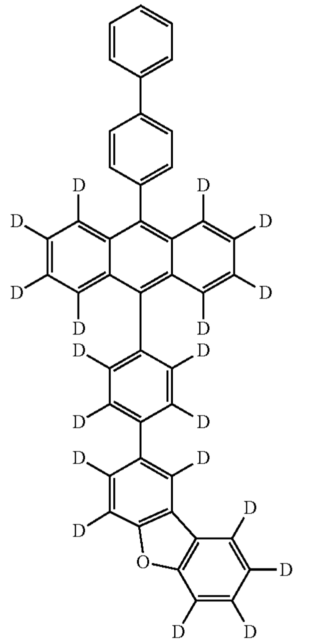
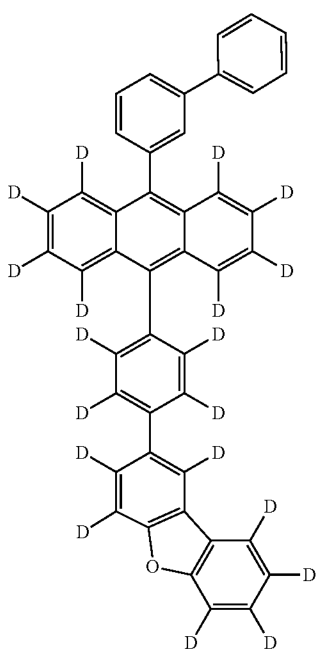
-continued
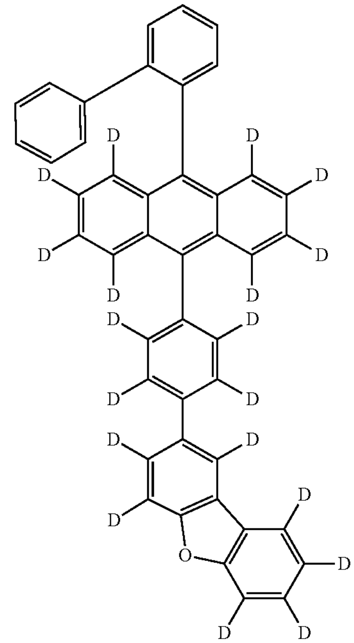
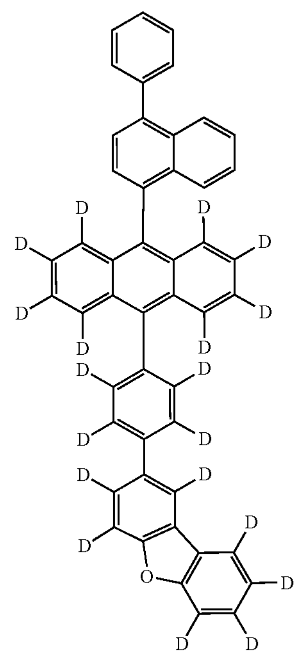

-continued
-continued
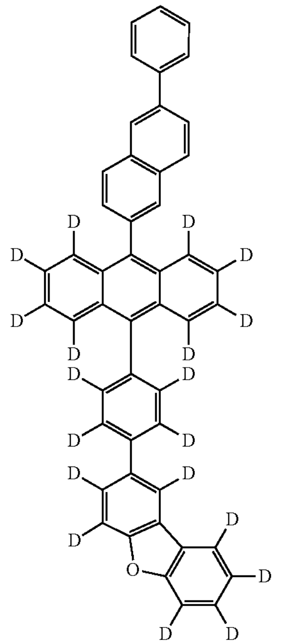
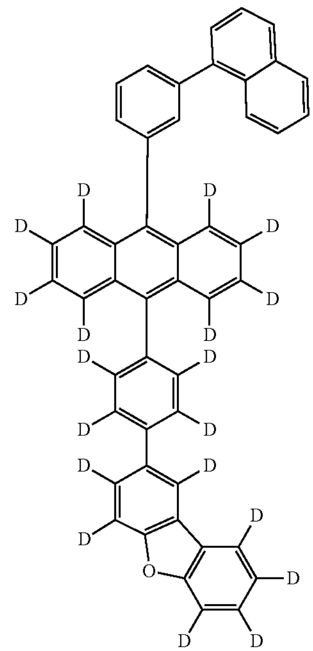
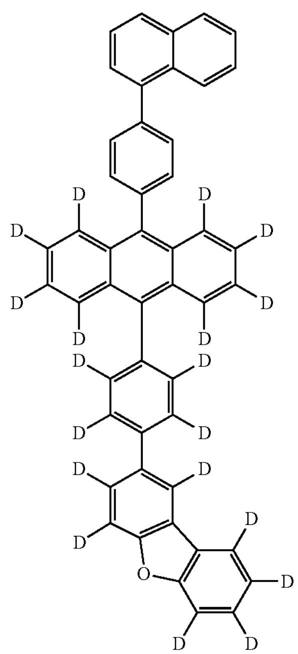
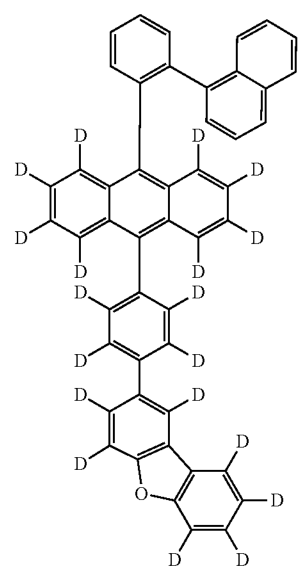

-continued
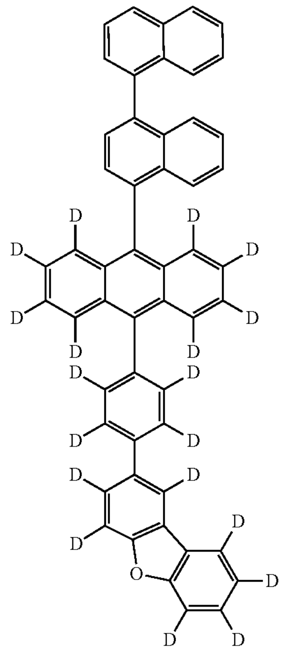
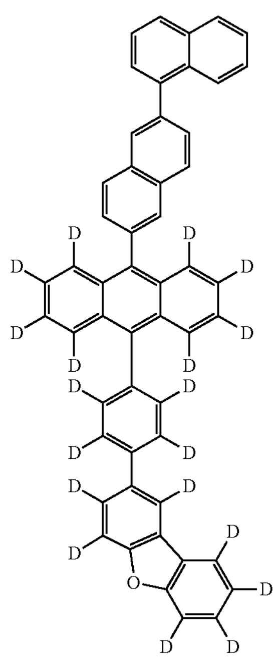
-continued
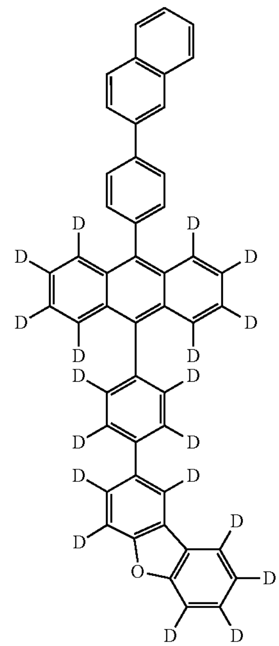
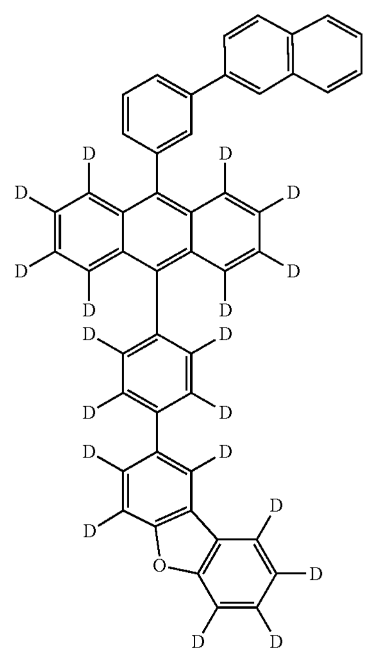

-continued
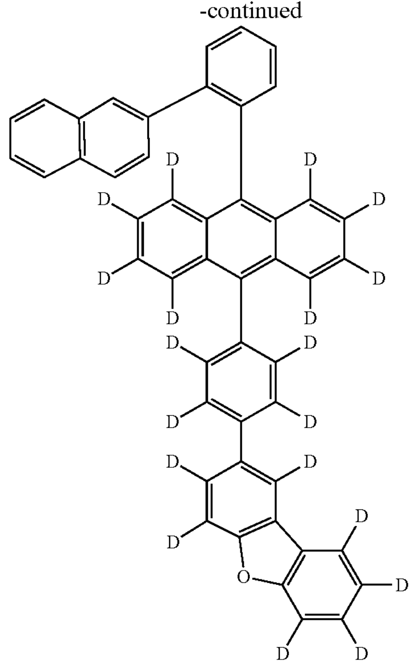
-continued
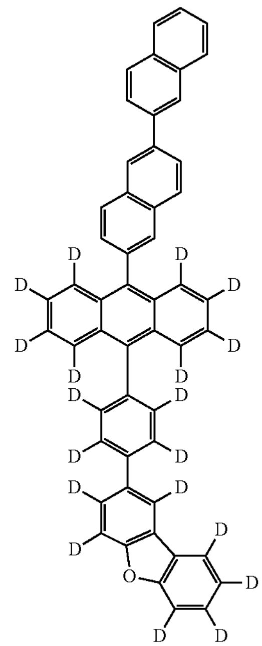
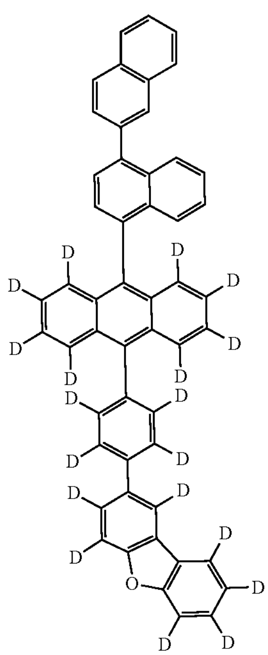
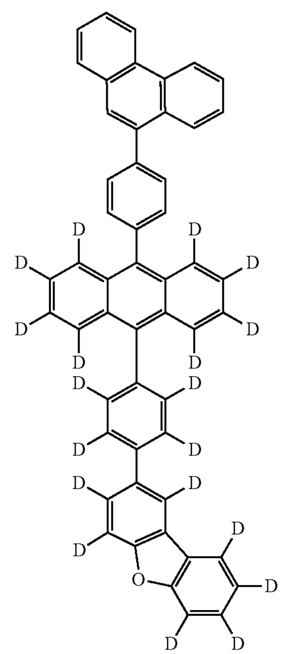

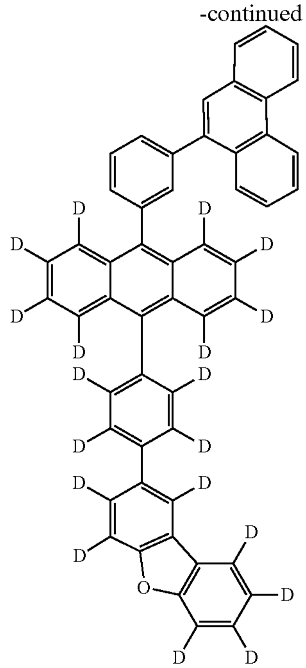
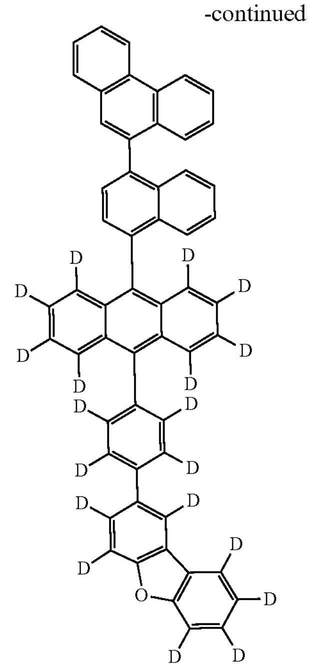
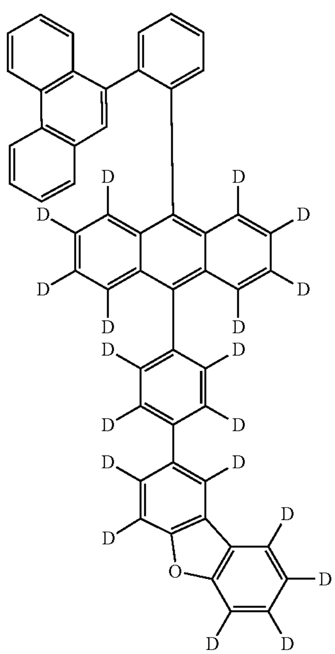
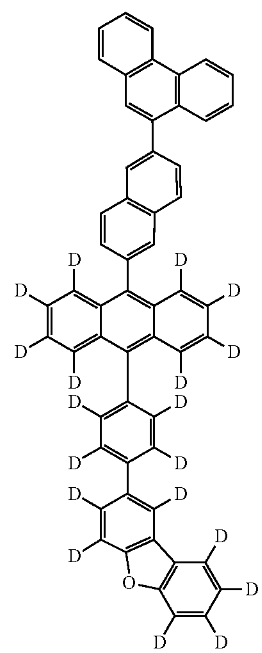 [SMILES: [2H]c1c([2H])c(-c2c3c([2H])c([2H])c([2H])c([2H])c3c(-c3ccc4cc(-c5cc6ccccc6c6ccccc56)ccc4c3)c3c([2H])c([2H])c([2H])c([2H])c23)c([2H])c([2H])c1-c1c([2H])c([2H])c2oc3c([2H])c([2H])c([2H])c([2H])c3c2c1[2H]]

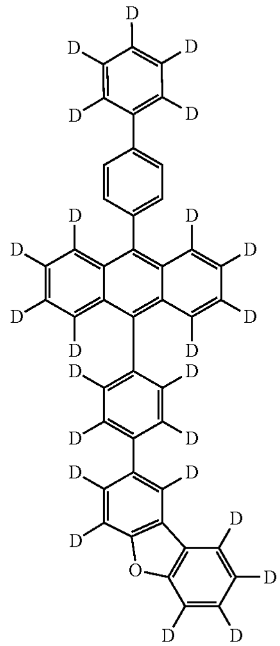
D
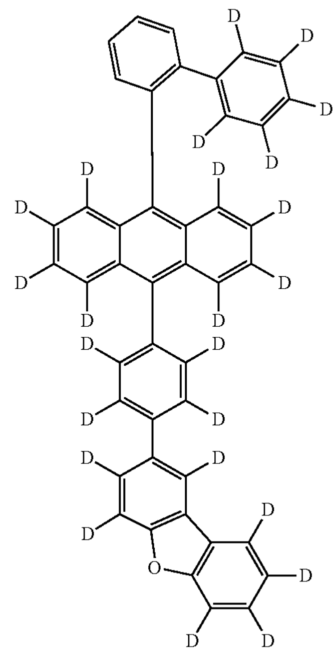
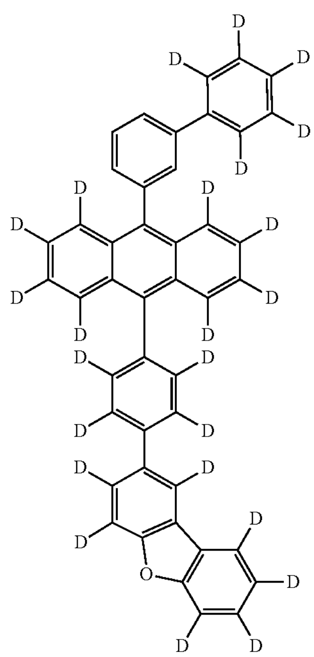
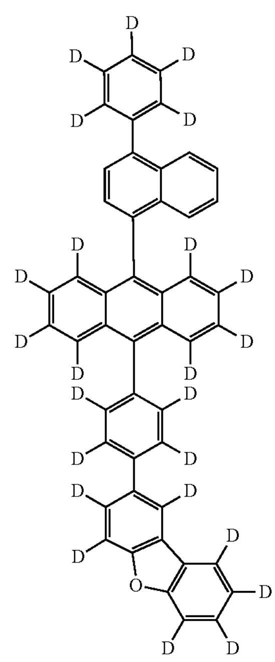

-continued
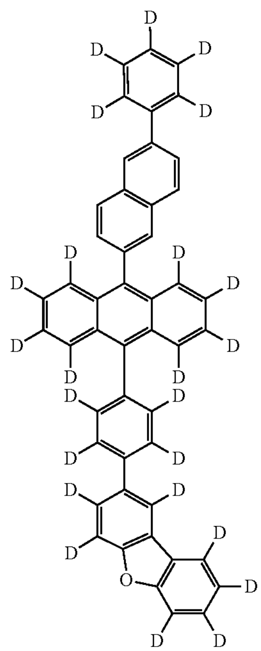
-continued
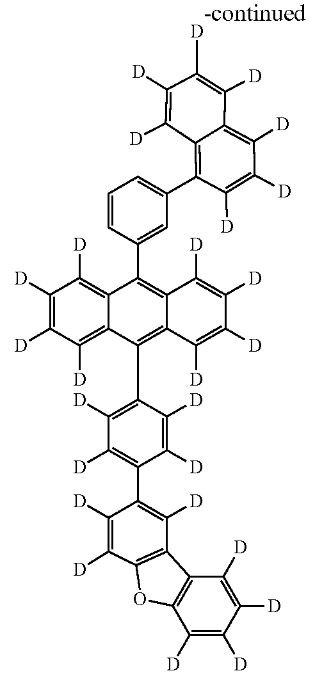
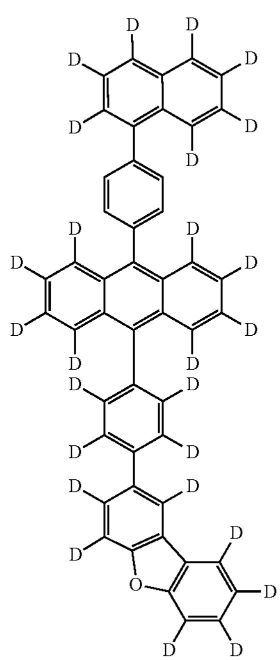
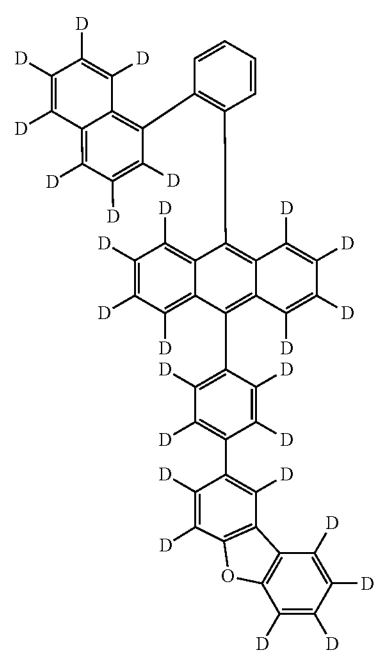

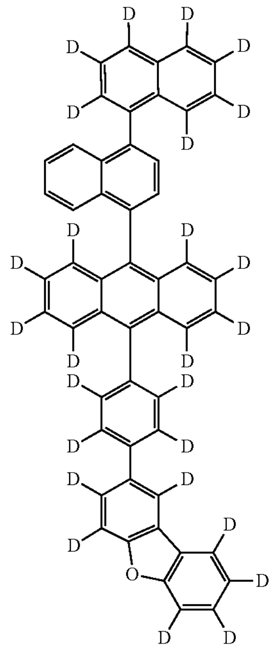
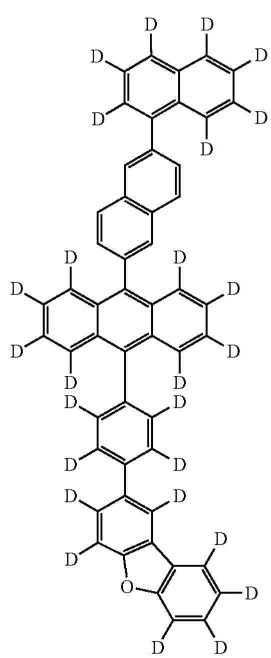
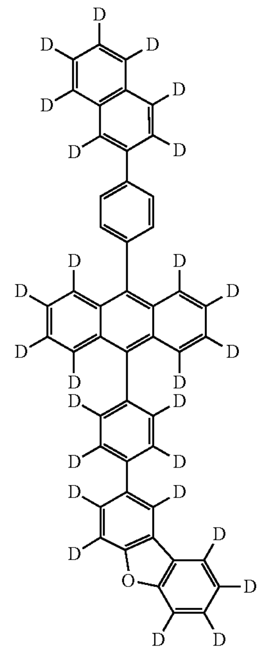
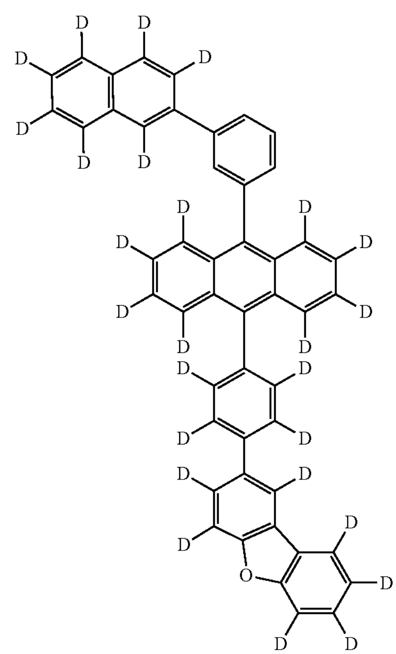

-continued
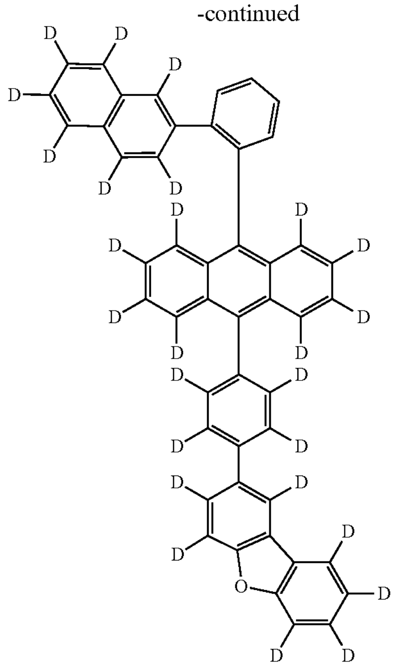
-continued
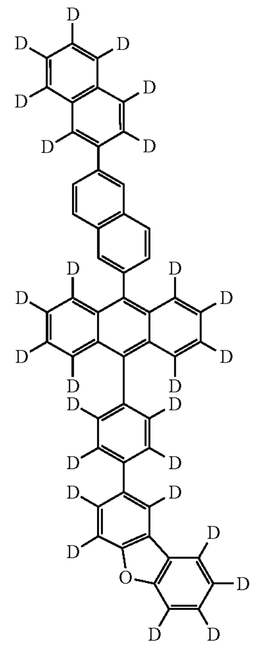
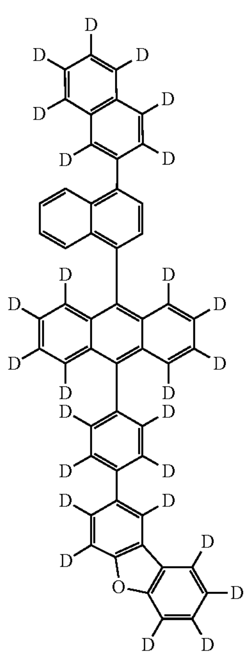
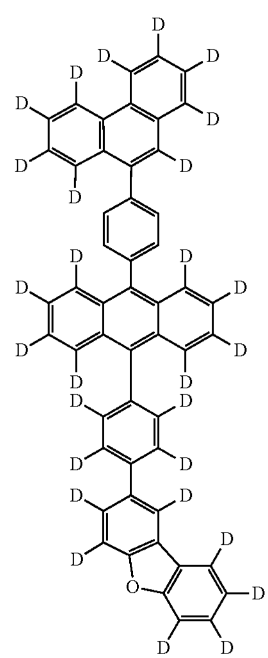

-continued
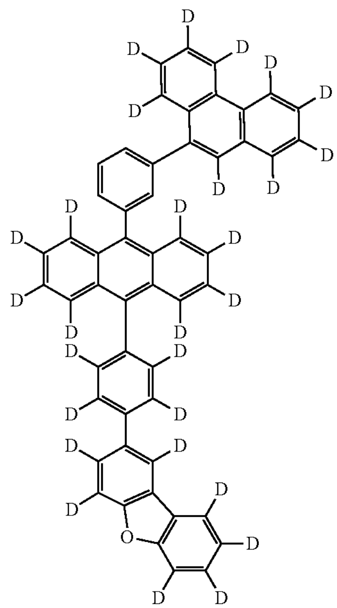 [SMILES: [2H]c1c([2H])c(-c2c3c([2H])c([2H])c([2H])c([2H])c3c(-c3cccc(-c4c([2H])c5c([2H])c([2H])c([2H])c([2H])c5c5c([2H])c([2H])c([2H])c([2H])c45)c3)c3c([2H])c([2H])c([2H])c([2H])c23)c([2H])c([2H])c1-c1c([2H])c([2H])c2oc3c([2H])c([2H])c([2H])c([2H])c3c2c1[2H]]
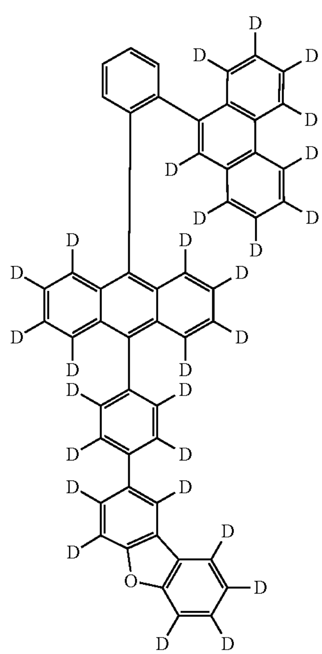
-continued
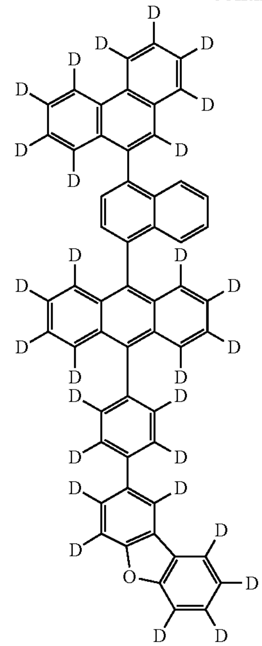
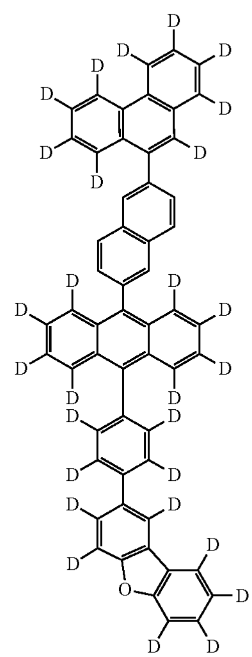 [SMILES: [2H]c1c([2H])c(-c2c3c([2H])c([2H])c([2H])c([2H])c3c(-c3ccc4cc(-c5c([2H])c6c([2H])c([2H])c([2H])c([2H])c6c6c([2H])c([2H])c([2H])c([2H])c56)ccc4c3)c3c([2H])c([2H])c([2H])c([2H])c23)c([2H])c([2H])c1-c1c([2H])c([2H])c2oc3c([2H])c([2H])c([2H])c([2H])c3c2c1[2H]]

-continued
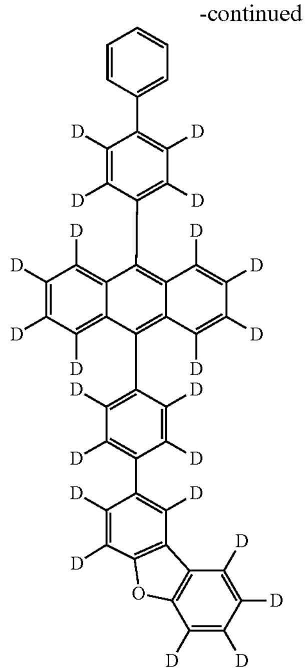
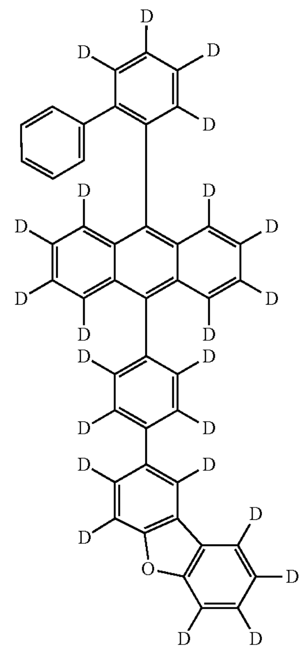
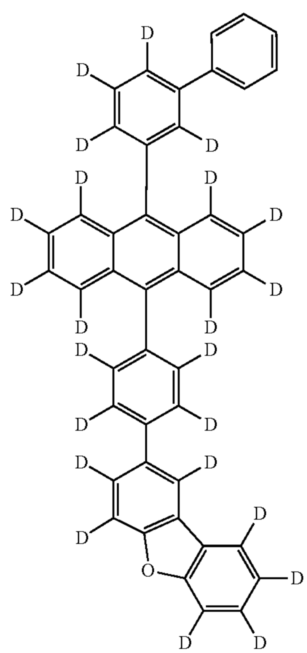
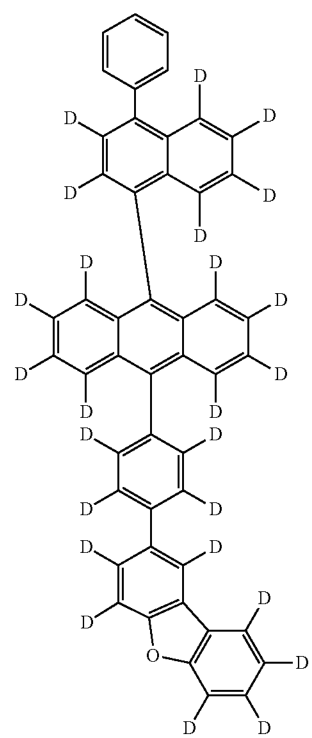

-continued
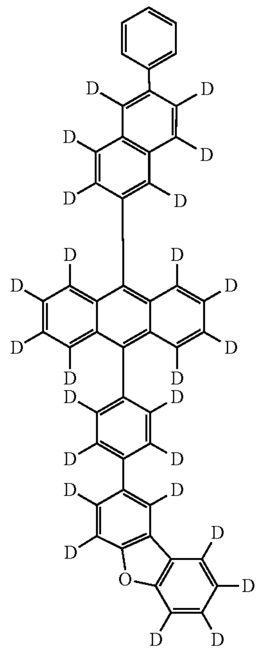
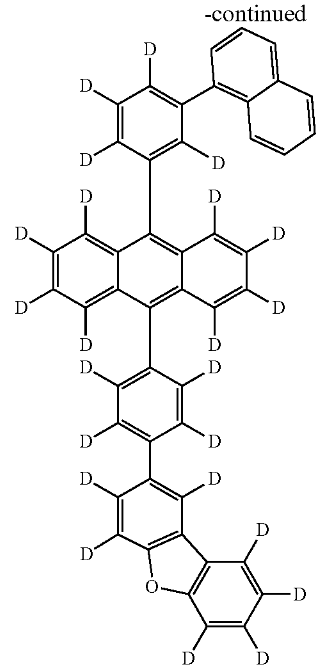
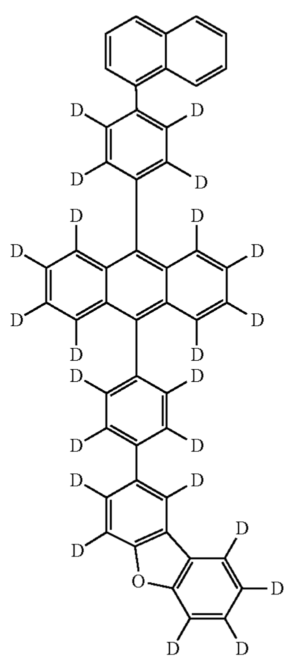
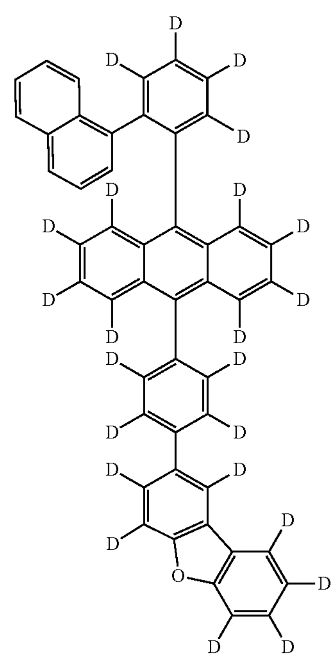

-continued
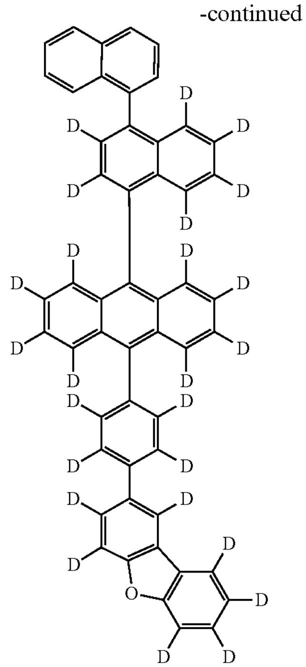
-continued
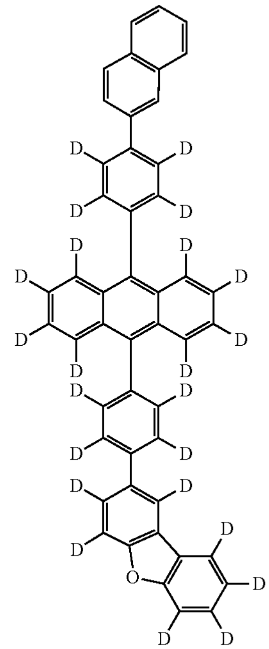
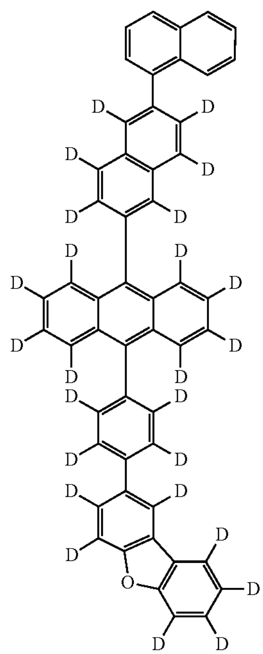
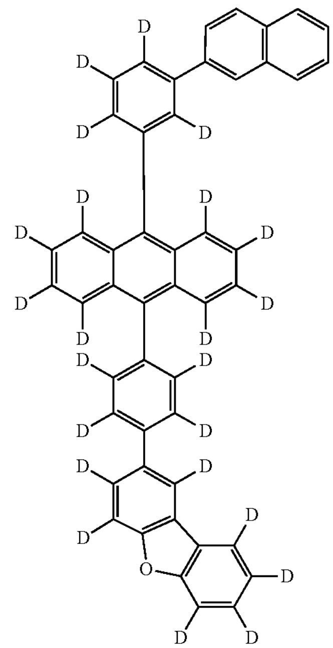

-continued
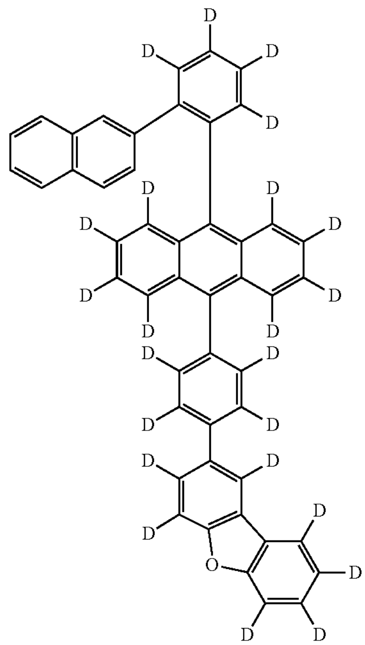
-continued
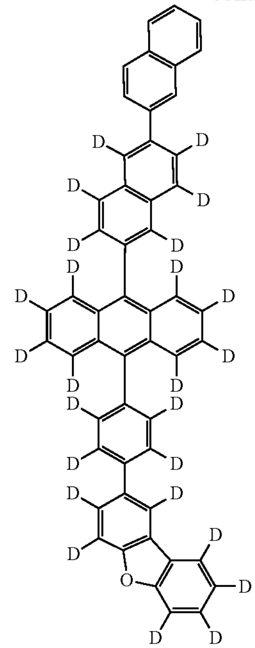
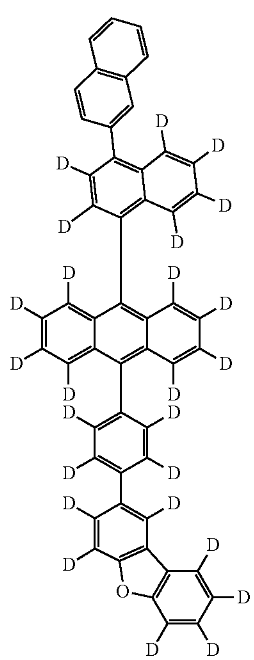
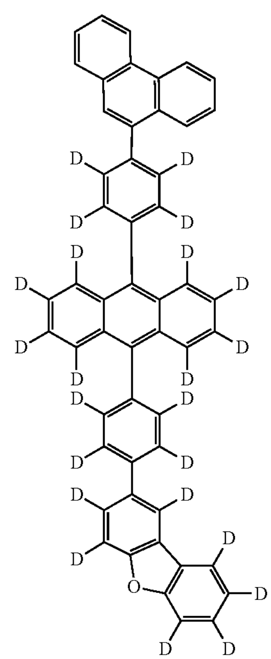

-continued
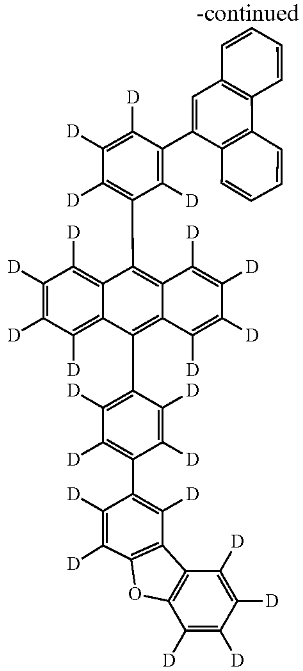
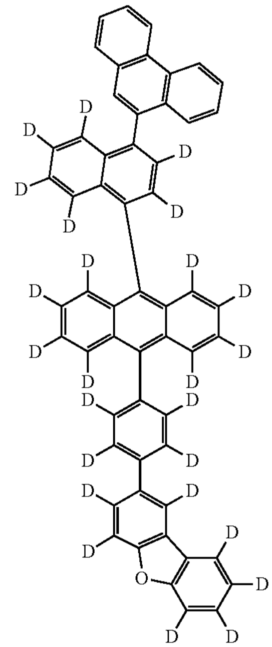
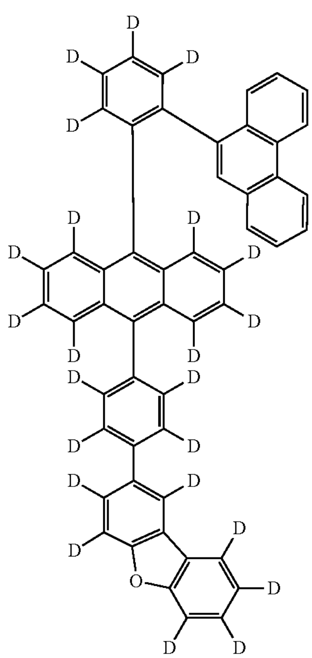
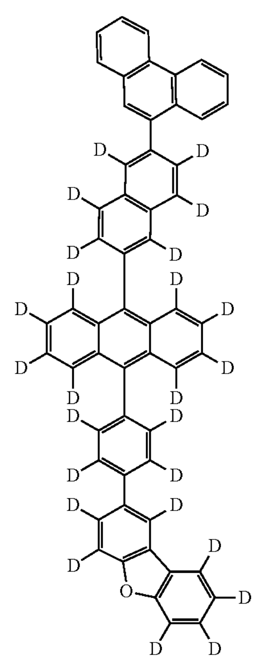
-continued

-continued
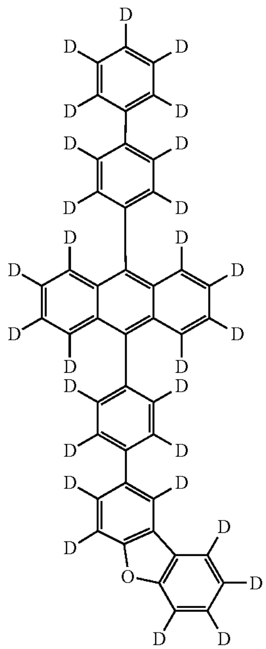
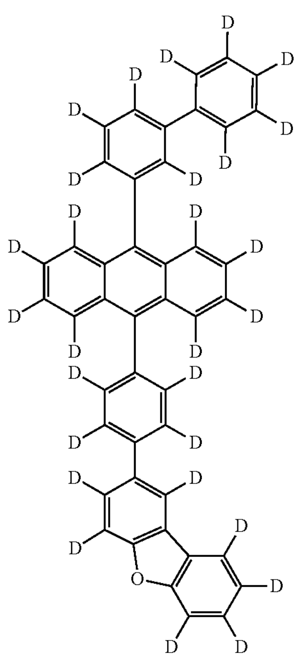
-continued
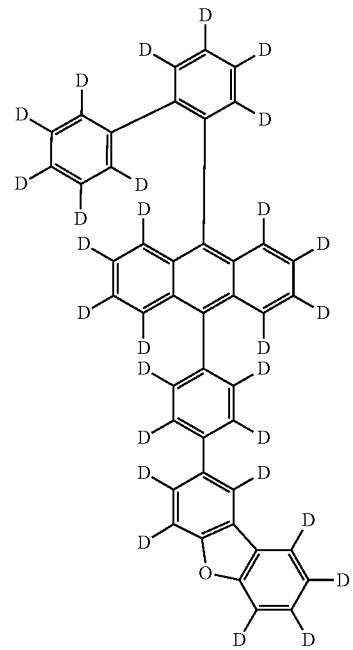
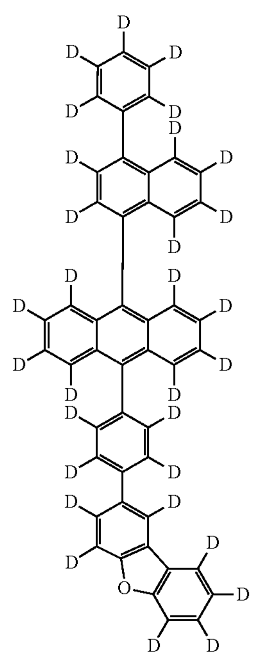

-continued
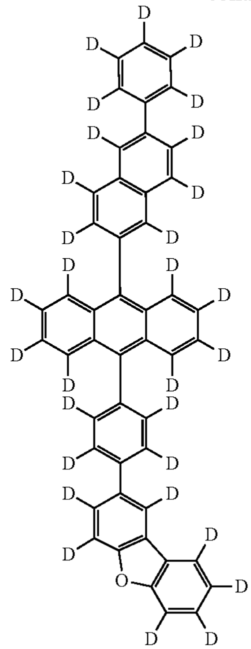
-continued
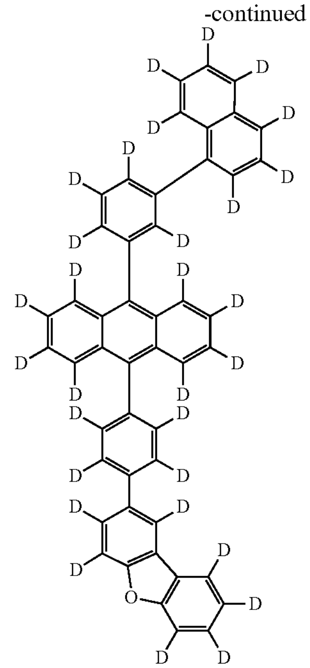
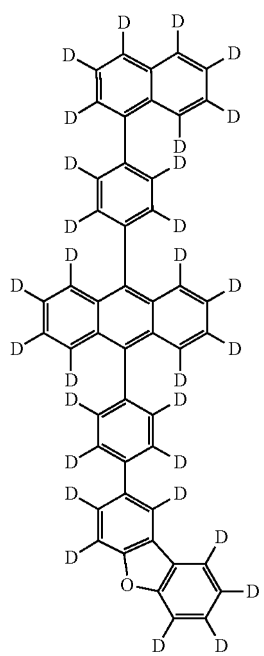
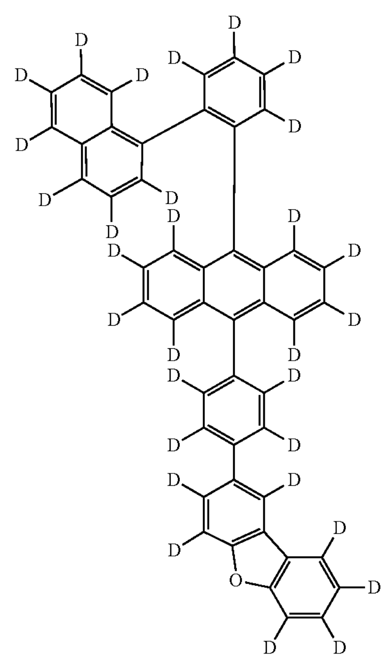

-continued
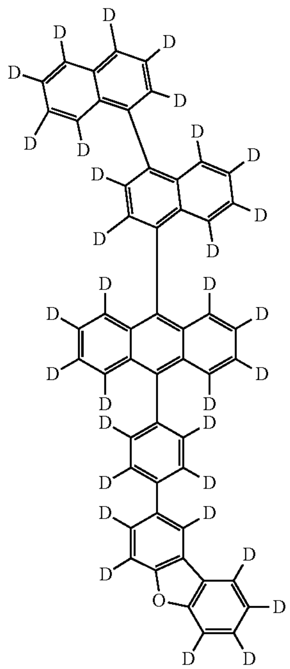
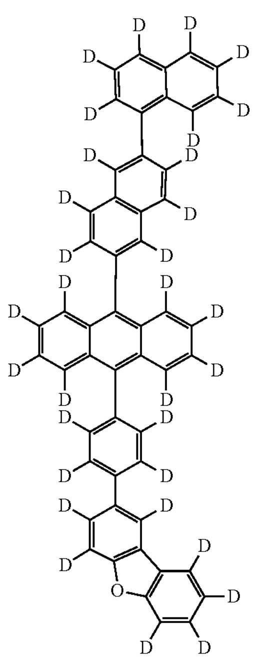
-continued
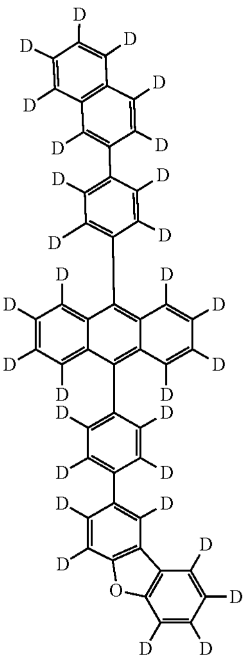
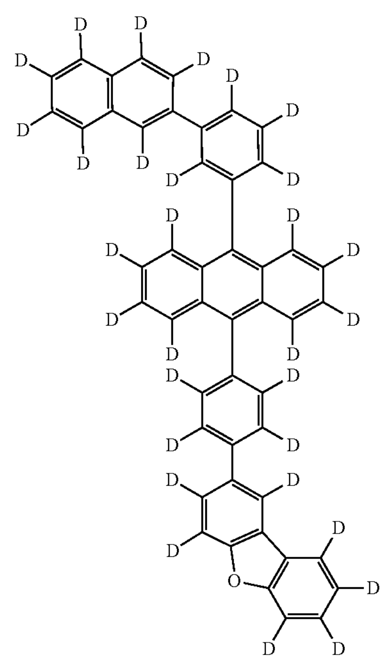

-continued
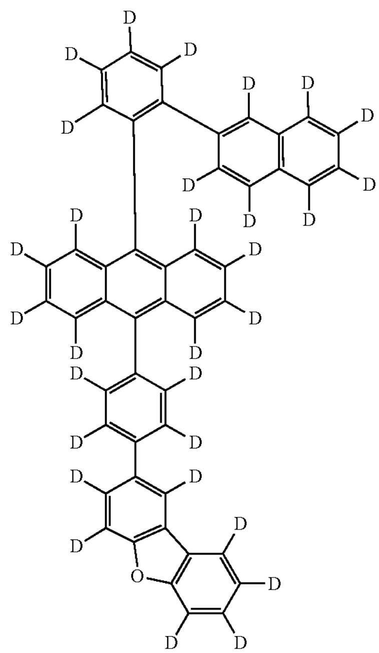
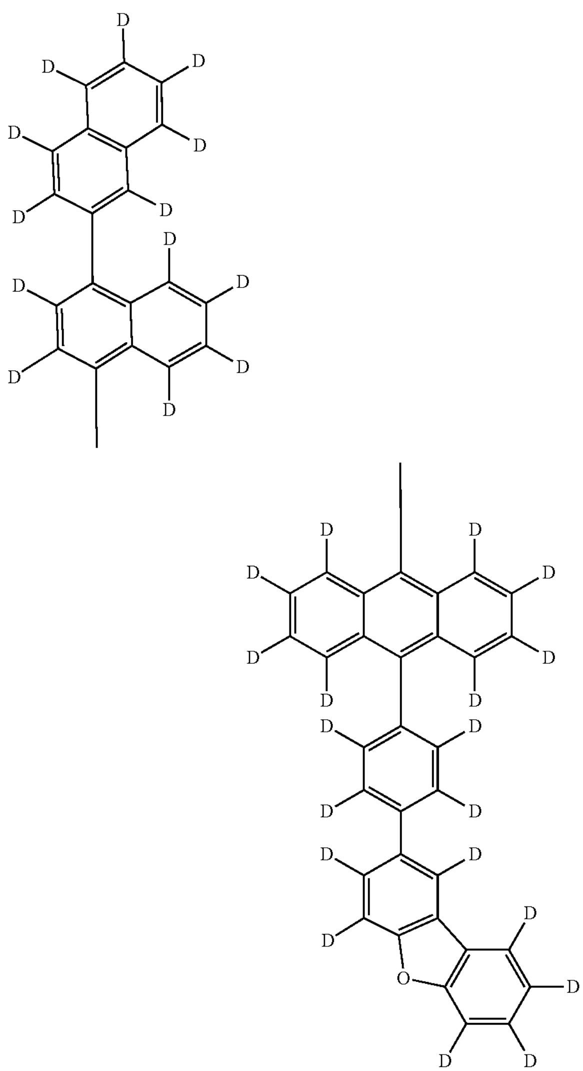
-continued
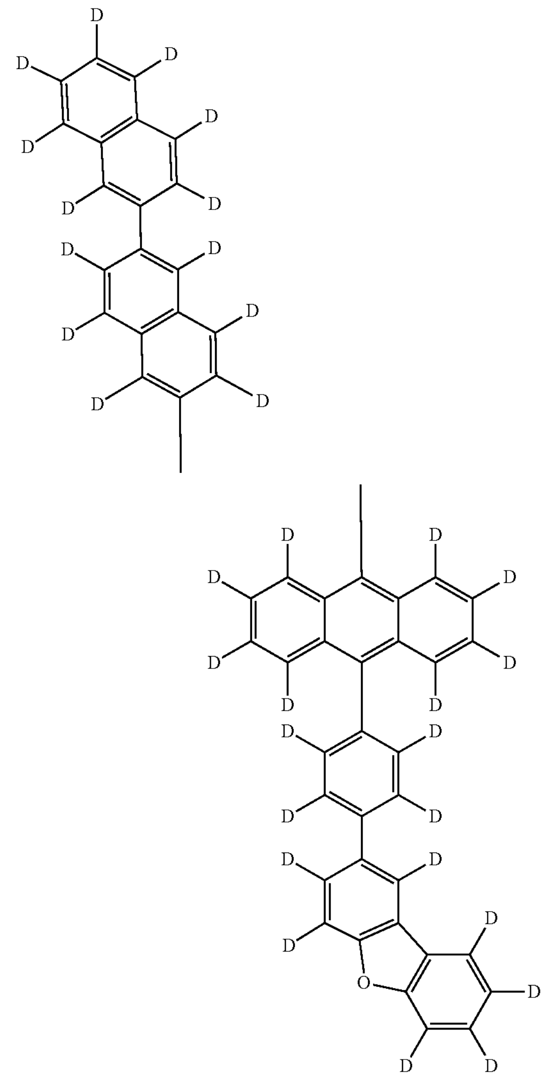
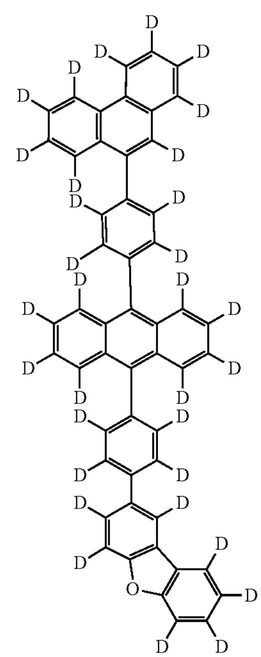

-continued
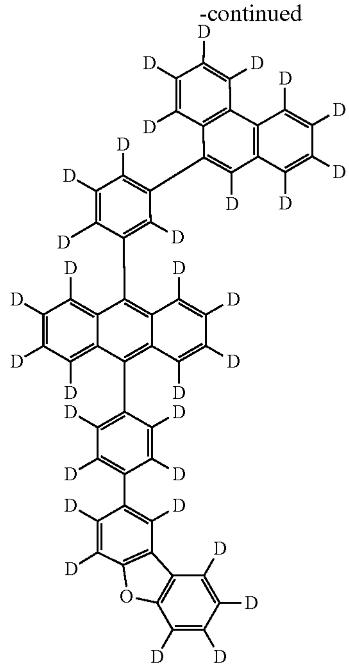
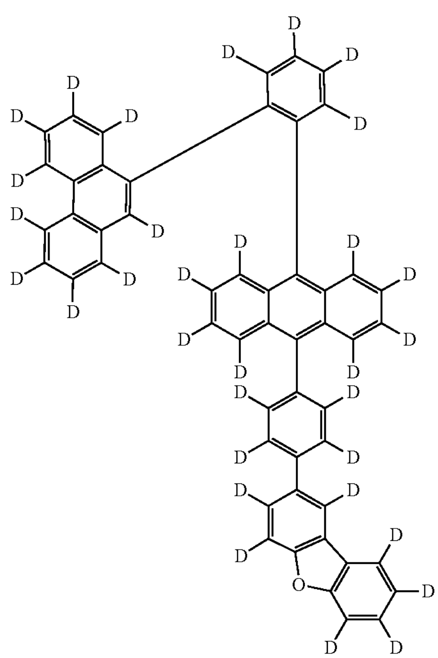
-continued
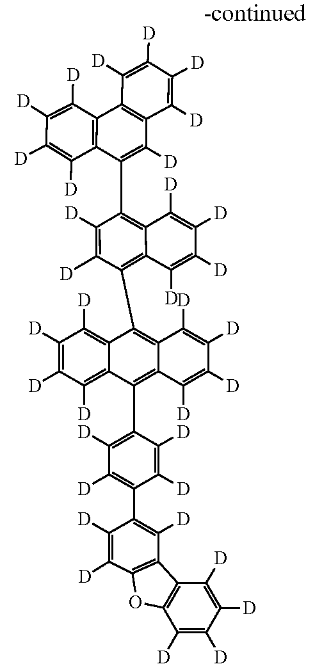
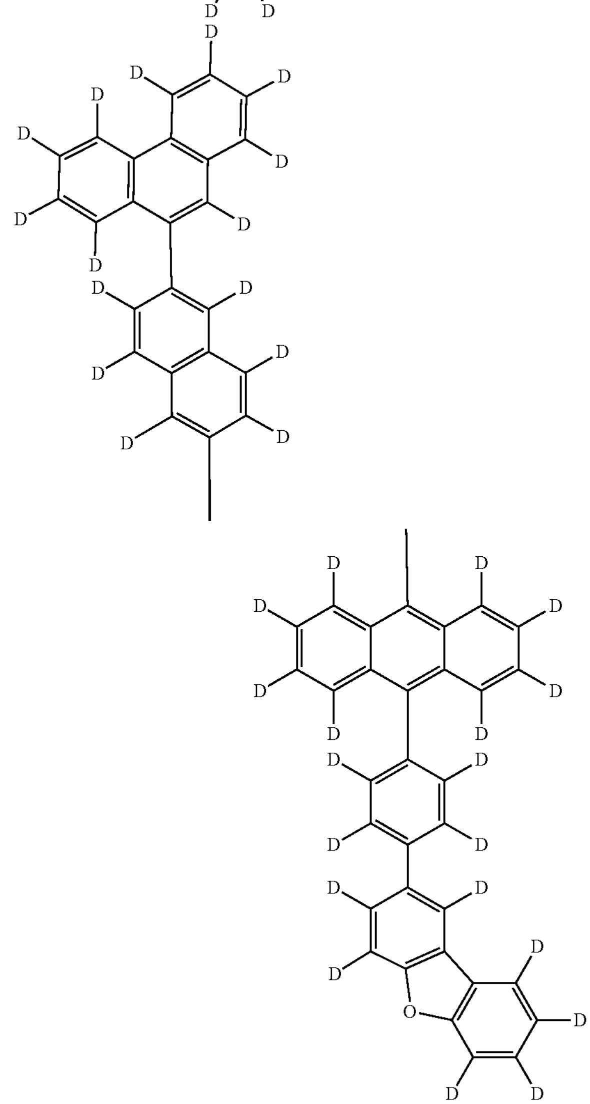

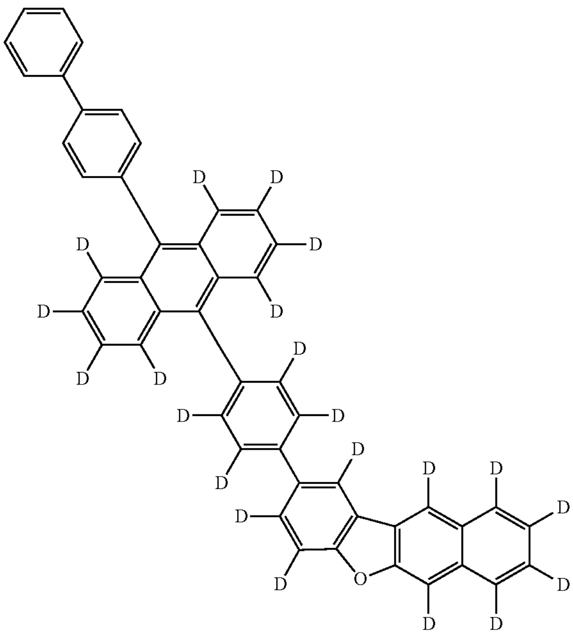
D
O
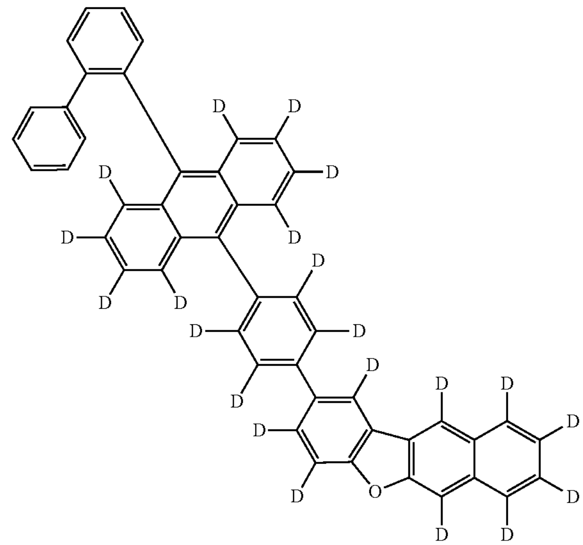
D
O
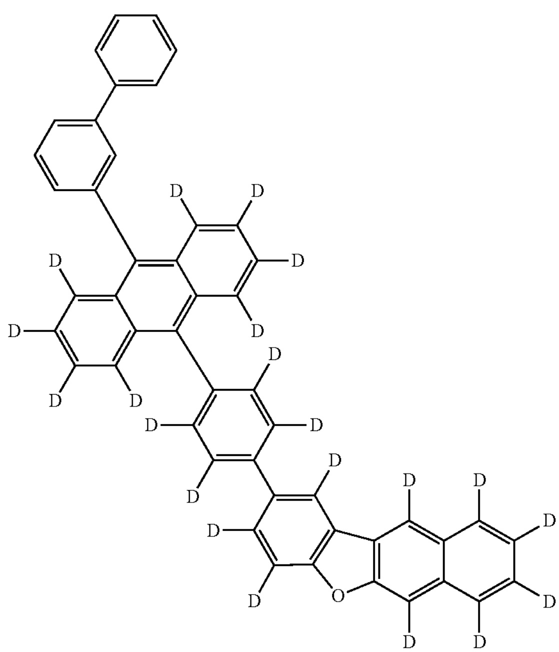
D
O
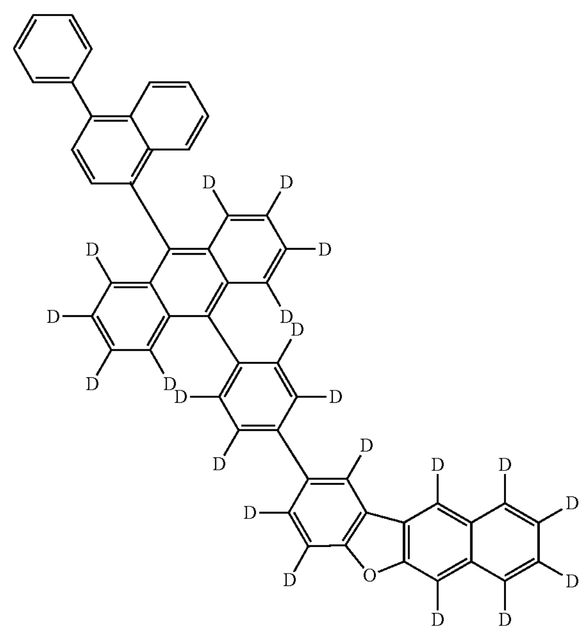
D
O

-continued
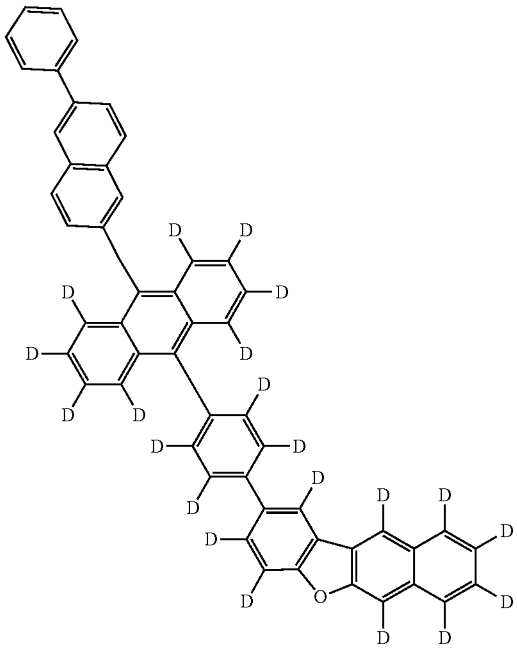
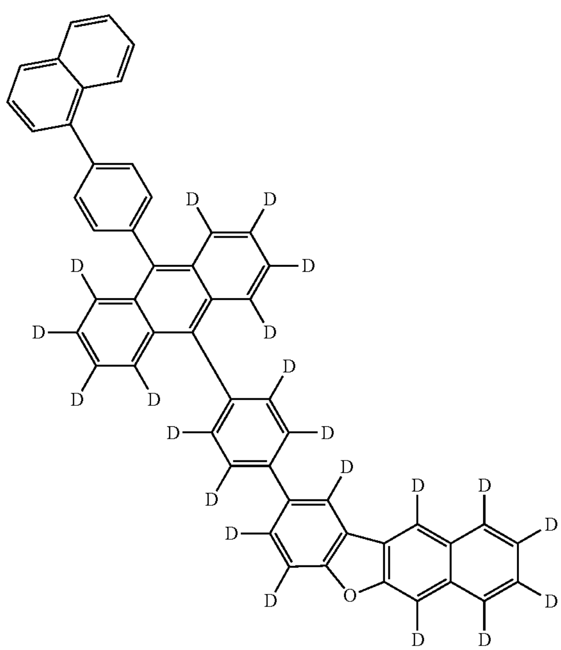
-continued
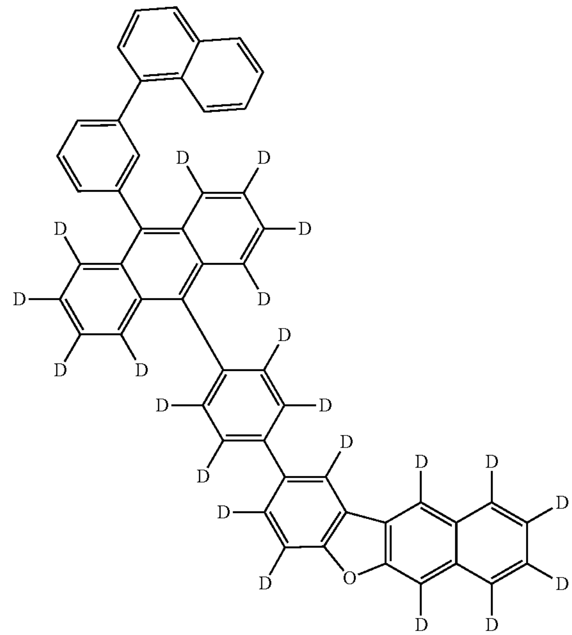
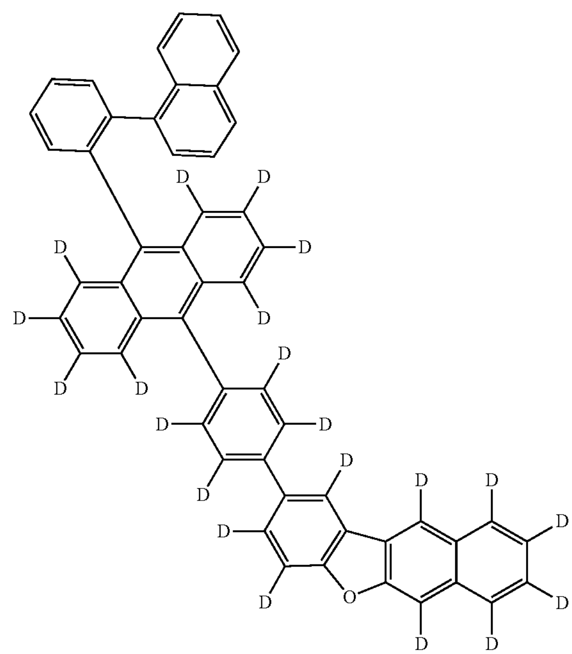

-continued
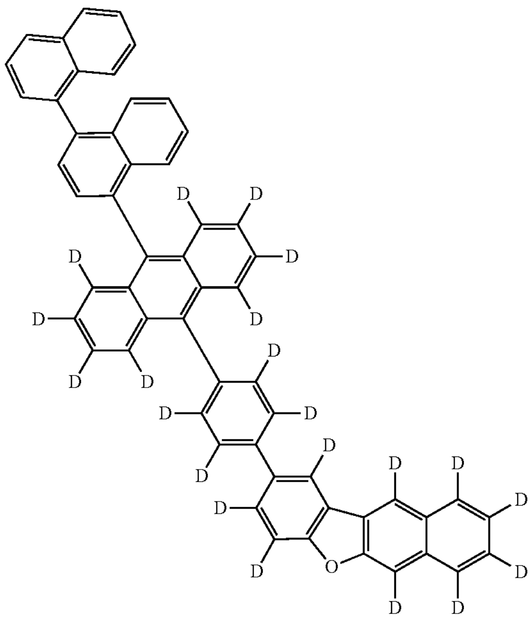
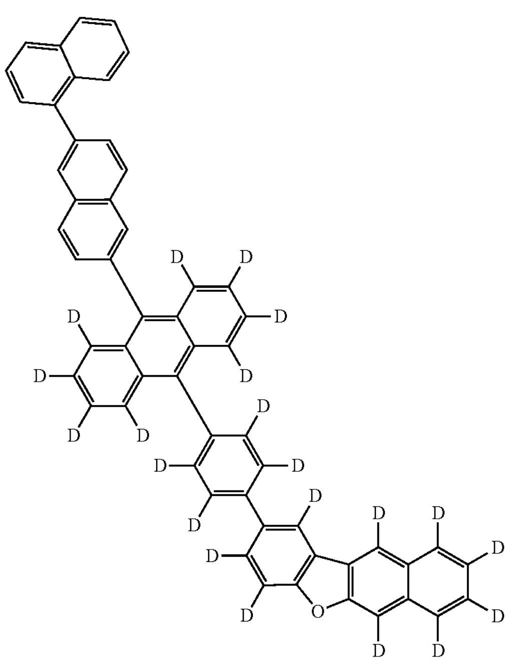
-continued
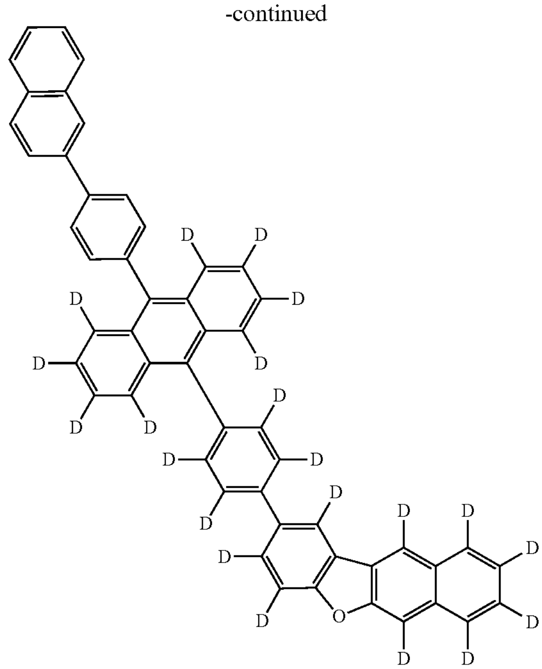
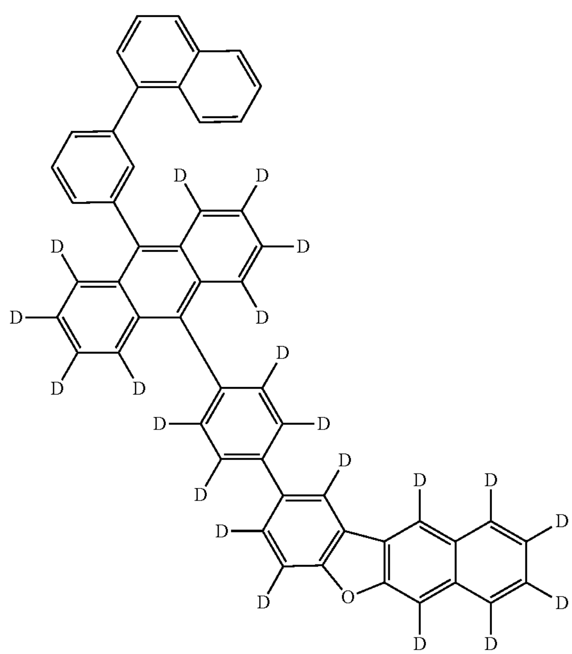

-continued
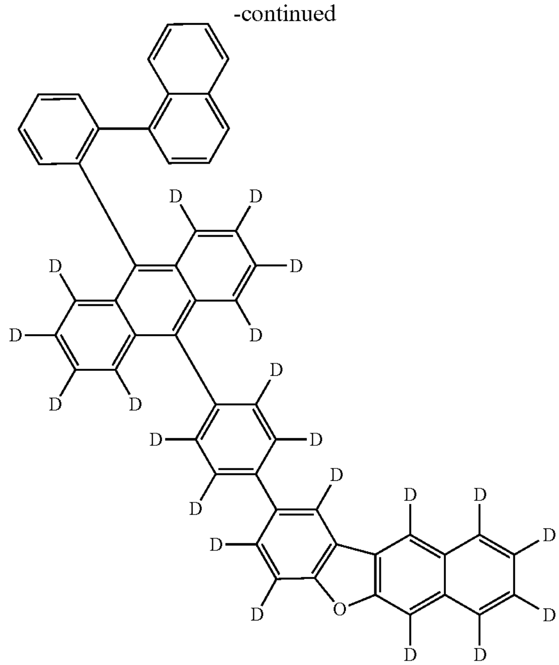
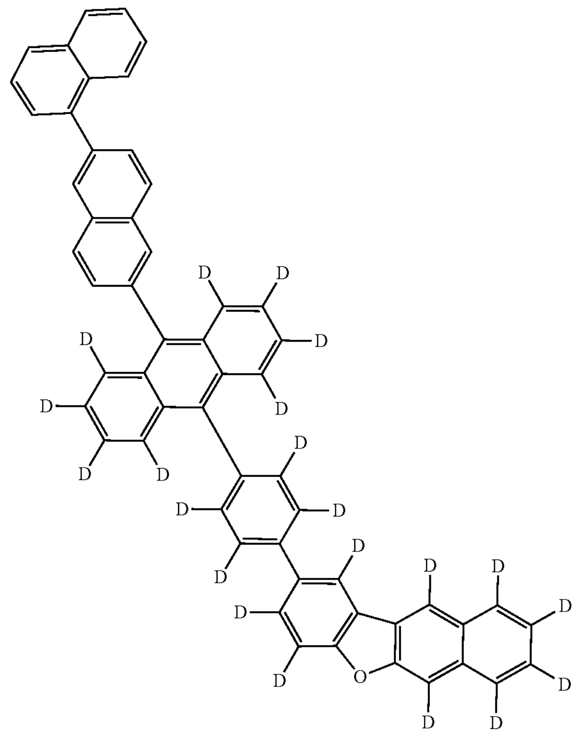
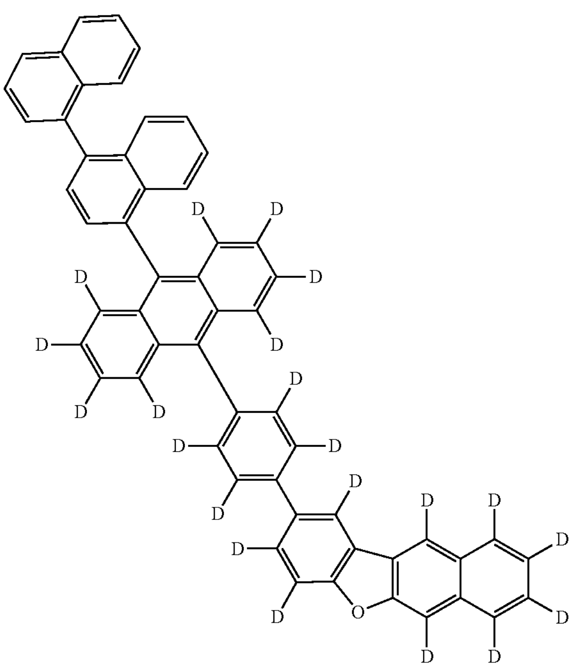
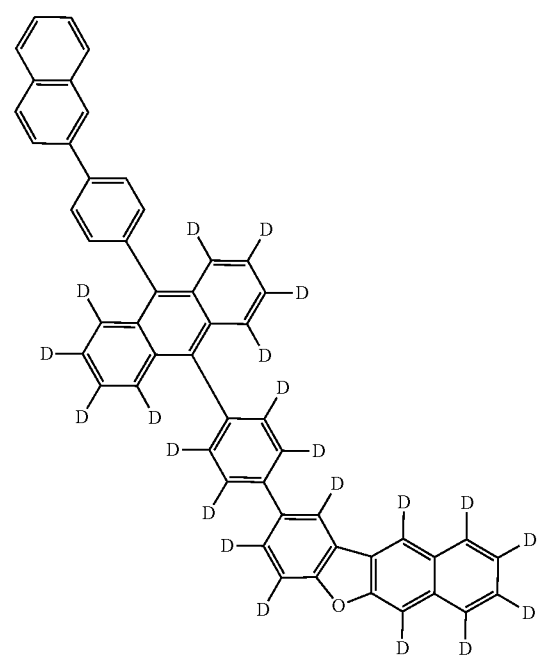

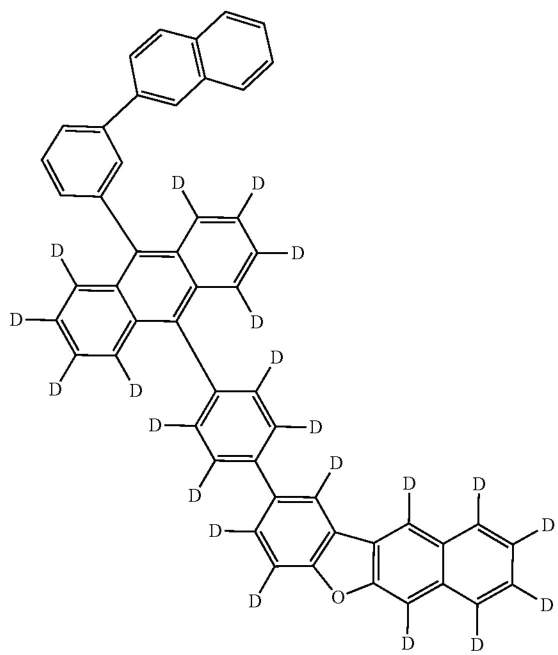
D
O
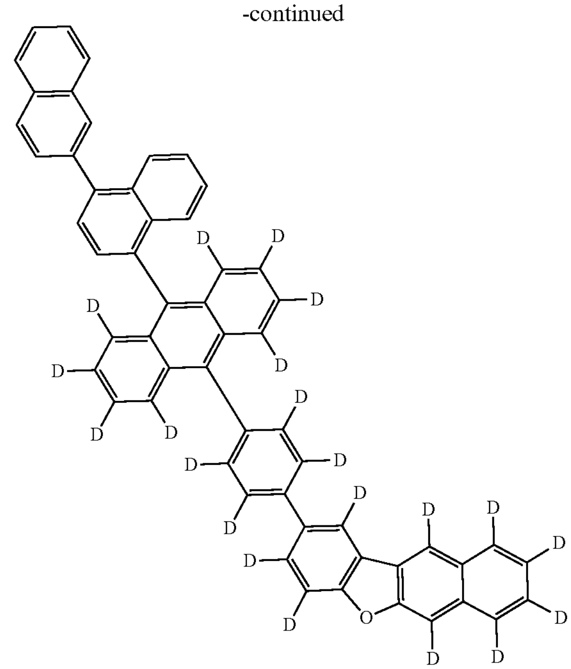
D
O
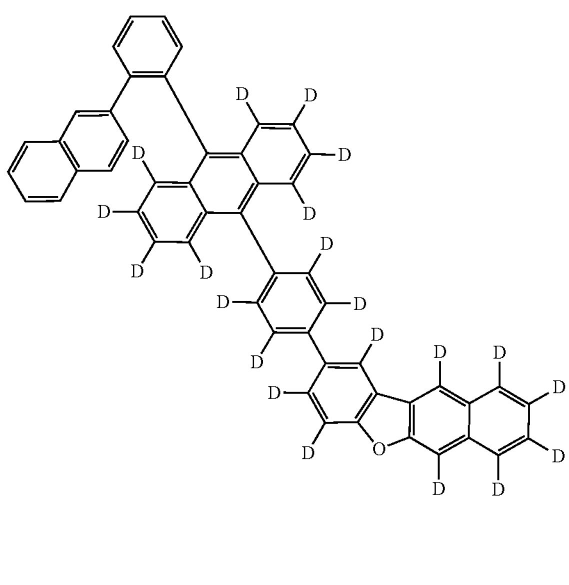
D
O
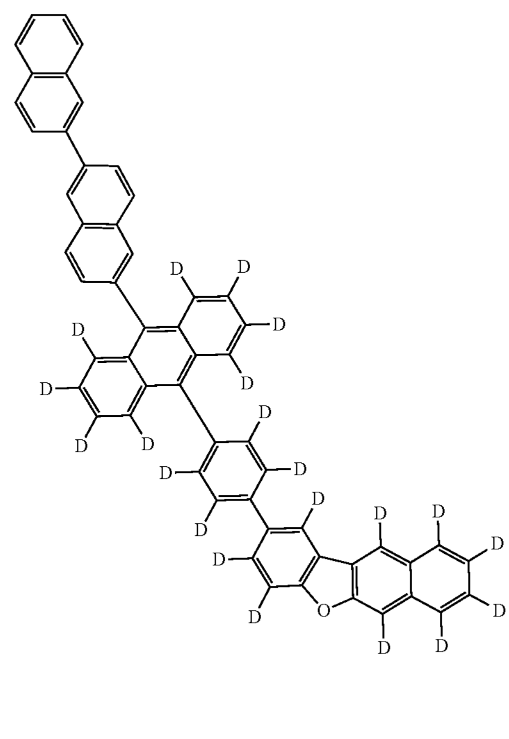
D
O

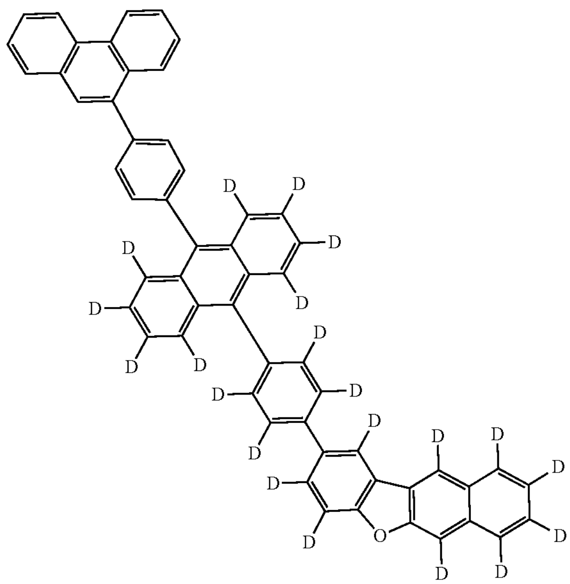
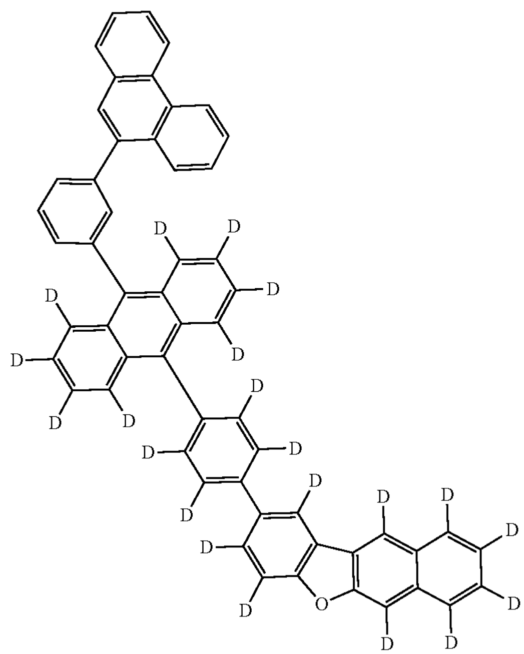
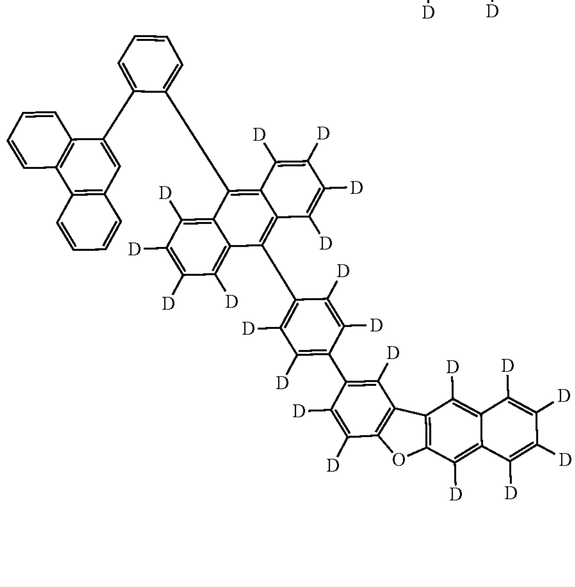
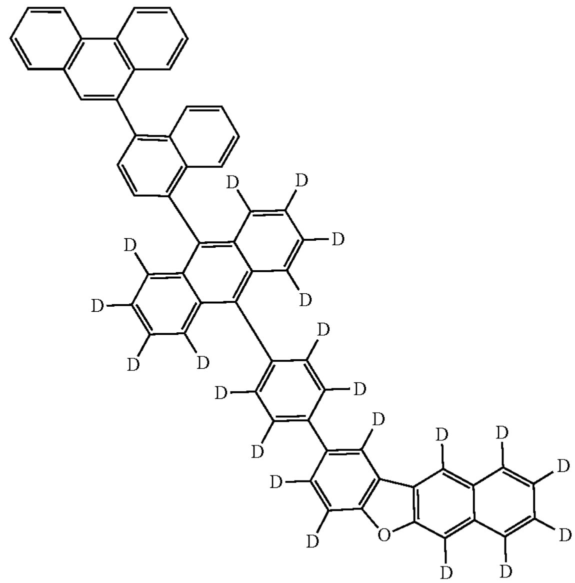
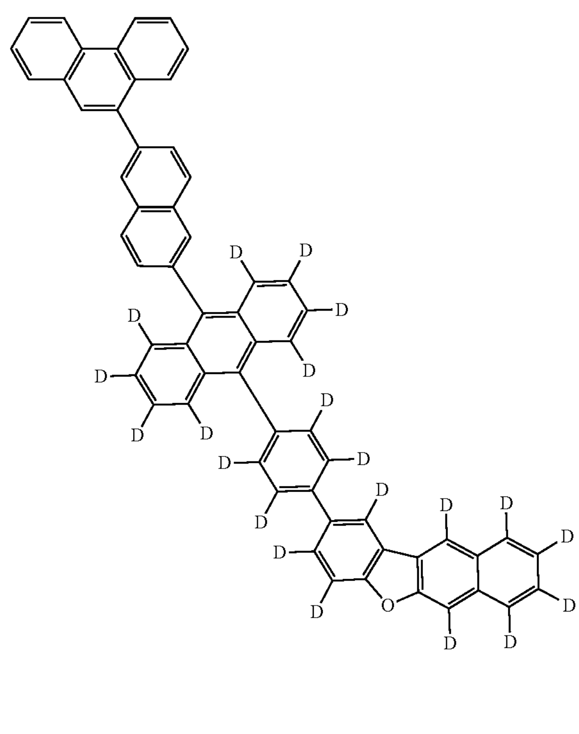

-continued
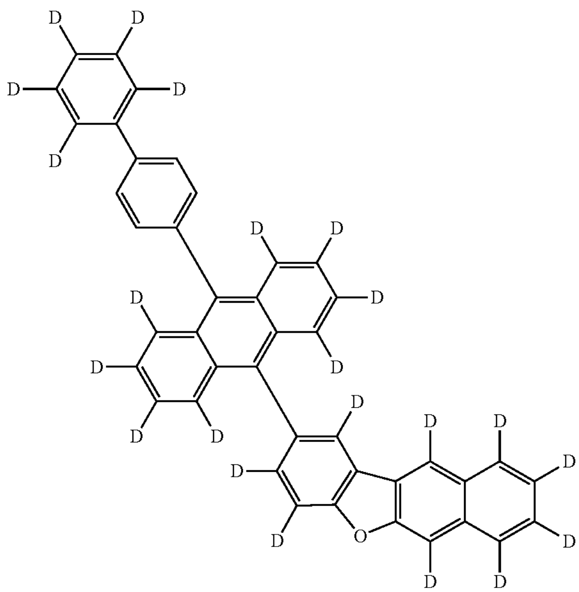
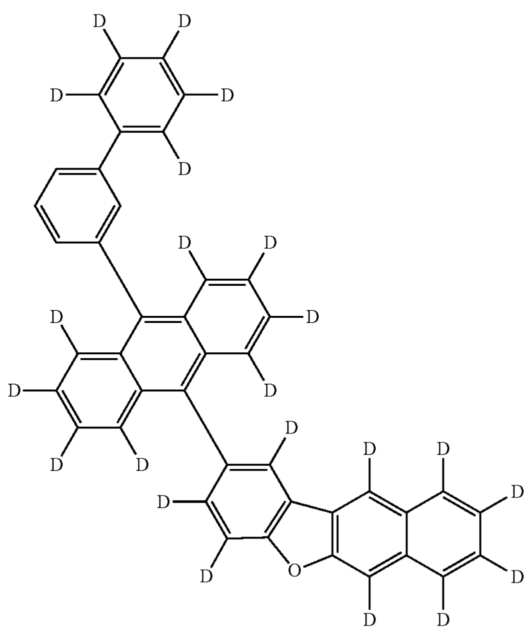
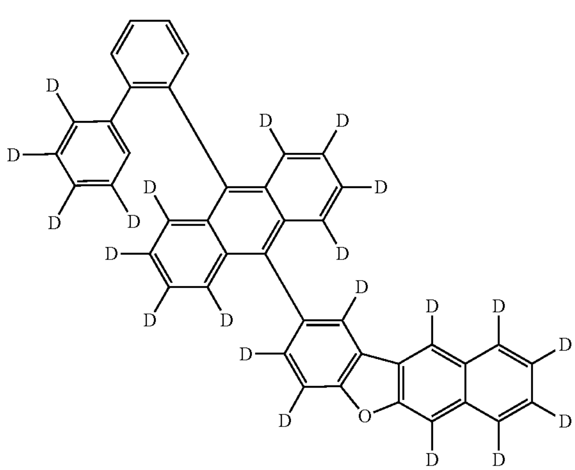
-continued
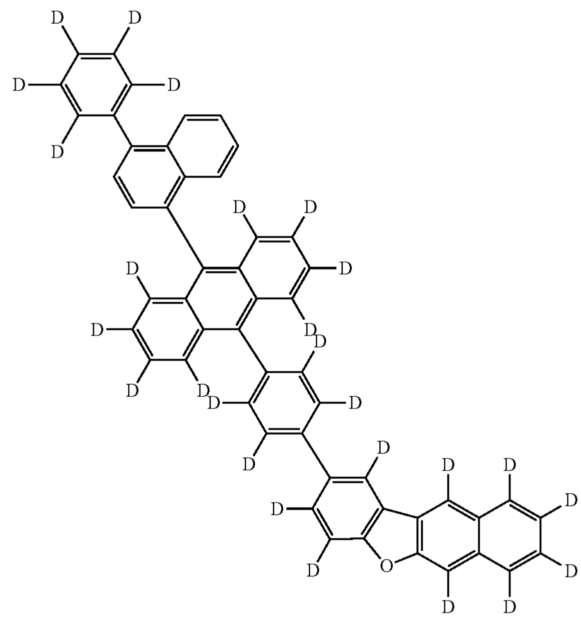
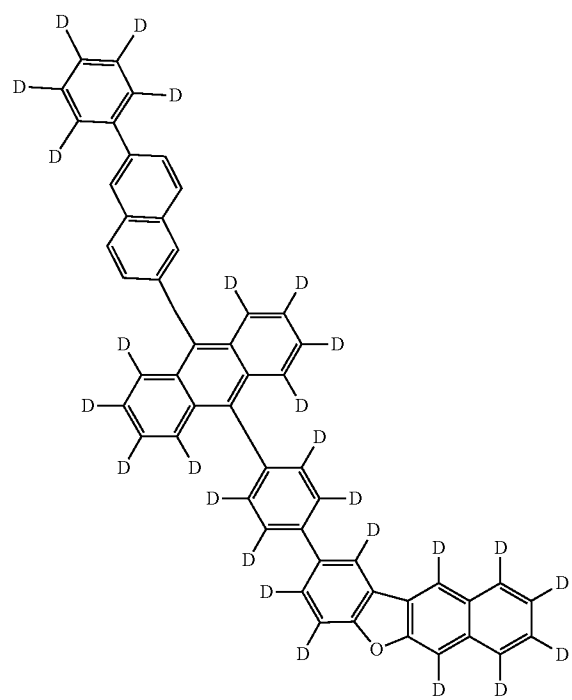

-continued
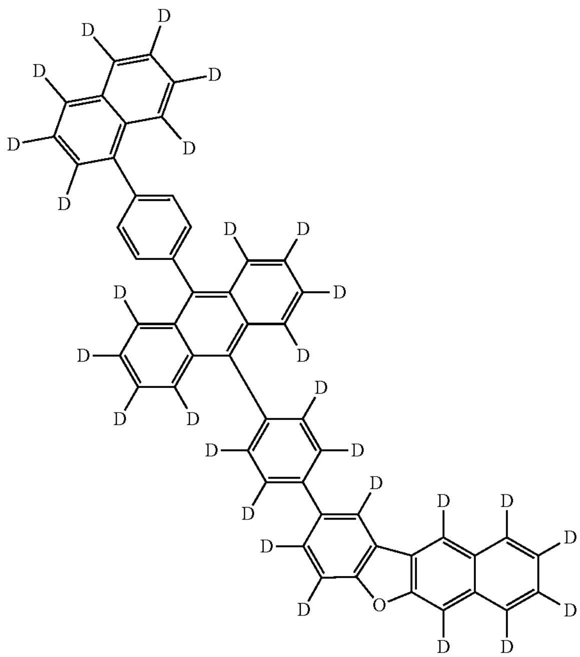
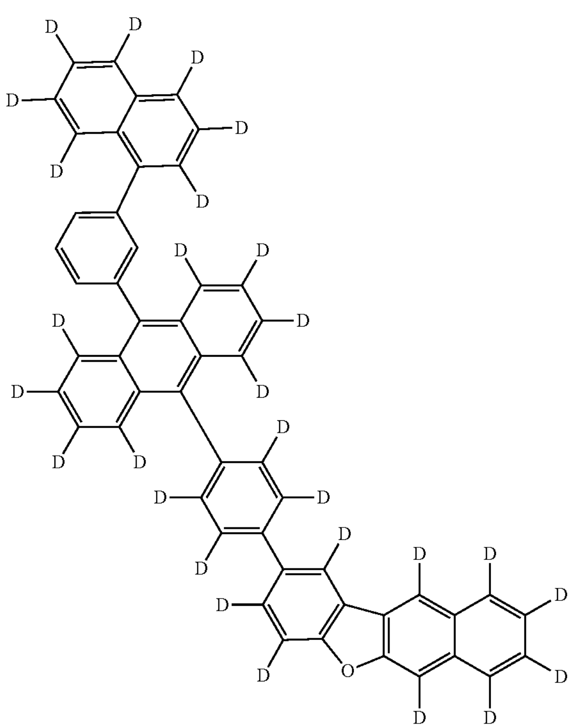
-continued
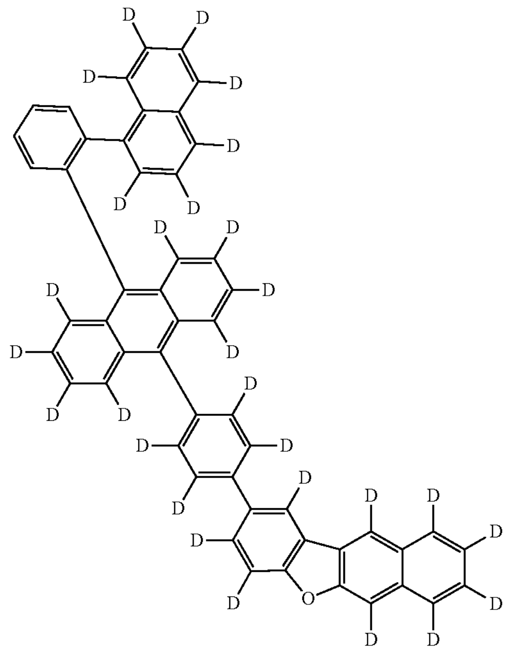
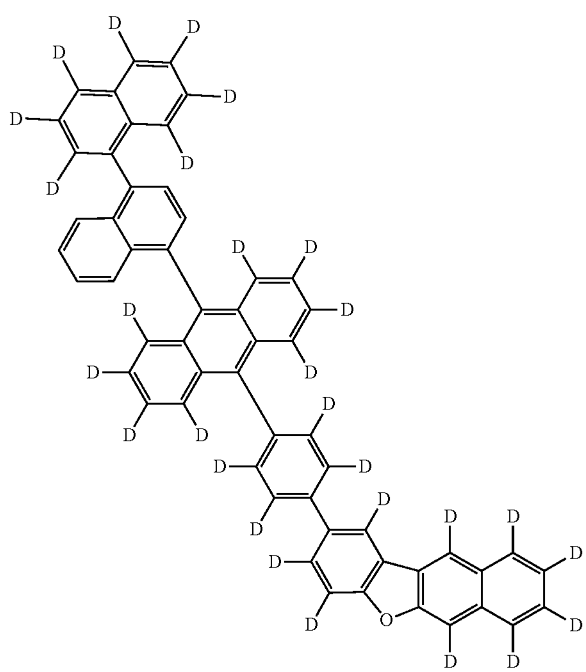

-continued
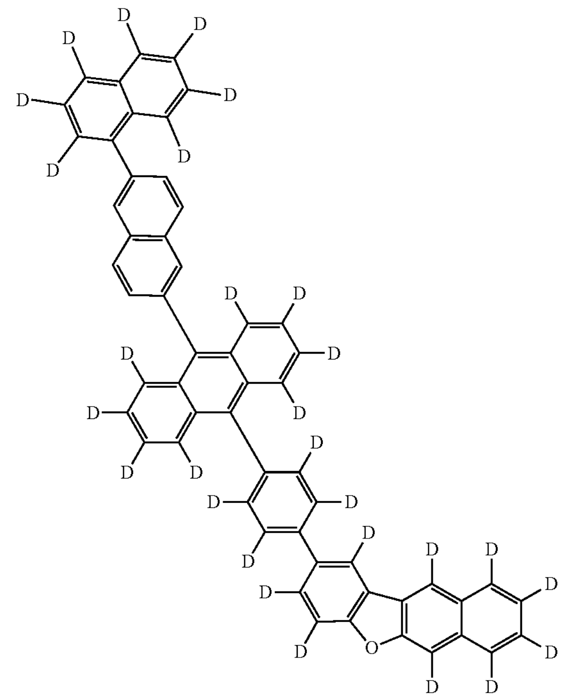
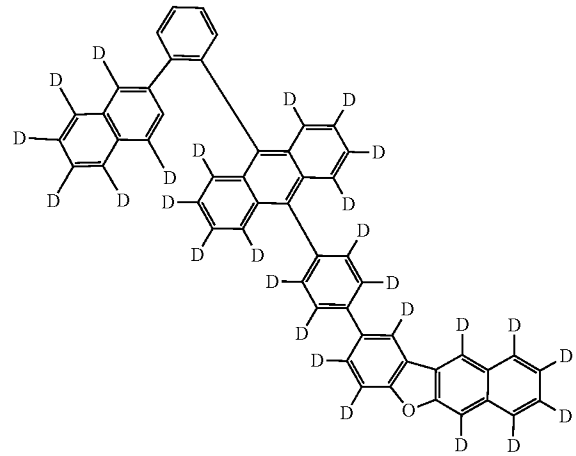
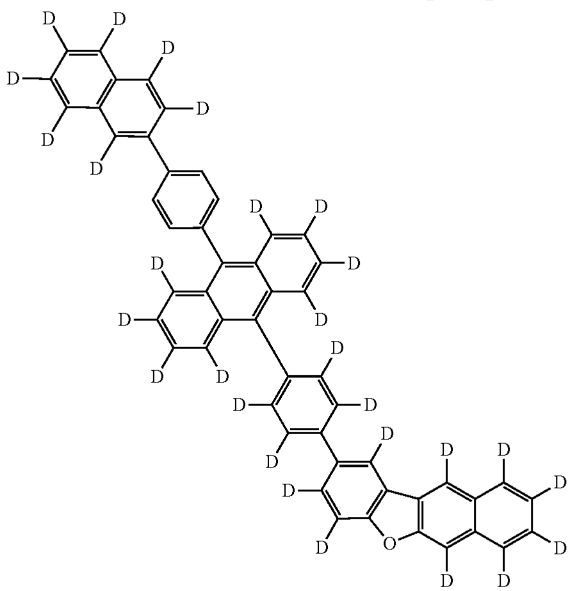
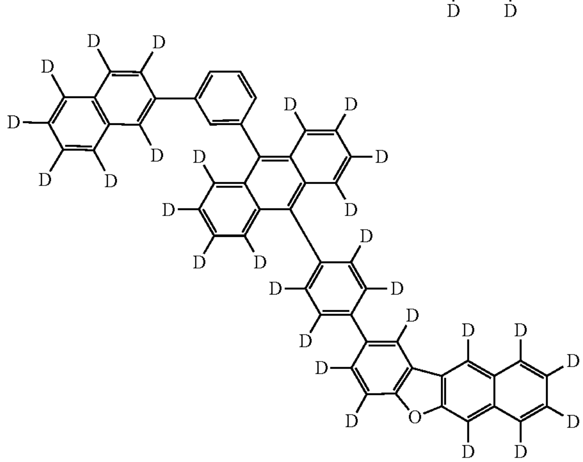
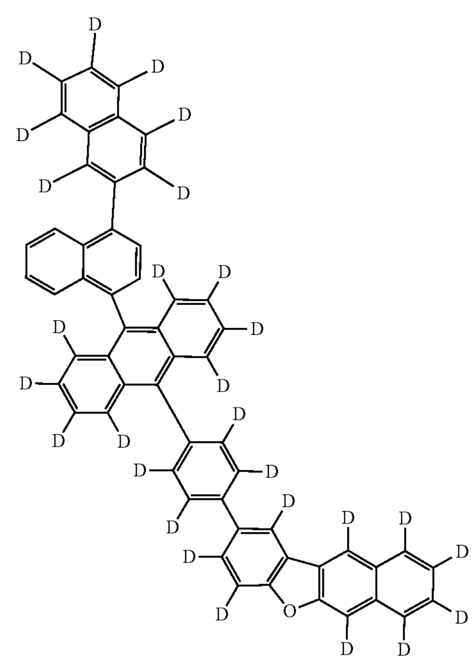

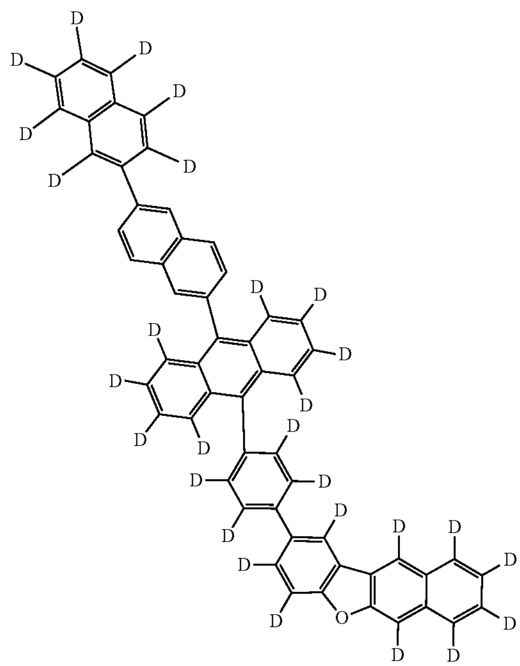
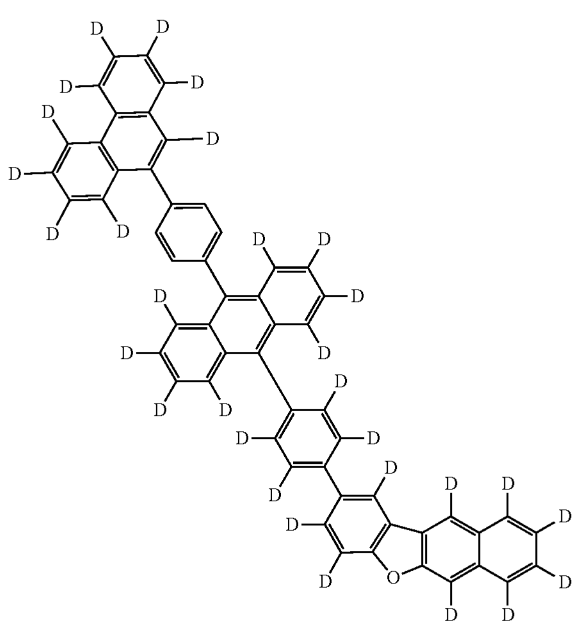
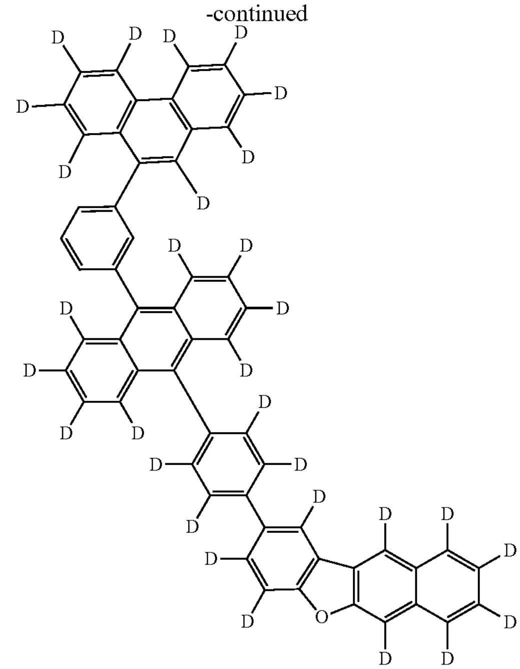
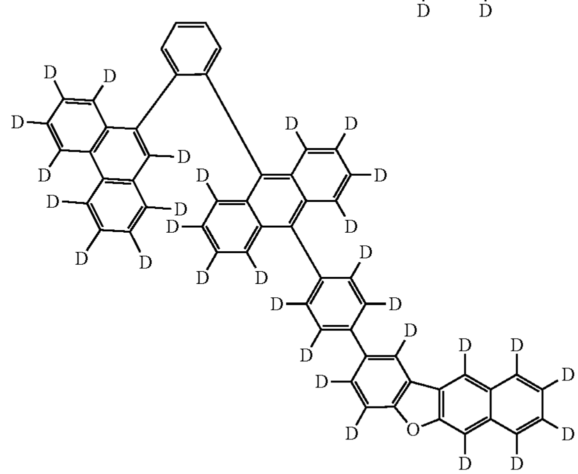
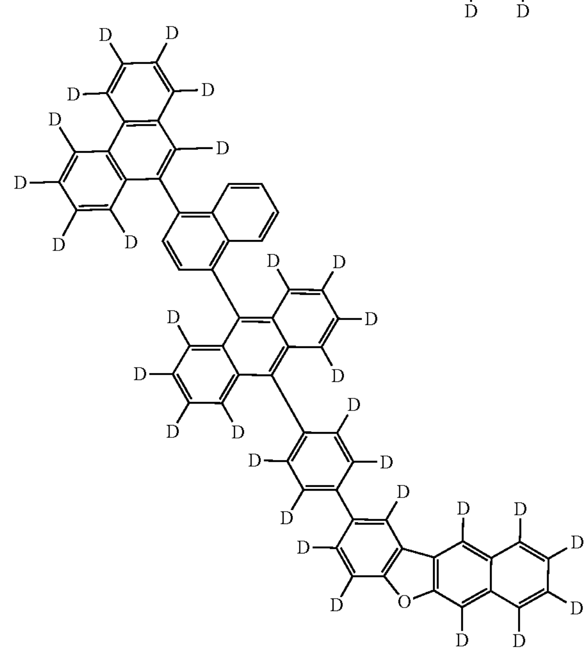

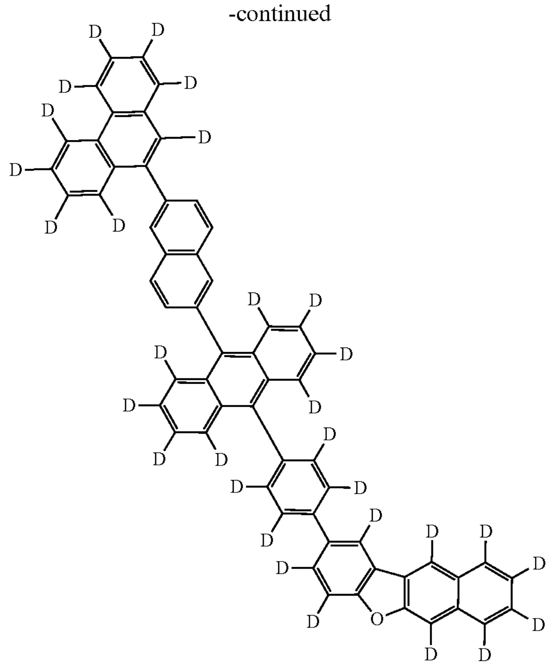
O
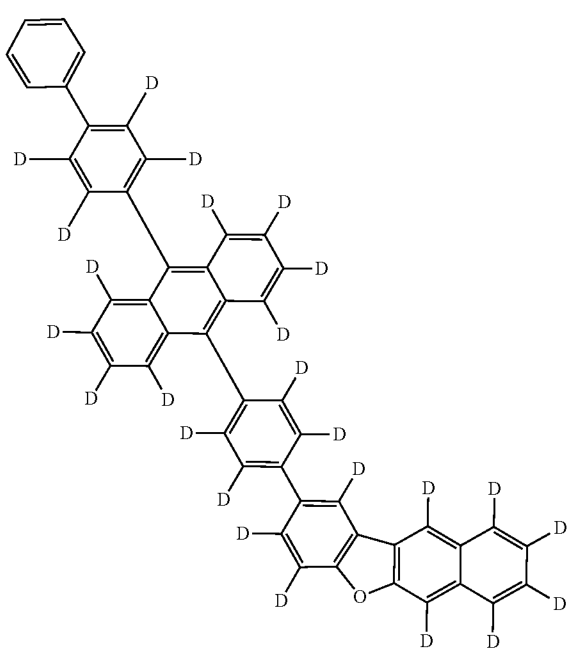
O
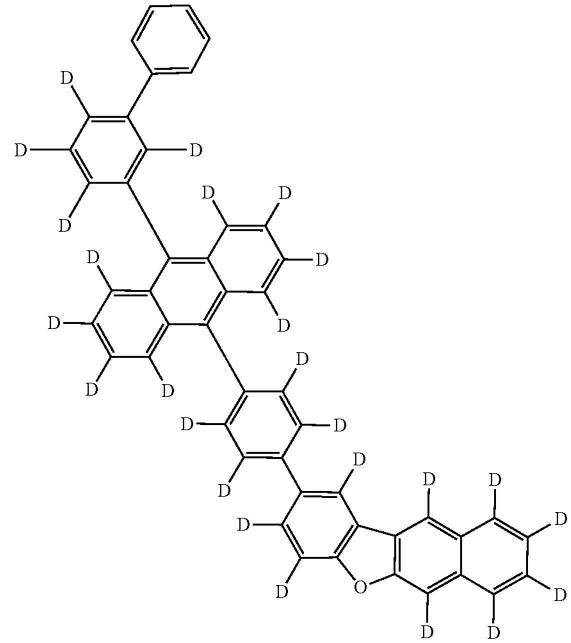
O
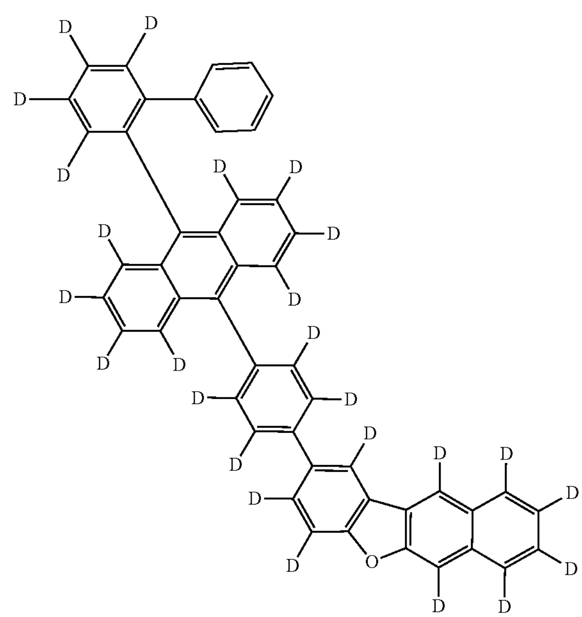
O

-continued
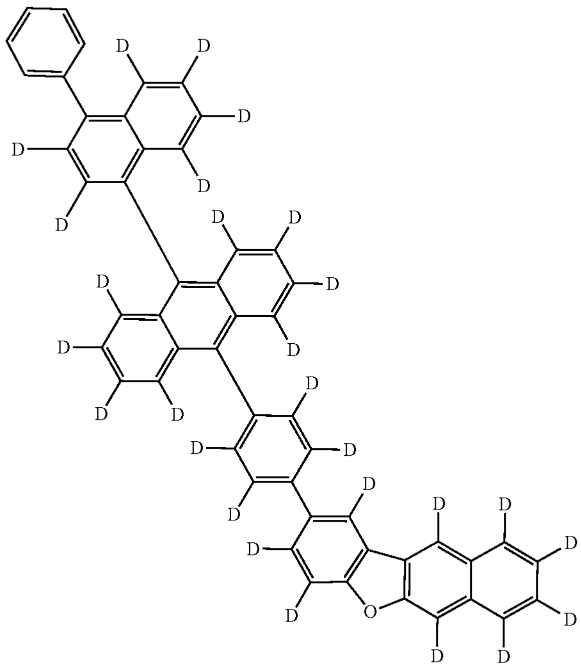
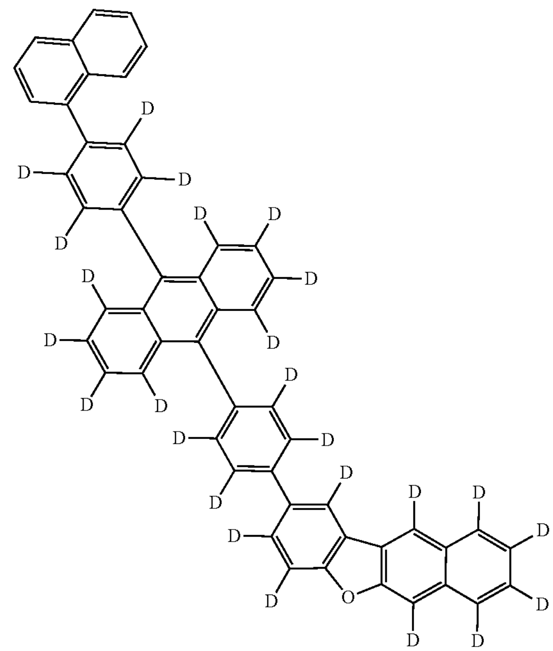
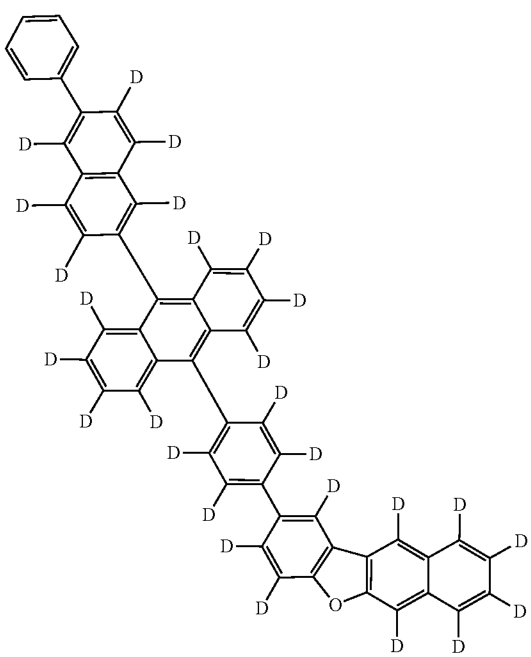
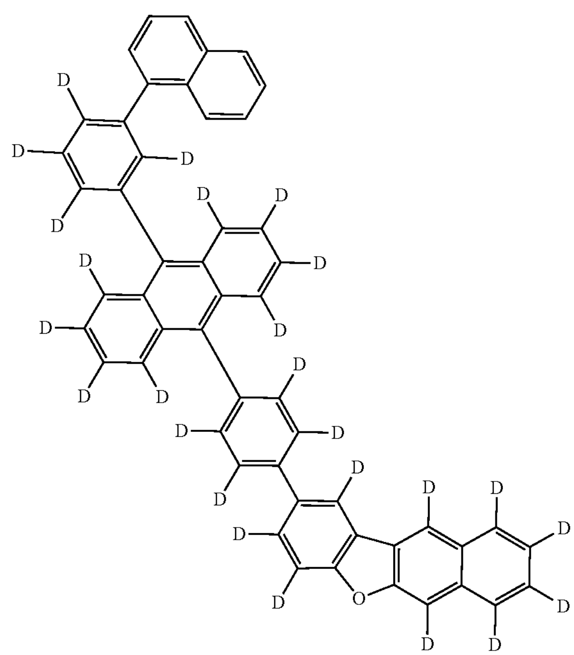

-continued
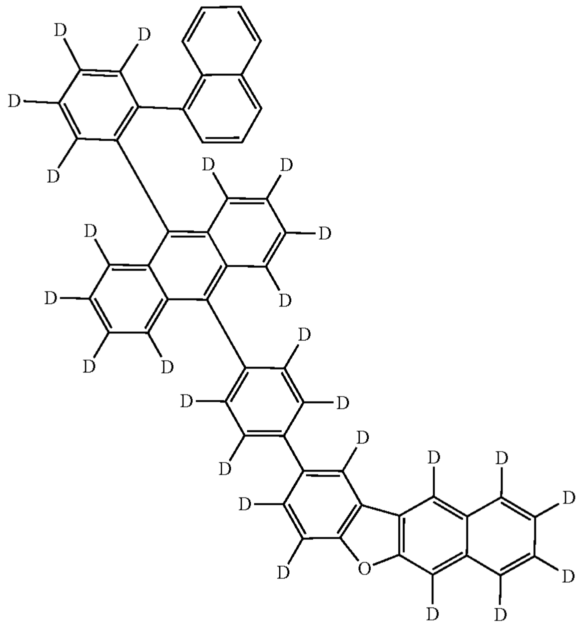
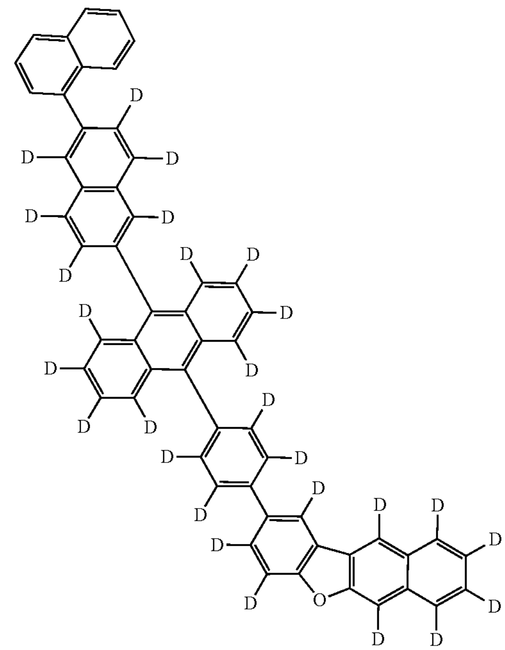
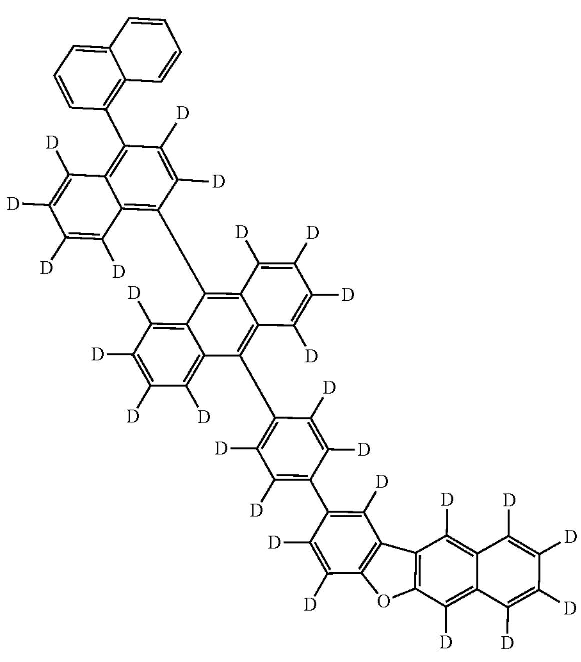
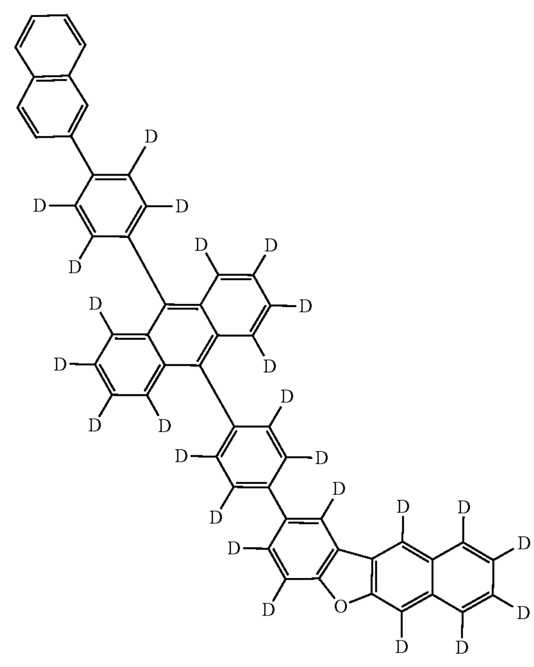

-continued
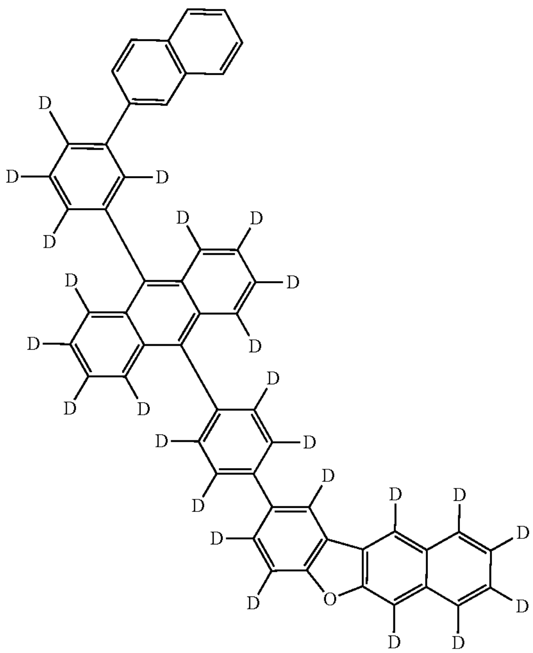
-continued
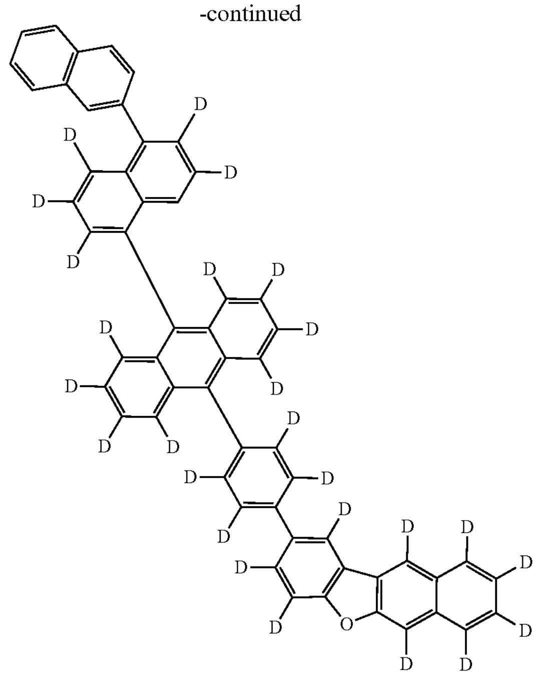
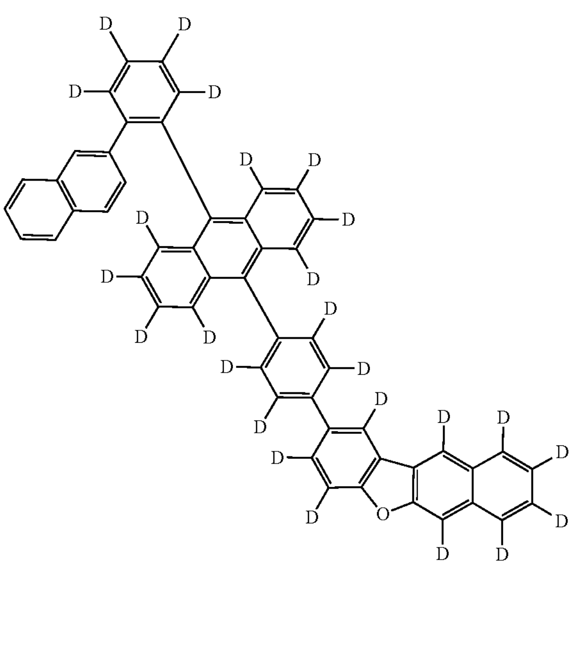
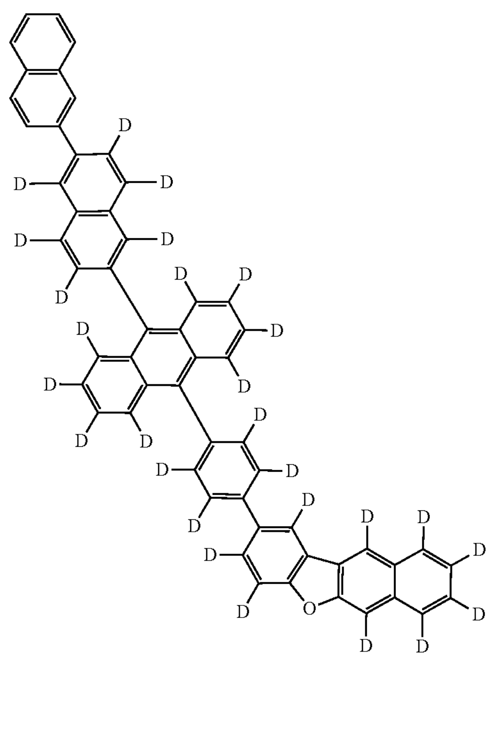

-continued
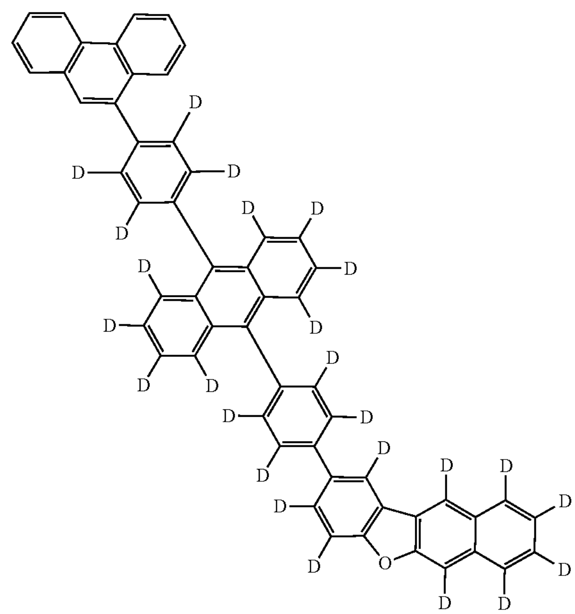
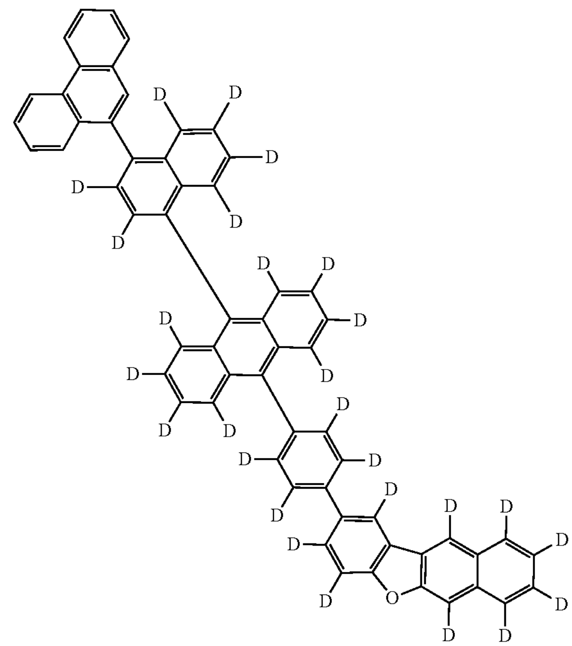
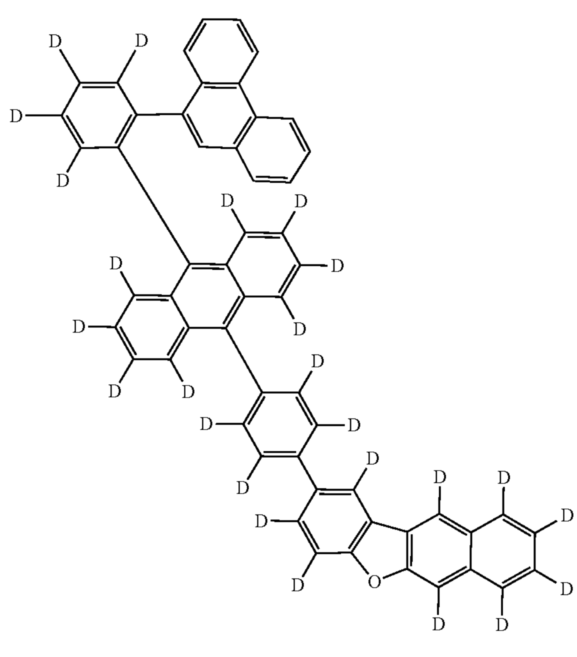
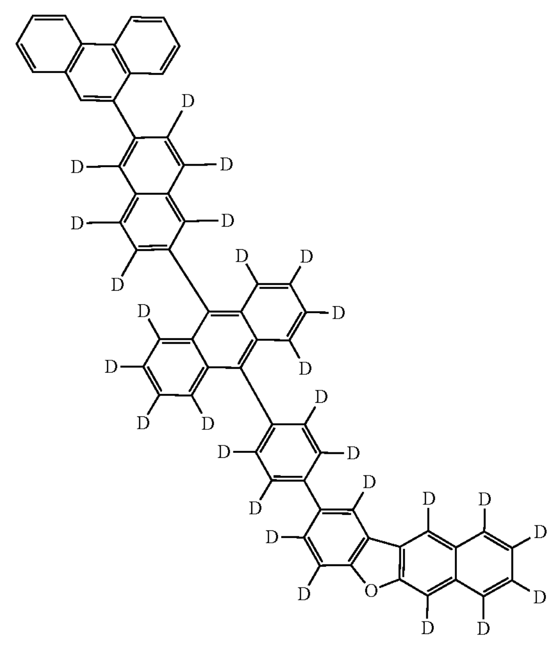 [SMILES: [2H]c1c([2H])c(-c2c([2H])c([2H])c3oc4c([2H])c5c([2H])c([2H])c([2H])c([2H])c5c([2H])c4c3c2[2H])c([2H])c([2H])c1Cc1c2c([2H])c([2H])c([2H])c([2H])c2c(-c2c([2H])c([2H])c3c([2H])c(-c4cc5ccccc5c5ccccc45)c([2H])c([2H])c3c2[2H])c2c([2H])c([2H])c([2H])c([2H])c12]

-continued
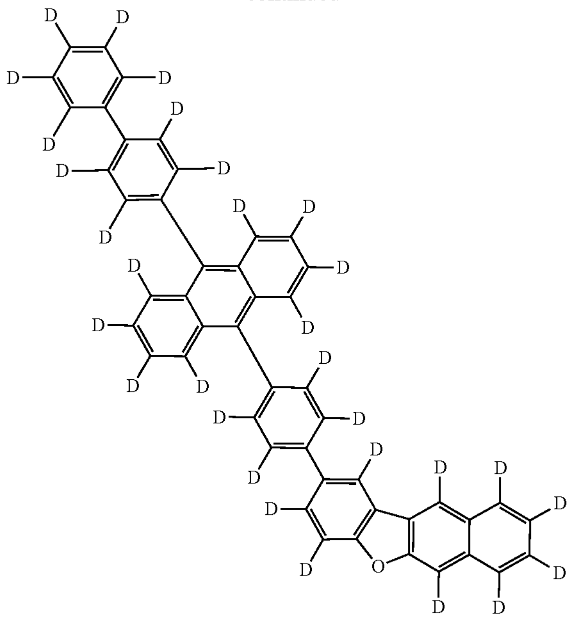
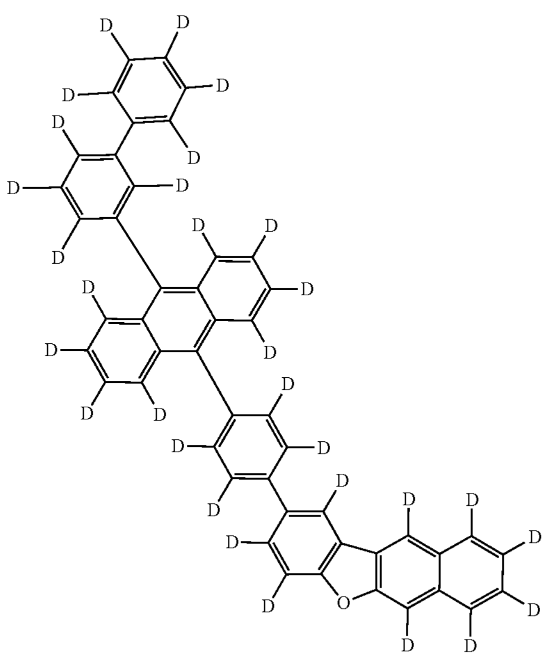
-continued
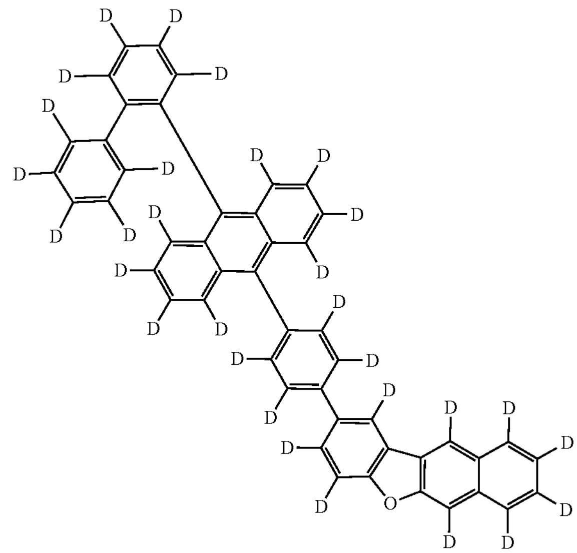
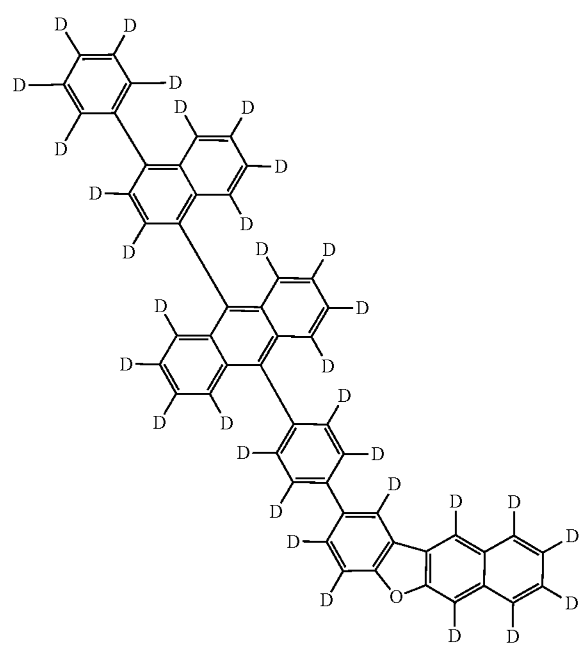

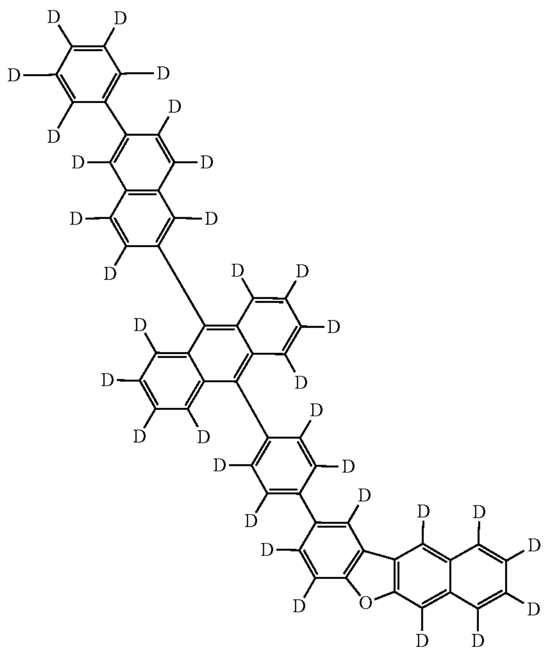
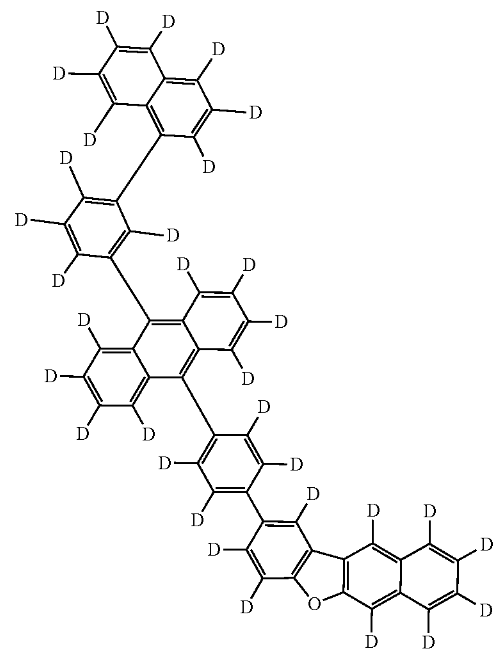
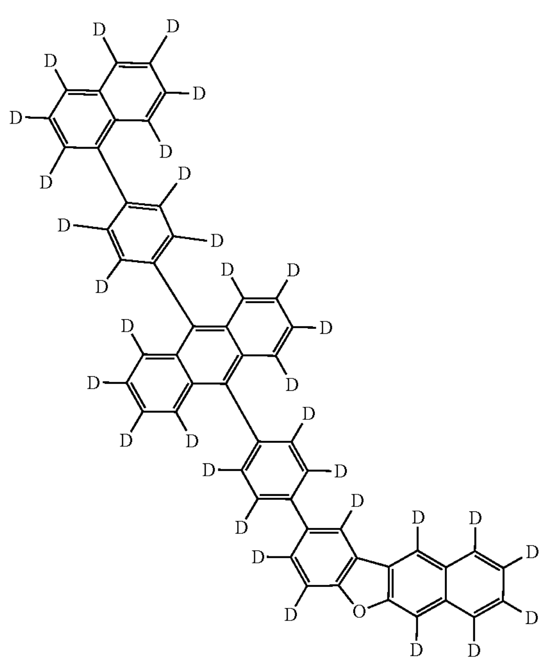
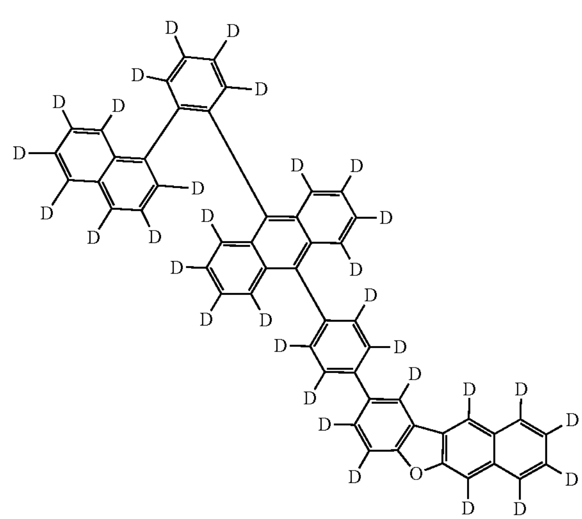

-continued
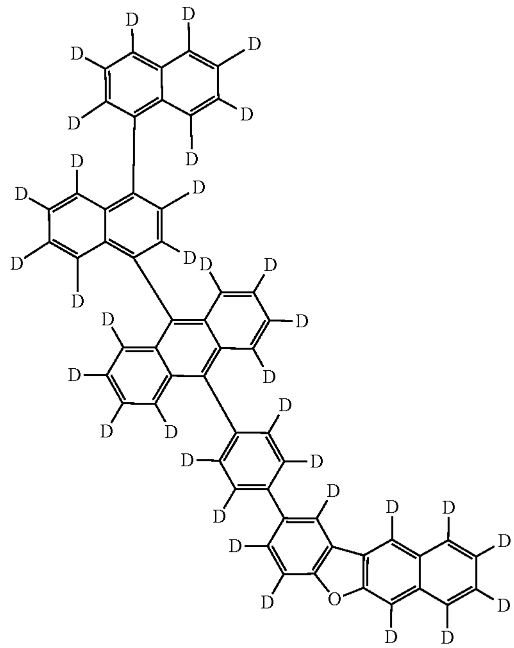
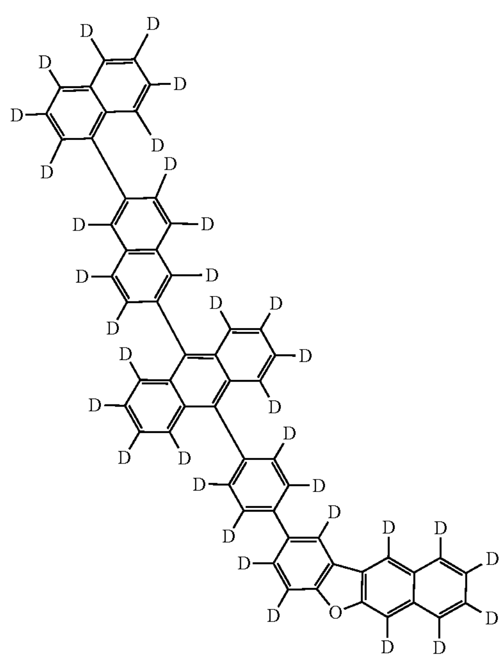
-continued
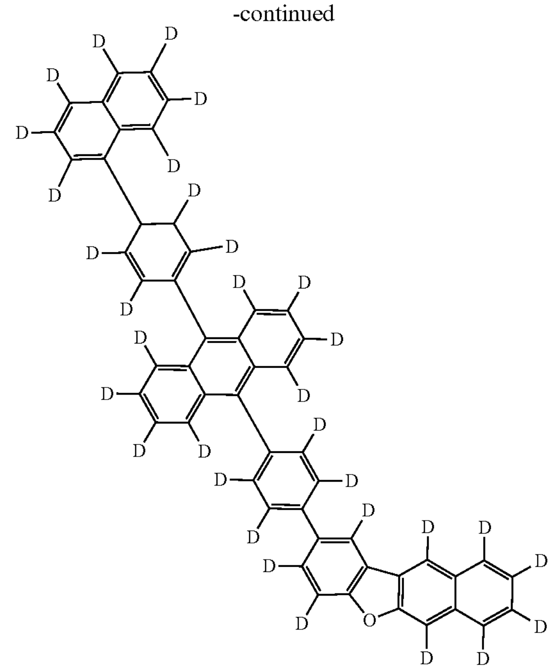
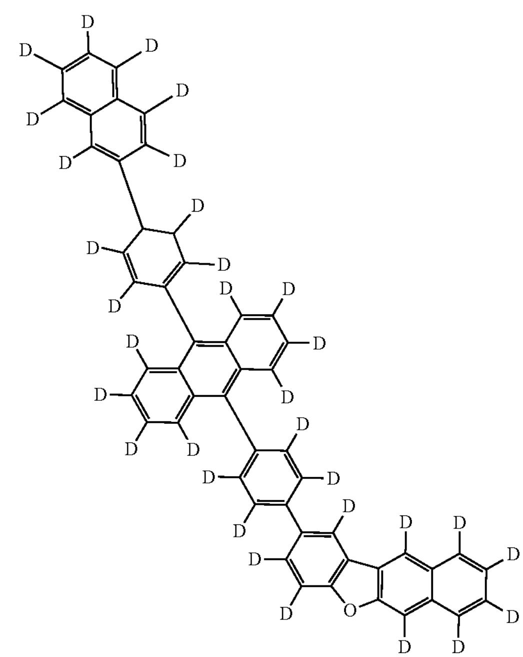

-continued
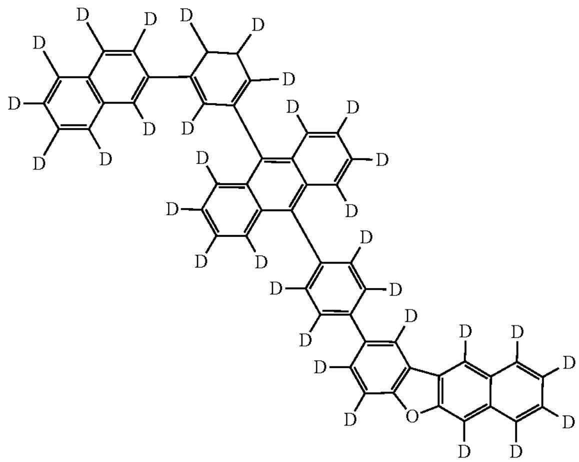
-continued
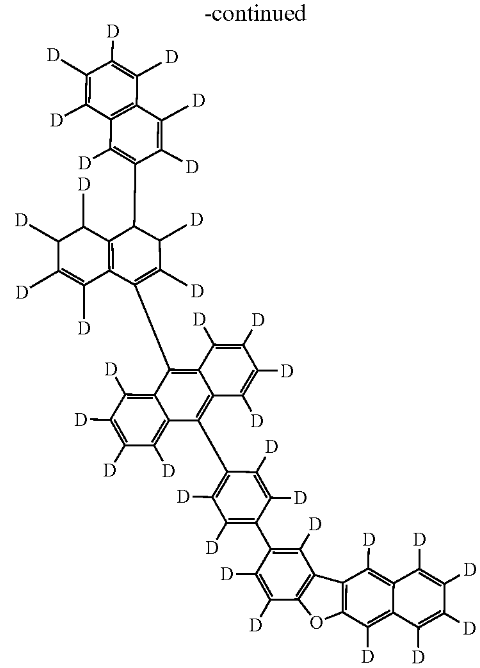
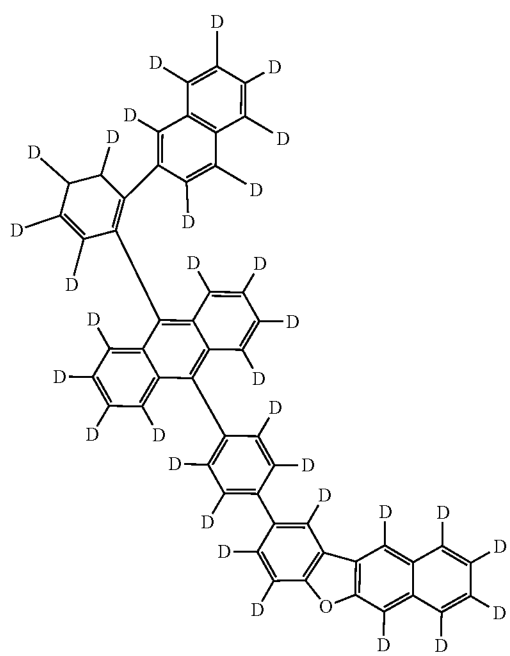
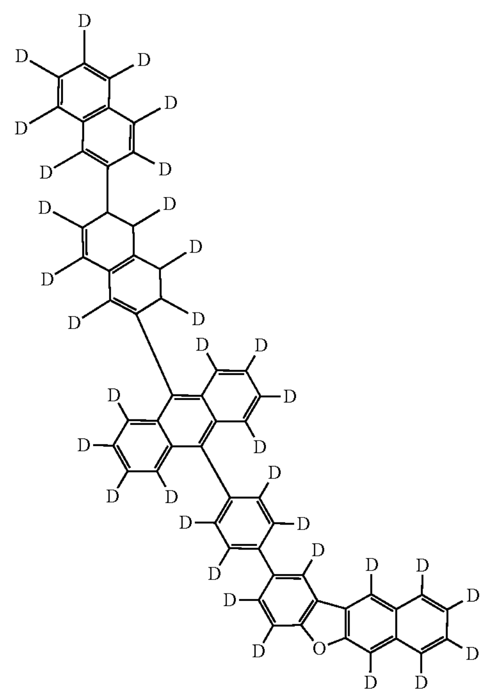

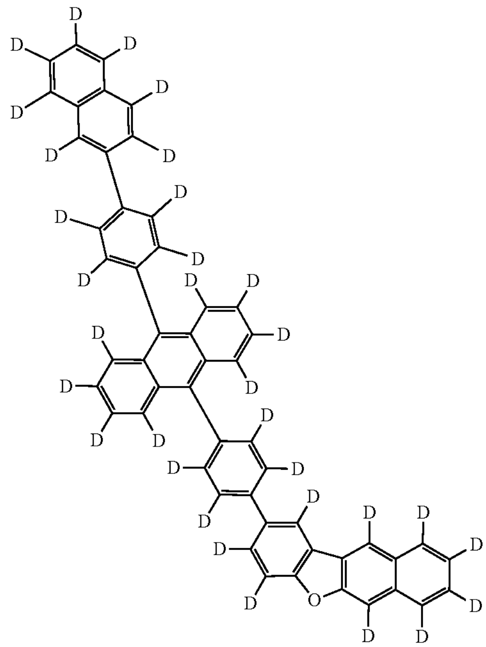
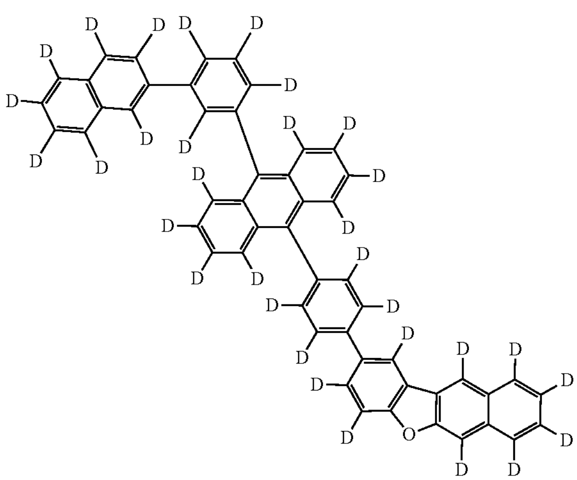
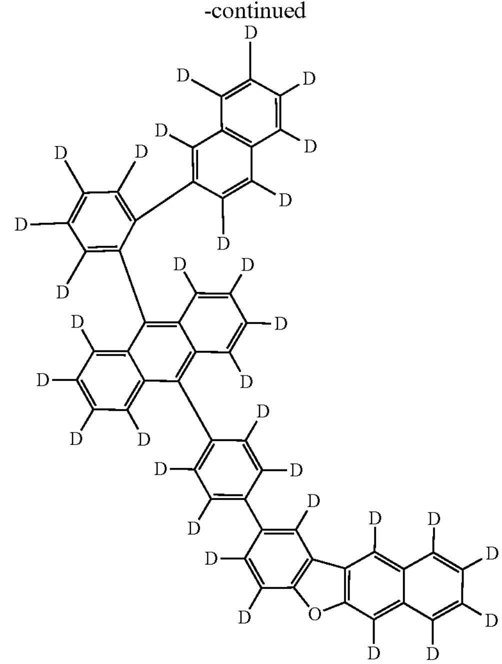
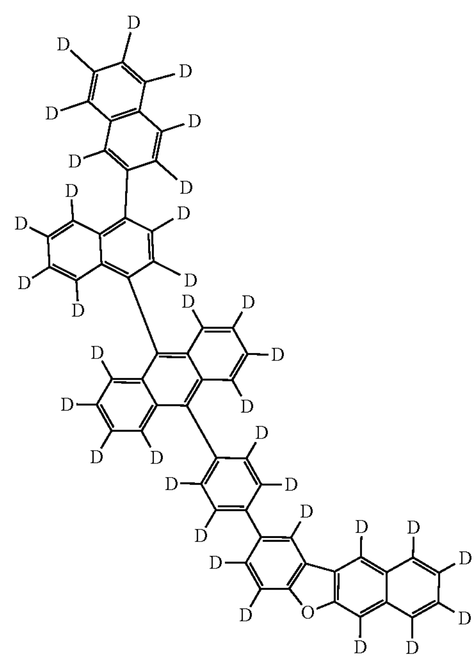

-continued
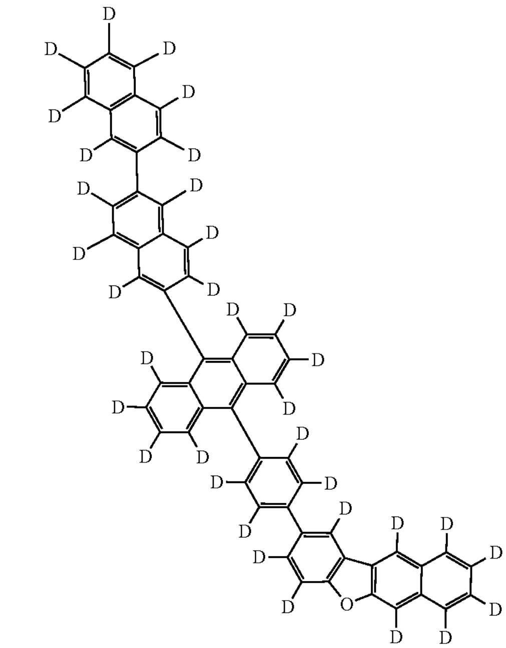
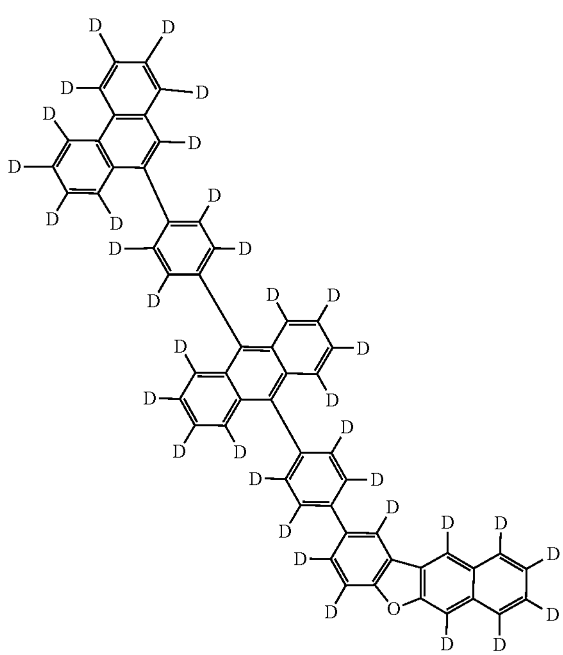
-continued
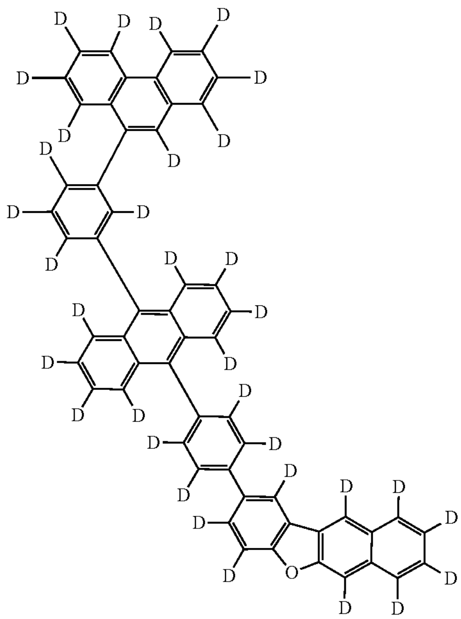
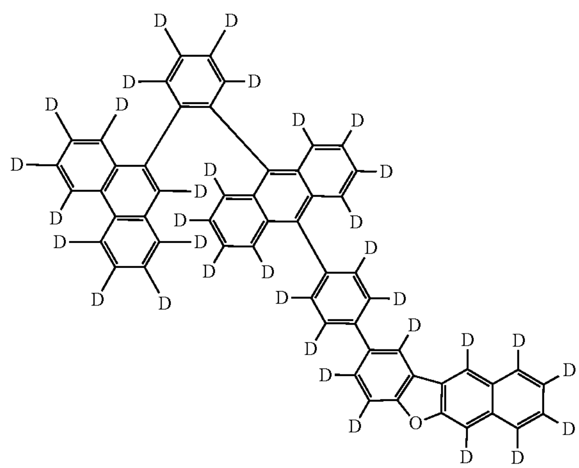
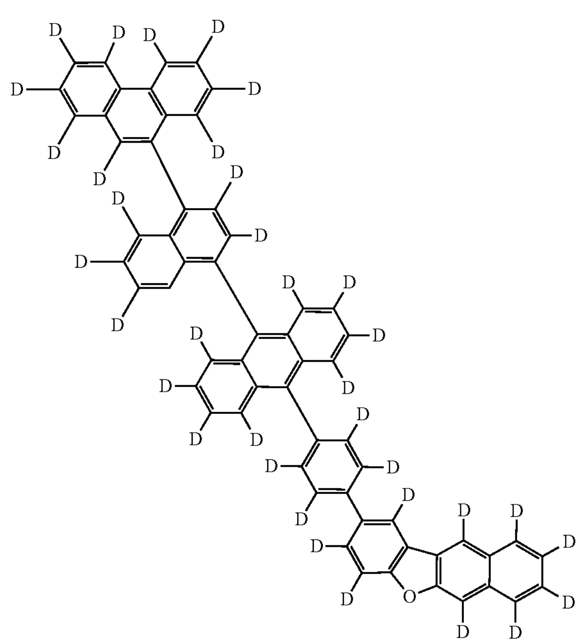

-continued
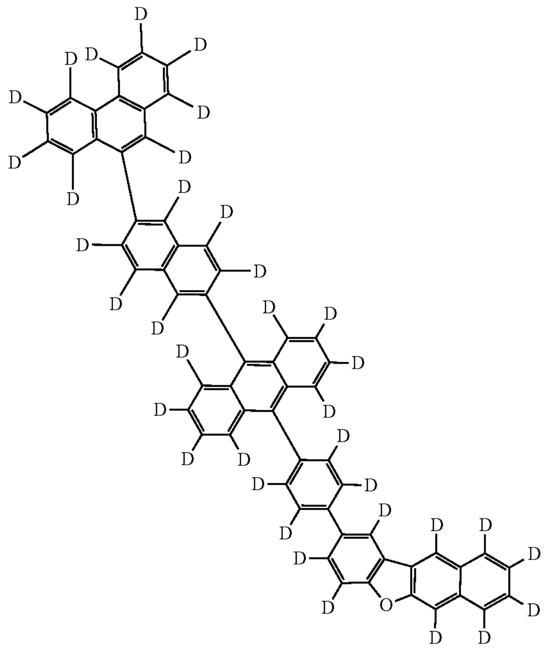
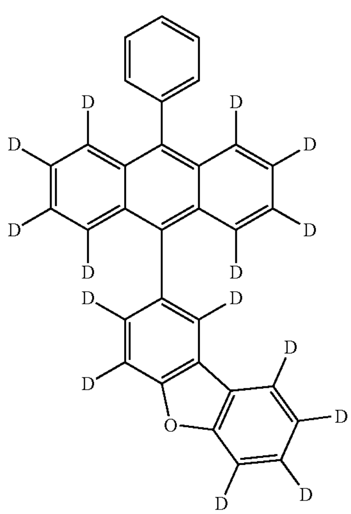
-continued
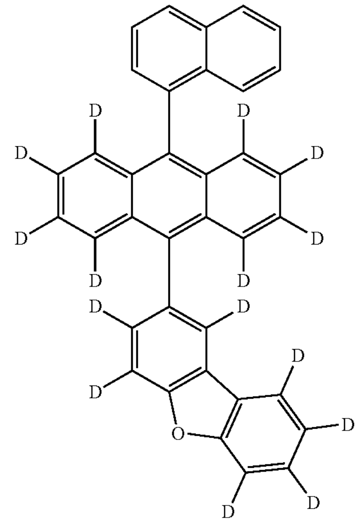
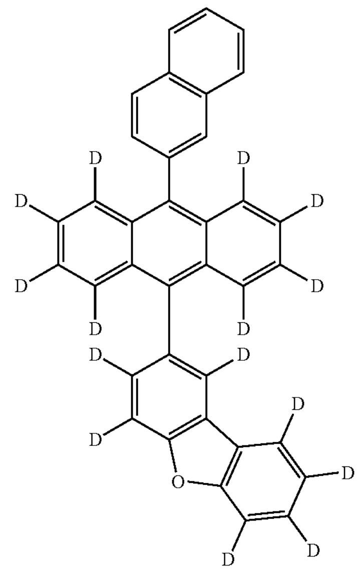
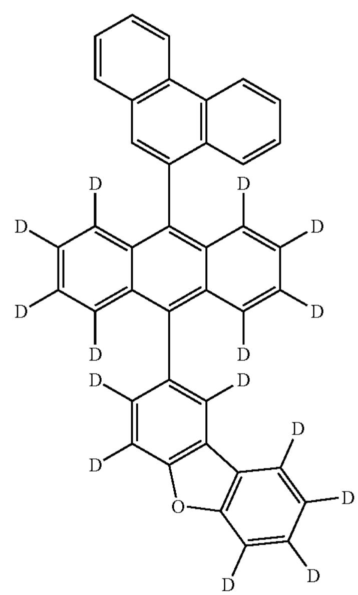

-continued
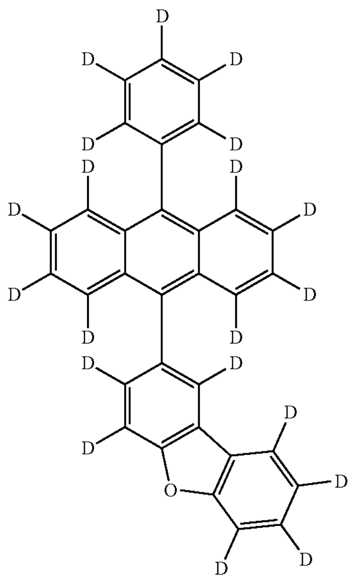
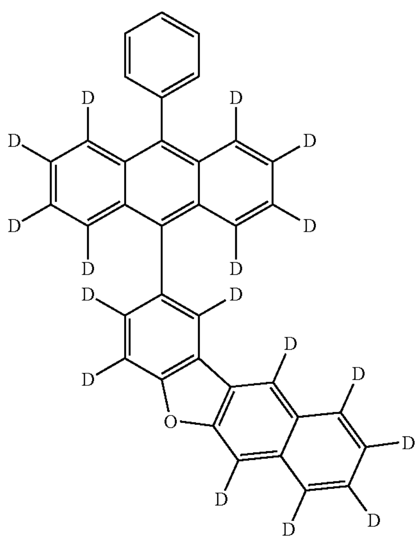
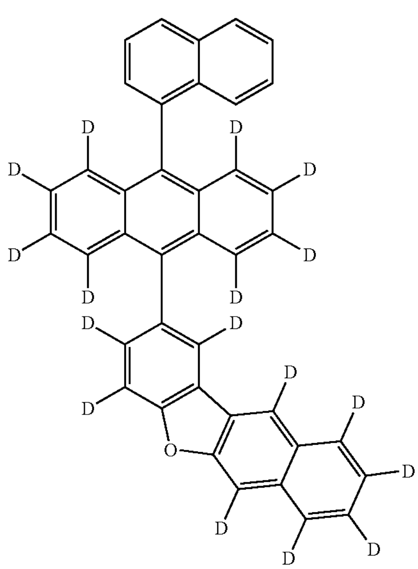
-continued
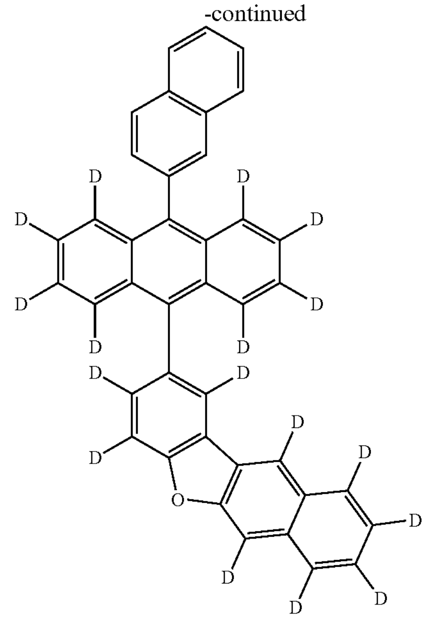
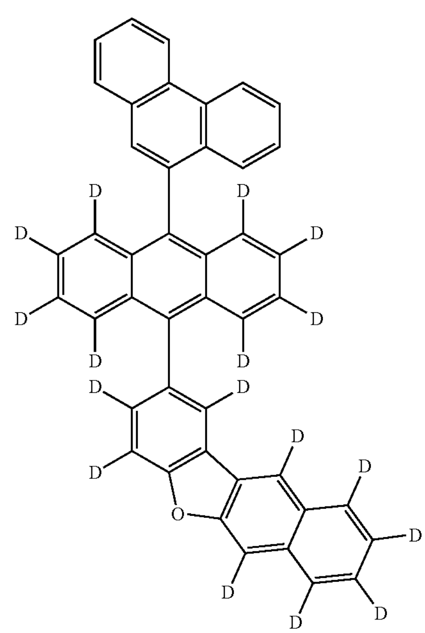

-continued
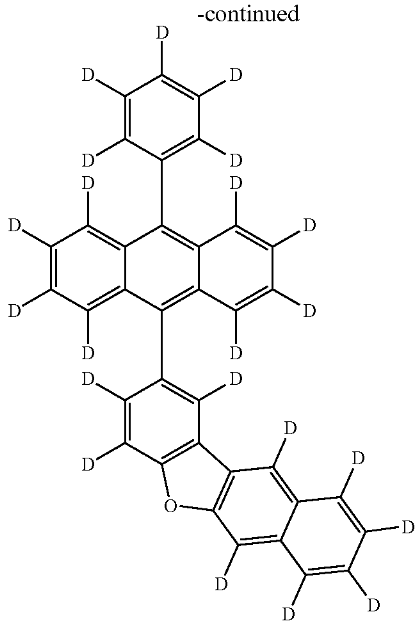
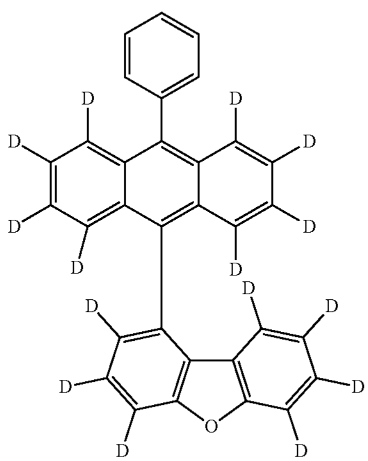
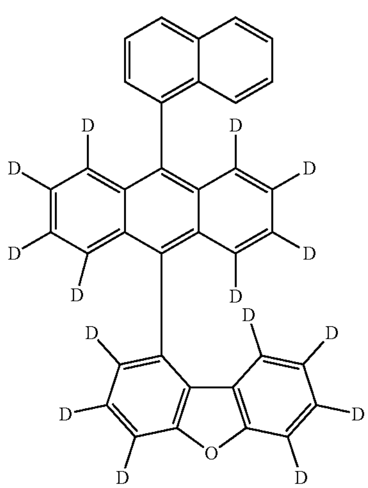
-continued
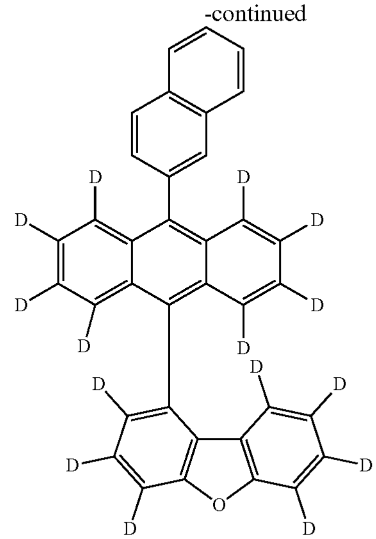
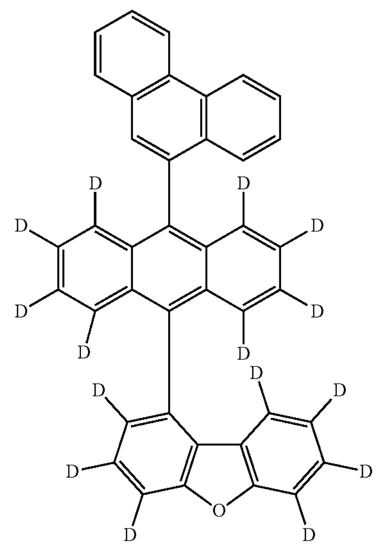
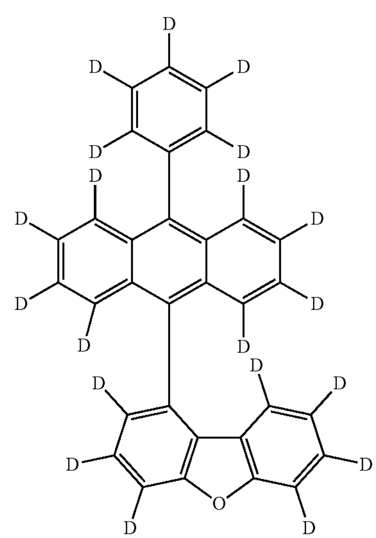

-continued
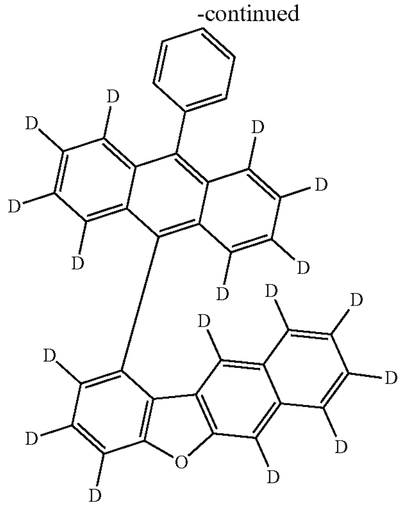
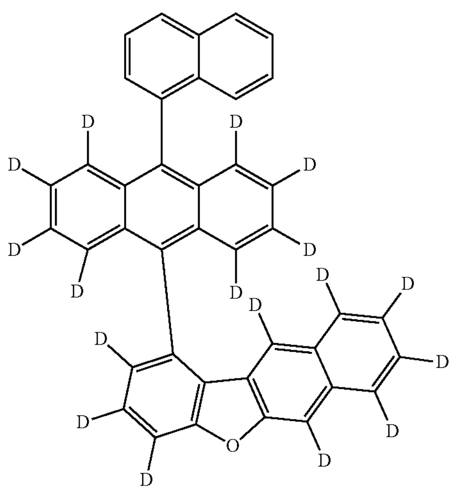
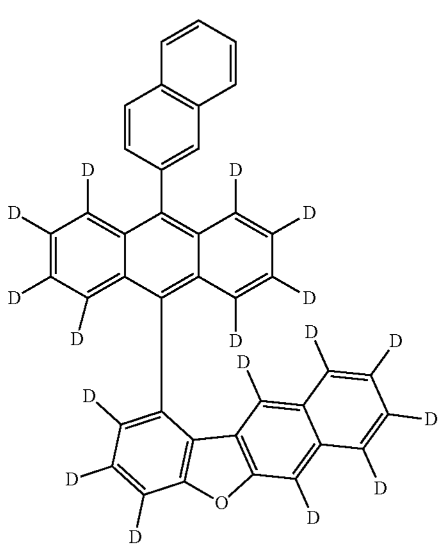
-continued
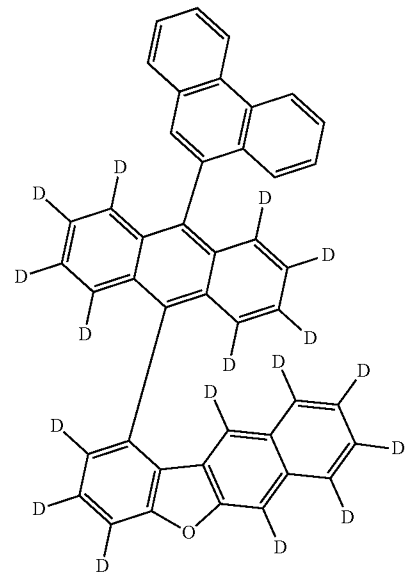
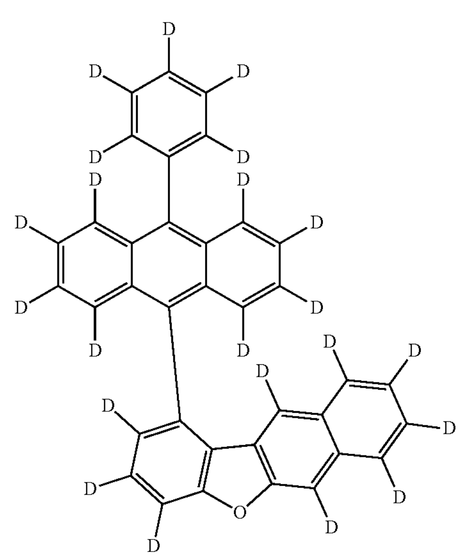

-continued
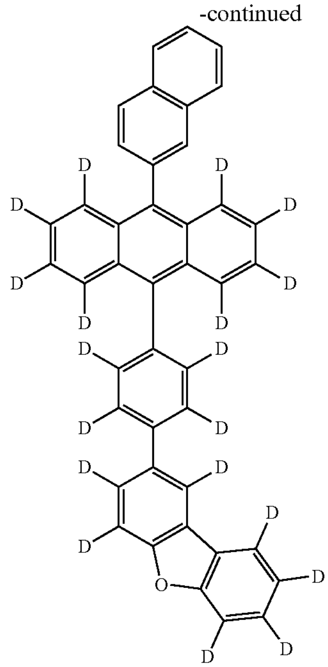
-continued
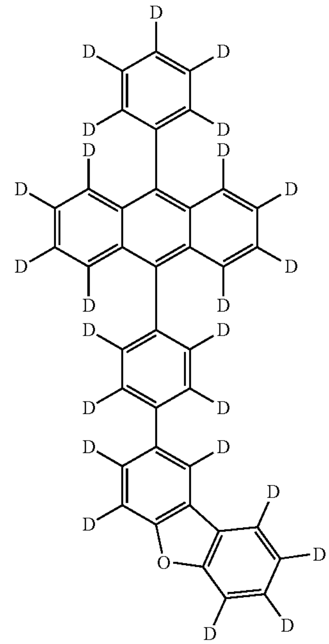
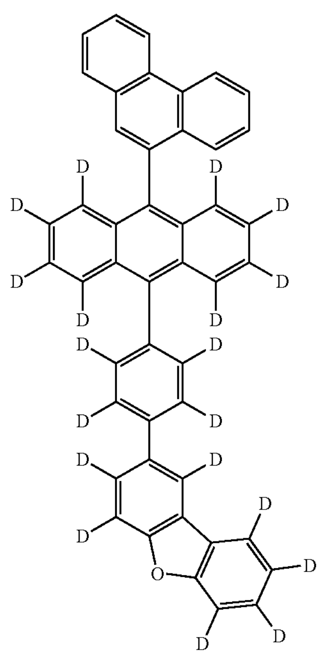
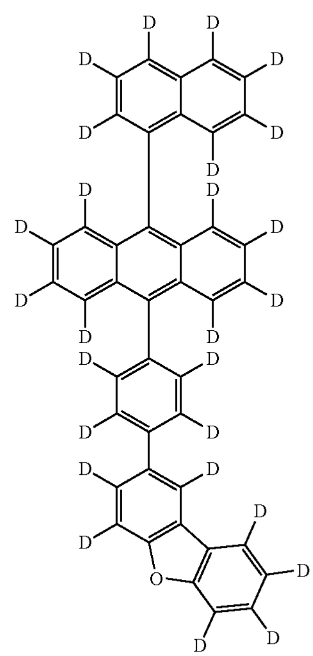

-continued
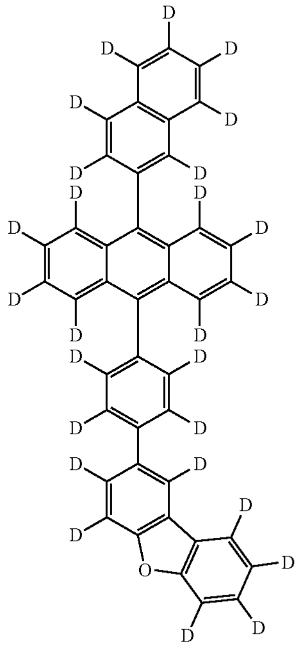
-continued
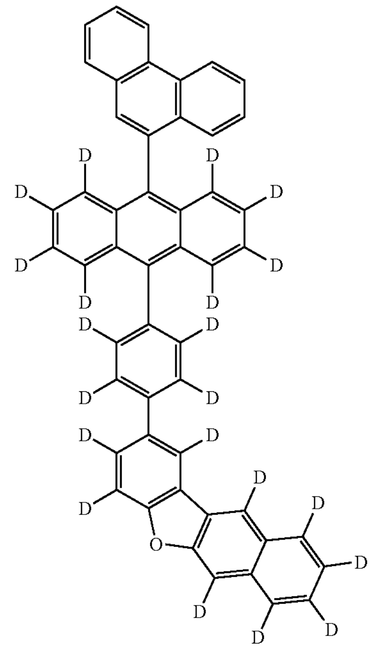
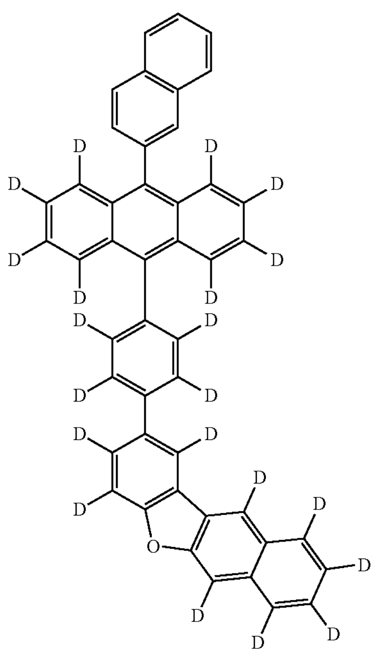
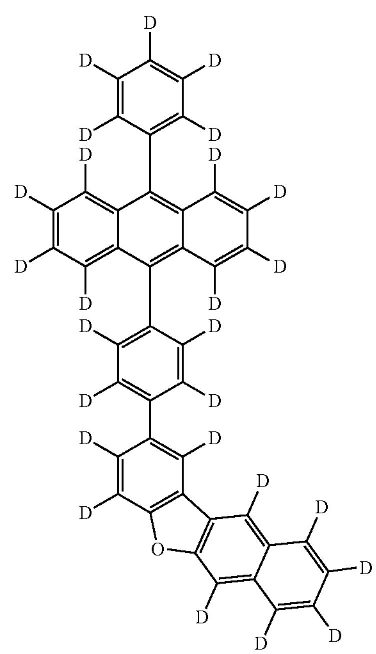

-continued
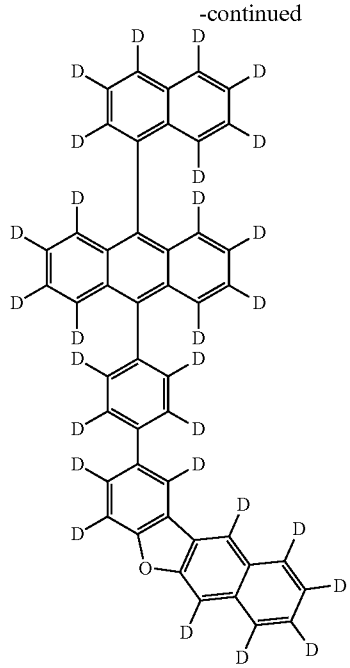
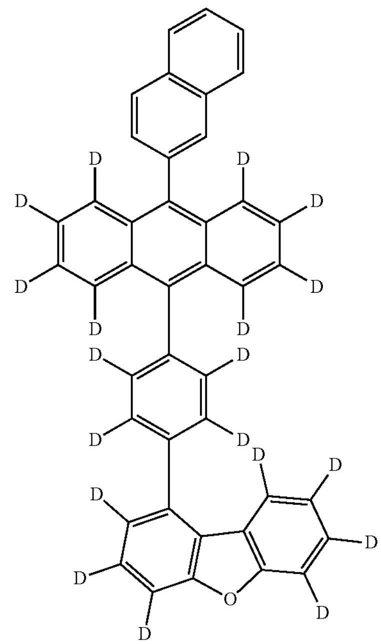
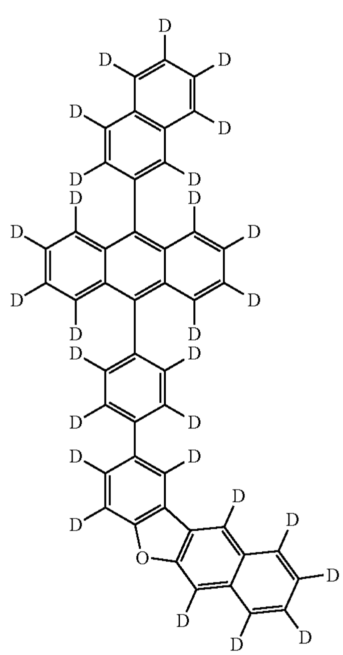
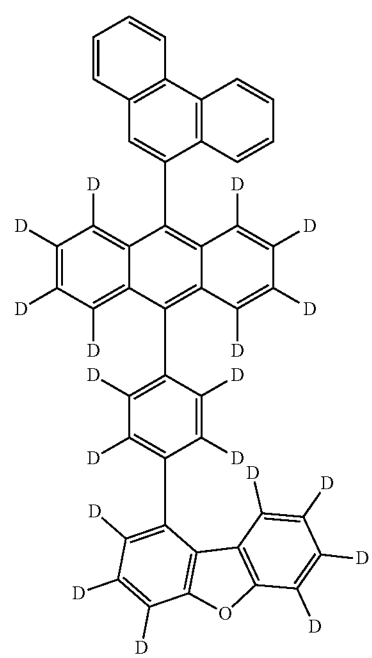

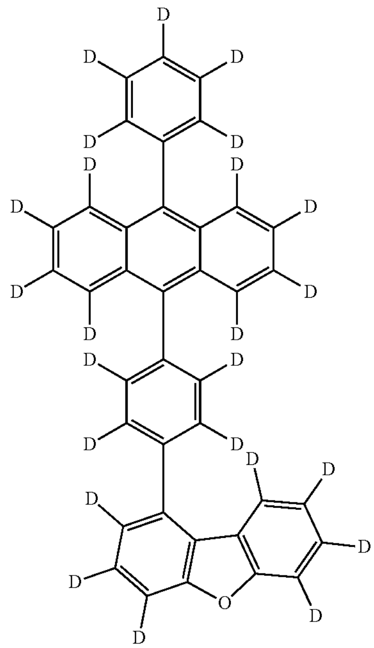
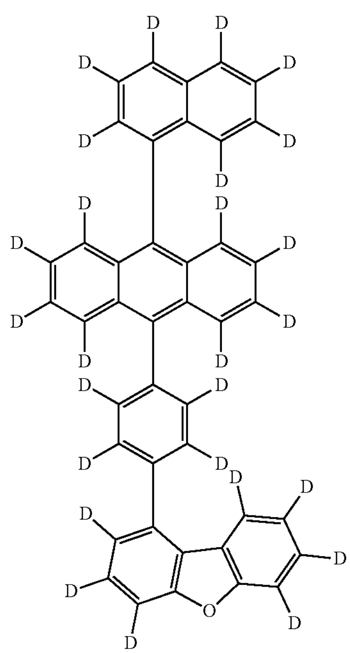
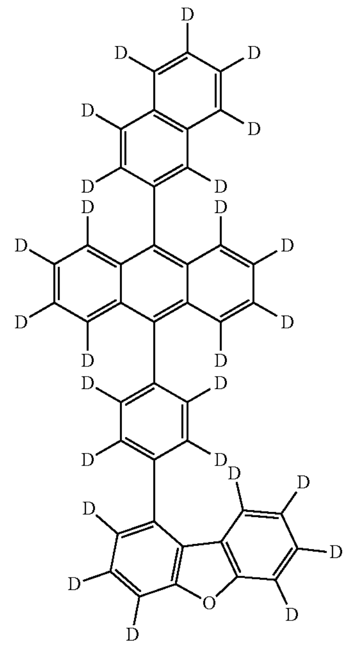
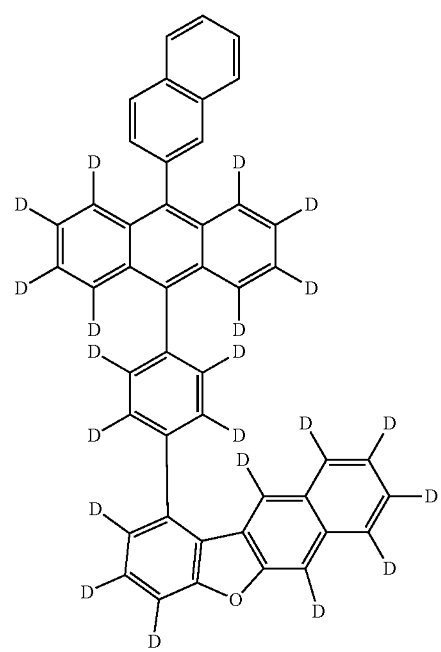

-continued
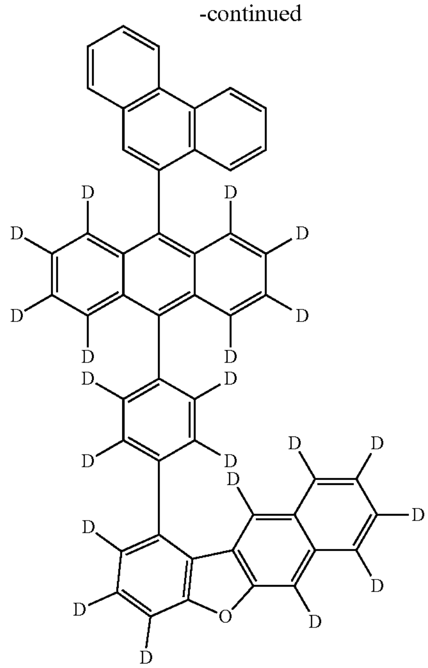
-continued
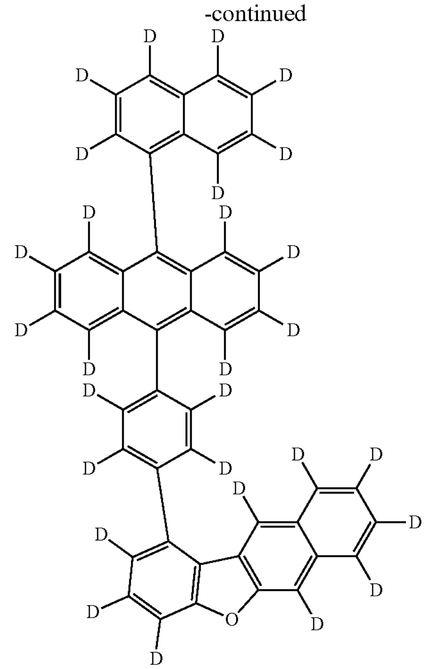
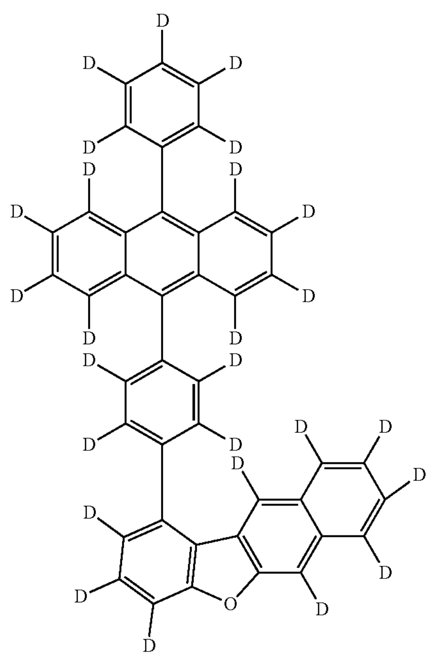
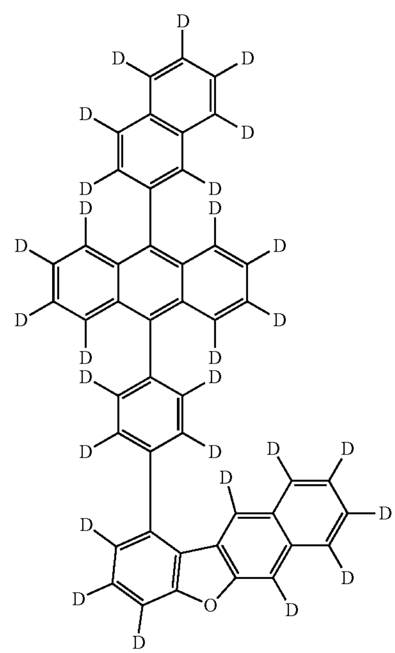

-continued
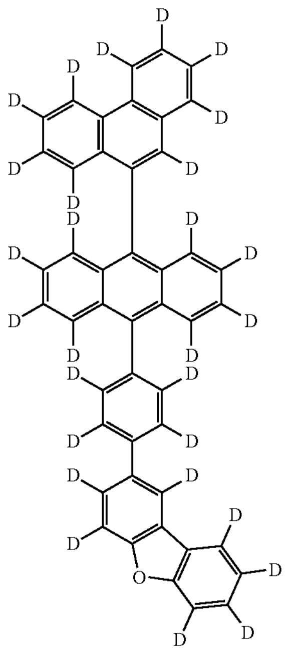
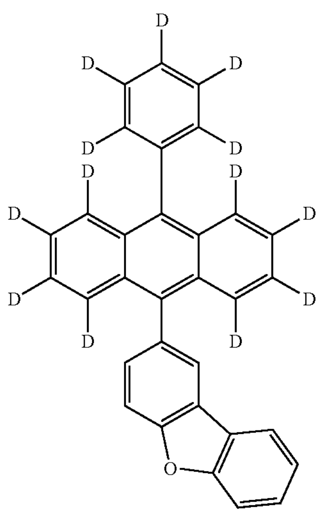
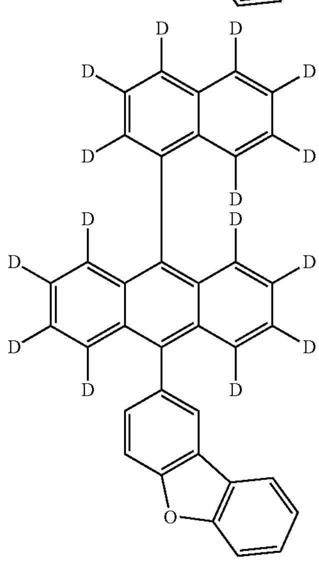
-continued
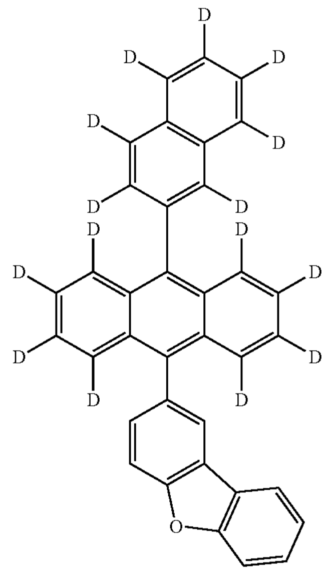
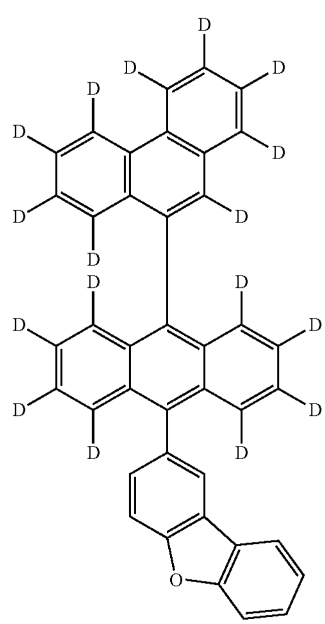

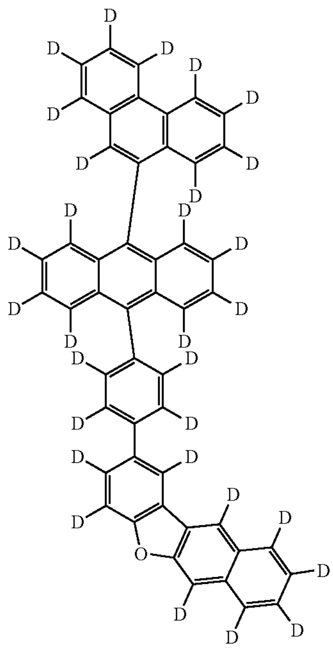
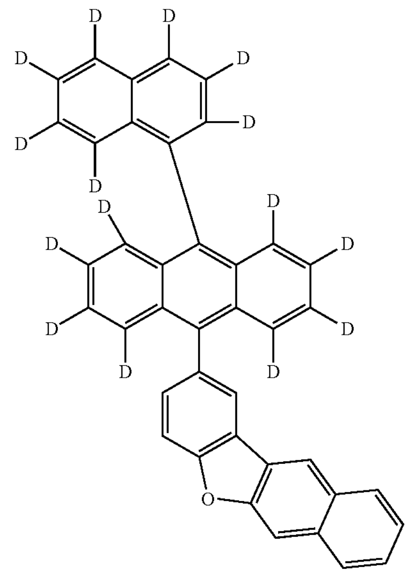
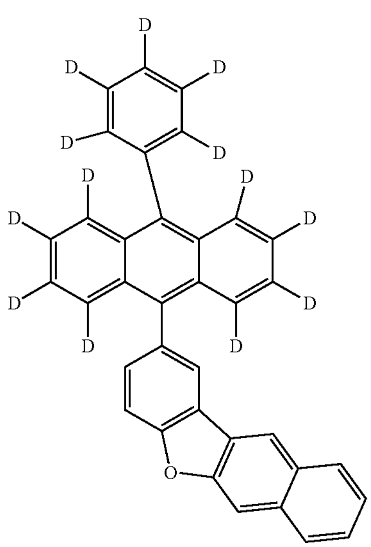
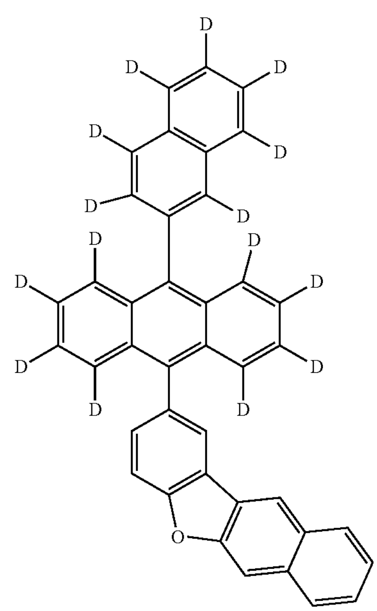

-continued
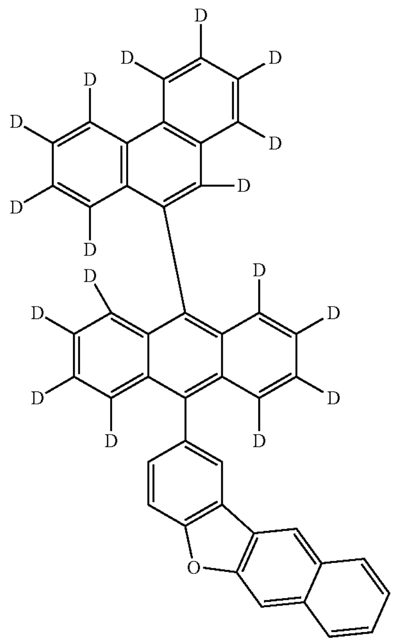
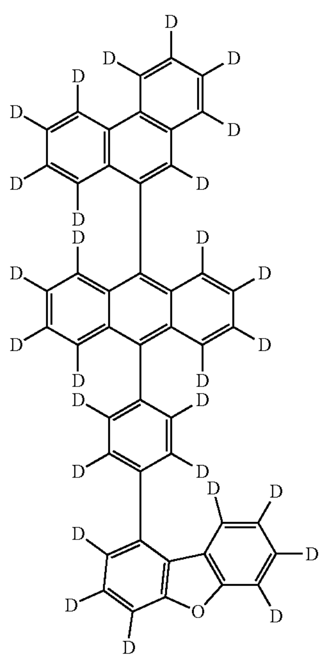
-continued
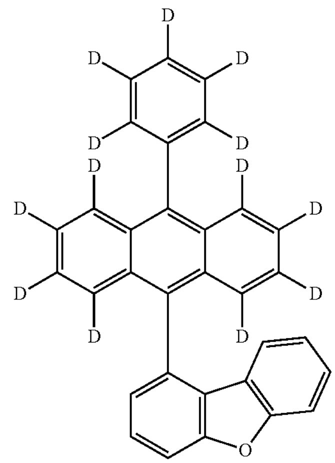
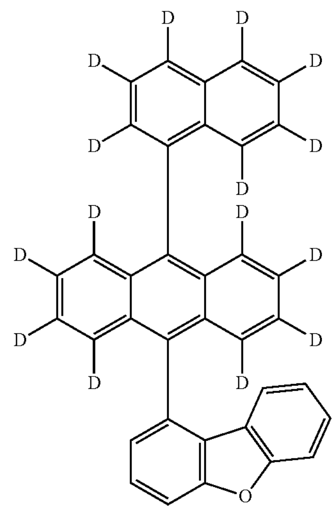
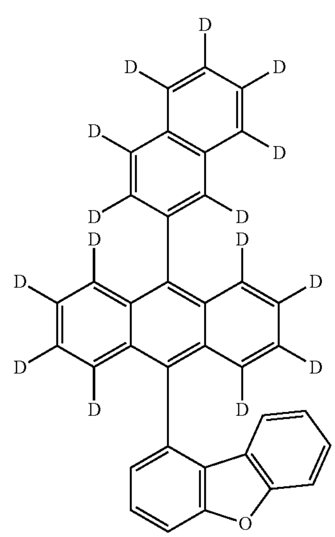

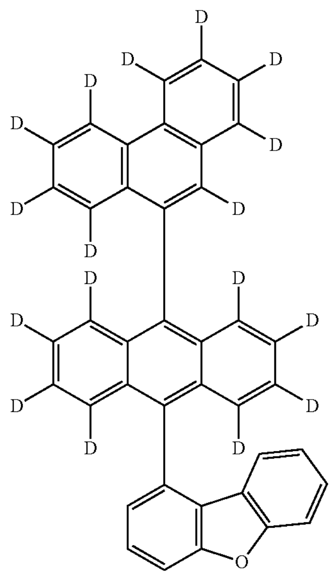
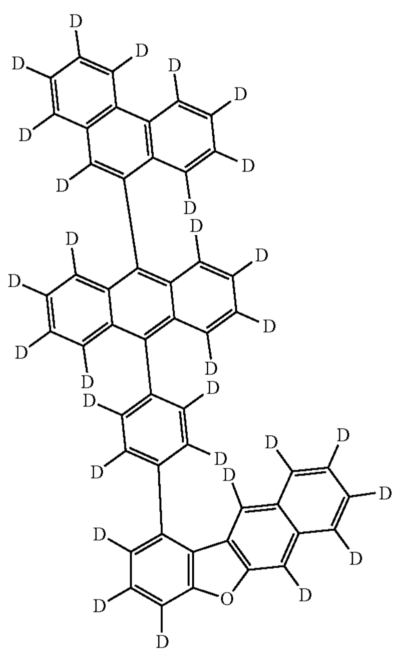
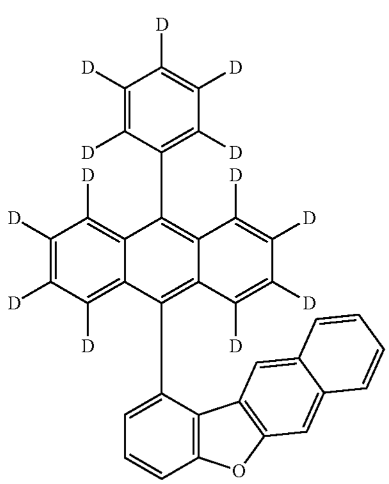
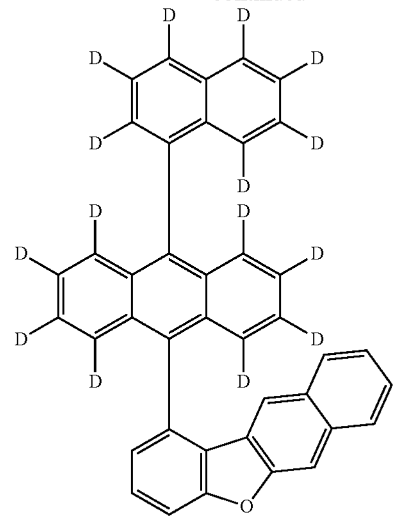
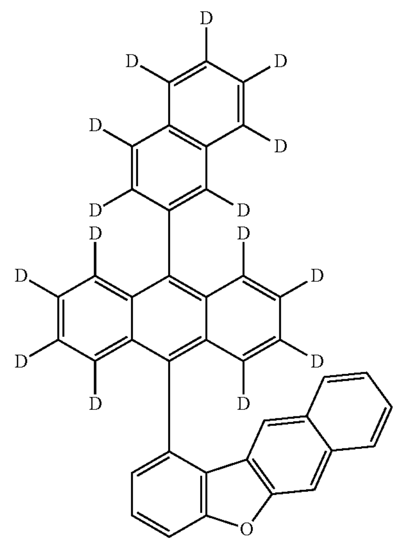
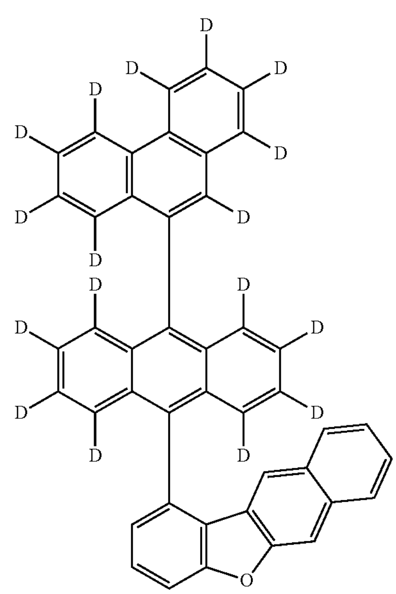

-continued
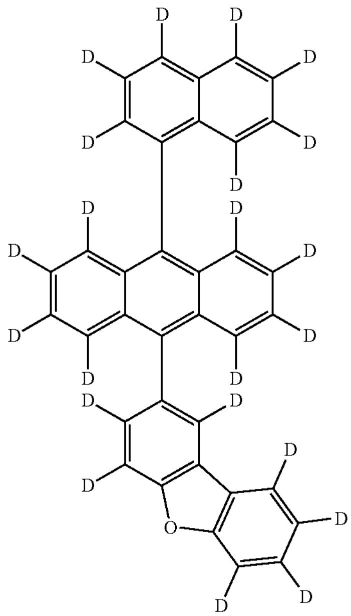
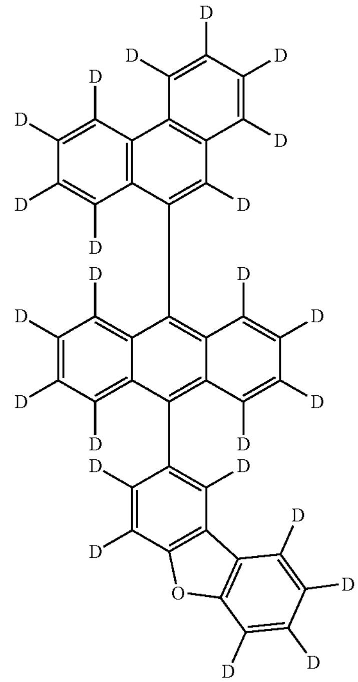
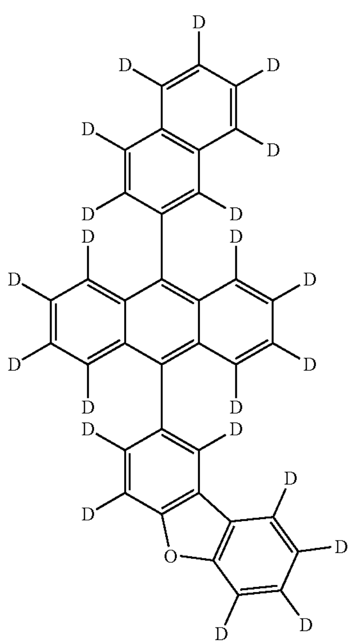
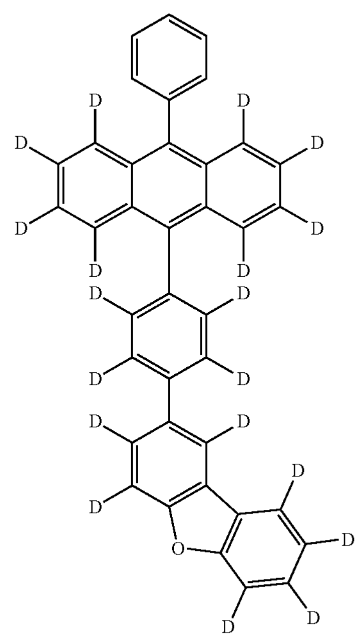

-continued
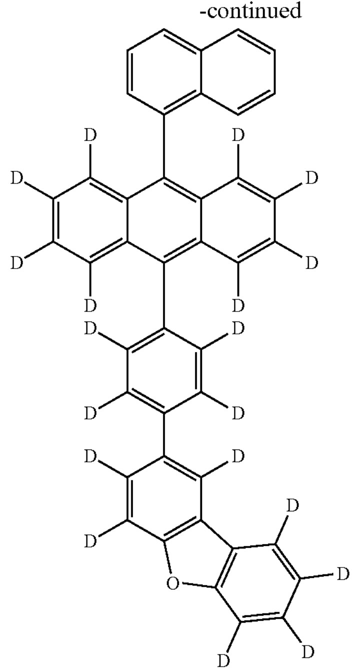
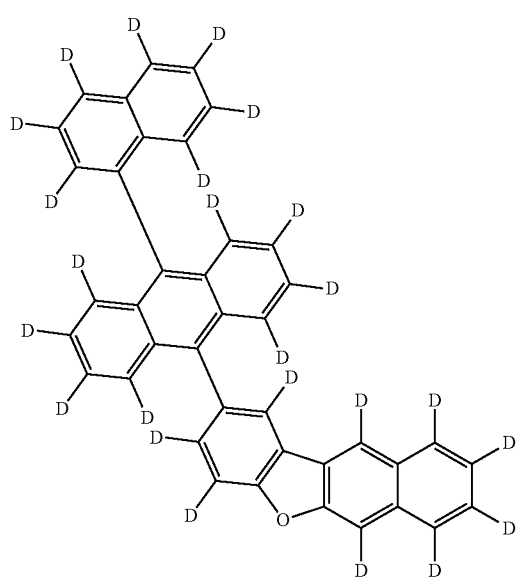
-continued
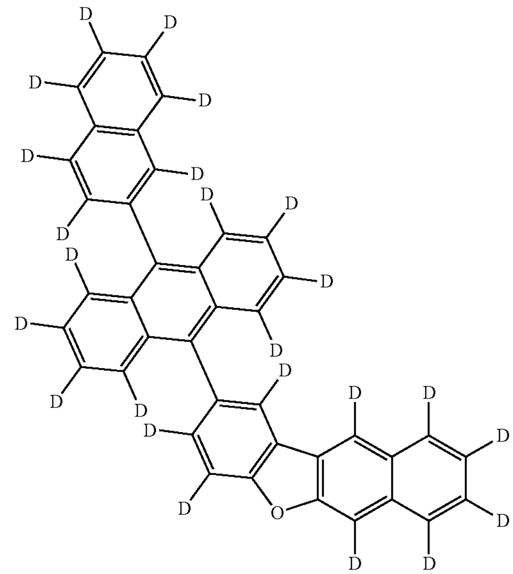
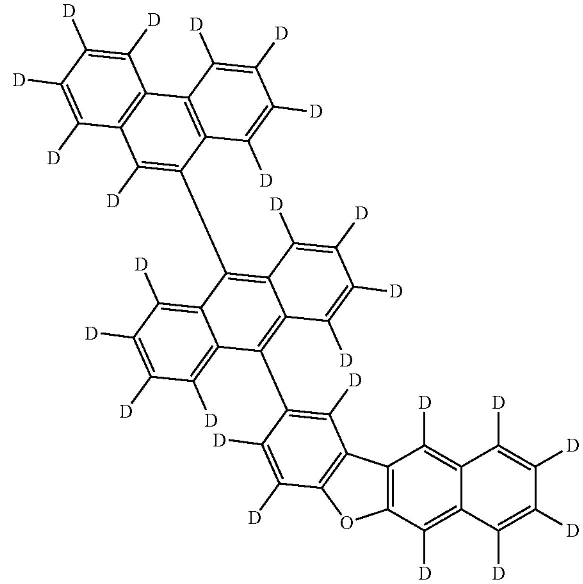
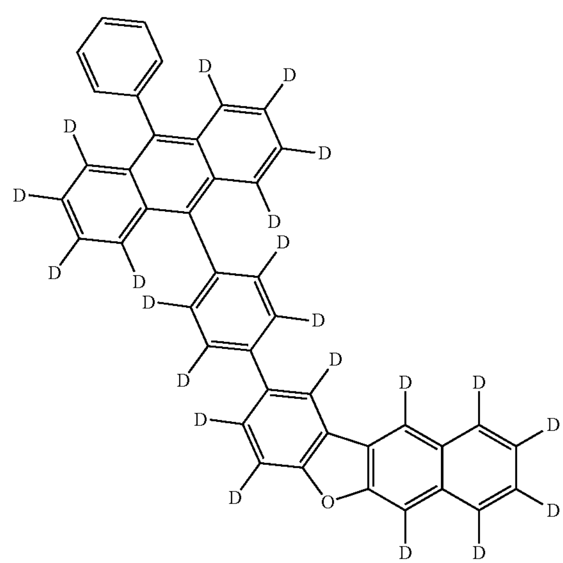

-continued
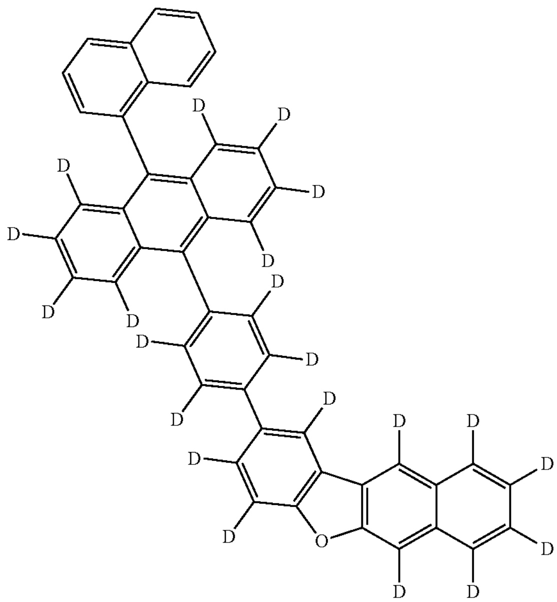
-continued
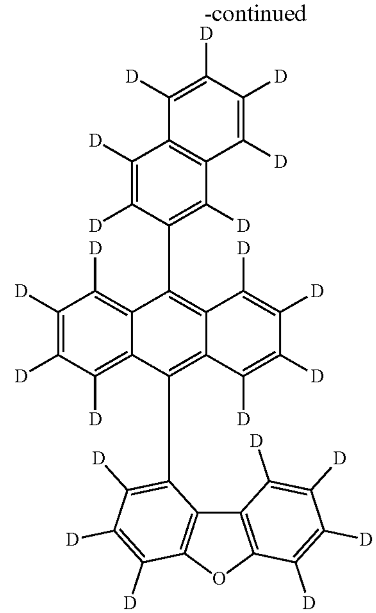
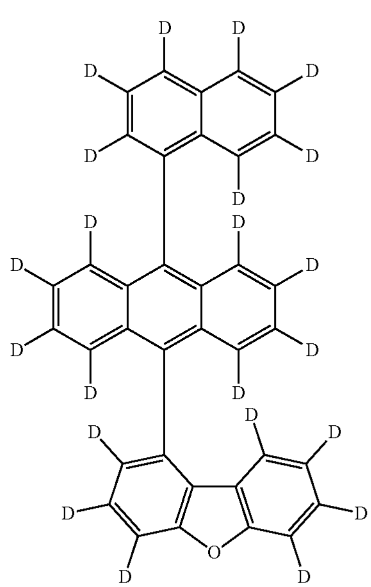
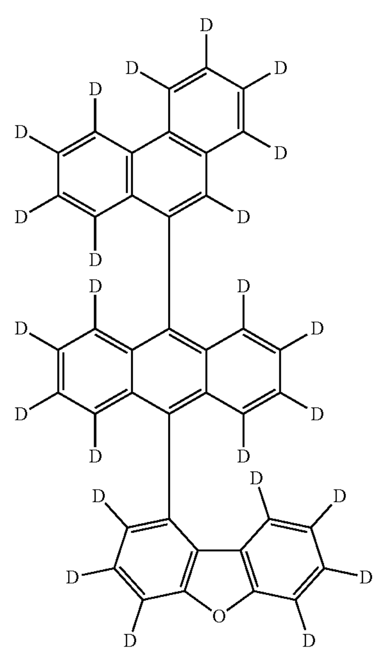

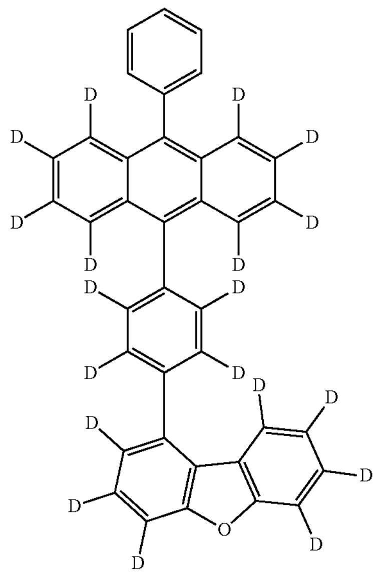
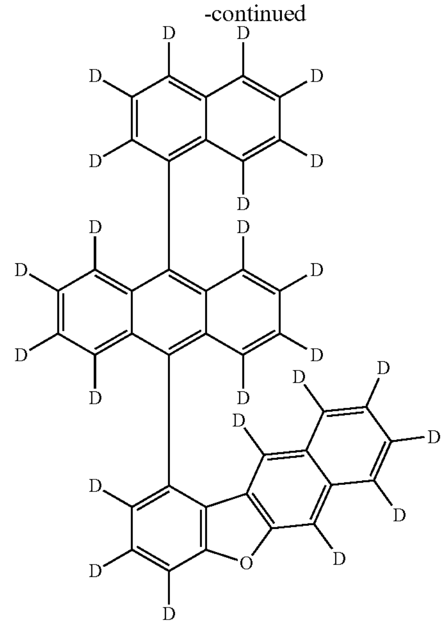
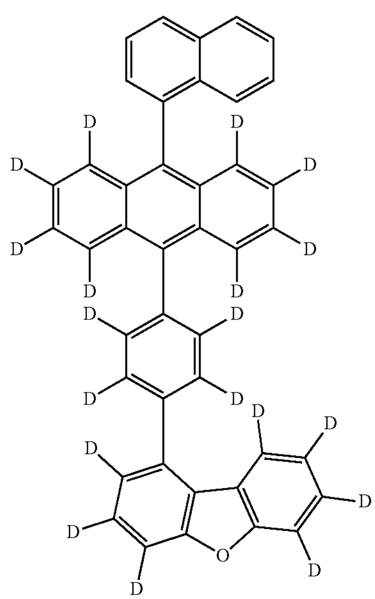
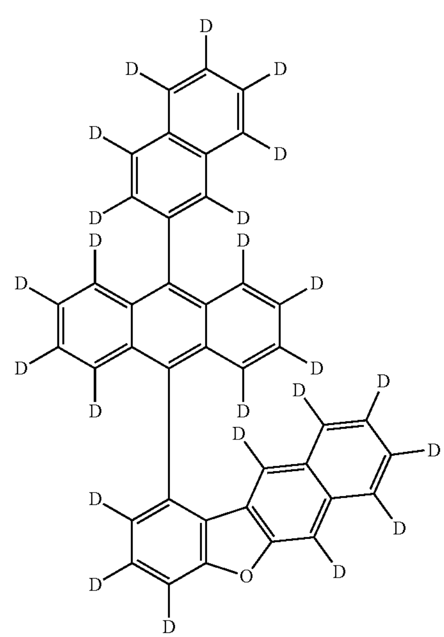

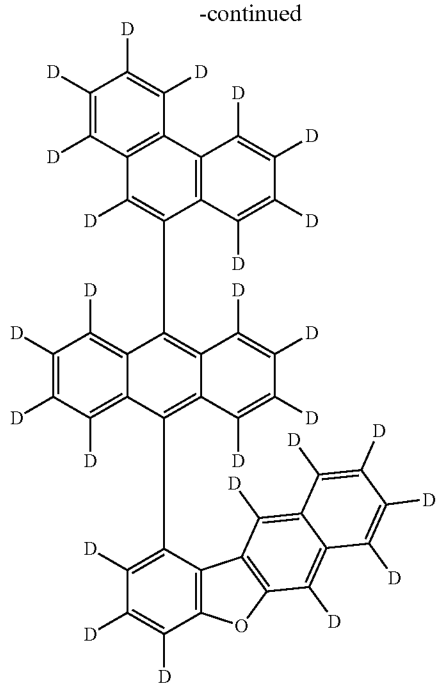
D
O
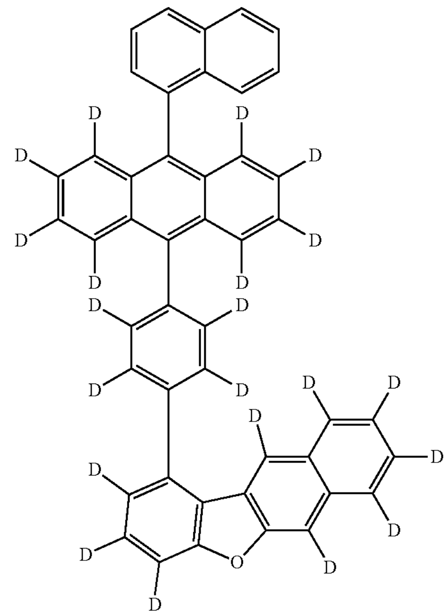
D
O
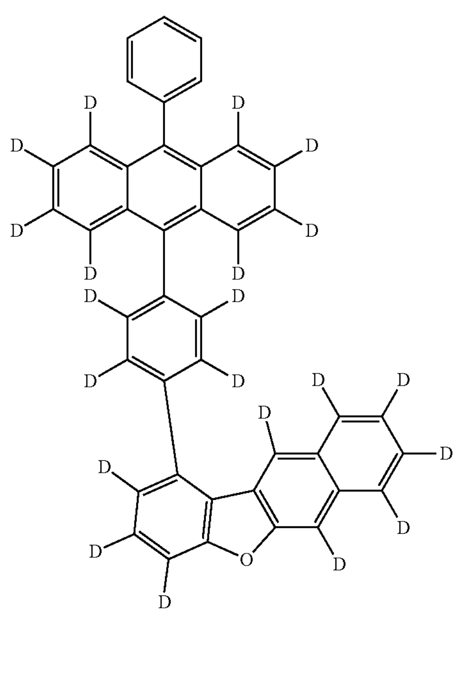
D
O
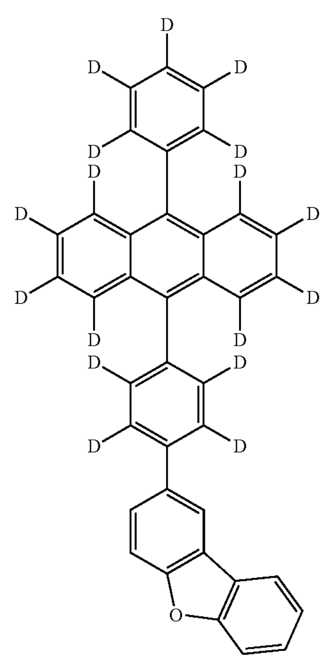
D
O

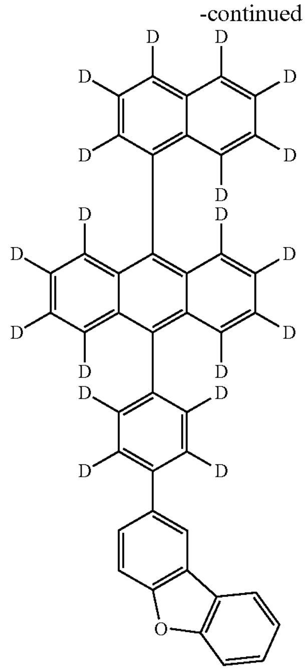
D
O
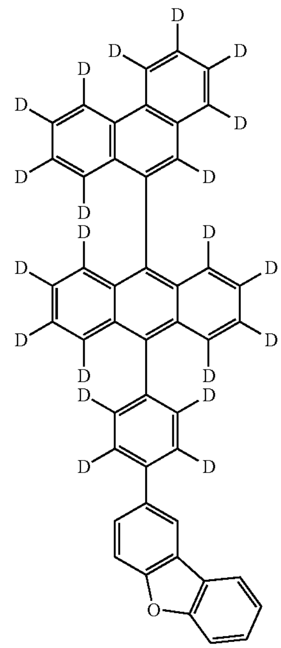
D
O
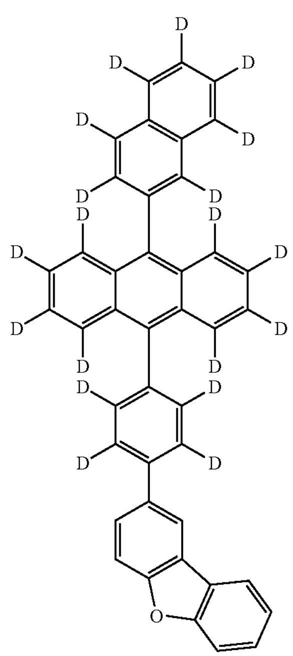
D
O
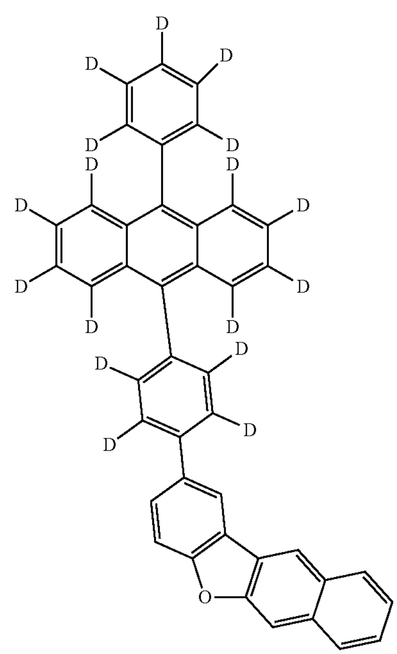
D
O

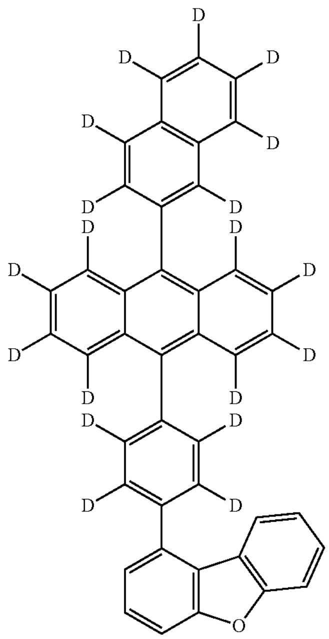
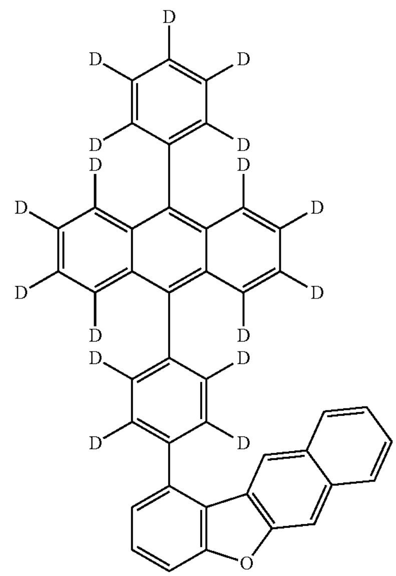
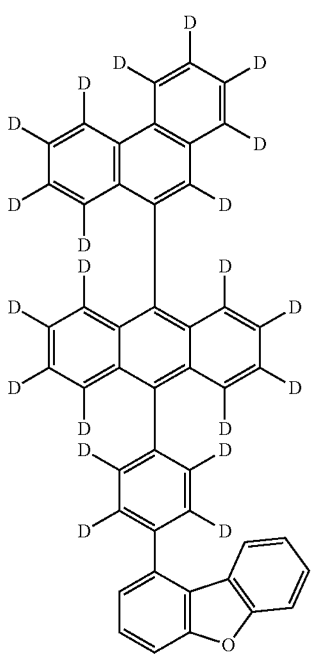
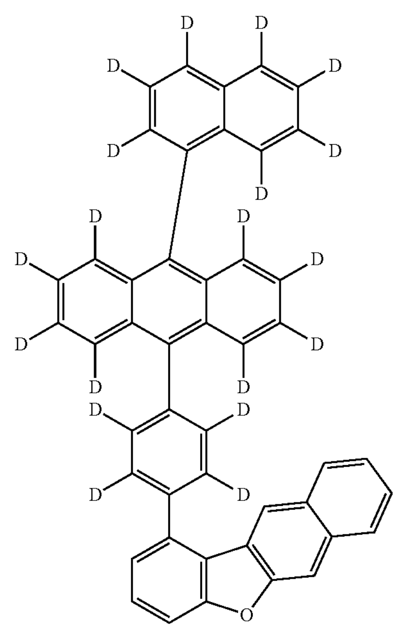

-continued
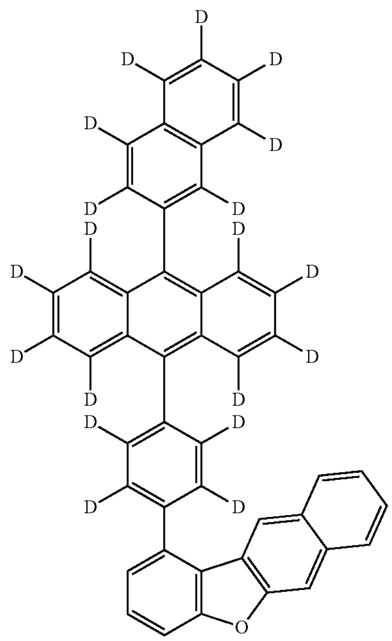
-continued
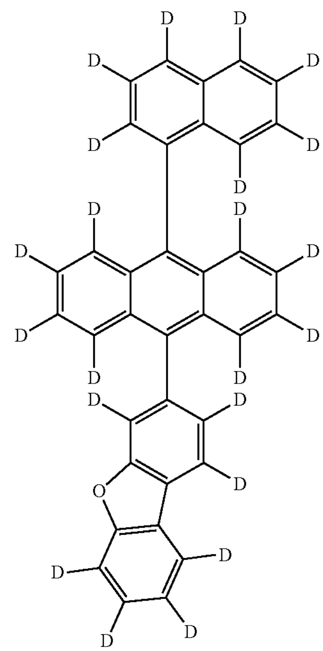
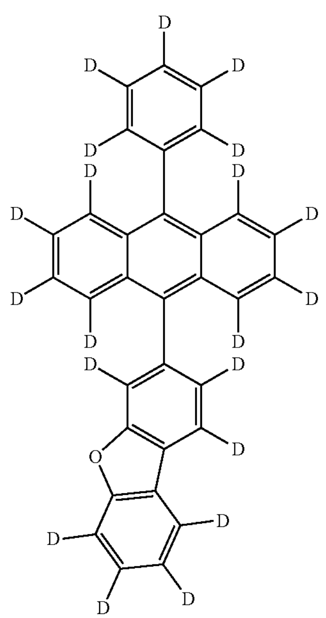
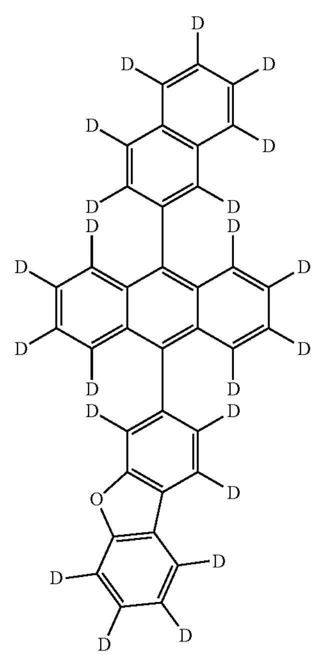

-continued
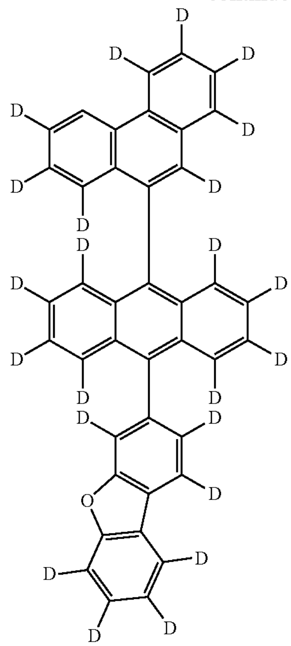
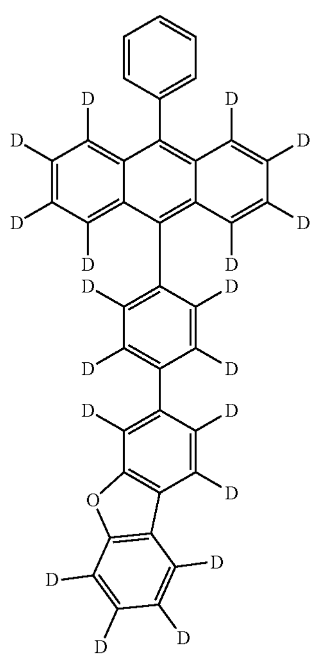
-continued
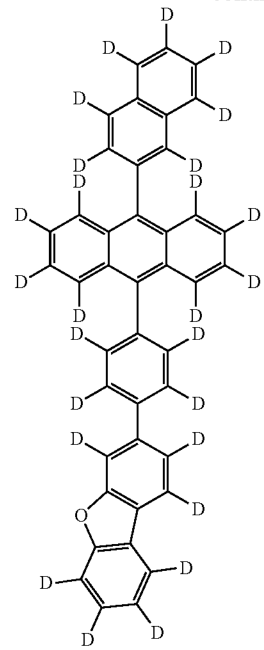
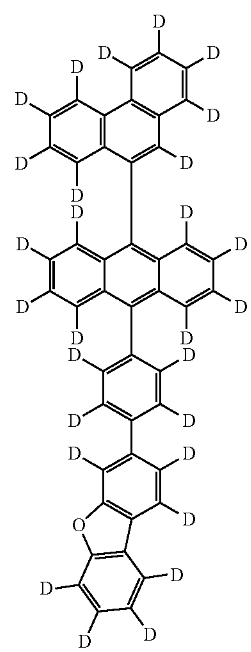

-continued
-continued
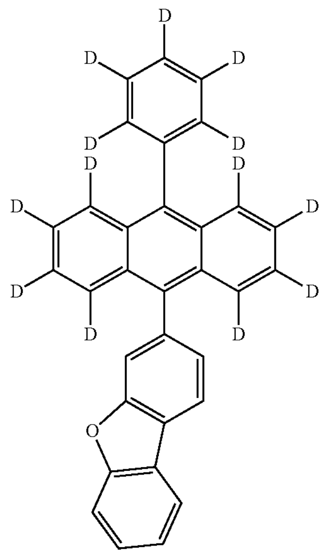
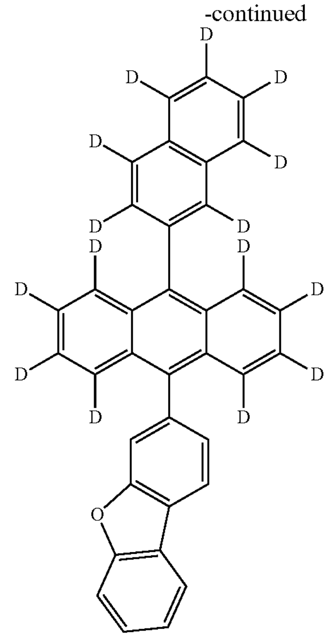
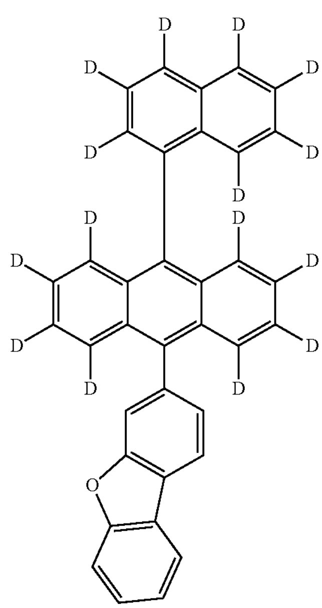
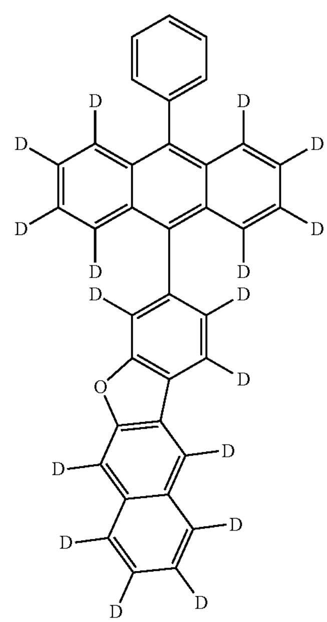

-continued
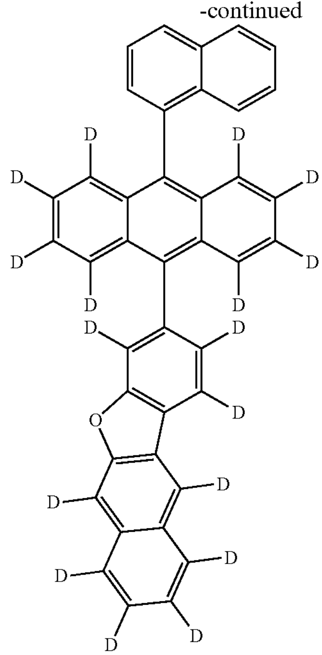
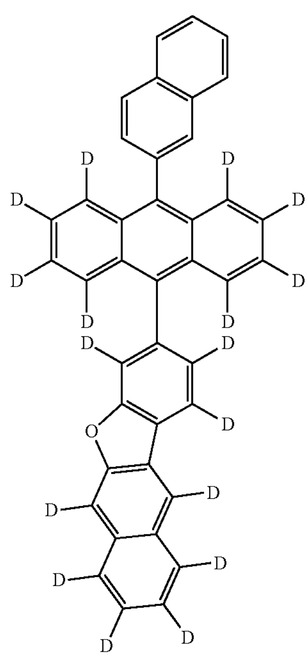
-continued
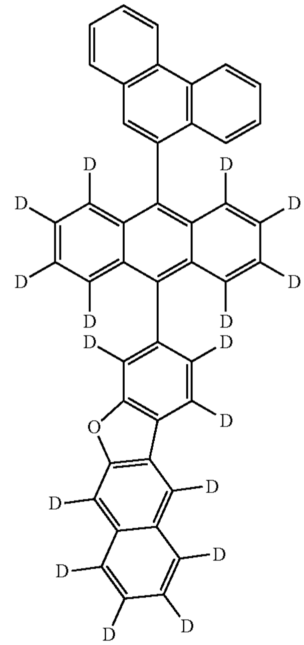
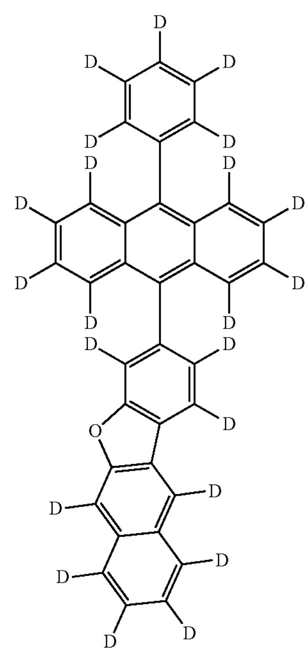

-continued
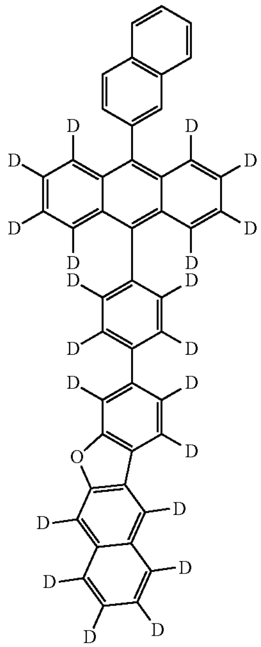
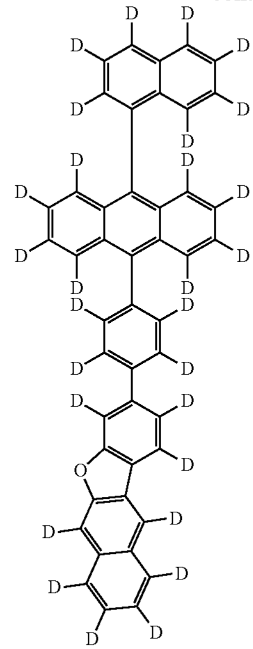
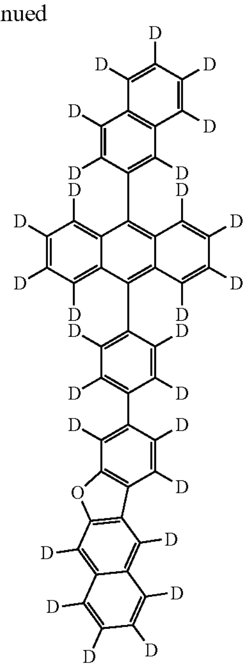
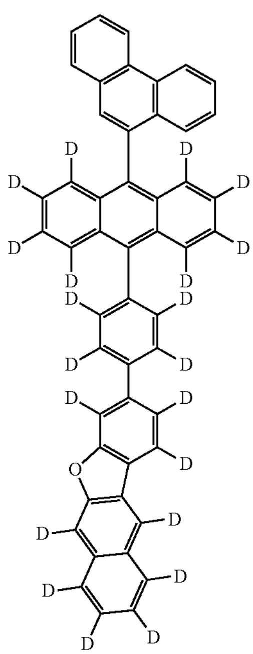
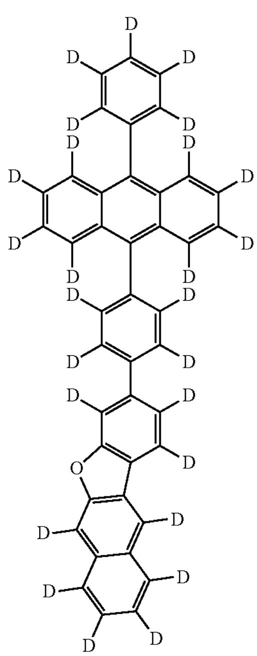
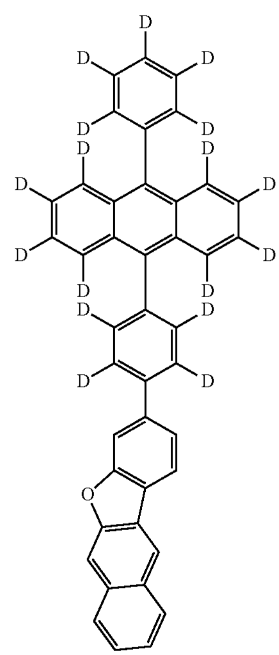

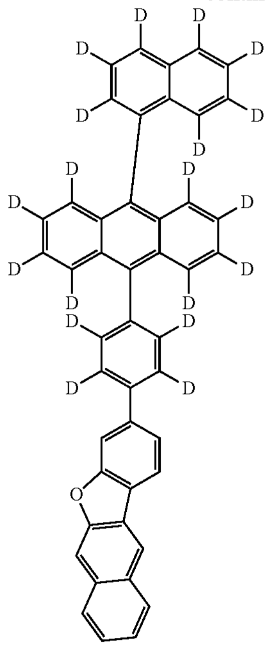
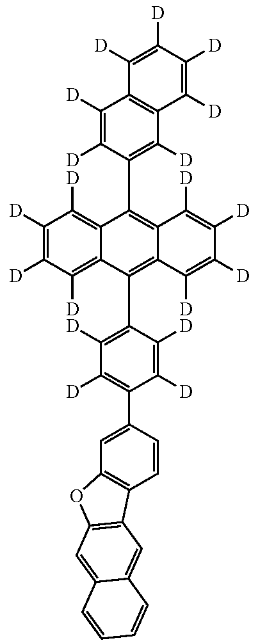
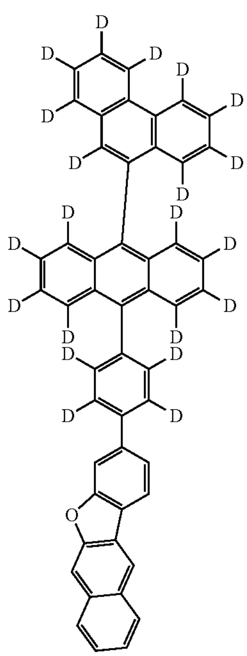
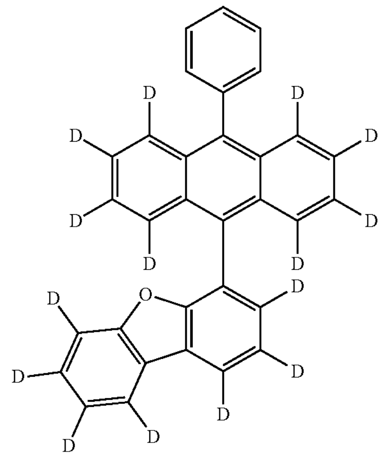
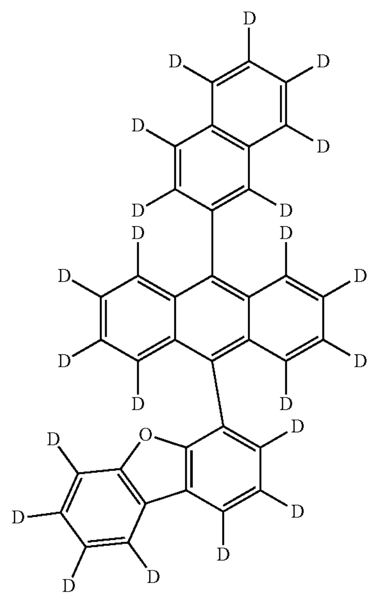
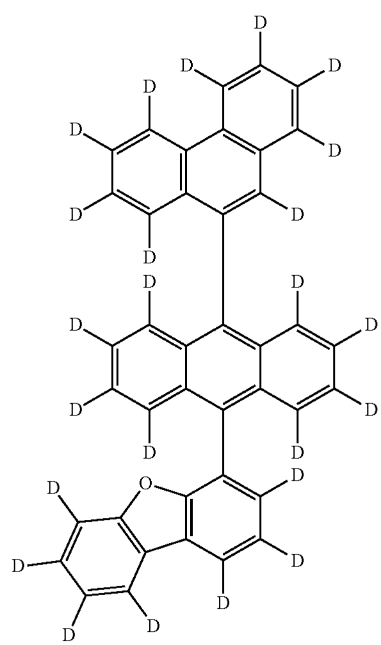

-continued
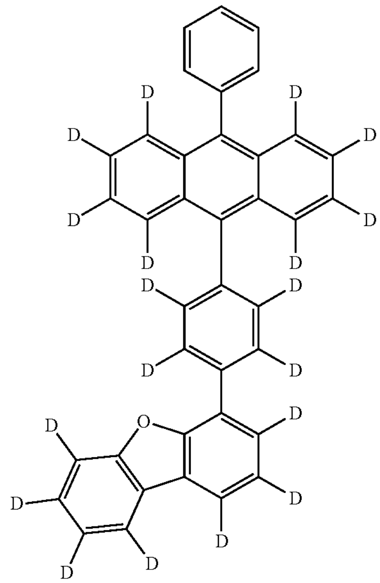
-continued
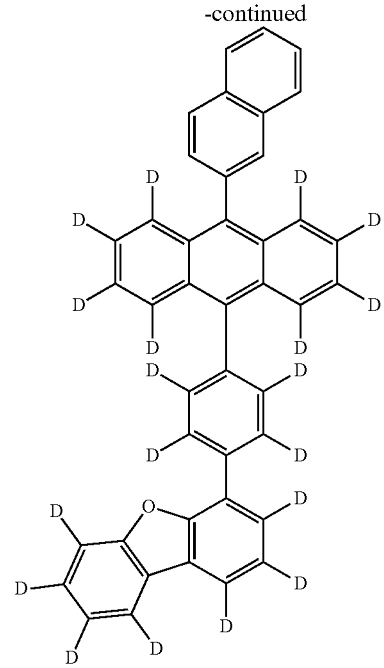
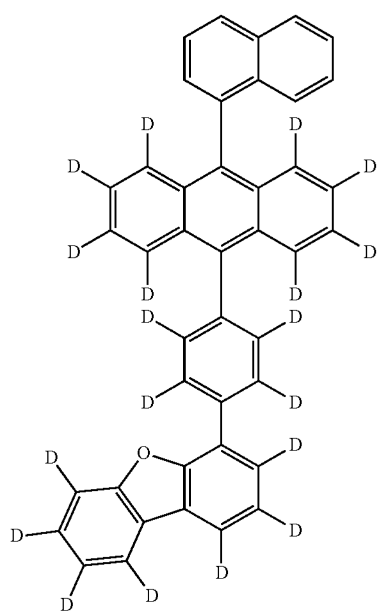
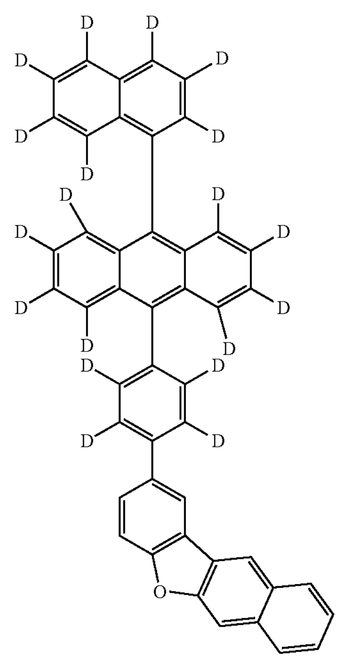

-continued
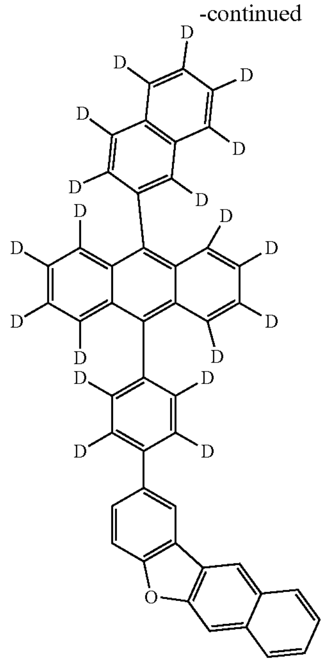
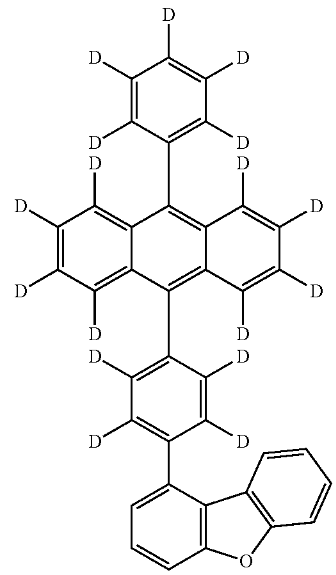
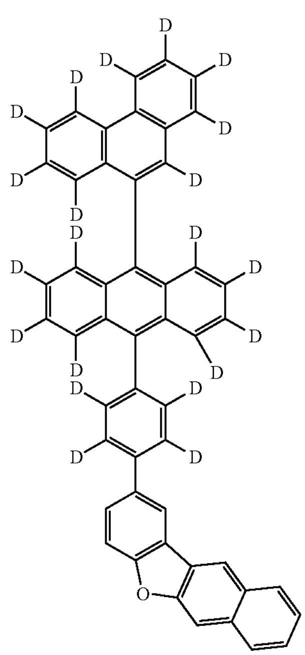
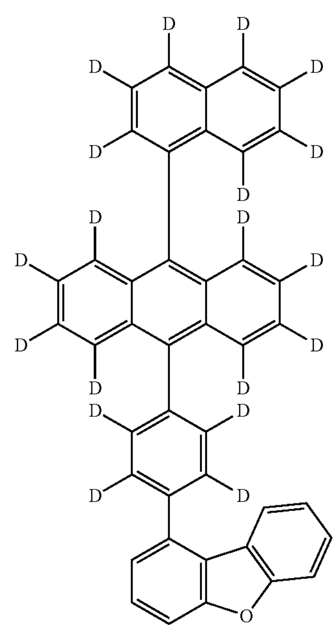

-continued
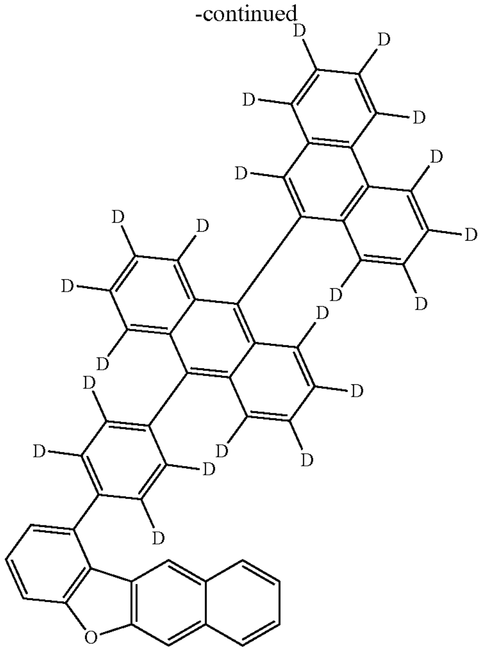
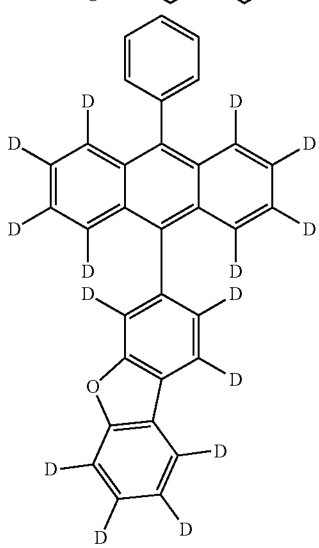
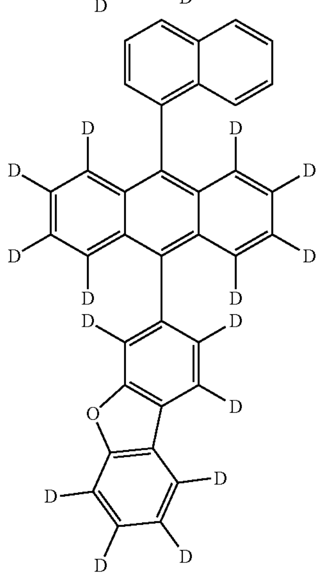
-continued
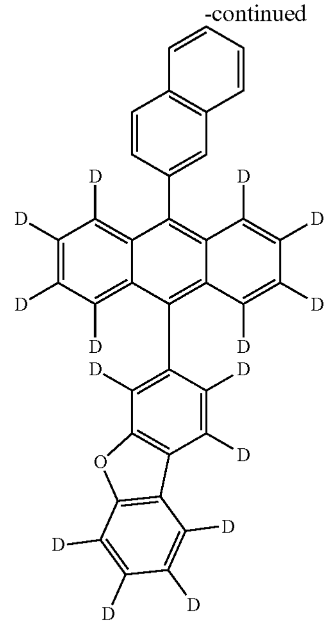
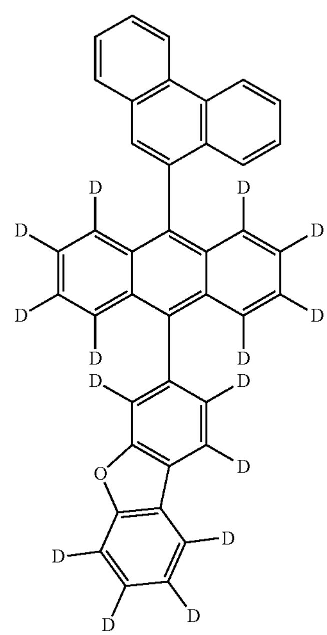

-continued
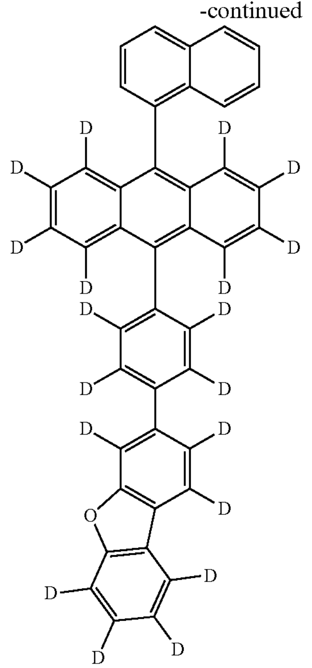
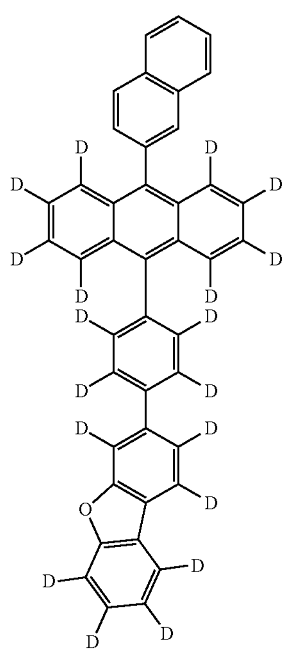
-continued
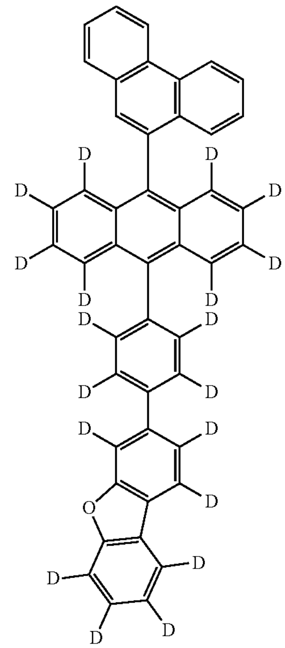
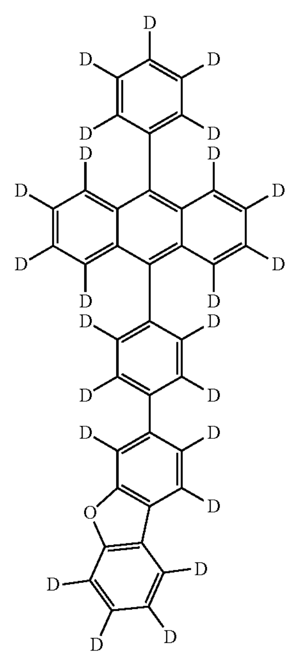

-continued
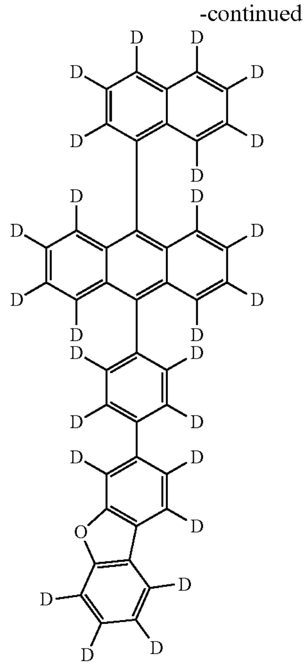
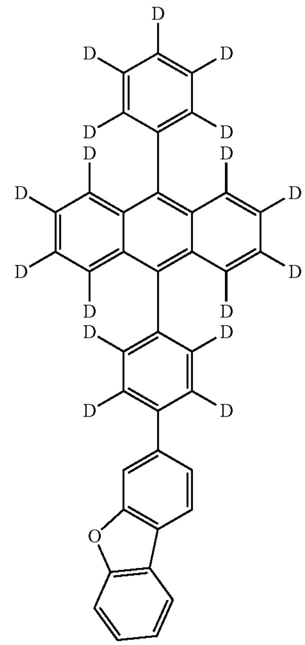
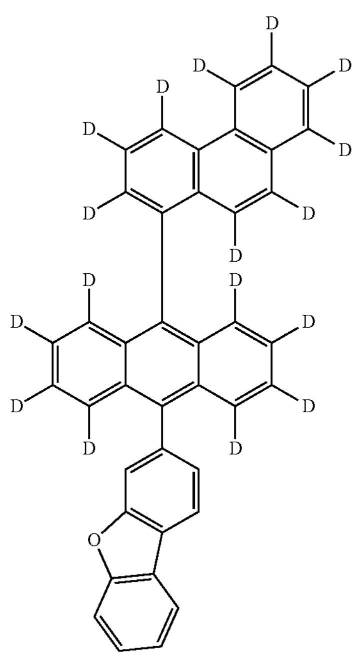
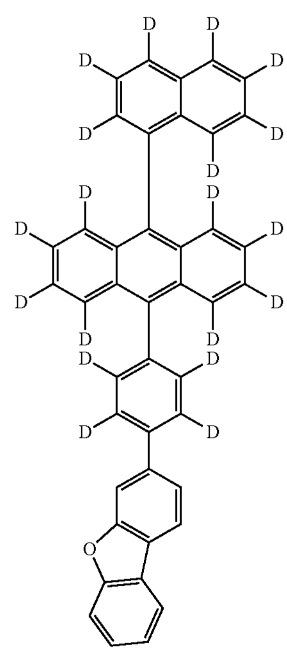

-continued
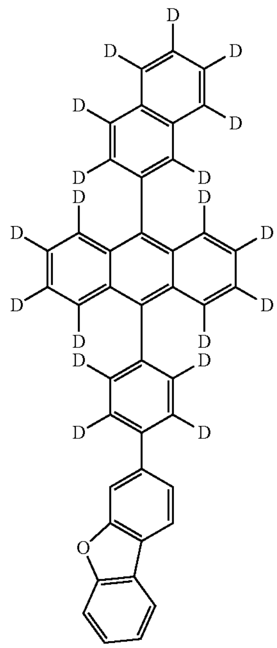
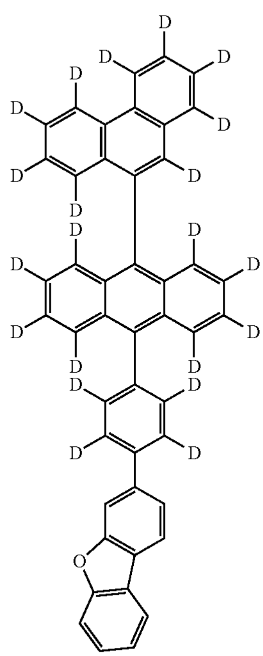
-continued
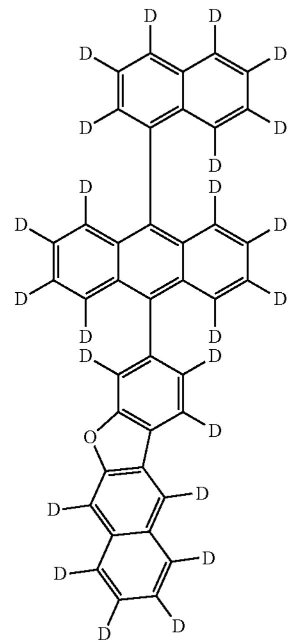
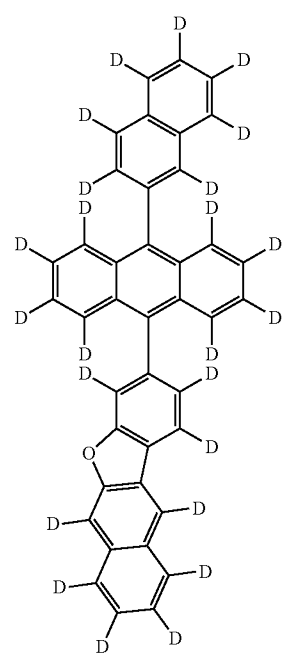

-continued
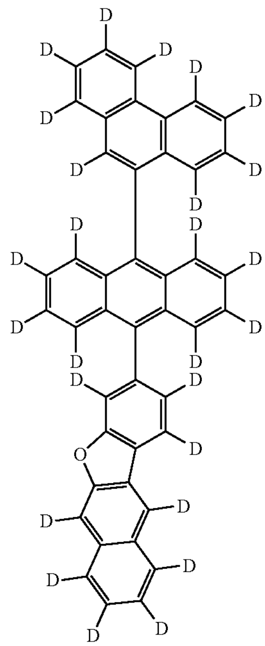
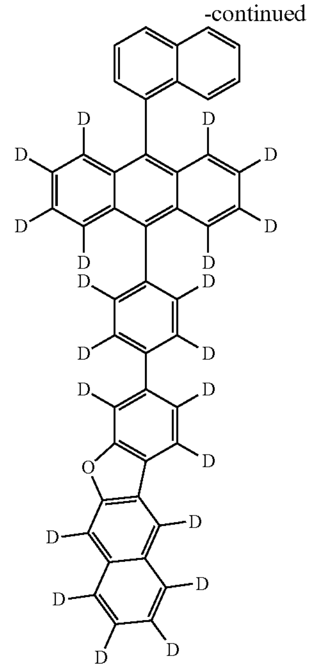
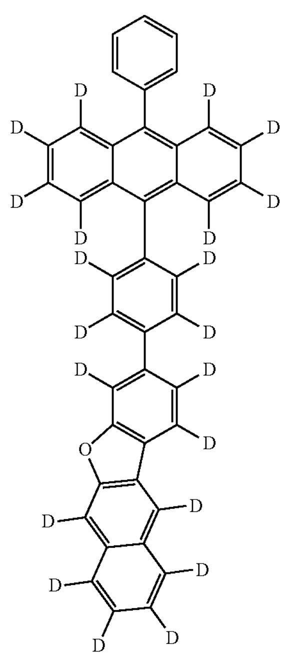
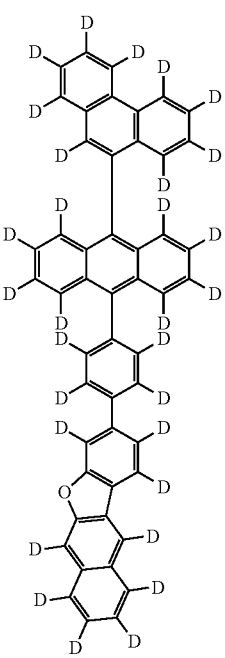

-continued
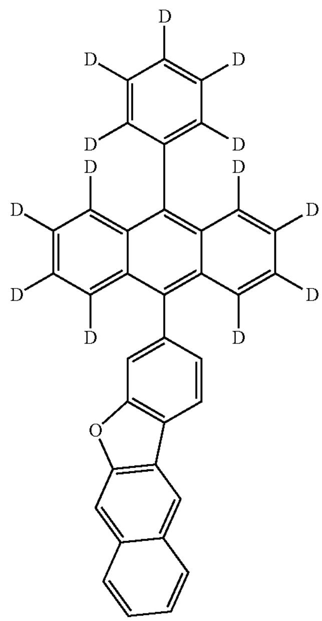
-continued
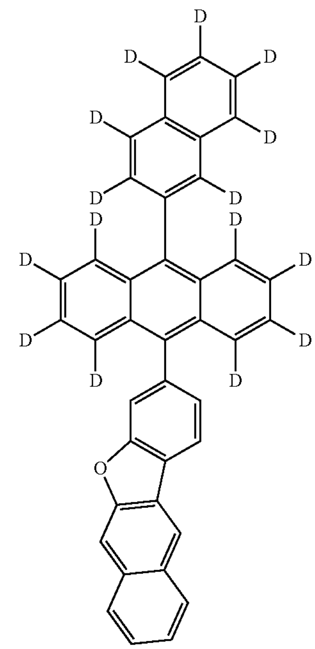
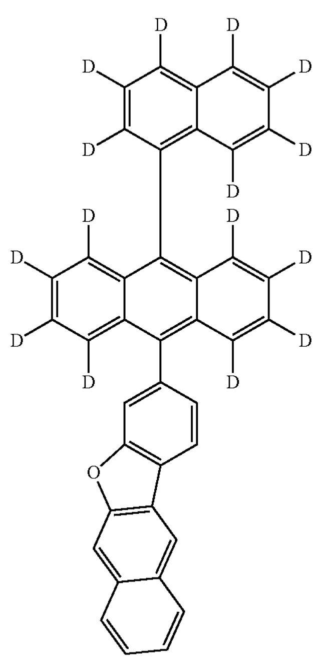
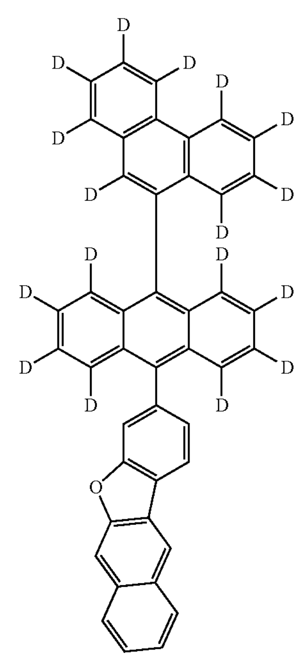

-continued
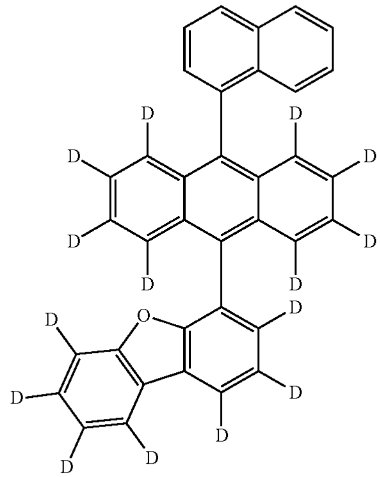
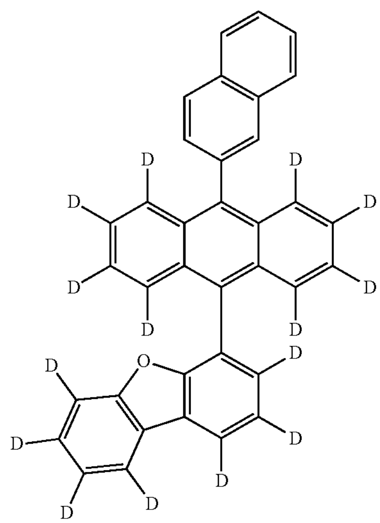
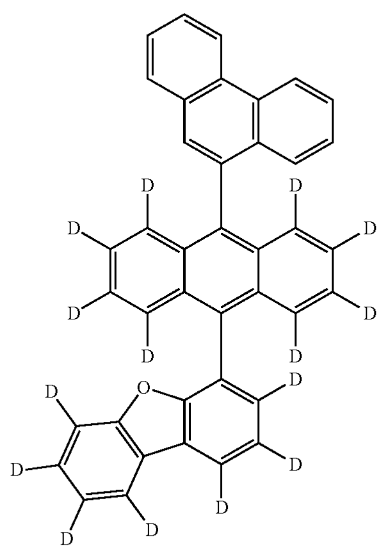
-continued
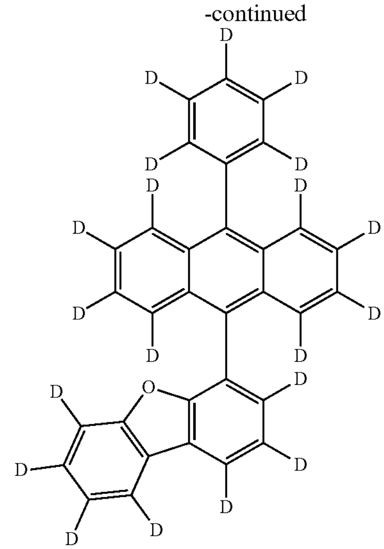
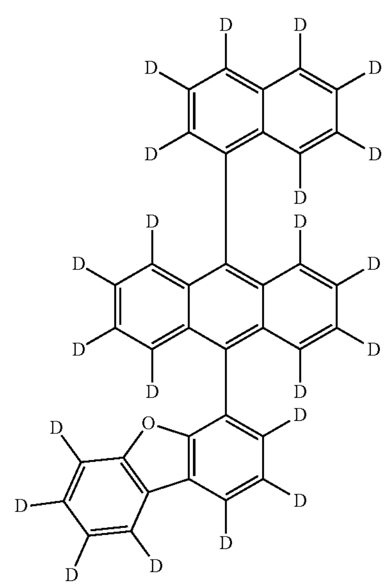

-continued
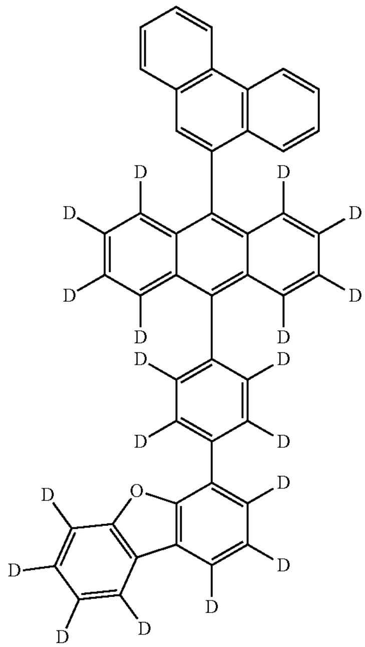
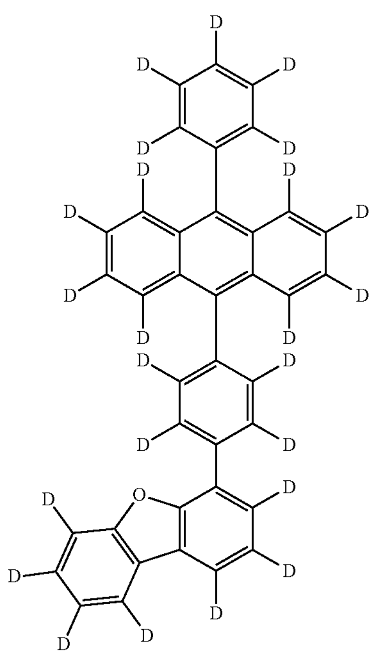
-continued
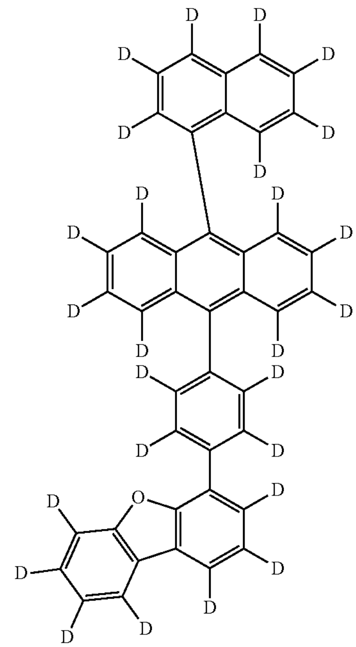
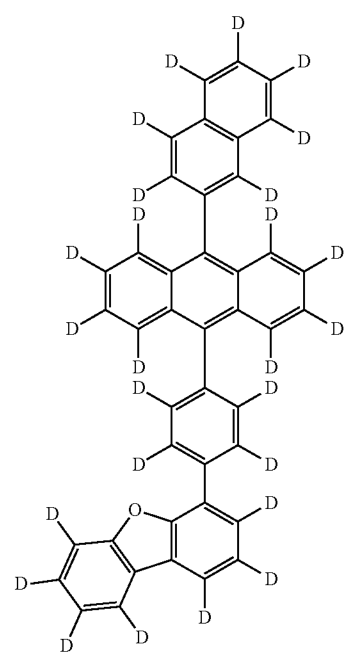

-continued
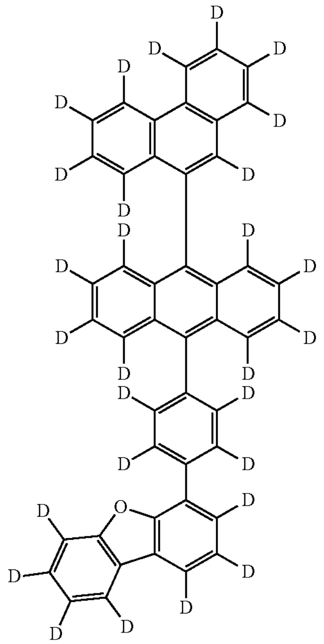
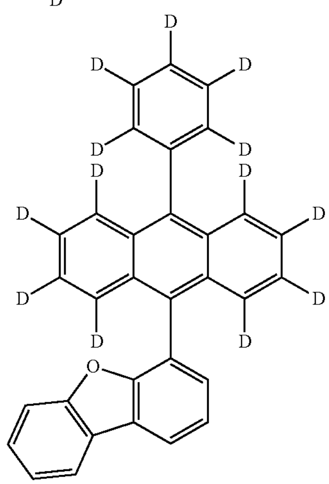
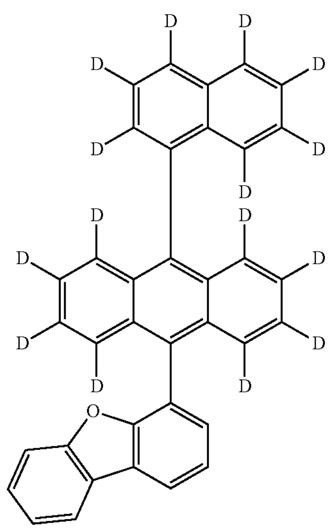
-continued
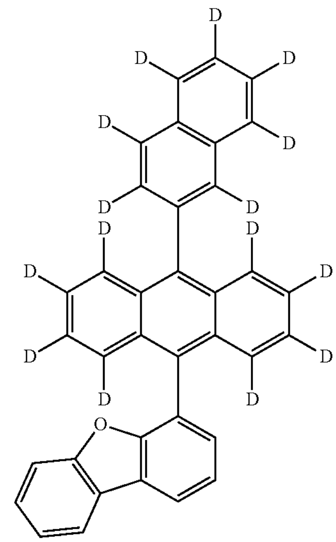
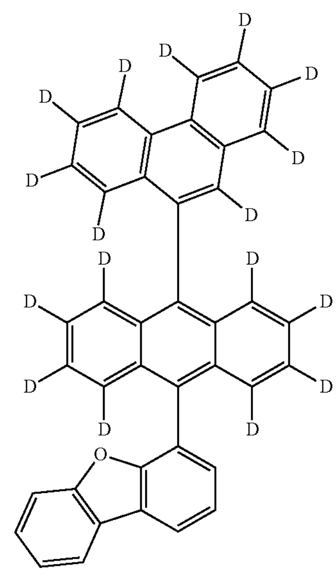
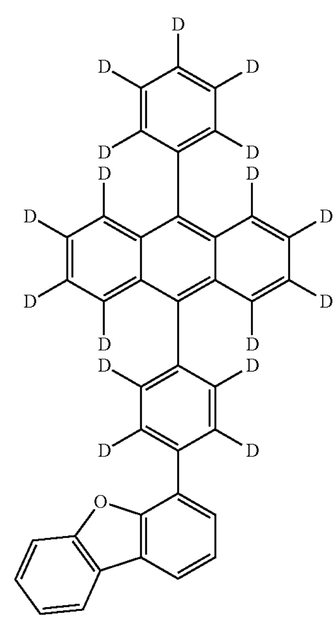

-continued
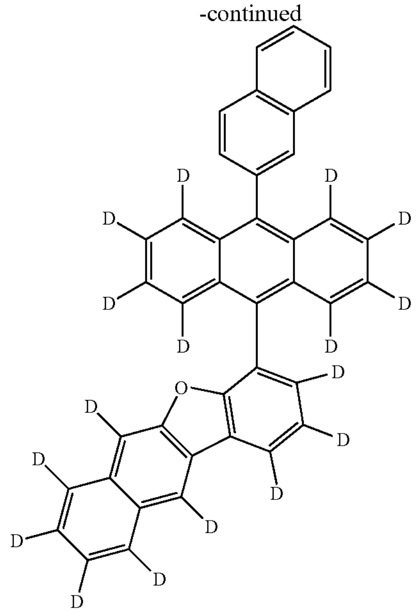
-continued
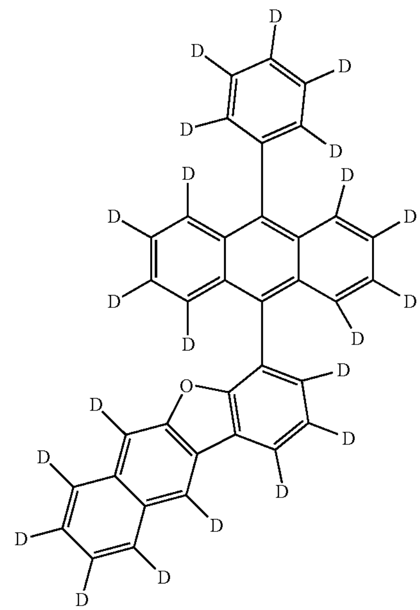
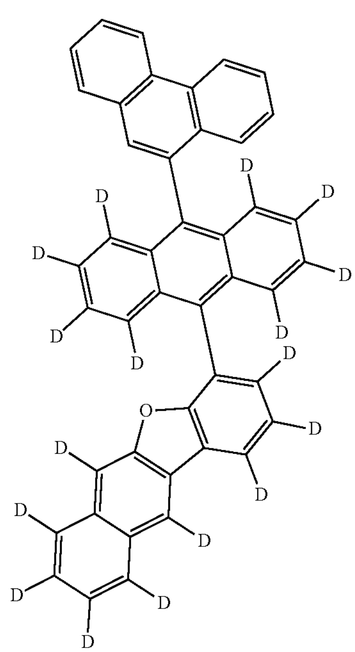
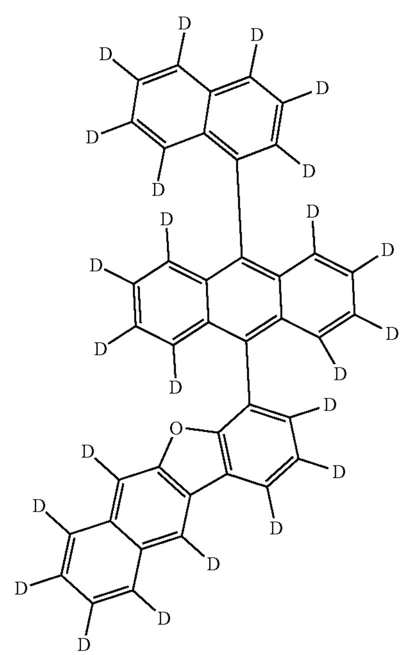

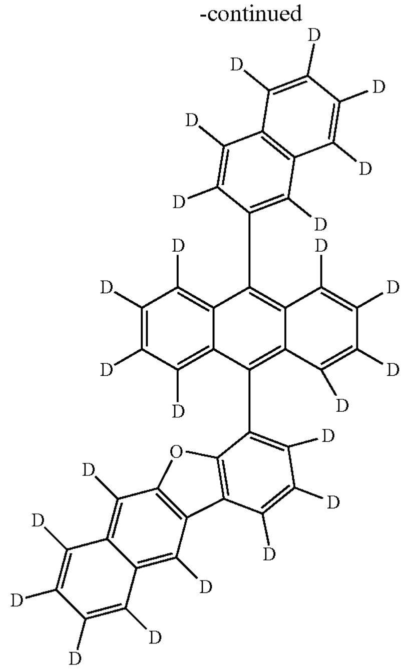
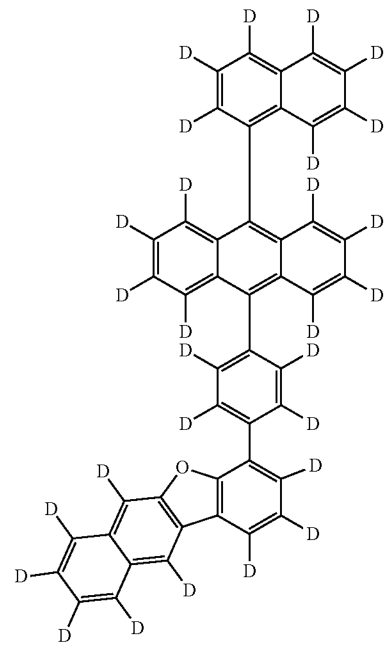
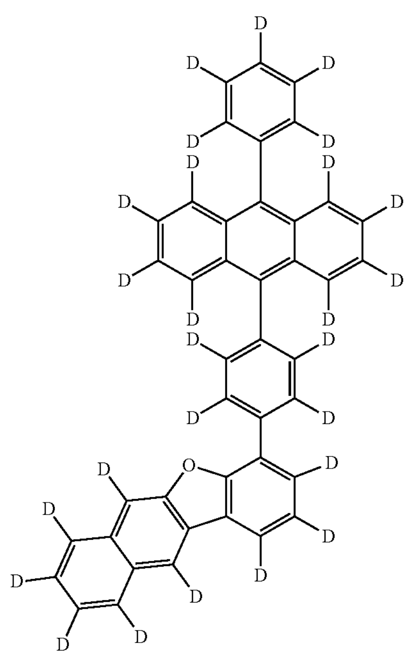
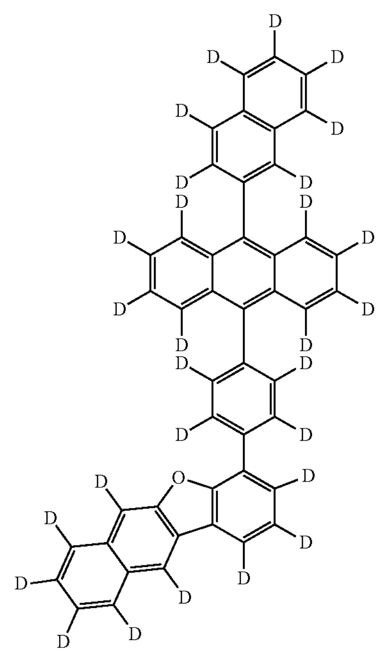

-continued
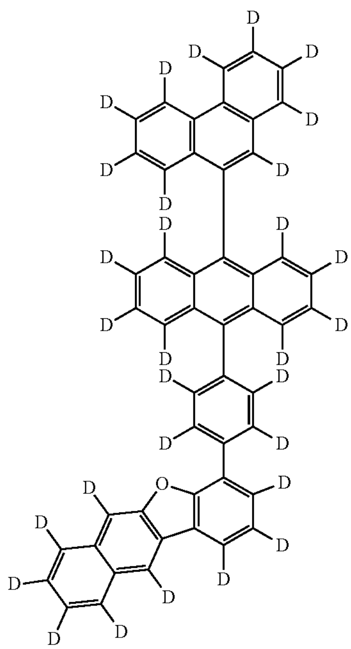
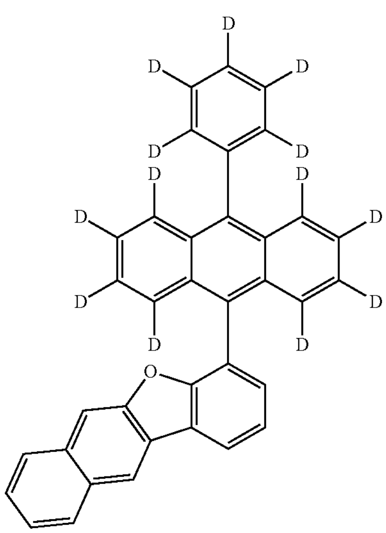
-continued
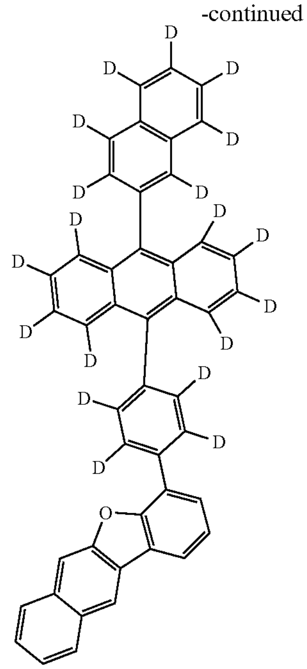
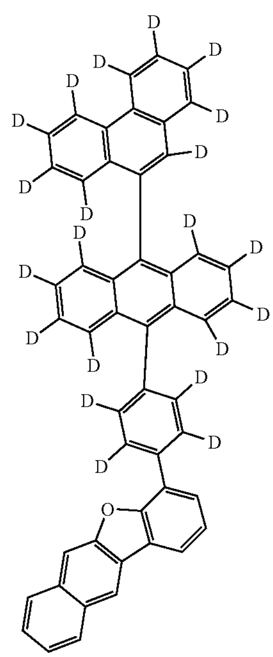

-continued
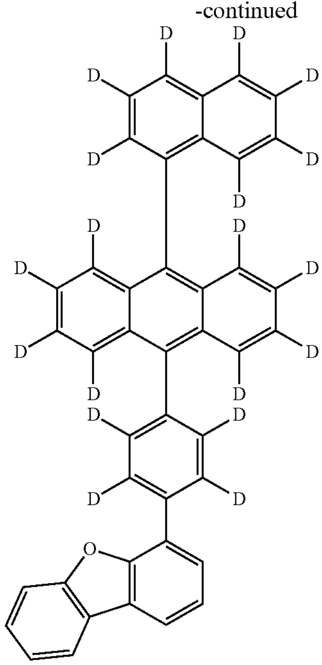
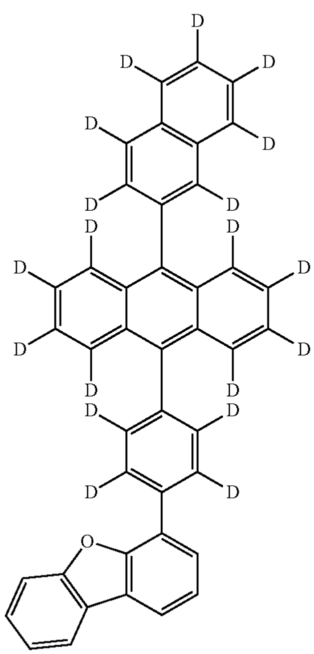
-continued
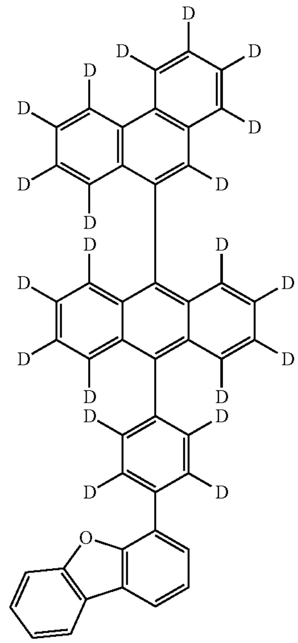
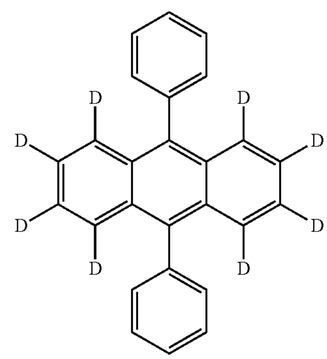
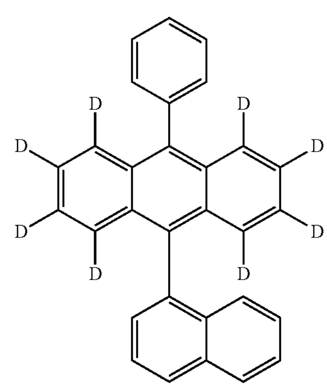

-continued
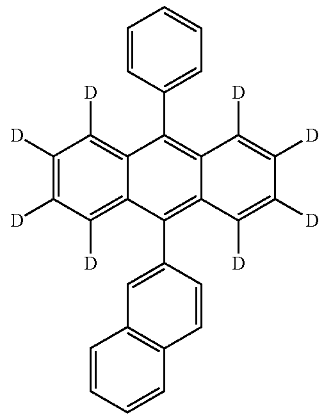
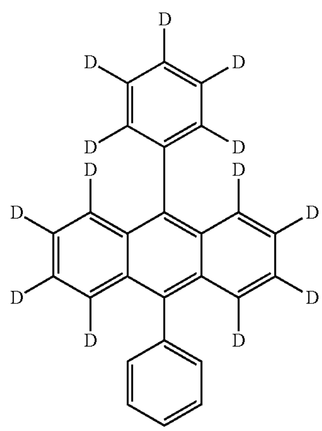
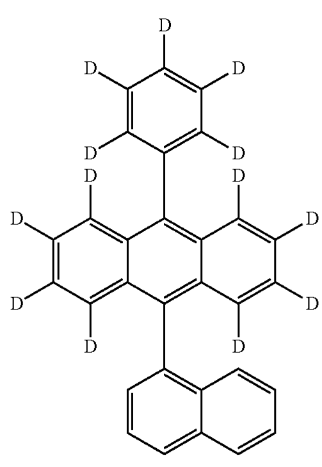
-continued
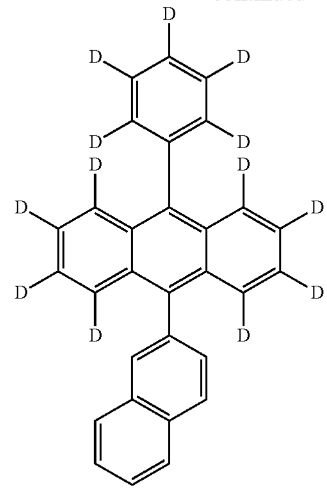
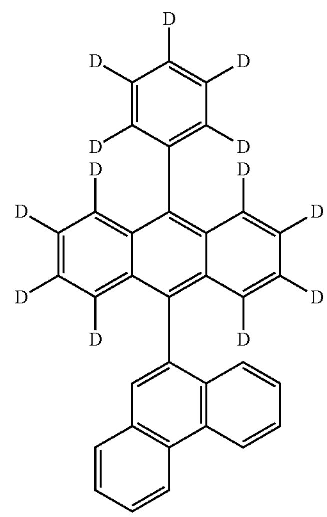
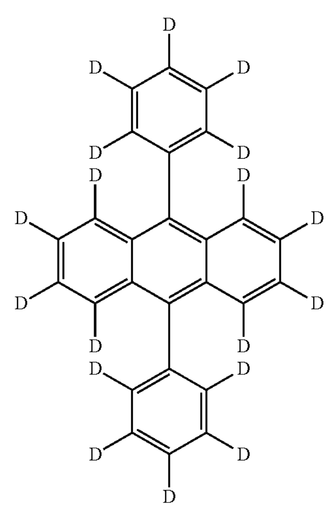

-continued
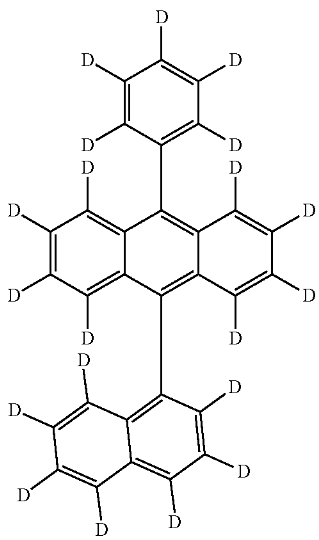
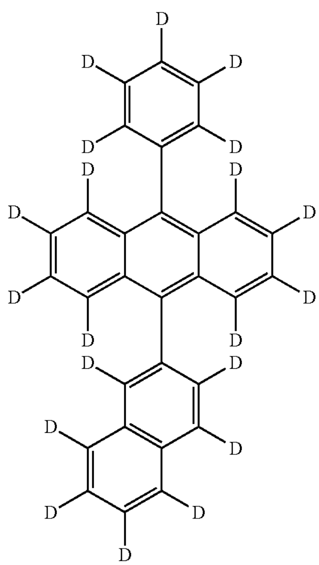
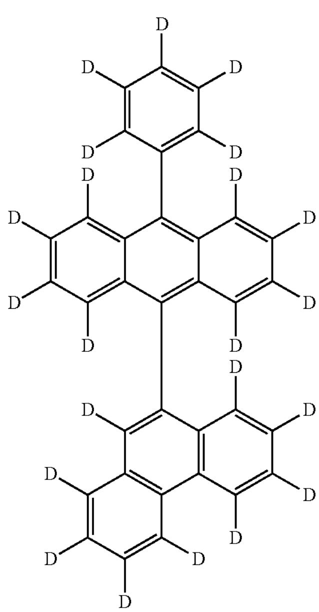
-continued
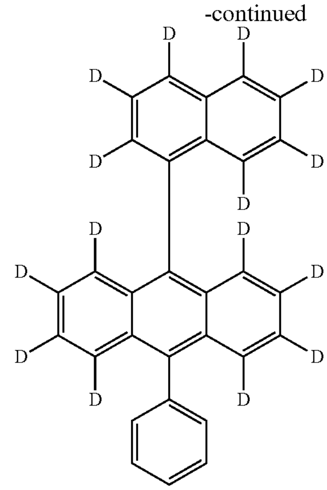
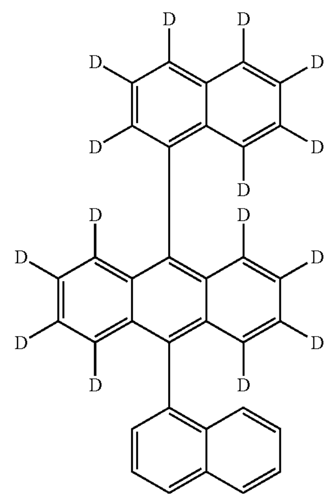
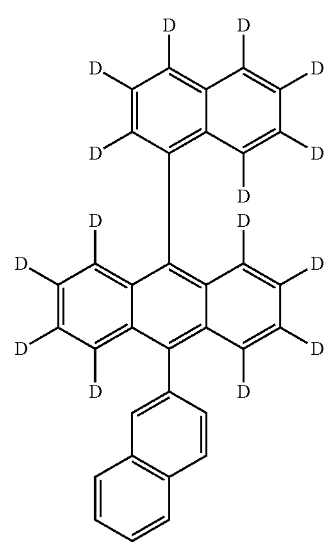

-continued
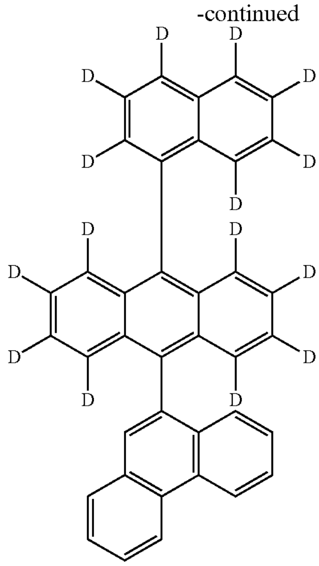
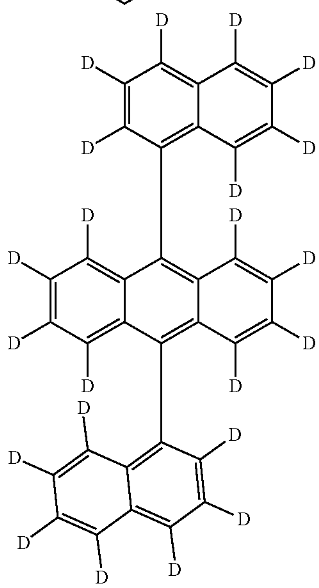
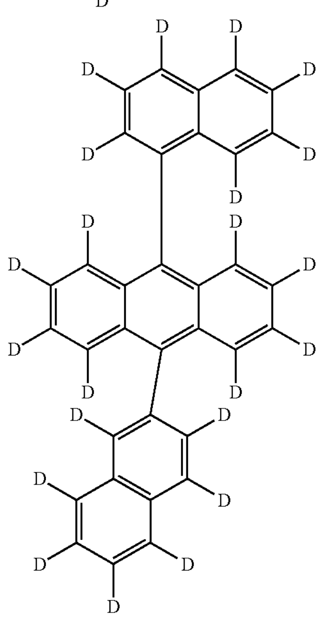
-continued
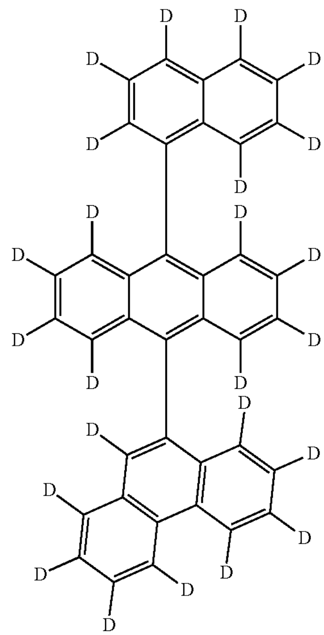
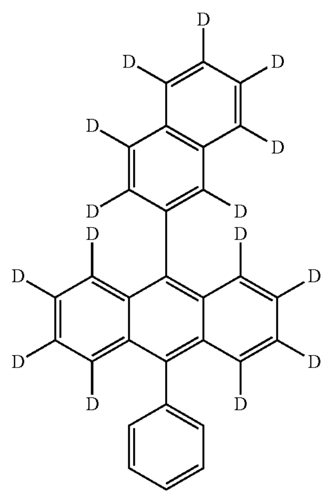
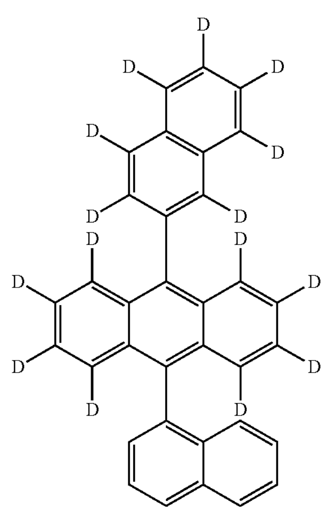

-continued
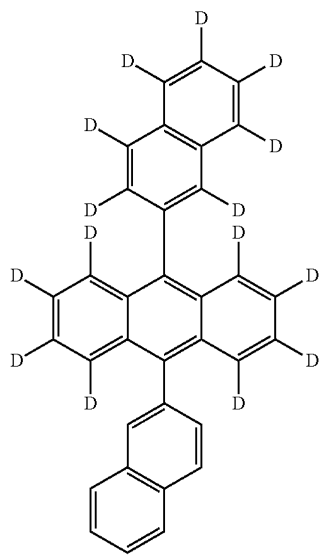
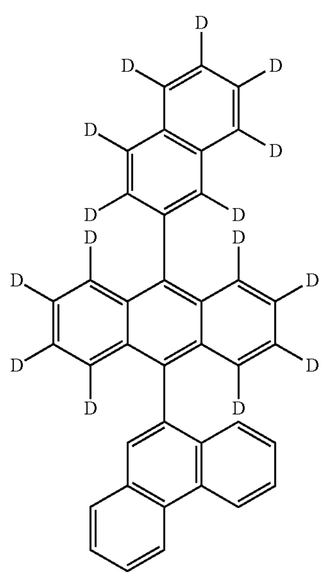
-continued
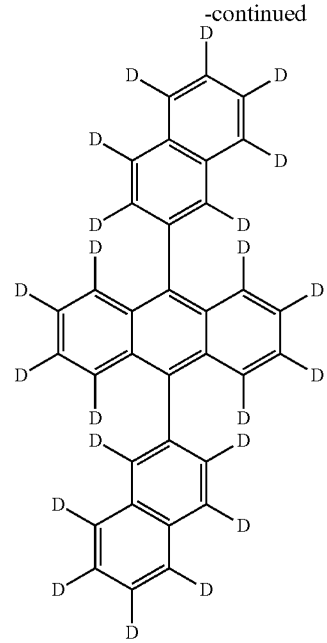
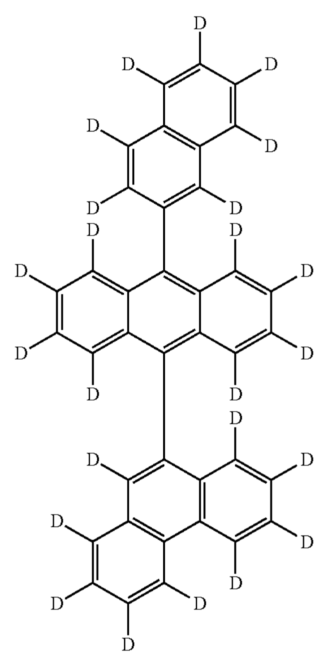

-continued
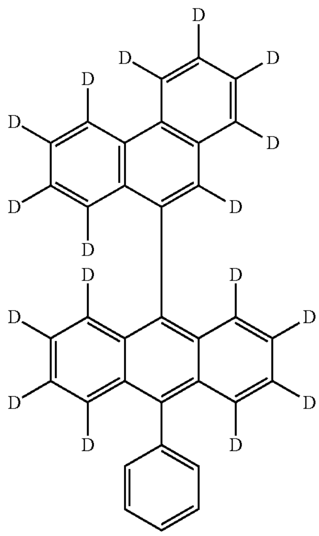
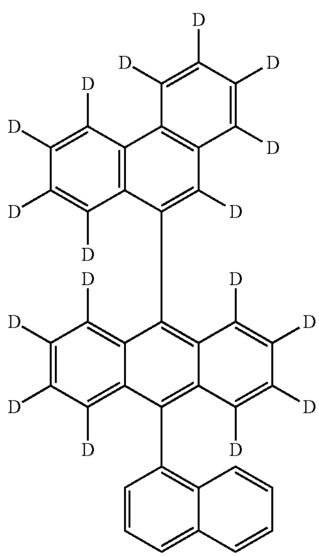
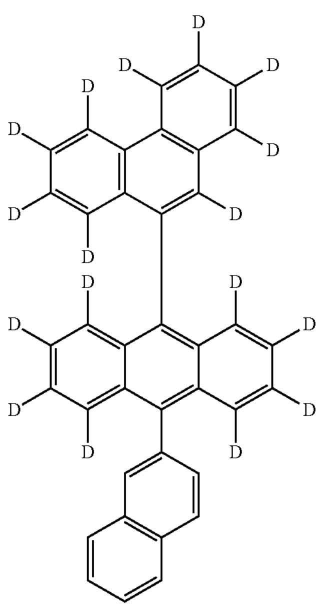
-continued
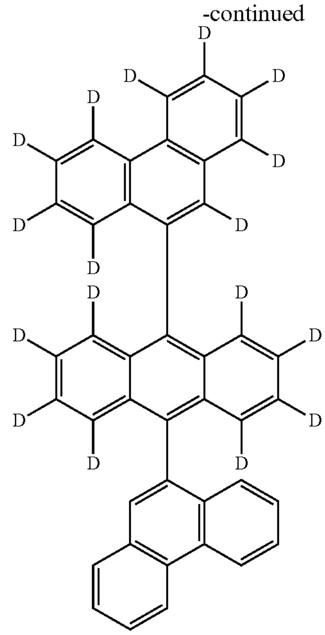
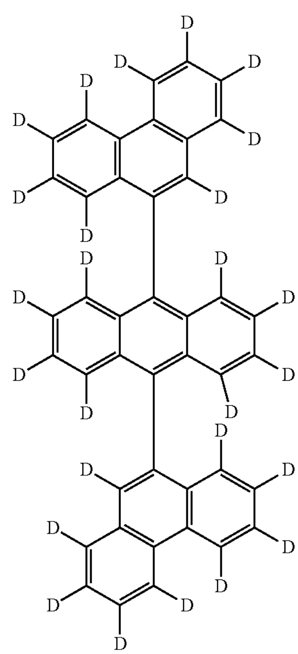

-continued
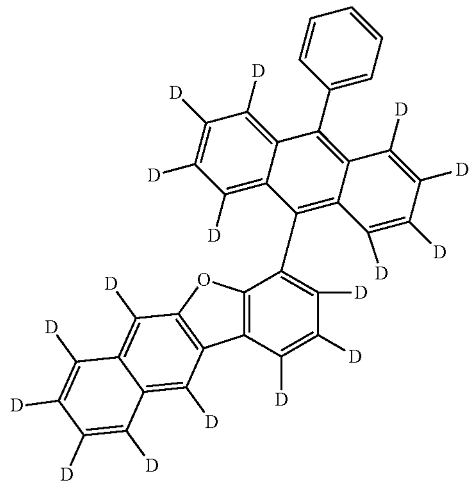
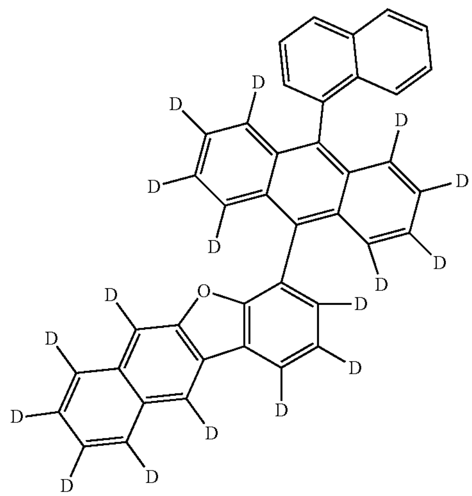
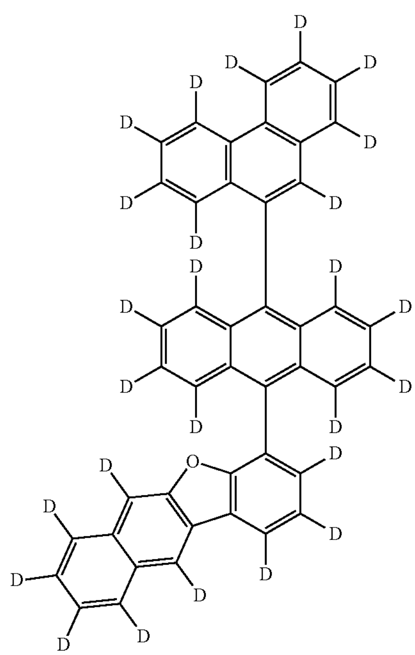
-continued
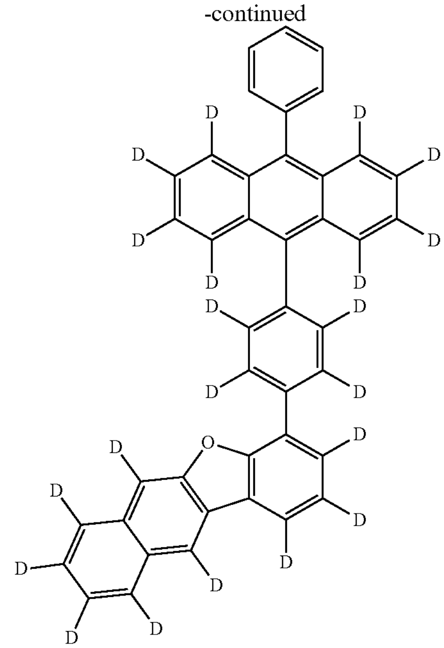
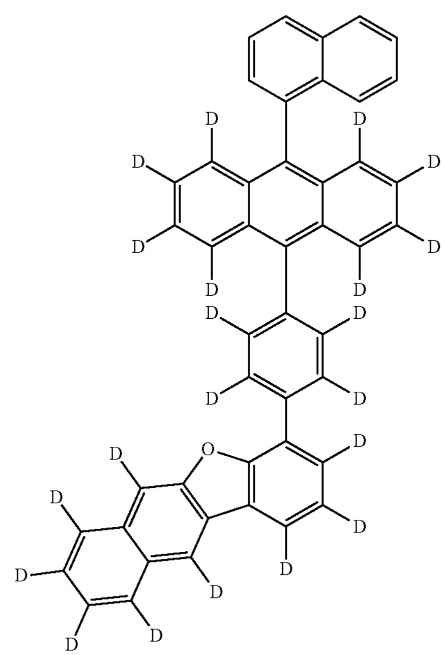

-continued
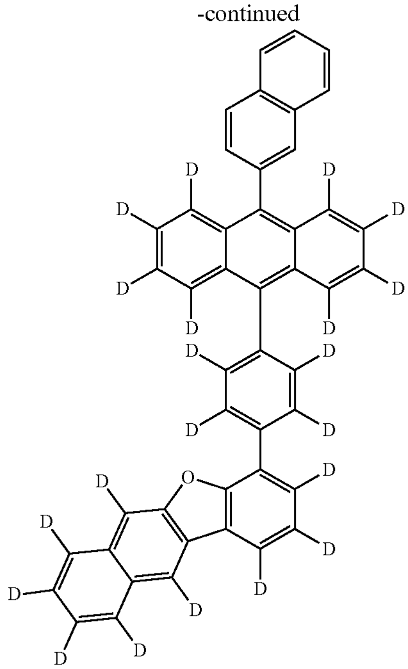
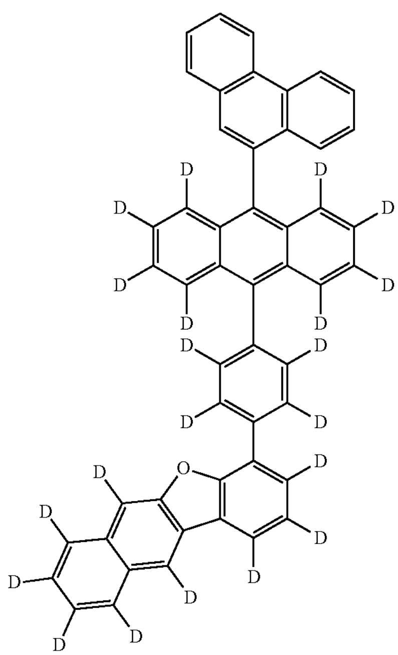
-continued
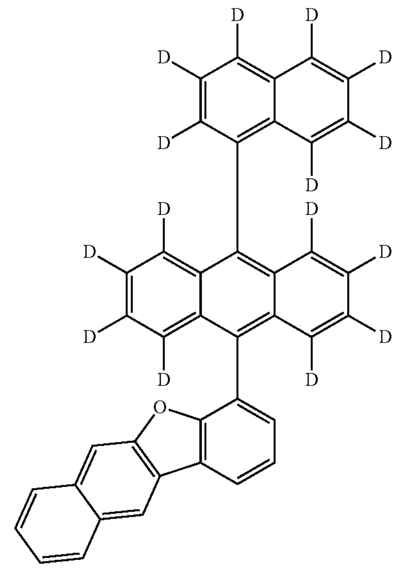
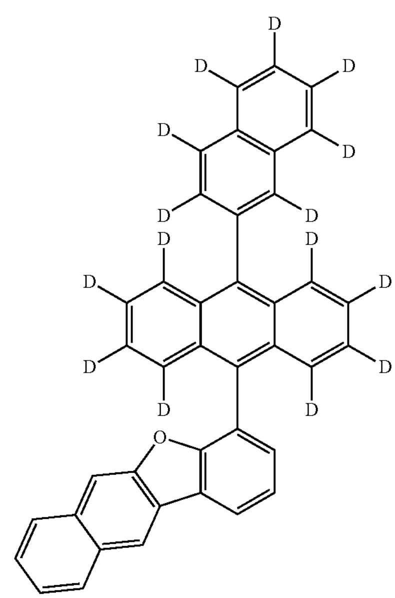

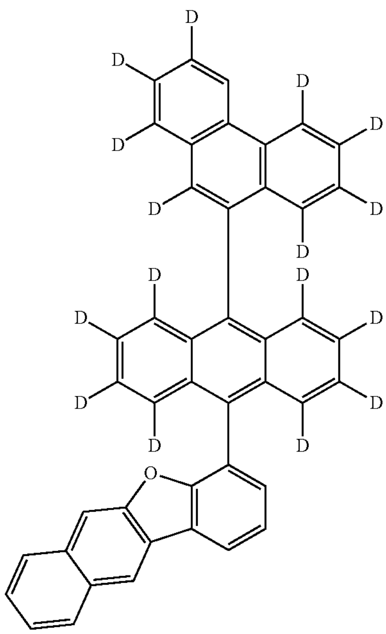

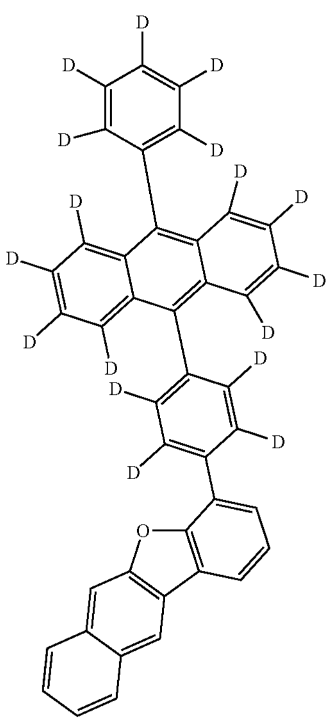

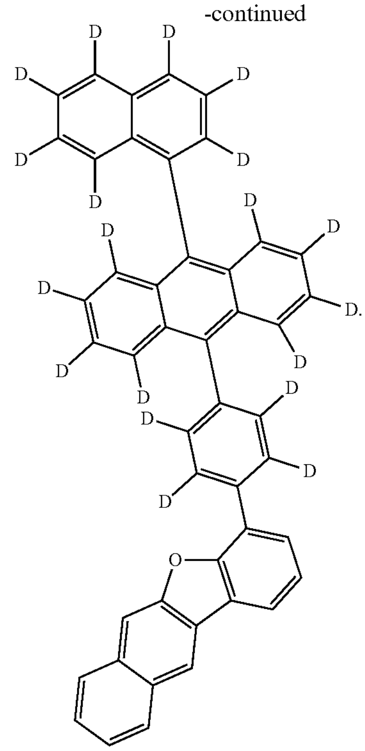

In an exemplary embodiment of the present specification, Y is O or S.

In an exemplary embodiment of the present specification, Y is O.

In an exemplary embodiment of the present specification, Y is S.

In an exemplary embodiment of the present specification, R21 to R24 are the same as or different from each other, and are each independently hydrogen, deuterium, a nitrile group, a substituted or unsubstituted alkyl group, a substituted or unsubstituted aryl group, or a substituted or unsubstituted heterocyclic group, or a Formula 3, or adjacent substituents are bonded to each other to form a substituted or unsubstituted ring, and at least one of R21 to R24 is of Formula 3.

In an exemplary embodiment of the present specification, R21 is of Formula 3.

In an exemplary embodiment of the present specification, R22 is of Formula 3.

In an exemplary embodiment of the present specification, R23 is of Formula 3.

In an exemplary embodiment of the present specification, R24 is of Formula 3.

In an exemplary embodiment of the present specification, R21 to R24 are the same as or different from each other, and are each independently hydrogen, deuterium, a nitrile group, a substituted or unsubstituted C1-C10 alkyl group, a substituted or unsubstituted C6-C30 aryl group, or a substituted or unsubstituted C6-C30 heterocyclic group, or of Formula 3, or adjacent substituents are bonded to each other to form a substituted or unsubstituted C3-C30 ring.

In an exemplary embodiment of the present specification, R21 to R24 are the same as or different from each other, and are each independently hydrogen, deuterium, a nitrile group, a C1-C10 alkyl group, or a C6-C30 aryl group which is unsubstituted or substituted with a nitrile group or a C1-C10 alkyl group, or of Formula 3, or adjacent substituents are bonded to each other to form a benzene ring.

In an exemplary embodiment of the present specification, R21 to R24 are the same as or different from each other, and are each independently hydrogen, deuterium, a nitrile group, a methyl group, an ethyl group, a propyl group, an isopropyl group, an n-butyl group, a sec-butyl group, a tert-butyl group, a phenyl group which is unsubstituted or substituted with a nitrile group, a methyl group, or a tert-butyl group, a biphenyl group, or a naphthyl group, or Formula 3, or adjacent substituents are bonded to each other to form a benzene ring.

In an exemplary embodiment of the present specification, one or more of R21 to R24 are of Formula 3, and the others are the same as or different from each other, and each independently hydrogen, deuterium, a nitrile group, a substituted or unsubstituted C1-C10 alkyl group, or a substituted or unsubstituted C6-C30 aryl group, or two of adjacent R21's, two of adjacent R22's, two of adjacent R23's, or two of adjacent R24's are bonded to each other to form a substituted or unsubstituted C3-C30 ring.

In an exemplary embodiment of the present specification, one or two of R21 to R24 is or are of Formula 3, and the others are the same as or different from each other, and are each independently hydrogen, deuterium, a nitrile group, a C1-C10 alkyl group, or a C6-C30 aryl group which is unsubstituted or substituted with a nitrile group, or two of adjacent R21's, or two of adjacent R22's are bonded to each other to form a benzene ring.

In an exemplary embodiment of the present specification, one or two of R21 to R24 is or are of Formula 3, and the others are the same as or different from each other, and are each independently hydrogen, deuterium, a nitrile group, a methyl group, an ethyl group, a propyl group, an isopropyl group, an n-butyl group, a sec-butyl group, a tert-butyl group, a phenyl group which is unsubstituted or substituted with a nitrile group, a methyl group, or a tert-butyl group, a biphenyl group, or a naphthyl group, or adjacent substituents are bonded to each other to form a benzene ring.

In an exemplary embodiment of the present specification, one or two of R21 to R24 is or are of Formula 3, and the others are the same as or different from each other, and are each independently hydrogen, deuterium, a nitrile group, a methyl group, a butyl group, a phenyl group which is unsubstituted or substituted with a nitrile group, a biphenyl group which is unsubstituted or substituted with a nitrile group, or a naphthyl group, or two of adjacent R21's, or two of adjacent R22's are bonded to each other to form a benzene ring.

In an exemplary embodiment of the present specification, R21's are bonded to each other to form a substituted or unsubstituted benzene ring.

In an exemplary embodiment of the present specification, R22's are bonded to each other to form a substituted or unsubstituted benzene ring.

In an exemplary embodiment of the present specification, R21's are bonded to each other to form a benzene ring.

In an exemplary embodiment of the present specification, R22's are bonded to each other to form a benzene ring.

In an exemplary embodiment of the present specification, r21 to r24 are the same as or different from each other, and each independently an integer from 0 to 4, and when r21 is 2 or higher, the R21s are the same as or different from each other, and when r22 is 2 or higher, the R22s are the same as or different from each other, and when r23 is 2 or higher, the R23s are the same as or different from each other, and when r24 is 2 or higher, the R24s are the same as or different from each other.

In an exemplary embodiment of the present specification, r21 to r24 are the same as or different from each other, and are each independently 0 to 2.

In an exemplary embodiment of the present specification, X1 is N or C(R31).

In an exemplary embodiment of the present specification, X2 is N or C(R32).

In an exemplary embodiment of the present specification, X3 is N or C(R33).

In an exemplary embodiment of the present specification, one or more of X1 to X3 are N.

In an exemplary embodiment of the present specification, two or more of X1 to X3 are N.

In an exemplary embodiment of the present specification, X1 to X3 are all N.

In an exemplary embodiment of the present specification, X1 is N, X2 is N, and X3 is C(R33). In another exemplary embodiment, R33 is bonded to Ar2 to form a benzene ring.

In an exemplary embodiment of the present specification, X1 is N, X2 is C(R32), and X3 is N. In another exemplary embodiment, R33 is bonded to Ar2 to form a benzene ring.

In an exemplary embodiment of the present specification, R31, R32, and R33 are the same as or different from each other, and are each independently hydrogen, deuterium, a substituted or unsubstituted aryl group, or a substituted or unsubstituted heterocyclic group, or are bonded to Ar1 or Ar2 to form a substituted or unsubstituted aromatic hydrocarbon ring or a substituted or unsubstituted hetero ring.

In an exemplary embodiment of the present specification, R31, R32, and R33 are the same as or different from each other, and are each independently hydrogen, deuterium, a substituted or unsubstituted C6-C30 aryl group, or a substituted or unsubstituted C2-C30 heterocyclic group, or are bonded to Ar1 or Ar2 to form a substituted or unsubstituted C6-C30 aromatic hydrocarbon ring or a substituted or unsubstituted C2-C30 hetero ring. In another exemplary embodiment, the "substituted or unsubstituted" refers to being substituted with one substituent selected from the group consisting of deuterium, a C1-C10 alkyl group, a C6-C30 aryl group, and a C2-C30 heteroaryl group or a substituent in which two or more substituents selected from the group are linked, or having no substituent.

In an exemplary embodiment of the present specification, R31, R32, and R33 are the same as or different from each other, and are each independently hydrogen, deuterium, a substituted or unsubstituted monocyclic to tetracyclic aryl group, or a substituted or unsubstituted monocyclic to tetracyclic heterocyclic group, or are bonded to Ar1 or Ar2 to form a substituted or unsubstituted monocyclic to tetracyclic aromatic hydrocarbon ring, or a substituted or unsubstituted monocyclic to tetracyclic hetero ring. In another exemplary embodiment, the "substituted or unsubstituted" with respect to R31, R32, and R33 refers to being substituted with one substituent selected from the group consisting of deuterium, a C1-C10 alkyl group, a C6-C30 aryl group, and a C2-C30 heteroaryl group or a substituent in which two or more substituents selected from the group are linked, or having no substituent.

In an exemplary embodiment of the present specification, R31, R32, and R33 are the same as or different from each other, and are each independently hydrogen, deuterium, a phenyl group, a biphenyl group, a naphthyl group, a carbazole group, a phenylcarbazole group, or a benzocarbazole group, or are bonded to Ar1 or Ar2 to form a benzene ring which is unsubstituted or substituted with a C6-C30 aryl group or a C2-C30 heterocyclic group.

In an exemplary embodiment of the present specification, R31, R32, and R33 are each hydrogen or deuterium.

In an exemplary embodiment of the present specification, R31, R32, and R33 are hydrogen.

In an exemplary embodiment of the present specification, R31 is bonded to Ar1 to form a substituted or unsubstituted ring, a substituted or unsubstituted hydrocarbon ring, or a substituted or unsubstituted hetero ring.

In an exemplary embodiment of the present specification, R32 is bonded to Ar1 to form a substituted or unsubstituted ring, a substituted or unsubstituted hydrocarbon ring; or a substituted or unsubstituted hetero ring.

In an exemplary embodiment of the present specification, R32 is bonded to Ar2 to form a substituted or unsubstituted ring, a substituted or unsubstituted hydrocarbon ring, or a substituted or unsubstituted hetero ring.

In an exemplary embodiment of the present specification, R33 is bonded to Ar2 to form a substituted or unsubstituted ring, a substituted or unsubstituted hydrocarbon ring, or a substituted or unsubstituted hetero ring.

In an exemplary embodiment of the present specification, R31 is bonded to Ar1 to form a benzene ring which is unsubstituted or substituted with R41.

In an exemplary embodiment of the present specification, R32 is bonded to Ar1 to form a benzene ring which is unsubstituted or substituted with R41.

In an exemplary embodiment of the present specification, R32 is bonded to Ar2 to form a benzene ring which is unsubstituted or substituted with R41.

In an exemplary embodiment of the present specification, R33 is bonded to Ar2 to form a benzene ring which is unsubstituted or substituted with R41.

In an exemplary embodiment of the present specification, Ar1 and Ar2 are the same as or different from each other, and are each independently a substituted or unsubstituted aryl group, or a substituted or unsubstituted heterocyclic group, or are bonded to R31, R32, or R33 to form a substituted or unsubstituted aromatic hydrocarbon ring; or a substituted or unsubstituted hetero ring.

In an exemplary embodiment of the present specification, Ar1 and Ar2 are the same as or different from each other, and are each independently a C6-C30 aryl group which is unsubstituted or substituted with one selected from the group consisting of deuterium, a nitrile group, a C1-C10 alkyl group, a C1-C10 alkoxy group which is unsubstituted or substituted with a halogen group, a C6-C30 aryl group, and a C2-C20 heterocyclic group or a substituent in which two or more substituents selected from the group are linked; or a C6-C30 heterocyclic group which is unsubstituted or substituted with one selected from the group consisting of deuterium, a nitrile group, a C1-C10 alkyl group, a C1-C10 alkoxy group which is unsubstituted or substituted with a halogen group, a C6-C30 aryl group, and a C2-C20 heterocyclic group or a substituent in which two or more substituents selected from the group are linked.

In an exemplary embodiment of the present specification, Ar1 and Ar2 are the same as or different from each other, and are each independently a C6-C30 aryl group which is unsubstituted or substituted with one selected from the group consisting of deuterium, a nitrile group, a C1-C10 alkyl group, a C1-C10 alkoxy group which is unsubstituted or substituted with a halogen group, a C6-C30 aryl group, and a C2-C20 heterocyclic group or a substituent in which two or more substituents selected from the group are linked; or a C6-C30 heterocyclic group.

In an exemplary embodiment of the present specification, Ar1 and Ar2 are the same as or different from each other, and are each independently a C6-C30 aryl group which is unsubstituted or substituted with one selected from the group consisting of deuterium, a nitrile group, a C1-C10 alkyl group, a C1-C10 alkoxy group which is unsubstituted or substituted with a halogen group, a C6-C30 aryl group, and a C2-C20 heterocyclic group or a substituent in which two or more substituents selected from the group are linked.

In an exemplary embodiment of the present specification, Ar1 and Ar2 are the same as or different from each other, and are each independently a C6-C20 aryl group which is unsubstituted or substituted with one selected from the group consisting of deuterium, a nitrile group, a methyl group, a trifluoromethoxy group, a phenyl group, a naphthyl group, a dimethylfluorene group, a phenanthrenyl group, a phenalene group, a fluoranthenyl group, a pyridine group, a quinoline group, a carbazole group, a benzocarbazole group, a dibenzofuran group, and a dibenzothiophene group or a substituent in which two or more groups selected from the group are linked; or a C2-C20 heterocyclic group which is unsubstituted or substituted with one selected from the group consisting of deuterium, a nitrile group, a methyl group, a trifluoromethoxy group, a phenyl group, a naphthyl group, a dimethylfluorene group, a phenanthrenyl group, a phenalene group, a fluoranthenyl group, a pyridine group, a quinoline group, a carbazole group, a benzocarbazole group, a dibenzofuran group, and a dibenzothiophene group or a substituent in which two or more groups selected from the group are linked.

In an exemplary embodiment of the present specification, Ar1 and Ar2 are the same as or different from each other, and are each independently a C6-C20 aryl group which is unsubstituted or substituted with one selected from the group consisting of deuterium, a nitrile group, a methyl group, a trifluoromethoxy group, a phenyl group, a naphthyl group, a dimethylfluorene group, a phenanthrenyl group, a phenalene group, a fluoranthenyl group, a pyridine group, a quinoline group, a carbazole group, a benzocarbazole group, a dibenzofuran group, and a dibenzothiophene group or a substituent in which two or more groups selected from the group are linked.

In an exemplary embodiment of the present specification, Ar1 and Ar2 are the same as or different from each other, and are each independently an aryl group which is unsubstituted or substituted with R41, or a heterocyclic group which is unsubstituted or substituted with R42, or are bonded to R31, R32, or R33 to form an aromatic hydrocarbon ring which is unsubstituted or substituted with R41; or a hetero ring which is unsubstituted or substituted with R42.

In an exemplary embodiment of the present specification, Ar1 and Ar2 are the same as or different from each other, and are each independently a C6-C30 aryl group which is unsubstituted or substituted with R41, or a C2-C30 heterocyclic group which is unsubstituted or substituted with R42, or are bonded to R31, R32, or R33 to form a C6-C30 aromatic hydrocarbon ring which is unsubstituted or substituted with R41 or a C2-C30 hetero ring which is unsubstituted or substituted with R42.

In an exemplary embodiment of the present specification, Ar1 and Ar2 are the same as or different from each other, and are each independently a C6-C20 aryl group which is unsubstituted or substituted with R41, or a C2-C20 heterocyclic group which is unsubstituted or substituted with R42, or are bonded to R31, R32, or R33 to form a C6-C20 aromatic hydrocarbon ring which is unsubstituted or substituted with R41 or a C2-C20 hetero ring which is unsubstituted or substituted with R42.

In an exemplary embodiment of the present specification, Ar1 and Ar2 are the same as or different from each other, and are each independently a monocyclic to pentacyclic aryl group which is unsubstituted or substituted with R41, or a monocyclic to pentacyclic heterocyclic group which is unsubstituted or substituted with R42, or are bonded to R31, R32, or R33 to form a monocyclic to pentacyclic aromatic hydrocarbon ring which is unsubstituted or substituted with R41, or a monocyclic to pentacyclic hetero ring which is unsubstituted or substituted with R42.

In an exemplary embodiment of the present specification, Ar1 and Ar2 are the same as or different from each other, and are each independently a monocyclic to tetracyclic aryl group which is unsubstituted or substituted with R41, or a monocyclic to tetracyclic heterocyclic group which is unsubstituted or substituted with R42, or are bonded to R31, R32, or R33 to form a monocyclic to tetracyclic aromatic hydrocarbon ring which is unsubstituted or substituted with R41, or a monocyclic to tetracyclic hetero ring which is unsubstituted or substituted with R42.

In an exemplary embodiment of the present specification, Ar1 and Ar2 are the same as or different from each other, and are each independently a monocyclic to tricyclic aryl group which is unsubstituted or substituted with R41, or a monocyclic to tricyclic heterocyclic group which is unsubstituted or substituted with R42, or are bonded to R31, R32, or R33 to form a monocyclic to tricyclic aromatic hydrocarbon ring which is unsubstituted or substituted with R41, or a monocyclic to tricyclic hetero ring which is unsubstituted or substituted with R42.

In an exemplary embodiment of the present specification, Ar1 and Ar2 are the same as or different from each other, and are each independently a phenyl group, a biphenyl group, a terphenyl group, a naphthyl group, a phenanthrenyl group, a triphenylene group, a fluoranthenyl group, a phenalene group, an anthracenyl group, a fluorenyl group, or a dimethylfluorenyl group, and the substituent is unsubstituted or substituted with R41.

In an exemplary embodiment of the present specification, Ar1 and Ar2 are the same as or different from each other, and are each independently a monocyclic to pentacyclic heterocyclic group which is unsubstituted or substituted with R42 and includes N, O, S, or Si.

In an exemplary embodiment of the present specification, Ar1 and Ar2 are the same as or different from each other, and are each independently a carbazole group, a phenylcarbazole group, a benzocarbazole group, an indenocarbazole group, a dibenzothiophene group, a dibenzofuran group, a dibenzosilole group, a phenoxazine group, a phenothiazine group, a phenazine group, an acridine group, a dihydrophenazine group, a dihydroacridine group, a pyridyl group, a pyrimidyl group, a quinoline group, an isoquinoline group, a quinazoline group, a pyridopyrimidine group, a pyridopyrazine group, a pyrimidoindole group, or a pyridoindole group, and the substituent is unsubstituted or substituted with R42.

In an exemplary embodiment of the present specification, Ar1 is bonded to R31 to form a substituted or unsubstituted ring, a substituted or unsubstituted hydrocarbon ring, or a substituted or unsubstituted hetero ring.

In an exemplary embodiment of the present specification, Ar1 is bonded to R32 to form a substituted or unsubstituted ring, a substituted or unsubstituted hydrocarbon ring, or a substituted or unsubstituted hetero ring.

In an exemplary embodiment of the present specification, Ar2 is bonded to R32 to form a substituted or unsubstituted ring, a substituted or unsubstituted hydrocarbon ring, or a substituted or unsubstituted hetero ring.

In an exemplary embodiment of the present specification, Ar2 is bonded to R33 to form a substituted or unsubstituted ring, a substituted or unsubstituted hydrocarbon ring, or a substituted or unsubstituted hetero ring.

In an exemplary embodiment of the present specification, Ar1 is bonded to R31 to form a benzene ring which is unsubstituted or substituted with R41.

In an exemplary embodiment of the present specification, Ar1 is bonded to R32 to form a benzene ring which is unsubstituted or substituted with R41.

In an exemplary embodiment of the present specification, Ar2 is bonded to R32 to form a benzene ring which is unsubstituted or substituted with R41.

In an exemplary embodiment of the present specification, Ar2 is bonded to R33 to form a benzene ring which is unsubstituted or substituted with R41.

In an exemplary embodiment of the present specification, R41 and R42 are the same as or different from each other, and are each independently one selected from the group consisting of deuterium, a halogen group, a nitrile group, an alkyl group, a haloalkyl group, an alkoxy group, a silyl group, an aryl group, and a heterocyclic group, or a group to which two or more substituents selected from the group are linked.

In an exemplary embodiment of the present specification, R41 and R42 are the same as or different from each other, and are each independently one selected from the group consisting of deuterium, a halogen group, a nitrile group, a C1-C20 alkyl group, a C1-C20 haloalkyl group, a C1-C20 alkoxy group, a C1-C50 silyl group, a C6-C50 aryl group, and a C2-C50 heterocyclic group, or a group to which two or more substituents selected from the group are linked.

In an exemplary embodiment of the present specification, R41 and R42 are the same as or different from each other, and are each independently one selected from the group consisting of deuterium, a halogen group, a nitrile group, a C1-C10 alkyl group, a C1-C10 haloalkyl group, a C1-C10 alkoxy group, a C1-C30 silyl group, a C6-C30 aryl group, and a C2-C30 heterocyclic group, or a group to which two or more substituents selected from the group are linked.

In an exemplary embodiment of the present specification, R41 and R42 are the same as or different from each other, and are each independently one selected from the group consisting of deuterium, a halogen group, a nitrile group, a C1-C5 alkyl group, a C1-C5 haloalkyl group, a C1-C5 alkoxy group, a C1-C20 silyl group, a C6-C20 aryl group, and a C2-C20 heterocyclic group, or a group to which two or more substituents selected from the group are linked.

In an exemplary embodiment of the present specification, R41 and R42 are the same as or different from each other, and are each independently one selected from the group consisting of deuterium, a halogen group, a nitrile group, a C1-C20 alkyl group, a C1-C20 haloalkyl group, a C1-C20 alkoxy group, a C1-C50 silyl group, a monocyclic to pentacyclic aryl group, and a monocyclic to pentacyclic heterocyclic group, or a group to which two or more substituents selected from the group are linked.

In an exemplary embodiment of the present specification, R41 and R42 are the same as or different from each other, and are each independently one selected from the group consisting of deuterium, a halogen group, a nitrile group, a C1-C10 alkyl group, a C1-C10 haloalkyl group, a C1-C10 alkoxy group, a C1-C30 silyl group, a monocyclic to tetracyclic aryl group, and a monocyclic to tetracyclic heterocyclic group, or a group to which two or more substituents selected from the group are linked.

In an exemplary embodiment of the present specification, R41 and R42 are the same as or different from each other, and are each independently one selected from the group consisting of deuterium, a halogen group, a nitrile group, a C1-C5 alkyl group, a C1-C5 haloalkyl group, a C1-C5 alkoxy group, a C1-C20 silyl group, a monocyclic to tricyclic aryl group, and a monocyclic to tricyclic heterocyclic group, or a group to which two or more substituents selected from the group are linked.

In an exemplary embodiment of the present specification, R41 and R42 are the same as or different from each other, and are each independently one selected from the group consisting of deuterium, a nitrile group, a methyl group, an ethyl group, a propyl group, an isopropyl group, an n-butyl group, a tert-butyl group, a trifluoromethyl group, a methoxy group, an ethoxy group, a trimethylsilyl group, a triphenylsilyl group, a phenyl group, a biphenyl group, a terphenyl group, a naphthyl group, a phenanthrenyl group, a triphenylene group, a fluoranthenyl group, a phenalene group, an anthracenyl group, a fluorenyl group, a dimethylfluorenyl group, a carbazole group, a phenylcarbazole group, a benzocarbazole group, an indenocarbazole group, a dibenzothiophene group, a dibenzofuran group, a dibenzosilole group, a phenoxazine group, a phenothiazine group, a phenazine group, an acridine group, a dihydrophenazine group, a dihydroacridine group, a pyridyl group, a pyrimidyl group, a quinoline group, an isoquinoline group, a quinazoline group, a pyridopyrimidine group, a pyridopyrazine group, a pyrimidoindole group, and a pyridoindole group, or a group in which two or more substituents selected from the group are linked.

In an exemplary embodiment of the present specification, L is a direct bond, a substituted or unsubstituted arylene group, or a substituted or unsubstituted divalent heterocyclic group.

In an exemplary embodiment of the present specification, L is a direct bond; a substituted or unsubstituted C6-C30 arylene group, or a substituted or unsubstituted C2-C30 divalent heterocyclic group.

In an exemplary embodiment of the present specification, L is a direct bond, a C6-C30 arylene group, or a C2-C30 divalent heterocyclic group. The arylene group or divalent heterocyclic group is unsubstituted or substituted with one selected from the group consisting of a nitrile group, a C1-C10 alkyl group, a C6-C30 aryl group, and a C2-C30 heterocyclic group is or a substituent in which two or more substituents selected from the group are linked.

In an exemplary embodiment of the present specification, L is a direct bond, a monocyclic to pentacyclic arylene group, or a monocyclic to pentacyclic divalent heterocyclic group. The arylene group or divalent heterocyclic group is unsubstituted or substituted with one selected from the group consisting of a nitrile group, a C1-C10 alkyl group, a C6-C30 aryl group, and a C2-C30 heterocyclic group or a substituent in which two or more substituents selected from the group are linked.

In an exemplary embodiment of the present specification, L is a direct bond, a monocyclic to tetracyclic arylene group, or a monocyclic to tetracyclic divalent heterocyclic group. The arylene group or divalent heterocyclic group is unsubstituted or substituted with one selected from the group consisting of a nitrile group, a C1-C10 alkyl group, a C6-C30 aryl group, and a C2-C30 heterocyclic group or a substituent in which two or more substituents selected from the group are linked.

In an exemplary embodiment of the present specification, L is a direct bond, a phenylene group, a biphenylene group, a terphenylene group, a naphthylene group, an anthracenylene group, a divalent phenathrenyl group, a divalent triphenylene group, a divalent fluoranthenyl group, a divalent phenalene group, a divalent fluorenyl group, a divalent dimethylfluorenyl group, a divalent carbazole group, a divalent phenylcarbazole group, a divalent benzocarbazole group, a divalent indenocarbazole group, a divalent dibenzothiophene group, a divalent dibenzofuran group, a divalent dibenzosilole group, a divalent phenoxazine group, a divalent phenothiazine group, a divalent phenazine group, a divalent acridine group, a divalent dihydrophenazine group, a divalent dihydroacridine group, a divalent pyridyl group, a divalent pyrimidyl group, a divalent quinoline group, a divalent isoquinoline group, a divalent quinazoline group, a divalent pyridopyrimidine group, a divalent pyridopyrazine group, a divalent pyrimidoindole group, or a divalent pyridoindole group. The aforementioned linking group (L) is unsubstituted or substituted with one selected from the group consisting of a nitrile group, a C1-C10 alkyl group, a C6-C30 aryl group, and a C2-C30 heterocyclic group or a substituent in which two or more substituents selected from the group are linked.

In an exemplary embodiment of the present specification, L is a direct bond, a C6-C30 arylene group, or a C2-C30 divalent heterocyclic group which is unsubstituted or substituted with a C1-C6 alkyl group.

In an exemplary embodiment of the present specification, L is a direct bond, a phenylene group, a biphenylene group, a terphenylene group, a naphthylene group, a divalent dibenzothiophene group, a divalent dibenzofuran group, or a divalent dimethylbenzosilole group.

In an exemplary embodiment of the present specification, L is a direct bond, a phenylene group, a biphenylene group, or a naphthylene group.

In an exemplary embodiment of the present specification, L is a direct bond.

In an exemplary embodiment of the present specification, m is an integer from 0 to 2.

In an exemplary embodiment of the present specification, m is 0 or 1.

In an exemplary embodiment of the present specification, m is 0.

In an exemplary embodiment of the present specification, r21 is an integer from 0 to 3.

In an exemplary embodiment of the present specification, r22 is an integer from 0 to 3.

In an exemplary embodiment of the present specification, r23 is an integer from 0 to 3.

In an exemplary embodiment of the present specification, r24 is an integer from 0 to 3.

In an exemplary embodiment of the present specification, r21 is an integer from 0 to 2.

In an exemplary embodiment of the present specification, r22 is an integer from 0 to 2.

In an exemplary embodiment of the present specification, r23 is an integer from 0 to 2.

In an exemplary embodiment of the present specification, r24 is an integer from 0 to 2.

In an exemplary embodiment of the present specification, r21 is 1.

In an exemplary embodiment of the present specification, r22 is 1.

In an exemplary embodiment of the present specification, r23 is 1.

In an exemplary embodiment of the present specification, r24 is 1.

In an exemplary embodiment of the present specification, r21 is 0.

In an exemplary embodiment of the present specification, r22 is 0.

In an exemplary embodiment of the present specification, r23 is 0.

In an exemplary embodiment of the present specification, r24 is 0.

In an exemplary embodiment of the present specification, Formula 3 is of any one of the following Formulae 301 to 303:

Formula 301

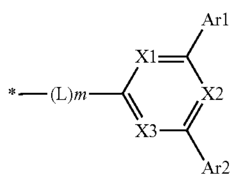

Formula 302

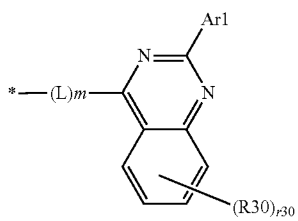

Formula 303

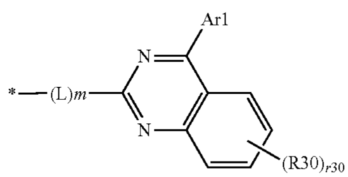

wherein in Formulae 301 to 303:

the definitions of L, m, Ar1, and Ar2 are the same as those defined in Formula 3;

one or more of X1 to X3 are N, and the others are CH or CD;

R30 is hydrogen, deuterium, a substituted or unsubstituted alkyl group, a substituted or unsubstituted aryl group, or a substituted or unsubstituted heteroaryl group; and r30 is an integer from 0 to 4, and when r30 is 2 or higher, the R30s are the same as or different from each other.

In an exemplary embodiment of the present specification, in Formula 301, X1 is N or C(R31), X2 is N or C(R32), X3 is N or C(R33), one or more of X1 to X3 are N, and R31, R32, and R33 are the same as or different from each other, and are each independently hydrogen, deuterium, a substituted or unsubstituted aryl group, or a substituted or unsubstituted heterocyclic group.

In an exemplary embodiment of the present specification, in Formula 301, R31, R32, and R33 are each hydrogen or deuterium.

In an exemplary embodiment of the present specification, in Formula 301, R31, R32, and R33 are hydrogen.

In an exemplary embodiment of the present specification, R30 is hydrogen, deuterium, a substituted or unsubstituted C1-10 alkyl group, or a substituted or unsubstituted C6-C30 aryl group, or a substituted or unsubstituted C2-C30 heterocyclic group.

In an exemplary embodiment of the present specification, R30 is hydrogen, a methyl group, a phenyl group, or a benzocarbazole group.

In an exemplary embodiment of the present specification, R30 is hydrogen or deuterium.

In an exemplary embodiment of the present specification, R30 is hydrogen.

In an exemplary embodiment of the present specification, Formula 2 is of any one of the following Formulae 201, 203, and 204:

Formula 201

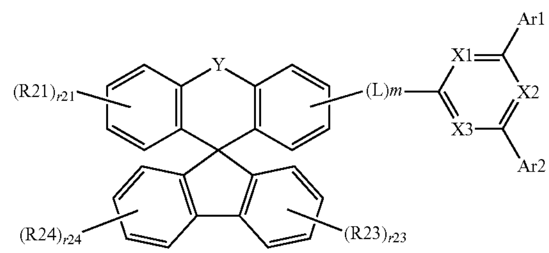

Formula 203

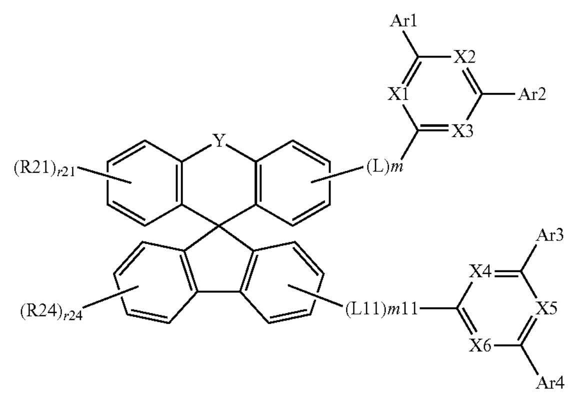

Formula 204

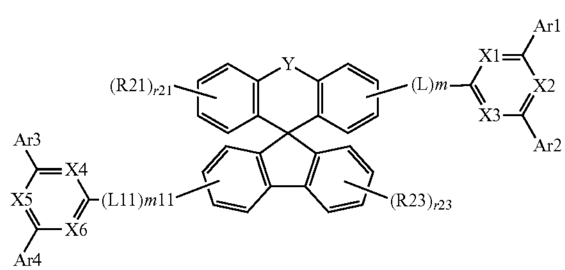

wherein in Formulae 201, 203, and 204:

the definitions of X1 to X3, L, m, Ar1, Ar2, R21, R23, and R24, r21, r23 and r24, and Y are the same as those defined in Formula 2;

X4 is N or C(R34), X5 is N or C(R35), X6 is N or C(R36), and one or more of X4 to X6 are N;

R34, R35, and R36 are the same as or different from each other, and are each independently hydrogen or deuterium, or are bonded to Ar3 or Ar4 to form a substituted or unsubstituted aromatic hydrocarbon ring or a substituted or unsubstituted hetero ring;

Ar3 and Ar4 are the same as or different from each other, and are each independently an aryl group which is unsubstituted or substituted with R43, or a heterocyclic group which is unsubstituted or substituted with R44, or are bonded to R34, R35, or R36 to form a substituted or unsubstituted aromatic hydrocarbon ring; or a substituted or unsubstituted hetero ring;

R43 and R44 are the same as or different from each other, and are each independently one selected from the group consisting of deuterium, a halogen group, a nitrile group, an alkyl group, a haloalkyl group, an alkoxy group, a silyl group, an aryl group, and a heterocyclic group, or a group in which two or more substituents selected from the group are linked;

L11 is a direct bond, a substituted or unsubstituted arylene group, or a substituted or unsubstituted divalent heterocyclic group;

m11 is an integer from 0 to 4, and when m11 is 2 or higher, the L11s are the same as or different from each other.

In an exemplary embodiment of the present specification,

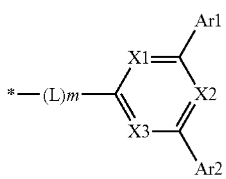

and

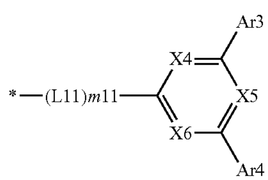

of Formulae 201, 203, and 204 can be any one of Formulae 301 to 303.

In an exemplary embodiment of the present specification, the above-described description of L can be applied to L11.

In an exemplary embodiment of the present specification, the above-described description on m can be applied to m11.

In an exemplary embodiment of the present specification, the above-described description on X1 to X3 can be applied to X4 to X6.

In an exemplary embodiment of the present specification, the above-described description on Ar1 and Ar2 can be applied to Ar3 and Ar4.

According to an exemplary embodiment of the present specification, Formula 2 is any one of the following Formulae 211 to 214:

Formula 211

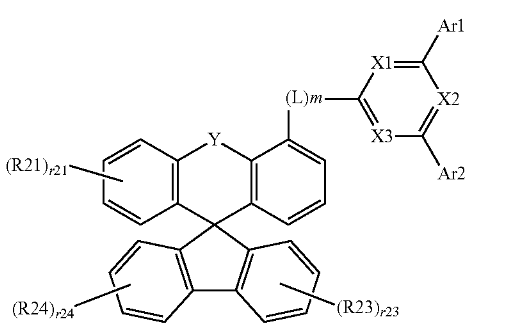

Formula 212

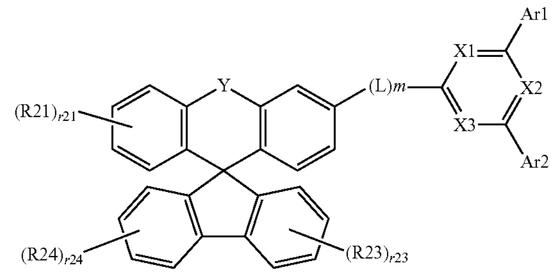

Formula 213

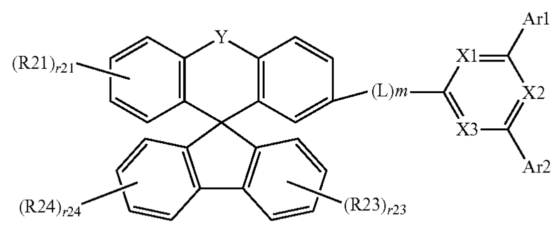

Formula 214

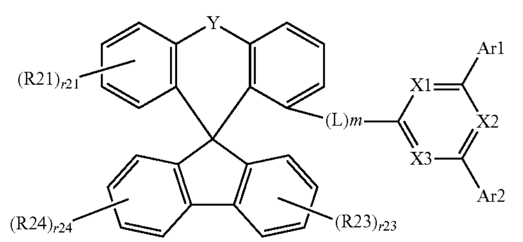

wherein in Formulae 211 to 214:

the definitions of X1 to X3, L, m, Ar1, Ar2, R21. R23 and R24, r21, r23 and r24, and Y are the same as those defined in Formula 2.

In an exemplary embodiment of the present specification, Formula 2 is any one of the following Formulae 401 to 403:

Formula 401

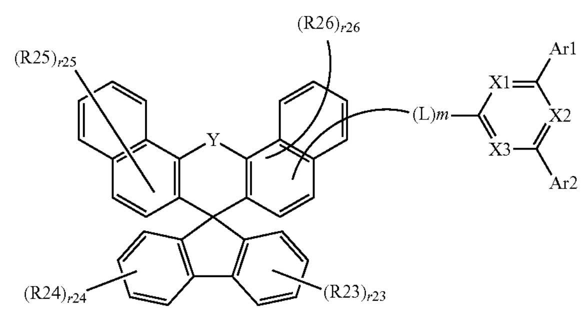

Formula 402

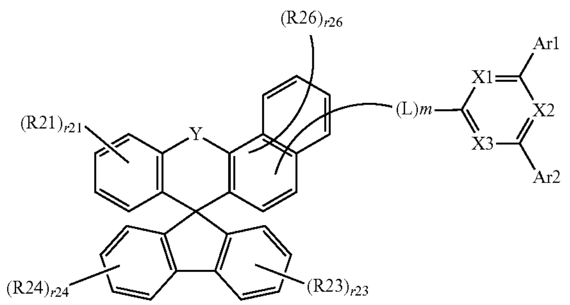

Formula 403

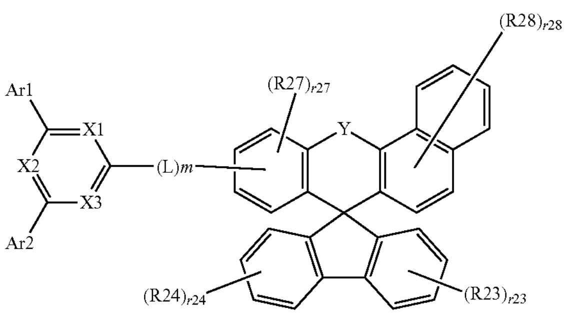

wherein in Formulae 401 to 403:

the definitions of X1 to X3, L, m, Ar1, Ar2, R21, R23, R24, r21, r23, r24, and Y are the same as those defined in Formula 2;

R25 to R28 are the same as or different from each other, and are each independently hydrogen, deuterium, a nitrile group, a substituted or unsubstituted alkyl group, a substituted or unsubstituted aryl group, or a substituted or unsubstituted heterocyclic group; and r25 and r28 are each an integer from 0 to 6, r26 is an integer from 0 to 5, r27 is an integer from 0 to 3, r28 and r26 are the same as or different from each other, and are each independently an integer from 0 to 6, and when r25 is 2 or higher, the R25s are the same as or different from each other, and when r26 is 2 or higher, the R26s are the same as or different from each other, and when r27 is 2 or higher, the R27s are the same as or different from each other, and when r28 is 2 or higher, the R28s are the same as or different from each other.

In an exemplary embodiment of the present specification, the above-described description of R21 to R24 can be applied to R25 to R28.

According to an exemplary embodiment of the present specification, the compound of Formula 2 is any one compound selected from the following compounds:

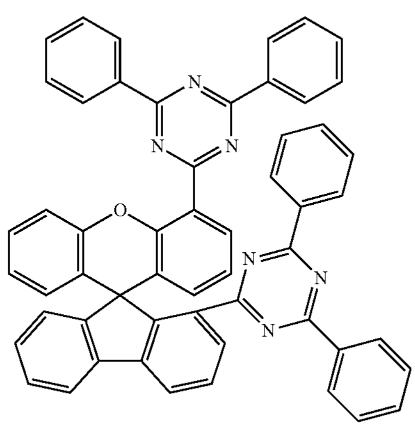

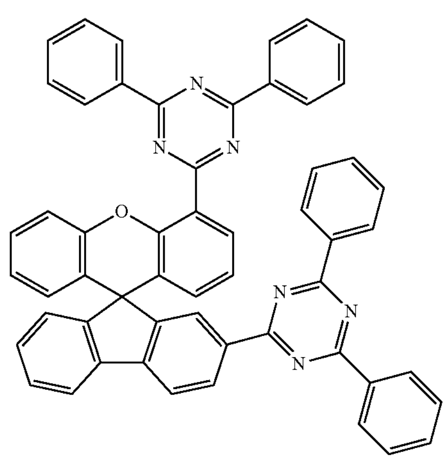

-continued
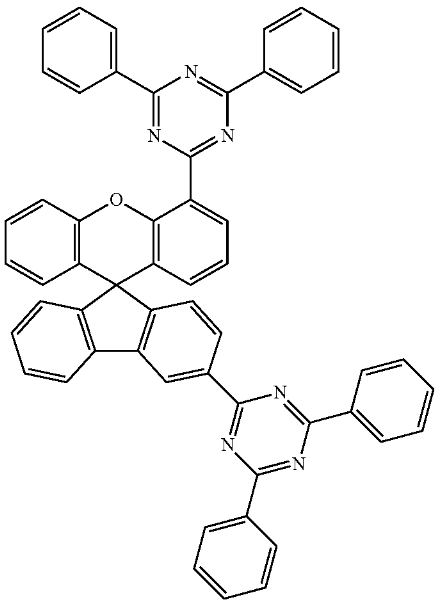
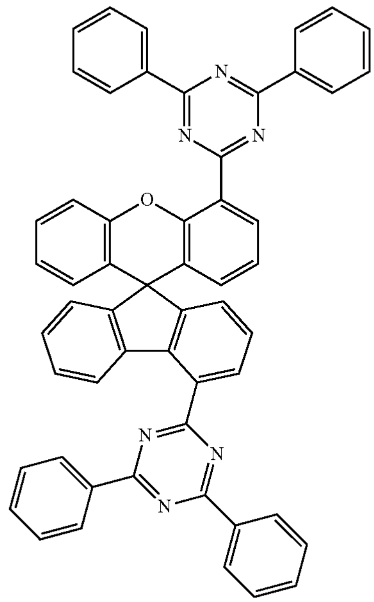
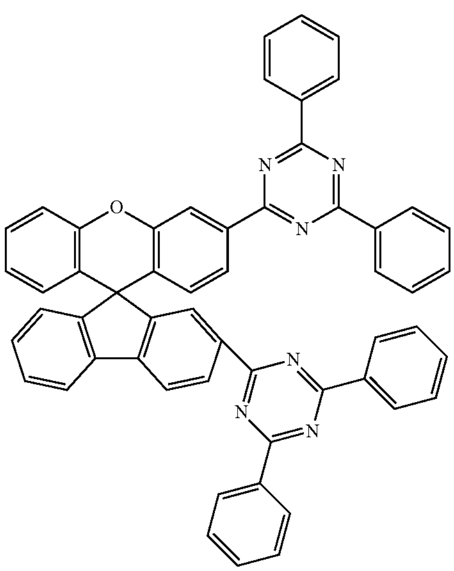
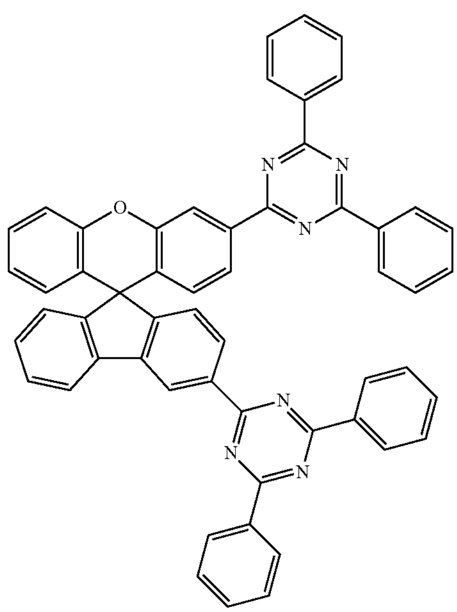

-continued
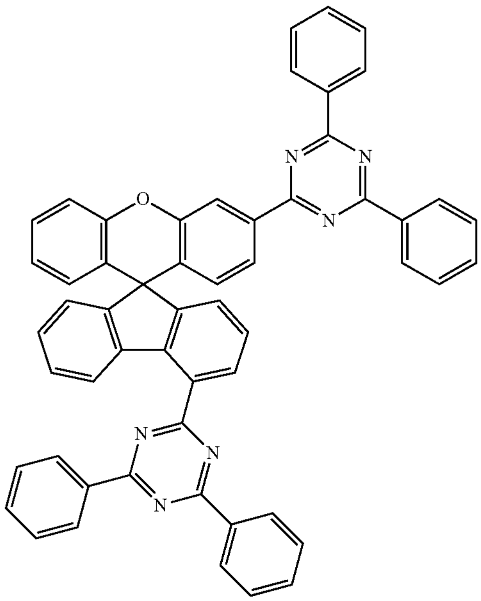
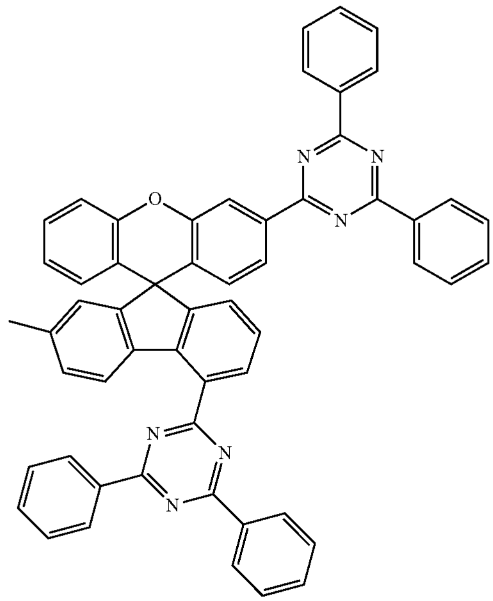
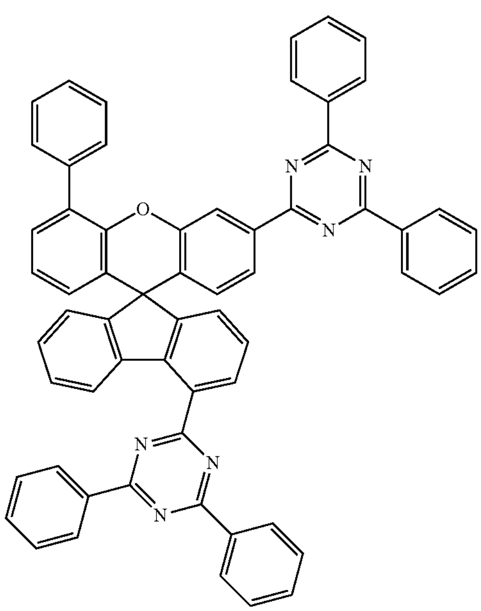
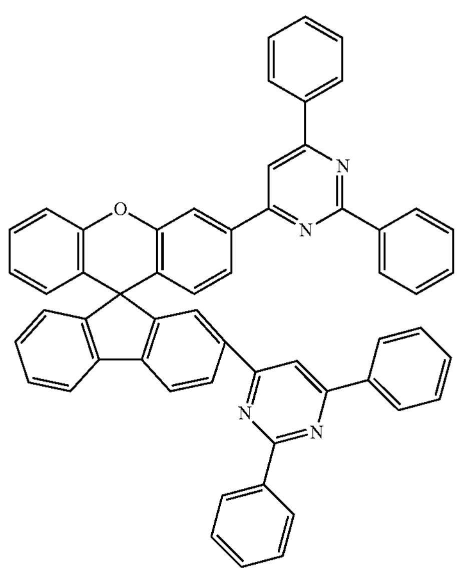

-continued
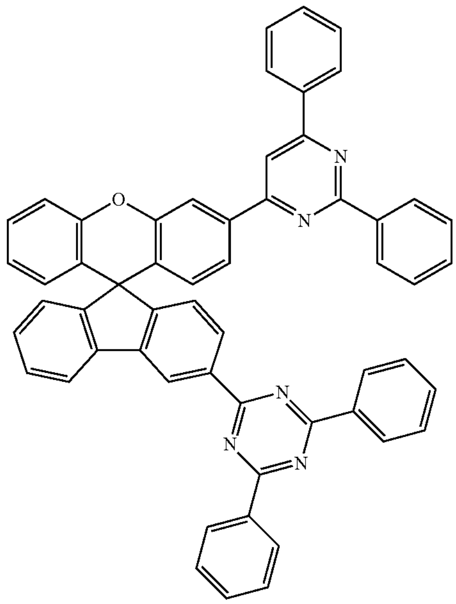
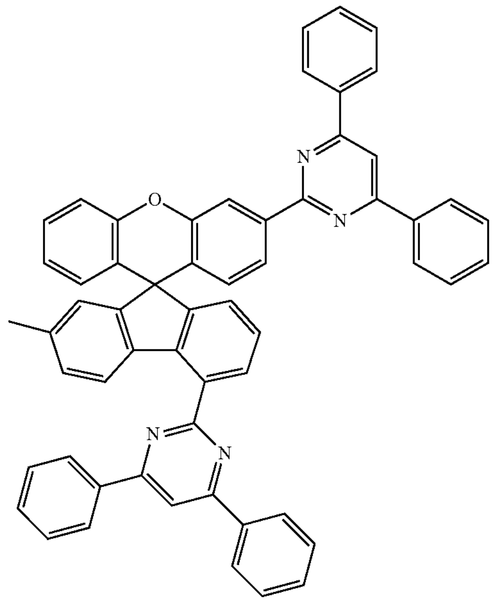
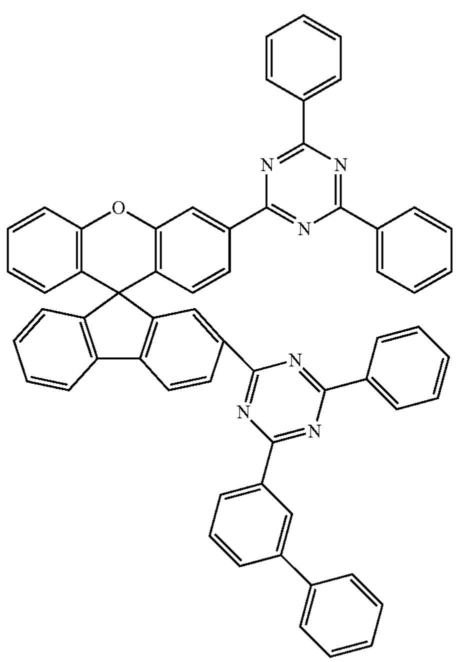
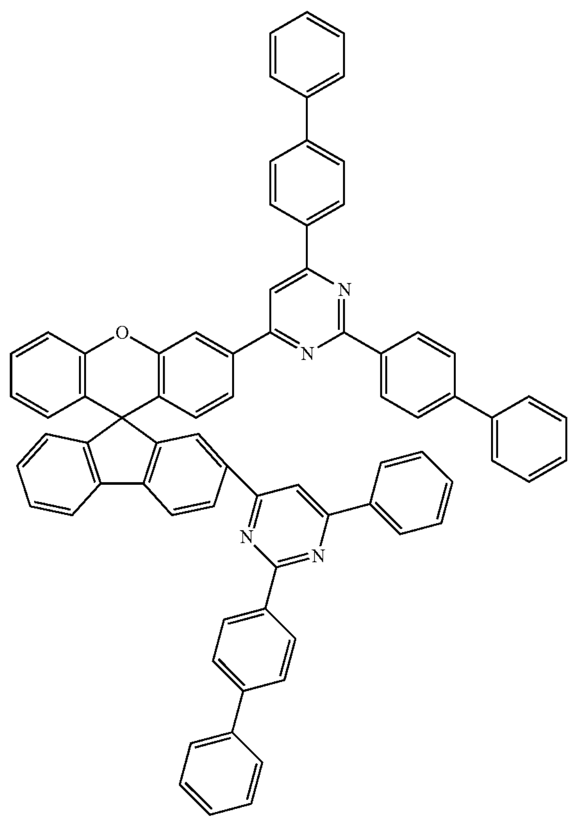

-continued
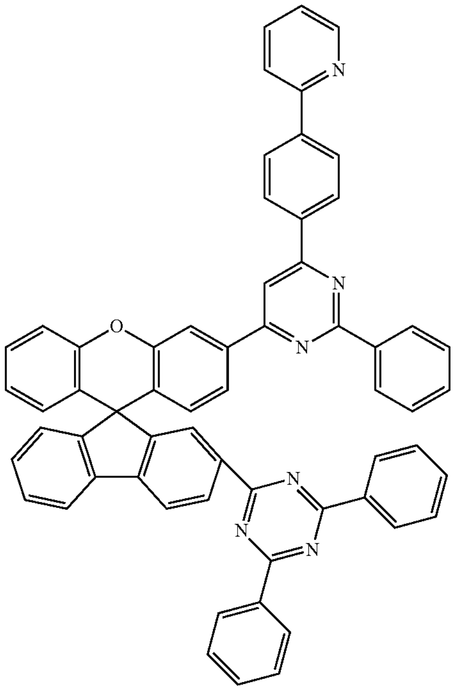
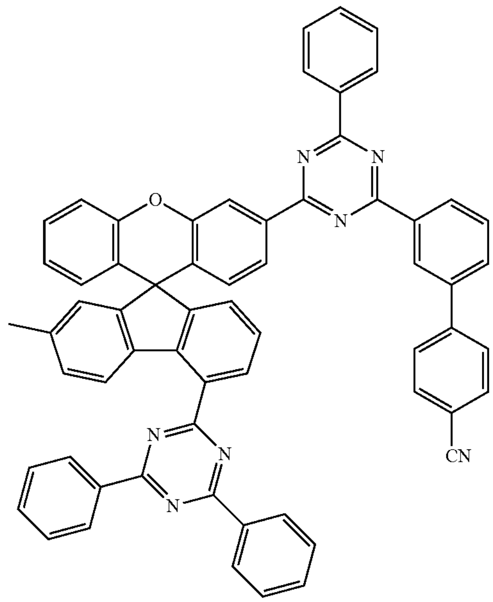
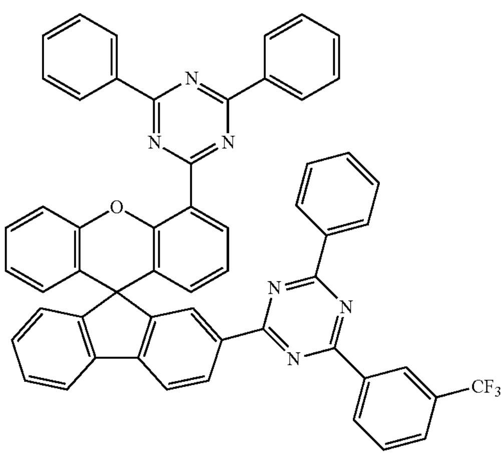
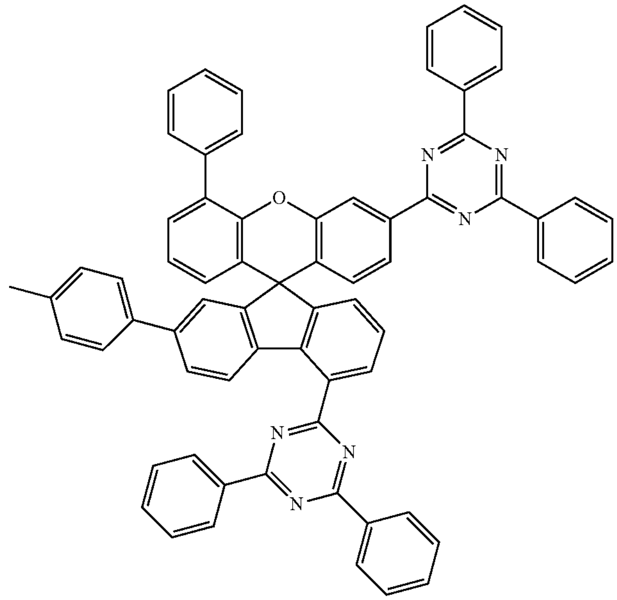

-continued
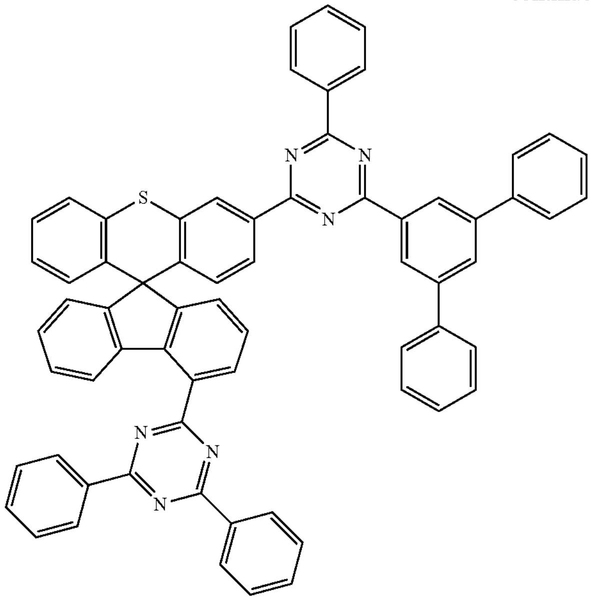
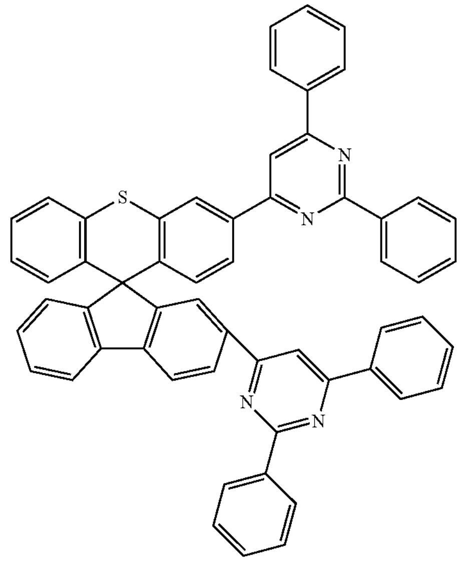
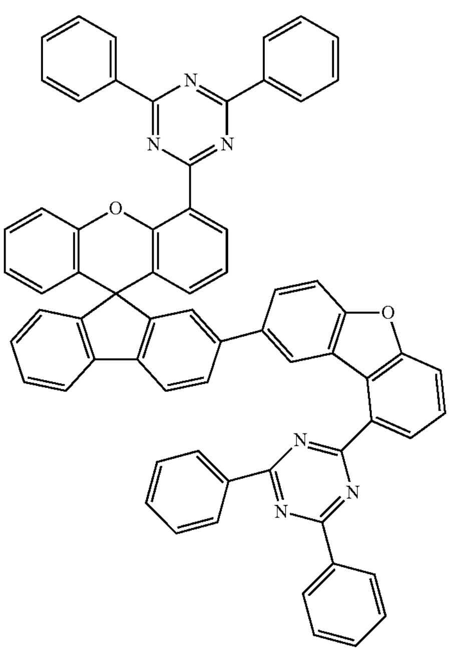
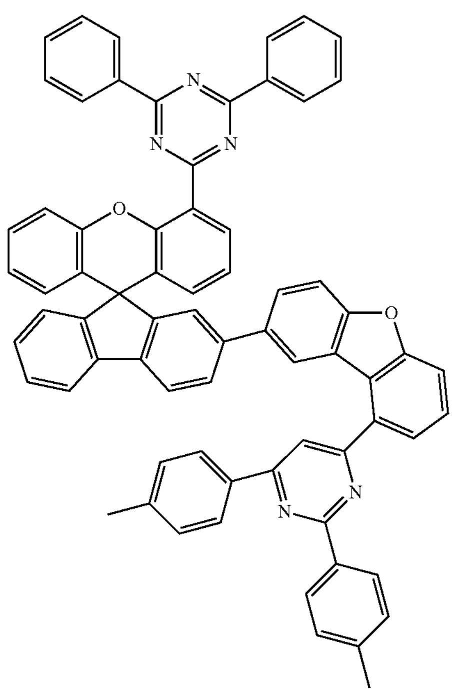

-continued
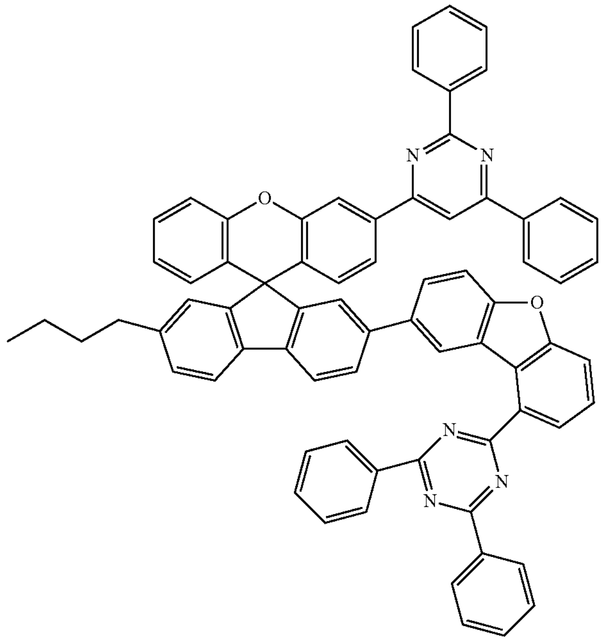
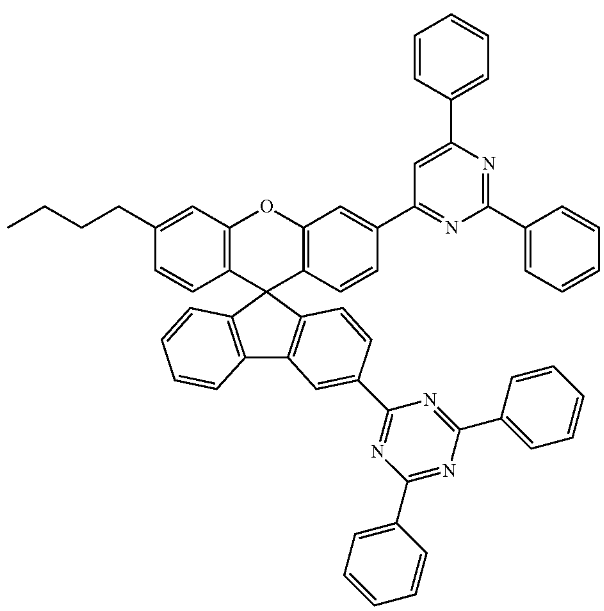

-continued
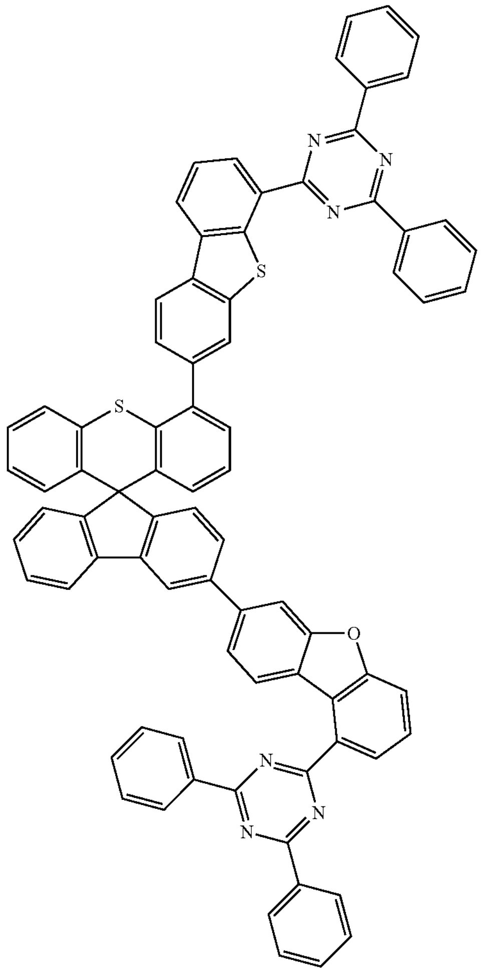
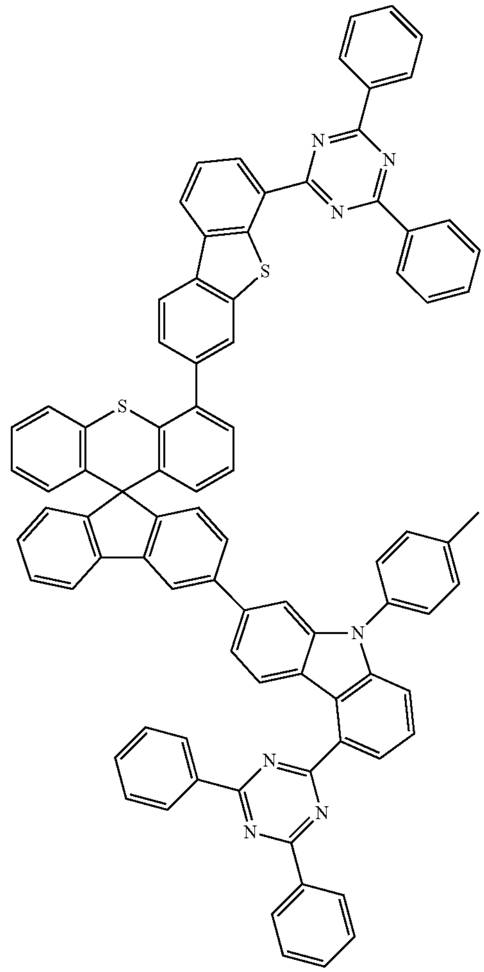

-continued
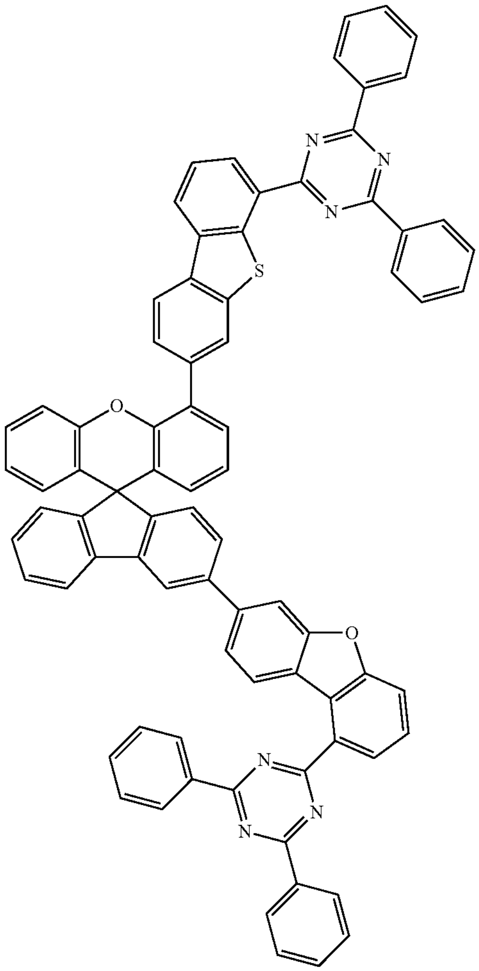
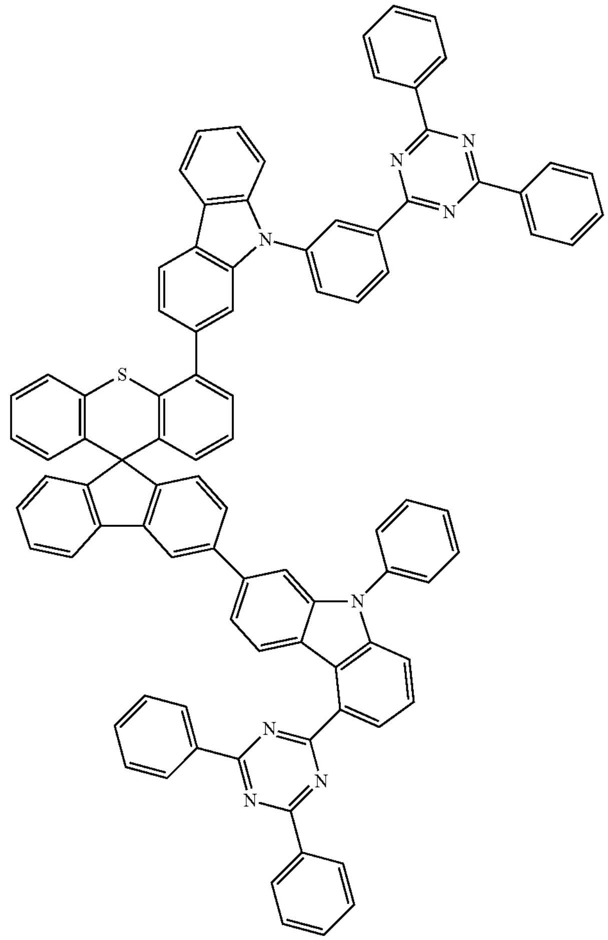
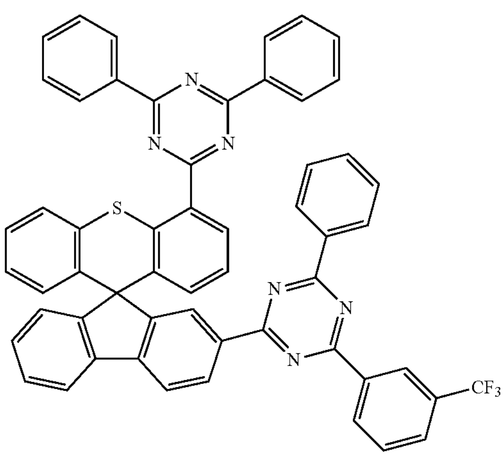
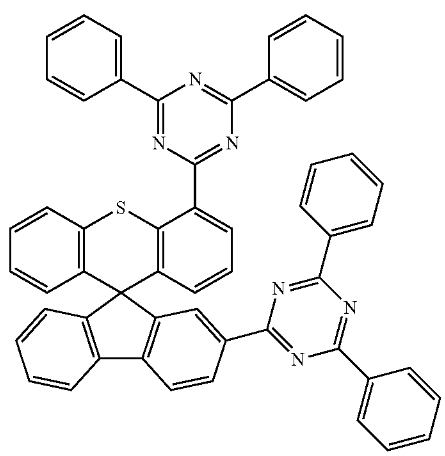

-continued
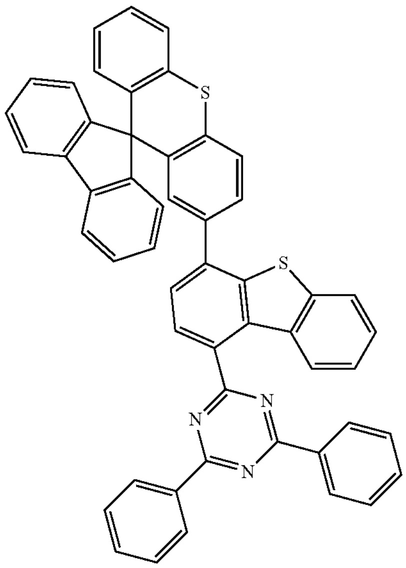
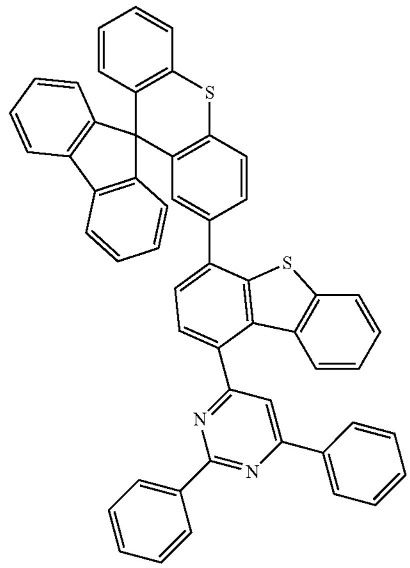
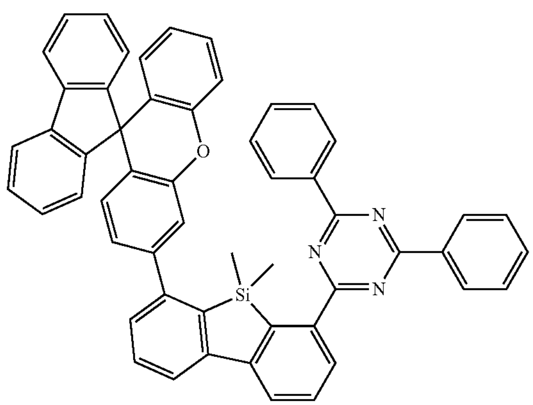
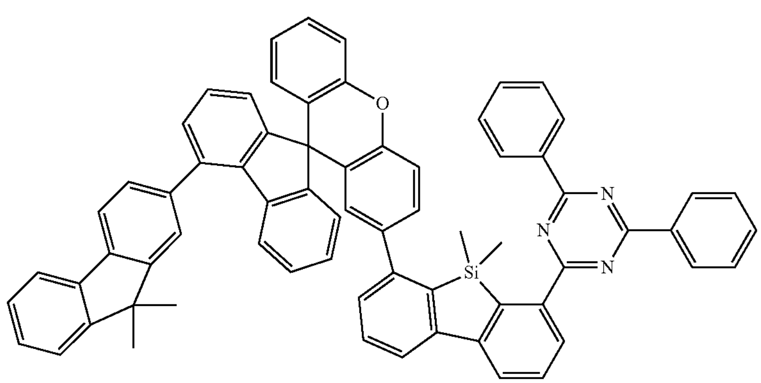

-continued
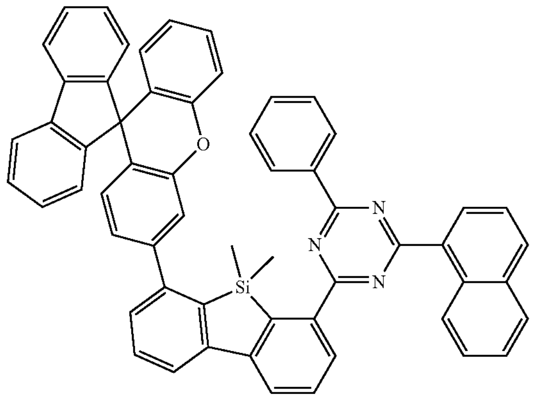
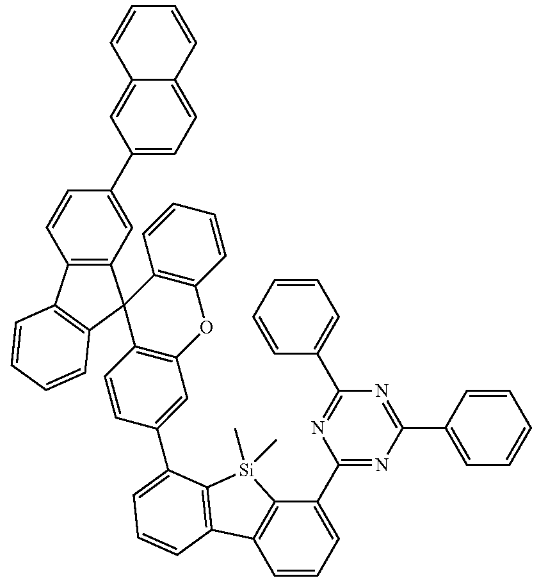
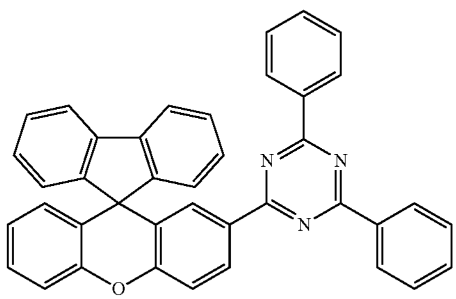
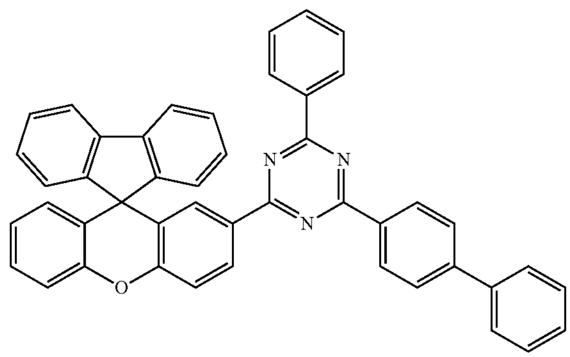
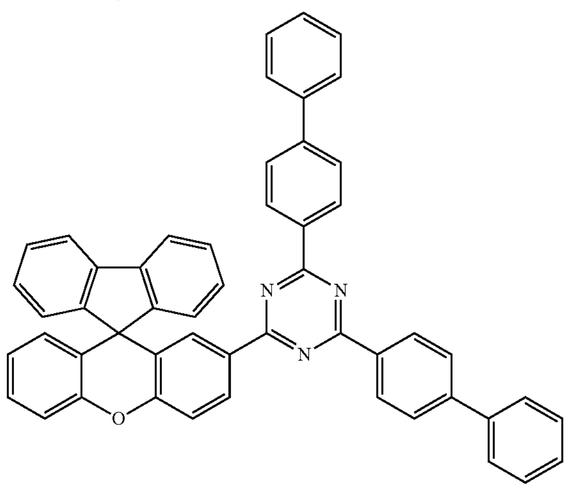
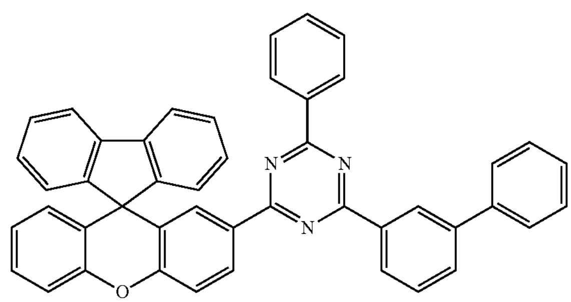
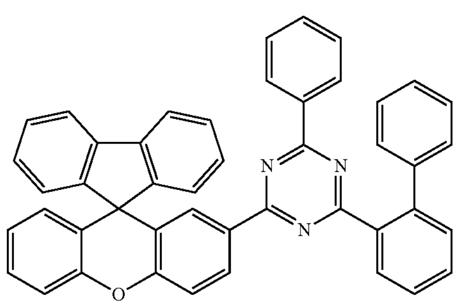
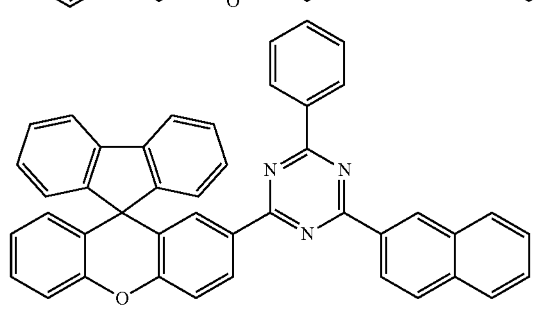

-continued
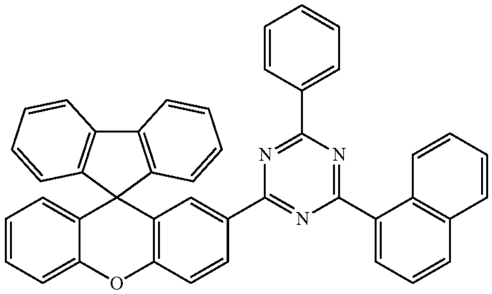
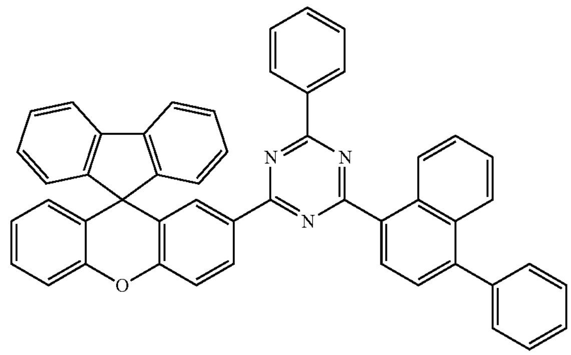
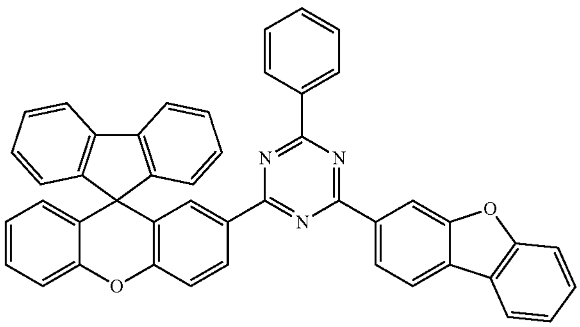
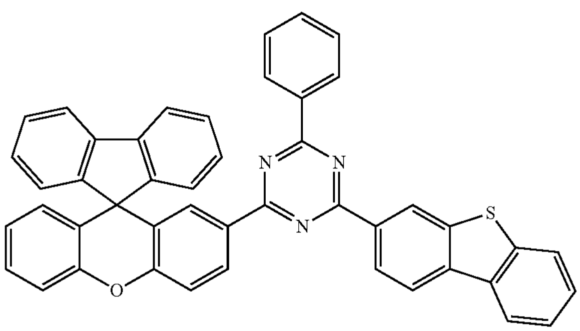
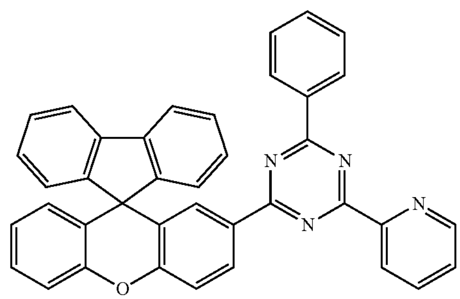
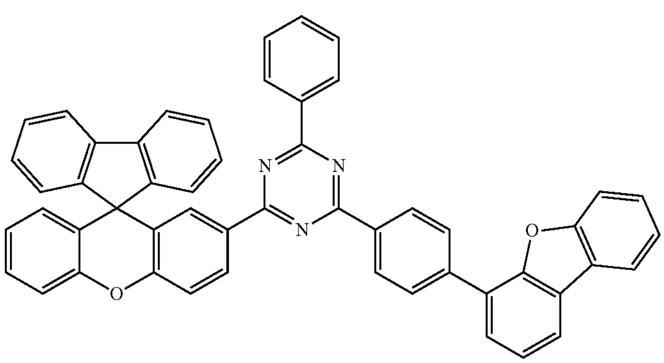
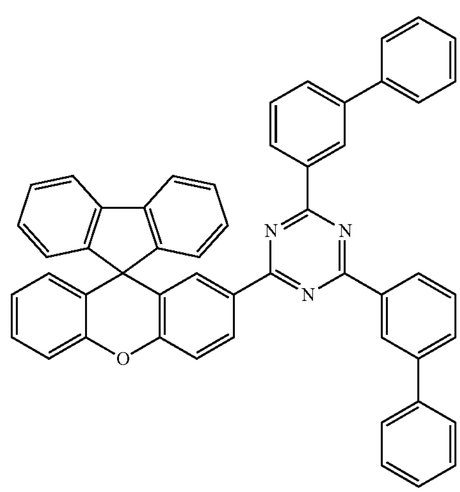

-continued
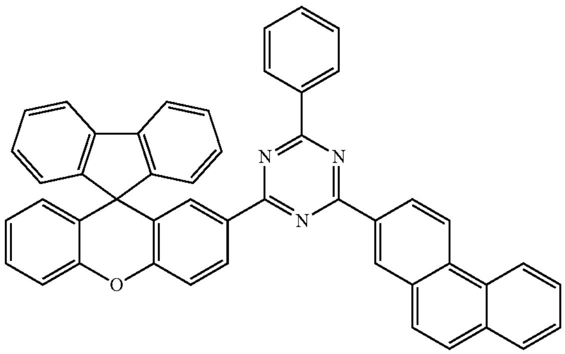
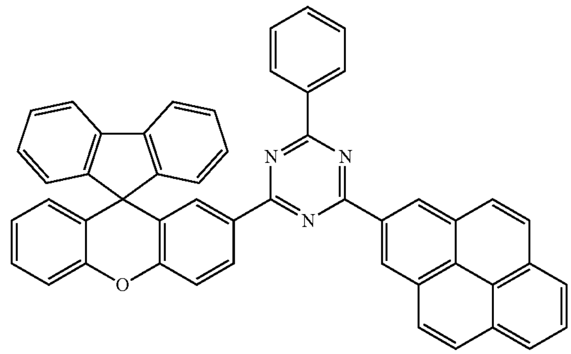
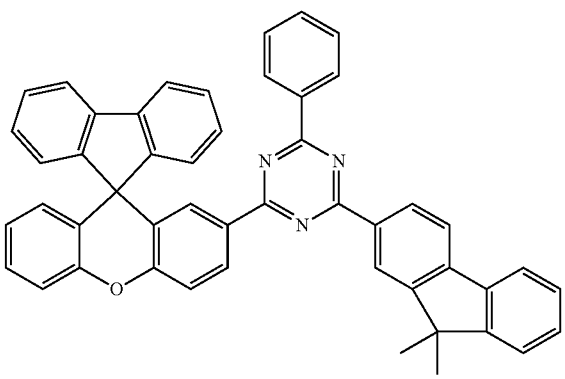
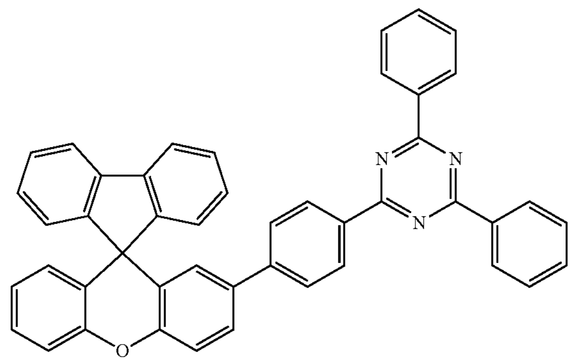
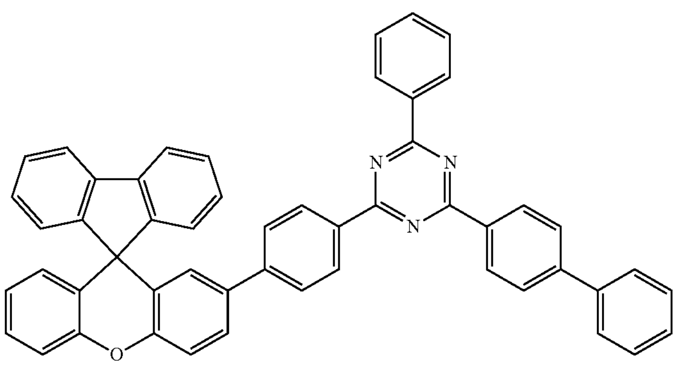
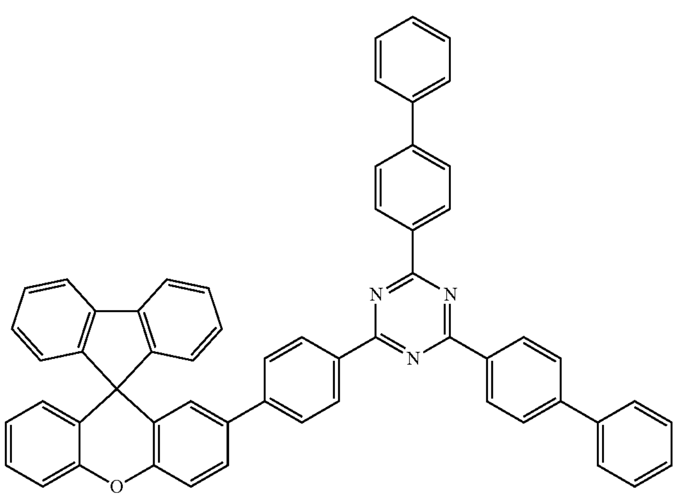

-continued
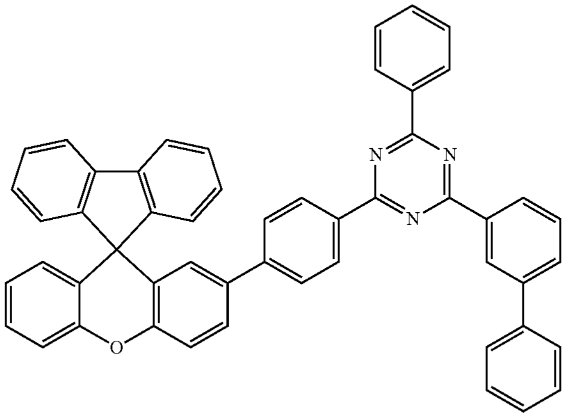
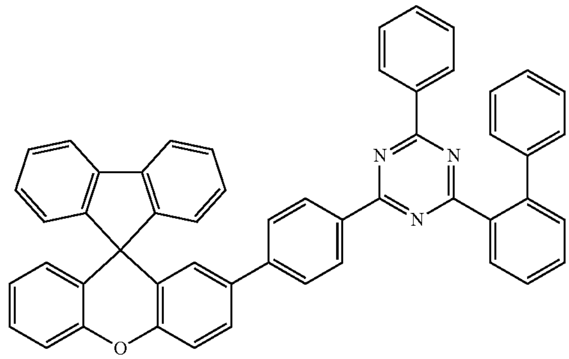
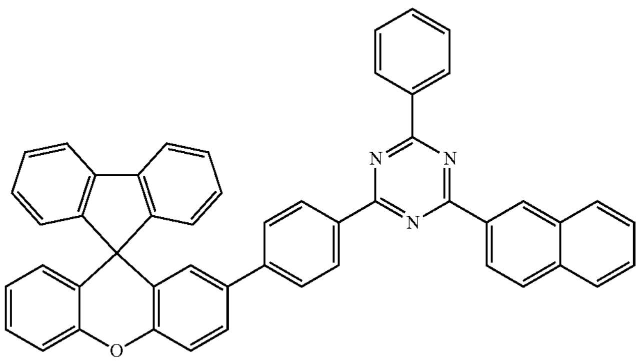
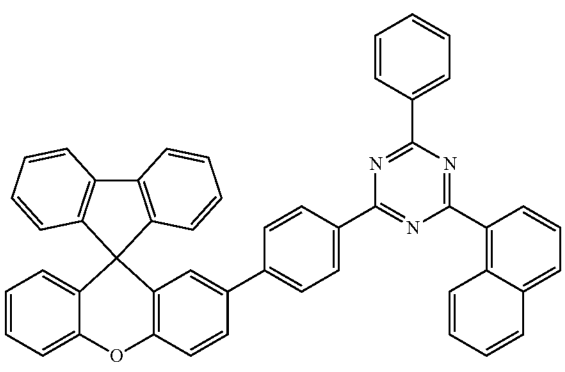
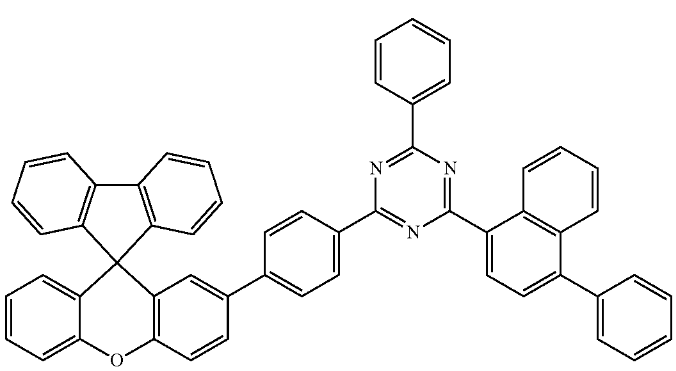

-continued
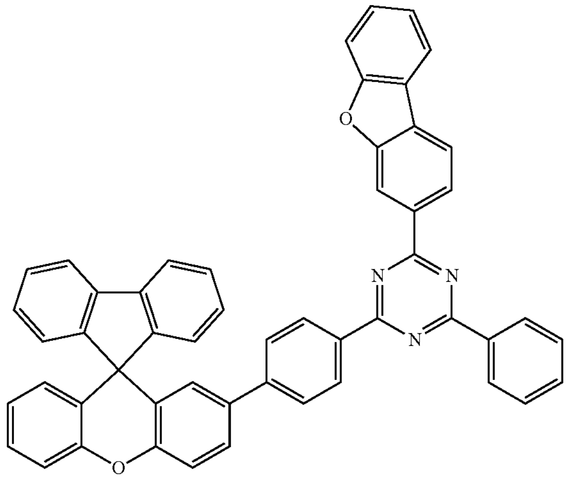
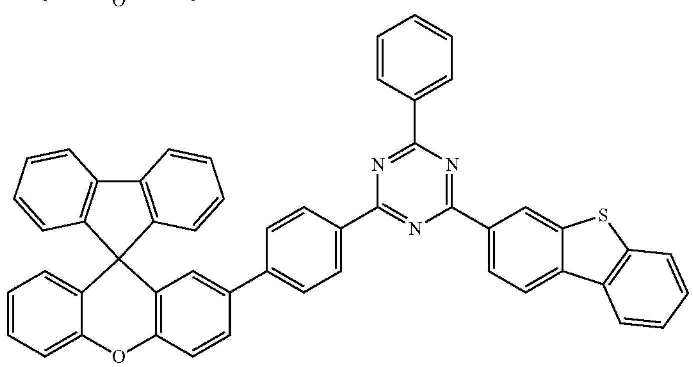
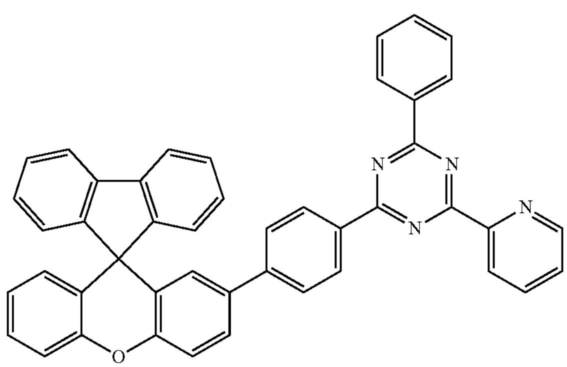
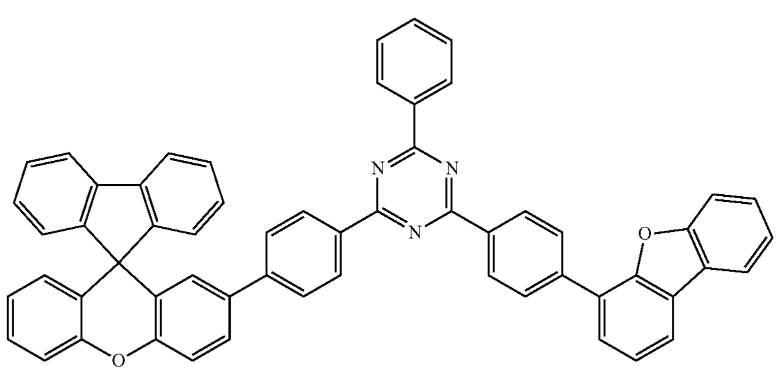

-continued
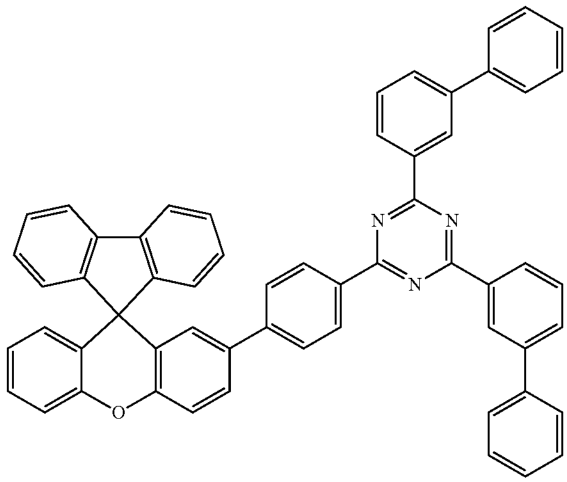
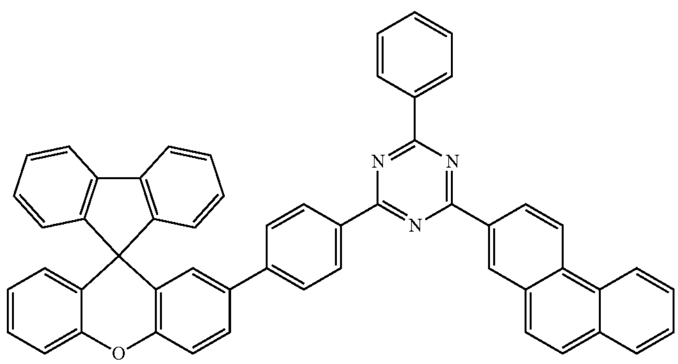
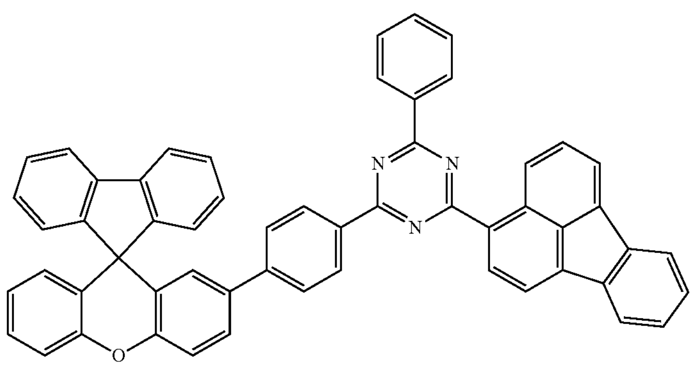
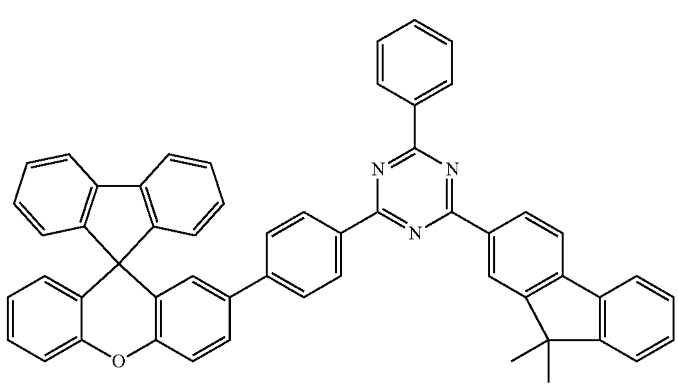

-continued
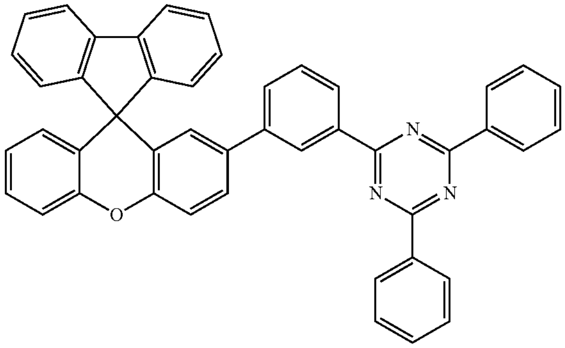
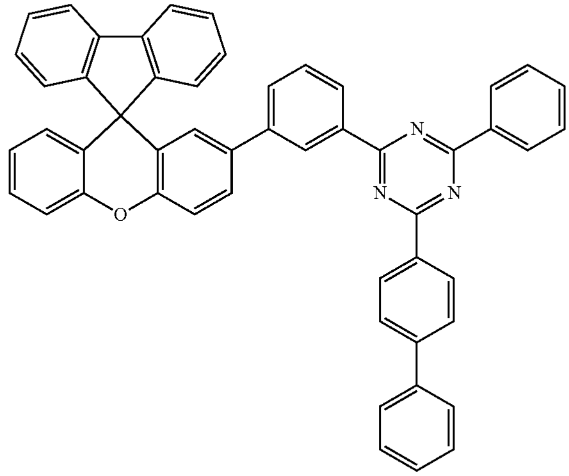
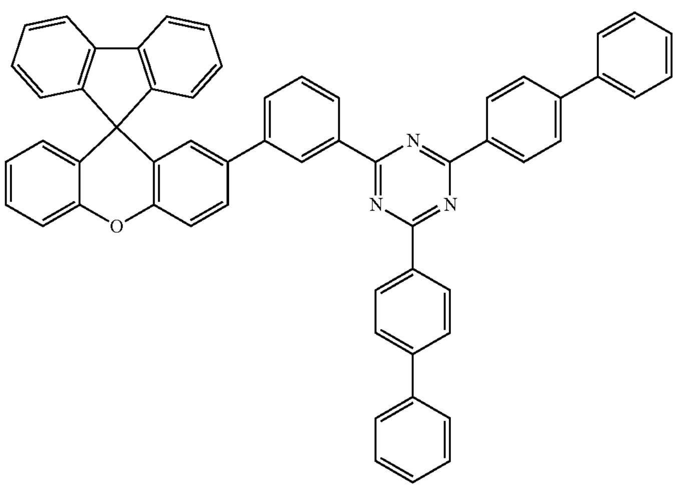
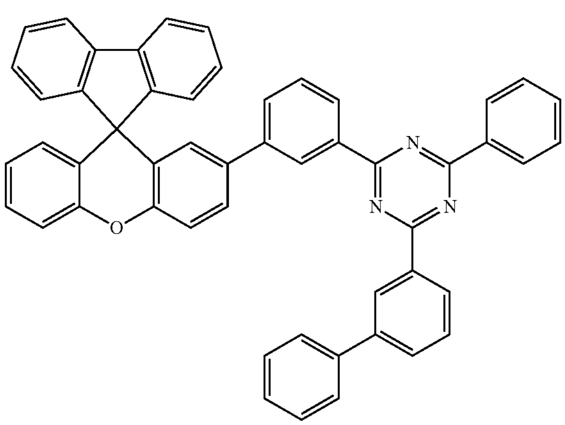
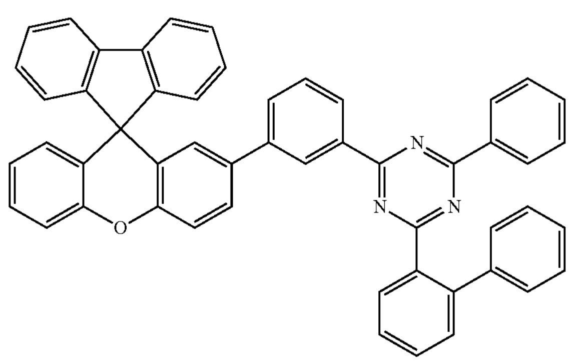

-continued
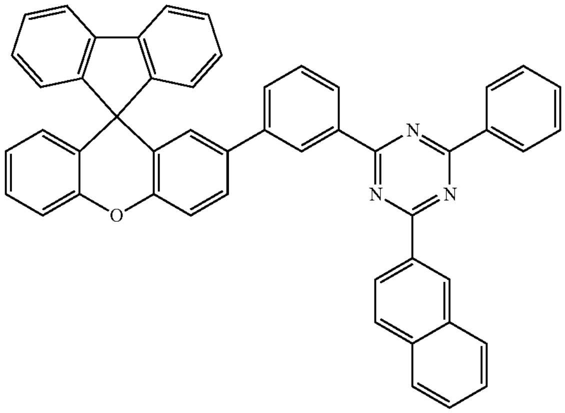
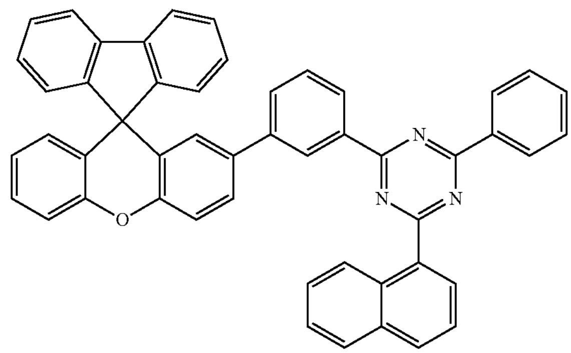
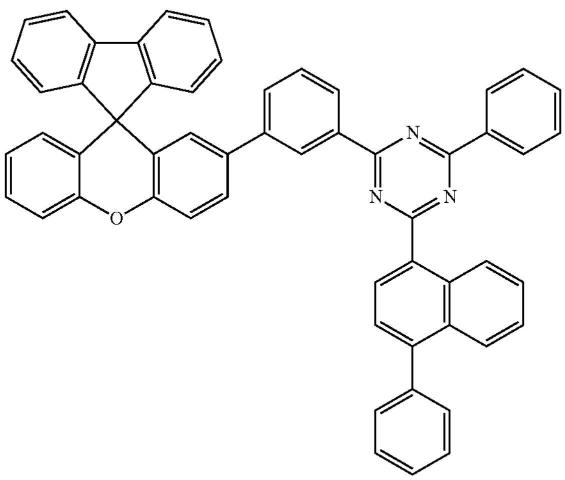
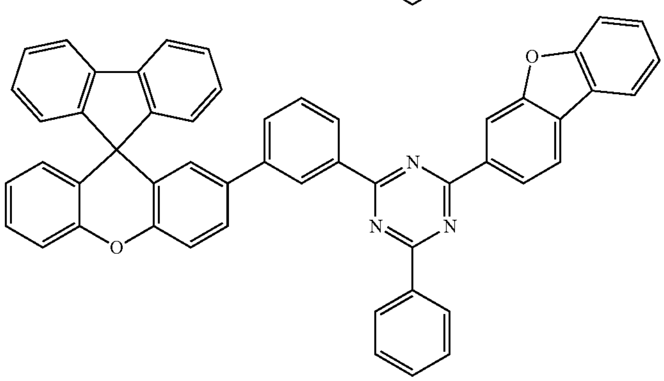
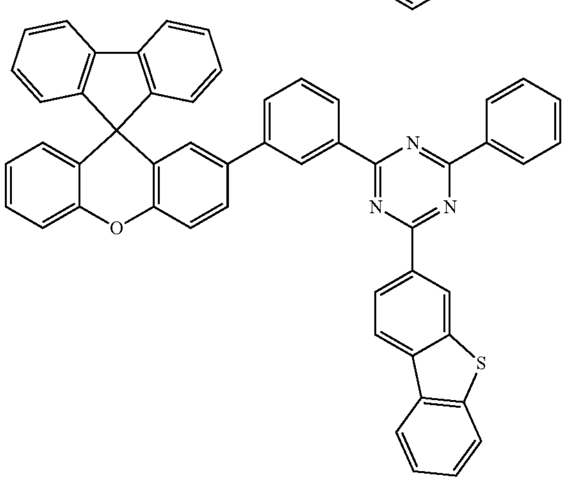
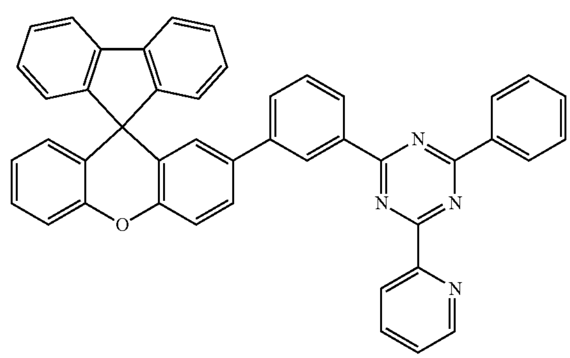

-continued
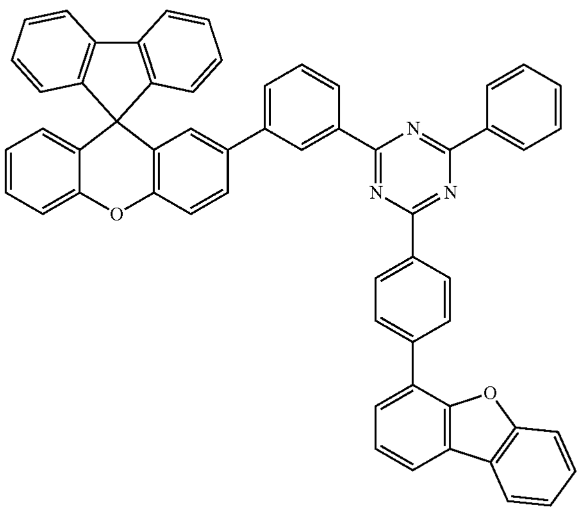
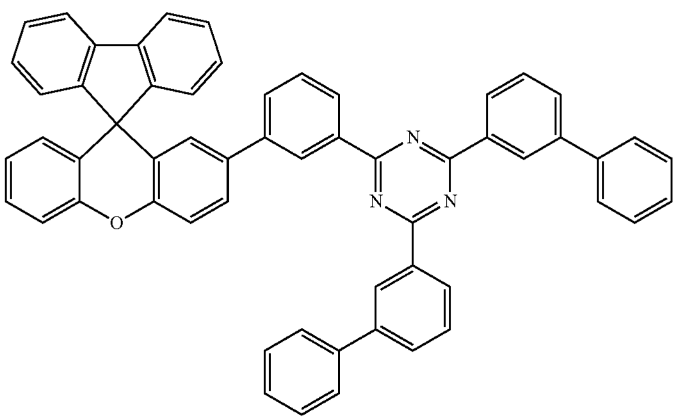
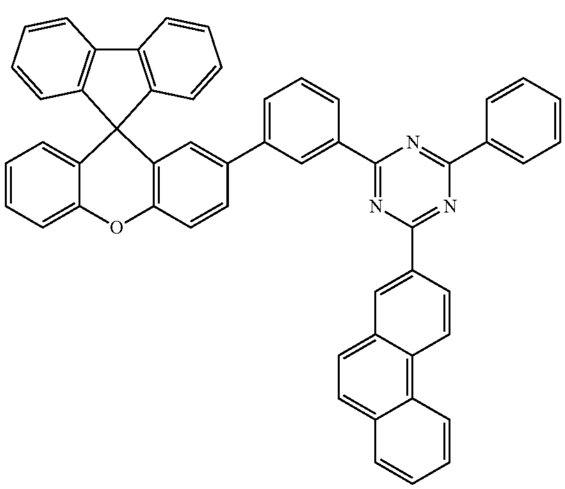
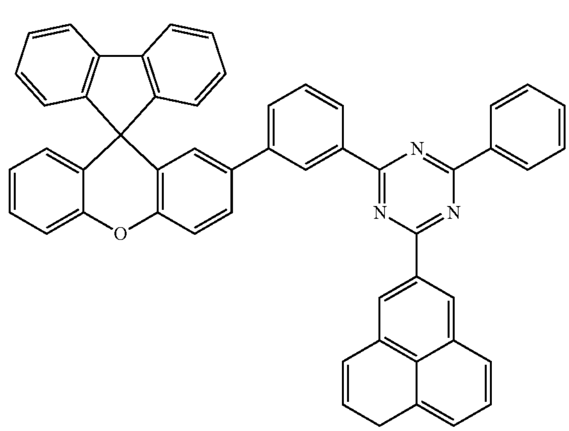

-continued
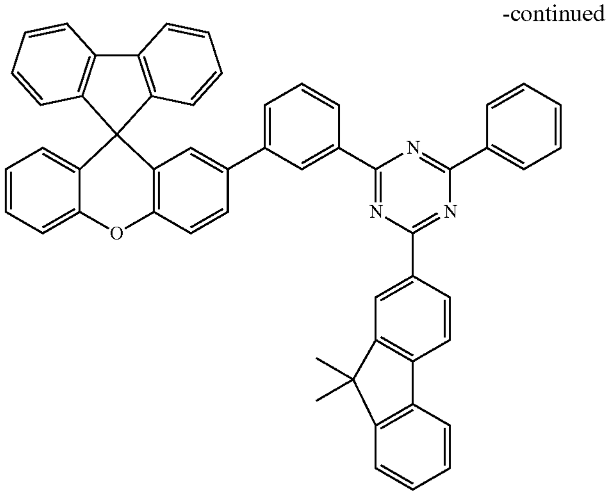
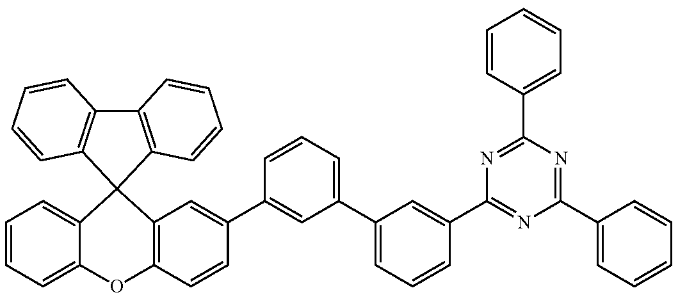
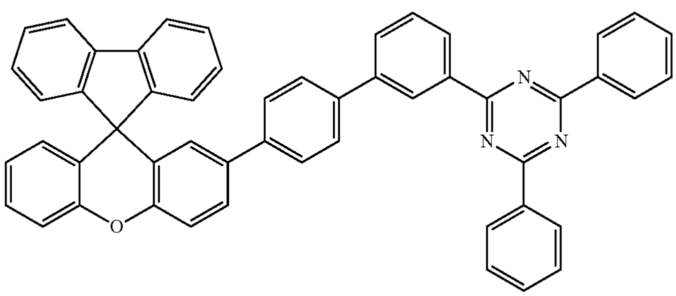
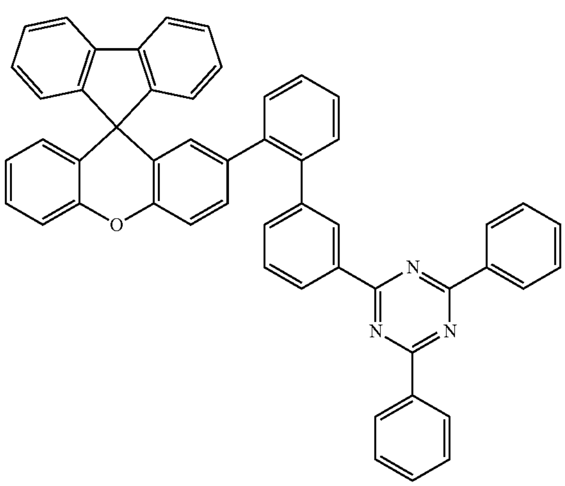
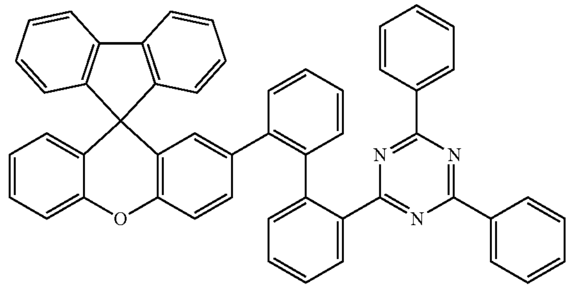

-continued
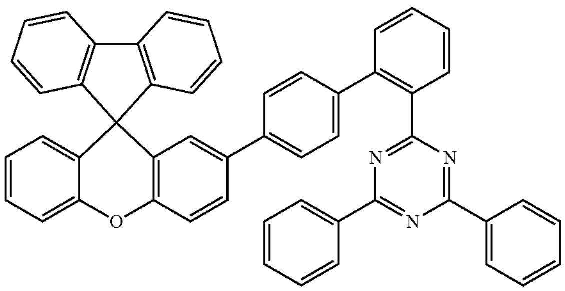
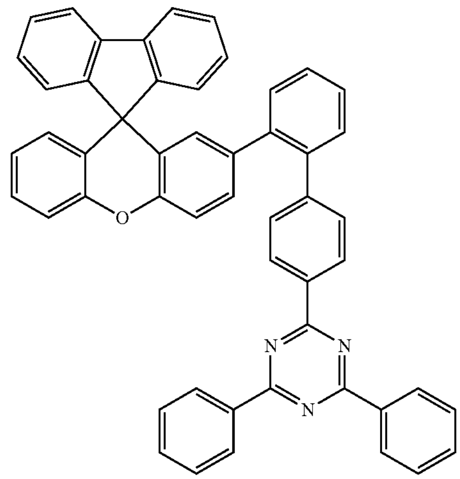
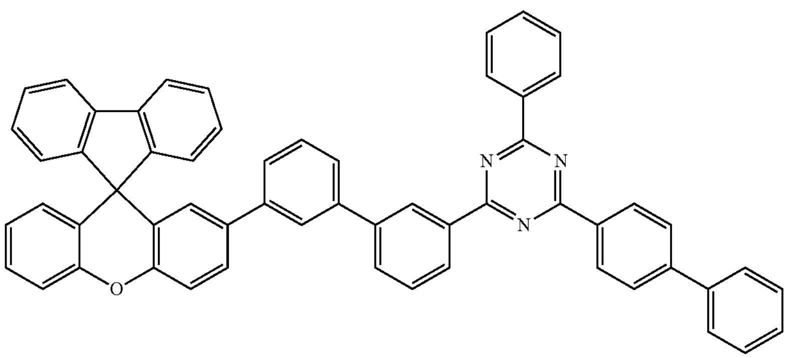
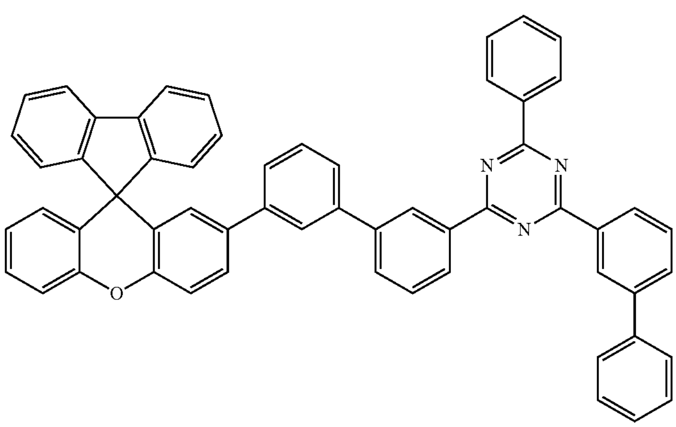
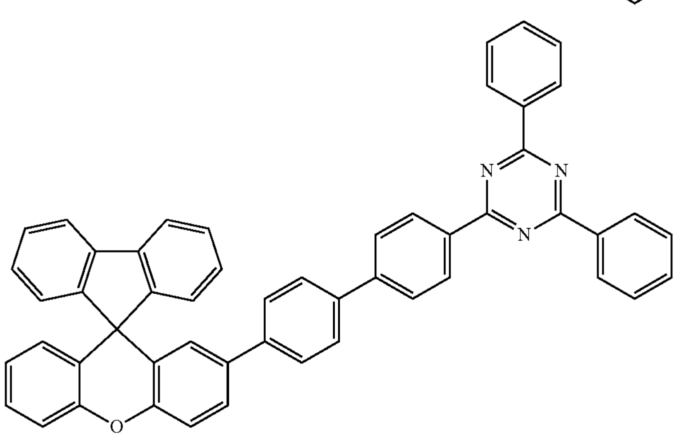
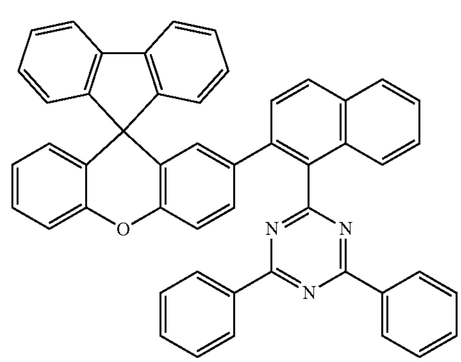

-continued
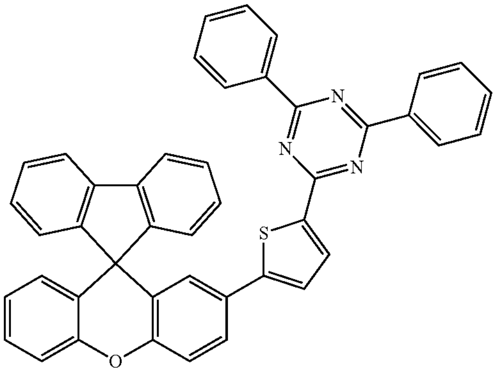
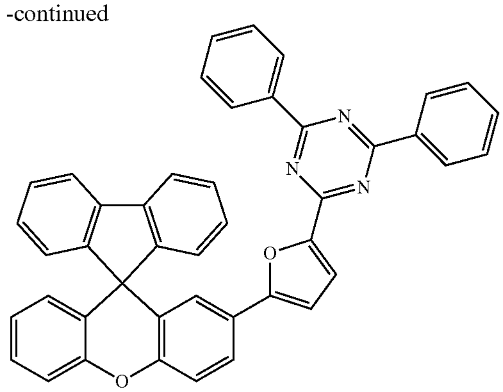
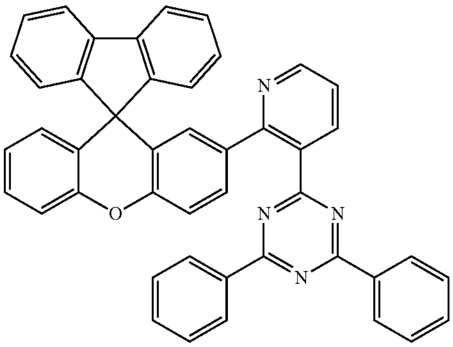
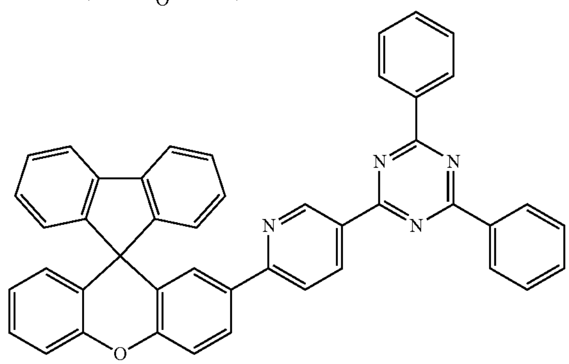
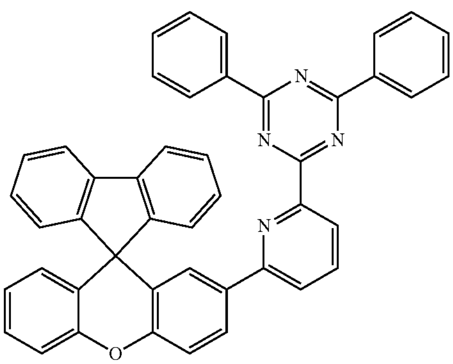
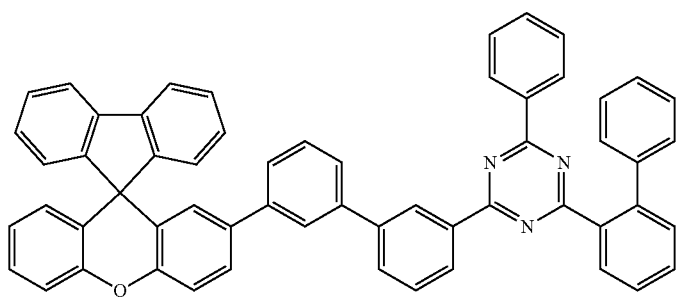
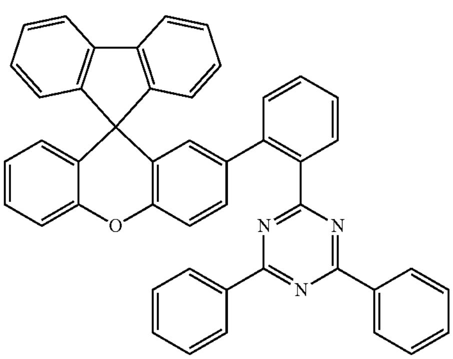
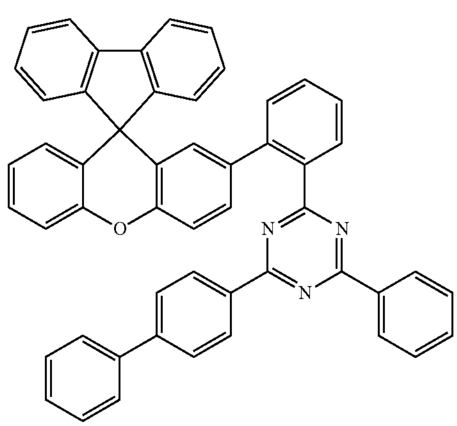

-continued
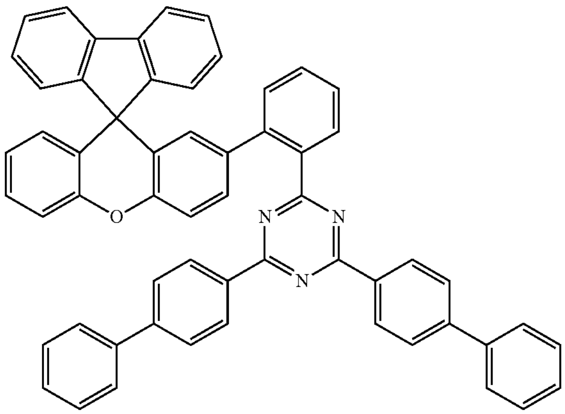
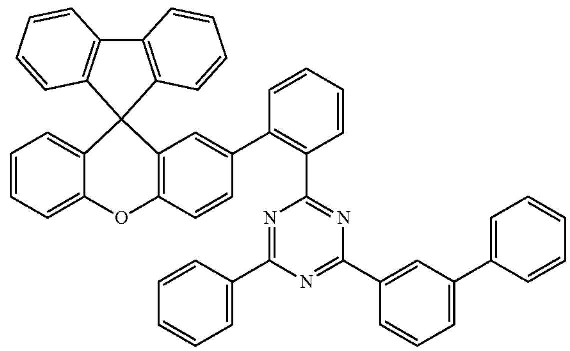
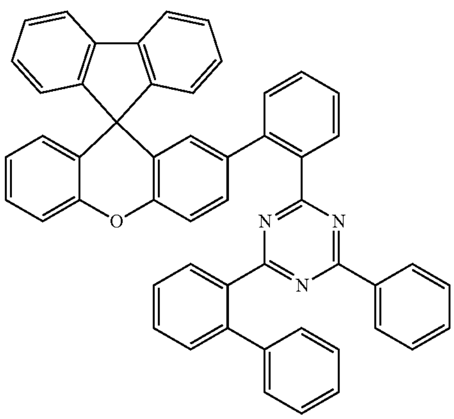
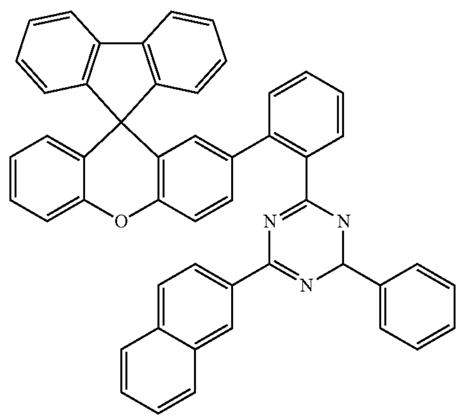
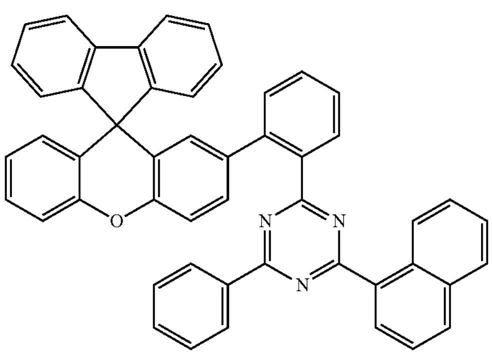
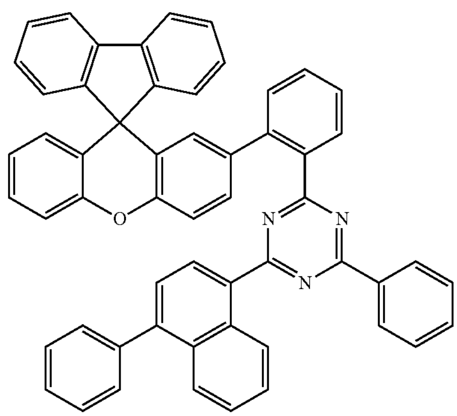
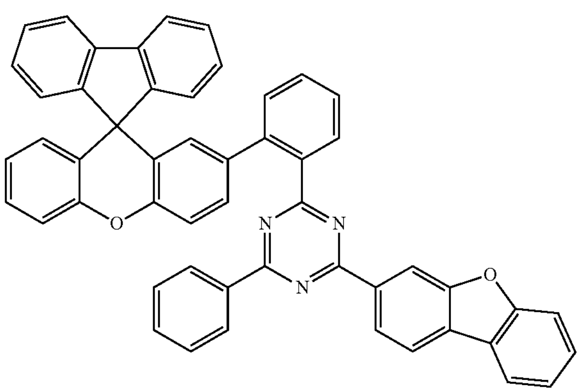
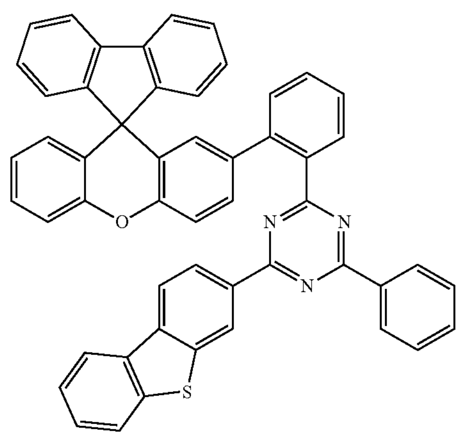

-continued
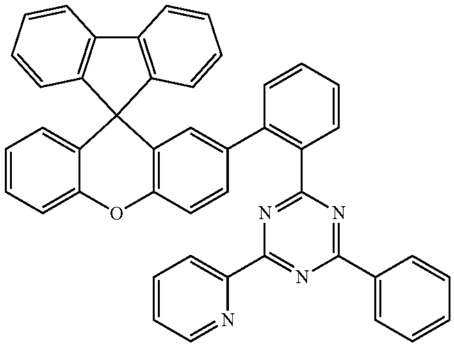
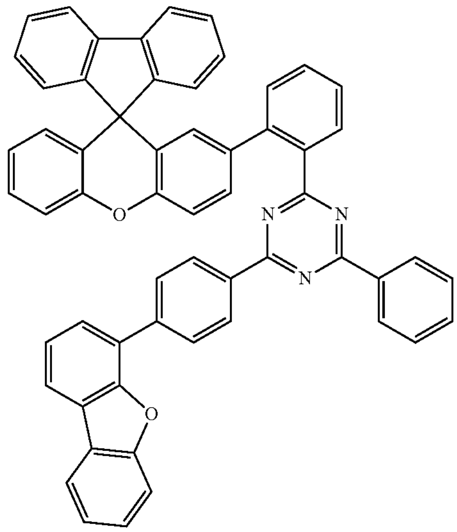
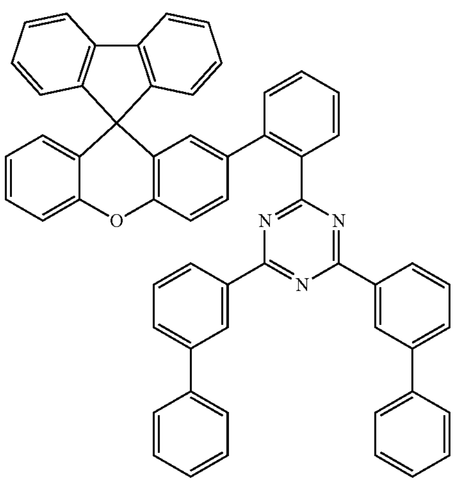
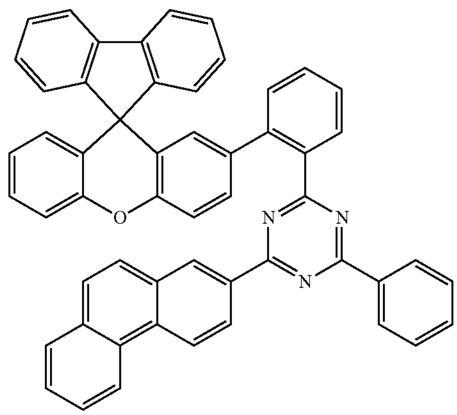
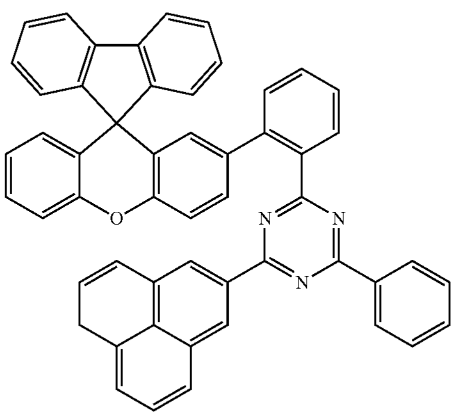
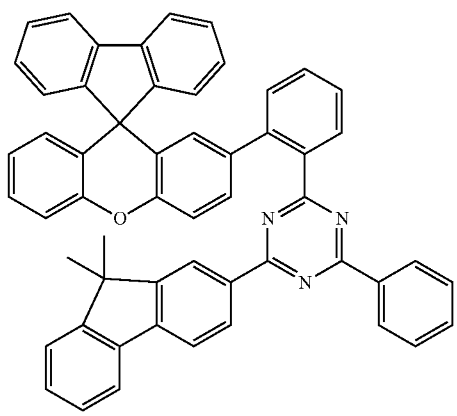

-continued
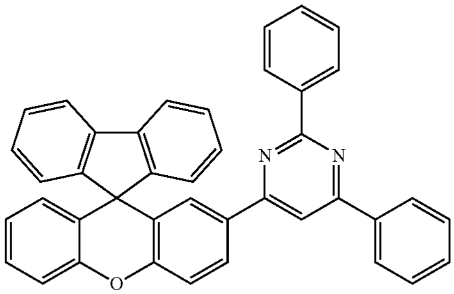
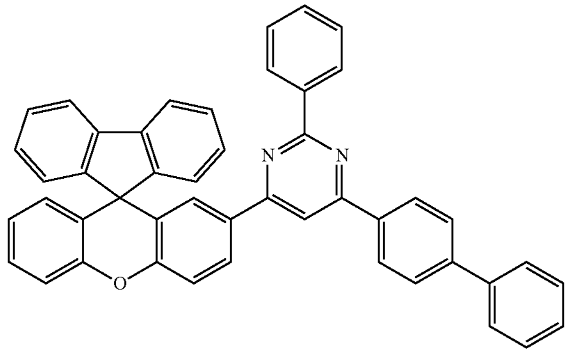
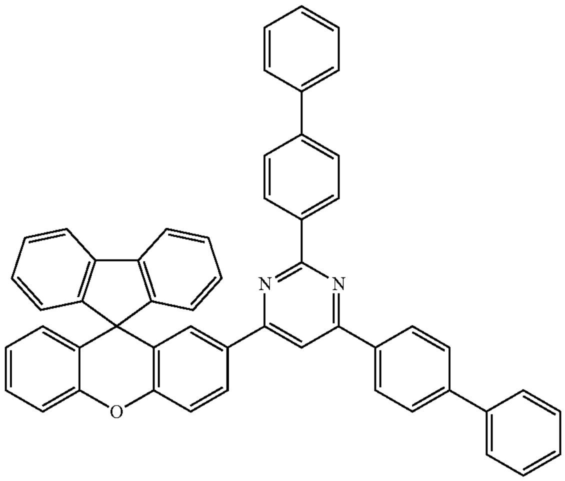
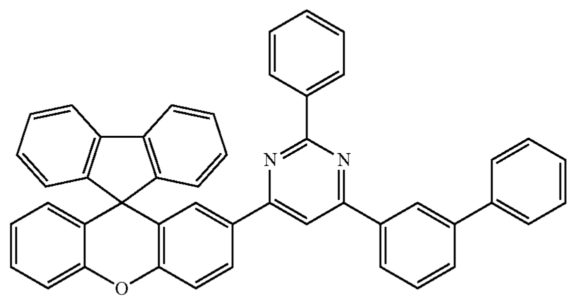
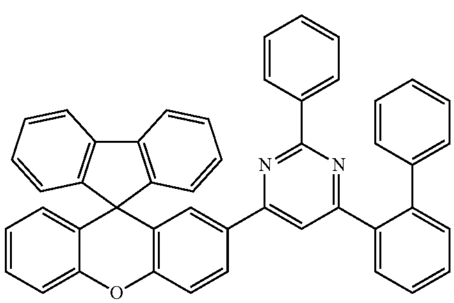
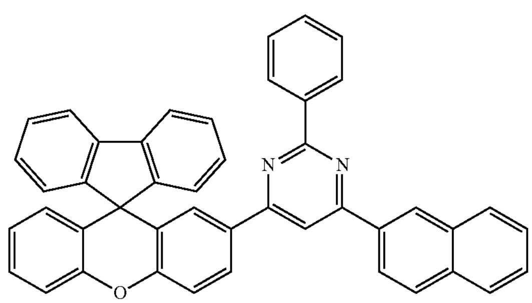
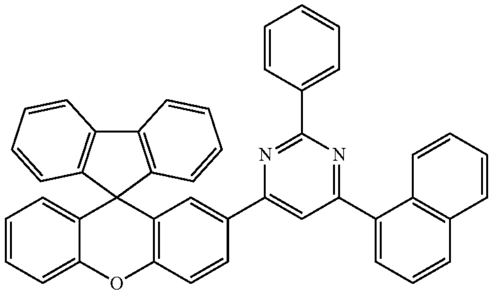
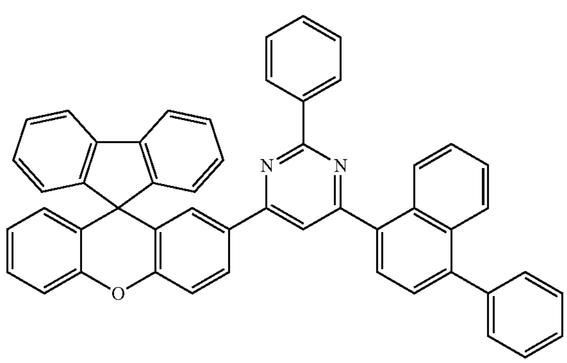

-continued
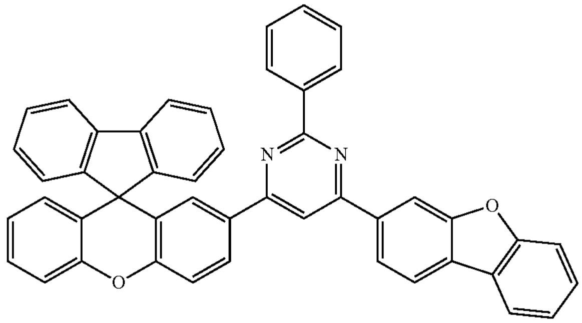
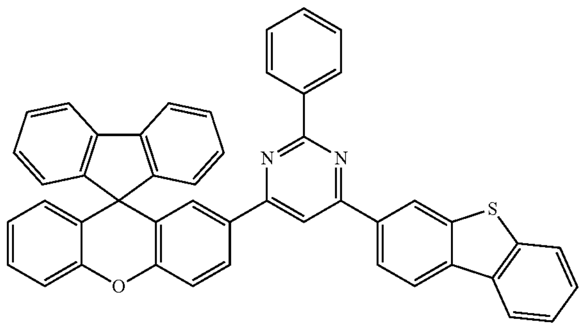
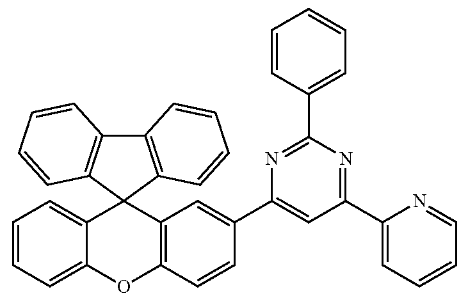
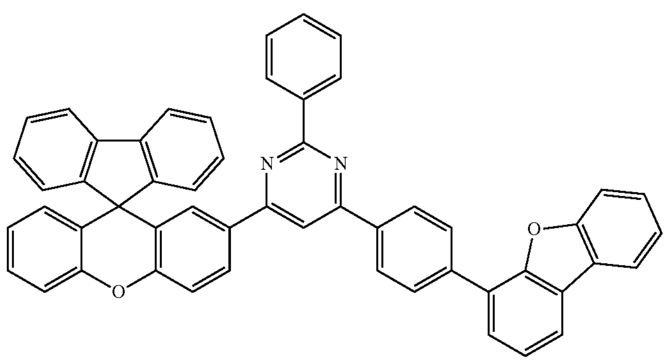
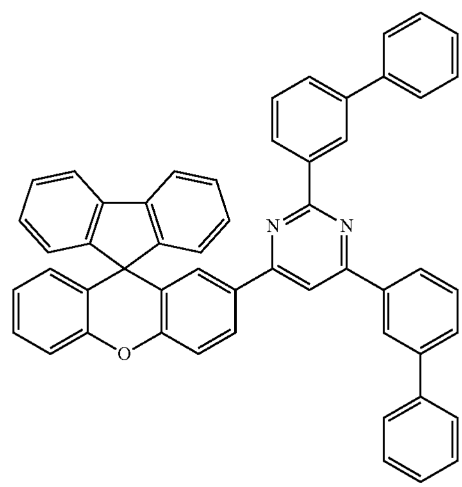
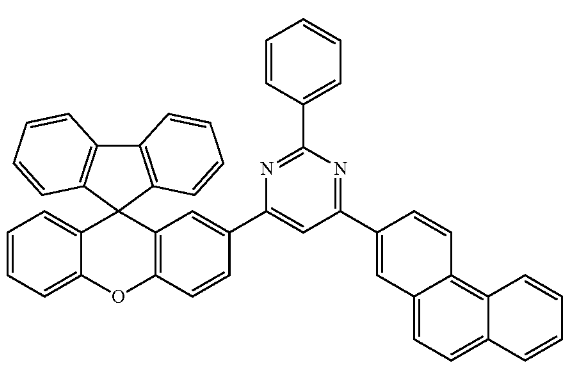
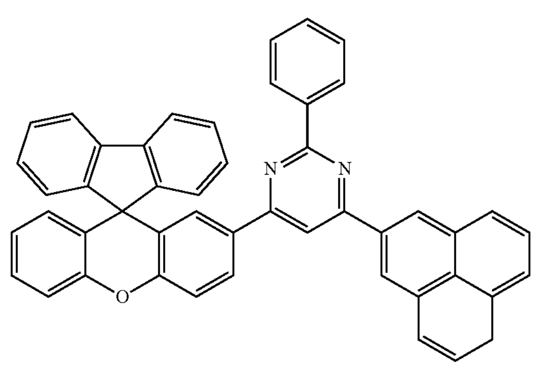

-continued
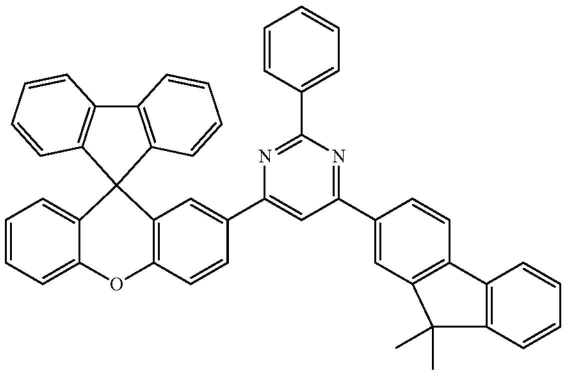
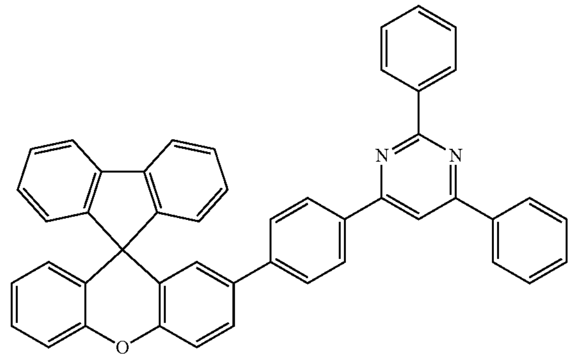
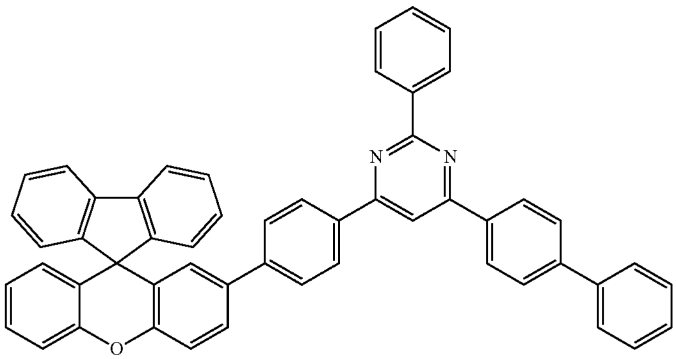
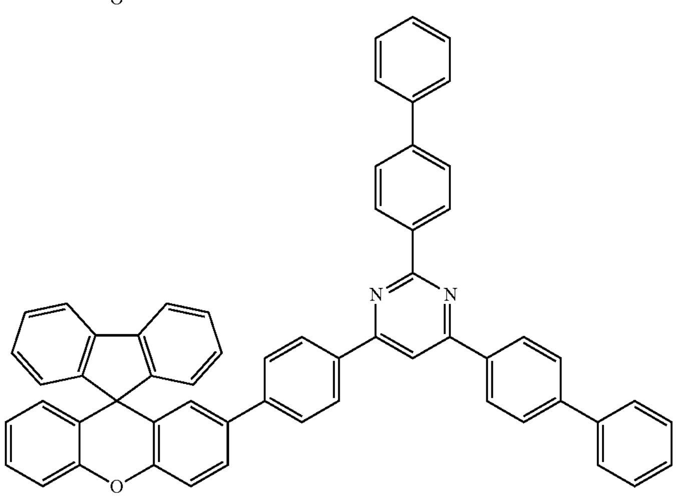
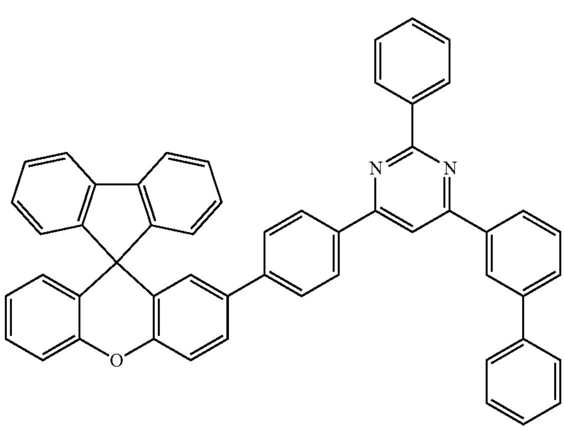
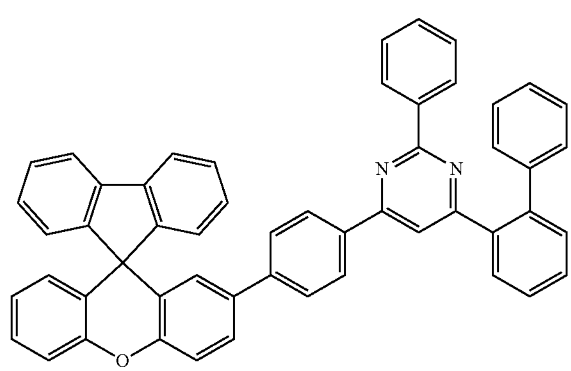

-continued
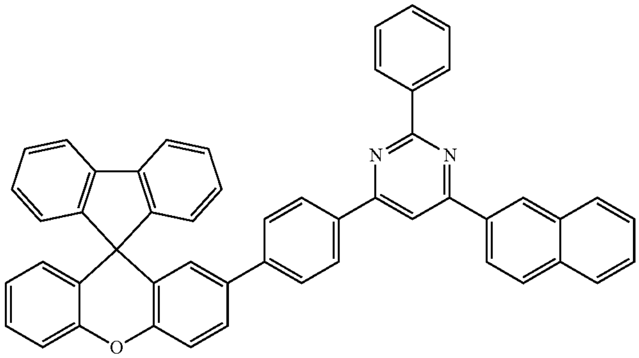
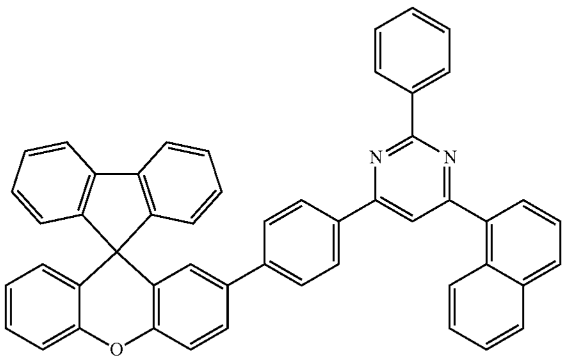
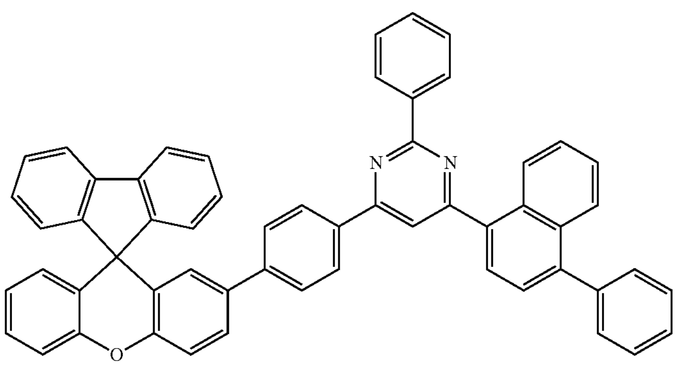
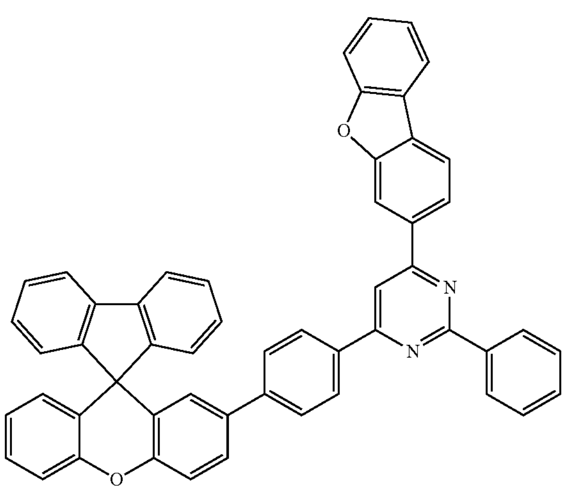

-continued
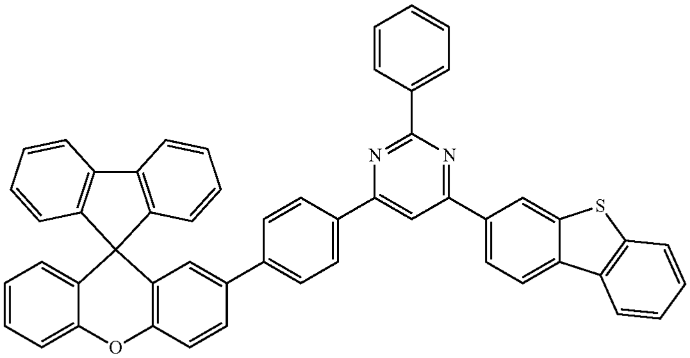
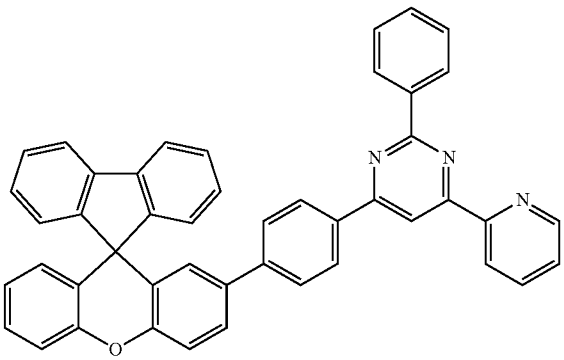
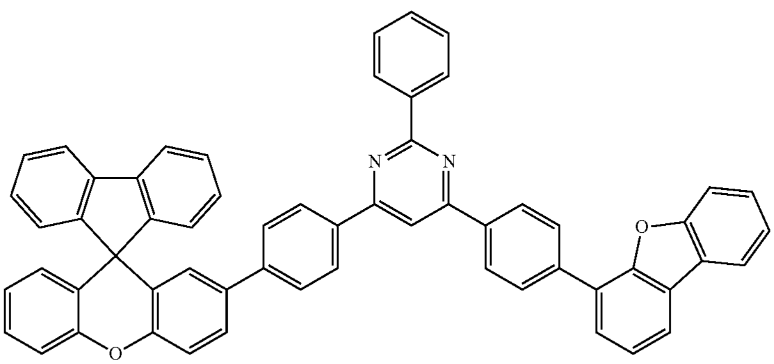
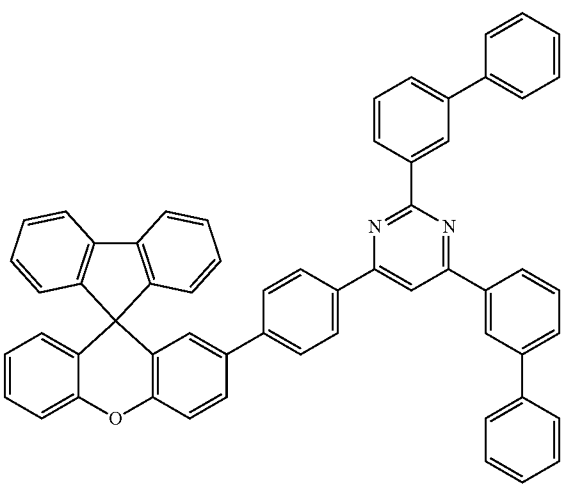

-continued
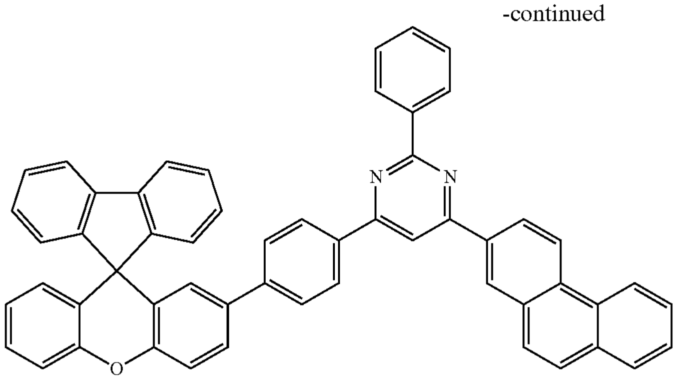
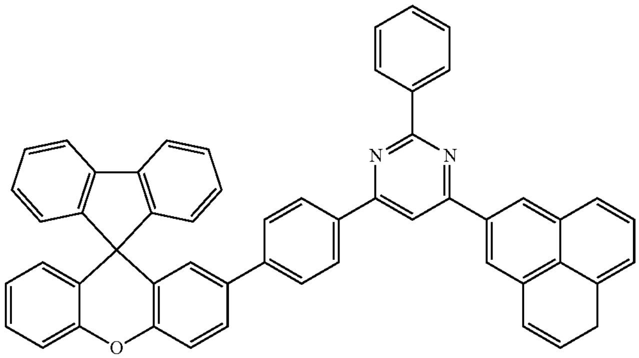
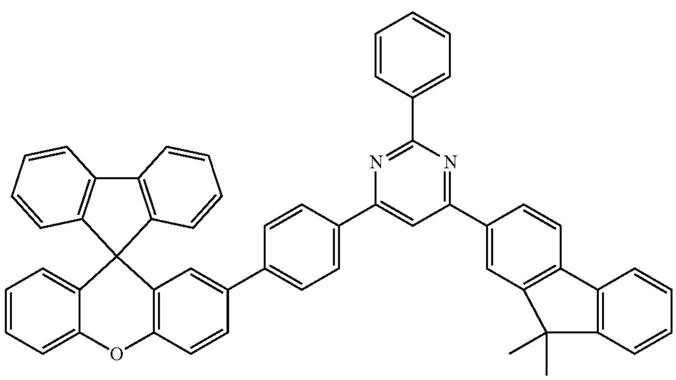
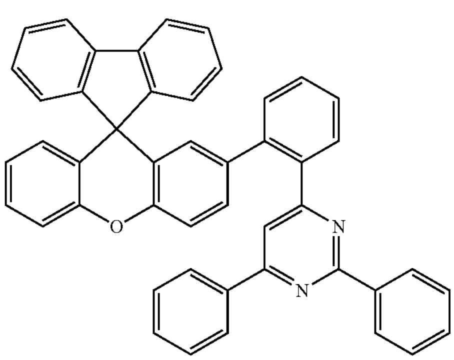
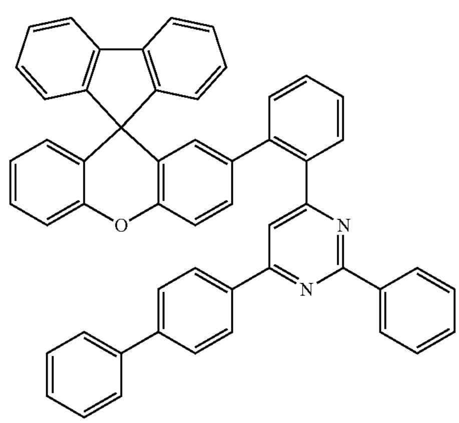

-continued
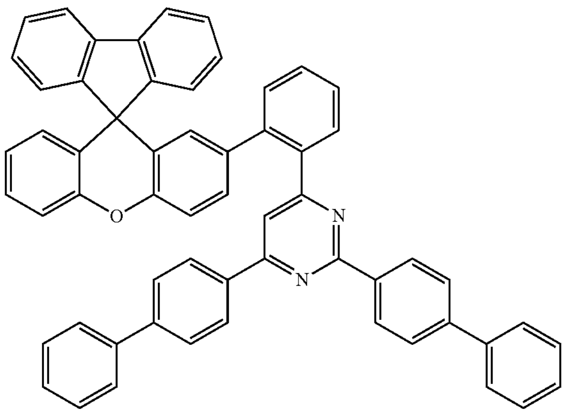
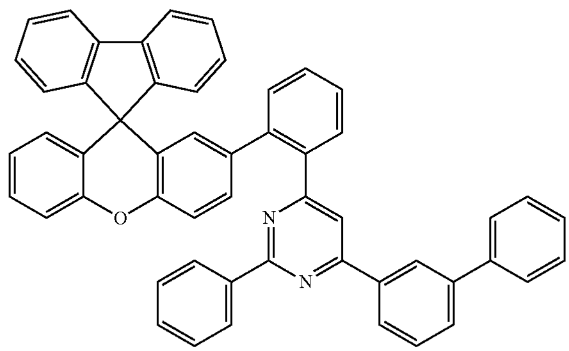
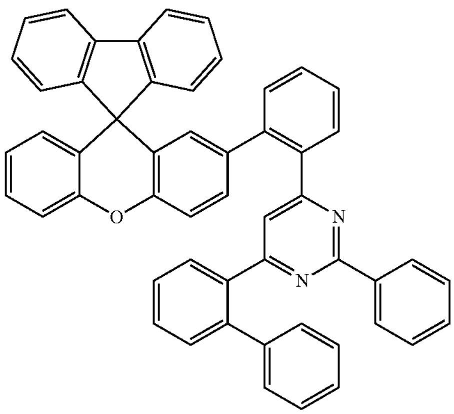
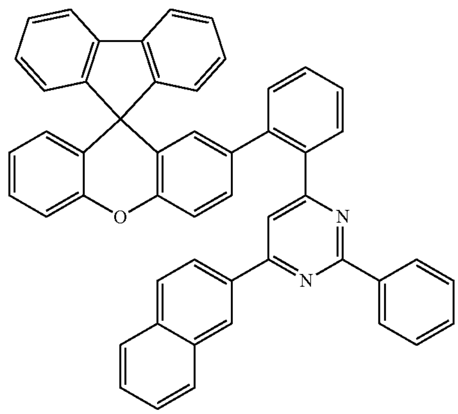
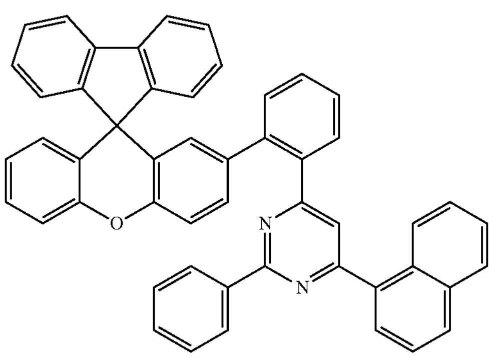
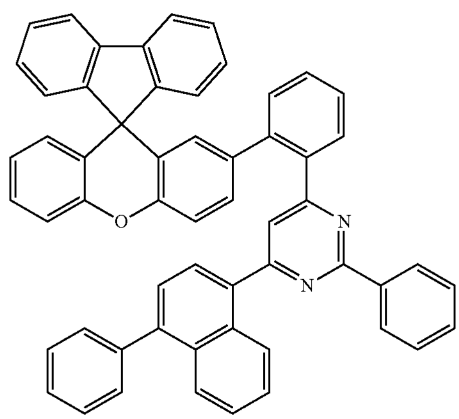
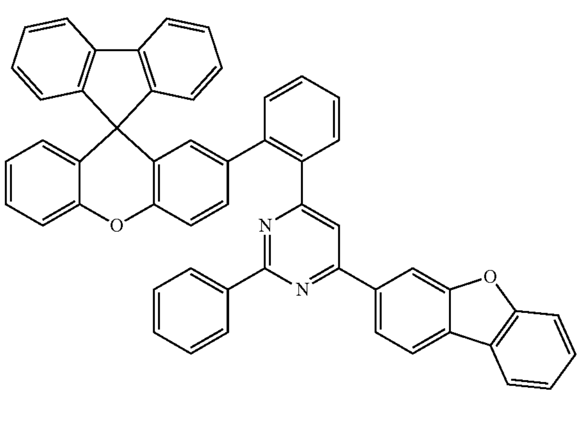
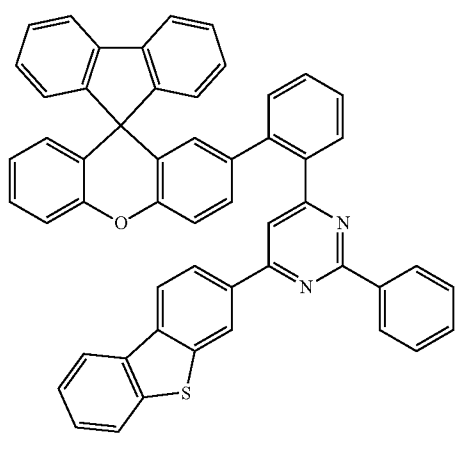

-continued
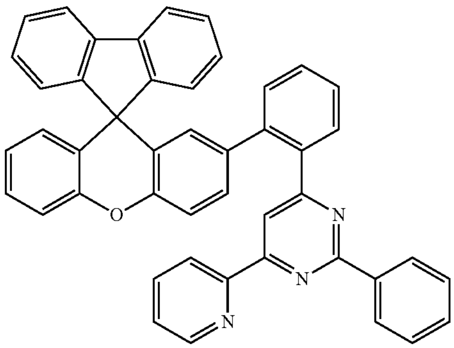
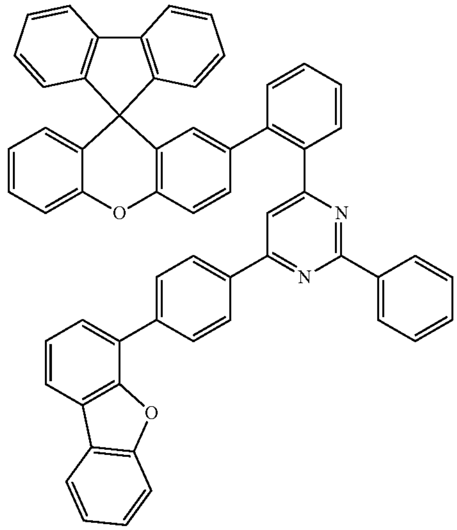
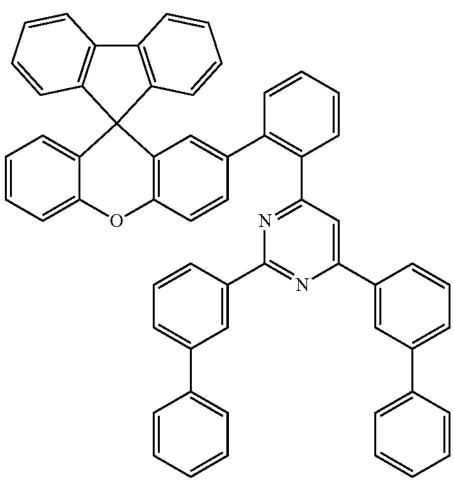
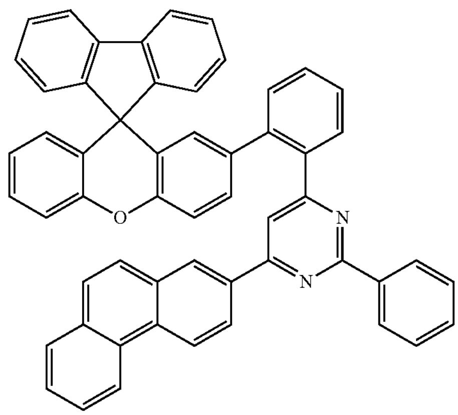
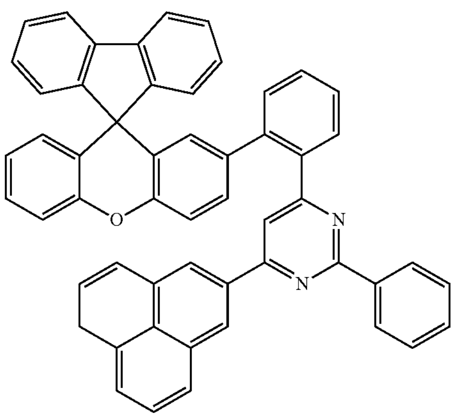
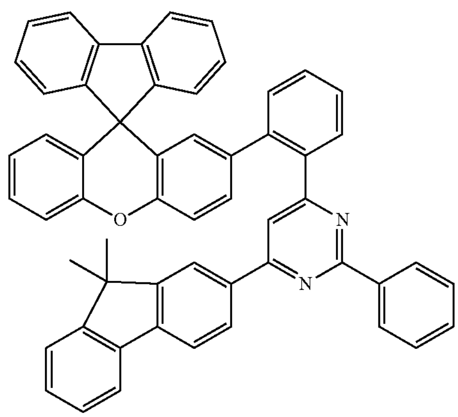

-continued
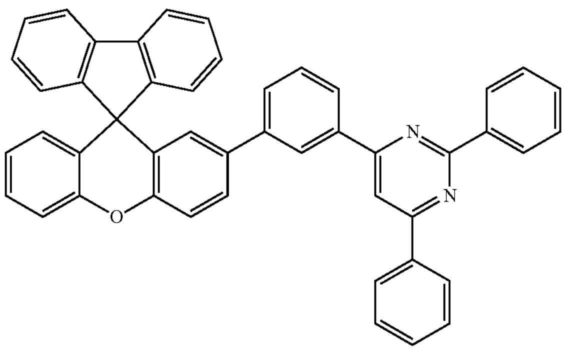
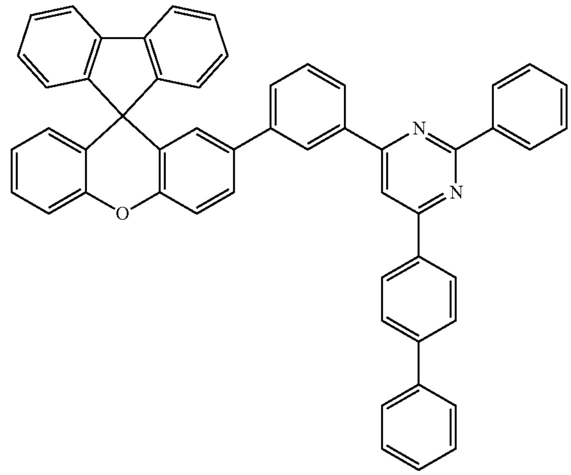
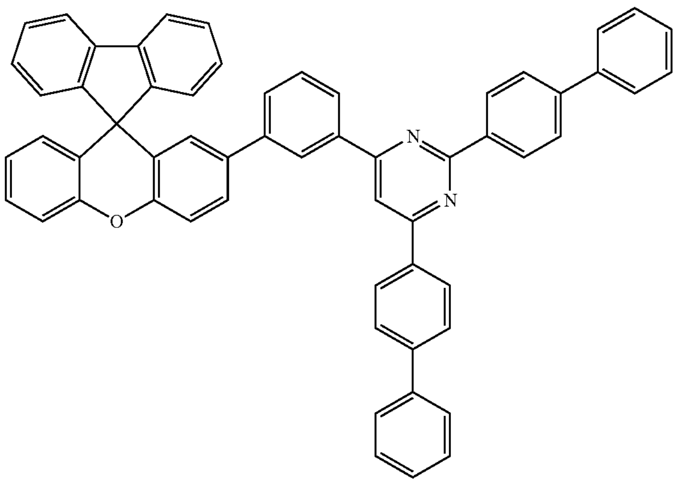
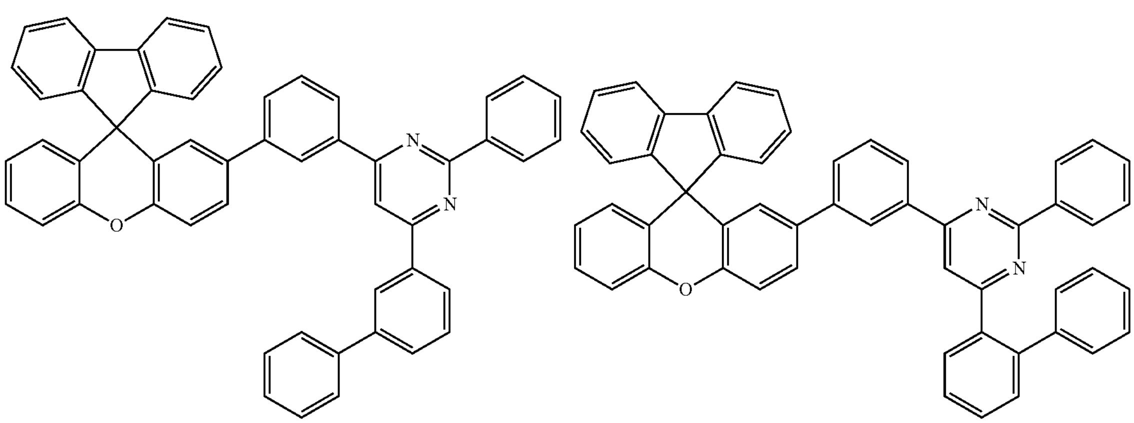

-continued
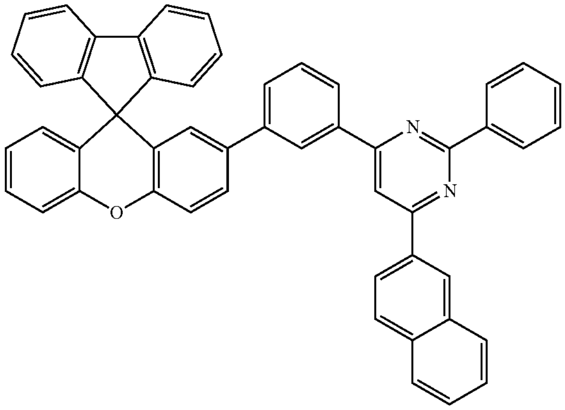
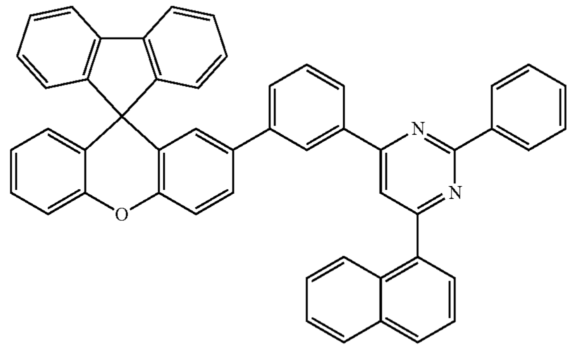
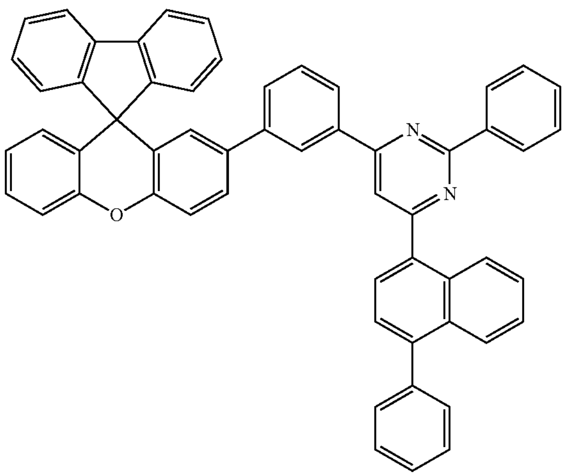
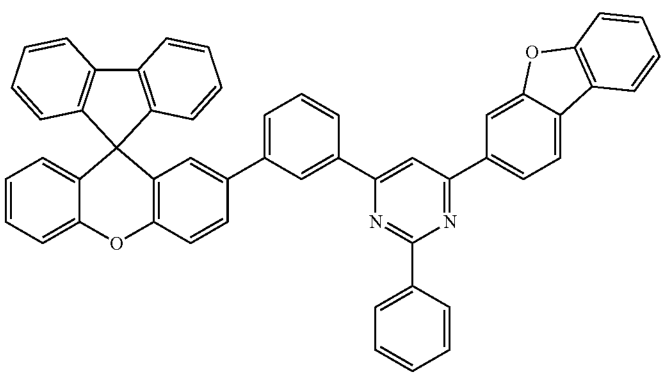
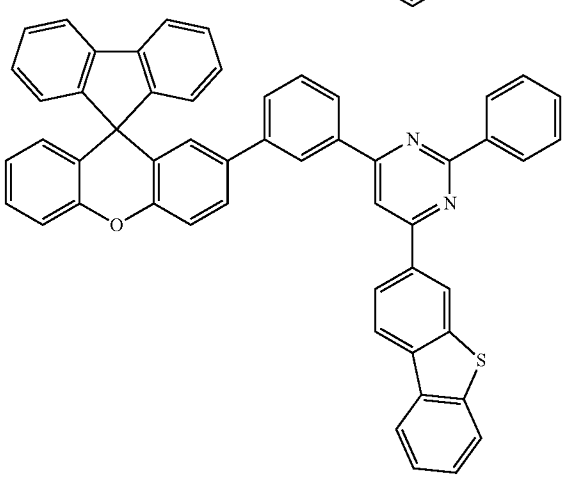
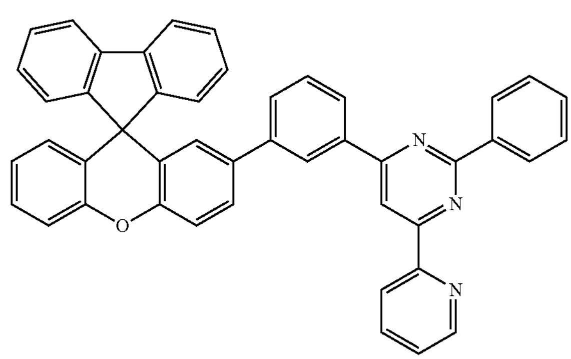

-continued
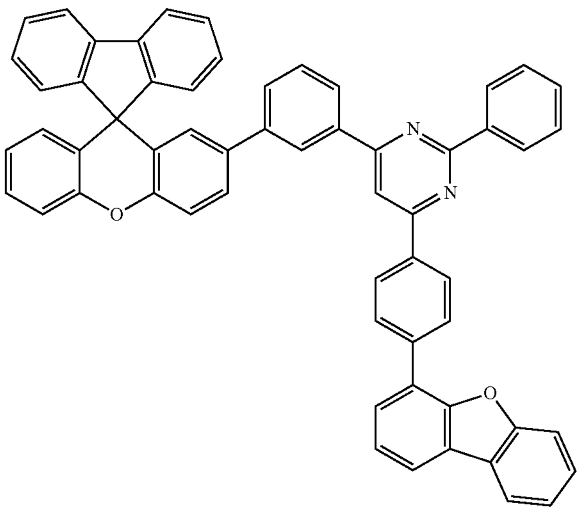
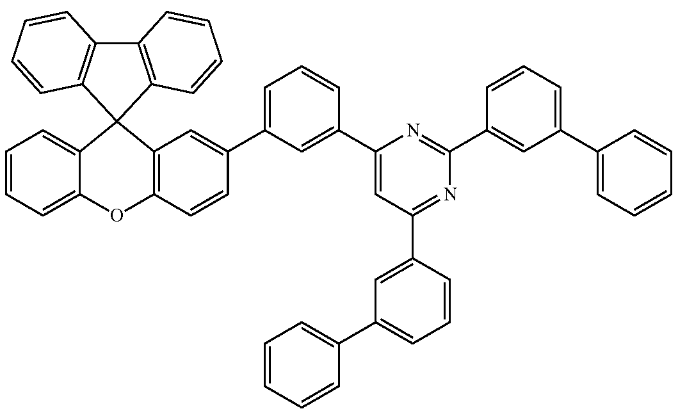
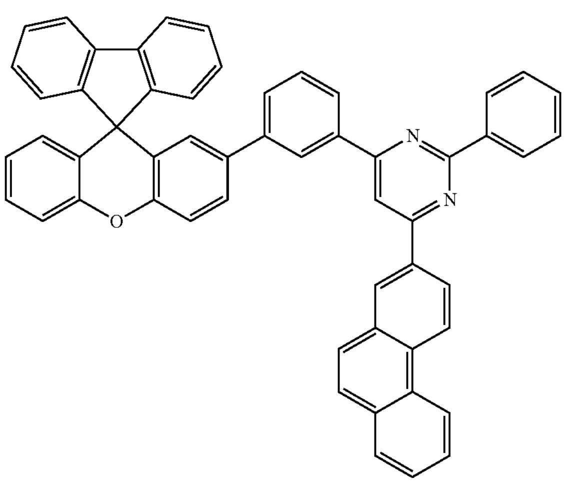
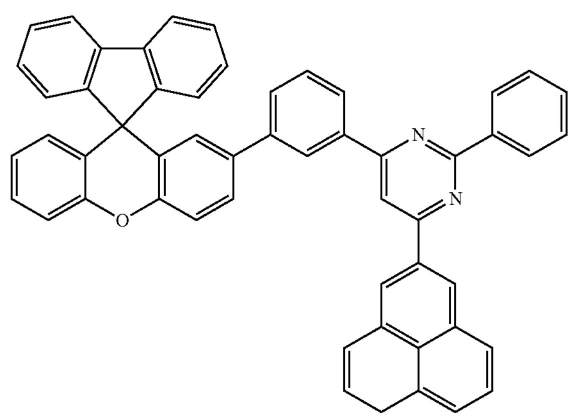

-continued
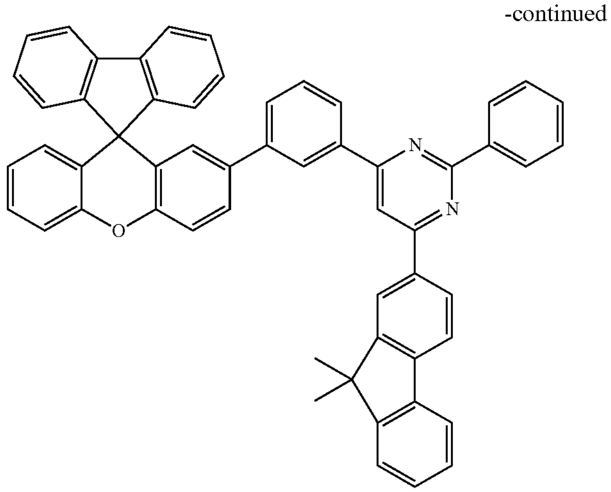
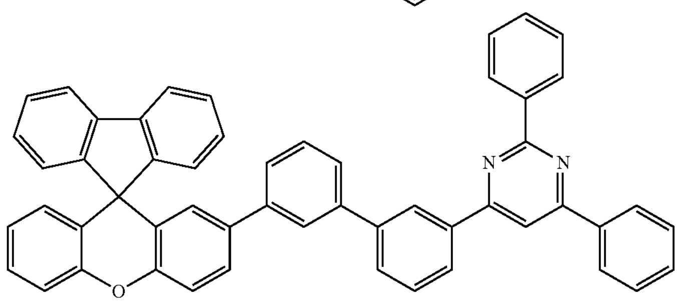
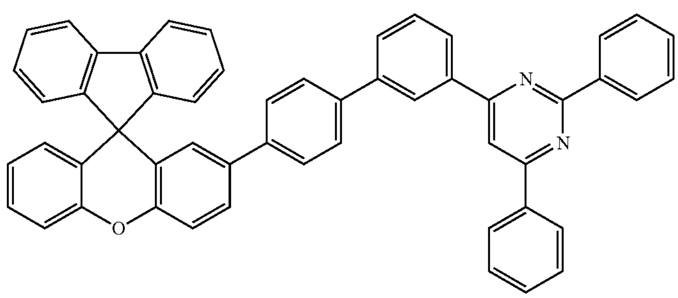
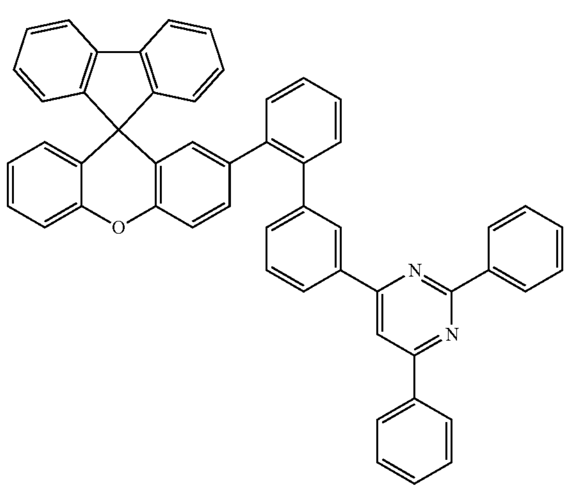
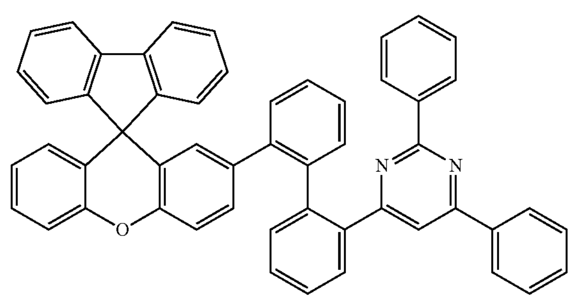

-continued
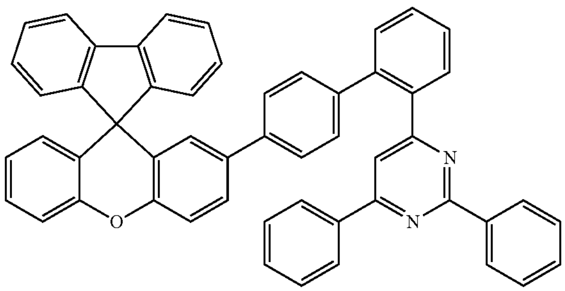
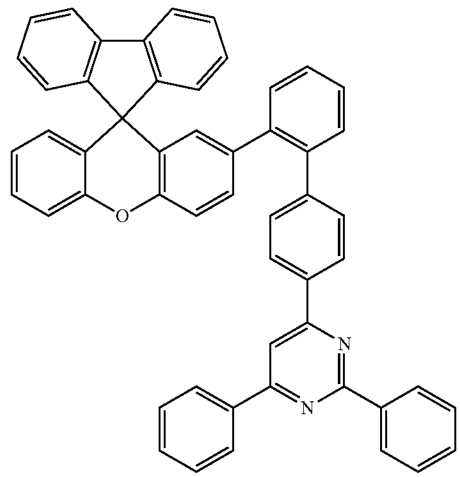
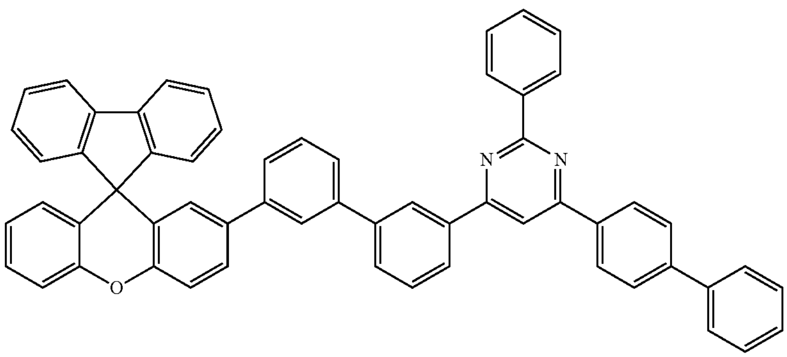
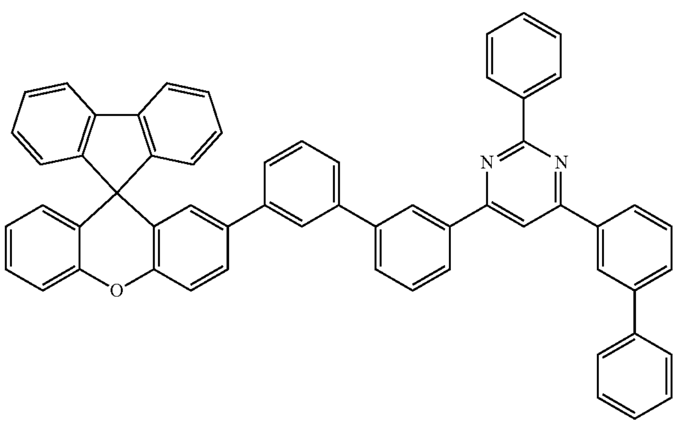
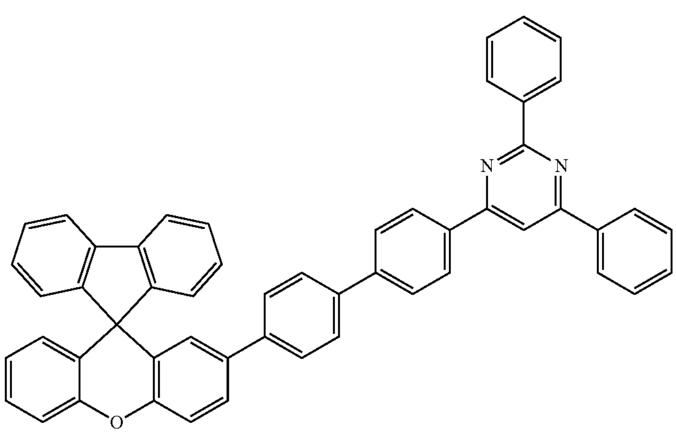
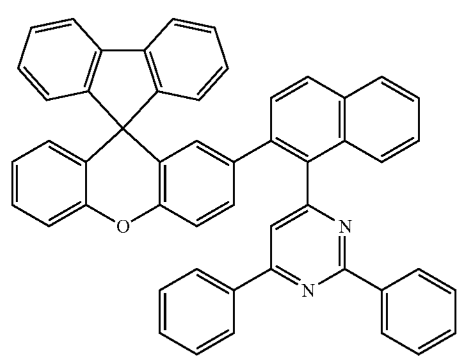

-continued
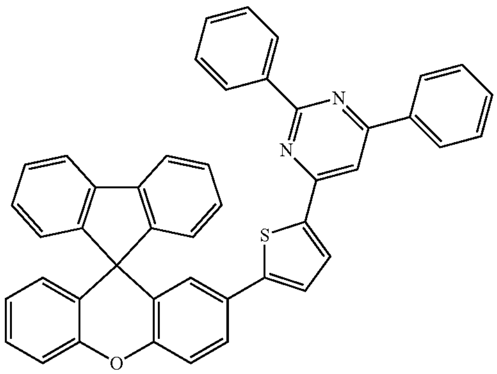
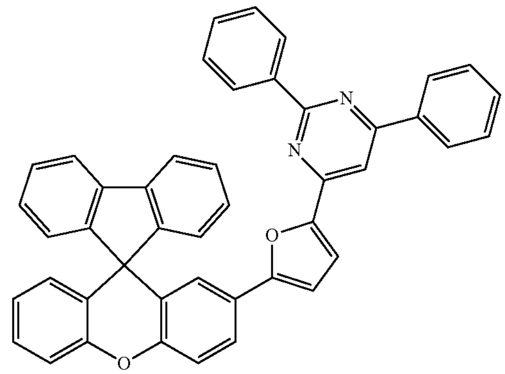
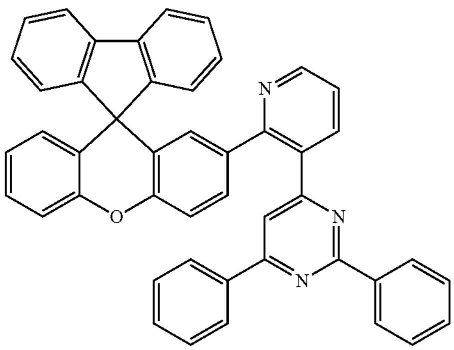
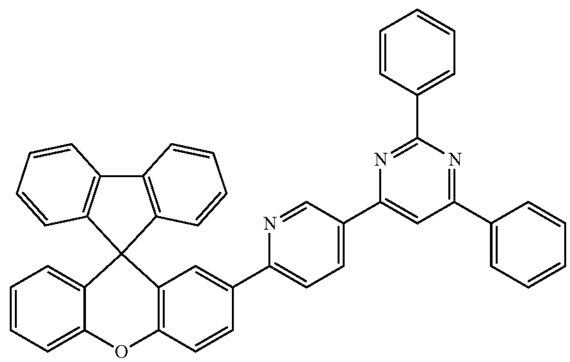
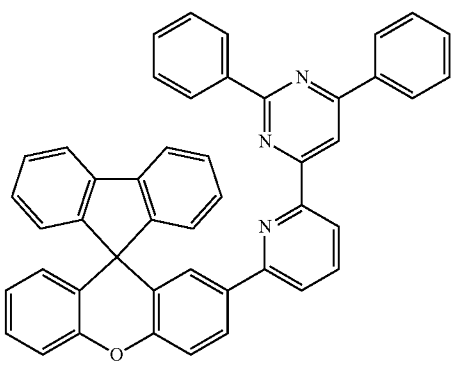
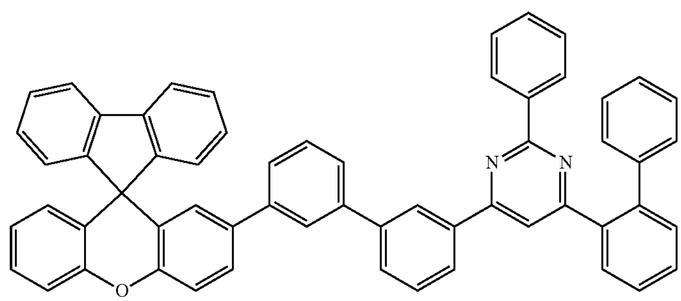
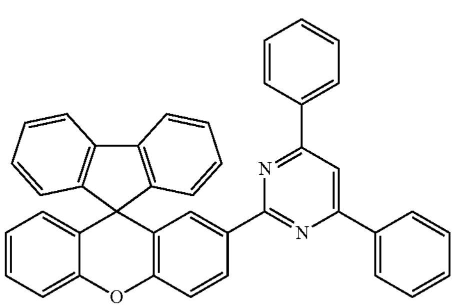
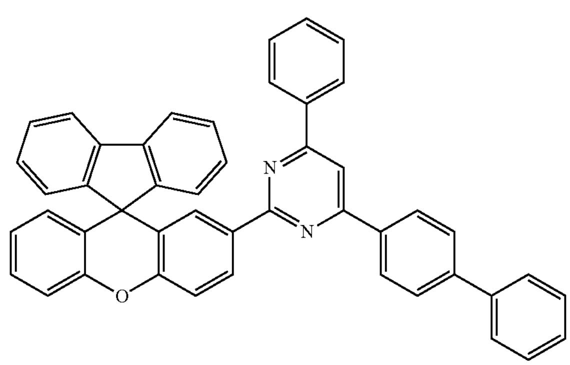

-continued
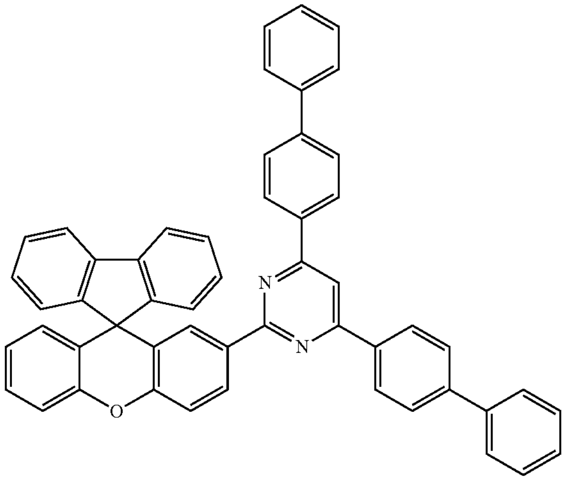
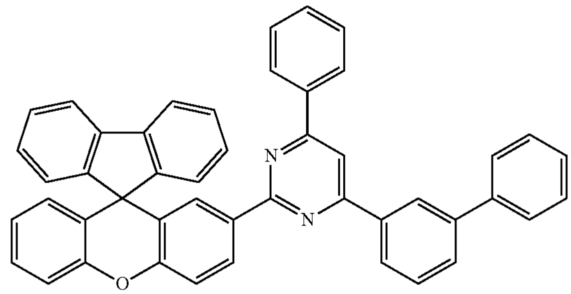
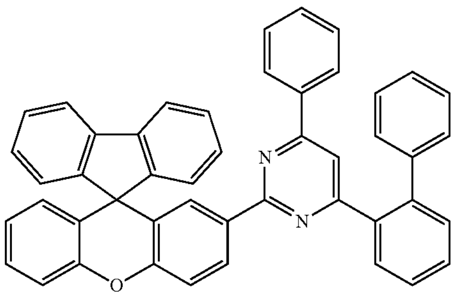
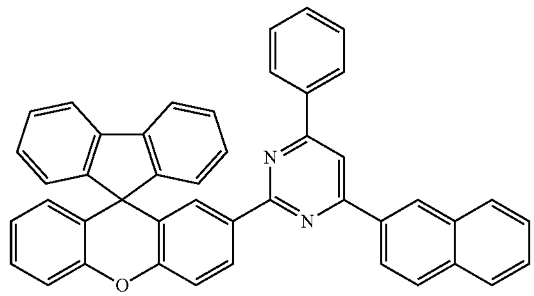
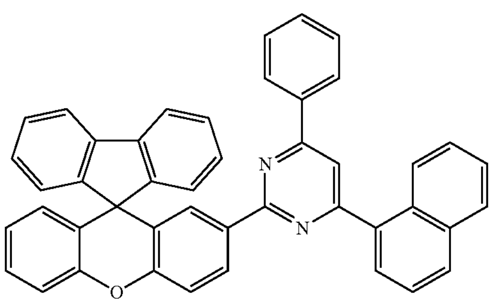
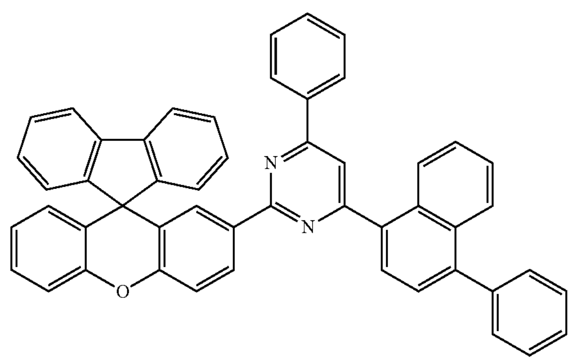
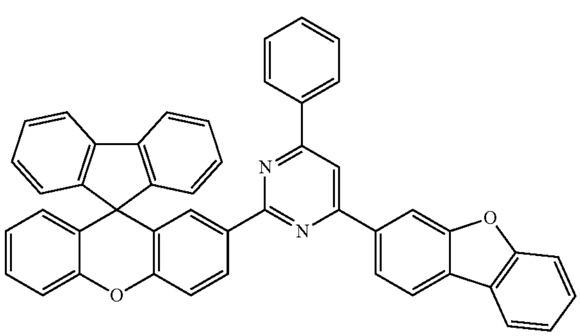

-continued
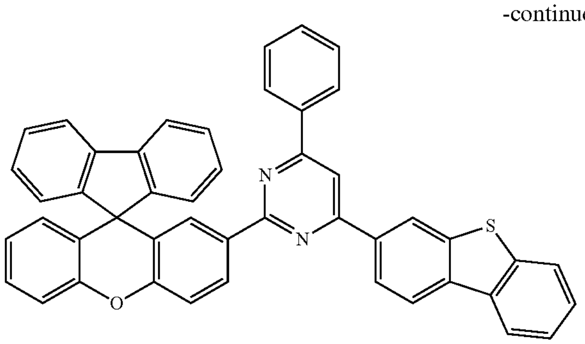
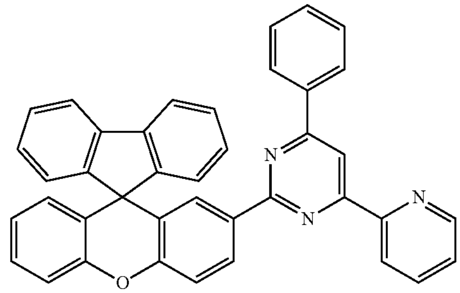
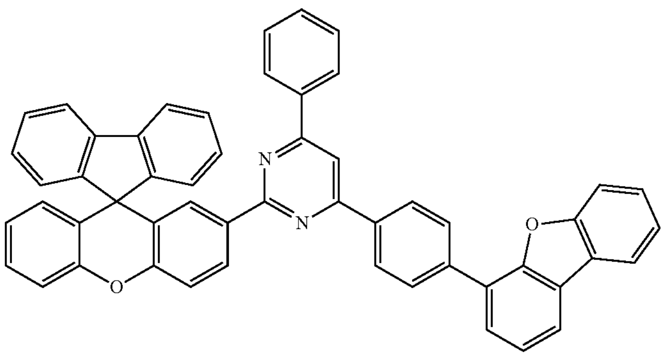
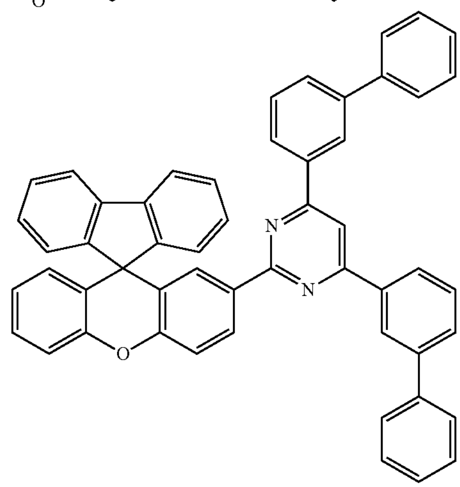
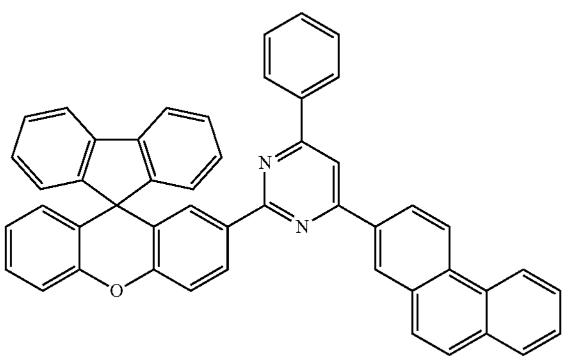
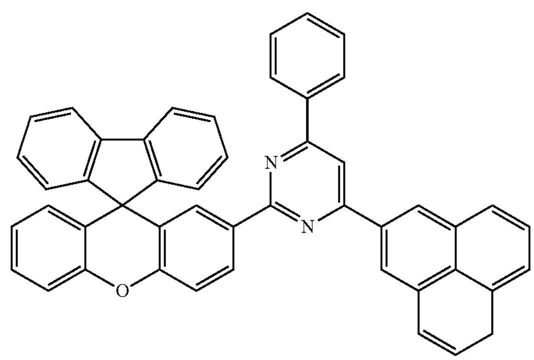
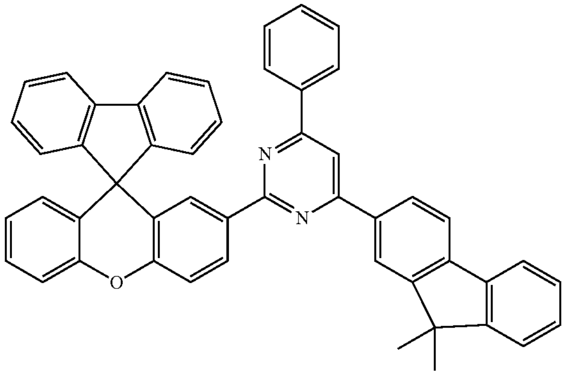
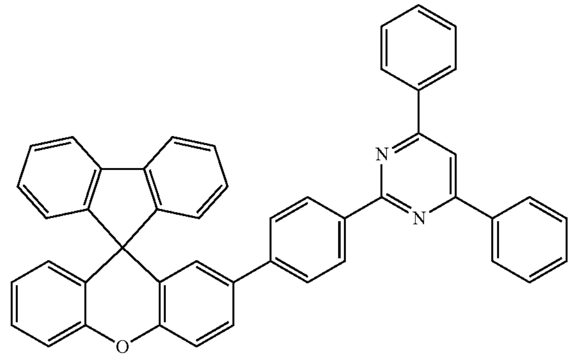

-continued
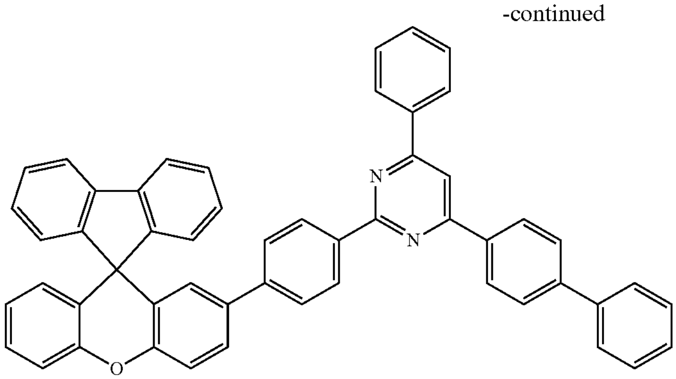
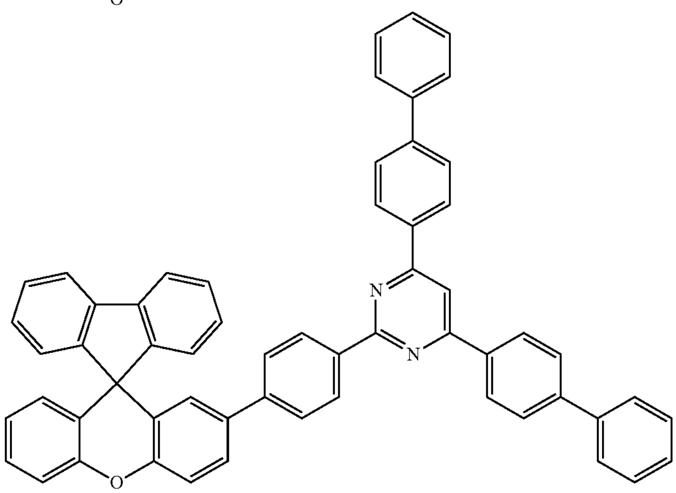
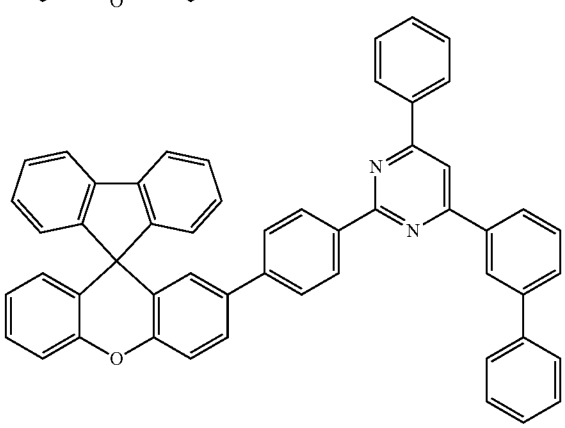
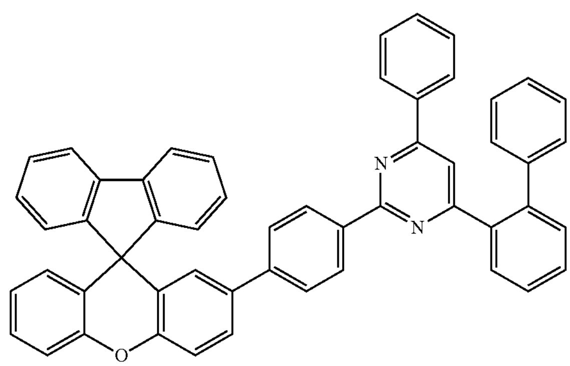
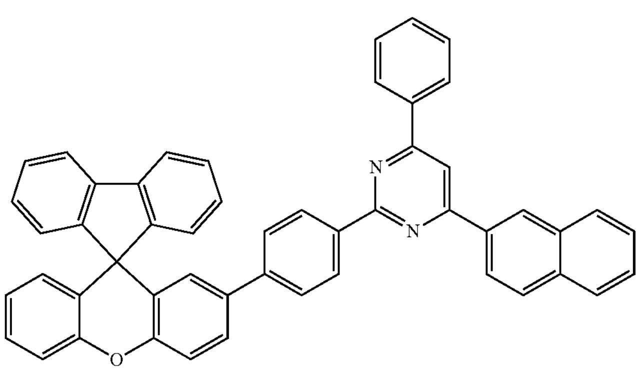

-continued
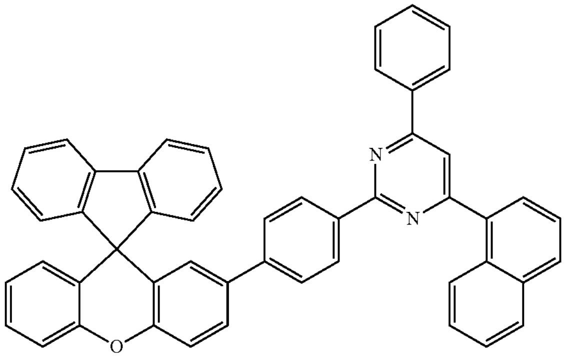
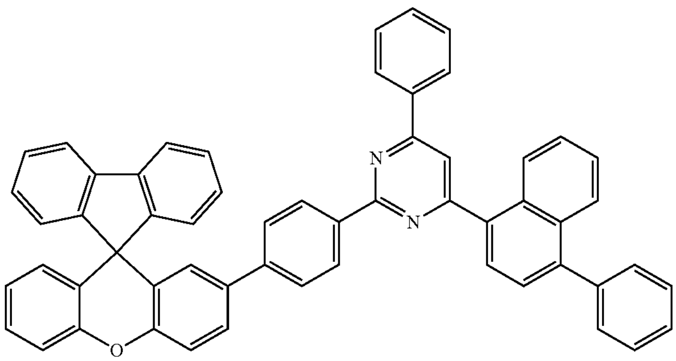
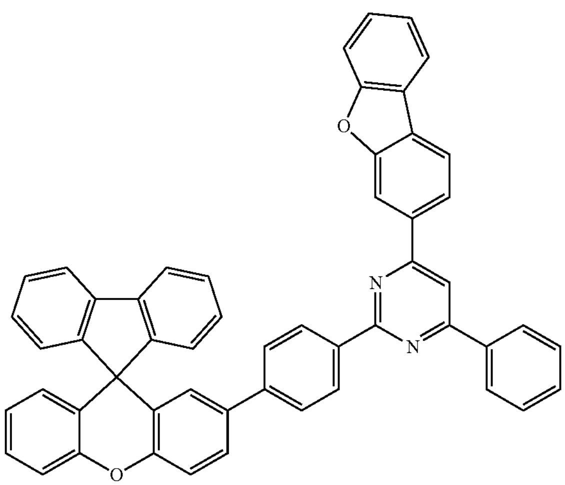
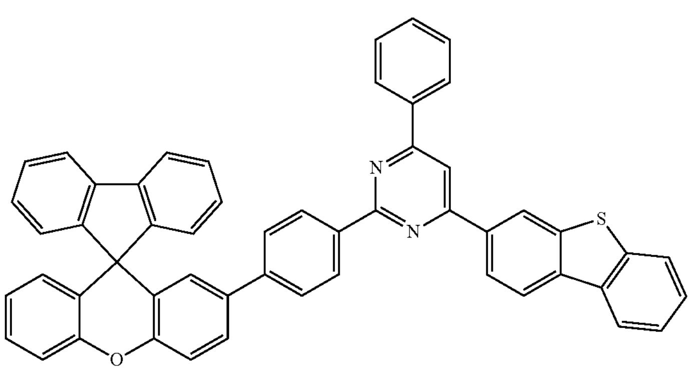

-continued
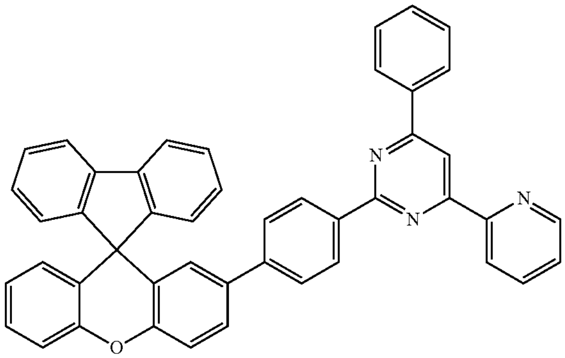
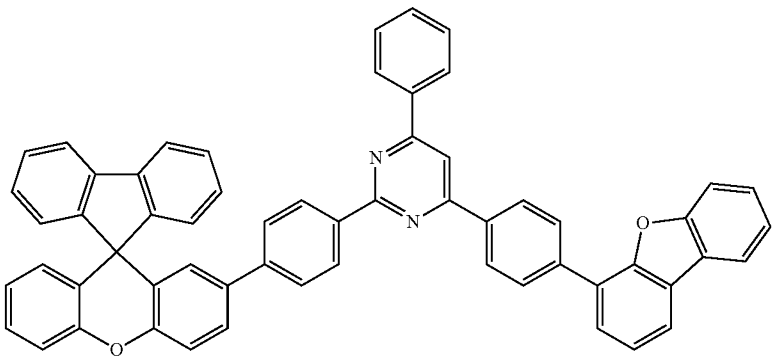
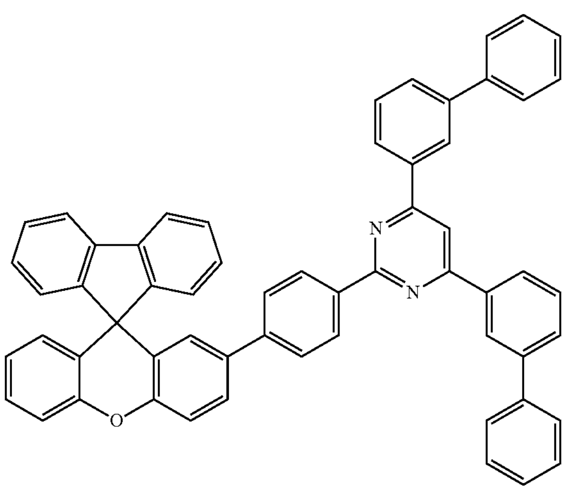
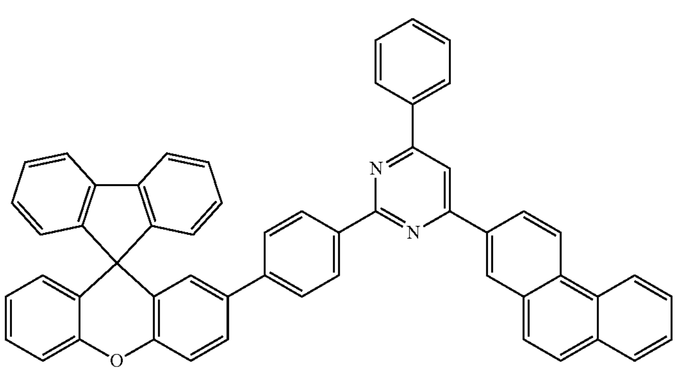

-continued
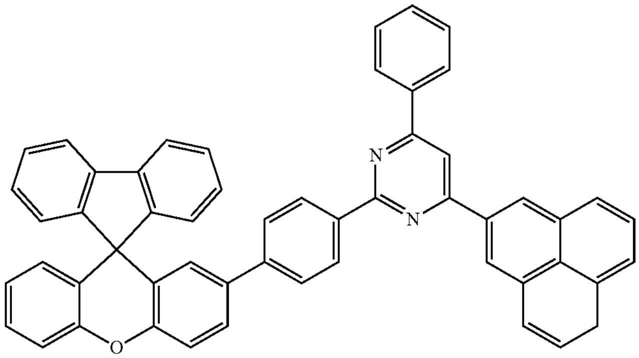
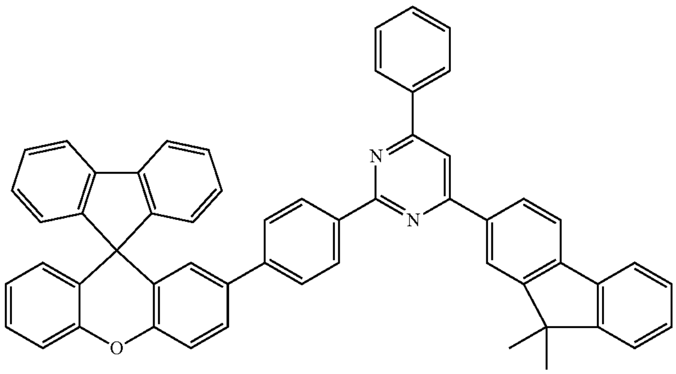
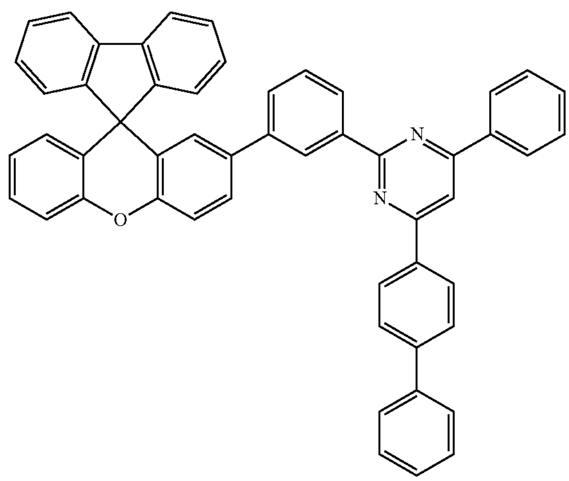
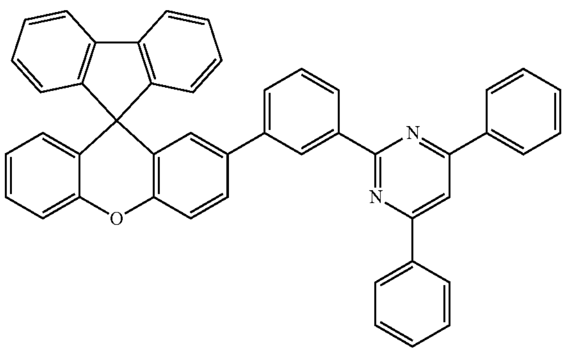
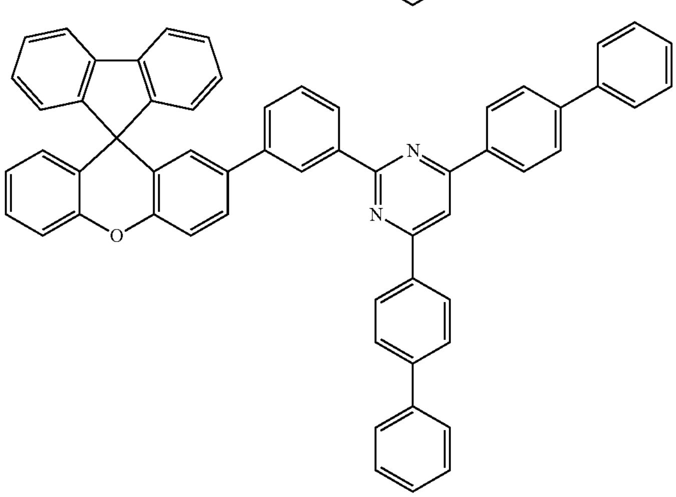

-continued
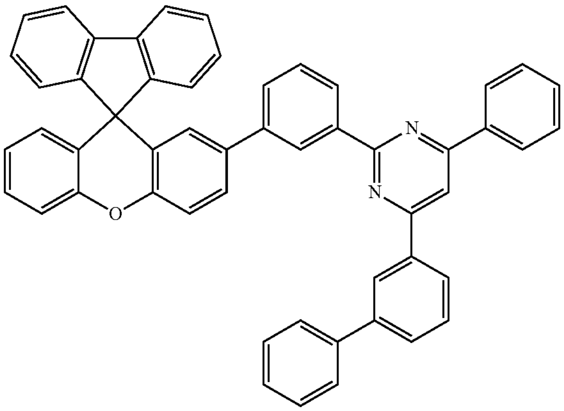
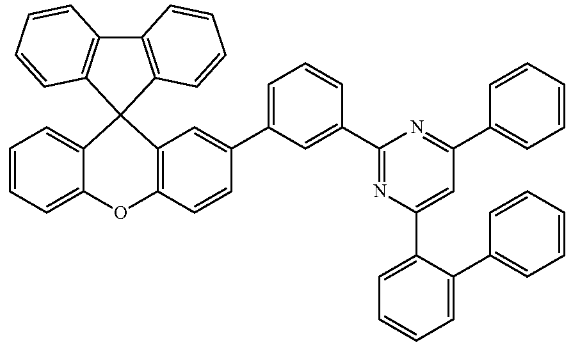
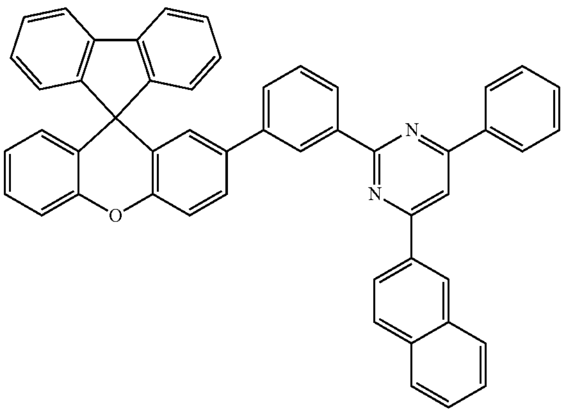
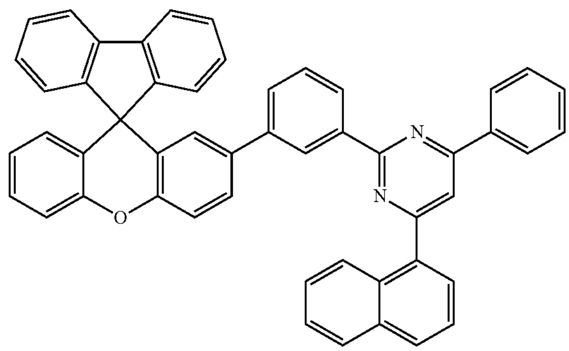
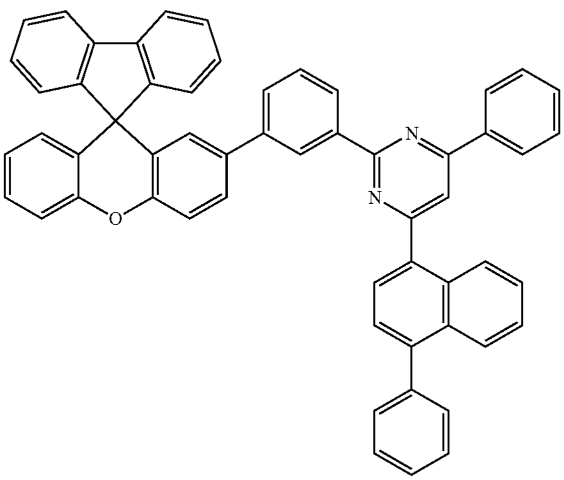
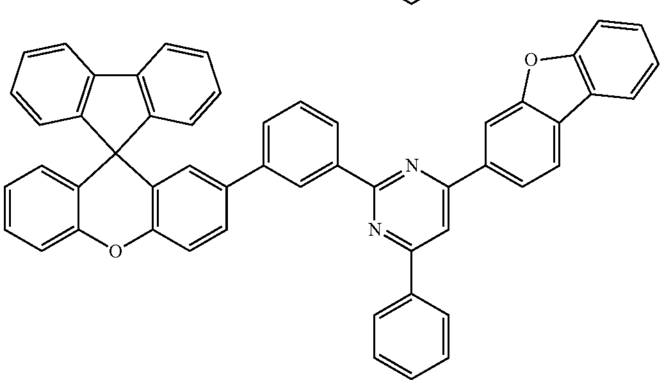

-continued
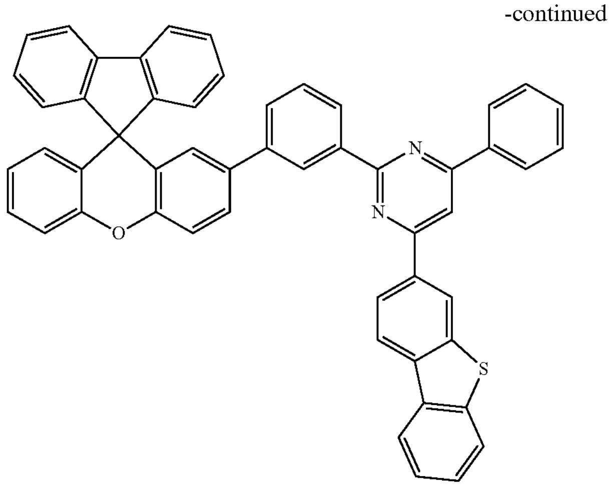
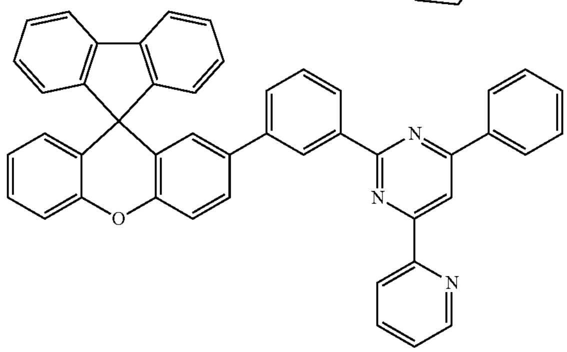
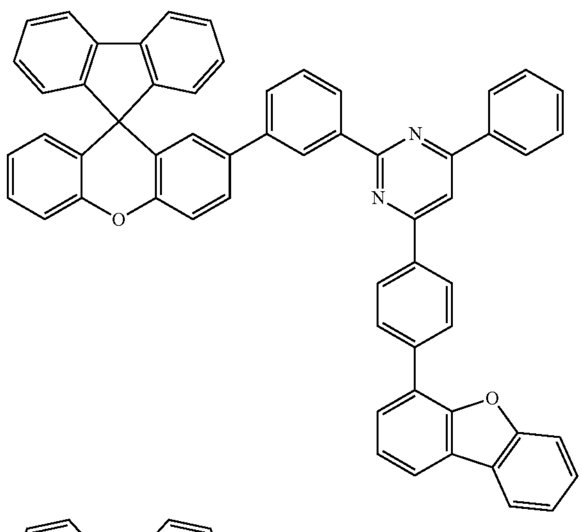
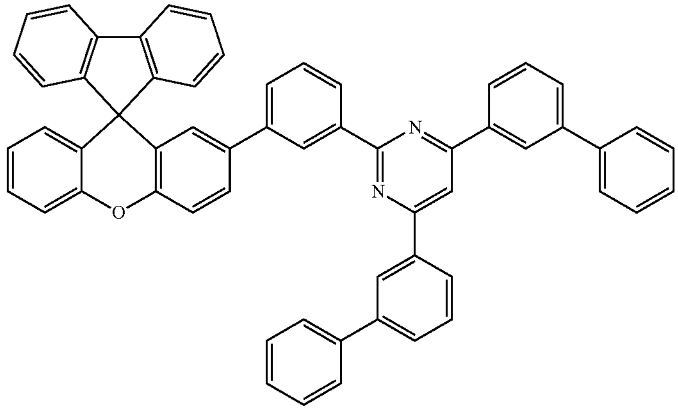

-continued
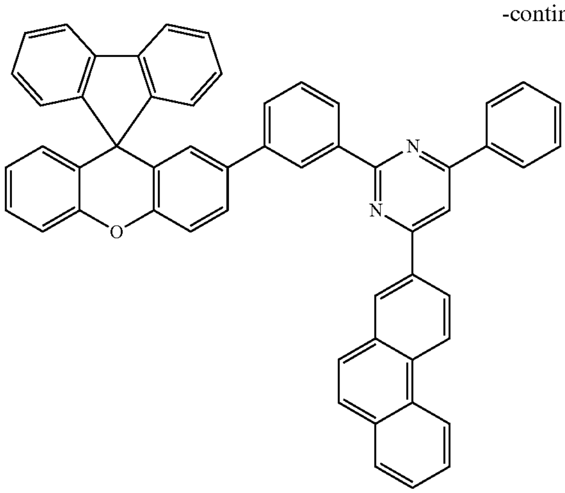
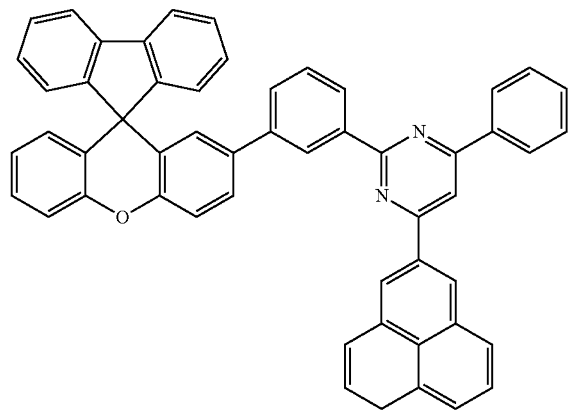
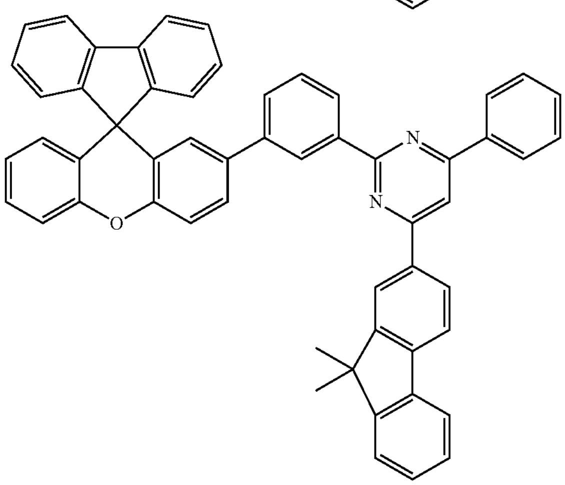
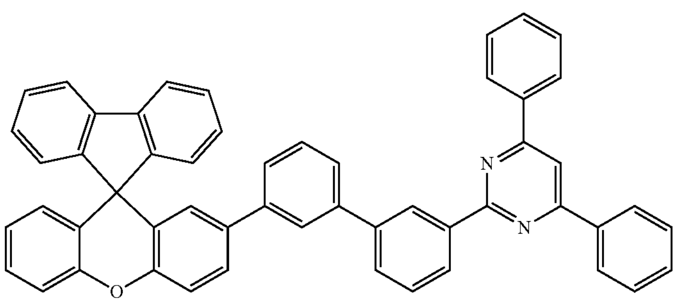
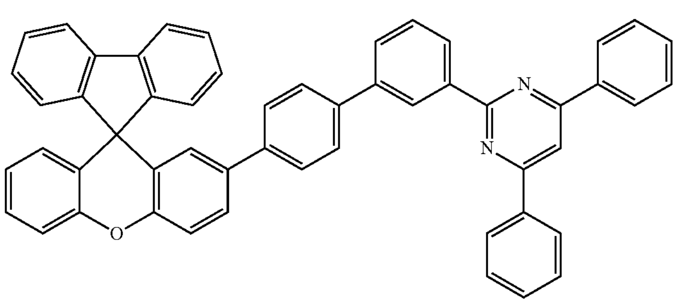

-continued
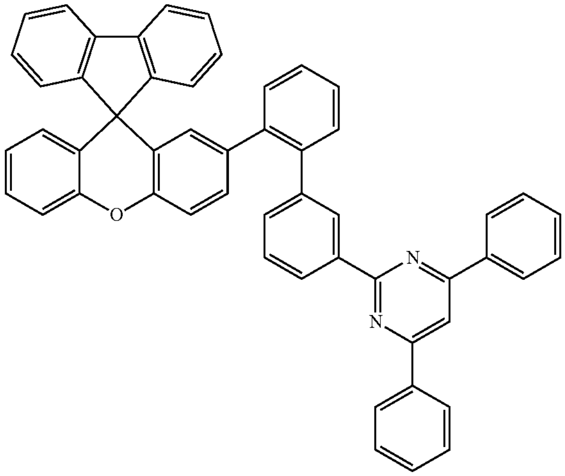
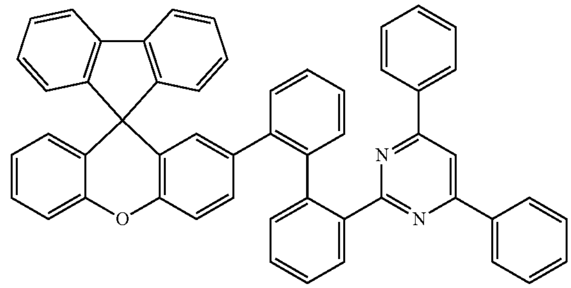
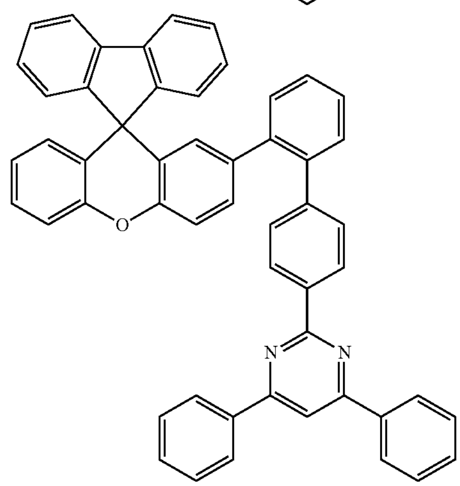
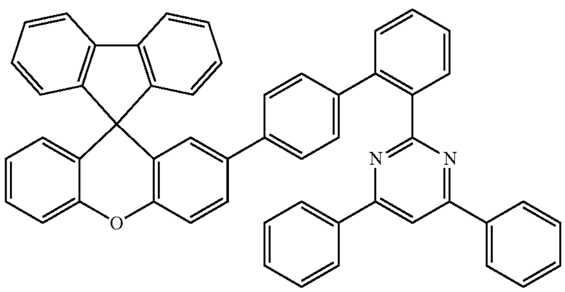
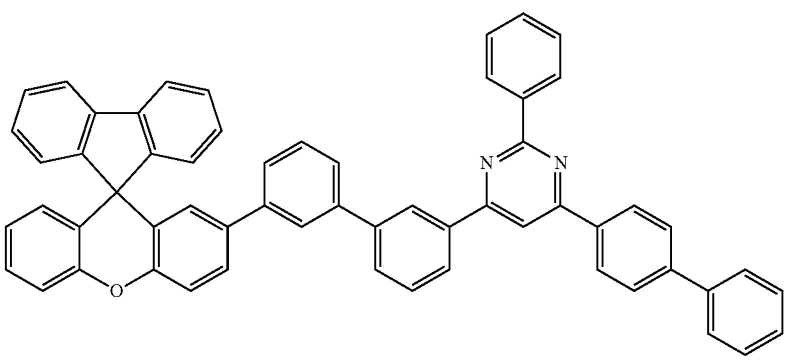
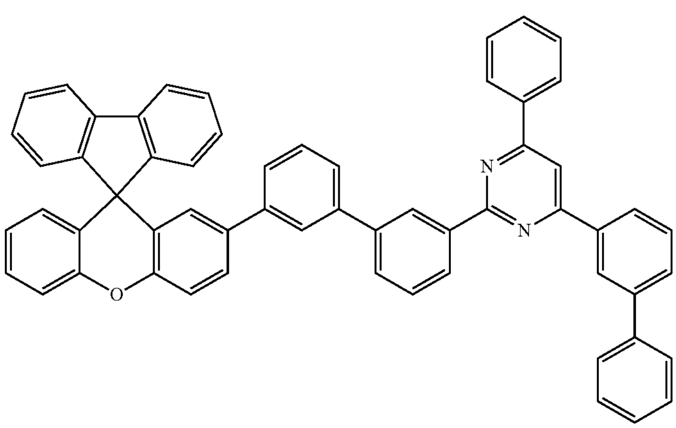

-continued
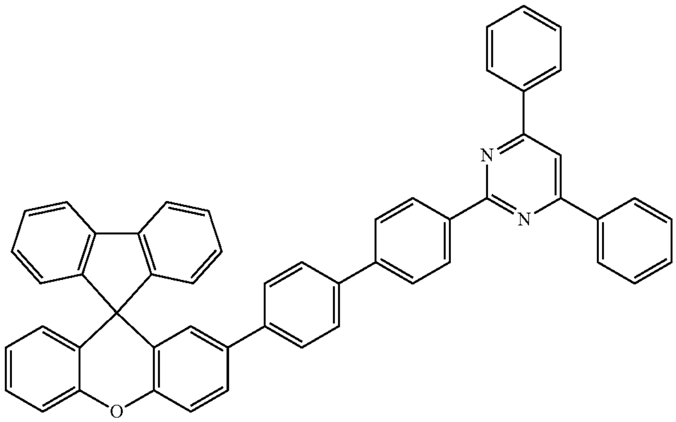
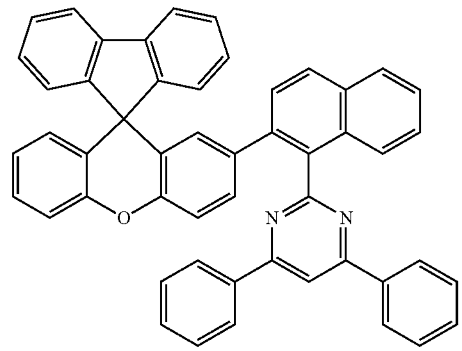
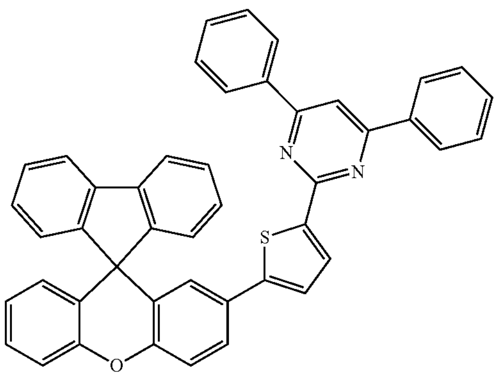
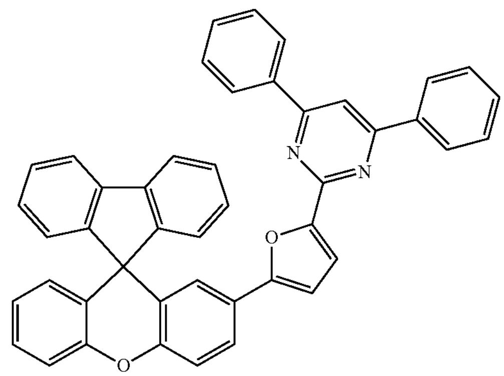
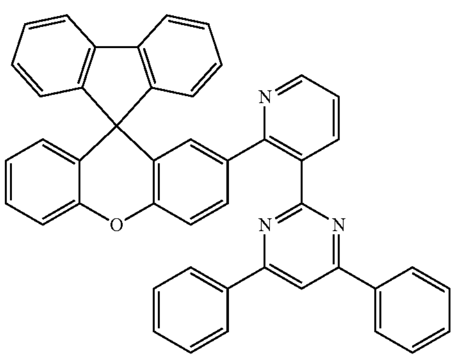
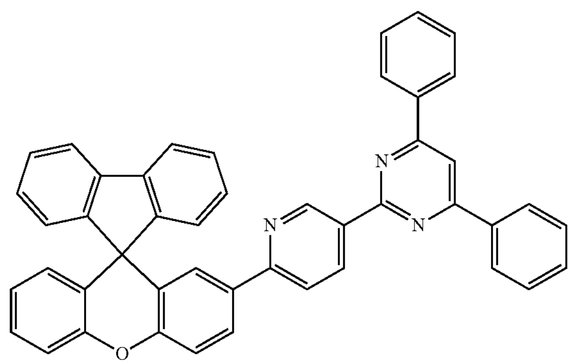
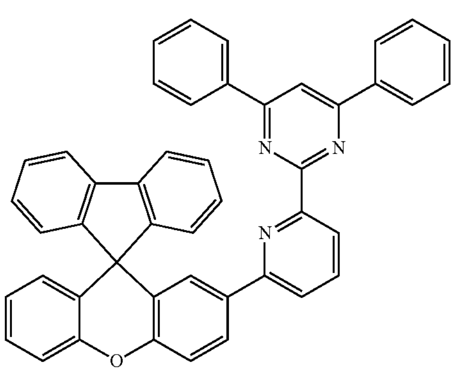
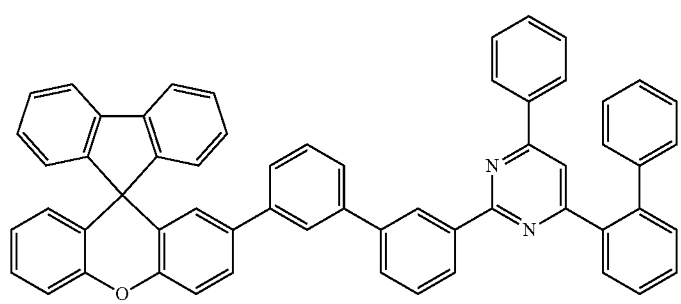

-continued
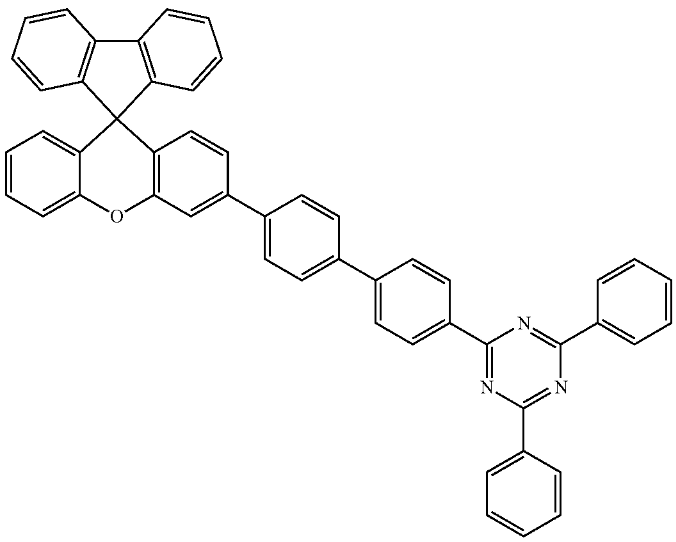
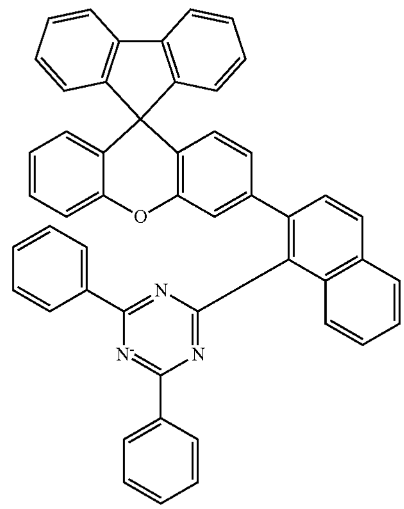
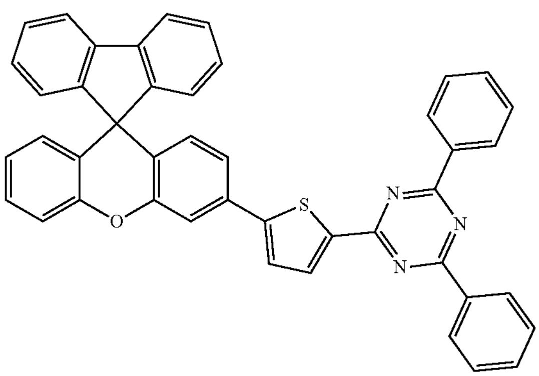
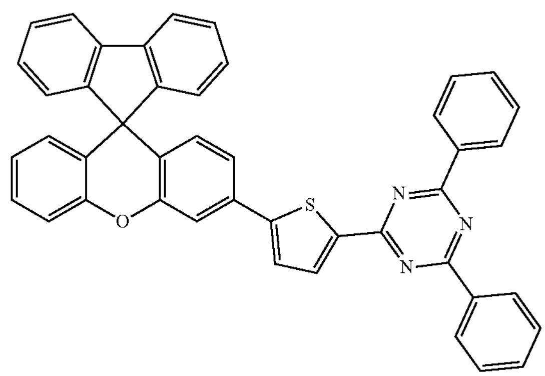
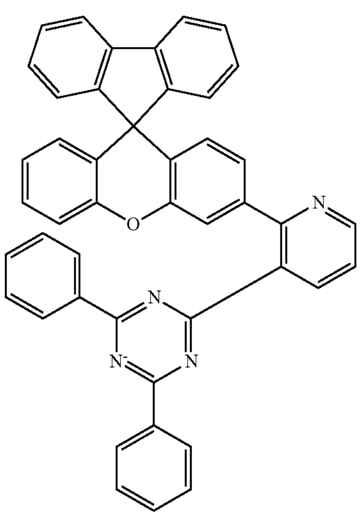
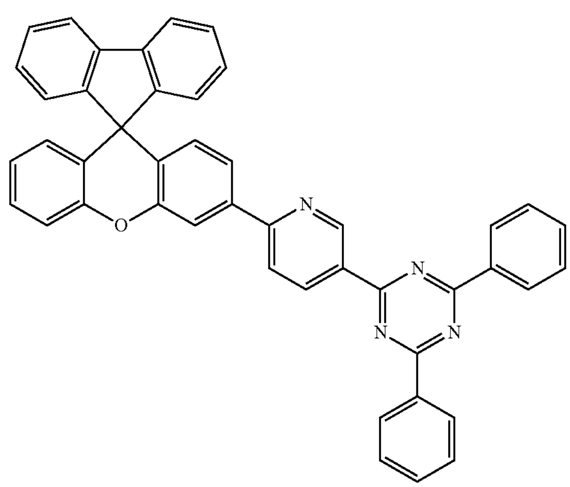
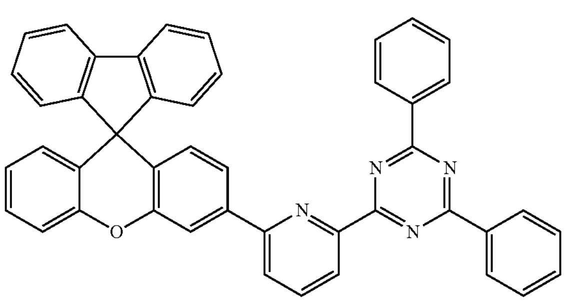

-continued
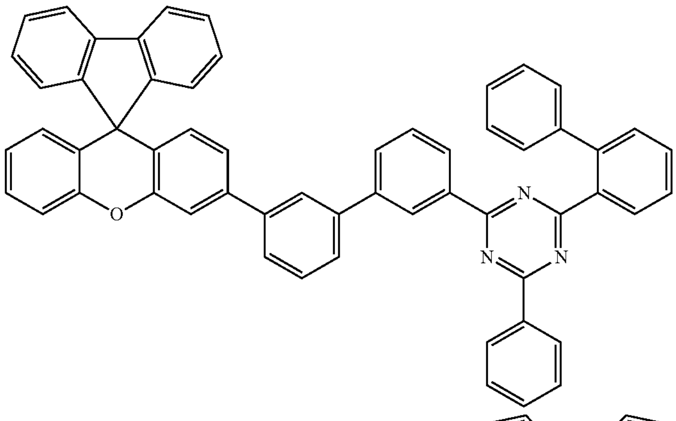
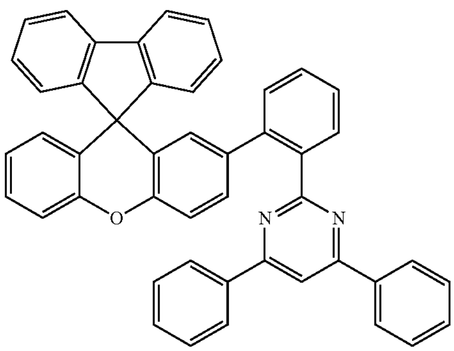
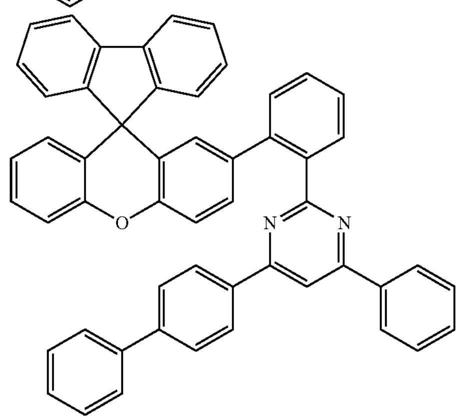
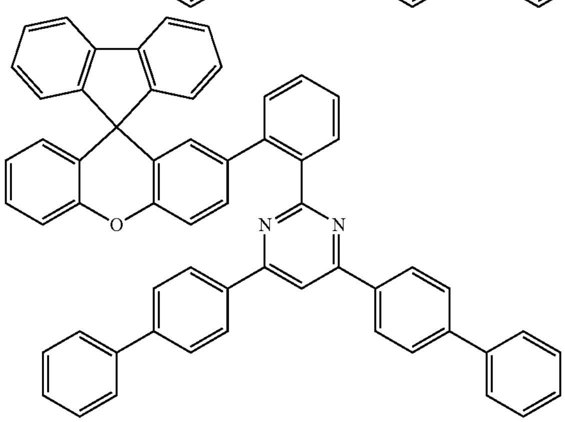
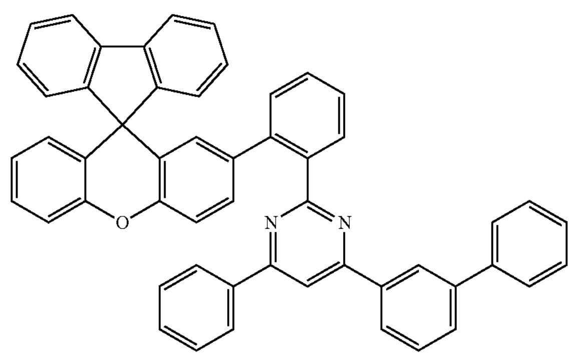
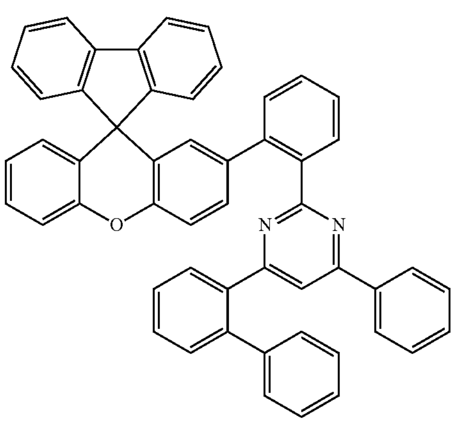
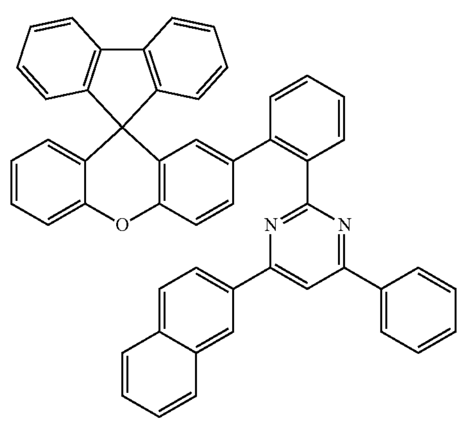

-continued
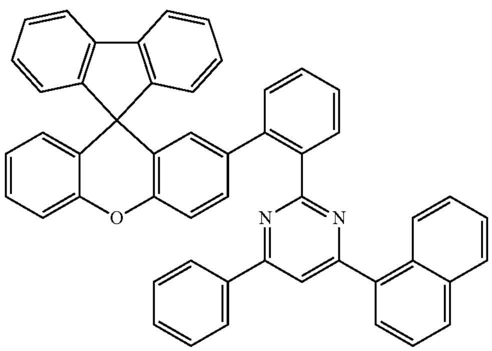
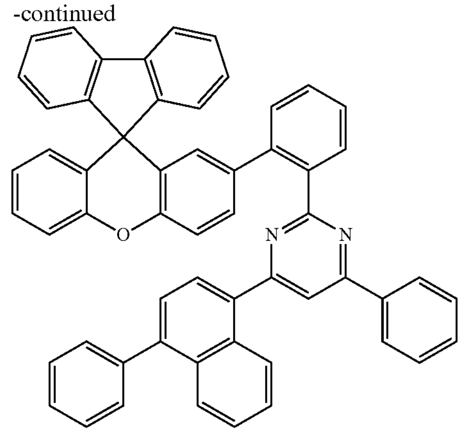
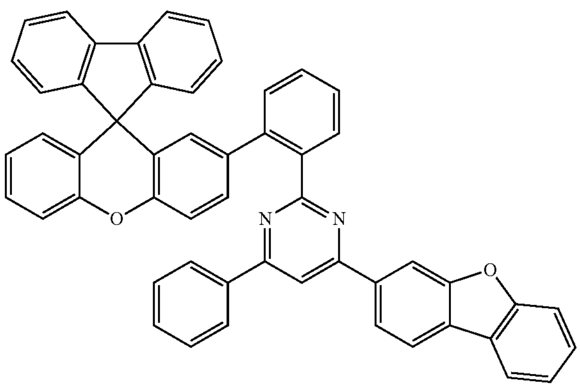
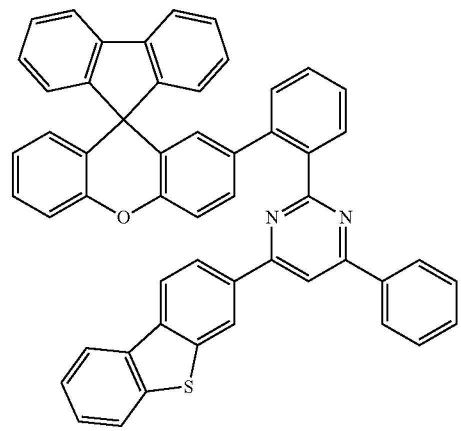
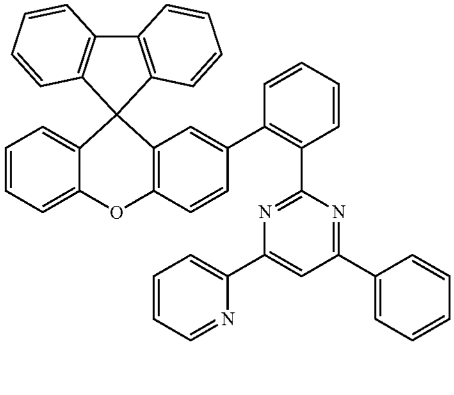
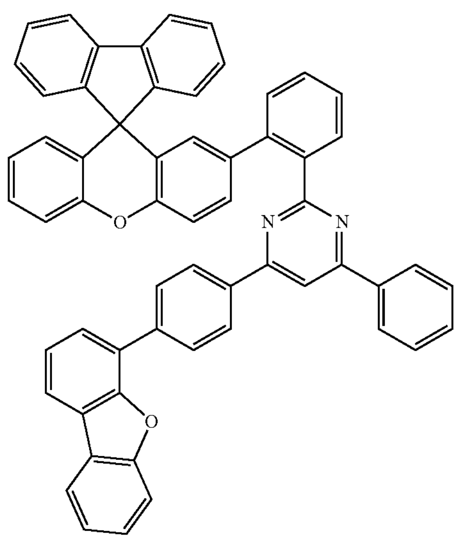

-continued
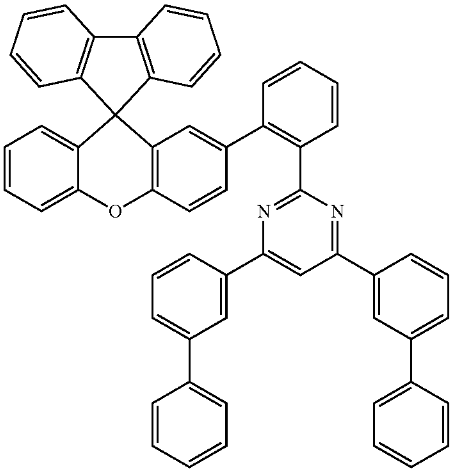
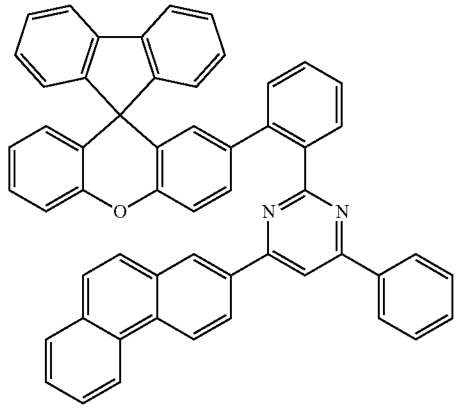
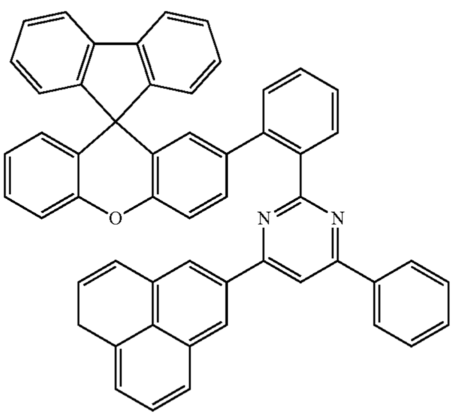
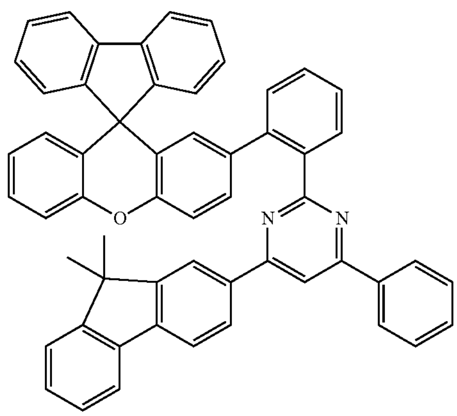
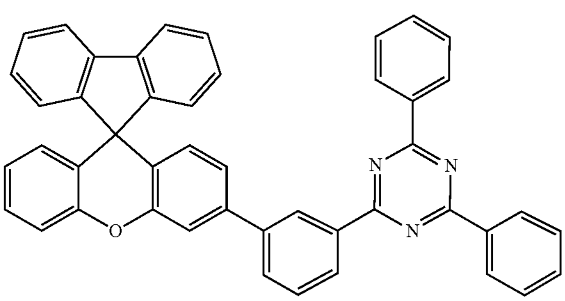
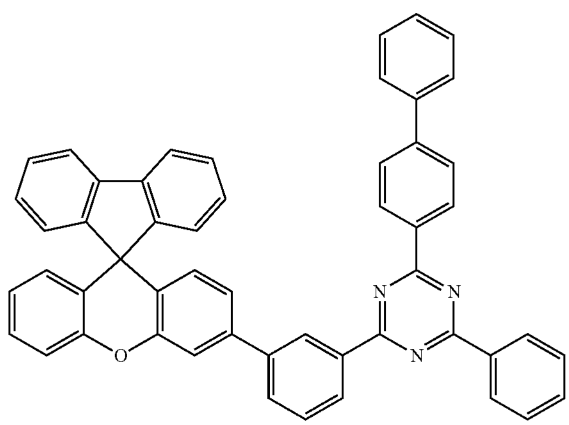

-continued
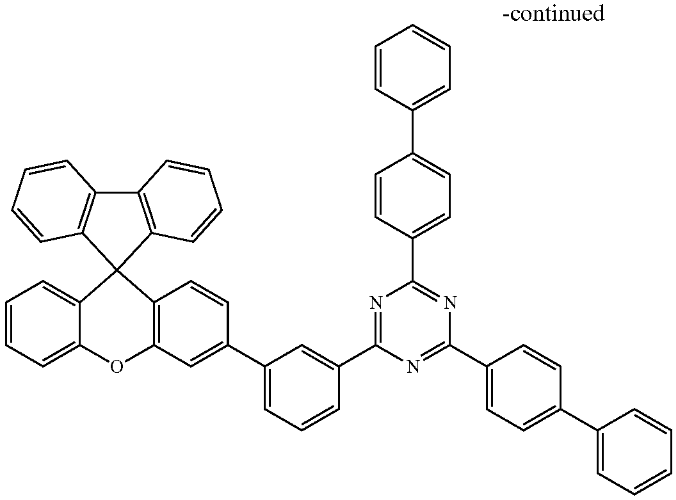
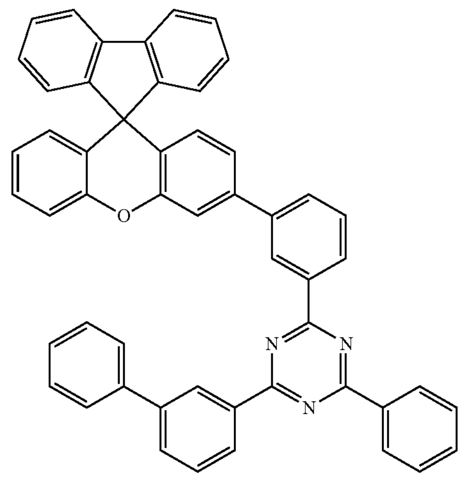
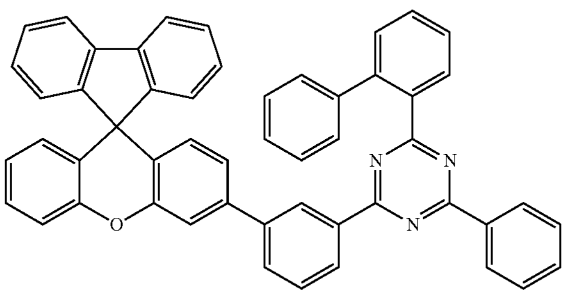
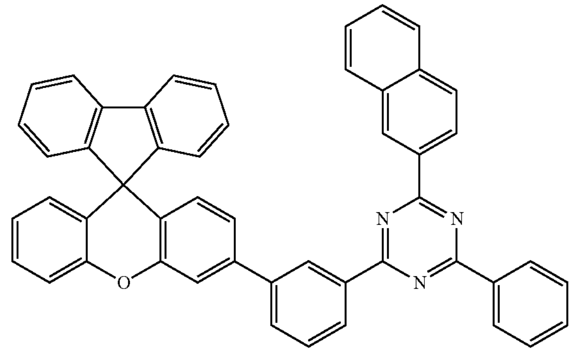
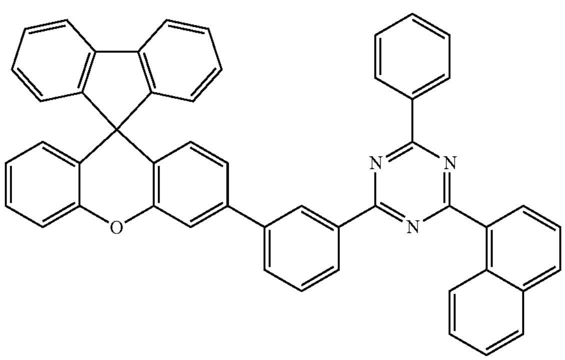
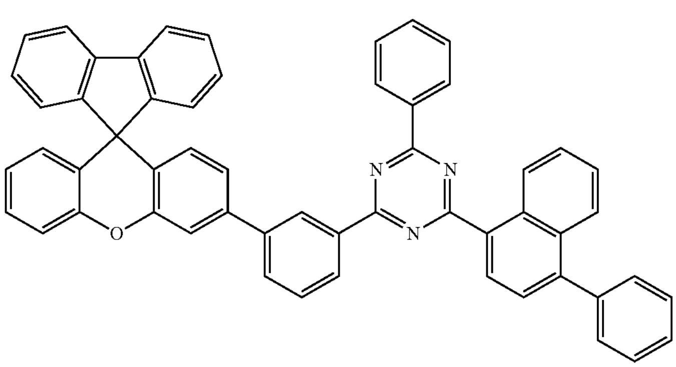

-continued
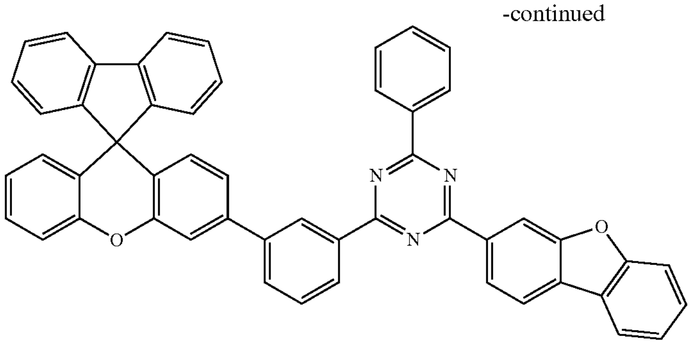
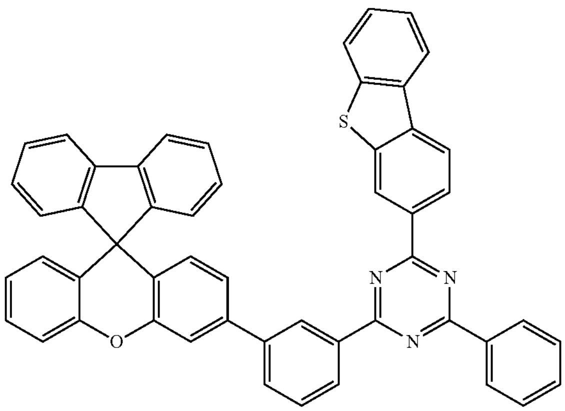
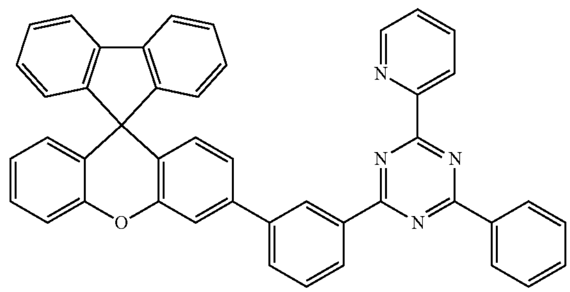
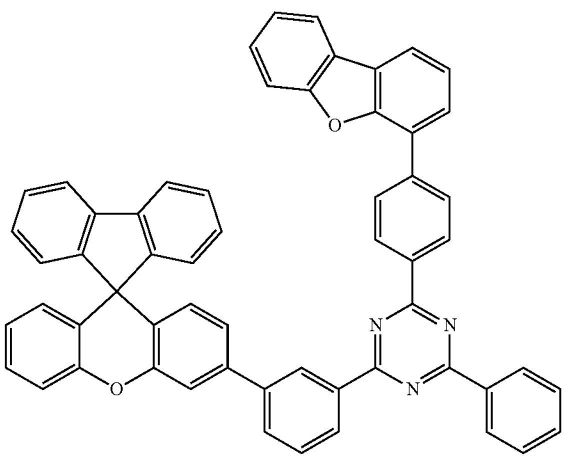
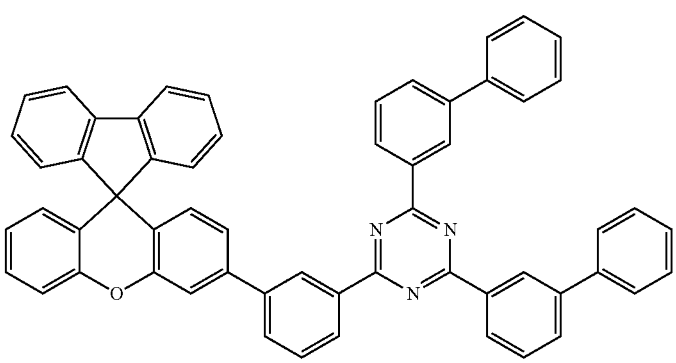

-continued
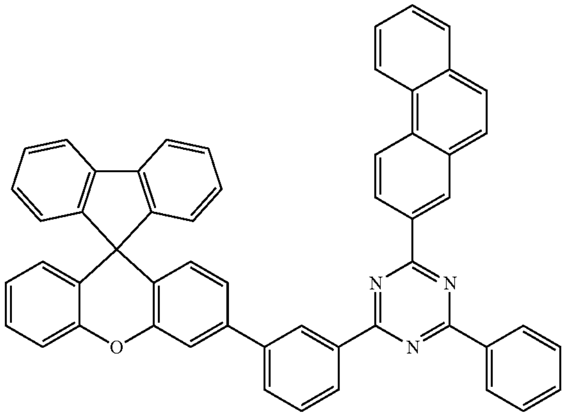
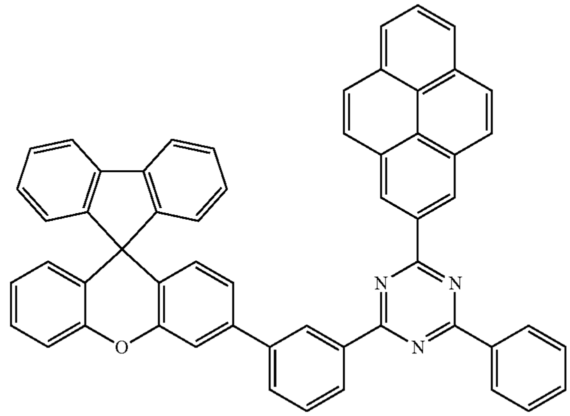
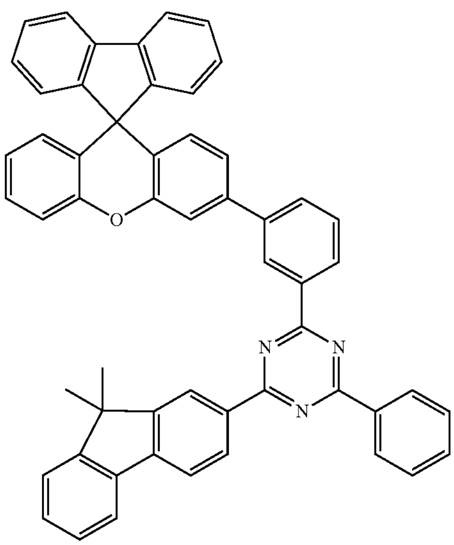
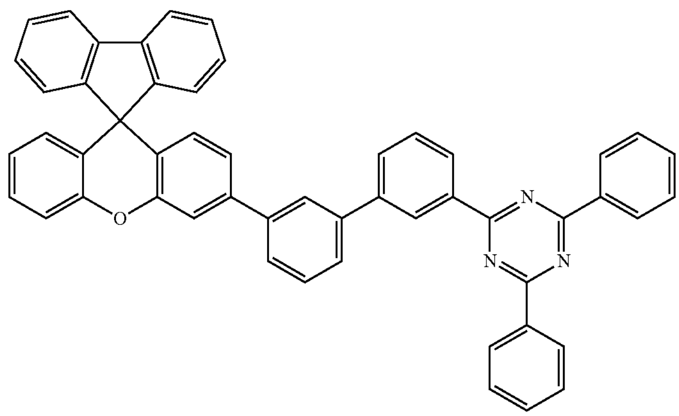
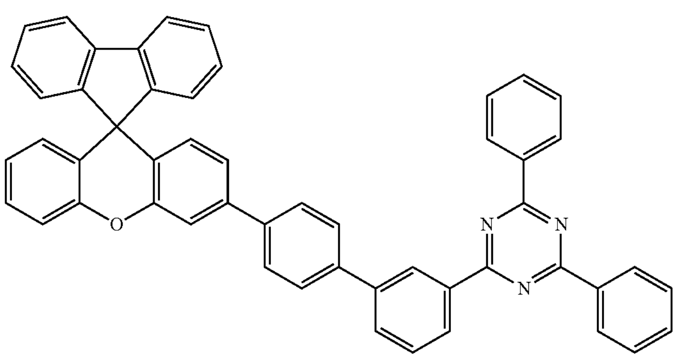

-continued
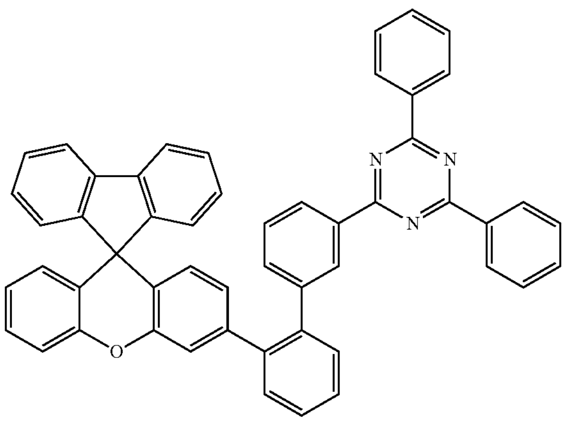
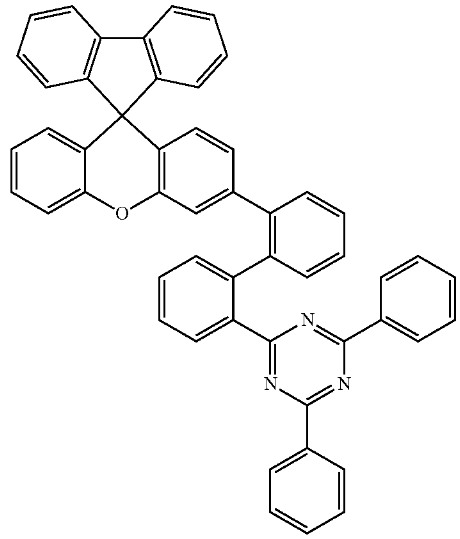
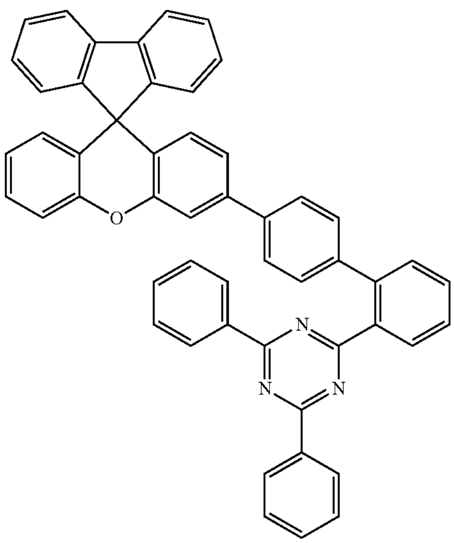
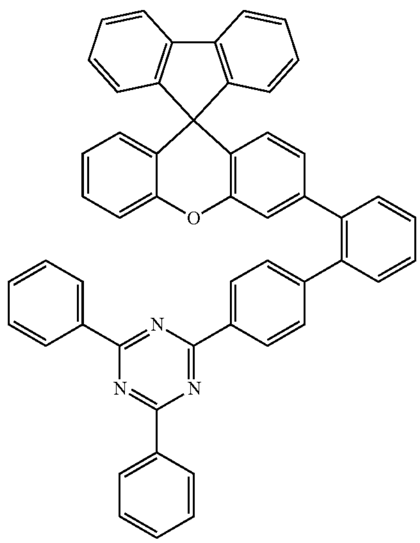
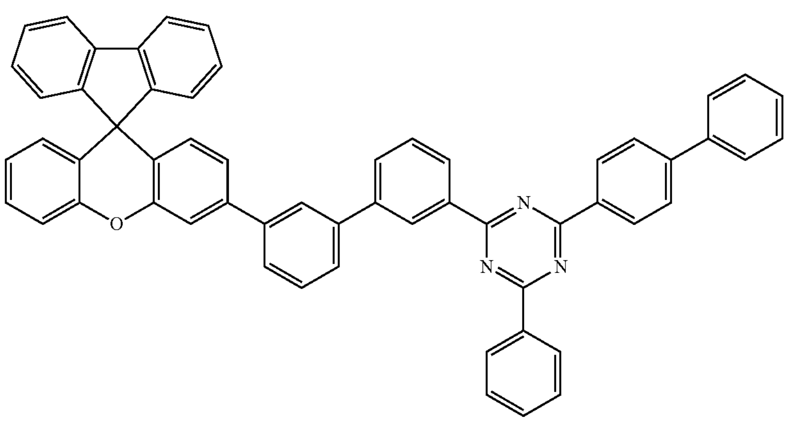

-continued
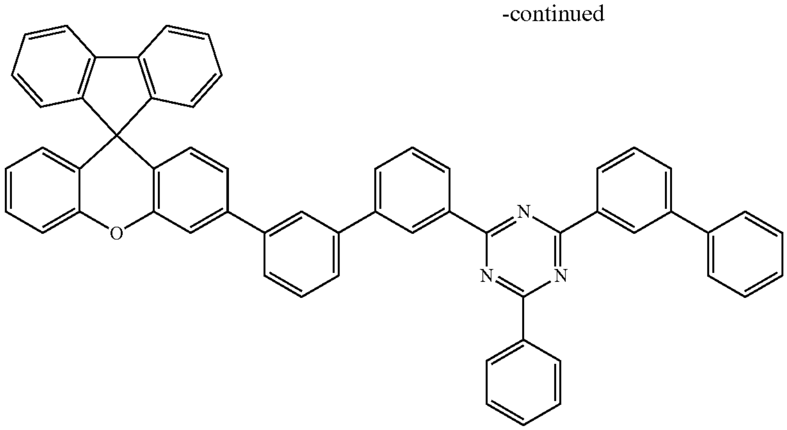
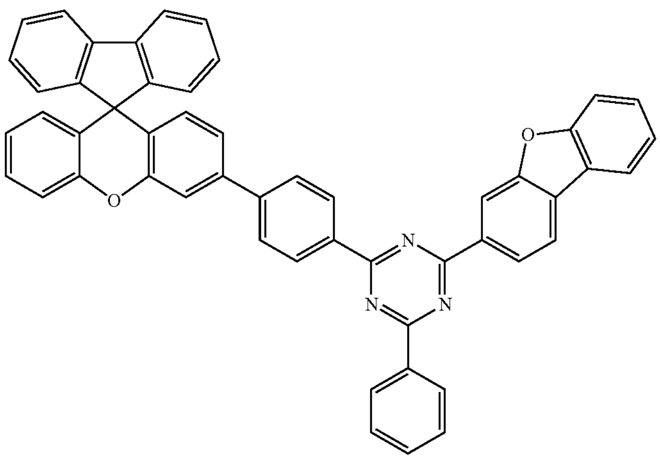
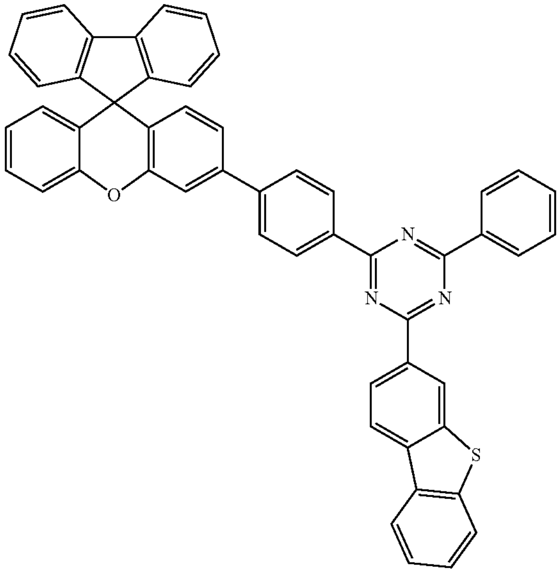
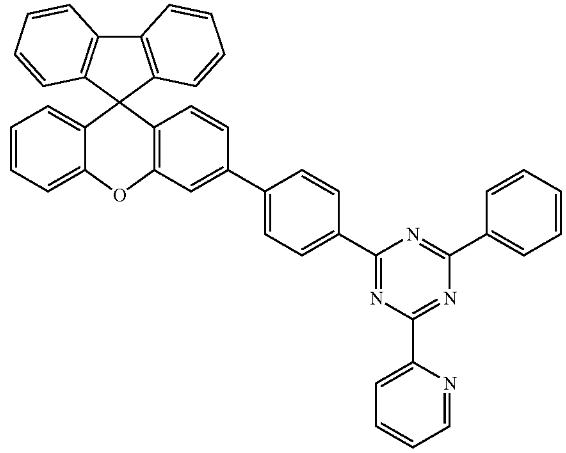

-continued
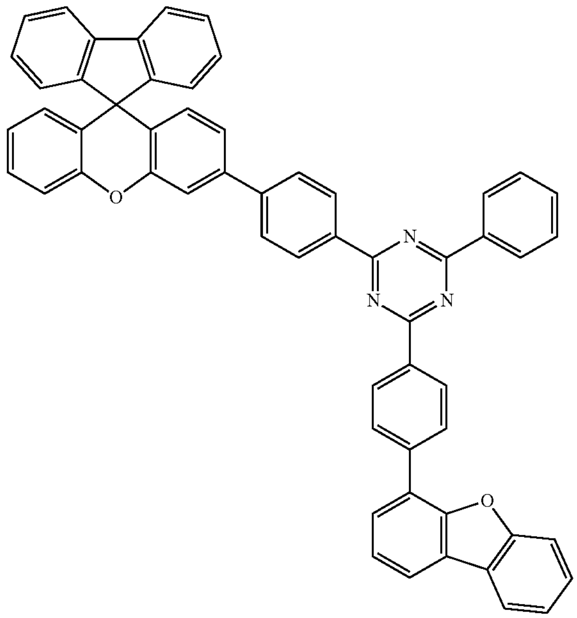
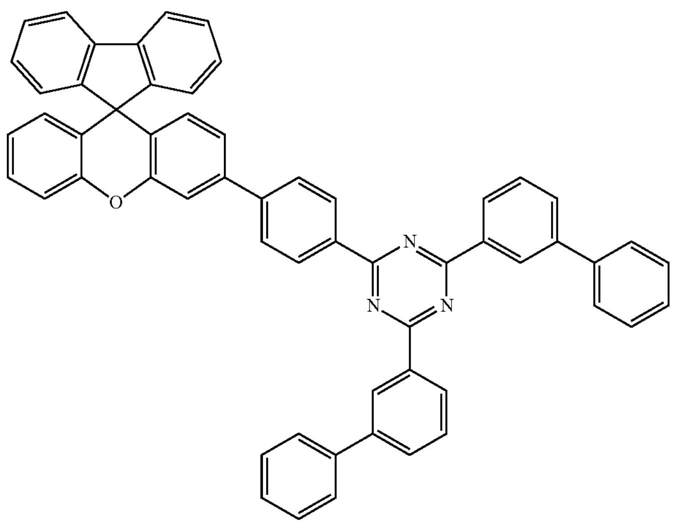
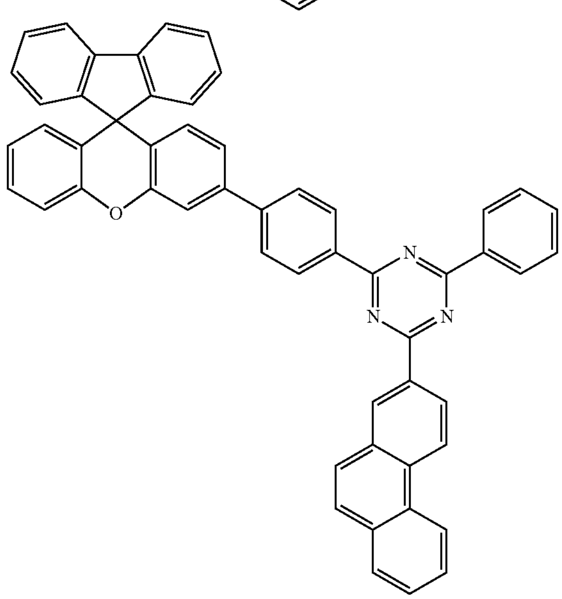
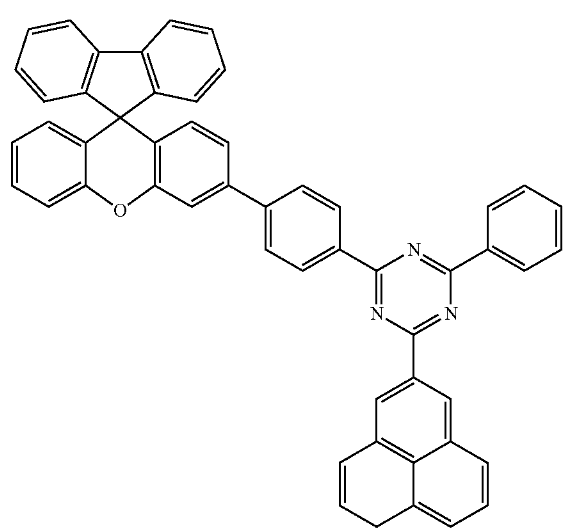

-continued
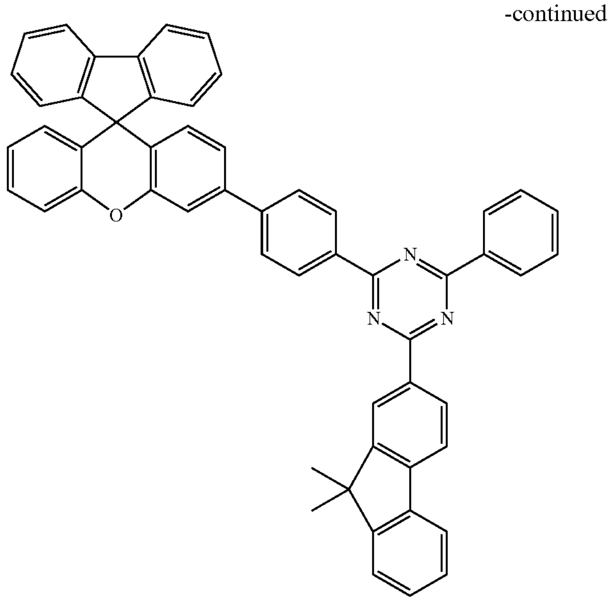
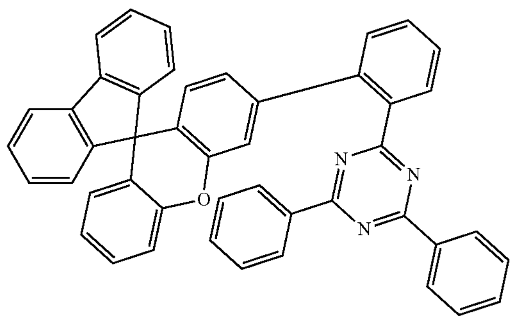
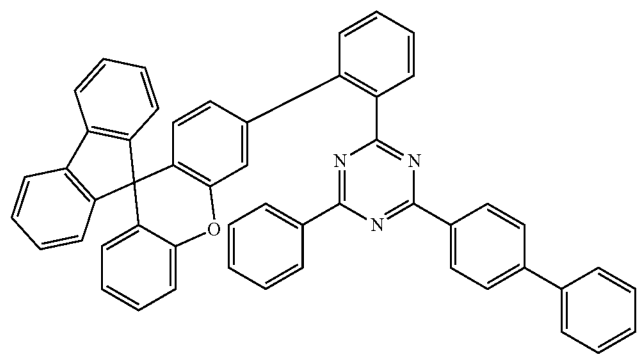
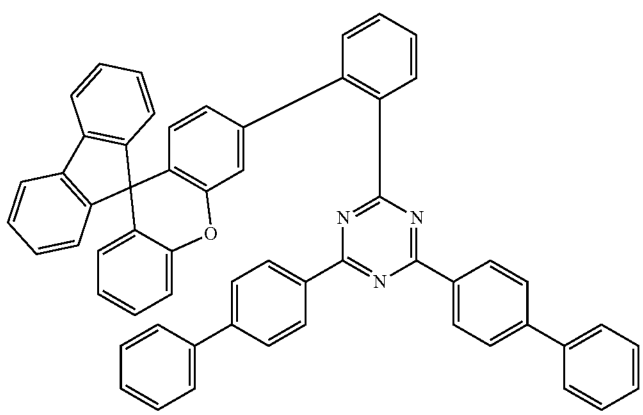
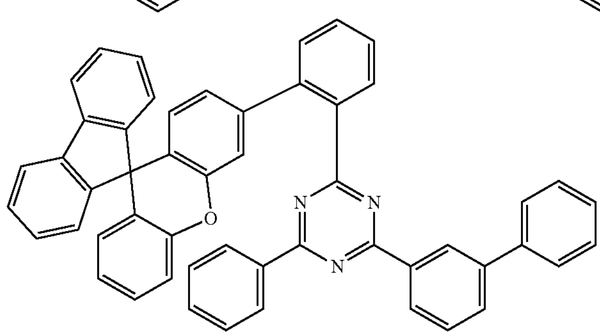
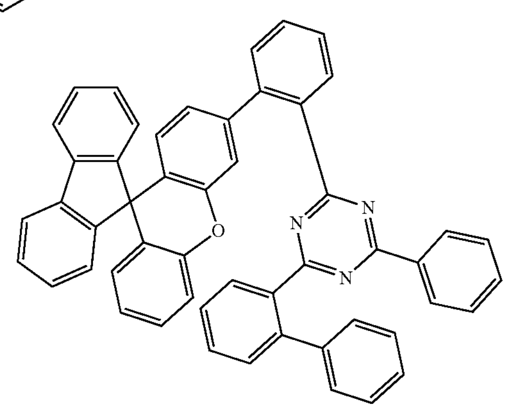

-continued
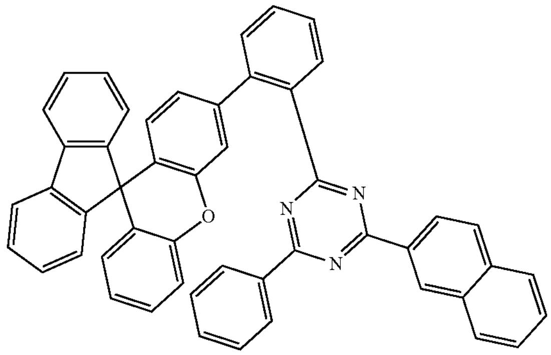
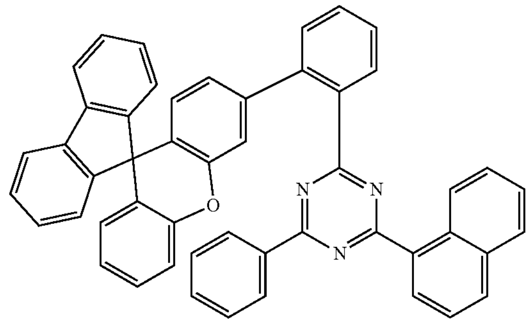
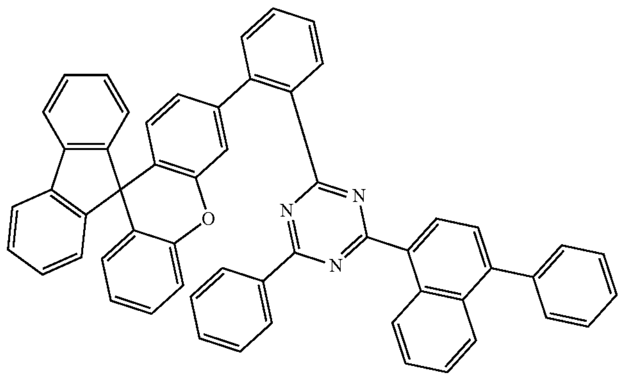
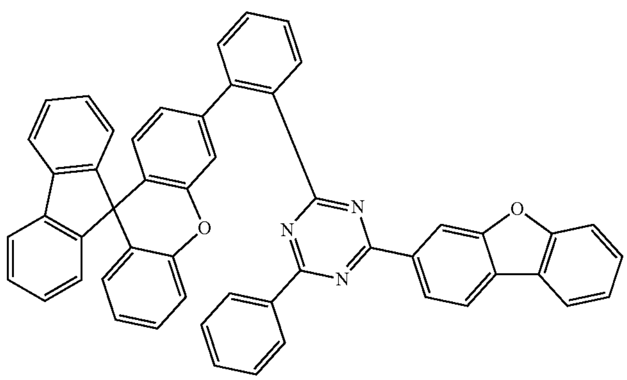
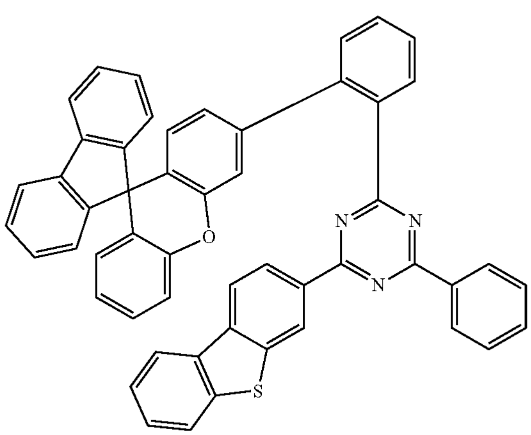

-continued
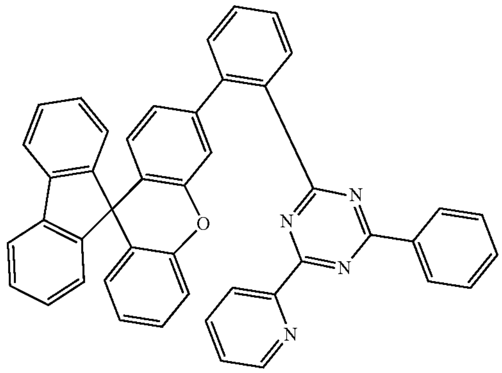
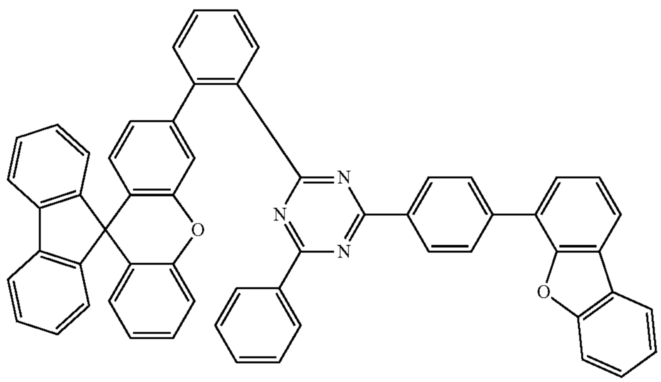
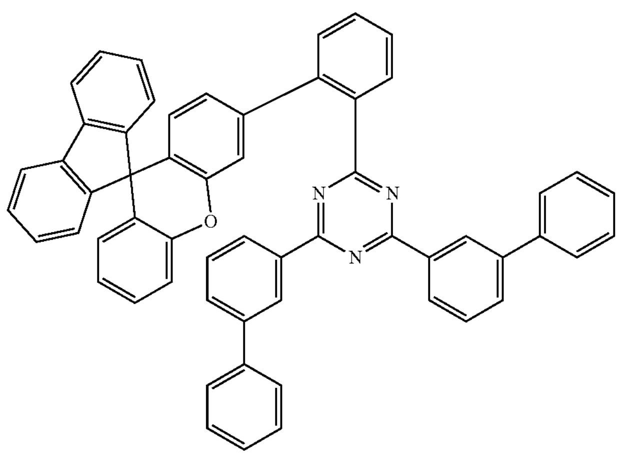
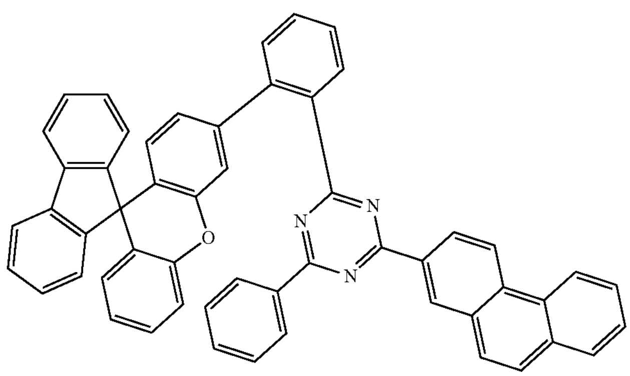

-continued
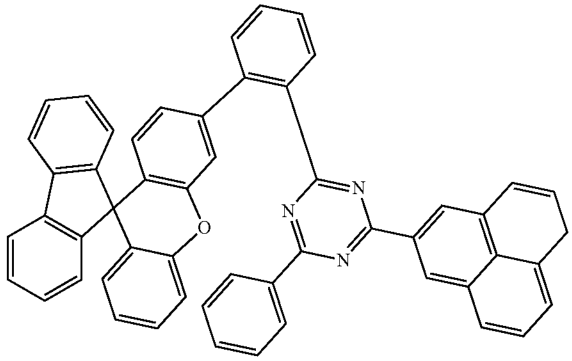
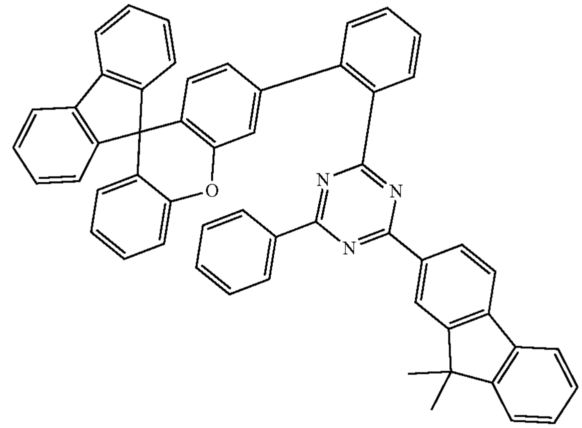
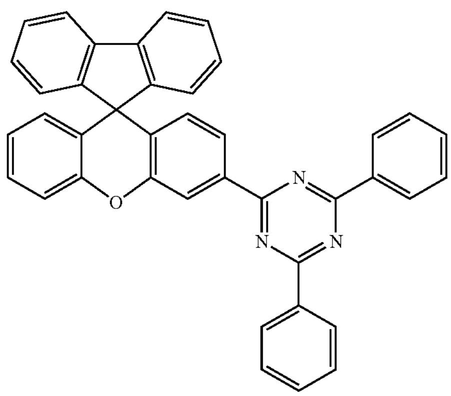
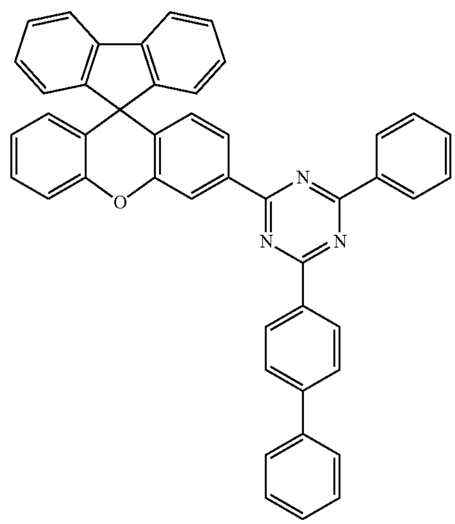
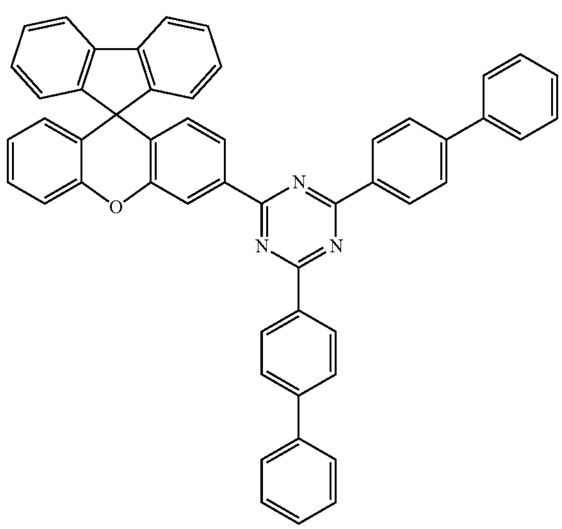
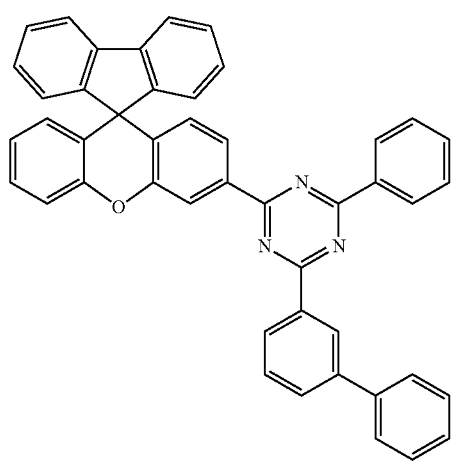

-continued
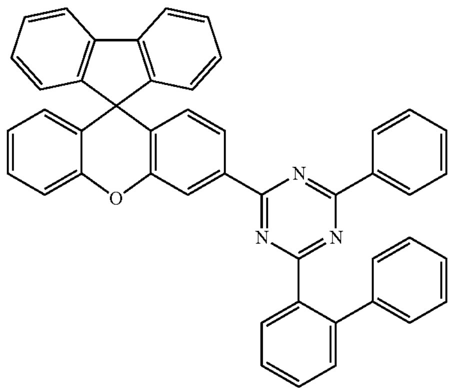
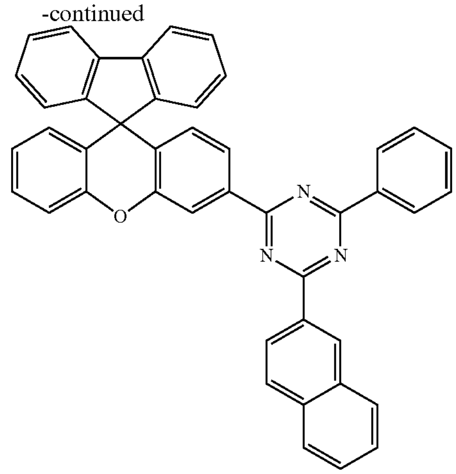
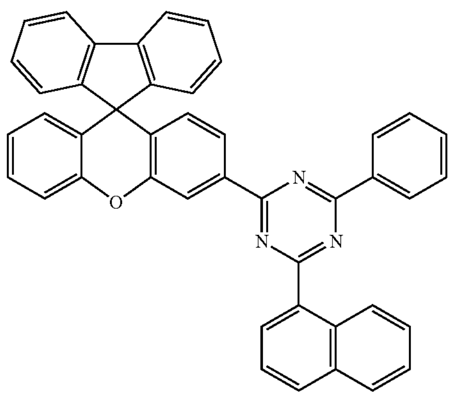
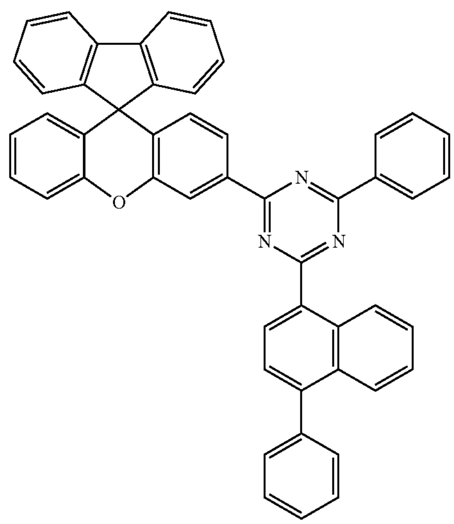
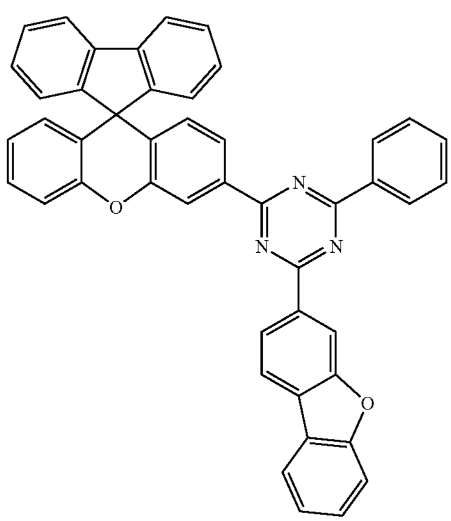
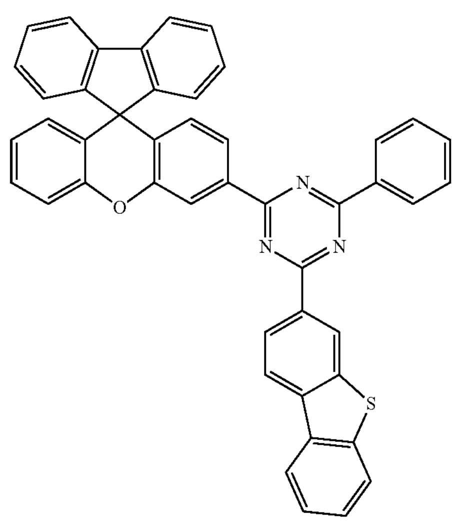

-continued
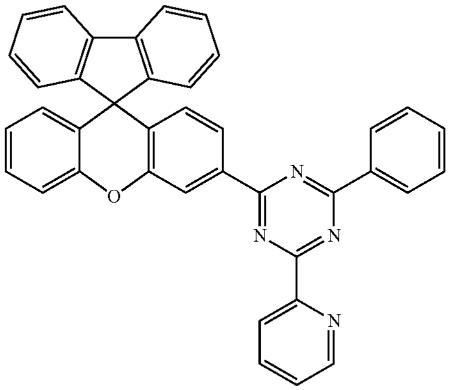
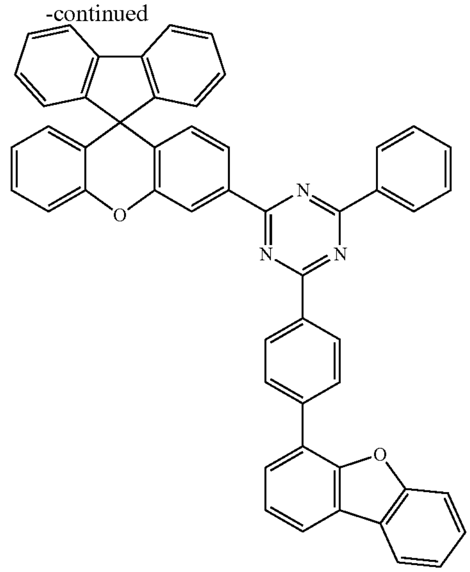
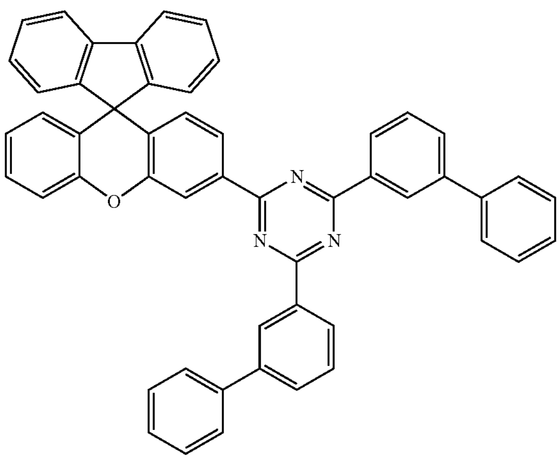
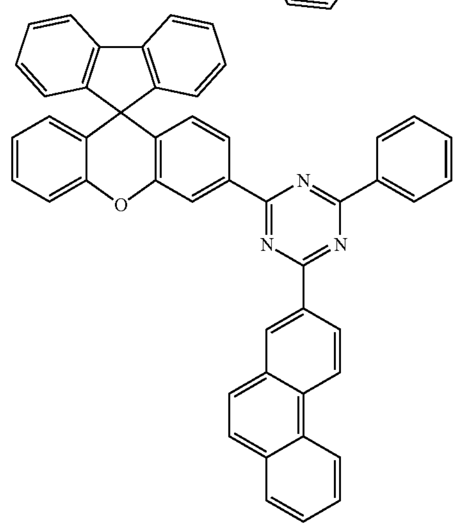
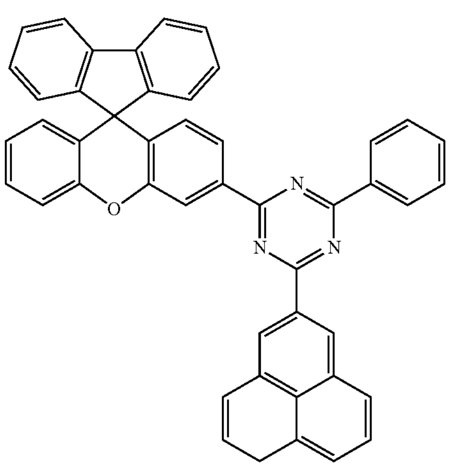
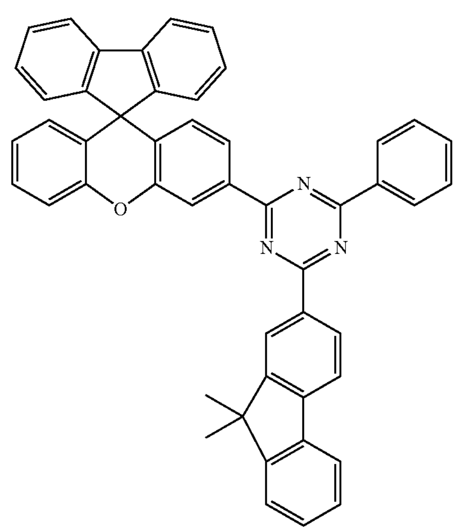

-continued
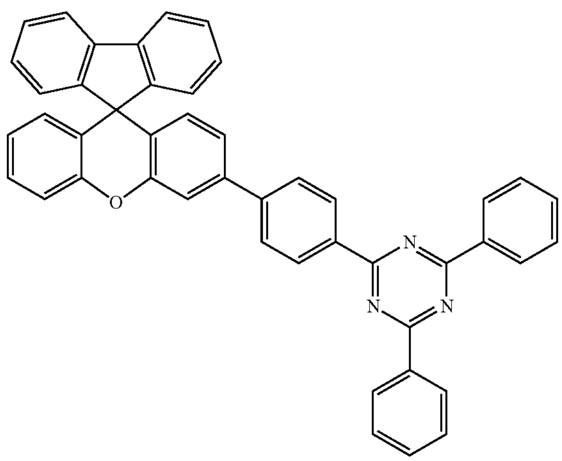
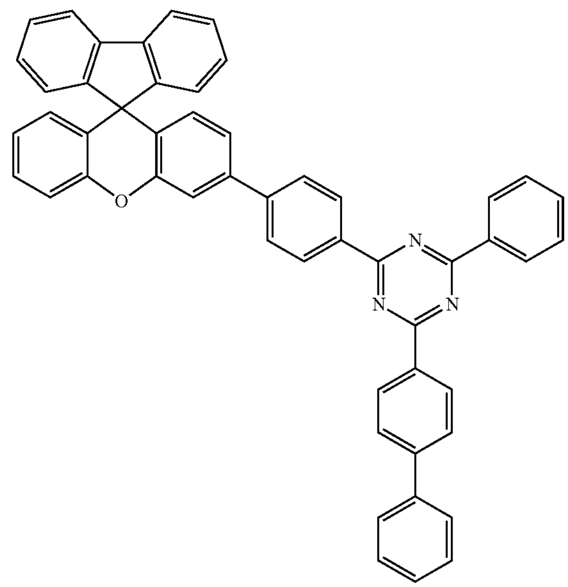
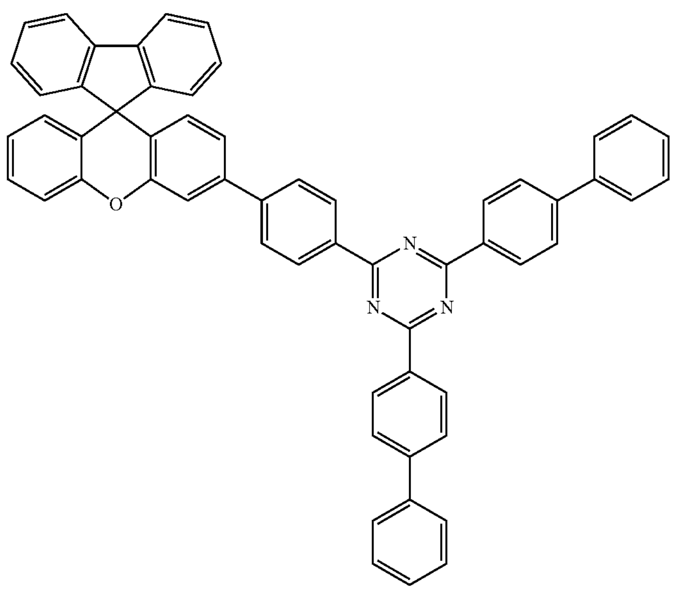
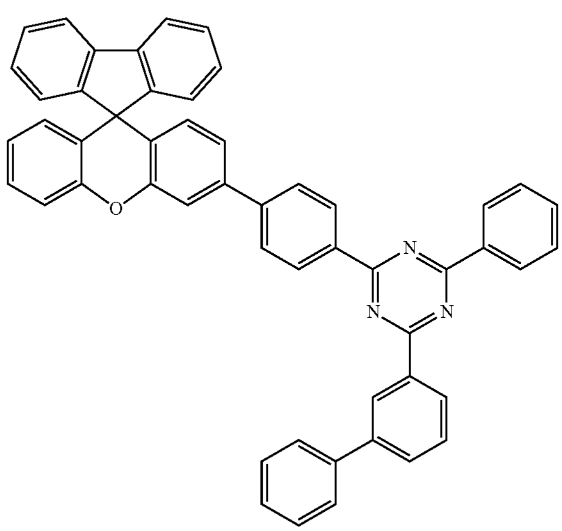
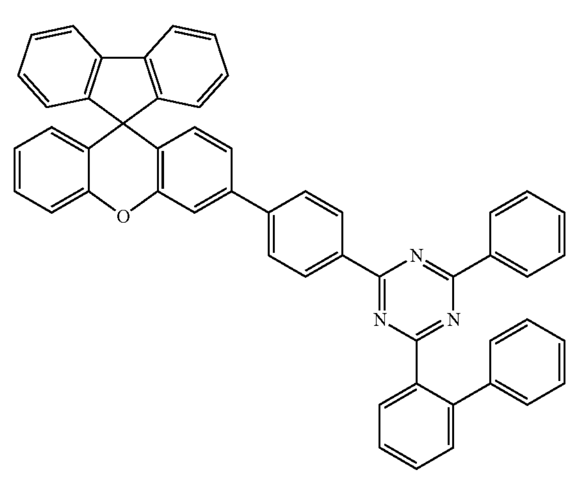

-continued
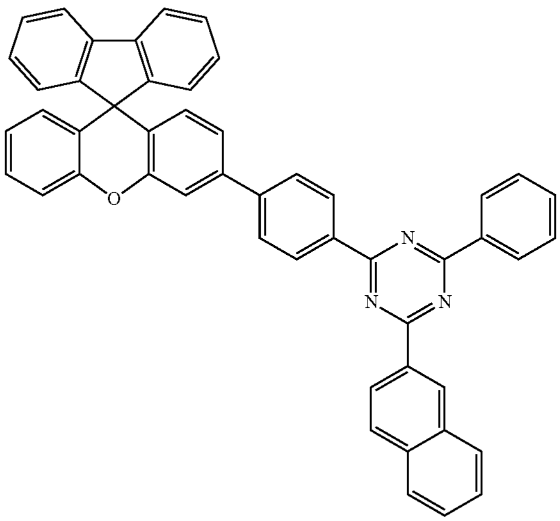
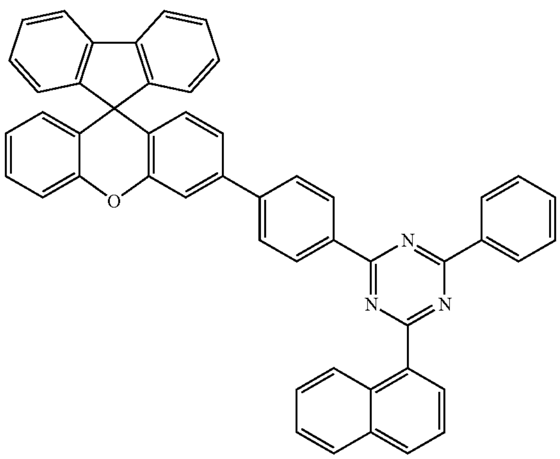
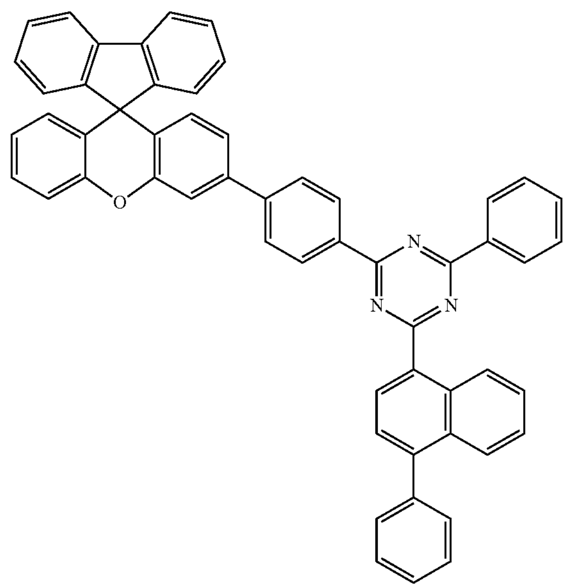
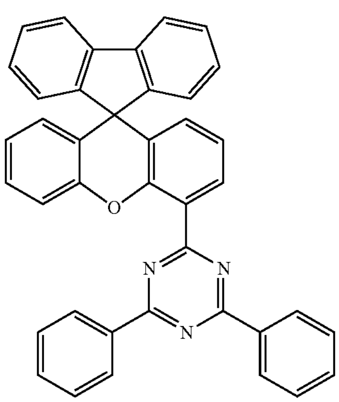
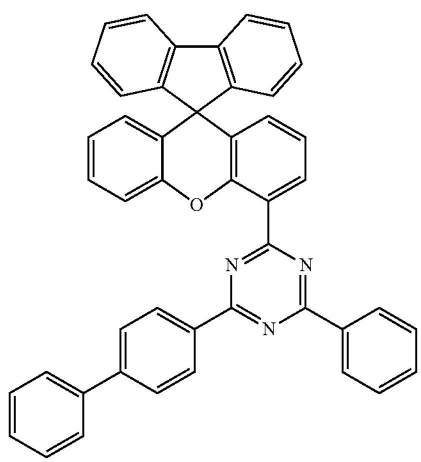

-continued
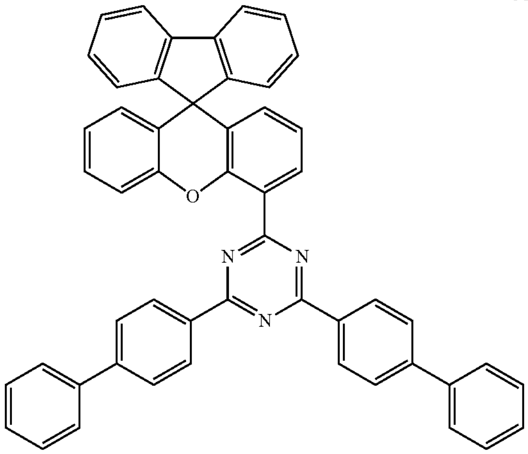
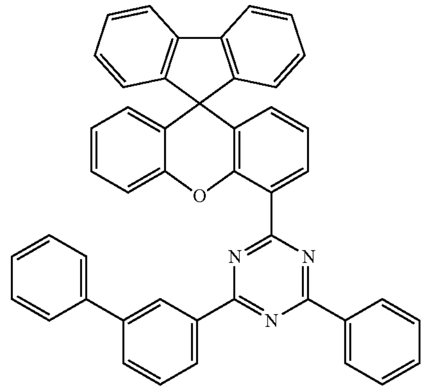
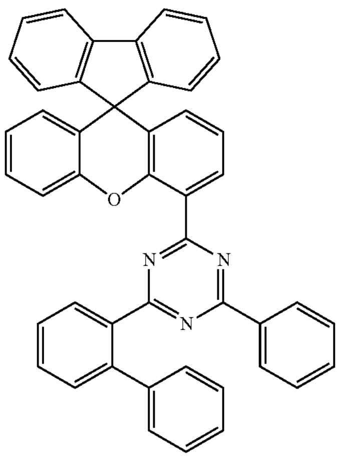
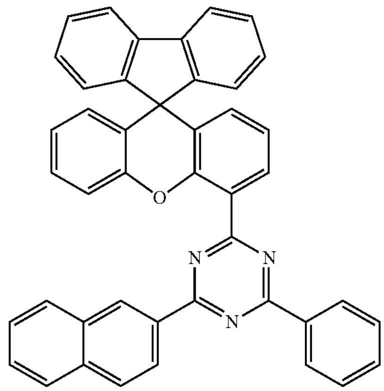
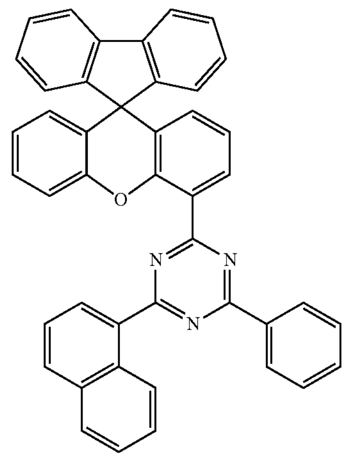
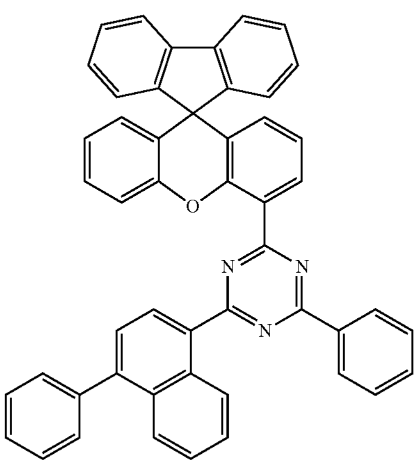
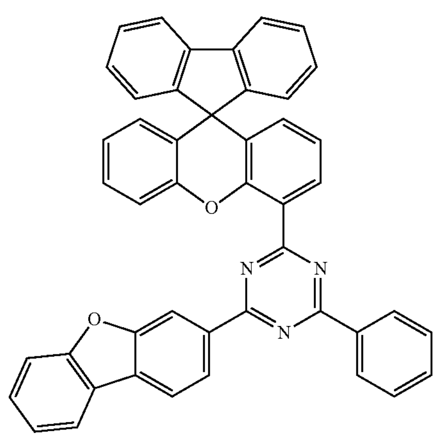

-continued
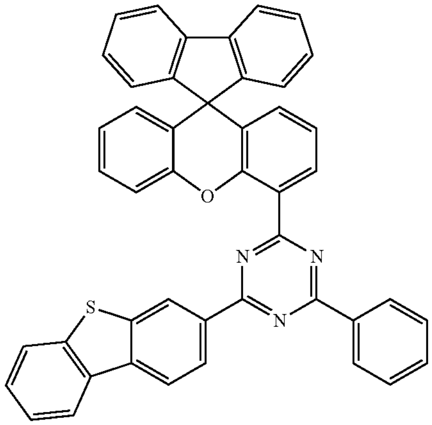
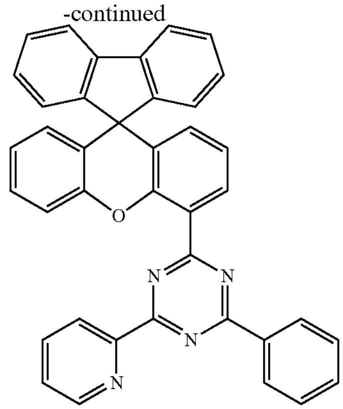
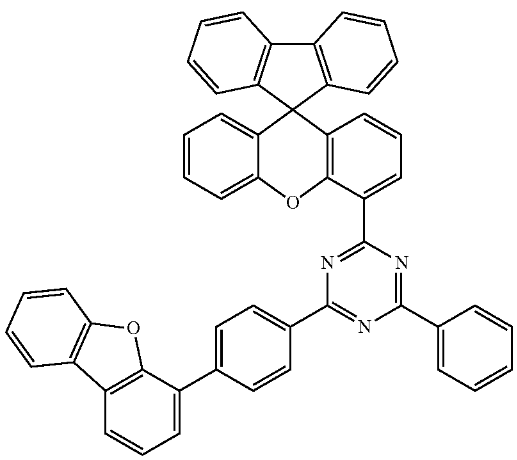
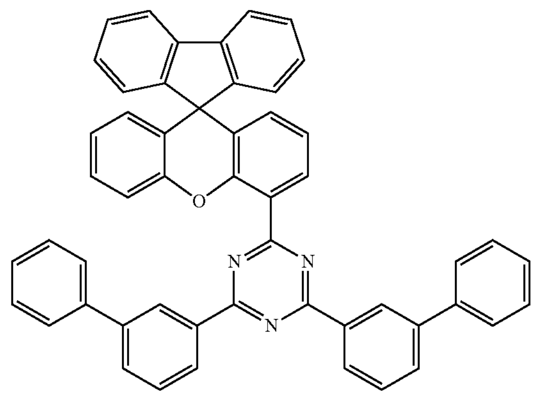
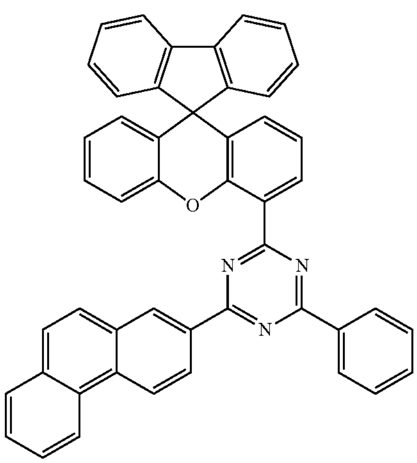
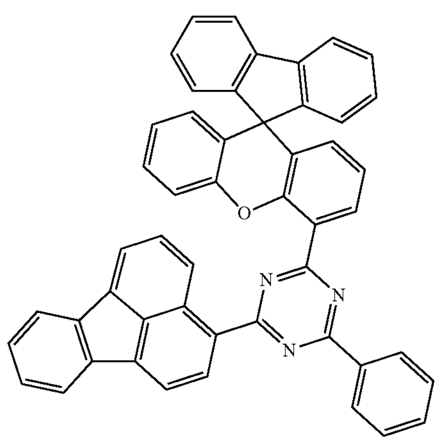

-continued
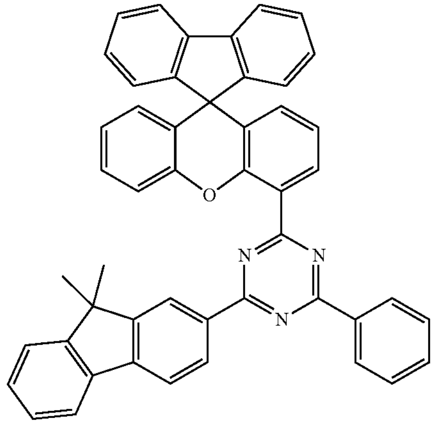
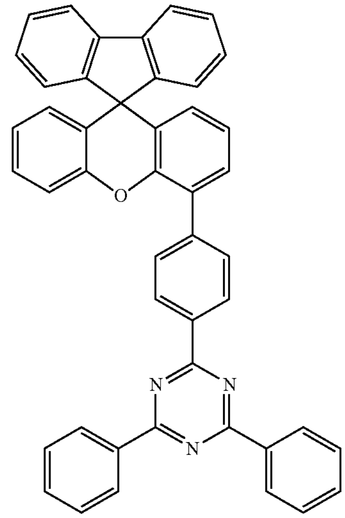
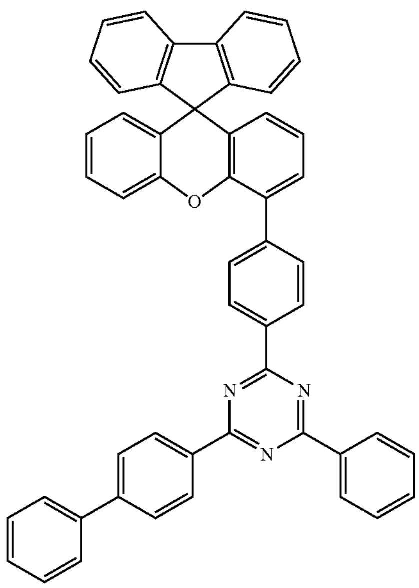
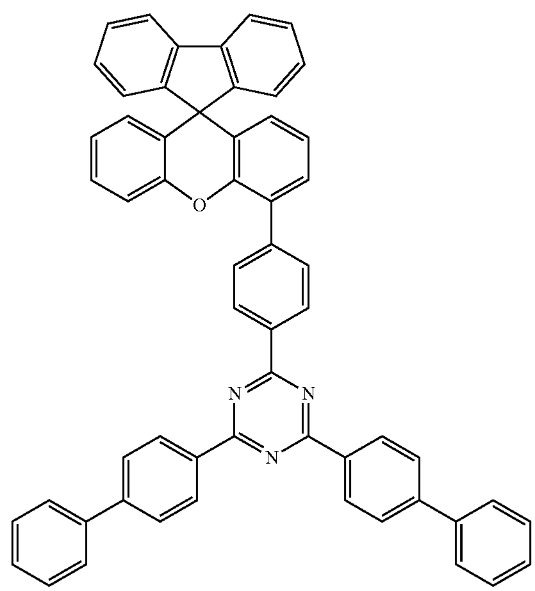
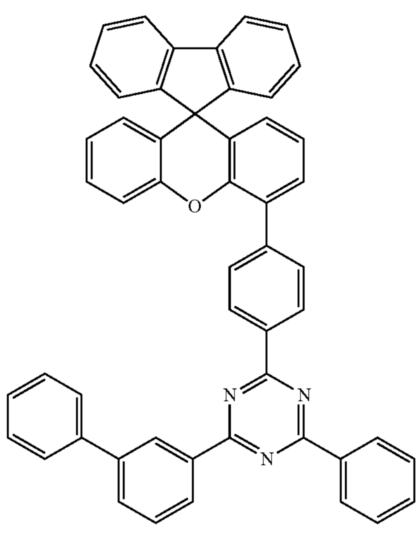
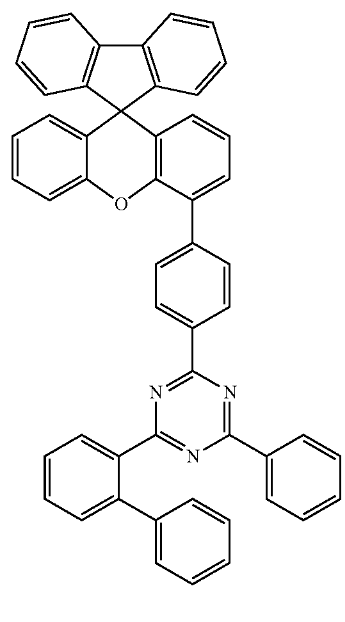
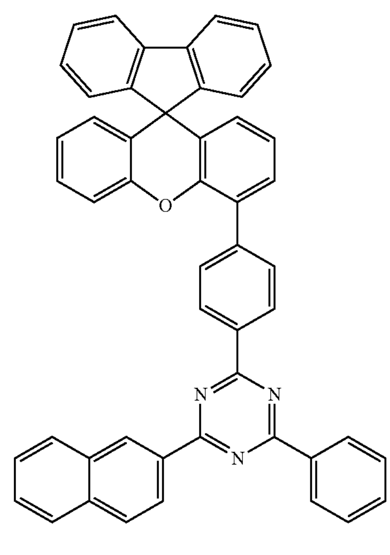

-continued
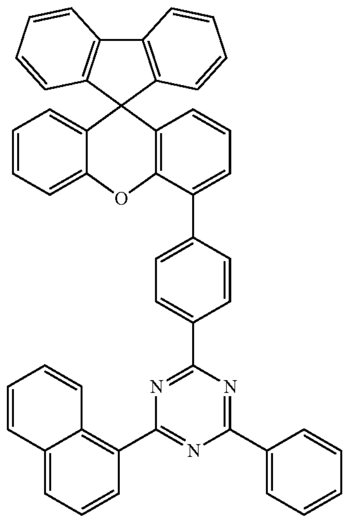
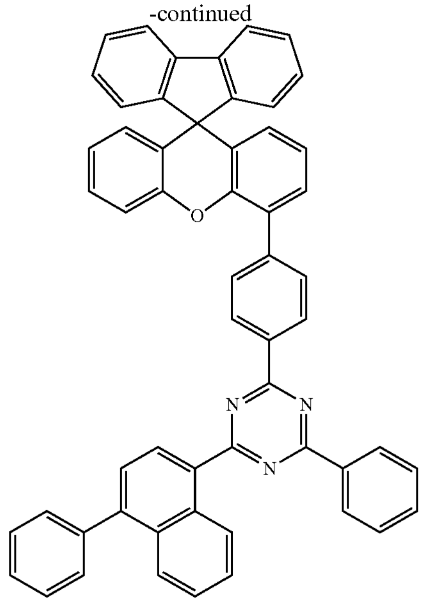
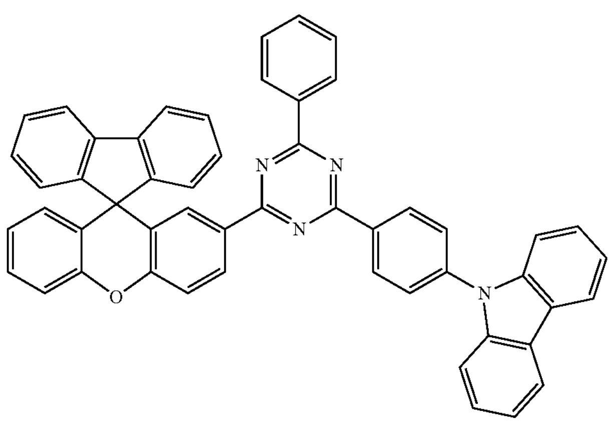
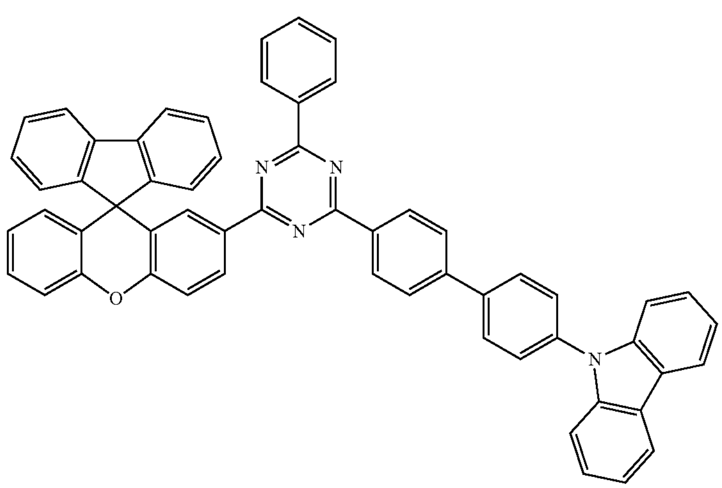

-continued
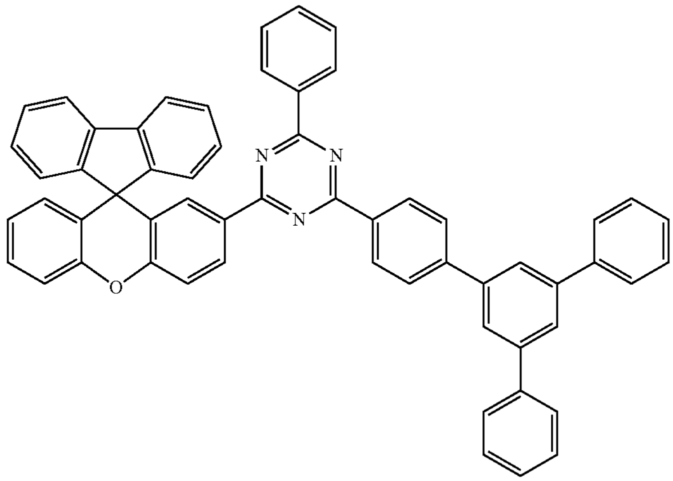
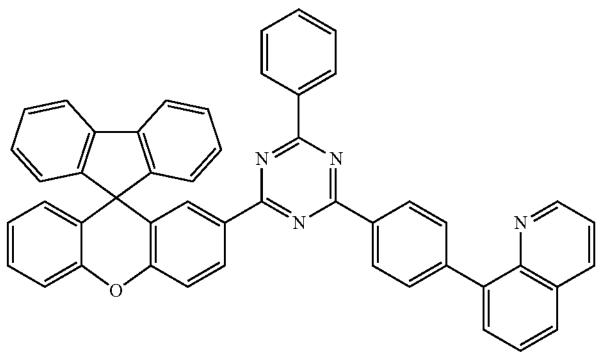
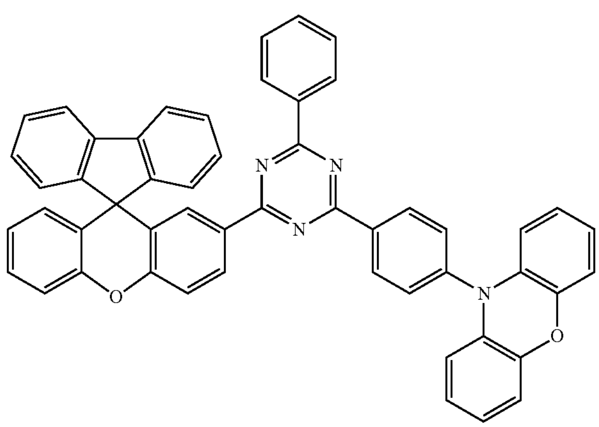
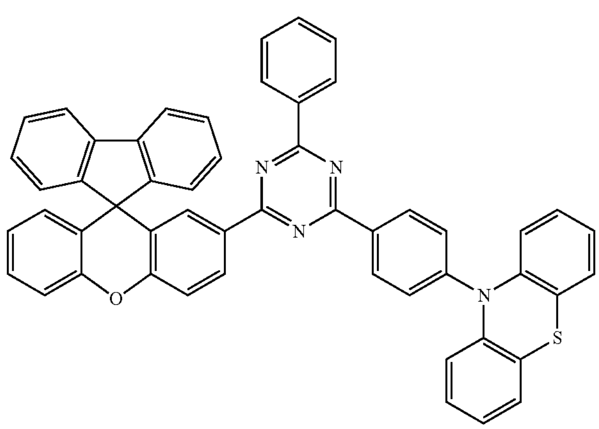

-continued
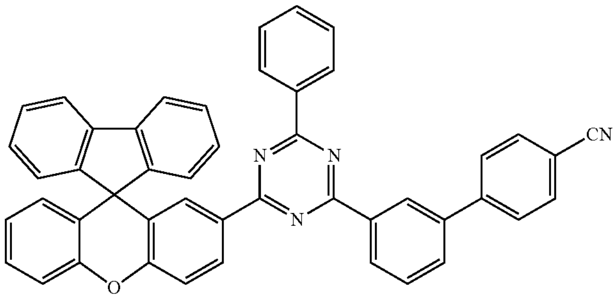
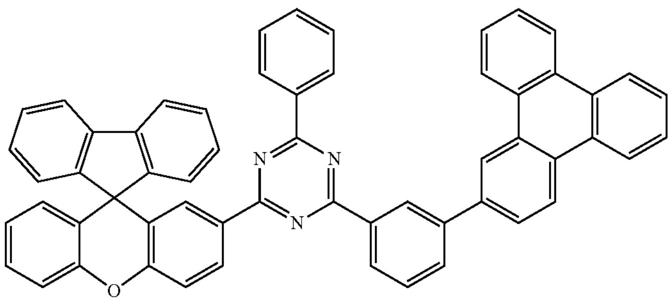
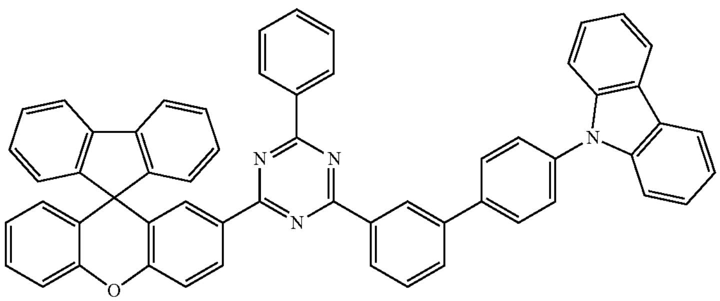
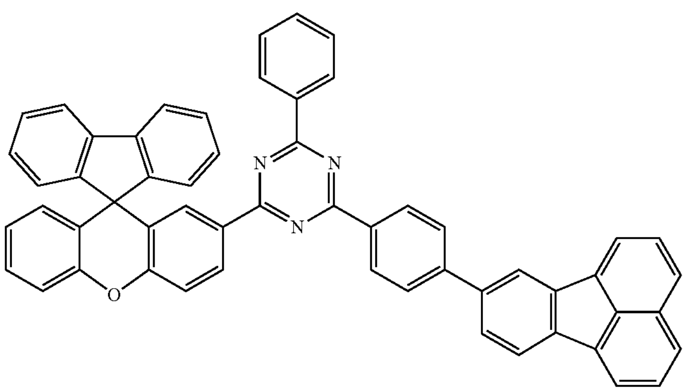
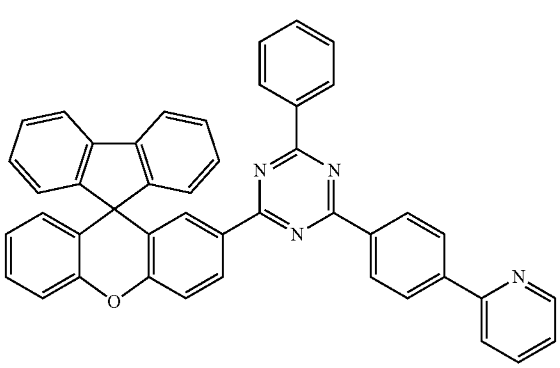
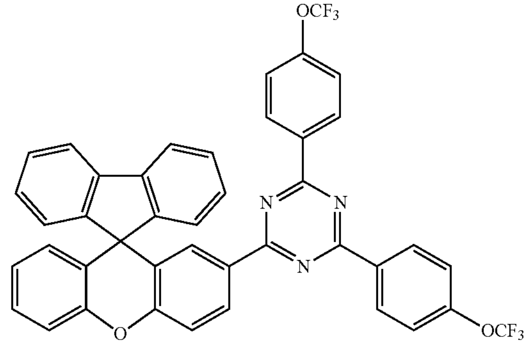

-continued
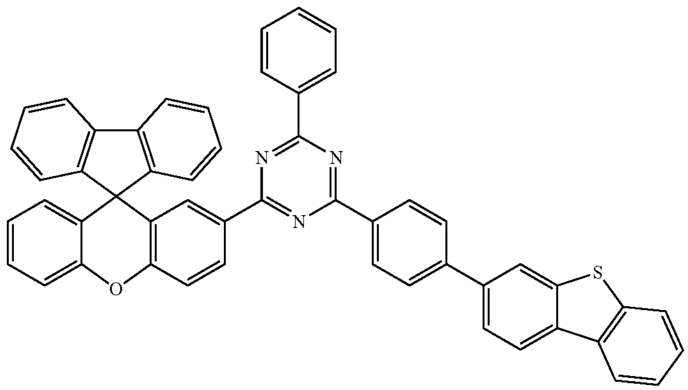
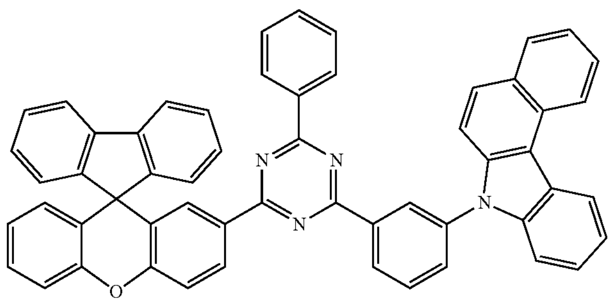
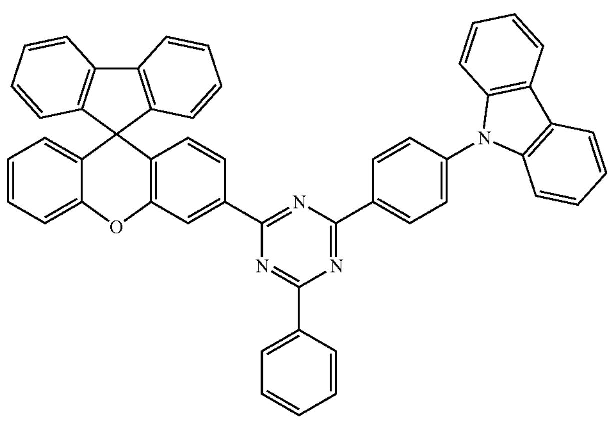
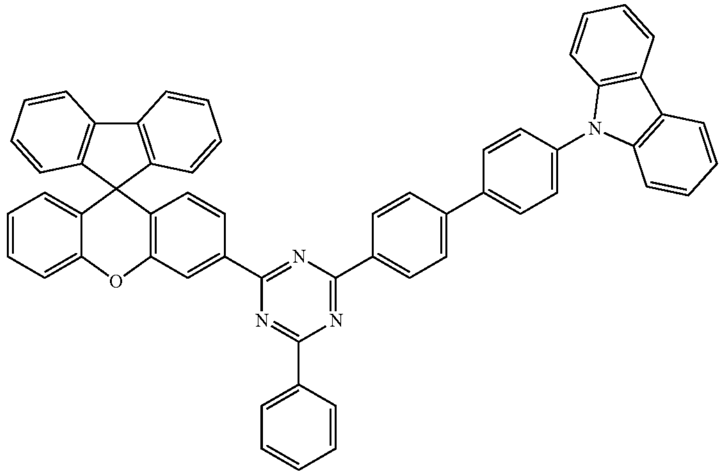

-continued
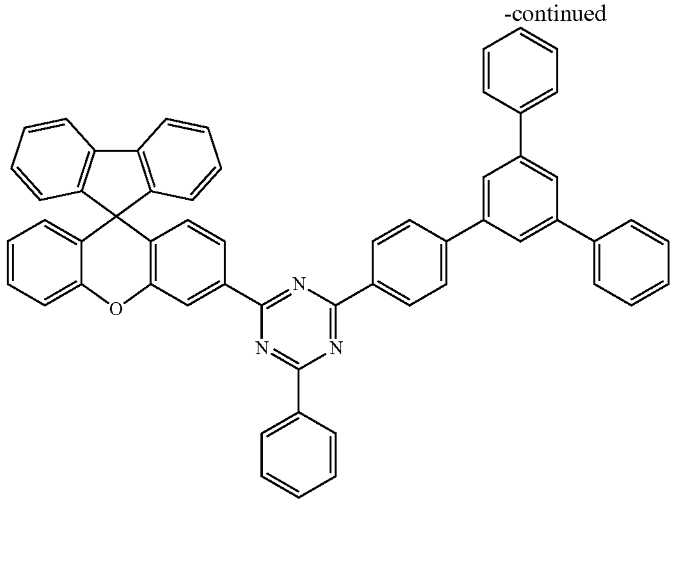
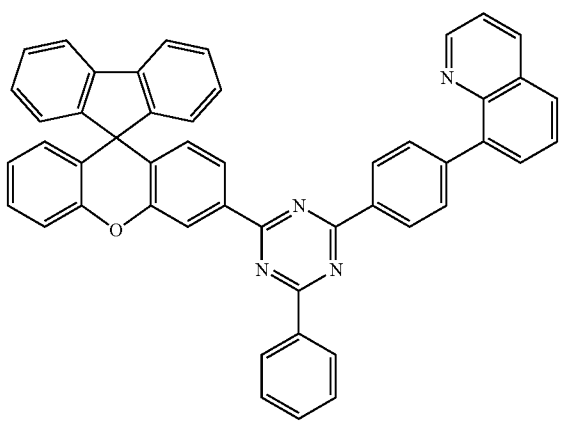
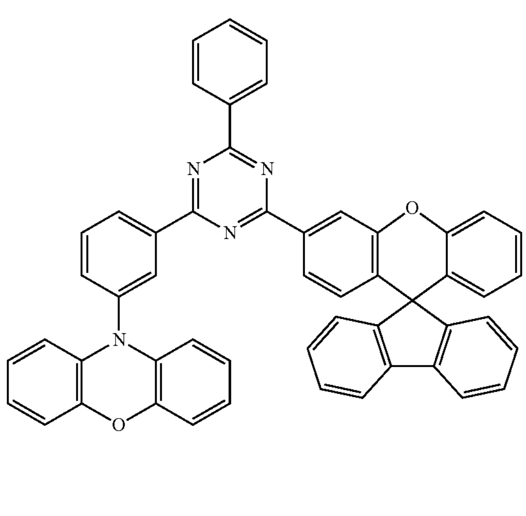

-continued
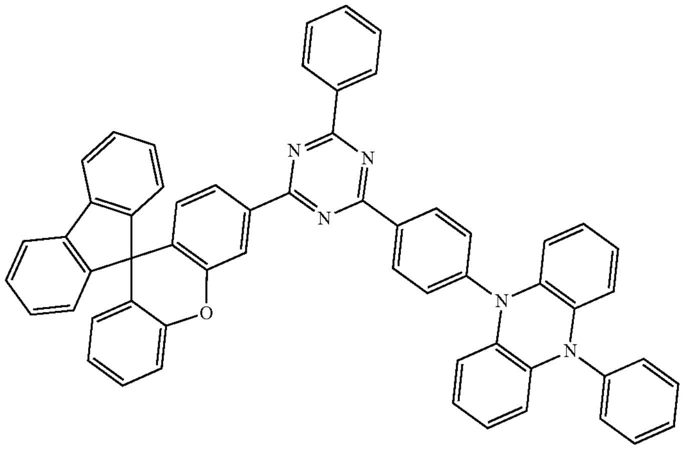
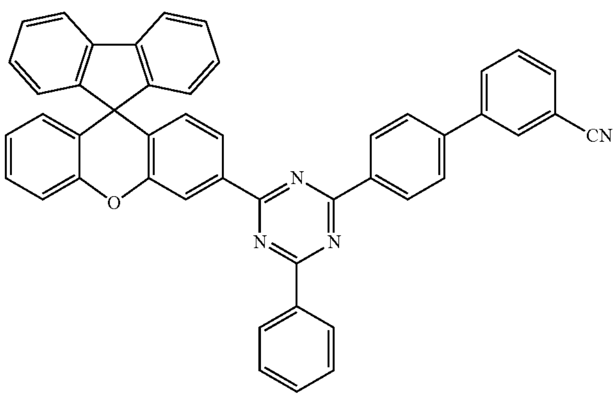
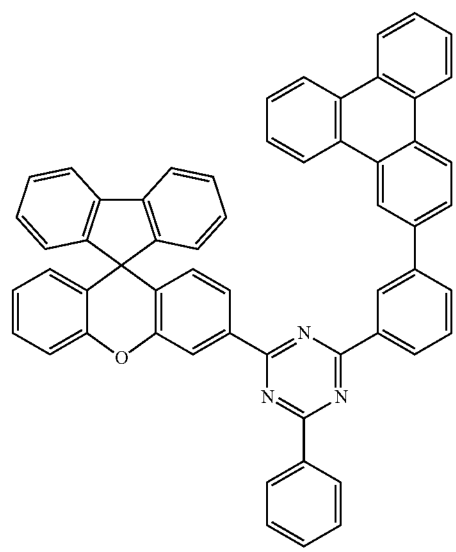
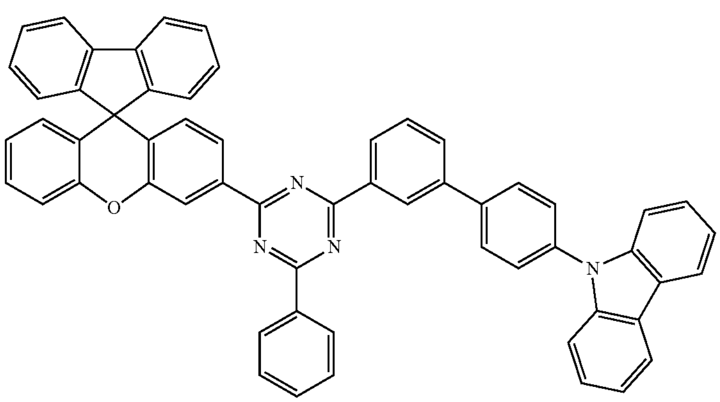
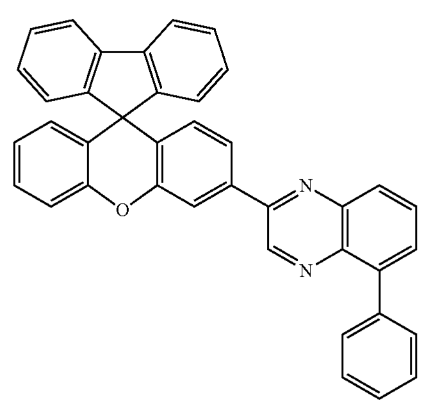

-continued
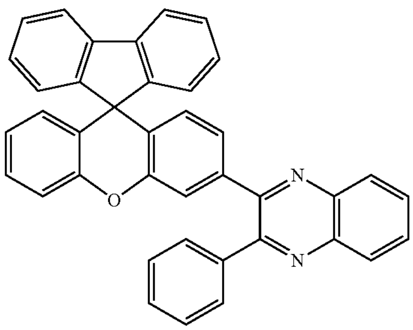
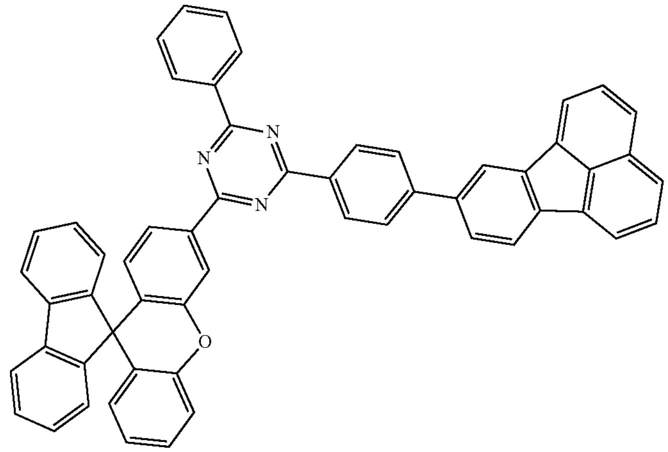
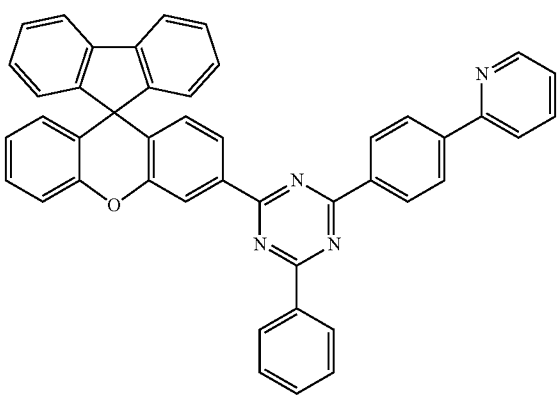
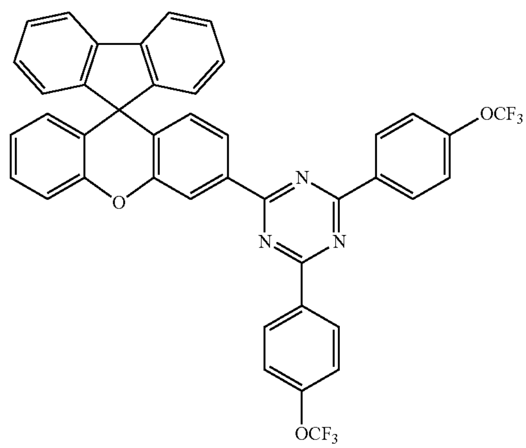
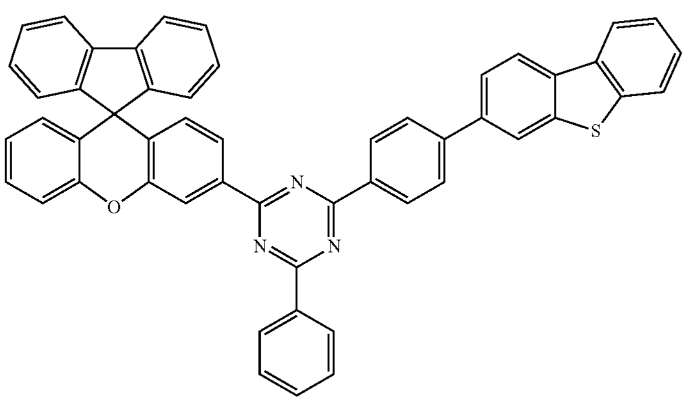

-continued
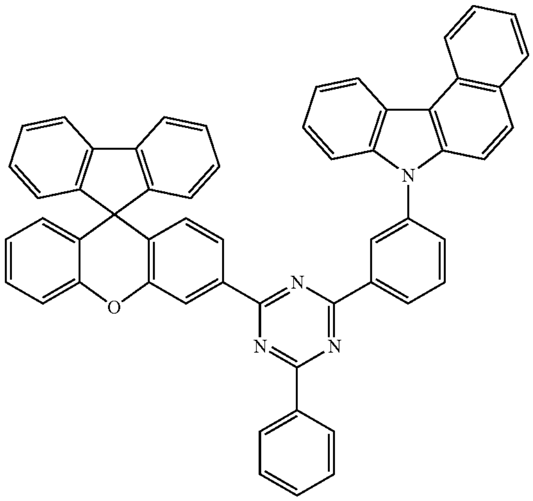
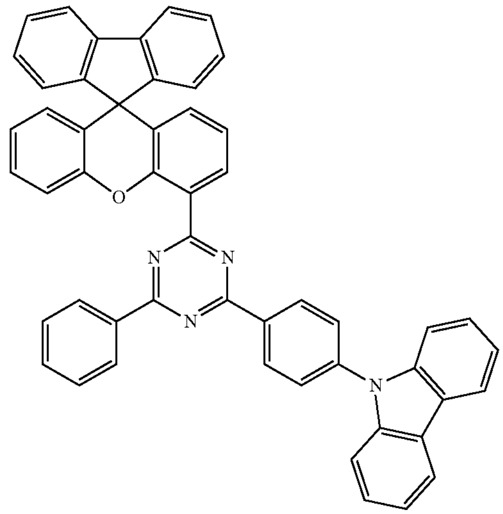
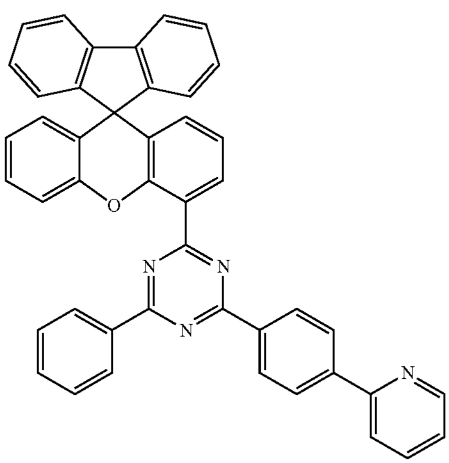
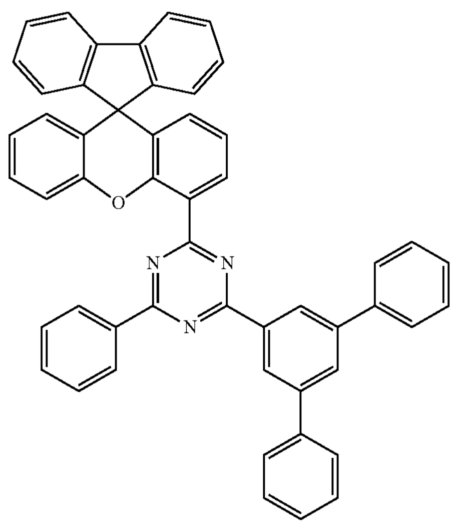
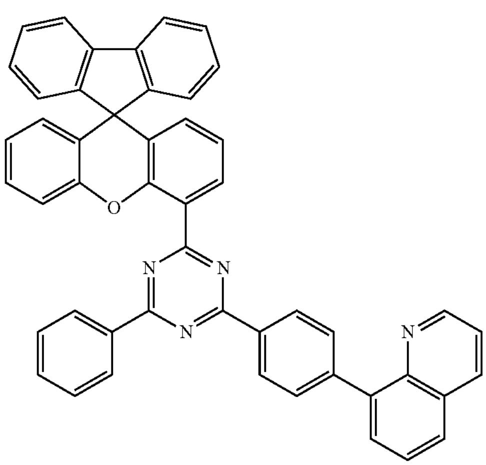
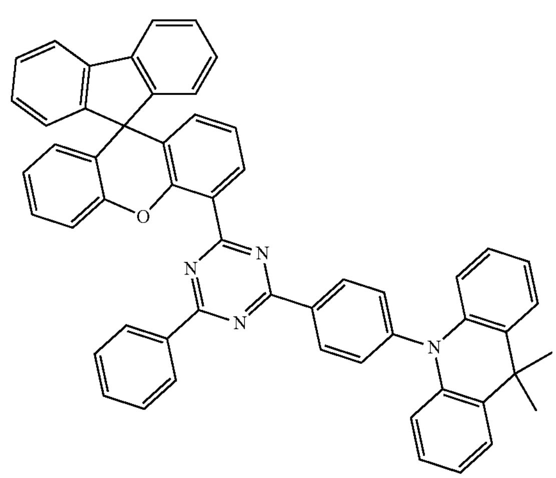

-continued
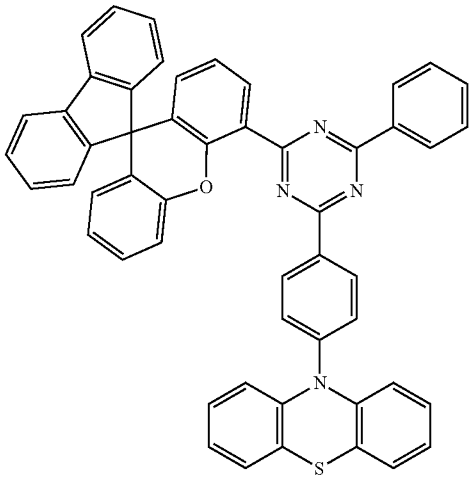
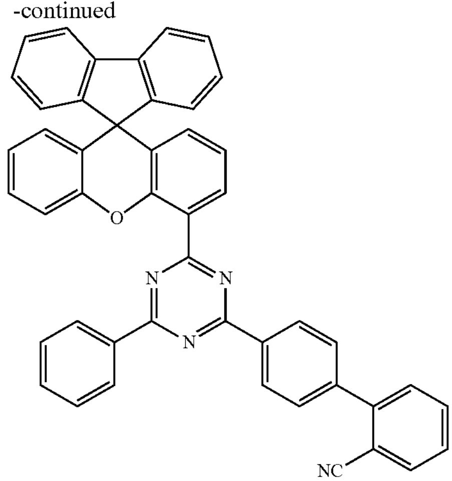
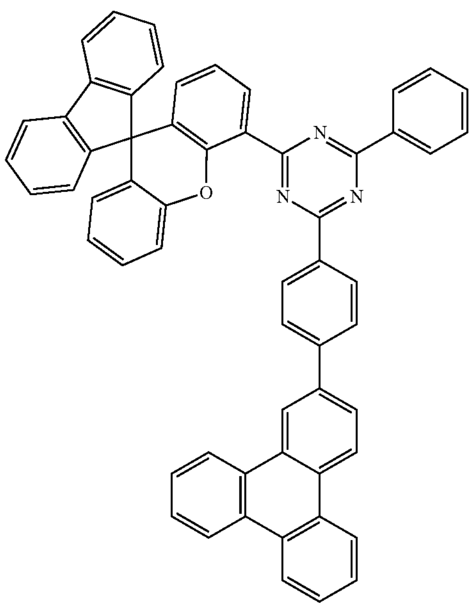
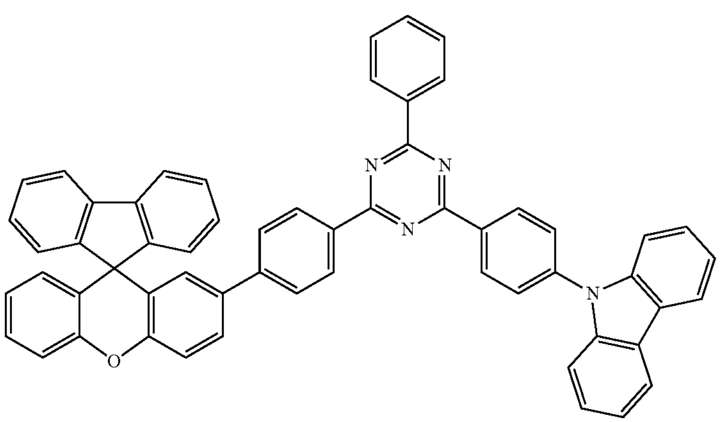

-continued
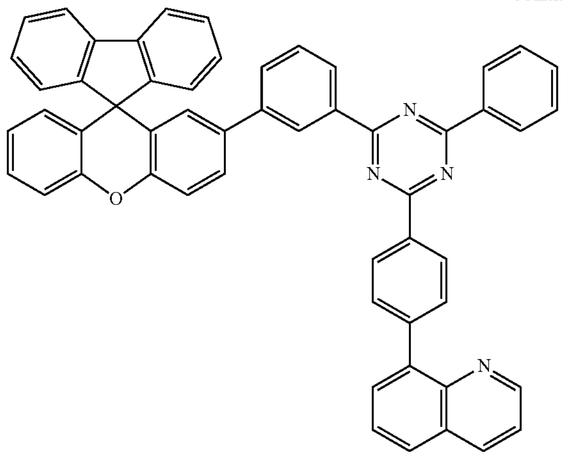
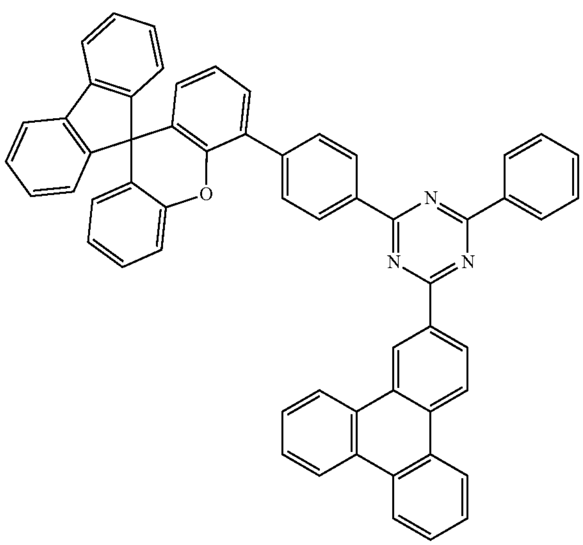
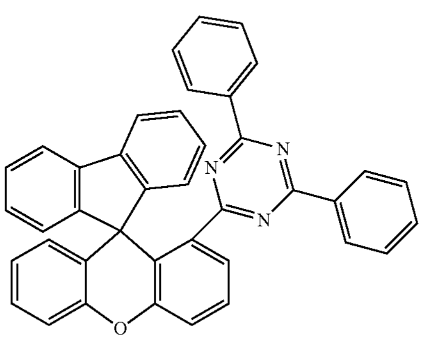
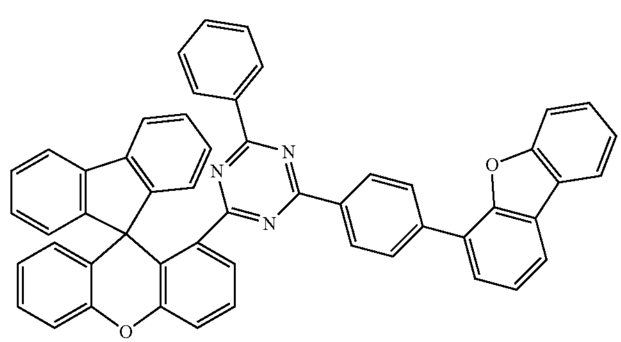

-continued
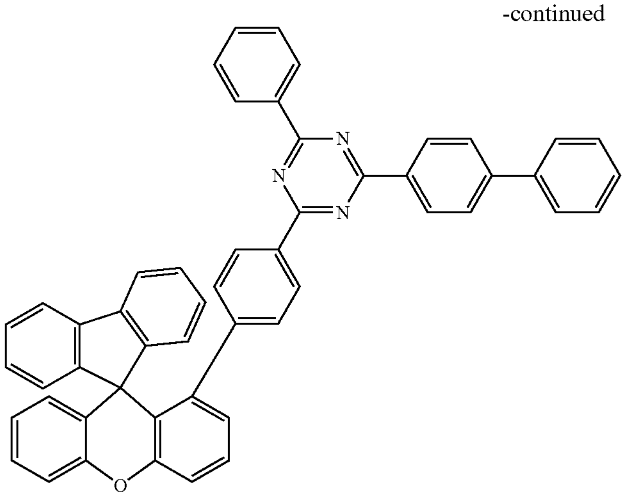
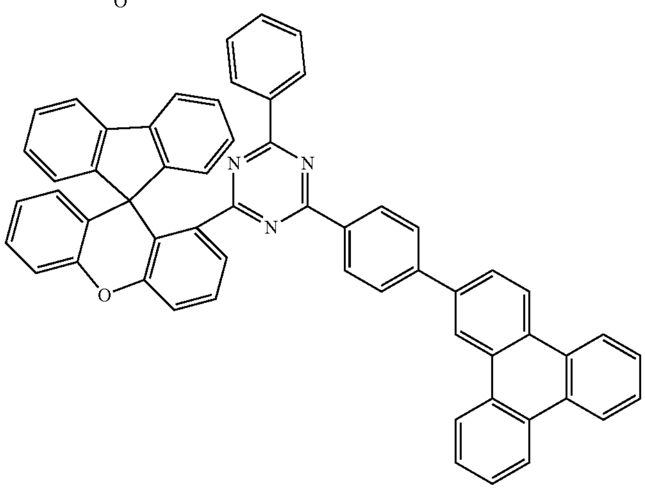
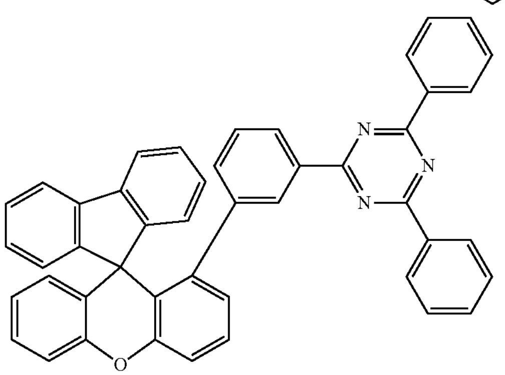
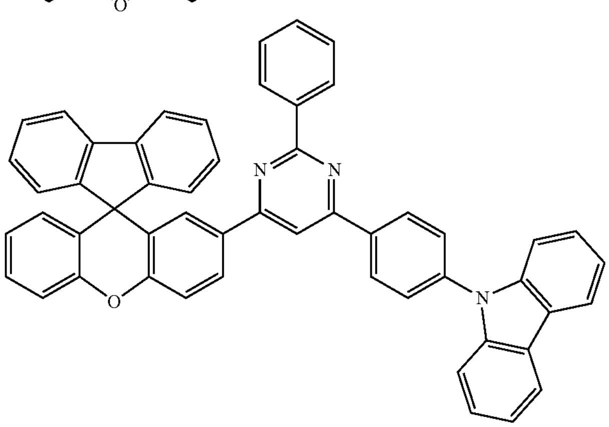

-continued
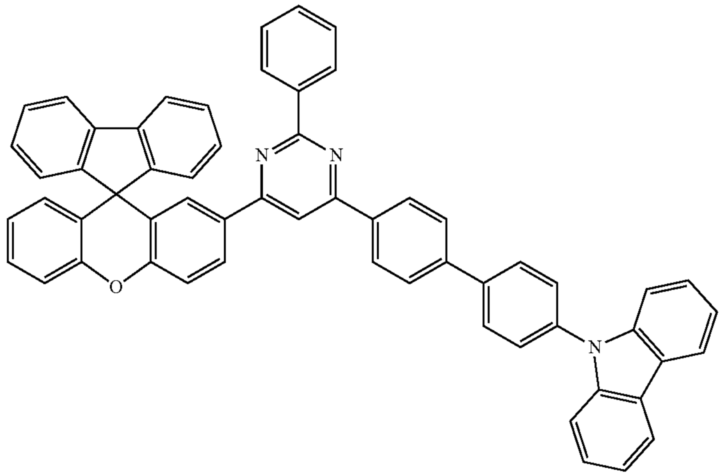
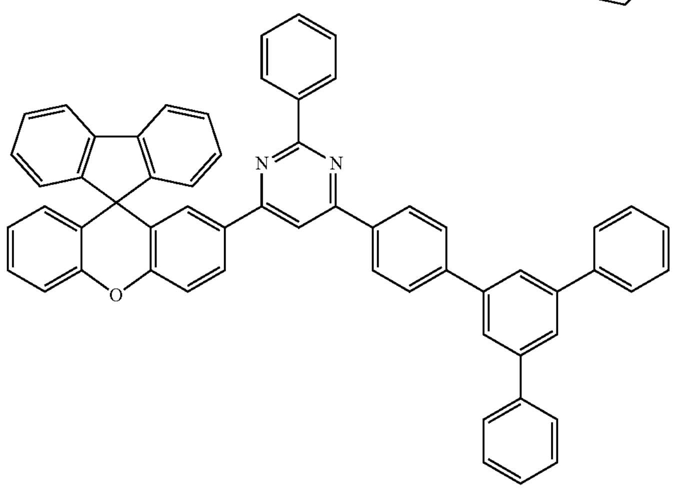
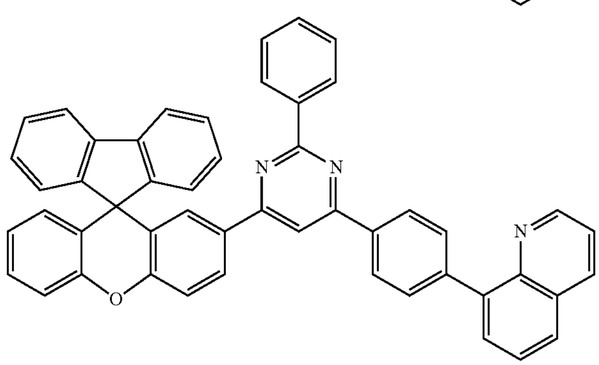
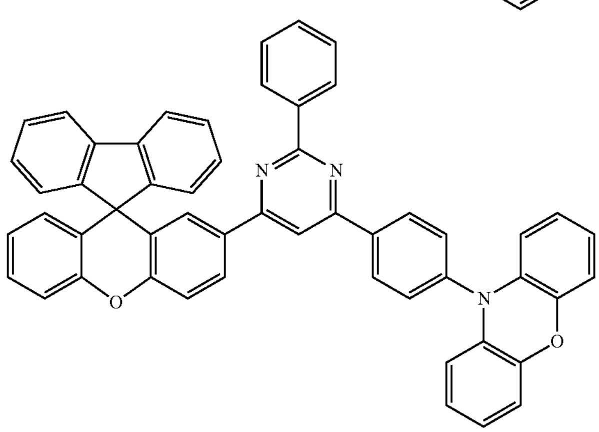

-continued
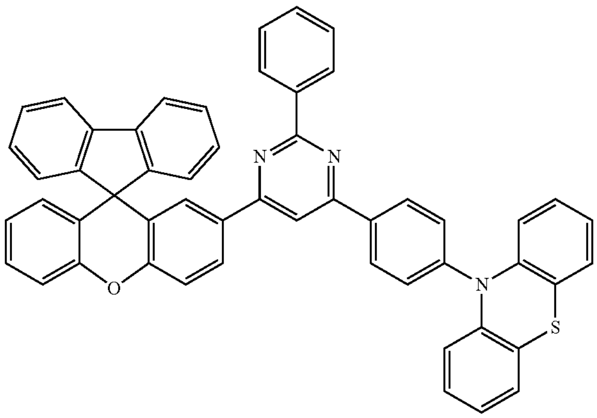
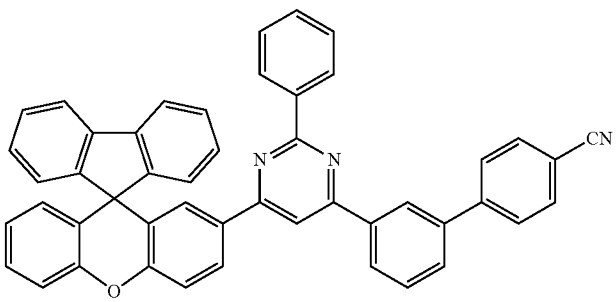
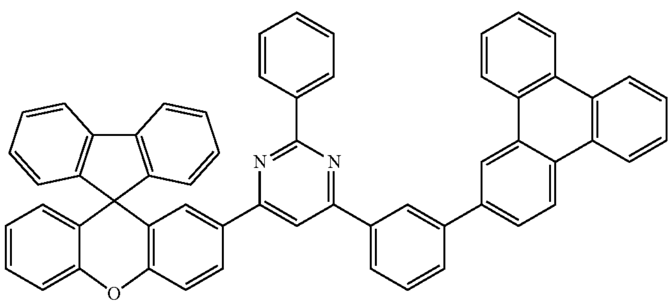
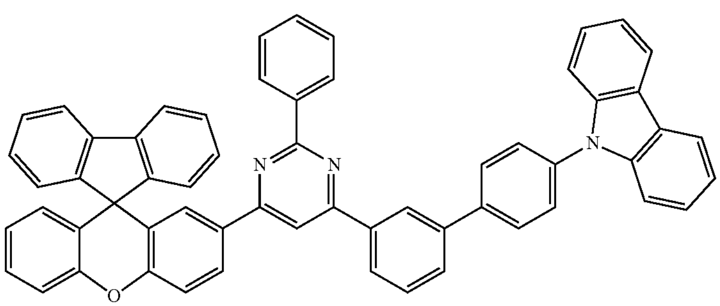
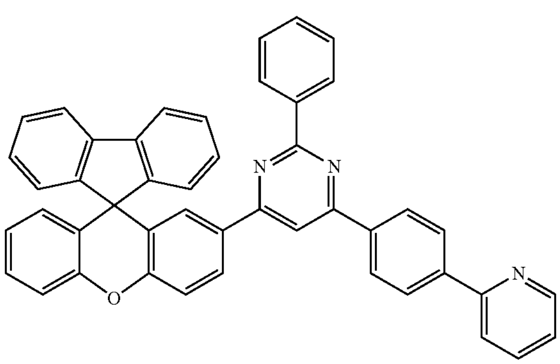

-continued
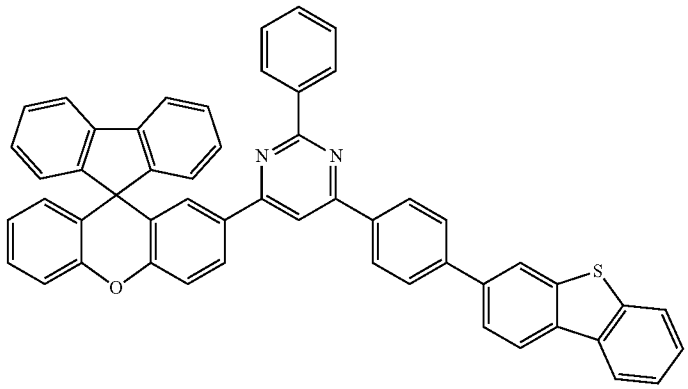
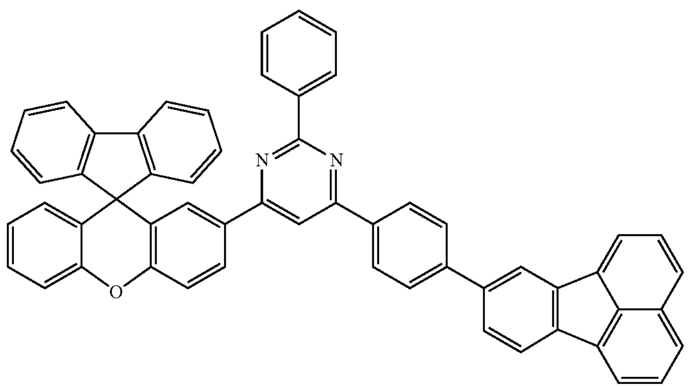
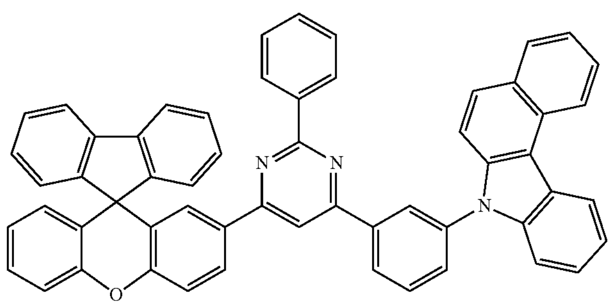
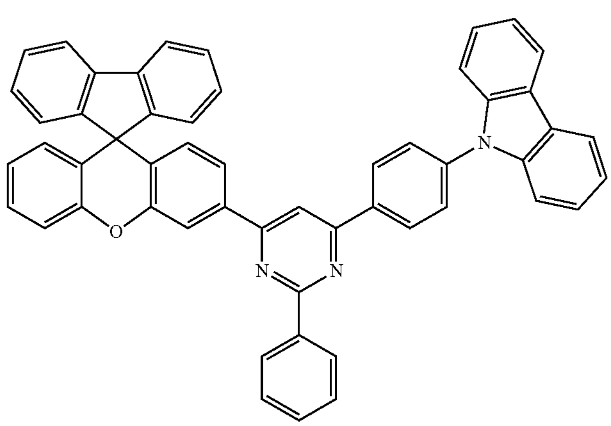
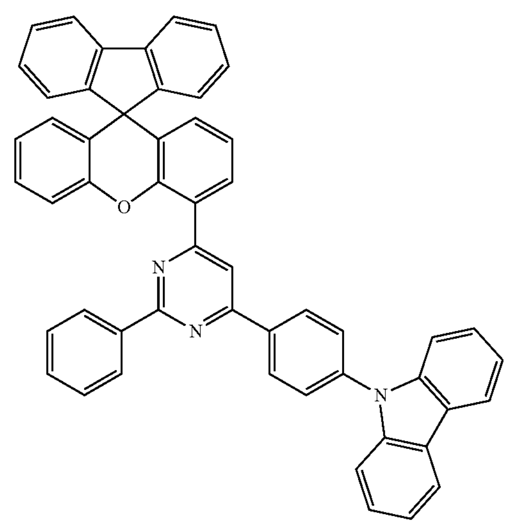

-continued
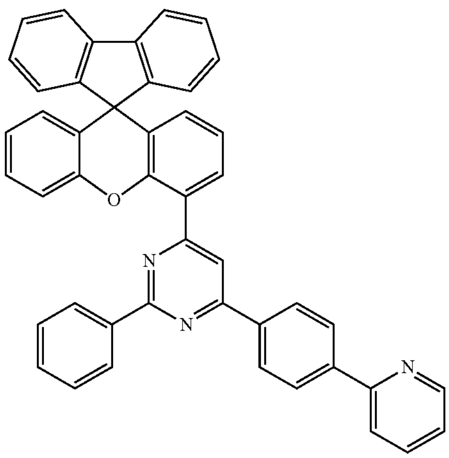
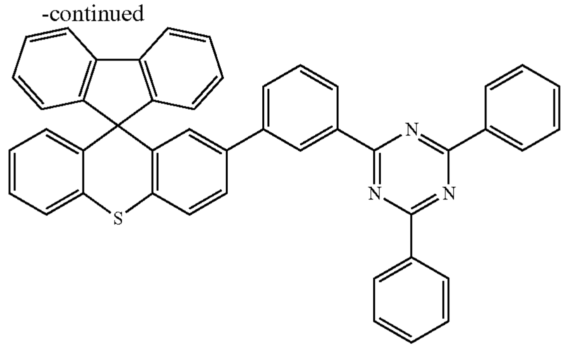
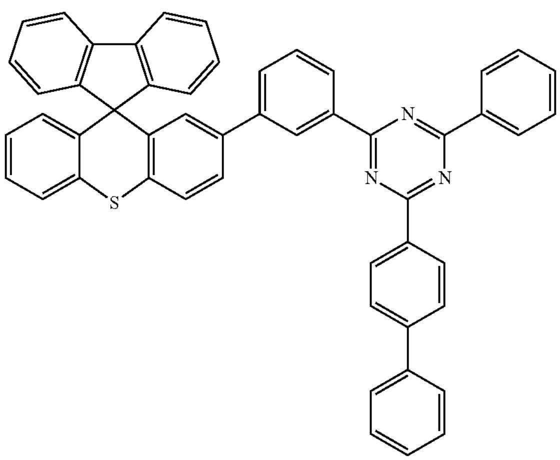
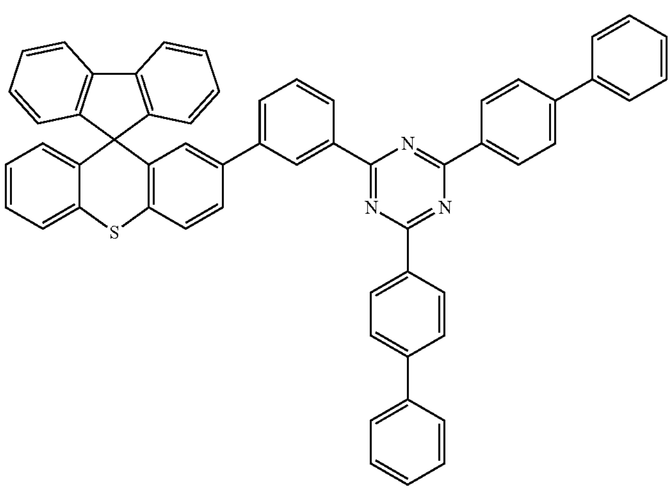

-continued
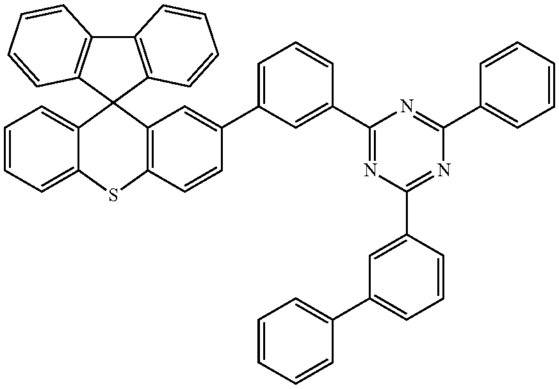
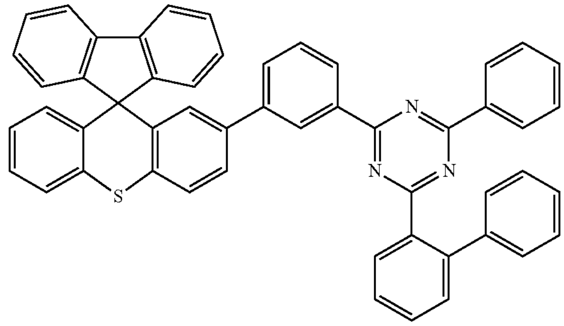
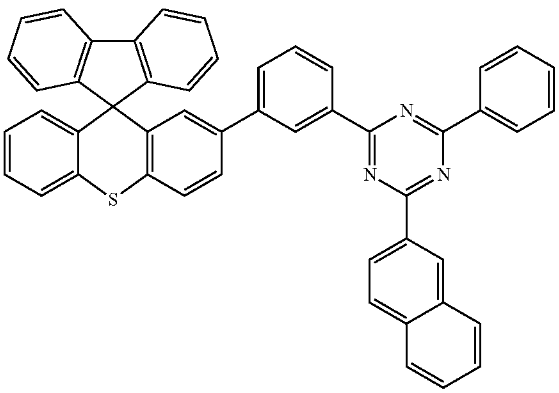
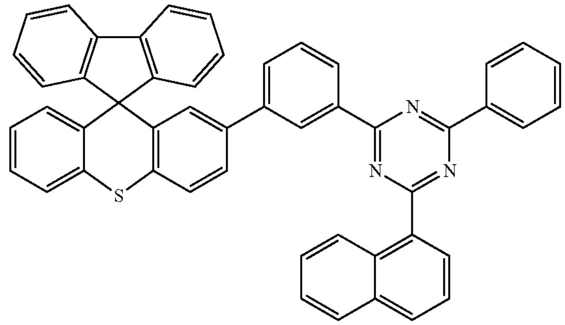
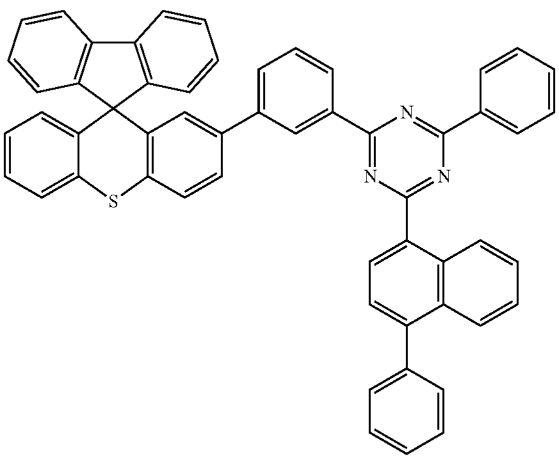
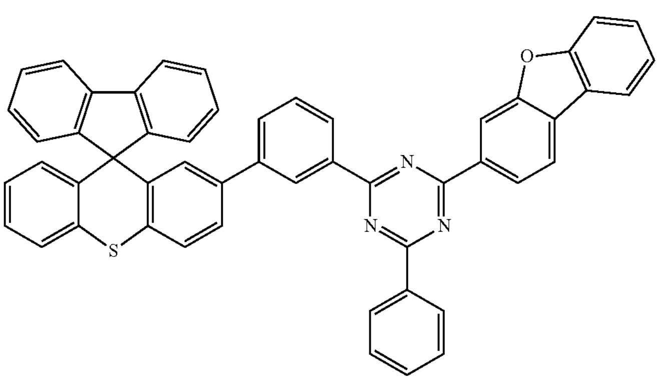

-continued
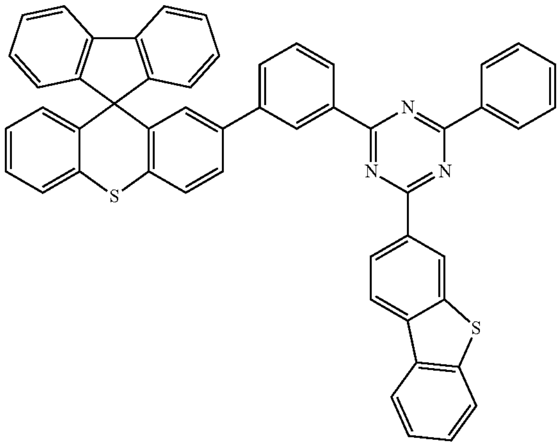
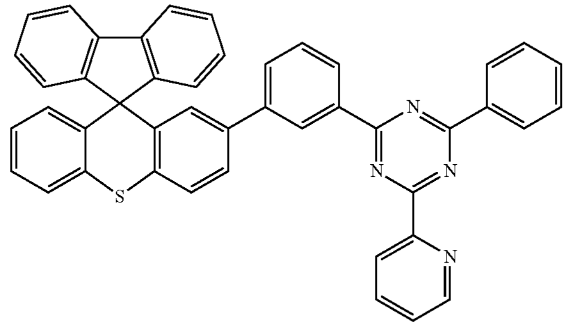
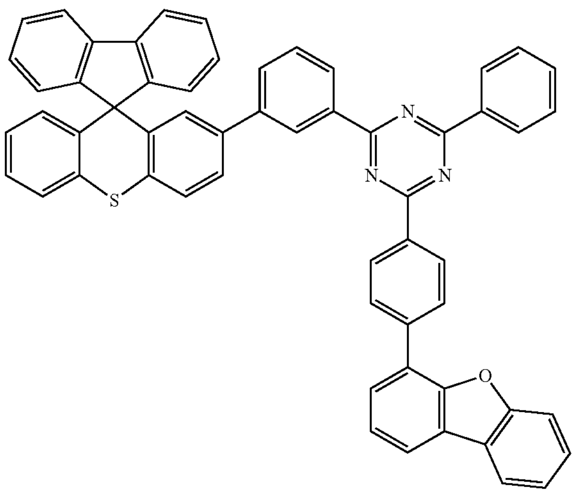
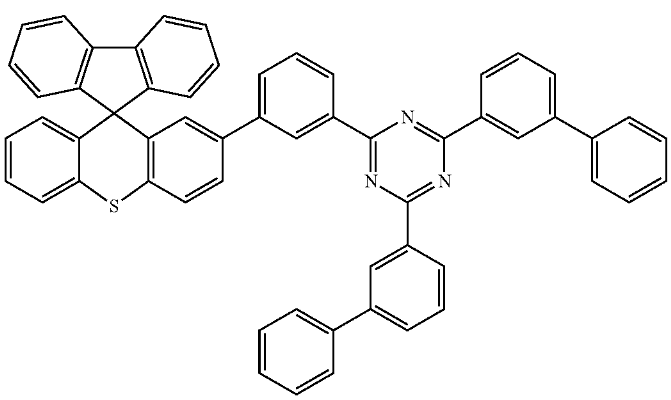

-continued
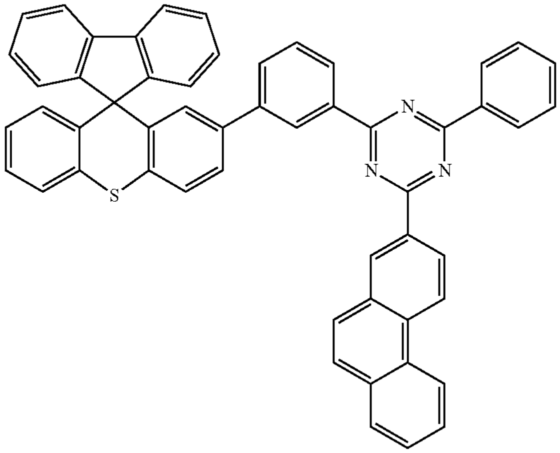
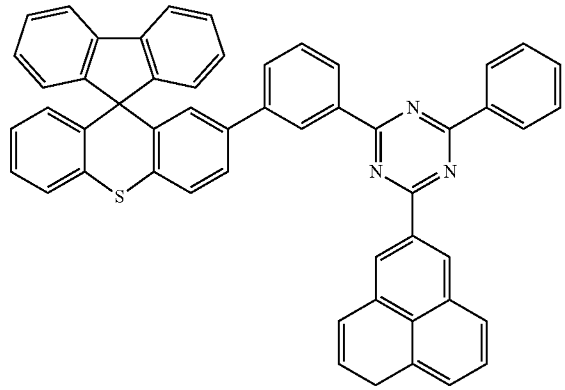
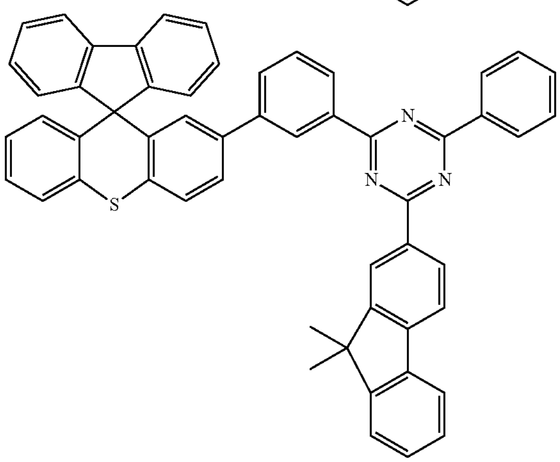
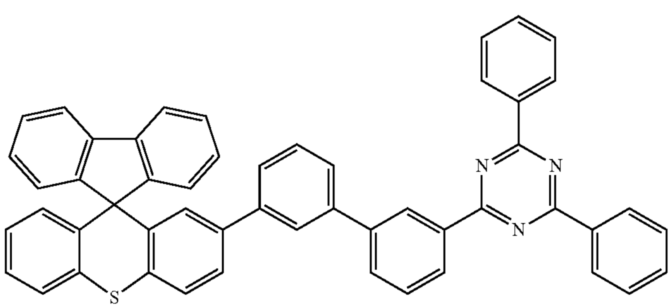 [SMILES: c1ccc(-c2nc(-c3ccccc3)nc(-c3cccc(-c4cccc(-c5ccc6c(c5)C5(c7ccccc7S6)c6ccccc6-c6ccccc65)c4)c3)n2)cc1]
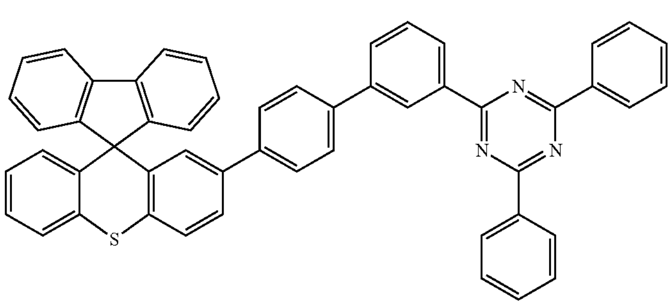

-continued
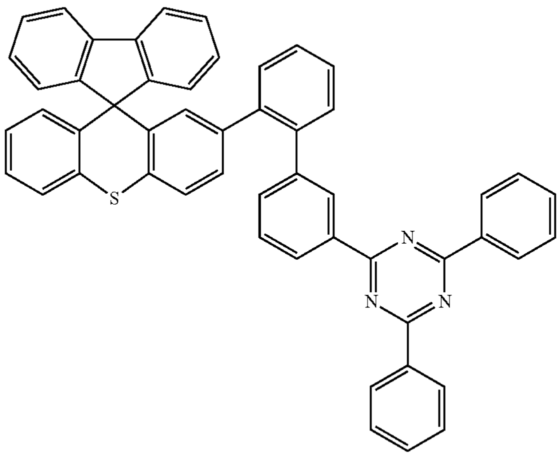
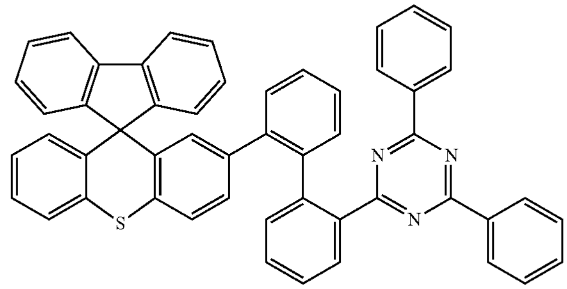
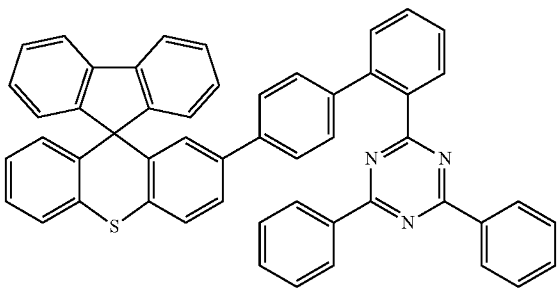
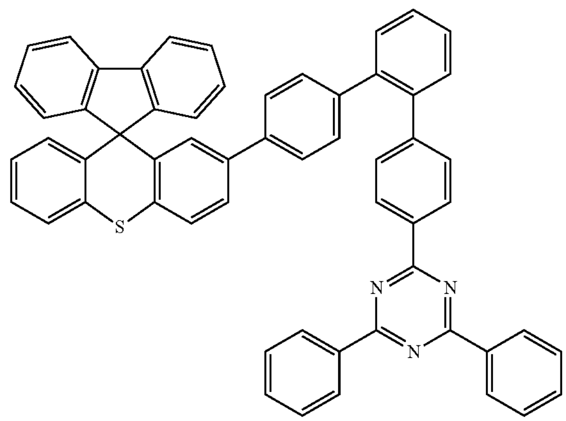
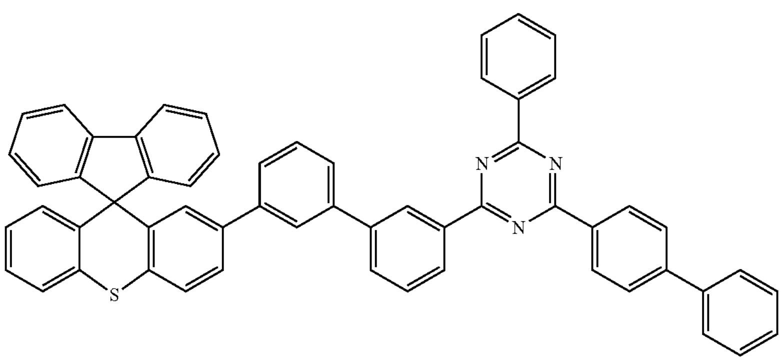
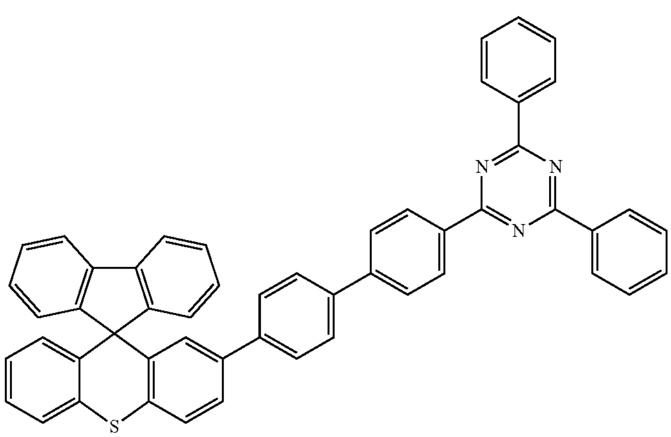
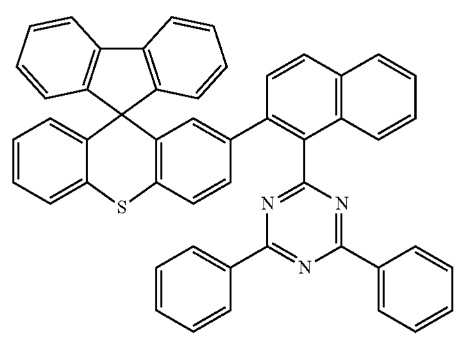

-continued
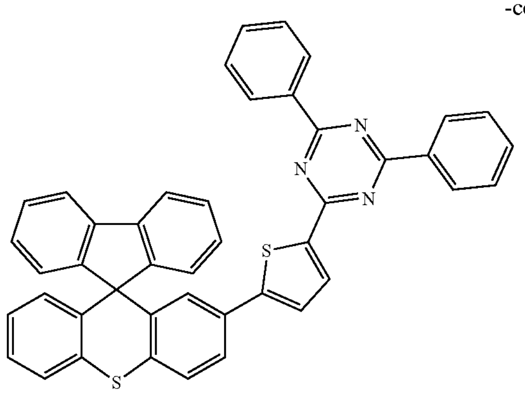
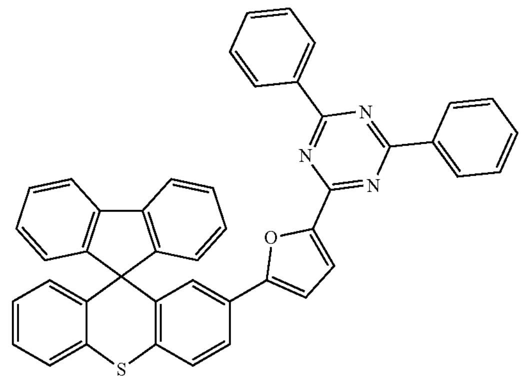
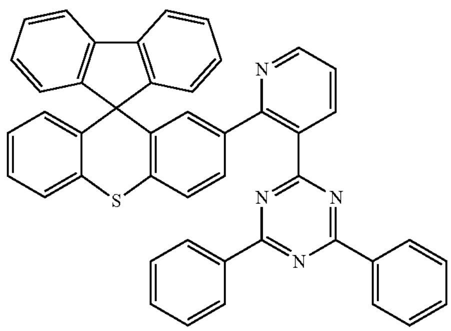
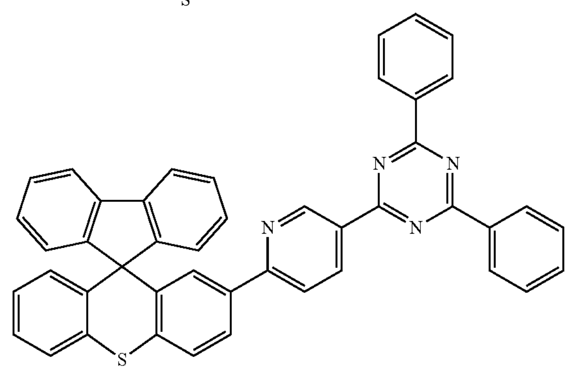
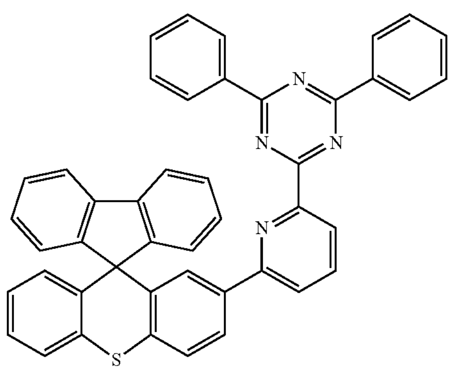
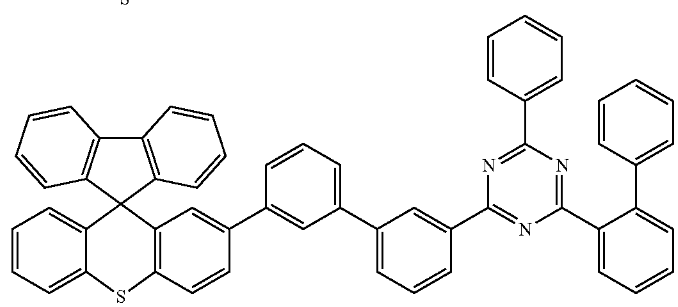
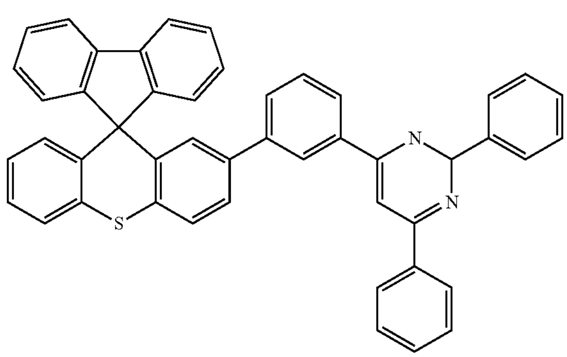
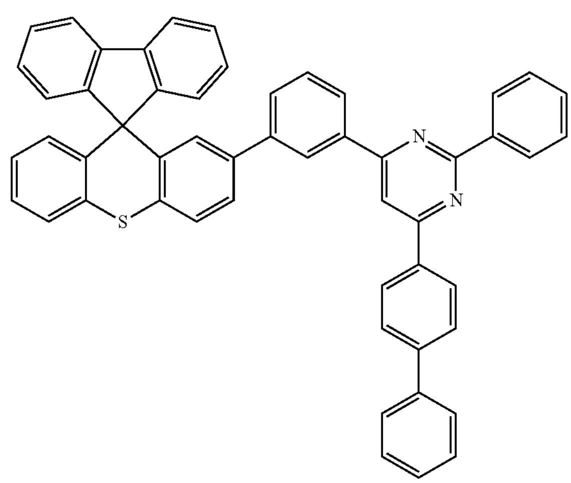

-continued
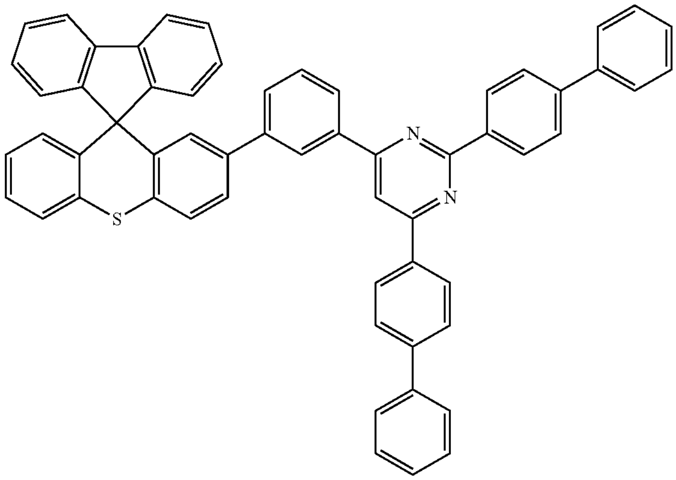
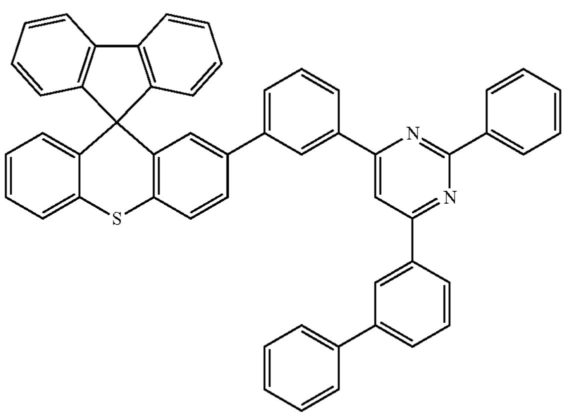
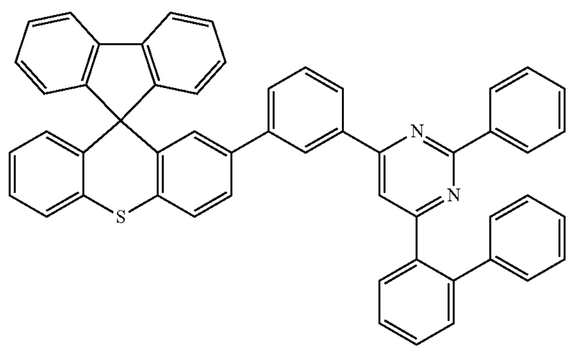
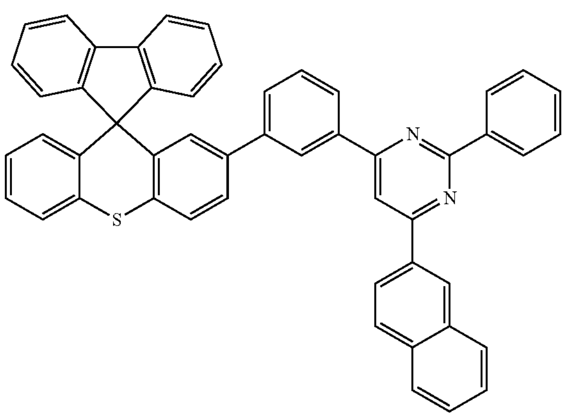
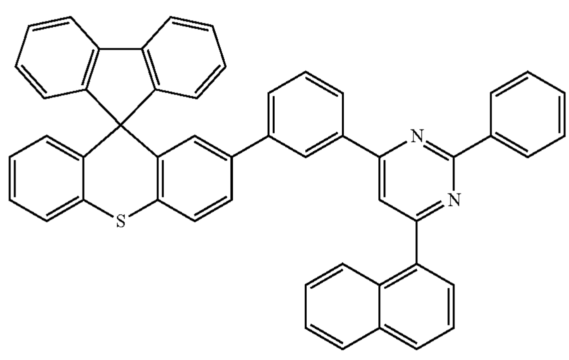

-continued
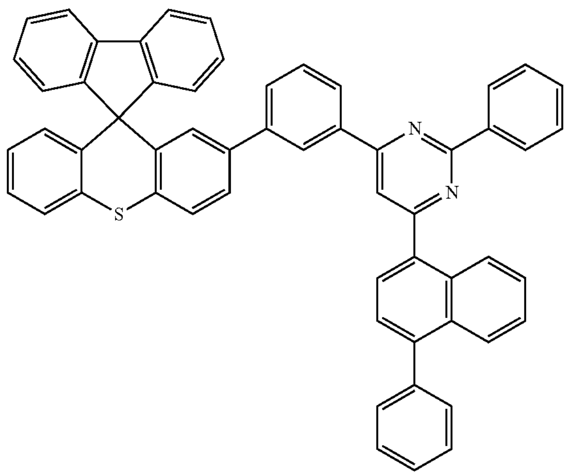
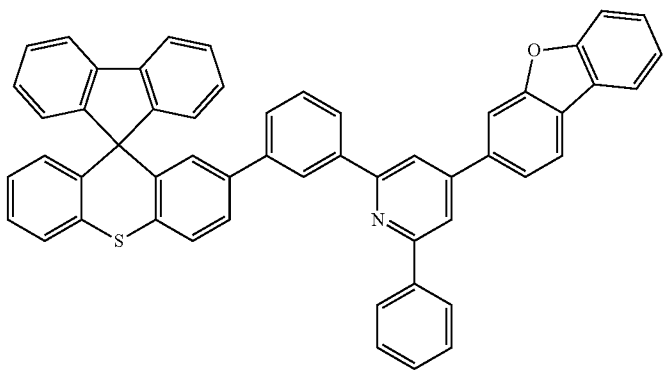
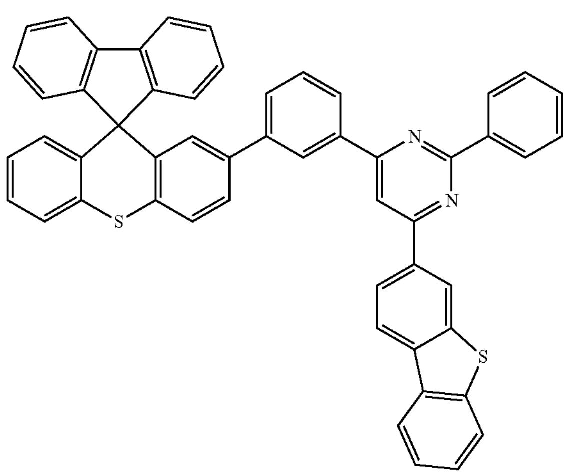
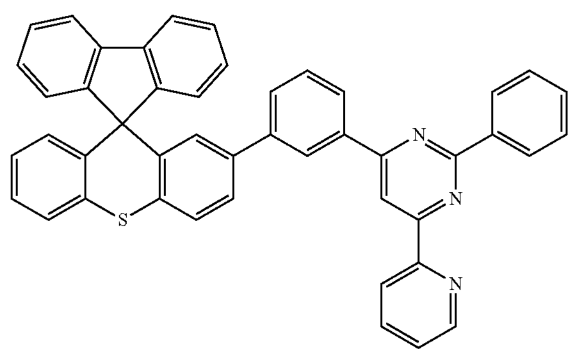

-continued
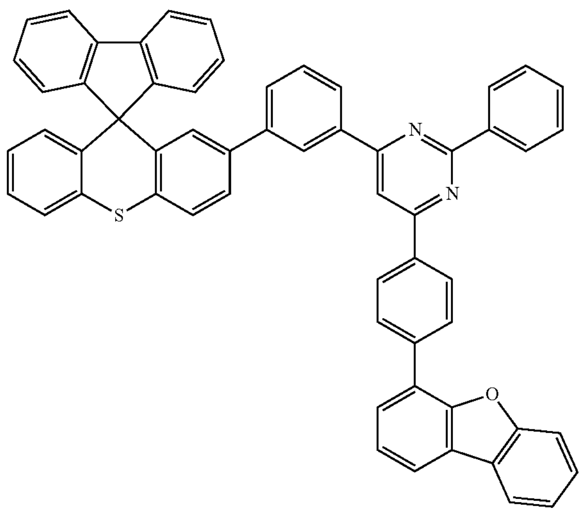
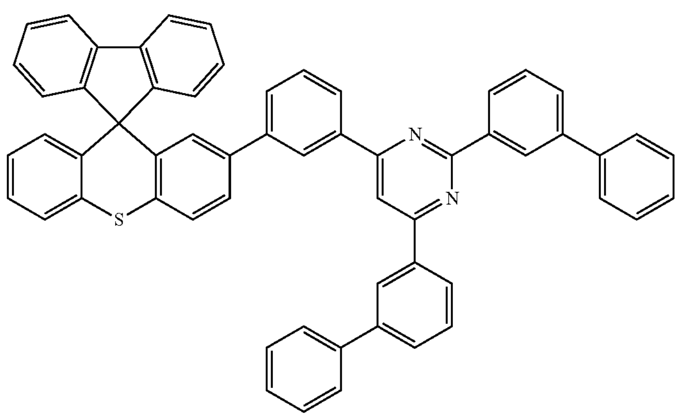
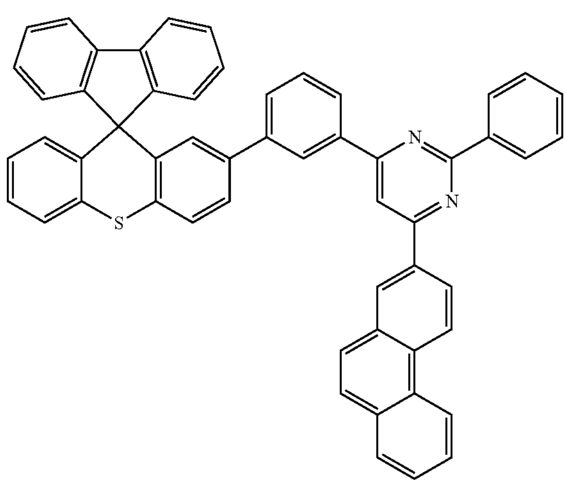
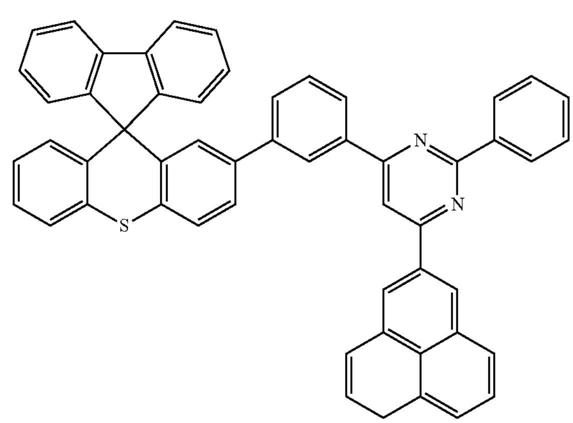

-continued
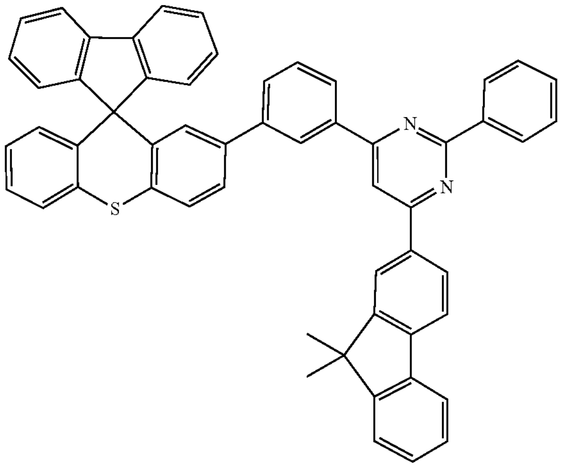
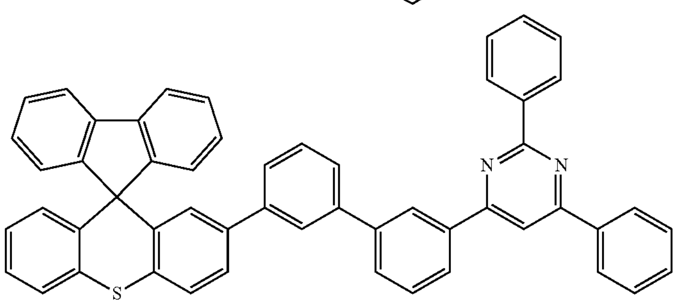
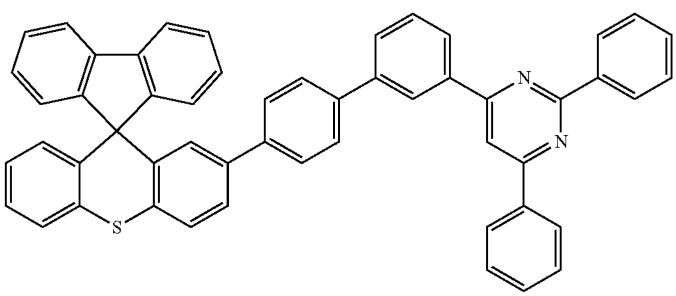
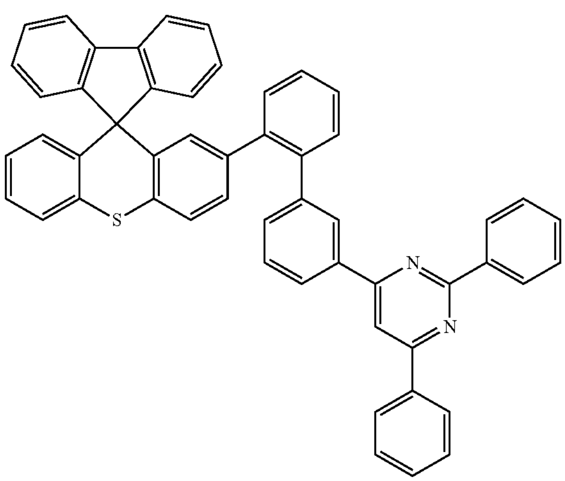
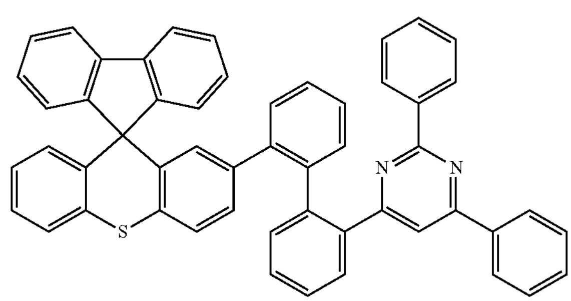

-continued
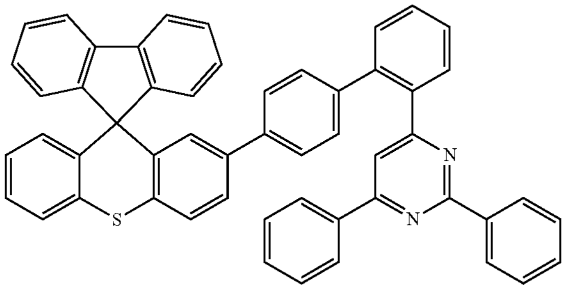
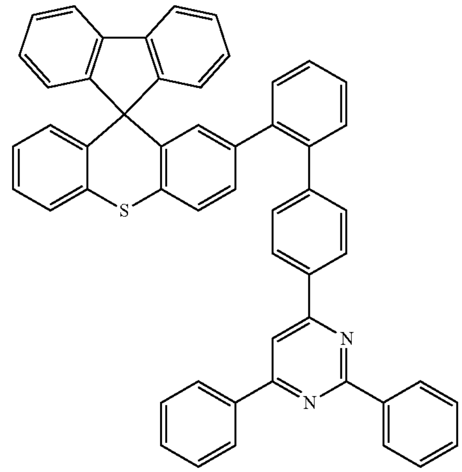
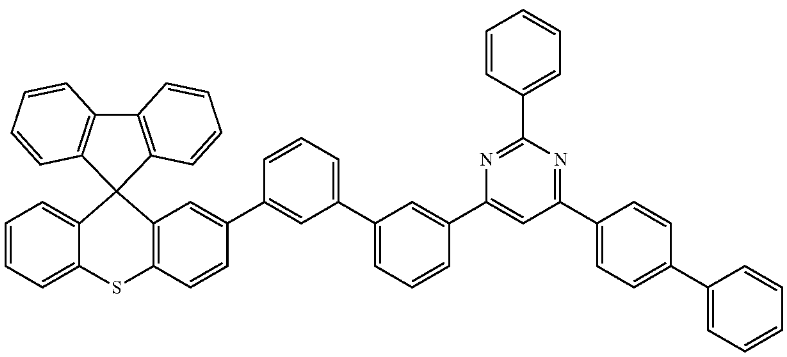
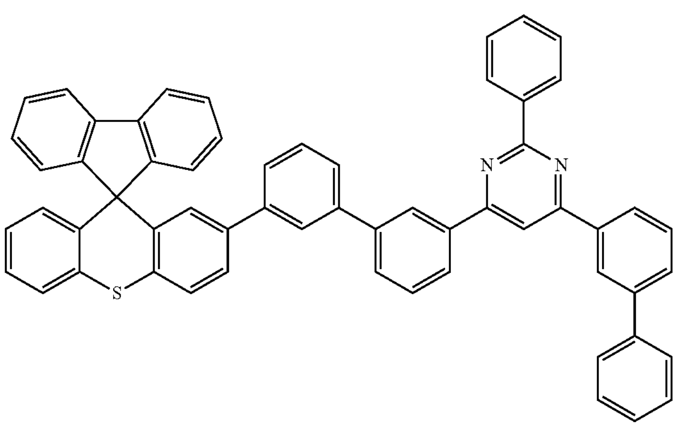
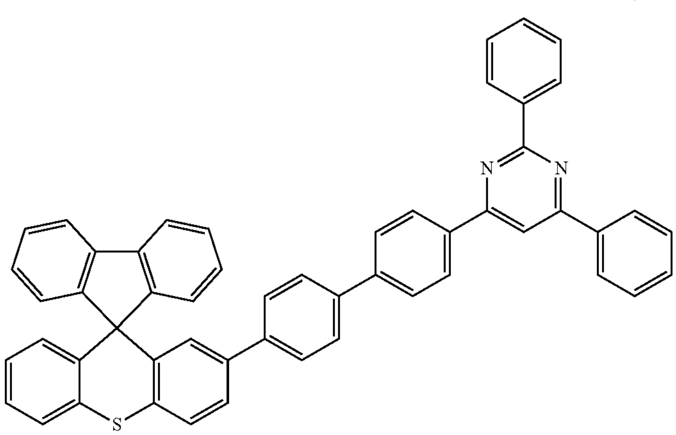
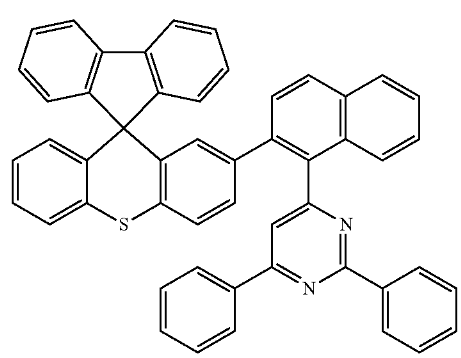

-continued
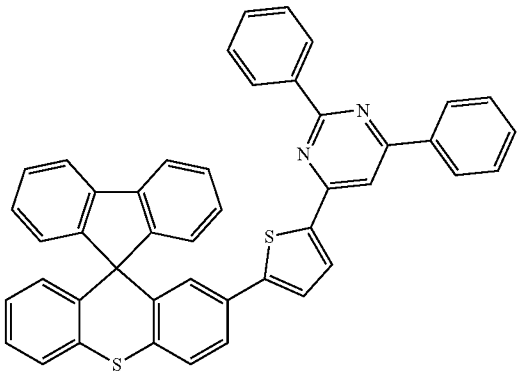
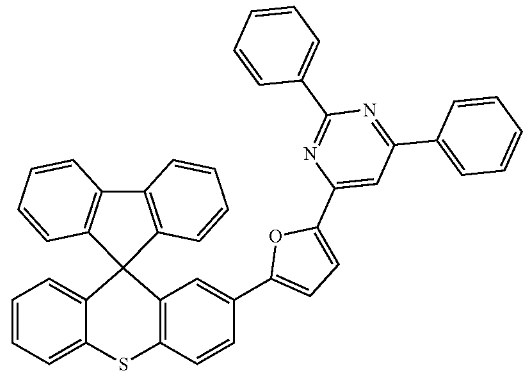
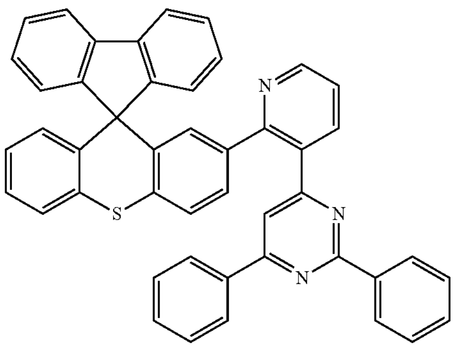
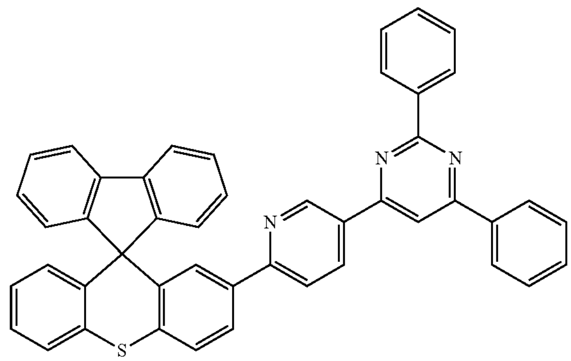
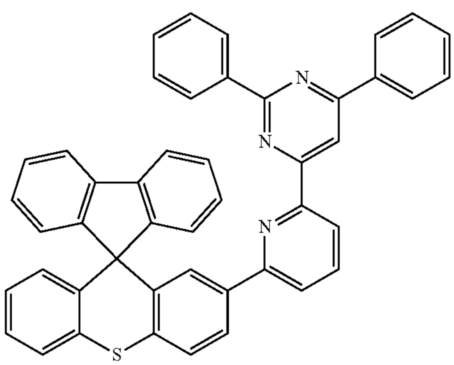
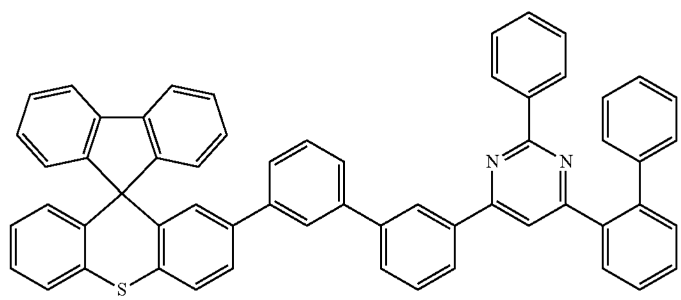
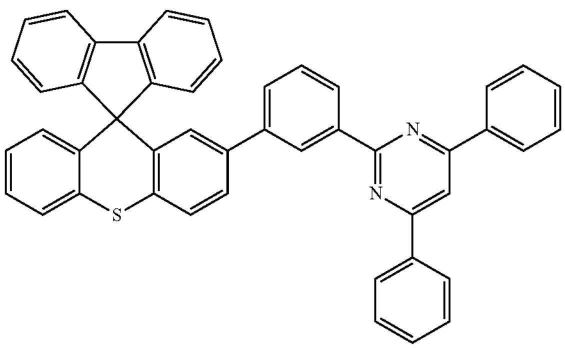
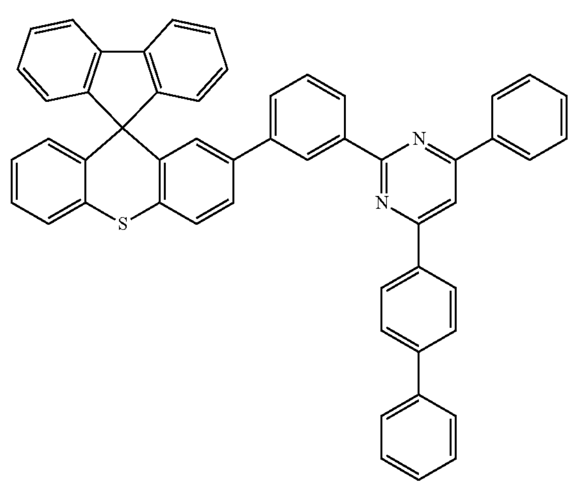

-continued
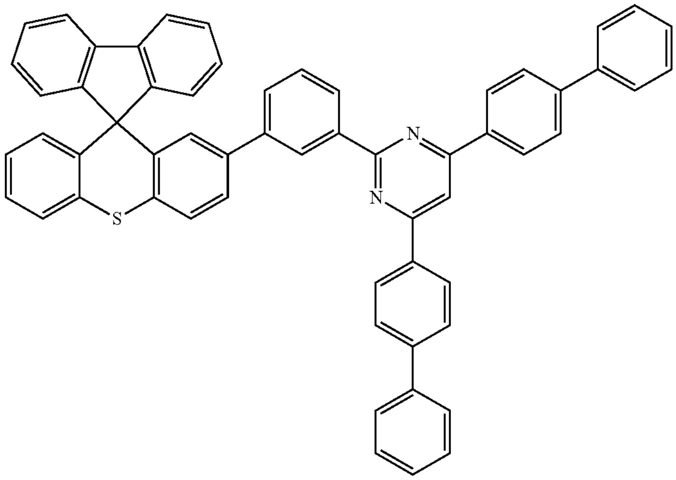
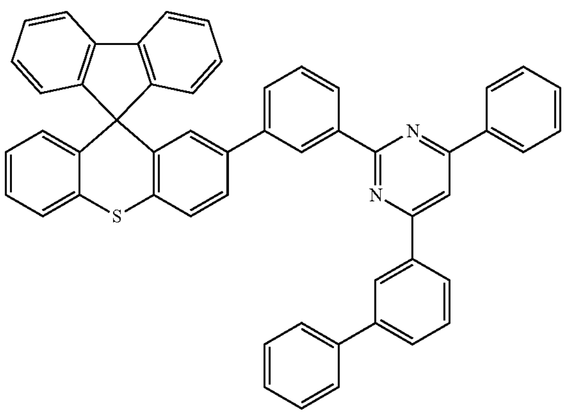
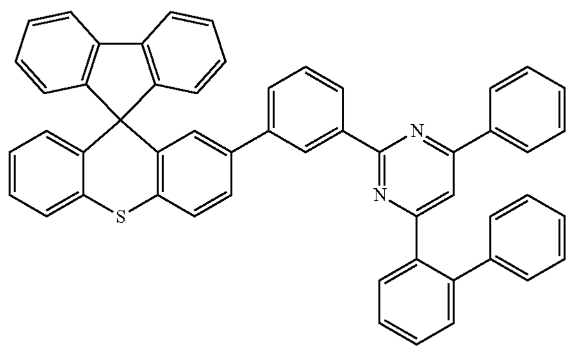
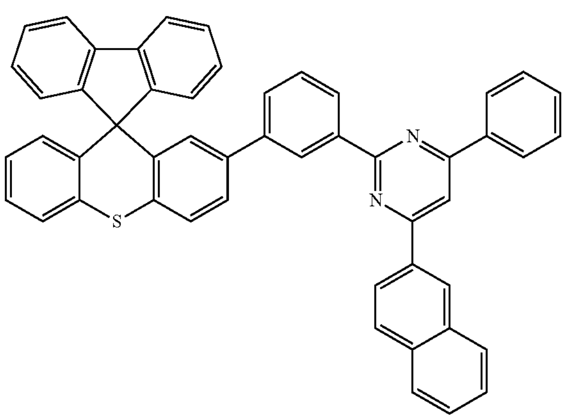
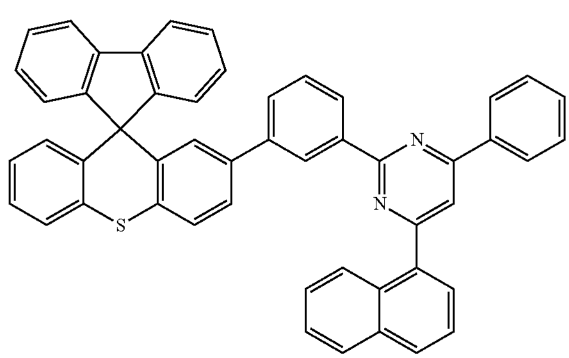

-continued
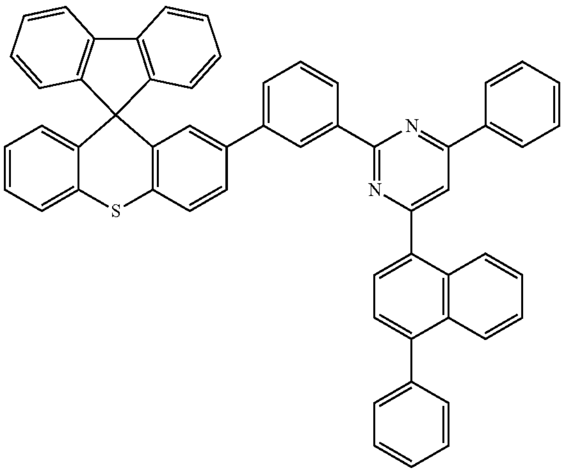
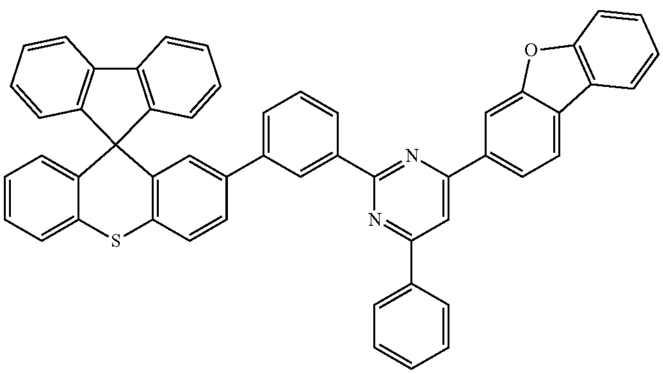
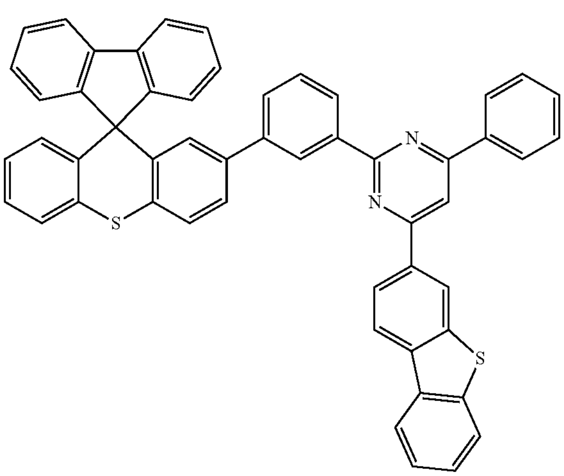
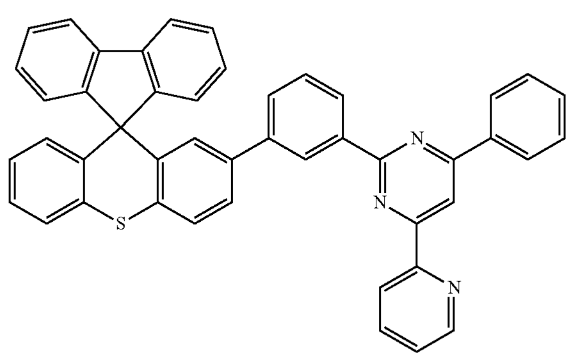

-continued
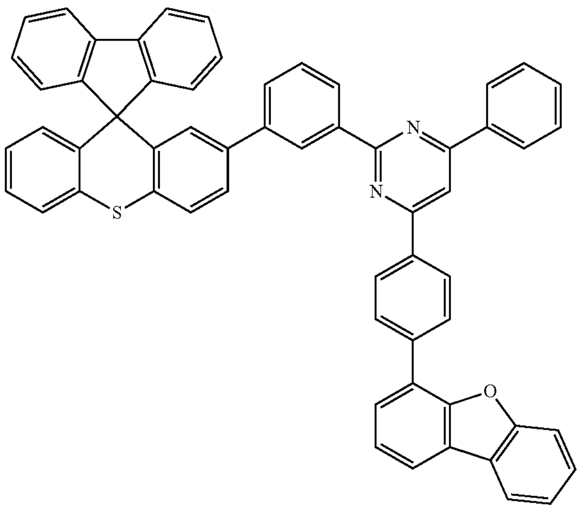
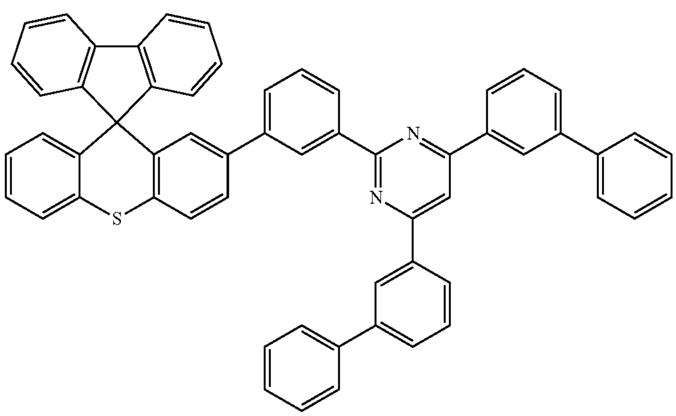
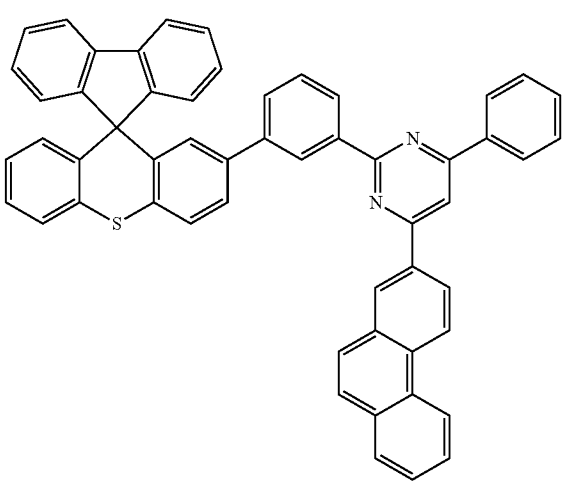
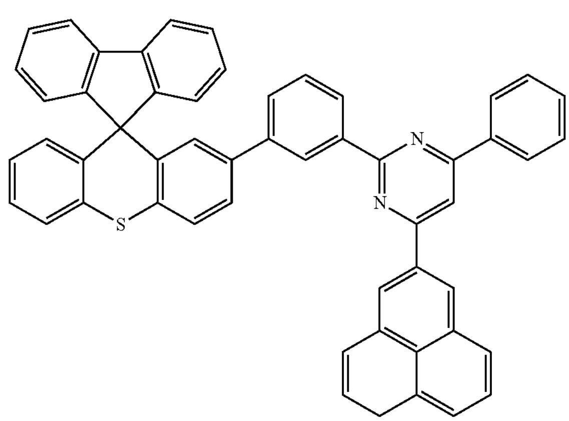

-continued
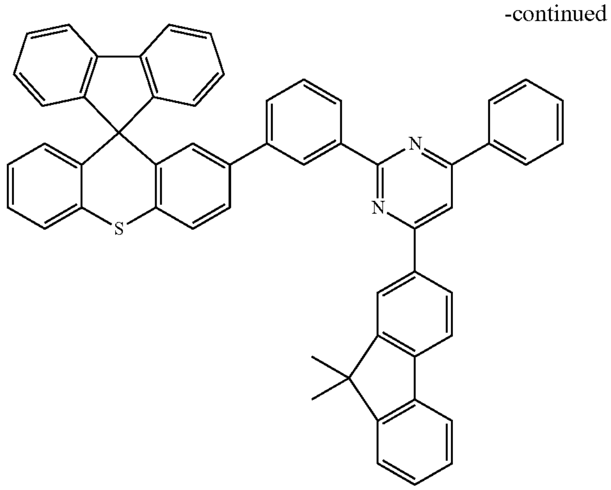
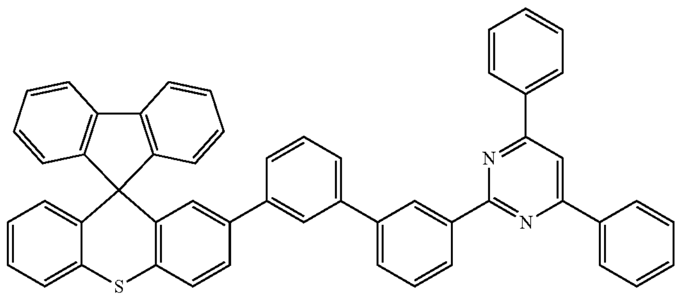
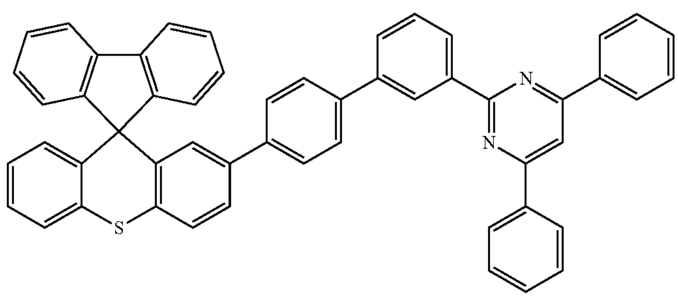
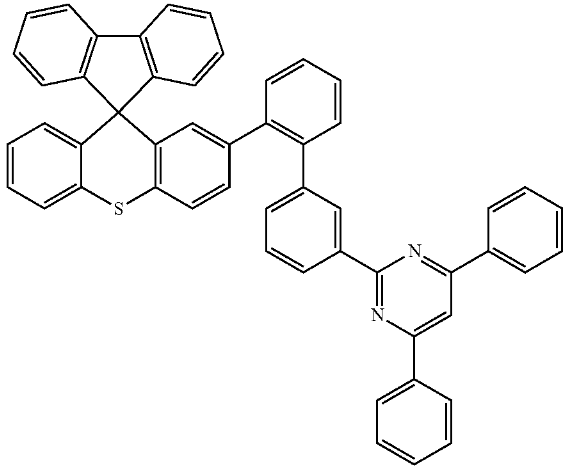
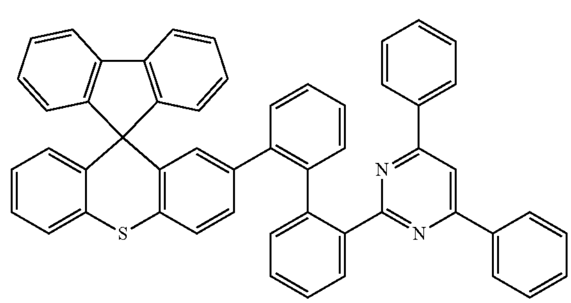

-continued
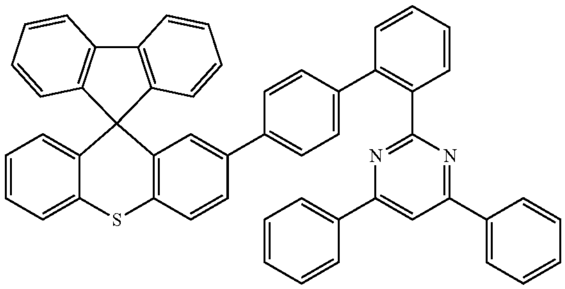
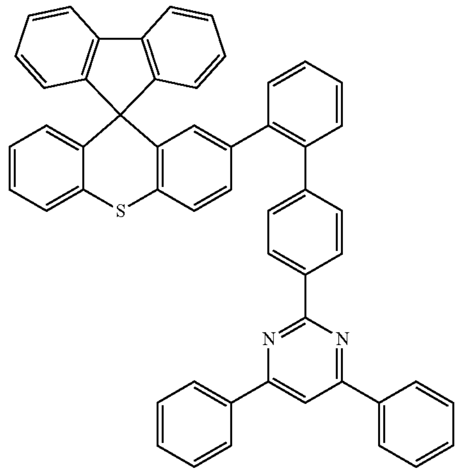
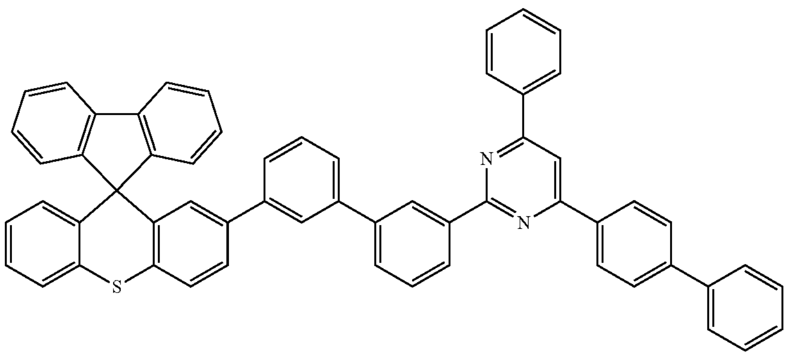
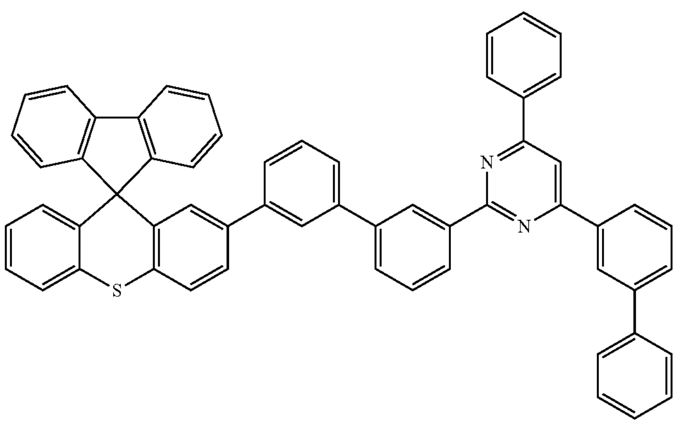
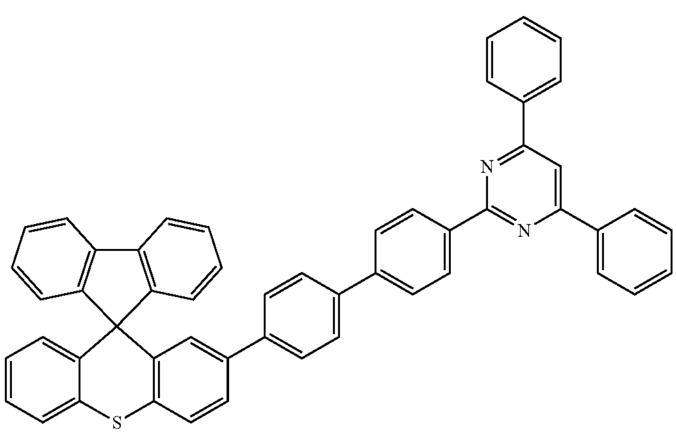

-continued
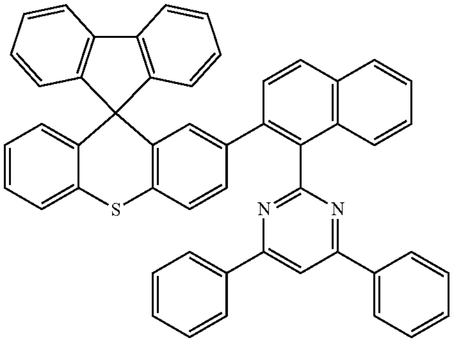
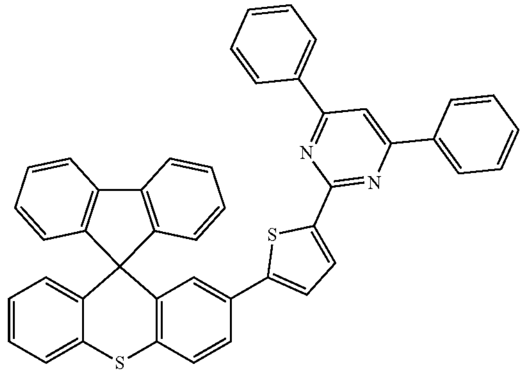
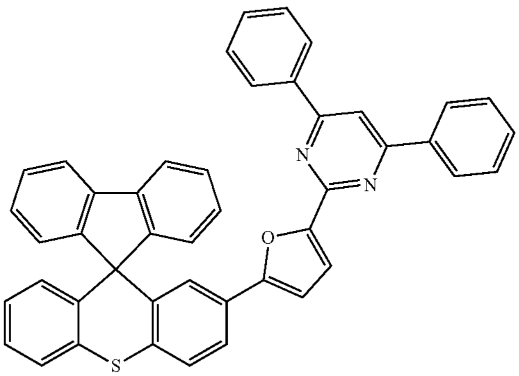
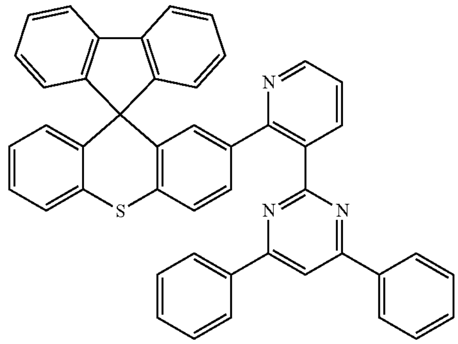
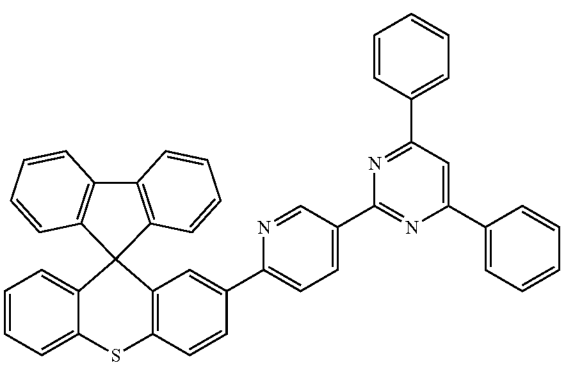
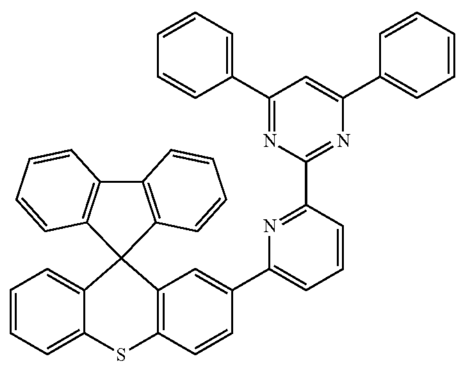
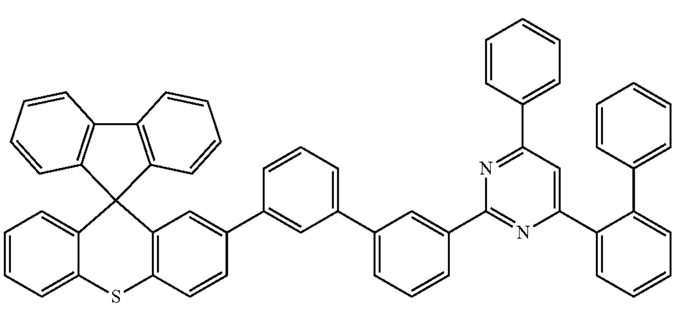
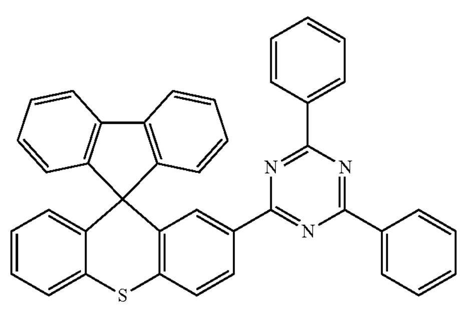

-continued
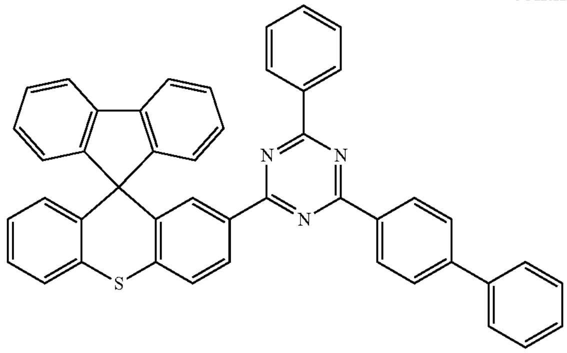
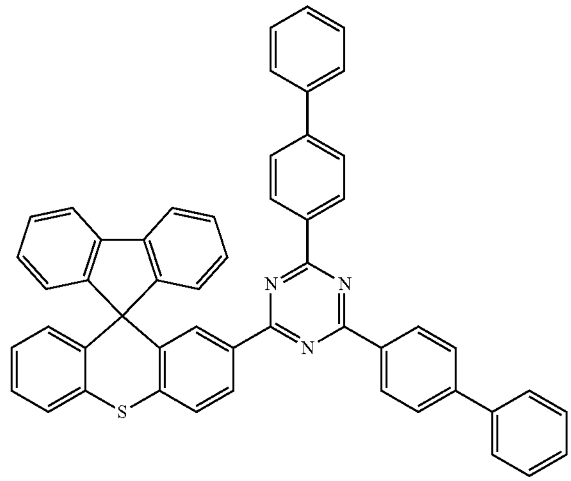
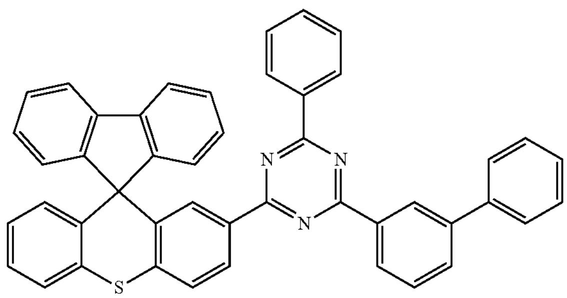
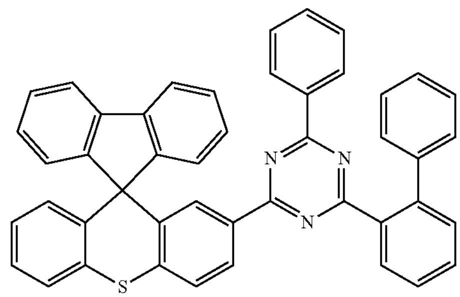
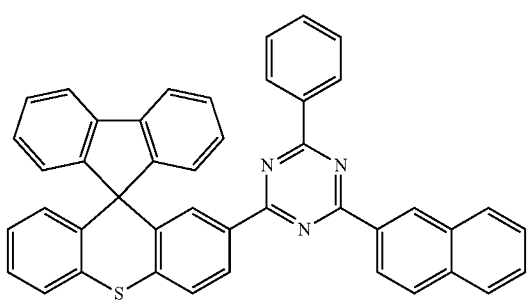
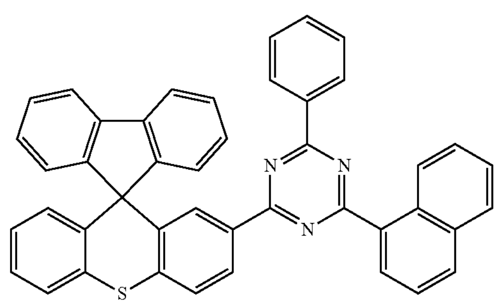
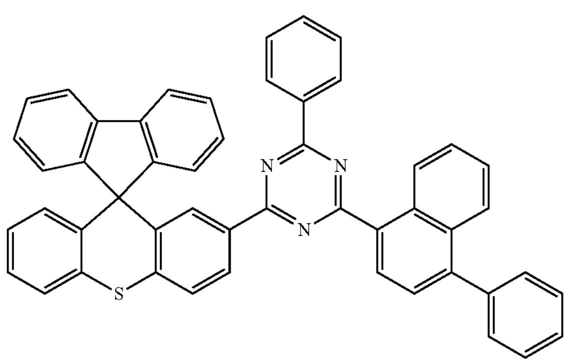
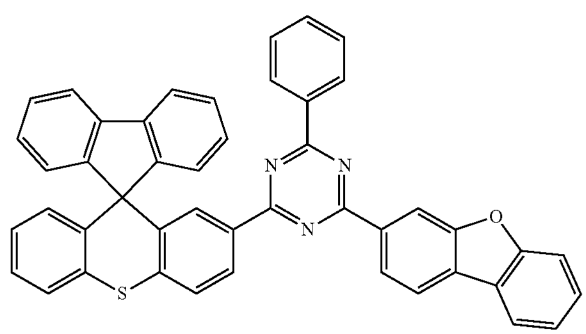

-continued
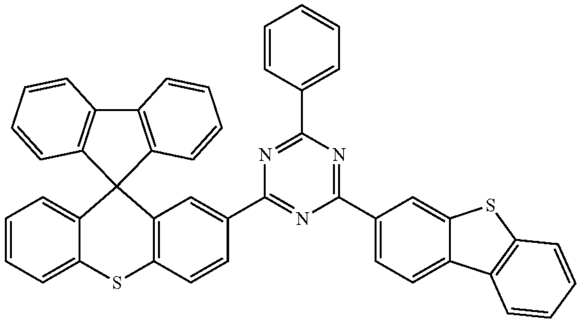
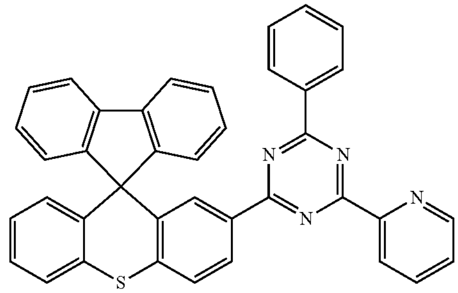
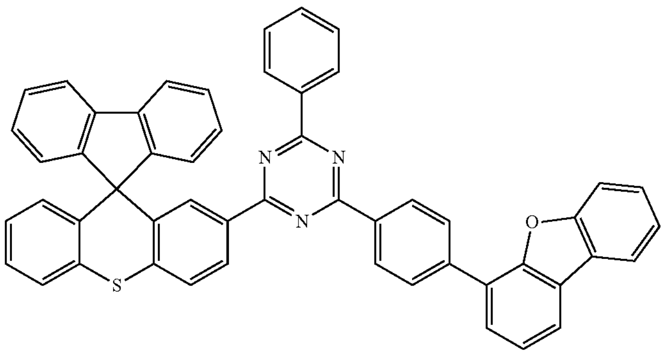
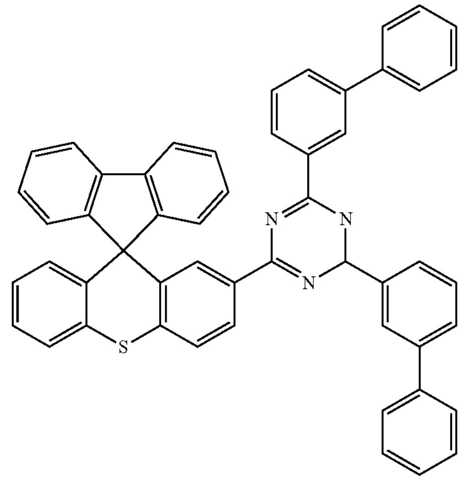
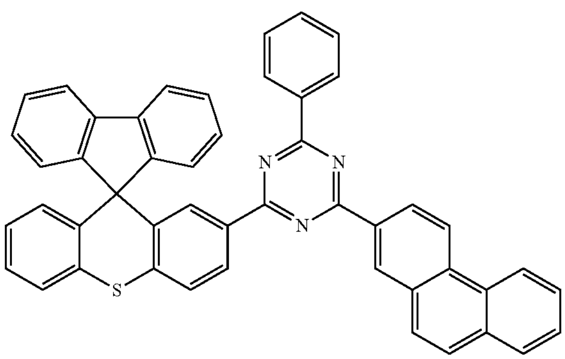
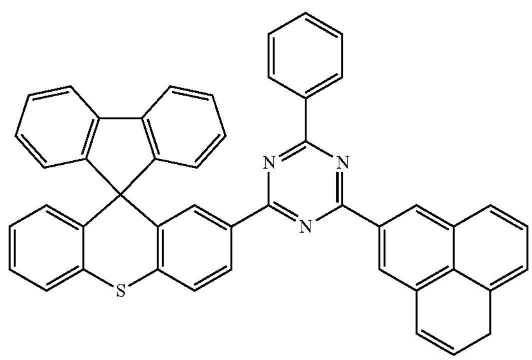
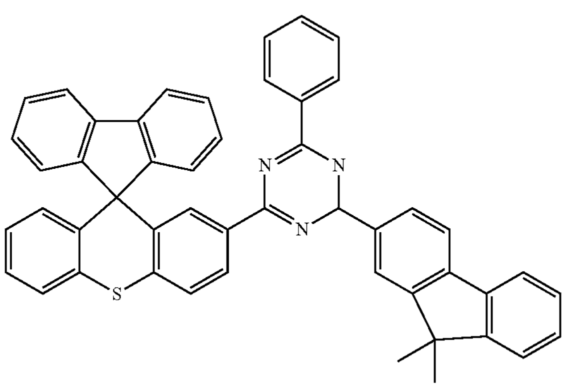
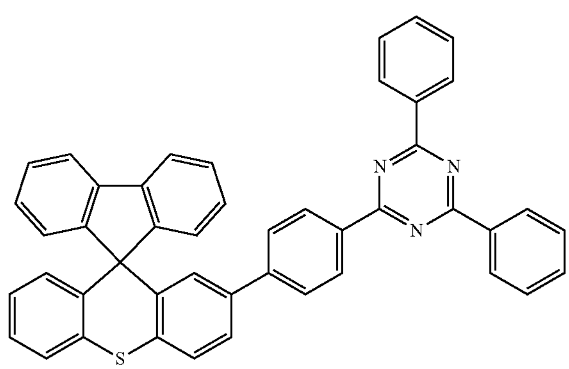

-continued
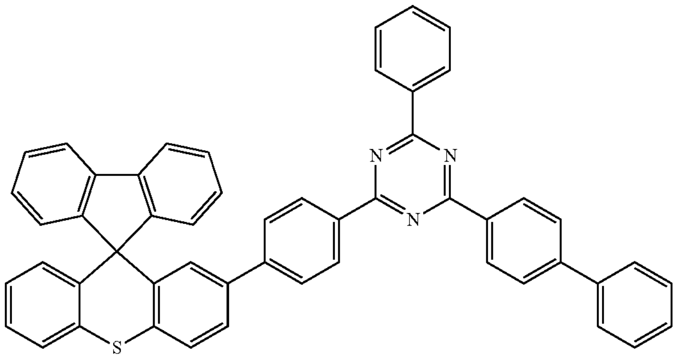
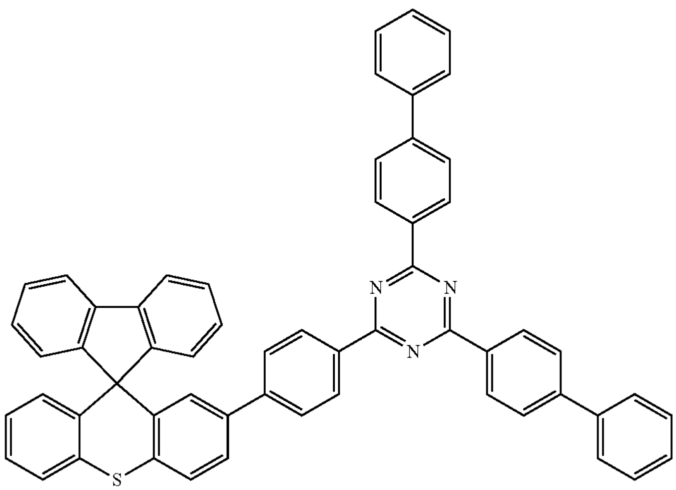
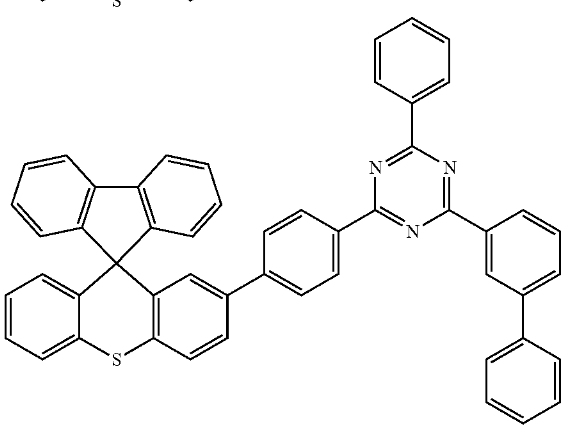
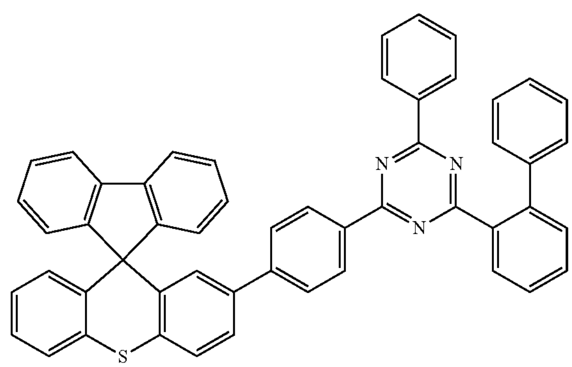
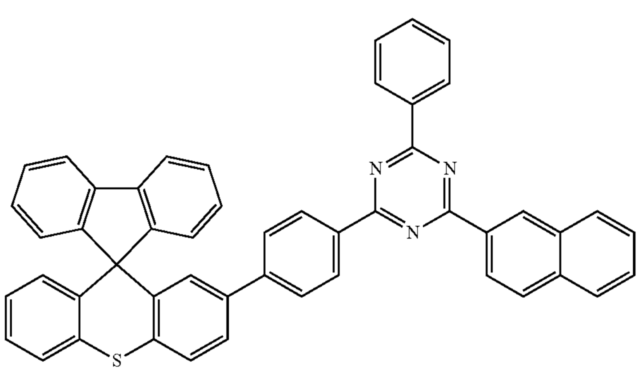

-continued
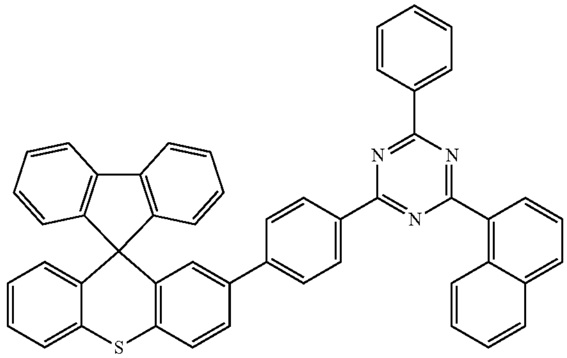
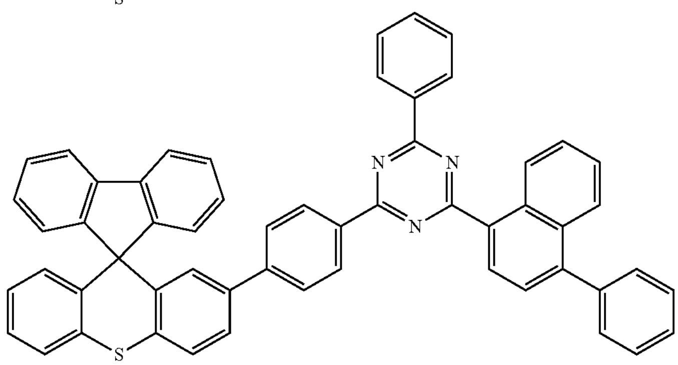
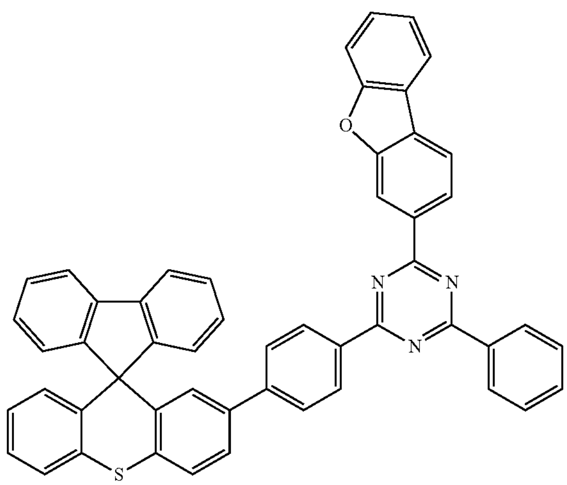
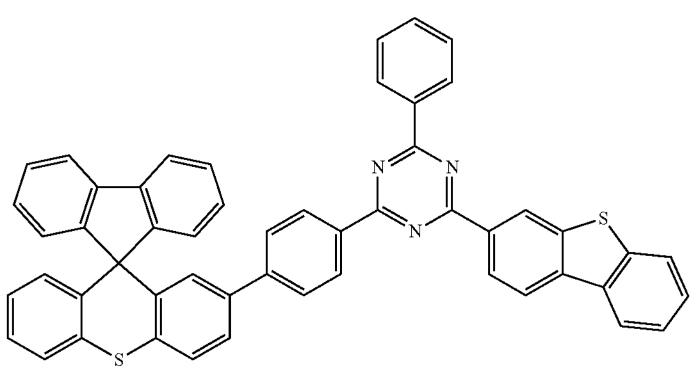

-continued
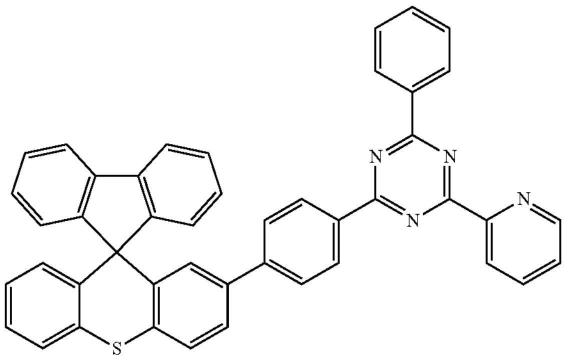
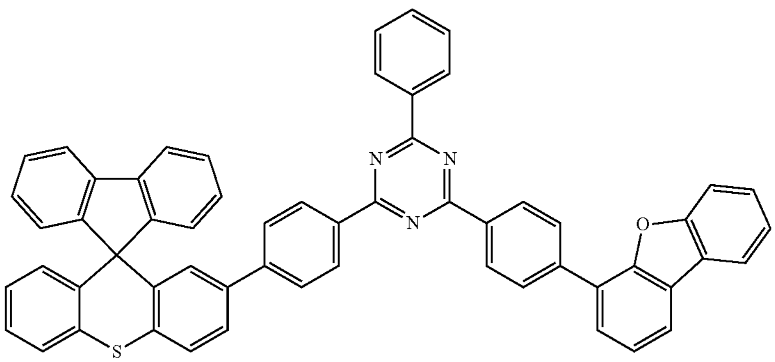
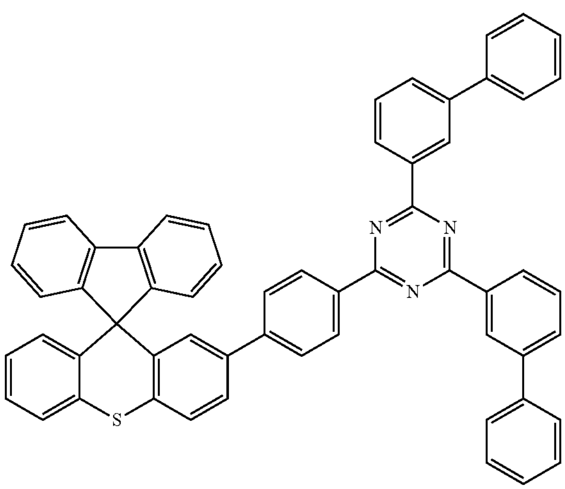
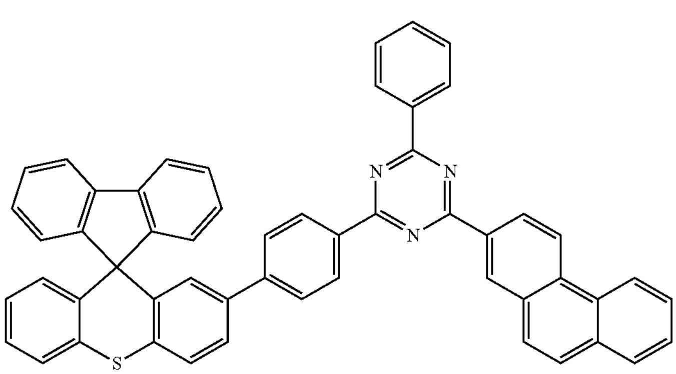

-continued
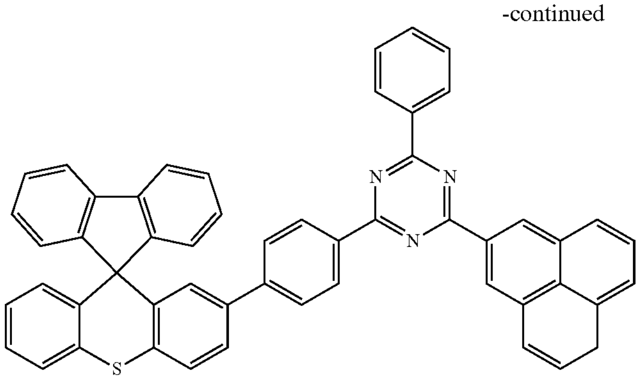
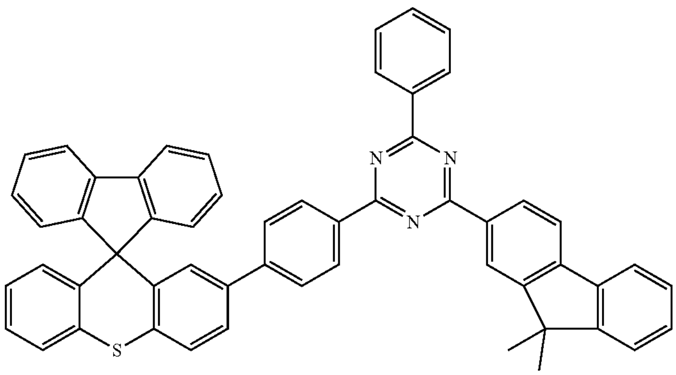
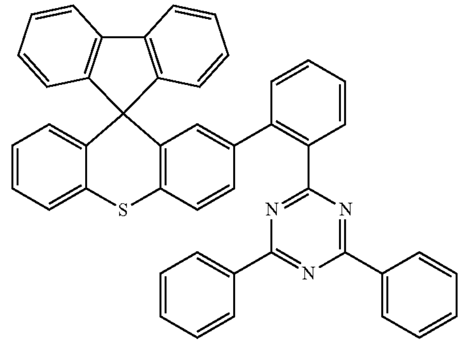
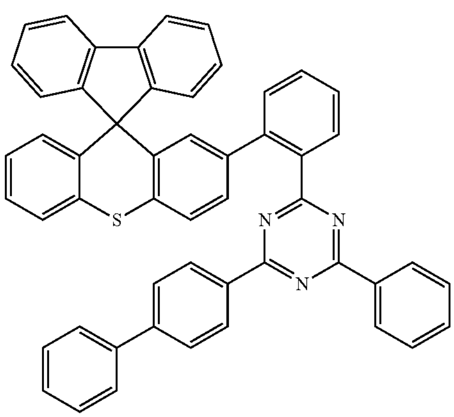
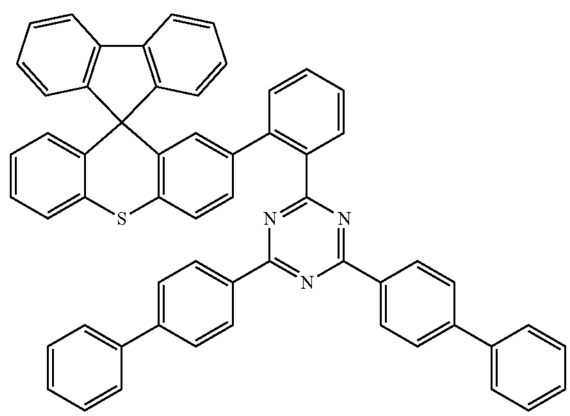
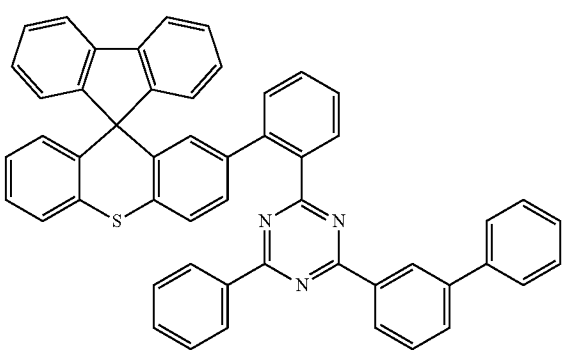

-continued
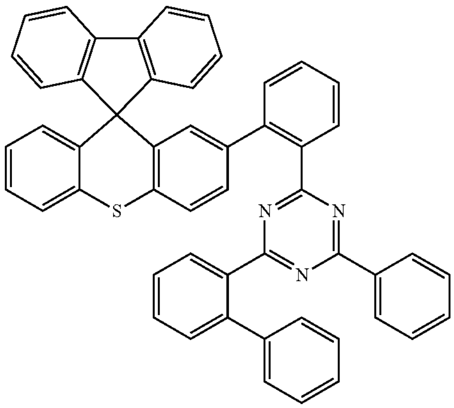
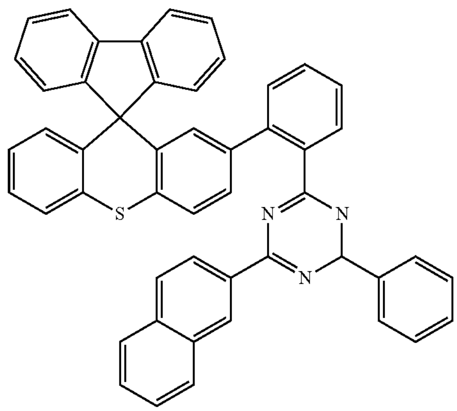
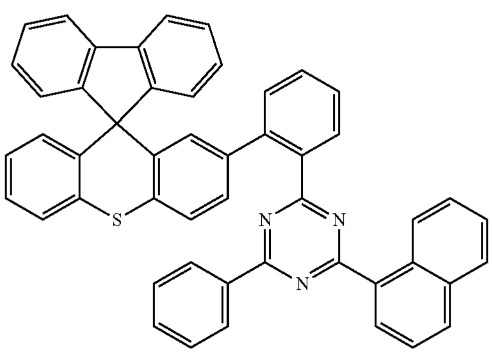
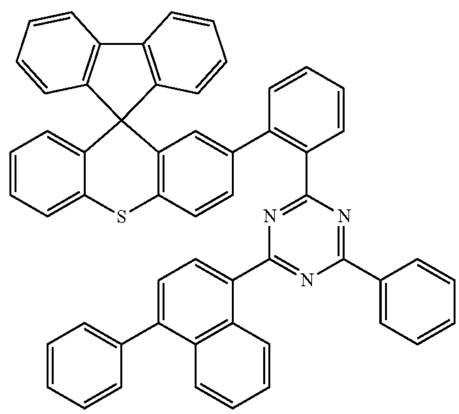
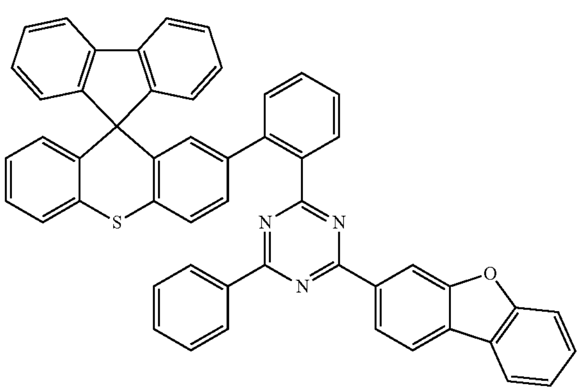
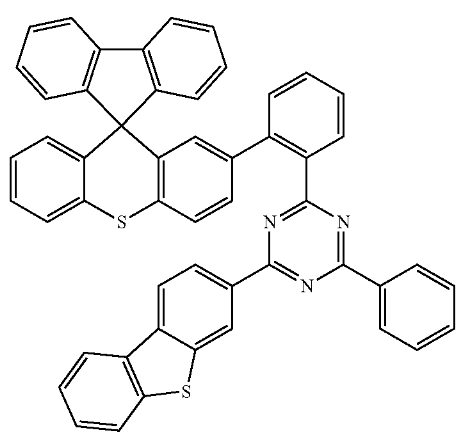

-continued
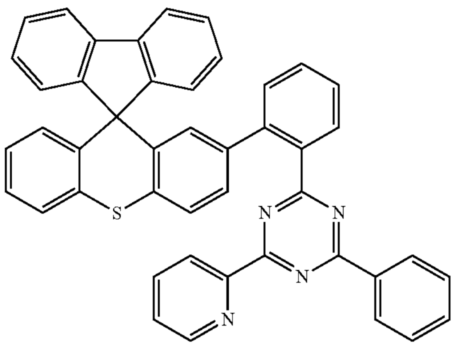
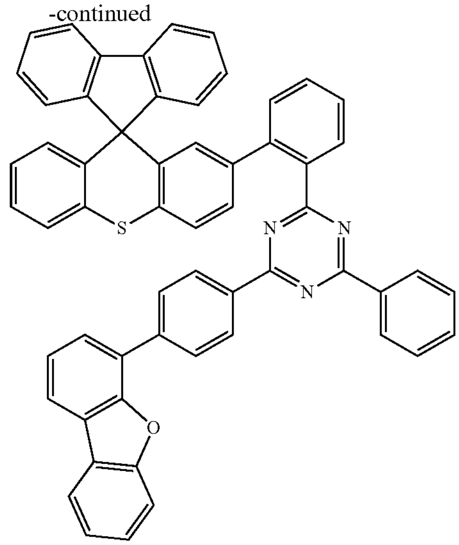
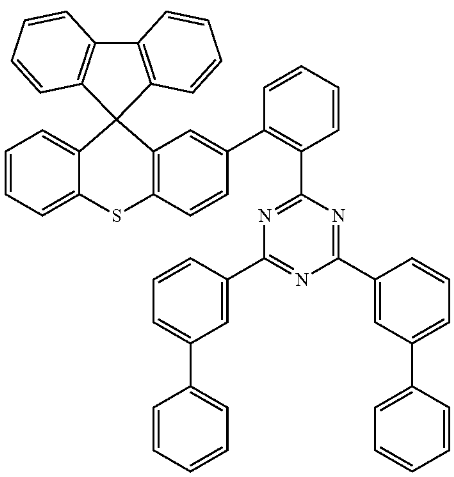
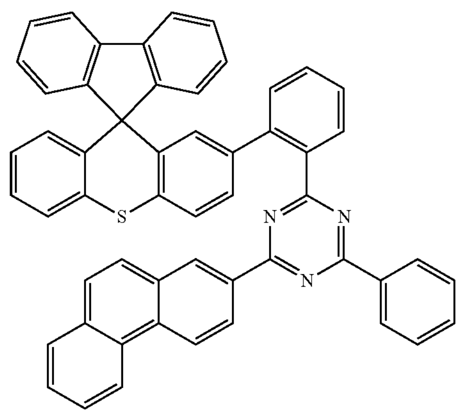
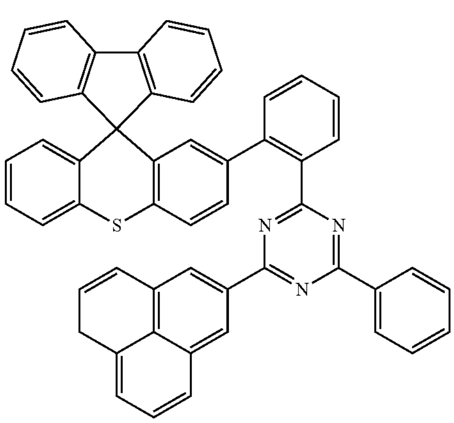
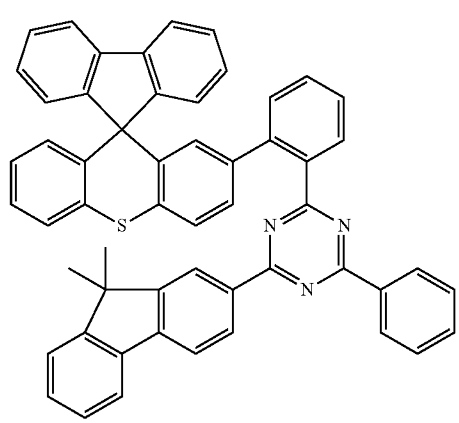

-continued
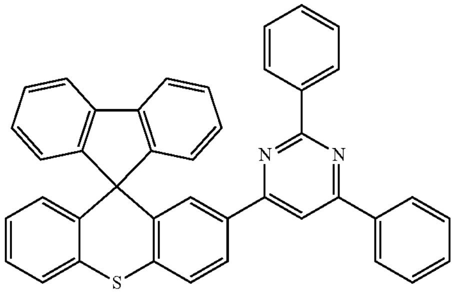
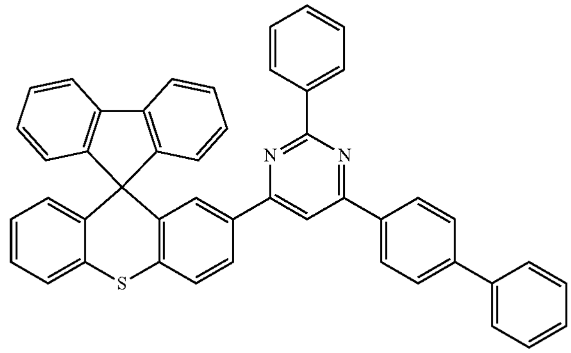
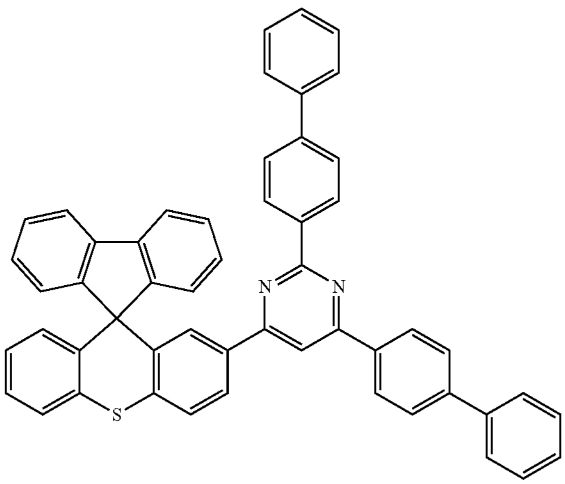
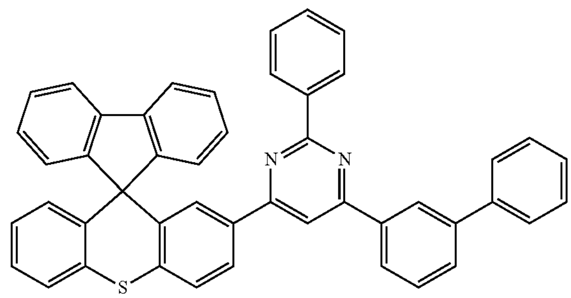
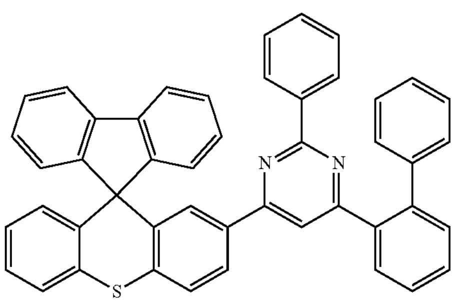
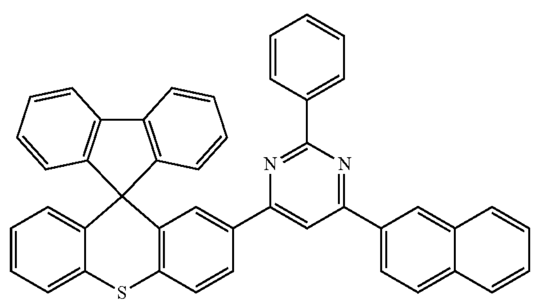
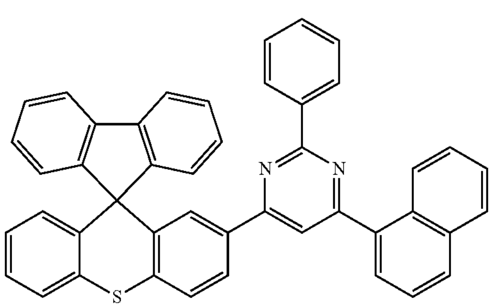
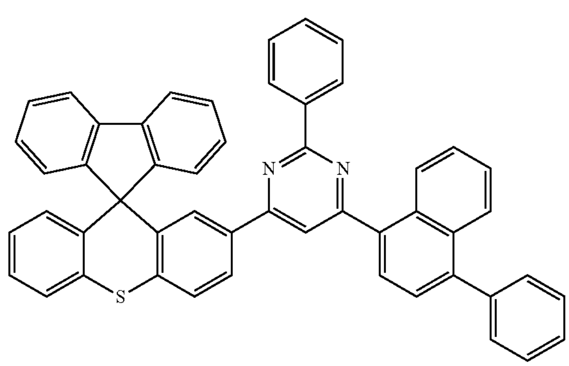

-continued
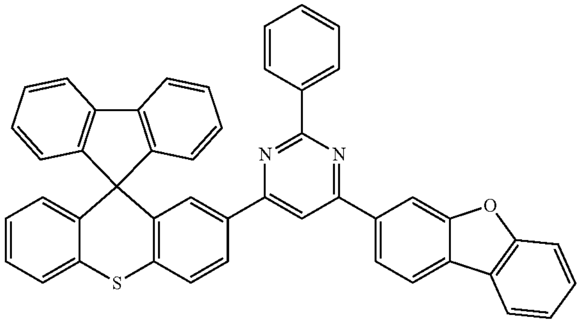
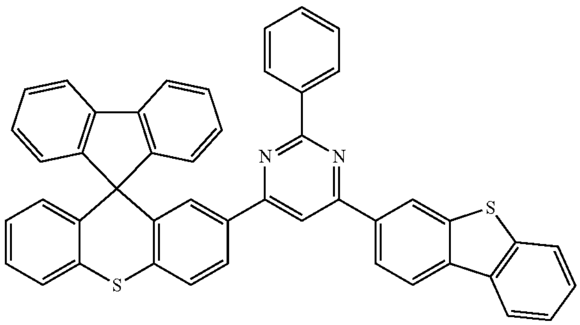
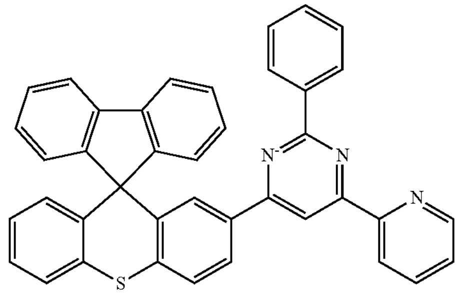
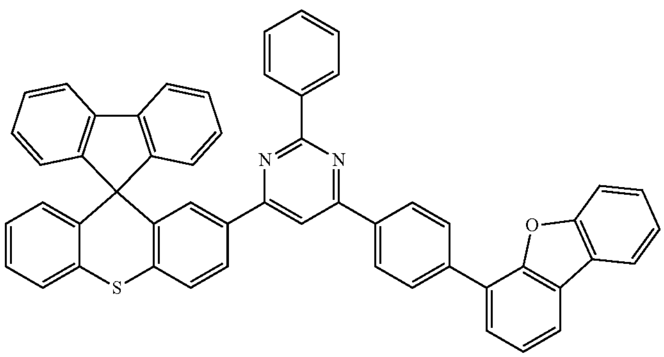
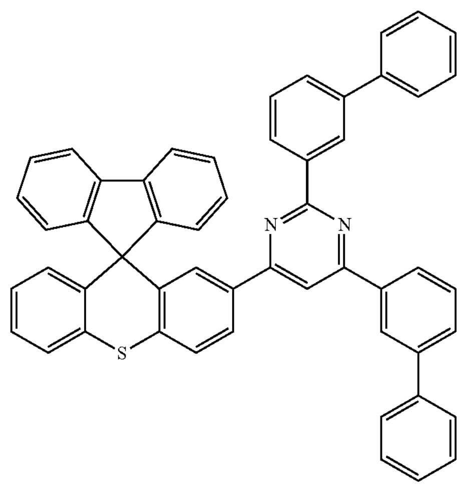
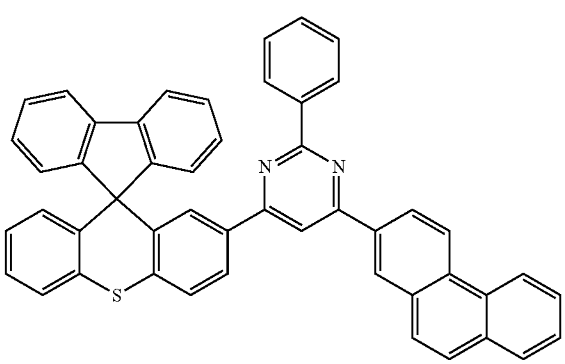
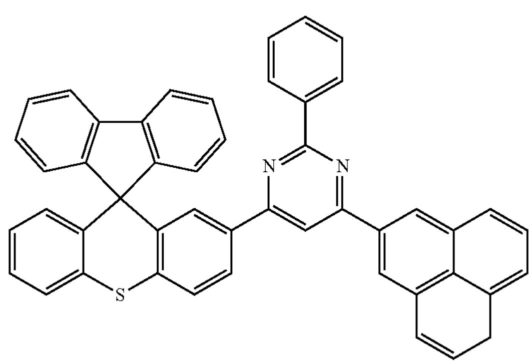

-continued
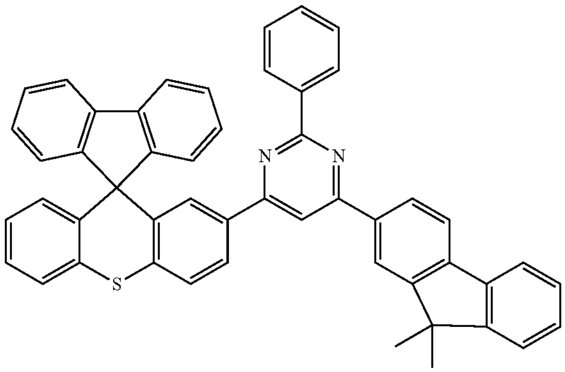
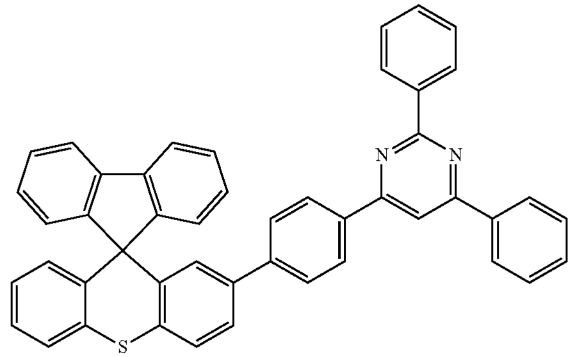
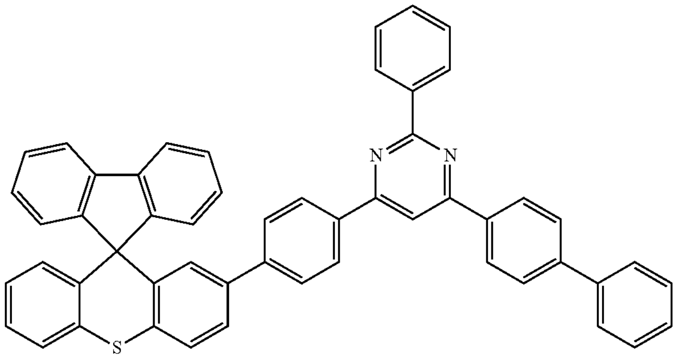
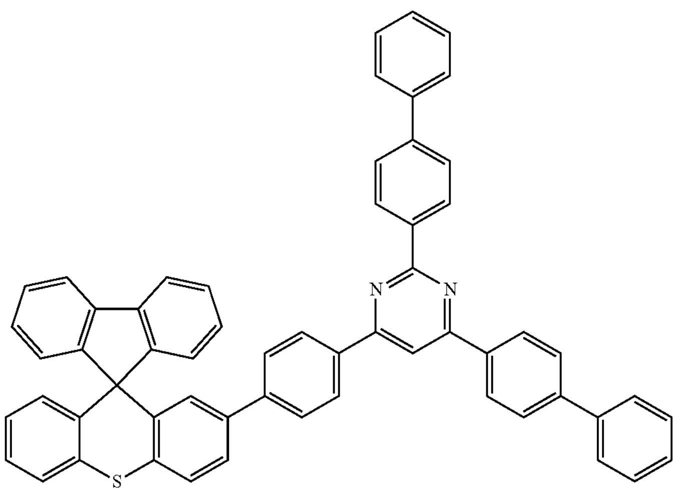
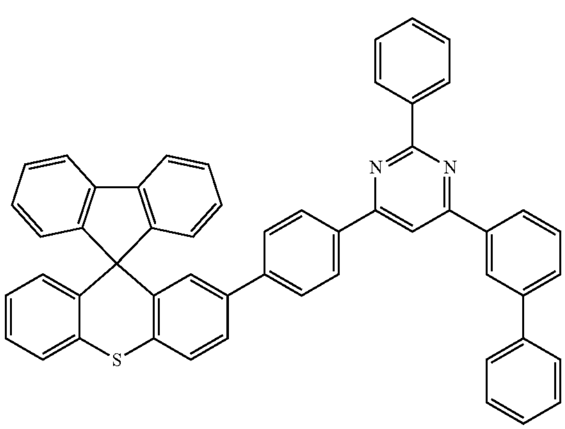
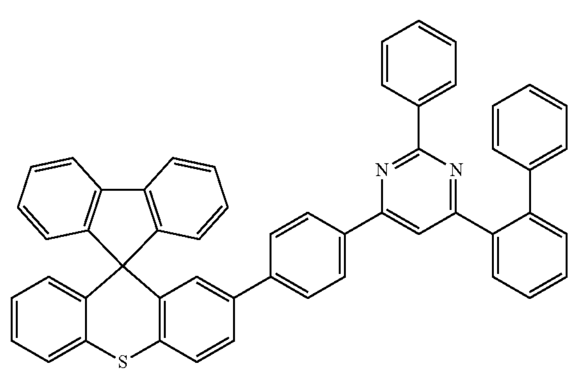

-continued
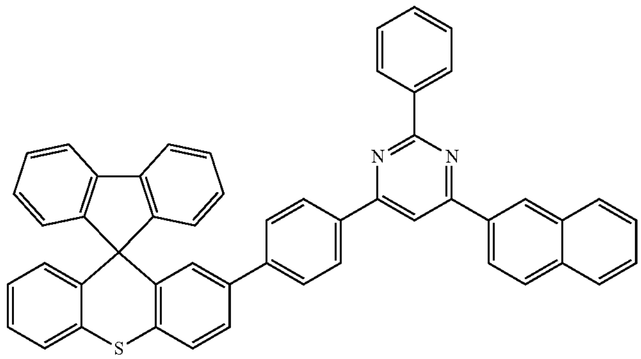
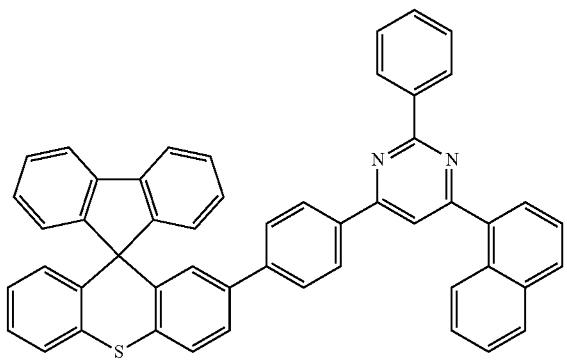
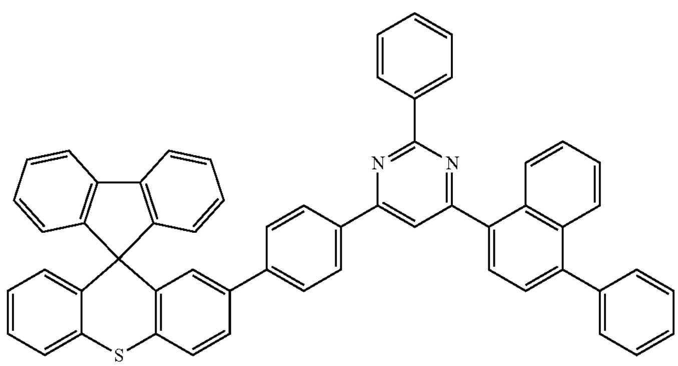
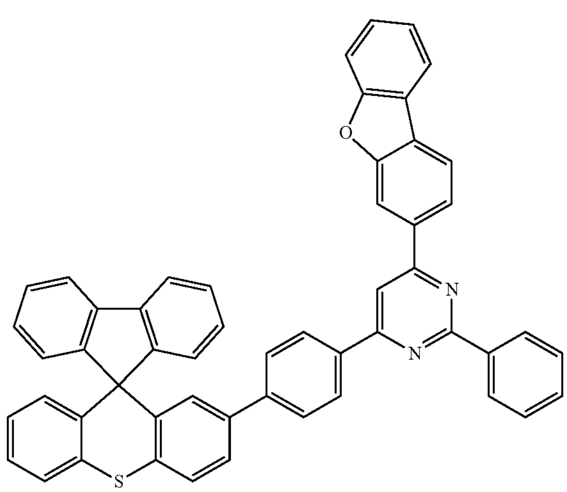

-continued
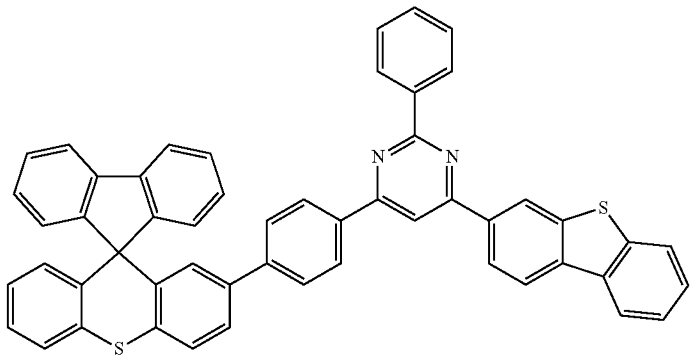
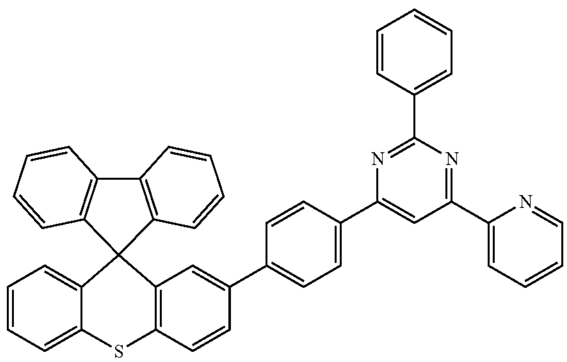
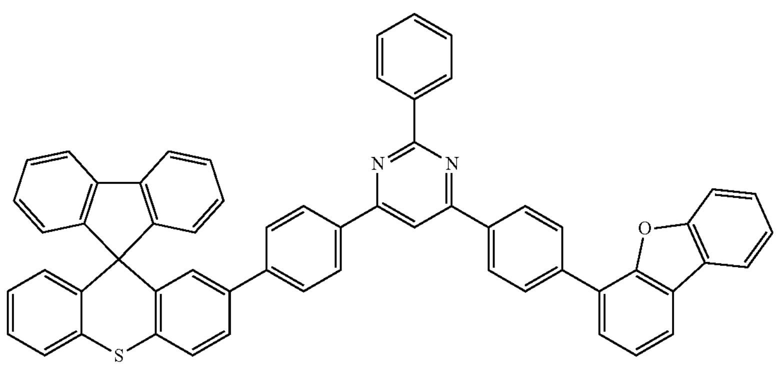
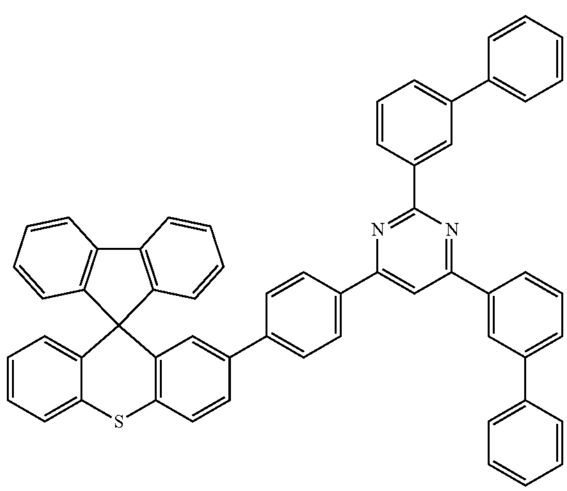

-continued
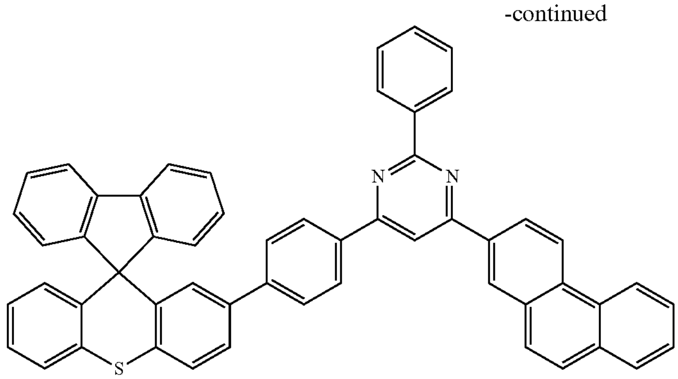
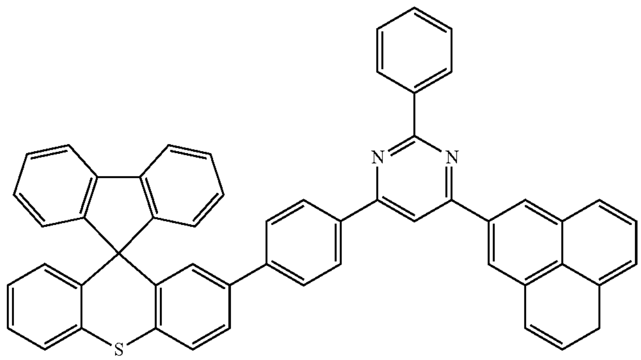
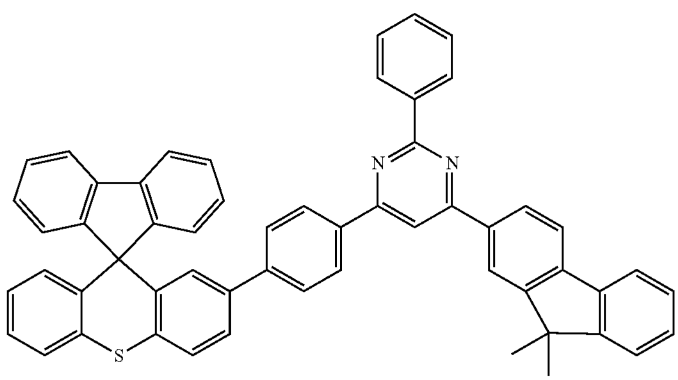
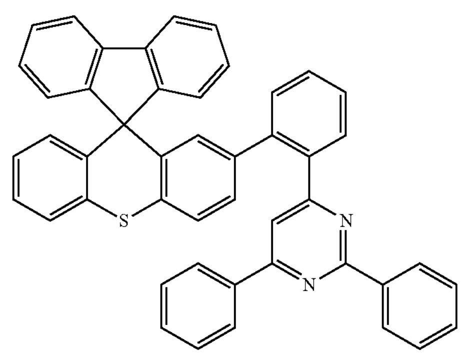
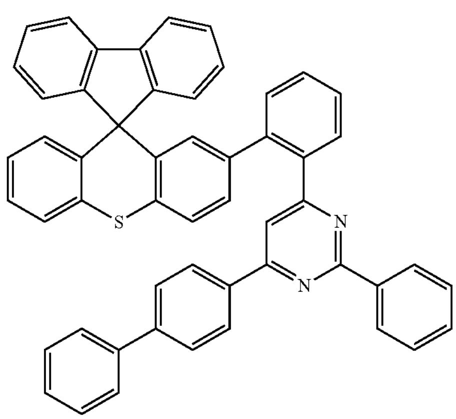
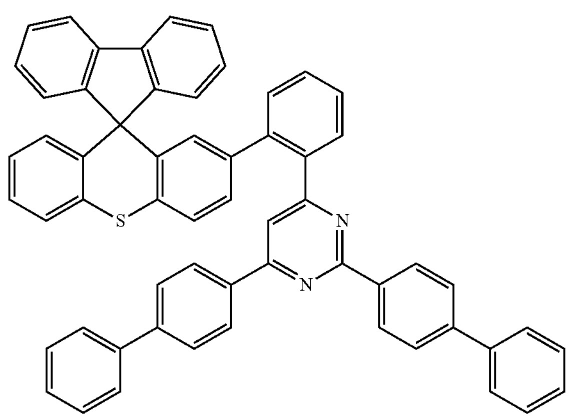

-continued
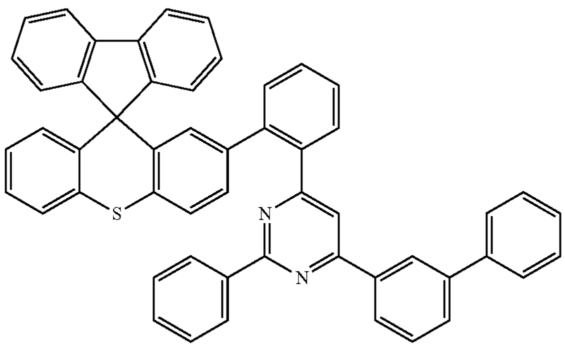
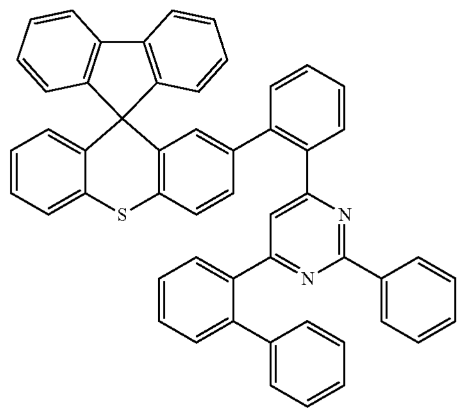
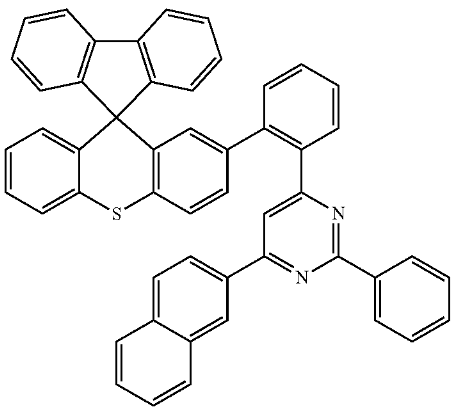
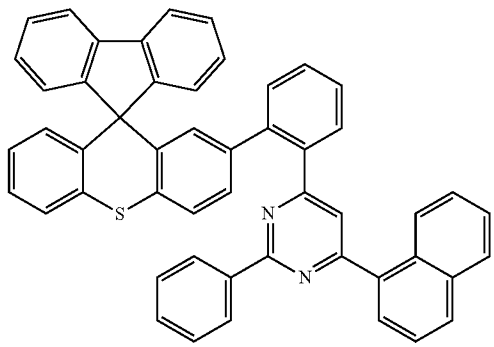
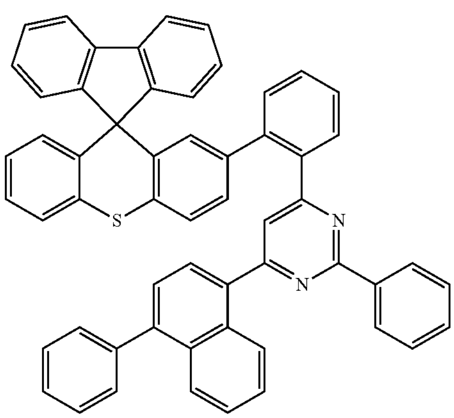
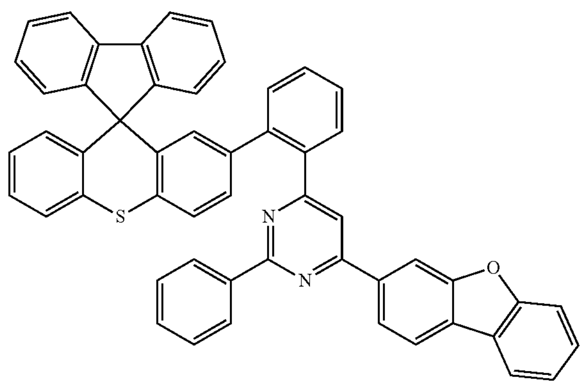
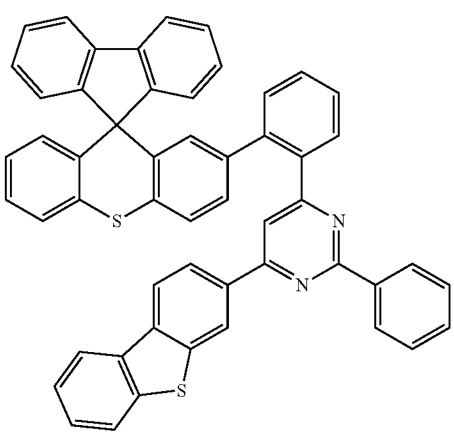
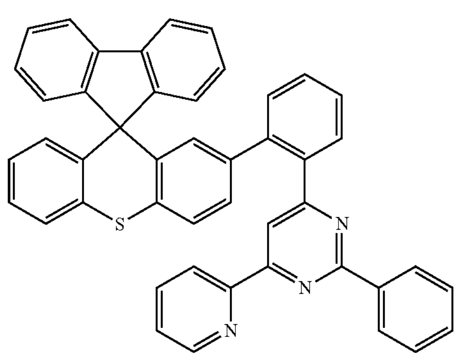

-continued
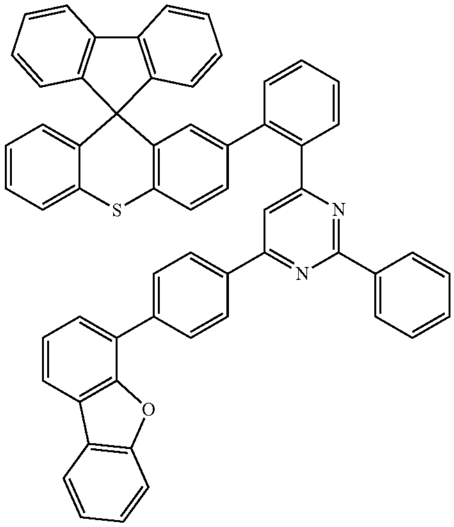
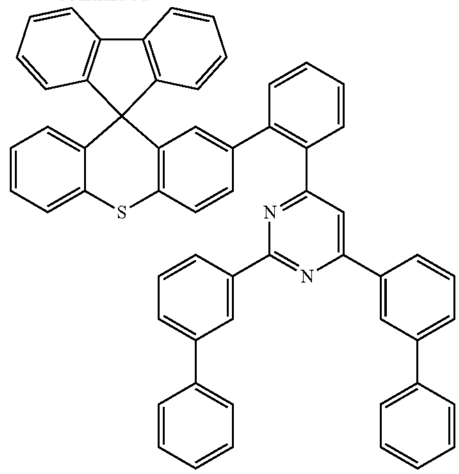
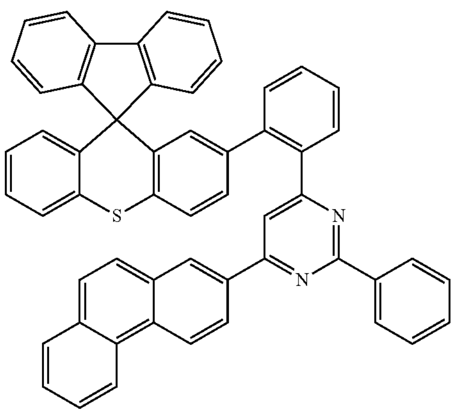
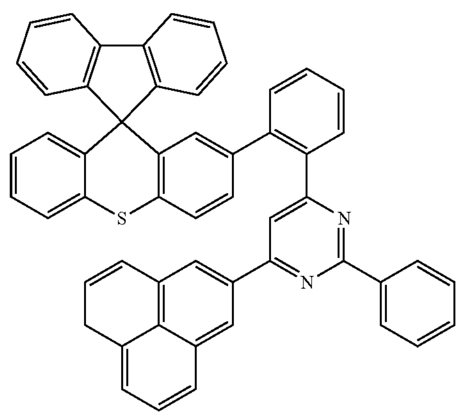
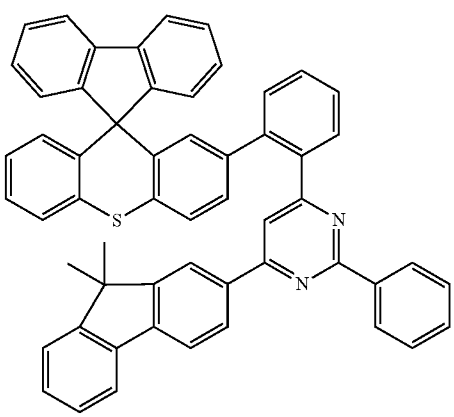
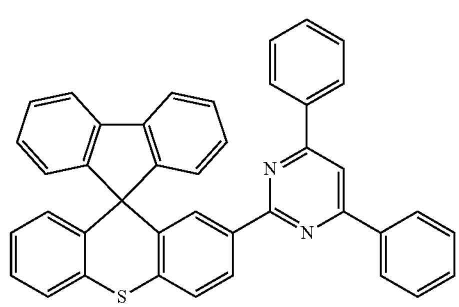

-continued
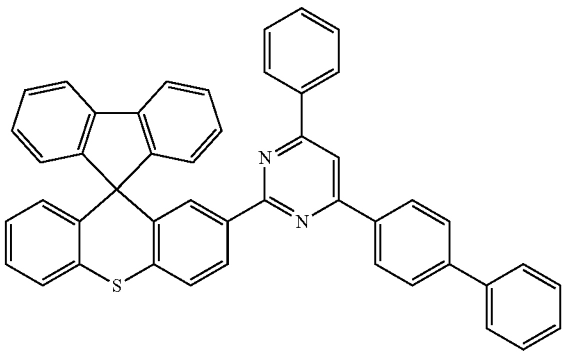
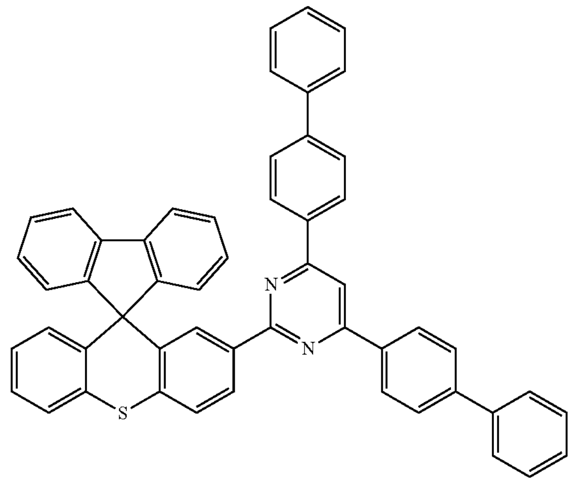
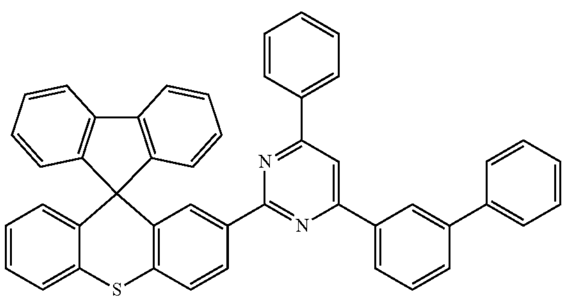
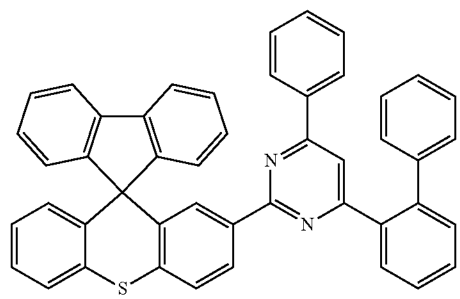
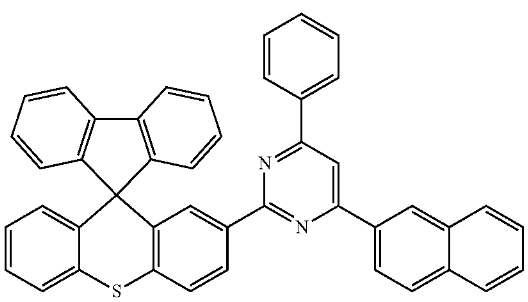
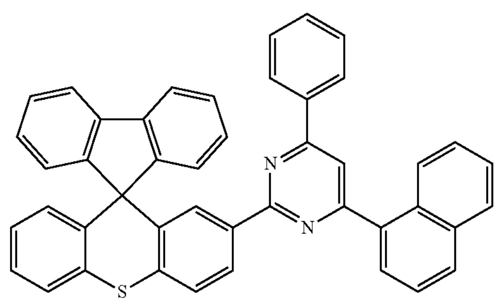
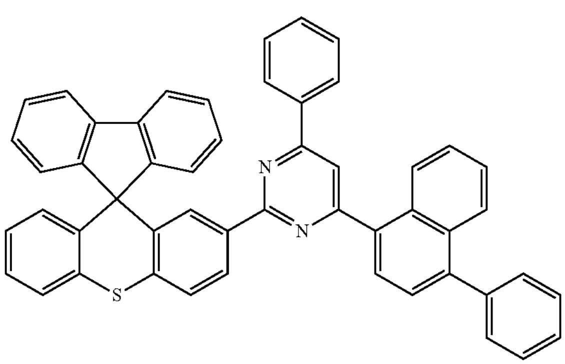
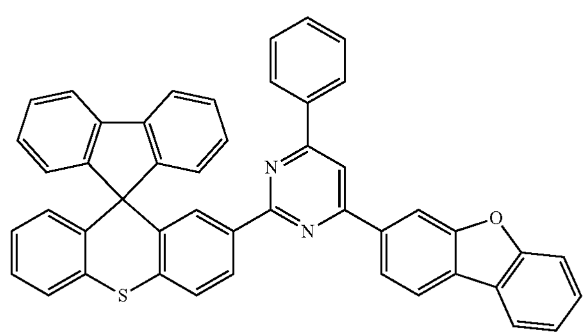

-continued
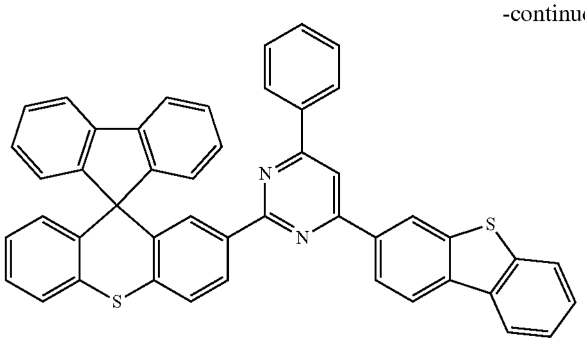
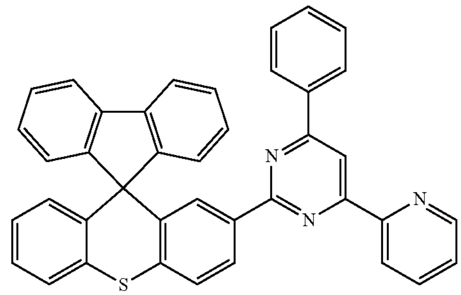
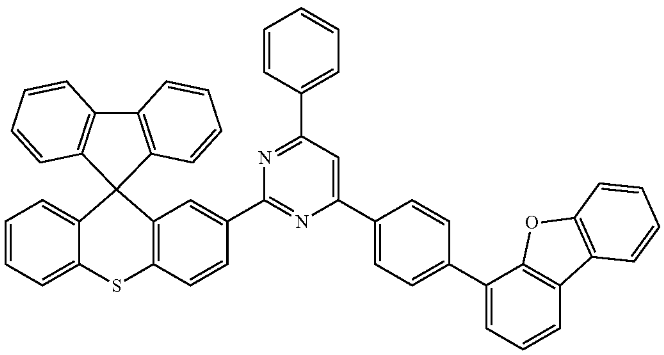
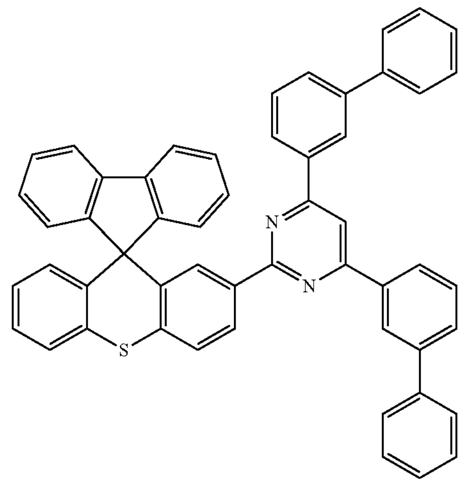
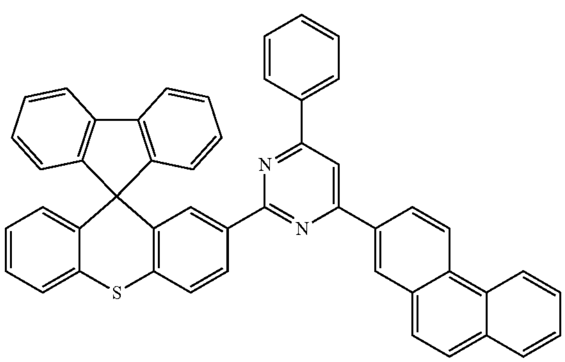
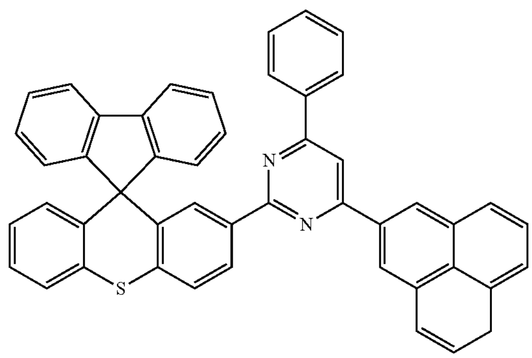
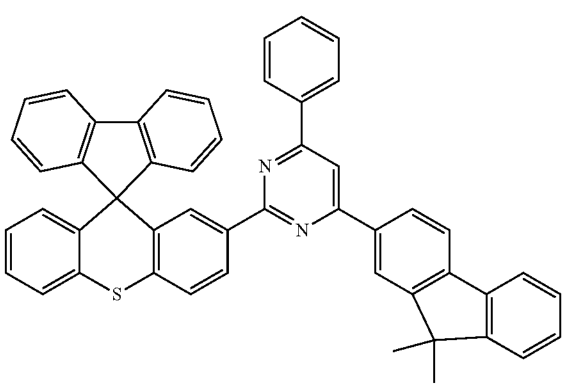
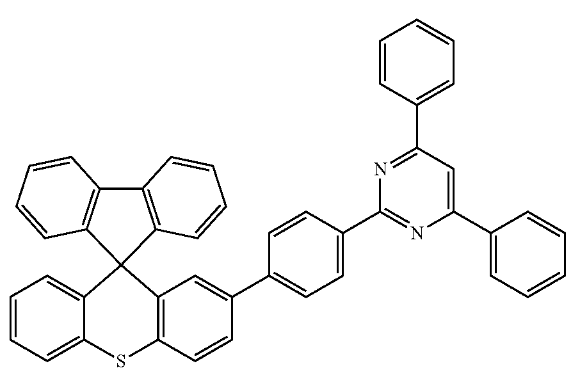

-continued
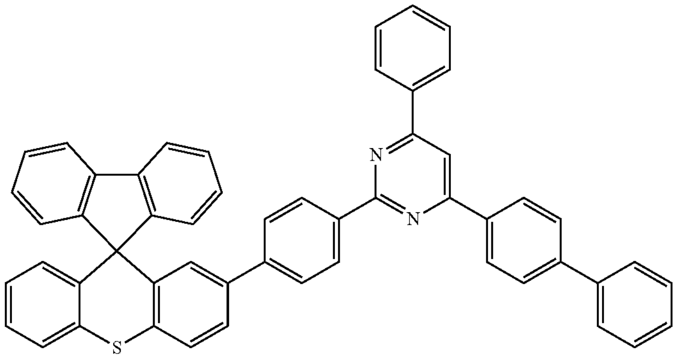
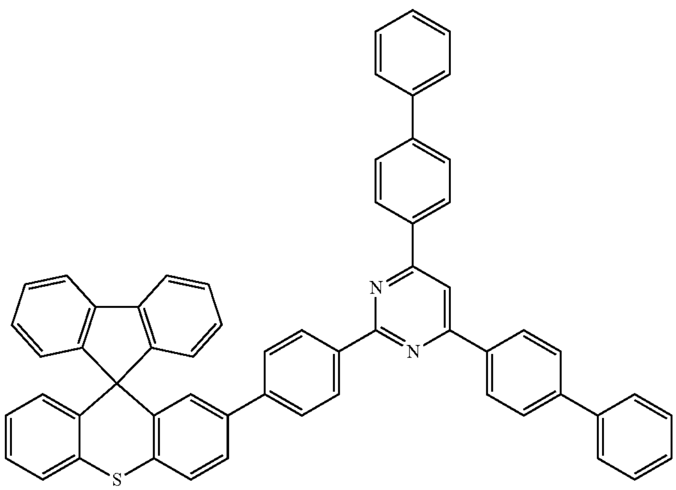
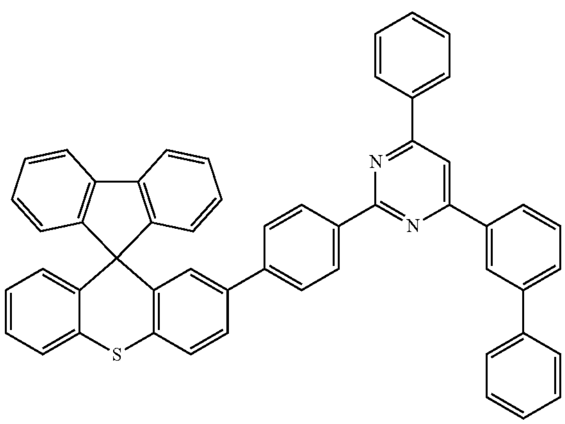
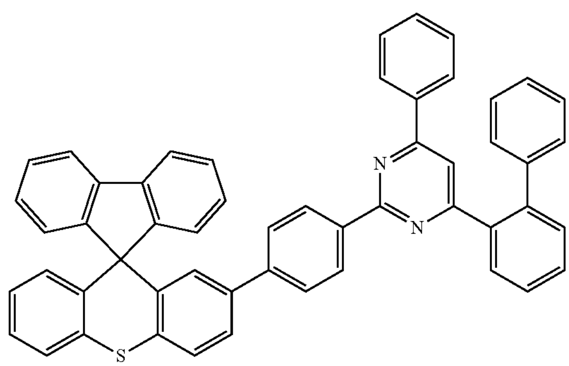
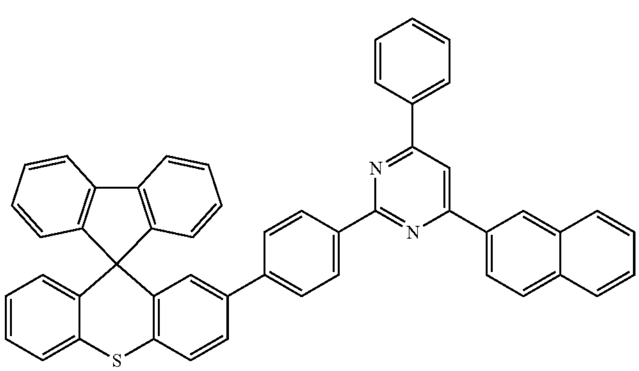

-continued
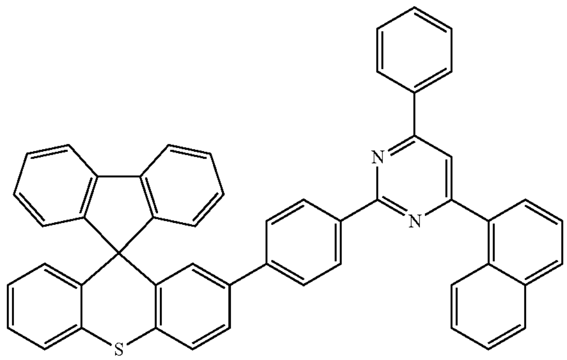
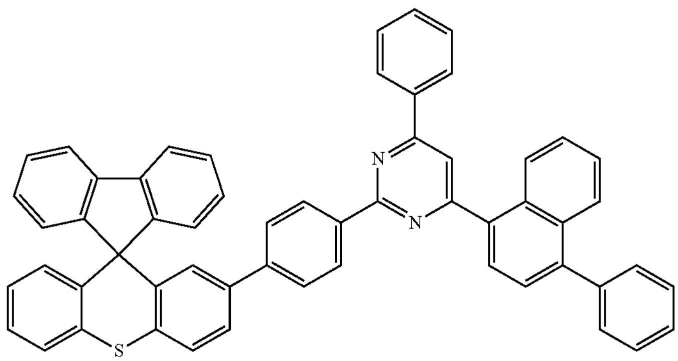
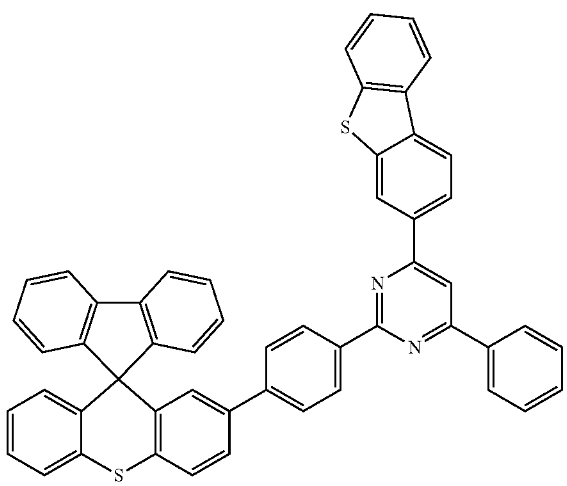
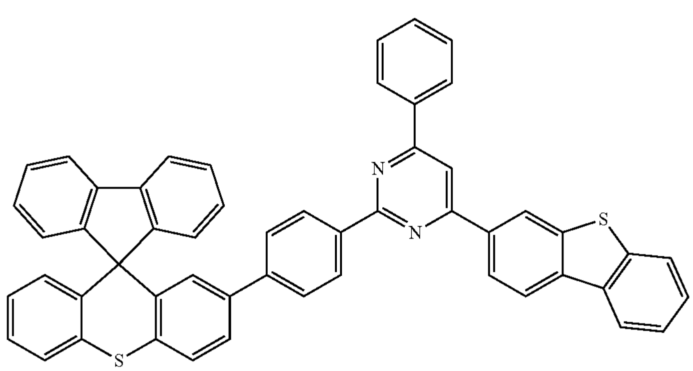

-continued
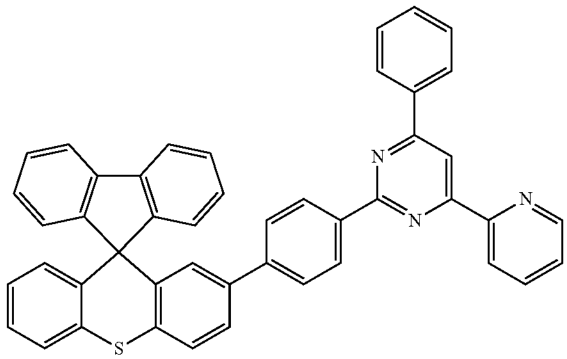
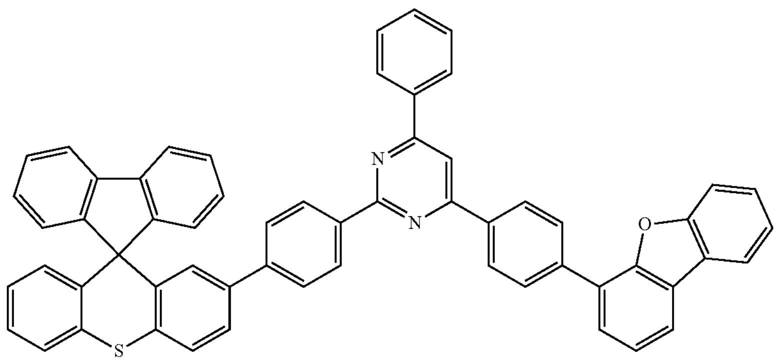
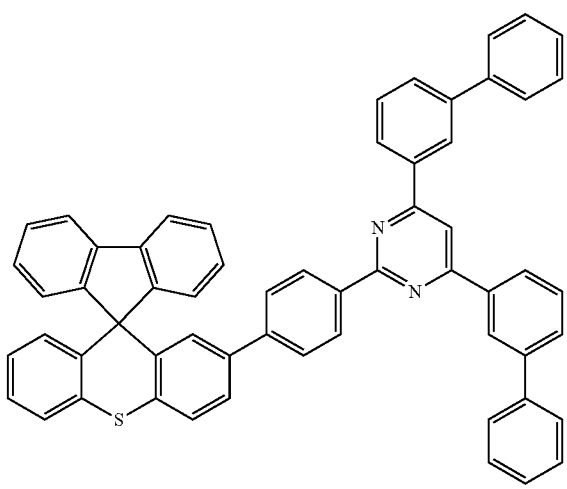
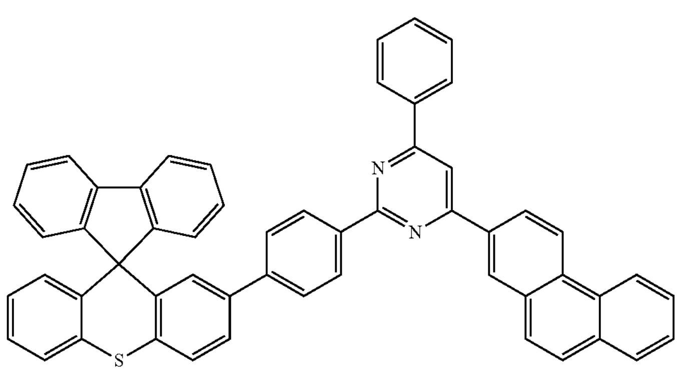

-continued
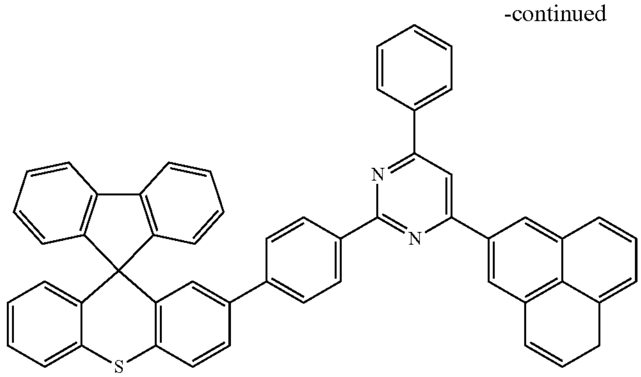
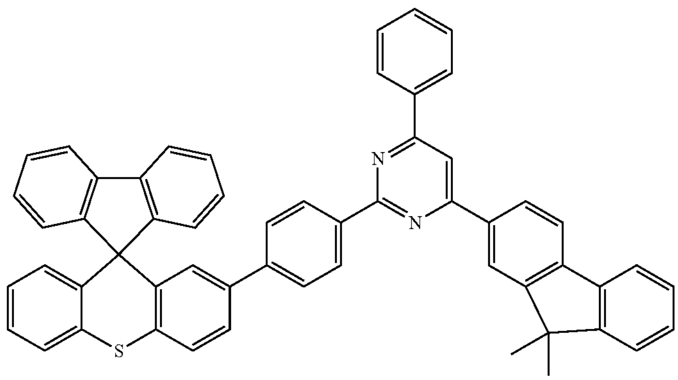 [SMILES: CC1(C)c2ccccc2-c2ccc(-c3cc(-c4ccccc4)nc(-c4ccc(-c5ccc6c(c5)C5(c7ccccc7S6)c6ccccc6-c6ccccc65)cc4)n3)cc21]
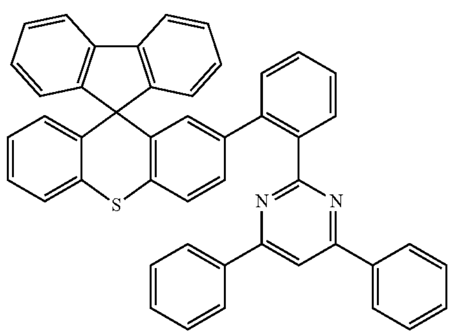
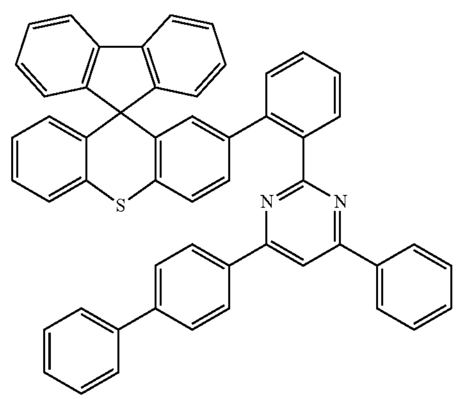
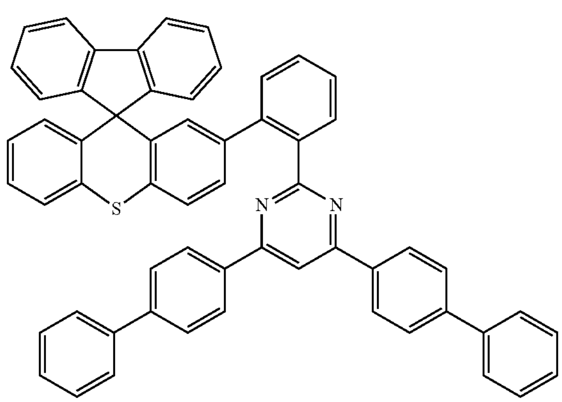
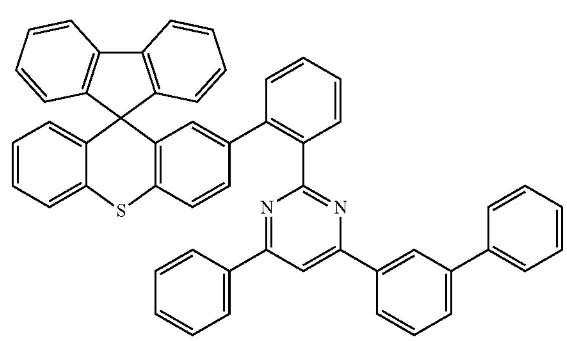

-continued
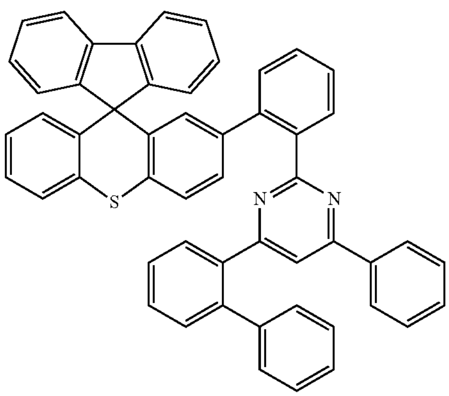
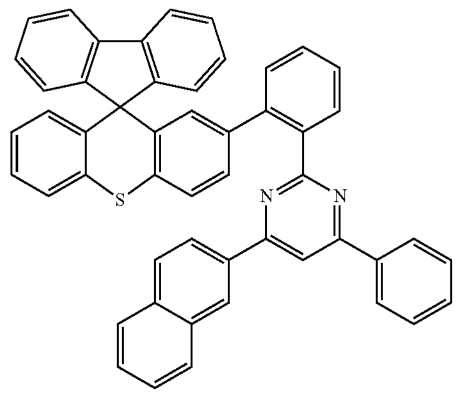
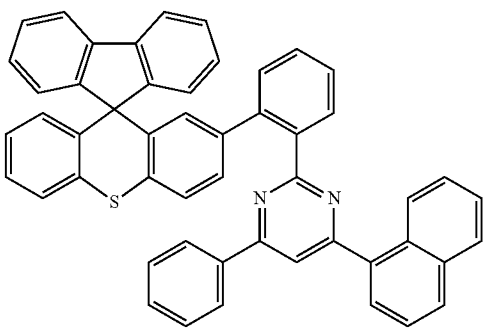
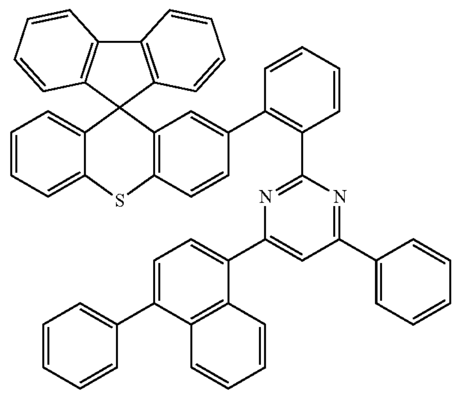
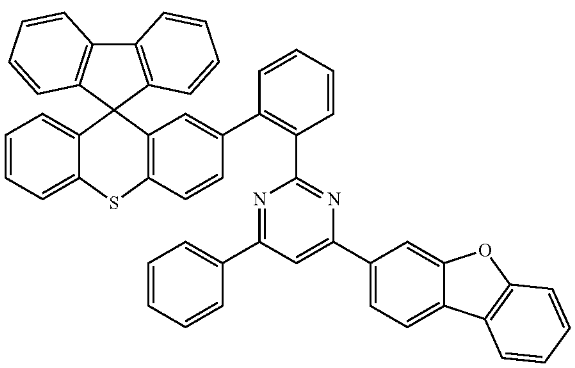
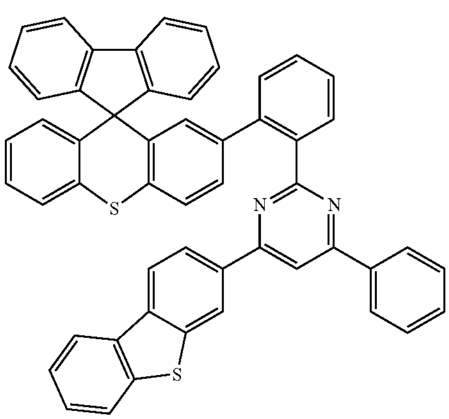
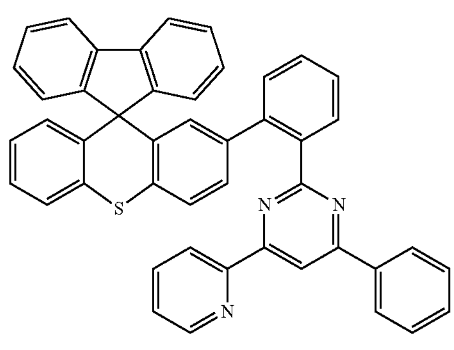

-continued
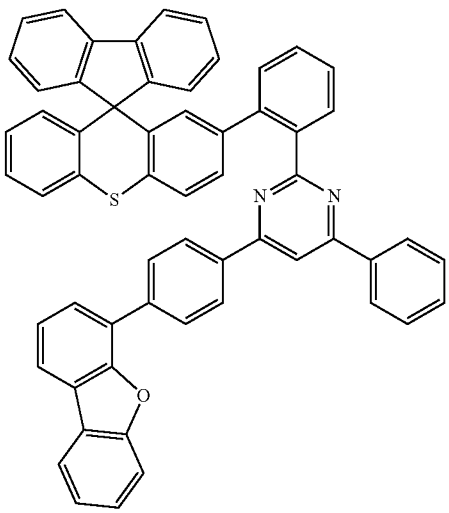
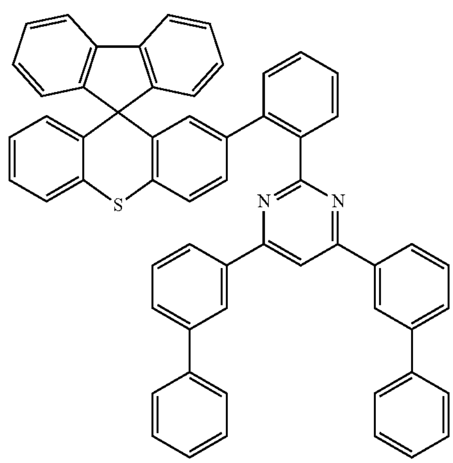
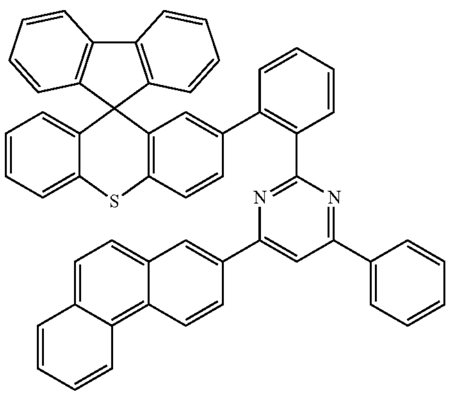
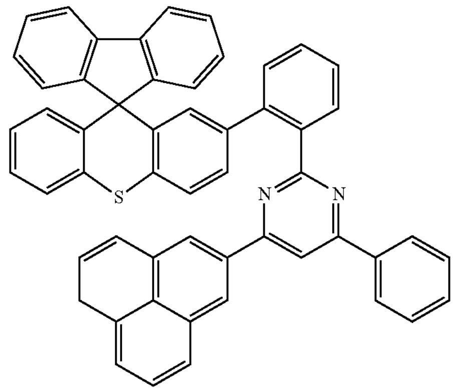
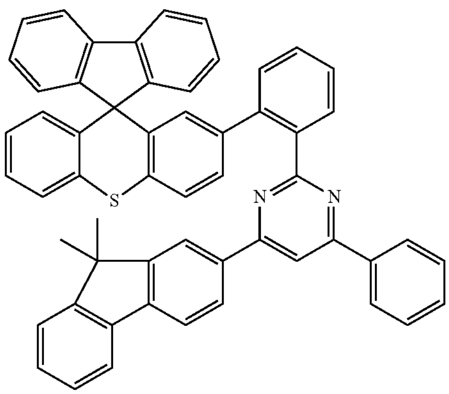
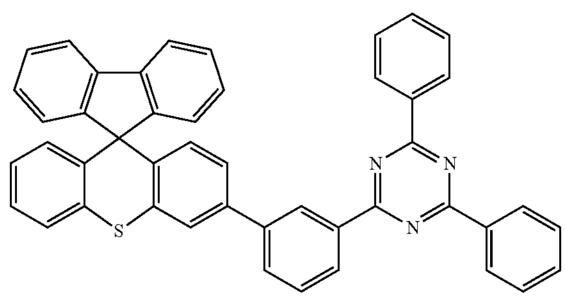
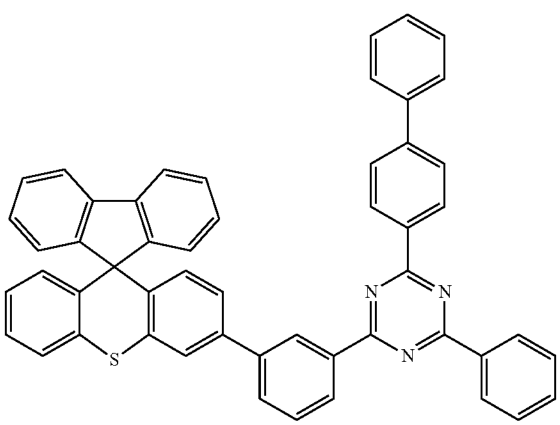

-continued
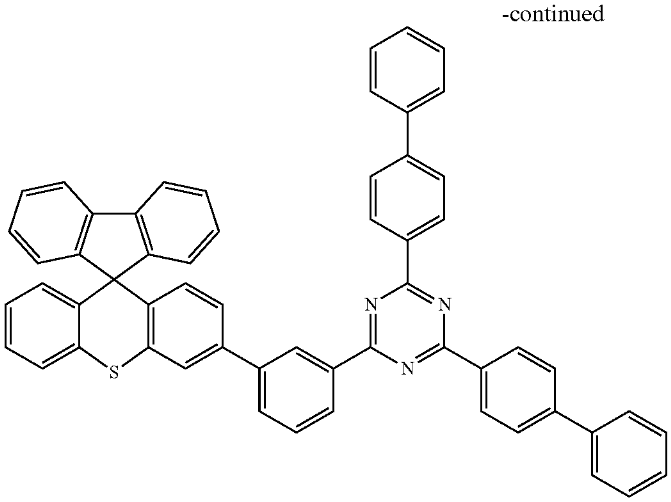
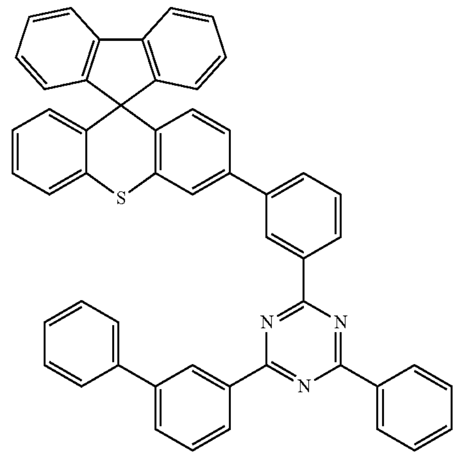
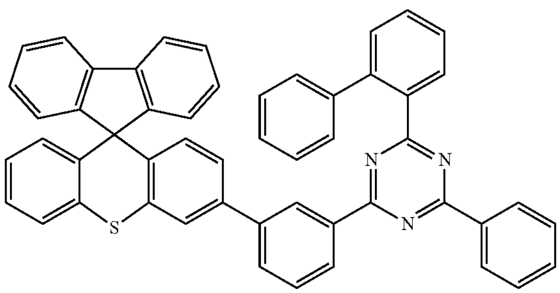
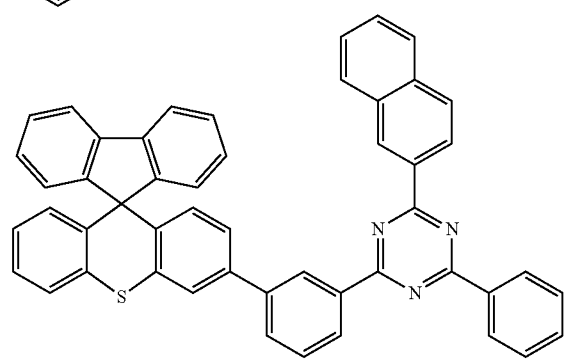
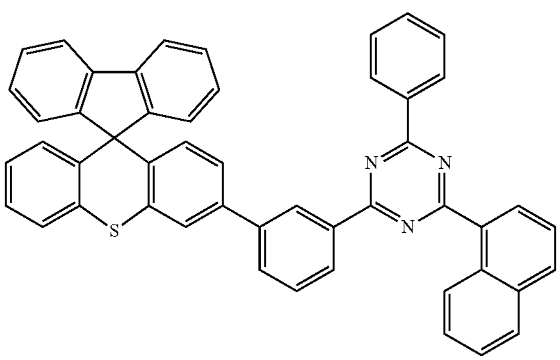
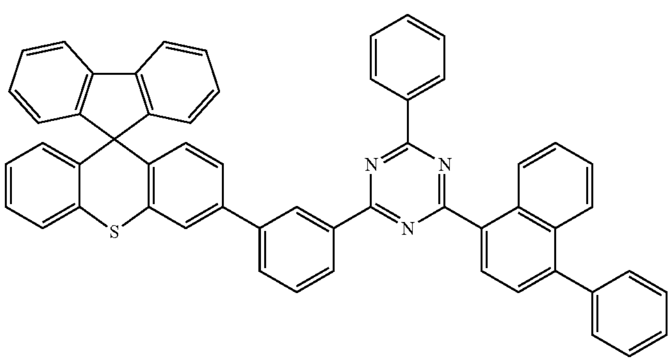

-continued
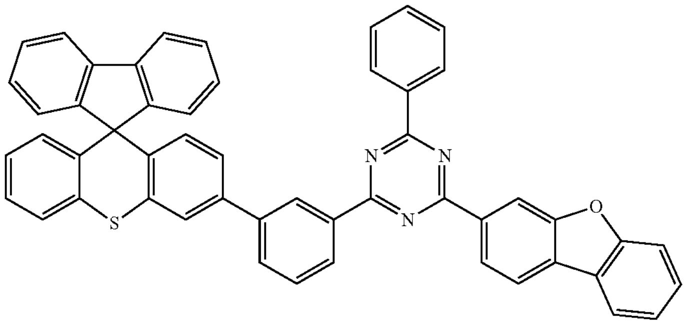
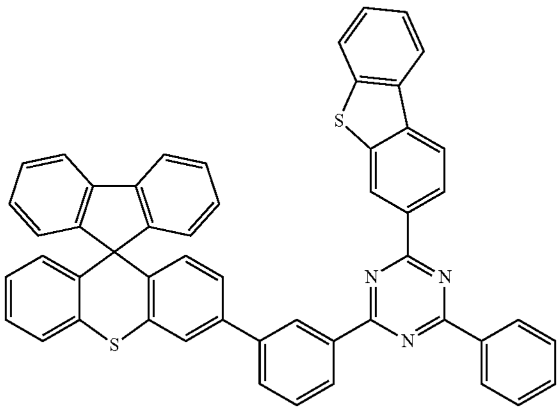
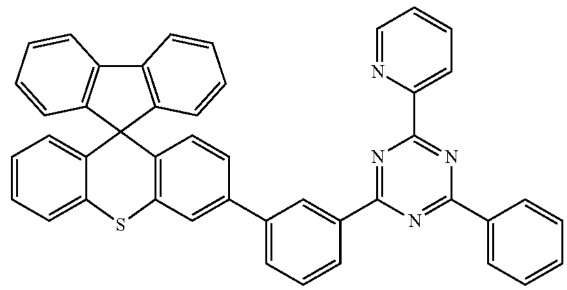
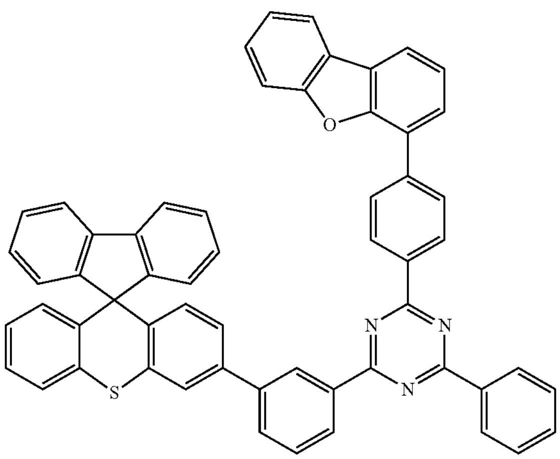
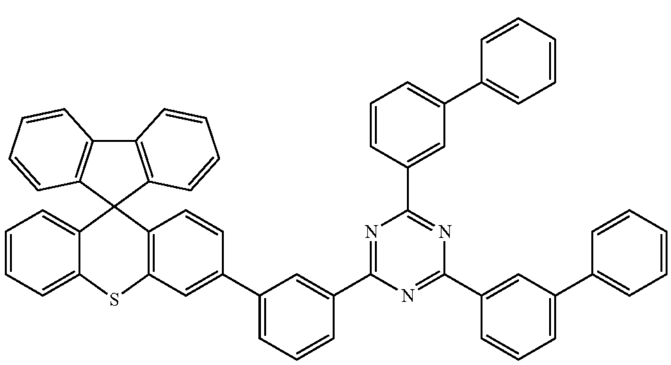

-continued
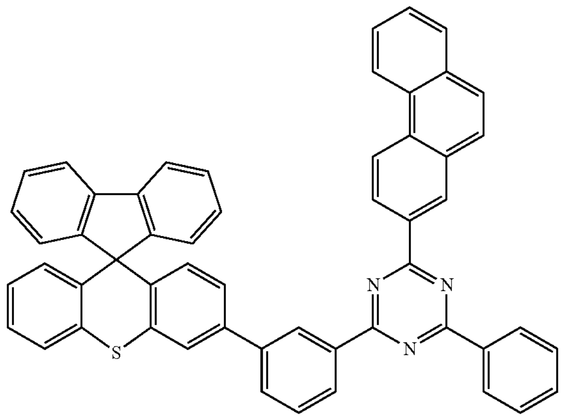
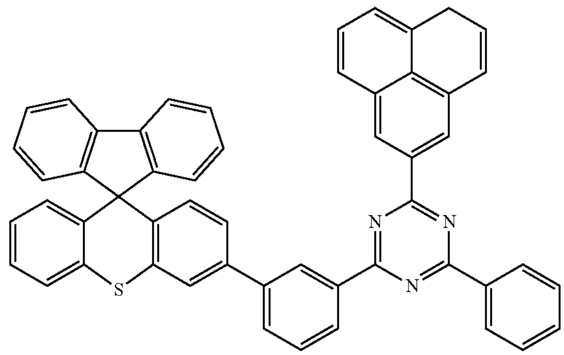
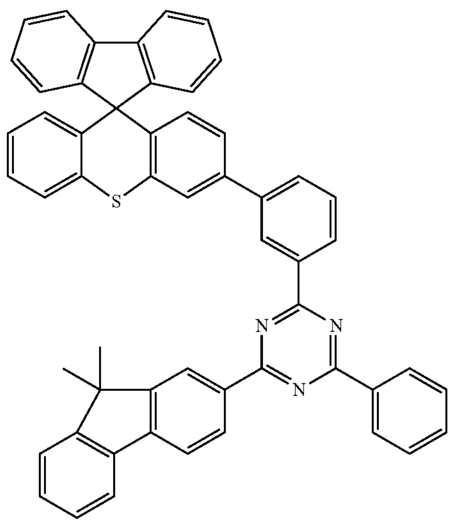
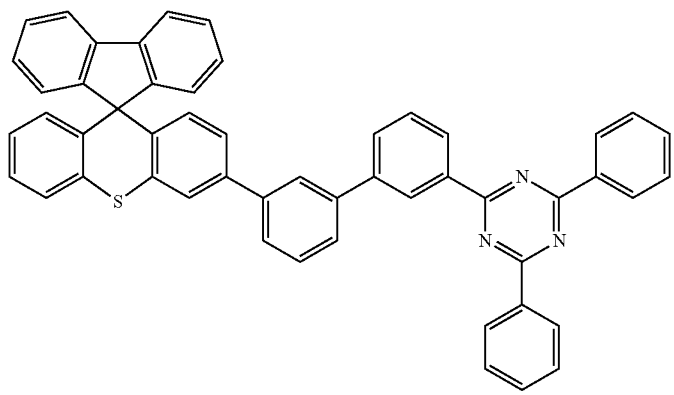
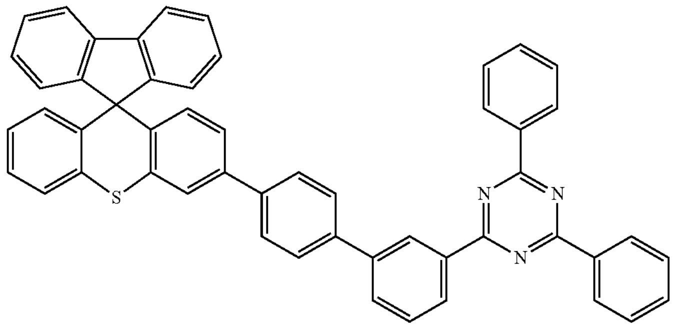

-continued
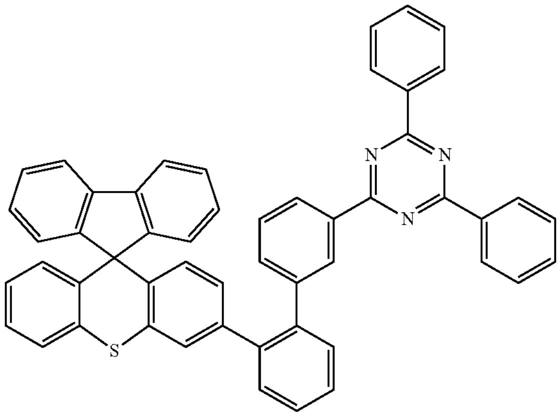
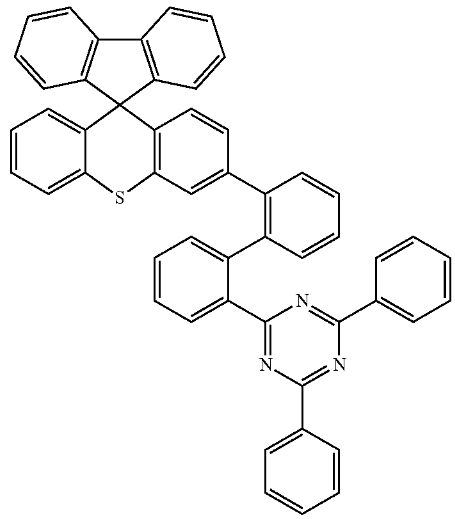
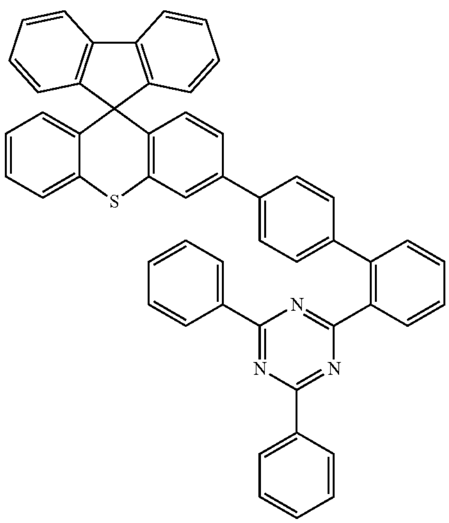
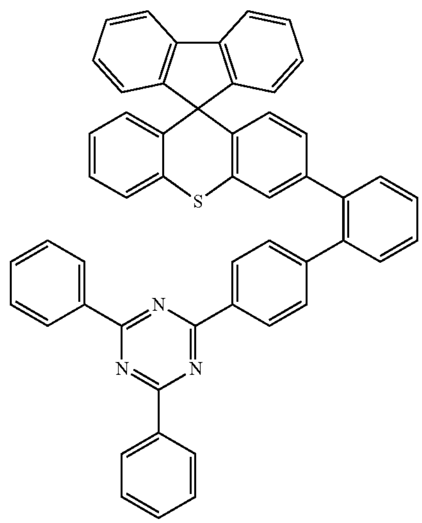
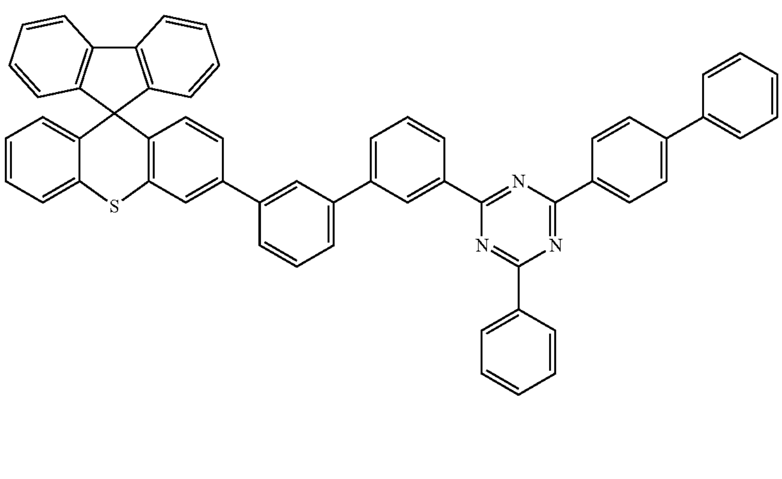

-continued
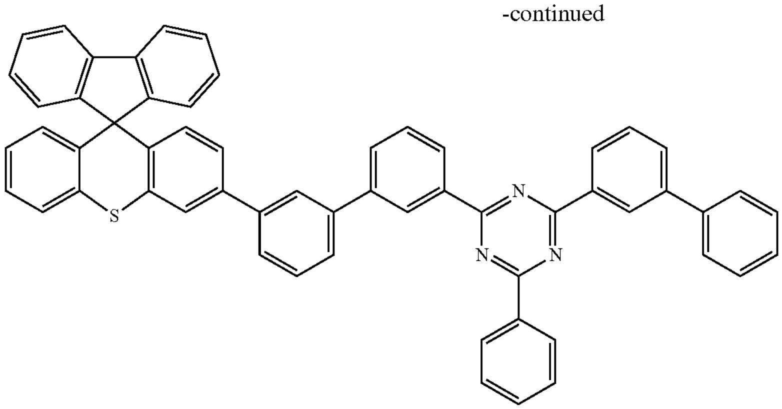
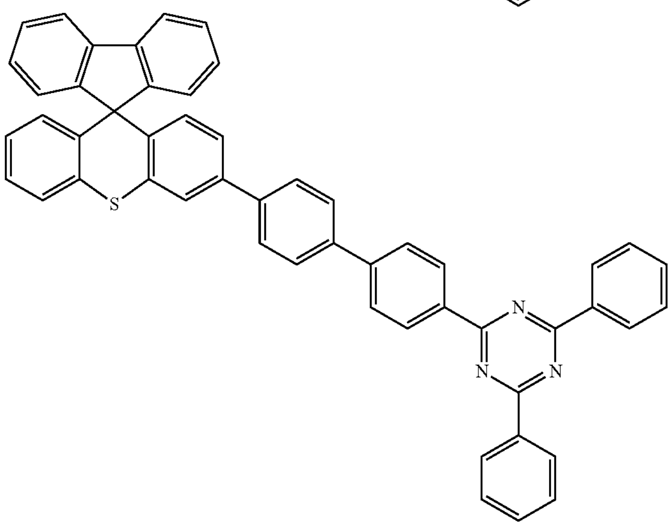
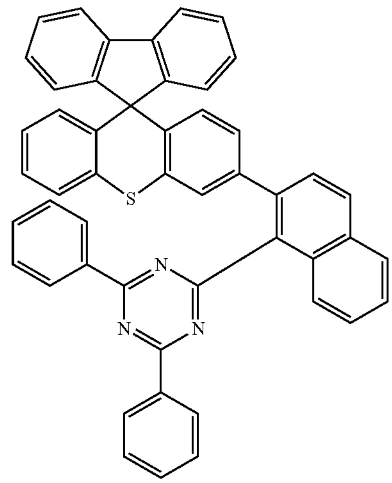
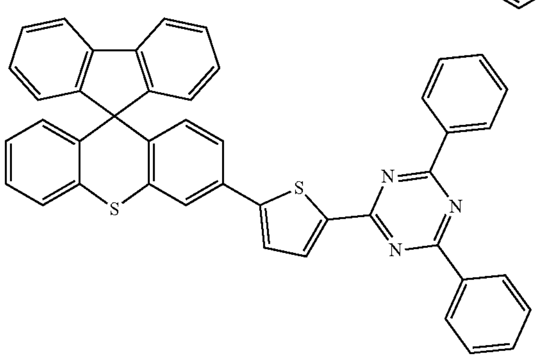
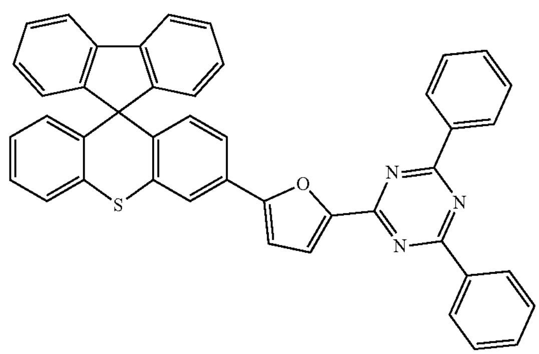
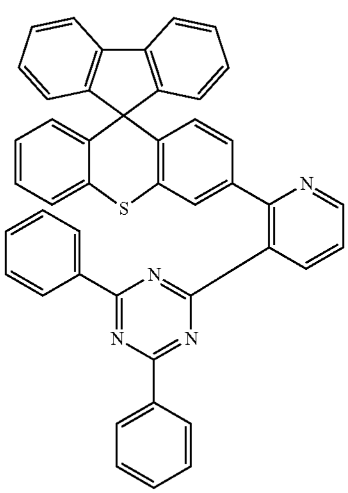
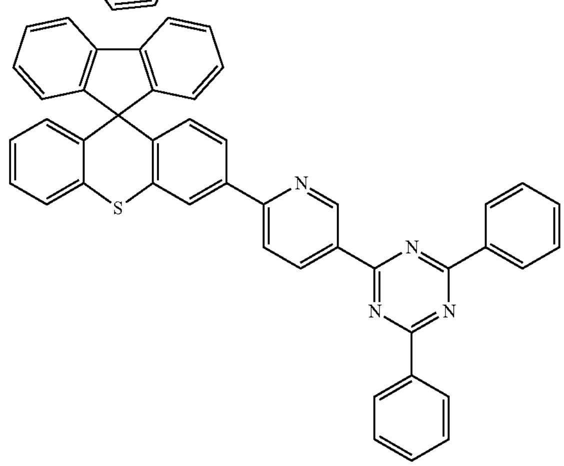

-continued
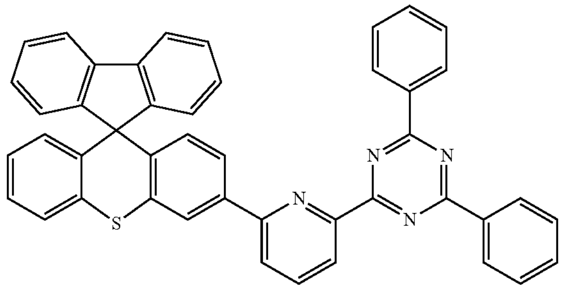
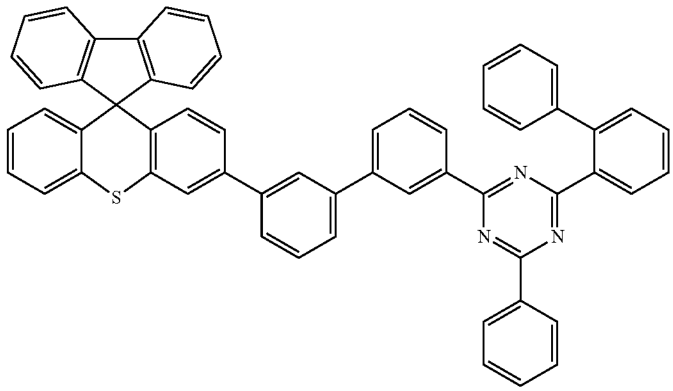
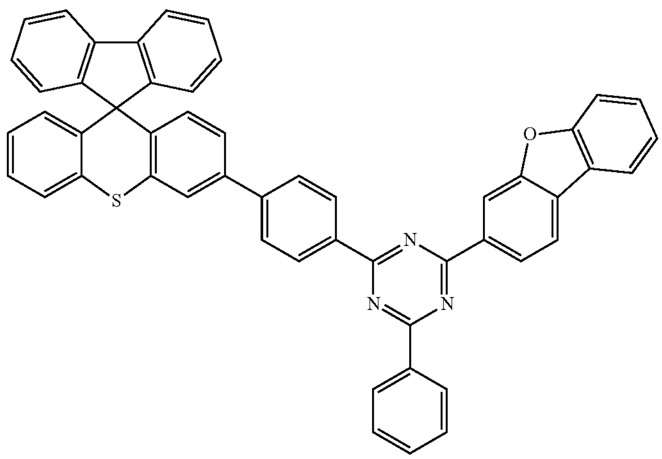
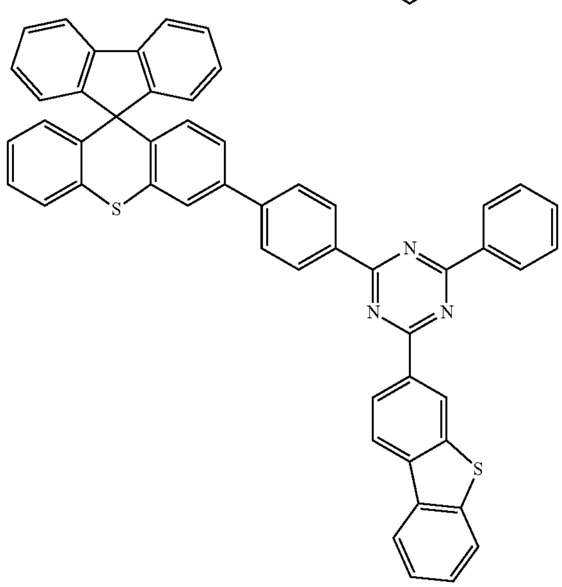
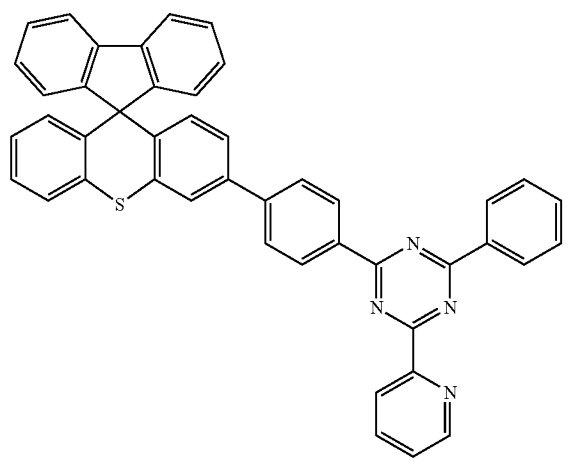

-continued
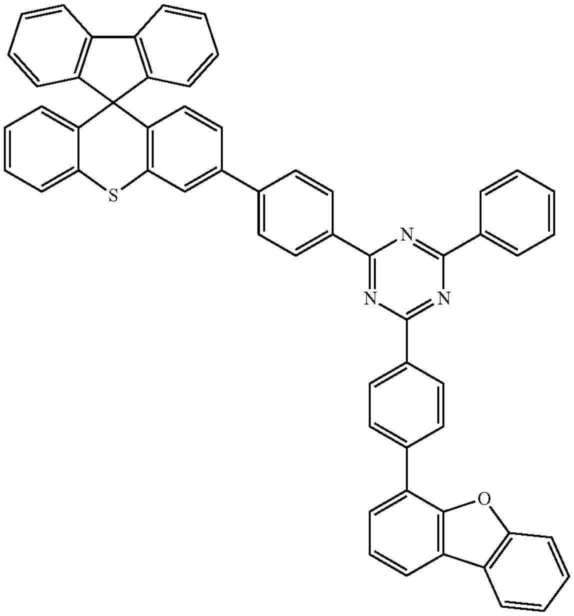
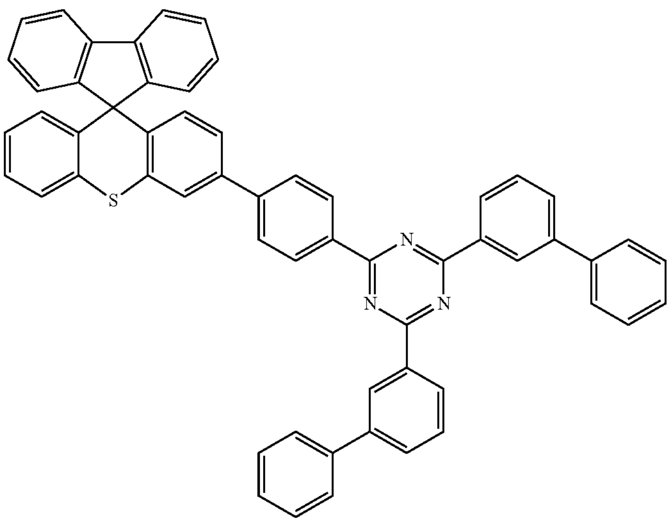
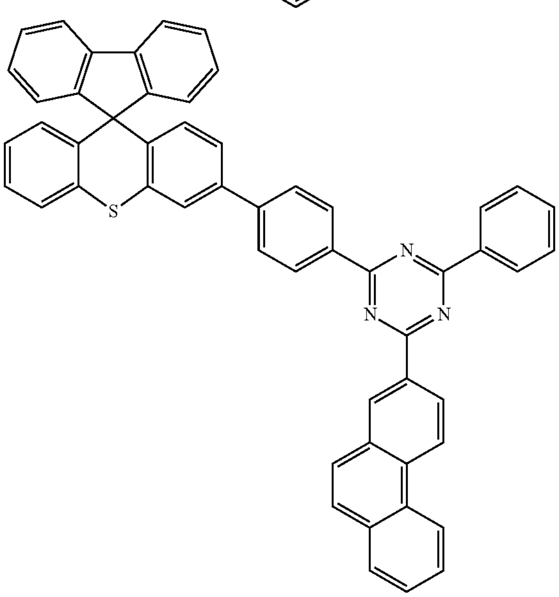
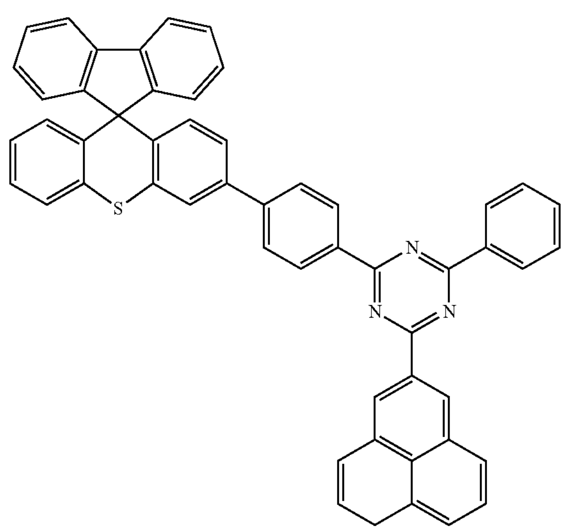

-continued
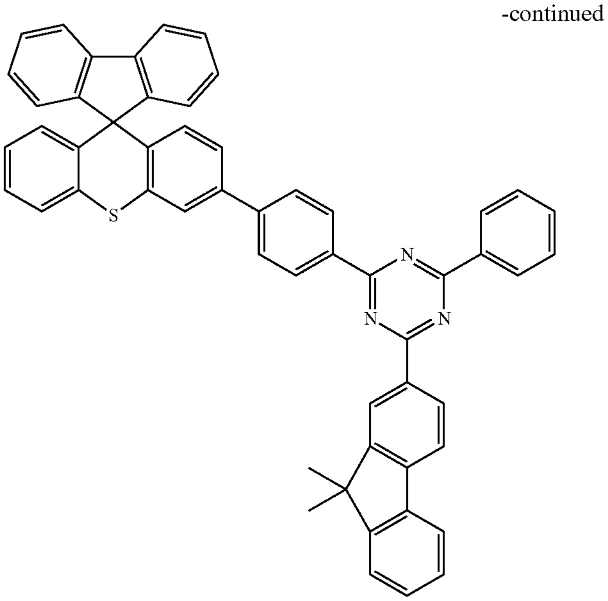
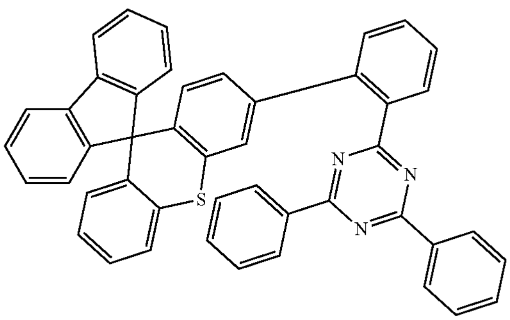
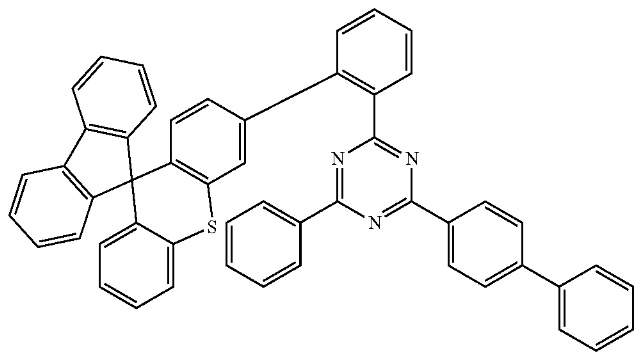
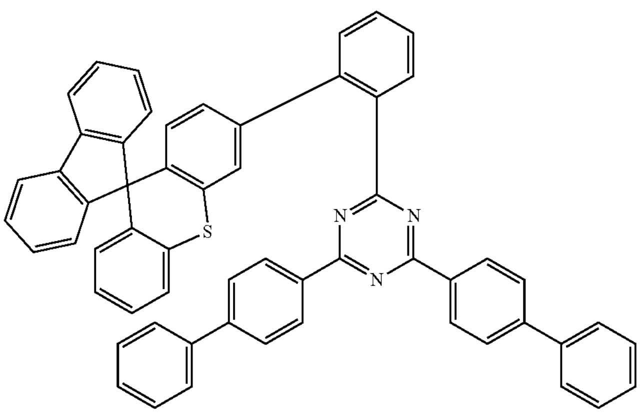
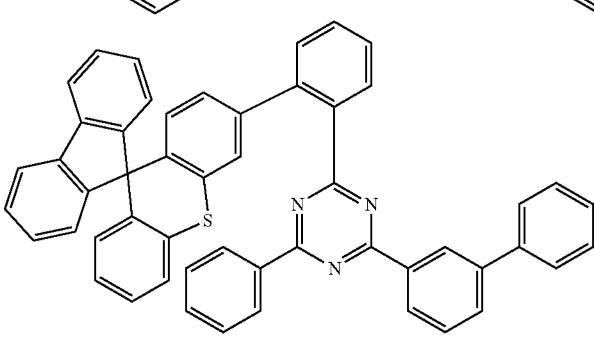
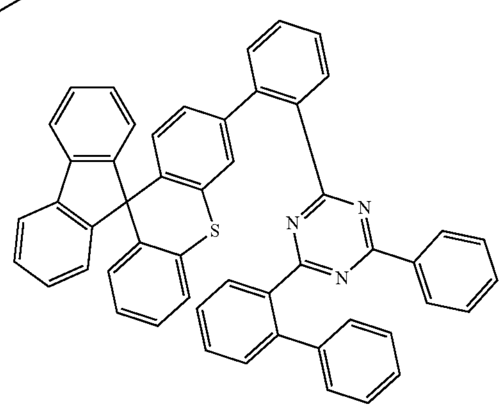

-continued
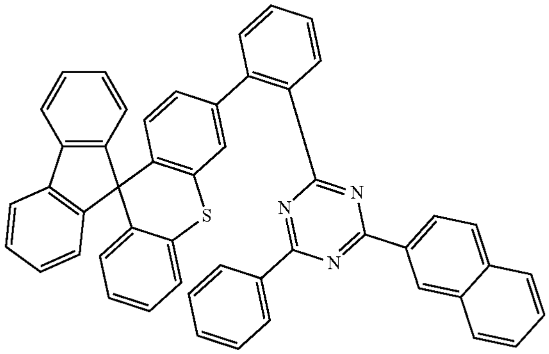
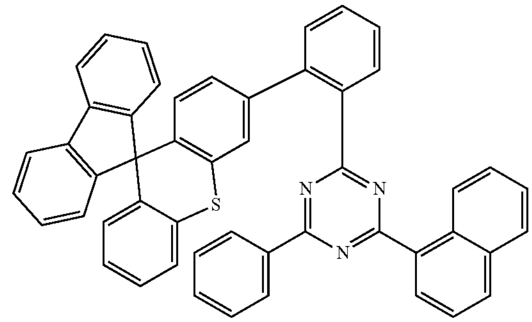
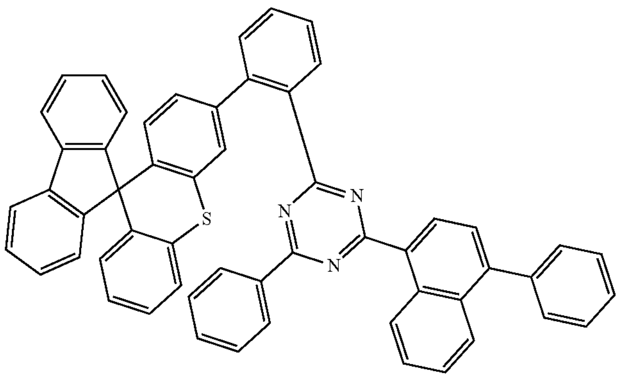
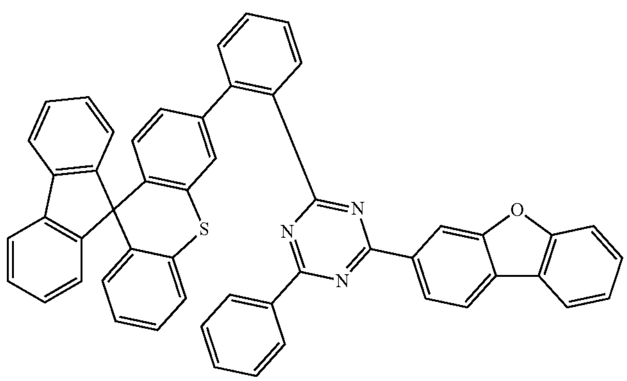
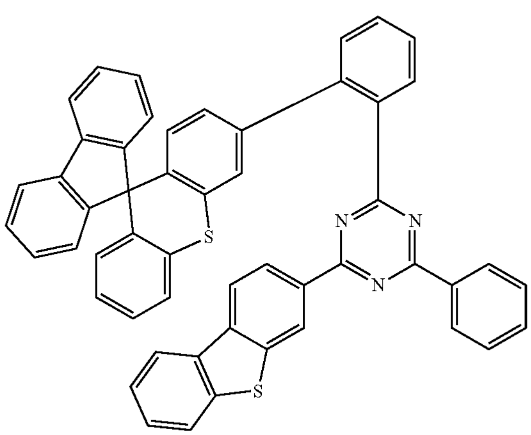

-continued
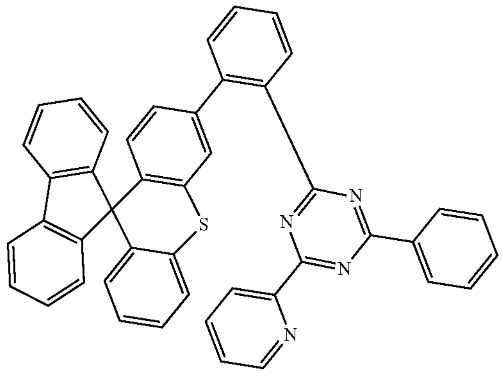
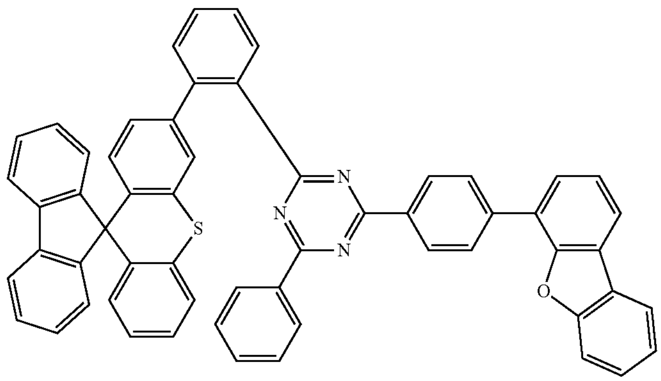
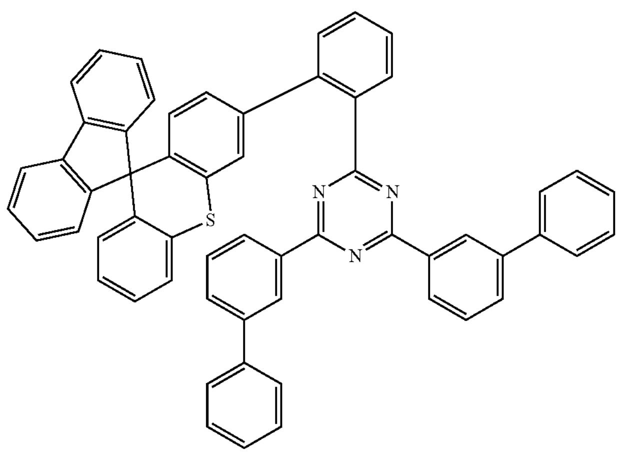
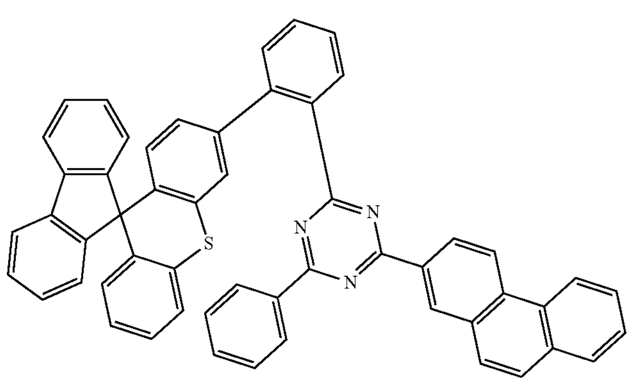

-continued
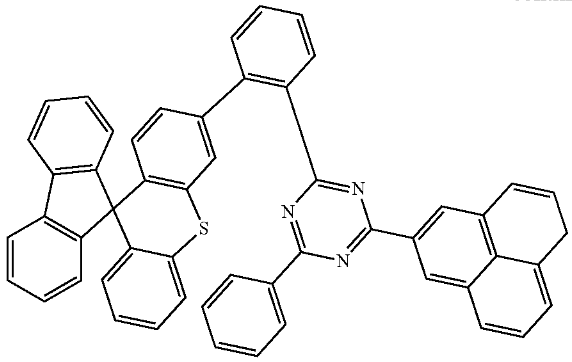
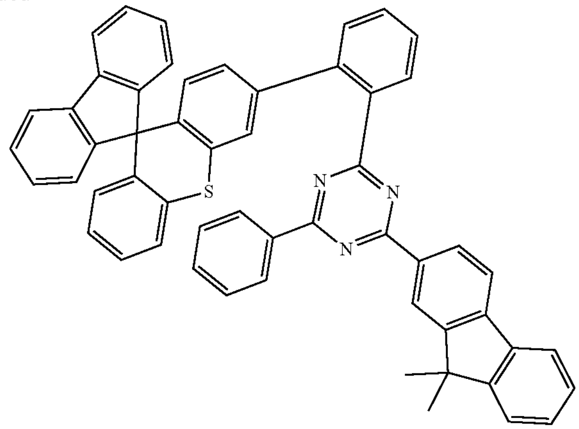
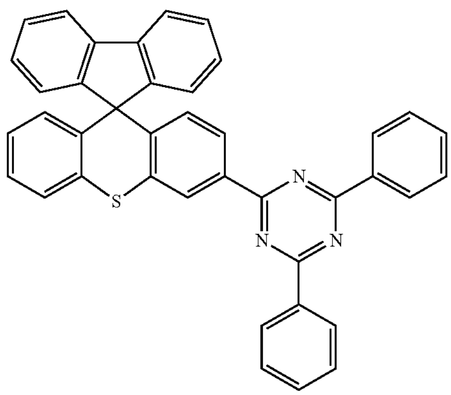
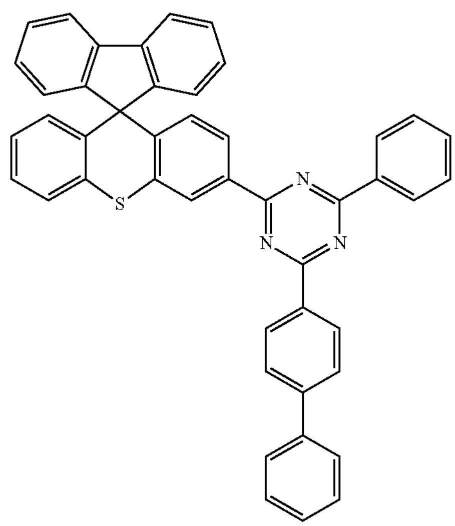
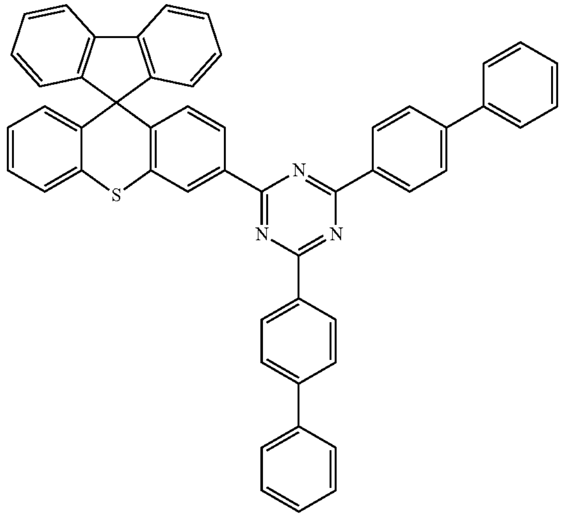
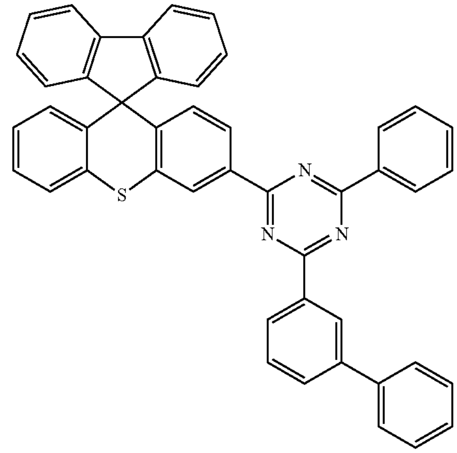

-continued
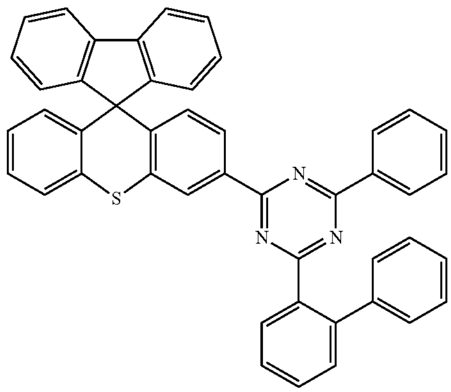
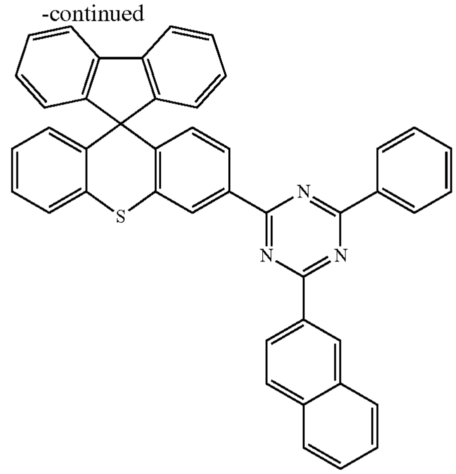
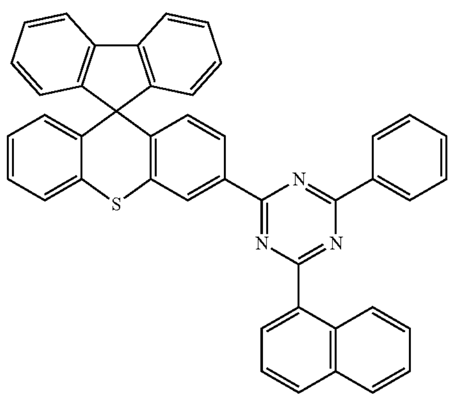
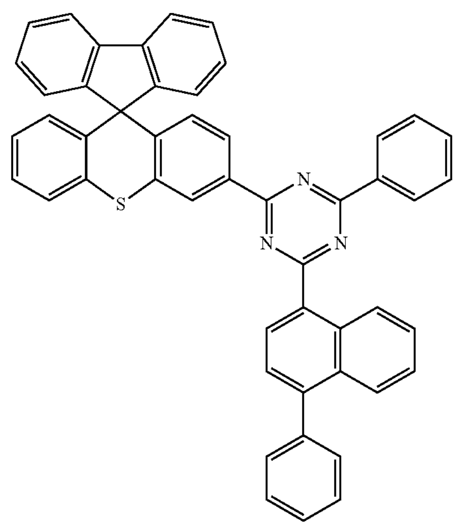
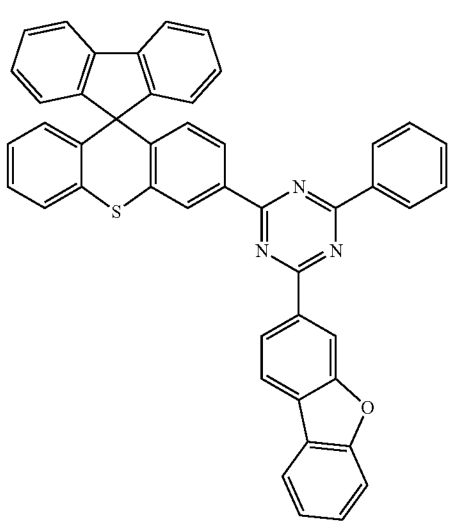
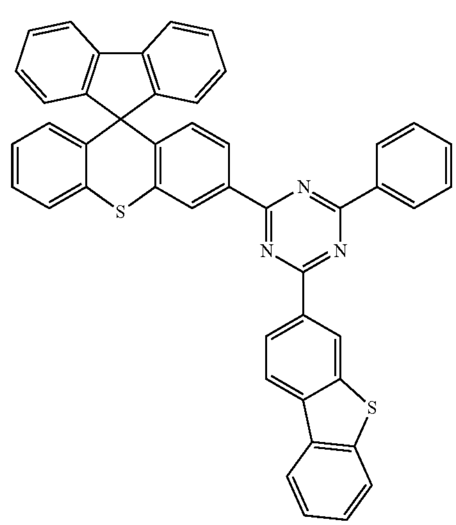

-continued
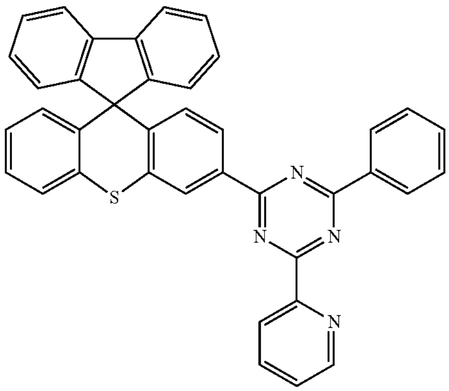
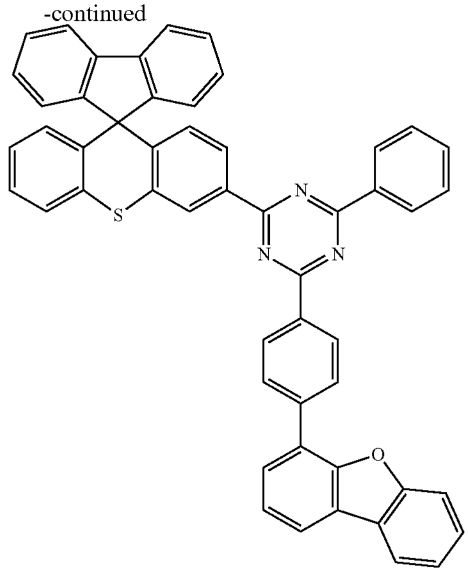
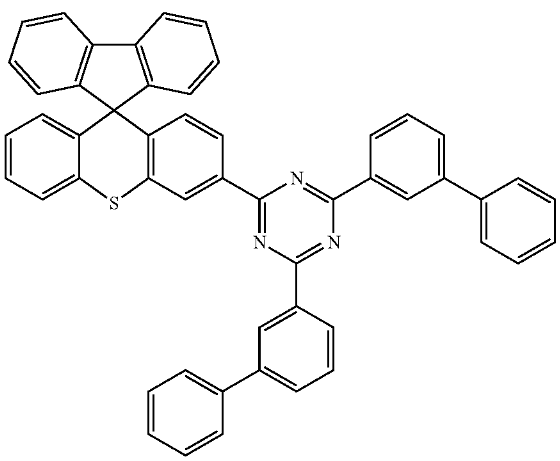
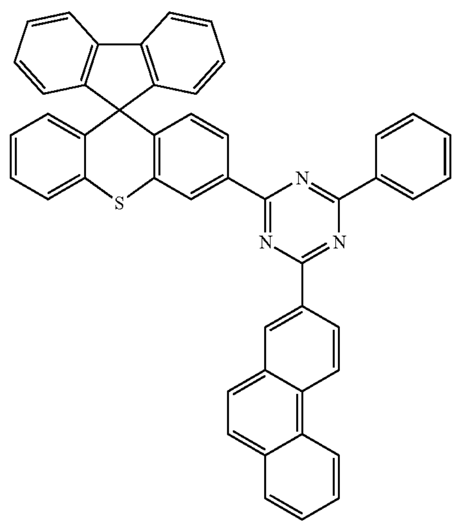
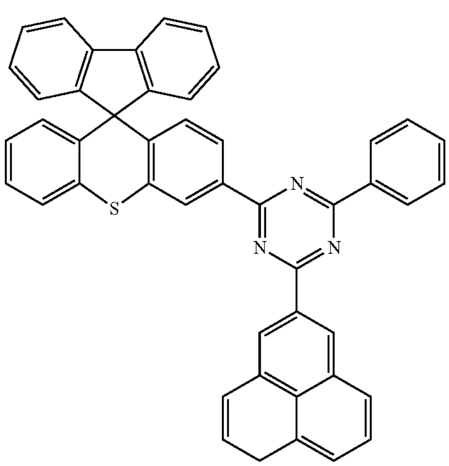
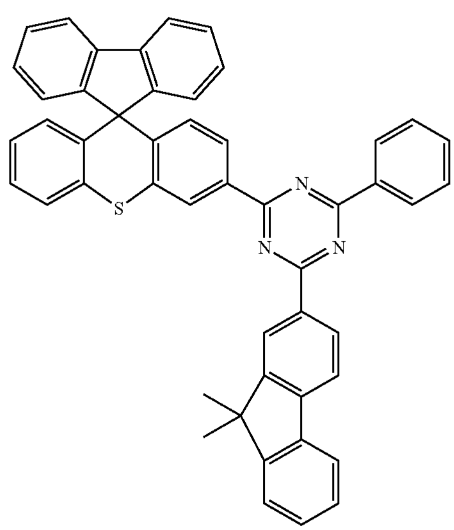

-continued
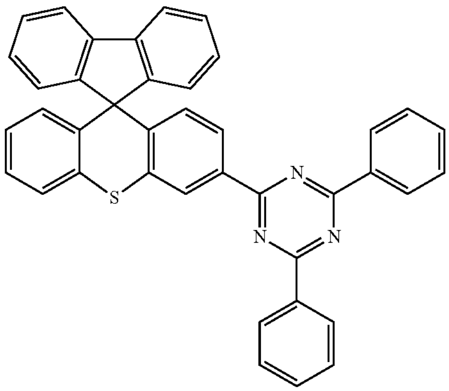
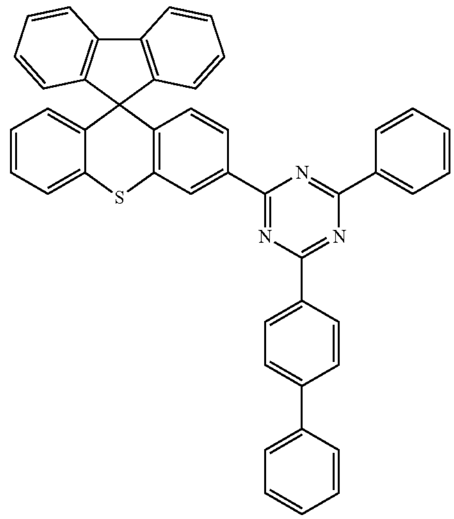
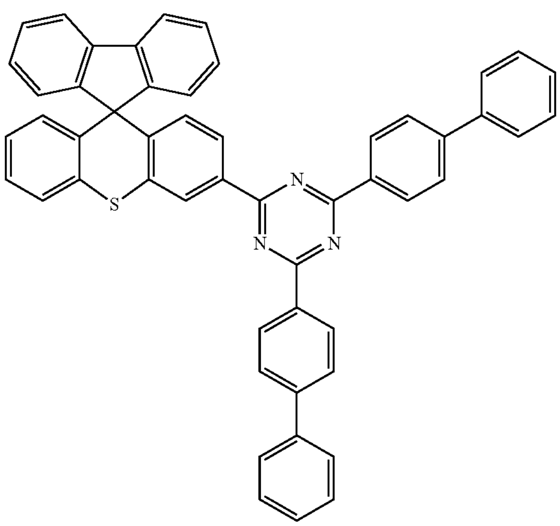
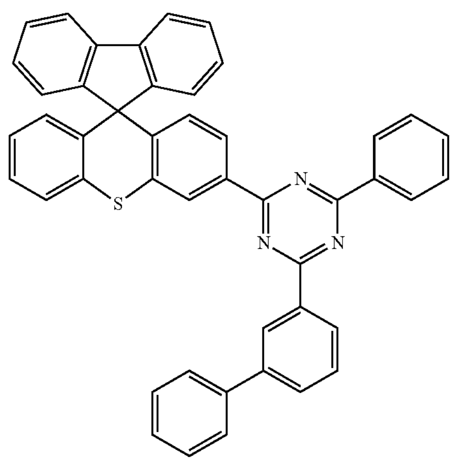
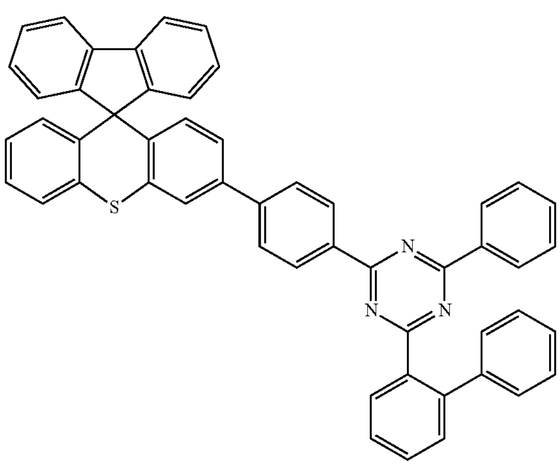
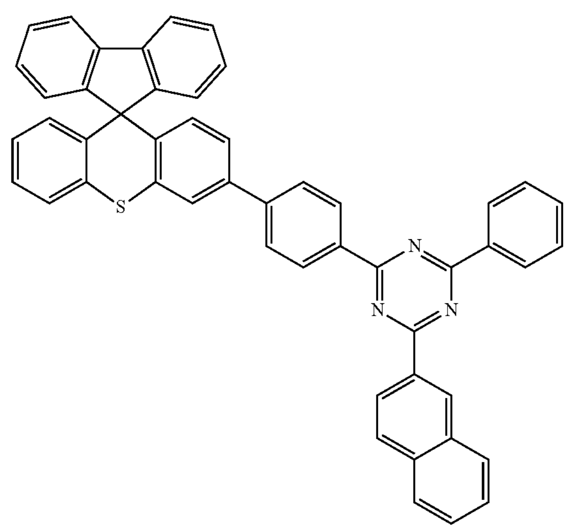

-continued
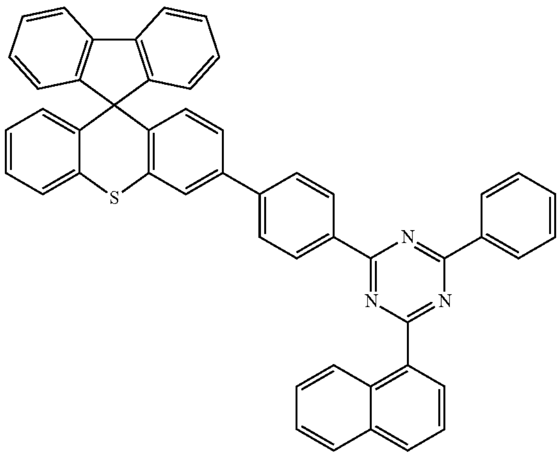
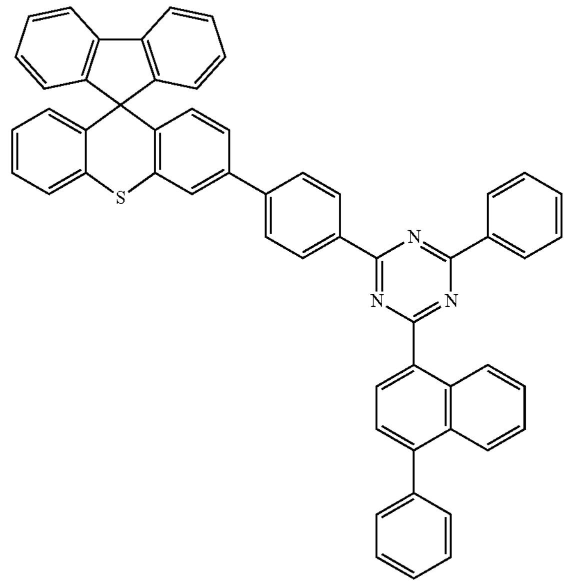
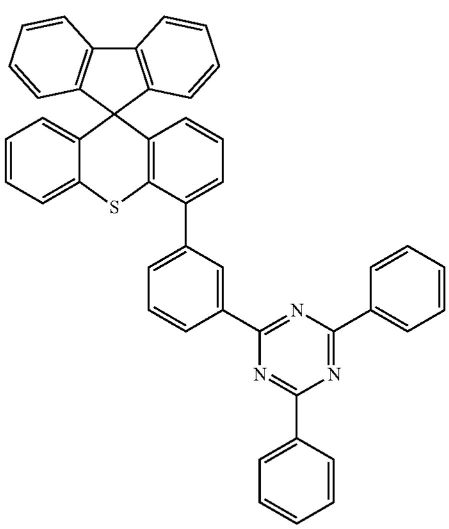
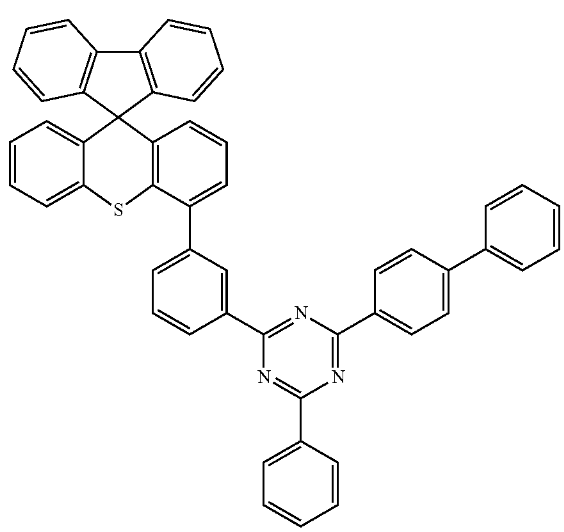

-continued
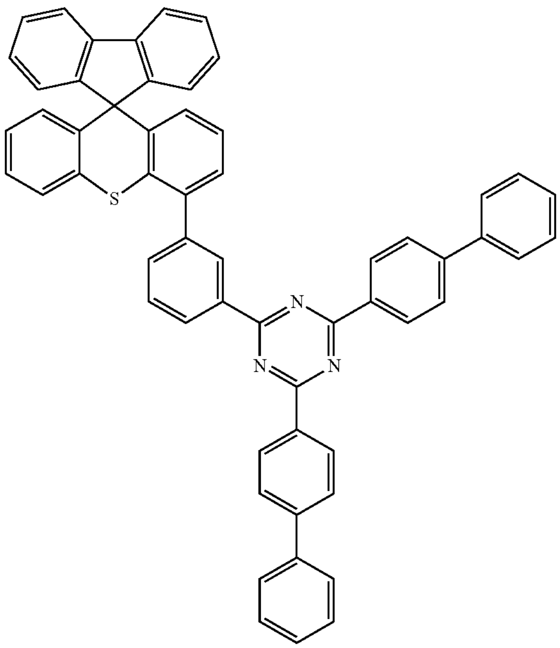
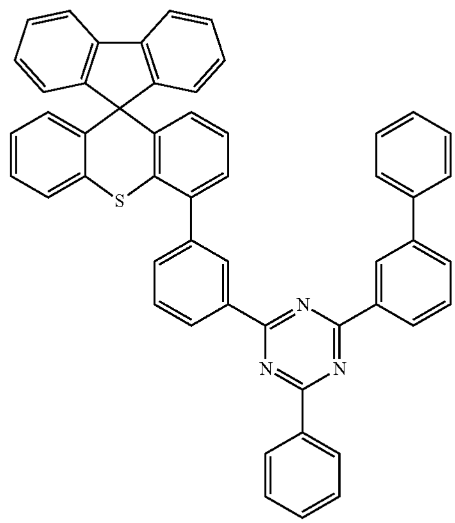
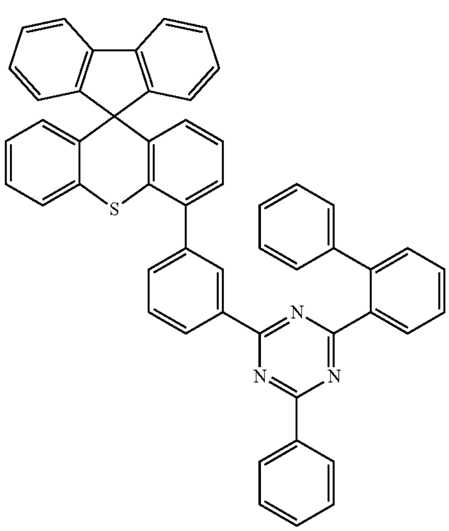
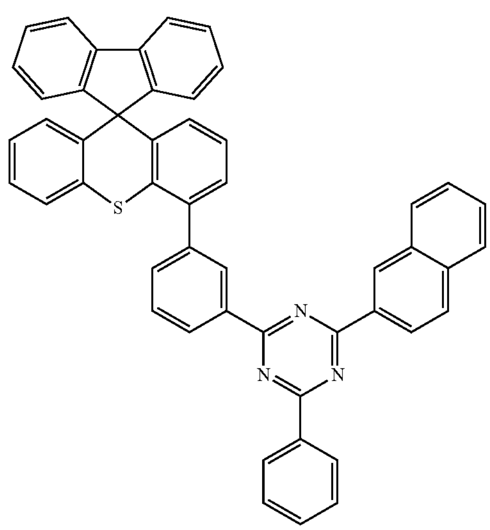

-continued
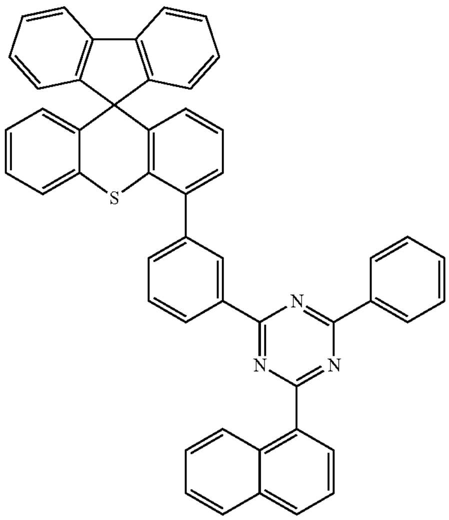
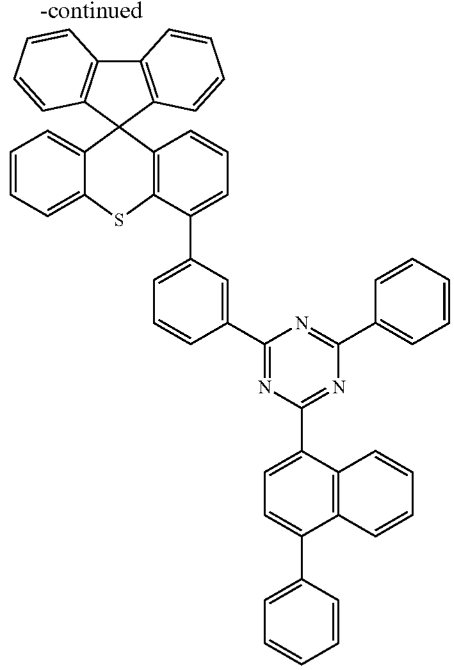
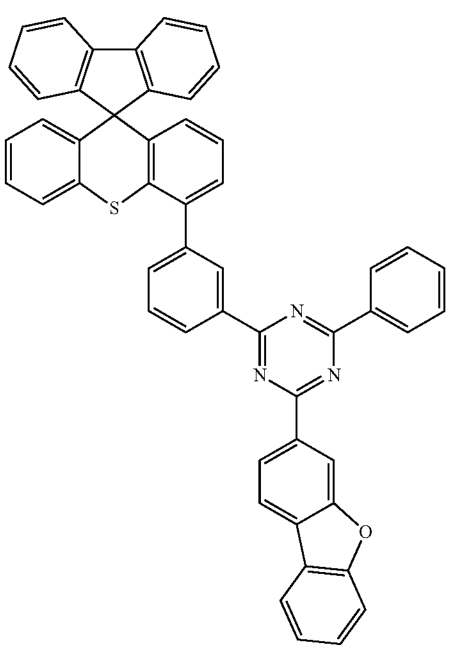
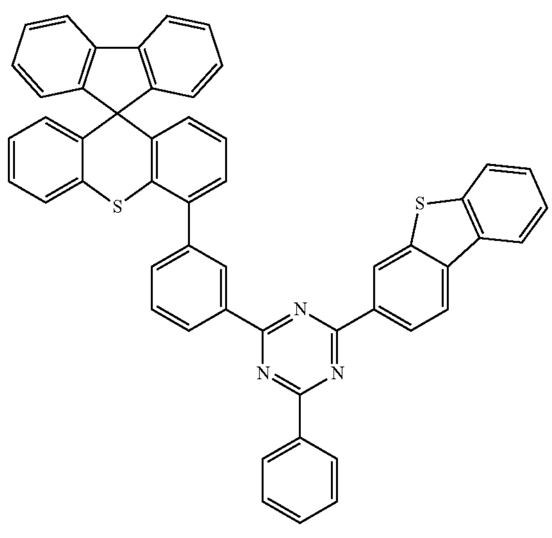

-continued
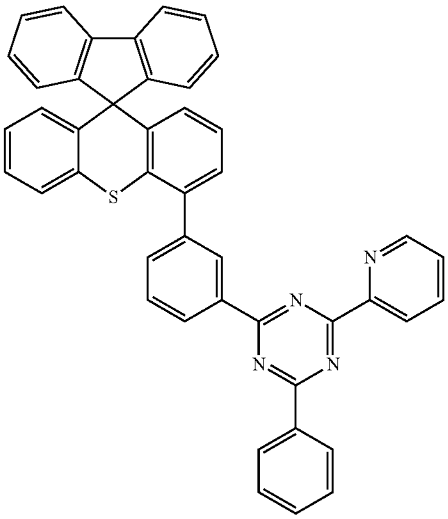
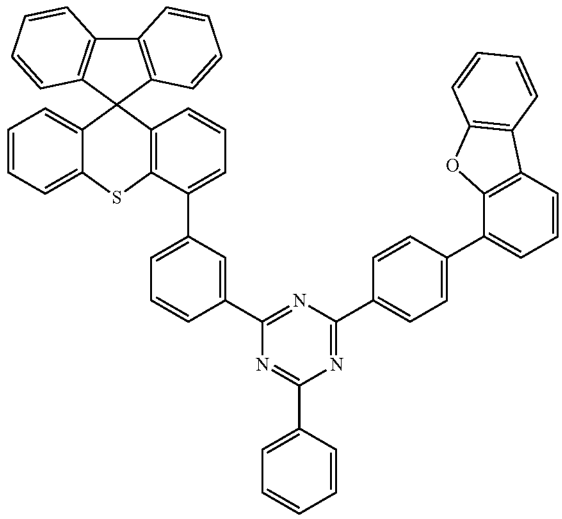
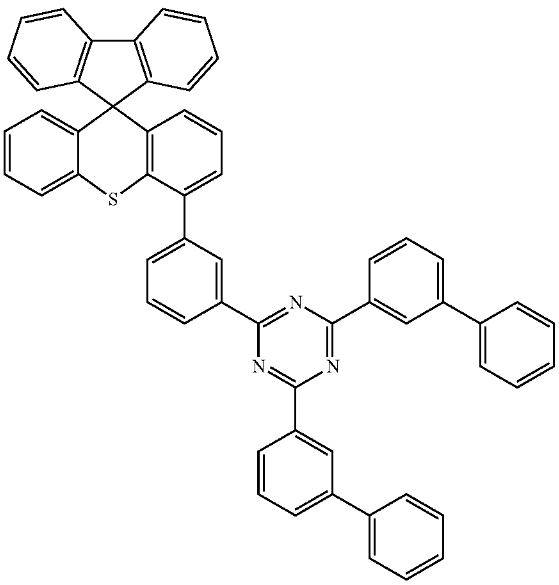
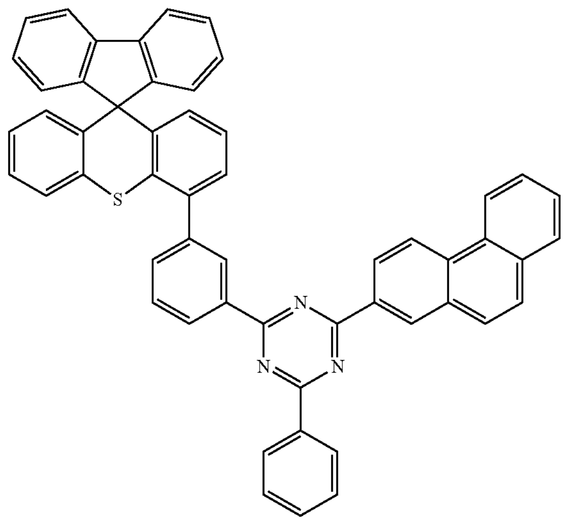
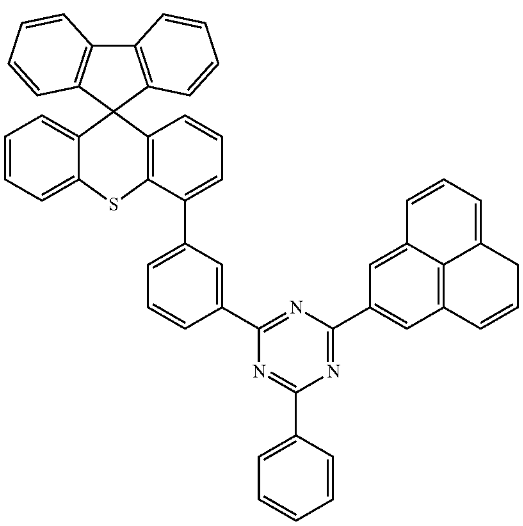
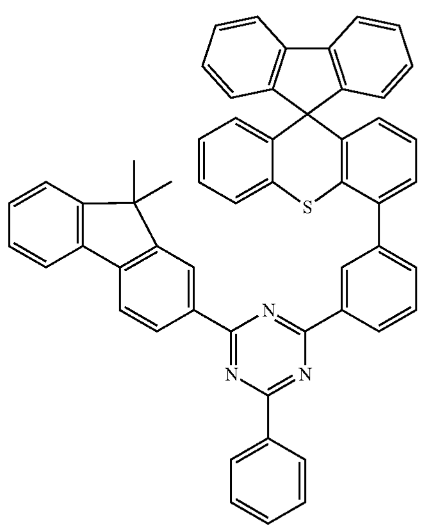

-continued
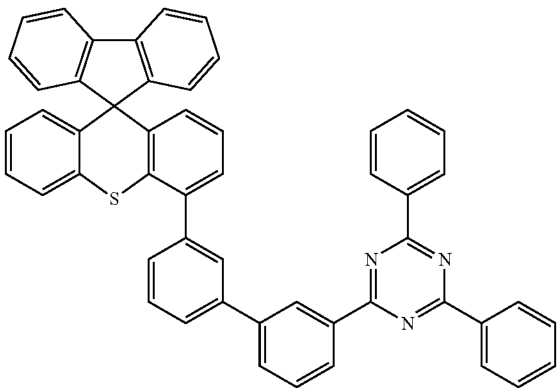
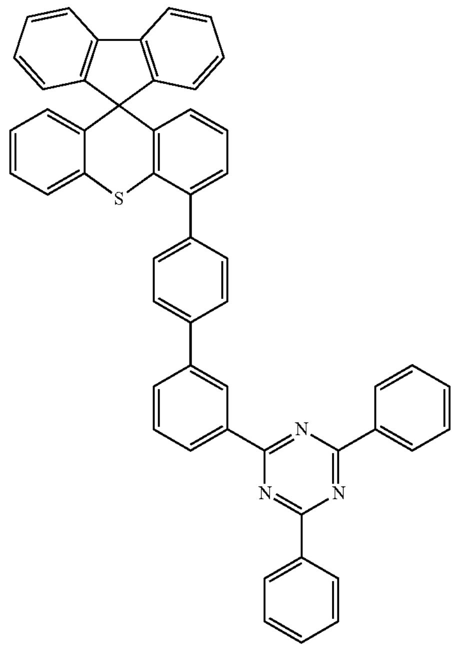
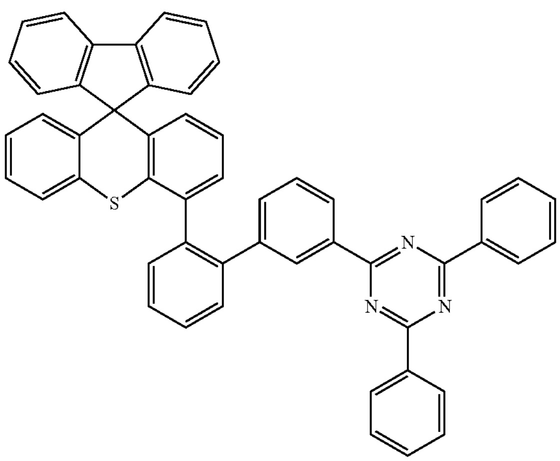
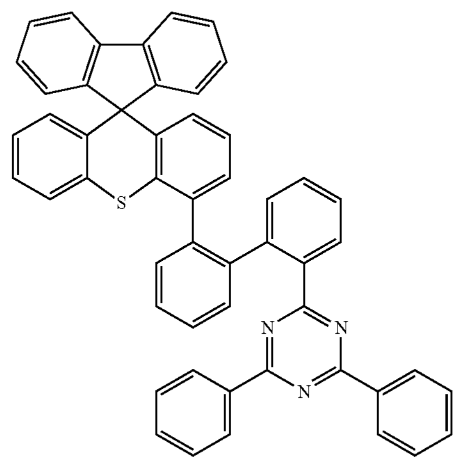
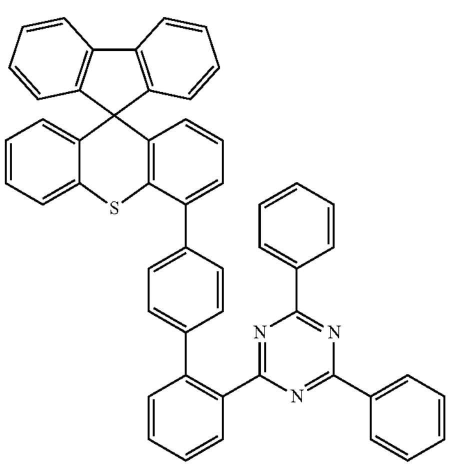
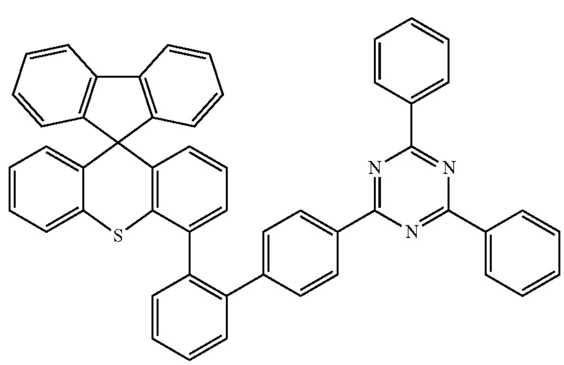

-continued
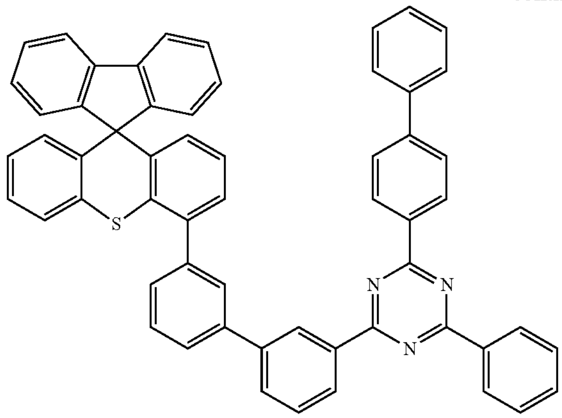
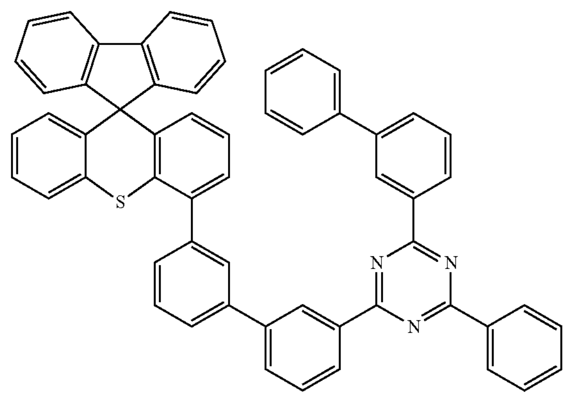
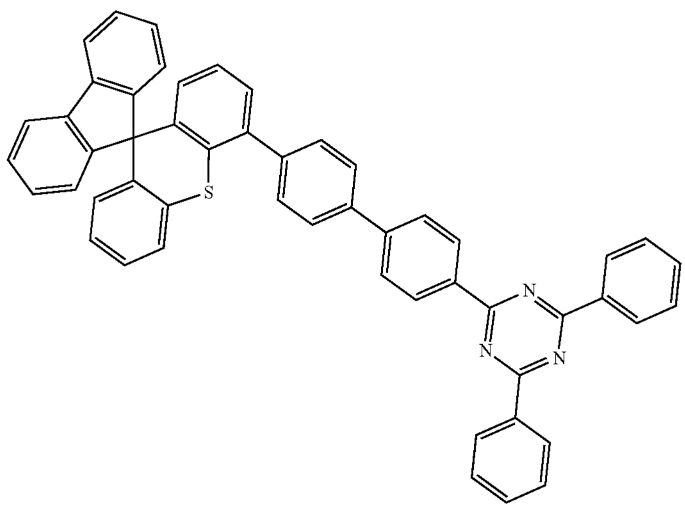
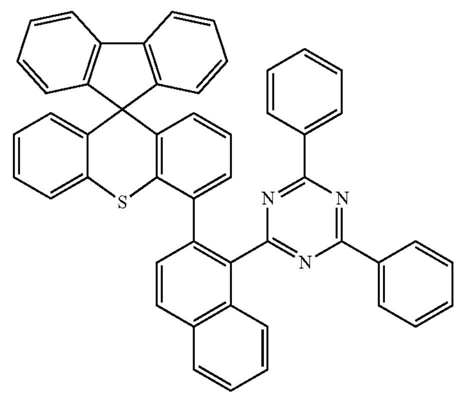
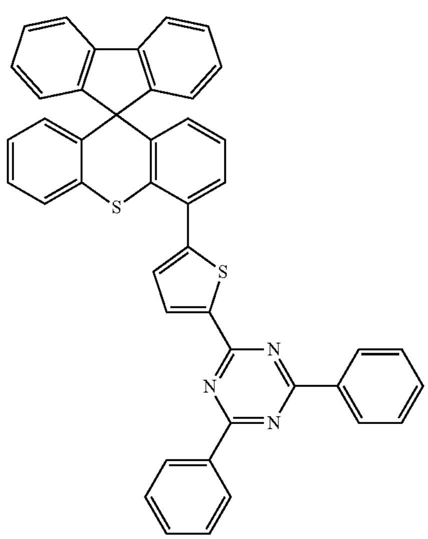
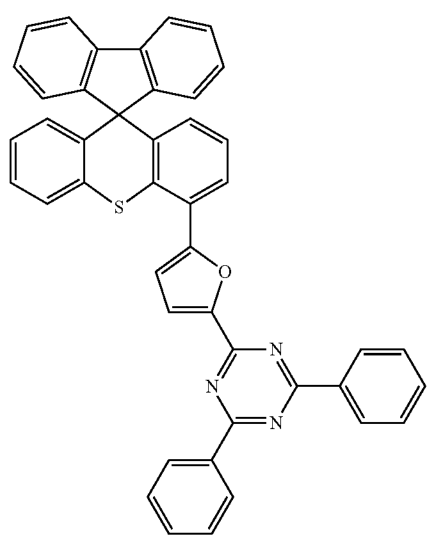

-continued
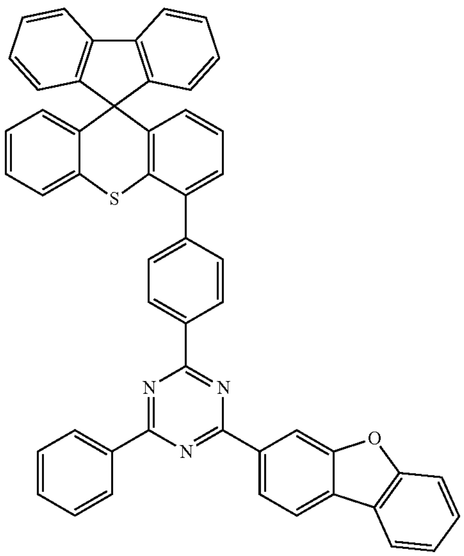
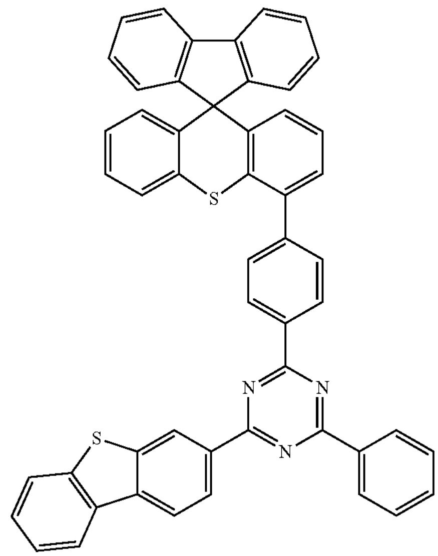
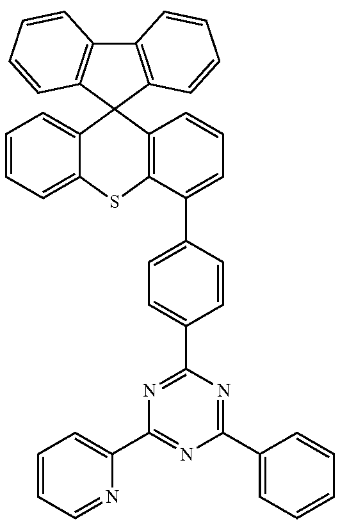
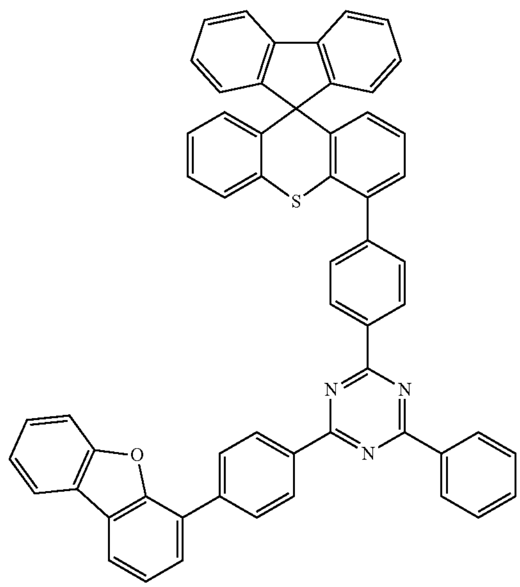
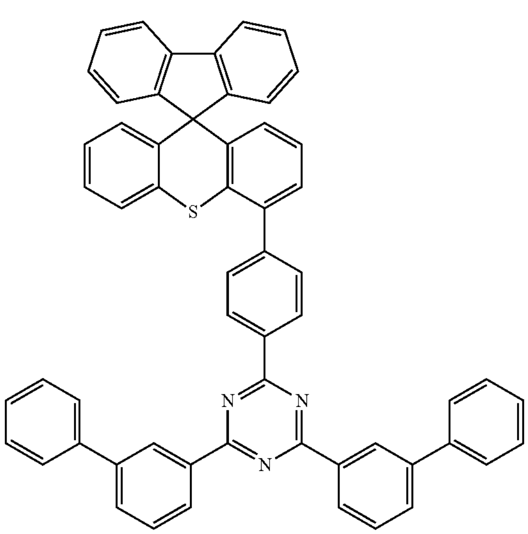
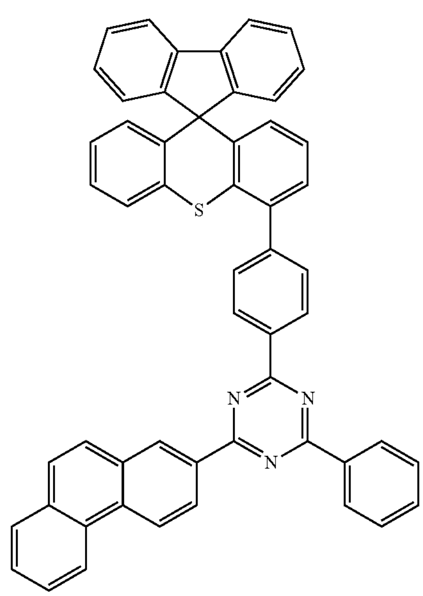

-continued
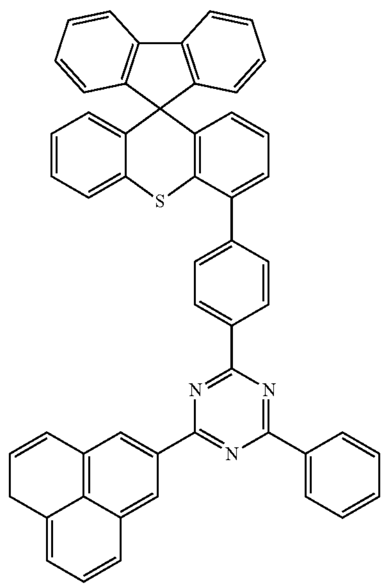
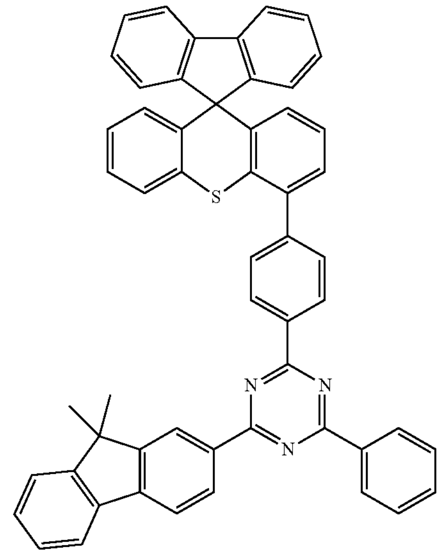
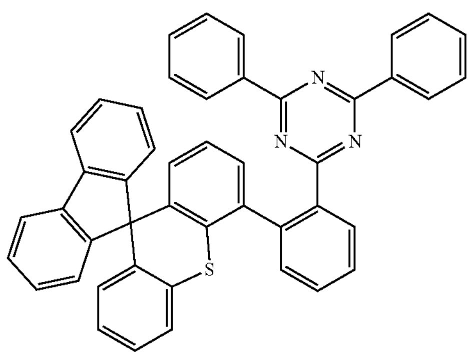
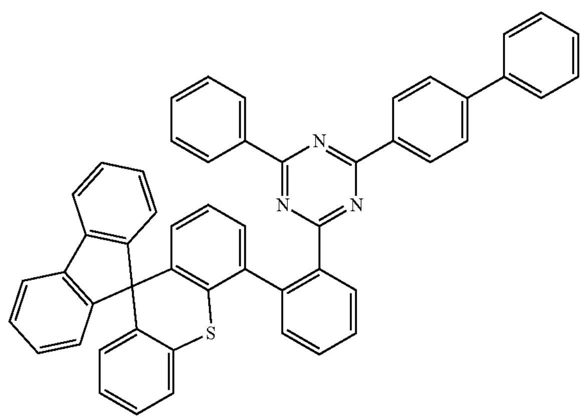
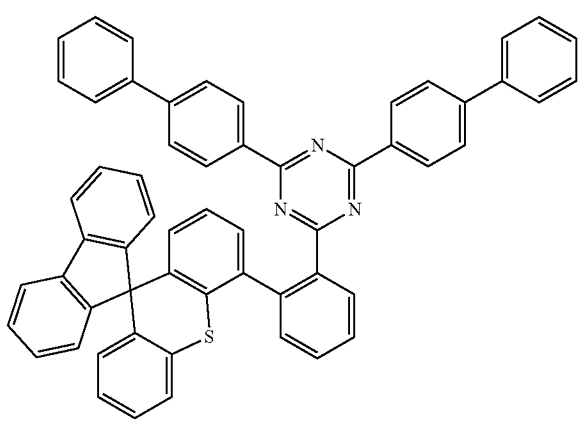
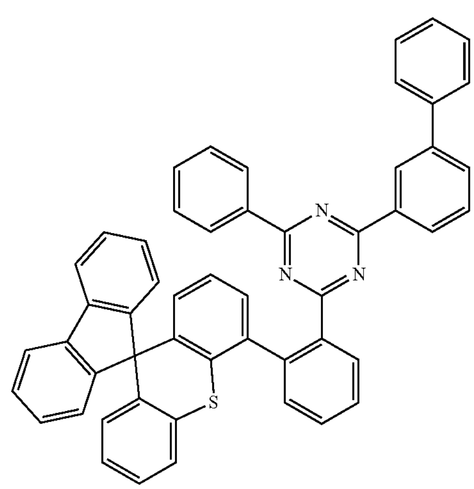

-continued
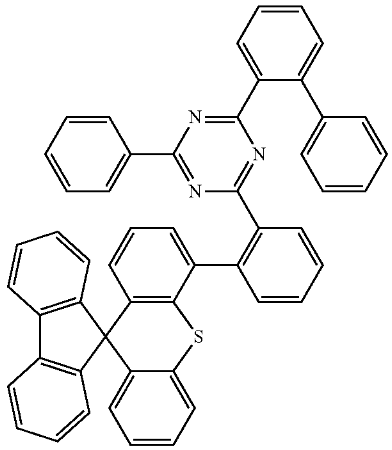
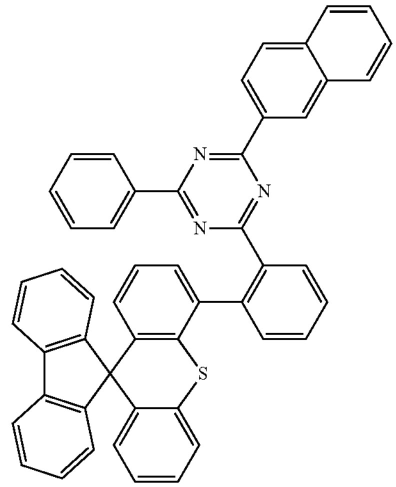
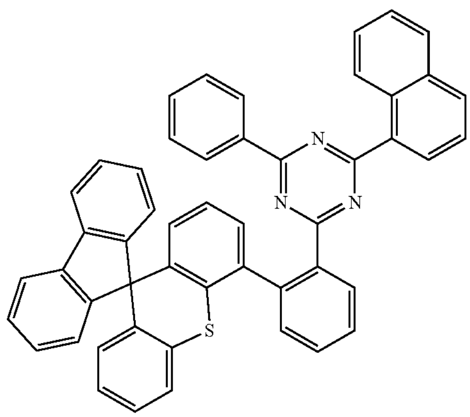
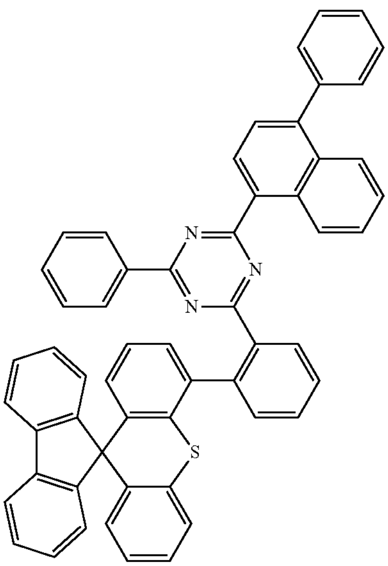
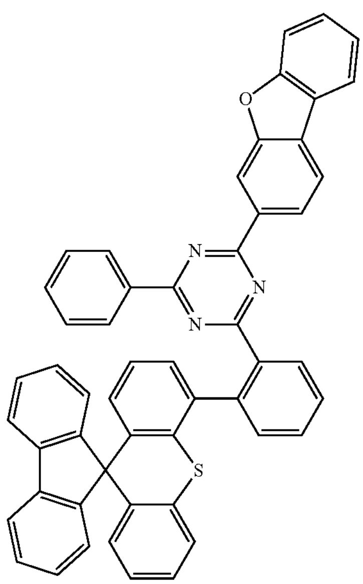
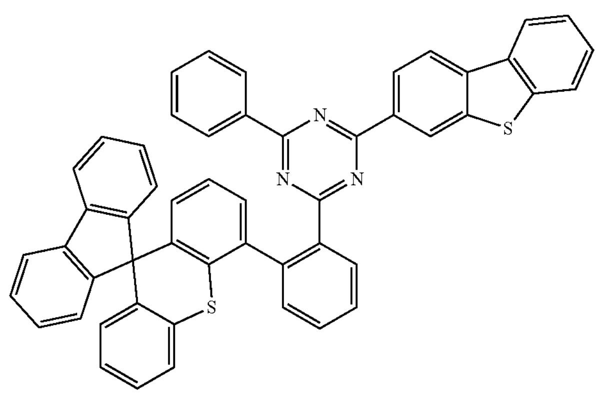

-continued
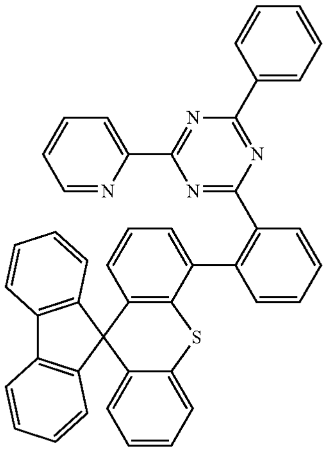
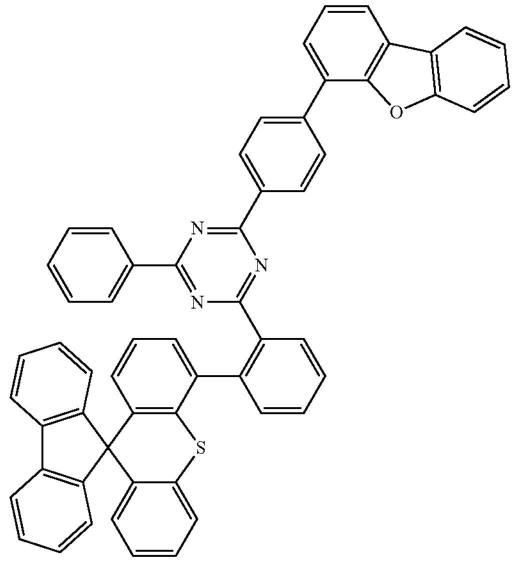
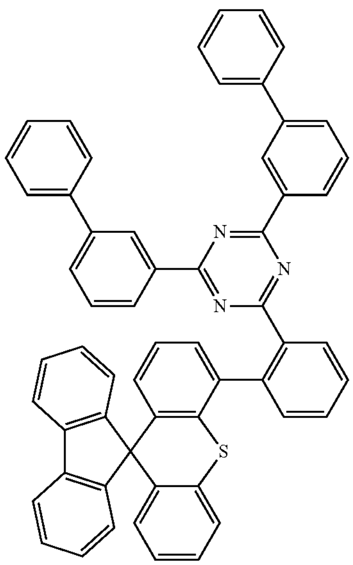
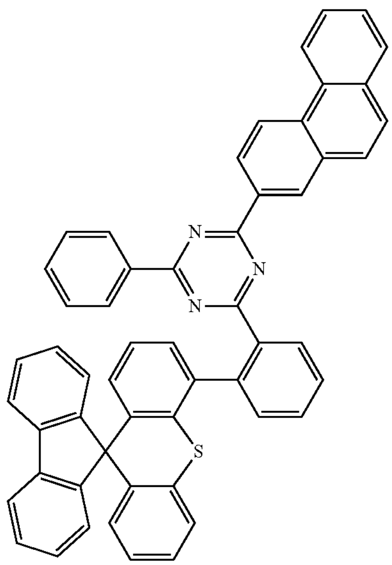
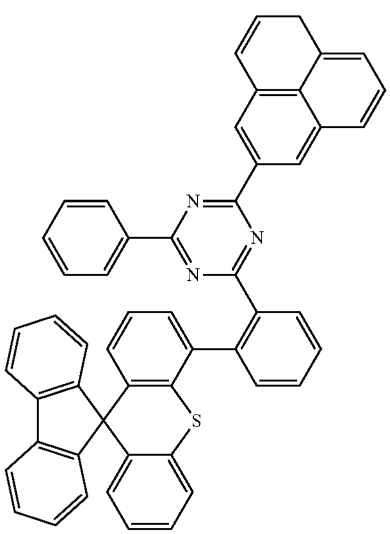
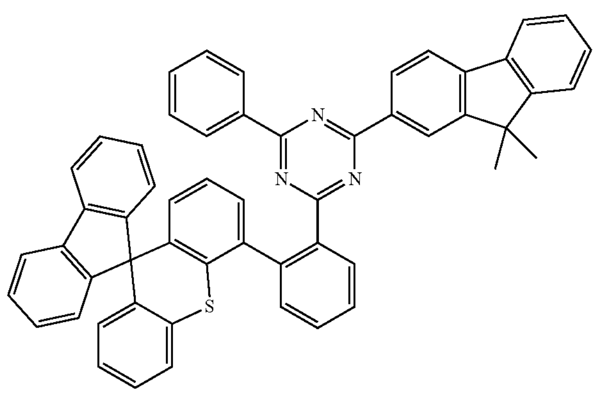

-continued
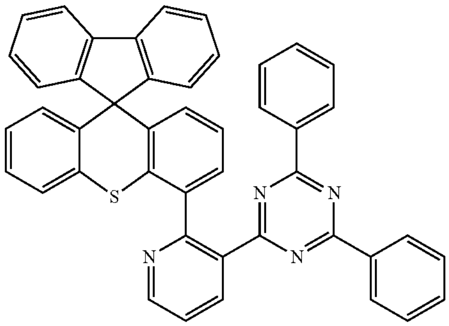
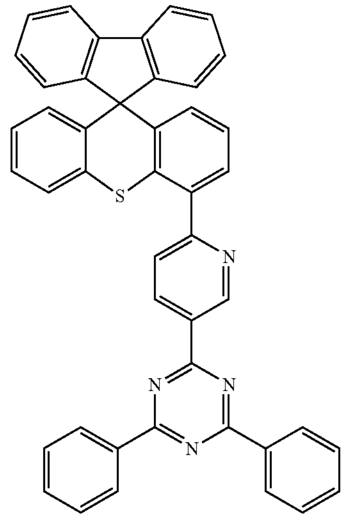
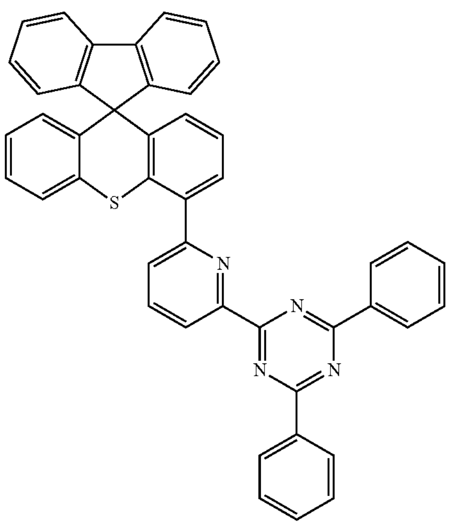
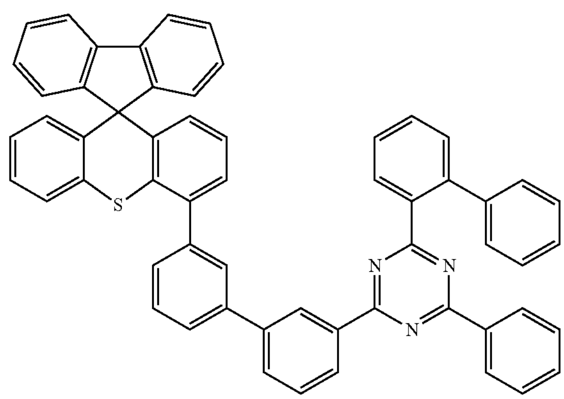
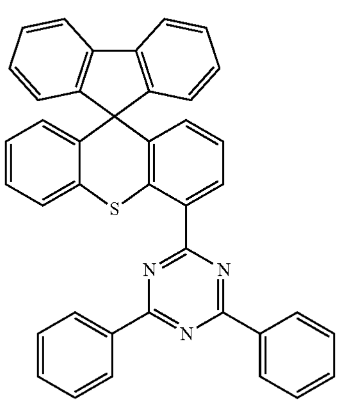
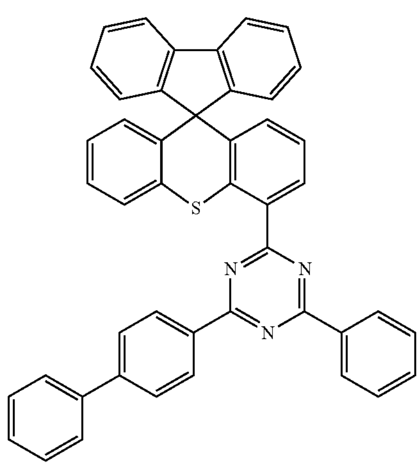

-continued
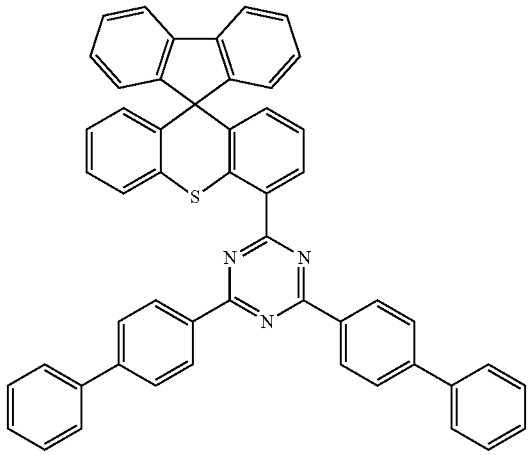
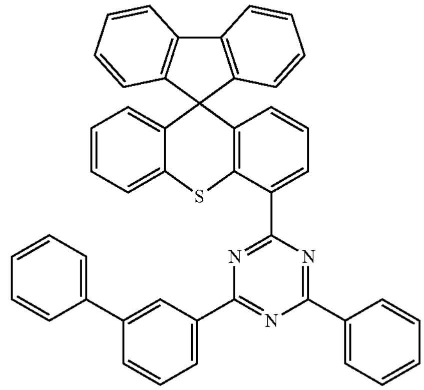
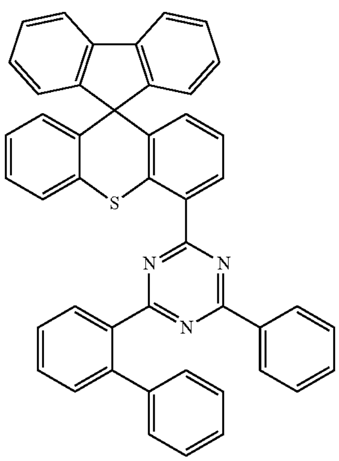
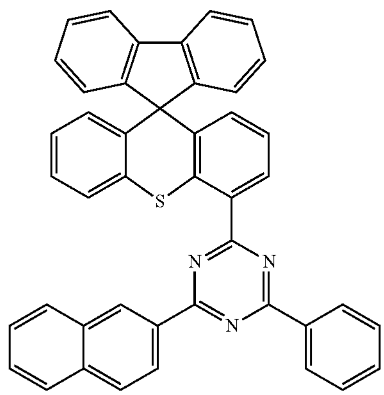
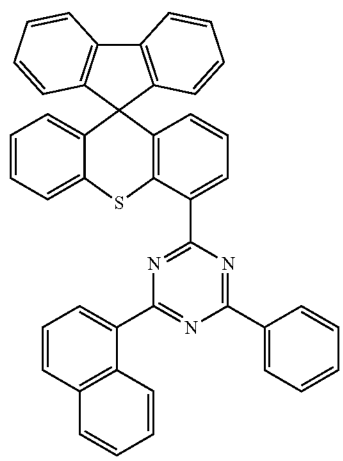
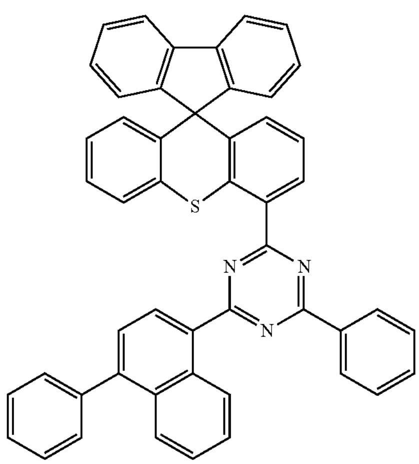
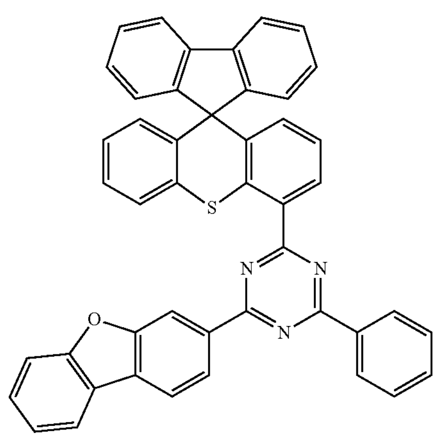

-continued
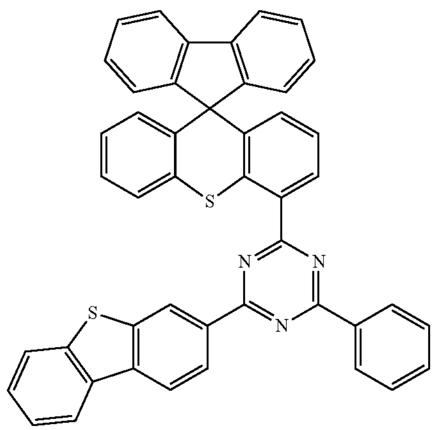
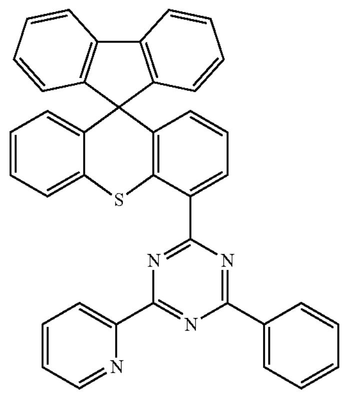
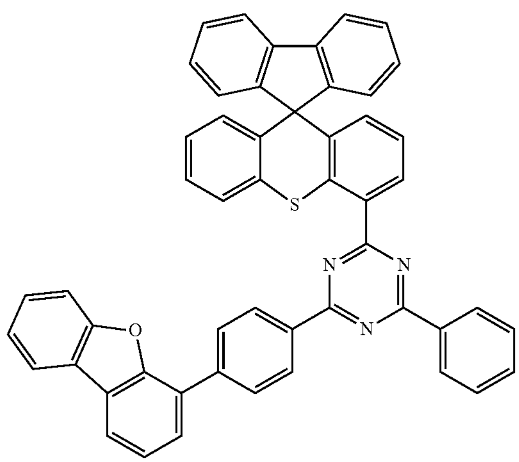
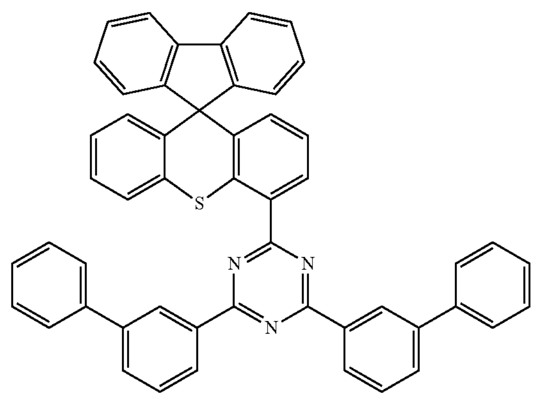
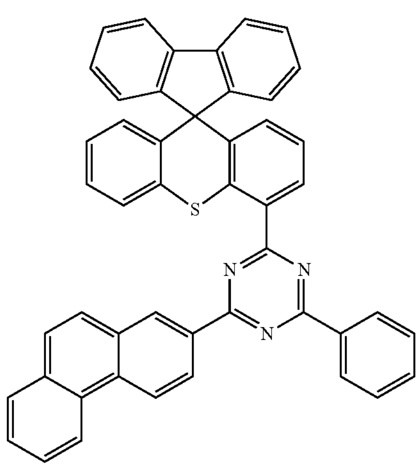
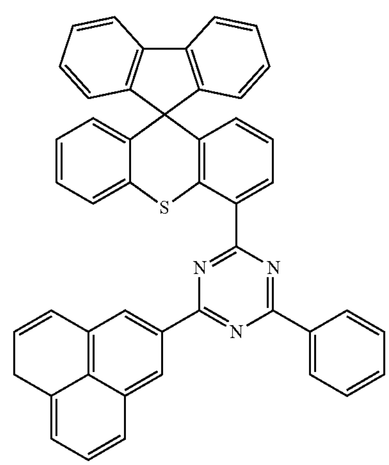

-continued
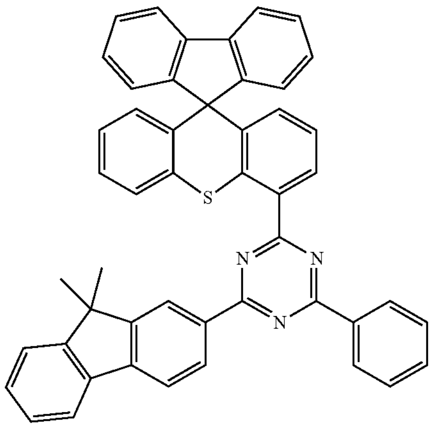
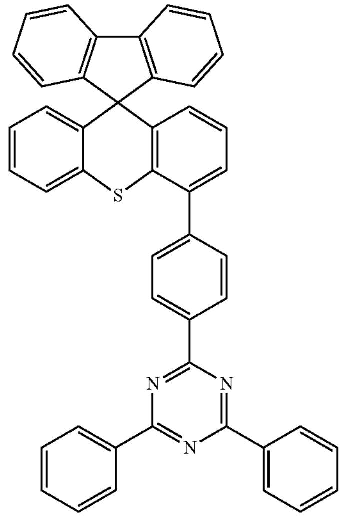
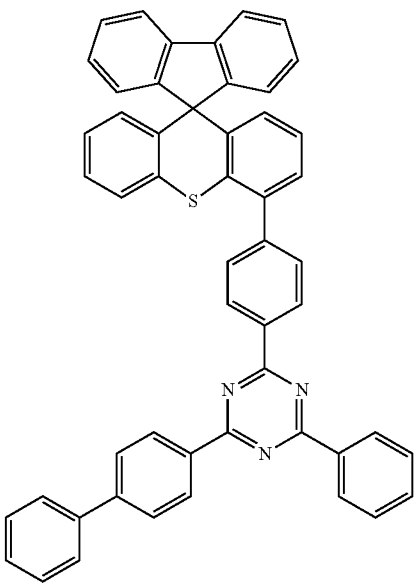
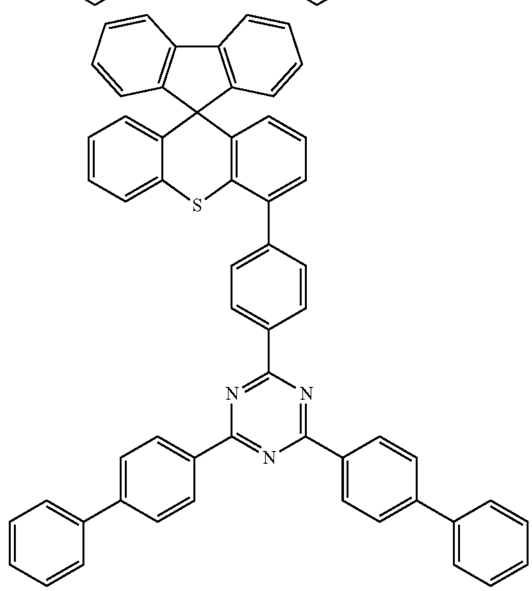
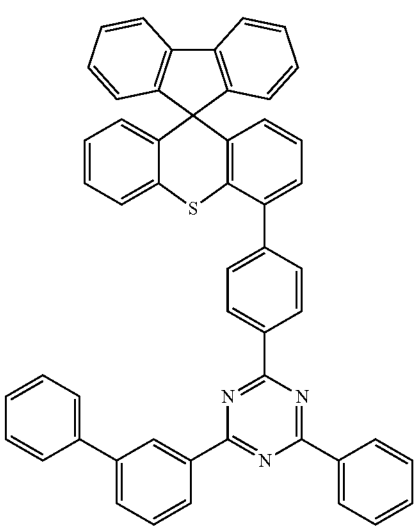
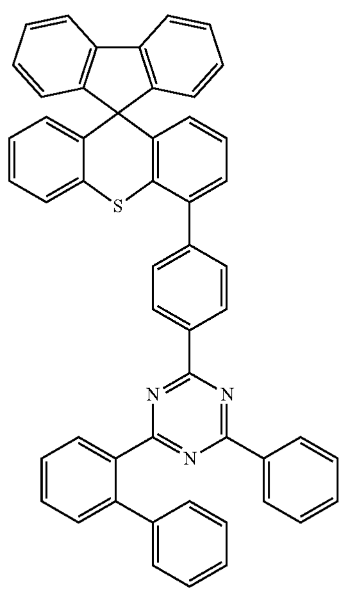
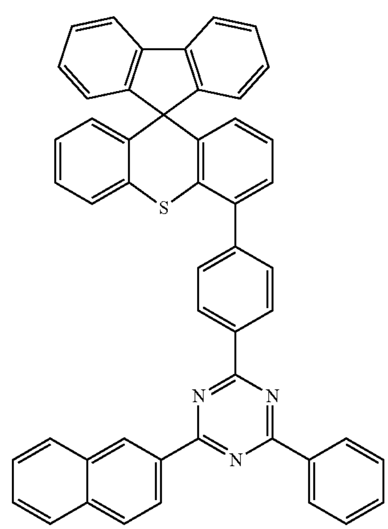

-continued
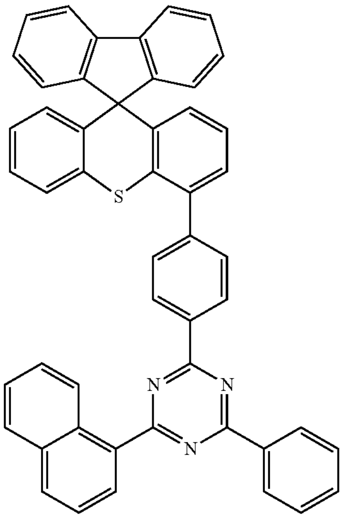
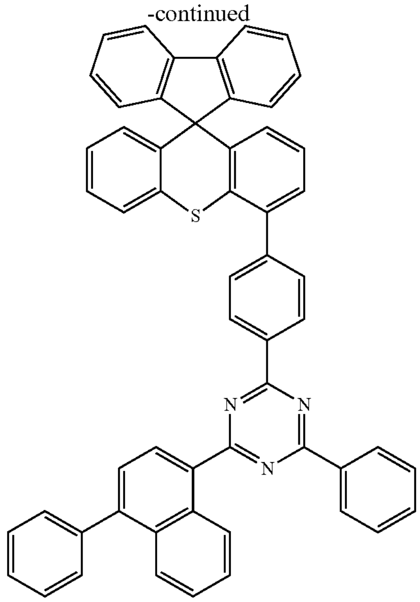
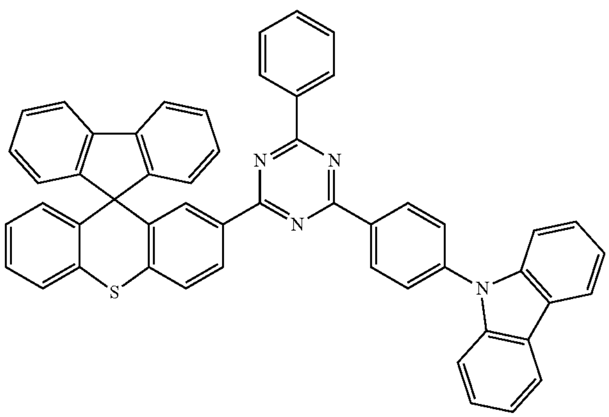
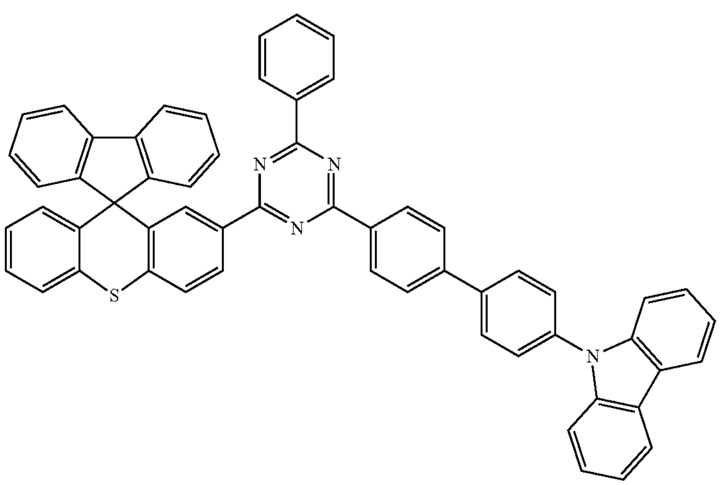

-continued
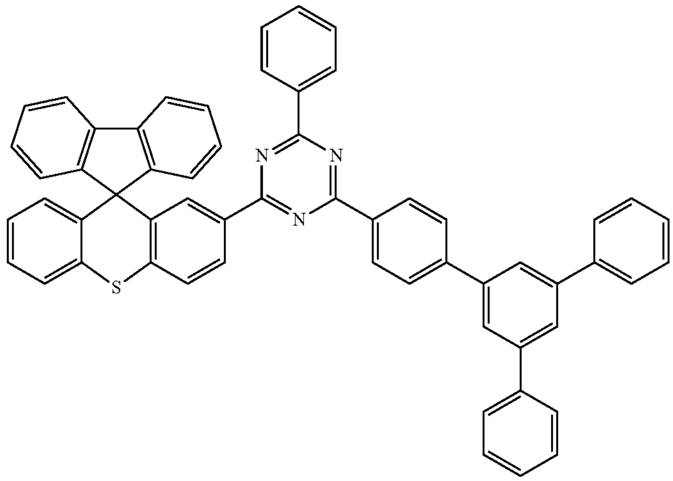
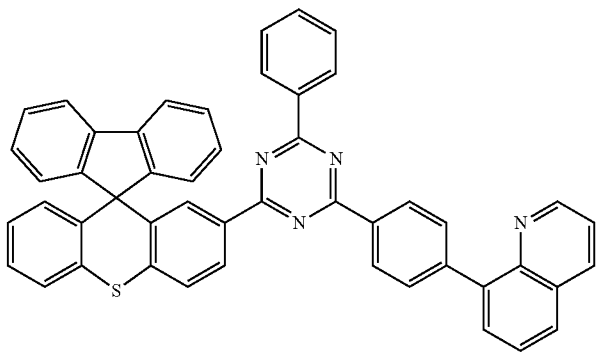
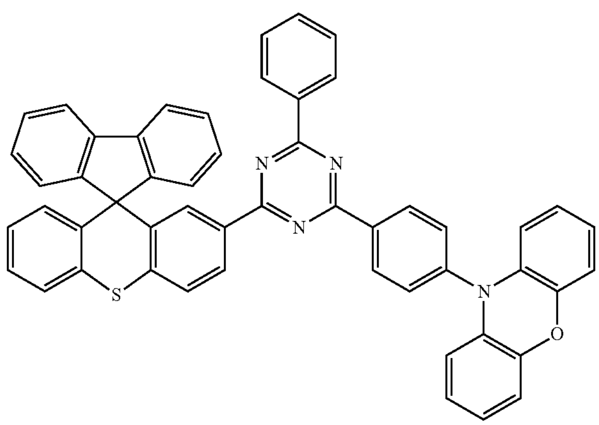
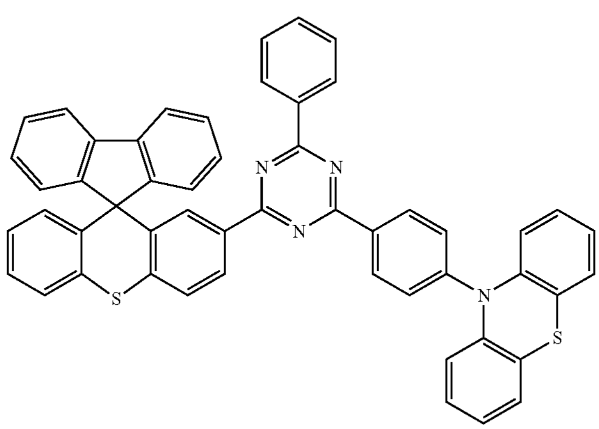

-continued
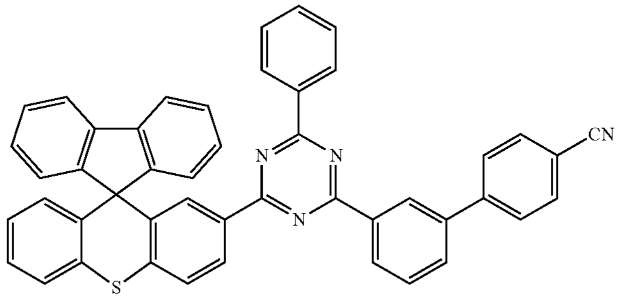
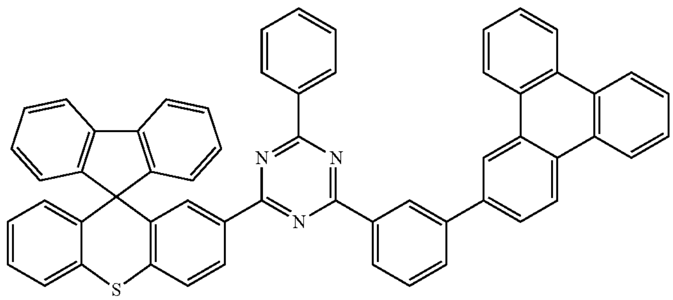
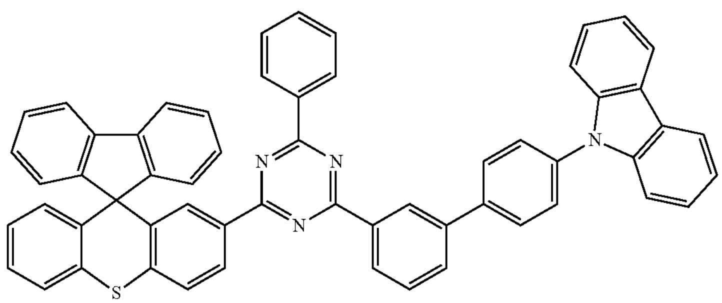
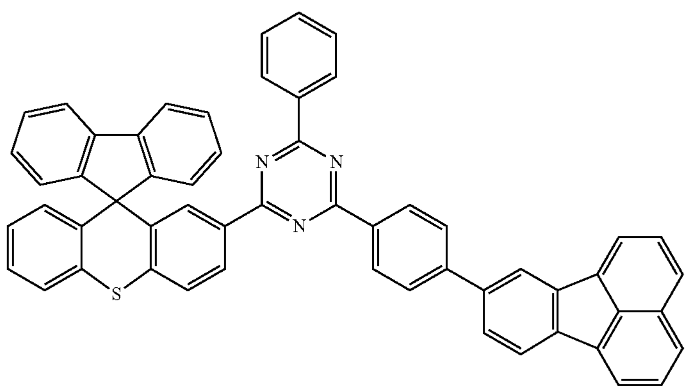
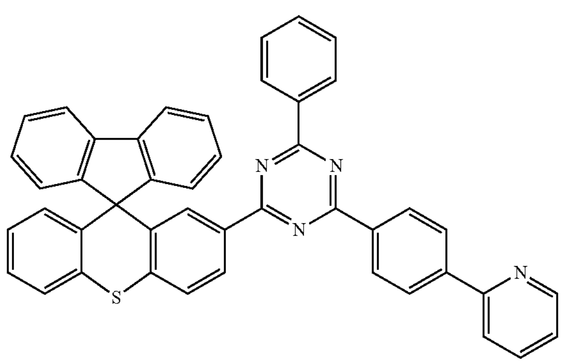
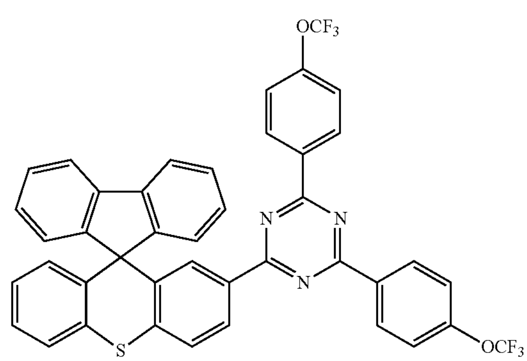

-continued
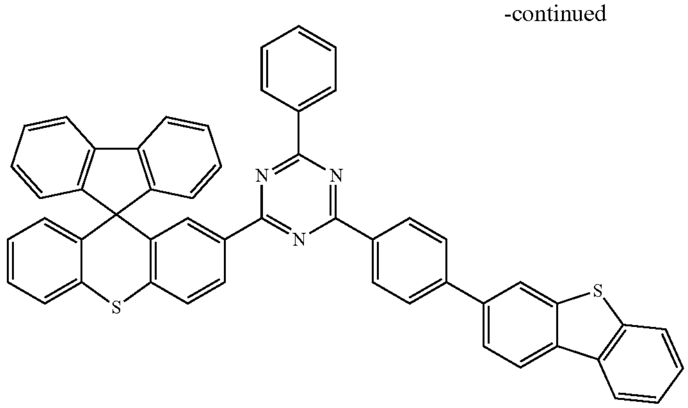
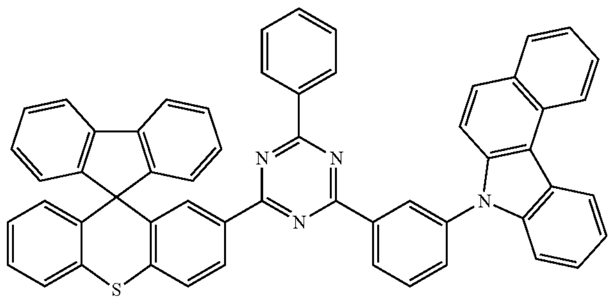
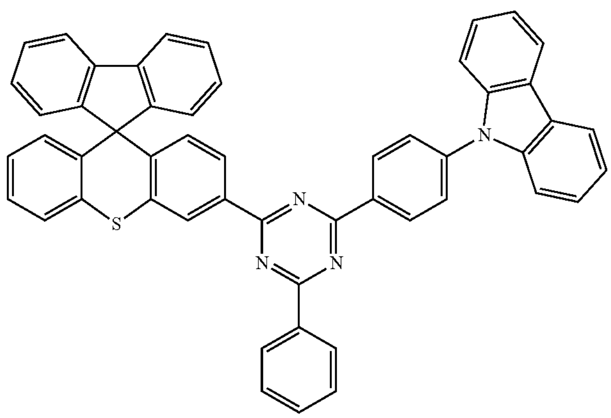
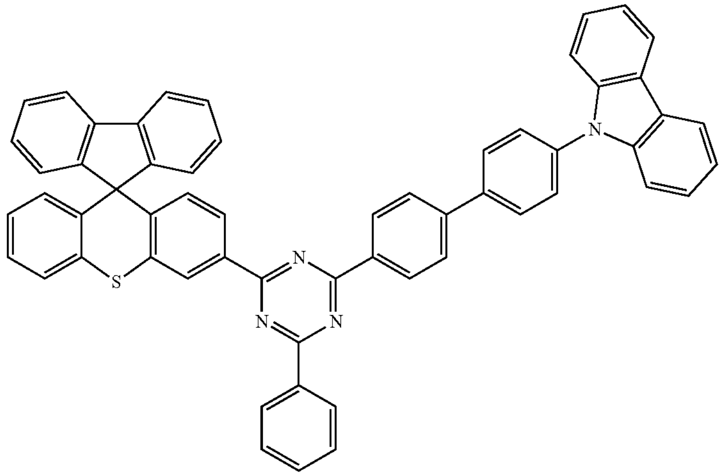

-continued
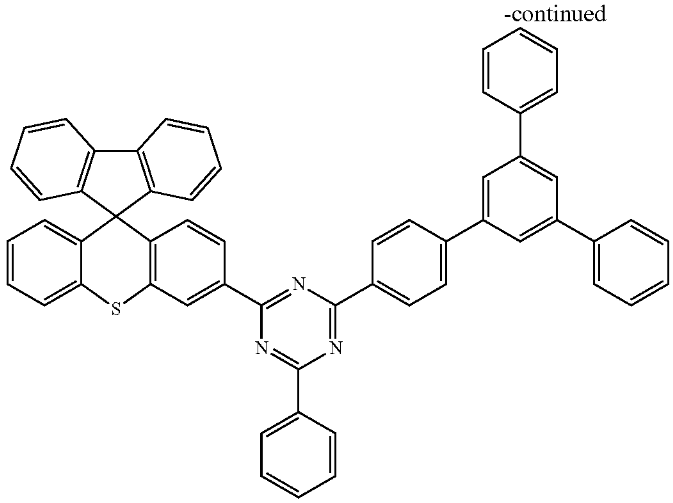
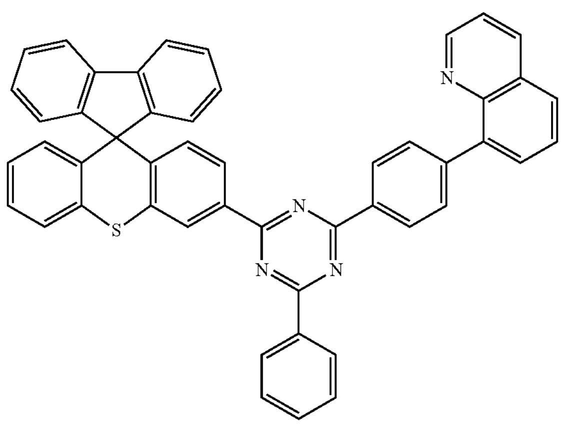
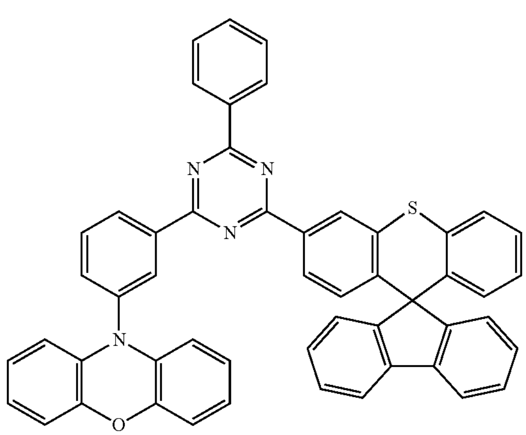

-continued
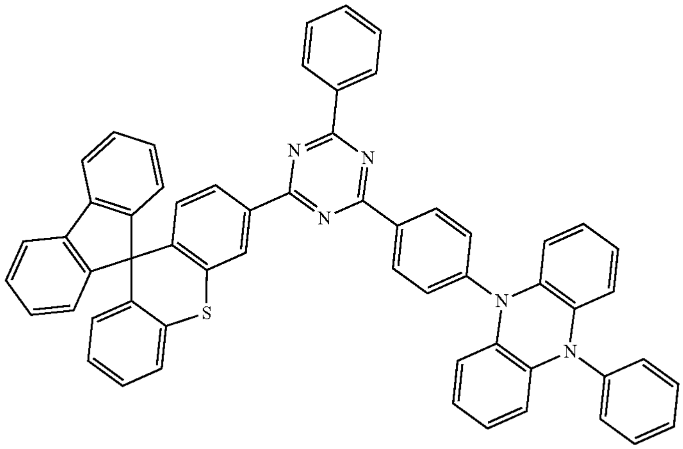
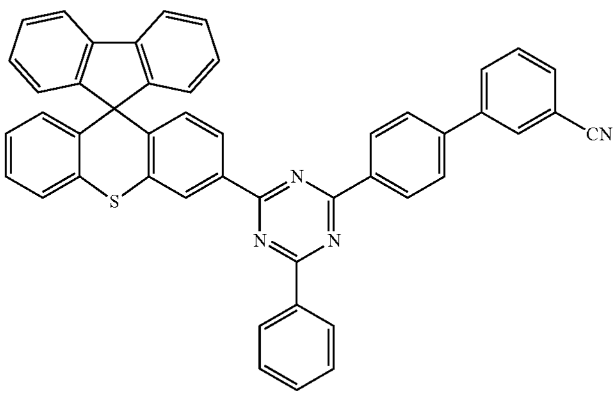
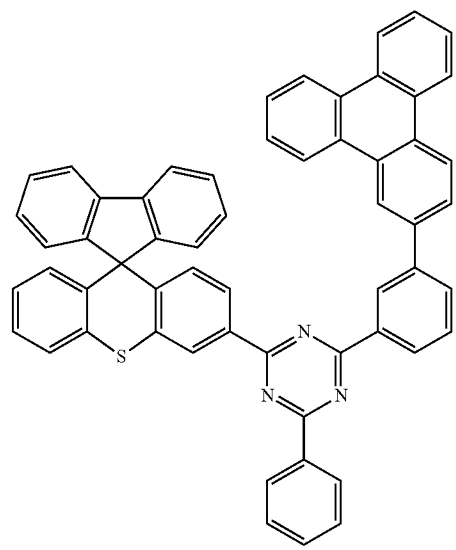
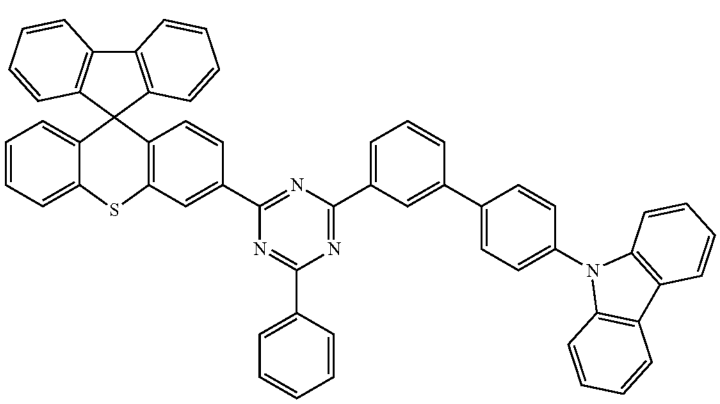
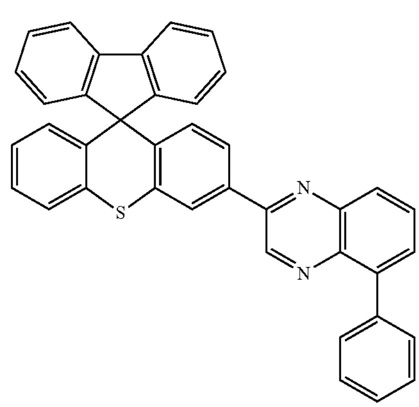

-continued
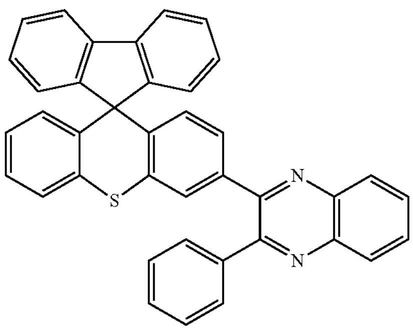
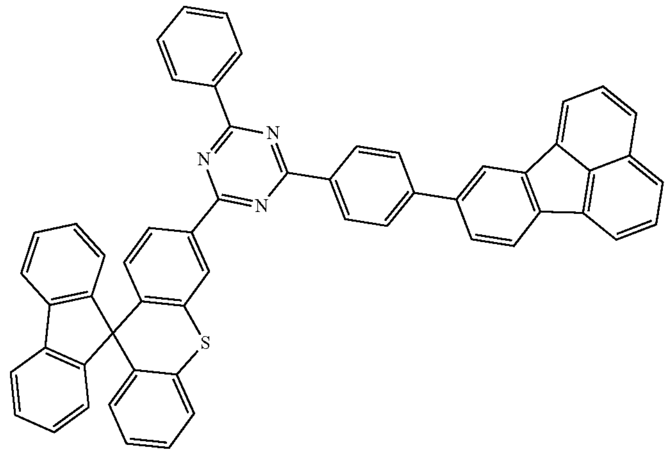
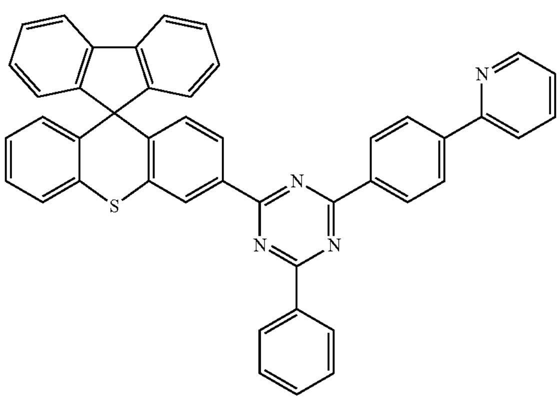
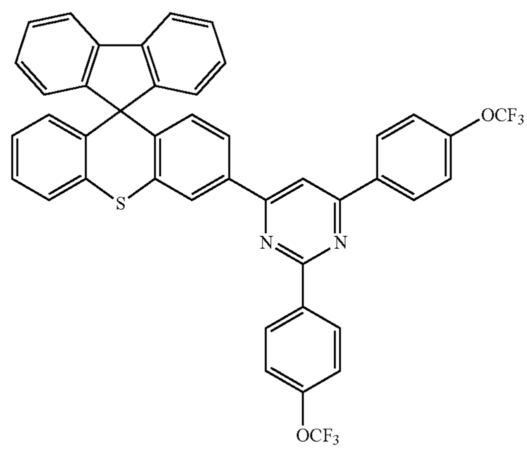
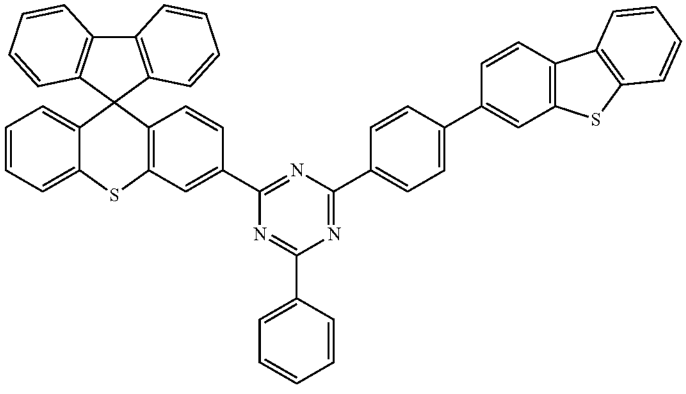

-continued
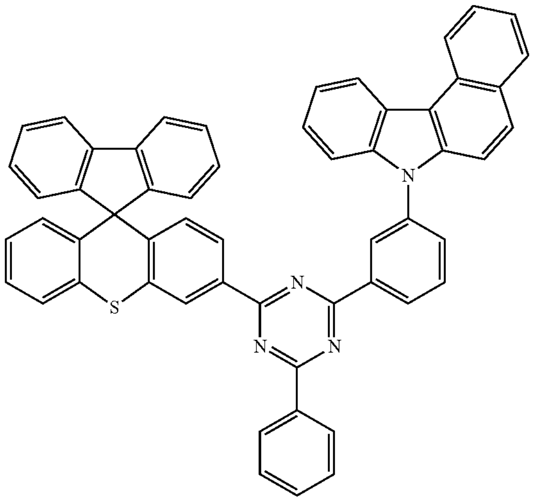
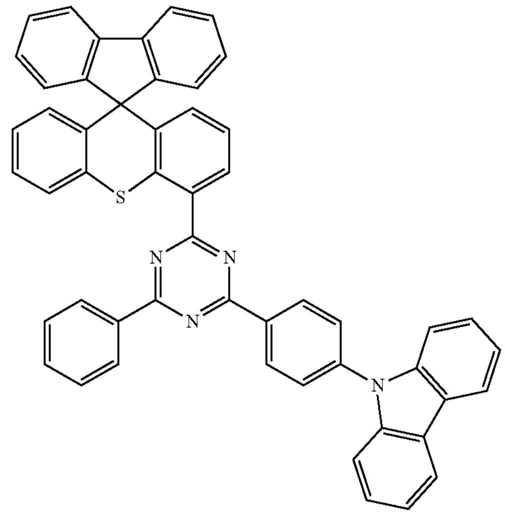
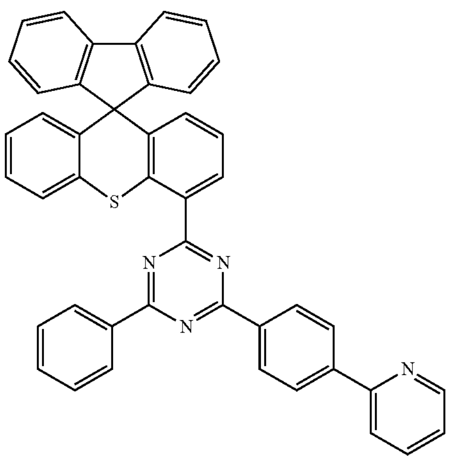
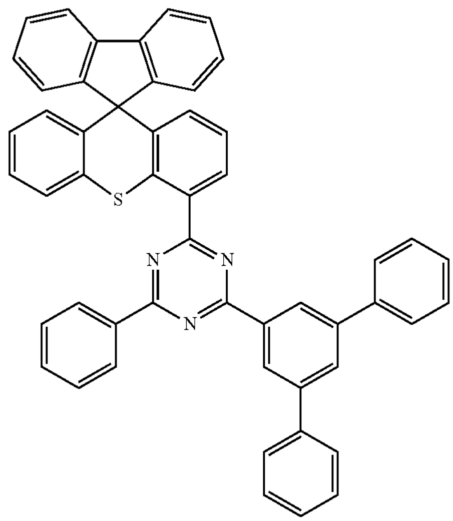
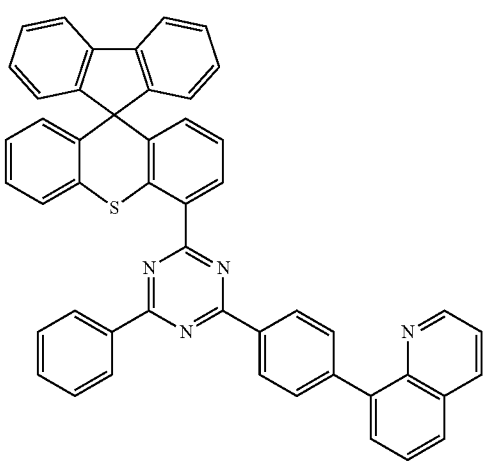
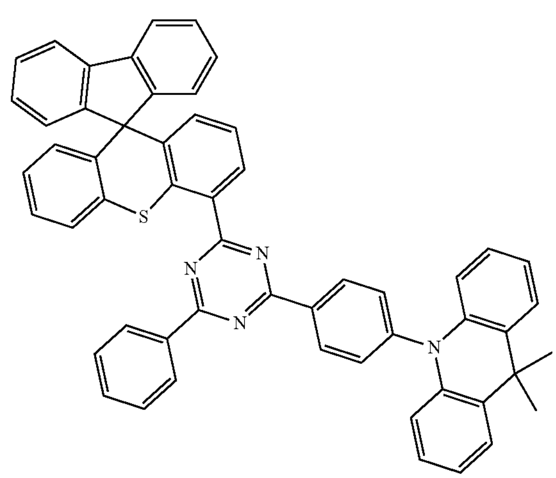

-continued
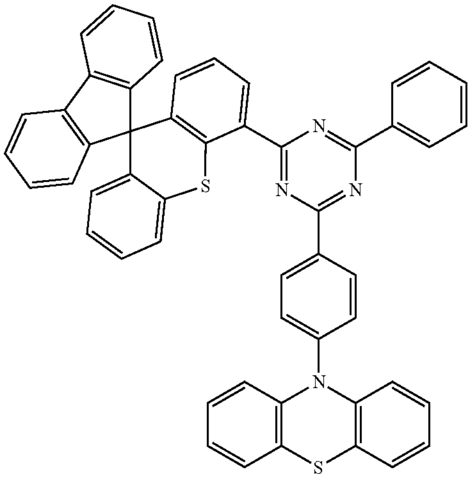
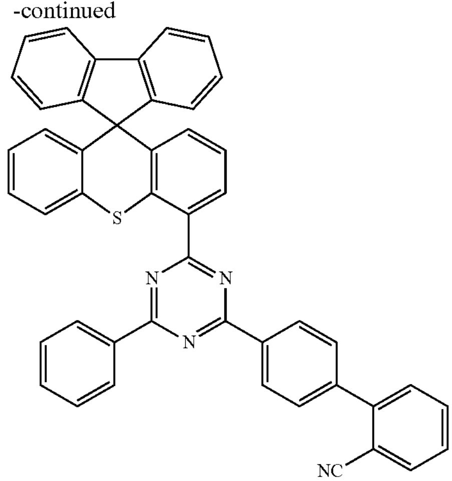
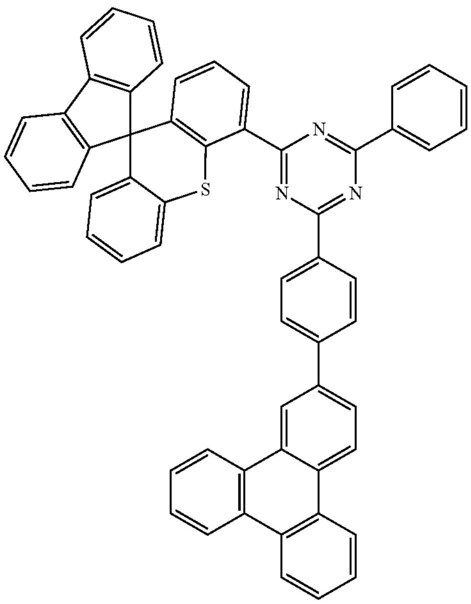
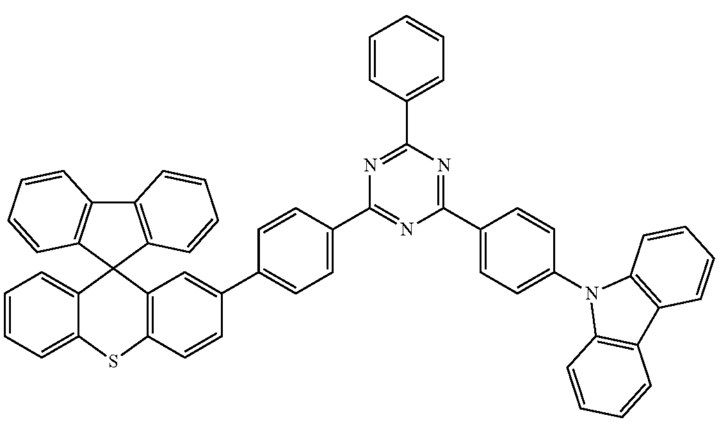

-continued
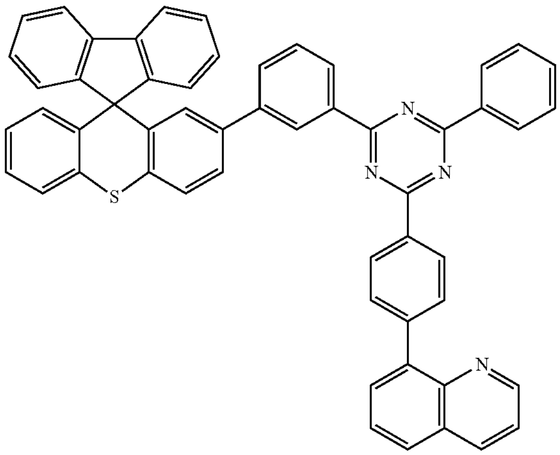
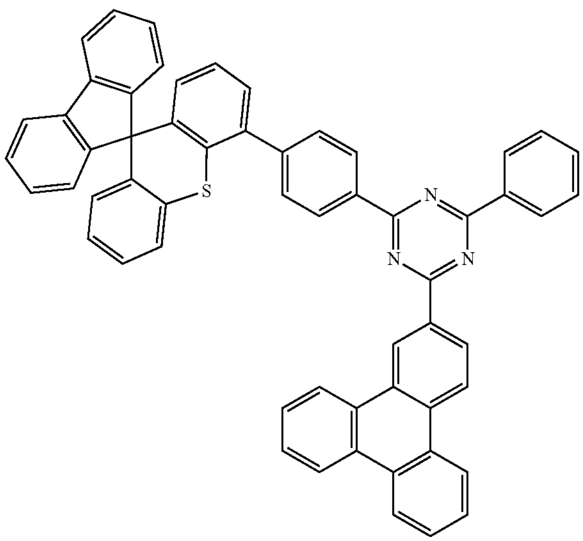
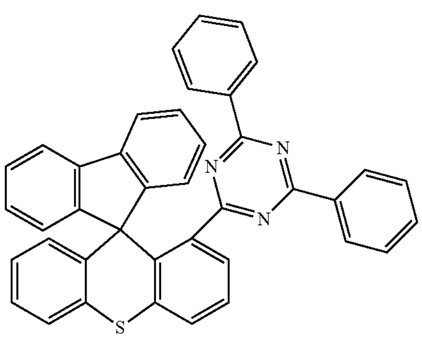
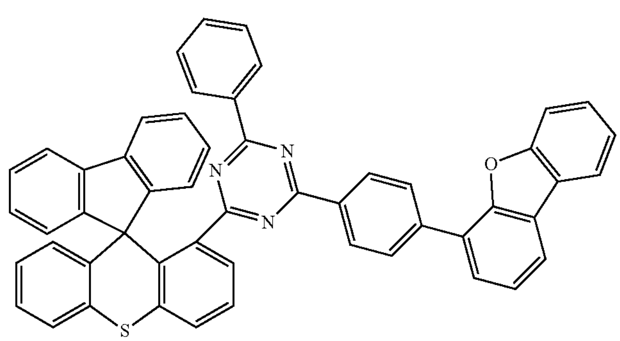

-continued
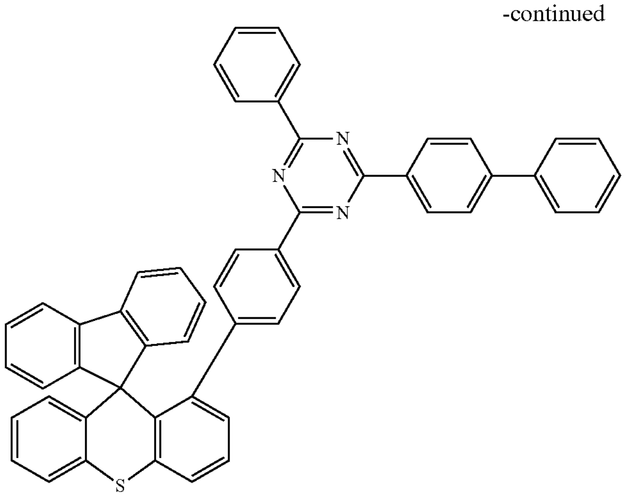
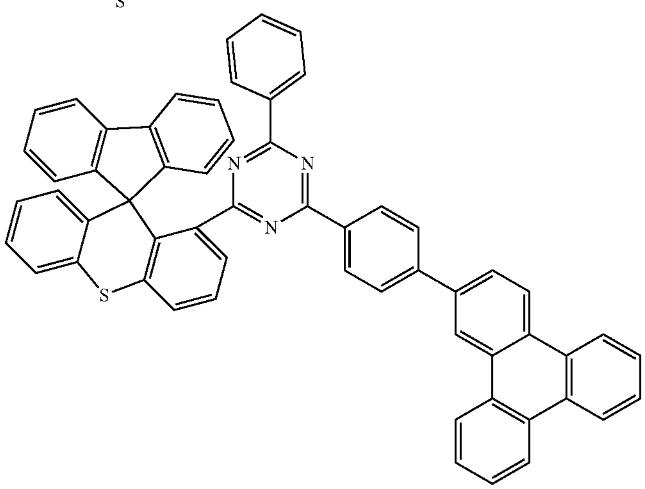
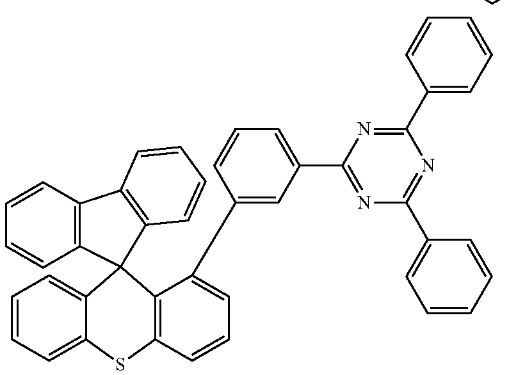
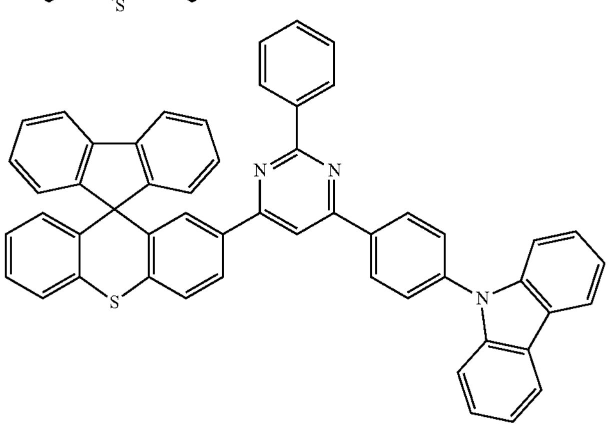

-continued
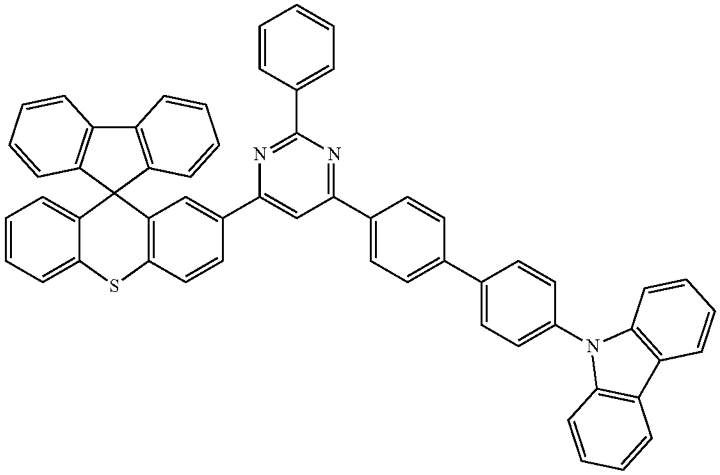
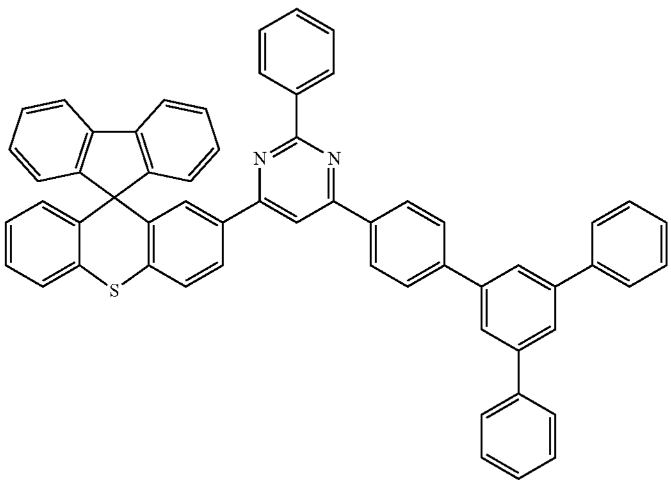
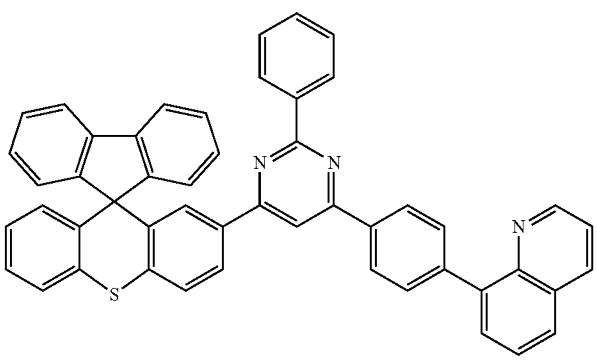
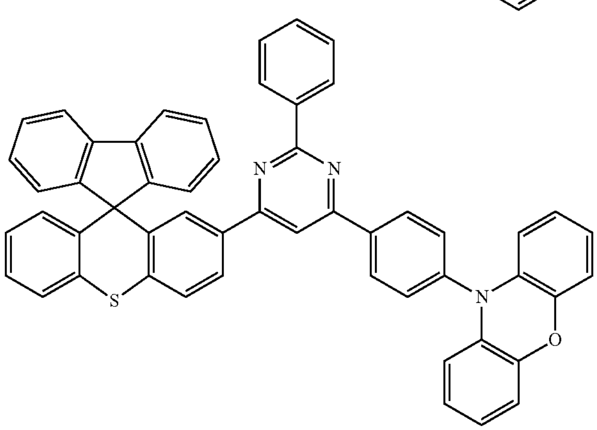

-continued
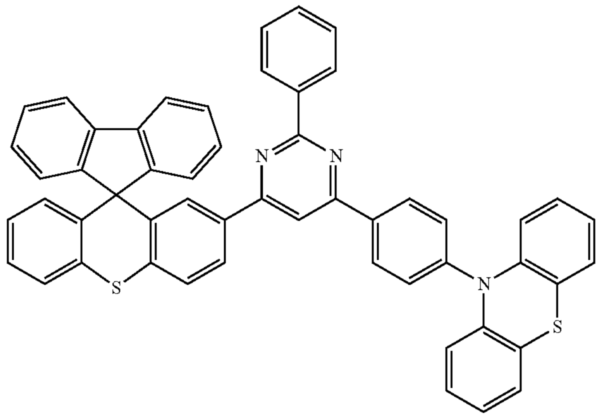
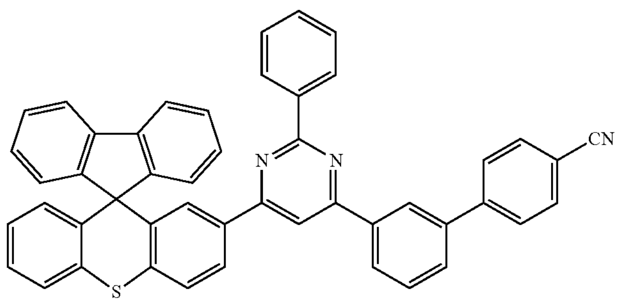
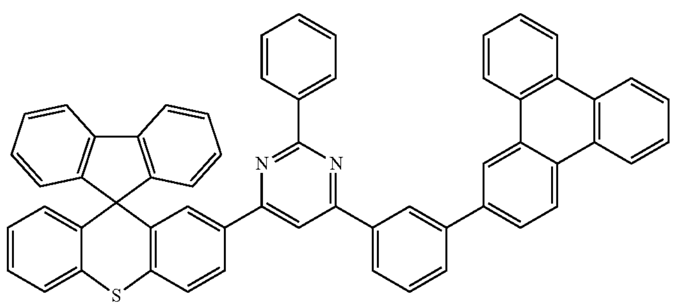
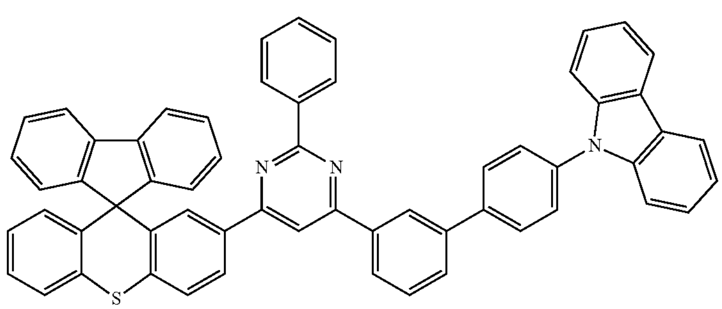
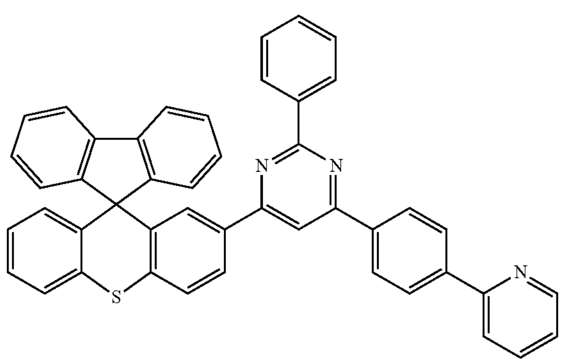

-continued
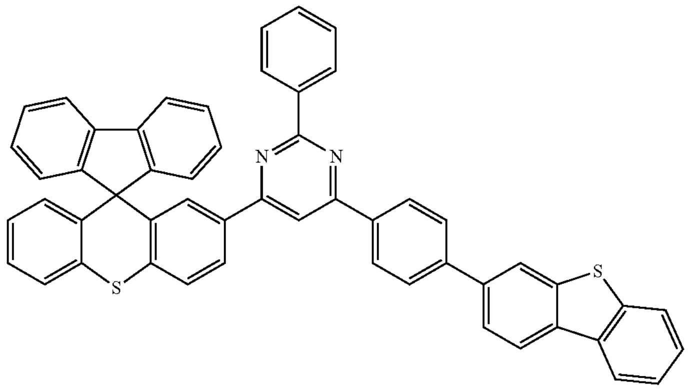
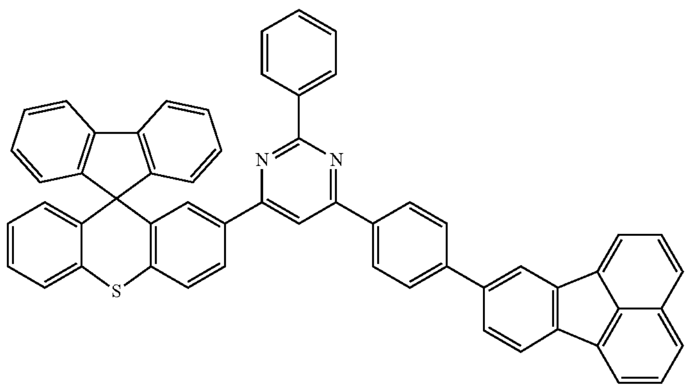
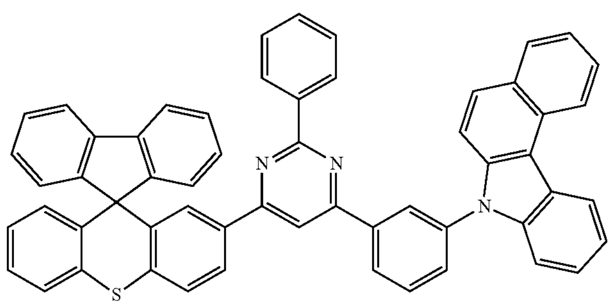
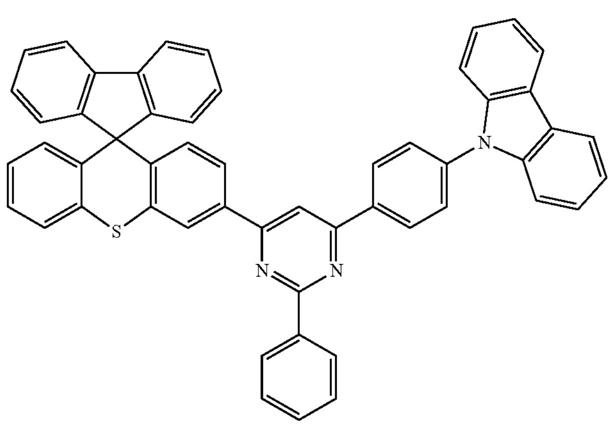

-continued
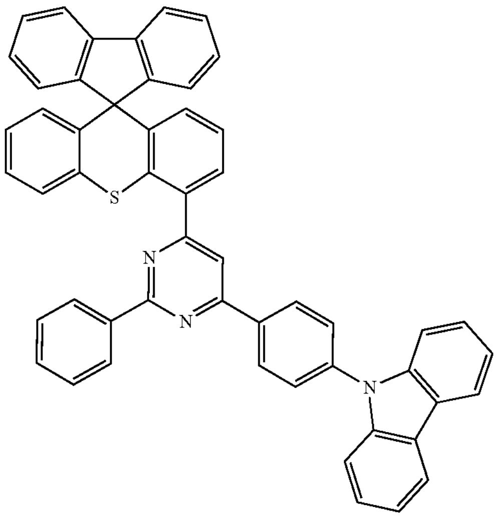
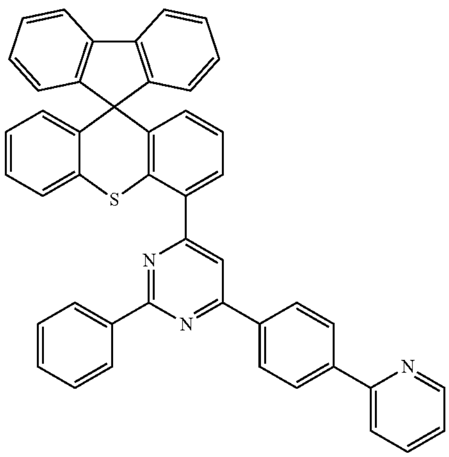
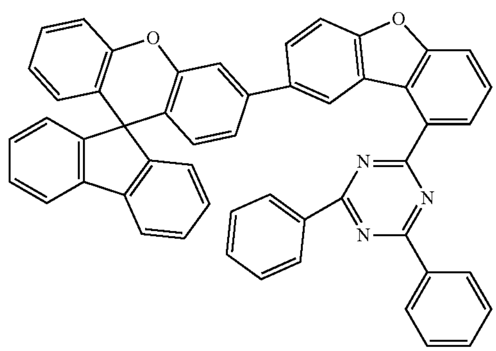
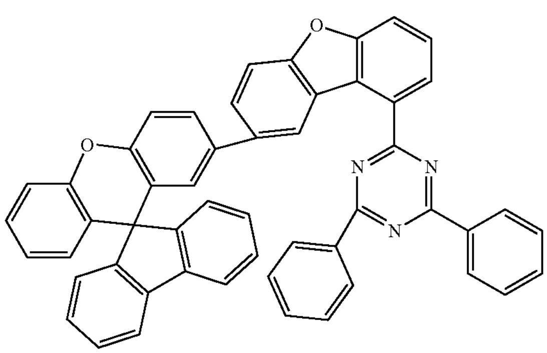
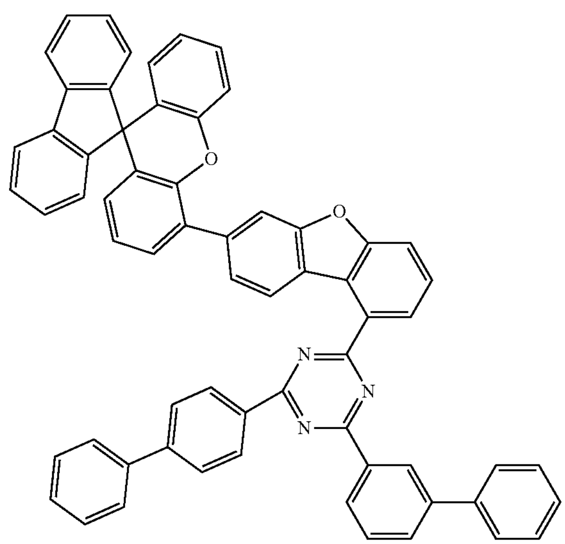

-continued
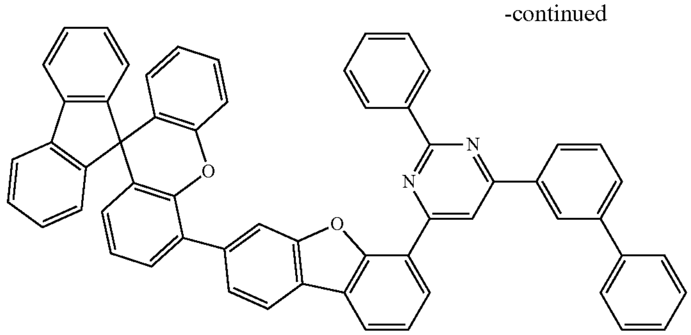
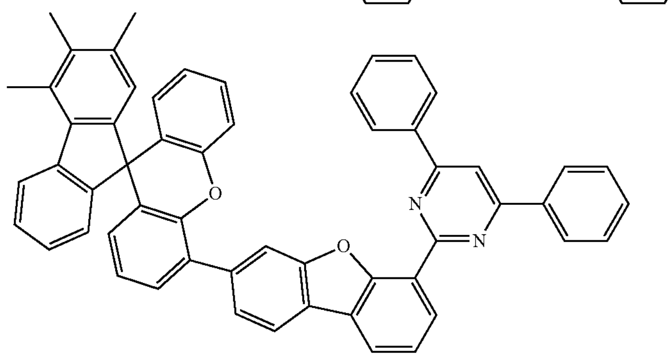
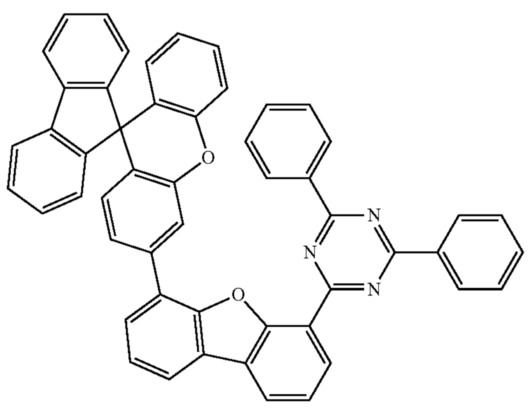
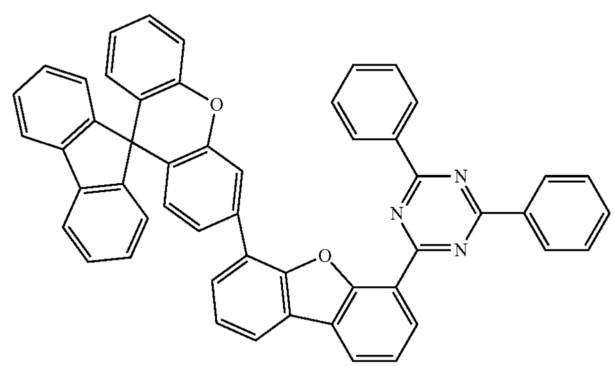
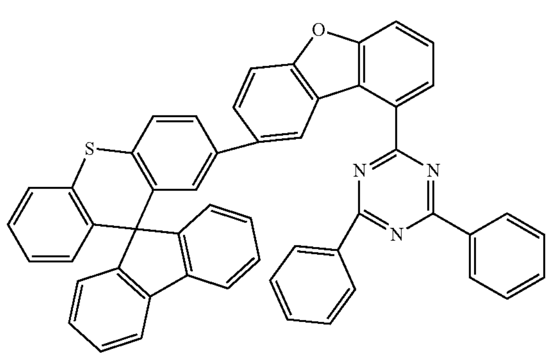
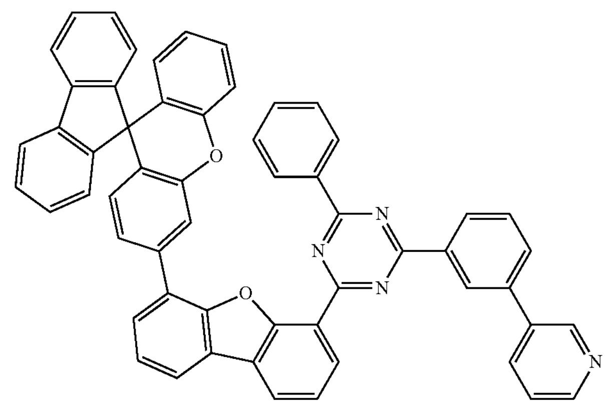

-continued
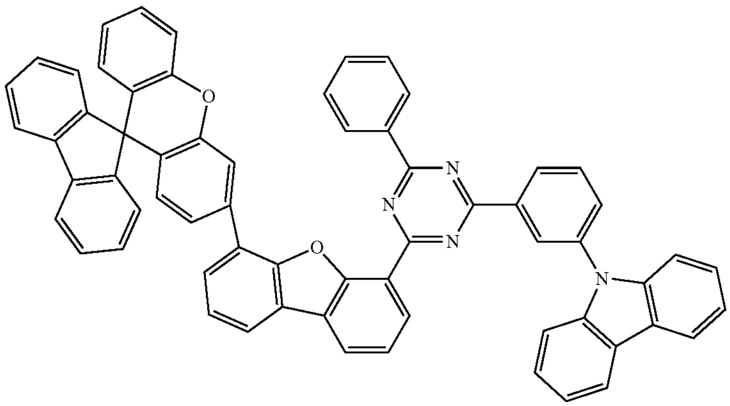
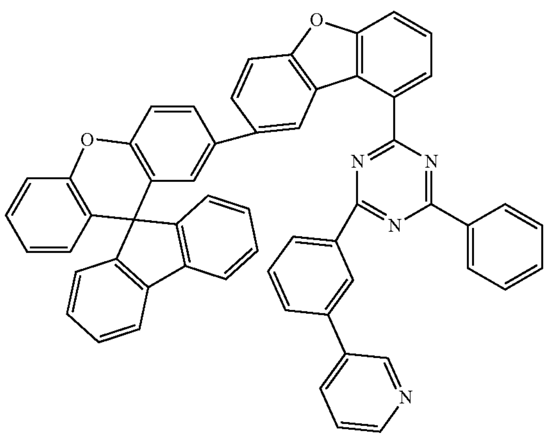
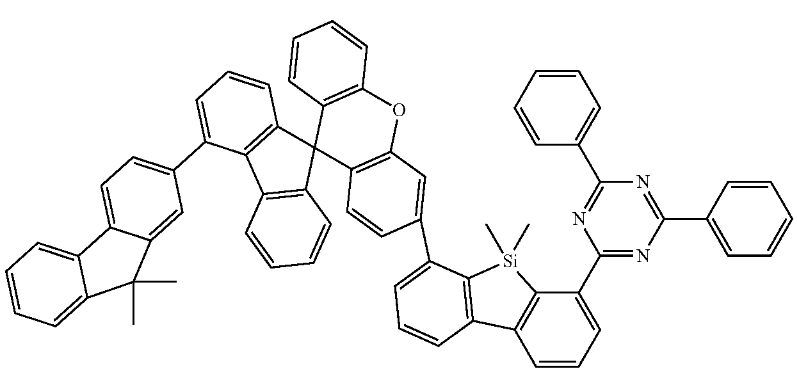

-continued
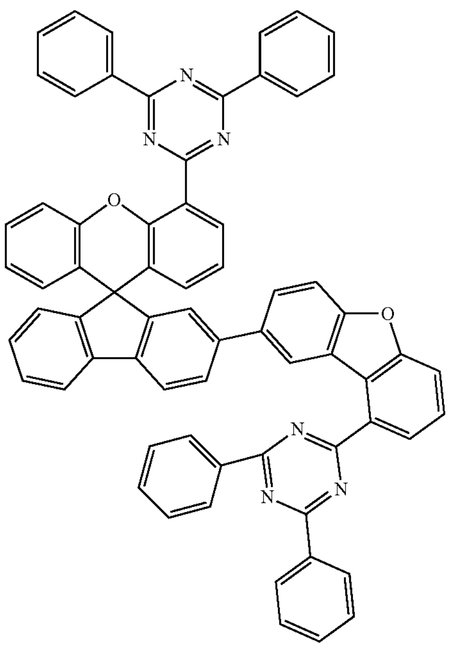
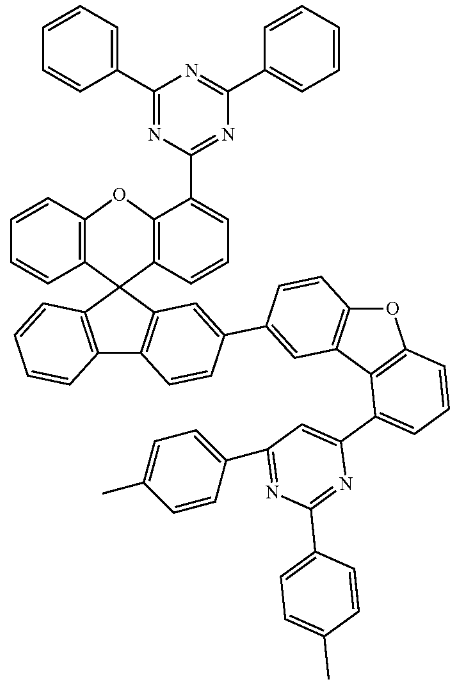
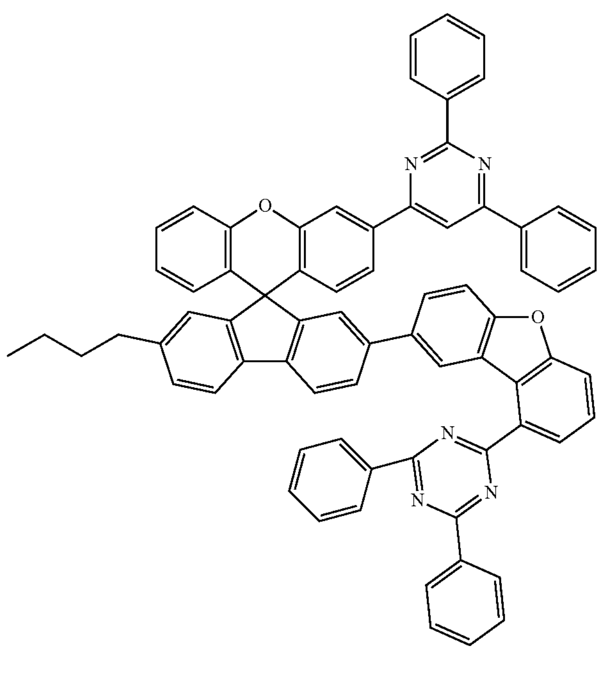

-continued
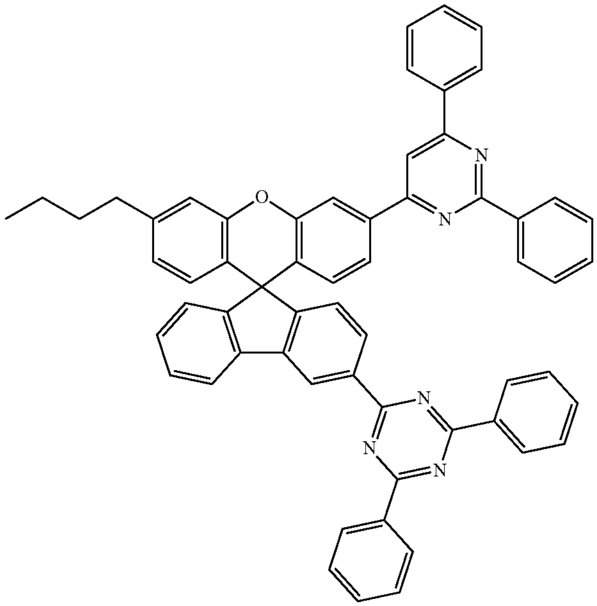
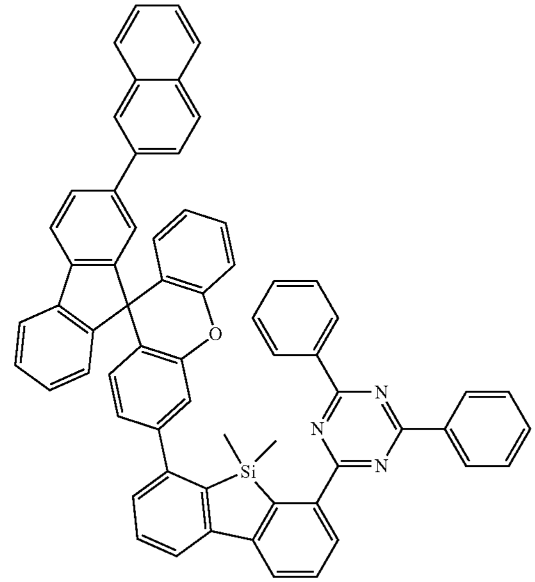
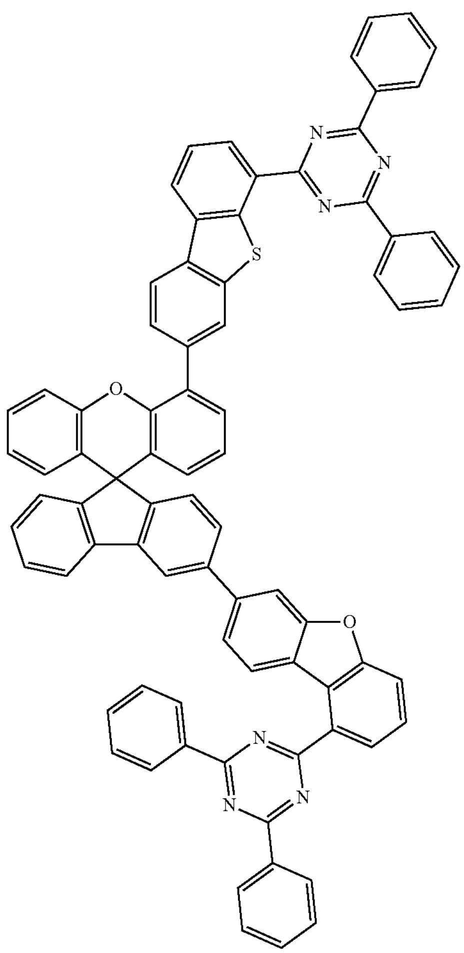
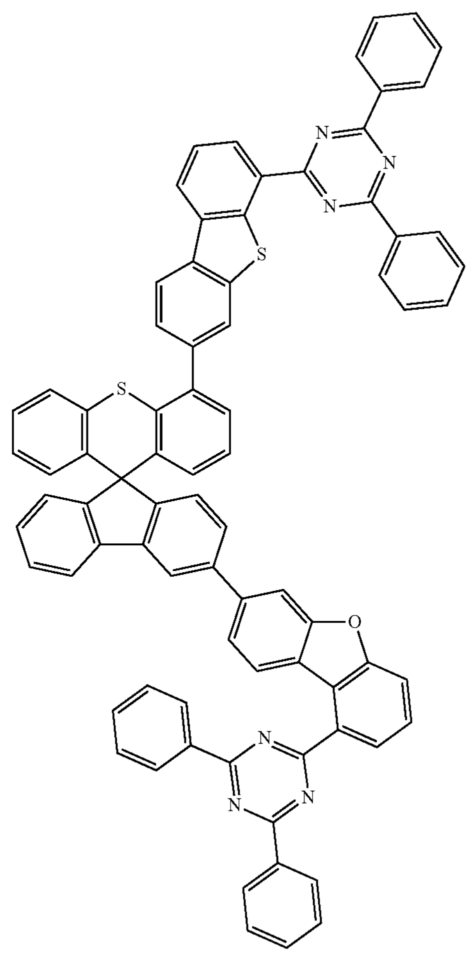

-continued
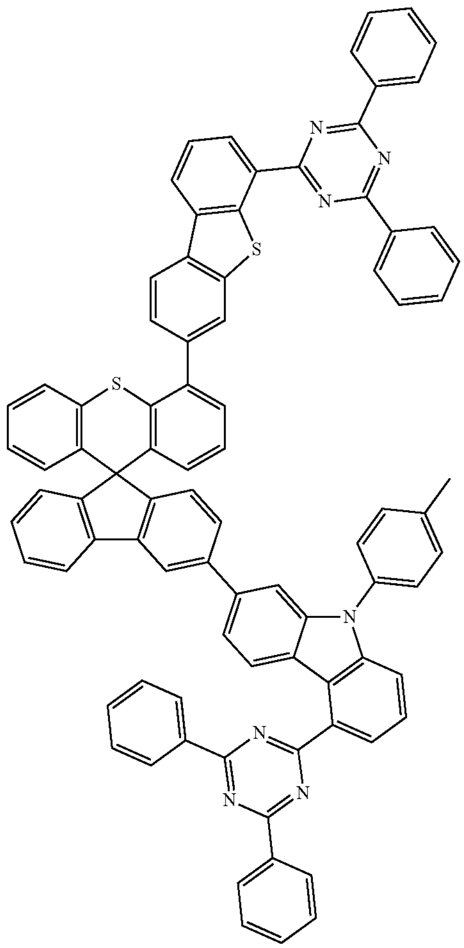
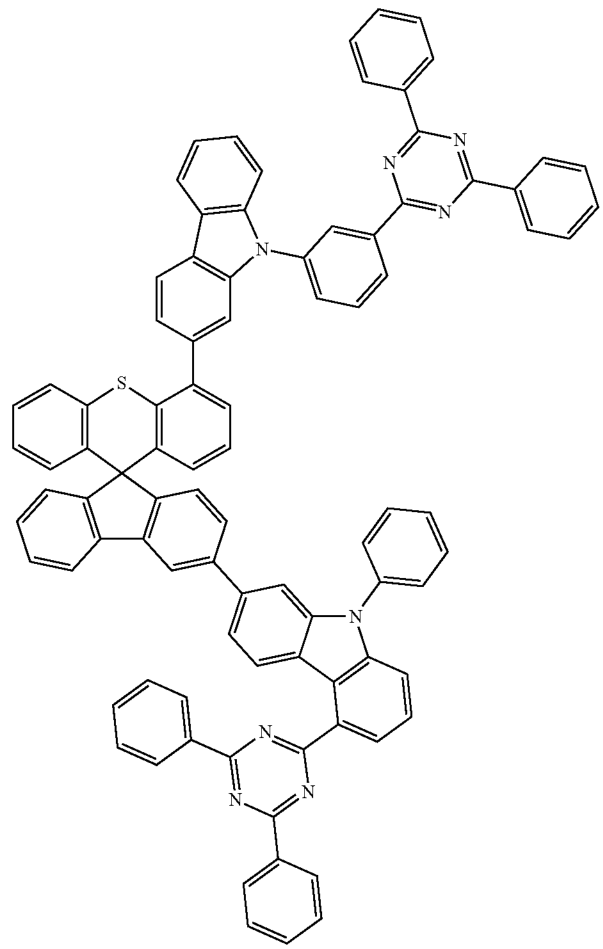
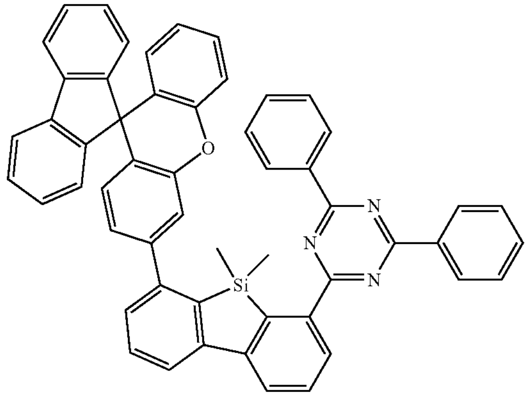

-continued
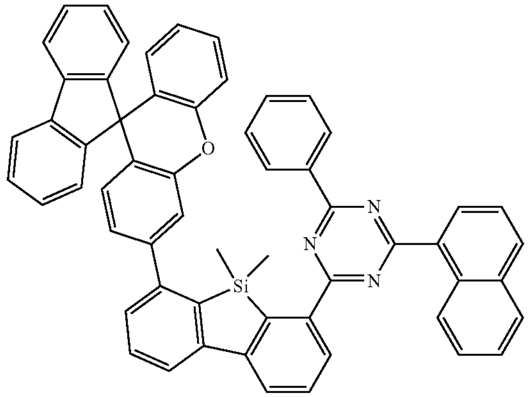
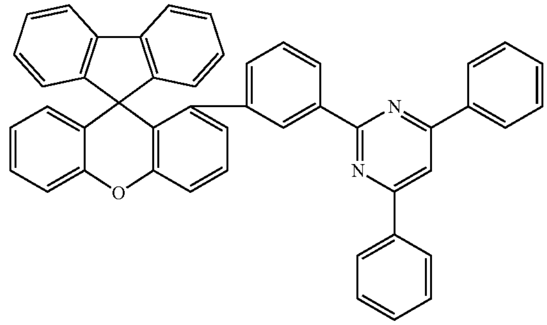
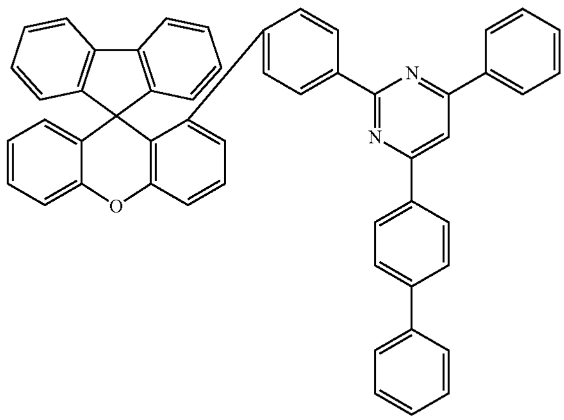
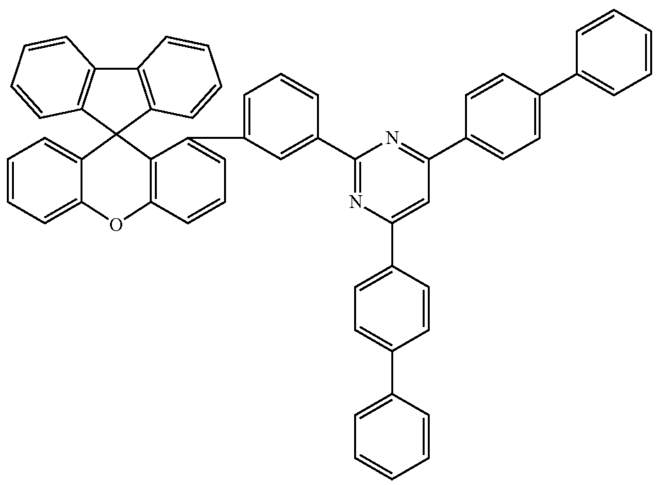
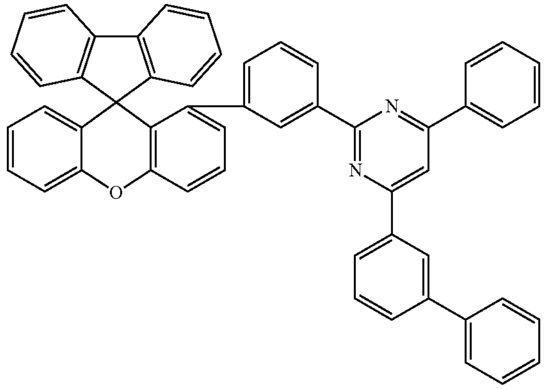
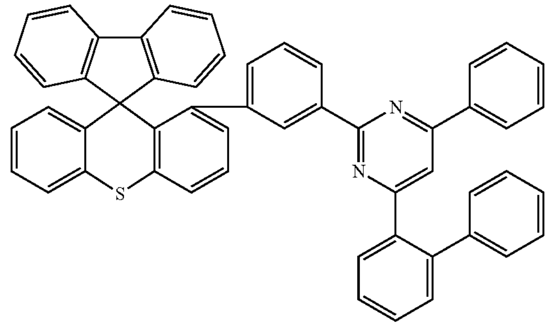

-continued
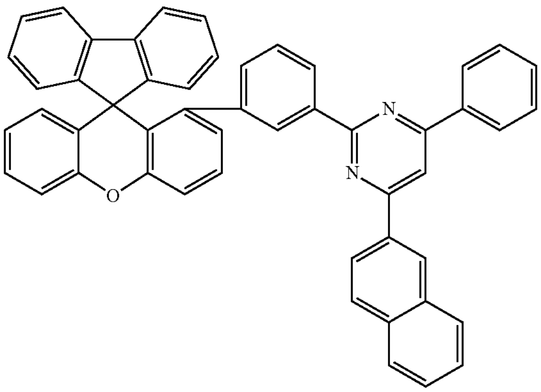
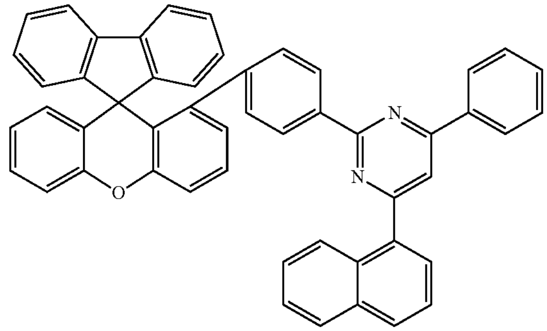
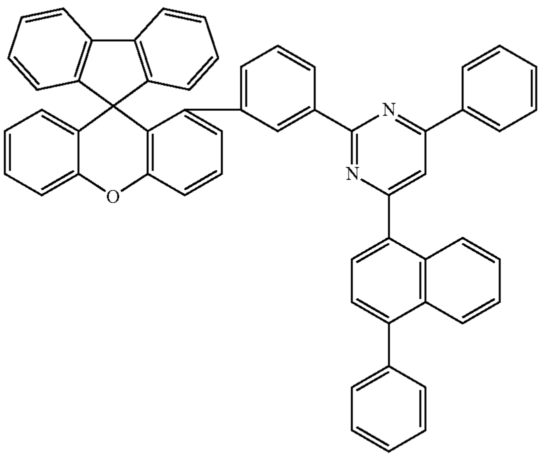
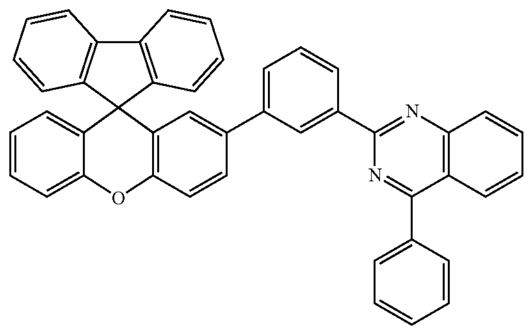
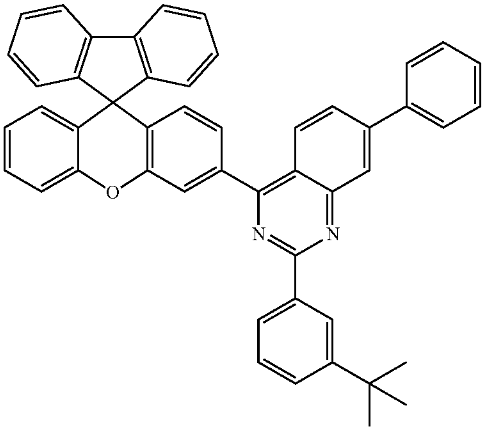
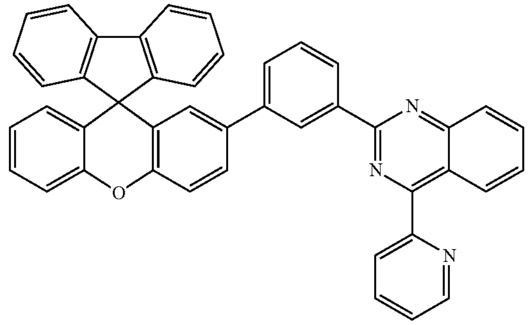

-continued
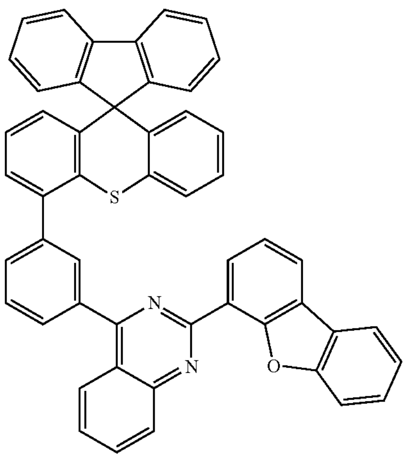
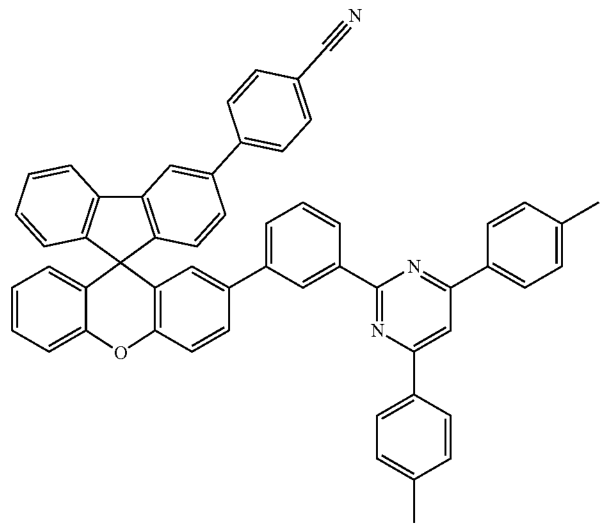
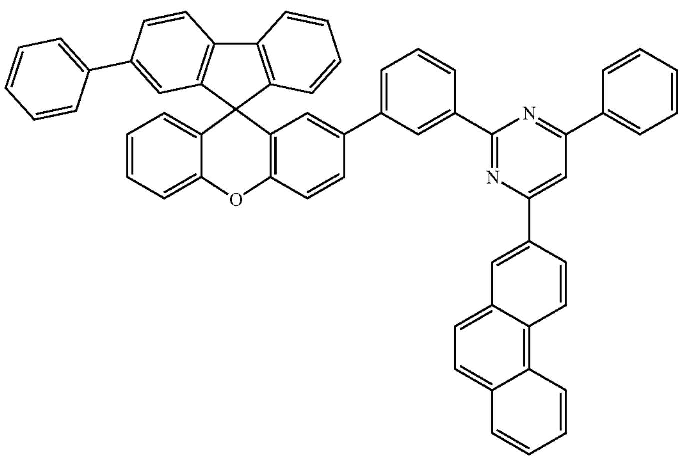
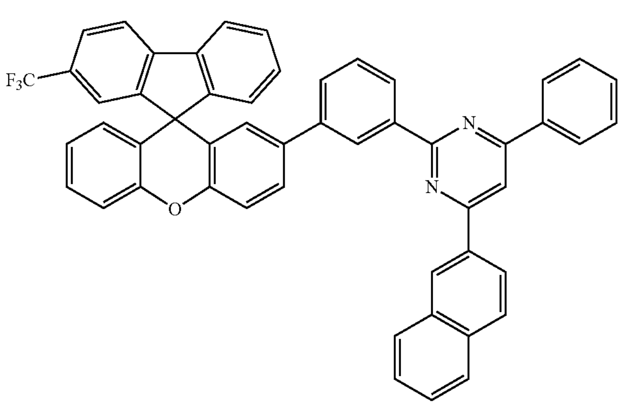

-continued
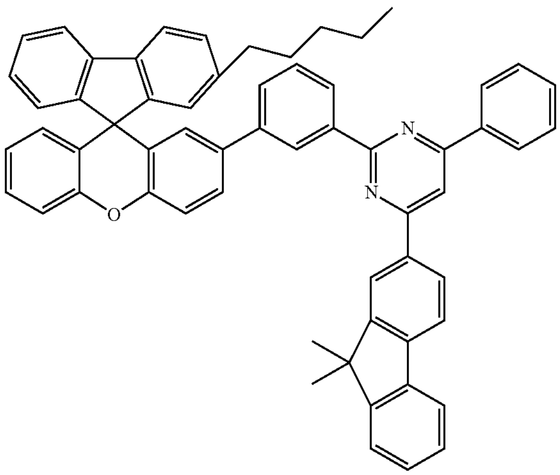
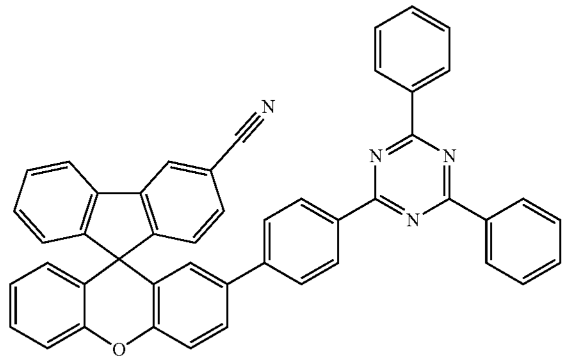
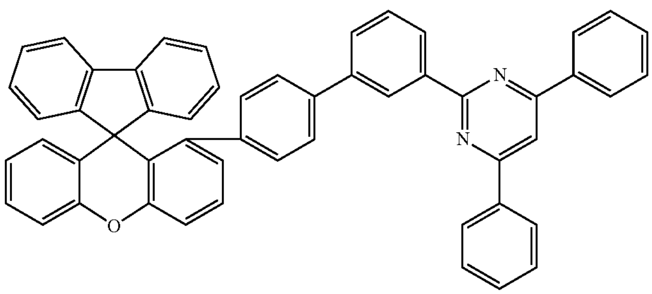
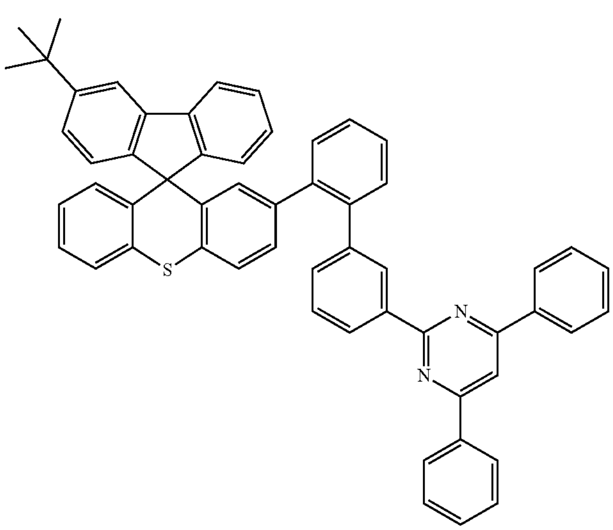

-continued
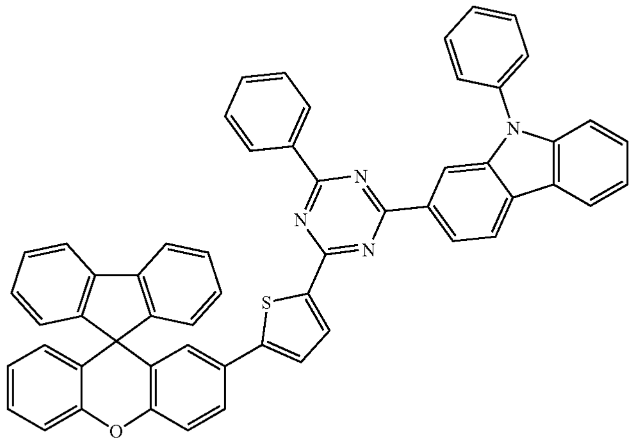
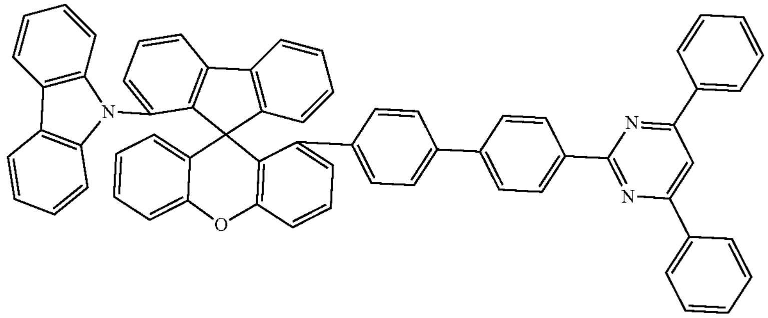
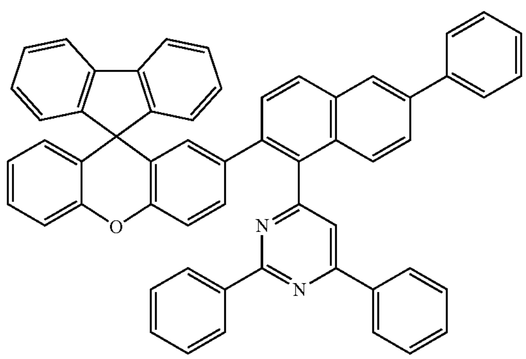
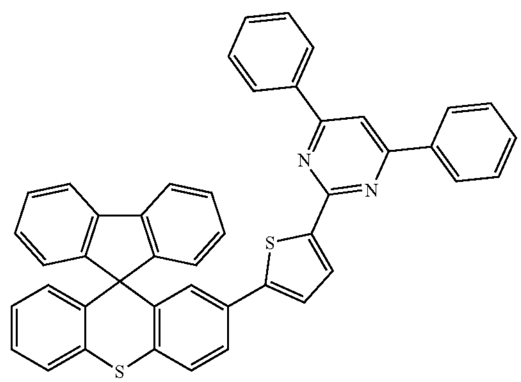
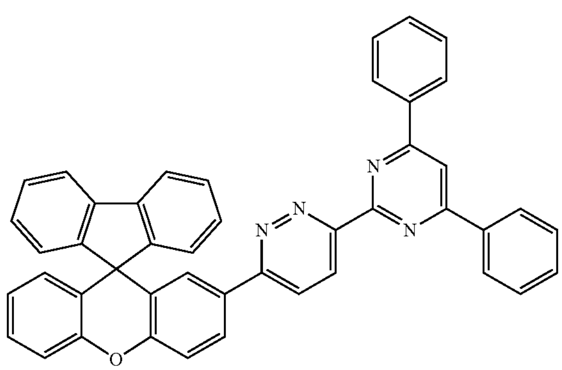
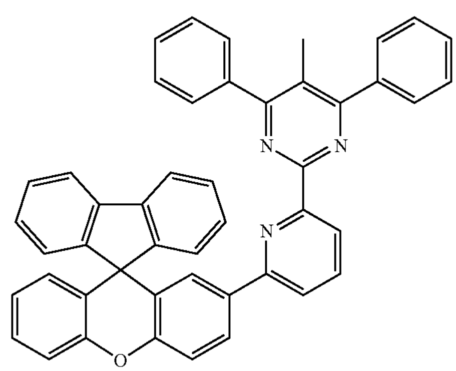

-continued
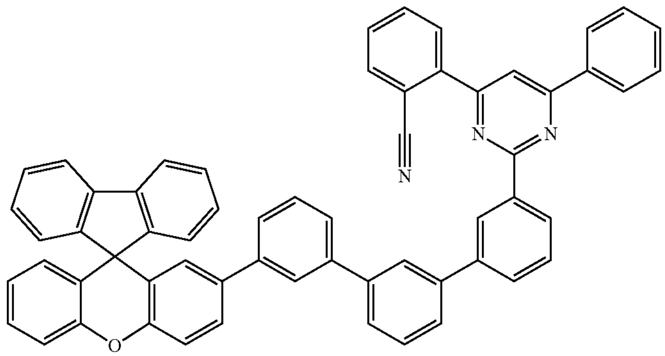
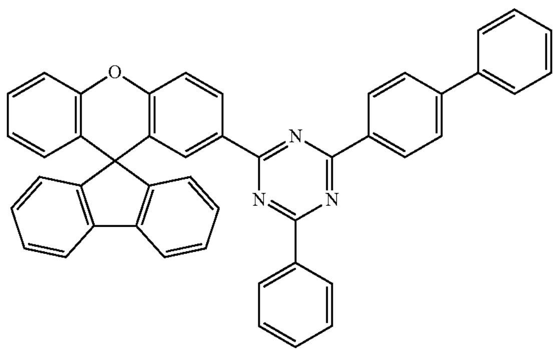
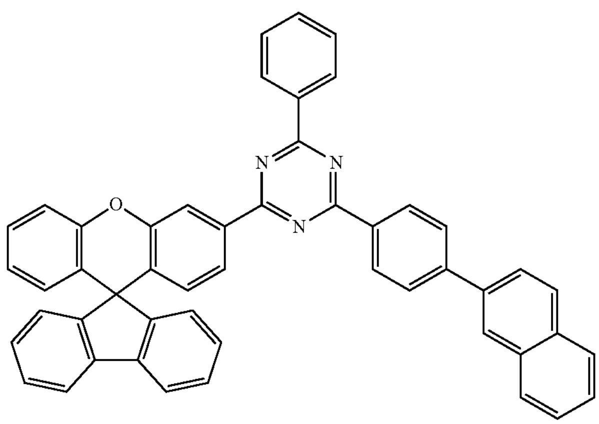
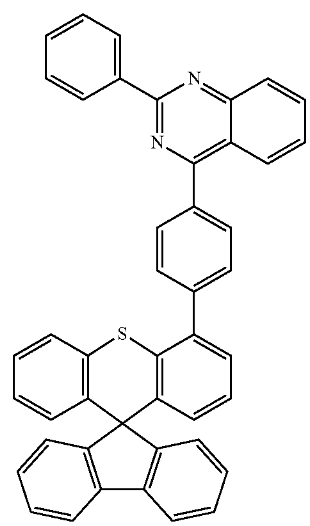
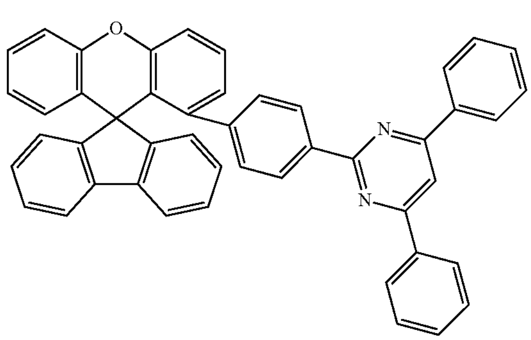
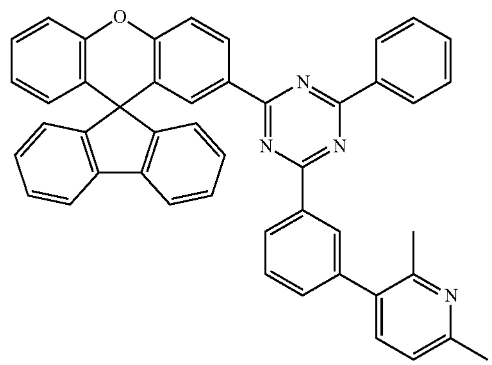

-continued
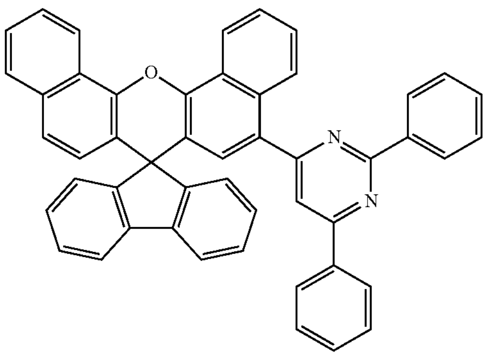
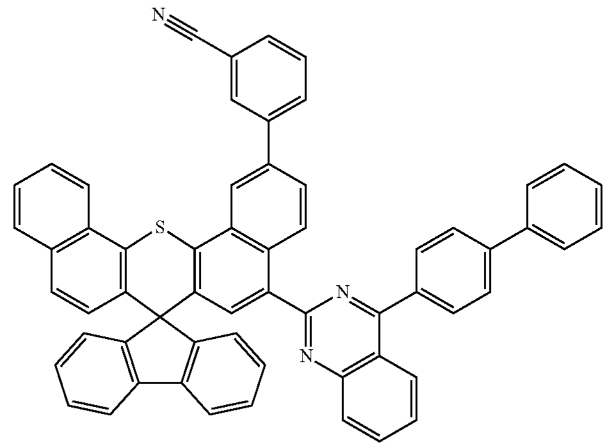
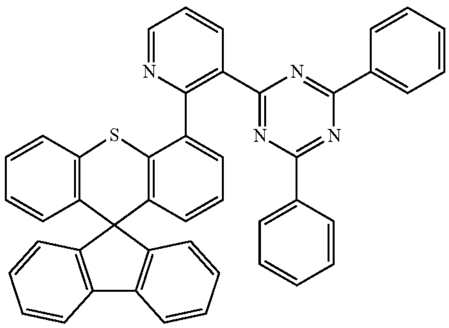
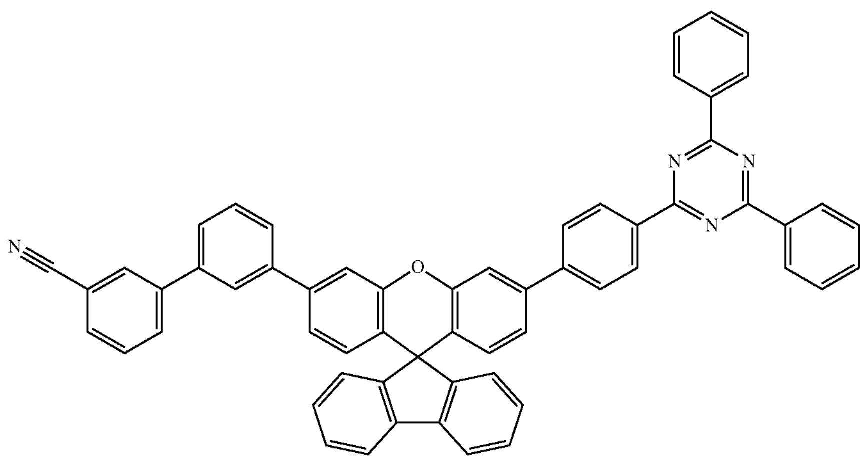
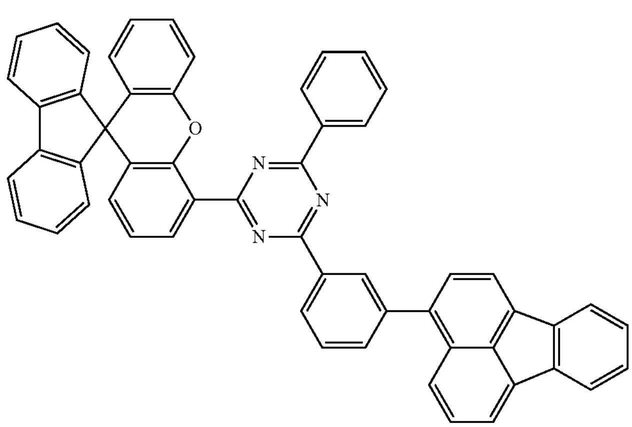

-continued
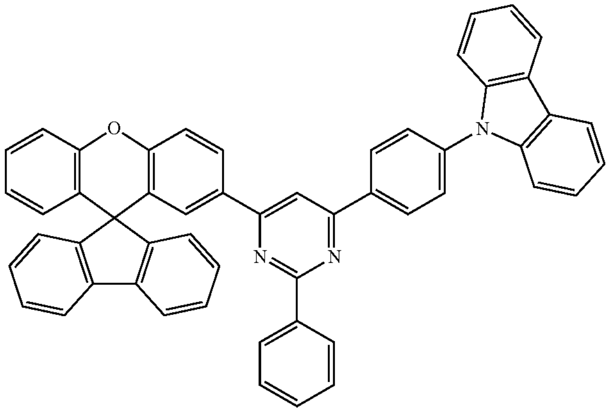
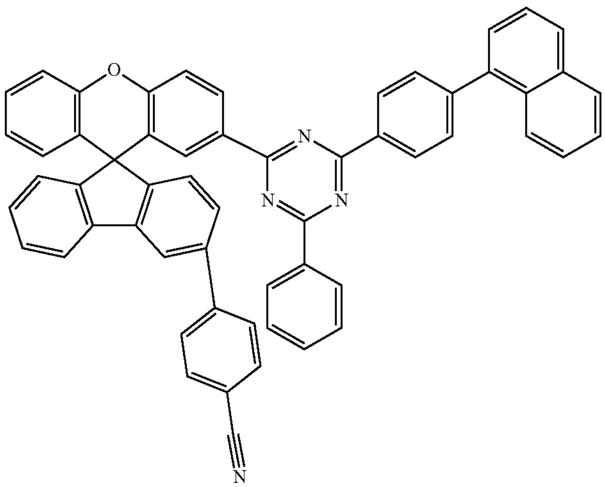
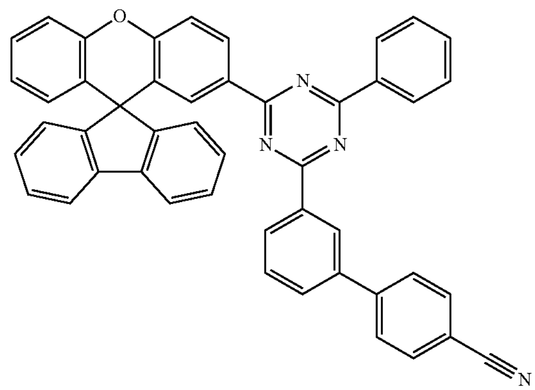
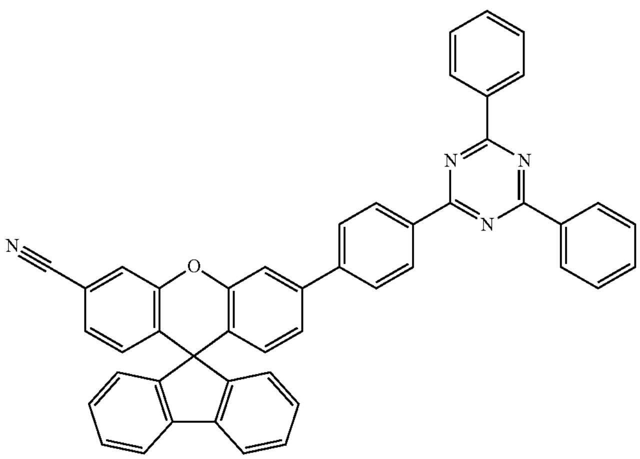
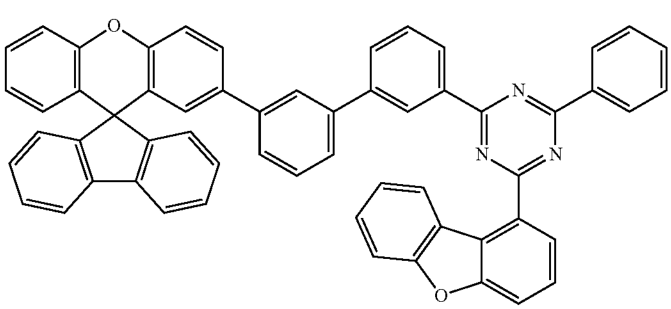

-continued
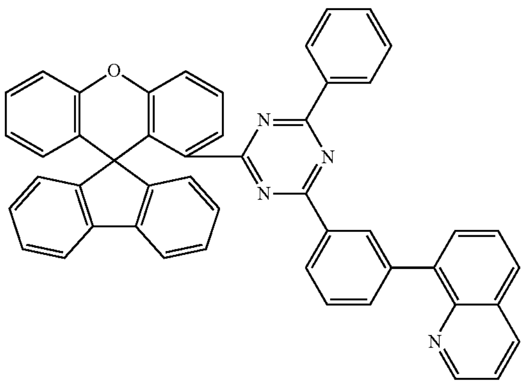
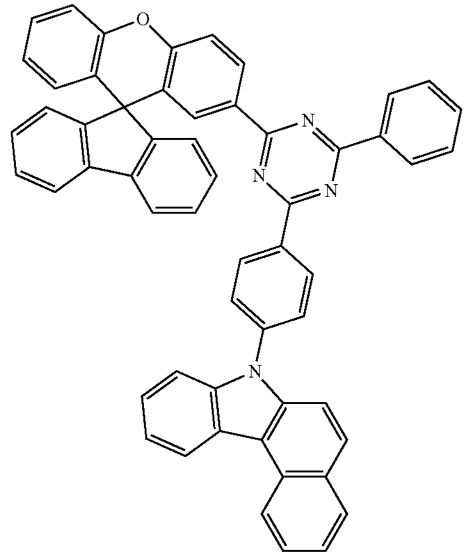
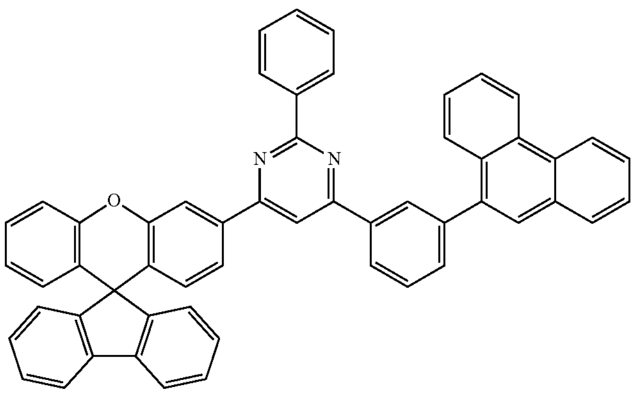
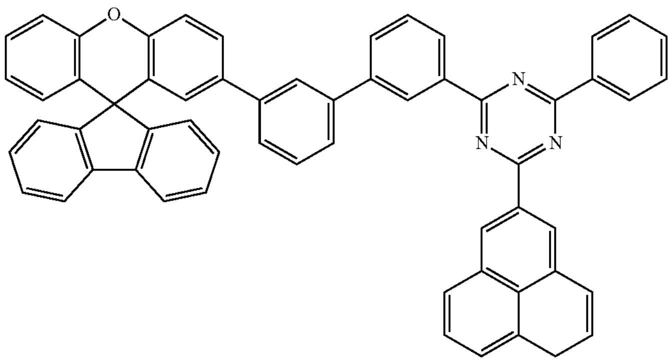
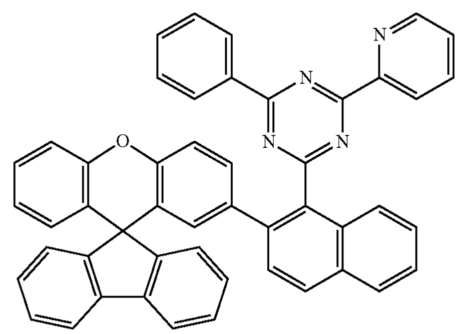
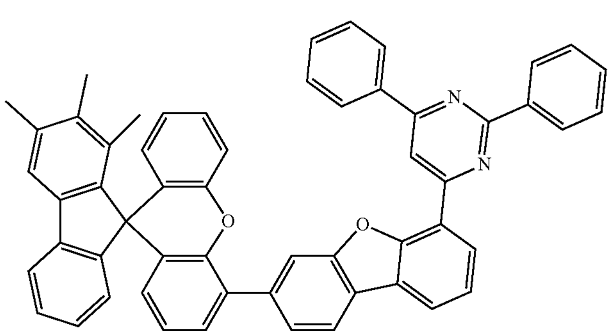

-continued

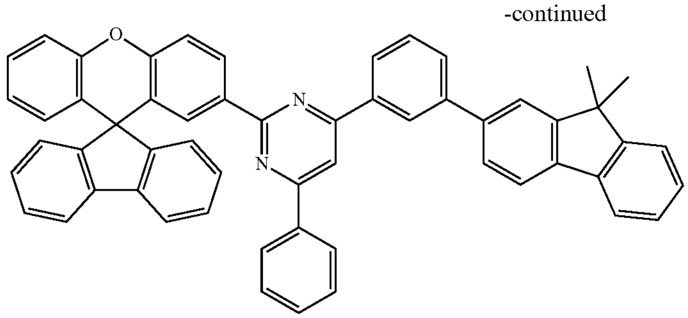

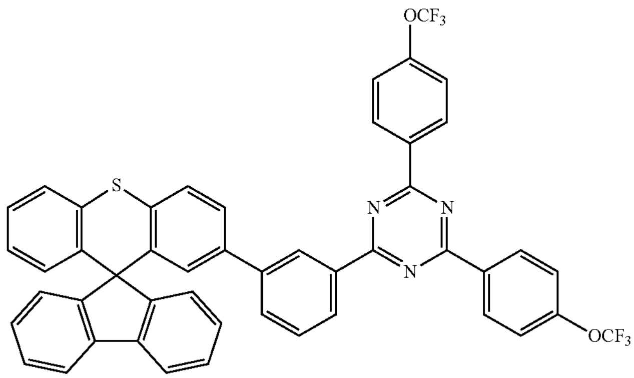

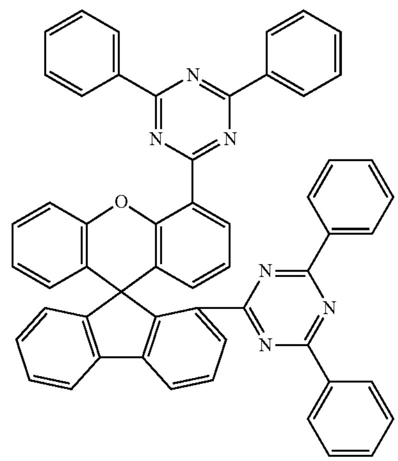

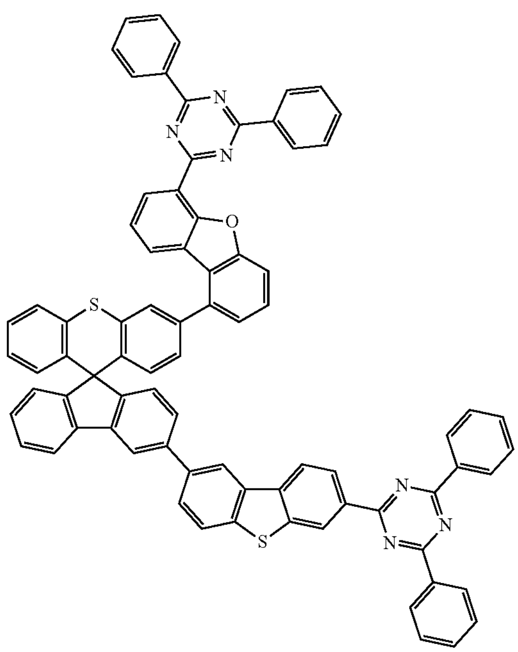

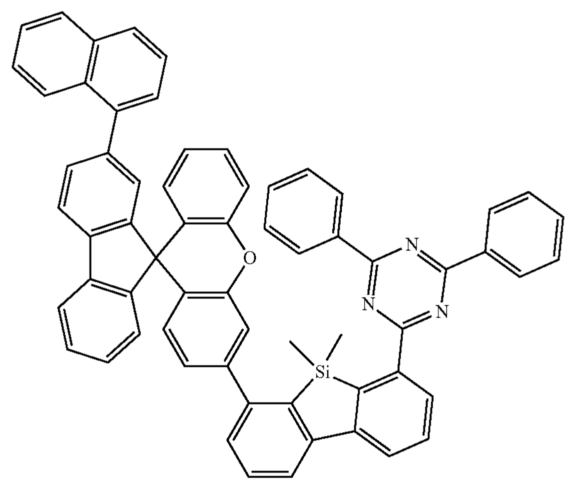

The present specification provides an organic light emitting device including: a positive electrode; a negative electrode; and a first organic material layer and a second organic material layer provided between the positive electrode and the negative electrode, in which the first organic material layer includes a compound of Formula 1 and the second organic material layer includes a compound of Formula 2.

The organic light emitting device according to the present specification can include an additional organic material layer in addition to the first organic material layer and the second organic material layer.

When one member is disposed "on" another member in the present specification, this includes not only a case where the one member is brought into contact with another member, but also a case where still another member is present between the two members.

In the present specification, the 'layer' has a meaning compatible with a 'film' usually used in the art, and means a coating covering a target region. The size of the 'layer' is not limited, and the sizes of the respective 'layers' can be the same as or different from one another. In an exemplary embodiment, the size of the 'layer' can be the same as that of the entire device, can correspond to the size of a specific functional region, and can also be as small as a single sub-pixel.

In the present specification, the meaning that a specific A material is included in a B layer includes both i) the fact that one or more A materials are included in one B layer and ii) the fact that the B layer is composed of one or more layers, and the A material is included in one or more layers of the multi-layered B layers.

In the present specification, the meaning that a specific A material is included in a C layer or a D layer includes all of i) the fact that the A material is included in one or more layers of the C layer having one or more layers, ii) the fact that the A material is included in one or more layers of the D layer having one or more layers, and iii) the fact that the A material is included in each of the C layer having one or more layers and the D layer having one or more layers.

The organic material layer of the organic light emitting device of the present specification can also be composed of a single-layered structure, but can be composed of a multi-layered structure in which an organic material layer having two or more layers is stacked. For example, the organic light emitting device can have a structure including a hole injection layer, a hole transport layer, a light emitting layer, an electron transport layer, an electron injection layer, an electron blocking layer, a hole blocking layer, and the like. However, the structure of the organic light emitting device is not limited thereto, and can include a greater or fewer number of organic material layers.

In an exemplary embodiment of the present specification, the compound of Formula 1 is included in the first organic material layer.

In an exemplary embodiment of the present specification, the first organic material layer includes a hole injection layer, a hole transport layer, a hole adjusting layer, an electron blocking layer, a layer which simultaneously transports and injects holes, or a light emitting layer.

In an exemplary embodiment of the present specification, the first organic material layer is a light emitting layer.

In an exemplary embodiment of the present specification, the compound of Formula 1 is included in an amount of 50 parts by weight or more and less than 100 parts by weight based on 100 parts by weight of the total weight of the first organic material layer. More preferably, the compound of Formula 1 is included in an amount of 70 parts by weight or more and 99 parts by weight or less based on 100 parts by weight of the total weight of the first organic material layer.

In an exemplary embodiment of the present specification, the light emitting layer includes the compound of Formula 1 as a host of the light emitting layer.

In an exemplary embodiment of the present specification, the light emitting layer includes the compound of Formula 1, and the light emitting layer including the compound of Formula 1 takes on a blue color.

In an exemplary embodiment of the present specification, the light emitting layer including the compound of Formula 1 can include a dopant. The dopant can be a fluorescent dopant or a phosphorescent dopant, and a fluorescent dopant is preferred. In this case, the dopant in the light emitting layer can be included in an amount of 0.1 part by weight to 50 parts by weight, and preferably 1 part by weight to 30 parts by weight, based on 100 parts by weight of the host. When the dopant satisfies the above range, energy transfer from the host to the dopant occurs efficiently.

In an exemplary embodiment of the present specification, the light emitting layer including the compound of Formula 1 further includes a fluorescent dopant.

In the present invention, the fluorescent dopant can be an aromatic amine derivative or a boron polycyclic compound, and any one of the following structures can be used, but the fluorescent dopant is not limited thereto:

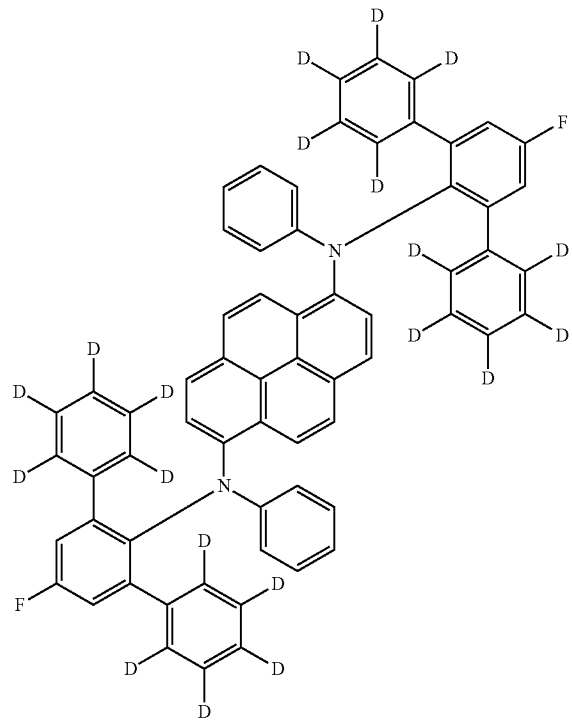

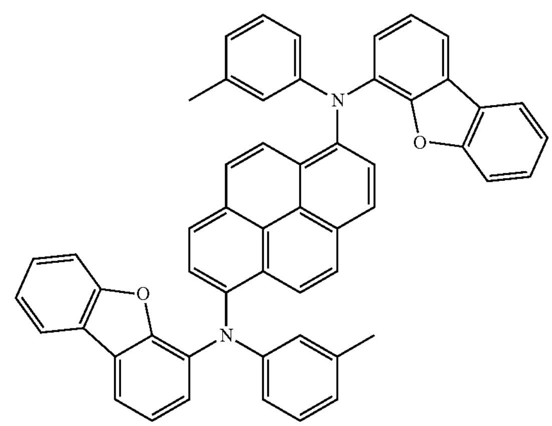

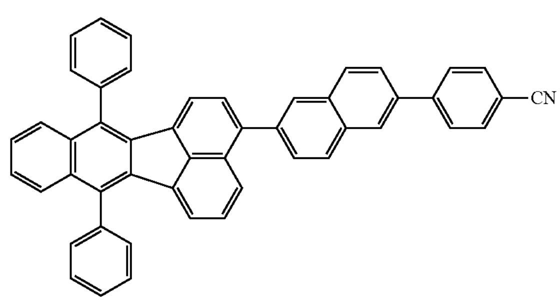

-continued
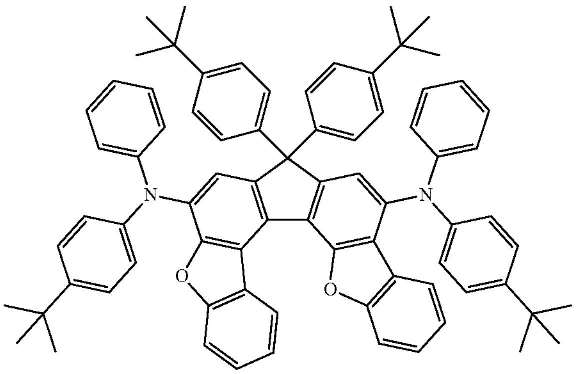
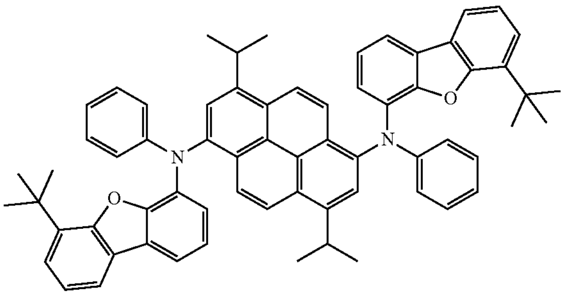
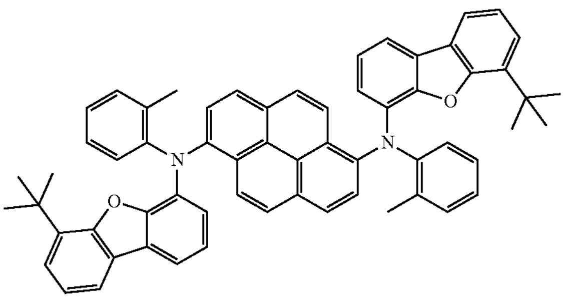
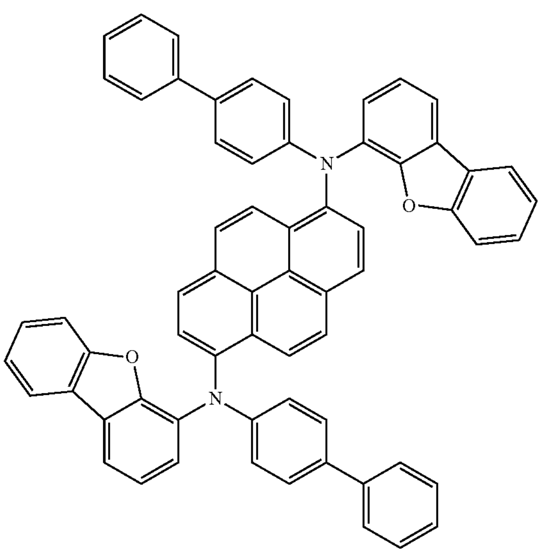
-continued
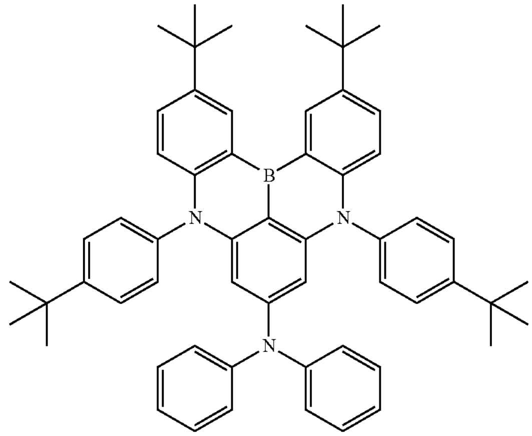
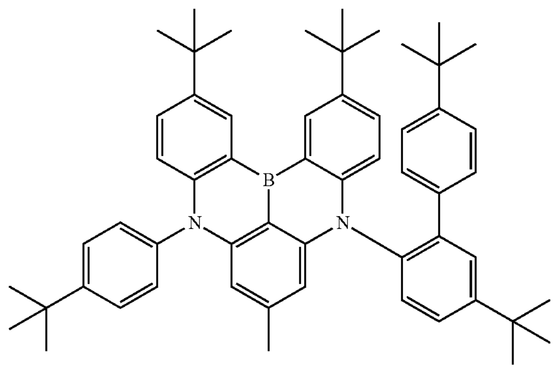
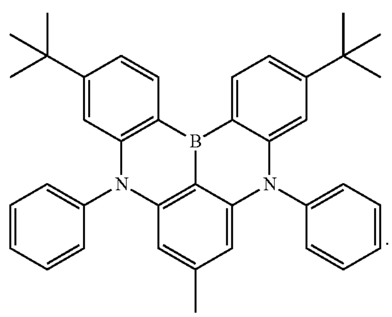
In the present invention, an Ir complex can be used as the phosphorescent dopant, and as an example thereof, any one of the following structures can be used, but the phosphorescent dopant is not limited thereto:
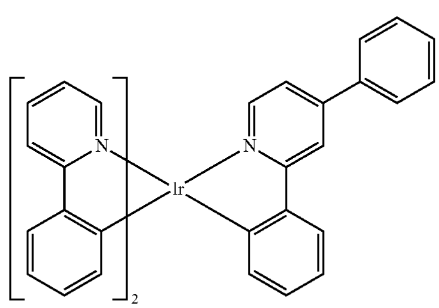

-continued
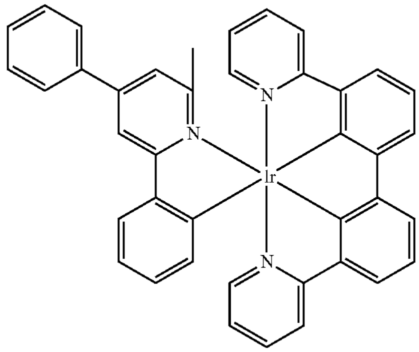
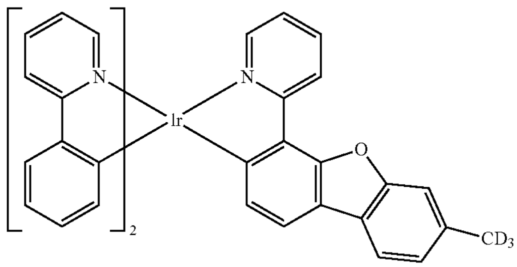
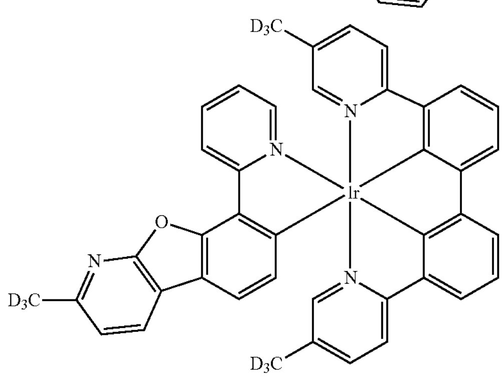
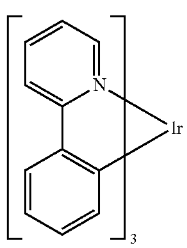
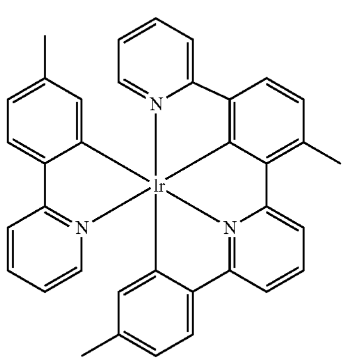
-continued
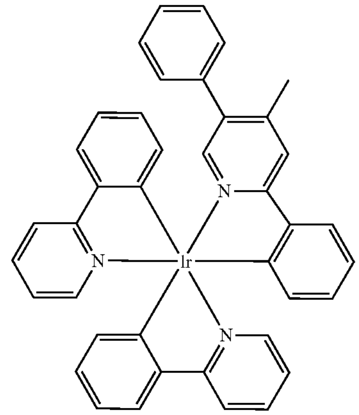
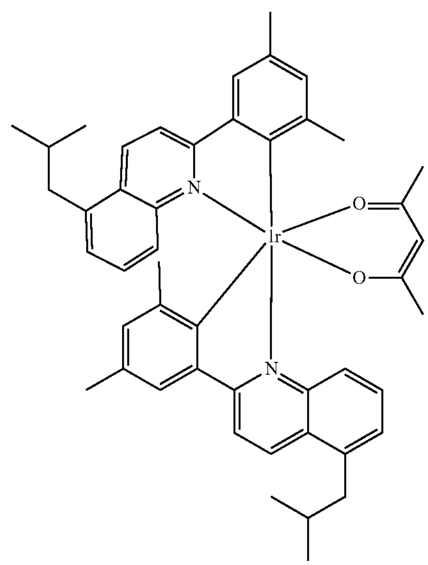
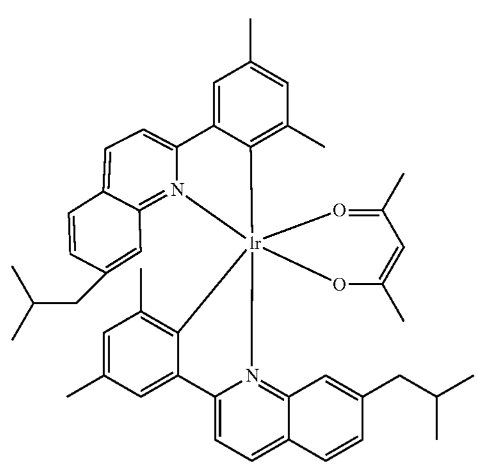

-continued

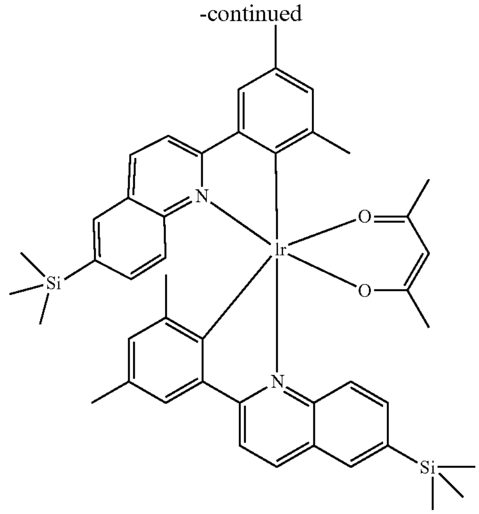

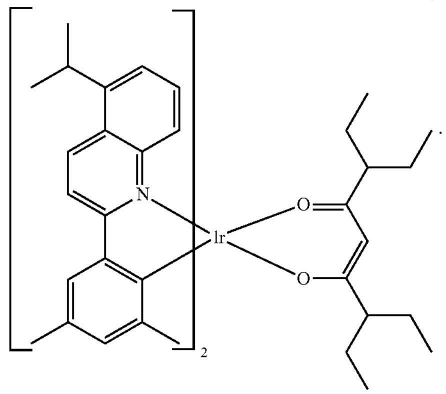

In an exemplary embodiment of the present specification, the organic light emitting device further includes one or more light emitting layers in addition to a light emitting layer including the compound of Formula 1. The one or more light emitting layers can each include the fluorescent dopant or phosphorescent dopant described above.

According to an exemplary embodiment of the present specification, the organic light emitting device includes a light emitting layer having two or more layers, and one layer of the light emitting layer having two or more layers includes a fluorescent dopant, and the other layer includes a phosphorescent dopant.

According to an exemplary embodiment of the present invention, the organic light emitting device includes a light emitting layer including the compound of Formula 1, and the maximum light emission peak of the light emitting layer is 400 nm to 500 nm.

In an exemplary embodiment of the present specification, the organic light emitting device can include a light emitting layer having two or more layers.

In an exemplary embodiment of the present specification, the maximum light emission peaks of the respective light emitting layers are different from each other. Specifically, the organic light emitting device further includes one or more light emitting layers in which the maximum light emission peak appears in a wavelength band different from a wavelength band in which the maximum light emission peak of the light emitting layer including one or more of the compound of Formula 1 appears.

The maximum light emission peak of the light emitting layer including the compound of Formula 1 is 400 nm to 500 nm, and the maximum light emission peak of another light emitting layer can exhibit a maximum light emission peak of 510 nm to 580 nm; or 610 nm to 680 nm.

In an exemplary embodiment of the present specification, a light emitting layer other than the light emitting layer including one or more of the compound of Formula 1 includes a phosphorescent dopant. Specifically, one or more light emitting layers in which the maximum light emission peak appears in a wavelength band different from a wavelength band in which the maximum light emission peak of the light emitting layer including one or more of the compound of Formula 1 appears include a phosphorescent dopant.

In an exemplary embodiment of the present specification, one light emitting layer takes on a blue color, and another light emitting layer can include a blue, red, or green light emitting compound known in the art.

According to an exemplary embodiment of the present invention, the organic light emitting device includes a light emitting layer having two or more layers, and one layer of the light emitting layer includes a fluorescent dopant, and the other layer of the light emitting layer includes a phosphorescent dopant.

Further, when the organic light emitting device of the present invention includes a light emitting layers having two or more layer, the organic light emitting device can be in a state where the two or more light emitting layers are sequentially and vertically stacked, and can be in a state where the two or more light emitting layers are horizontally arranged in parallel.

In an exemplary embodiment of the present specification, the organic light emitting device includes a light emitting layer having three or more layers. In an exemplary embodiment, the organic light emitting device can be in a state where the three or more light emitting layers are sequentially stacked, and in all the three or more light emitting layers, the maximum light emission peak can appear in the same wavelength band. In this case, the maximum light emission peak is within 400 nm to 500 nm, which is a blue region.

In an exemplary embodiment of the present specification, the compound of Formula 2 is included in the second organic material layer.

In an exemplary embodiment of the present specification, the compound of Formula 2 is included in a hole blocking layer, an electron adjusting layer, an electron transport layer, an electron injection layer, or a layer which simultaneously transports and injects electrons.

In an exemplary embodiment of the present specification, the second organic material layer includes a hole blocking layer, an electron adjusting layer, an electron transport layer, an electron injection layer, or a layer which simultaneously transports and injects electrons.

In an exemplary embodiment of the present specification, the second organic material layer includes an electron transport layer or a layer which simultaneously transports and injects electrons.

In an exemplary embodiment of the present specification, the first organic material layer and the second organic material layer are provided to be brought into contact with each other.

In an exemplary embodiment of the present specification, a first organic material layer is provided between the positive electrode and the negative electrode. In another exemplary embodiment, the second organic material layer is provided between the first organic material layer and the negative electrode.

In an exemplary embodiment of the present specification, the second organic material layer is provided to be brought into contact with the negative electrode.

In an exemplary embodiment of the present specification, the organic light emitting device further comprises an electron transport region between the second organic material layer and the first organic material layer.

In an exemplary embodiment of the present specification, the second organic material layer further includes one n-type dopant or two or more n-type dopants selected from alkali metals and alkaline earth metals in addition to the compound of Formula 2.

When the organic alkali metal compound or the organic alkaline earth metal compound is used as an n-type dopant, the stability for holes can be secured from the light emitting layer, so that the service life of the organic light emitting device can be improved. In addition, for the electron mobility of the electron transport layer, the balance of holes and electrons in the light emitting layer can be maximized by controlling the ratio of the organic alkali metal compound or the organic alkaline earth metal compound, thereby increasing the light emitting efficiency.

In the present specification, as the n-type dopant used in the second organic material layer, LiQ is further preferred. The second organic material layer can include a heterocyclic compound as Formula 2 and the n-type dopant at a weight ratio of 1:9 to 9:1. Preferably, the second organic material layer can include the heterocyclic compound of Formula 2 and the n-type dopant at a weight ratio of 2:8 to 8:2, and more preferably at a weight ratio of 3:7 to 7:3.

In an exemplary embodiment of the present specification, the negative electrode has a multi-layered structure of metals or metal alloys.

In an exemplary embodiment, the organic light emitting device of the present specification can be manufactured by sequentially stacking a first electrode, an organic material layer, and a second electrode on a substrate.

In an exemplary embodiment of the present specification, the first electrode is a positive electrode, and the second electrode is a negative electrode. In another exemplary embodiment, the first electrode is a negative electrode, and the second electrode is a positive electrode.

In an exemplary embodiment of the present specification, the organic light emitting device can be a normal type organic light emitting device in which a positive electrode, one or more organic material layers, and a negative electrode are sequentially stacked on a substrate.

In an exemplary embodiment of the present specification, the organic light emitting device can be an inverted type organic light emitting device in which a negative electrode, one or more organic material layers, and a positive electrode are sequentially stacked on a substrate.

FIGS. 1 to 4 illustrate the stacking structure of the organic light emitting device of the present invention.

FIG. 1 illustrates an organic light emitting device in which a substrate 0, a negative electrode 1, a second organic material layer 202, a first organic material layer 201, and a positive electrode 4 are sequentially and vertically stacked. In an exemplary embodiment of the present specification, the compound of Formula 1 is included in the first organic material layer 201, and the compound of Formula 2 is included in the second organic material layer 202.

FIGS. 2 to 4 each illustrate the stacking structure of the organic light emitting device of the present invention including two or more light emitting layers.

FIG. 2 illustrates an organic light emitting device in which a substrate 0, a negative electrode 1, an electron transport layer 2, a hole blocking layer or electron adjusting layer 7, a first light emitting layer 11, an organic material layer 5, a second light emitting layer 12, a hole transport layer 3, and a positive electrode 4 are sequentially and vertically stacked. In an exemplary embodiment of the present specification, the compound of Formula 1 is included in the organic material layer 5 or the hole transport layer 3. In an exemplary embodiment, the compound of Formula 2 is included in the electron transport layer 2, the hole blocking layer or electron adjusting layer 7, or the organic material layer 5.

FIG. 3 illustrates an organic light emitting device in which a substrate 0, a negative electrode 1, an electron transport layer 2, a hole blocking layer or electron adjusting layer 7, a first light emitting layer 11, an organic material layer 5, a second light emitting layer 12, an organic material layer 6, a third light emitting layer 13, a hole transport layer 3, and a positive electrode 4 are sequentially and vertically stacked. In an exemplary embodiment of the present specification, the compound of Formula 1 is included in the organic material layer 5, the organic material layer 6, or the hole transport layer 3.

FIG. 4 illustrates an organic light emitting device in which a substrate 0, a negative electrode 1, an electron transport layer 2, a hole blocking layer or electron adjusting layer 7, a light emitting layer 101, a hole transport layer 3, and a positive electrode 4 are sequentially stacked, and in the light emitting layer 101, a first light emitting layer 11 and a second light emitting layer 12 are horizontally arranged in parallel. In an exemplary embodiment of the present specification, the compound of Formula 1 is included in the hole transport layer 3. In an exemplary embodiment, the compound of Formula 2 is included in the electron transport layer 2 or the hole blocking layer or electron adjusting layer 7.

In an exemplary embodiment, the compound of Formula 2 is included in the electron transport layer 2, the hole blocking layer or electron adjusting layer 7, the organic material layer 5, or the organic material layer 6. In an exemplary embodiment of the present invention, the first light emitting layer 11, the second light emitting layer 12, and the third light emitting layer 13 have the same light emitting color. In an exemplary embodiment of the present invention, the first light emitting layer 11, the second light emitting layer 12, and the third light emitting layer 13 have a blue color.

As in FIGS. 2 and 3, when a plurality of light emitting layers are stacked, an organic material layer provided between the plurality of light emitting layers can be an intermediate layer. The intermediate layer is generally also called an intermediate electrode, an intermediate conductive layer, a charge generation layer, an electron withdrawing layer, a connecting layer, and an intermediate insulating layer, and a publicly known material configuration can be used as long as the intermediate layer is a layer having a function of supplying electrons to a layer adjacent to the positive electrode side and holes to a layer adjacent to the negative electrode side. In an exemplary embodiment of the present invention, the organic material layer 5 located between the first light emitting layer and the second light emitting layer is a charge generation layer or an intermediate insulating layer. In an exemplary embodiment of the present invention, the organic material layer 6 located between the second light emitting layer and the third light emitting layer is a charge generation layer or an intermediate insulating layer.

However, the structure of the organic light emitting device according to an exemplary embodiment of the present specification is not limited to those of FIGS. 1 and 4, and can be any one of the following structures:

(1) Positive electrode/Hole transport layer/Light emitting layer/Negative electrode
(2) Positive electrode/Hole injection layer/Hole transport layer/Light emitting layer/Negative electrode
(3) Positive electrode/Hole transport layer/Light emitting layer/Electron transport layer/Negative electrode
(4) Positive electrode/Hole transport layer/Light emitting layer/Electron transport layer/Electron injection layer/Negative electrode
(5) Positive electrode/Hole injection layer/Hole transport layer/Light emitting layer/Electron transport layer/Negative electrode
(6) Positive electrode/Hole injection layer/Hole transport layer/Light emitting layer/Electron transport layer/Electron injection layer/Negative electrode
(7) Positive electrode/Hole transport layer/Hole adjusting layer/Light emitting layer/Electron transport layer/Negative electrode
(8) Positive electrode/Hole transport layer/Hole adjusting layer/Light emitting layer/Electron transport layer/Electron injection layer/Negative electrode
(9) Positive electrode/Hole injection layer/Hole transport layer/Hole adjusting layer/Light emitting layer/Electron transport layer/Negative electrode
(10) Positive electrode/Hole injection layer/Hole transport layer/Hole adjusting layer/Light emitting layer/Electron transport layer/Electron injection layer/Negative electrode
(11) Positive electrode/Hole transport layer/Light emitting layer/Electron adjusting layer/Electron transport layer/Negative electrode
(12) Positive electrode/Hole transport layer/Light emitting layer/Electron adjusting layer/Electron transport layer/Electron injection layer/Negative electrode
(13) Positive electrode/Hole injection layer/Hole transport layer/Light emitting layer/Electron adjusting layer/Electron transport layer/Negative electrode
(14) Positive electrode/Hole injection layer/Hole transport layer/First light emitting layer/Intermediate layer/Second light emitting layer/Electron transport layer/Electron injection layer/Negative electrode
(15) Positive electrode/Hole injection layer/Hole transport layer/First light emitting layer/Intermediate layer/Second light emitting layer/Intermediate layer/Third light emitting layer/Electron transport layer/Electron injection layer/Negative electrode.

In an exemplary embodiment of the present invention, the first organic material layer is a light emitting layer, a first light emitting layer, a second light emitting layer, or a third light emitting layer.

When the organic light emitting device includes a plurality of organic material layers, the organic material layers can be formed of the same material or different materials.

The organic material layer of the organic light emitting device can be formed by various methods.

In an exemplary embodiment, the organic light emitting device can be manufactured by depositing a metal or a metal oxide having conductivity, or an alloy thereof on a substrate to form a positive electrode, forming an organic material layer including a hole injection layer, a hole transport layer, a light emitting layer, and an electron transport layer thereon, and then depositing a material, which can be used as a negative electrode, thereon.

In other exemplary embodiments, the organic light emitting device can also be made by sequentially depositing a negative electrode material, an organic material layer, and a positive electrode material on a substrate (International Patent Application Laid-Open Publication No. WO2003/012890). However, the manufacturing method is not limited thereto.

Each organic material layer can be formed by any commonly used deposition technique, for example, vapor deposition, liquid deposition (continuous and discontinuous techniques), and thermal transfer. The continuous deposition technique includes spin coating, gravure coating, curtain coating, dip coating, slot-die coating, spray coating, and continuous nozzle coating, but is not limited thereto. The discontinuous deposition technique includes ink jet printing, gravure printing, and screen printing, but is not limited thereto.

In an exemplary embodiment of the present specification, the first organic material layer and the second organic material layer can be formed using a physical vapor deposition (PVD) method such as deposition, sputtering, or e-beam evaporation.

According to another exemplary embodiment, the first organic material layer and the second organic material layer can be formed as an organic material layer by a solution application method. Here, the solution application method means spin coating, dip coating, doctor blading, inkjet printing, screen printing, a spray method, roll coating, and the like, but is not limited thereto.

In an exemplary embodiment of the present specification, other layers in the organic light emitting device can be manufactured using any publicly known material as long as the material is useful for each layer. Hereinafter, a preferred material that can be used for the organic material layer will be exemplified, but is not limited thereto.

As the positive electrode material, materials having a high work function are usually preferred so as to facilitate the injection of holes into an organic material layer. Examples thereof include: a metal, such as vanadium, chromium, copper, zinc, and gold, or an alloy thereof; a metal oxide, such as zinc oxide, indium oxide, indium tin oxide (ITO), and indium zinc oxide (IZO); a combination of a metal and an oxide, such as Zno:Al or $SnO_2$:Sb; a conductive polymer, such as poly(3-methylthiophene), poly[3,4-(ethylene-1,2-dioxy)thiophene] (PEDOT), polypyrrole, and polyaniline; and the like, but are not limited thereto.

As the negative electrode material, materials having a low work function are usually preferred so as to facilitate the injection of electrons into an organic material layer. Examples thereof include: a metal, such as magnesium, calcium, sodium, potassium, titanium, indium, yttrium, lithium, gadolinium, aluminum, silver, tin, and lead, or an alloy thereof; a multi-layered structural material, such as LiF/Al or $LiO_2$/Al; and the like, but are not limited thereto.

The light emitting layer can include a host material and a dopant material. Examples of the host material include a fused aromatic ring derivative, or a hetero ring-containing compound, and the like. Specific examples of the fused aromatic ring derivative include an anthracene derivative, a pyrene derivative, a naphthalene derivative, a pentacene derivative, a phenanthrene compound, a fluoranthene compound, and the like, and specific examples of the hetero ring-containing compound include a dibenzofuran derivative, a ladder-type furan compound, a pyrimidine derivative, and the like, but the examples are not limited thereto.

Examples of the dopant material include an aromatic amine derivative, a styrylamine compound, a boron complex, a fluoranthene compound, a metal complex, and the like. Specifically, the aromatic amine derivative is a fused aromatic ring derivative having a substituted or unsubstituted arylamine group, and examples thereof include pyrene, anthracene, chrysene, periflanthene, and the like having an arylamine group. Further, the styrylamine compound is a compound in which a substituted or unsubstituted arylamine is substituted with at least one arylvinyl group, and is unsubstituted or substituted with one or two or more substituents selected from the group consisting of an aryl group, a silyl group, an alkyl group, a cycloalkyl group, and an arylamine group. Specific examples thereof include styrylamine, styryldiamine, styryltriamine, styryltetramine, and the like, but are not limited thereto. Further, examples of the metal complex include an iridium complex, a platinum complex, and the like, but are not limited thereto.

The hole injection layer is a layer which accepts holes from an electrode. A hole injection material has an ability to transport holes, so that it is preferred that the hole injection material has an effect of accepting holes from a positive electrode and an excellent hole injection effect for a light emitting layer or a light emitting material. Further, the hole injection material is preferably a material which is excellent in ability to prevent excitons produced from a light emitting layer from moving to an electron injection layer or an electron injection material. In addition, the hole injection material is preferably a material which is excellent in ability to form a thin film. In addition, the highest occupied molecular orbital (HOMO) of the hole injection material is preferably a value between the work function of the positive electrode material and the HOMO of the neighboring organic material layer. Specific examples of the hole injection material include: metal porphyrin, oligothiophene, and arylamine-based organic materials; hexanitrile hexaazatriphenylene-based organic materials; quinacridone-based organic materials; perylene-based organic materials; polythiophene-based conductive polymers such as anthraquinone and polyaniline; and the like, but are not limited thereto.

The hole transport layer is a layer which accepts holes from a hole injection layer and transports the holes to a light emitting layer. A hole transport material is preferably a material having high hole mobility which can accept holes from a positive electrode or a hole injection layer and transfer the holes to a light emitting layer. Specific examples thereof include an arylamine-based organic material, a conductive polymer, a block copolymer having both conjugated portions and non-conjugated portions, and the like, but are not limited thereto.

The electron transport layer is a layer which accepts electrons from an electron injection layer and transports the electrons to a light emitting layer. An electron transport material is preferably a material having high electron mobility which can proficiently accept electrons from a negative electrode and transfer the electrons to a light emitting layer. Specific examples thereof include: an Al complex of 8-hydroxyquinoline, a complex including Alq3, an organic radical compound, a hydroxyflavone-metal complex, and the like, but are not limited thereto. An electron transport layer can be used with any desired negative electrode material, as used according to the related art. In particular, an appropriate negative electrode material is a typical material which has a low work function, followed by an aluminum layer or a silver layer. Specific examples thereof include cesium, barium, calcium, ytterbium, and samarium, in each case followed by an aluminum layer or a silver layer.

The electron injection layer is a layer which accepts electrons from an electrode. It is preferred that an electron injection material is excellent in ability to transport electrons and has an effect of accepting electrons from the second electrode and an excellent electron injection effect for a light emitting layer or a light emitting material. Further, the electron injection material is preferably a material which prevents excitons produced from a light emitting layer from moving to a hole injection layer and is excellent in ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, metal complex compounds, nitrogen-containing 5-membered ring derivatives, and the like, but are not limited thereto.

Examples of the metal complex compounds include 8-hydroxyquinolinato lithium, bis(8-hydroxyquinolinato) zinc, bis(8-hydroxyquinolinato) copper, bis(8-hydroxyquinolinato) manganese, tris(8-hydroxyquinolinato) aluminum, tris(2-methyl-8-hydroxyquinolinato) aluminum, tris(8-hydroxy-quinolinato) gallium, bis(10-hydroxybenzo[h]quinolinato) beryllium, bis(10-hydroxybenzo[h]quinolinato) zinc, bis(2-methyl-8-quinolinato) chlorogallium, bis(2-methyl-8-quinolinato) (o-cresolato) gallium, bis(2-methyl-8-quinolinato) (1-naphtholato) aluminum, bis(2-methyl-8-quinolinato) (2-naphtholato) gallium, and the like, but are not limited thereto.

The electron blocking layer is a layer which can improve the service life and efficiency of a device by preventing electrons injected from an electron injection layer from passing through a light emitting layer and entering a hole injection layer. The publicly-known material can be used without limitation, and can be formed between a light emitting layer and a hole injection layer, or between a light emitting layer and a layer which simultaneously injects and transports holes.

The hole blocking layer is a layer which blocks holes from reaching a negative electrode, and can be generally formed under the same conditions as those of the hole injection layer. Specific examples thereof include an oxadiazole derivative or a triazole derivative, a phenanthroline derivative, an aluminum complex, and the like, but are not limited thereto.

The organic light emitting device according to the present specification can be a top emission type, a bottom emission type, or a dual emission type according to the materials to be used.

EXAMPLES

Hereinafter, the present specification will be described in detail with reference to Examples for specifically describing the present specification. However, the Examples according to the present specification can be modified in various forms, and it is not interpreted that the scope of the present application is limited to the Examples described in detail below. The Examples of the present application are provided to more completely explain the present specification to a person with ordinary skill in the art.

Synthesis Example 1

Synthesis Example 1-1

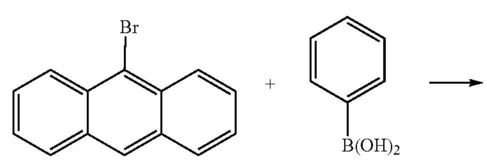

-continued

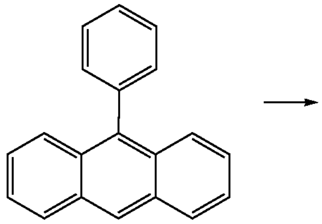

1-1A

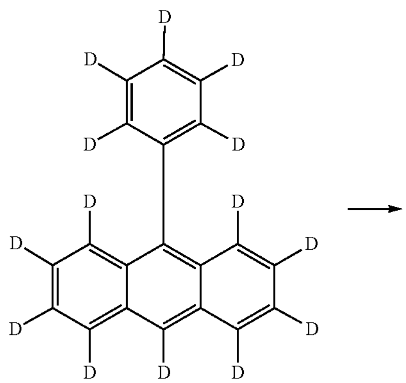

1-1B

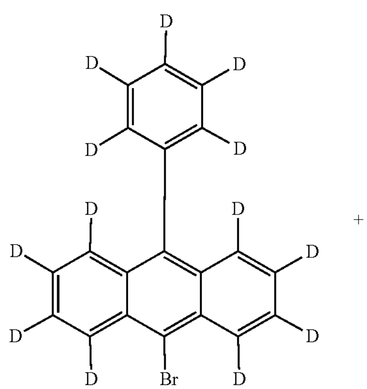

1-1C

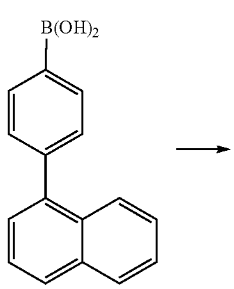

-continued

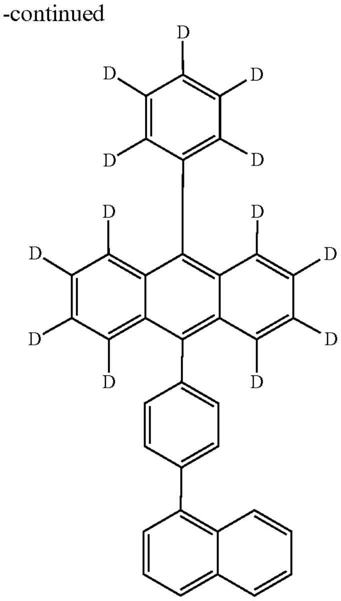

1-1

Preparation of Compound 1-1A

After 9-bromoanthracene (22 g, 95.8 mmol) and phenylboronic acid (10.5 g, 85.9 mmol) were completely dissolved in 1,4-dioxane (300 mL), an aqueous 2M potassium carbonate solution (100 mL) was added thereto, tetrakistriphenylphosphinopalladium ($Pd(PPh_3)_4$, 0.2 g, 2 mol %) was added thereto, and then the resulting mixture was stirred and refluxed for 5 hours. The temperature was lowered to room temperature, the aqueous layer was removed, and the organic layer was dried over anhydrous magnesium sulfate ($MgSO_4$), and then filtered. The filtrate was concentrated under reduced pressure and purified with silica gel column chromatography to obtain Compound 1-1A (18.0 g, 82%, MS: $[M+H]^+=255$).

Preparation of Compound 1-1B

Compound 1-1A (18.0 g, 71 mmol) and $AlCl_3$ (0.5 g) were put into $C_6D_6$ (400 ml), and the resulting solution was stirred for 2 hours. After the reaction was completed, $D_2O$ (60 ml) was added thereto, the resulting solution was stirred for 30 minutes, and then trimethylamine (6 ml) was added dropwise thereto. The reaction solution was transferred to a separatory funnel, and an extraction with water and toluene was performed. The extract was dried over anhydrous magnesium sulfate ($MgSO_4$), and then the residue was recrystallized with ethyl acetate to obtain Compound 1-1B (13.1 g, 68%, MS: $[M+H]^+=269$).

Preparation of Compound 1-1C

Compound 1-1B (13 g, 49 mmol), N-bromosuccinimide (NBS, 9.5 g, 53.4 mmol), and 300 ml of dimethylformamide (DMF) were put into a container, and the resulting solution was stirred at room temperature under an argon atmosphere for 8 hours. After the reaction was completed, the organic layer was extracted with water and ethyl acetate. The extract was dried over anhydrous magnesium sulfate ($MgSO_4$), and then filtered. After the filtrate was concentrated under reduced pressure, the sample was purified with silica gel column chromatography to obtain Compound 1-1C (12.8 g, 76%, MS: $[M+H]^+=346$).

Preparation of Compound 1-1

Compound 1-1 (MS: $[M+H]^+=470$) was obtained in the same manner as in the preparation method of Compound 1-1A, except that Compound 1-1C was used instead of 9-bromoanthracene, and (4-(naphthalen-1-yl)phenyl)boronic acid was used instead of phenylboronic acid.

Synthesis Example 1-2

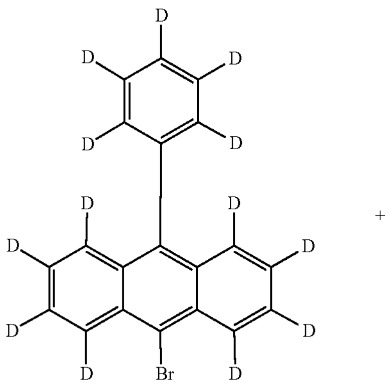

1-1C

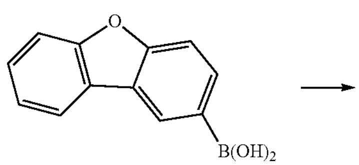

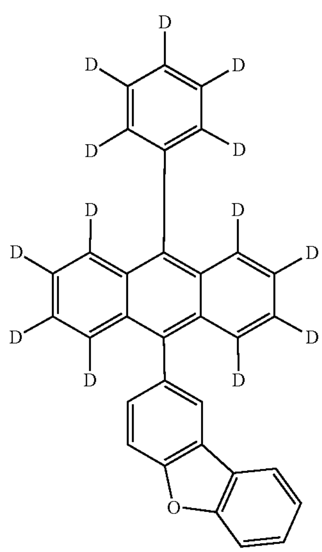

1-2

Compound 1-2 (MS: $[M+H]^+$=434) was obtained in the same manner as in the preparation method of Compound 1-1A, except that Compound 1-1C was used instead of 9-bromo-anthracene, and dibenzo[b,d]furan-2-ylboronic acid was used instead of phenylboronic acid.

Synthesis Example 1-3

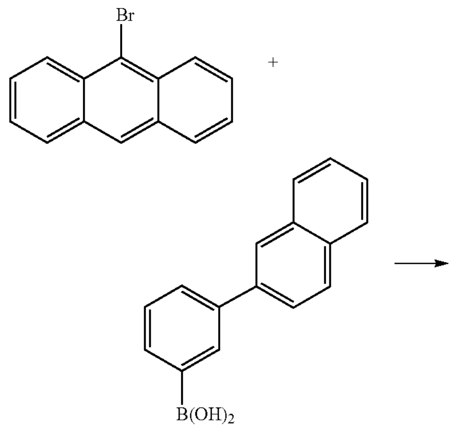

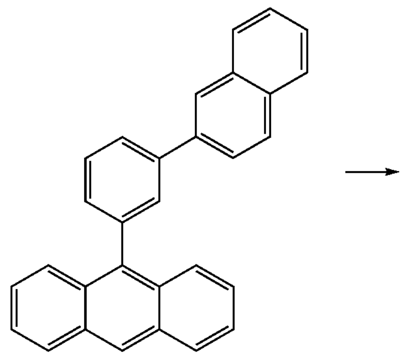

1-3A

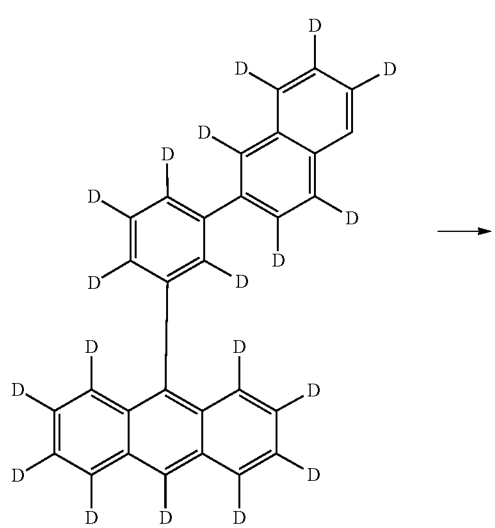

1-3B

-continued

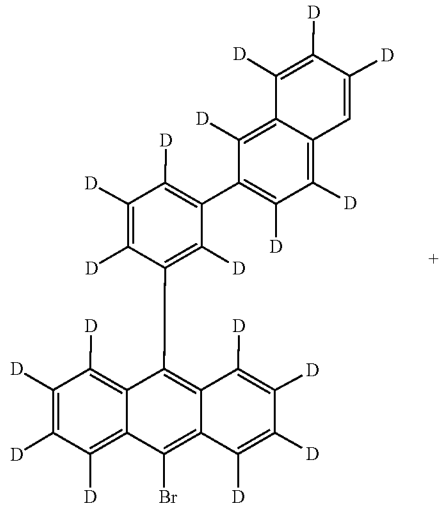

1-3C

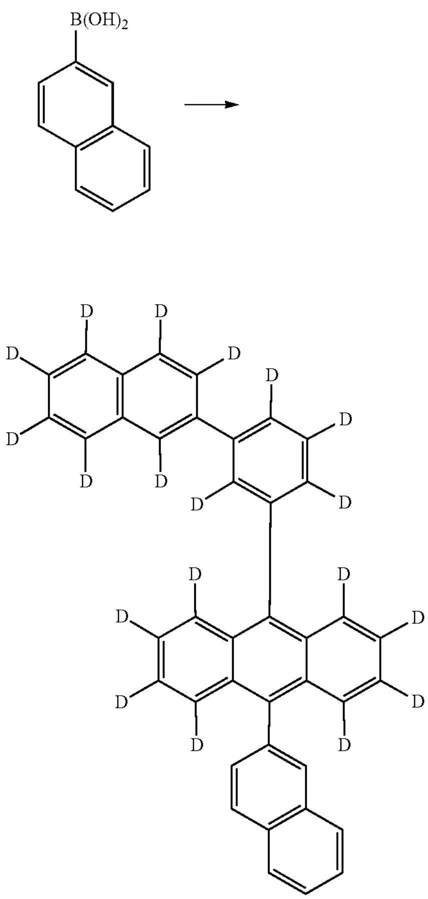

1-3

Preparation of Compound 1-3A

Compound 1-3A (MS: $[M+H]^+$=381) was obtained in the same manner as in the preparation method of Compound 1-1A, except that 3-(naphthalen-2-yl)phenyl)boronic acid was used instead of phenylboronic acid.

Preparation of Compound 1-3B

Compound 1-3B (MS: $[M+H]^+$=400) was obtained in the same manner as in the preparation method of Compound 1-1B, except that Compound 1-3A was used instead of Compound 1-1A.

Preparation of Compound 1-3C

Compound 1-3C (MS: $[M+H]^+$=477) was obtained in the same manner as in the preparation method of Compound 1-1C, except that Compound 1-3B was used instead of Compound 1-1B.

Preparation of Compound 1-3

Compound 1-3 (MS: [M+H]+=526) was obtained in the same manner as in the preparation method of Compound 1-1A, except that Compound 1-3C was used instead of 9-bromoanthracene, and naphthalen-2-ylboronic acid was used instead of phenylboronic acid.

Synthesis Example 1-4

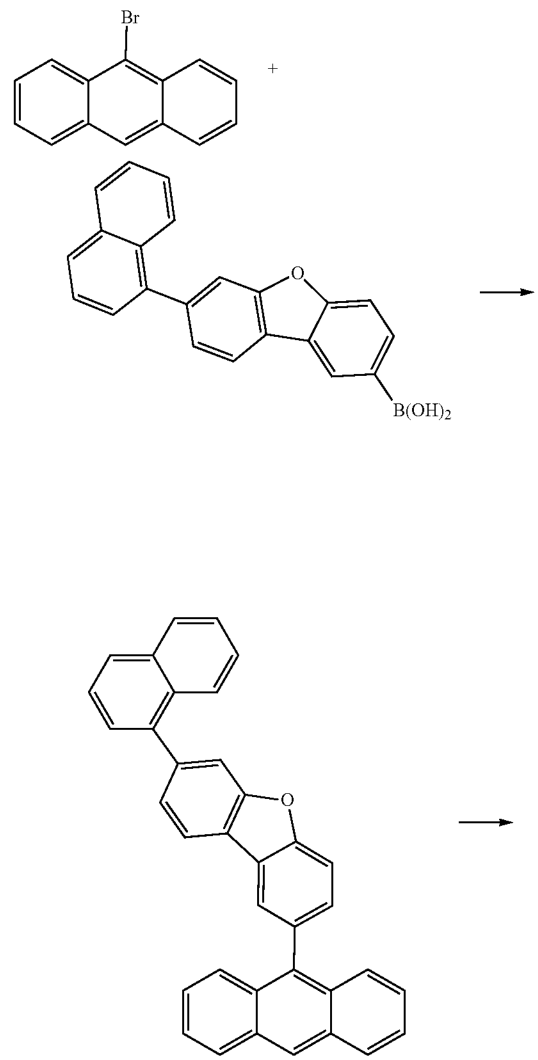

1-4A

-continued

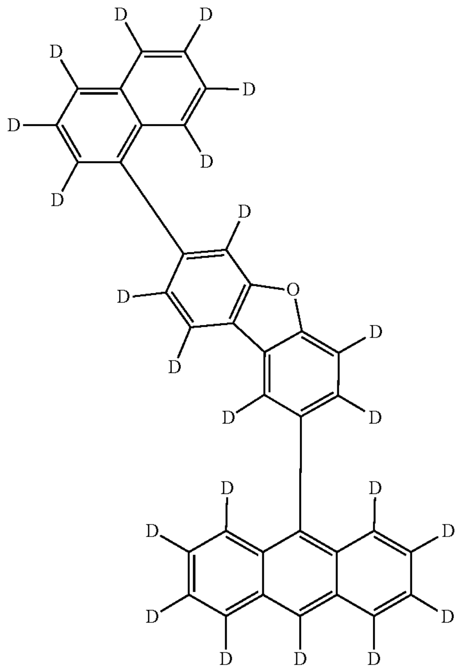

1-4B

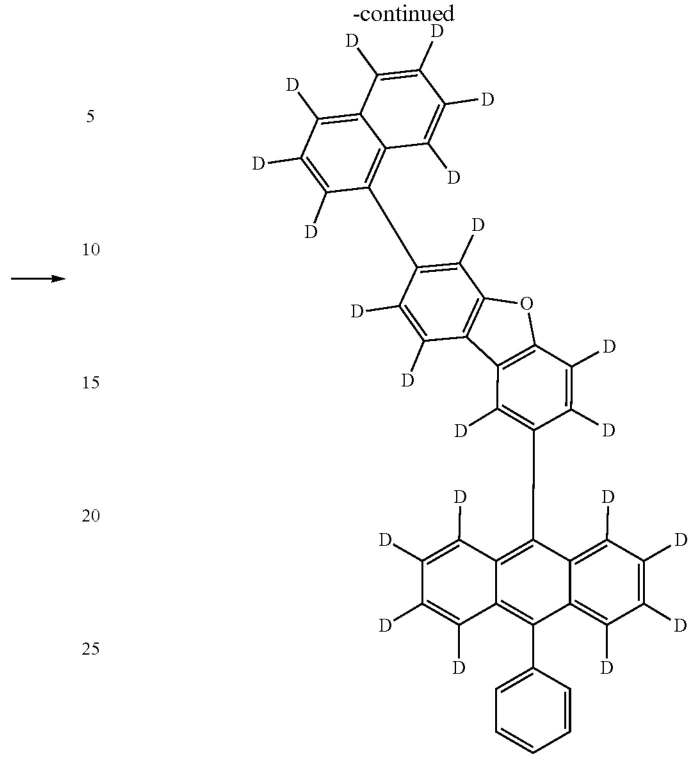

1-4

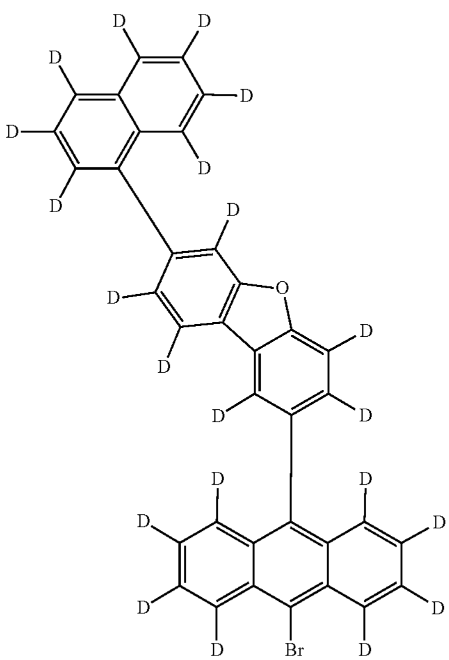

1-4C

+

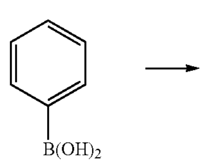

Preparation of Compound 1-4A

Compound 1-4A (MS: $[M+H]^+$=471) was obtained in the same manner as in the preparation method of Compound 1-1A, except that 7-(naphthalen-1-yl)dibenzo[b,d]furan-2-yl)boronic acid was used instead of phenylboronic acid.

Preparation of Compound 1-4B

Compound 1-4B (MS: $[M+H]^+$=493) was obtained in the same manner as in the preparation method of Compound 1-1B, except that Compound 1-4A was used instead of Compound 1-1A.

Preparation of Compound 1-4C

Compound 1-4C (MS: $[M+H]^+$=570) was obtained in the same manner as in the preparation method of Compound 1-1C, except that Compound 1-4B was used instead of Compound 1-1B.

Preparation of Compound 1-4

Compound 1-4 (MS: [M+H]+=568) was obtained in the same manner as in the preparation method of Compound 1-1A, except that Compound 1-4C was used instead of 9-bromoanthracene.

Synthesis Example 1-5

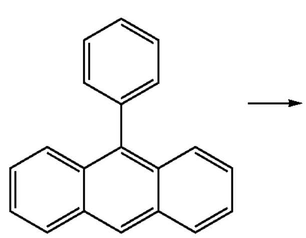

1-1A

-continued

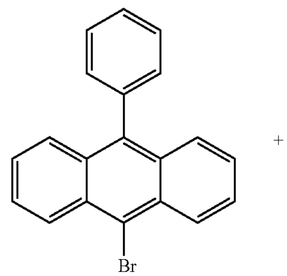

1-5B

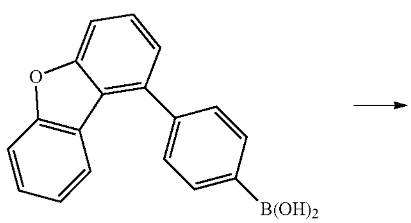

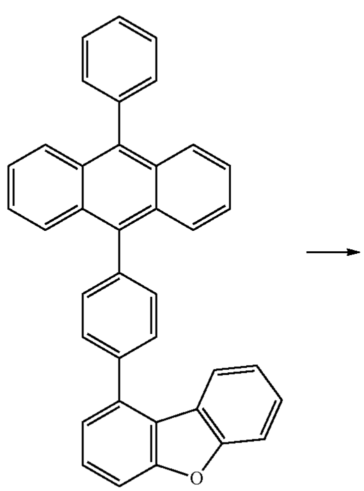

1-5C

-continued

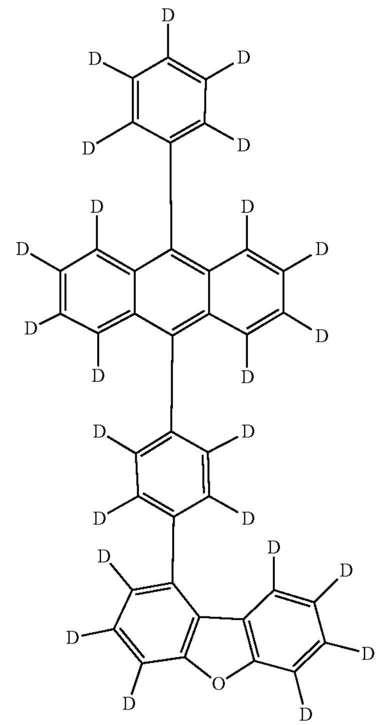

1-5

Preparation of Compound 1-5B

Compound 1-5B (MS: $[M+H]^+$=333) was obtained in the same manner as in the preparation method of Compound 1-1C, except that Compound 1-1A was used instead of Compound 1-1B.

Preparation of Compound 1-5C

Compound 1-5C (MS: $[M+H]^+$=497) was obtained in the same manner as in the preparation method of Compound 1-1A, except that Compound 1-5B was used instead of 9-bromoanthracene, and (4-(dibenzo[b,d]furan-1-yl)phenyl)-boronic acid was used instead of phenylboronic acid.

Preparation of Compound 1-5

Compound 1-5 (MS: [M+H]+=521) was obtained in the same manner as in the preparation method of Compound 1-1B, except that Compound 1-5C was used instead of Compound 1-1A.

Synthesis Example 1-6

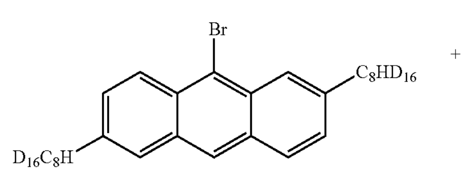

-continued

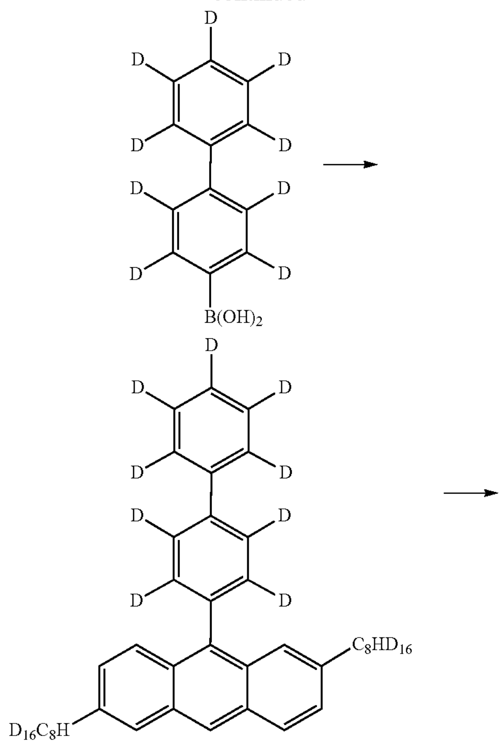

1-6A

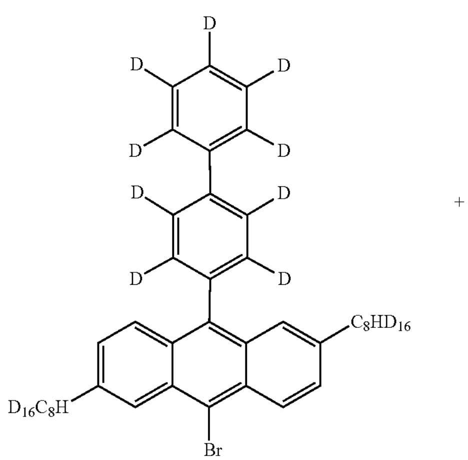

1-6B

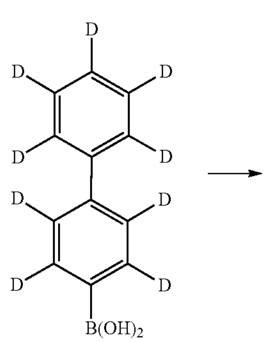

-continued

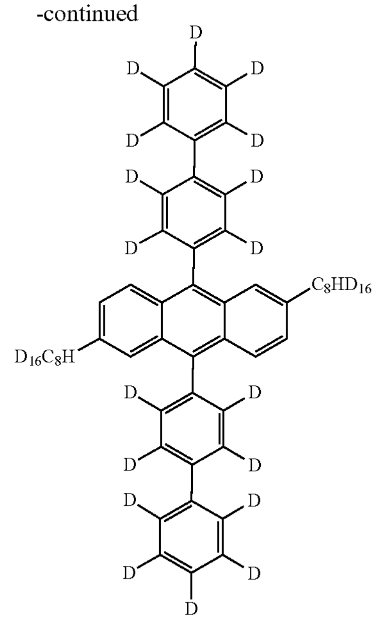

1-6

Preparation of Compound 1-6A

Compound 1-6A (MS: $[M+H]^+=596$) was obtained in the same manner as in the preparation method of Compound 1-1A, except that 9-bromo-2,6-bis(octyl-1,1,2,2,3,3,4,4,5,5,6,6,7,7,8,8-d16)anthracene was used instead of 9-bromoanthracene, and ([1,1'-biphenyl]-4-yl-d9) boronic acid was used instead of phenylboronic acid.

Preparation of Compound 1-6B

Compound 1-6B (MS: $[M+H]^+=674$) was obtained in the same manner as in the preparation method of Compound 1-1C, except that Compound 1-6A was used instead of Compound 1-1B.

Preparation of Compound 1-6

Compound 1-6 (MS: [M+H]+=757) was obtained in the same manner as in the preparation method of Compound 1-1A, except that Compound 1-6B was used instead of 9-bromoanthracene, and ([1,1'-biphenyl]-4-yl-d9) boronic acid was used instead of phenylboronic acid.

Synthesis Example 1-7

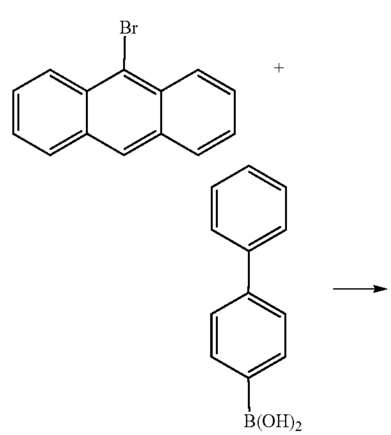

-continued

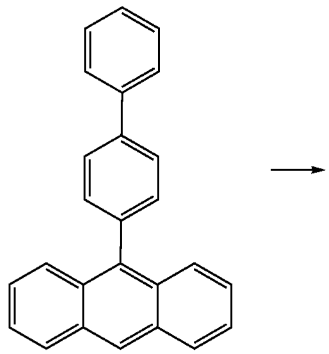

1-7A

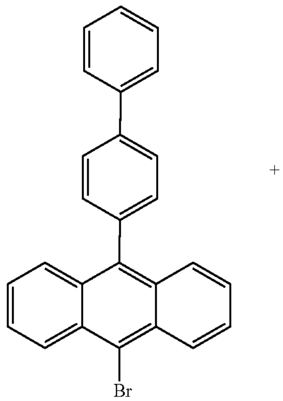

1-7B

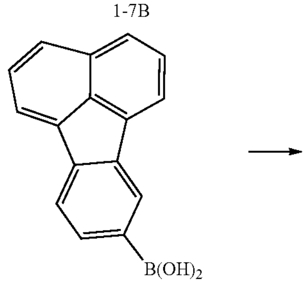

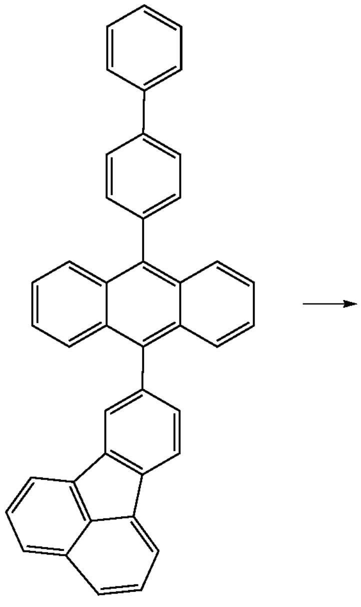

1-7C

-continued

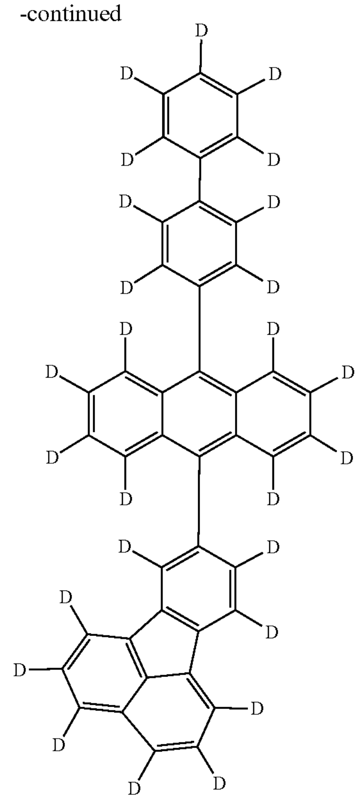

1-7

Preparation of Compound 1-7A

Compound 1-7A (MS: $[M+H]^+$=331) was obtained in the same manner as in the preparation method of Compound 1-1A, except that [1,1'-biphenyl]-4-ylboronic acid was used instead of phenylboronic acid.

Preparation of Compound 1-7B

Compound 1-7B (MS: $[M+H]^+$=409) was obtained in the same manner as in the preparation method of Compound 1-1C, except that Compound 1-7A was used instead of Compound 1-1B.

Preparation of Compound 1-7C

Compound 1-7C (MS: $[M+H]^+$=531) was obtained in the same manner as in the preparation method of Compound 1-1A, except that Compound 1-7B was used instead of 9-bromoanthracene, and fluoranthen-8-ylboronic acid was used instead of phenylboronic acid.

Preparation of Compound 1-7

Compound 1-7 (MS: [M+H]+=557) was obtained in the same manner as in the preparation method of Compound 1-1B, except that Compound 1-7C was used instead of Compound 1-1A.

Synthesis Example 1-8

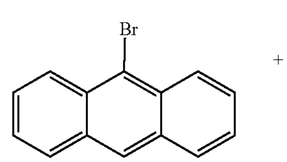

-continued

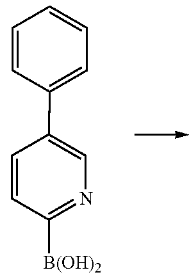

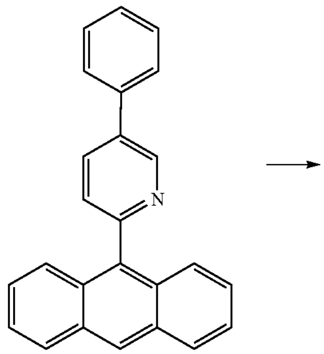

1-8A

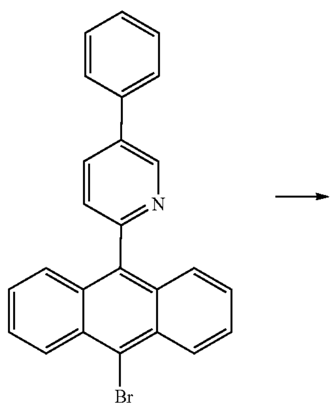

1-8B

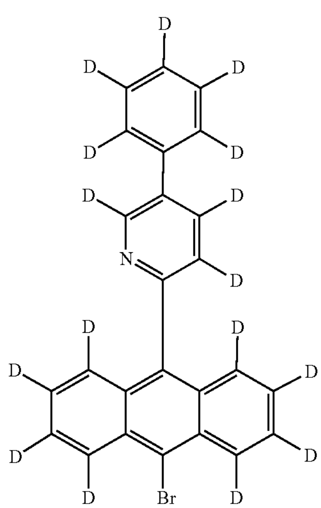

1-8C

+

-continued

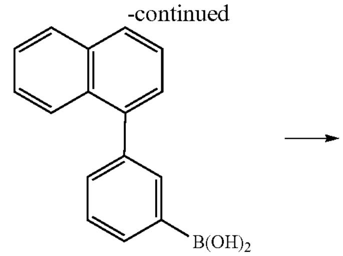

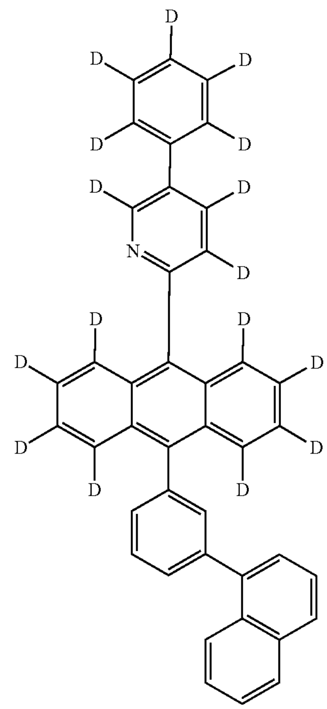

1-8

Preparation of Compound 1-8A

Compound 1-8A (MS: $[M+H]^+=332$) was obtained in the same manner as in the preparation method of Compound 1-1A, except that (5-phenylpyridin-2-yl)boronic acid was used instead of phenylboronic acid.

Preparation of Compound 1-8B

Compound 1-8B (MS: $[M+H]^+=410$) was obtained in the same manner as in the preparation method of Compound 1-1C, except that Compound 1-8A was used instead of Compound 1-1B.

Preparation of Compound 1-8C

Compound 1-8C (MS: $[M+H]^+=426$) was obtained in the same manner as in the preparation method of Compound 1-1B, except that Compound 1-8B was used instead of Compound 1-1A.

Preparation of Compound 1-8

Compound 1-8 (MS: [M+H]+=550) was obtained in the same manner as in the preparation method of Compound 1-1A, except that Compound 1-8C was used instead of 9-bromoanthracene, and (3-(naphthalen-1-yl)phenyl)boronic acid was used instead of phenylboronic acid.

Synthesis Example 1-9

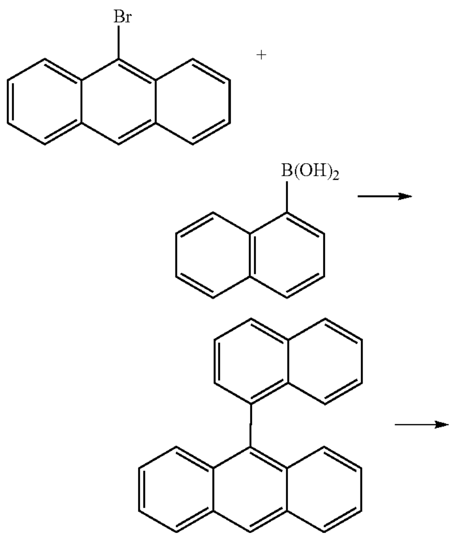

1-9A

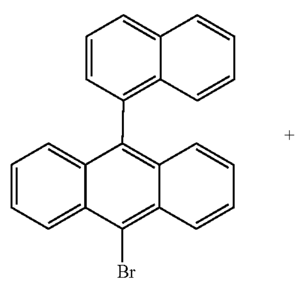

1-9B

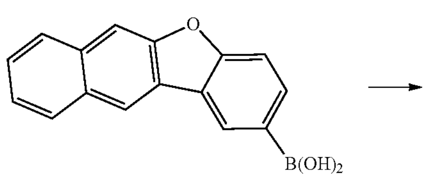

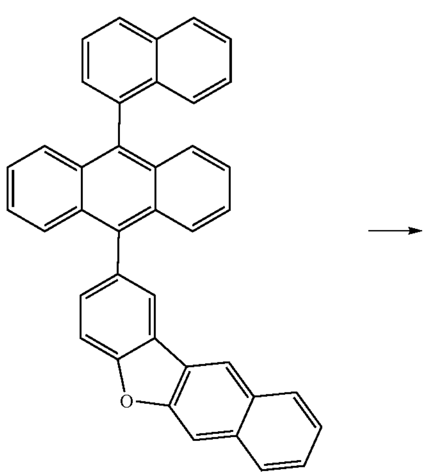

1-9C

-continued

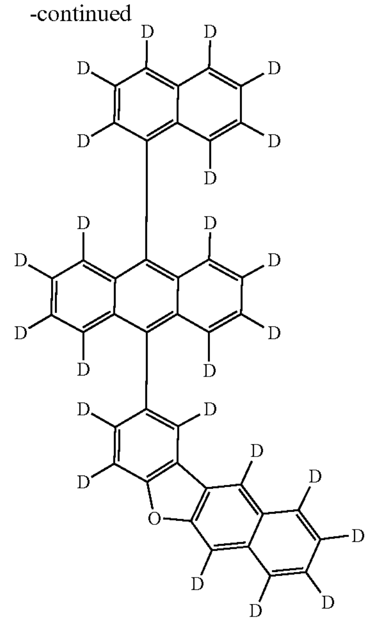

1-9

Preparation of Compound 1-9A

Compound 1-9A (MS: $[M+H]^+=305$) was obtained in the same manner as in the preparation method of Compound 1-1A, except that naphthalen-1-ylboronic acid was used instead of phenylboronic acid.

Preparation of Compound 1-9B

Compound 1-9B (MS: $[M+H]^+=383$) was obtained in the same manner as in the preparation method of Compound 1-1C, except that Compound 1-9A was used instead of Compound 1-1B.

Preparation of Compound 1-9C

Compound 1-9C (MS: $[M+H]^+=521$) was obtained in the same manner as in the preparation method of Compound 1-1A, except that Compound 1-9B was used instead of 9-bromoanthracene, and naphtho[2,3-b]benzofuran-2-ylboronic acid was used instead of phenylboronic acid.

Preparation of Compound 1-9

Compound 1-9 (MS: [M+H]+=545) was obtained in the same manner as in the preparation method of Compound 1-1B, except that Compound 1-9C was used instead of Compound 1-1A.

Synthesis Example 1-10

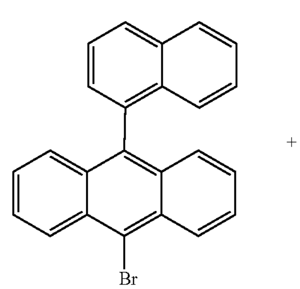

1-9B

-continued

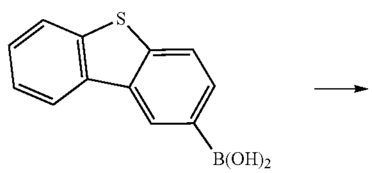

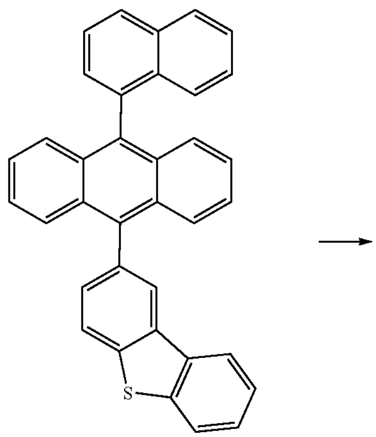

1-10C

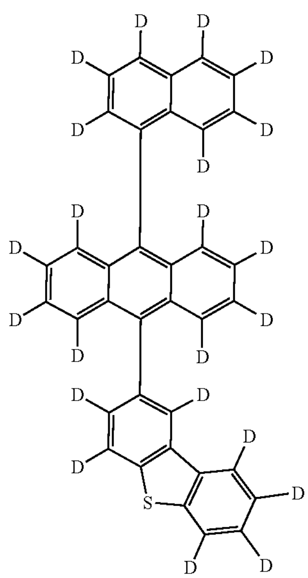

1-10

Preparation of Compound 1-10C

Compound 1-10C (MS: [M+H]$^+$=487) was obtained in the same manner as in the preparation method of Compound 1-1A, except that Compound 1-9B was used instead of 9-bromoanthracene, and dibenzo[b,d]thiophen-2-ylboronic acid was used instead of phenylboronic acid.

Preparation of Compound 1-10

Compound 1-10 (MS: [M+H]+=509) was obtained in the same manner as in the preparation method of Compound 1-1B, except that Compound 1-10C was used instead of Compound 1-1A.

Synthesis Example 1-11

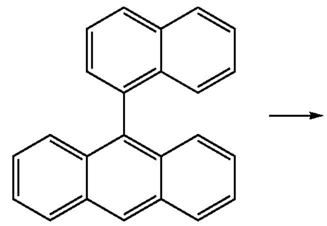

1-9A

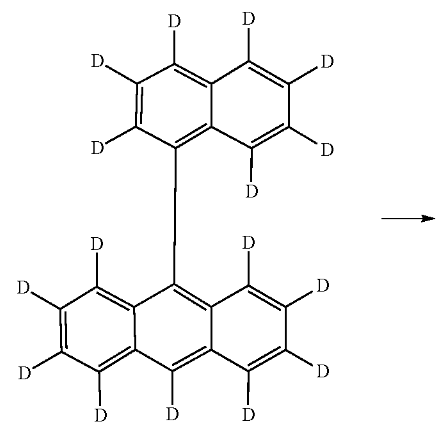

1-11B

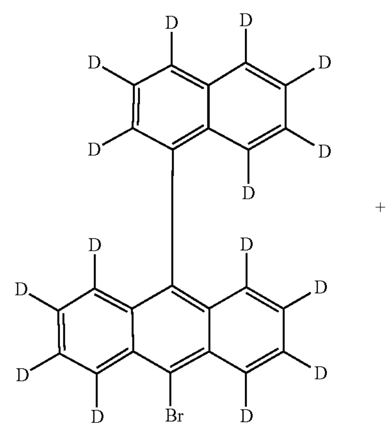

1-11C

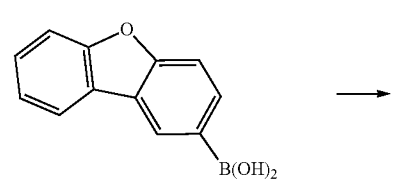

-continued

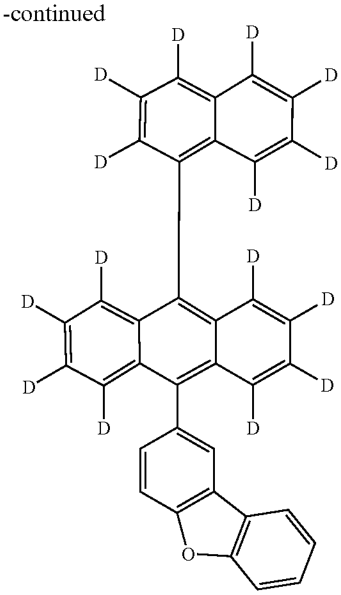

1-11

Preparation of Compound 1-11B

Compound 1-11B (MS: $[M+H]^+$=321) was obtained in the same manner as in the preparation method of Compound 1-1B, except that Compound 1-9A was used instead of Compound 1-1A.

Preparation of Compound 1-11C

Compound 1-11C (MS: $[M+H]^+$=398) was obtained in the same manner as in the preparation method of Compound 1-1C, except that Compound 1-11B was used instead of Compound 1-1B.

Preparation of Compound 1-11

Compound 1-11 (MS: [M+H]+=486) was obtained in the same manner as in the preparation method of Compound 1-1A, except that Compound 1-11C was used instead of 9-bromoanthracene, and dibenzo[b,d]furan-2-ylboronic acid was used instead of phenylboronic acid.

Synthesis Example 1-12

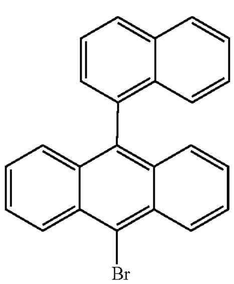

1-9B

+

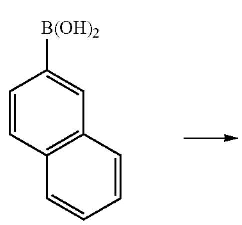

-continued

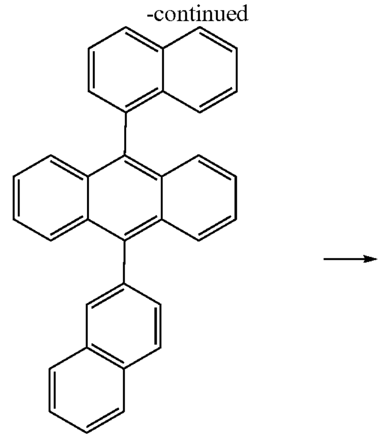

1-12C

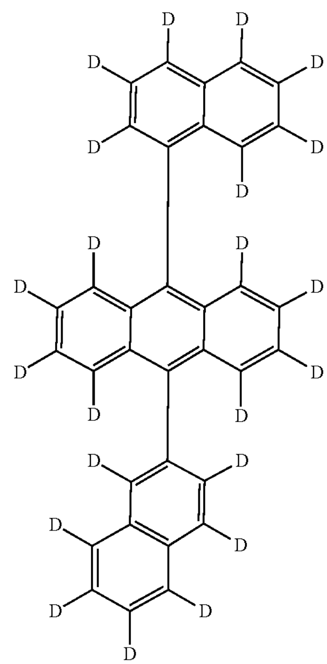

1-12

Preparation of Compound 1-12C

Compound 1-12C (MS: $[M+H]^+$=431) was obtained in the same manner as in the preparation method of Compound 1-1A, except that Compound 1-9B was used instead of 9-bromoanthracene, and naphthalen-2-ylboronic acid was used instead of phenylboronic acid.

Preparation of Compound 1-12

Compound 1-12 (MS: [M+H]+=453) was obtained in the same manner as in the preparation method of Compound 1-1B, except that Compound 1-12C was used instead of Compound 1-1A.

Synthesis Example 1-13

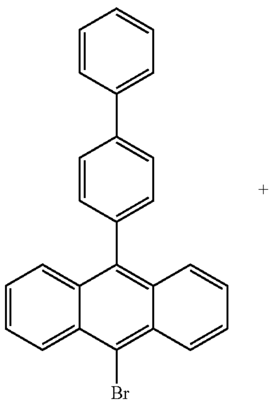

1-7B

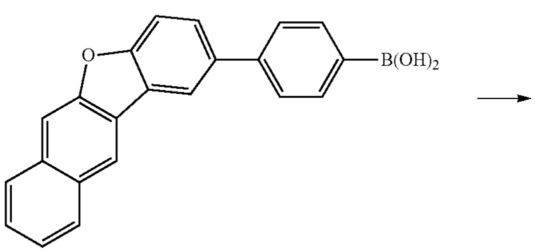

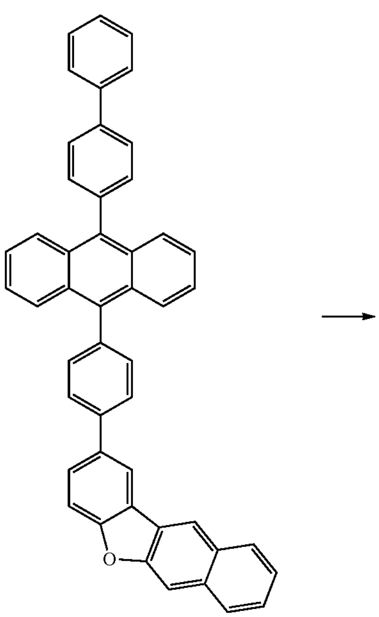

1-13C

-continued

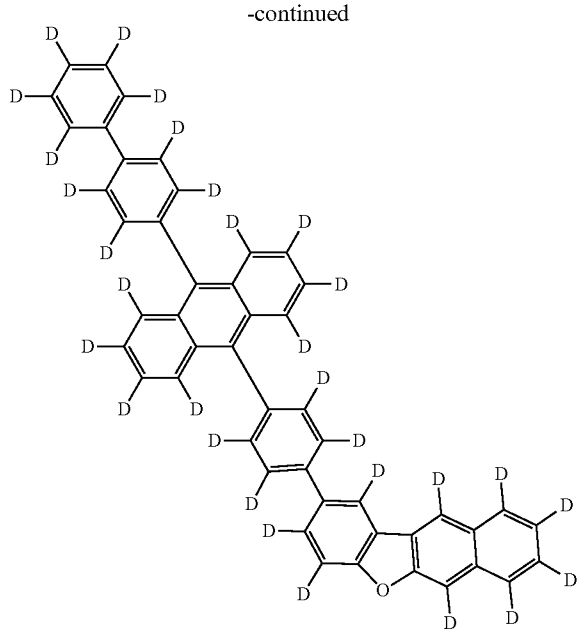

1-13

Preparation of Compound 1-13C

Compound 1-13C (MS: $[M+H]^+$=623) was obtained in the same manner as in the preparation method of Compound 1-1A, except that Compound 1-7B was used instead of 9-bromoanthracene, and 4-naphtho[2,3-b]benzofuran-2-yl)-phenyl)boronic acid was used instead of phenylboronic acid.

Preparation of Compound 1-13

Compound 1-13 (MS: [M+H]+=653) was obtained in the same manner as in the preparation method of Compound 1-1B, except that Compound 1-13C was used instead of Compound 1-1A.

Synthesis Example 1-14

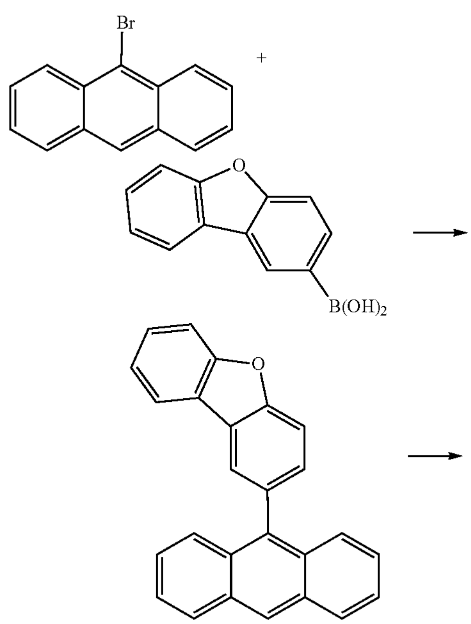

1-14A

-continued

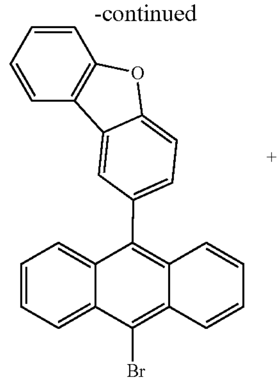

1-14B

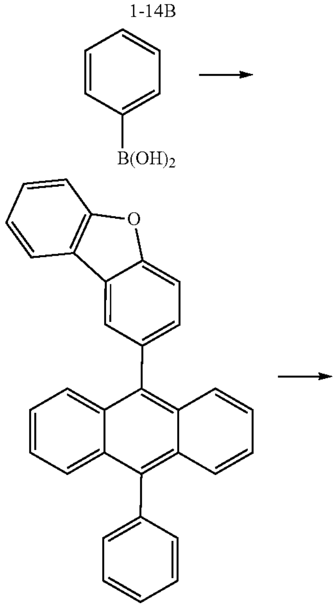

1-14C

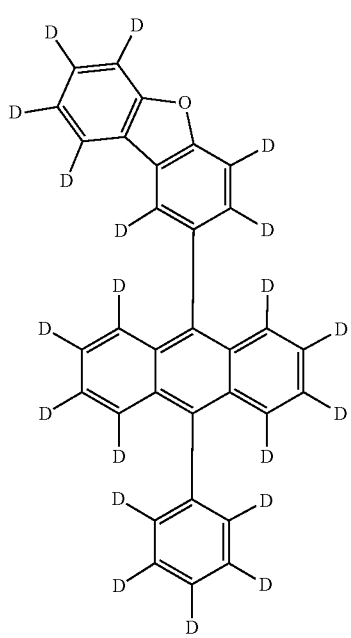

1-14

Preparation of Compound 1-14A

Compound 1-14A (MS: [M+H]$^+$=345) was obtained in the same manner as in the preparation method of Compound 1-1A, except that dibenzo[b,d]furan-2-ylboronic acid was used instead of phenylboronic acid.

Preparation of Compound 1-14B

Compound 1-14B (MS: [M+H]$^+$=423) was obtained in the same manner as in the preparation method of Compound 1-1C, except that Compound 1-14A was used instead of Compound 1-1B.

Preparation of Compound 1-14C

Compound 1-14C (MS: [M+H]+=421) was obtained in the same manner as in the preparation method of Compound 1-1A, except that Compound 1-14B was used instead of 9-bromoanthracene.

Preparation of Compound 1-14

Compound 1-14 (MS: [M+H]+=441) was obtained in the same manner as in the preparation method of Compound 1-1B, except that Compound 1-14C was used instead of Compound 1-1A.

Synthesis Example 1-15

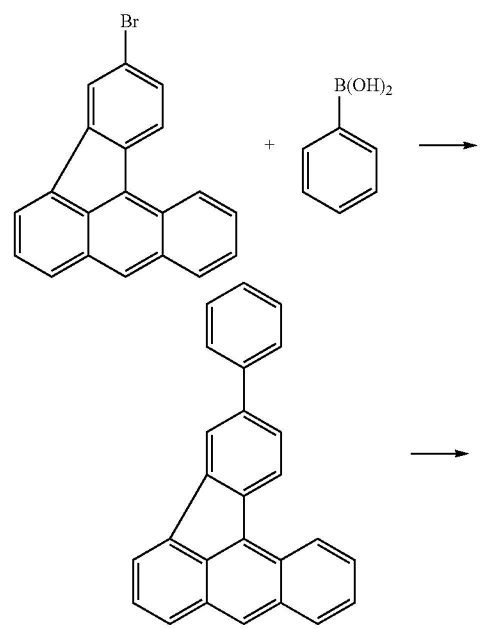

1-15A

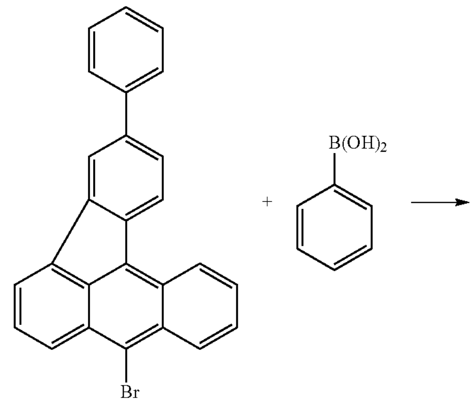

1-15B

-continued

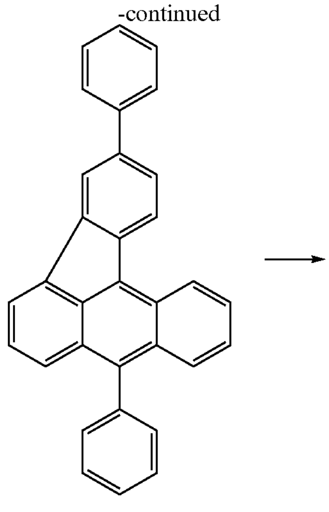

1-15C

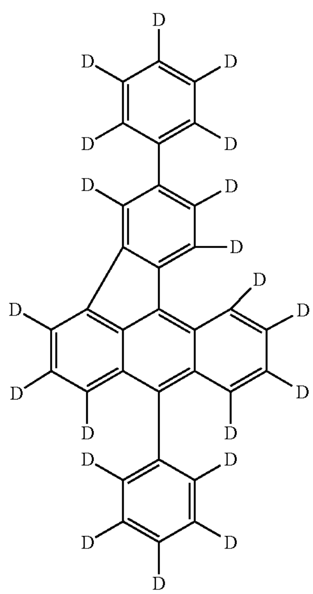

1-15

Preparation of Compound 1-15A

Compound 1-15A (MS: $[M+H]^+=329$) was obtained in the same manner as in the preparation method of Compound 1-1A, except that 3-bromobenzo[a]aceanthrylene was used instead of 9-bromoanthracene.

Preparation of Compound 1-15B

Compound 1-15B (MS: $[M+H]^+=407$) was obtained in the same manner as in the preparation method of Compound 1-1C, except that Compound 1-15A was used instead of Compound 1-1B.

Preparation of Compound 1-15C

Compound 1-15C (MS: $[M+H]^+=405$) was obtained in the same manner as in the preparation method of Compound 1-1A, except that Compound 1-15B was used instead of 9-bromoanthracene.

Preparation of Compound 1-15

Compound 1-15 (MS: [M+H]+=425) was obtained in the same manner as in the preparation method of Compound 1-1B, except that Compound 1-15C was used instead of Compound 1-1A.

Synthesis Example 1-16

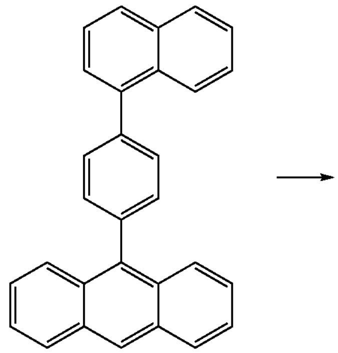

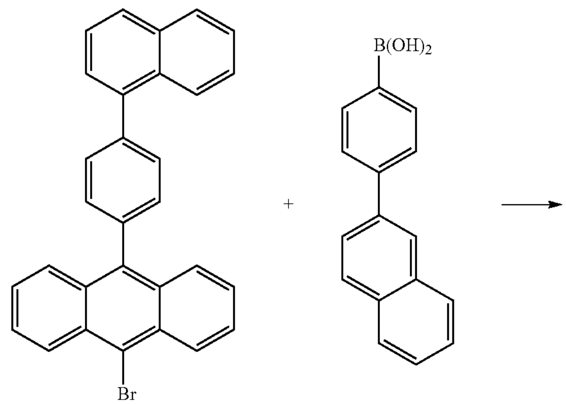

1-16A

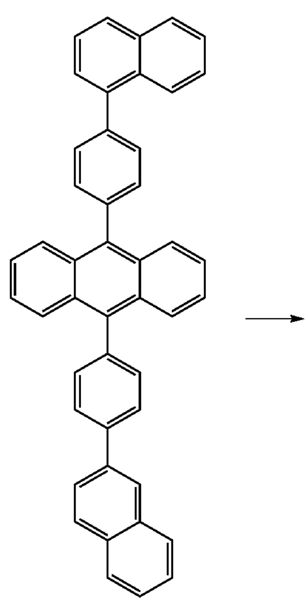

1-16B

-continued

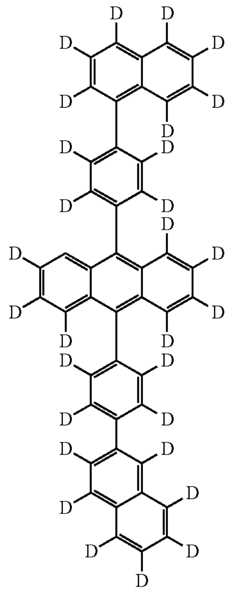

1-16

Preparation of Compound 1-16A

Compound 1-16A (MS: $[M+H]^+$=459) was obtained in the same manner as in the preparation method of Compound 1-1C, except that 9-(4-(naphthalen-1-yl)phenyl)anthracene was used instead of Compound 1-1B.

Preparation of Compound 1-16B

Compound 1-16B (MS: $[M+H]^+$=583) was obtained in the same manner as in the preparation method of Compound 1-1A, except that Compound 1-16A was used instead of 9-bromoanthracene, and (4-(naphthalen-2-yl)phenyl)boronic acid was used instead of phenylboronic acid.

Preparation of Compound 1-16

Compound 1-16 (MS: [M+H]+=611) was obtained in the same manner as in the preparation method of Compound 1-1B, except that Compound 1-16B was used instead of Compound 1-1A.

Synthesis Example 1-17

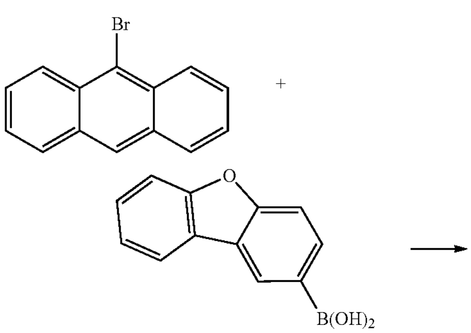

-continued

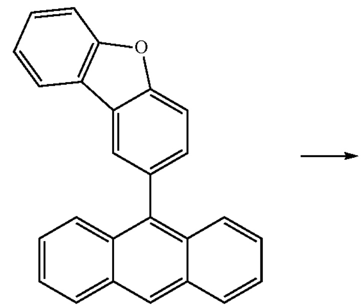

1-17A

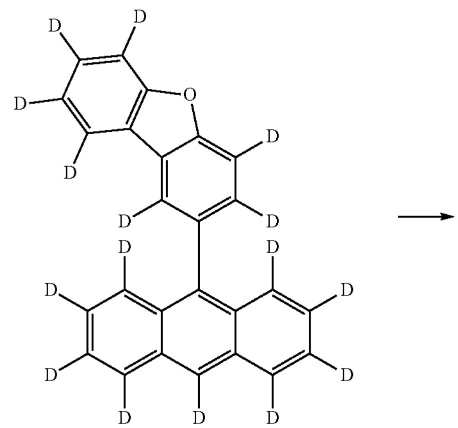

1-17B

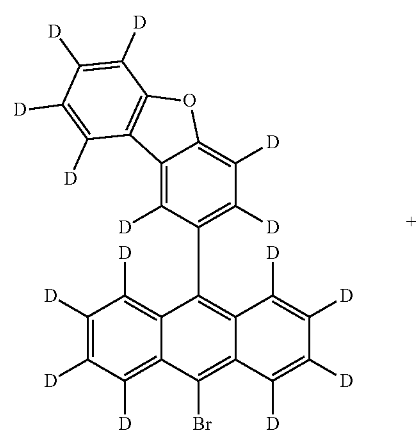

1-17C

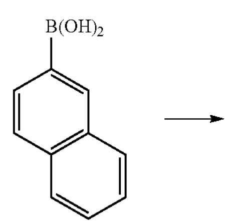

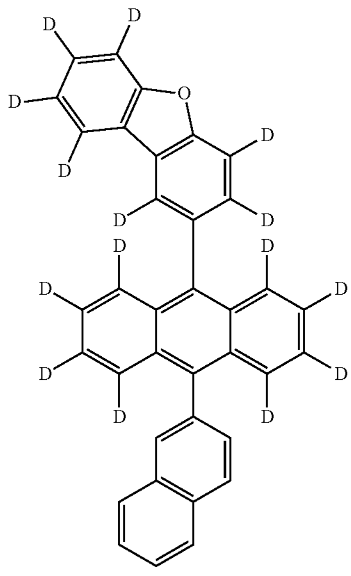

1-17

Preparation of Compound 1-17A

Compound 1-17A (MS: $[M+H]^+$=345) was obtained in the same manner as in the preparation method of Compound 1-1A, except that dibenzo[b,d]furan-2-ylboronic acid was used instead of phenylboronic acid.

Preparation of Compound 1-17B

Compound 1-17B (MS: $[M+H]^+$=361) was obtained in the same manner as in the preparation method of Compound 1-1B, except that Compound 1-17A was used instead of Compound 1-1A.

Preparation of Compound 1-17C

Compound 1-17C (MS: $[M+H]^+$=438) was obtained in the same manner as in the preparation method of Compound 1-1C, except that Compound 1-17B was used instead of Compound 1-1B.

Preparation of Compound 1-17

Compound 1-17 (MS: [M+H]+=486) was obtained in the same manner as in the preparation method of Compound 1-1A, except that Compound 1-17C was used instead of 9-bromoanthracene, and naphthalen-2-ylboronic acid was used instead of phenylboronic acid.

Synthesis Example 2

Synthesis Example 2-1

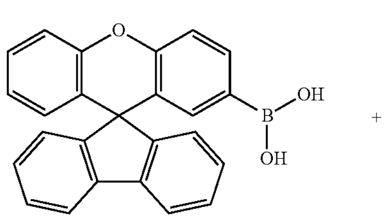

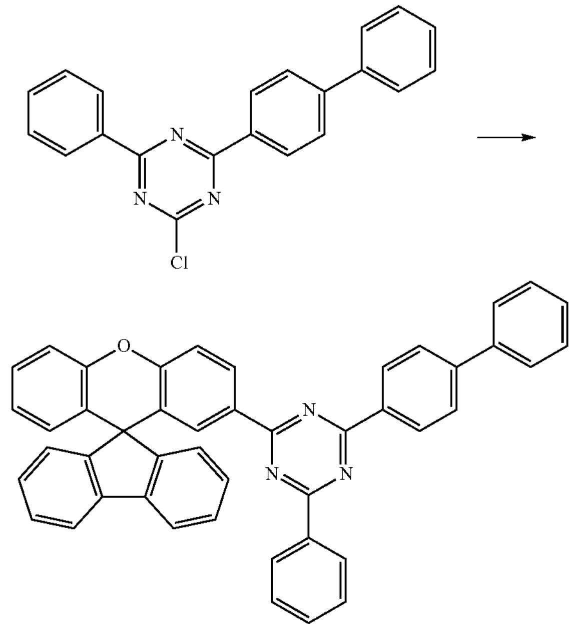

[2-1]

Under a nitrogen current, spiro[fluorene-9,9'-xanthen]-2'-ylboronic acid (30 g, 79.7 mmol) and 2-([1,1'-biphenyl]-4-yl)-4-chloro-6-phenyl-1,3,5-triazine (30.2 g, 87.7 mmol) were put into 300 mL of a tetrahydrofuran solvent and the resulting solution was stirred. An aqueous potassium carbonate solution (22 g, 159.5 mmol) was added thereto and the resulting mixture was refluxed by increasing the temperature. When the reflux began, tetrakis(triphenyl-phosphine) palladium(0) (2.76 g, 2.39 mmol) was added thereto, and the resulting solution was stirred for 3 hours. After the reaction was completed, the resulting product was filtered, and then subjected to ethanol slurry purification to obtain Compound 2-1 ($[M+H]^+$=640).

Synthesis Example 2-2

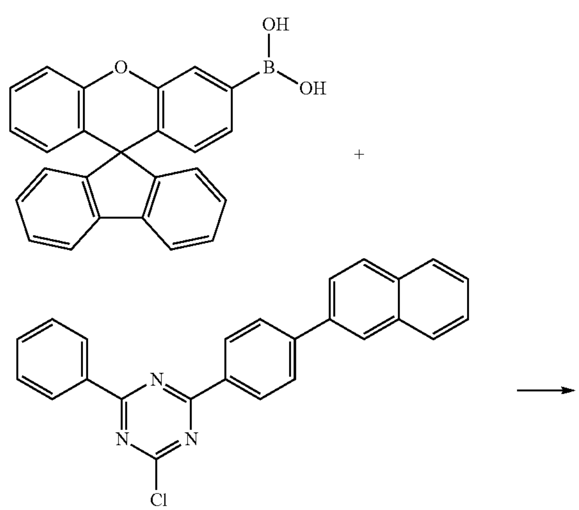

-continued

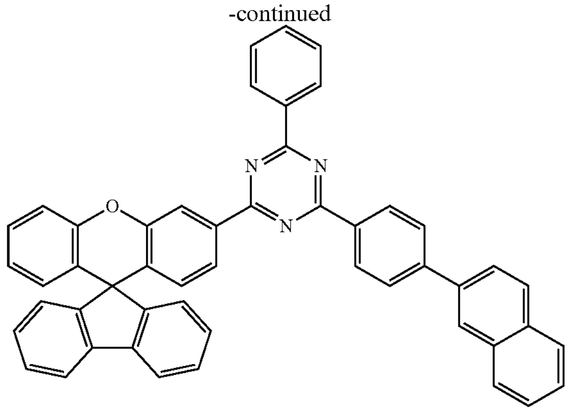

[2-2]

[Compound 2-2] ([M+H]+=690) was prepared in the same manner as in the preparation of Synthesis Example 2-1, except that spiro[fluorene-9,9'-xanthen]-3'-ylboronic acid was used instead of spiro[fluorene-9,9'-xanthen]-2'-ylboronic acid, and 2-chloro-4-(4-(naphthalen-2-yl)phenyl)-6-phenyl-1,3,5-triazine was used instead of 2-([1,1'-biphenyl]-4-yl)-4-chloro-6-phenyl-1,3,5-triazine.

Synthesis Example 2-3

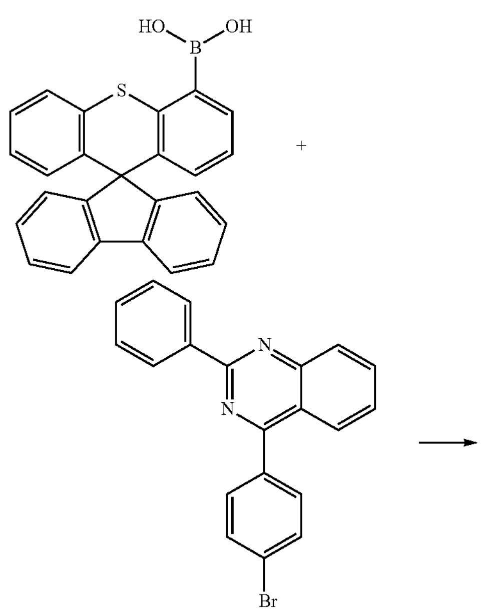

-continued

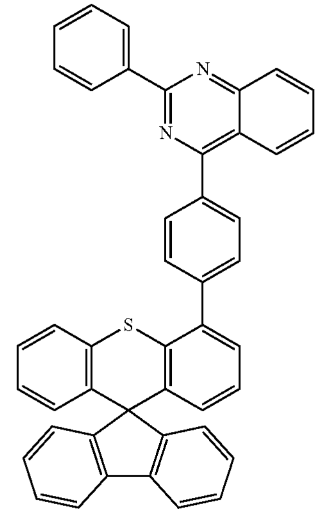

[2-3]

[Compound 2-3] ([M+H]+=629) was prepared in the same manner as in the preparation of Synthesis Example 2-1, except that spiro[fluorene-9,9'-thioxanthen]-4'-ylboronic acid was used instead of spiro[fluorene-9,9'-xanthen]-2'-ylboronic acid, and 4-(4-bromophenyl)-2-phenylquinazoline was used instead of 2-([1,1'-biphenyl]-4-yl)-4-chloro-6-phenyl-1,3,5-triazine.

Synthesis Example 2-4

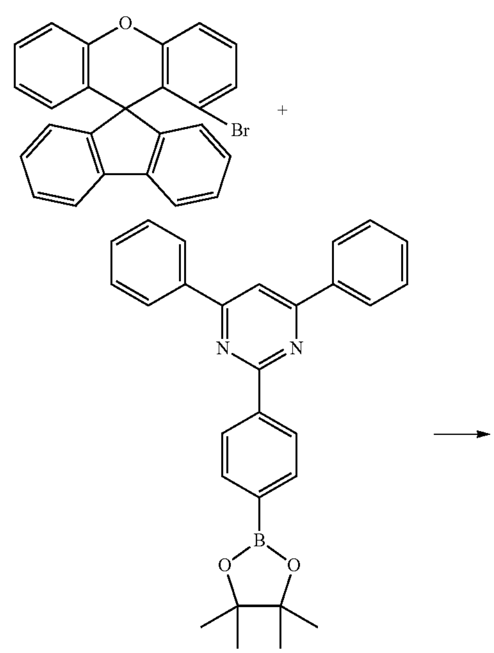

-continued

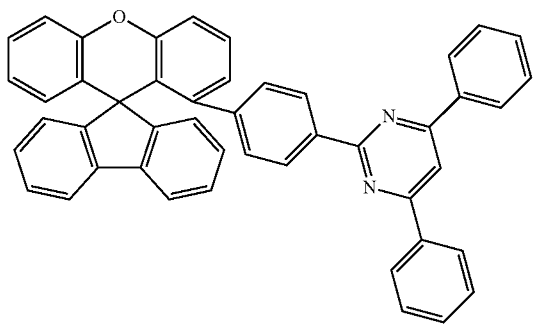

[2-4]

[Compound 2-4] ([M+H]$^+$=639) was prepared in the same manner as in the preparation of Synthesis Example 2-1, except that 1'-bromospiro[fluorene-9,9'-xanthene] was used instead of spiro[fluorene-9,9'-xanthen]-2'-ylboronic acid, and 4,6-diphenyl-2-(4-(4,4,5,5-tetramethyl-1,3,2-dioxaborolan-2-yl)phenyl)pyrimidine was used instead of 2-([1,1'-biphenyl]-4-yl)-4-chloro-6-phenyl-1,3,5-triazine.

Synthesis Example 2-5

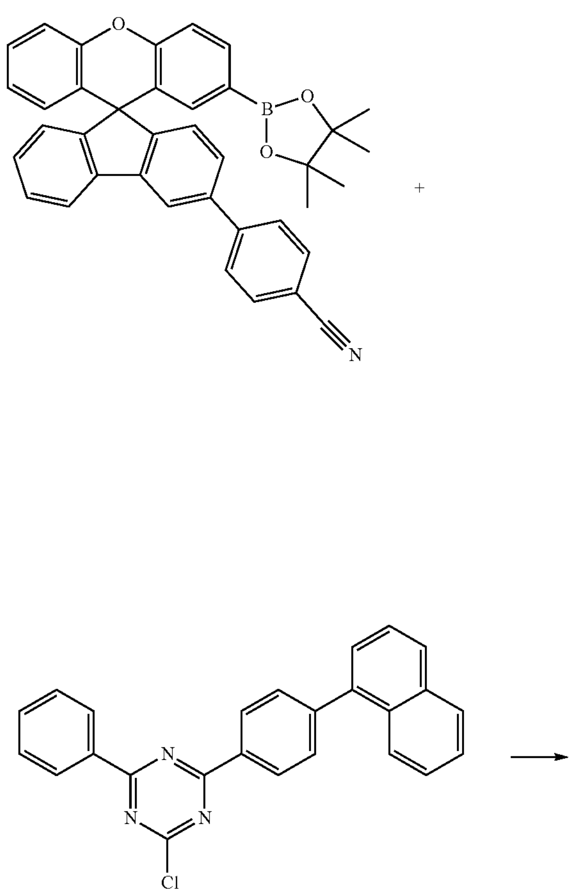

-continued

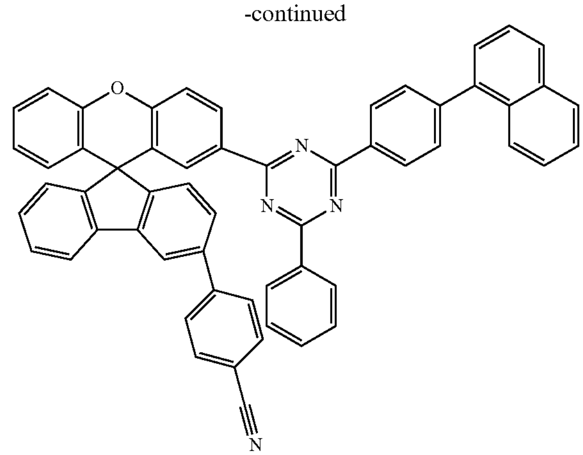

[2-5]

[Compound 2-5] ([M+H]$^+$=791) was prepared in the same manner as in the preparation of Synthesis Example 2-1, except that 4-(2'-(4,4,5,5-tetramethyl-1,3,2-dioxaborolan-2-yl)spiro[fluorene-9,9'-xanthen]-3-yl)benzonitrile was used instead of spiro[fluorene-9,9'-xanthen]-2'-ylboronic acid, and 2-chloro-4-(4-(naphthalen-1-yl)phenyl)-6-phenyl-1,3,5-triazine was used instead of 2-([1,1'-biphenyl]-4-yl)-4-chloro-6-phenyl-1,3,5-triazine.

Synthesis Example 2-6

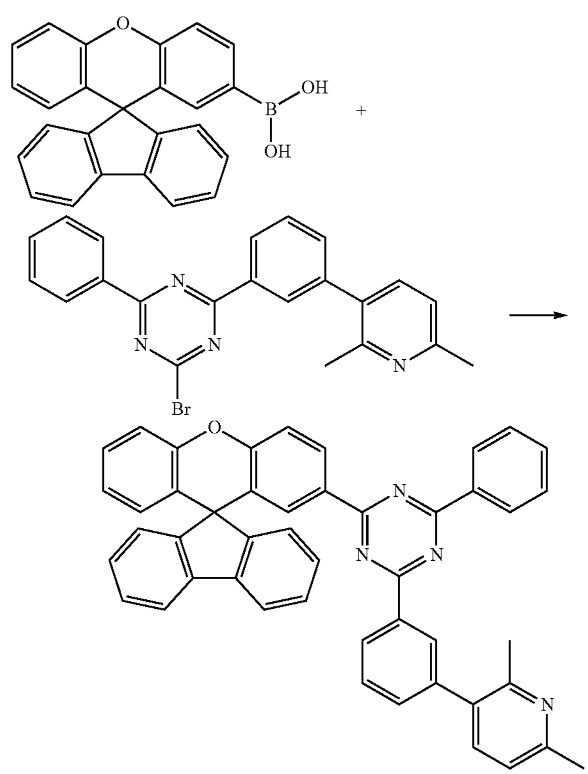

[2-6]

[Compound 2-6] ([M+H]$^+$=669) was prepared in the same manner as in the preparation of Synthesis Example 2-1, except that 2-bromo-4-(3-(2,6-dimethylpyridin-3-yl)phenyl)-6-phenyl-1,3,5-triazine was used instead of 2-([1,1'-biphenyl]-4-yl)-4-chloro-6-phenyl-1,3,5-triazine.

Synthesis Example 2-7

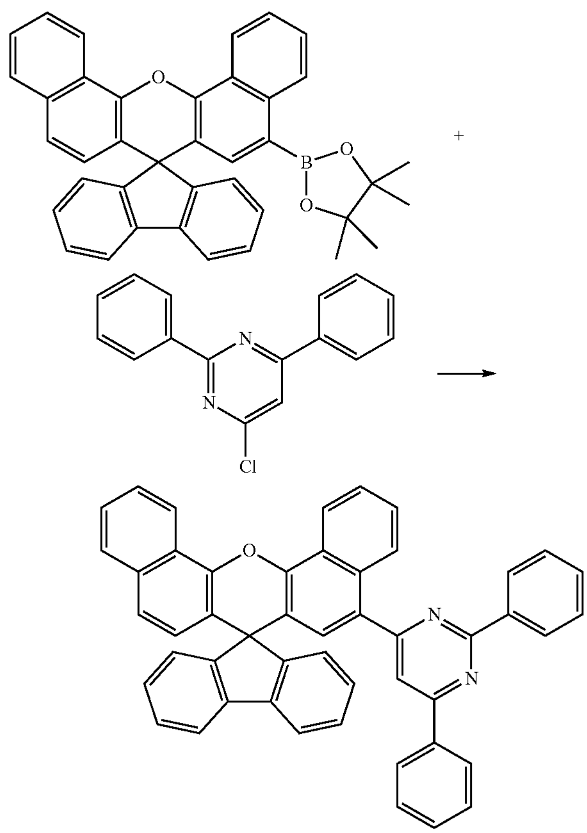

[2-7]

[Compound 2-7] ([M+H]$^+$=663) was prepared in the same manner as in the preparation of Synthesis 2-1, except that 4,4,5,5-tetramethyl-2-(spiro[dibenzo[c,h]-xanthene-7,9'-fluoren]-5-yl)-1,3,2-dioxaborolane was used instead of spiro[fluorene-9,9'-xanthen]-2'-ylboronic acid, and 4-chloro-2,6-diphenylpyrimidine was used instead of 2-([1,1'-biphenyl]-4-yl)-4-chloro-6-phenyl-1,3,5-triazine.

Synthesis Example 2-8

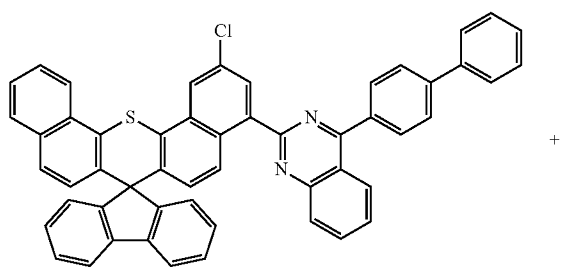

-continued

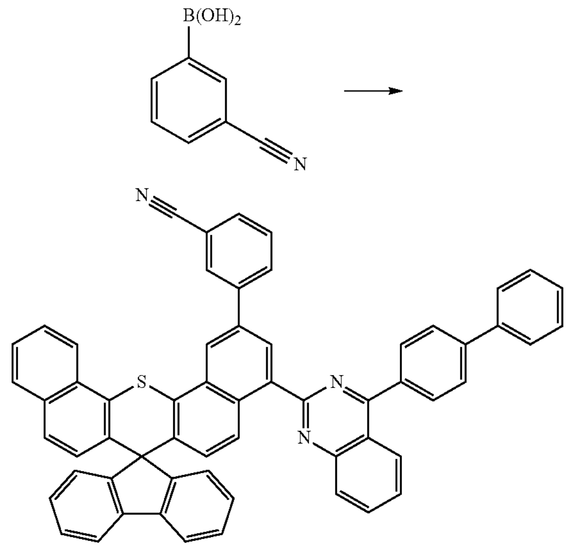

[2-8]

[Compound 2-8] ([M+H]$^+$=830) was prepared in the same manner as in the preparation of Synthesis Example 2-1, except that 4-([1,1'-biphenyl]-4-yl)-2-(2-chlorospiro[dibenzo[c,h]thioxanthene-7,9'-fluoren]-4-yl) quinazoline was used instead of spiro[fluorene-9,9'-xanthen]-2'-ylboronic acid, and (3-cyanophenyl)boronic acid was used instead of 2-([1,1'-biphenyl]-4-yl)-4-chloro-6-phenyl-1,3,5-triazine.

Synthesis Example 2-9

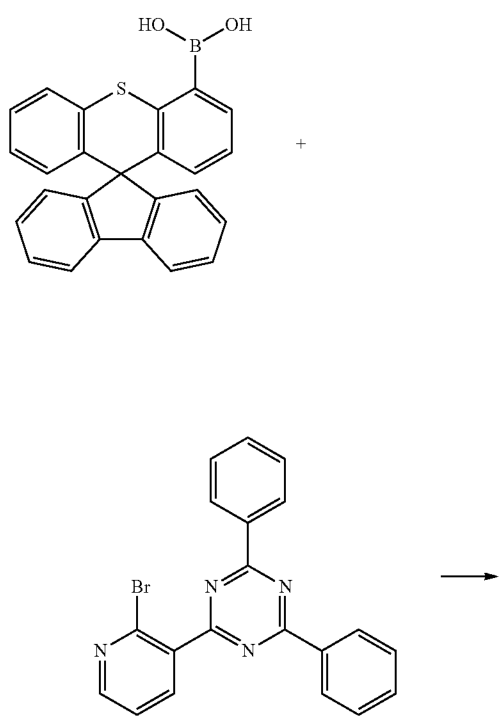

-continued

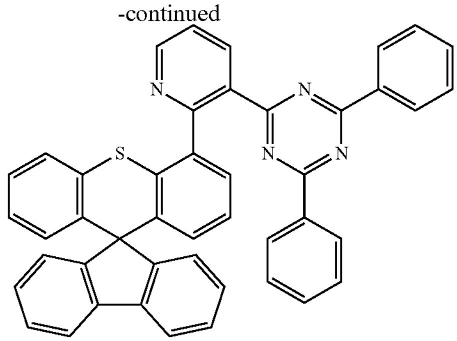

[2-9]

[Compound 2-9] ([M+H]$^+$=657) was prepared in the same manner as in the preparation of Synthesis Example 2-3, except that 2-(2-bromopyridin-3-yl)-4,6-diphenyl-1,3,5-triazine was used instead of 4-(4-bromophenyl)-2-phenylquinazoline.

Synthesis Example 2-10

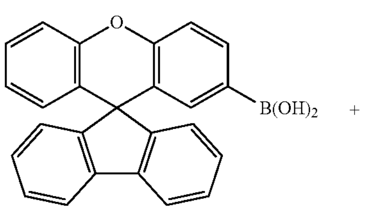

-continued

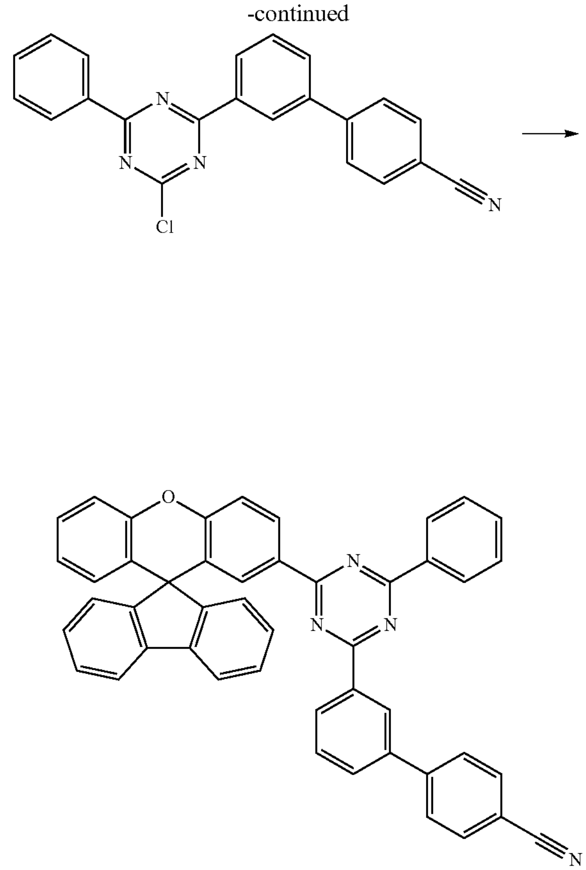

[2-10]

[Compound 2-10] ([M+H]$^+$=665) was prepared in the same manner as in the preparation of Synthesis Example 2-1, except that 3'-(4-chloro-6-phenyl-1,3,5-triazin-2-yl)-[1,1'-biphenyl]-4-carbonitrile was used instead of 2-([1,1'-biphenyl]-4-yl)-4-chloro-6-phenyl-1,3,5-triazine.

Synthesis Example 2-11

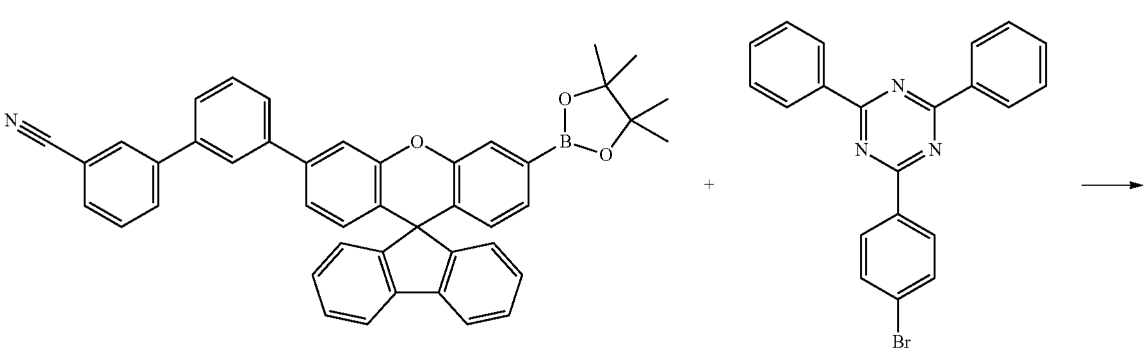

-continued

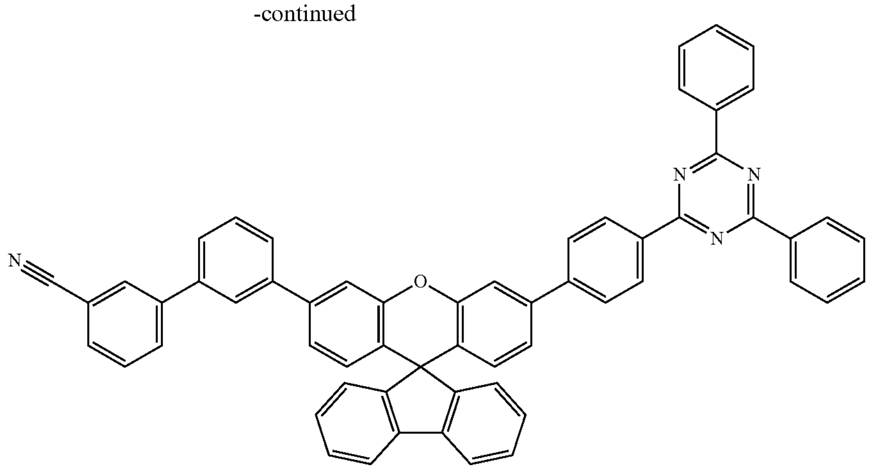

[2-11]

[Compound 2-11] ([M+H]$^+$=817) was prepared in the same manner as in the preparation of Synthesis Example 2-1, except that 3'-(3'-(4,4,5,5-tetramethyl-1,3,2-dioxaborolan-2-yl)spiro[fluorene-9,9'-xanthen]-6'-yl)-[1,1'-biphenyl]-3-carbonitrile was used instead of spiro[fluorene-9,9'-xanthen]-2'-ylboronic acid, and 2-(4-bromophenyl)-4,6-diphenyl-1,3,5-triazine was used instead of 2-([1,1'-biphenyl]-4-yl)-4-chloro-6-phenyl-1,3,5-triazine.

Synthesis Example 2-12

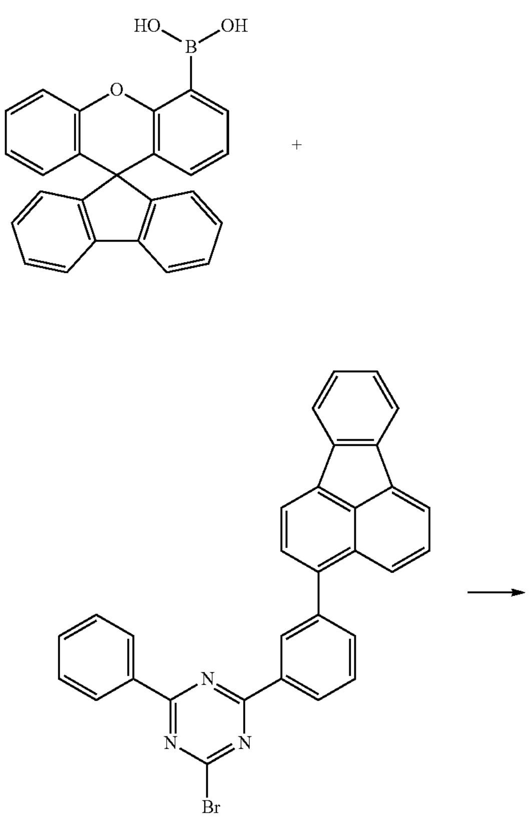

-continued

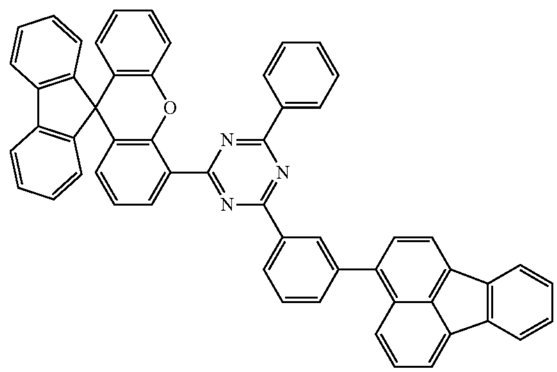

[2-12]

[Compound 2-12] ([M+H]$^+$=764) was prepared in the same manner as in the preparation of Synthesis Example 2-1, except that spiro[fluorene-9,9'-xanthen]-4'-ylboronic acid was used instead of spiro[fluorene-9,9'-xanthen]-2'-ylboronic acid, and 2-bromo-4-(3-(fluoranthen-3-yl)phenyl)-6-phenyl-1,3,5-triazine was used instead of 2-([1,1'-biphenyl]-4-yl)-4-chloro-6-phenyl-1,3,5-triazine.

Synthesis Example 2-13

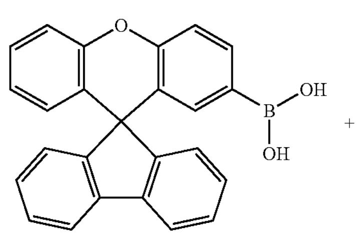

-continued

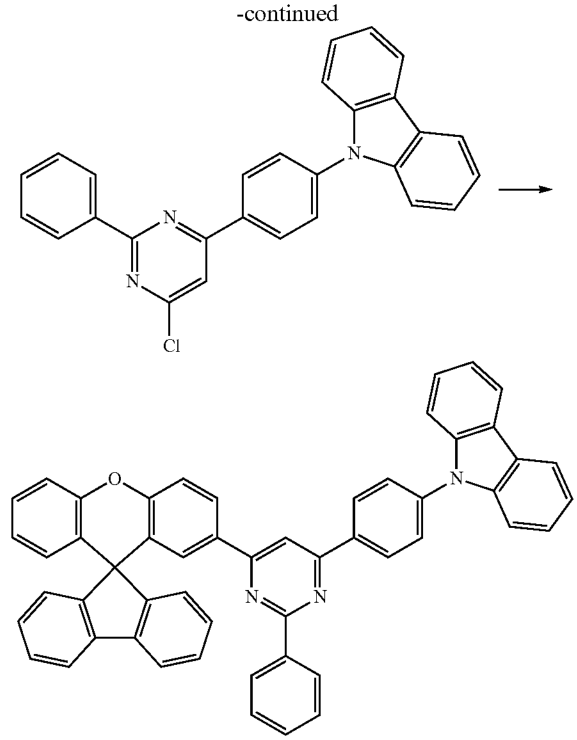

[2-13]

[Compound 2-13] ([M+H]$^+$=728) was prepared in the same manner as in the preparation of Synthesis Example 2-1, except that 9-(4-(6-chloro-2-phenylpyrimidin-4-yl)phenyl)-9H-carbazole was used instead of 2-([1,1'-biphenyl]-4-yl)-4-chloro-6-phenyl-1,3,5-triazine.

Synthesis Example 2-14

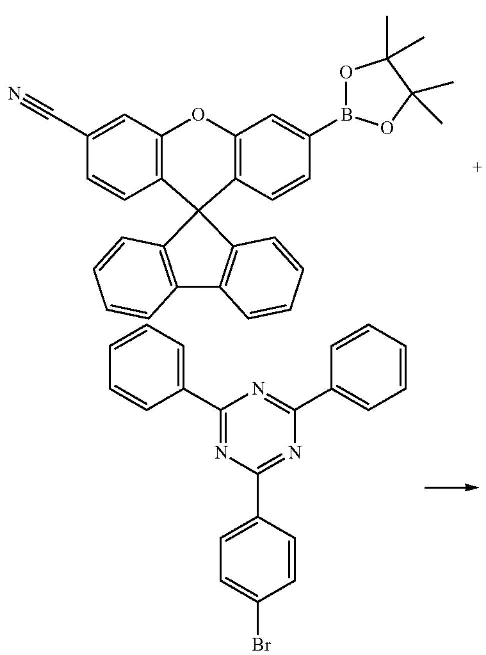

-continued

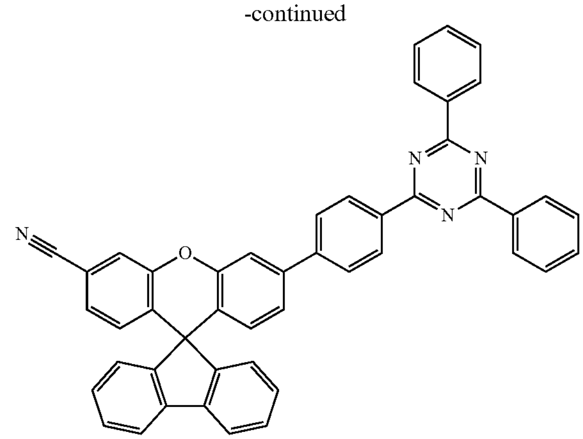

[2-14]

[Compound 2-14] ([M+H]$^+$=665) was prepared in the same manner as in the preparation of Synthesis Example 2-1, except that 6'-(4,4,5,5-tetramethyl-1,3,2-dioxaborolan-2-yl)spiro[fluorene-9,9'-xanthene]-3'-carbonitrile was used instead of spiro[fluorene-9,9'-xanthen]-2'-ylboronic acid, and 2-(4-bromophenyl)-4,6-diphenyl-1,3,5-triazine was used instead of 2-([1,1'-biphenyl]-4-yl)-4-chloro-6-phenyl-1,3,5-triazine.

Synthesis Example 2-15

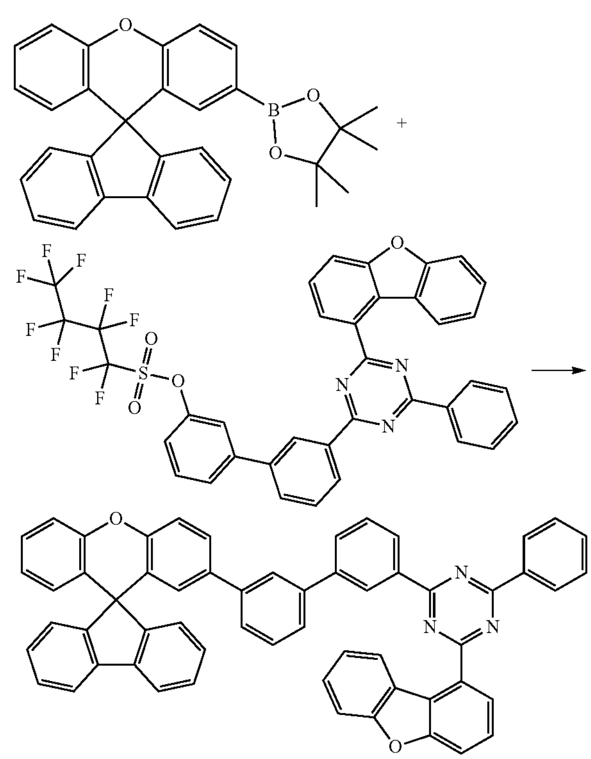

[2-15]

[Compound 2-15] ([M+H]$^+$=806) was prepared in the same manner as in the preparation of Synthesis Example 2-1, except that 4,4,5,5-tetramethyl-2-(spiro[fluorene-9,9'-xanthen]-2'-yl)-1,3,2-dioxaborolane was used instead of spiro[fluorene-9,9'-xanthen]-2'-ylboronic acid, and 3'-(4-(dibenzo[b,d]furan-1-yl)-6-phenyl-1,3,5-triazin-2-yl)-[1,1'-biphenyl]-3-yl 1,1,2,2,3,3,4,4,4-nonafluorobutane-1-sulfonate was used instead of 2-([1,1'-biphenyl]-4-yl)-4-chloro-6-phenyl-1,3,5-triazine.

Synthesis Example 2-17

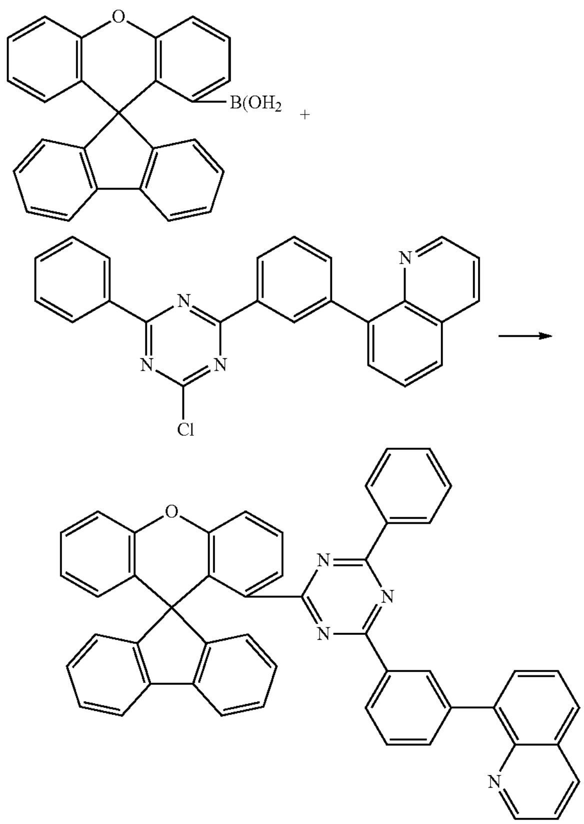

[2-17]

[Compound 2-17] ([M+H]$^+$=691) was prepared in the same manner as in the preparation of Synthesis Example 2-1, except that spiro[fluorene-9,9'-xanthen]-1'-ylboronic acid was used instead of spiro[fluorene-9,9'-xanthen]-2'-ylboronic acid, and 8-(3-(4-chloro-6-phenyl-1,3,5-triazin-2-yl)phenyl)quinoline was used instead of 2-([1,1'-biphenyl]-4-yl)-4-chloro-6-phenyl-1,3,5-triazine.

Synthesis Example 2-18

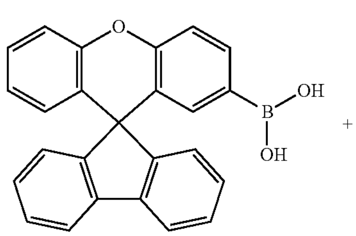

-continued

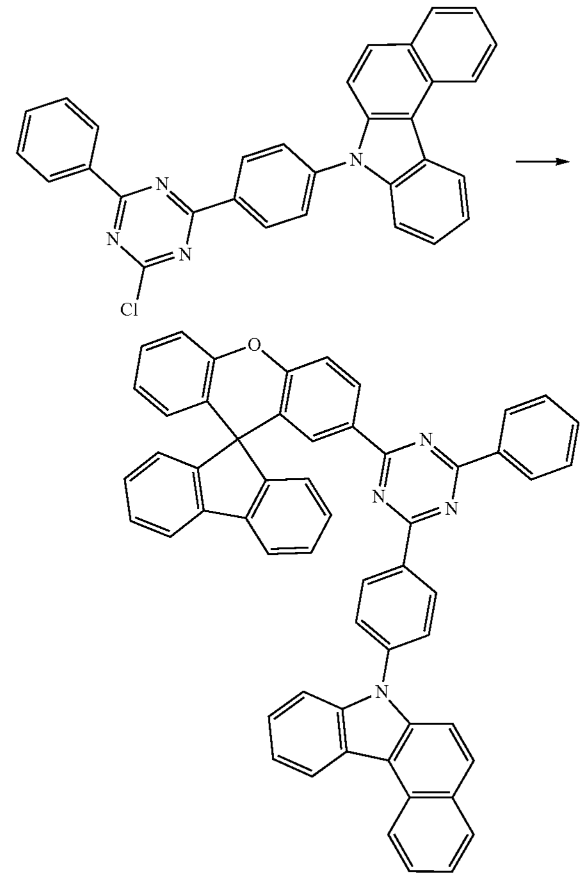

[2-18]

[Compound 2-18] ([M+H]$^+$=779) was prepared in the same manner as in the preparation of Synthesis Example 2-1, except that 7-(4-(4-chloro-6-phenyl-1,3,5-triazin-2-yl)phenyl)-7H-benzo[c]carbazole was used instead of 2-([1,1'-biphenyl]-4-yl)-4-chloro-6-phenyl-1,3,5-triazine.

Synthesis Example 2-19

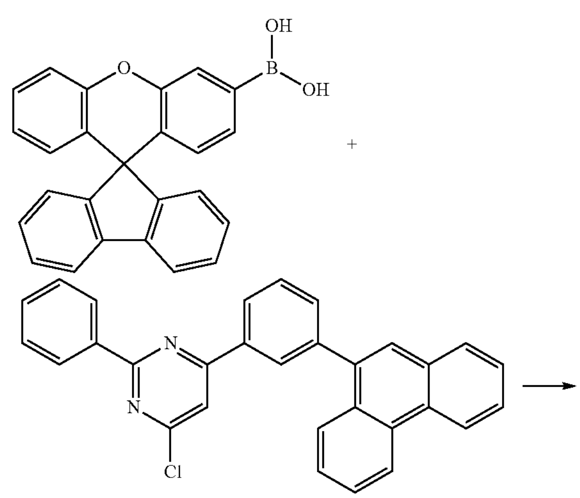

-continued

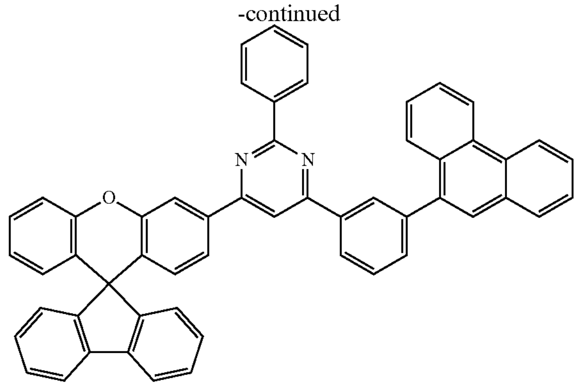

[2-19]

[Compound 2-19] ([M+H]$^+$=739) was prepared in the same manner as in the preparation of Synthesis Example 2-1, except that spiro[fluorene-9,9'-xanthen]-3'-ylboronic acid was used instead of spiro[fluorene-9,9'-xanthen]-2'-yl-boronic acid, and 4-chloro-6-(3-(phenanthren-9-yl)phenyl)-2-phenylpyrimidine was used instead of 2-([1,1'-biphenyl]-4-yl)-4-chloro-6-phenyl-1,3,5-triazine.

Synthesis Example 2-20

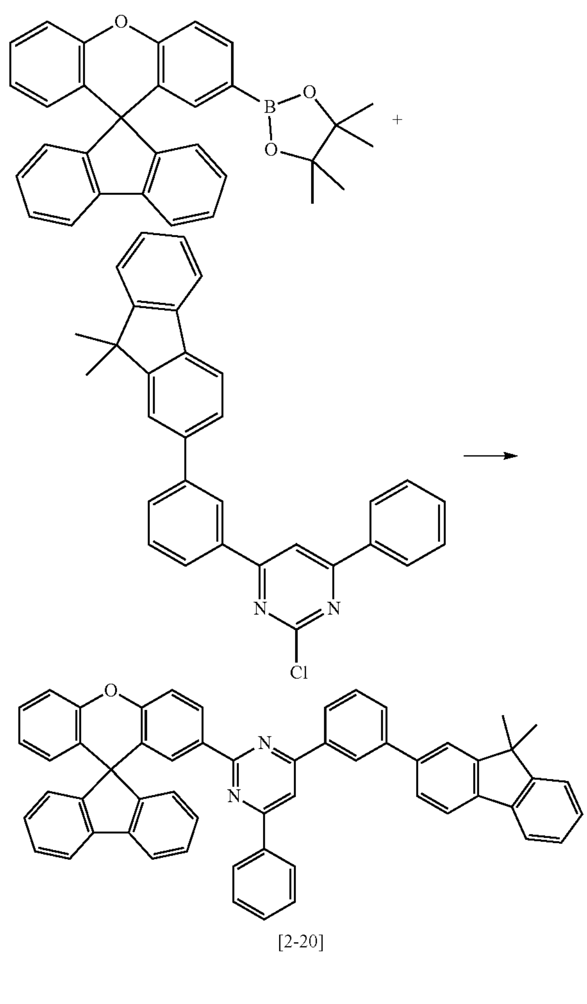

[2-20]

[Compound 2-20] ([M+H]$^+$=755) was prepared in the same manner as in the preparation of Synthesis Example 2-15, except that 2-chloro-4-(3-(9,9-dimethyl-9H-fluoren-2-yl)phenyl)-6-phenylpyrimidine was used instead of 3'-(4-(dibenzo[b,d]furan-1-yl)-6-phenyl-1,3,5-triazin-2-yl)-[1,1'-biphenyl]-3-yl 1,1,2,2,3,3,4,4,4-nonafluorobutane-1-sulfonate.

Synthesis Example 2-21

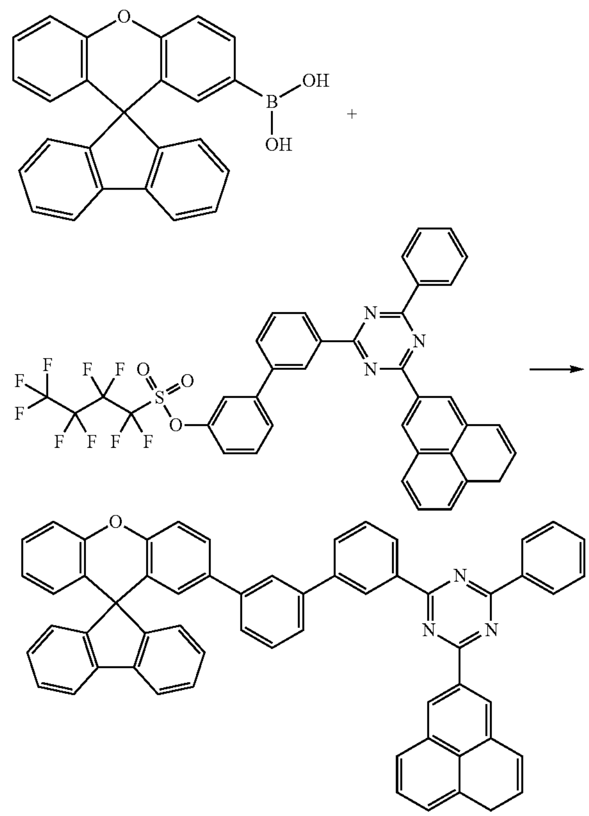

[2-21]

[Compound 2-21] ([M+H]$^+$=804) was prepared in the same manner as in the preparation of Synthesis Example 2-1, except that 3'-(4-(1H-phenalen-5-yl)-6-phenyl-1,3,5-triazin-2-yl)-[1,1'-biphenyl]-3-yl 1,1,2,2,3,4,4,4-octafluoro-3-methylbutane-1-sulfonate was used instead of 2-([1,1'-biphenyl]-4-yl)-4-chloro-6-phenyl-1,3,5-triazine.

Synthesis Example 2-22

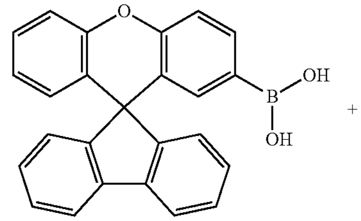

-continued

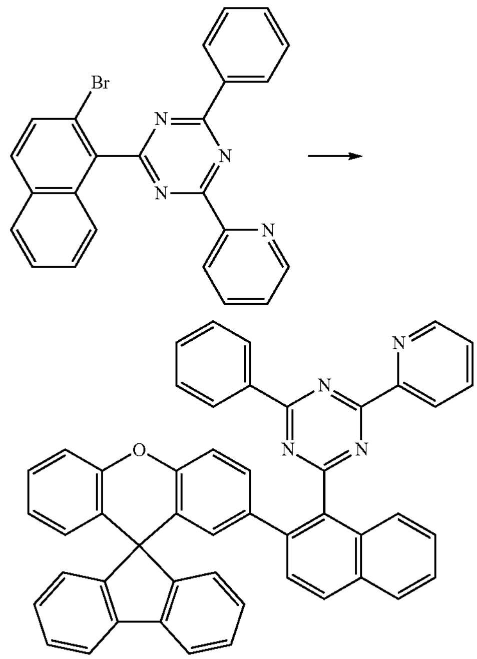

[2-22]

[Compound 2-22] ([M+H]$^+$=691) was prepared in the same manner as in the preparation of Synthesis Example 2-1, except that 2-(2-bromonaphthalen-1-yl)-4-phenyl-6-(pyridin-2-yl)-1,3,5-triazine was used instead of 2-([1,1'-biphenyl]-4-yl)-4-chloro-6-phenyl-1,3,5-triazine.

Synthesis Example 2-23

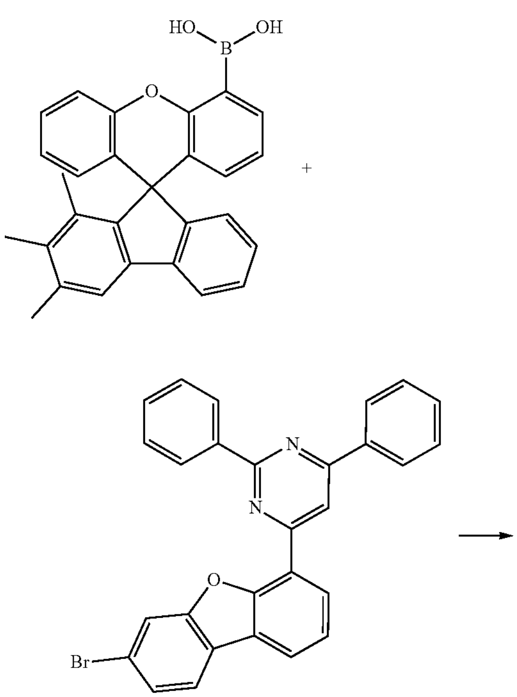

-continued

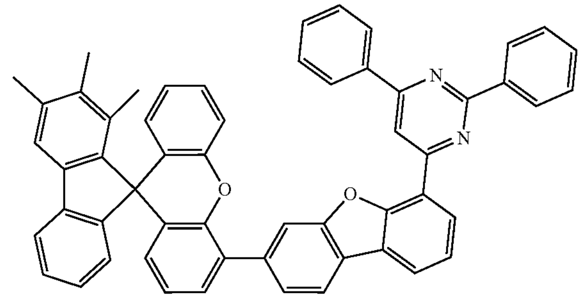

[2-23]

[Compound 2-23] ([M+H]$^+$=771) was prepared in the same manner as in the preparation of Synthesis Example 2-1, except that (1,2,3-trimethylspiro[fluorene-9,9'-xanthen]-4'-yl)boronic acid was used instead of spiro[fluorene-9,9'-xanthen]-2'-ylboronic acid, and 4-(7-bromodibenzo[b,d]-furan-4-yl)-2,6-diphenylpyrimidine was used instead of 2-([1,1'-biphenyl]-4-yl)-4-chloro-6-phenyl-1,3,5-triazine.

Synthesis Example 2-24

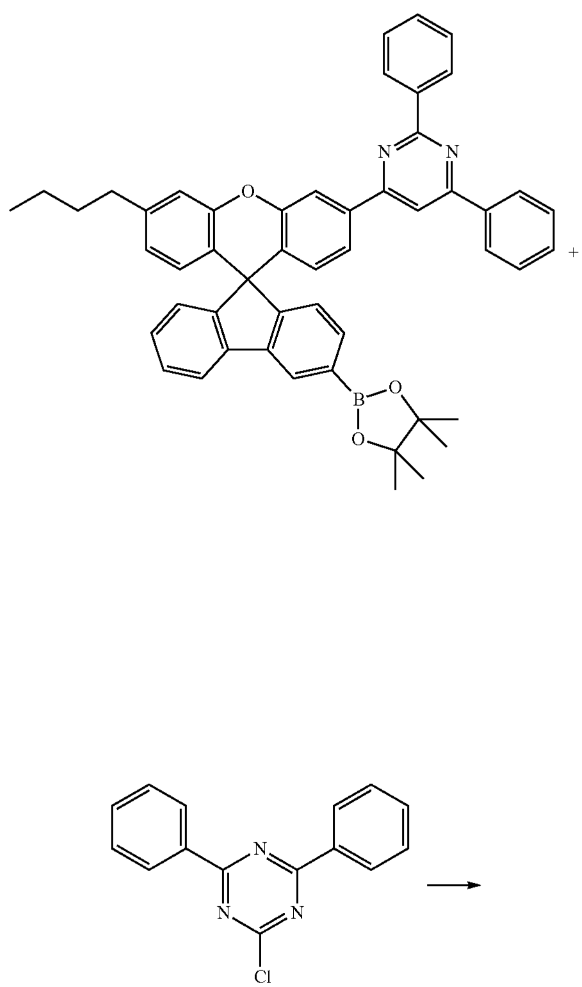

-continued

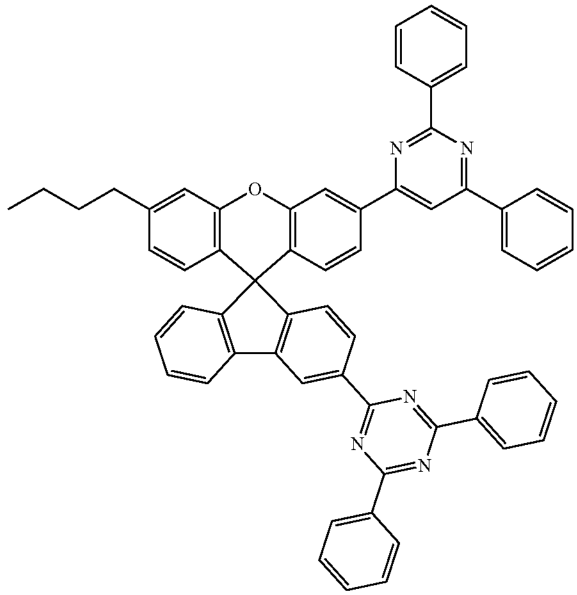

[2-24]

-continued

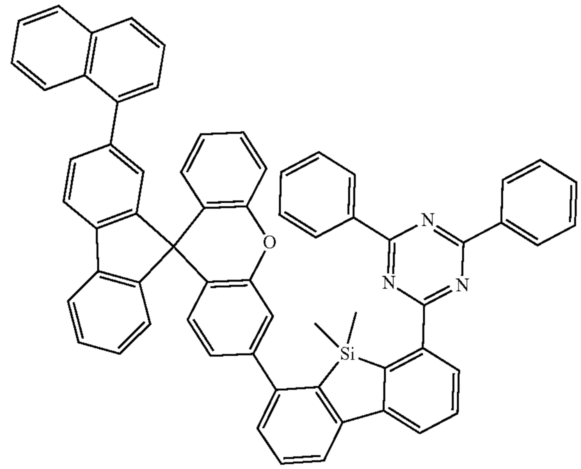

[2-25]

[Compound 2-24] ([M+H]$^+$=850) was prepared in the same manner as in the preparation of Synthesis 2-1, except that 4-(3'-butyl-3-(4,4,5,5-tetramethyl-1,3,2-dioxaborolan-2-yl)spiro[fluorene-9,9'-xanthen]-6'-yl)-2,6-diphenyl-pyrimidine was used instead of spiro[fluorene-9,9'-xanthen]-2'-ylboronic acid, and 2-chloro-4,6-diphenyl-1,3,5-triazine was used instead of 2-([1,1'-biphenyl]-4-yl)-4-chloro-6-phenyl-1,3,5-triazine.

Synthesis Example 2-25

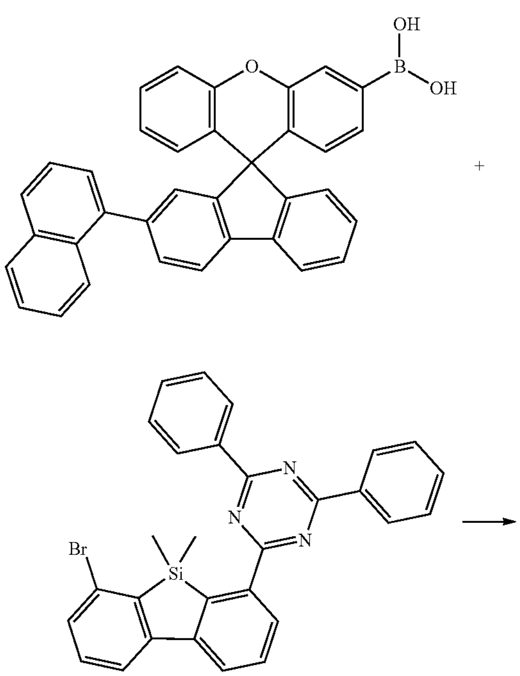

[Compound 2-25] ([M+H]$^+$=898) was prepared in the same manner as in the preparation of Synthesis Example 2-1, except that (2-(naphthalen-1-yl)spiro[fluorene-9,9'-xanthen]-3'-yl)boronic acid was used instead of spiro[fluorene-9,9'-xanthen]-2'-ylboronic acid, and 2-(6-bromo-5,5-dimethyl-5H-dibenzo[b,d]silol-4-yl)-4,6-diphenyl-1,3,5-triazine was used instead of 2-([1,1'-biphenyl]-4-yl)-4-chloro-6-phenyl-1,3,5-triazine.

Synthesis Example 2-26

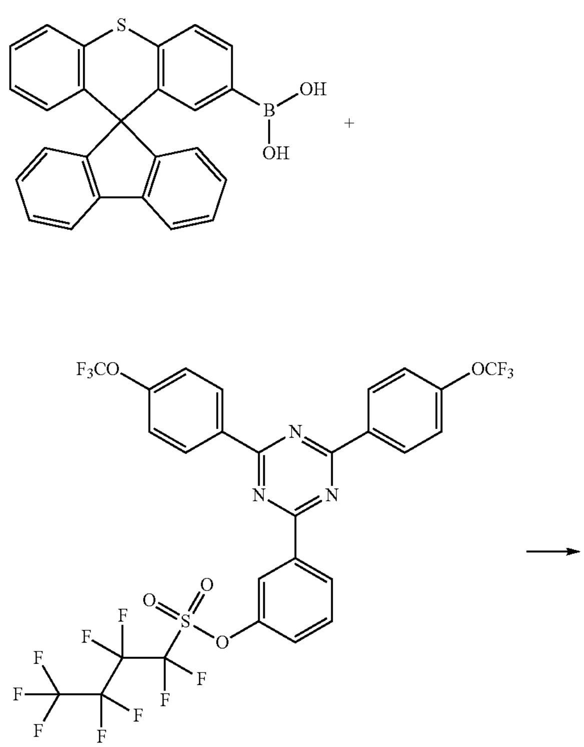

-continued

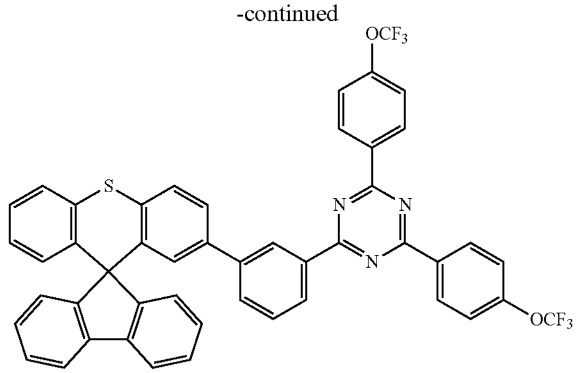

[2-26]

-continued

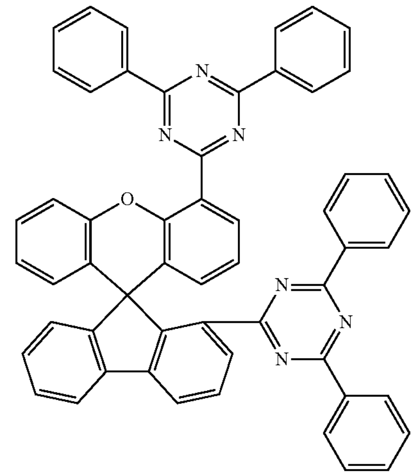

[2-27]

[Compound 2-26] ([M+H]+=824) was prepared in the same manner as in the preparation of Synthesis Example 2-1, except that spiro[fluorene-9,9'-thioxanthen]-2'-ylboronic acid was used instead of spiro[fluorene-9,9'-xanthen]-2'-ylboronic acid, and 3-(4,6-bis(4-(trifluoromethoxy)phenyl)-1,3,5-triazin-2-yl)phenyl 1,1,2,2,3,4,4,4-octafluoro-3-methylbutane-1-sulfonate was used instead of 2-([1,1'-biphenyl]-4-yl)-4-chloro-6-phenyl-1,3,5-triazine.

Synthesis Example 2-27

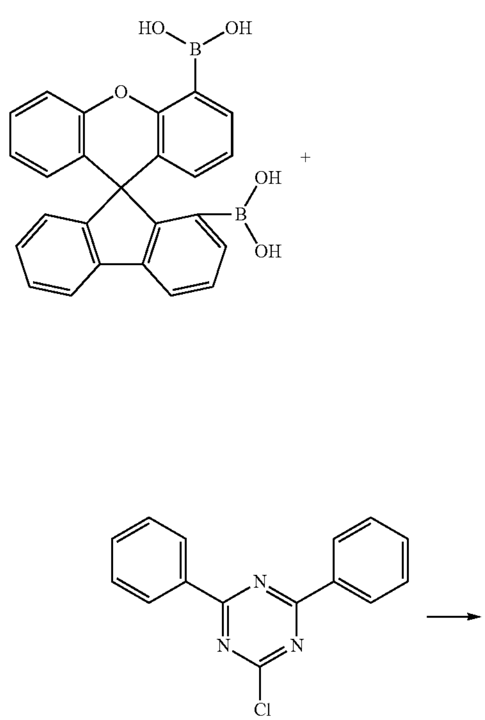

[Compound 2-27] ([M+H]+=795) was prepared in the same manner as in the preparation of Synthesis Example 2-1, except that spiro[fluorene-9,9'-xanthene]-1,4'-diyldiboronic acid was used instead of spiro[fluorene-9,9'-xanthen]-2'-ylboronic acid, and 2-chloro-4,6-diphenyl-1,3,5-triazine was used instead of 2-([1,1'-biphenyl]-4-yl)-4-chloro-6-phenyl-1,3,5-triazine.

Synthesis Example 2-28

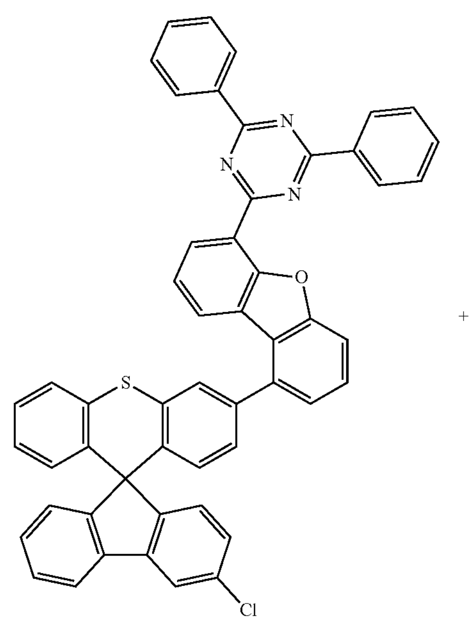

-continued

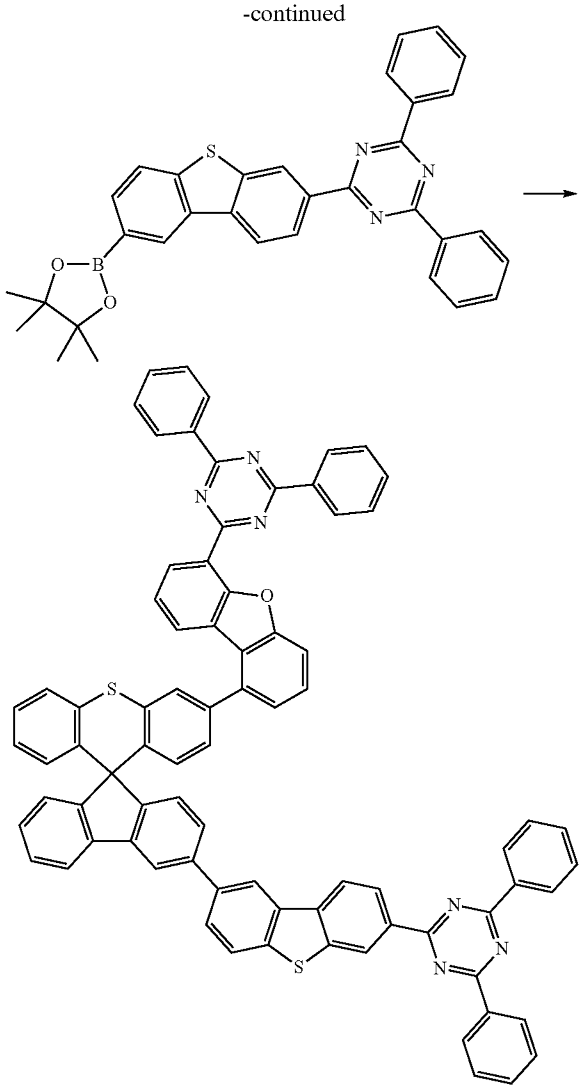

[2-28]

[Compound 2-28] ([M+H]$^+$=1159) was prepared in the same manner as in the preparation of Synthesis Example 2-1, except that 2-(9-(3-chlorospiro[fluorene-9,9'-thioxanthen]-3'-yl)dibenzo[b,d]furan-4-yl)-4,6-diphenyl-1,3,5-triazine was used instead of spiro[fluorene-9,9'-xanthen]-2'-ylboronic acid, and 2,4-diphenyl-6-(8-(4,4,5,5-tetramethyl-1,3,2-dioxaborolan-2-yl)dibenzo[b,d]thiophen-3-yl)-1,3,5-triazine was used instead of 2-([1,1'-biphenyl]-4-yl)-4-chloro-6-phenyl-1,3,5-triazine.

Example 1-1

A glass substrate (Corning 7059 glass) thinly coated with ITO (indium tin oxide) to have a thickness of 100 nm was put into distilled water in which a detergent was dissolved, and ultrasonically washed. A product manufactured by Fischer Co., was used as the detergent, and distilled water twice filtered using a filter manufactured by Millipore Co., was used as the distilled water. After the ITO was washed for 30 minutes, ultrasonic washing was conducted twice repeatedly using distilled water for 10 minutes. After the washing using distilled water was completed, ultrasonic washing was conducted using isopropyl alcohol, acetone, and methanol solvents in this order, and drying was then conducted.

Hexanitrile hexaazatriphenylene (HAT-CN) was thermally vacuum deposited on a transparent ITO electrode, which was thus prepared, thereby forming a hole injection layer having a thickness of 50 nm.

Compound HT1, which is a material for transporting holes, was vacuum deposited thereon, thereby forming a hole transport layer having a thickness of 40 nm.

Compound 1-1 and Compound D1 were vacuum deposited at a weight ratio of 25:1 on the hole transport layer, thereby forming a light emitting layer having a thickness of 30 nm.

Compound ET1 was vacuum deposited on the light emitting layer, thereby forming an electron adjusting layer having a thickness of 3 nm.

Compound 2-1 and Compound LiQ (lithium quinolate) were vacuum deposited at a weight ratio of 1:1 on the electron adjusting layer, thereby forming an electron injection and transport layer having a thickness of 35 nm.

A negative electrode was formed by sequentially depositing lithium fluoride (LiF) and aluminum to have a thickness of 1.2 nm and 200 nm, respectively, on the electron injection and transport layer, thereby manufacturing an organic light emitting device.

In the aforementioned procedure, the deposition rates of the organic materials were maintained at 0.04 nm/sec to 0.07 nm/sec, the deposition rates of lithium fluoride and aluminum were maintained at 0.03 nm/sec and at 0.2 nm/sec, respectively, and the degree of vacuum during the deposition was maintained at $2\times10^{-7}$ torr to $5\times10^{-6}$ torr.

HAT-CN

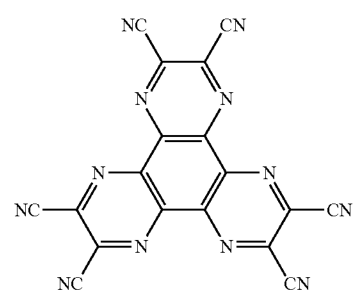

HT1

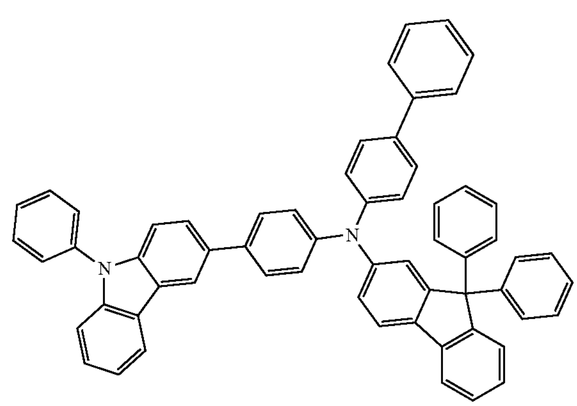

-continued
D1
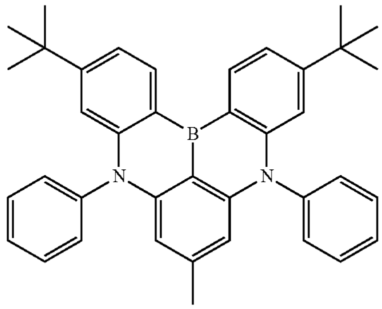
ET1
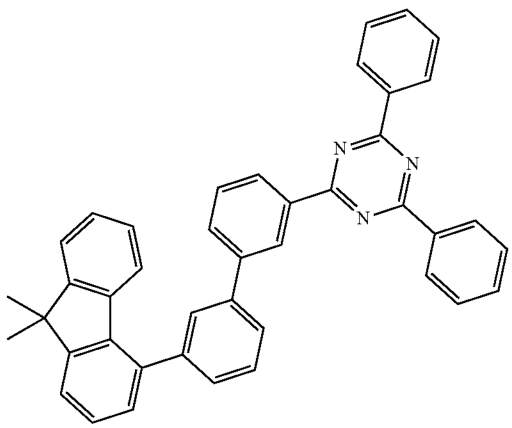
-continued
LiQ
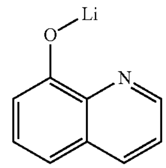
Examples 1-2 to 1-12 and 2-1 to 2-12
Organic light emitting devices were manufactured in the same manner as in Example 1-1, except that the compounds of the following Table 1 were used instead of Compound 1-1 and Compound 2-1.
1-1
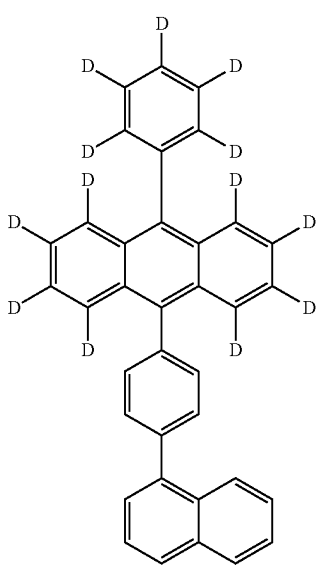
1-2
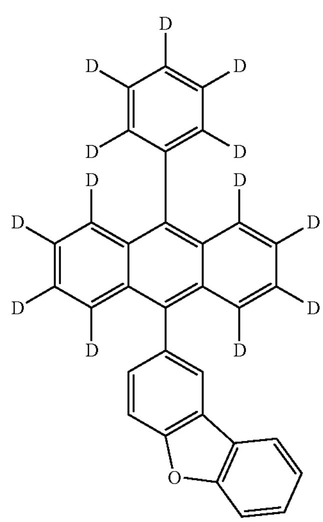

-continued
1-3
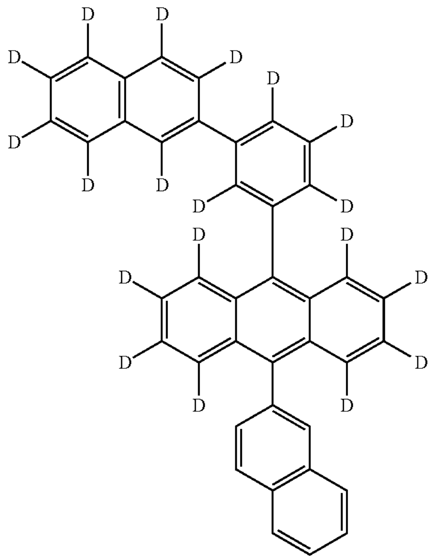
1-4
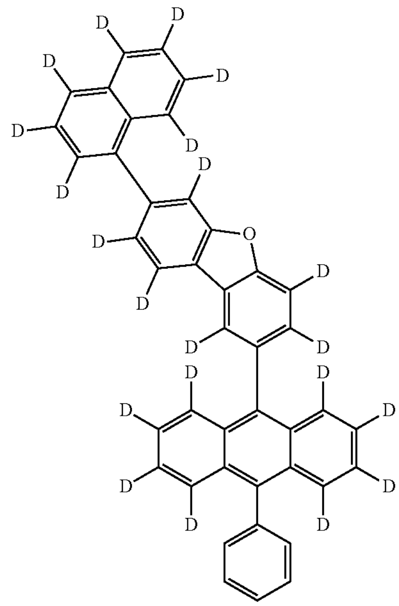
1-5
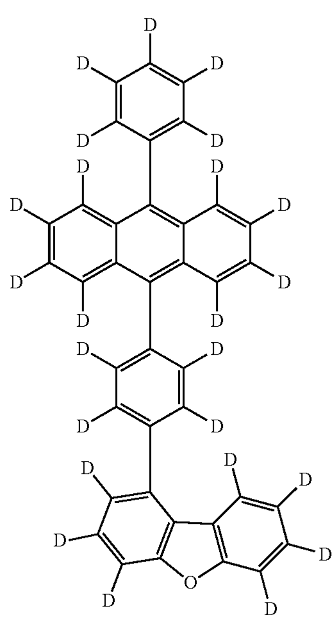
1-6
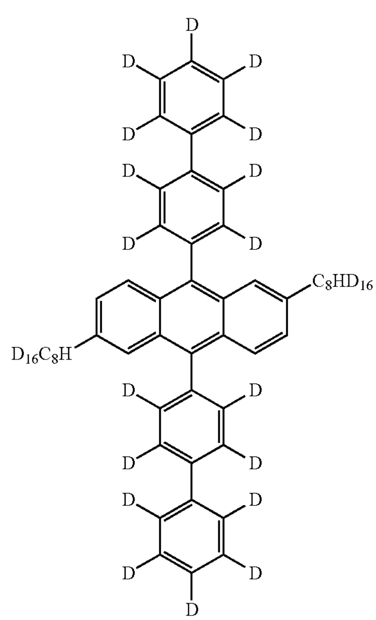

-continued
1-7
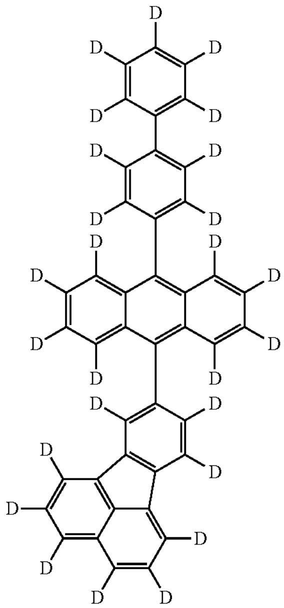
1-8
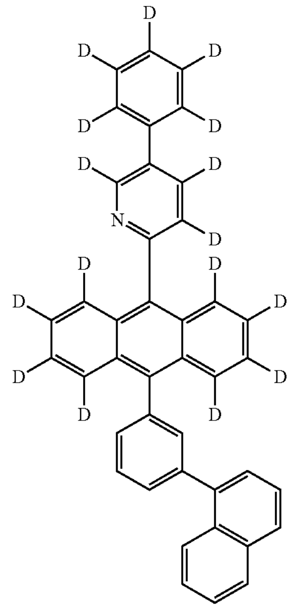
1-9
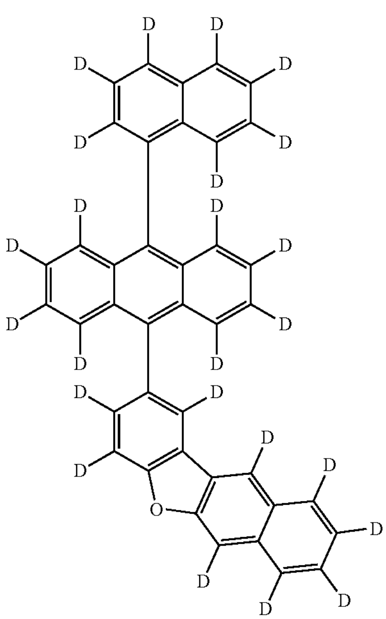
1-10
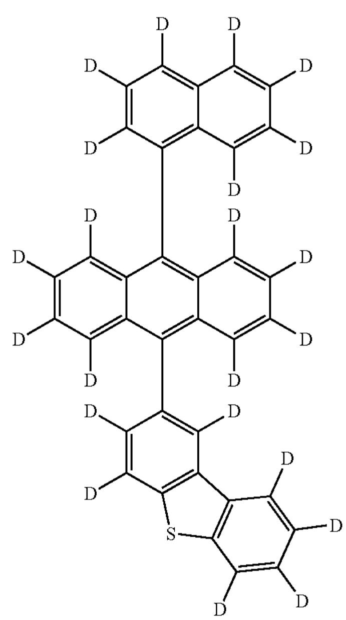

-continued
1-11
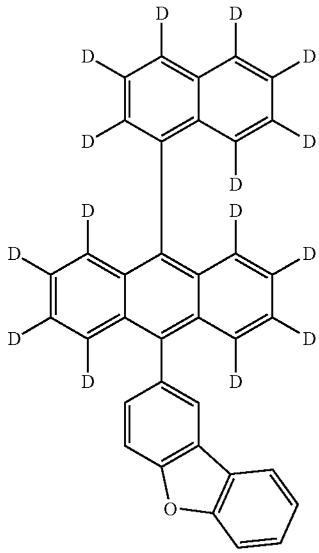
1-12
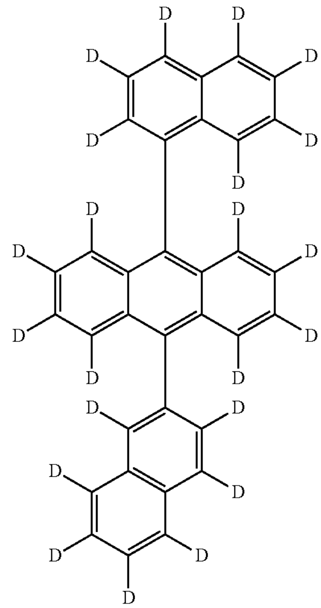
1-13
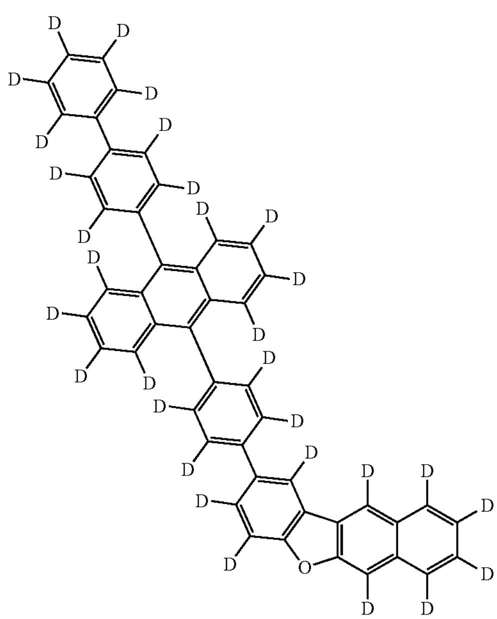
1-14
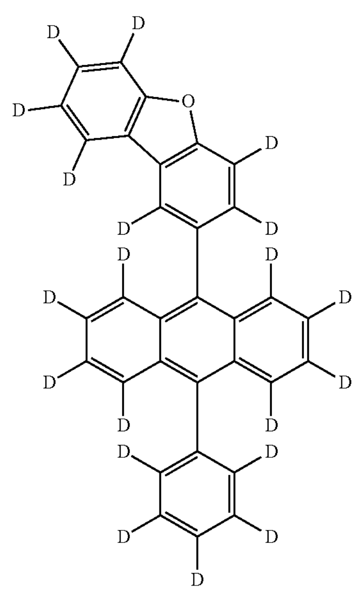

-continued
1-15
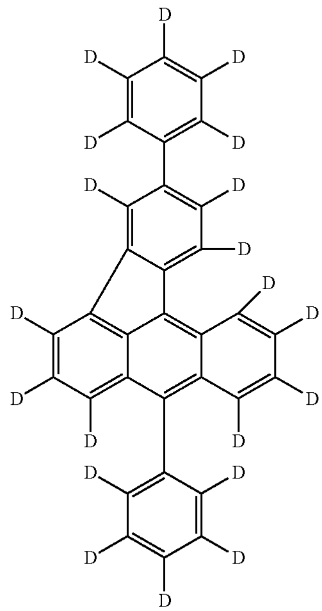
1-16
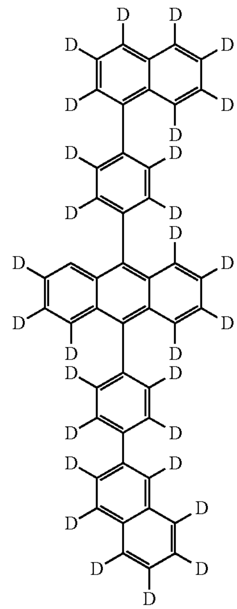
1-17
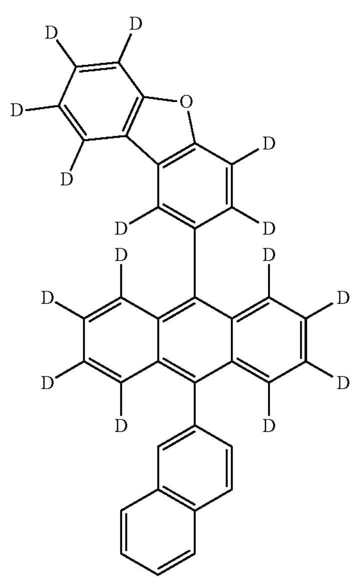
2-1
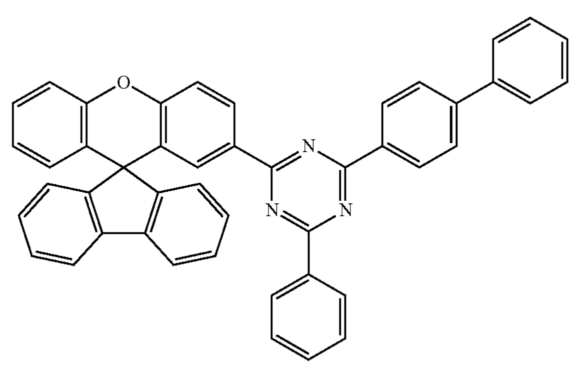

-continued
2-2
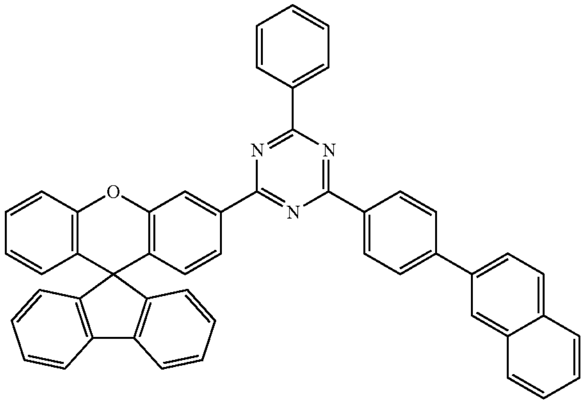
2-3
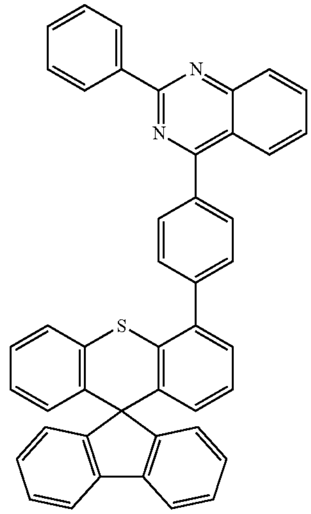
2-4
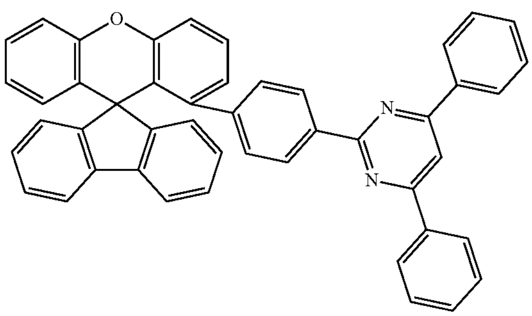
2-5
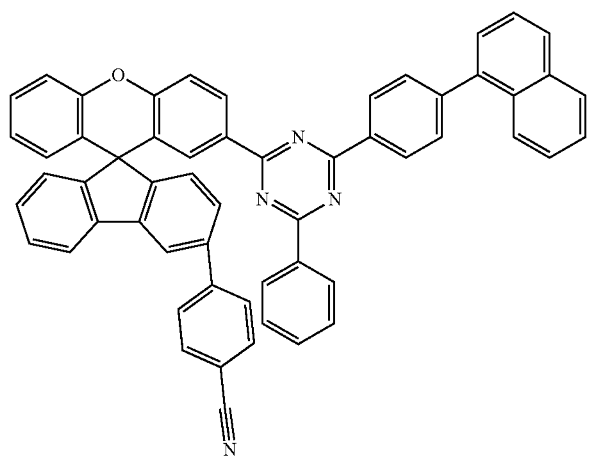
2-6
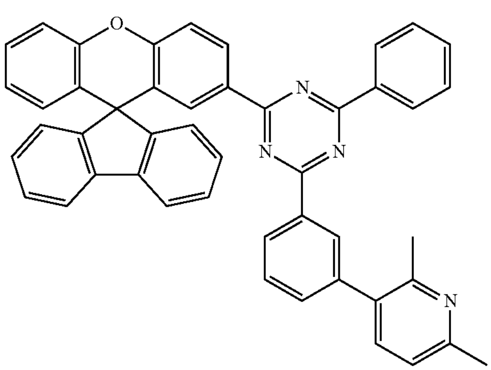
2-7
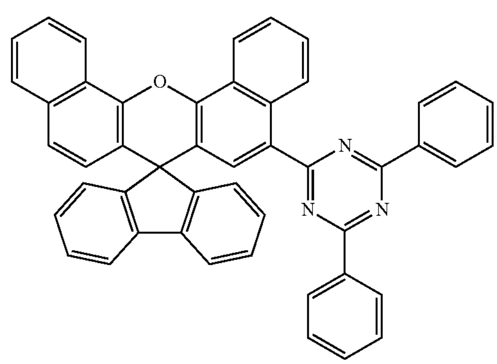

-continued
2-8
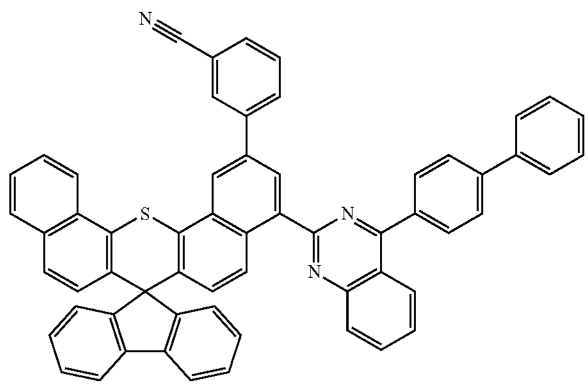
2-9
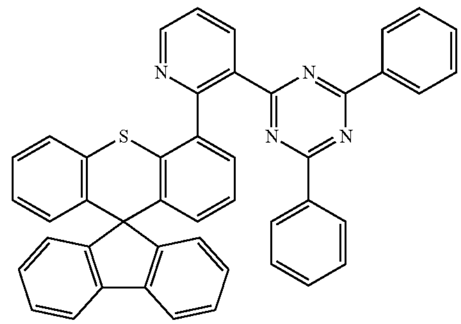
2-10
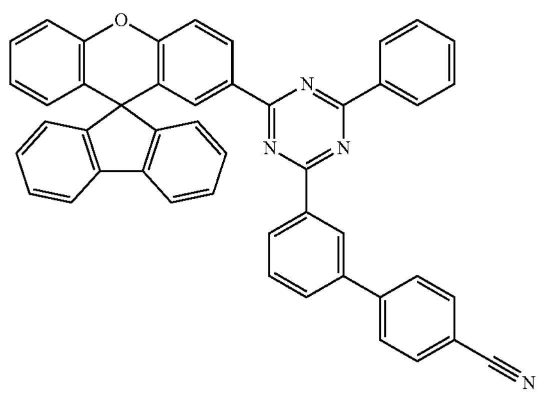
2-11
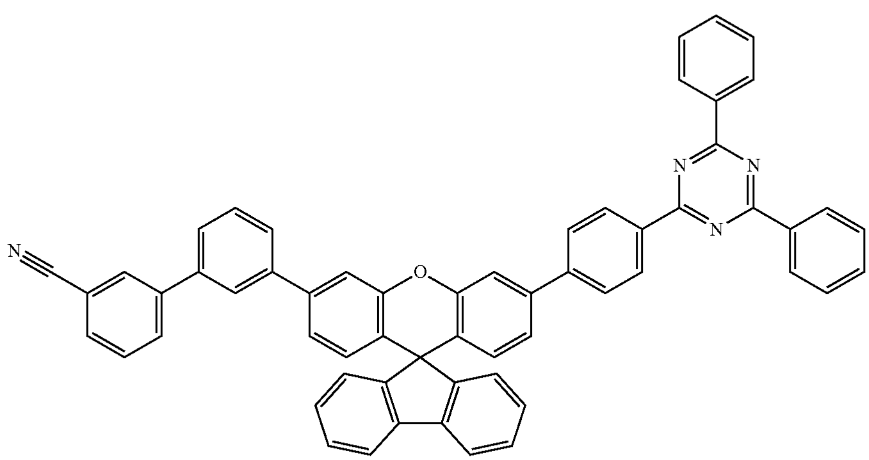
2-12
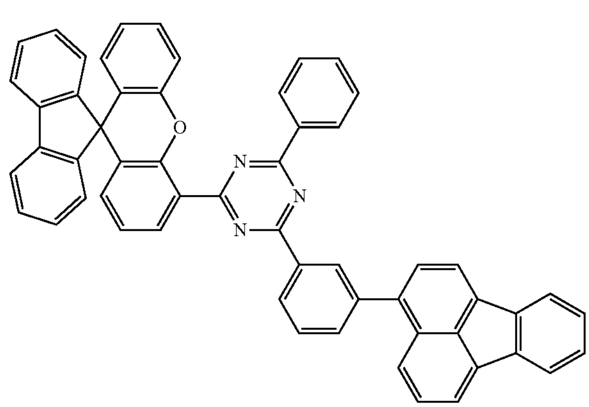
2-13
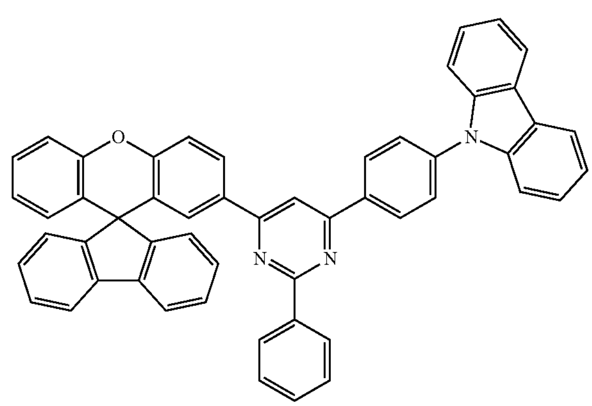

-continued
2-14
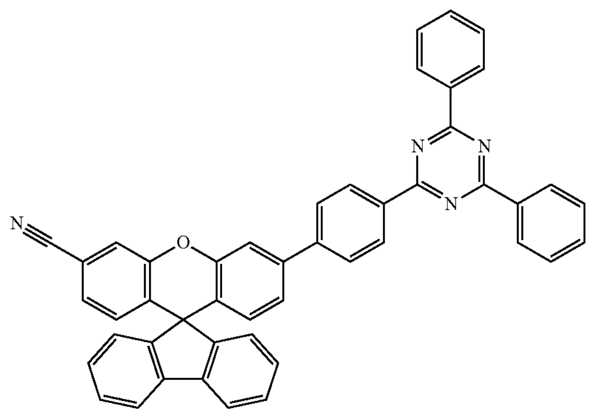
2-15
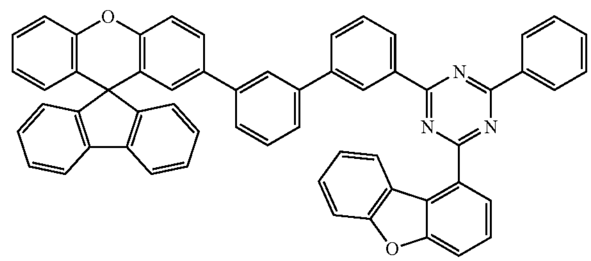
2-17
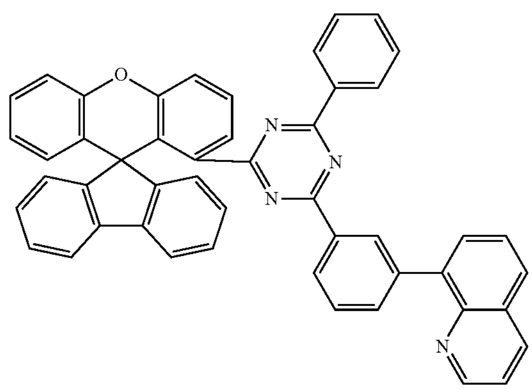
2-18
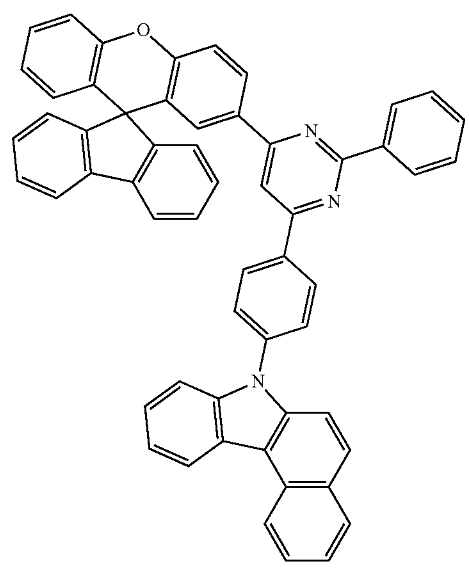
2-19
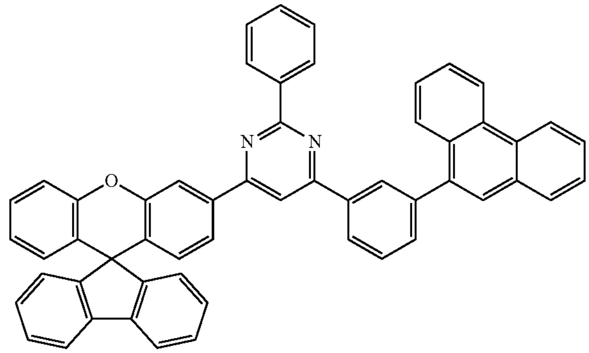
2-20
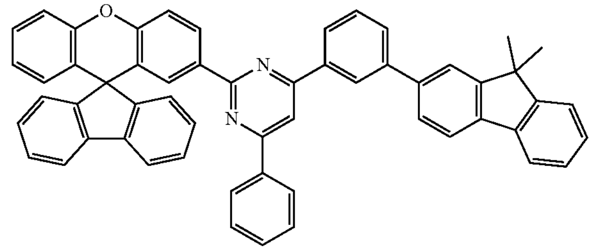

-continued
2-21
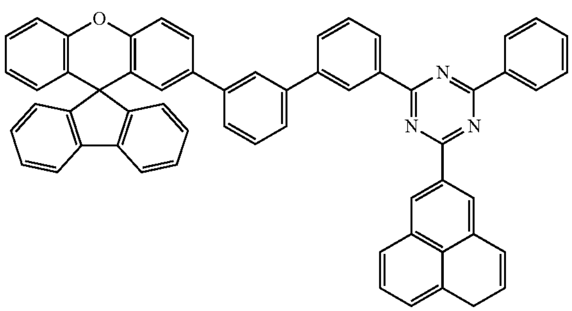
2-22
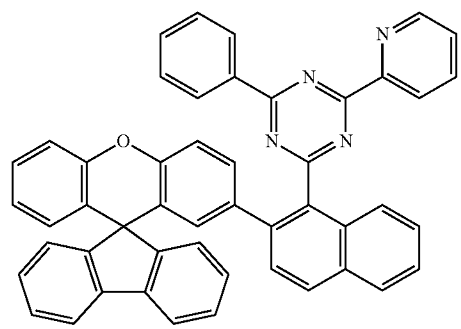
2-23
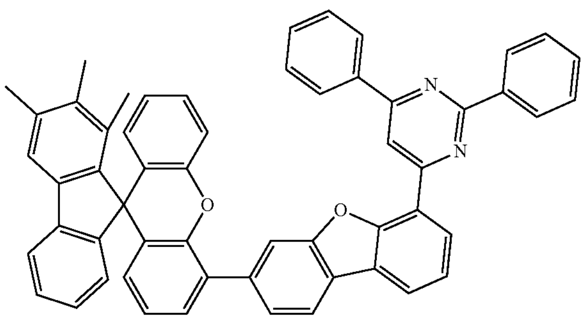
2-24
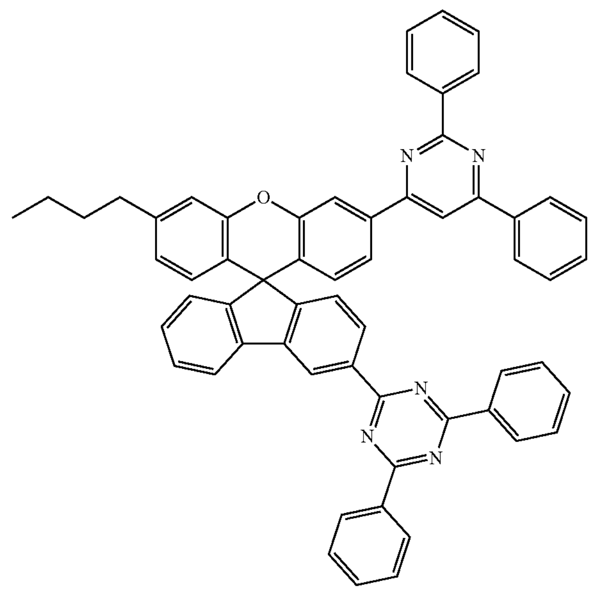
2-25
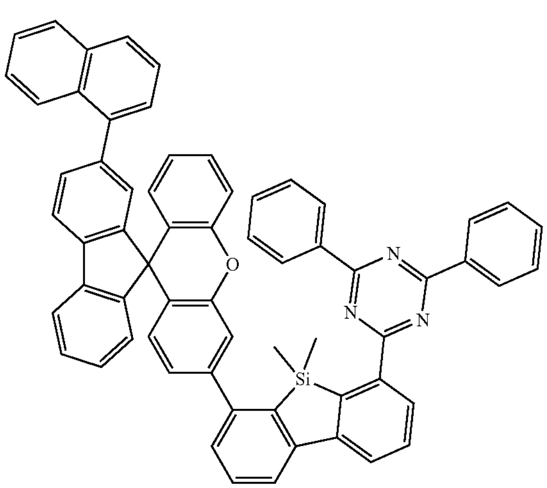
2-26
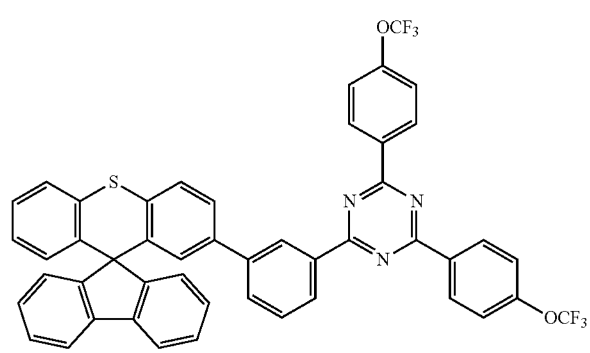

-continued
2-27
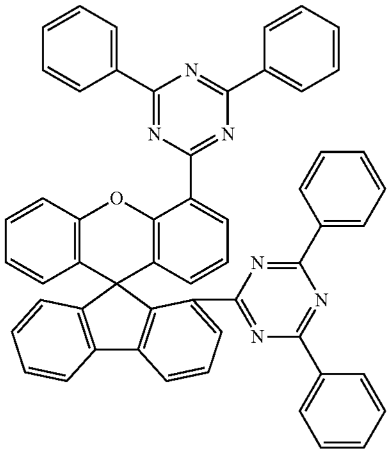
2-28
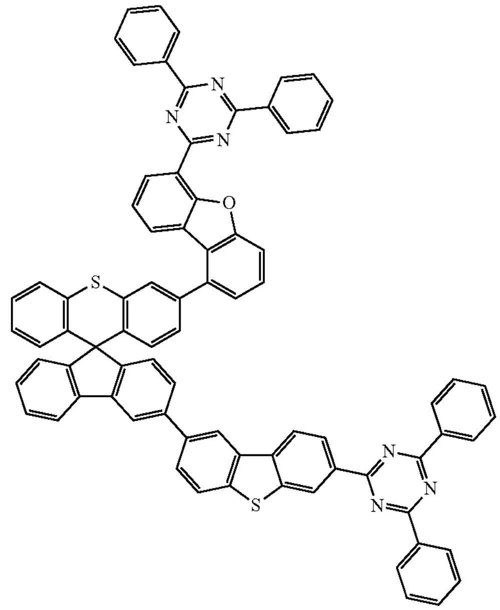
Comparative Examples 1-1 to 1-5 and 2-1 to 2-7
Organic light emitting devices were manufactured in the same manner as in Example 1-1, except that the compounds of the following Table 1 were used instead of Compound 1-1 and Compound 2-1.
H-A
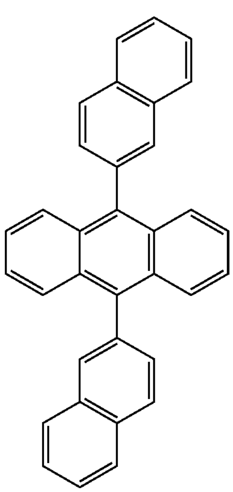
-continued
H-B
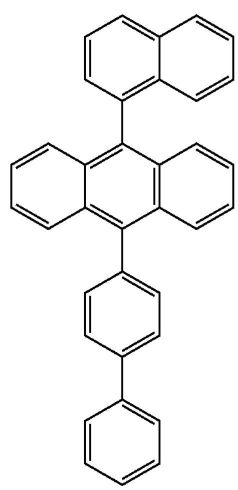

-continued
H-C
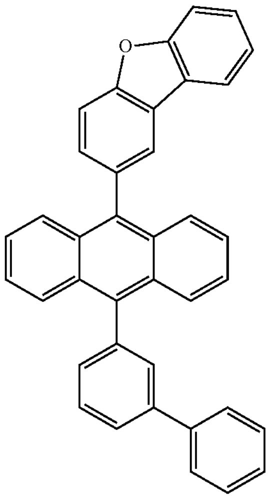
H-D
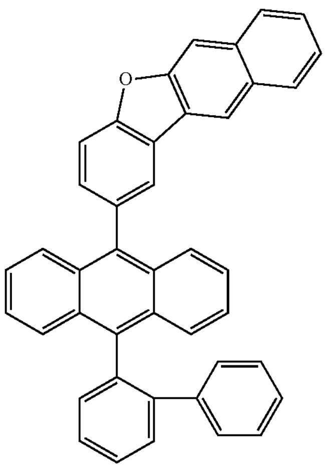
H-E
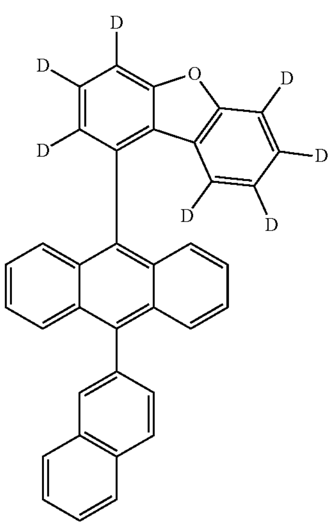
-continued
ET-A
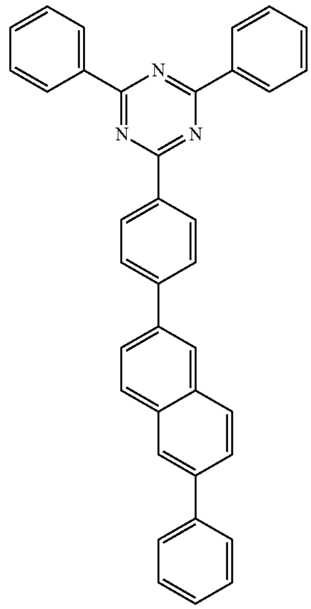
ET-B
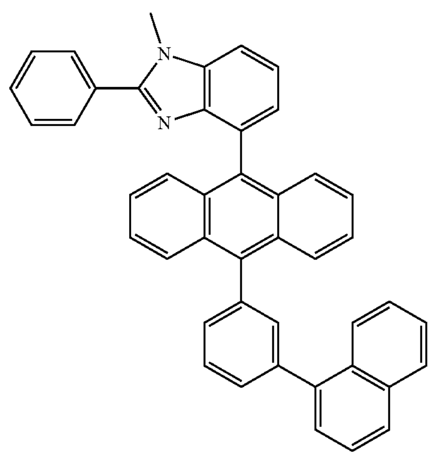
ET-C
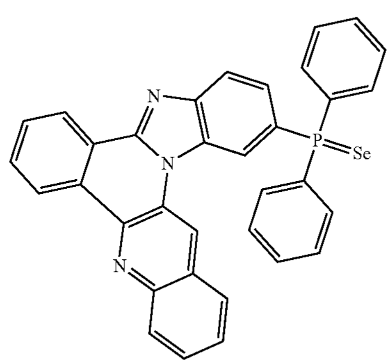

-continued

ET-D

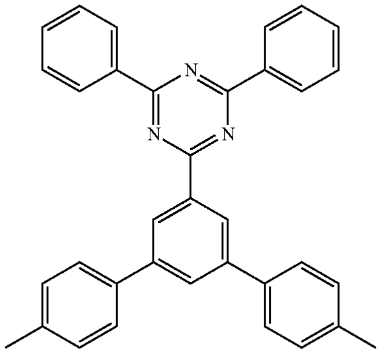

ET-E

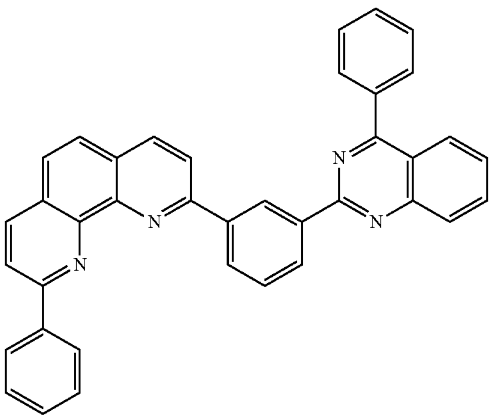

-continued

ET-F

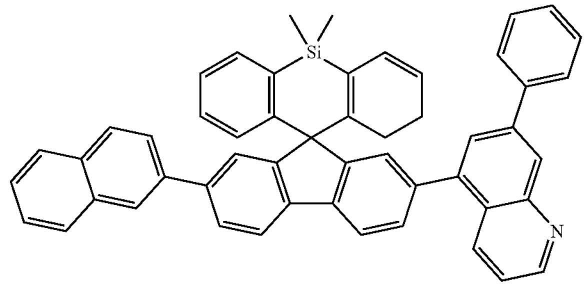

For each of the organic light emitting devices of the Examples and the Comparative Examples, the driving voltage and the light emitting efficiency were measured at a current density of 10 mA/cm$^2$, and a time (LT98) for the luminance to reach a 98% value compared to the initial luminance was measured at a current density of 20 mA/cm$^2$. The results are shown in the following Tables 1 and 2.

TABLE 1

| | Light emitting layer | Electron injection and transport layer | Voltage (V) | Current efficiency (cd/A) | Color coordinate (x, y) | LT98 (h) |
|---|---|---|---|---|---|---|
| Example 1-1 | Compound 1-1 | Compound 2-1 | 3.89 | 4.61 | (0.140, 0.126) | 161 |
| Example 1-2 | Compound 1-3 | Compound 2-1 | 3.91 | 4.57 | (0.140, 0.126) | 176 |
| Example 1-3 | Compound 1-6 | Compound 2-6 | 3.91 | 4.62 | (0.140, 0.126) | 162 |
| Example 1-4 | Compound 1-7 | Compound 2-5 | 3.93 | 4.55 | (0.140, 0.126) | 194 |
| Example 1-5 | Compound 1-12 | Compound 2-10 | 3.88 | 4.57 | (0.140, 0.126) | 172 |
| Example 1-6 | Compound 1-15 | Compound 2-14 | 3.92 | 4.60 | (0.140, 0.126) | 178 |
| Example 1-7 | Compound 1-17 | Compound 2-15 | 3.94 | 4.54 | (0.140, 0.126) | 175 |
| Example 1-8 | Compound 1-7 | Compound 2-28 | 3.96 | 4.49 | (0.140, 0.126) | 168 |
| Example 1-9 | Compound 1-3 | Compound 2-19 | 3.86 | 4.61 | (0.140, 0.126) | 175 |
| Example 1-10 | Compound 1-1 | Compound 2-23 | 3.84 | 4.66 | (0.140, 0.126) | 165 |
| Example 1-11 | Compound 1-12 | Compound 2-24 | 3.87 | 4.63 | (0.140, 0.126) | 184 |
| Example 1-12 | Compound 1-16 | Compound 2-13 | 3.93 | 4.59 | (0.140, 0.126) | 173 |
| Comparative Example 1-1 | H-A | Compound 2-25 | 4.09 | 4.35 | (0.140, 0.127) | 106 |
| Comparative Example 1-2 | H-B | Compound 2-21 | 4.06 | 4.38 | (0.141, 0.127) | 101 |

TABLE 1-continued

| | Light emitting layer | Electron injection and transport layer | Voltage (V) | Current efficiency (cd/A) | Color coordinate (x, y) | LT98 (h) |
|---|---|---|---|---|---|---|
| Comparative Example 1-3 | Compound 1-15 | ET-C | 4.18 | 4.10 | (0.140, 0.127) | 123 |
| Comparative Example 1-4 | Compound 1-1 | ET-E | 4.13 | 4.08 | (0.140, 0.127) | 118 |
| Comparative Example 1-5 | H-A | ET-F | 4.25 | 3.97 | (0.141, 0.127) | 98 |

From Table 1, it was confirmed that when the compound of Formula 2 having high efficiency characteristics and the compound of Formula 1 having low voltage and long service life characteristics due to the substitution of deuterium were used together, insufficient characteristics of the compound of Formula 1 and the compound of Formula 2 complemented each other, and thus a better device could be implemented.

TABLE 2

| | Light emitting layer | Electron injection and transport layer | Voltage (V) | Current efficiency (cd/A) | Color coordinate (x, y) | LT98 (h) |
|---|---|---|---|---|---|---|
| Example 2-1 | Compound 1-2 | Compound 2-19 | 3.79 | 4.65 | (0.140, 0.126) | 174 |
| Example 2-2 | Compound 1-4 | Compound 2-12 | 3.75 | 4.61 | (0.140, 0.126) | 179 |
| Example 2-3 | Compound 1-5 | Compound 2-20 | 3.68 | 4.67 | (0.140, 0.126) | 184 |
| Example 2-4 | Compound 1-8 | Compound 2-18 | 3.76 | 4.59 | (0.140, 0.126) | 178 |
| Example 2-5 | Compound 1-9 | Compound 2-26 | 3.80 | 4.62 | (0.140, 0.126) | 175 |
| Example 2-6 | Compound 1-10 | Compound 2-27 | 3.78 | 4.60 | (0.140, 0.126) | 178 |
| Example 2-7 | Compound 1-11 | Compound 2-11 | 3.75 | 4.67 | (0.140, 0.126) | 183 |
| Example 2-8 | Compound 1-13 | Compound 2-9 | 3.79 | 4.58 | (0.140, 0.126) | 191 |
| Example 2-9 | Compound 1-14 | Compound 2-17 | 3.69 | 4.63 | (0.140, 0.126) | 186 |
| Example 2-10 | Compound 1-5 | Compound 2-4 | 3.73 | 4.61 | (0.140, 0.126) | 188 |
| Example 2-11 | Compound 1-10 | Compound 2-3 | 3.83 | 4.56 | (0.140, 0.126) | 176 |
| Example 2-12 | Compound 1-14 | Compound 2-7 | 3.75 | 4.60 | (0.140, 0.126) | 178 |
| Comparative Example 2-1 | H-D | Compound 2-8 | 4.10 | 4.26 | (0.140, 0.127) | 109 |
| Comparative Example 2-2 | H-E | Compound 2-26 | 4.07 | 4.34 | (0.140, 0.127) | 111 |
| Comparative Example 2-3 | Compound 1-10 | ET-B | 4.14 | 4.02 | (0.140, 0.127) | 122 |
| Comparative Example 2-4 | Compound 1-4 | ET-D | 4.11 | 4.07 | (0.140, 0.126) | 125 |
| Comparative Example 2-5 | Compound 1-8 | ET-A | 4.15 | 3.99 | (0.140, 0.127) | 116 |
| Comparative Example 2-6 | H-C | ET-D | 4.23 | 3.99 | (0.140, 0.127) | 100 |
| Comparative Example 2-7 | H-E | ET-B | 4.17 | 4.04 | (0.140, 0.126) | 103 |

As in the above-described Table 1, from Table 2, it was confirmed that insufficient characteristics of the compound of Formula 1 and the compound of Formula 2 complemented each other, and thus a better device could be implemented. In particular, Comparative Example Compound H-E has the same structure as that of Formula 1, but it can be seen that the deuterium substitution rate is less than 40%, and service life characteristics deteriorate compared to those of the device of the present invention.

Further, it can be seen that Compounds 1-2, 1-4, 1-5, 1-9 to 1-11, 1-13, and 1-14 of Table 2 include a heteroaryl group (a dibenzofuran group, a naphthobenzofuran group, or a dibenzothiophene group) as Ar101 or Ar102, and long service life characteristics are further improved compared to those of compounds including only an aryl group.

The invention claimed is:

1. An organic light emitting device, comprising:

a positive electrode;

a negative electrode; and a first organic material layer and a second organic material layer provided between the positive electrode and the negative electrode, wherein the first organic material layer comprises a compound of the following Formula 1, and the second organic material layer comprises a compound of the following Formula 2:

Formula 1

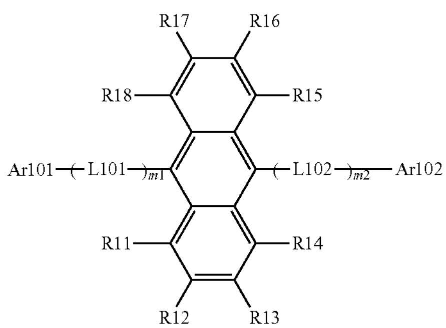

wherein in Formula 1:

L101 and L102 are the same as or different from each other, and are each independently a direct bond, a substituted or unsubstituted arylene group, or a substituted or unsubstituted heteroarylene group;

R11 to R18 are deuterium, or adjacent substituents are bonded to each other to form a ring substituted with deuterium;

Ar101 and Ar102 are the same as or different from each other, and are each independently a substituted or unsubstituted aryl group, or a substituted or unsubstituted heteroaryl group, or are linked to an adjacent substituent to form a substituted or unsubstituted ring;

m1 and m2 are each an integer from 0 to 5;

when m1 is 2 or higher, the L101s are the same as or different from each other, and when m2 is 2 or higher, the L102s are the same as or different from each other, and the compound of Formula 1 is at least 40% or more deuterated;

Formula 2

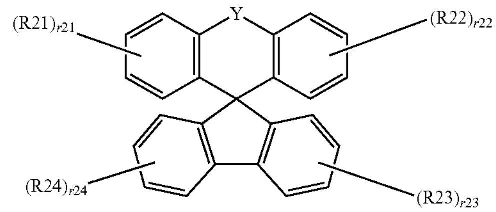

wherein in Formula 2:

Y is O or S;

R21 to R24 are the same as or different from each other, and are each independently hydrogen, deuterium, a nitrile group, a substituted or unsubstituted alkyl group, a substituted or unsubstituted aryl group, or a substituted or unsubstituted heterocyclic group, or are the following Formula 3, or adjacent substituents are bonded to each other to form a substituted or unsubstituted ring;

at least one of R21 and R22 is the following Formula 3;

r21 to r24 are the same as or different from each other, and are each independently an integer from 0 to 4, and when r21 is 2 or higher, the R21s are the same as or different from each other, and when r22 is 2 or higher, the R22s are the same as or different from each other, and when r23 is 2 or higher, the R23s are the same as or different from each other, and when r24 is 2 or higher, the R24s are the same as or different from each other;

Formula 3

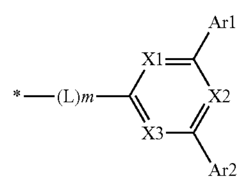

wherein in Formula 3:

X1 is N or C(R31), X2 is N or C(R32), X3 is N or C(R33), and one or more of X1 to X3 are N;

R31, R32, and R33 are the same as or different from each other, and are each independently hydrogen, a substituted or unsubstituted aryl group, or a substituted or unsubstituted heterocyclic group, or are bonded to Ar1 or Ar2 to form a substituted or unsubstituted aromatic hydrocarbon ring or a substituted or unsubstituted hetero ring;

Ar1 and Ar2 are the same as or different from each other, and are each independently an aryl group which is unsubstituted or substituted with R41, or a heterocyclic group which is unsubstituted or substituted with R42, or are bonded to R31, R32, or R33 to form a substituted or unsubstituted aromatic hydrocarbon ring or a substituted or unsubstituted hetero ring;

R41 and R42 are the same as or different from each other, and are each independently one selected from the group consisting of deuterium, a halogen group, a nitrile group, an alkyl group, a haloalkyl group, an alkoxy group, a silyl group, an aryl group, and a heterocyclic group, or a group to which two or more substituents are linked;

L is a direct bond, a substituted or unsubstituted arylene group, or a substituted or unsubstituted divalent heterocyclic group;

m is an integer from 0 to 4, and when m is 2 or higher, the Ls are the same as or different from each other; and

* is a moiety bonded to Formula 2.

2. The organic light emitting device of claim 1, wherein Formula 3 is any one of the following Formulae 301 to 303:

Formula 301

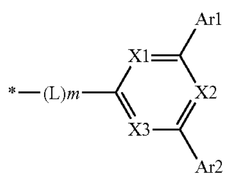

Formula 302

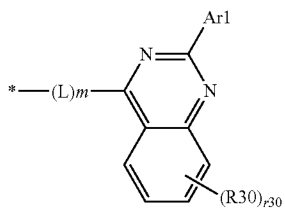

Formula 303

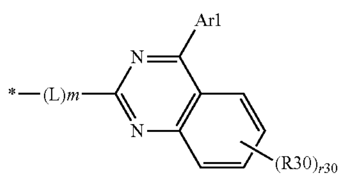

wherein in Formulae 301 to 303:

the definitions of L, m, Ar1, and Ar2 are the same as those defined in Formula 3;

one or more of X1 to X3 are N, and the others are CH or CD;

R30 is hydrogen, deuterium, a substituted or unsubstituted alkyl group, a substituted or unsubstituted aryl group, or a substituted or unsubstituted heteroaryl group; and r30 is an integer from 0 to 4, and when r30 is 2 or higher, the R30s are the same as or different from each other.

3. The organic light emitting device of claim 1, wherein Formula 2 is any one of the following Formulae 201, 203, and 204:

Formula 201

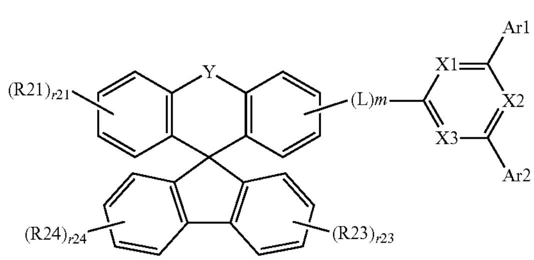

-continued

Formula 203

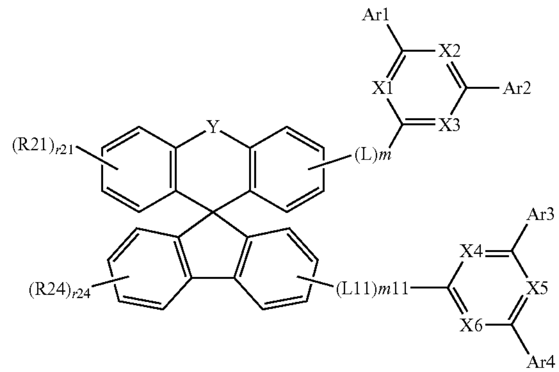

Formula 204

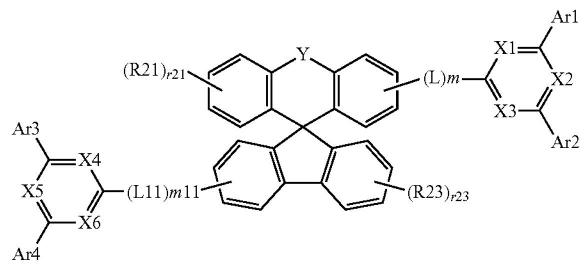

wherein in Formulae 201, 203, and 204:

the definitions of X1 to X3, L, m, Ar1, Ar2, R21 to R24, r21 to r24, and Y are the same as those defined in Formula 2;

X4 is N or C(R34), X5 is N or C(R35), X6 is N or C(R36), and one or more of X4 to X6 are N;

R34, R35, and R36 are the same as or different from each other, and are each independently hydrogen or deuterium, or are bonded to Ar3 or Ar4 to form a substituted or unsubstituted aromatic hydrocarbon ring or a substituted or unsubstituted hetero ring;

Ar3 and Ar4 are the same as or different from each other, and are each independently an aryl group which is unsubstituted or substituted with R43, or a heterocyclic group which is unsubstituted or substituted with R44, or are bonded to R34, R35, or R36 to form a substituted or unsubstituted aromatic hydrocarbon ring or a substituted or unsubstituted hetero ring;

R43 and R44 are the same as or different from each other, and are each independently one selected from the group consisting of deuterium, a halogen group, a nitrile group, an alkyl group, a haloalkyl group, an alkoxy group, a silyl group, an aryl group, and a heterocyclic group, or a group to which two or more substituents are linked;

L11 is a direct bond, a substituted or unsubstituted arylene group, or a substituted or unsubstituted divalent heterocyclic group;

m11 is an integer from 0 to 4, and when m11 is 2 or higher, the L11s are the same as or different from each other.

4. The organic light emitting device of claim 1, wherein Formula 2 is any one of the following Formulae 211 to 214:

Formula 211

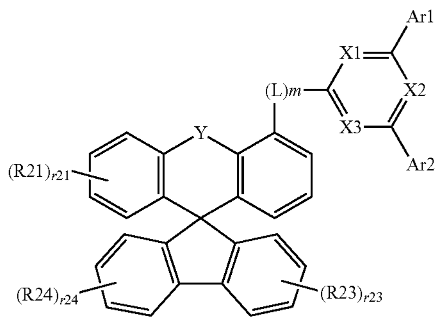

Formula 212

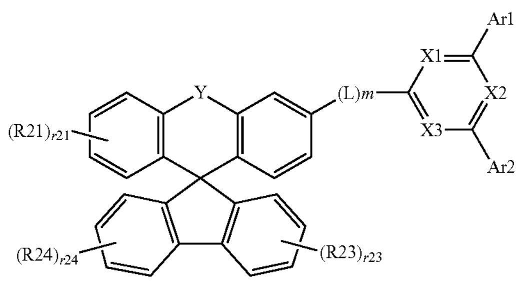

Formula 213

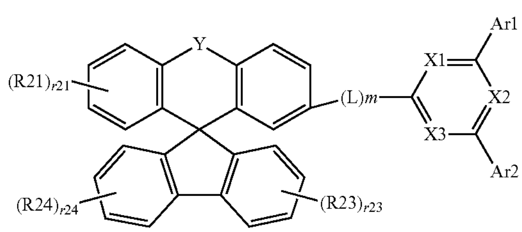

Formula 214

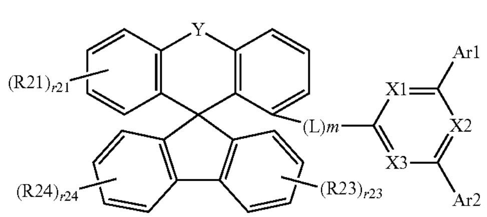

wherein in Formulae 211 to 214:

the definitions of X1 to X3, L, m, Ar1, Ar2, R21 to R24, r21 to r24, and Y are the same as those defined in Formula 2.

5. The organic light emitting device of claim 1, wherein Formula 2 is any one of the following Formulae 401 to 403:

Formula 401

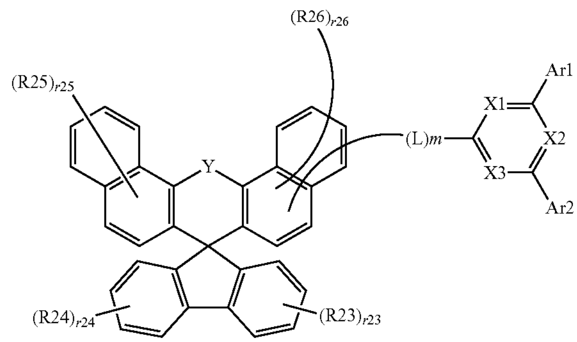

Formula 402

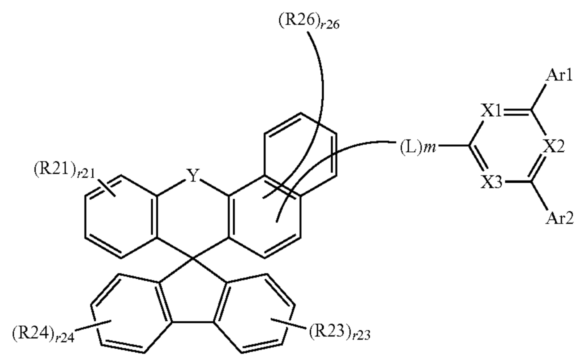

Formula 403

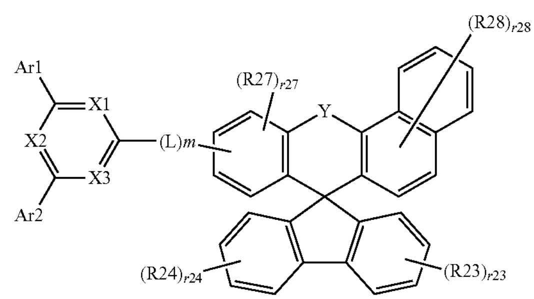

wherein in Formulae 401 to 403:

the definitions of X1 to X3, L, m, Ar1, Ar2, R23, R24, r23, r24, and Y are the same as those defined in Formula 2;

R25 to R28 are the same as or different from each other, and are each independently hydrogen, deuterium, a nitrile group, a substituted or unsubstituted alkyl group, a substituted or unsubstituted aryl group, or a substituted or unsubstituted heterocyclic group; and r25 and r28 are each an integer from 0 to 6, r26 is an integer from 0 to 5, r27 is an integer from 0 to 3, r28 and r26 are the same as or different from each other, and are each independently an integer from 0 to 6, and when r25 is 2 or higher, the R25s are the same as or different from each other, and when r26 is 2 or higher, the R26s are the same as or different from each other, and when r27 is 2 or higher, the R27s are the same as or different from each other, and when r28 is 2 or higher, the R28s are the same as or different from each other.

6. The organic light emitting device of claim 1, wherein the compound of Formula 1 is 60% or more deuterated.

7. The organic light emitting device of claim 1, wherein one of Ar101 and Ar102 is a substituted or unsubstituted C2-C20 heteroaryl group, and the other is a substituted or unsubstituted C6-C20 aryl group.

8. The organic light emitting device of claim 1, wherein the compound of Formula 1 is any one compound selected from the following Compounds M1 to M5 and M7 to M34:

Compound M1

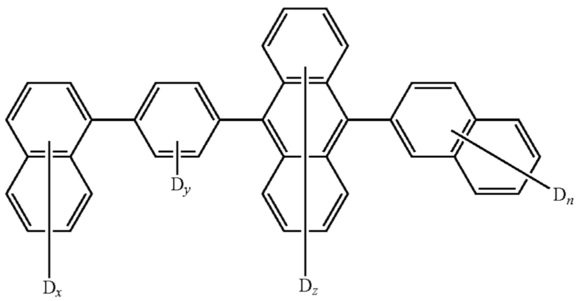

wherein in Compound M1, z is 8 and a value of x+y+z+n is 20 to 26;

Compound M2

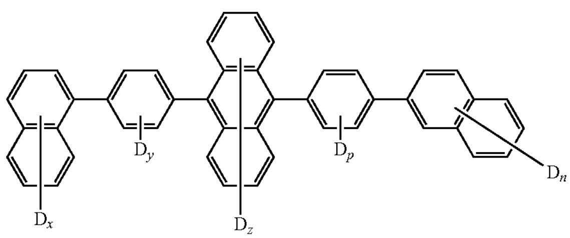

wherein in Compound M2, z is 8 and a value of x+y+z+p+n is 24 to 30;

Compound M3

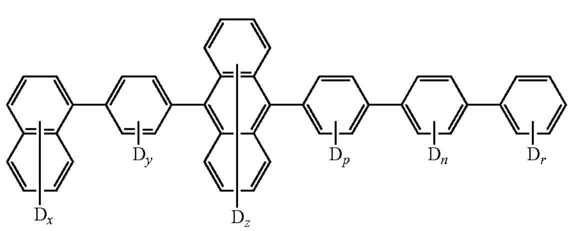

wherein in Compound M3, z is 8 and a value of x+y+z+p+n+r is 26 to 32;

Compound M4

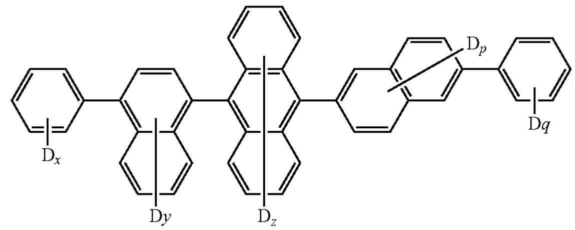

wherein in Compound M4, z is 8 and a value of x+y+z+q+n is 22 to 30;

Compound M5

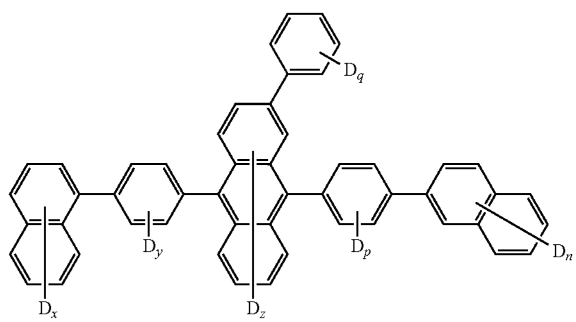

wherein in Compound M5, z is 8 and a value of x+y+z+p+n+q is 28 to 34;

Compound M7

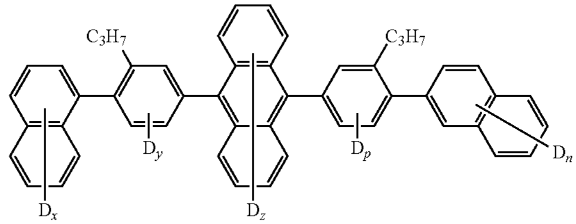

wherein in Compound M7, z is 8 and a value of x+y+z+p+n is 22 to 28;

Compound M8

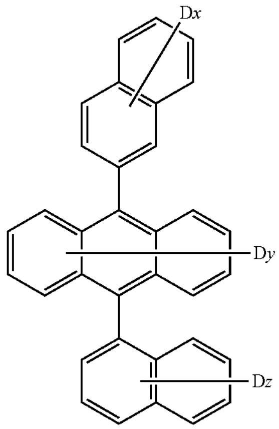

wherein in Compound M8, y is 8 and a value of x+y+z is 16 to 22;

Compound M9

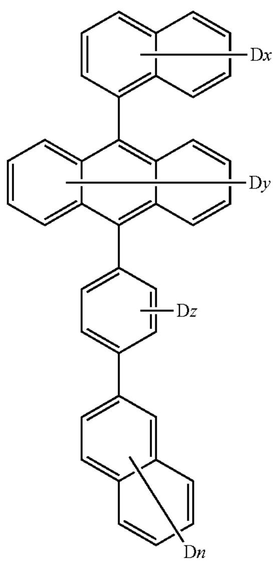

wherein in Compound M9, y is 8 and a value of x+y+z+n is 20 to 26;

Compound M10

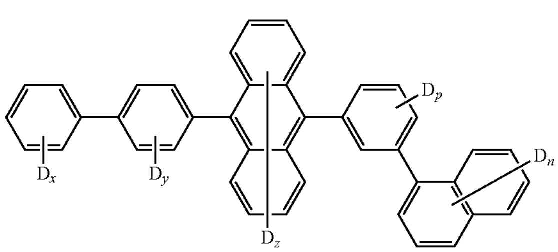

wherein in Compound M10, z is 8 and a value of x+y+z+p+n is 22 to 28;

Compound M11

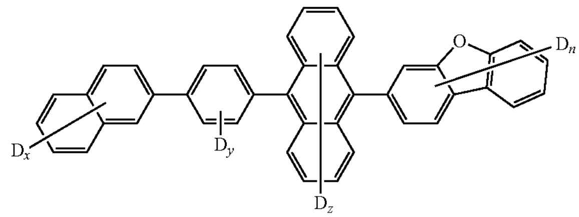

wherein in Compound M11, z is 8 and a value of x+y+z+n is 20 to 26;

Compound M12

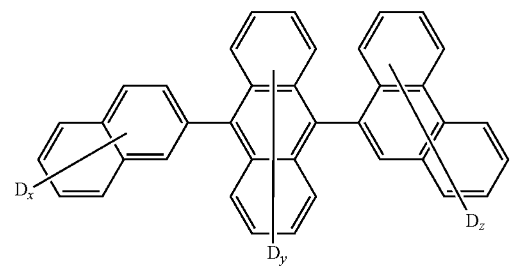

wherein in Compound M1, y is 8 and a value of x+y+z is 18 to 24;

Compound M13

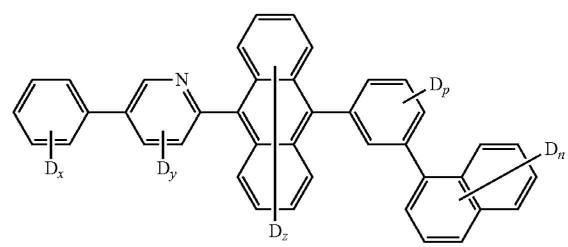

wherein in Compound M13, z is 8 and a value of x+y+z+p+n is 21 to 27;

Compound M14

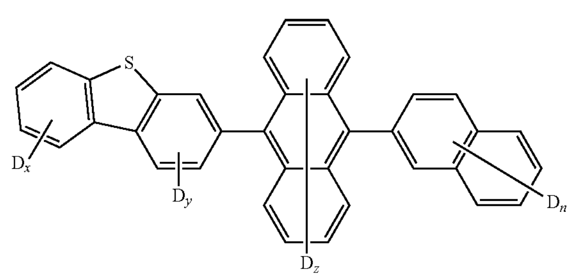

wherein in Compound M14, z is 8 and a value of x+y+2+n is 16 to 22;

Compound M15

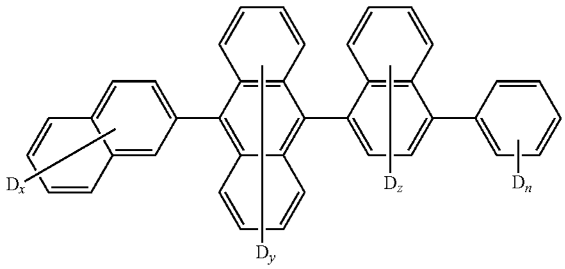

wherein in Compound M15, y is 8 and a value of x+y+z+n is 20 to 26;

Compound M16

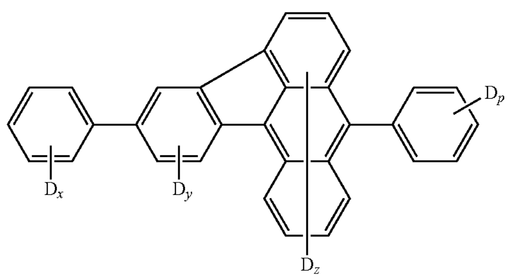

wherein in Compound M16, z is 7, y is 3, and a value of x+y+z+p is 14 to 20;

Compound M17

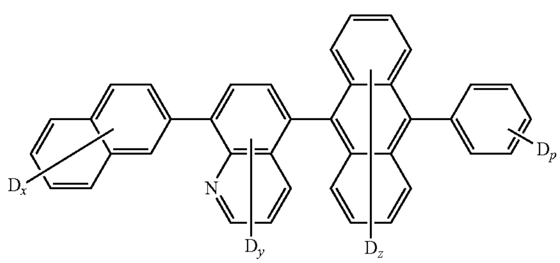

wherein in Compound M17, z is 8 and a value of x+y+z+p is 19 to 25;

Compound M18

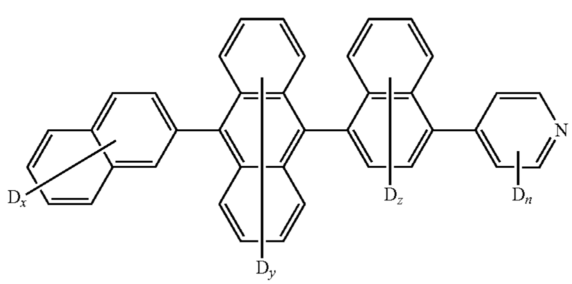

wherein in Compound M18, y is 8 and a value of x+y+z+n is 19 to 25;

Compound M19

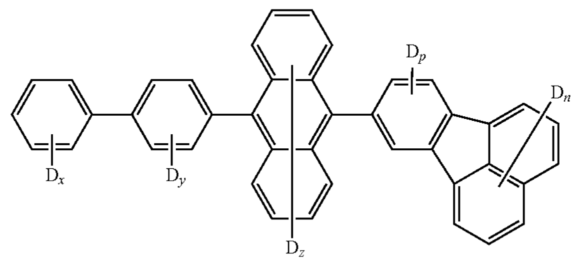

wherein in Compound M19, z is 8 and a value of x+y+z+p+n is 20 to 26;

Compound M20

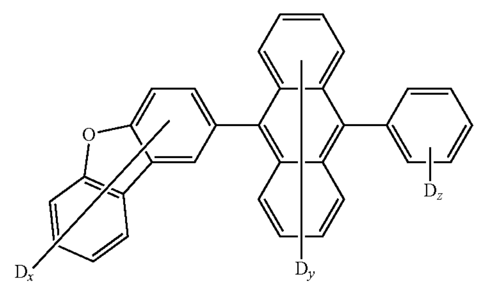

wherein in Compound M20, y is 8 and a value of x+y+z is 14 to 20;

Compound M21

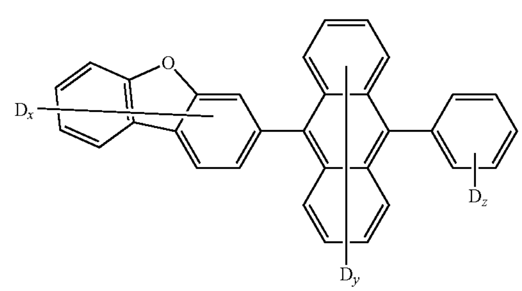

wherein in Compound M21, y is 8 and a value of x+y+z is 14 to 20;

Compound M22

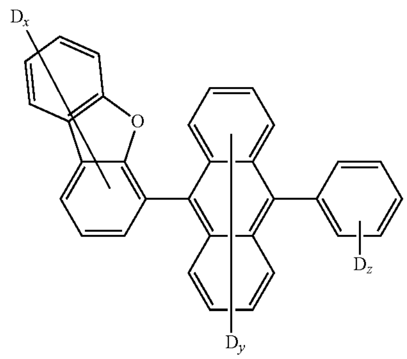

wherein in Compound M22, y is 8 and a value of x+y+z is 14 to 20;

Compound M23

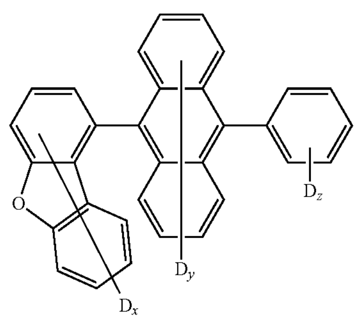

wherein in Compound M23, y is 8 and a value of x+y+z is 14 to 20;

Compound M24

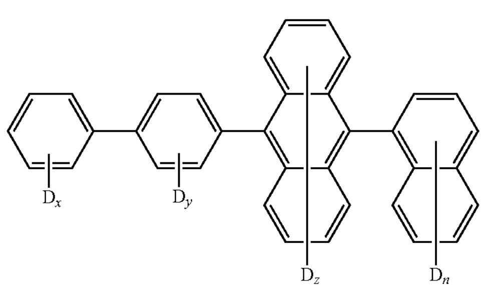

wherein in Compound M24, z is 8 and a value of x+y+z+n is 18 to 24;

Compound M25

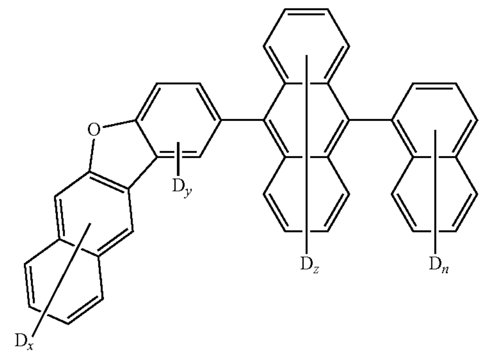

wherein in Compound M25, z is 8 and a value of x+y+z+p is 16 to 22;

Compound M26

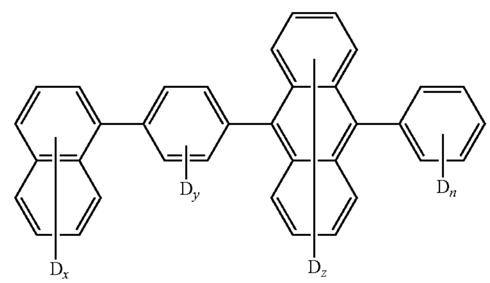

wherein in Compound M26, z is 8 and a value of x+y+2+n is 12 to 24;

Compound M27

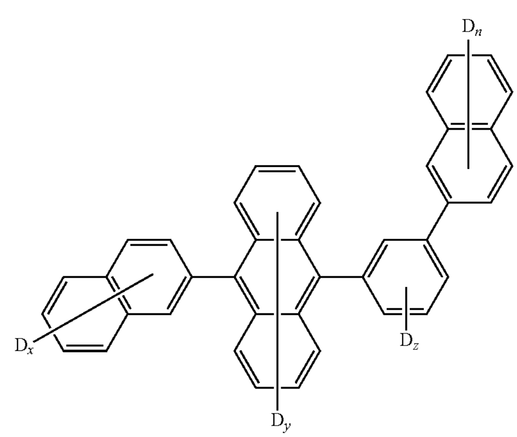

wherein in Compound M27, y is 8 and a value of x+y+z+n is 13 to 26;

Compound M28

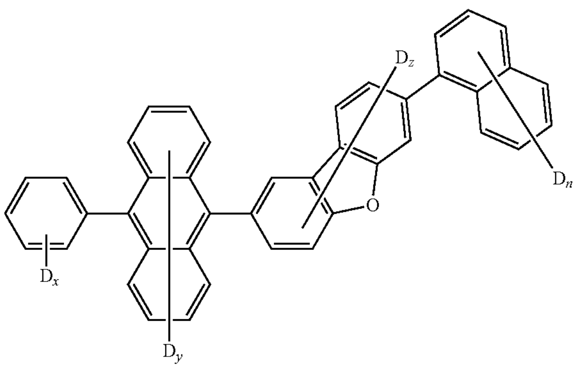

wherein in Compound M28, y is 8 and a value of x+y+z+n is 16 to 22;

Compound M29

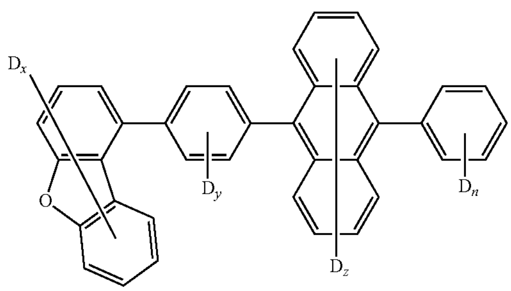

wherein in Compound M29, z is 8 and a value of x+y+z+n is 12 to 24;

Compound M30

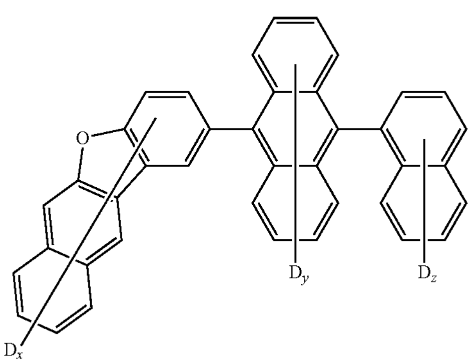

wherein in Compound M30, y is 8 and a value of x+y+z is 12 to 24;

Compound M31

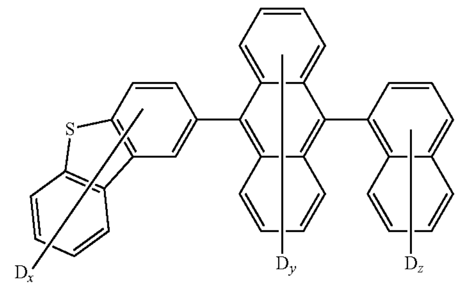

wherein in Compound M31, y is 8 and a value of x+y+z is 11 to 22;

Compound M32

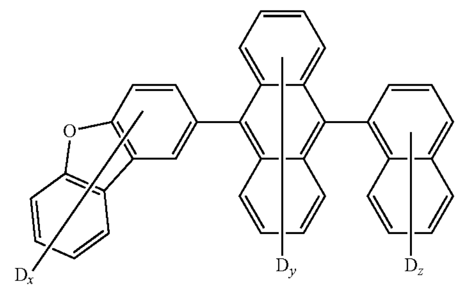

wherein in Compound M32, y is 8 and a value of x+y+z is 11 to 22;

Compound M33

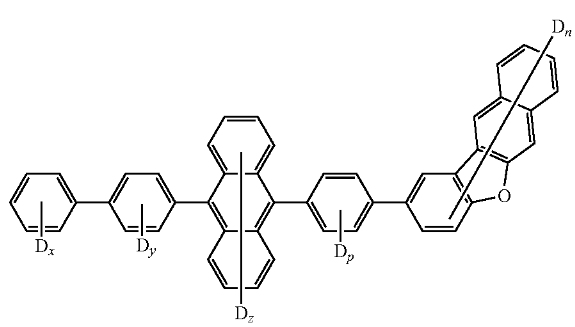

wherein in Compound M33, z is 8 and a value of x+y+z+p+n is 15 to 30;

Compound M34
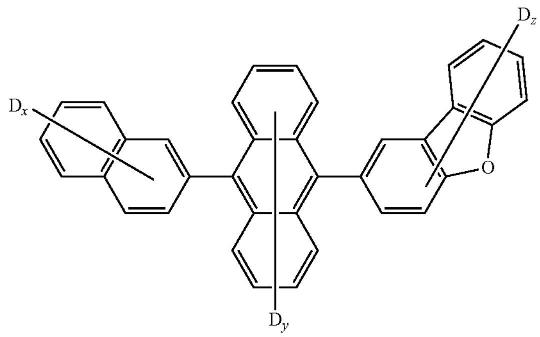
wherein in Compound M34, y is 8 and a value of x+y+z is 11 to 22.
9. The organic light emitting device of claim 1, wherein the compound of Formula 1 is any one compound selected from the following compounds:
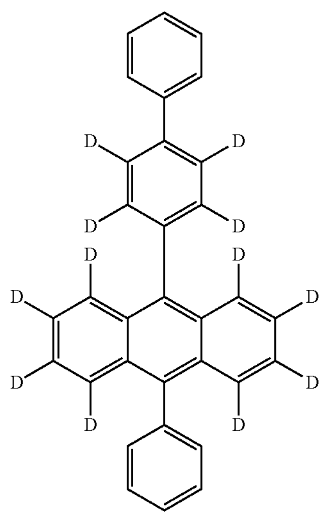
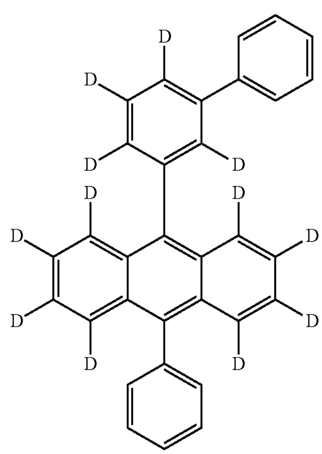
-continued
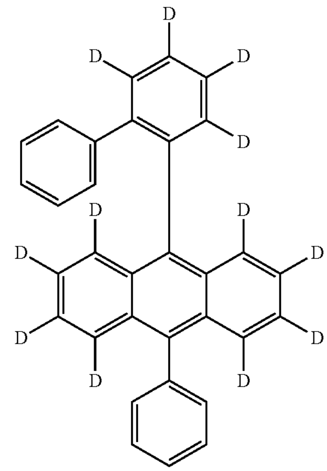
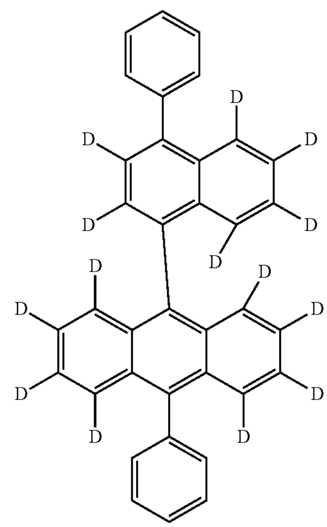
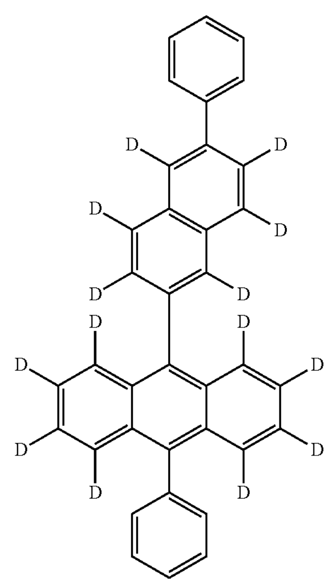

-continued
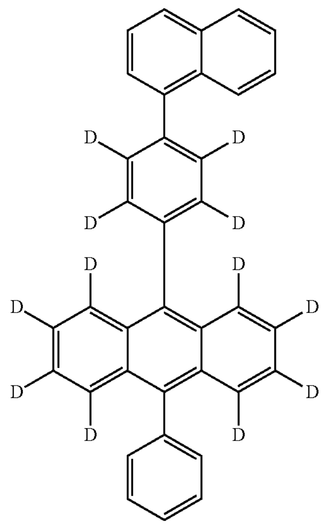
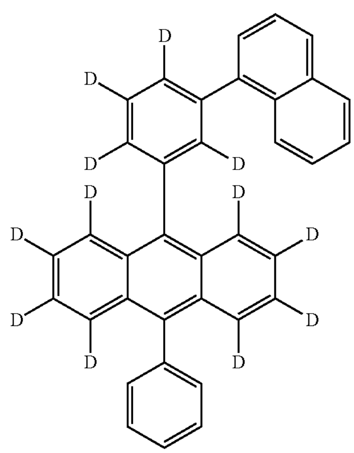
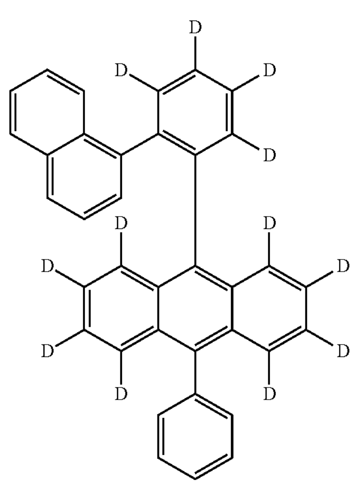
-continued
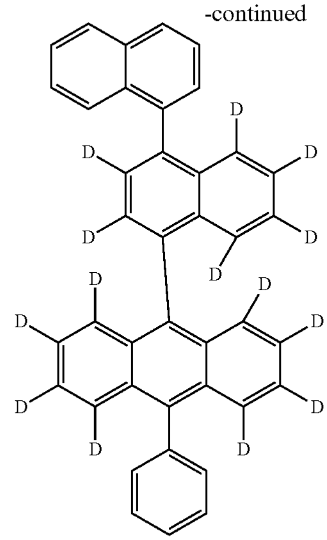
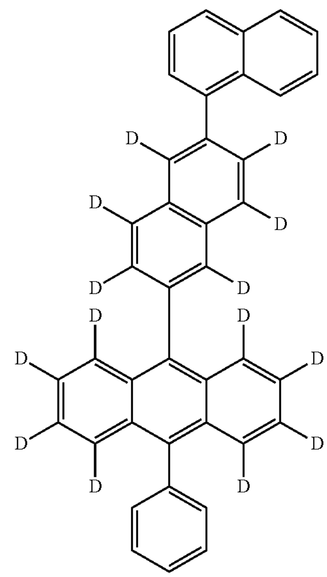
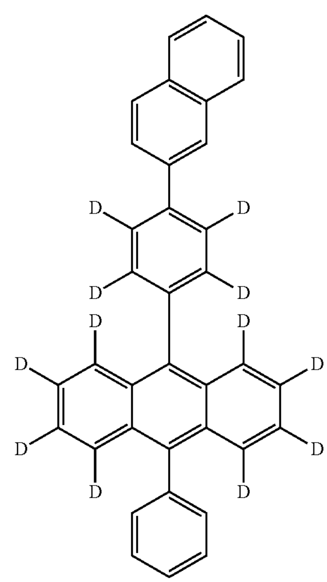

-continued
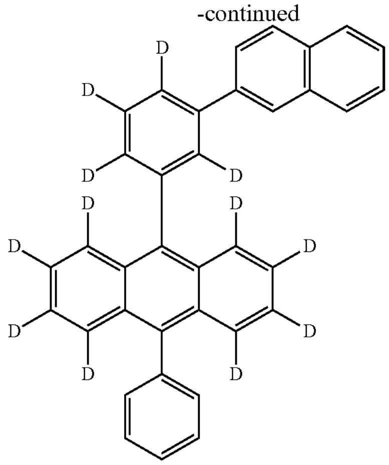
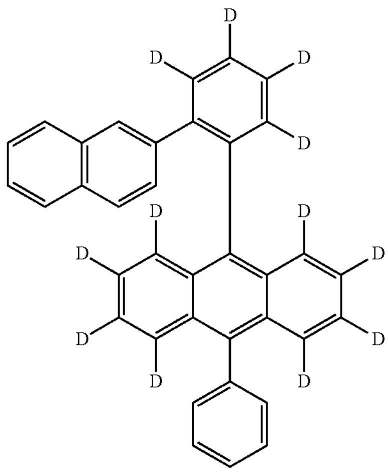
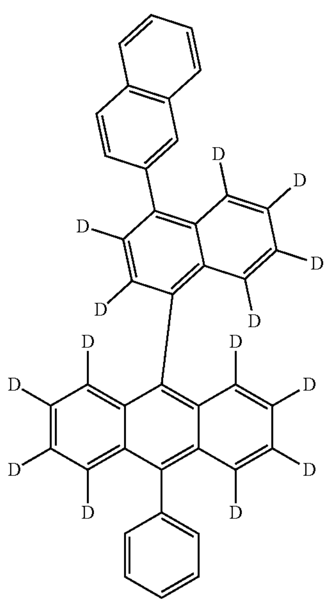
-continued
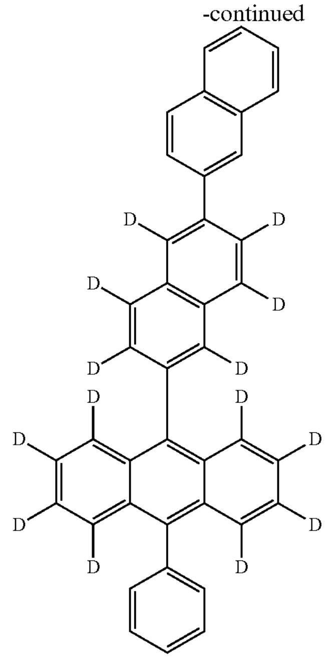
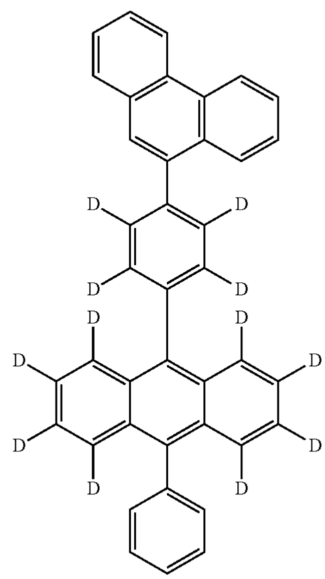
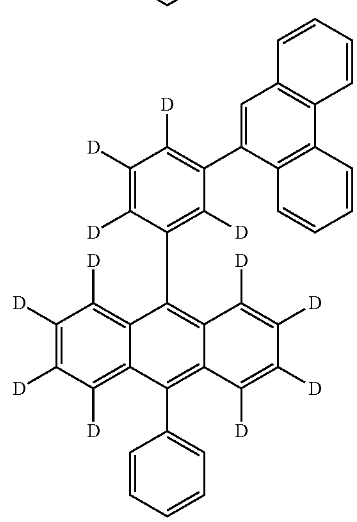

-continued
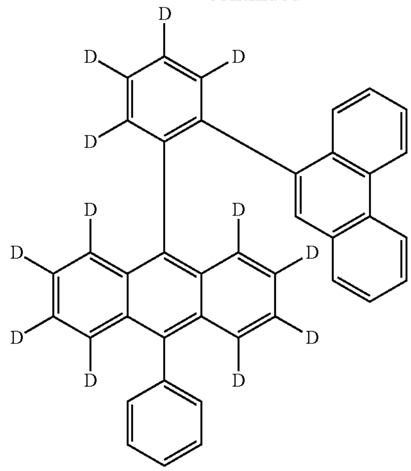
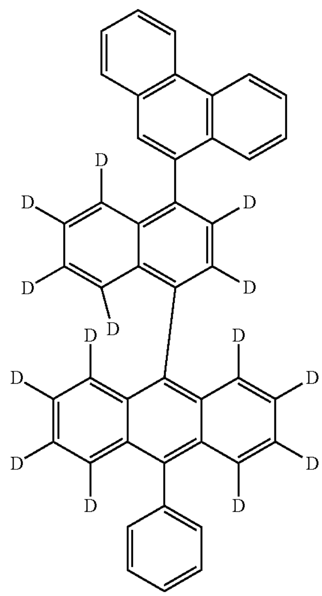
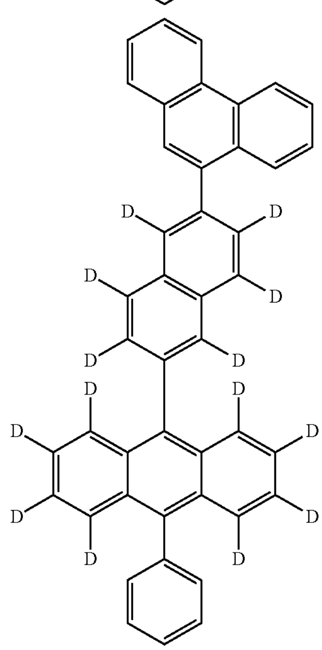
-continued
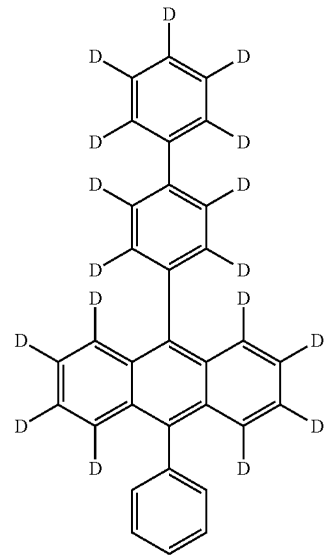
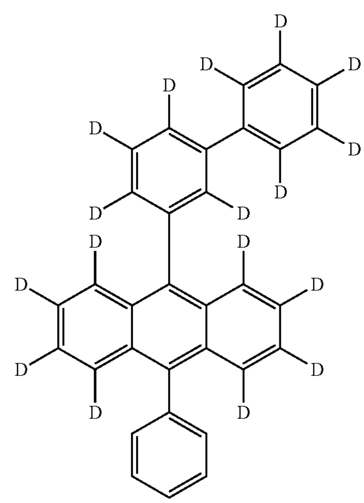
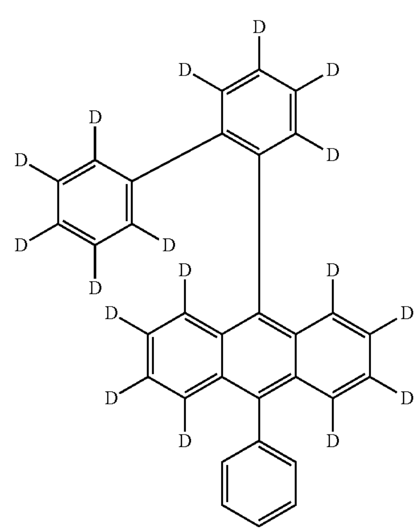

-continued
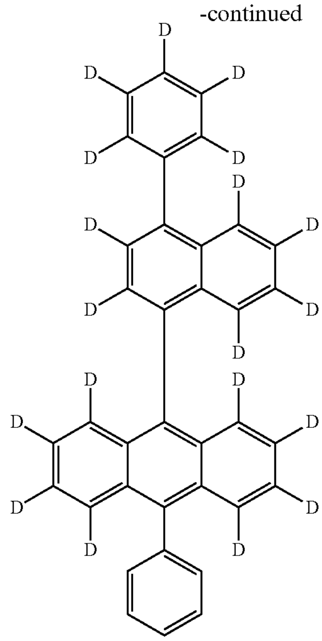
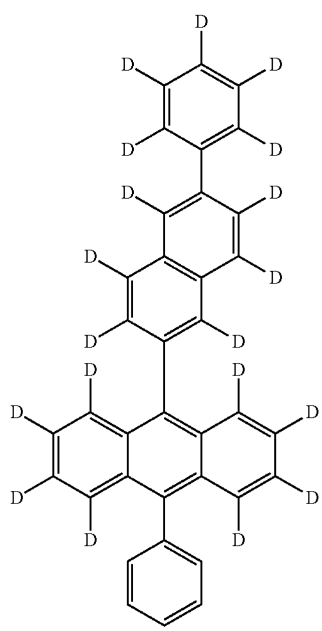
-continued
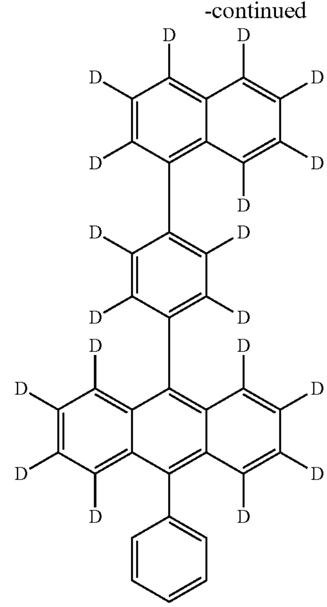
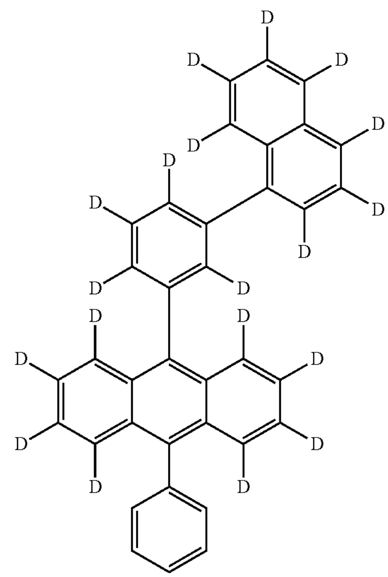
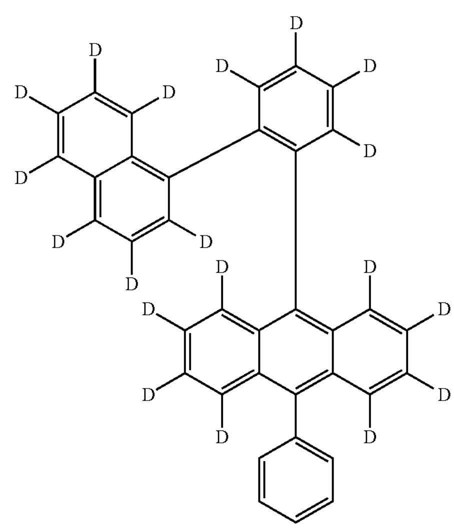

-continued
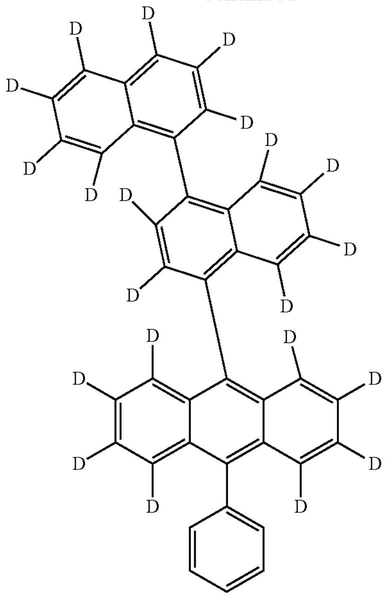
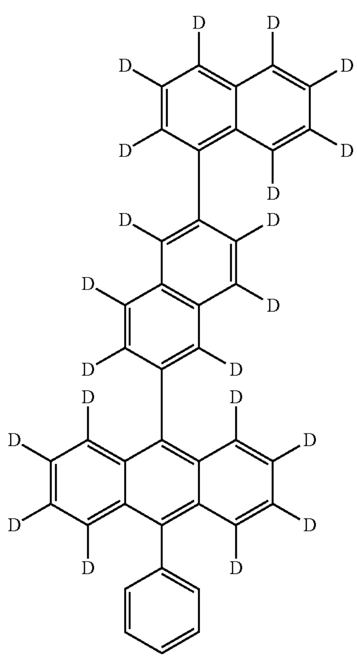
-continued
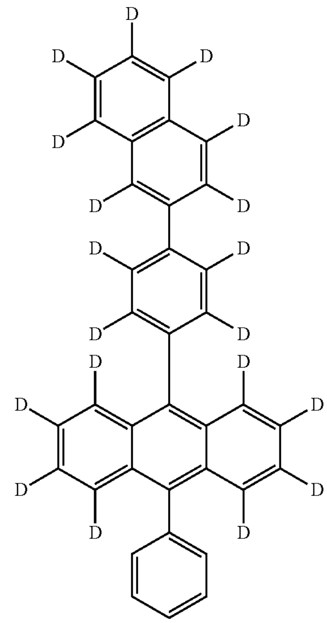
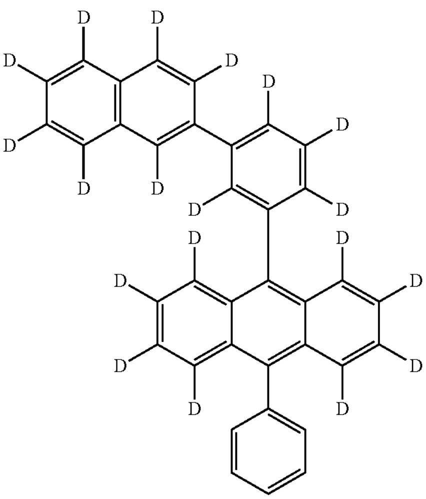
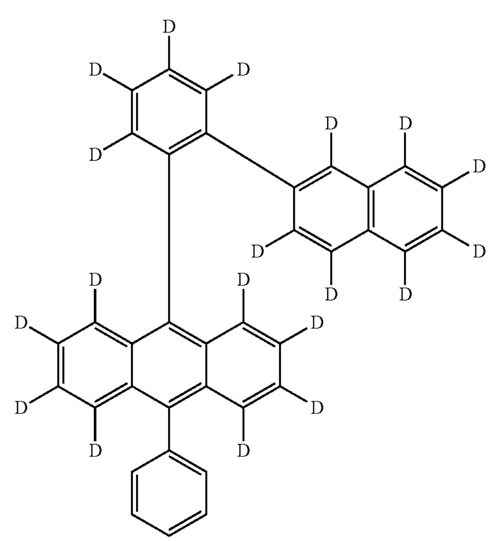

-continued
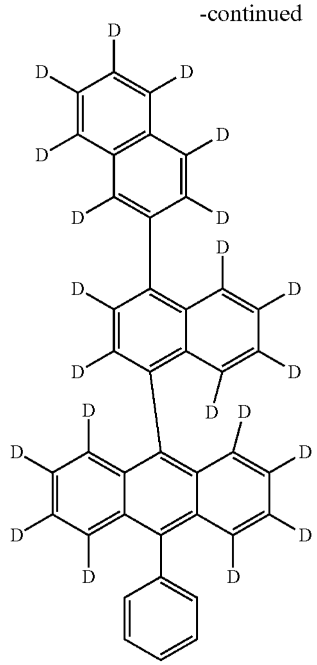
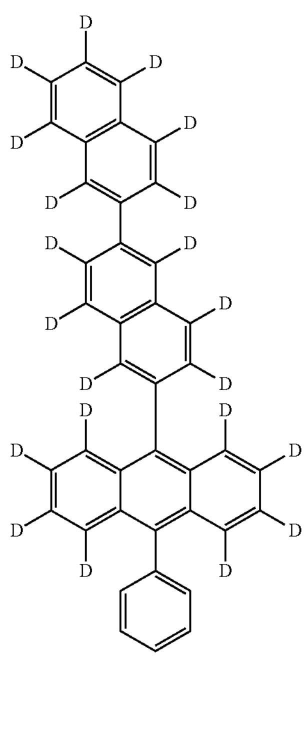
-continued
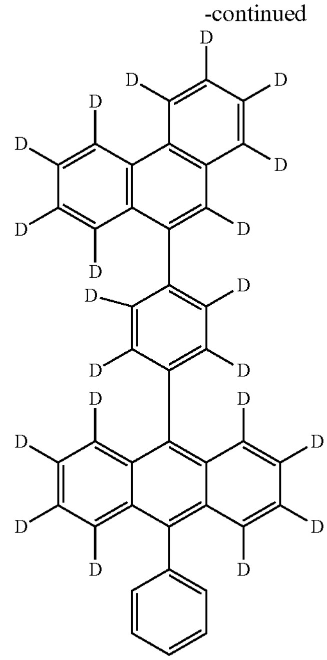
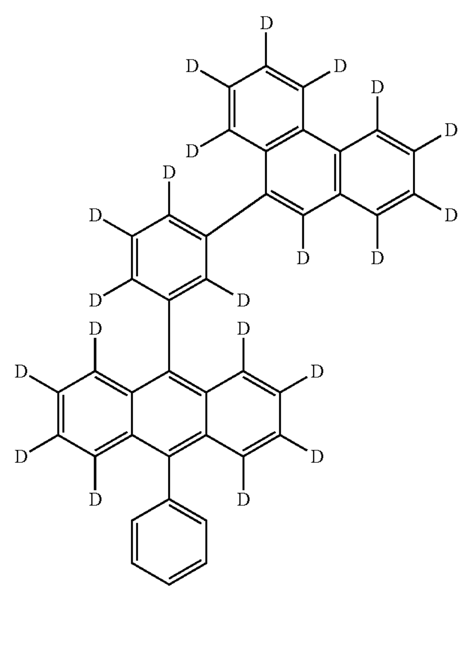

-continued
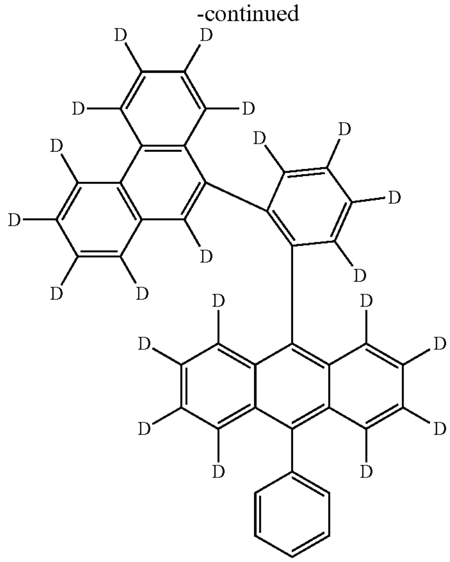
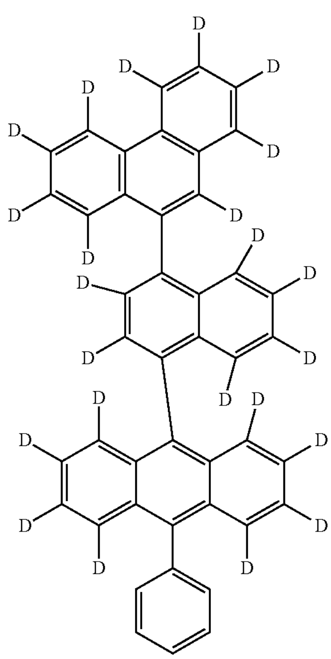
-continued
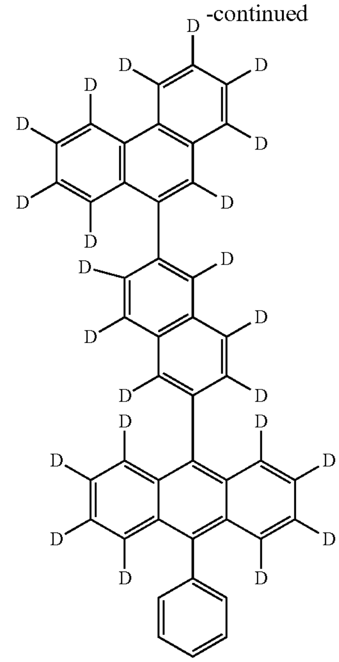
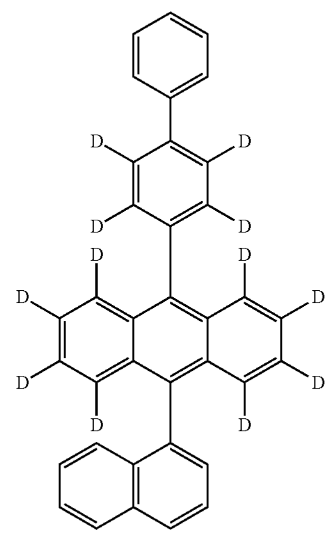
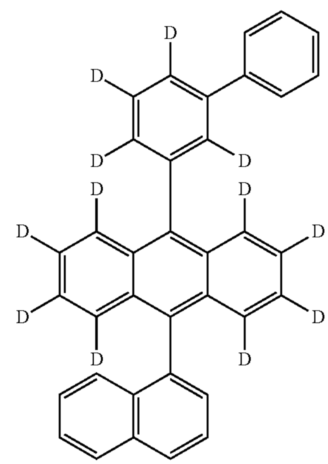

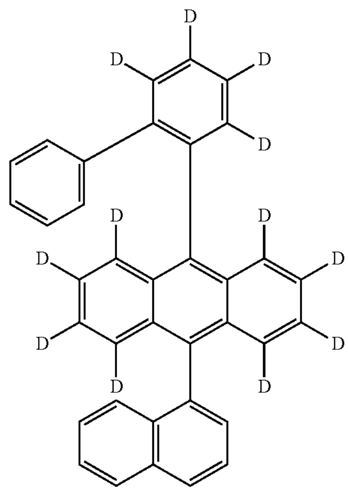
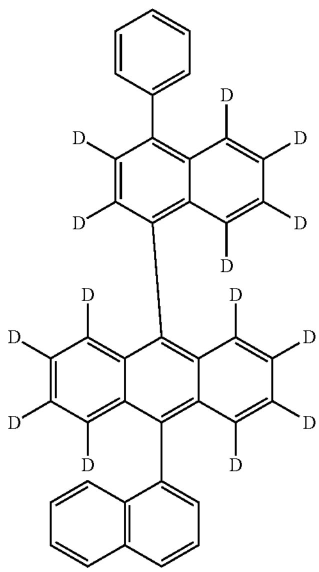
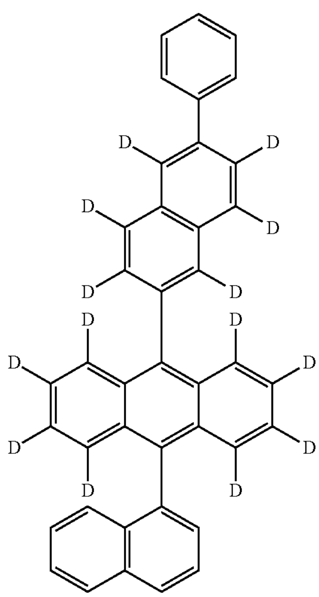
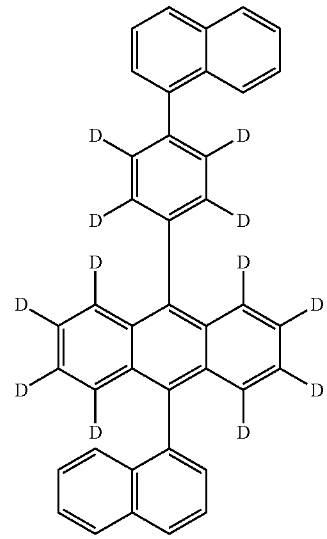
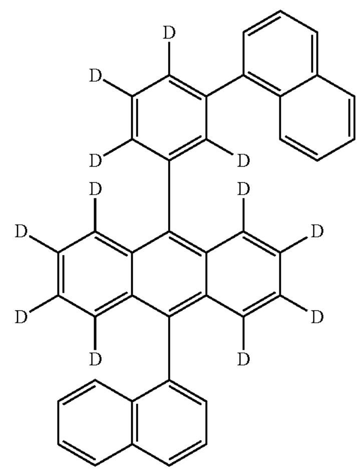
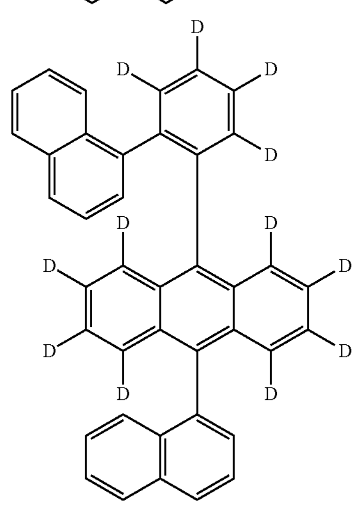
D

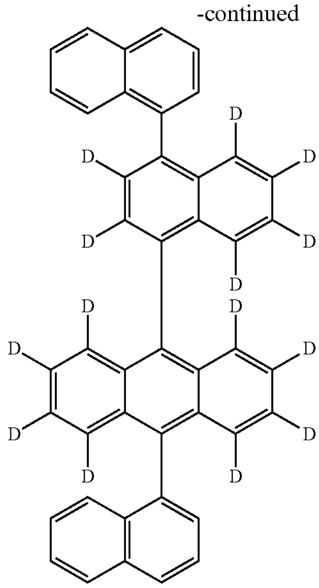
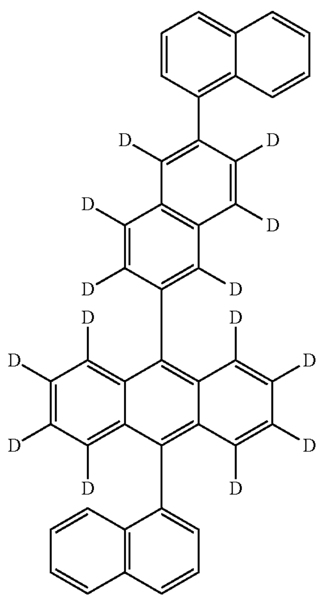
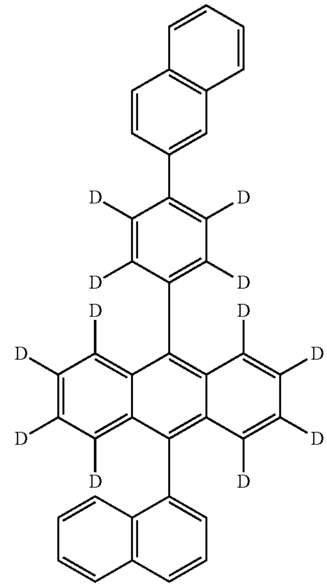
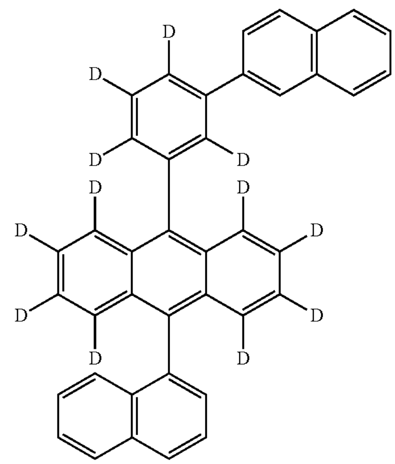
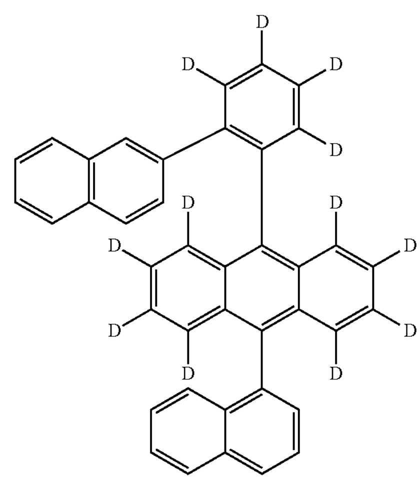

-continued
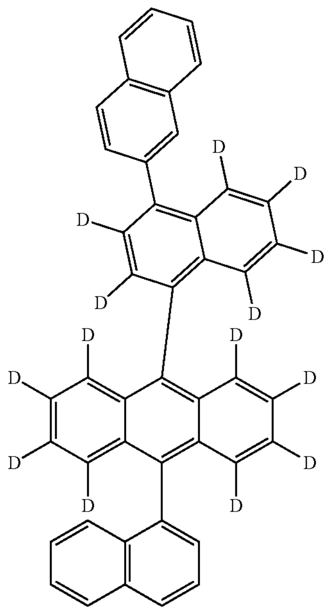
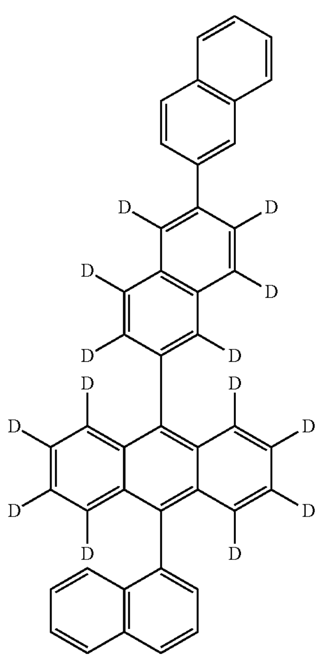
-continued
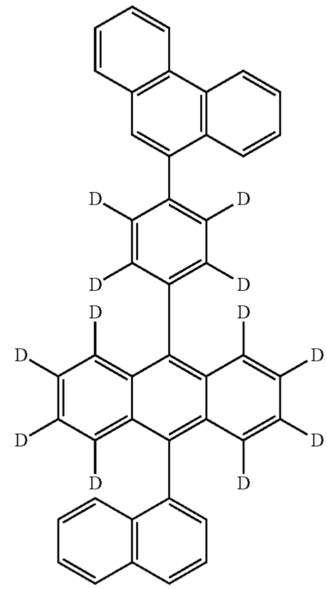
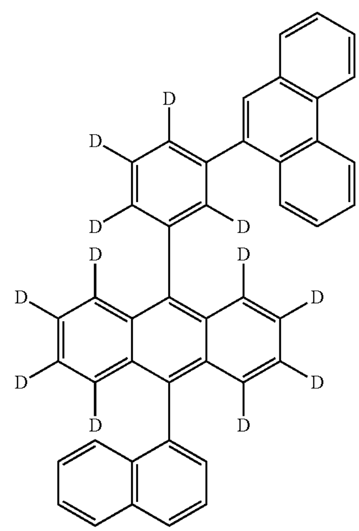
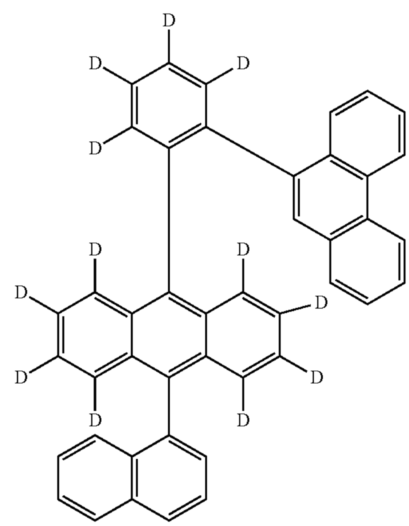

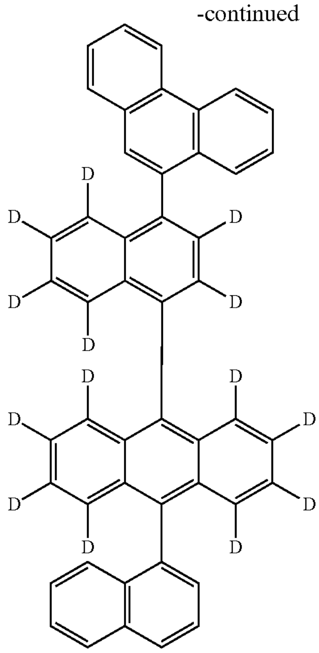
D
D
D
D
D
D
D
D
D
D
D
D
D
D
D
D
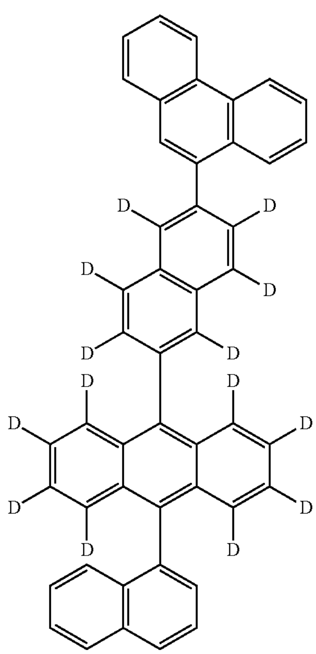
D
D
D
D
D
D
D
D
D
D
D
D
D
D
D
D
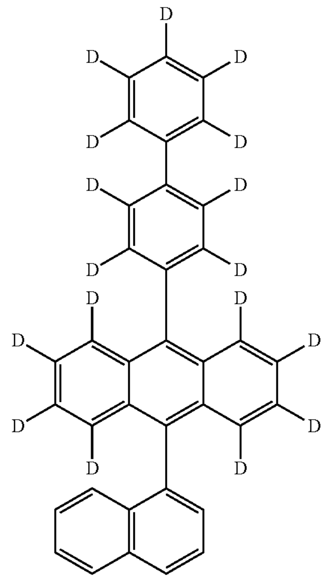
D
D
D
D
D
D
D
D
D
D
D
D
D
D
D
D
D
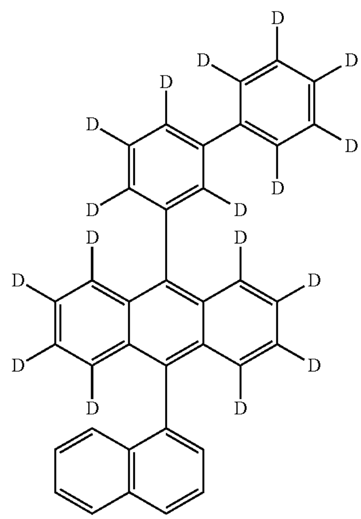
D
D
D
D
D
D
D
D
D
D
D
D
D
D
D
D
D
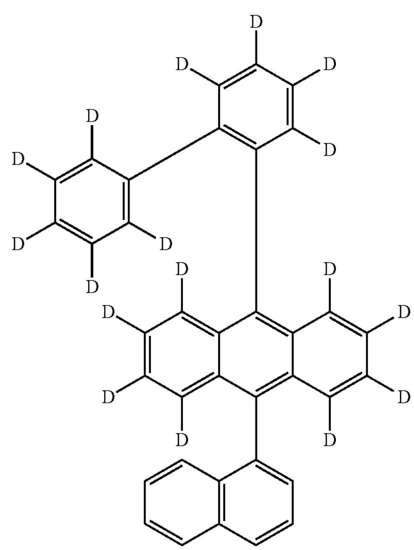
D
D
D
D
D
D
D
D
D
D
D
D
D
D
D
D
D -continued
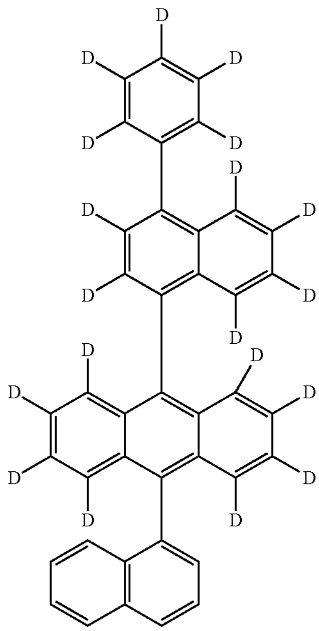
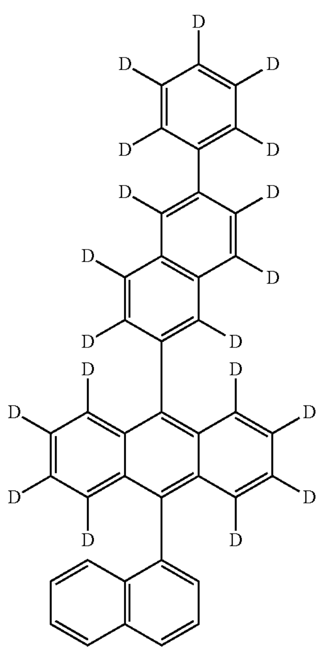
-continued
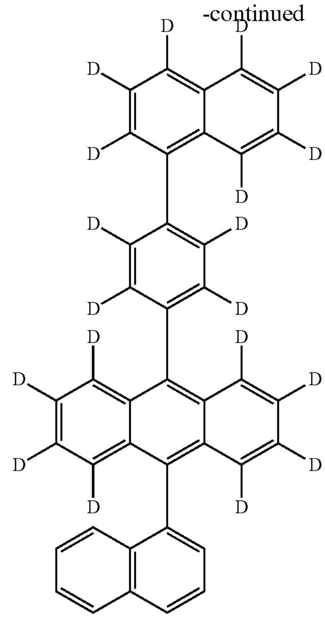
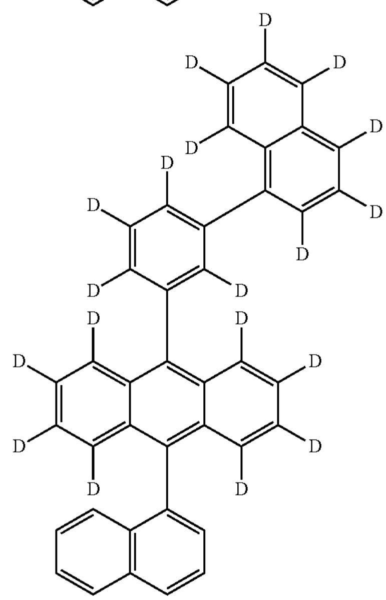
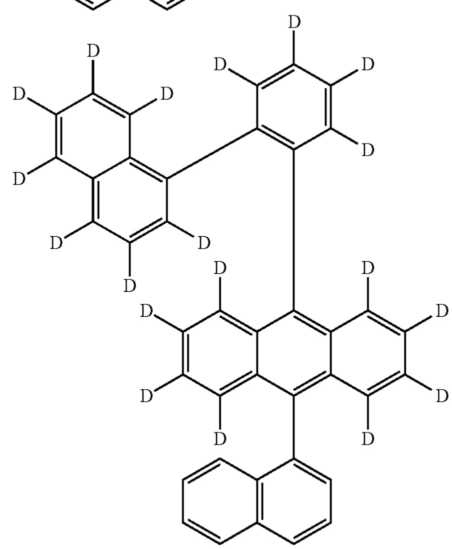

-continued
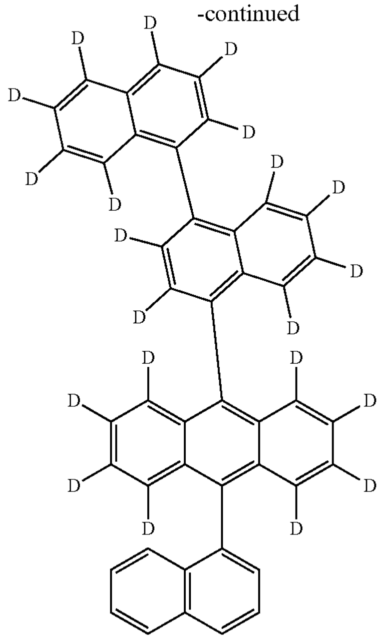
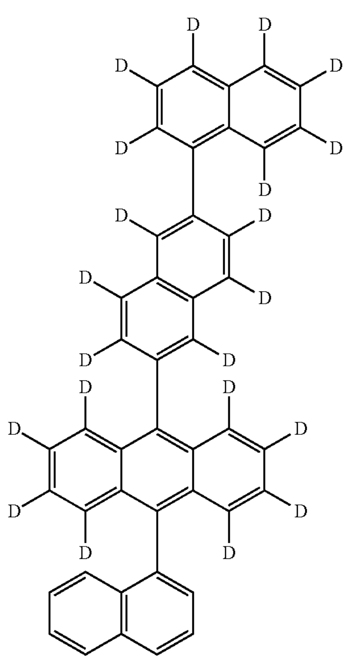
-continued
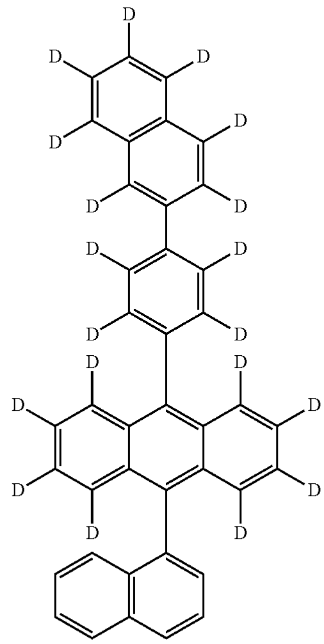
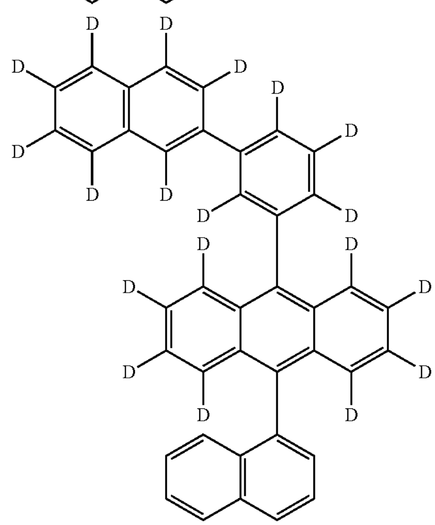
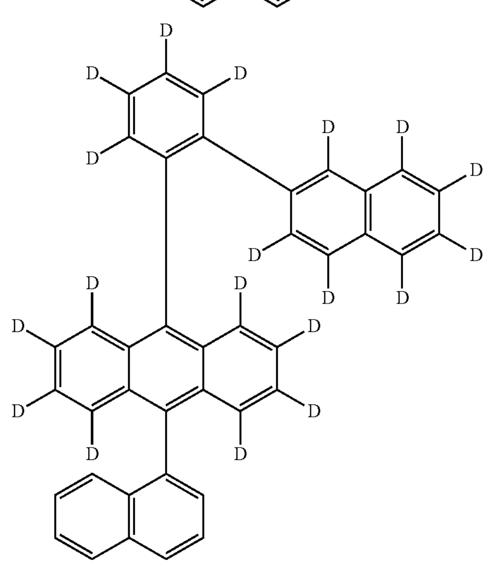

1003
-continued
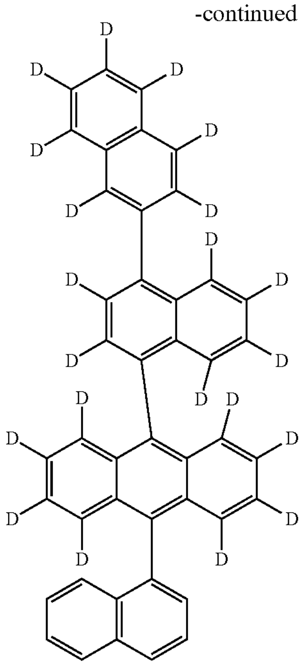
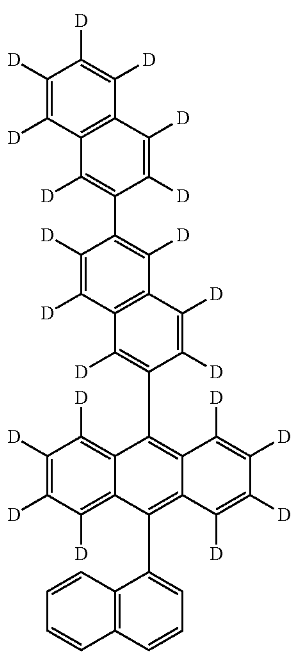
1004
-continued
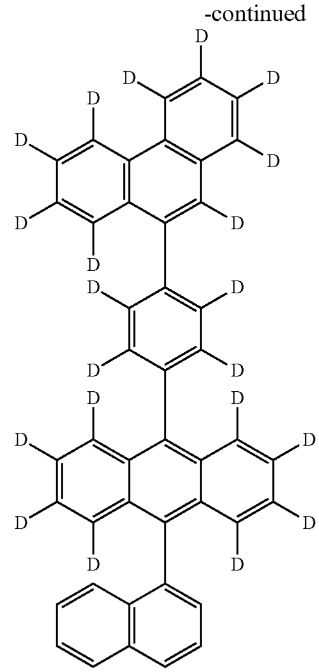
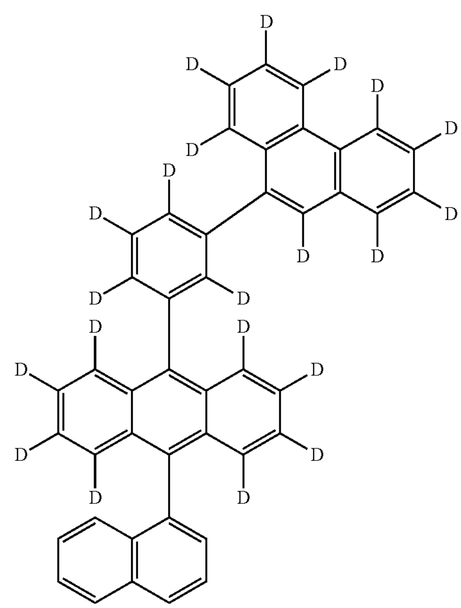

-continued
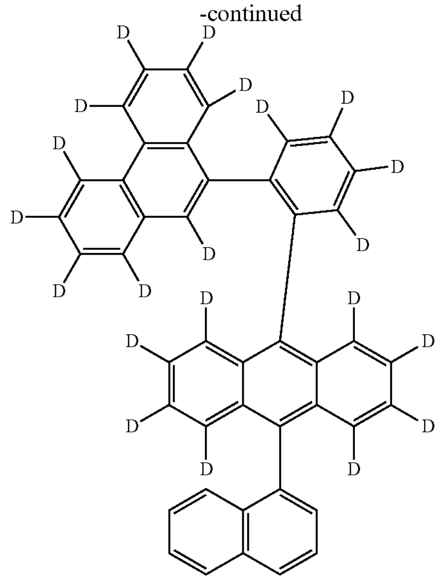
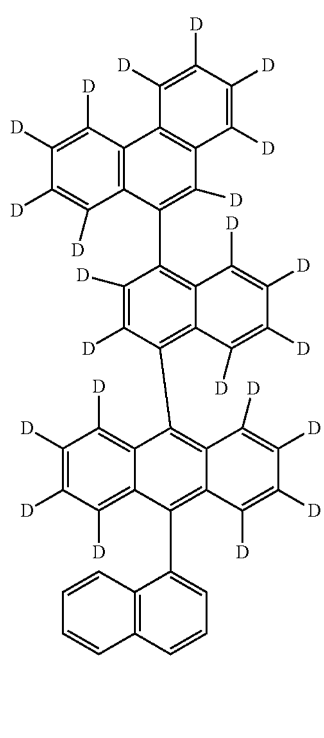
-continued
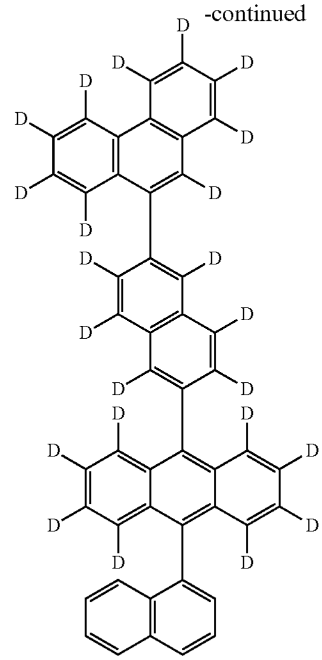
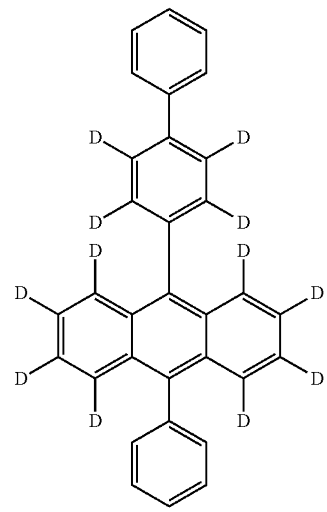
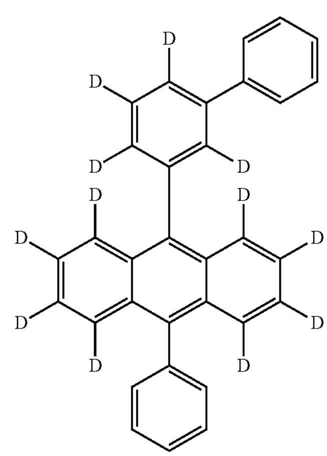

-continued
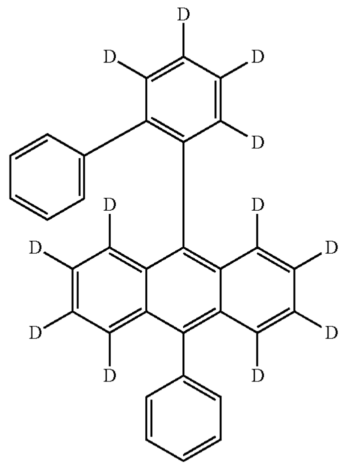
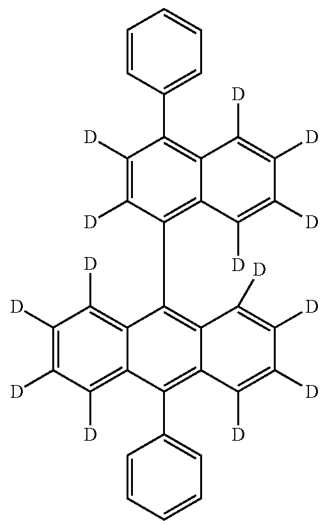
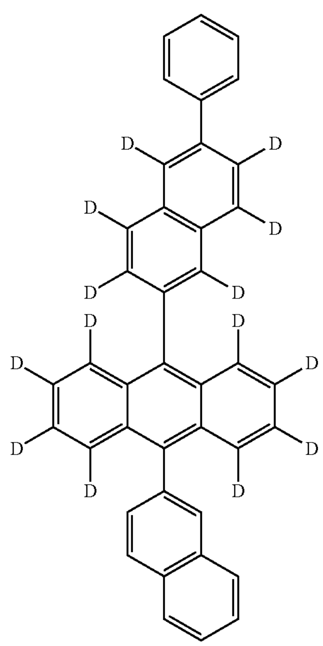
-continued
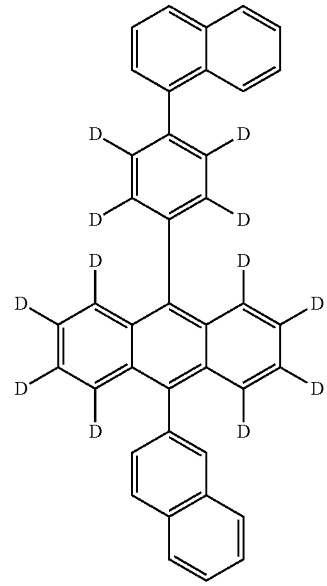
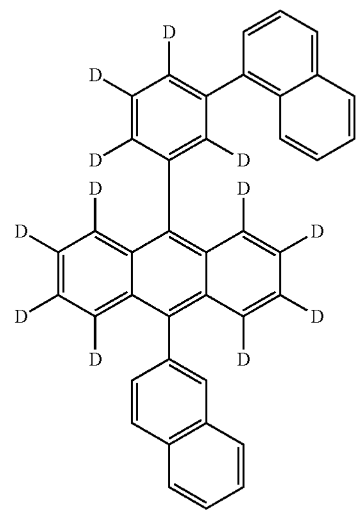
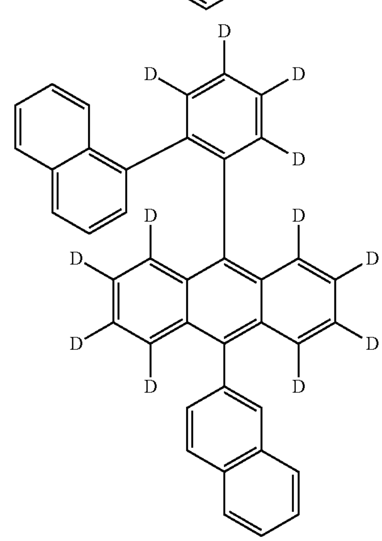

-continued
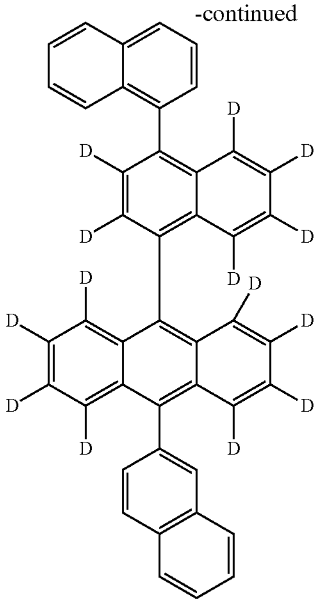
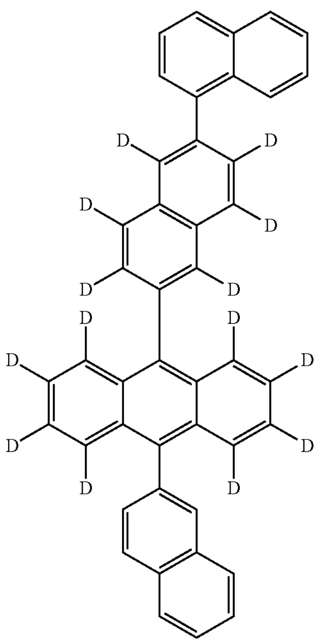
-continued
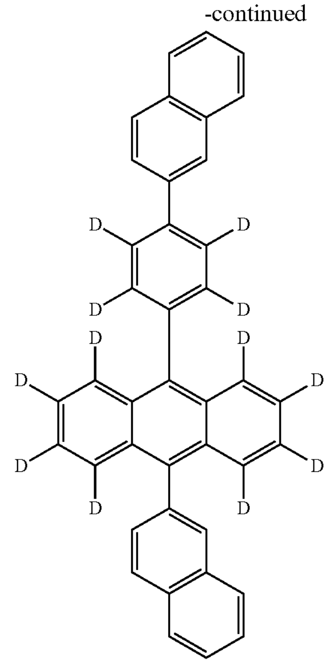
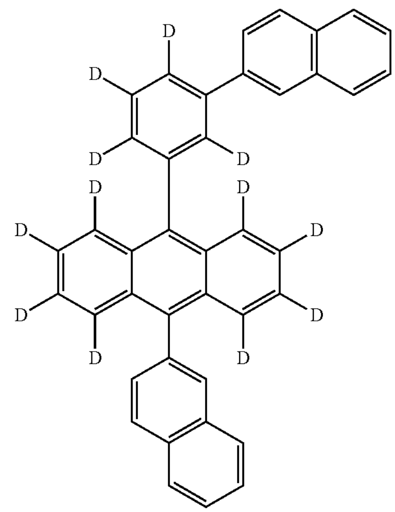
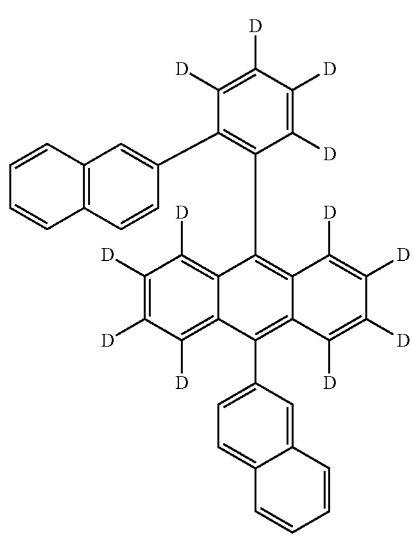

-continued
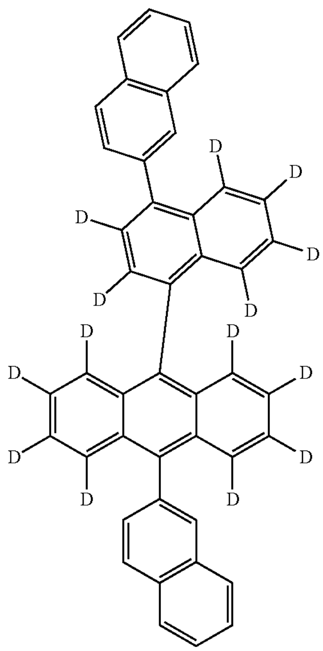
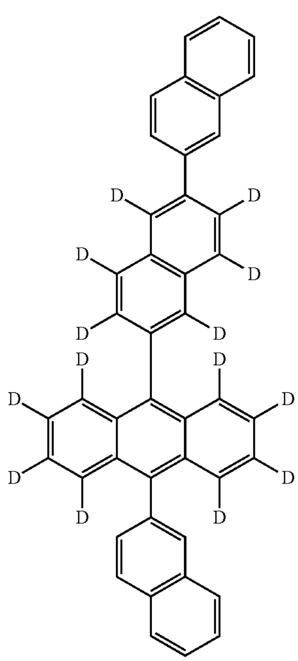
-continued
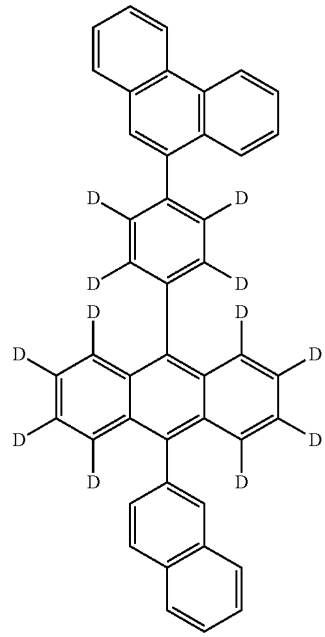
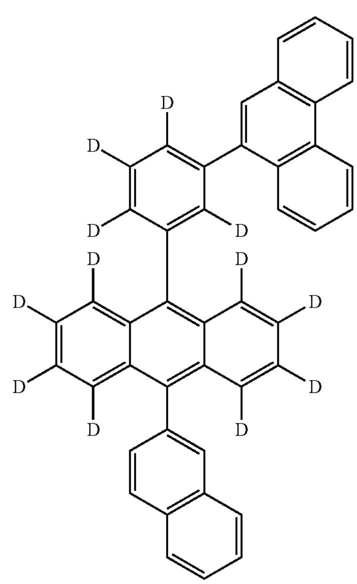

-continued
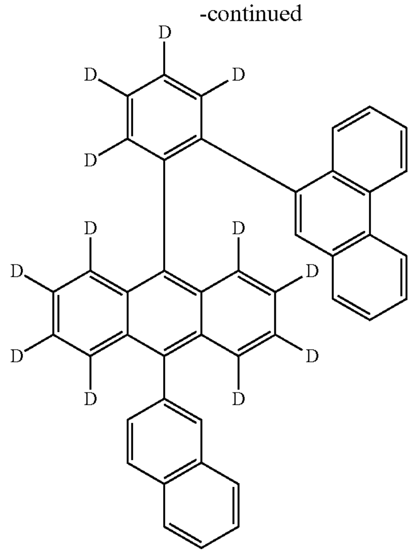
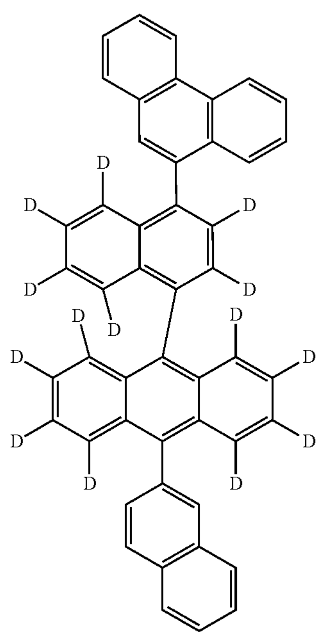
-continued
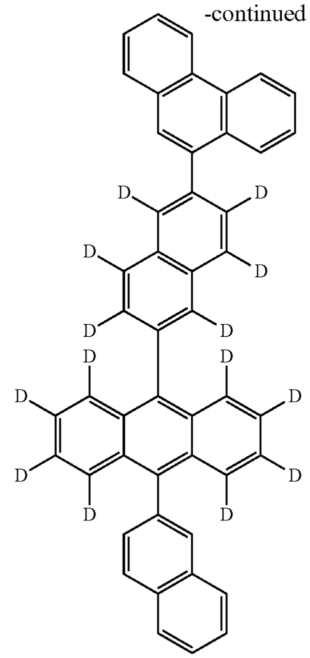
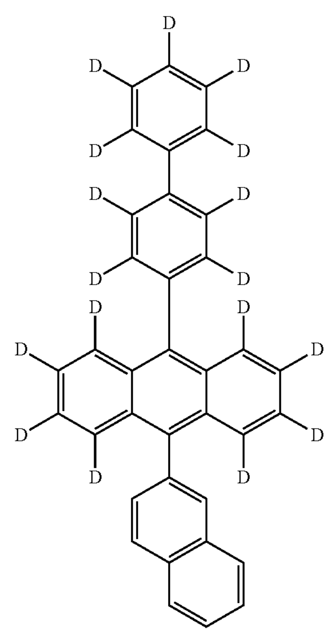

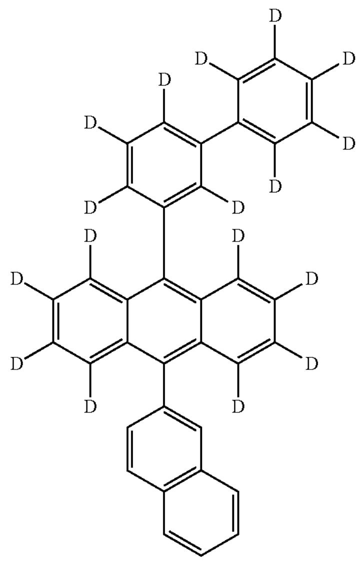
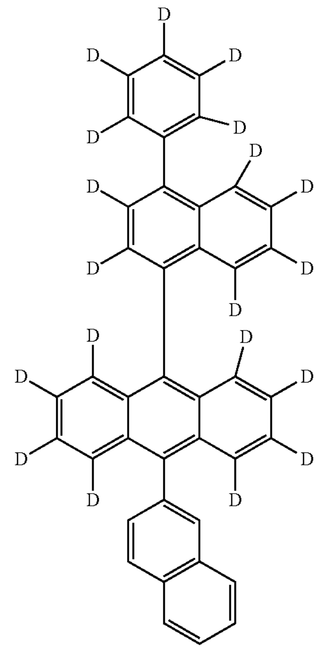
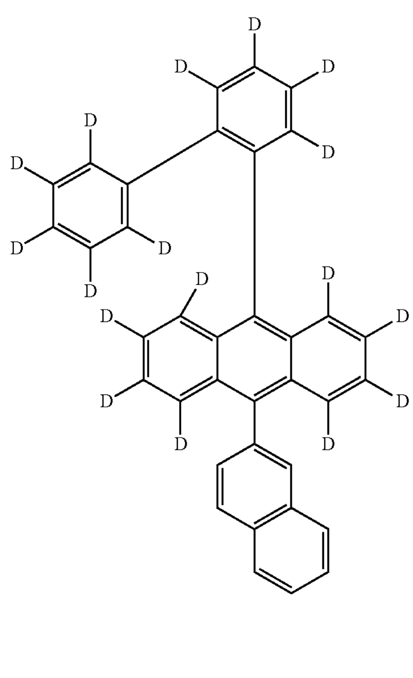
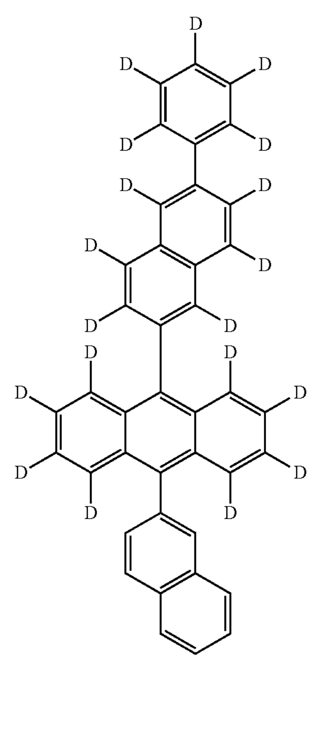

-continued
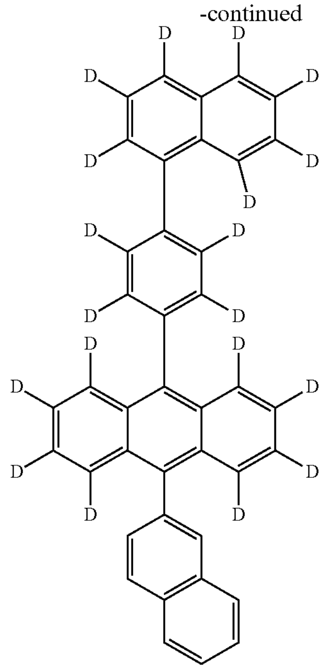
-continued
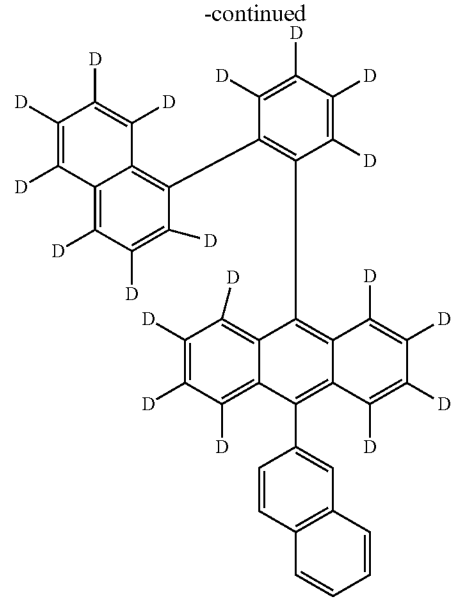
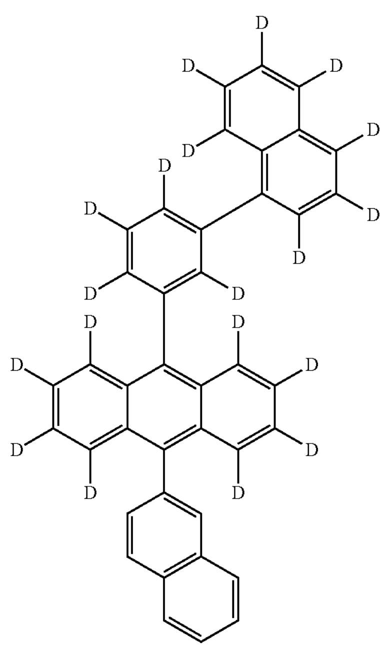
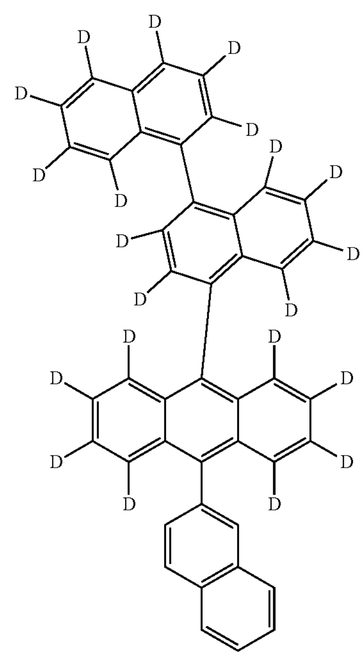

-continued
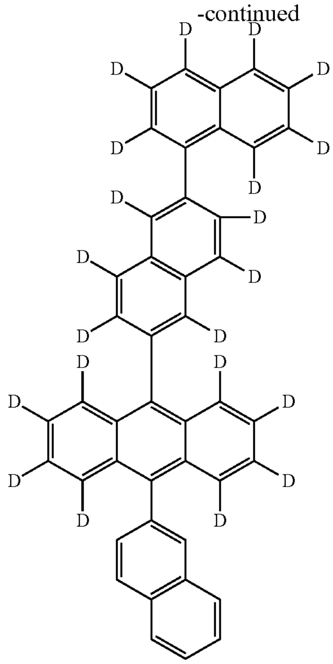
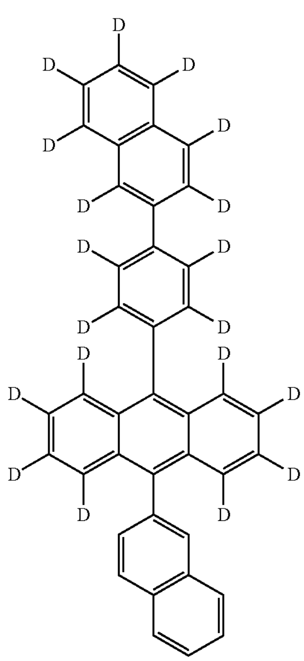
-continued
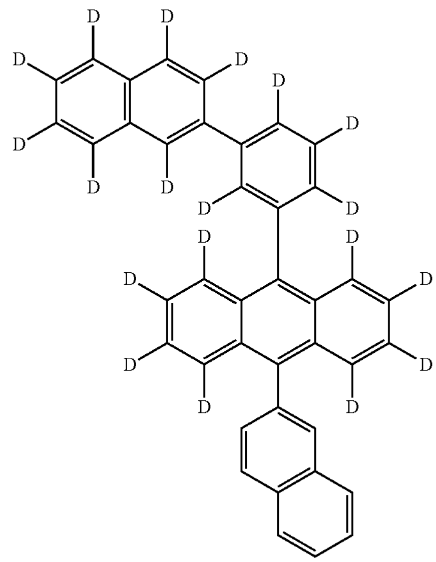
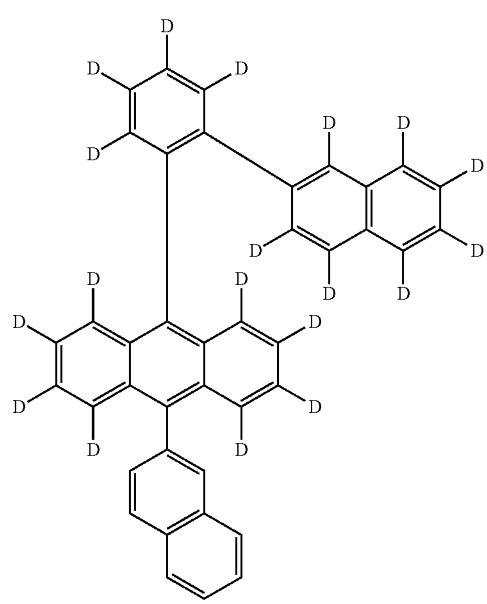

-continued
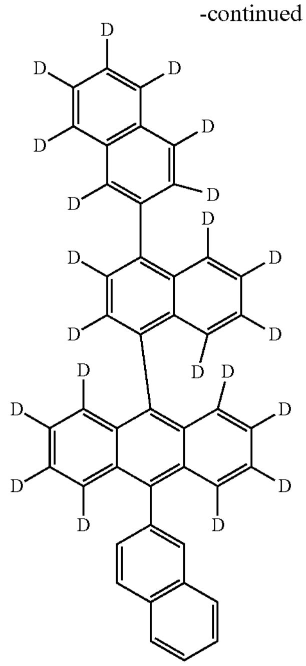
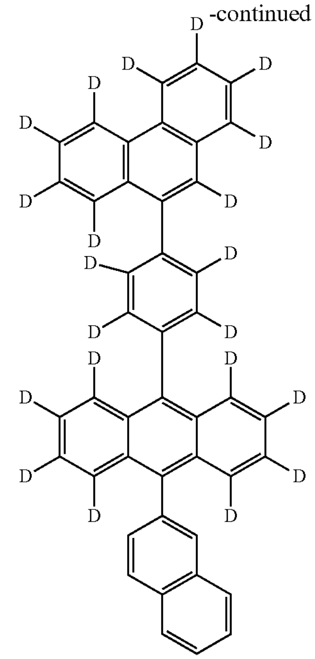
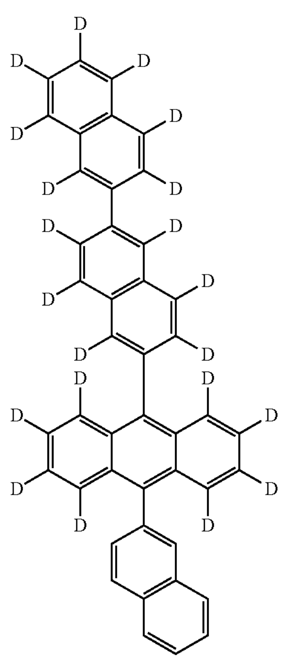
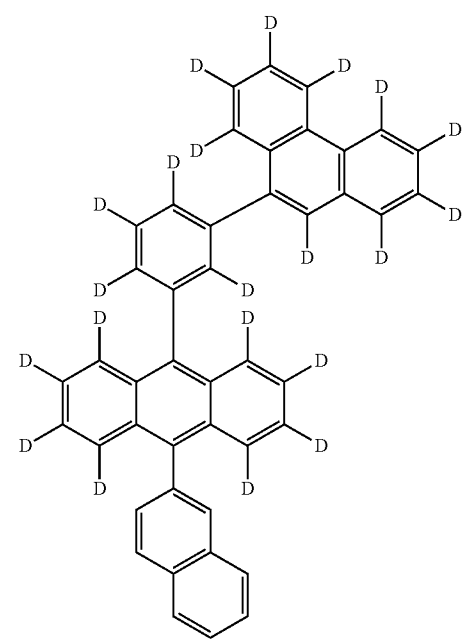

-continued
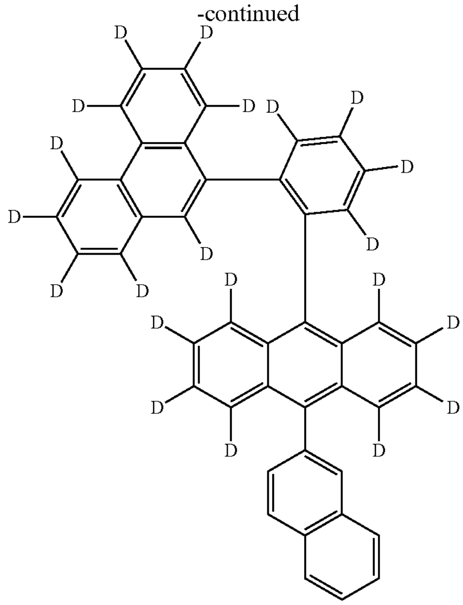
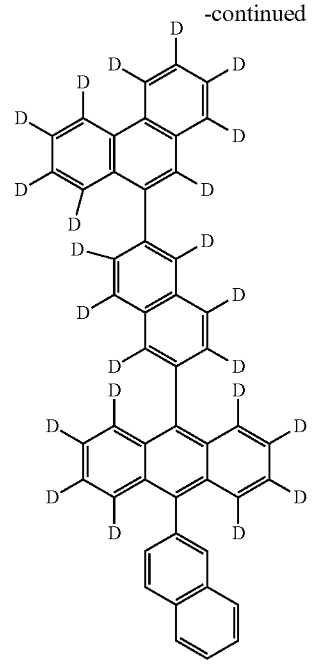
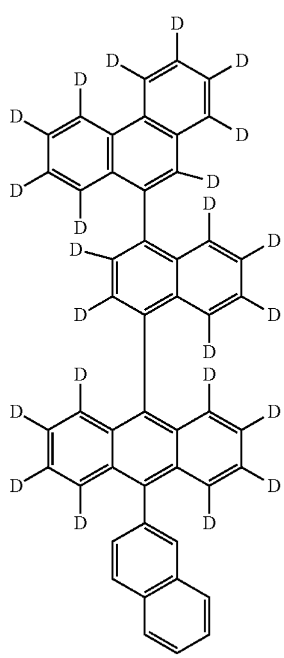
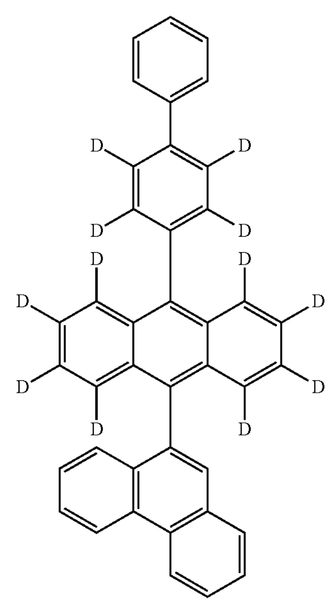
-continued

-continued
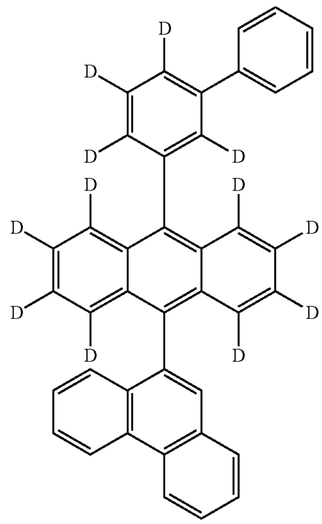
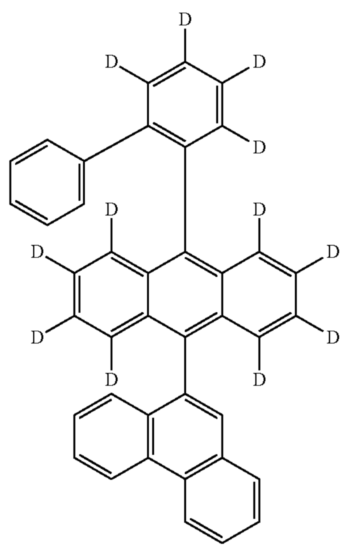
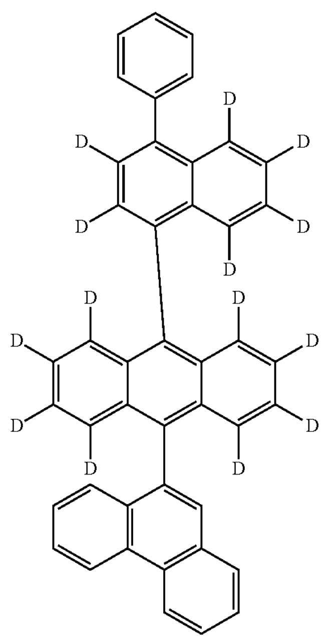
-continued
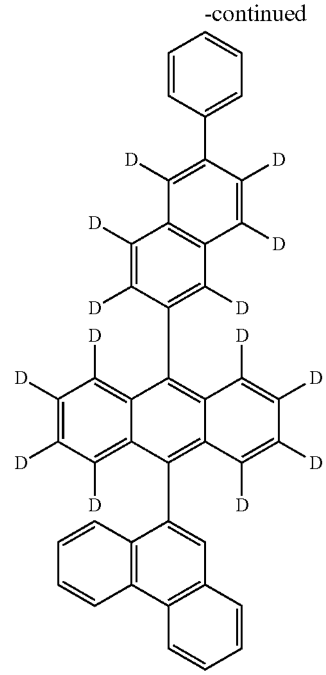
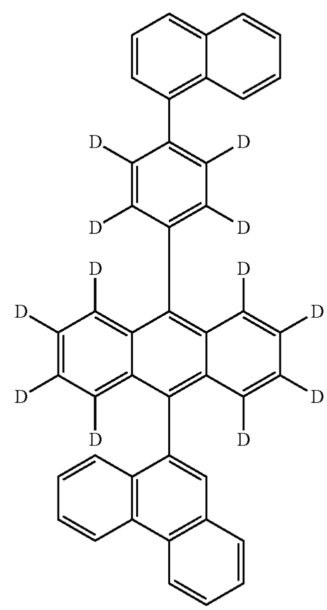

-continued
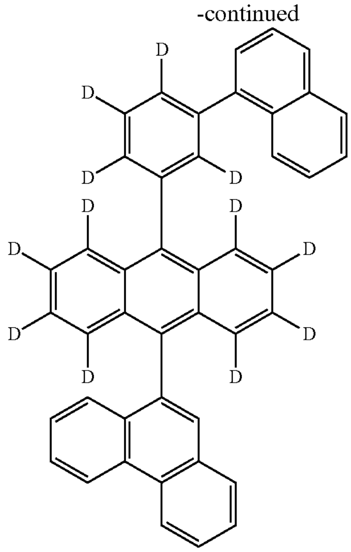
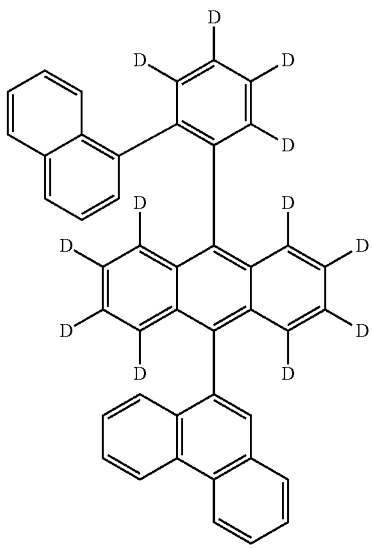
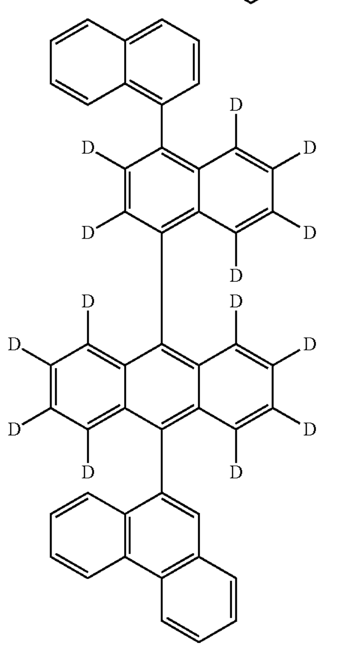
-continued
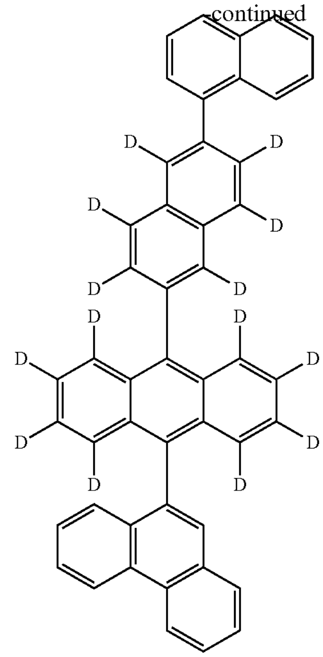
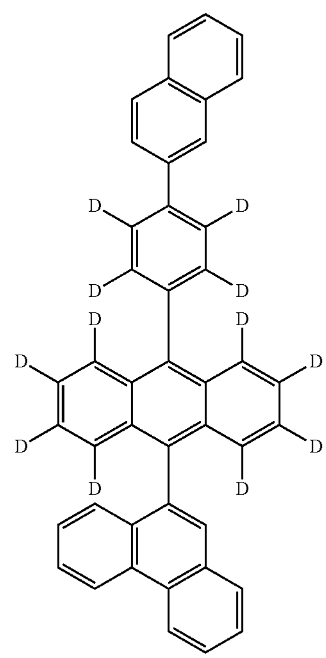

-continued
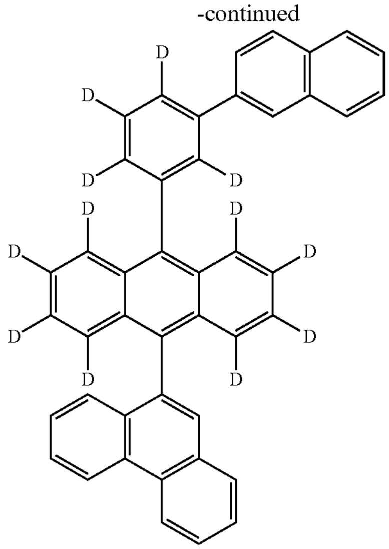
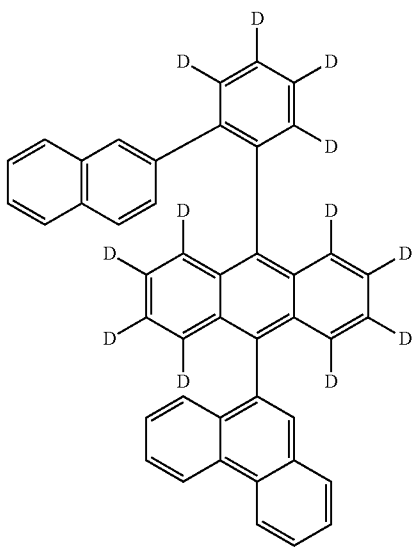
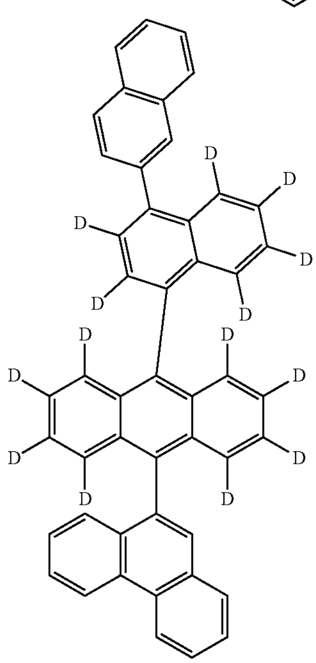
-continued
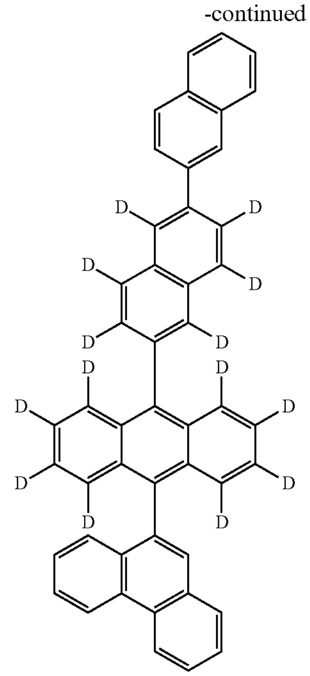
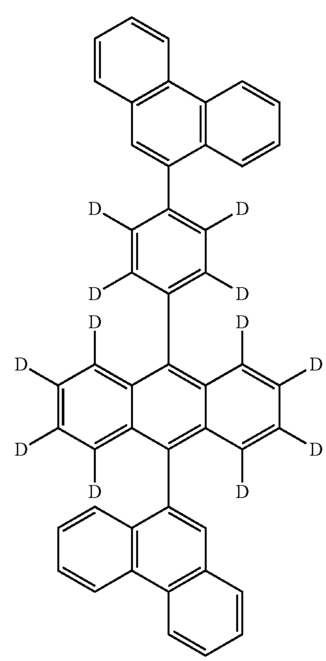

-continued
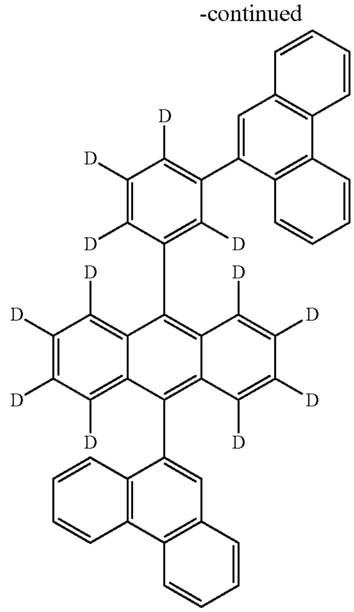
-continued
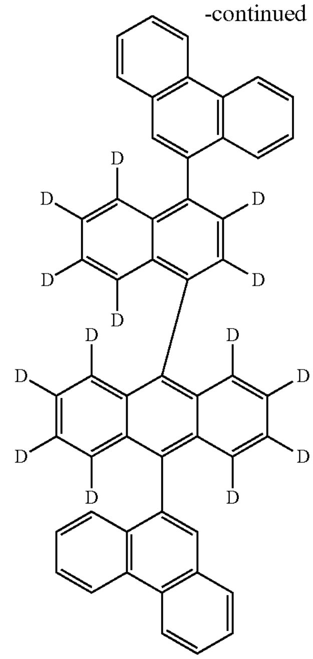
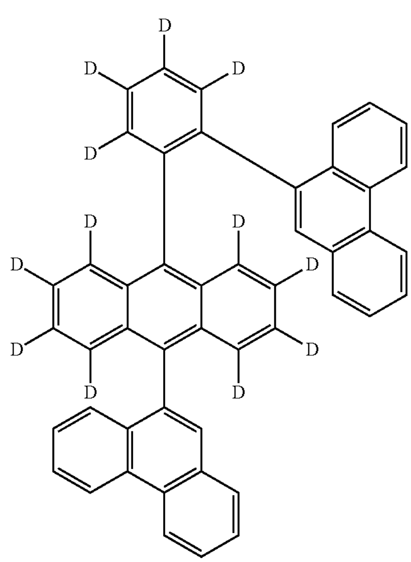
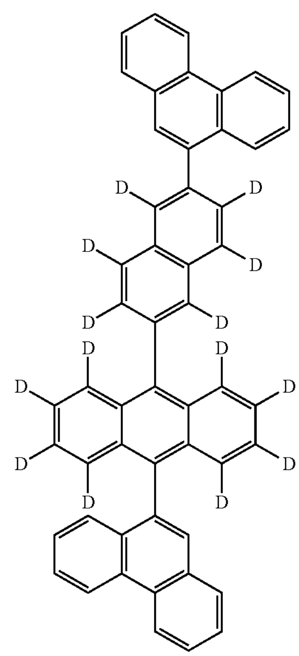

-continued
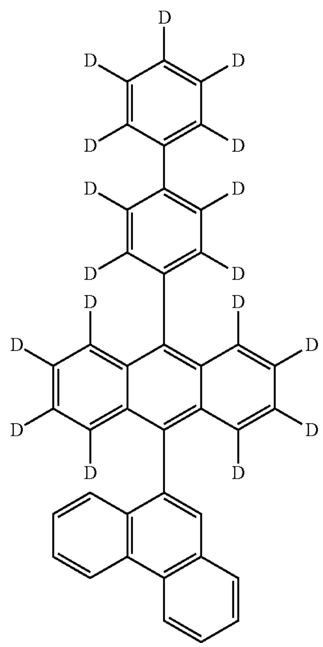
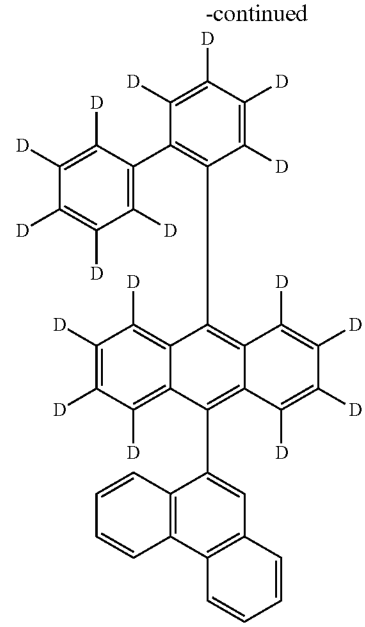
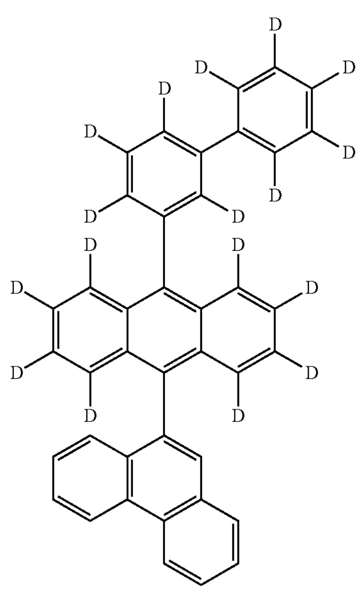
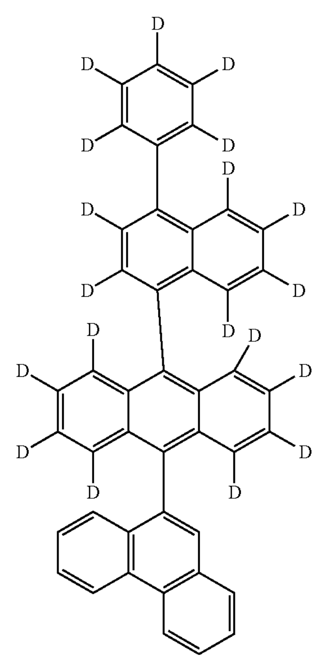

-continued
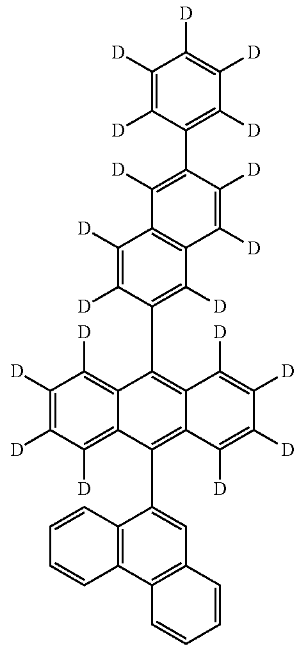
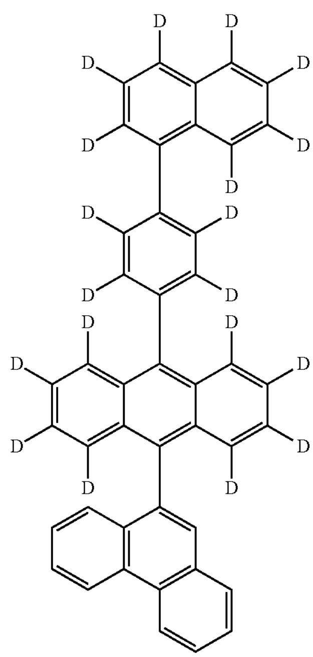
-continued
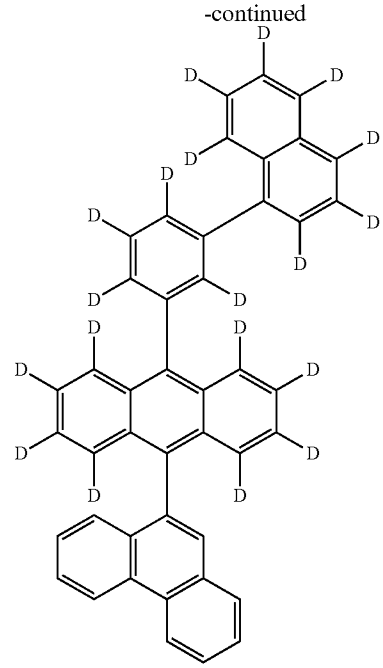
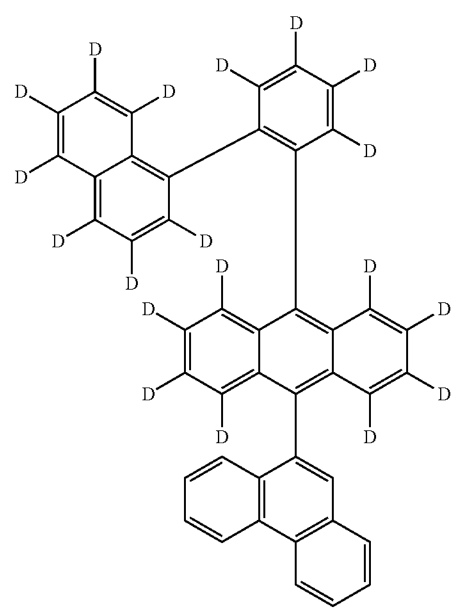

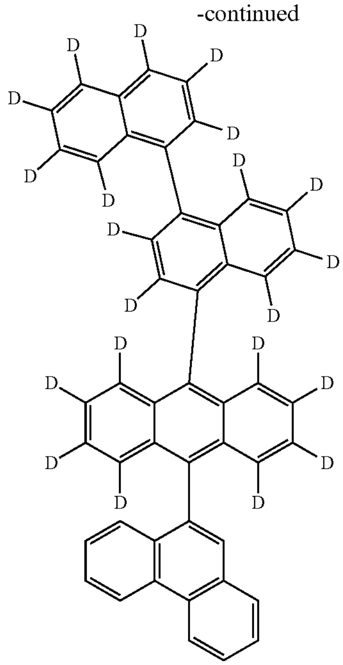
D
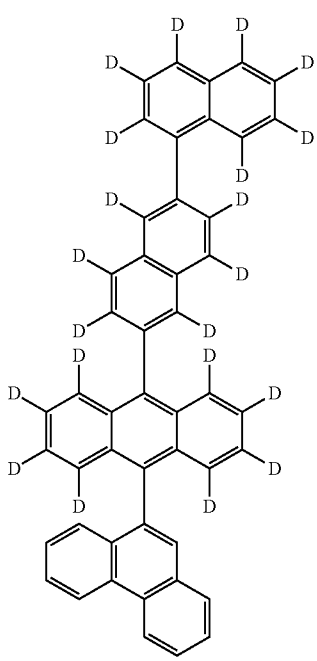
D
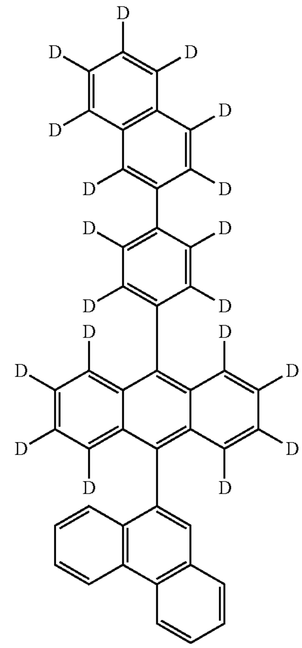
D
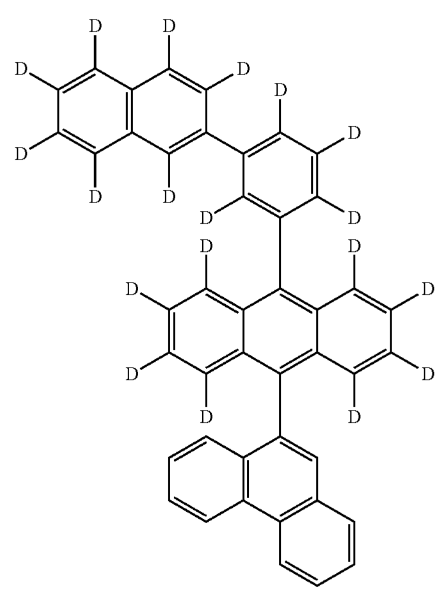
D

-continued
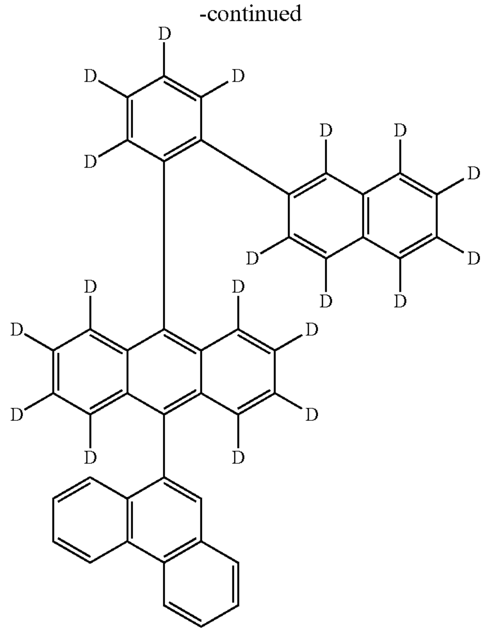
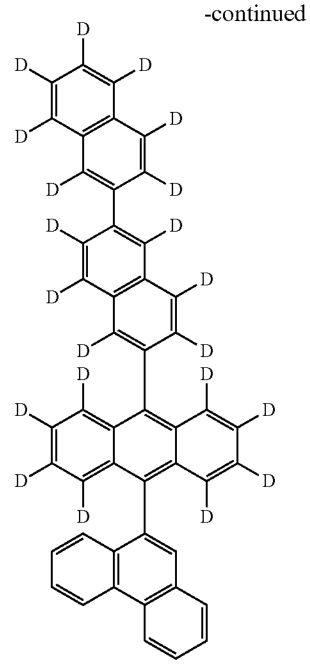
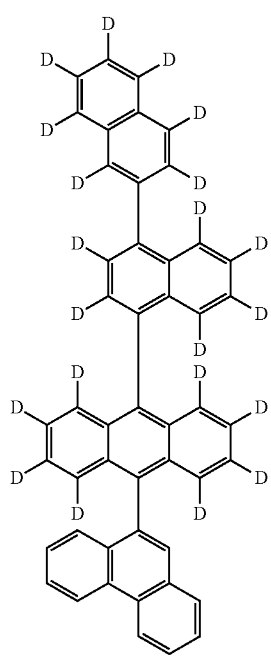
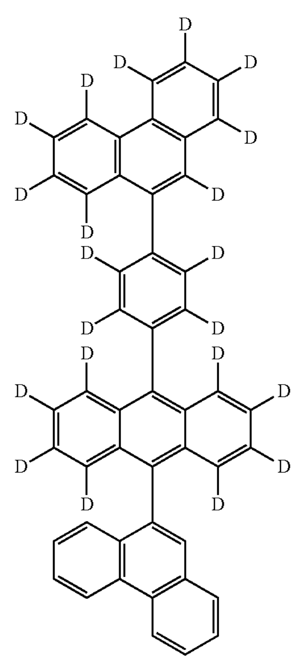

-continued
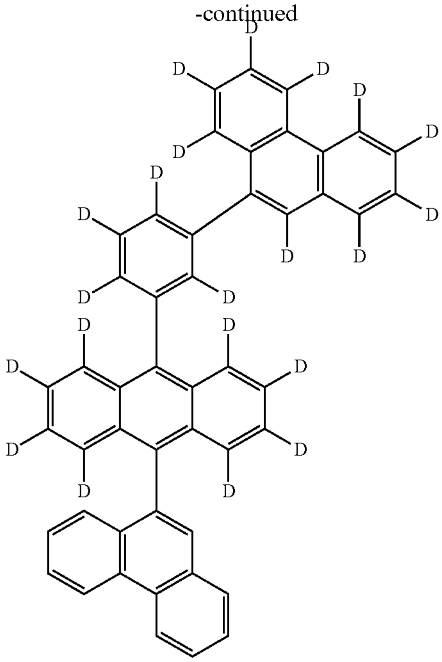
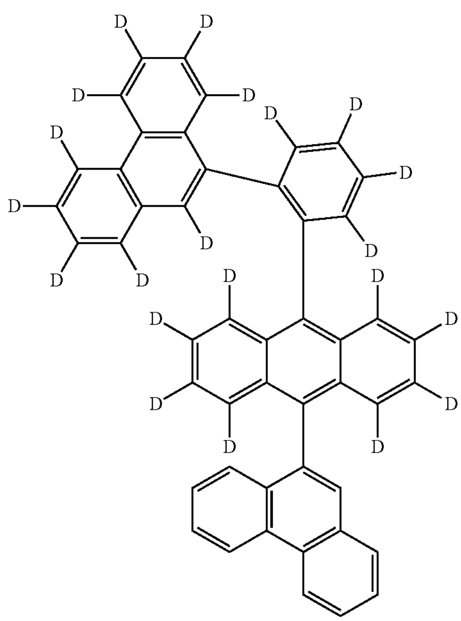
-continued
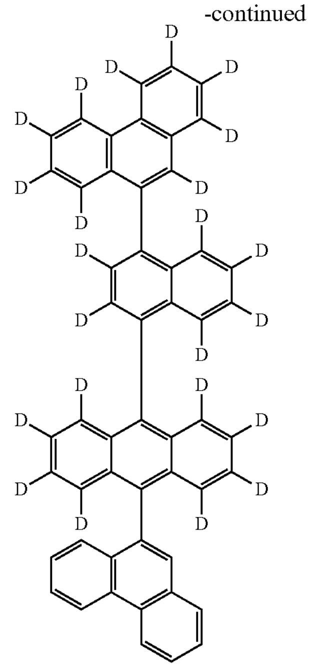
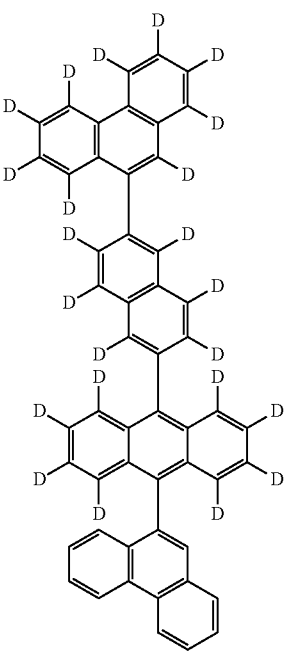

-continued
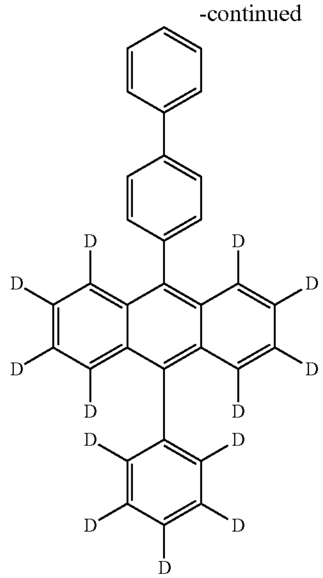
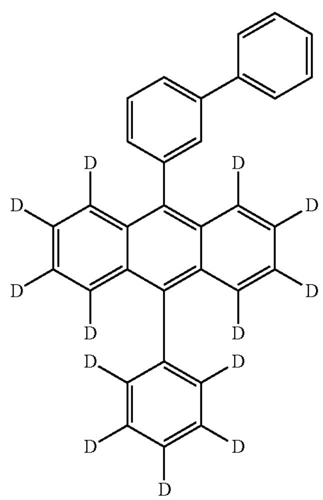
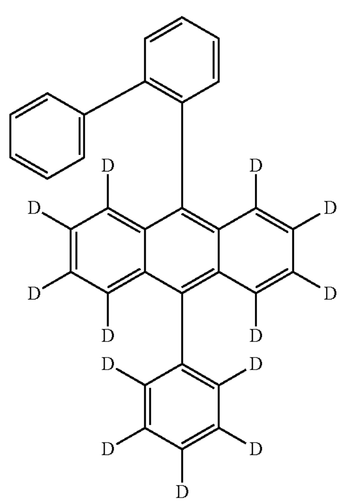
-continued
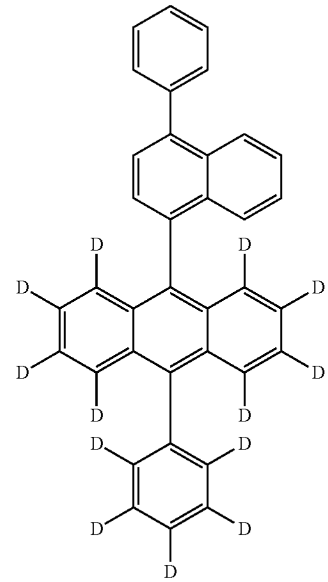
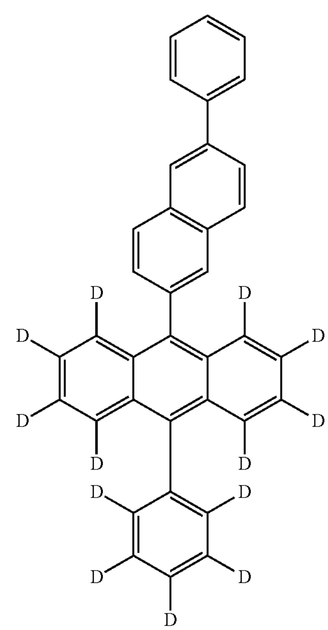

-continued
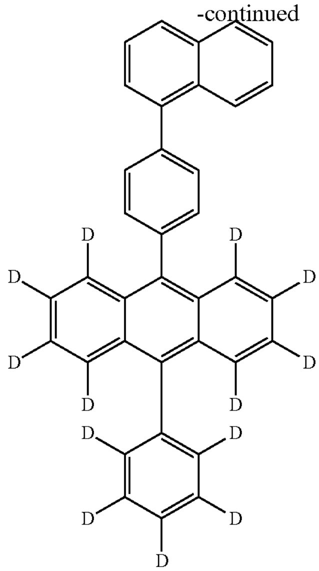
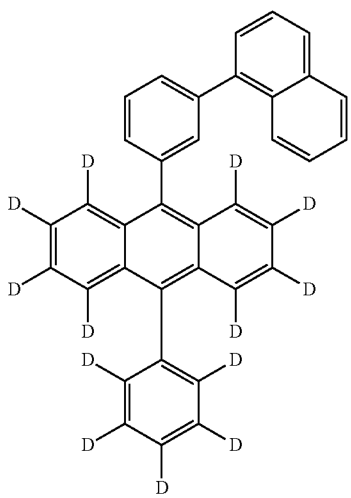
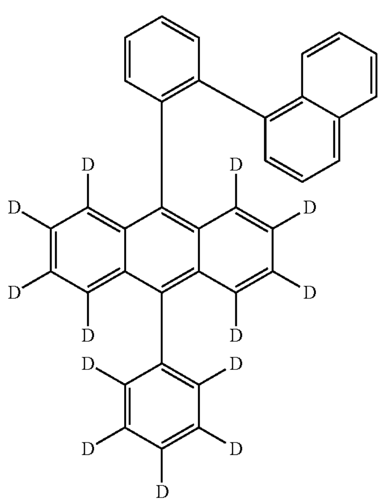
-continued
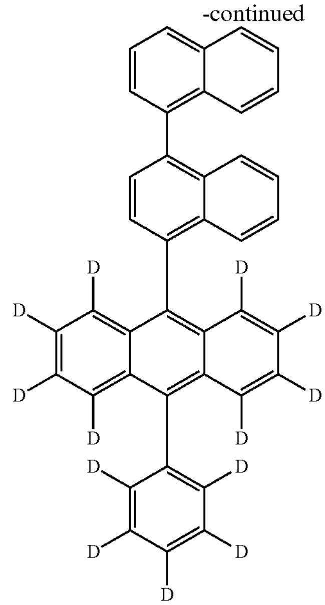
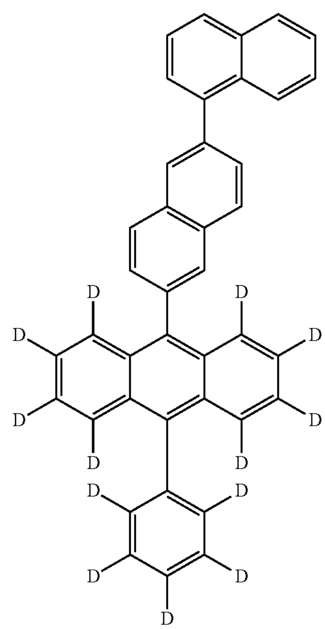

-continued
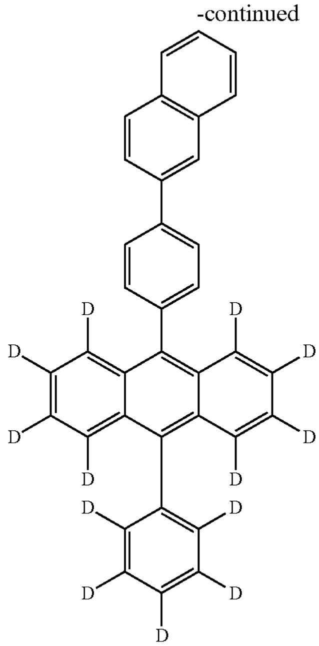
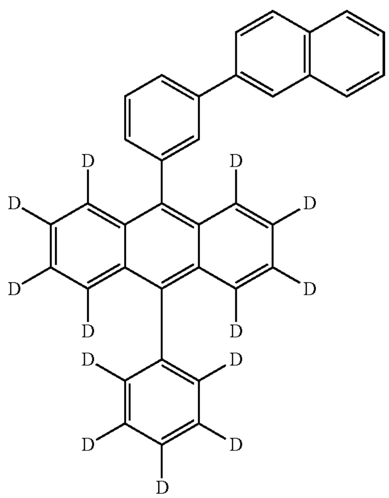
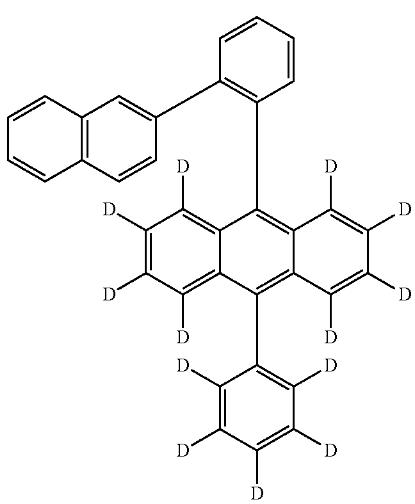
-continued
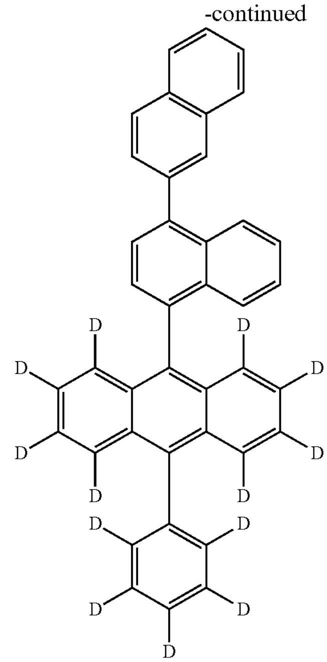
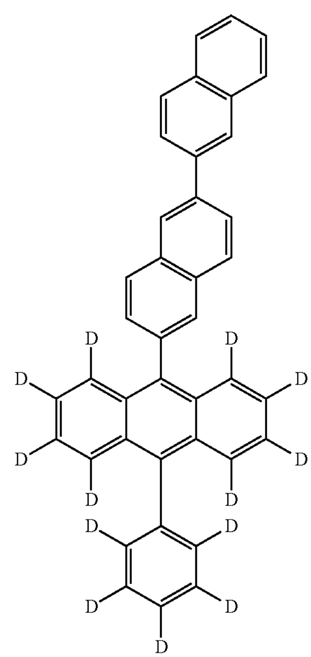

-continued
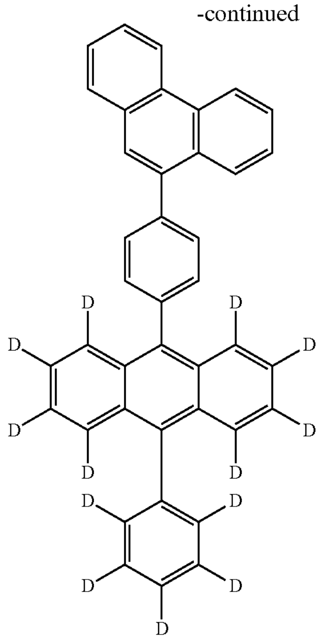
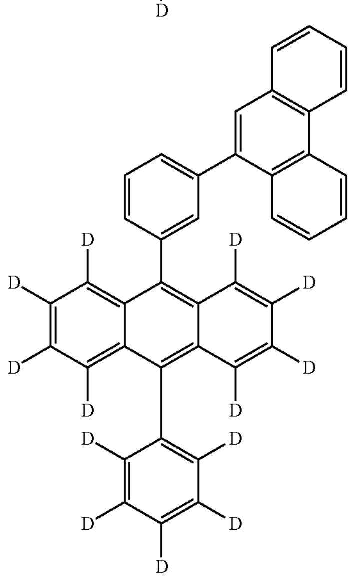
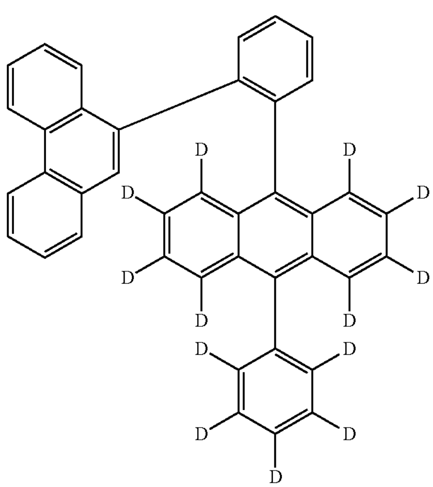
-continued
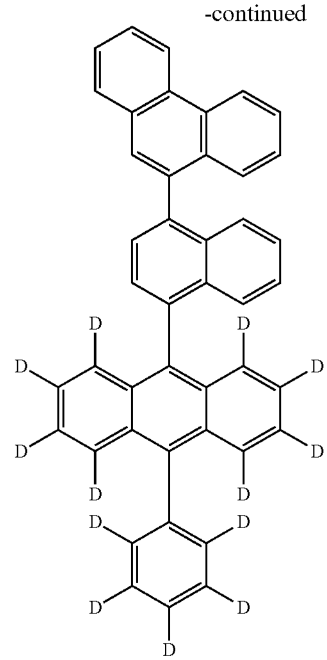
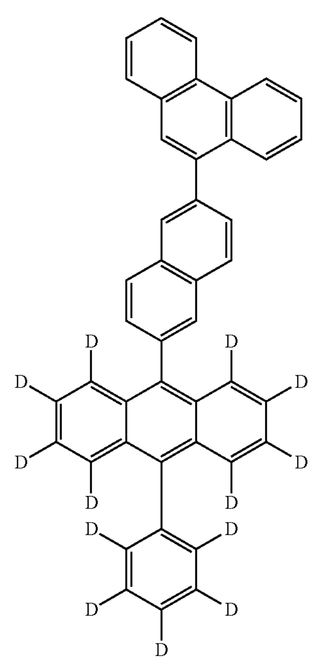

-continued
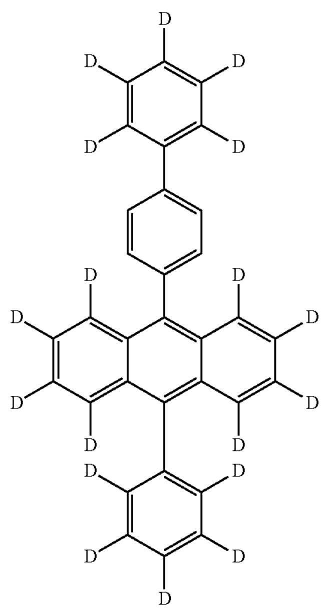
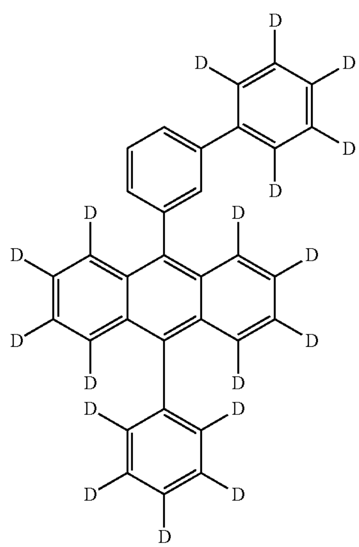
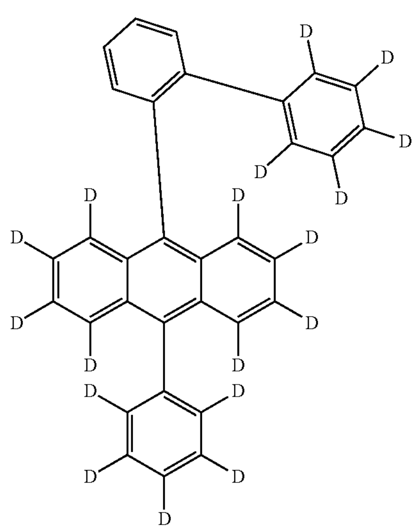
-continued
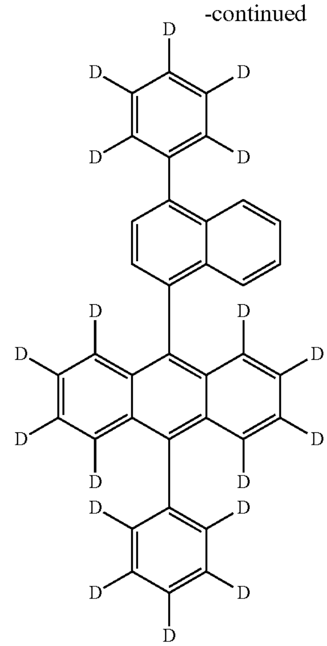
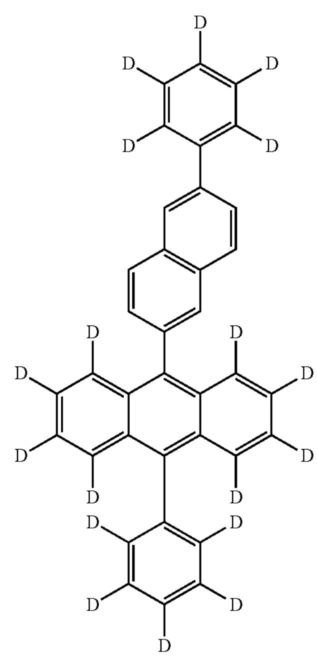

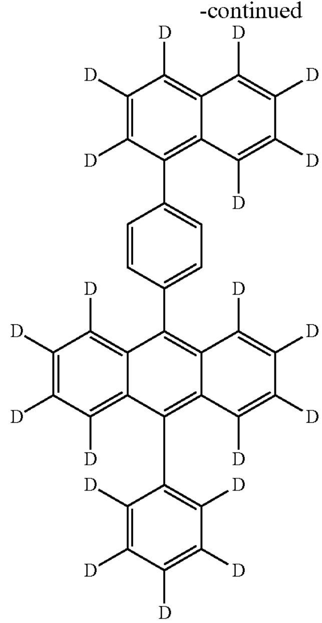
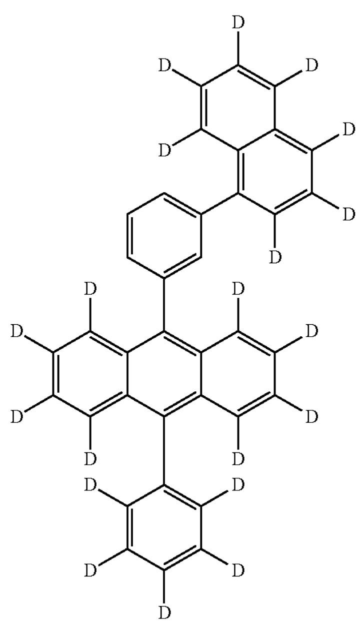
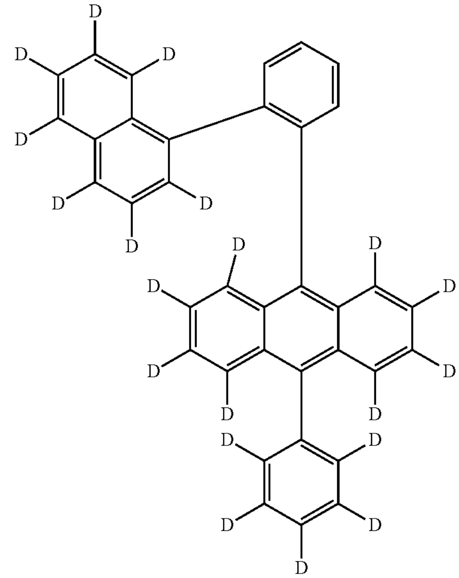
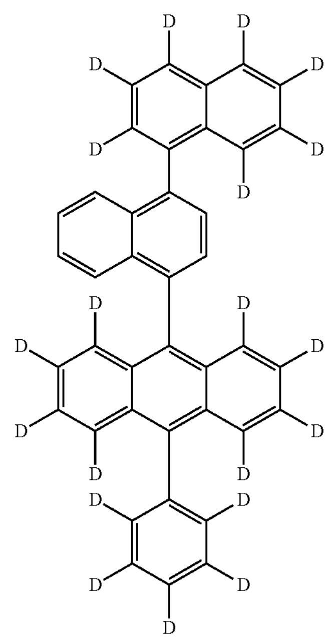

-continued
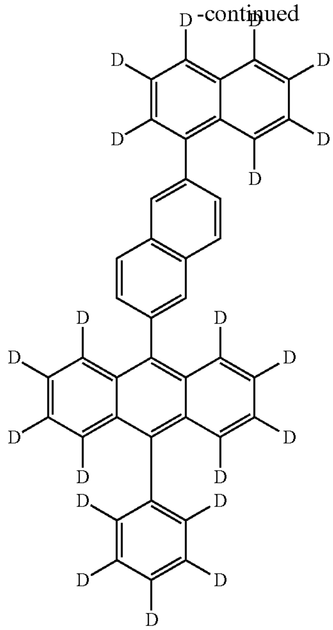
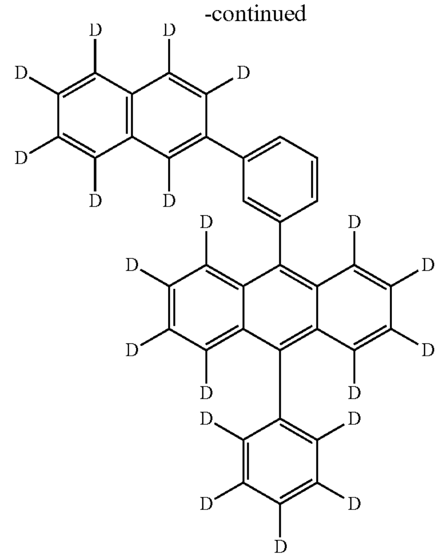
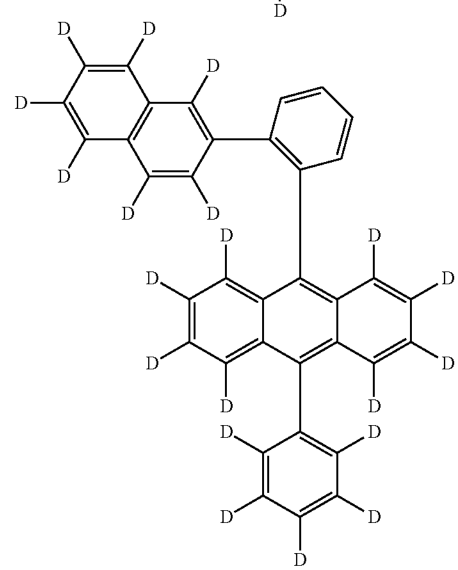
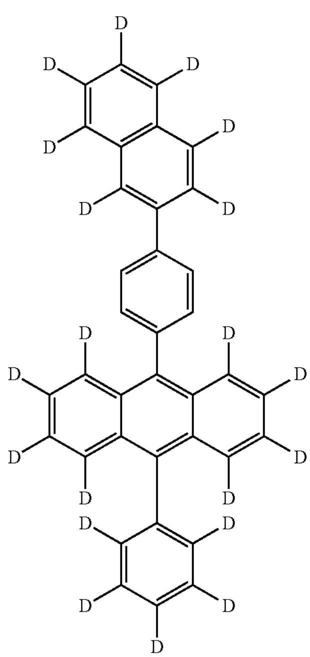
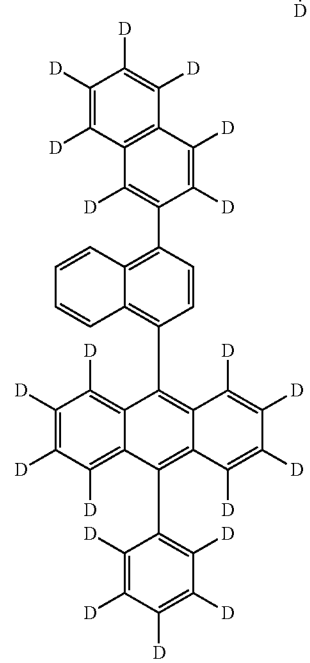

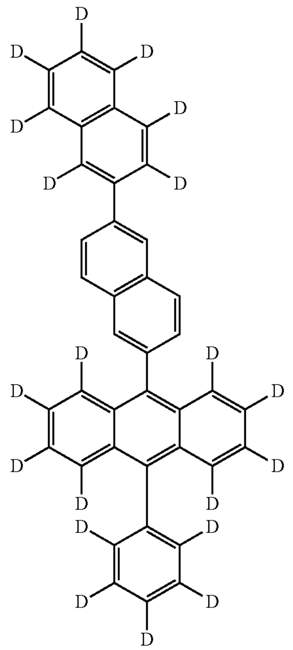
D
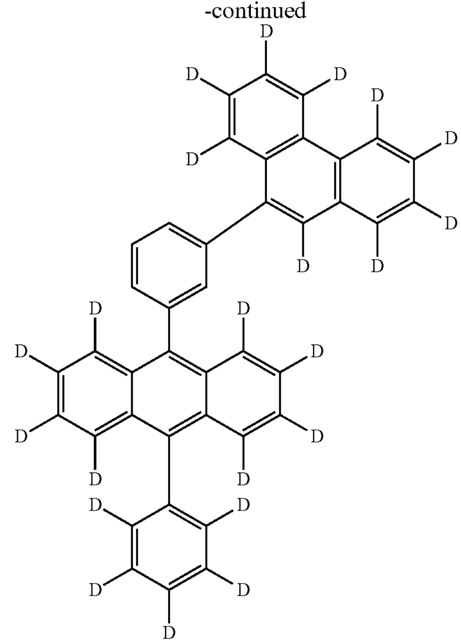
D
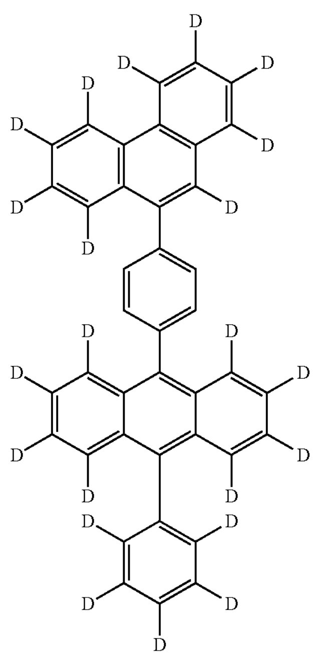
D
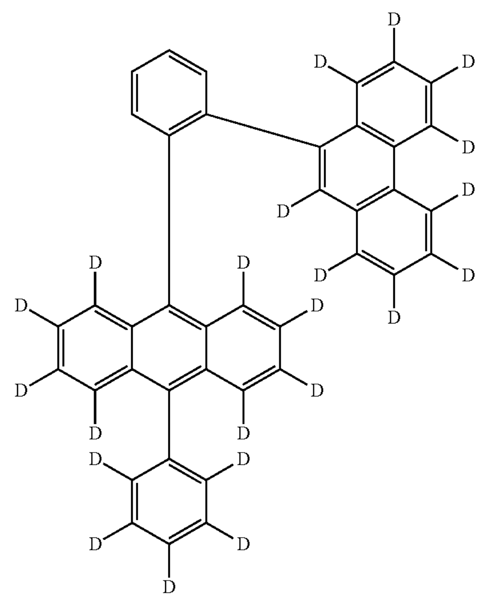
D

-continued
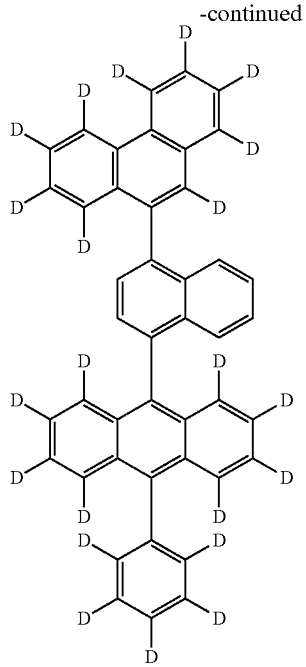
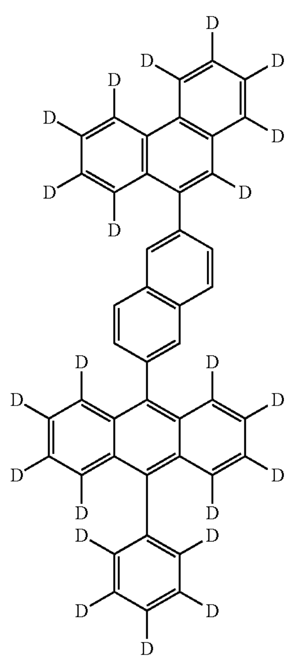
-continued
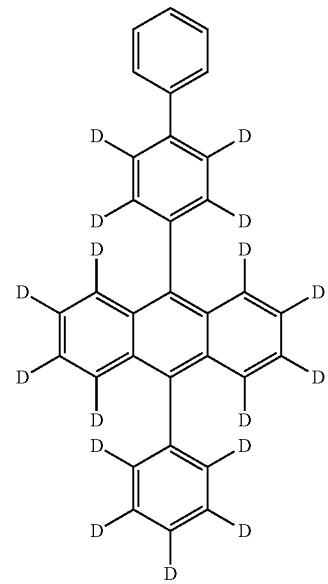
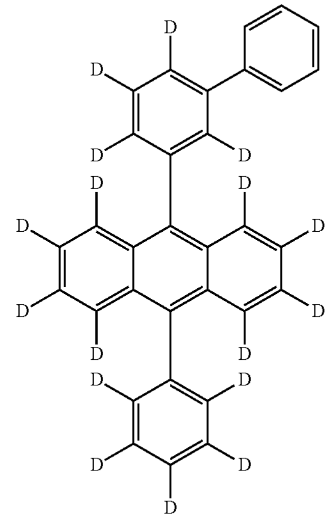
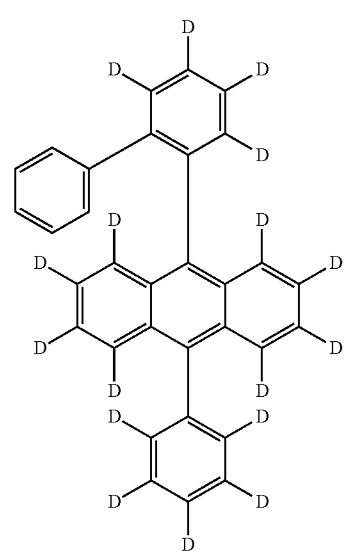

-continued
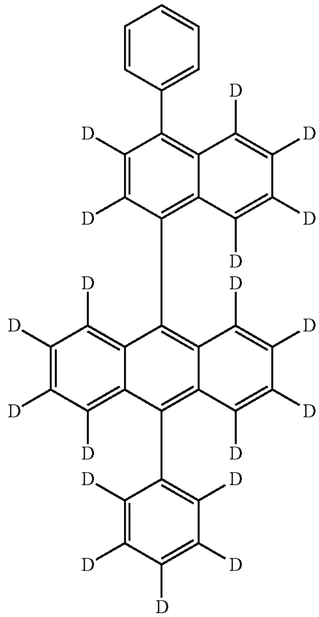
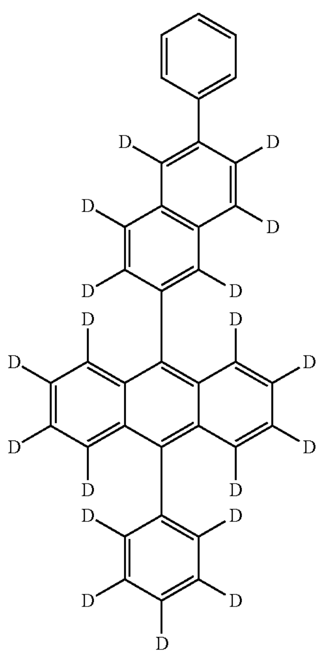
-continued
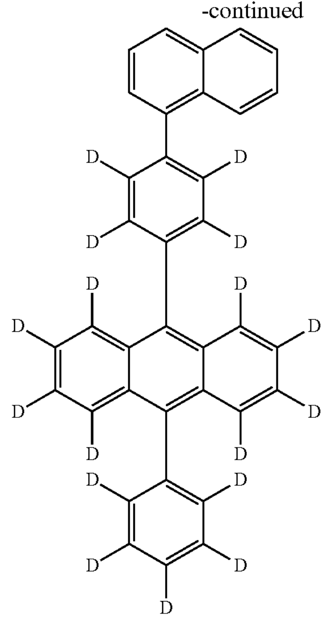
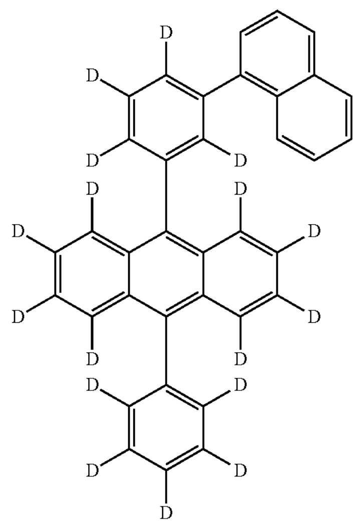
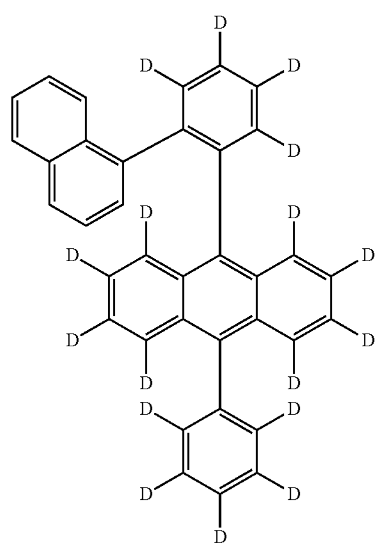

-continued
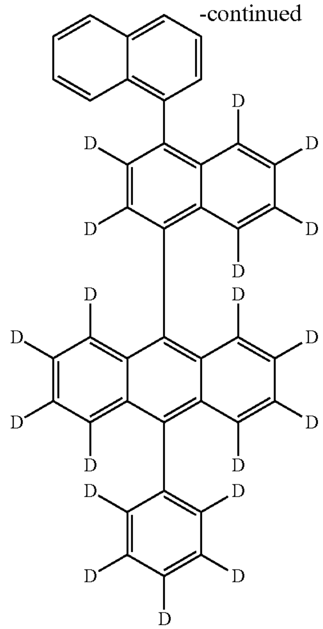
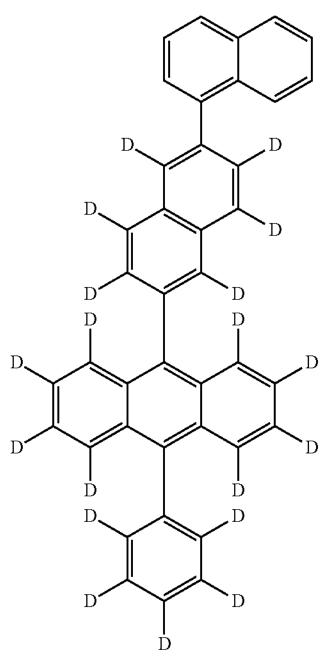
-continued
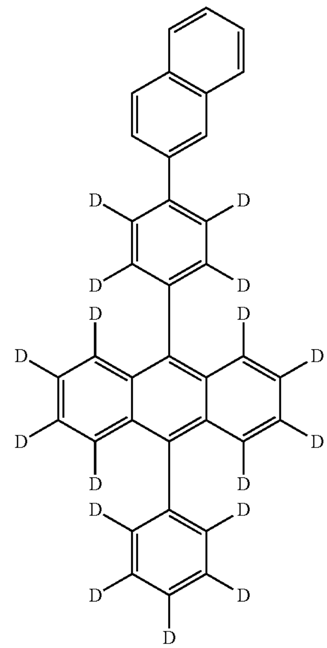
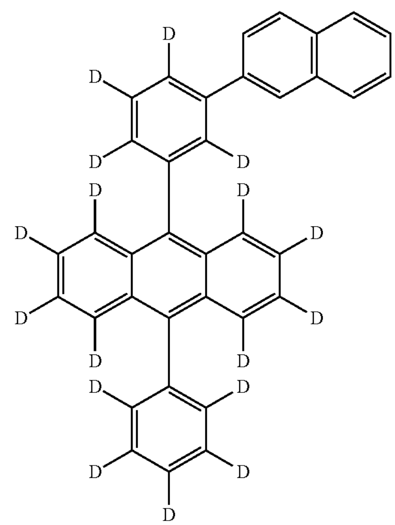
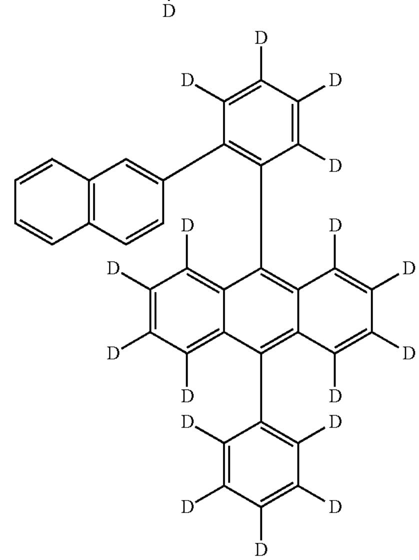

-continued
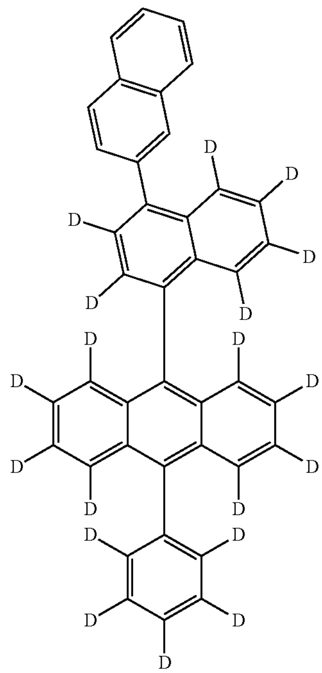
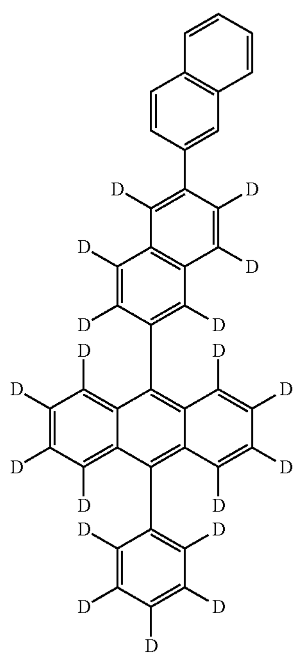
-continued
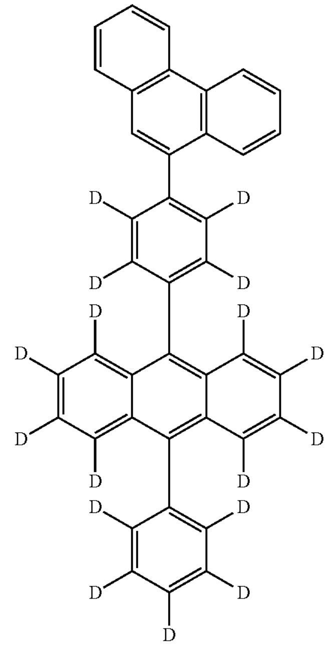
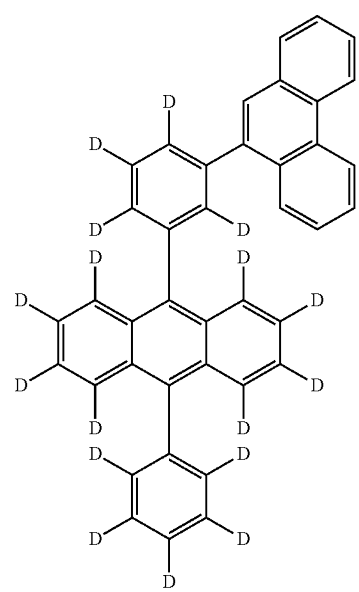

-continued
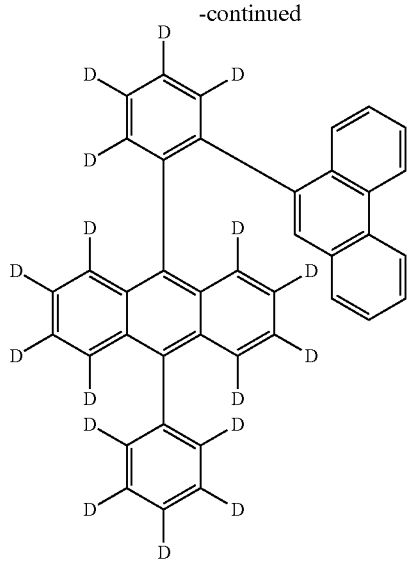
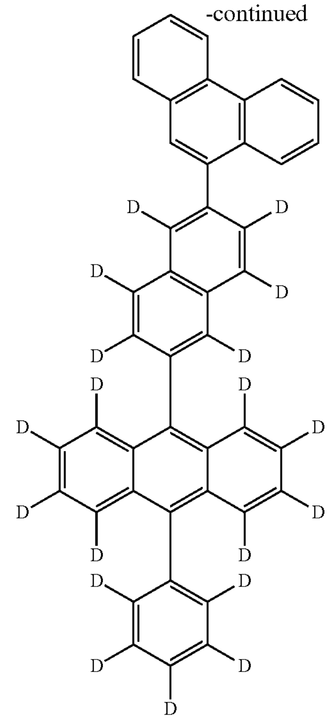
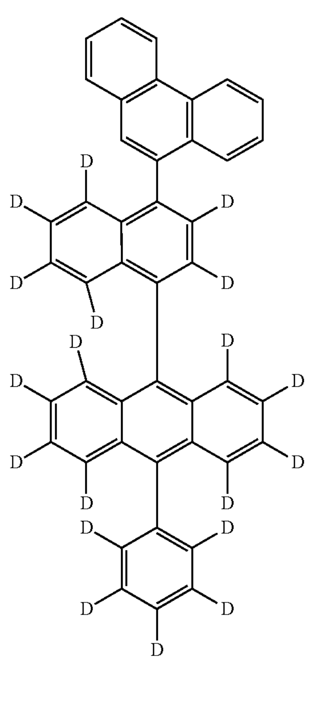
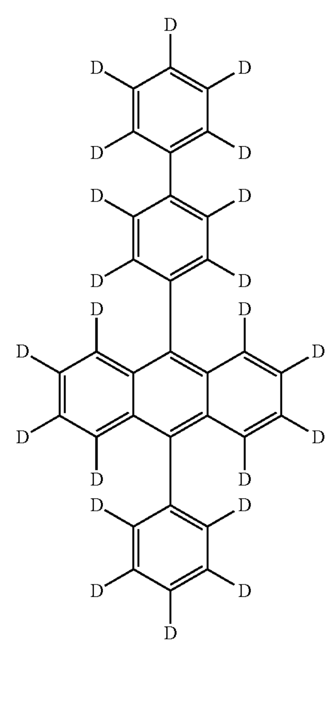

-continued
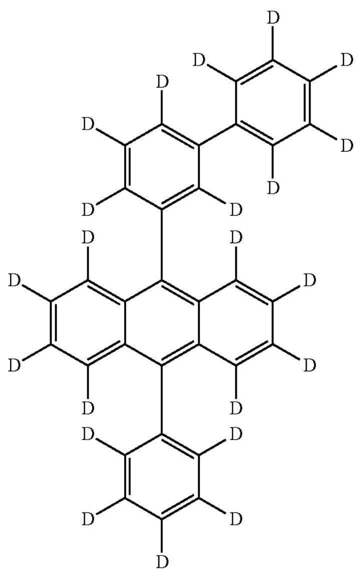
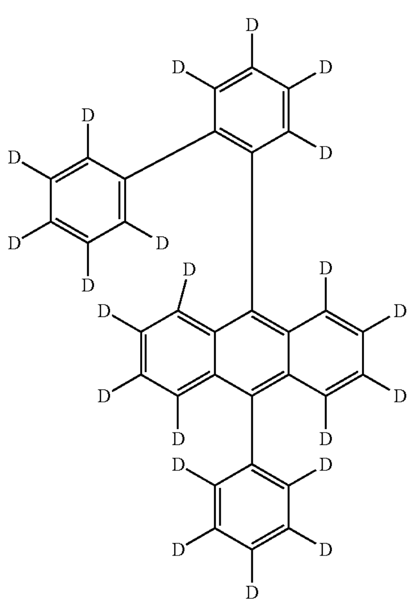
-continued
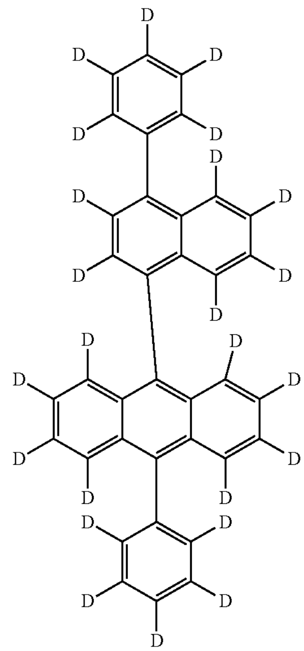
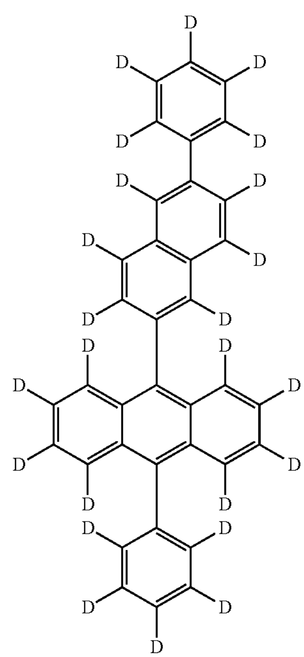

-continued
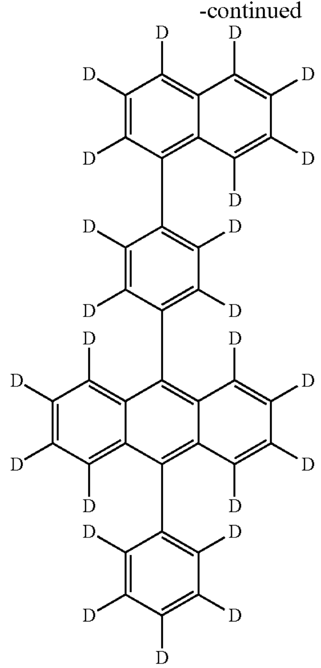
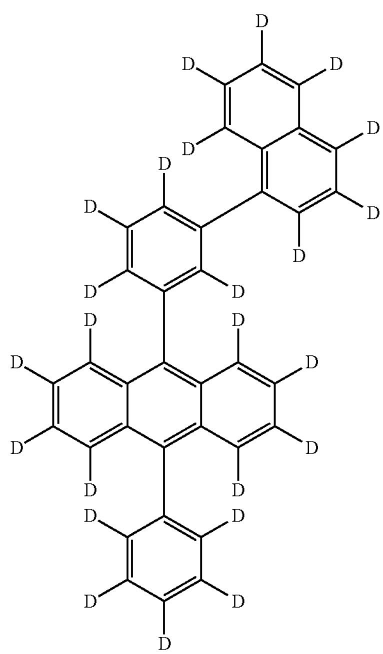
-continued
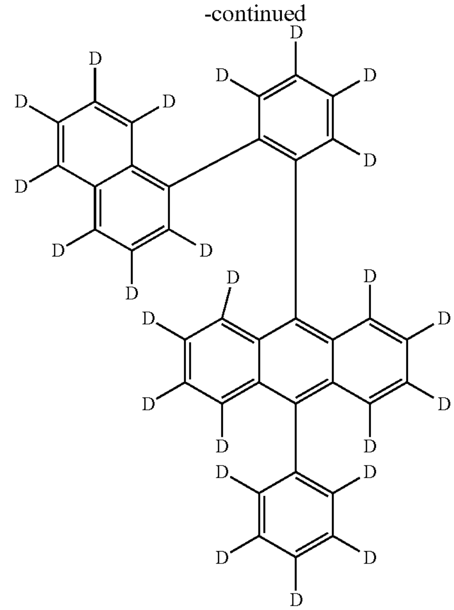
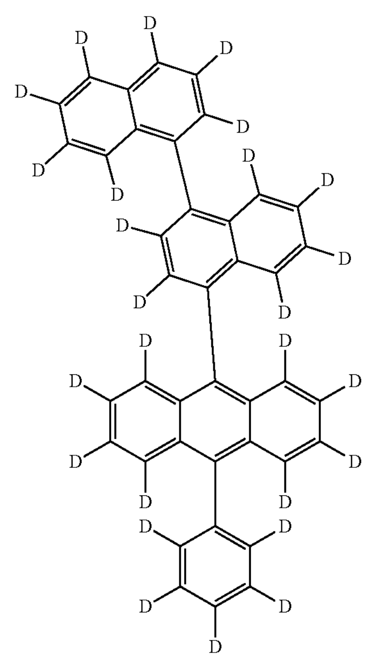

-continued
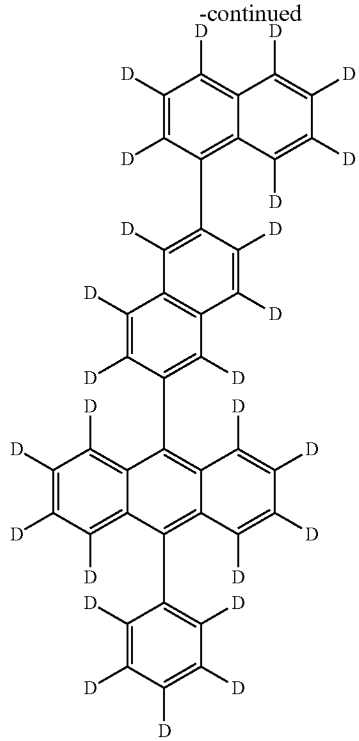
-continued
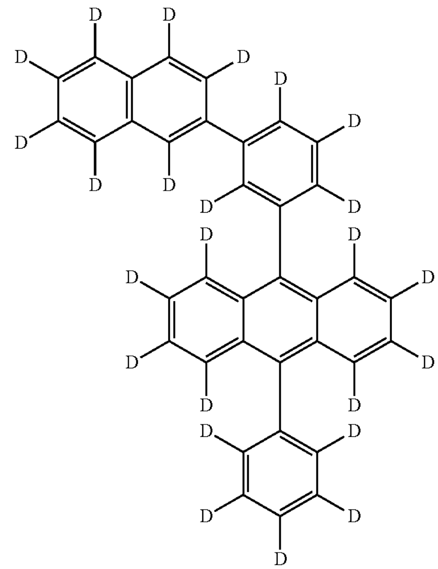
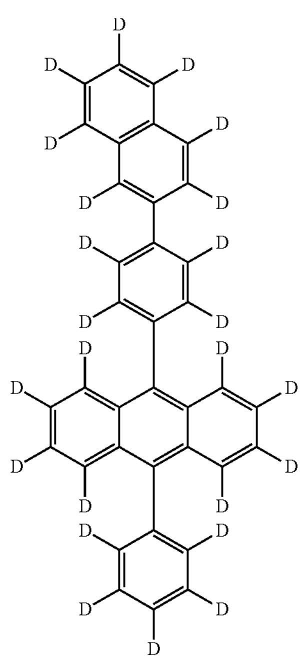
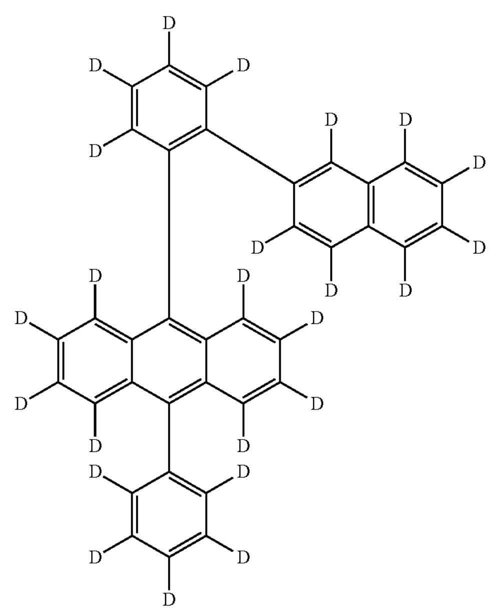

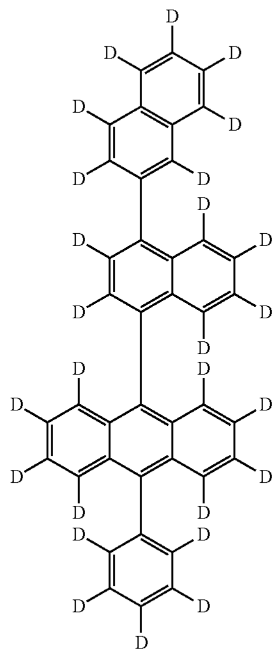
D
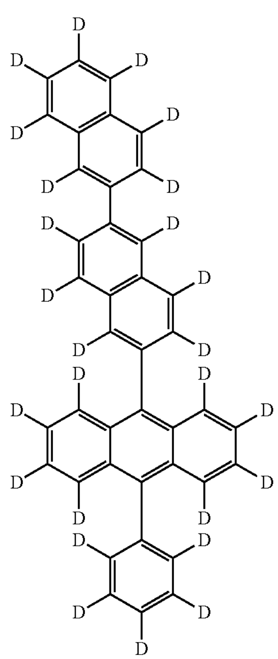
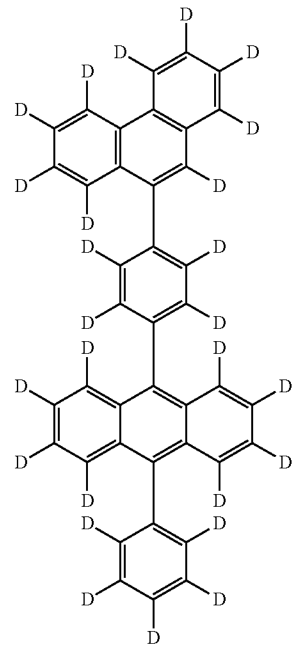
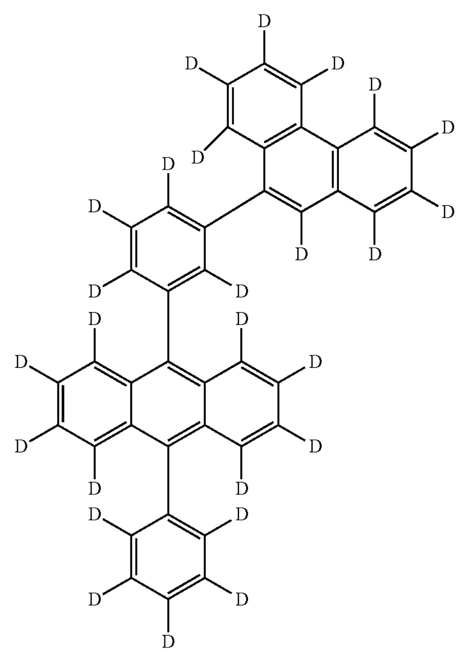

-continued
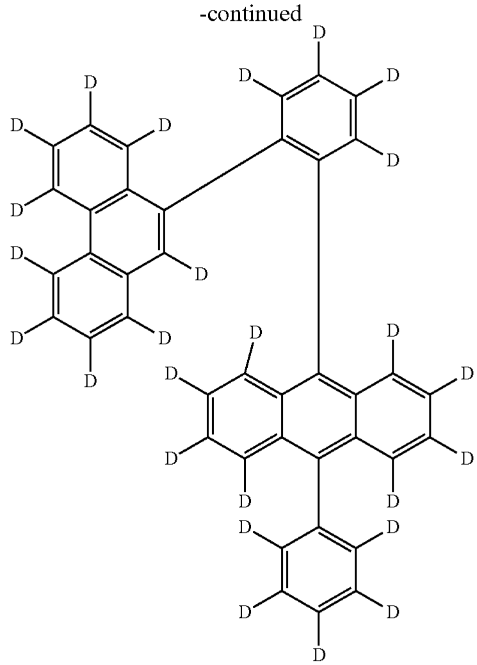
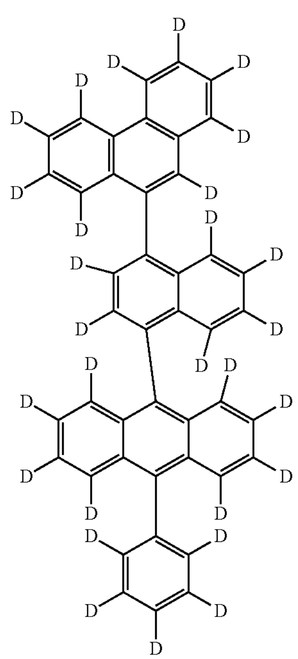
-continued
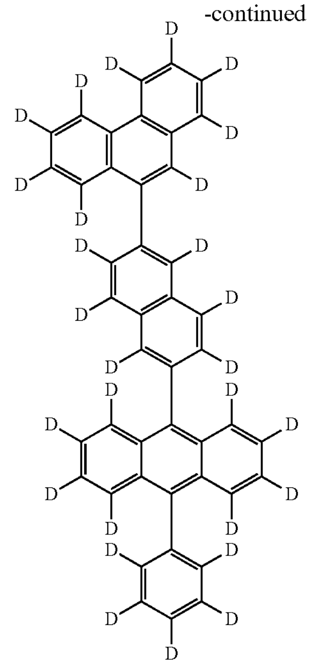
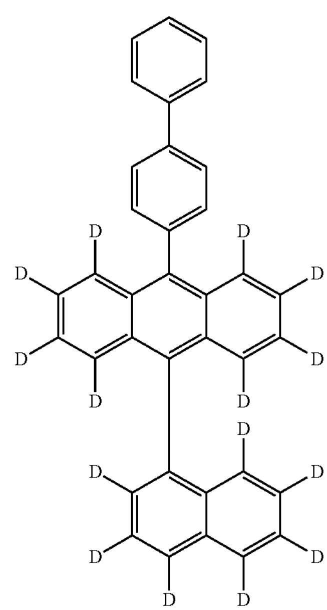

-continued
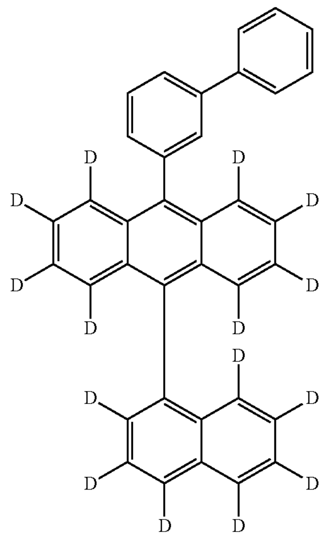
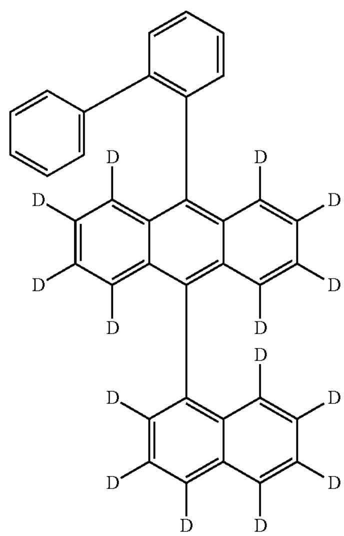
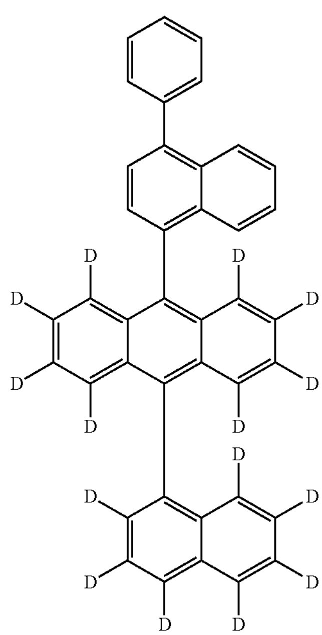
-continued
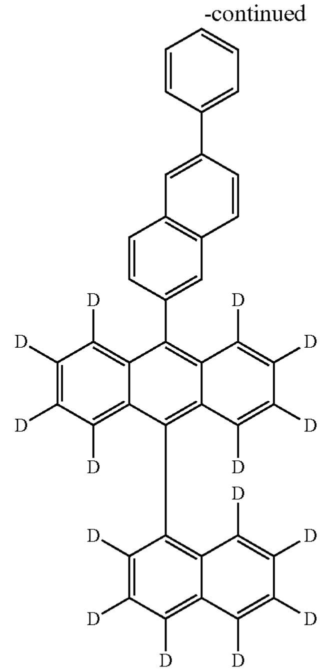
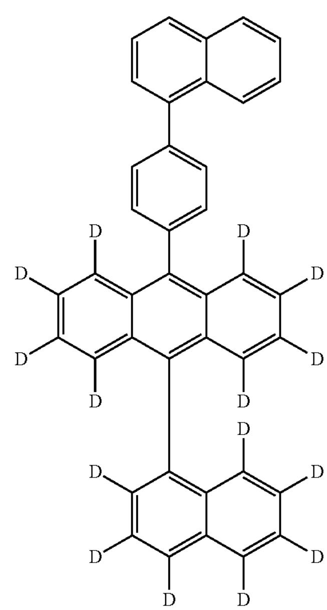

-continued
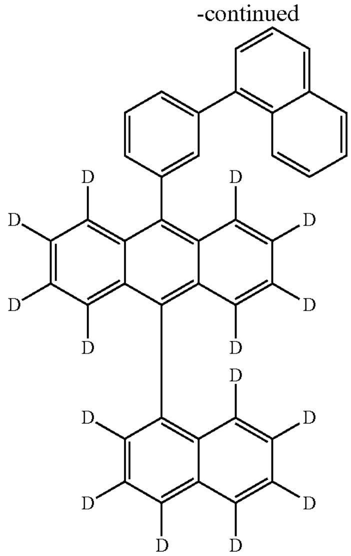
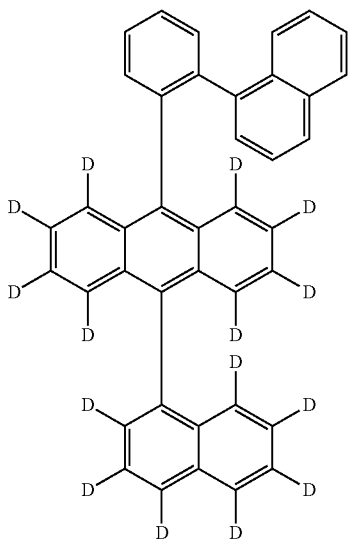
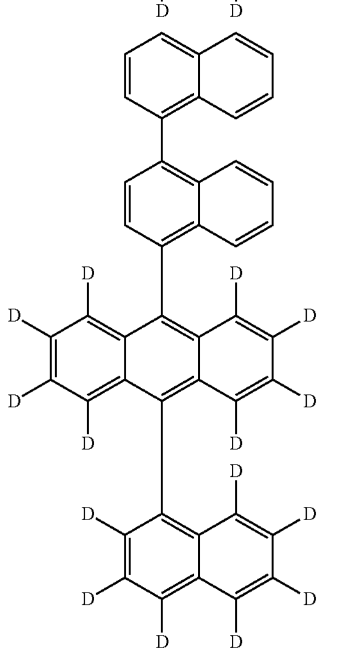
-continued
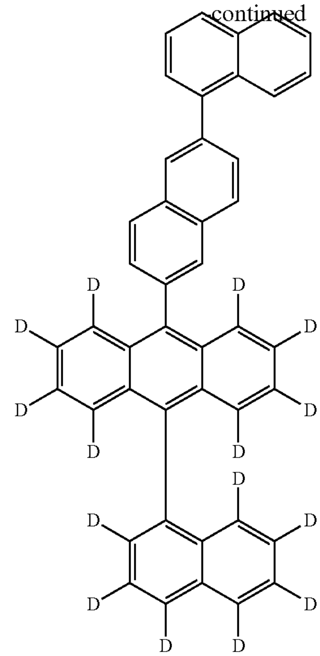
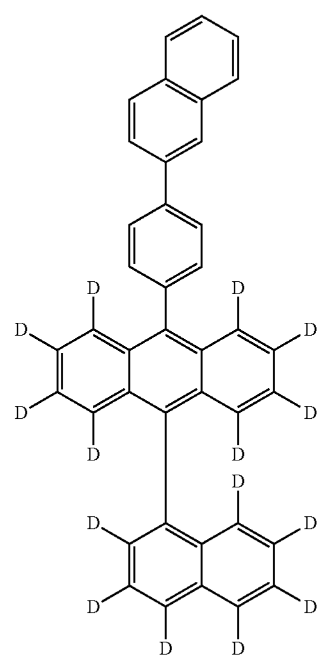

-continued
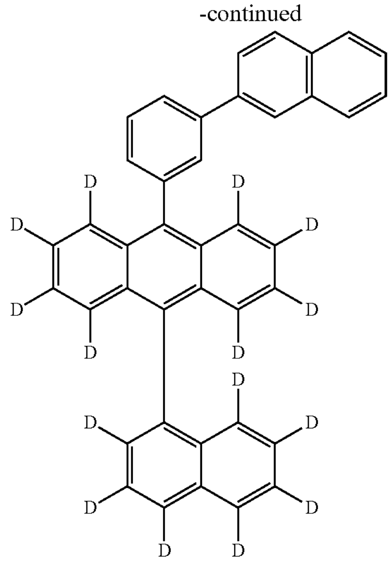
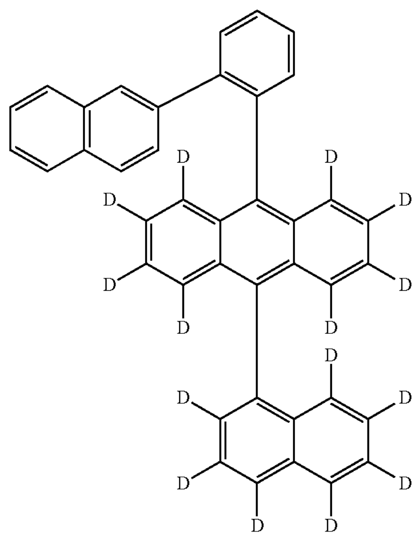
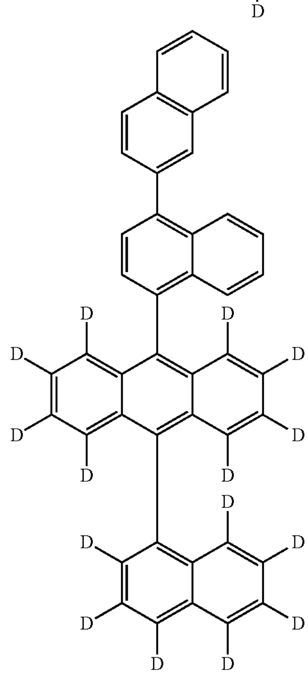
-continued
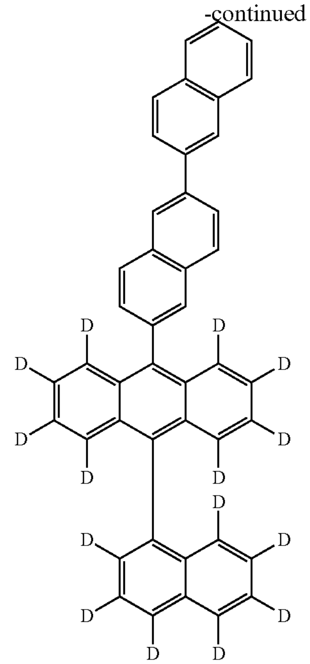
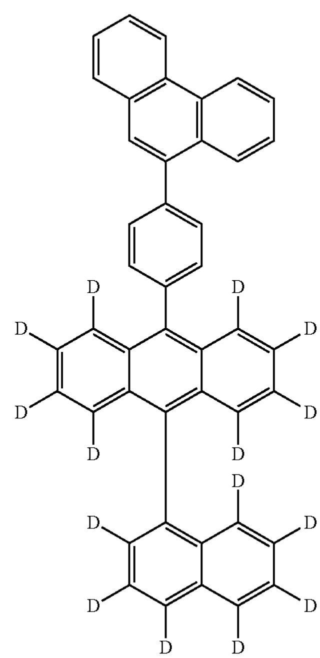

-continued
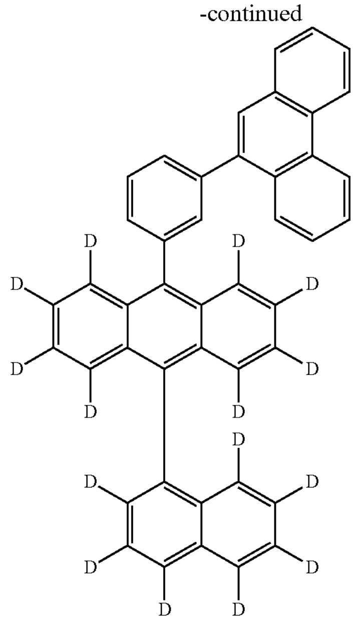
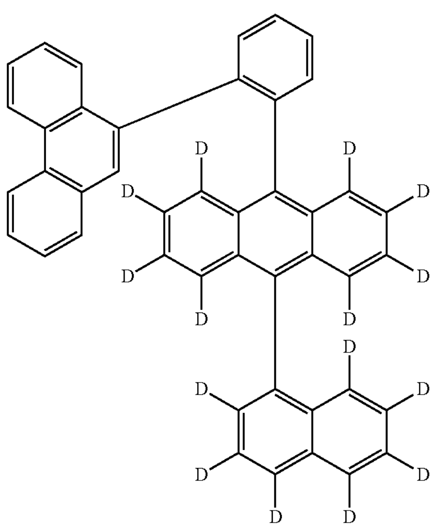
-continued
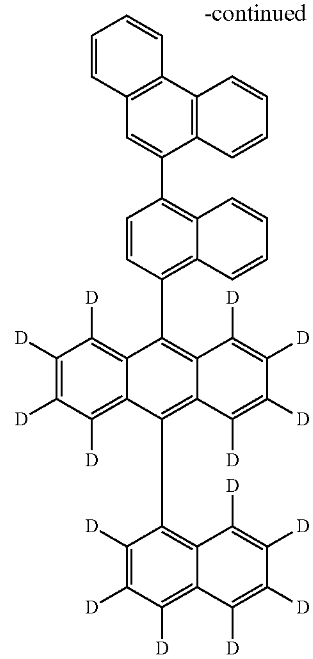
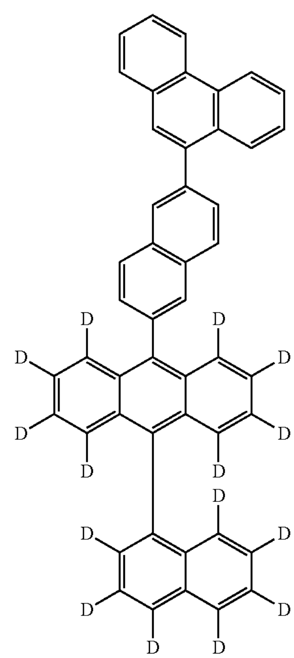

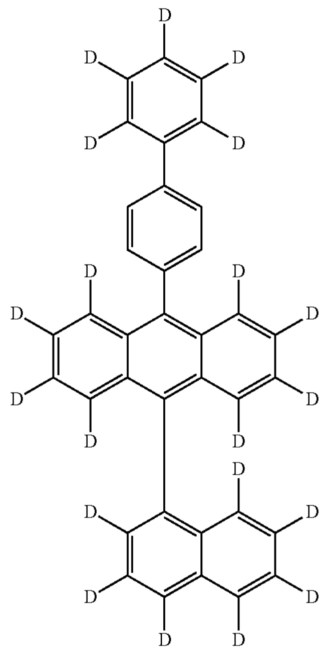
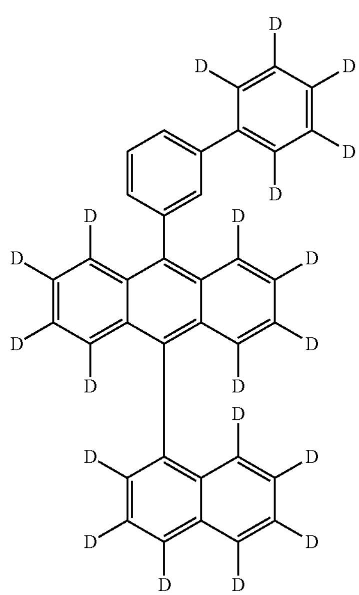
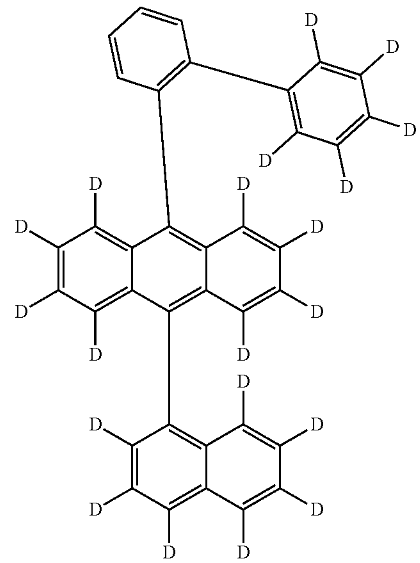
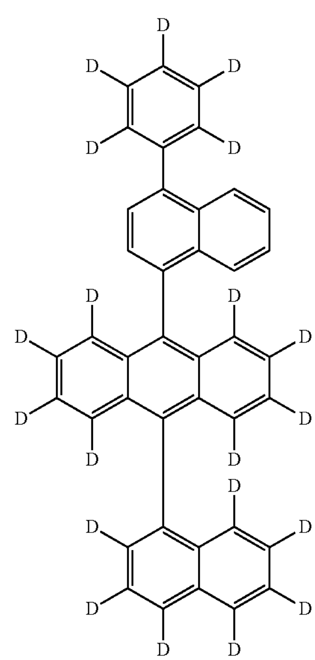

-continued
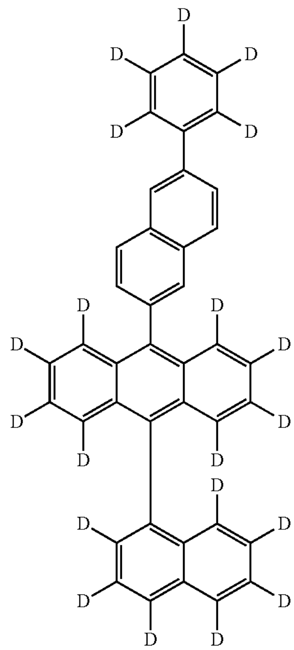
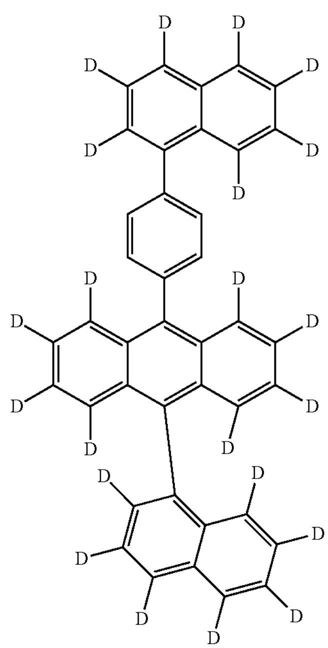
-continued
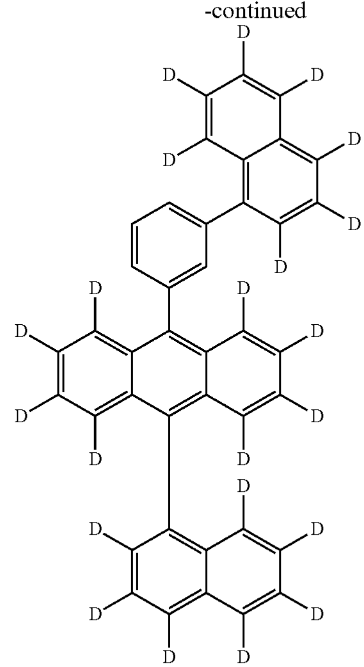
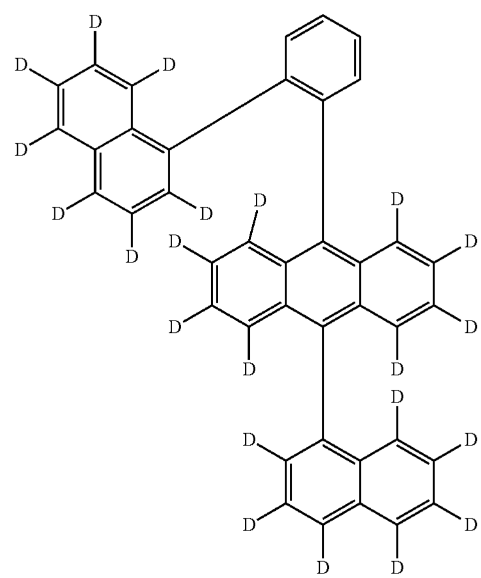

-continued
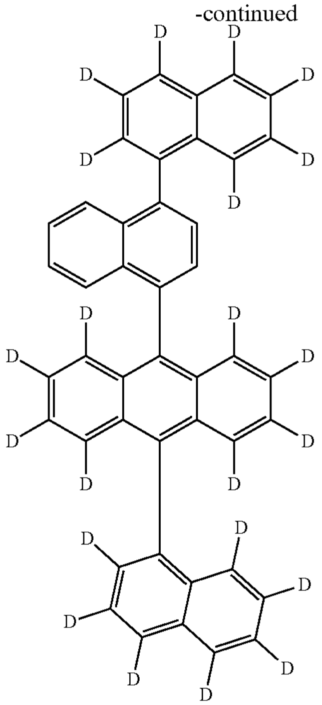
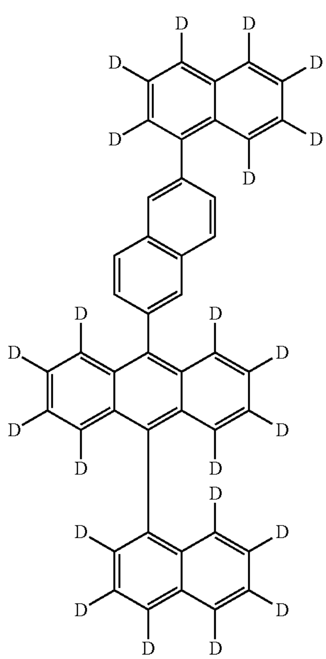
-continued
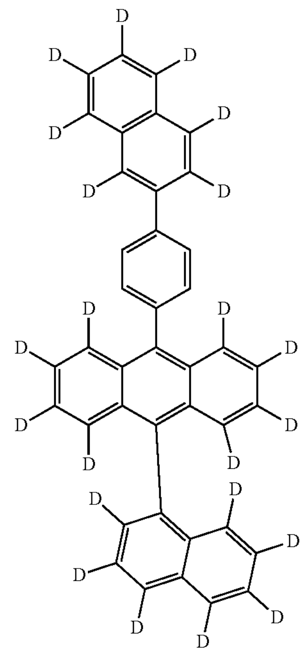
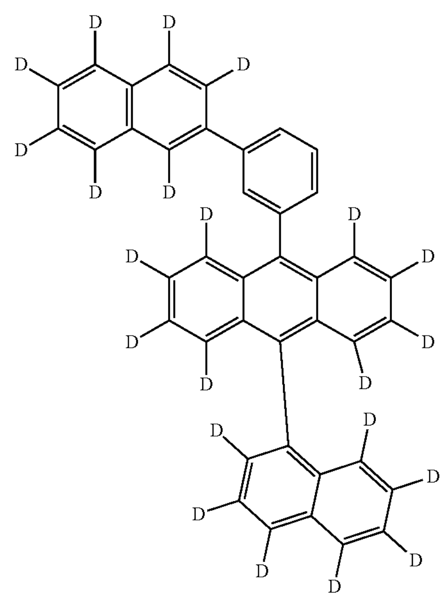

-continued
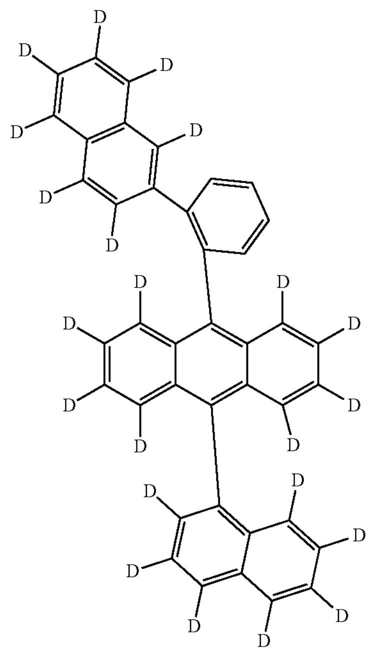
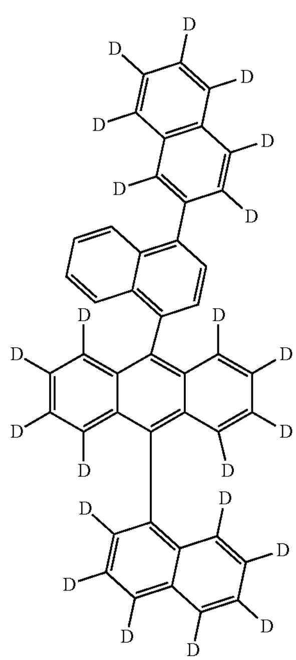
-continued
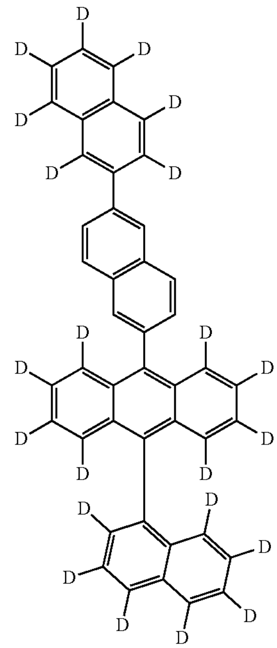
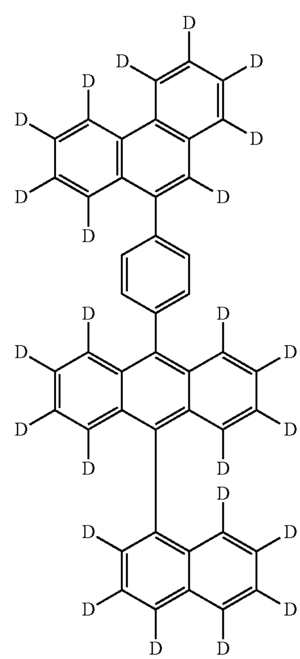

-continued
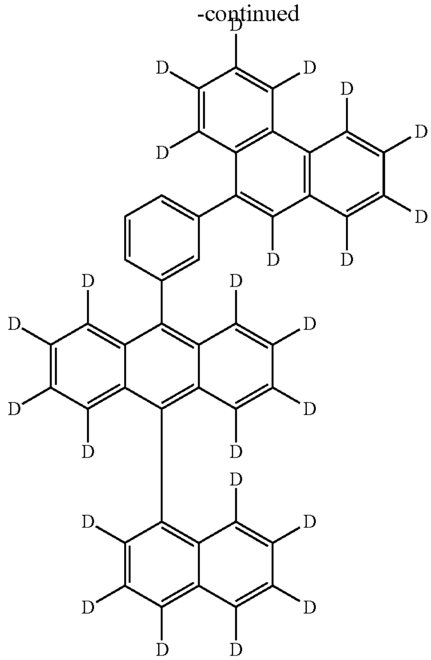
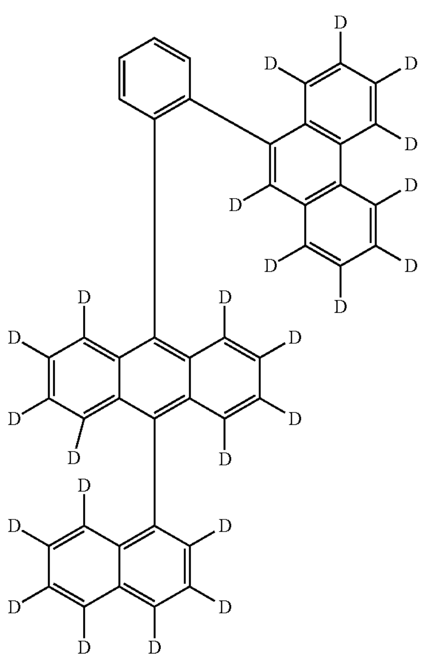
-continued
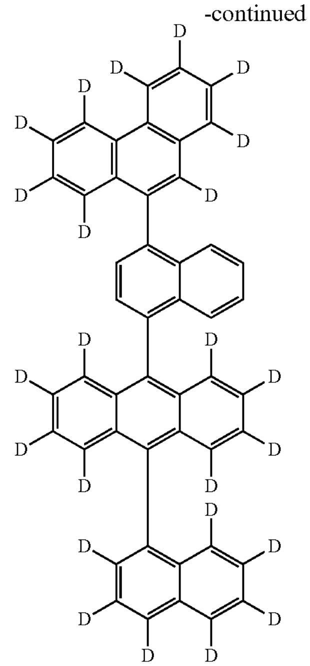
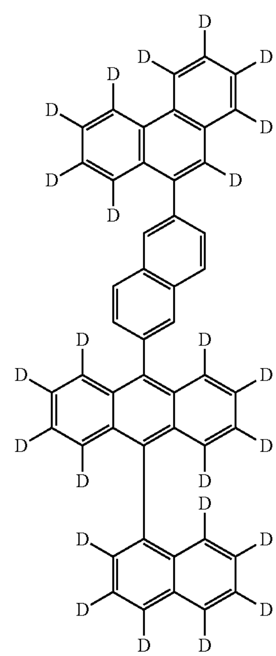

-continued
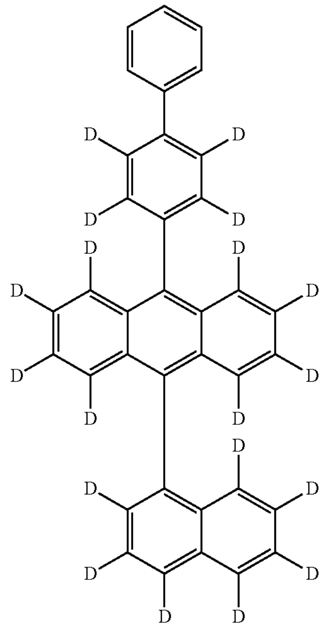
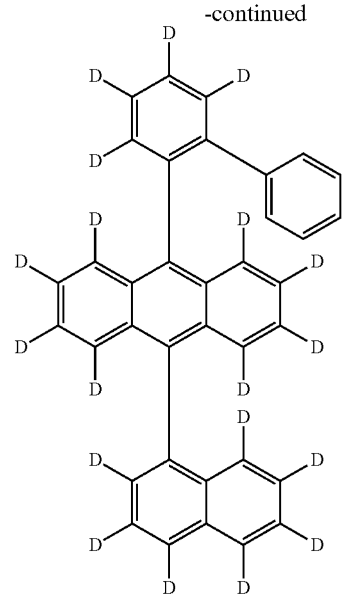
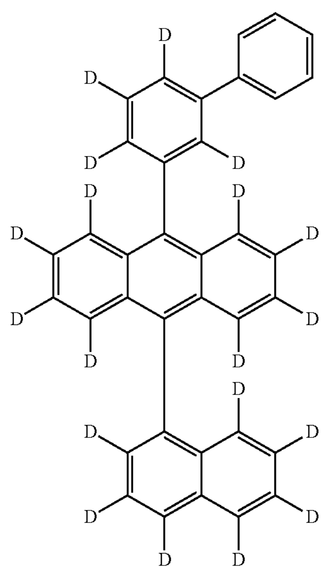
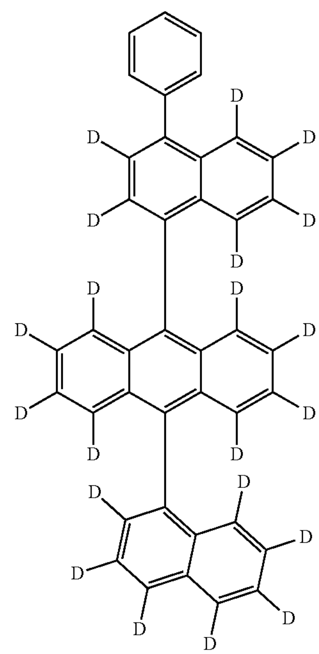

-continued
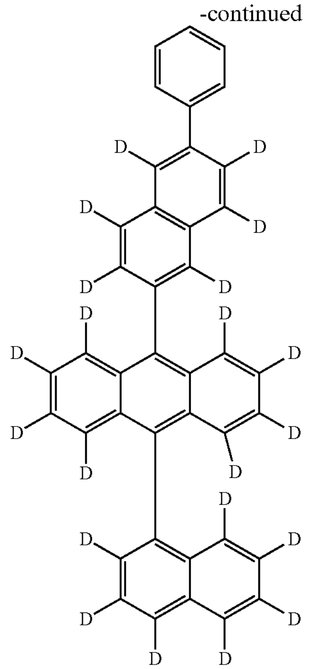
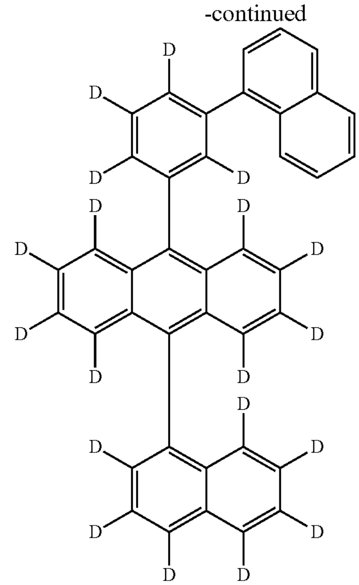
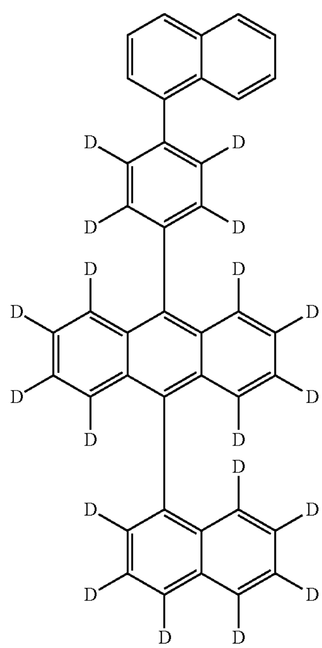
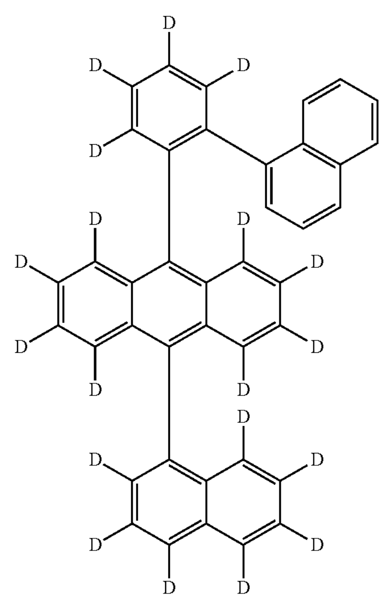

1101
-continued
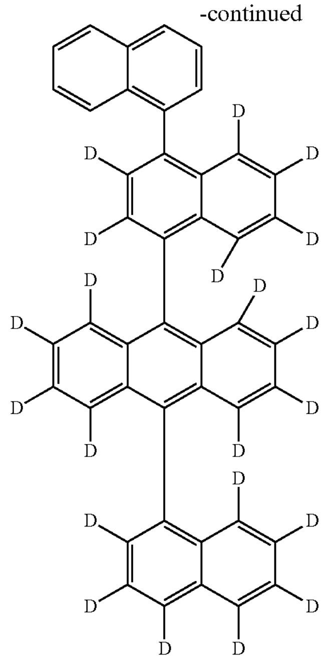
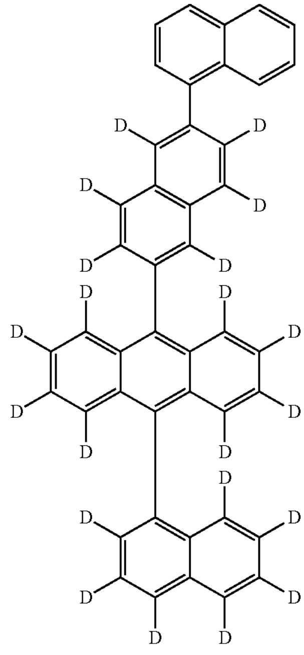
1102
-continued
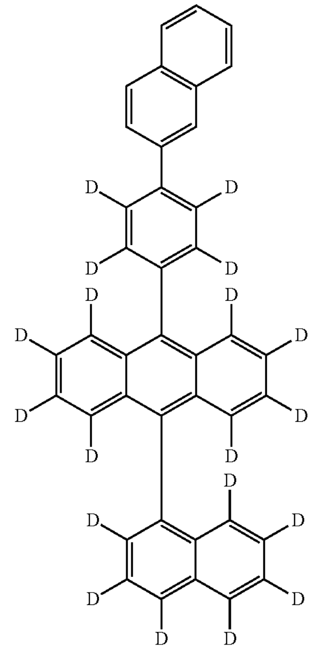
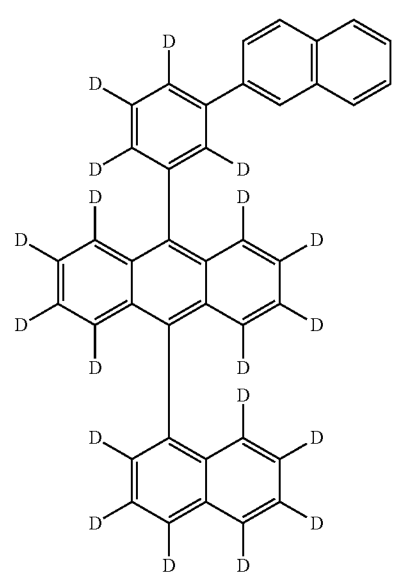

-continued
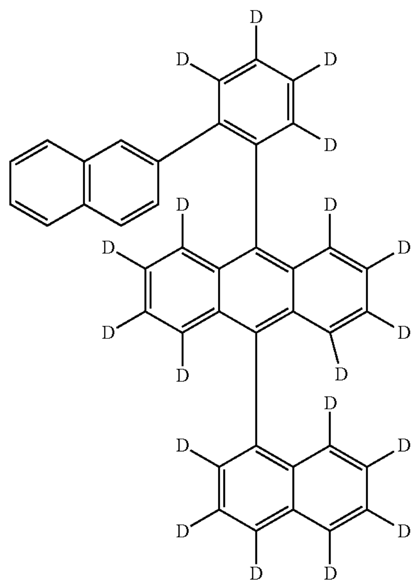
-continued
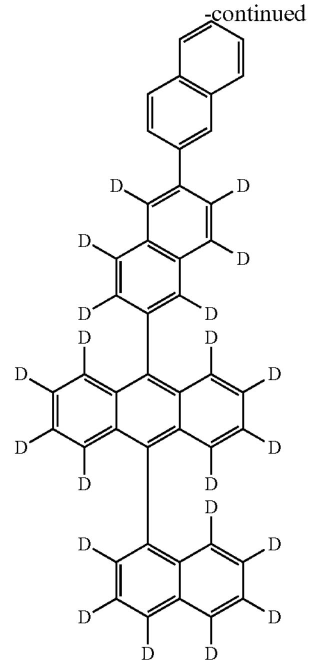
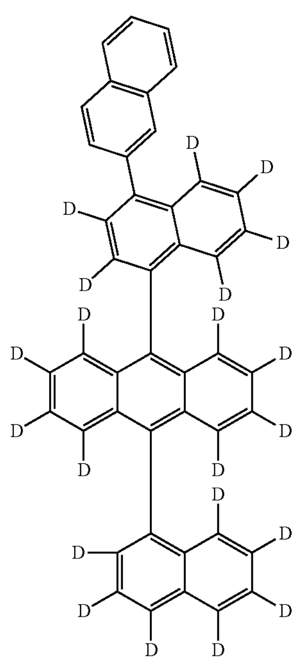
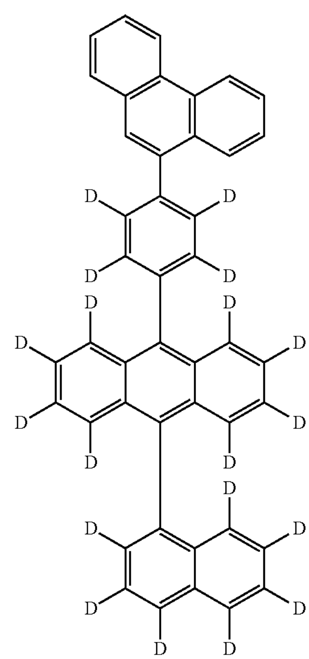

-continued
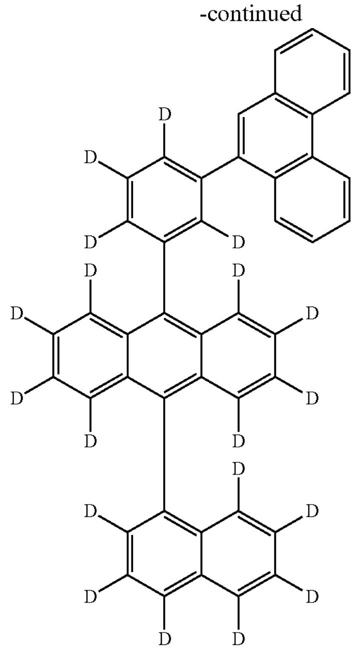
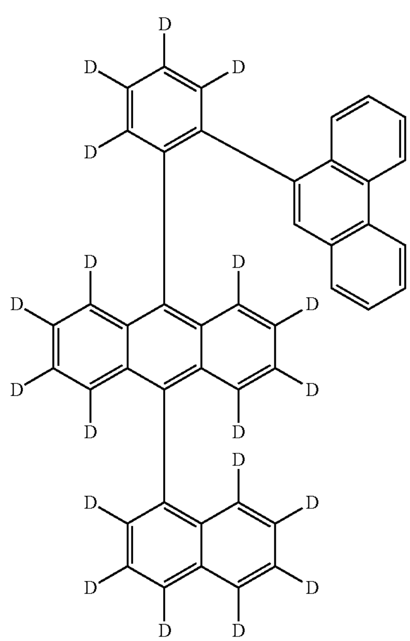
-continued
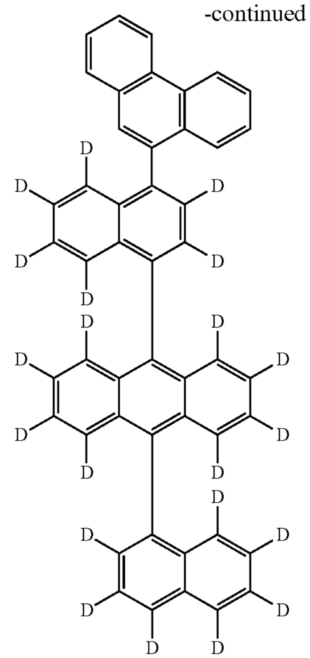
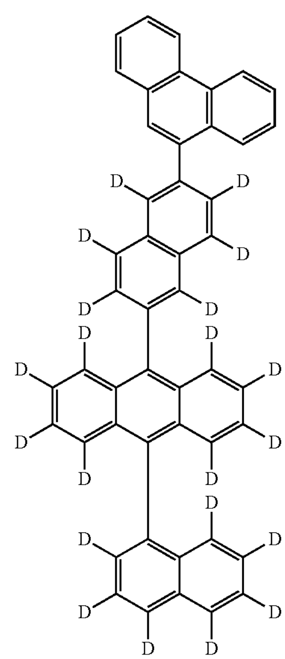

-continued
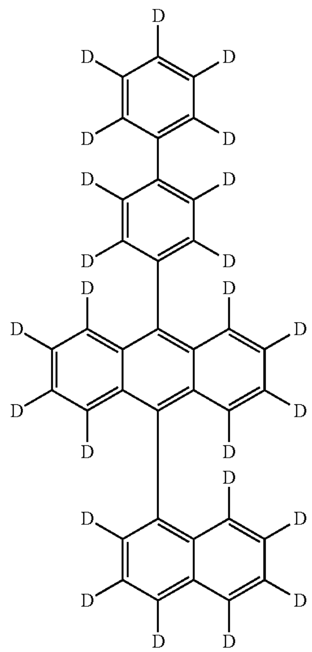
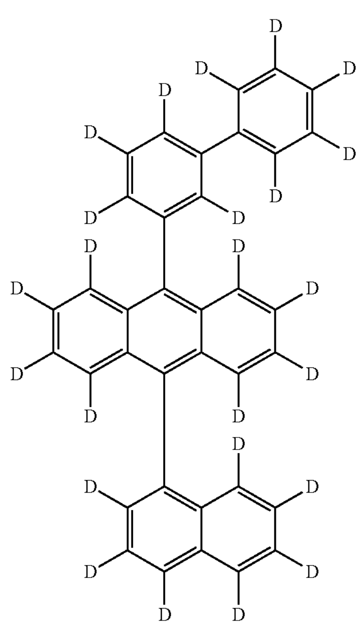
-continued
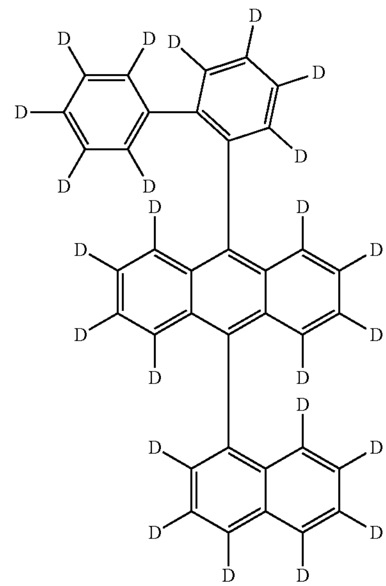
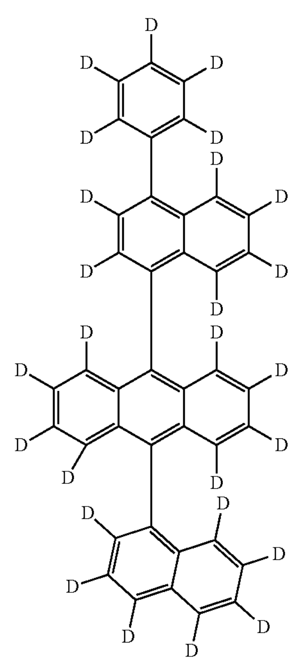

-continued
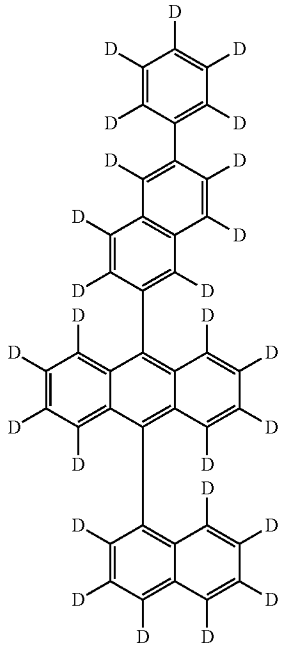
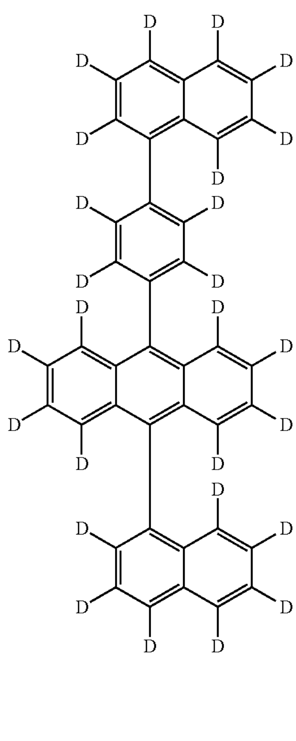
-continued
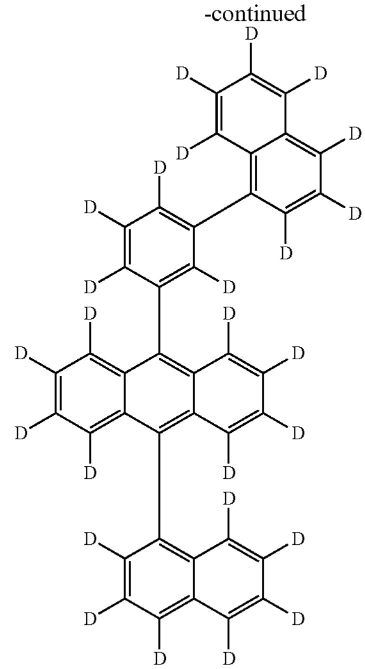
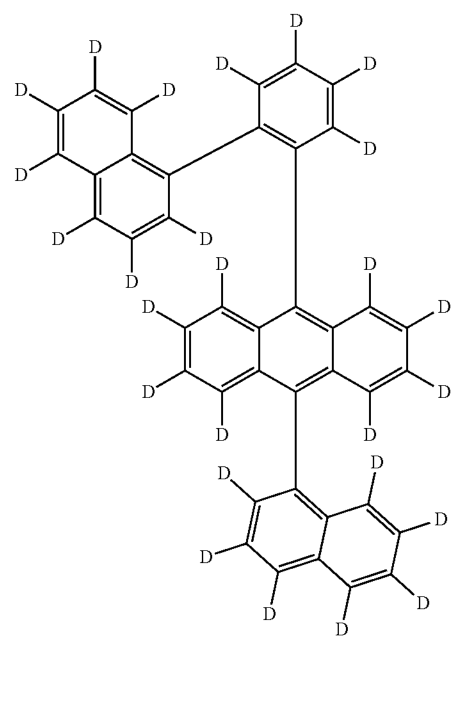

-continued
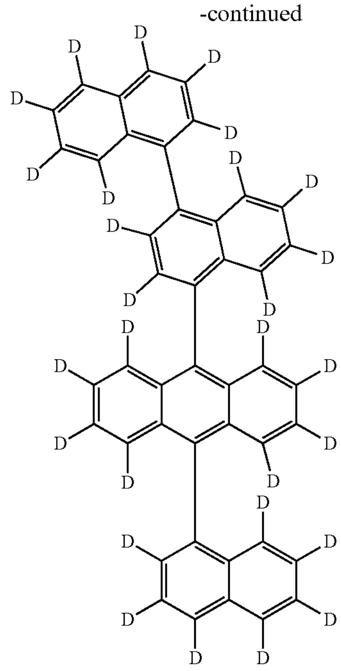
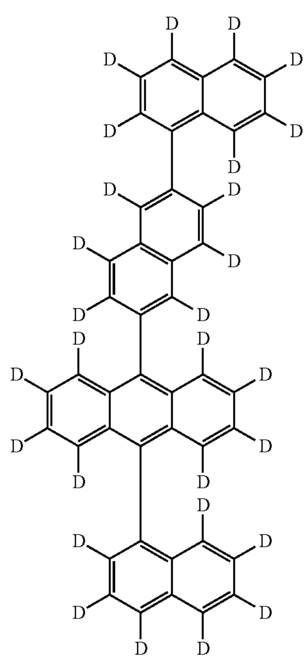
-continued
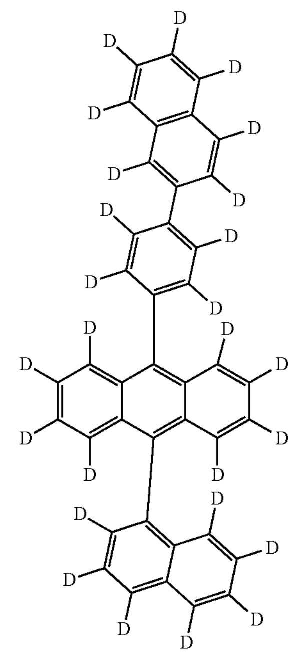
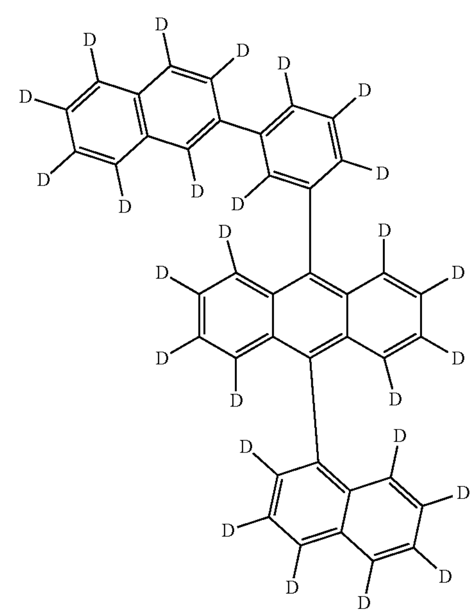

-continued
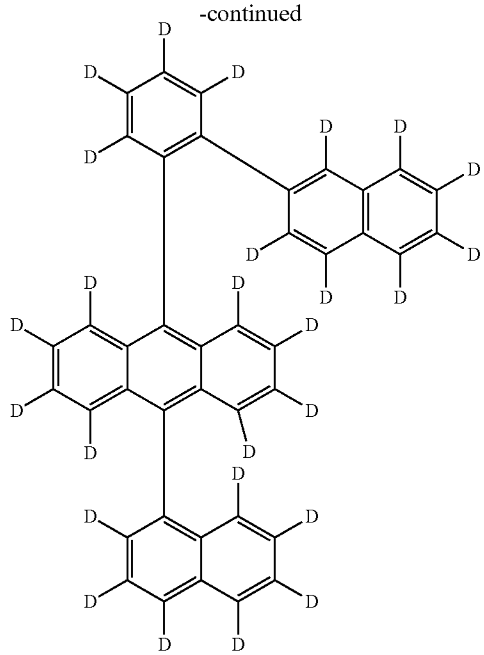
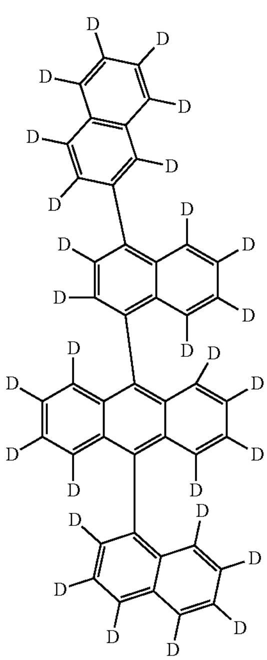
-continued
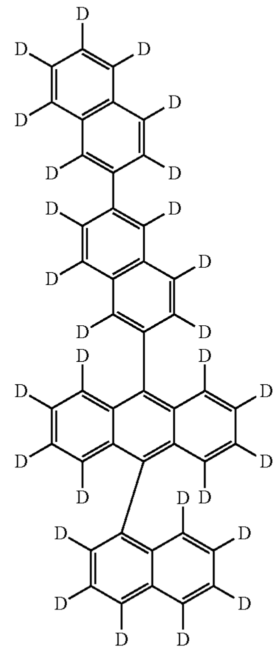
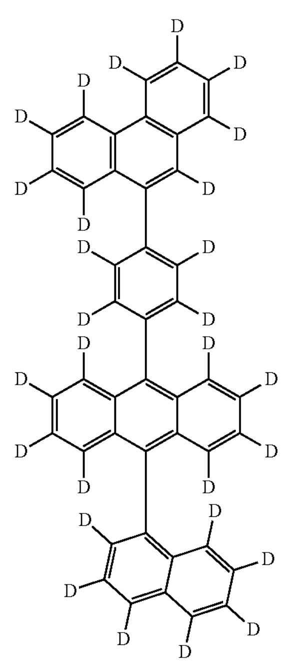

-continued
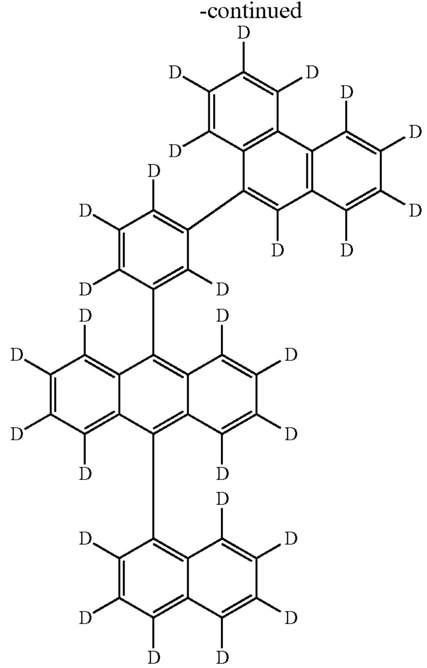
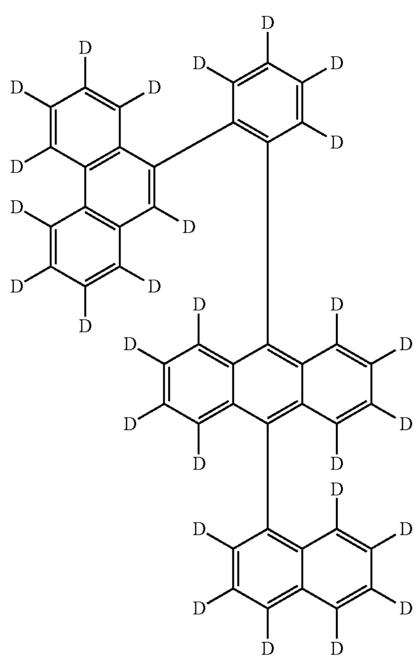
-continued
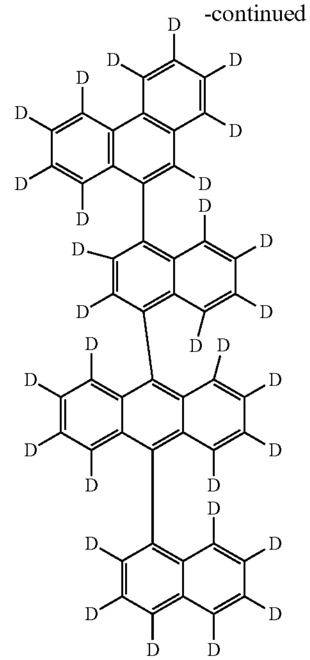
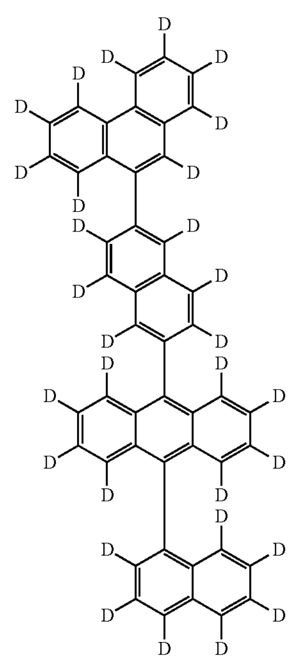

-continued
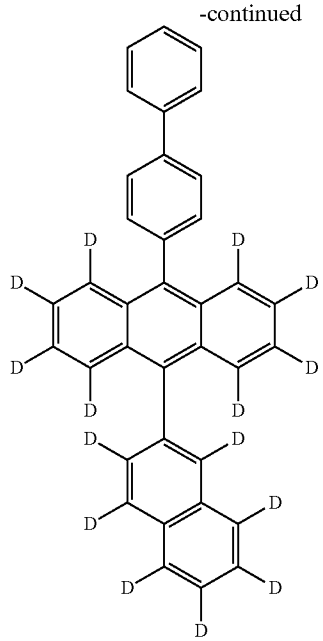
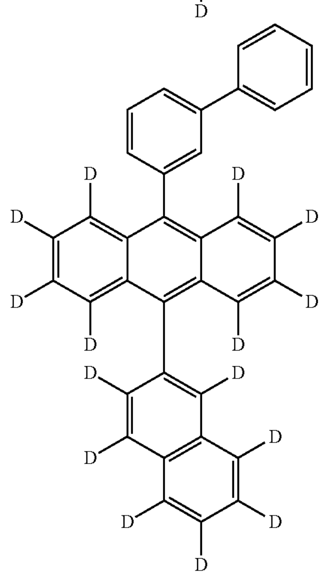
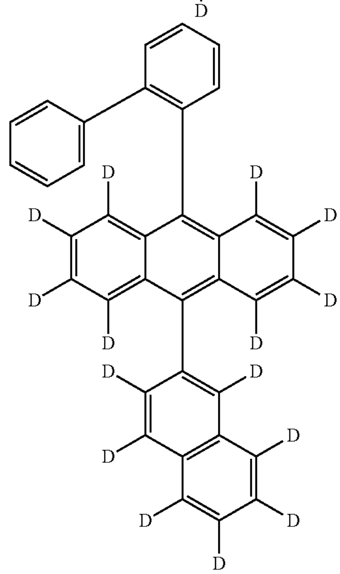
-continued
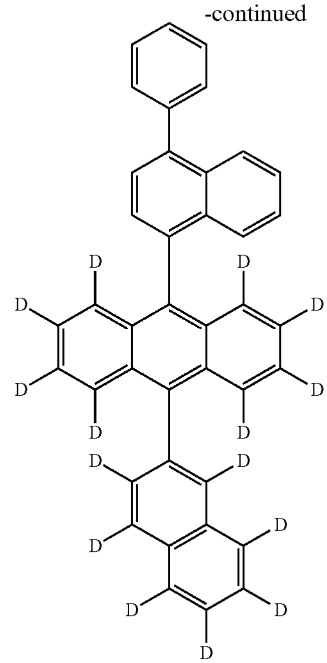
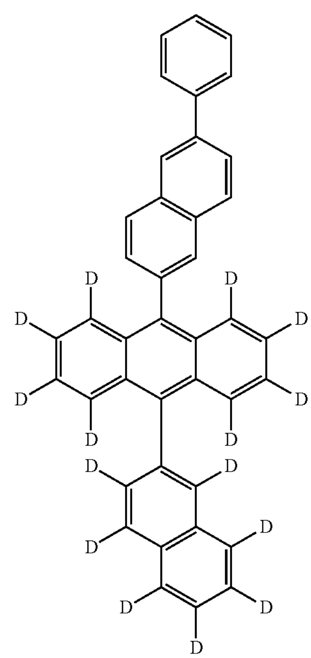

-continued
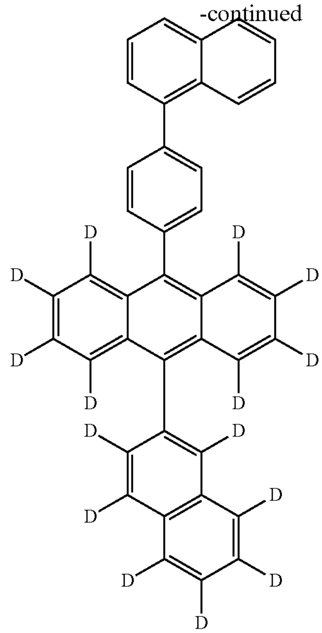
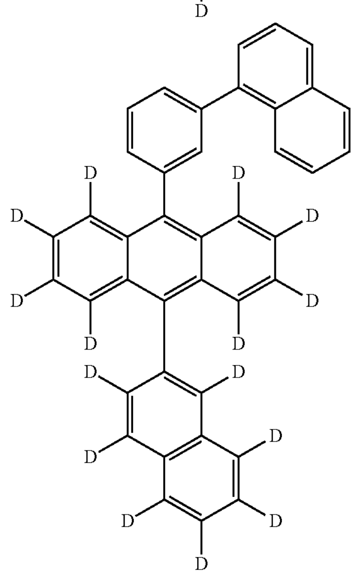
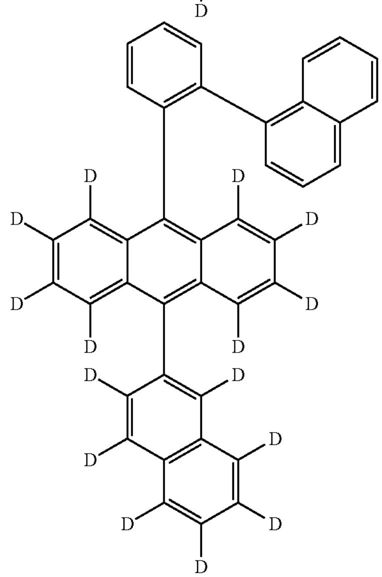
-continued
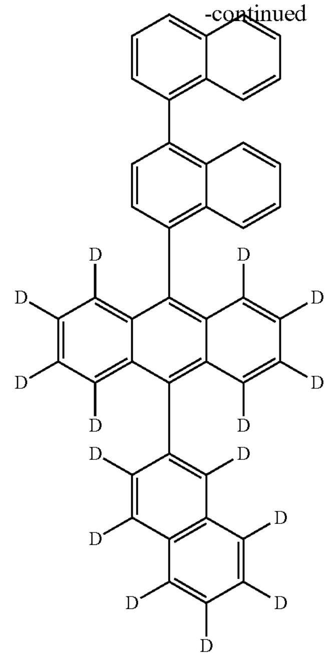
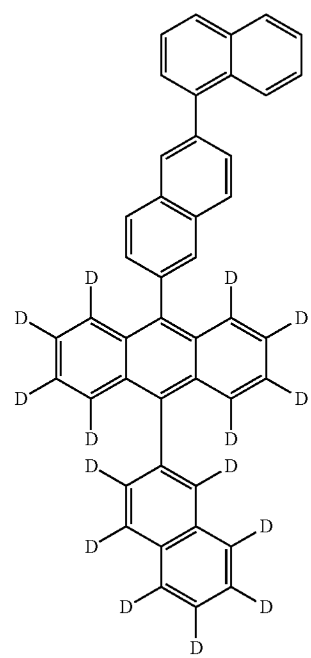

-continued
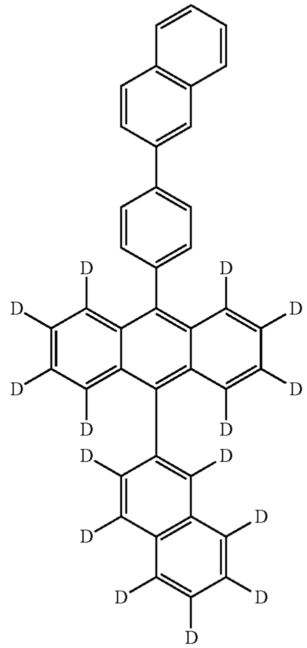
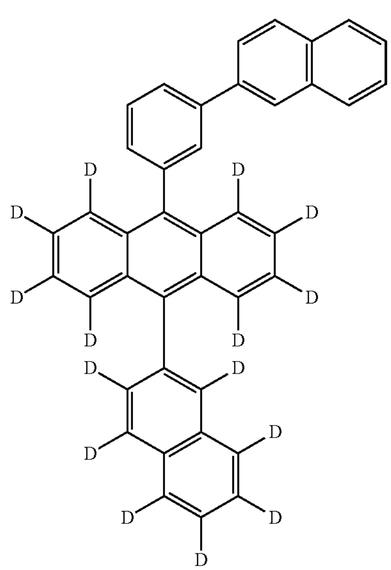
-continued
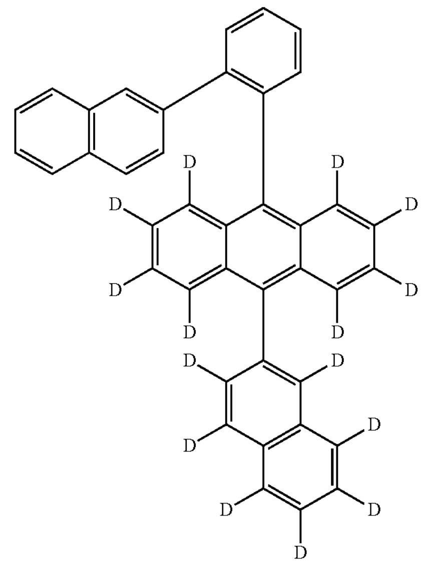
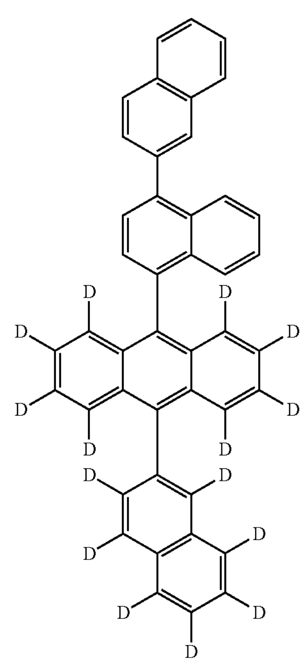

-continued
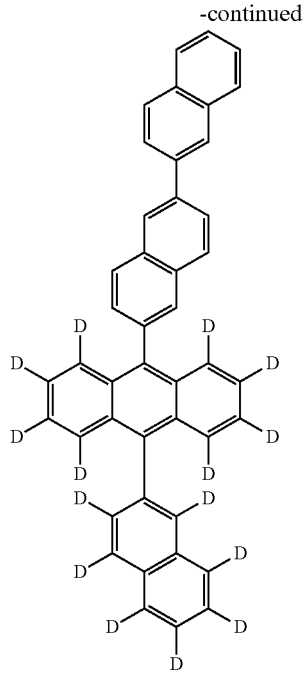
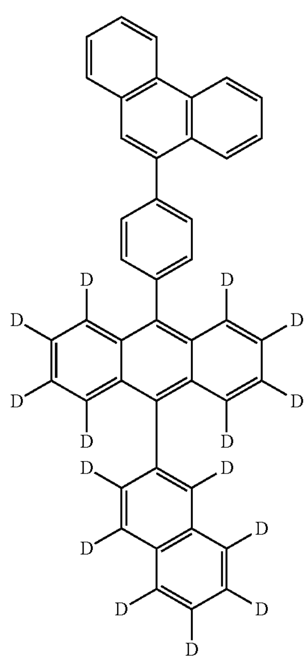
-continued
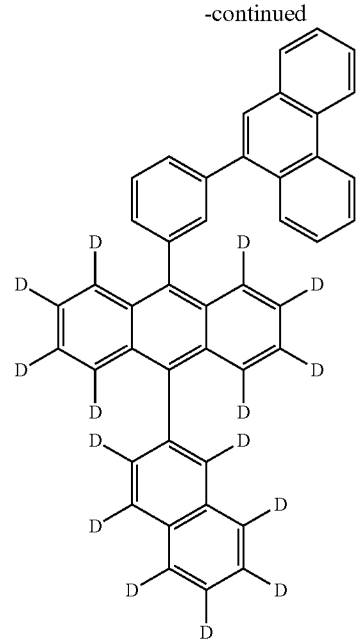
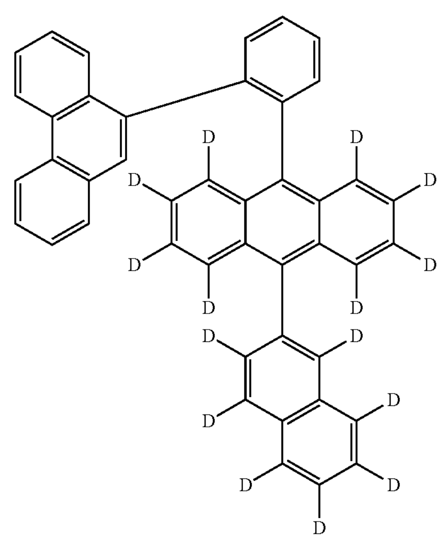

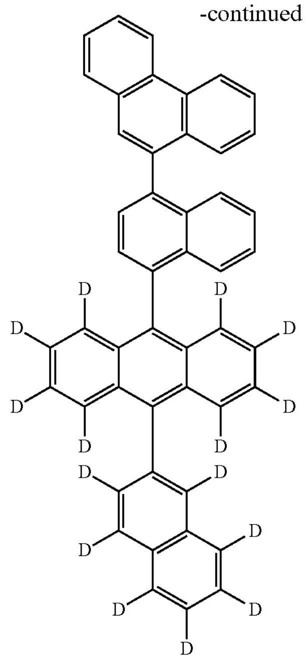
D
D
D
D
D
D
D
D
D
D
D
D
D
D
D
D
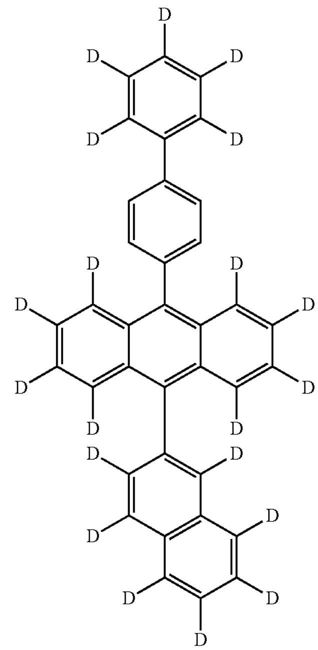
D
D
D
D
D
D
D
D
D
D
D
D
D
D
D
D
D
D
D
D
D
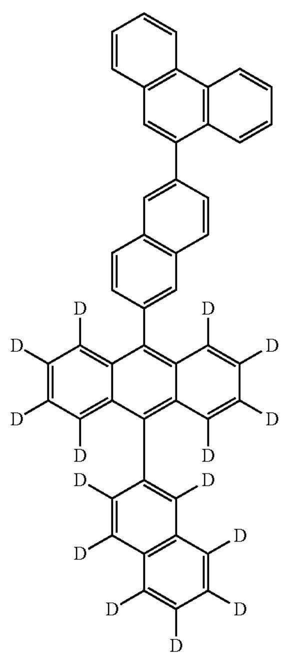
D
D
D
D
D
D
D
D
D
D
D
D
D
D
D
D
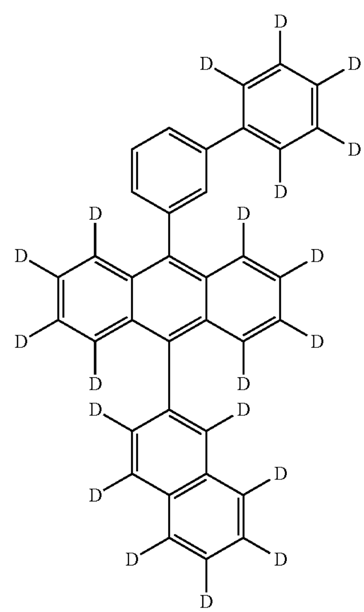
D
D
D
D
D
D
D
D
D
D
D
D
D
D
D
D
D
D
D
D
D -continued
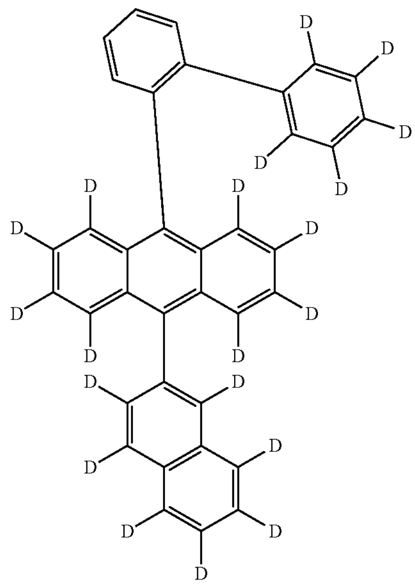
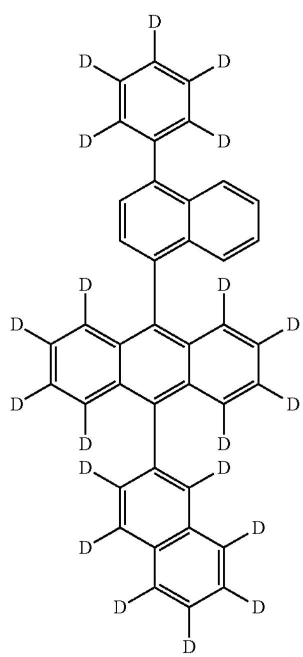
-continued
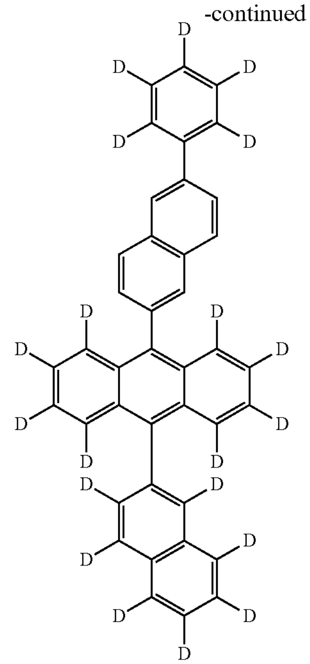
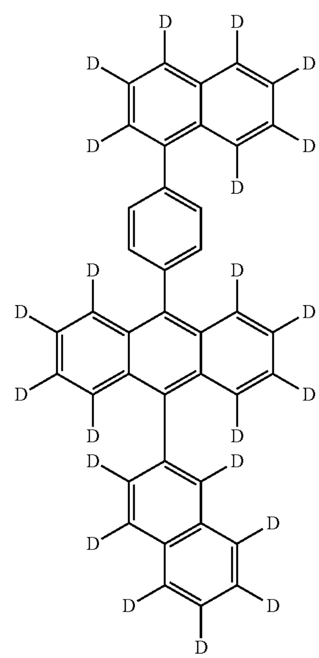

-continued
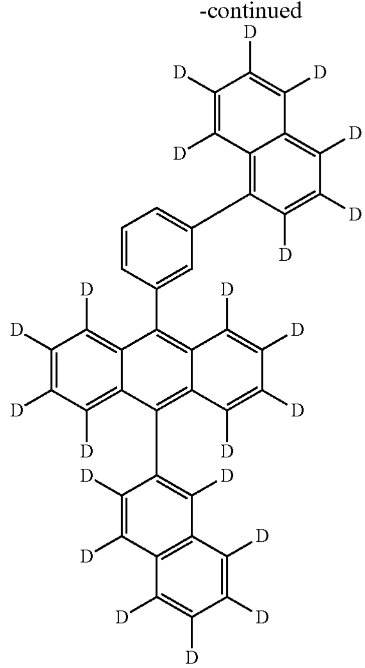
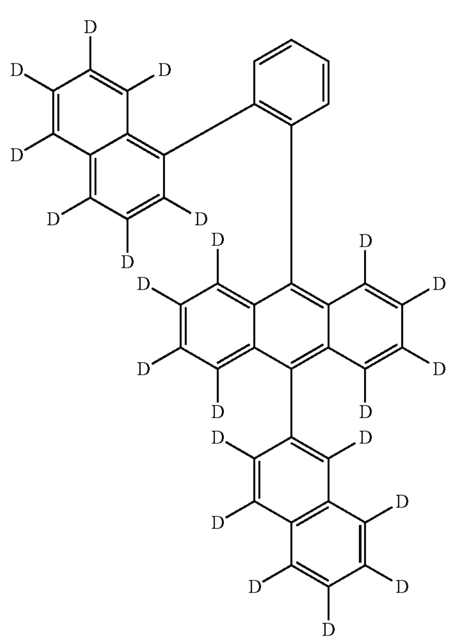
-continued
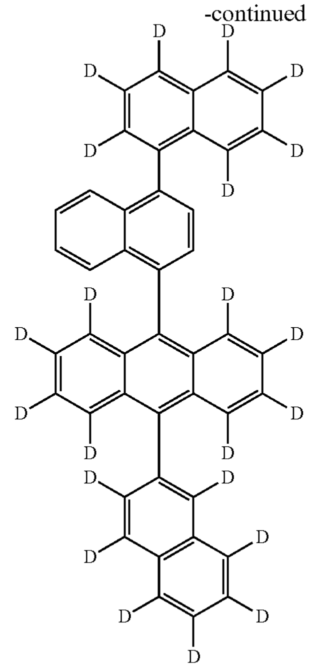
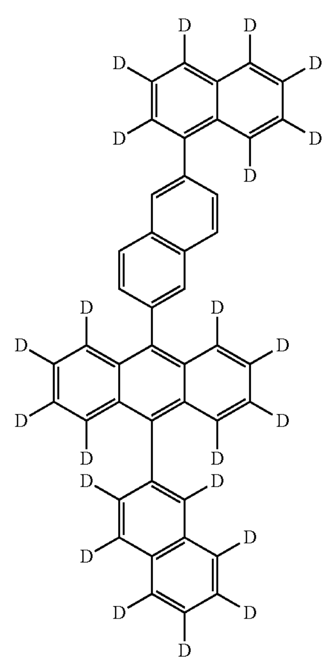

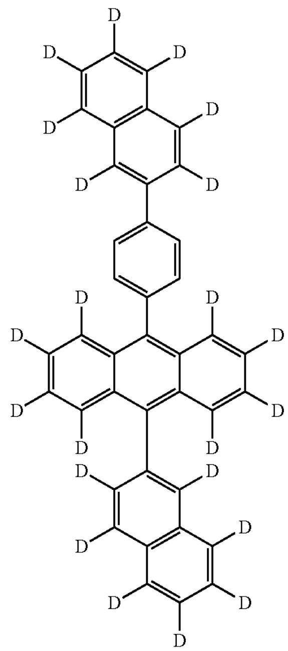
D
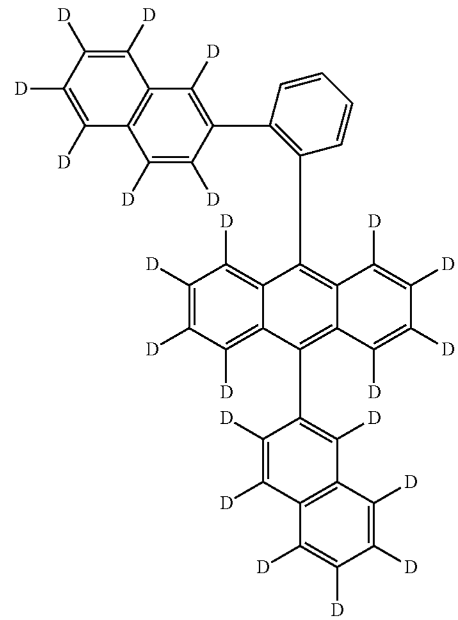
D
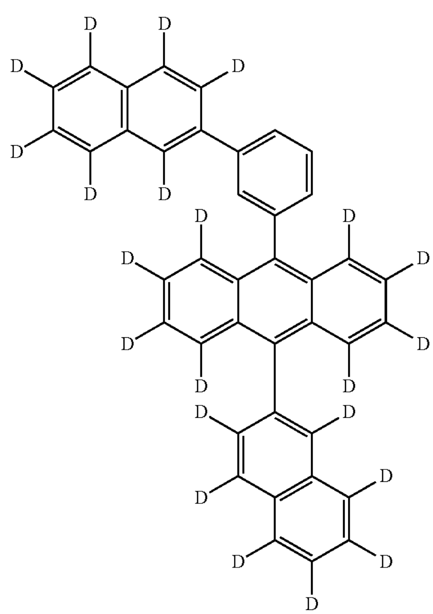
D
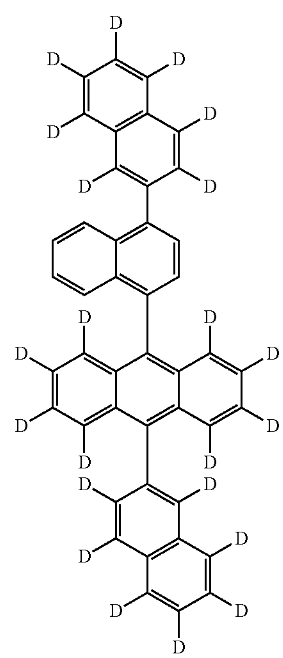
D

-continued
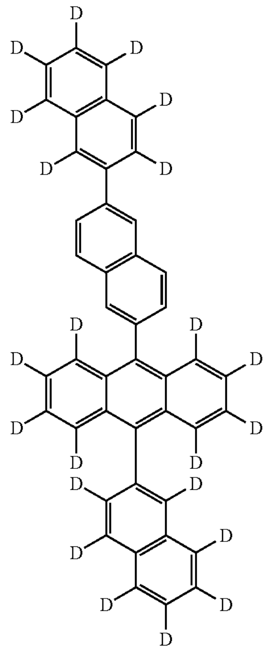
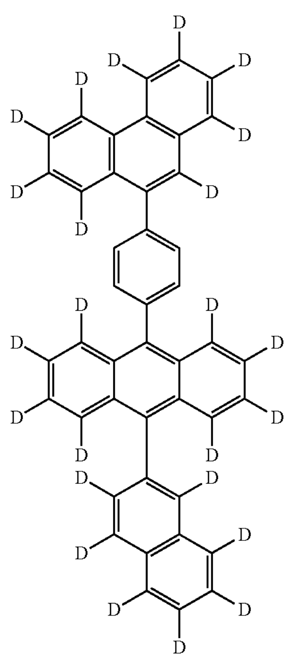
-continued
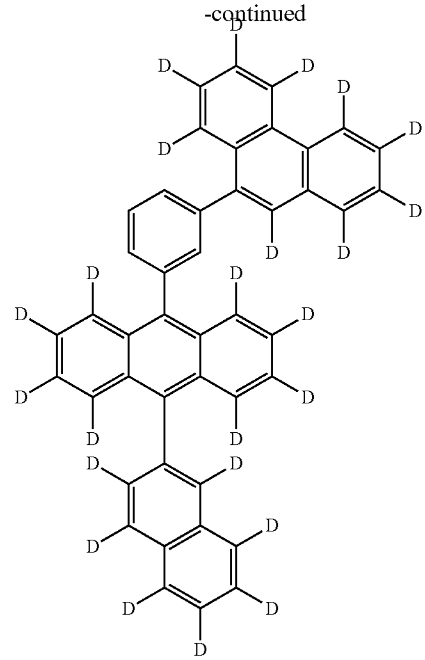
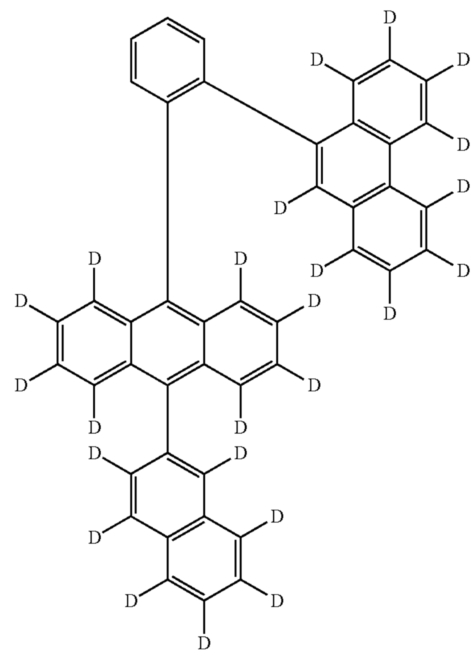

-continued
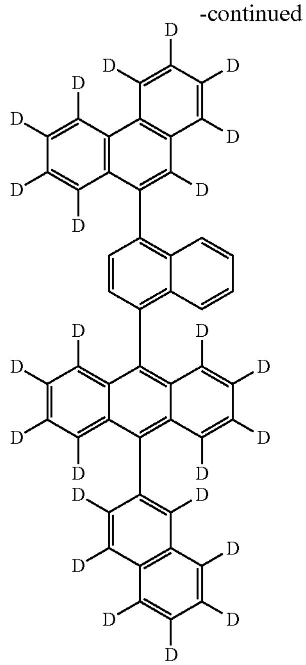
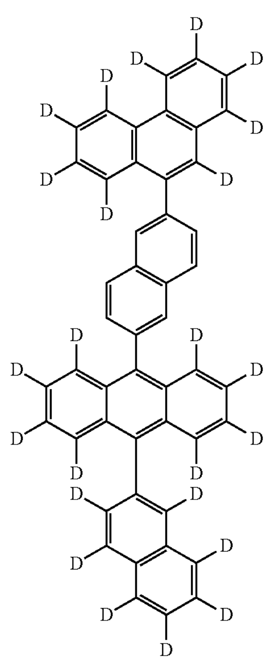
-continued
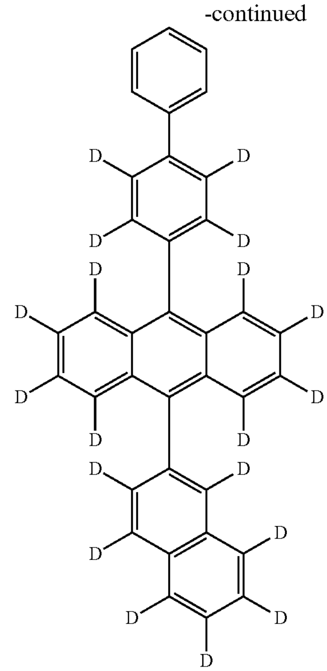
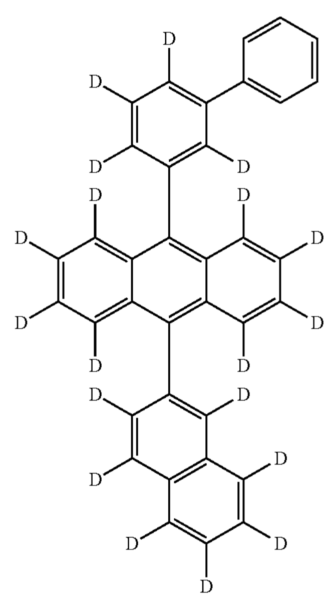

-continued
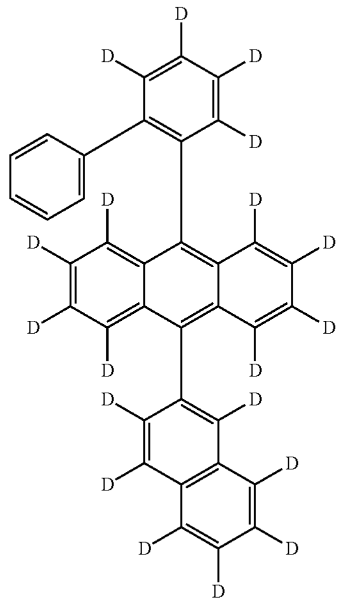
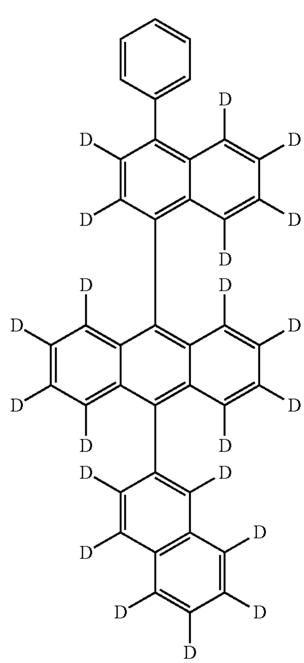
-continued
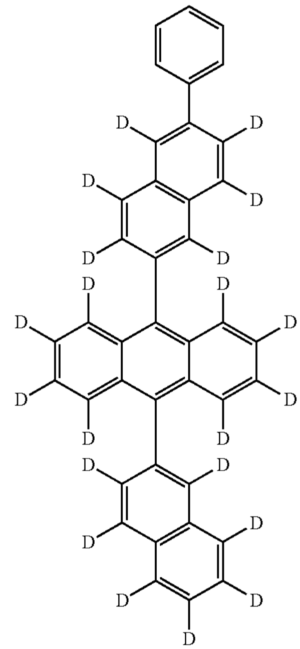
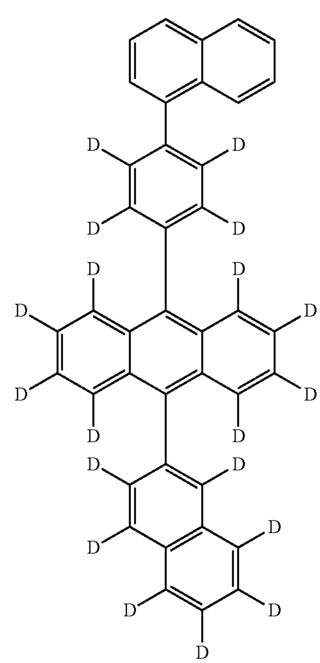

-continued
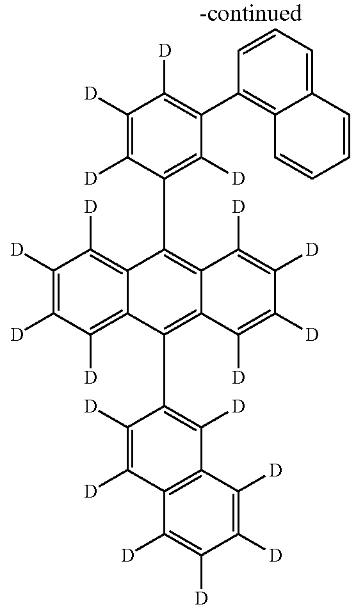
-continued
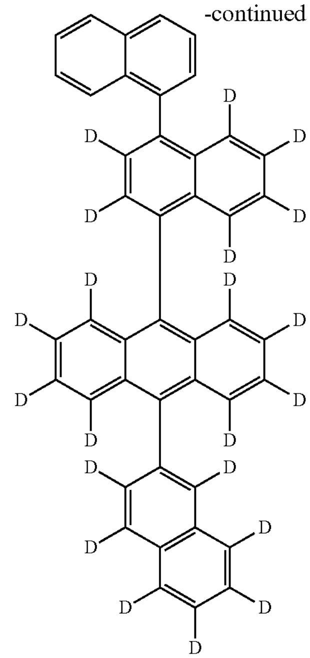
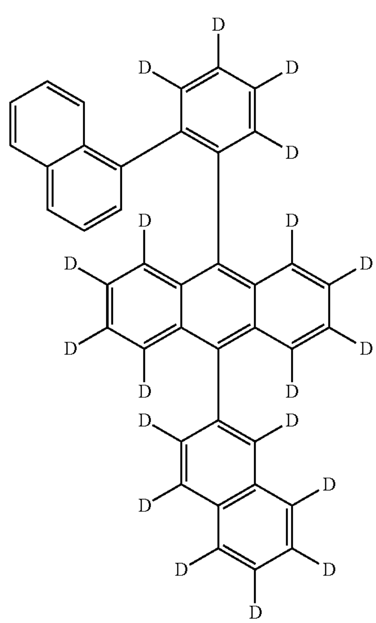
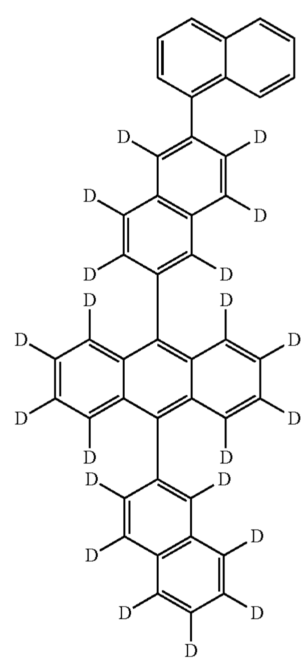

-continued
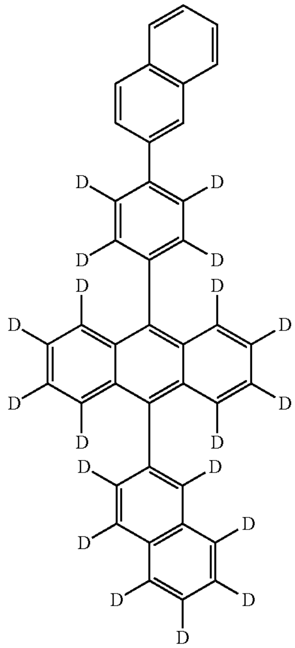
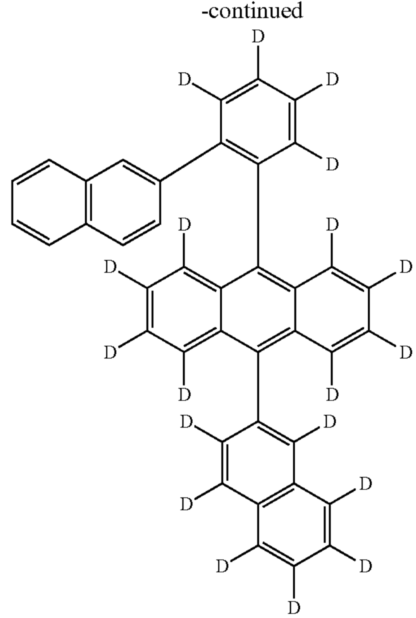
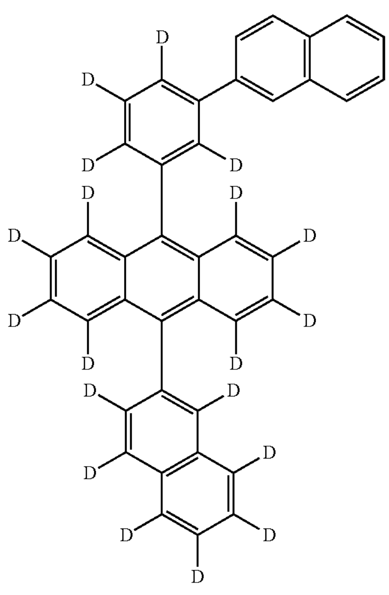
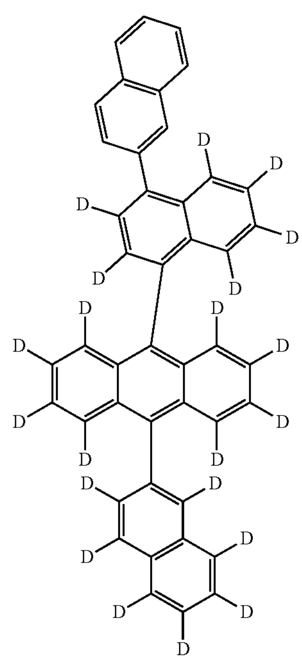

-continued
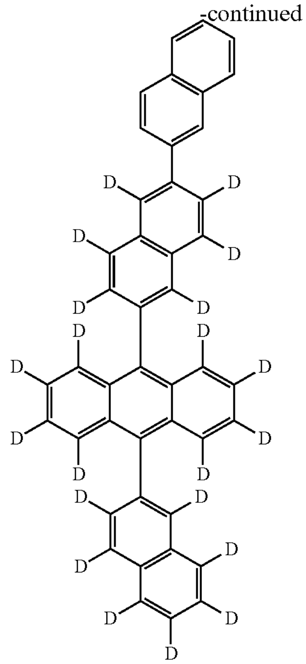
-continued
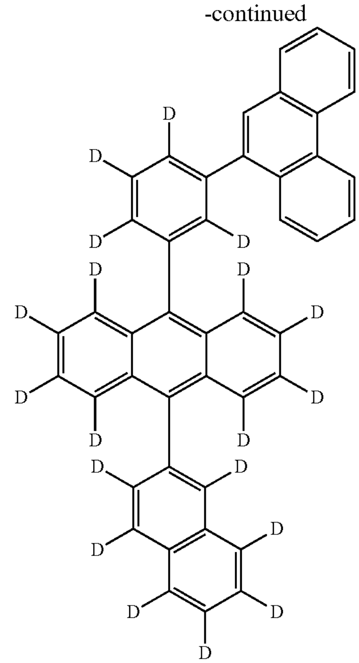
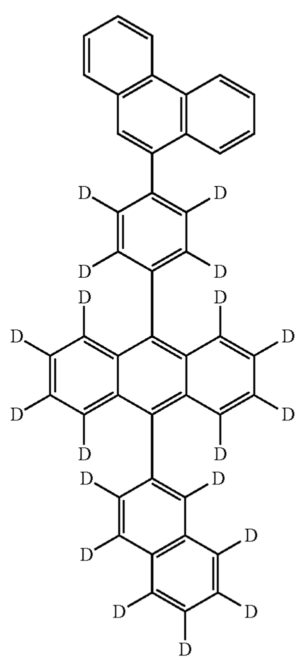
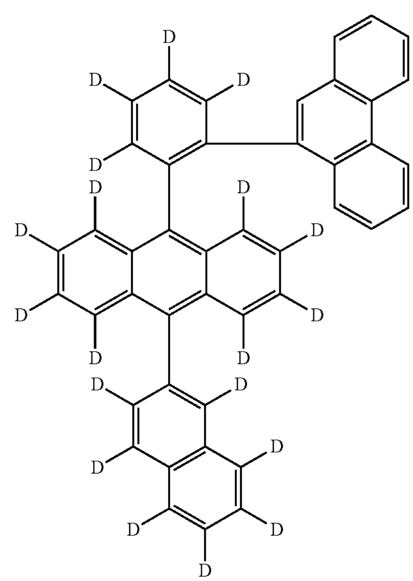

-continued
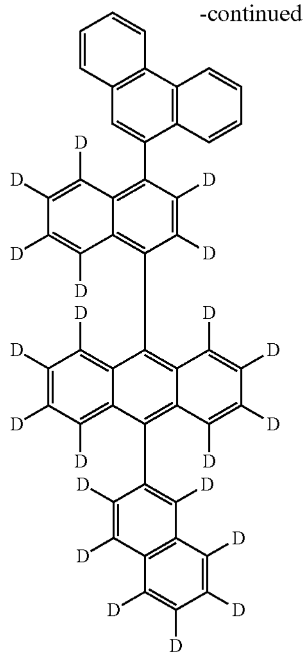
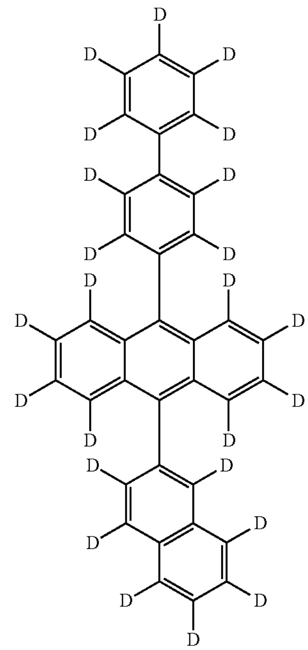
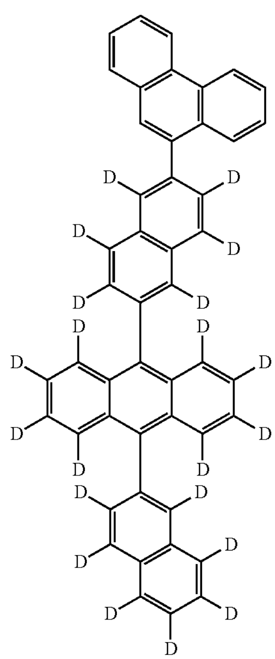
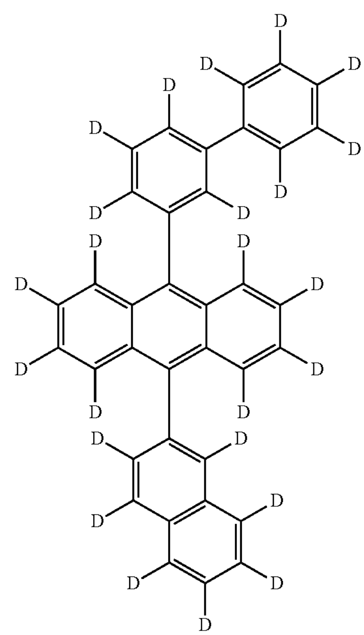

-continued
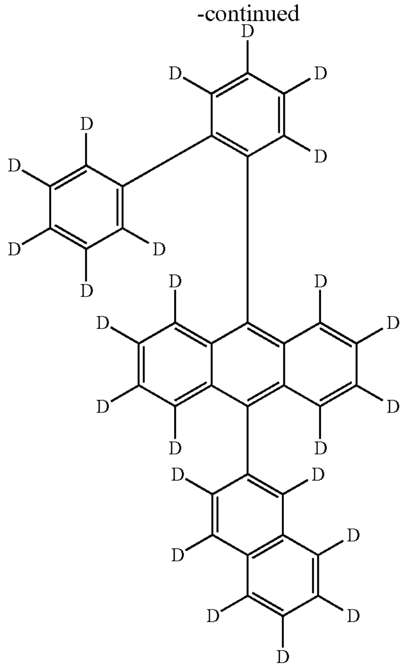
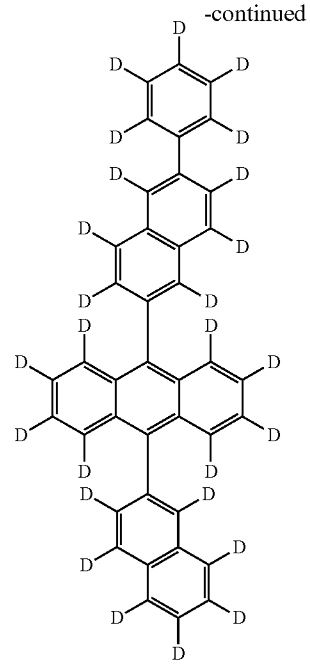
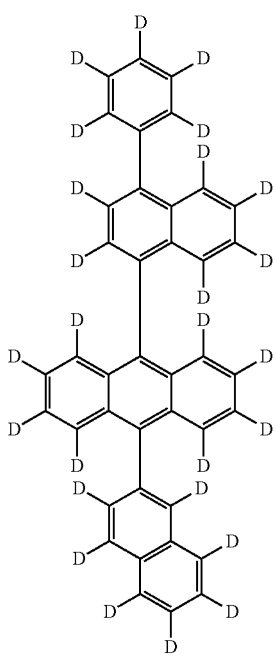
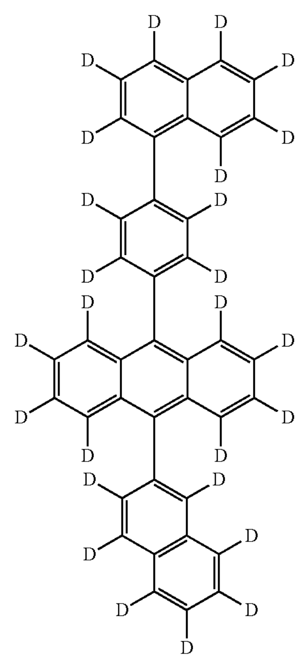

-continued
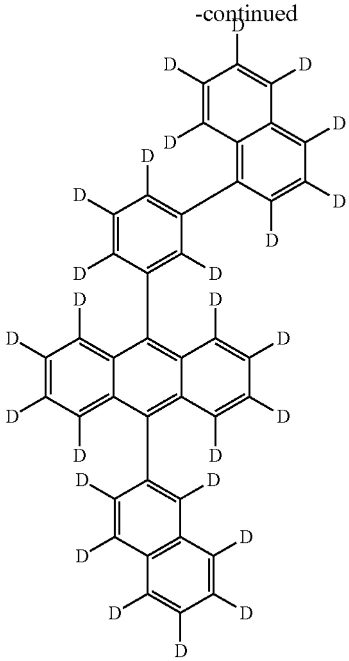
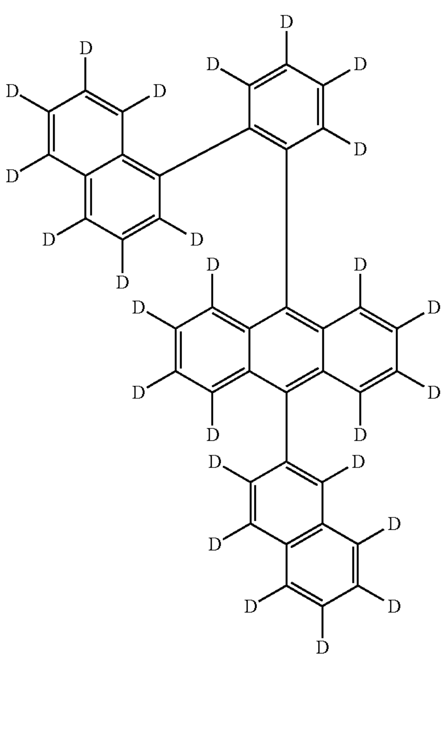
-continued
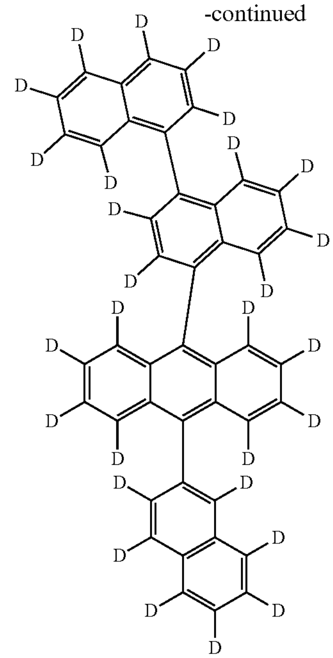
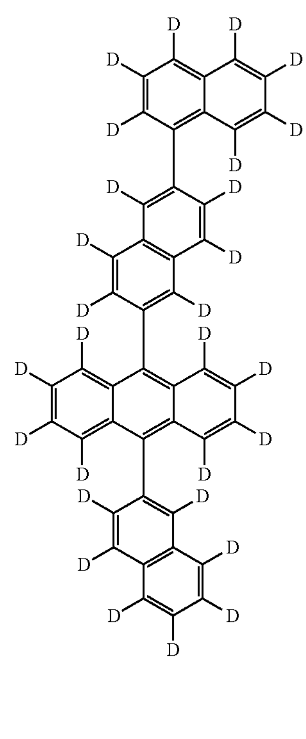

-continued
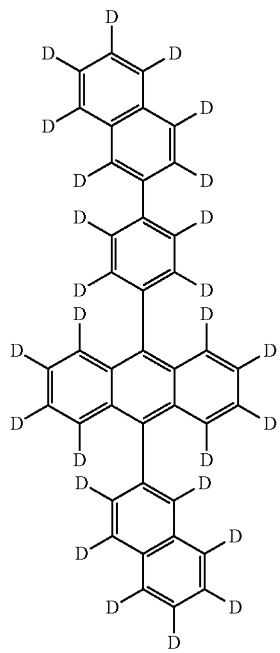
-continued
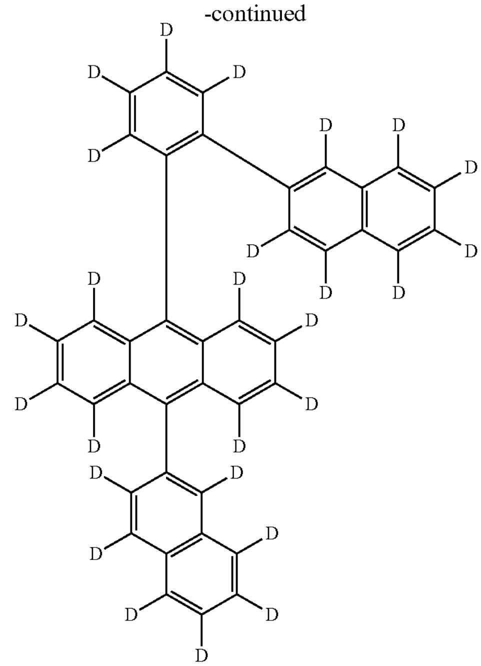
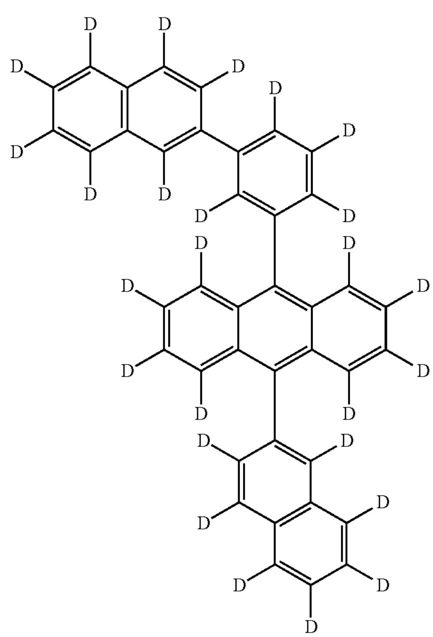
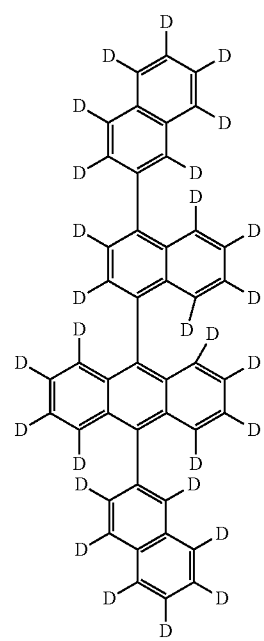
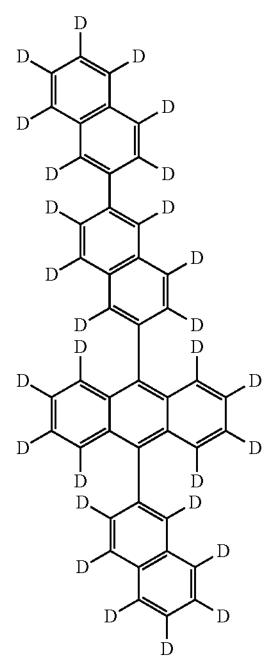

-continued
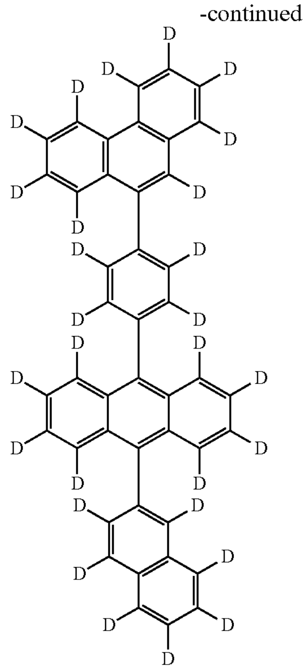
-continued
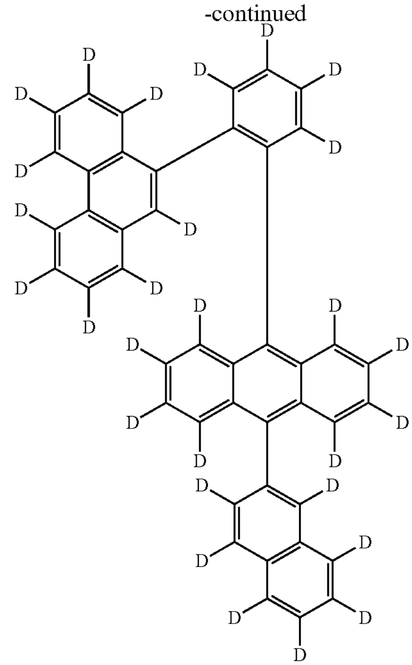
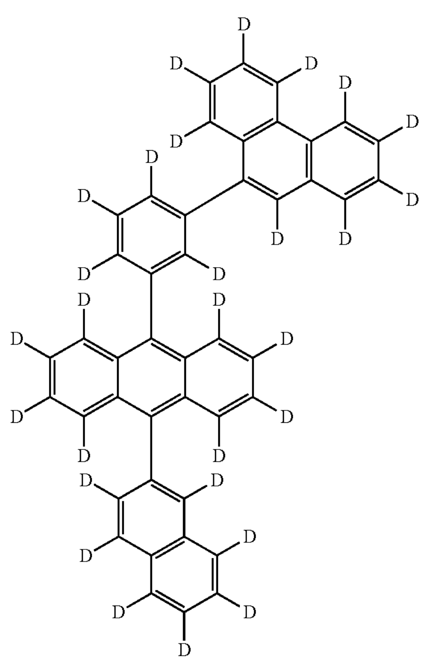
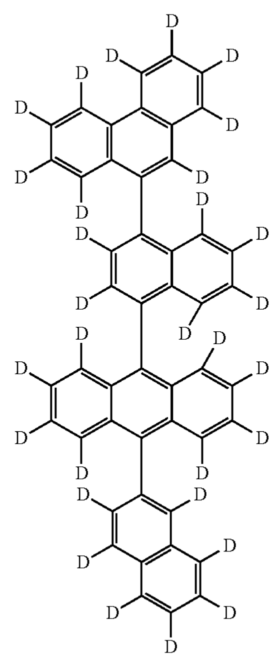

-continued
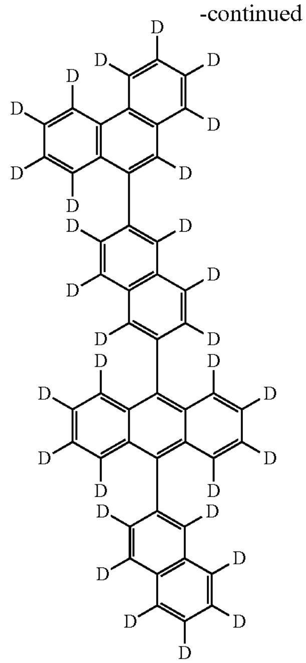
-continued
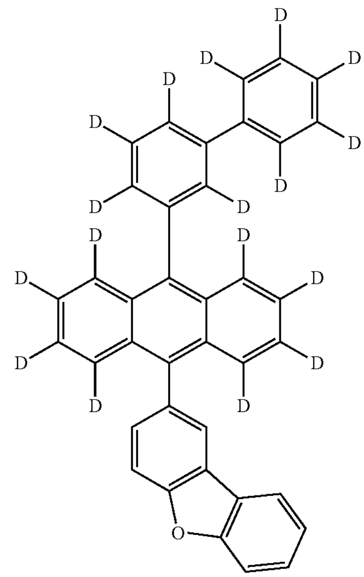
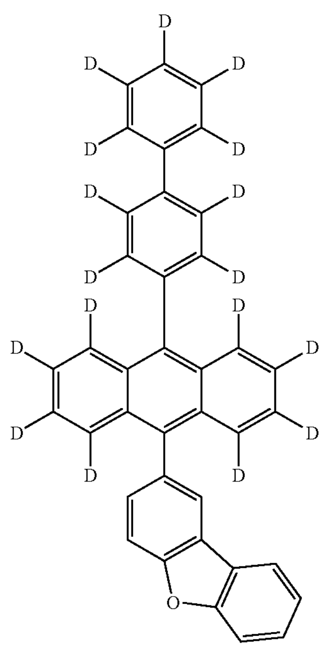
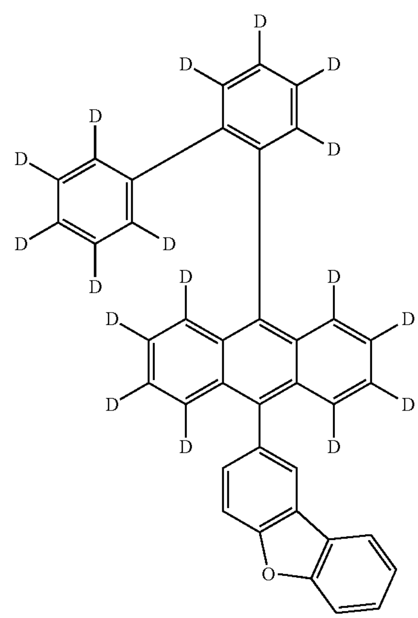

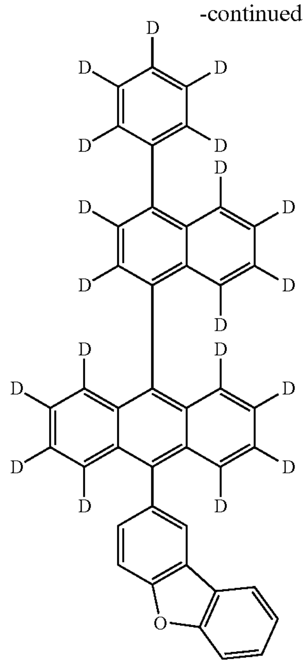
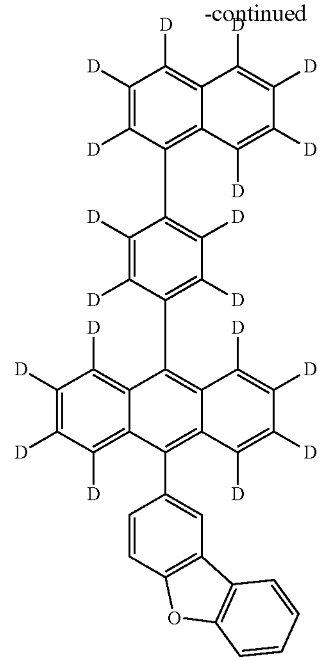
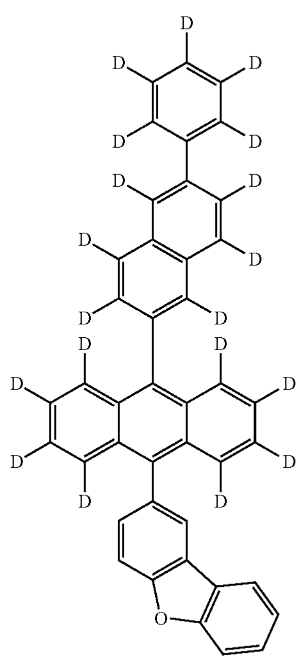
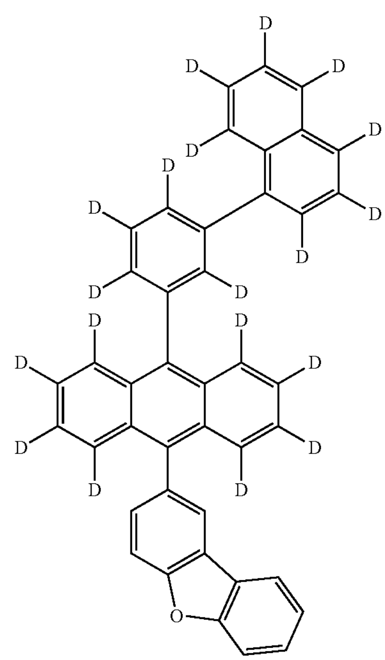

-continued
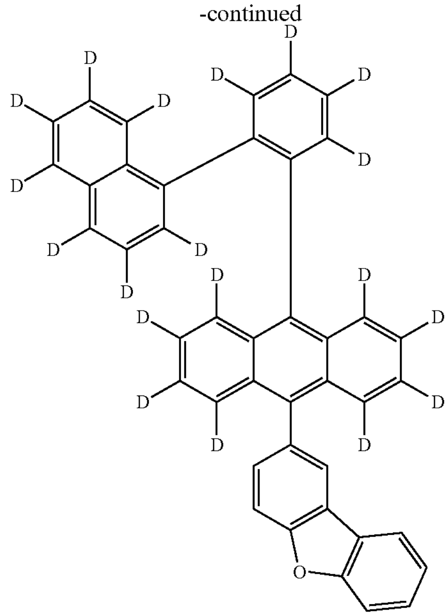
-continued
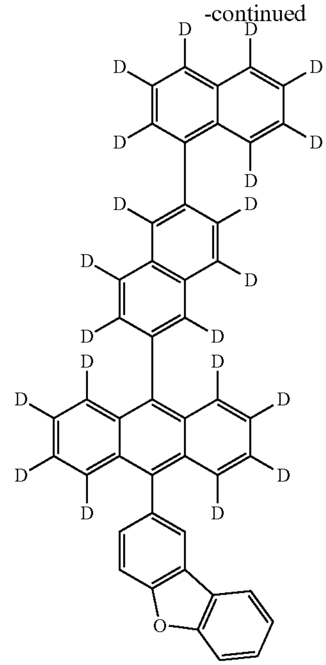
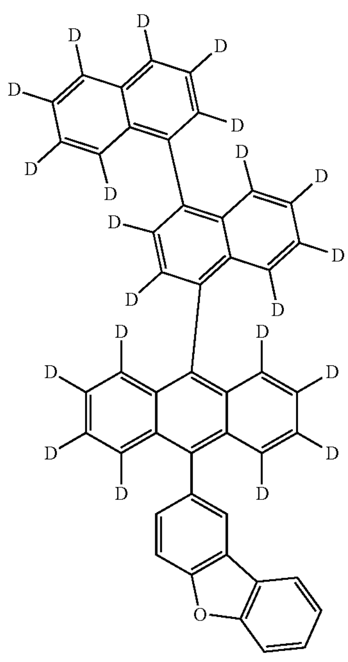
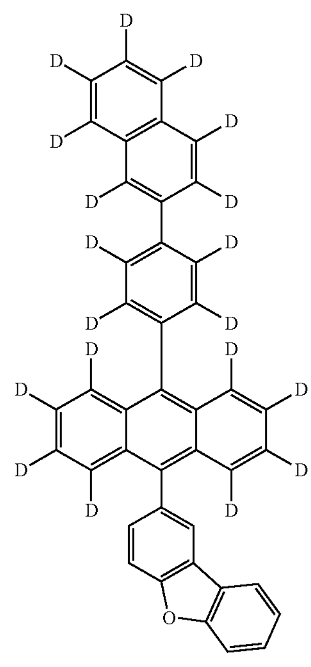

-continued
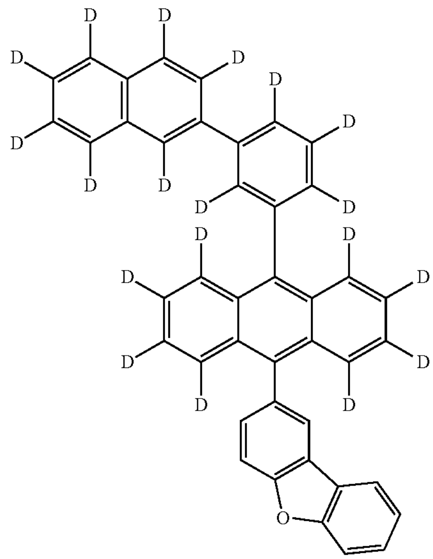
-continued
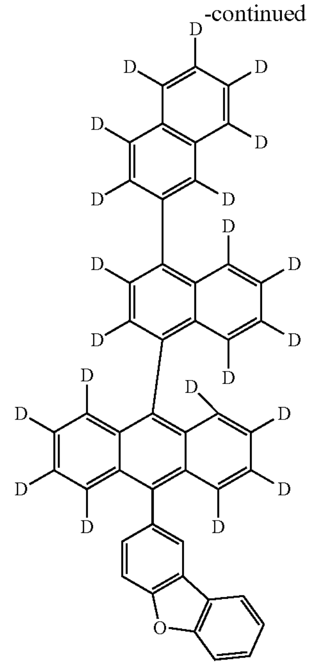
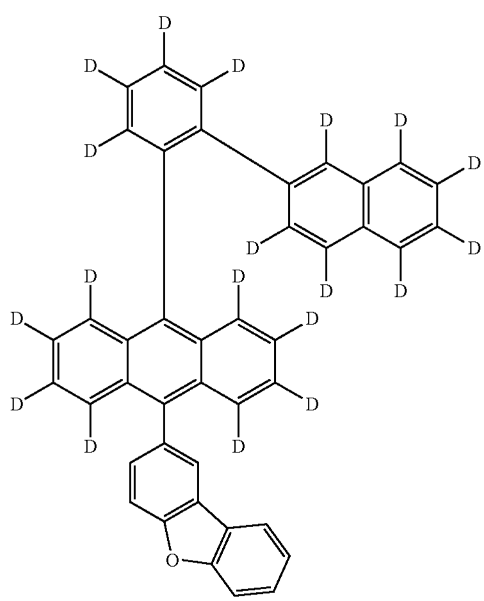
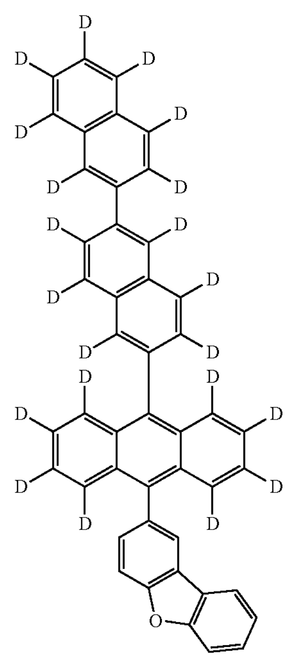

-continued
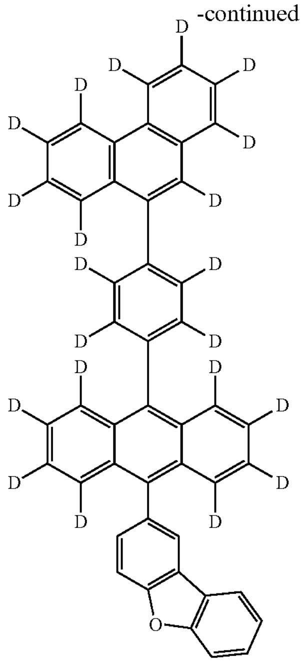
-continued
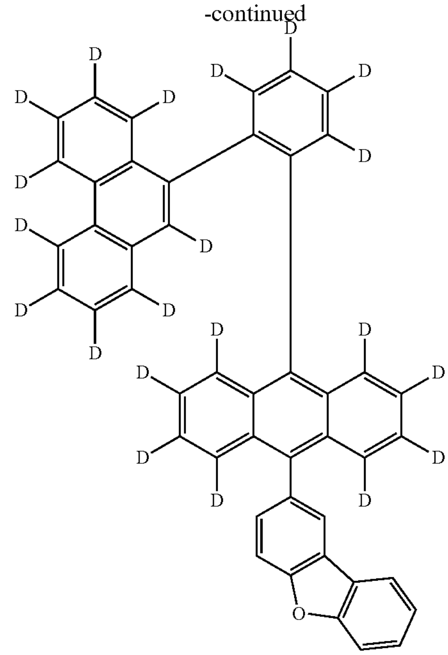
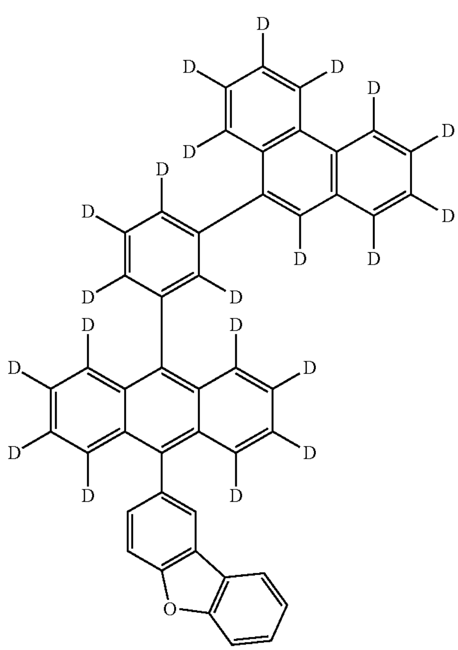
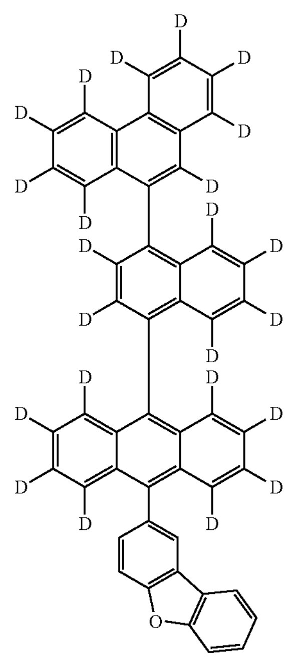

-continued
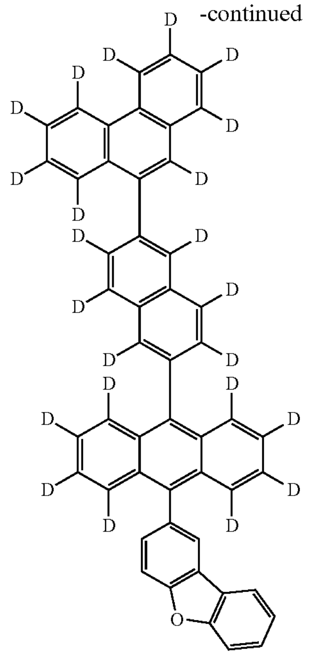
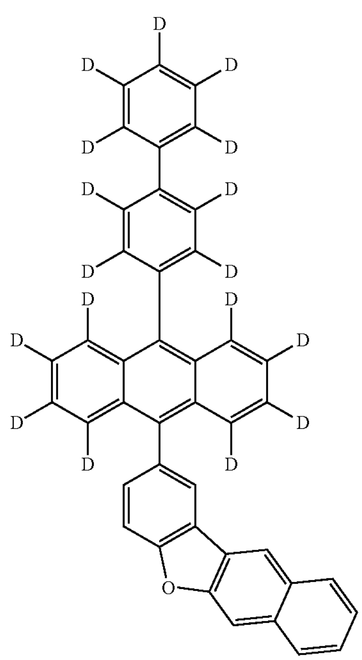
-continued
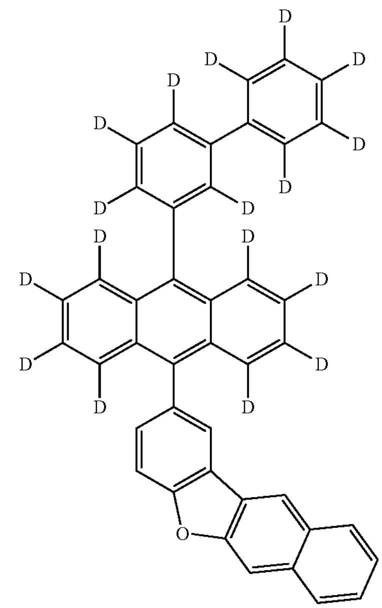
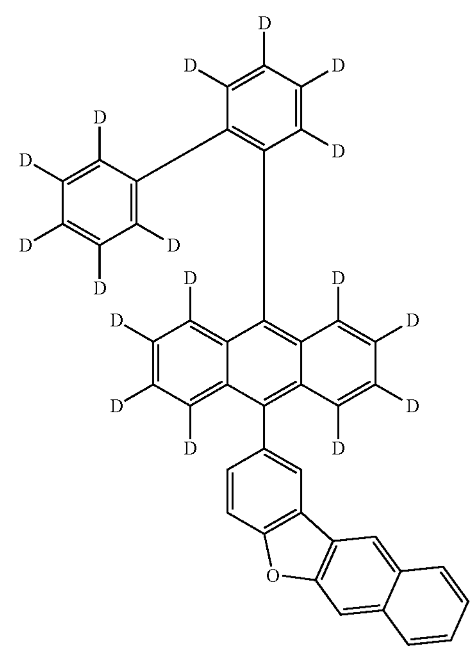

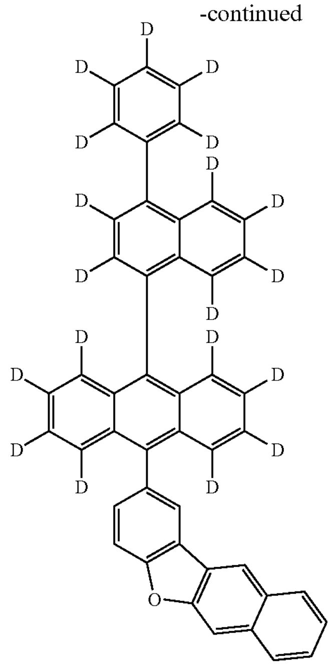
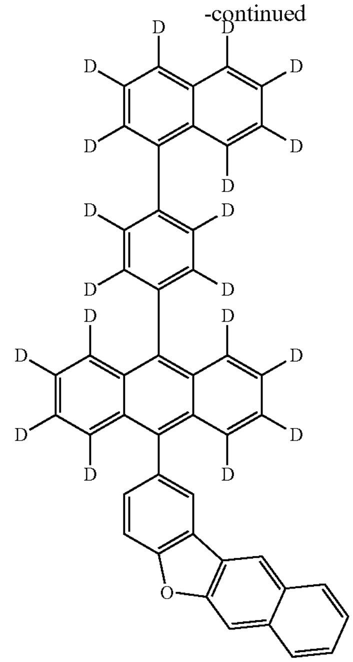
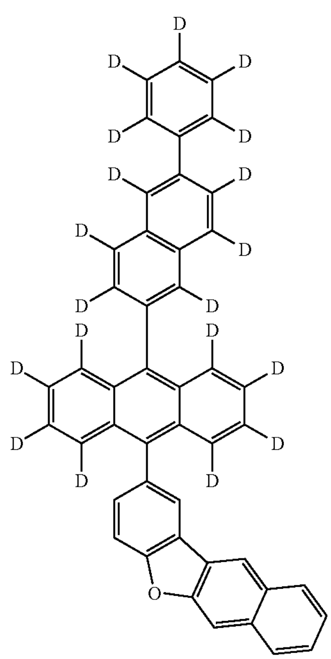
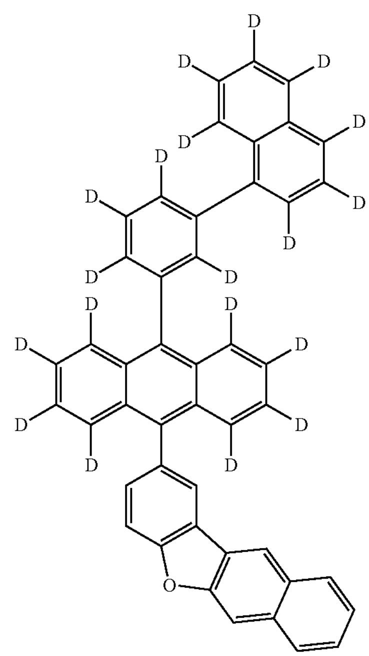

-continued
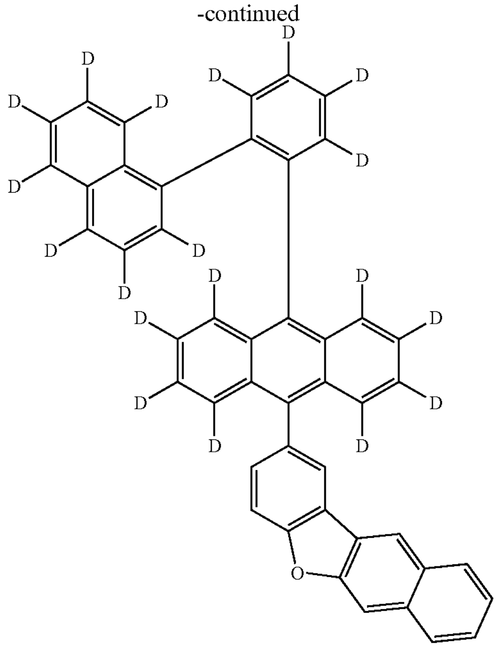
-continued
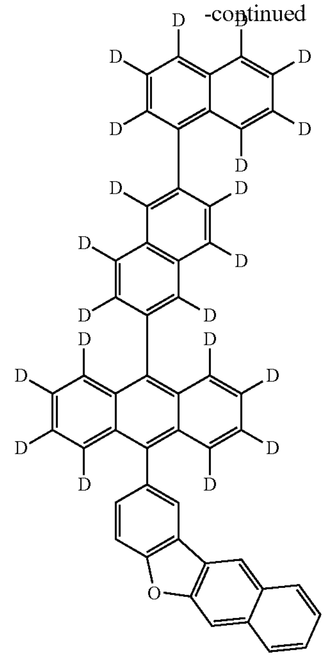
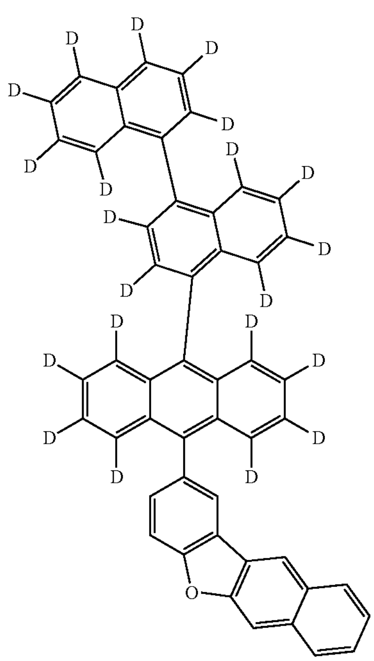
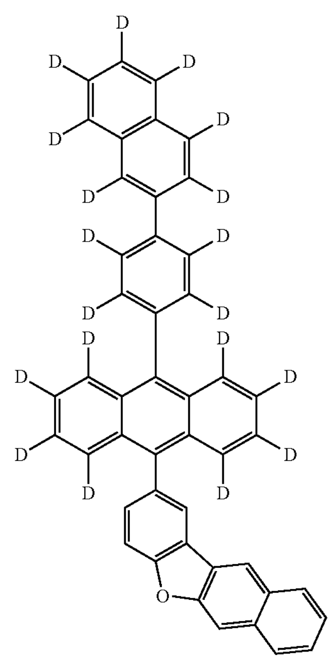

-continued
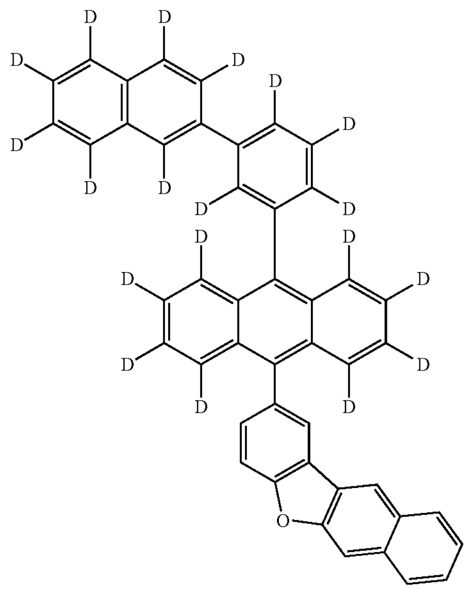
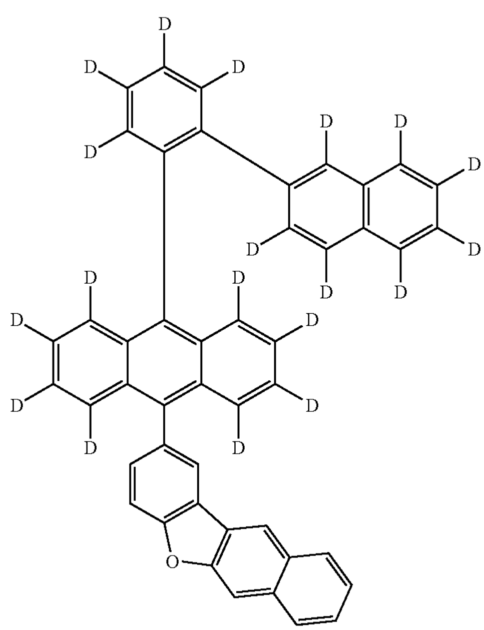
-continued
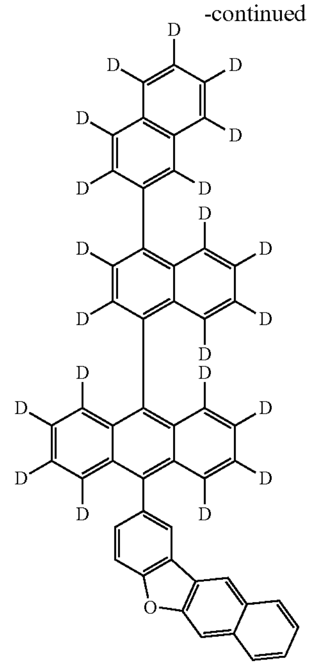
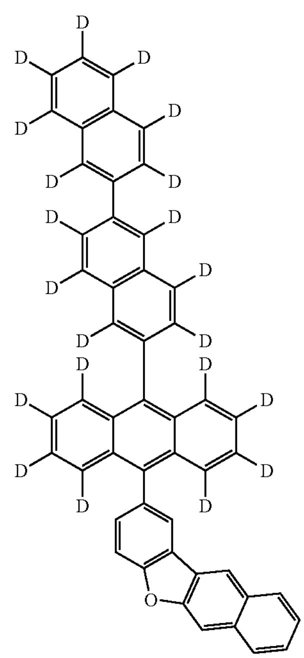

-continued
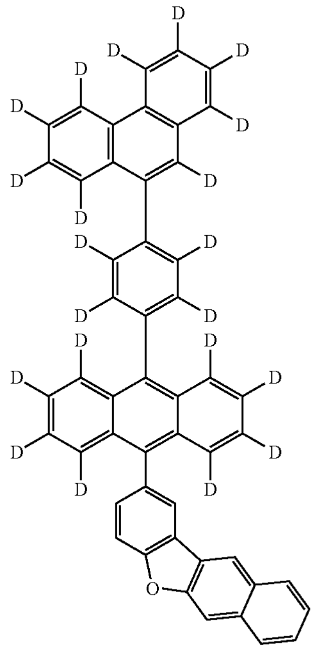
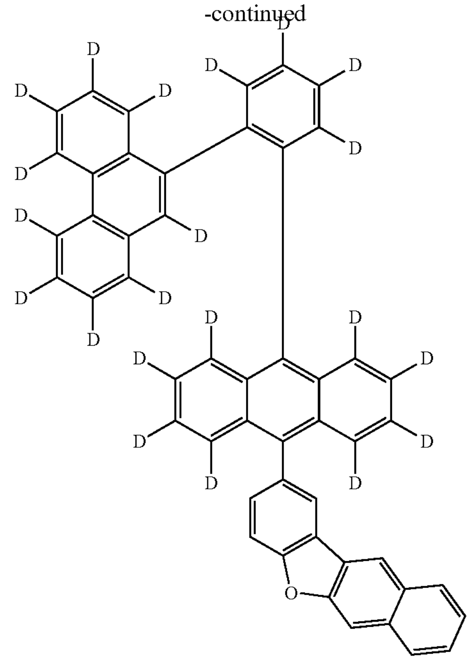
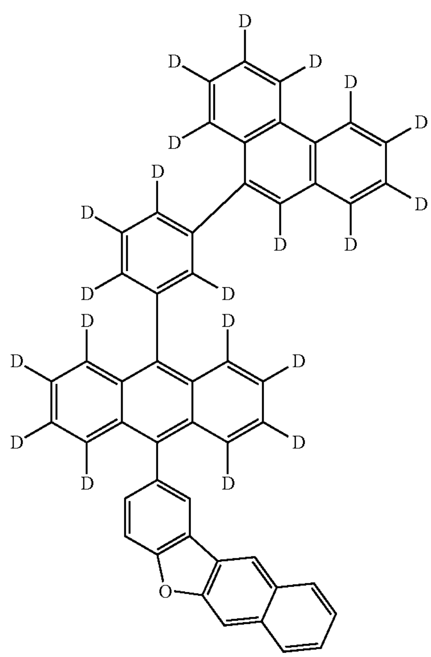
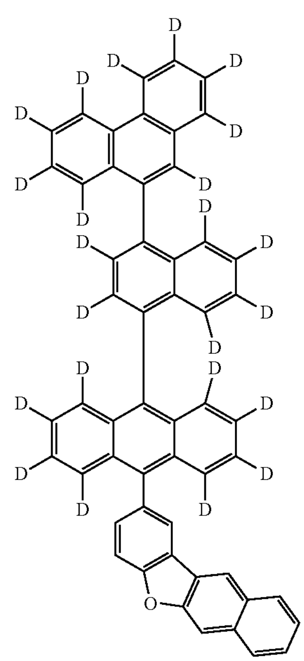

-continued
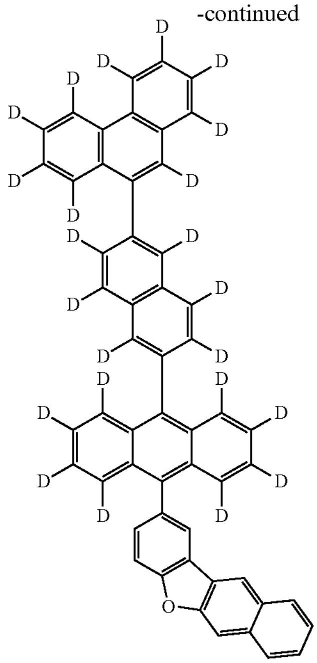
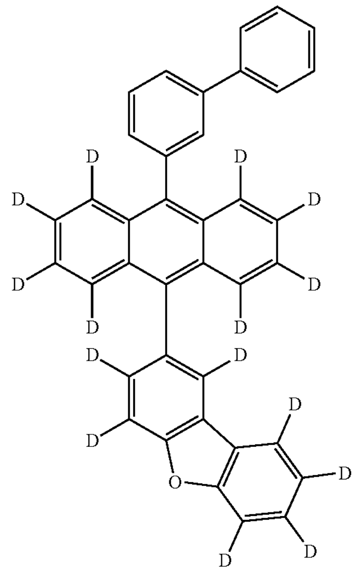
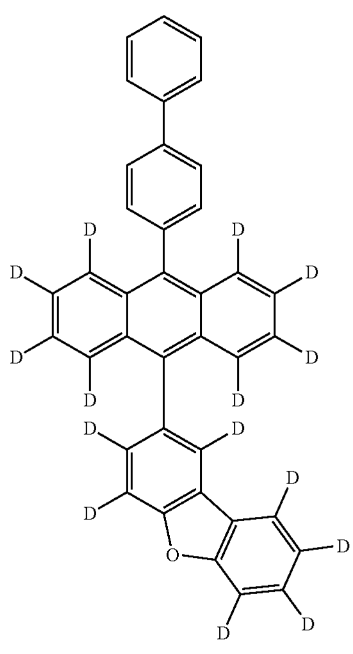
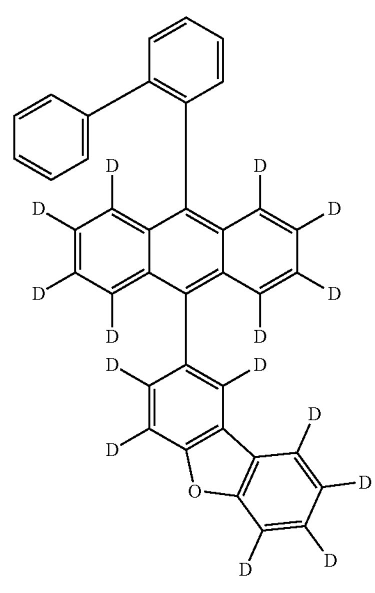

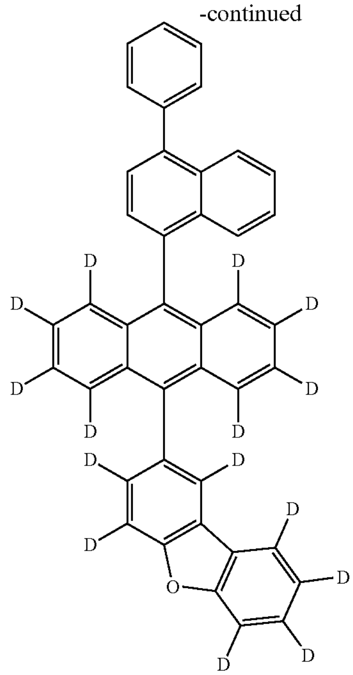
D
D
D
D
D
D
D
D
D
D
D
D
D
D
O
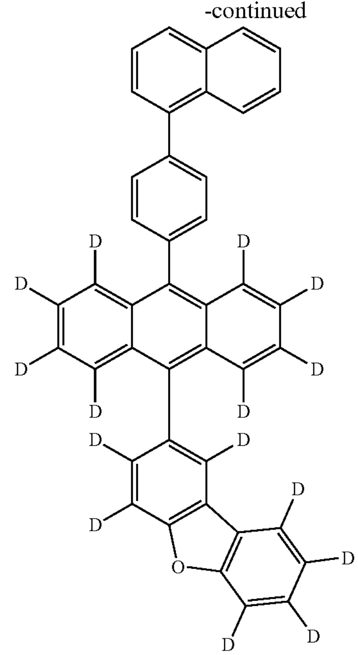
D
D
D
D
D
D
D
D
D
D
D
D
D
D
O
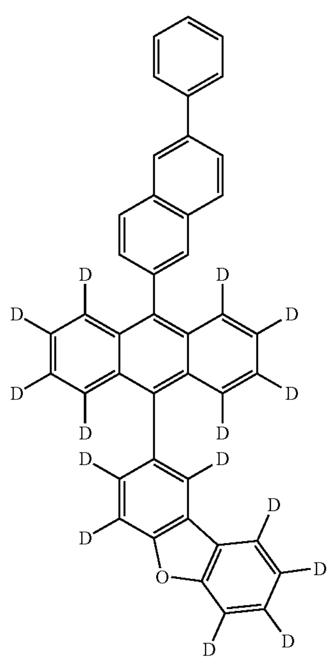
D
D
D
D
D
D
D
D
D
D
D
D
D
D
O
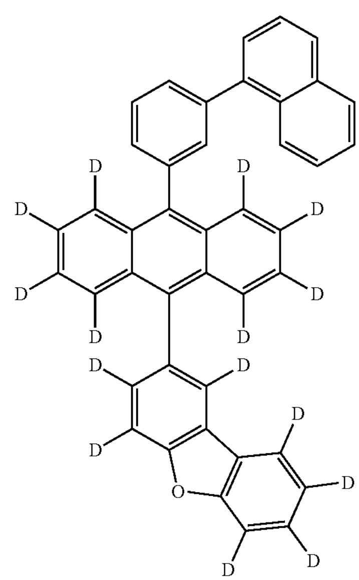
D
D
D
D
D
D
D
D
D
D
D
D
D
D
O -continued
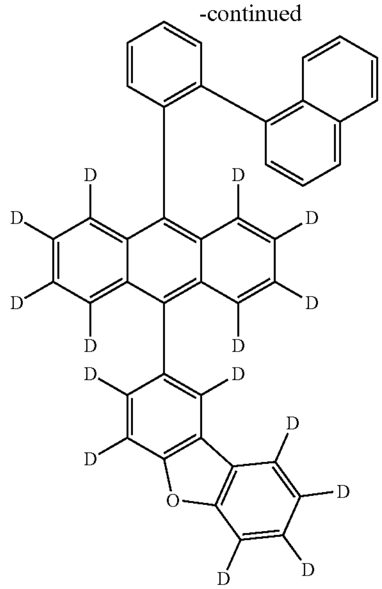
-continued
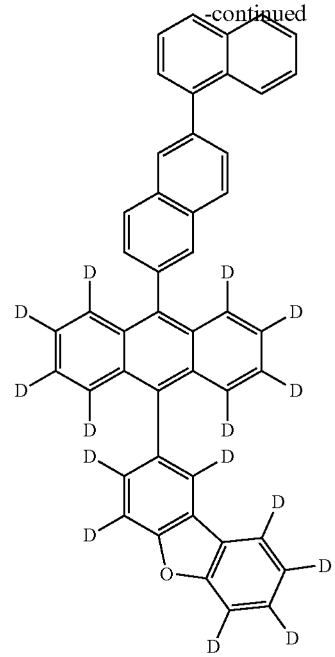
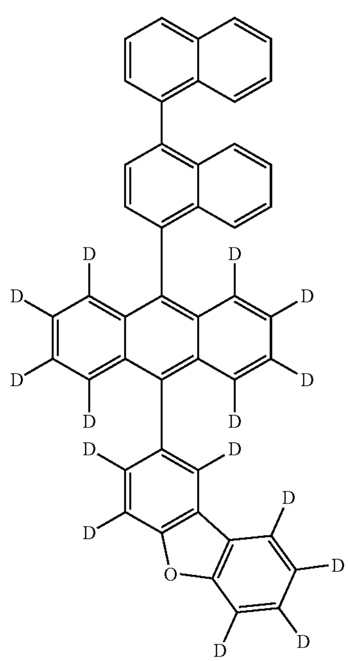
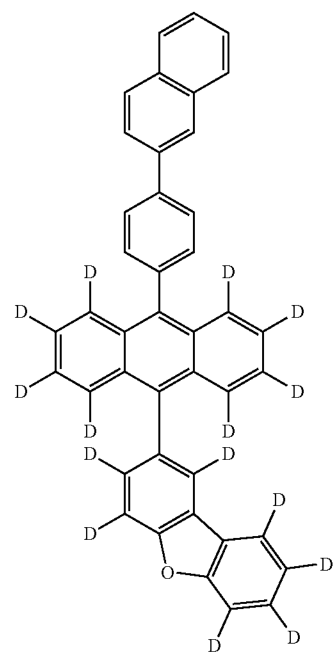

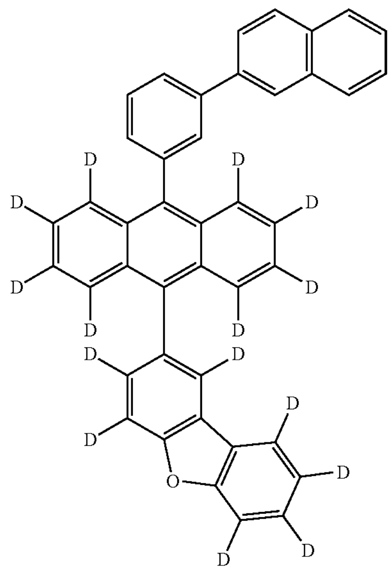
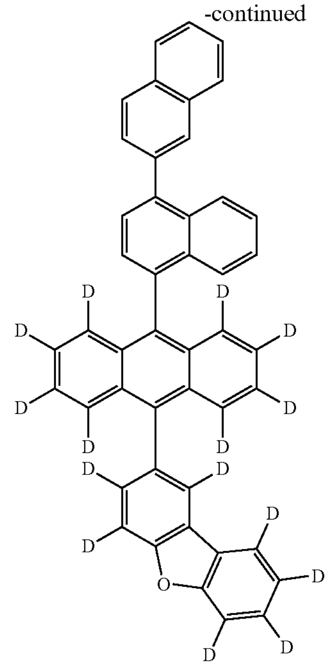
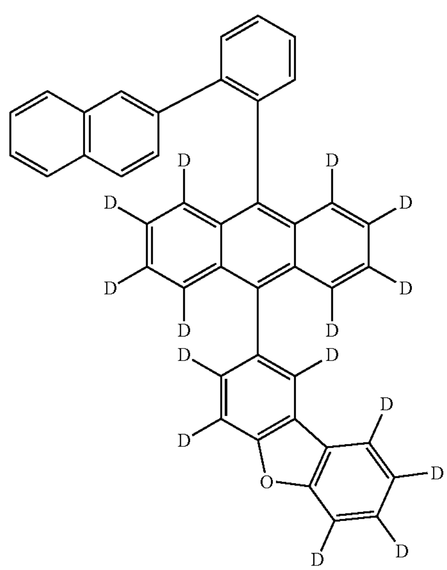
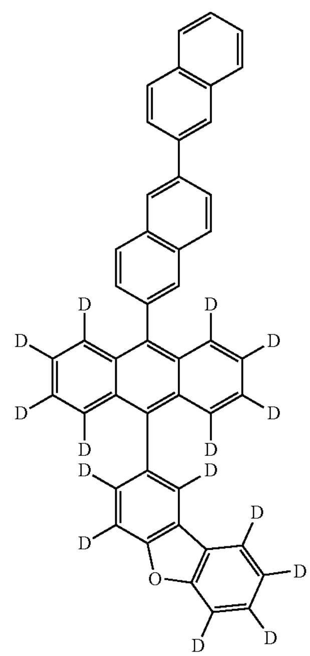

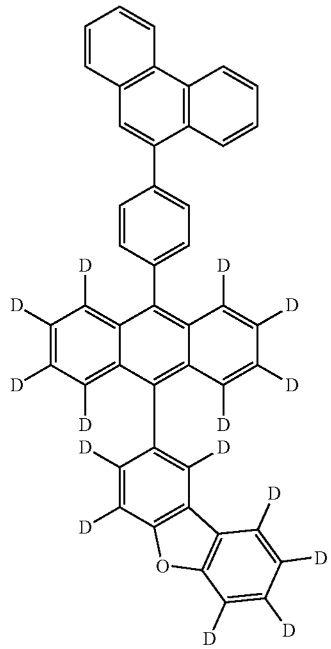
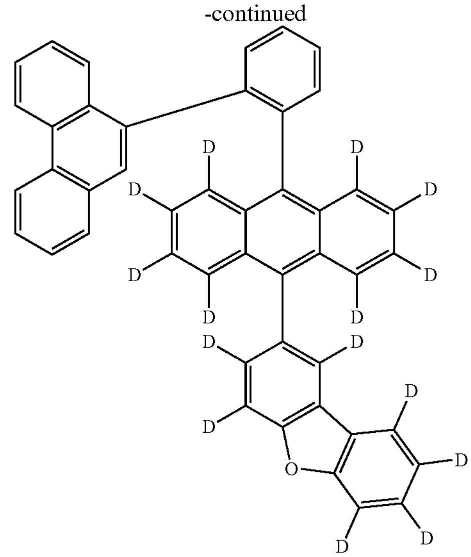
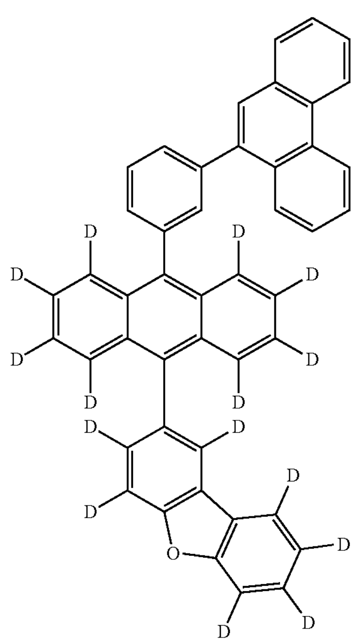
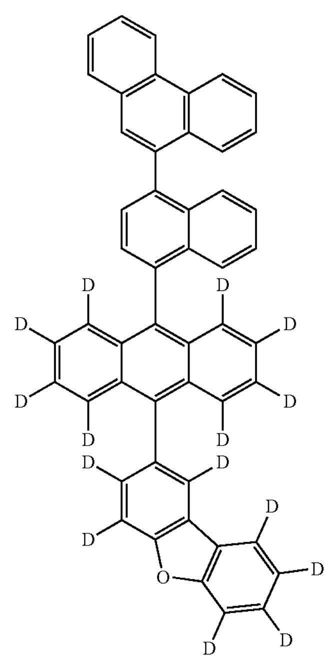

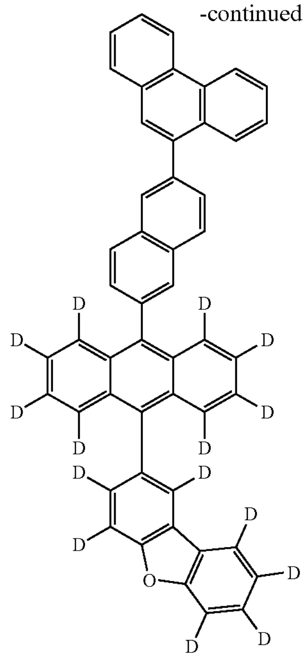
D
O
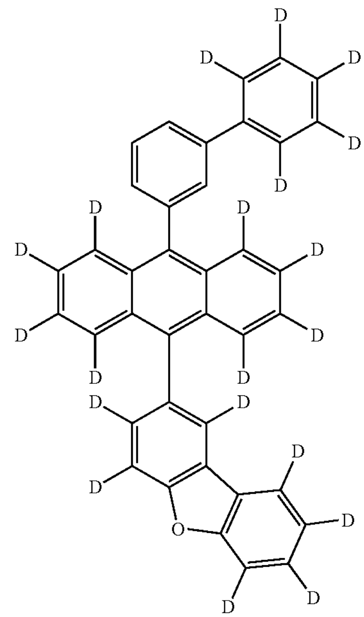
D
O
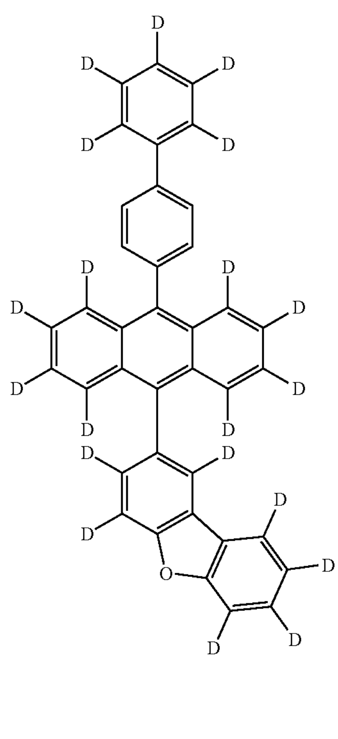
D
O
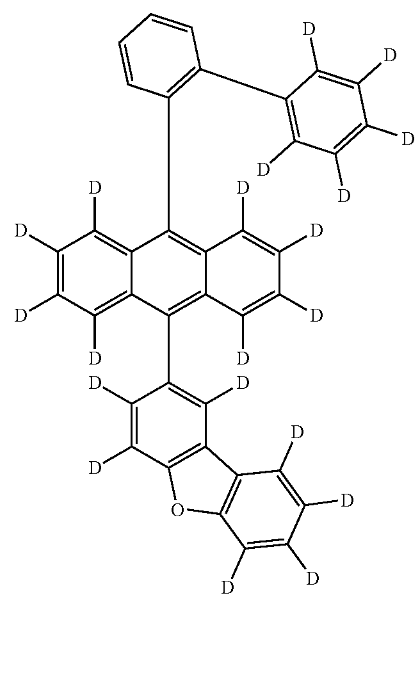
D
O

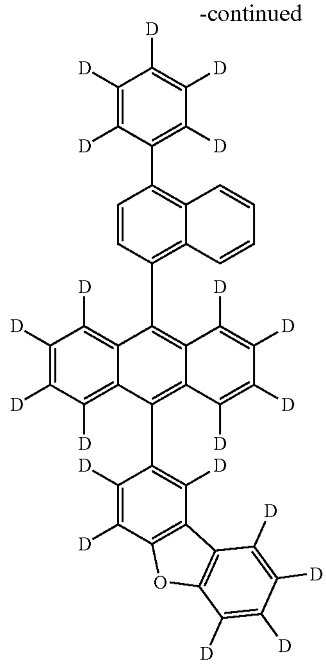
D
O
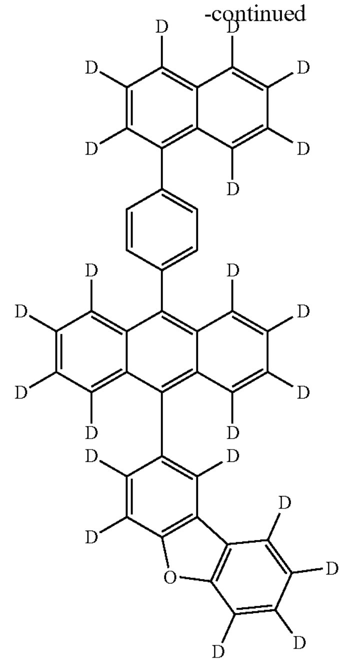
D
O
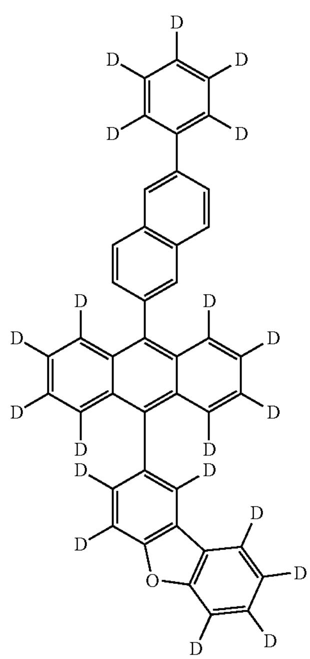
D
O
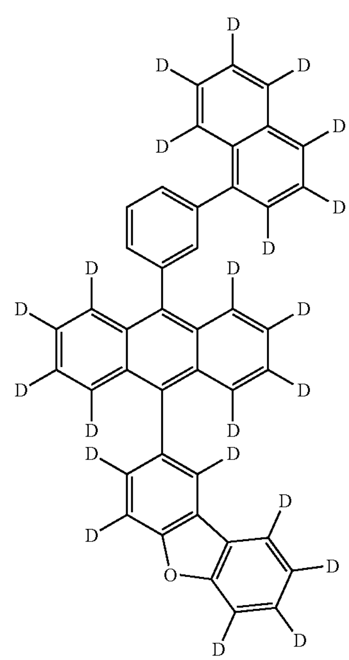
D
O

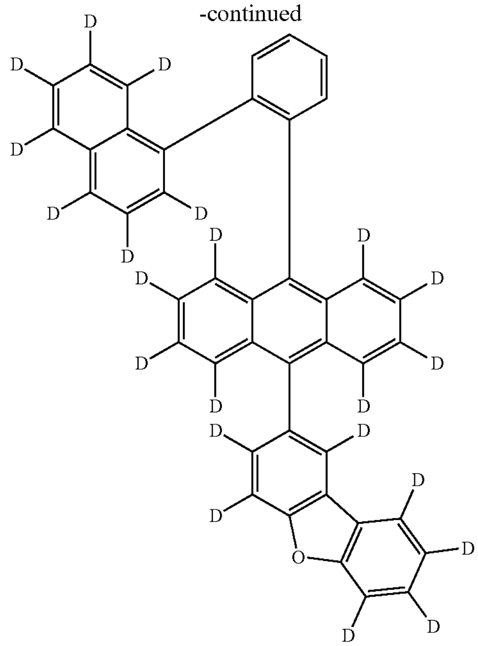
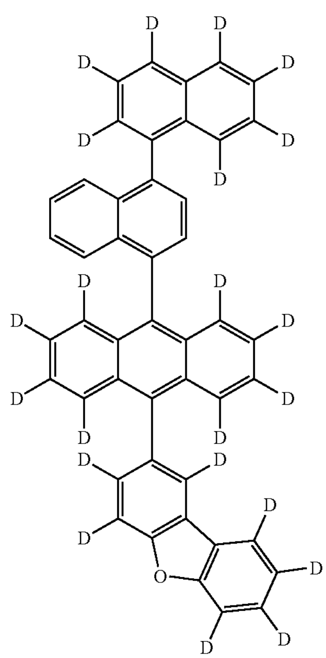
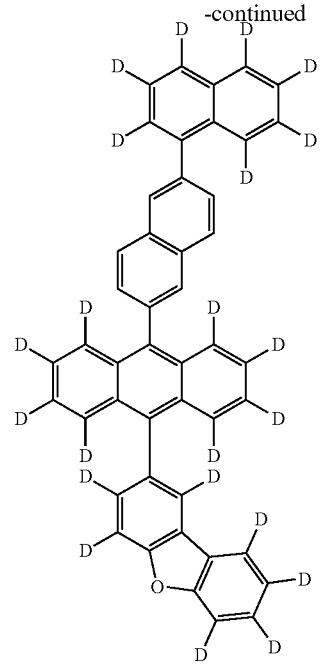
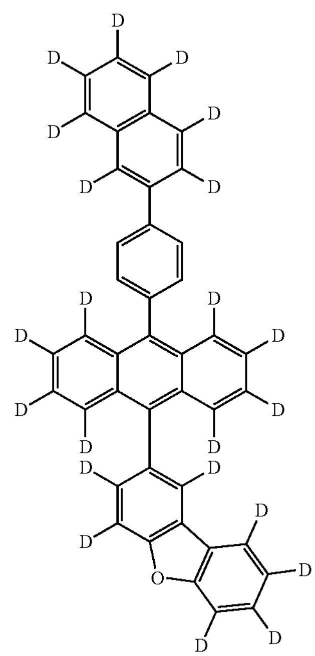

-continued
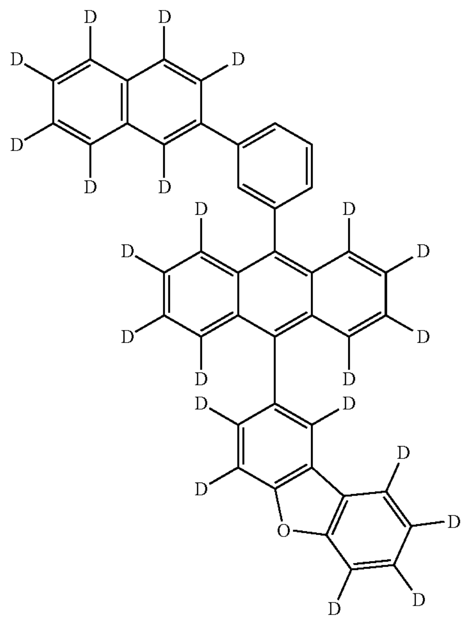
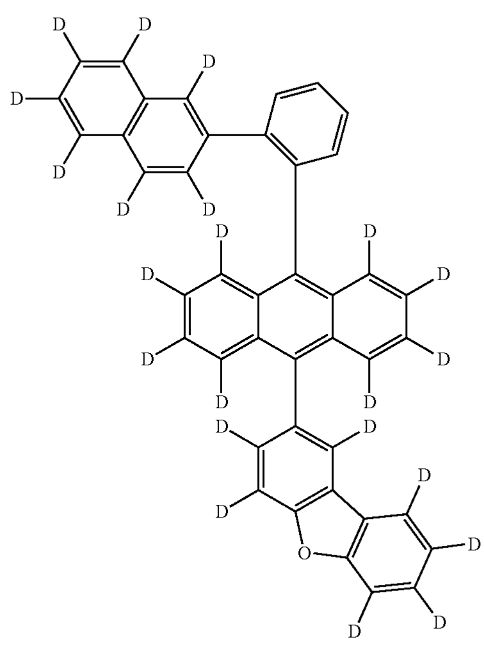
-continued
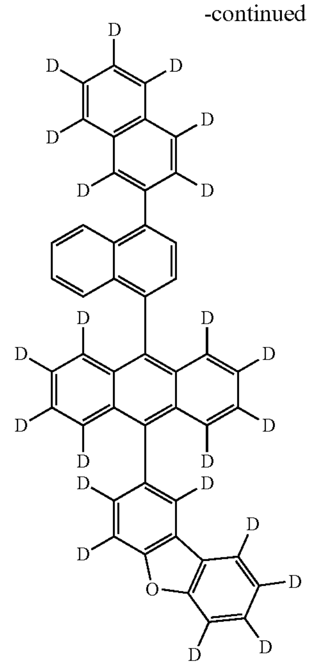
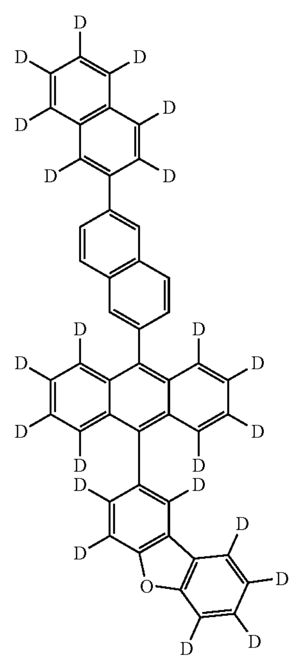

-continued
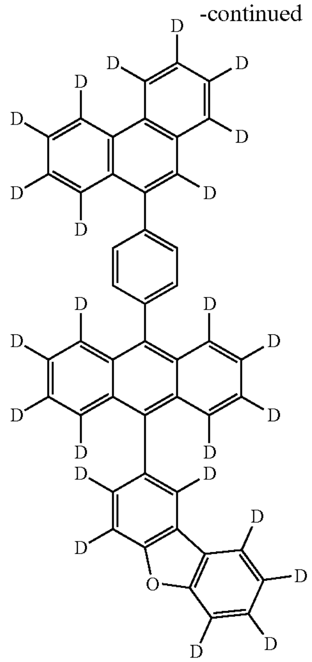
-continued
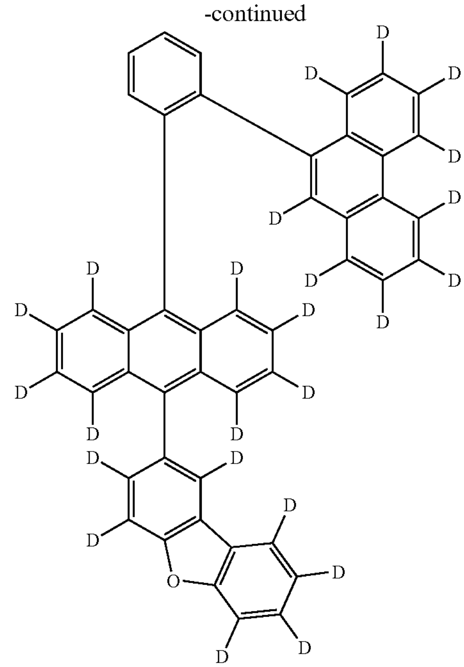
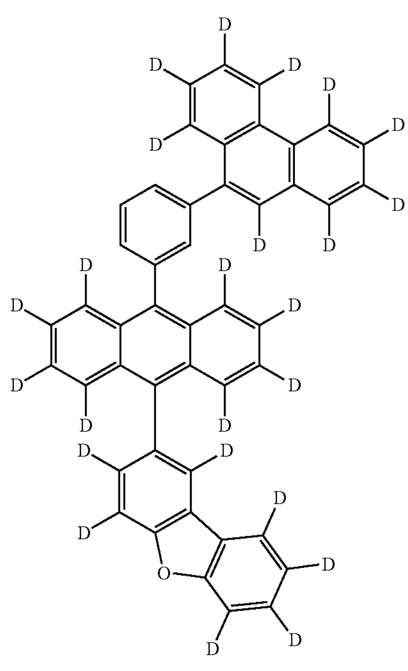
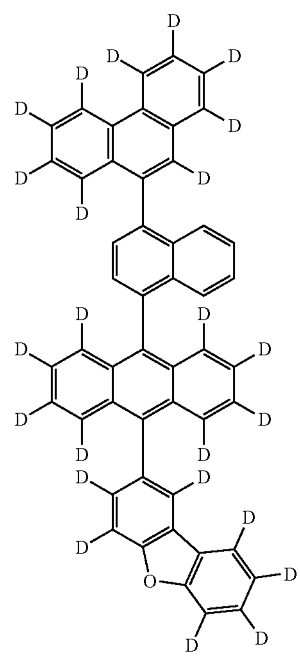

-continued
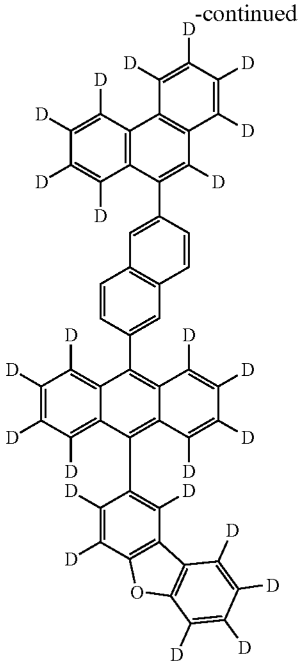
-continued
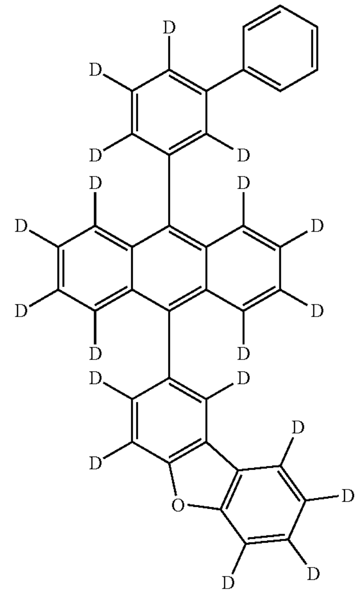
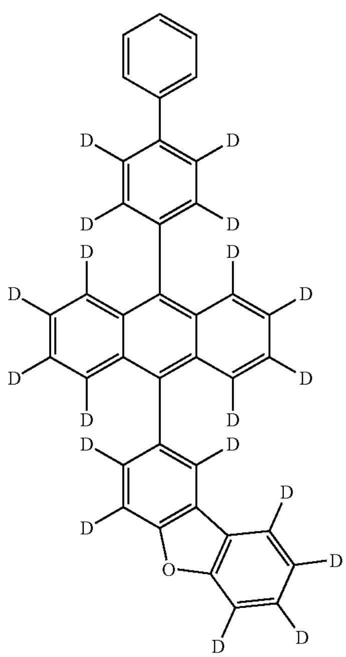
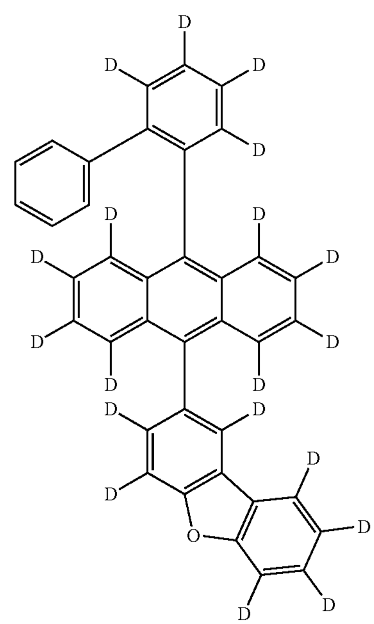

-continued
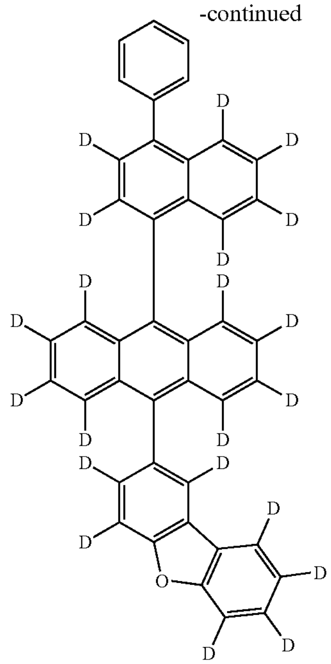
-continued
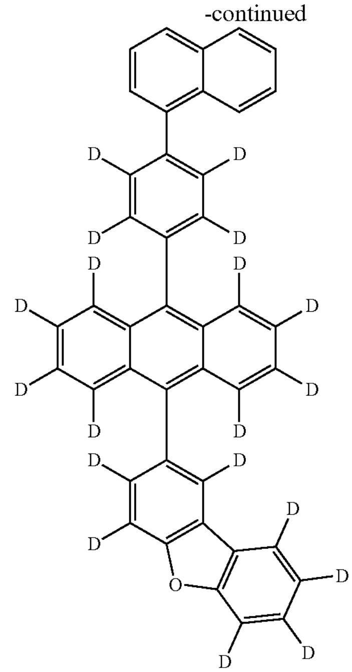
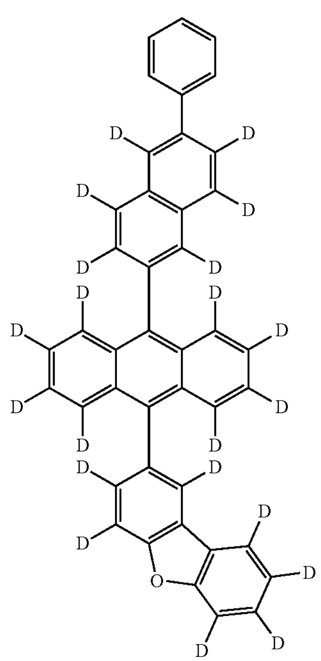
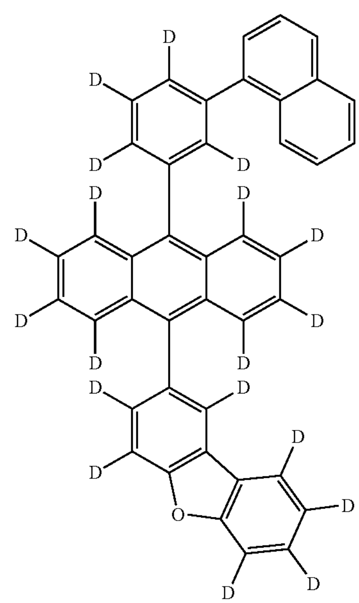

-continued
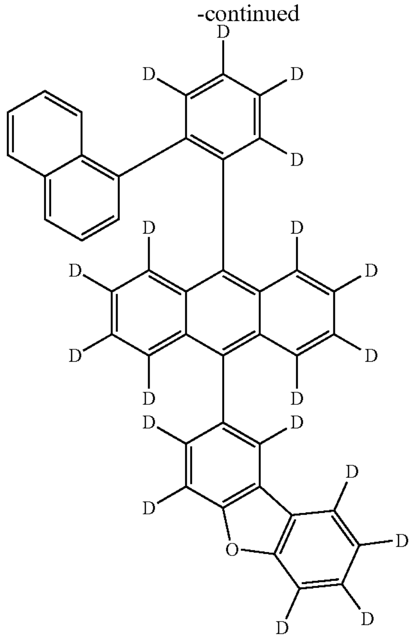
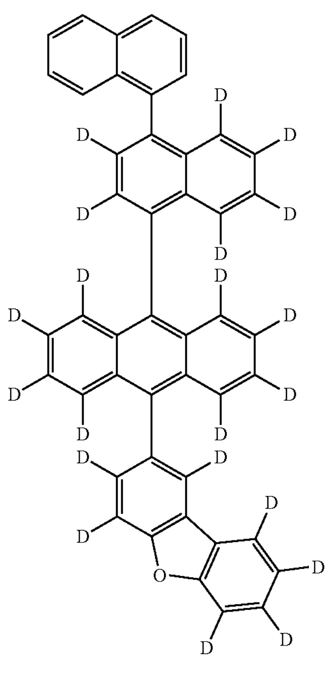
-continued
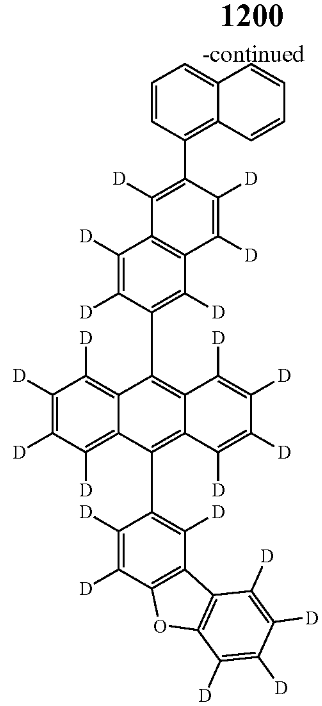
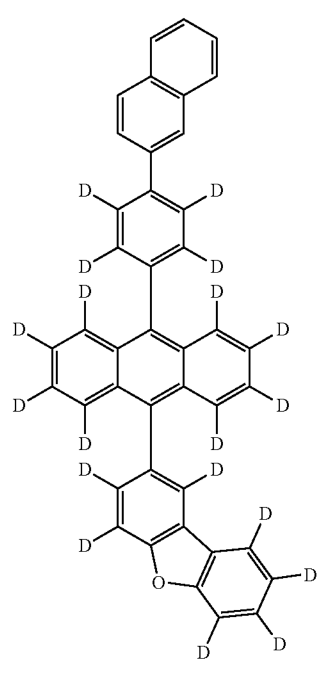

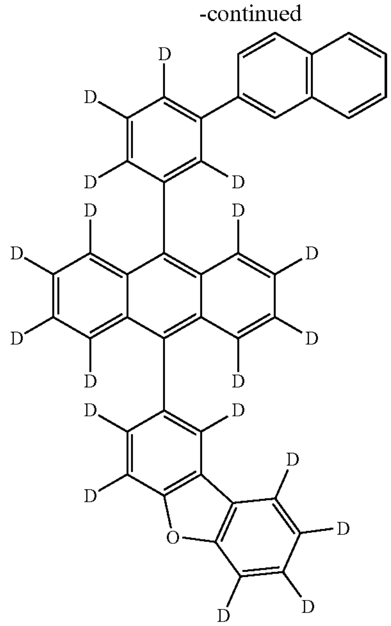
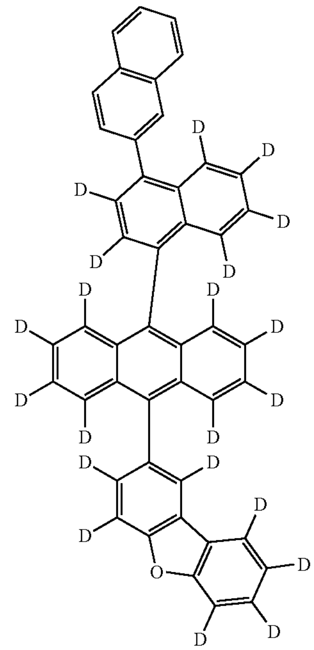
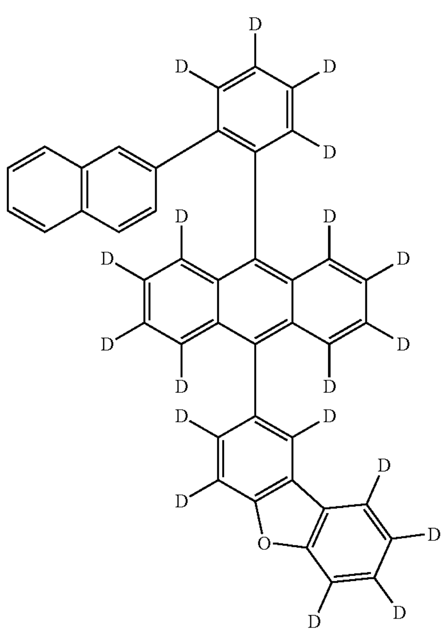
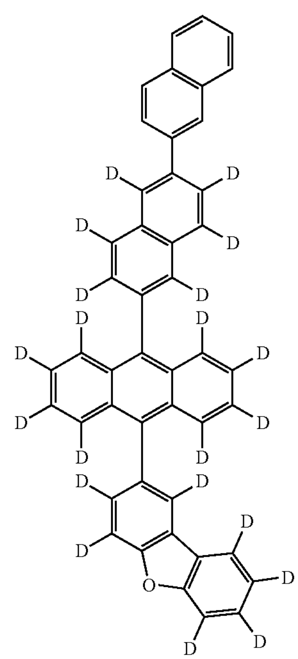

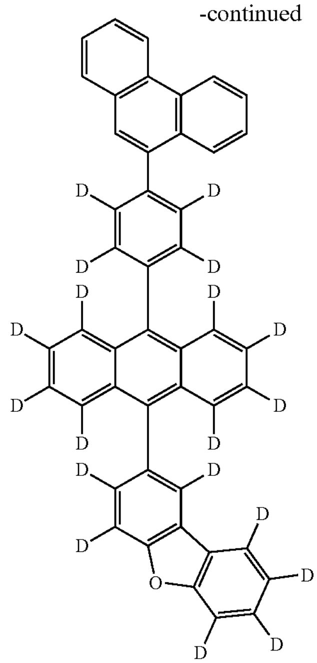
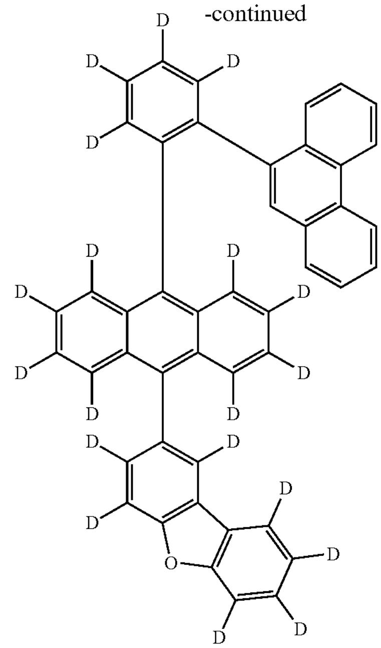
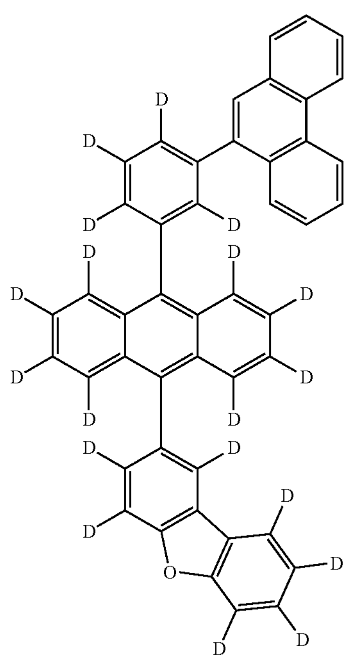
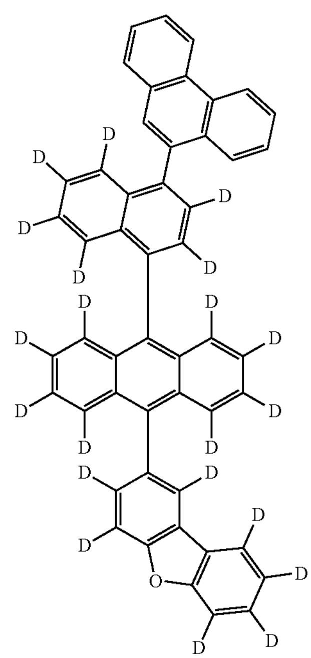

-continued
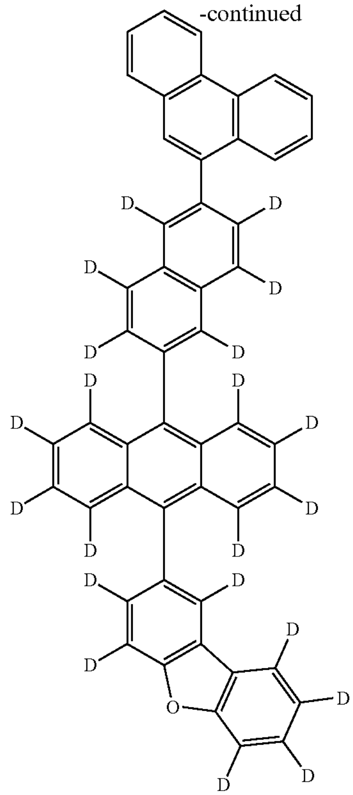
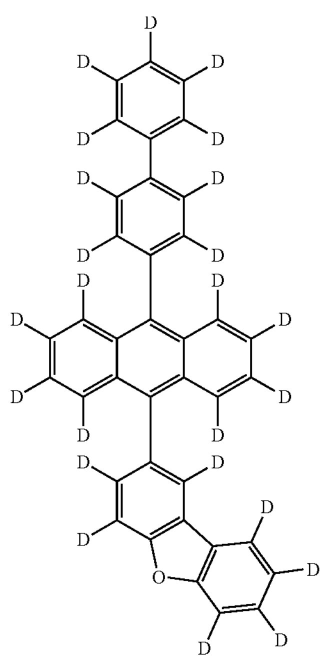
-continued
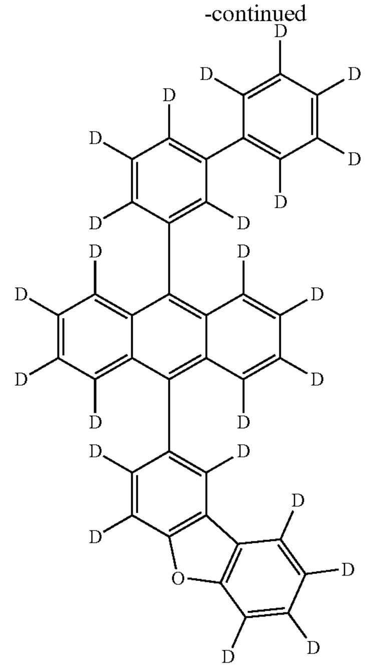
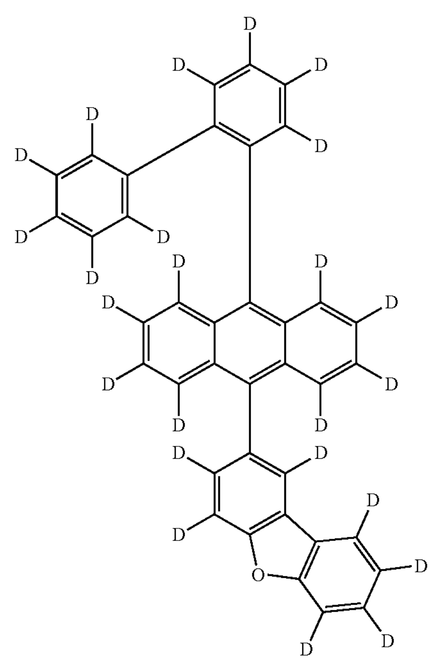

-continued
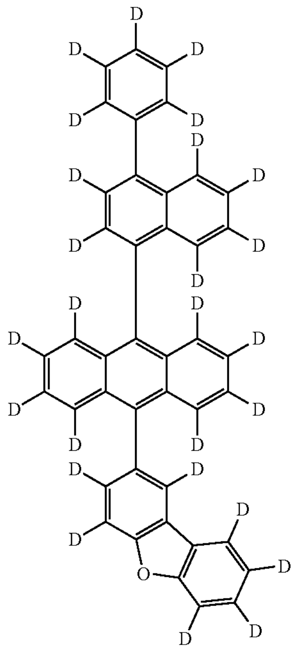
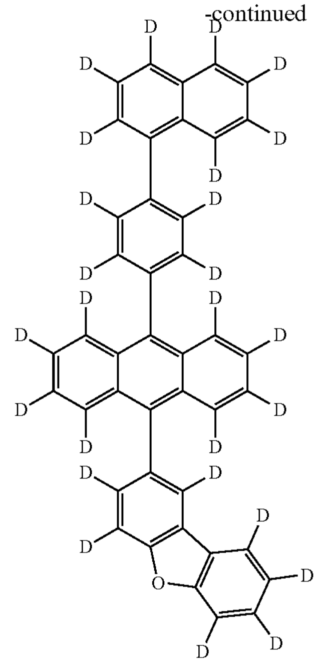
-continued
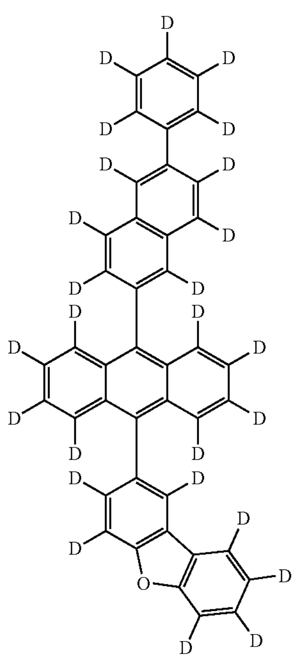
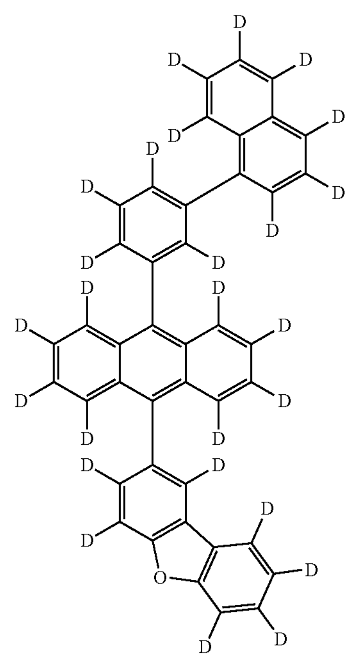

-continued
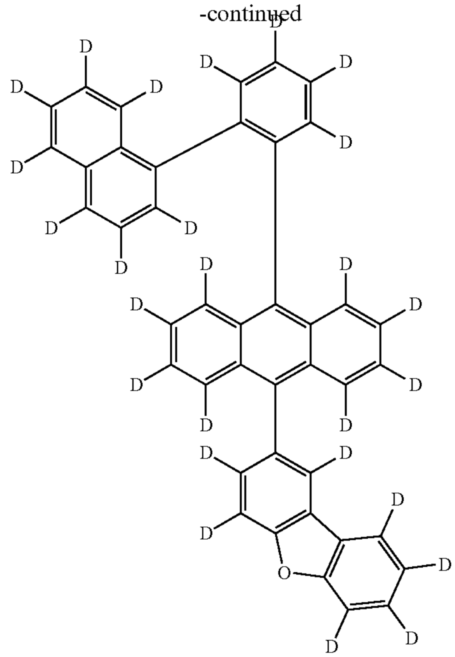
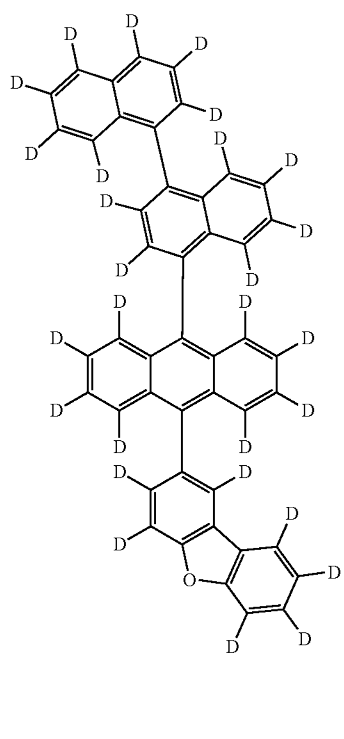
-continued
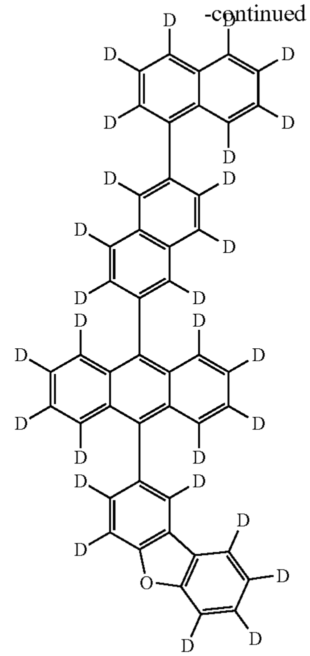
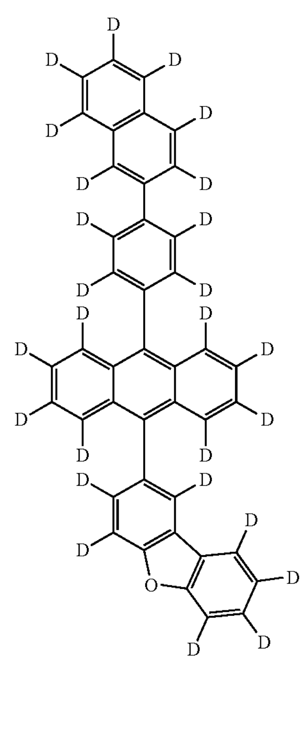

-continued
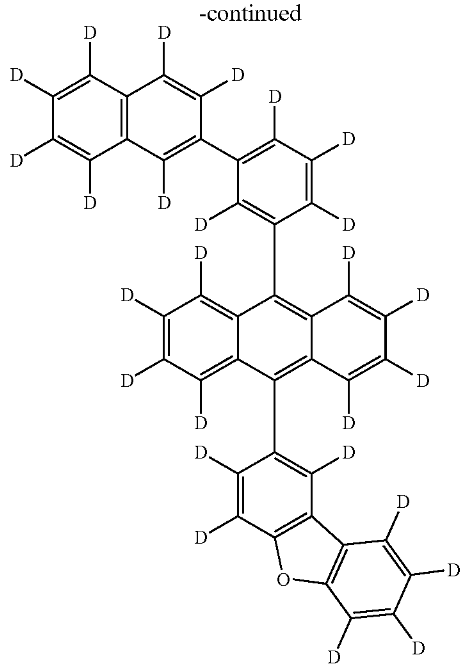
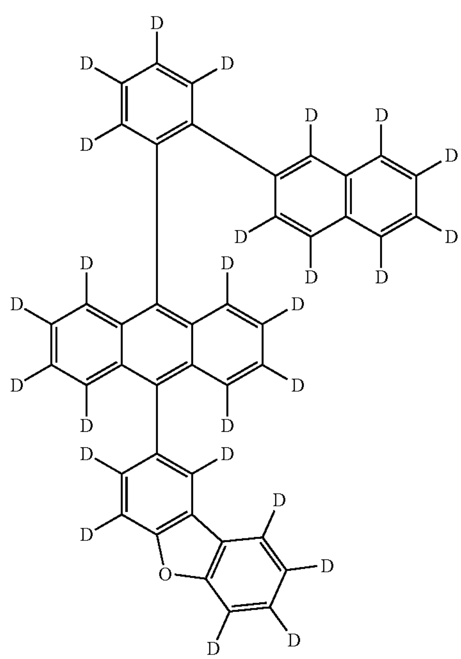
-continued
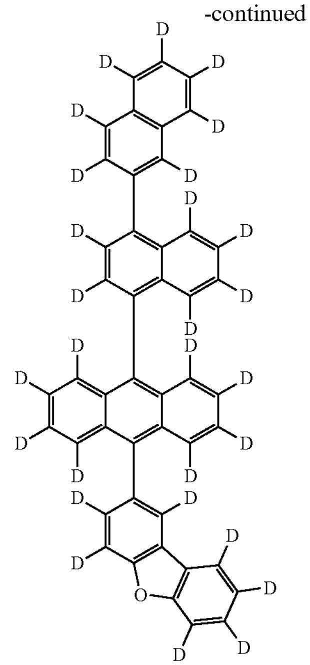
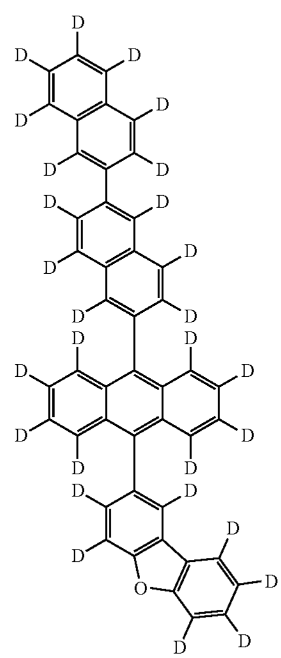

-continued
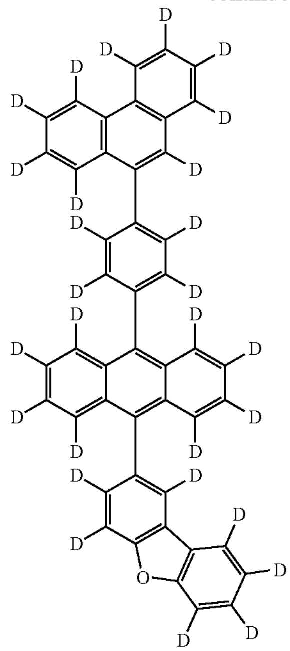
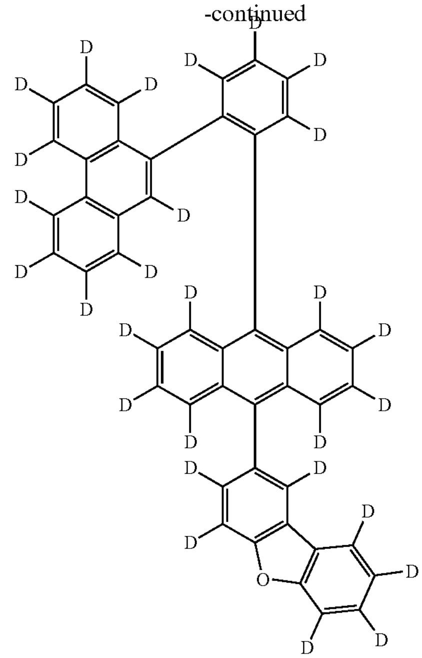
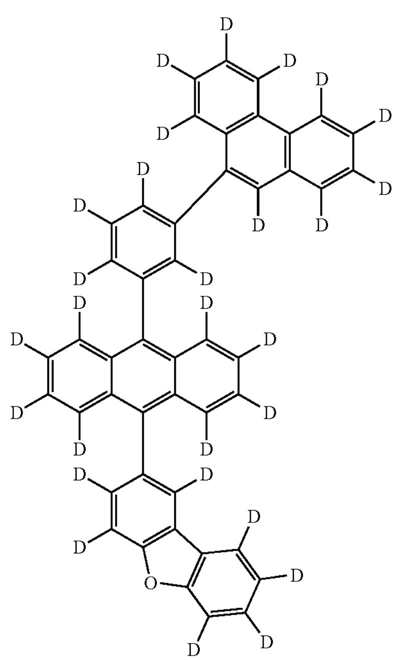
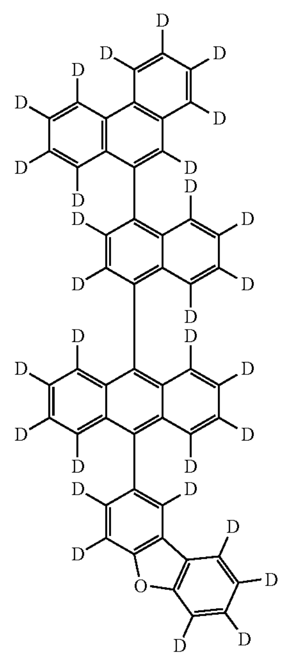

-continued
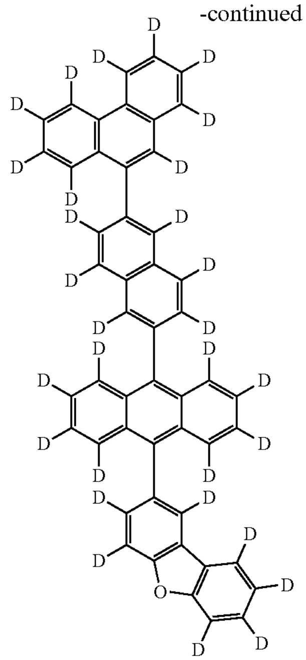
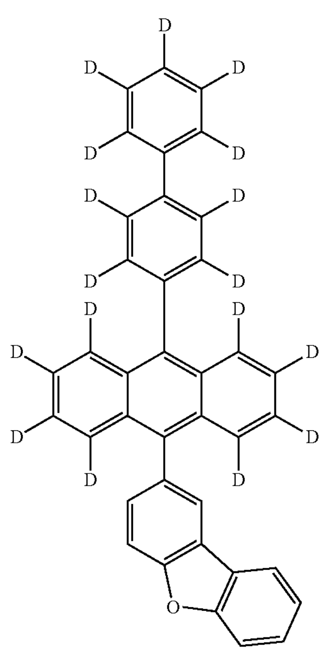
-continued
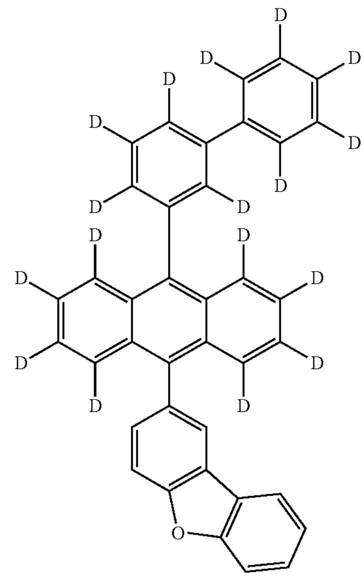
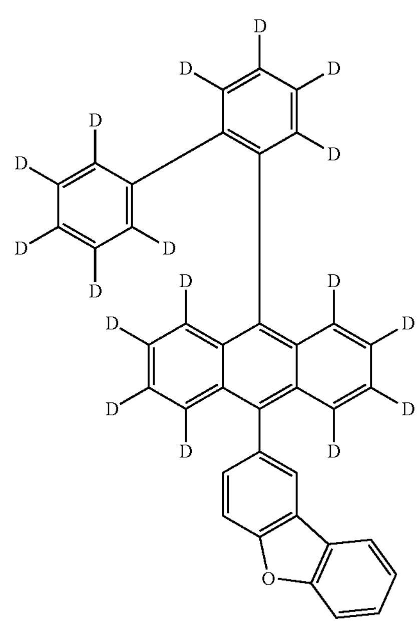

-continued
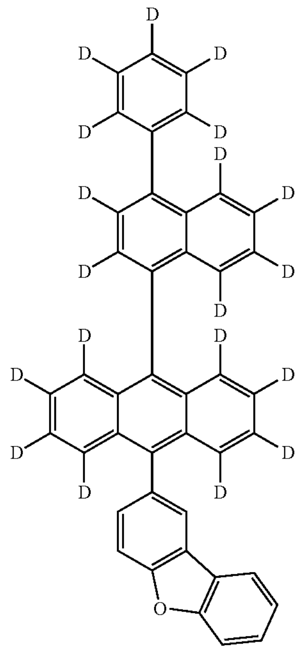
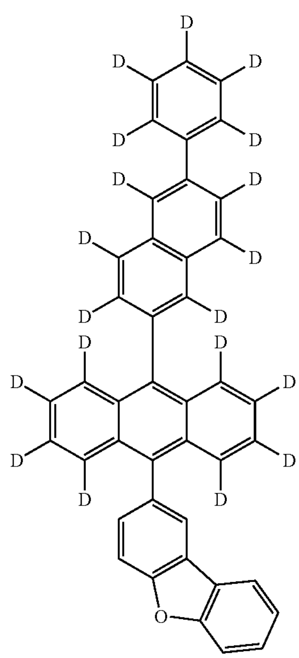
-continued
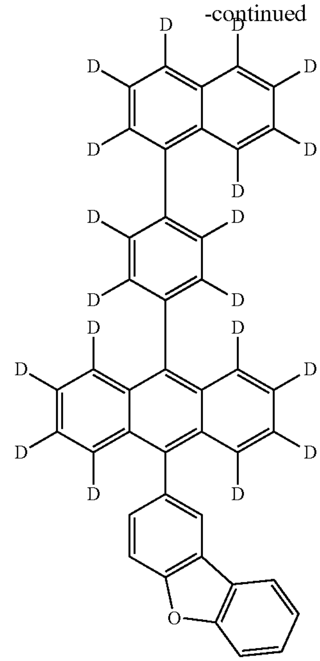
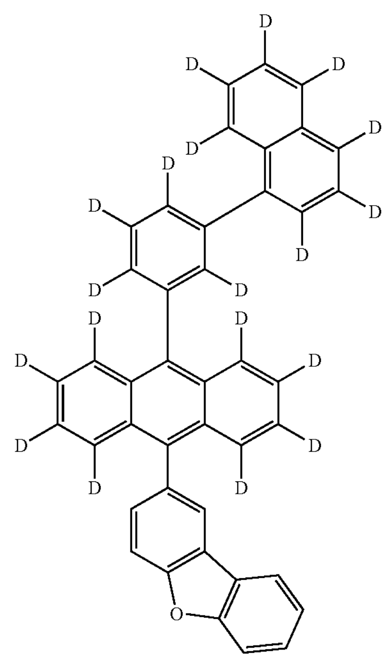

-continued
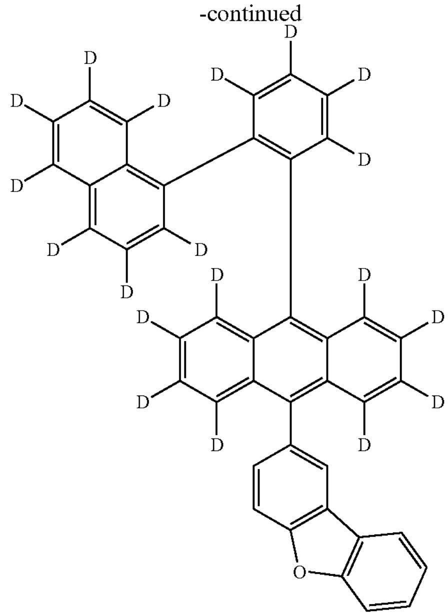
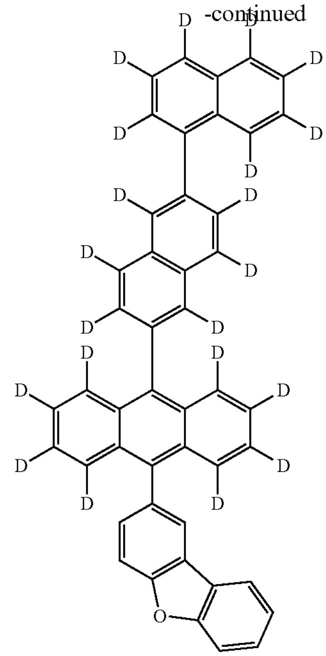
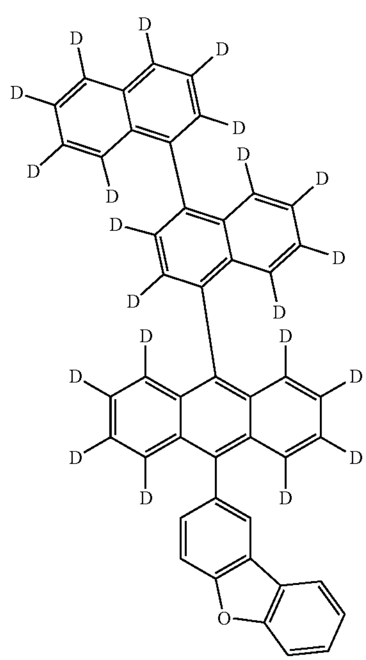
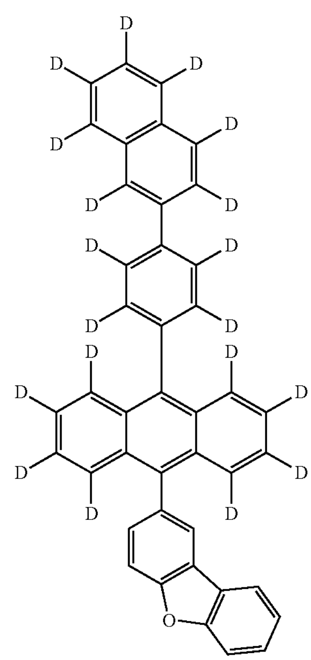

-continued
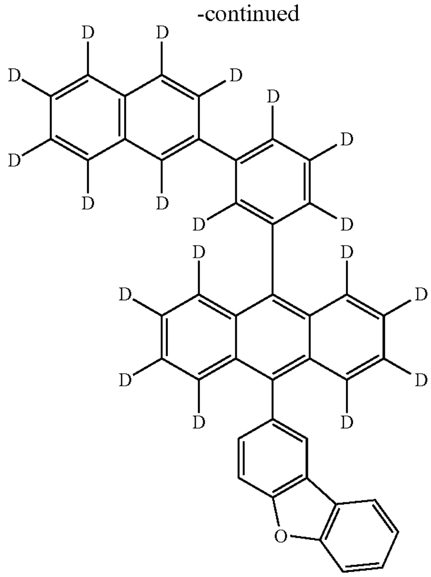
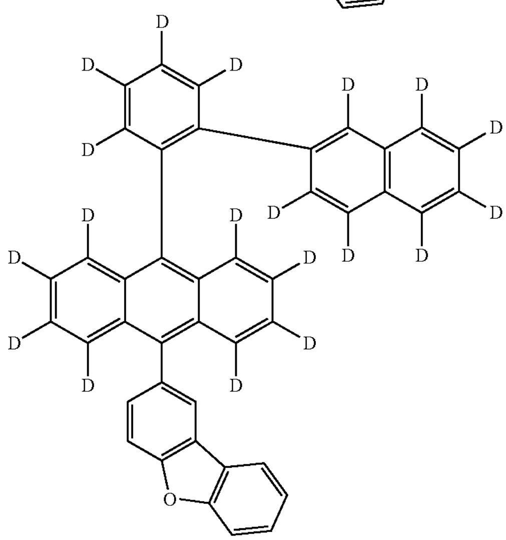
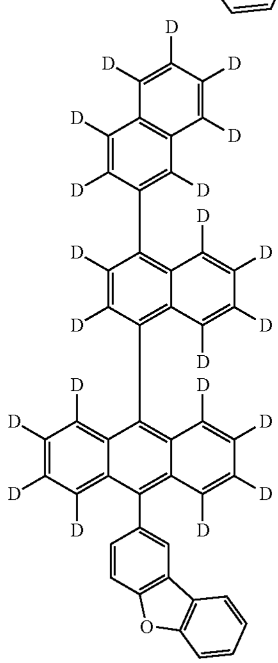
-continued
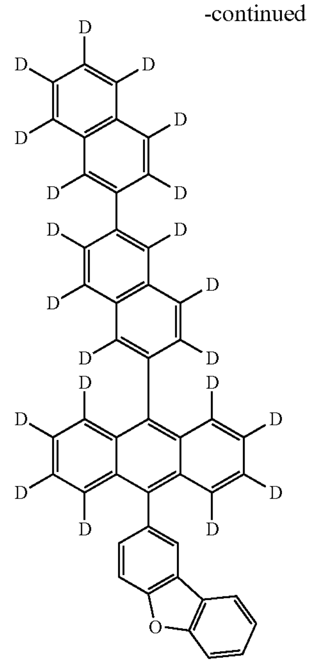
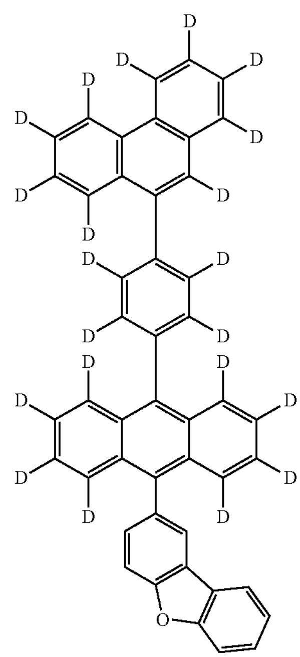

-continued
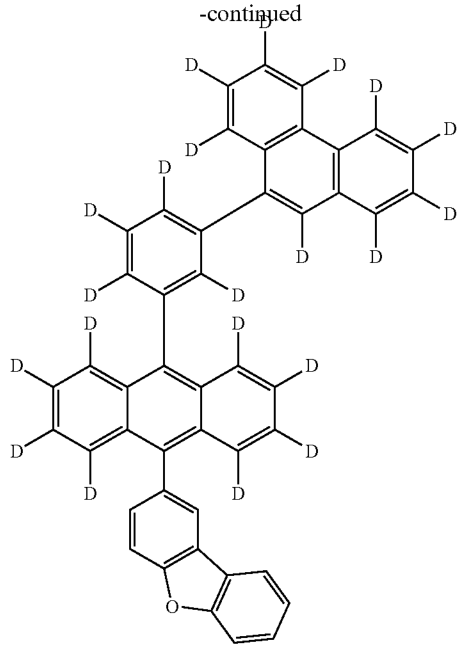
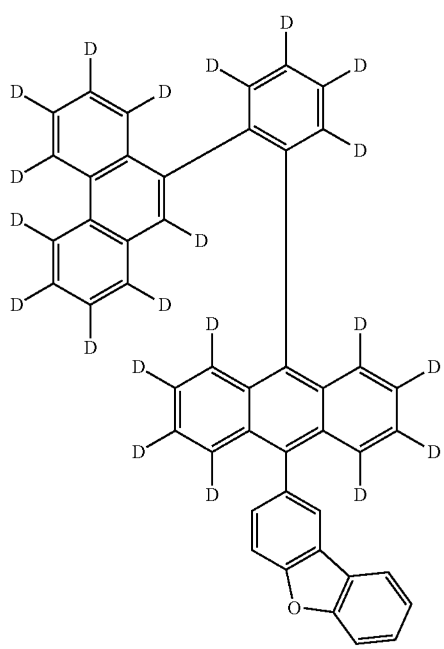
-continued
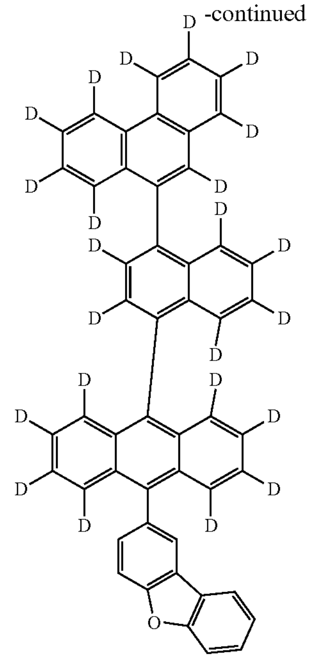
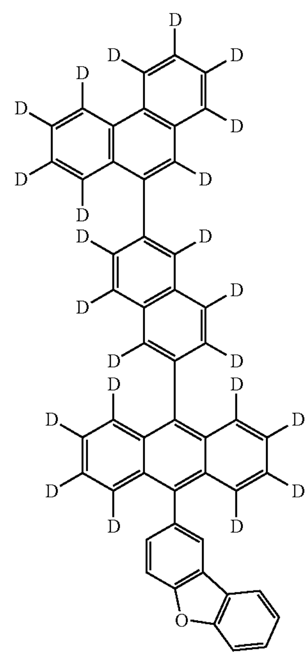

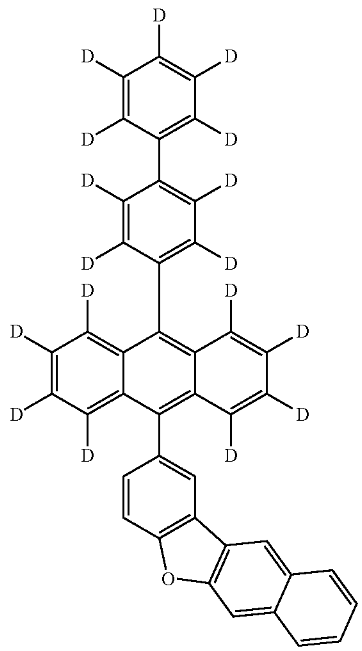
O
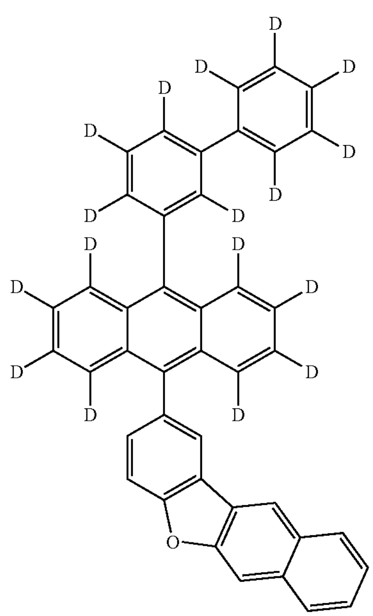
O
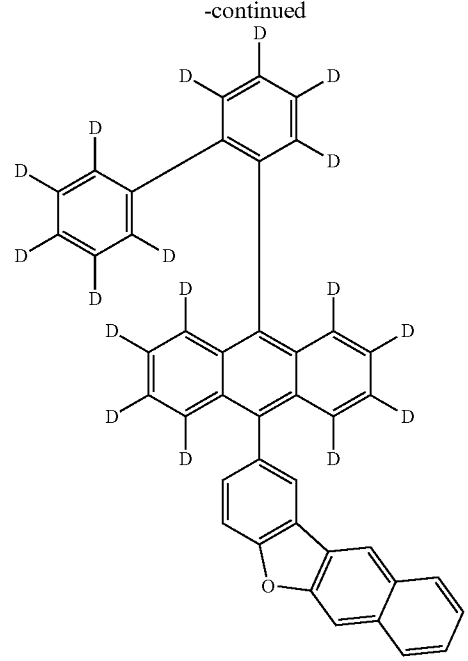
O
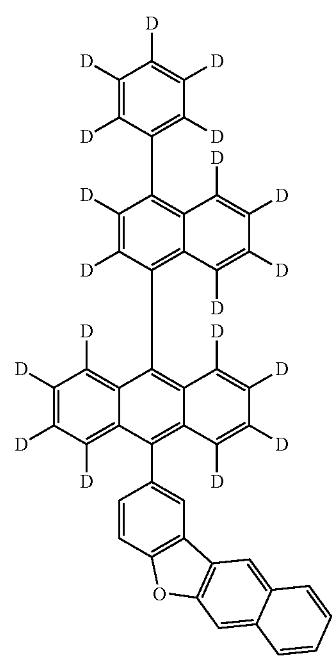
O

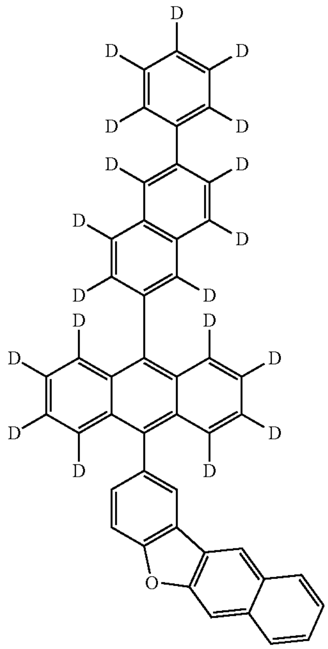
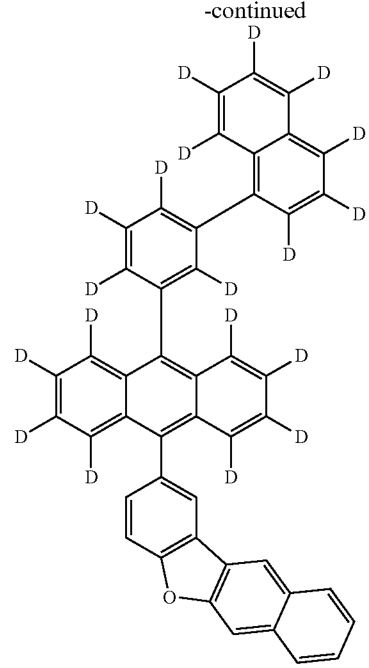
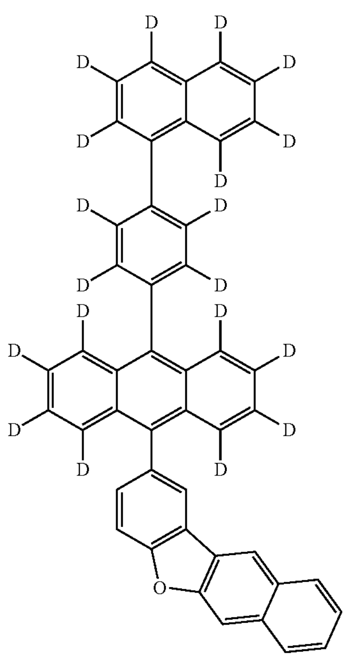
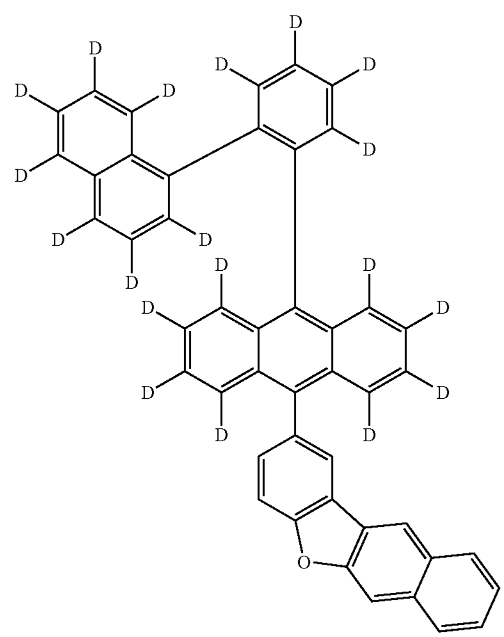

-continued
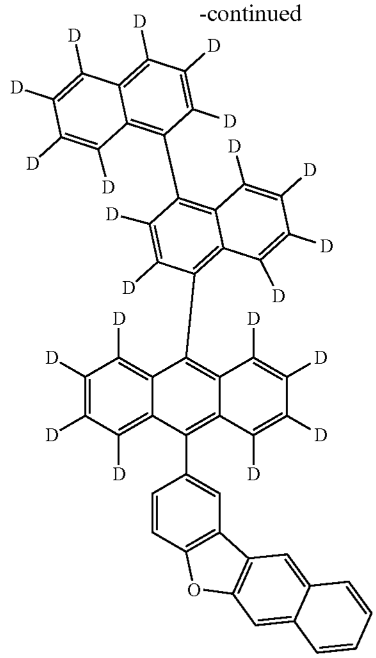
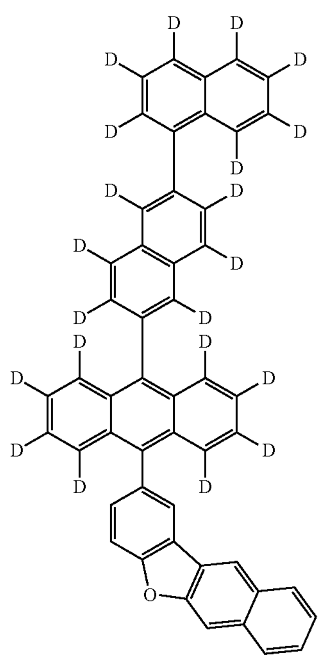
-continued
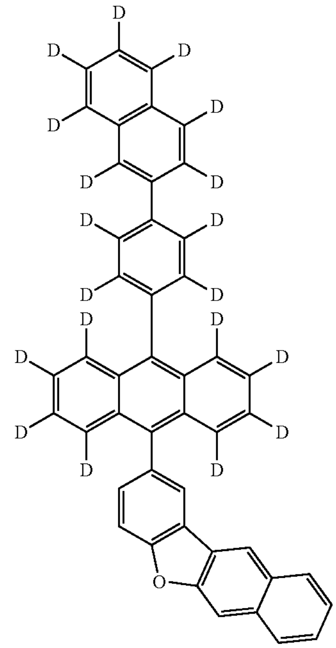
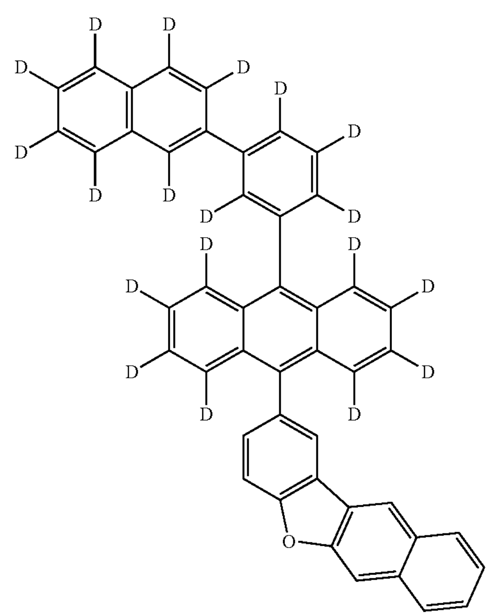

-continued
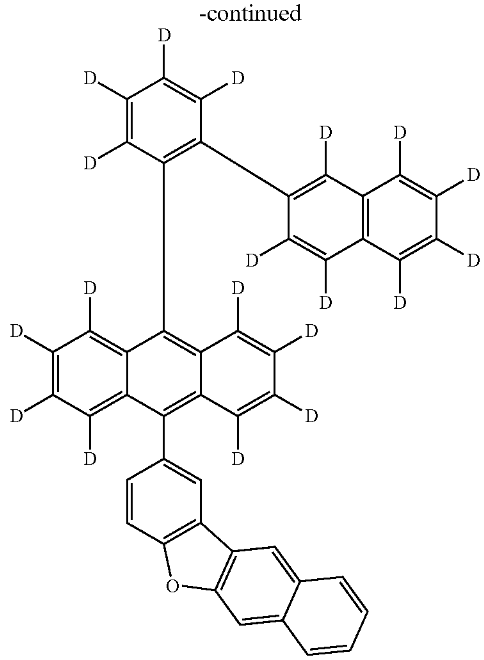
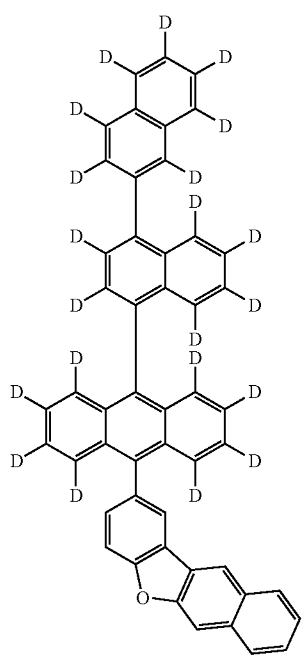
-continued
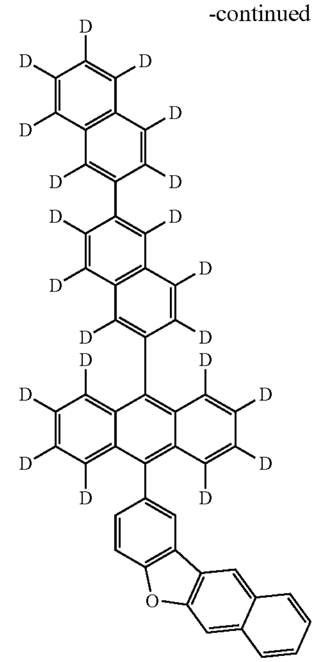
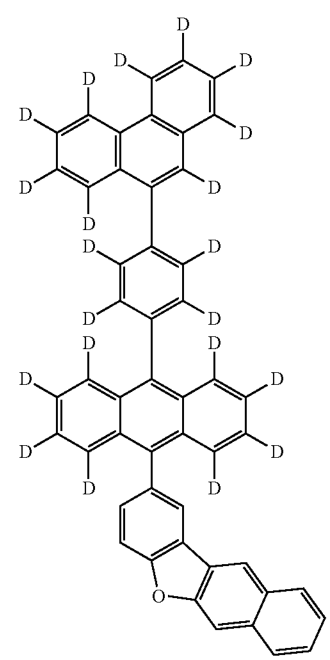

-continued
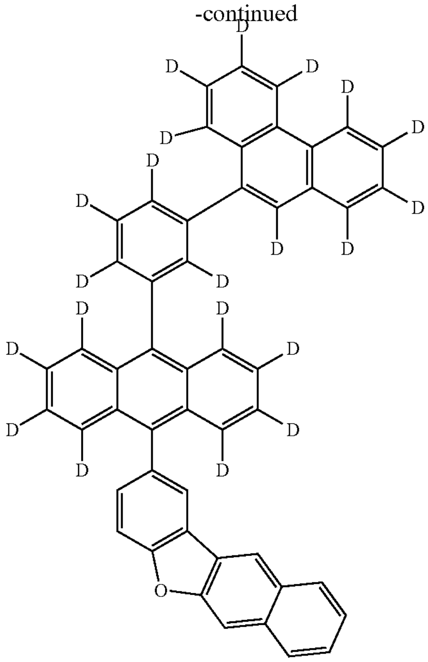
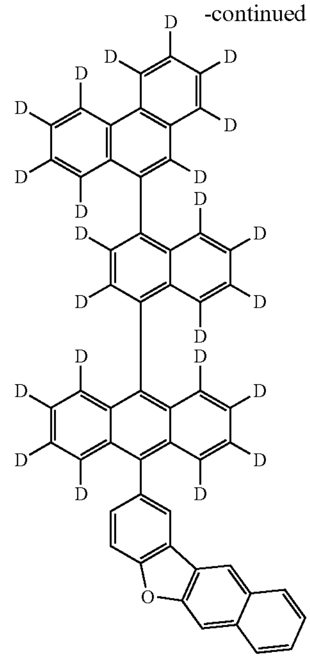
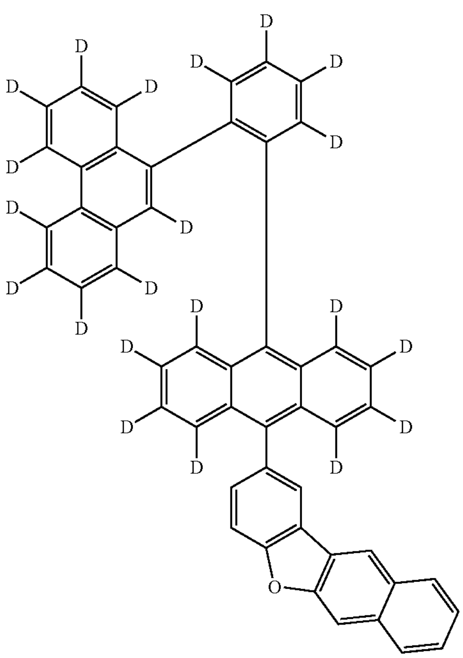
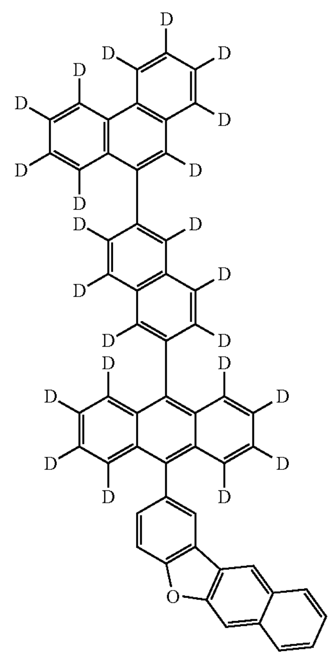

-continued
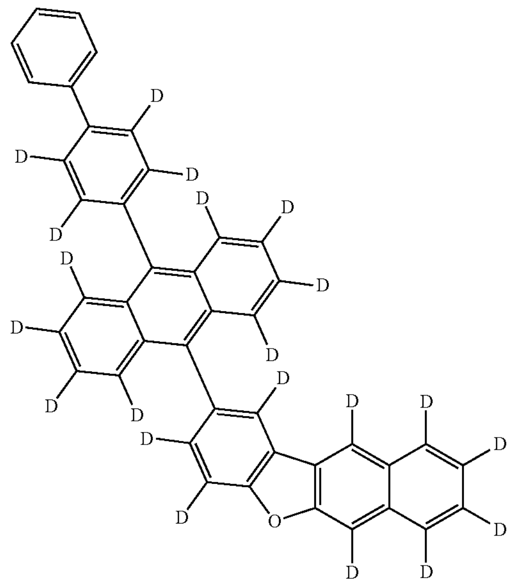
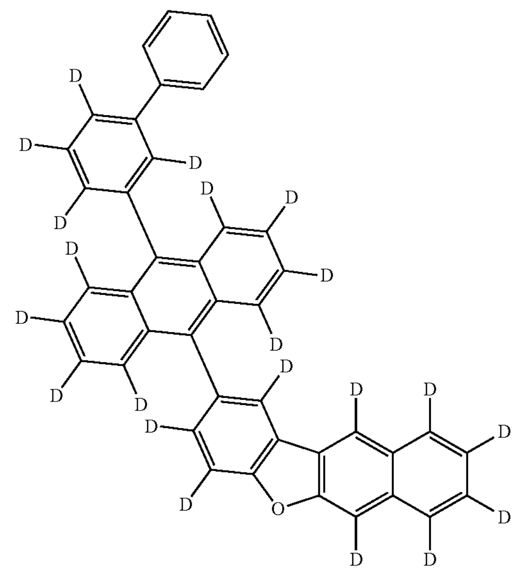
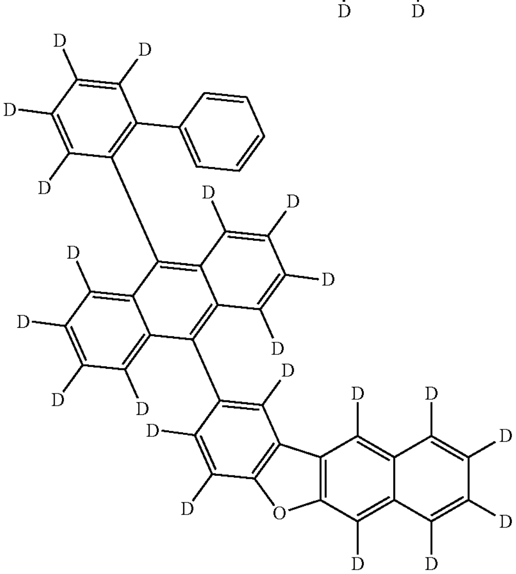
-continued
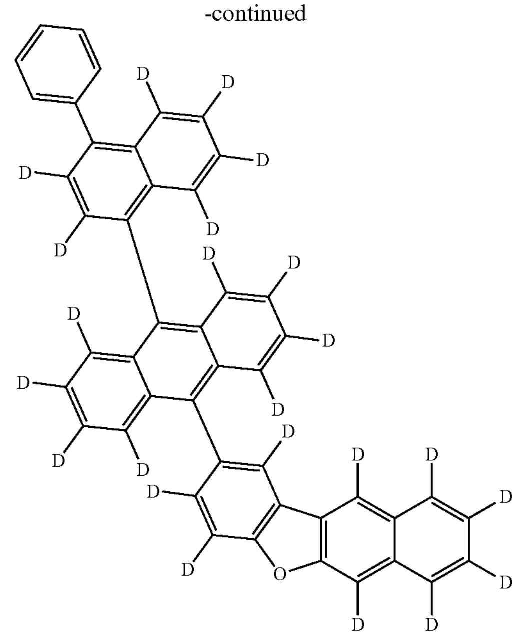
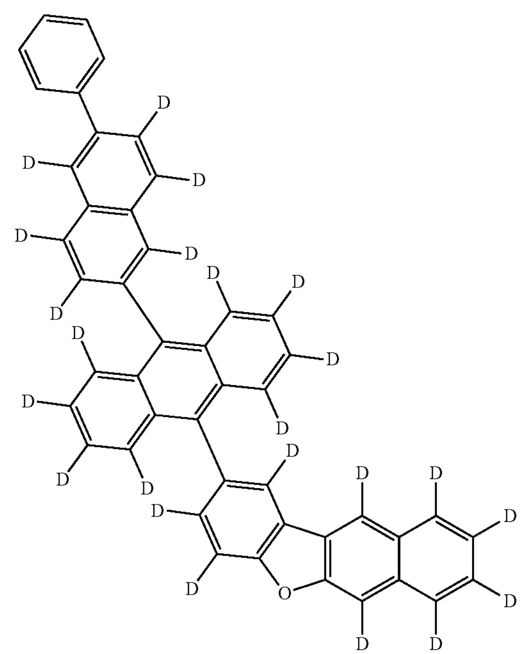

-continued
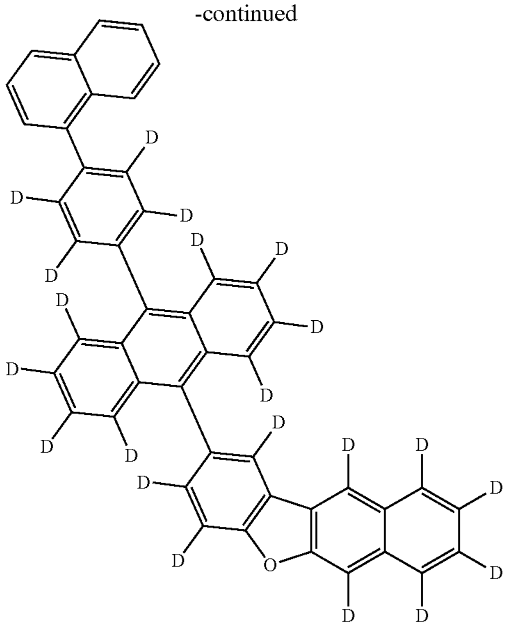
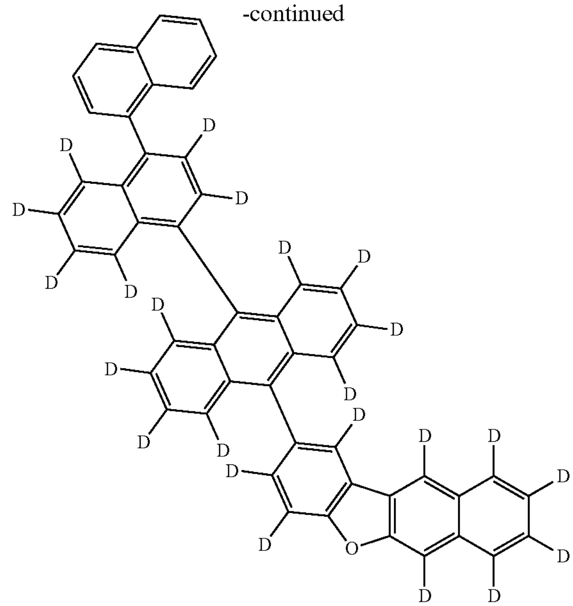
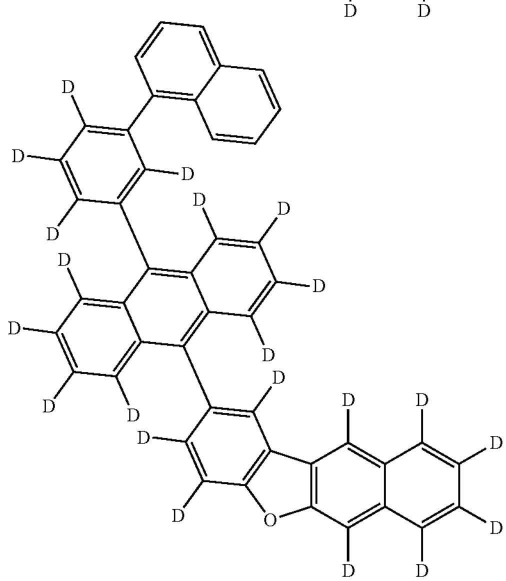
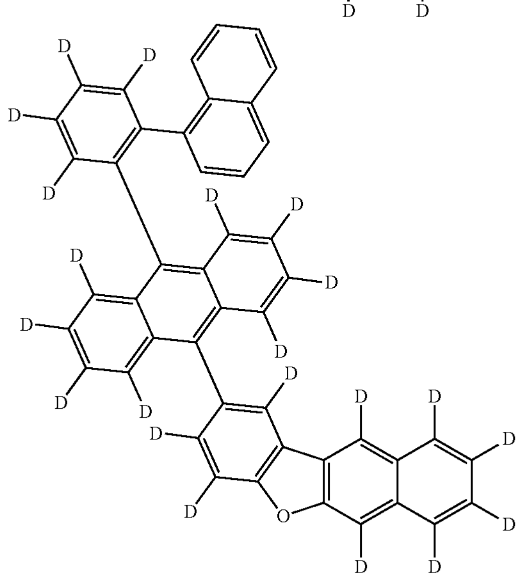
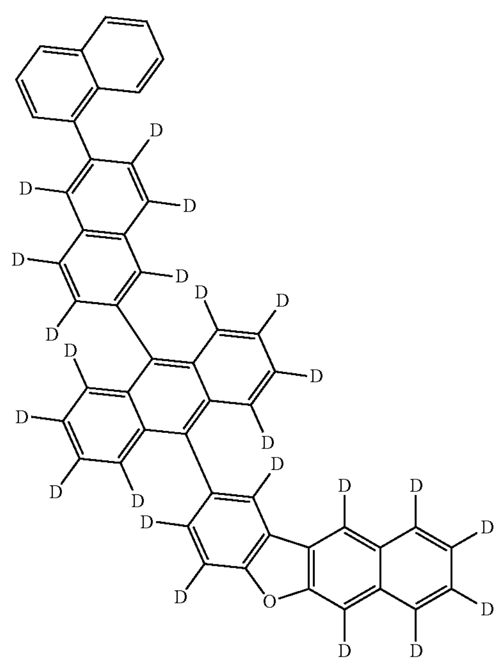

-continued
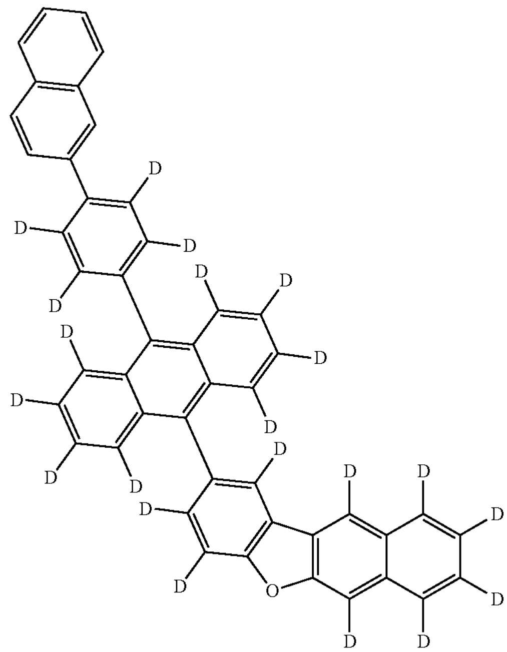
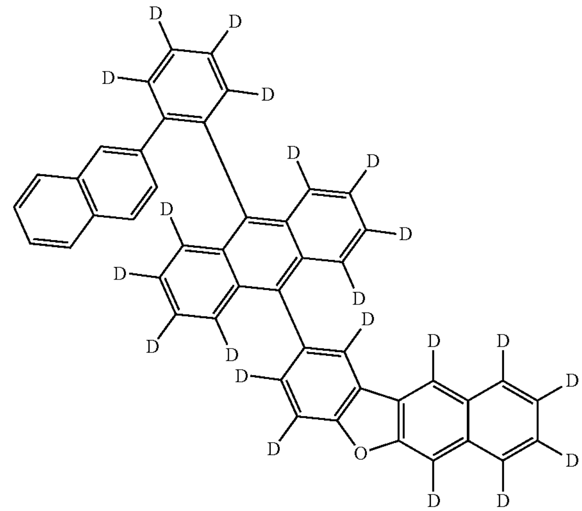
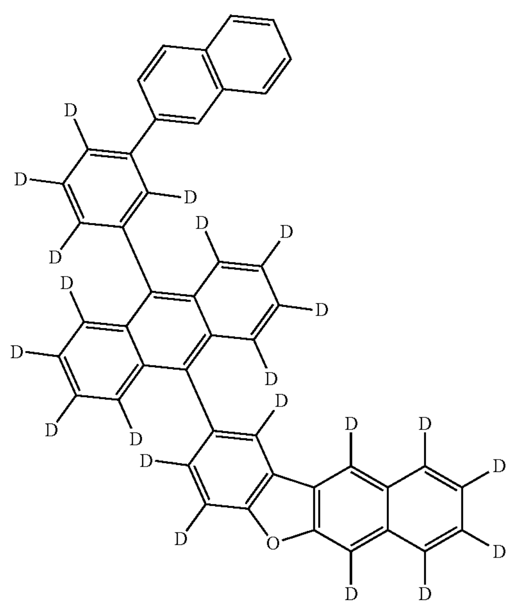
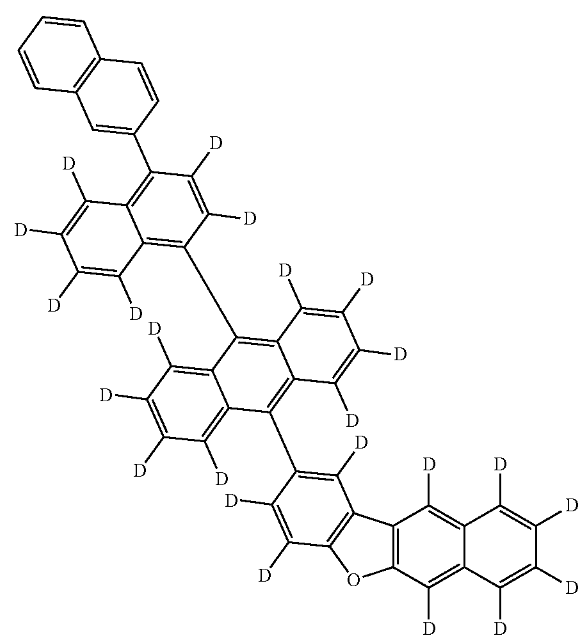

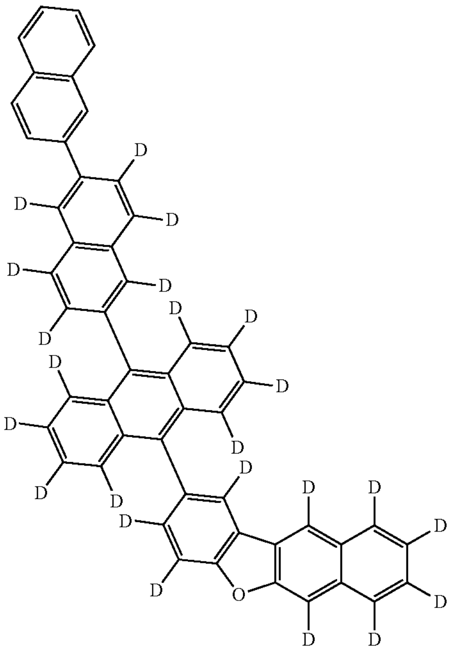
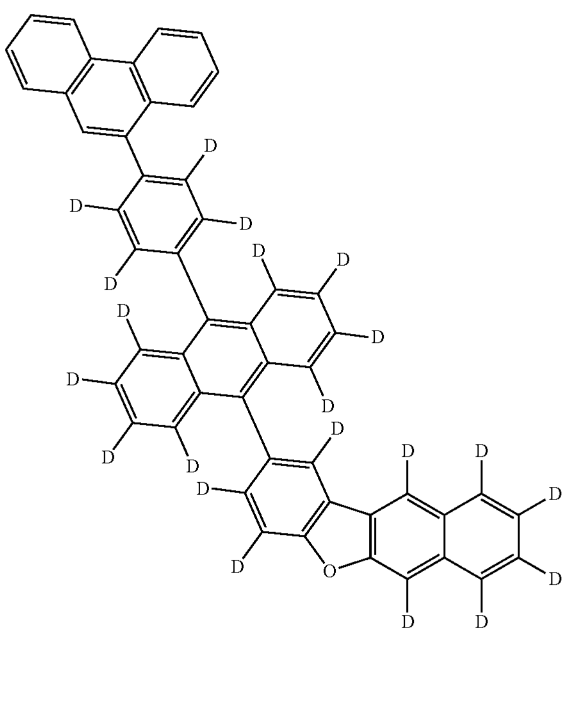
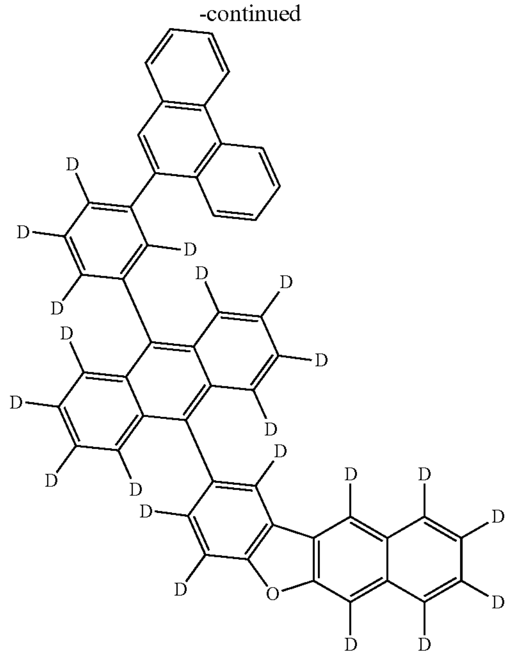
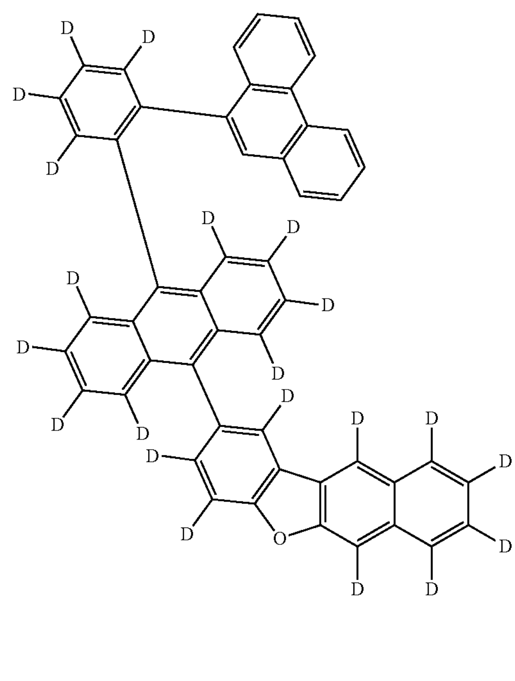

-continued
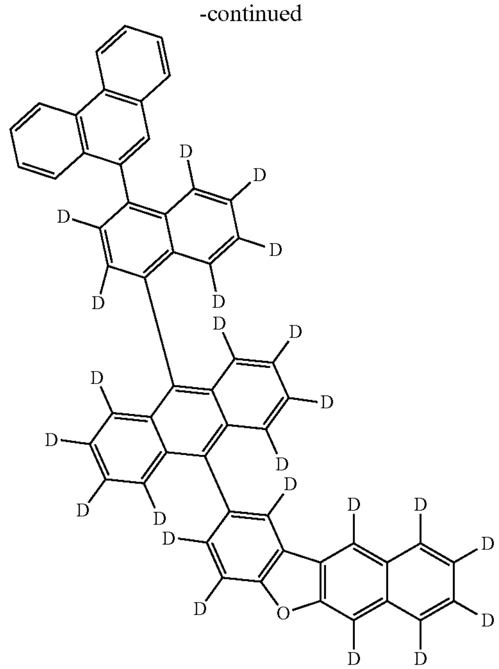
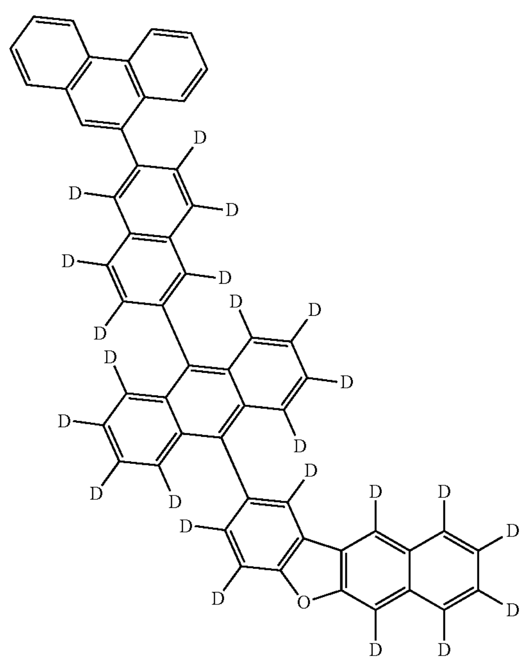
-continued
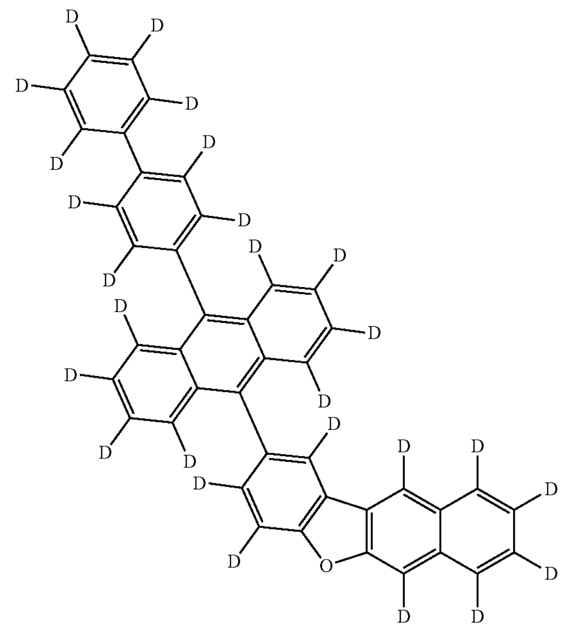
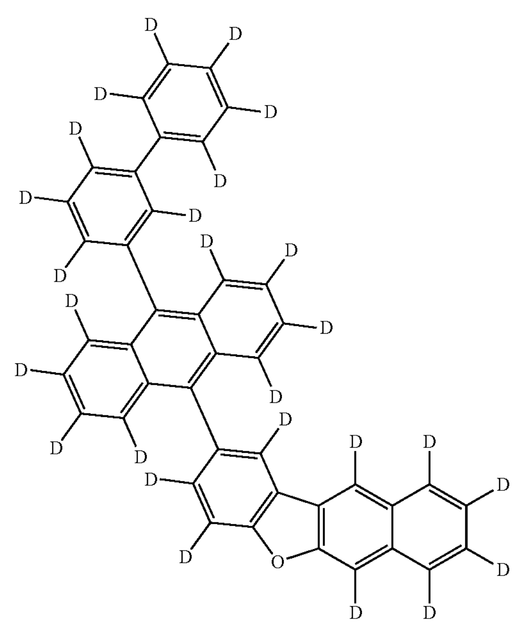

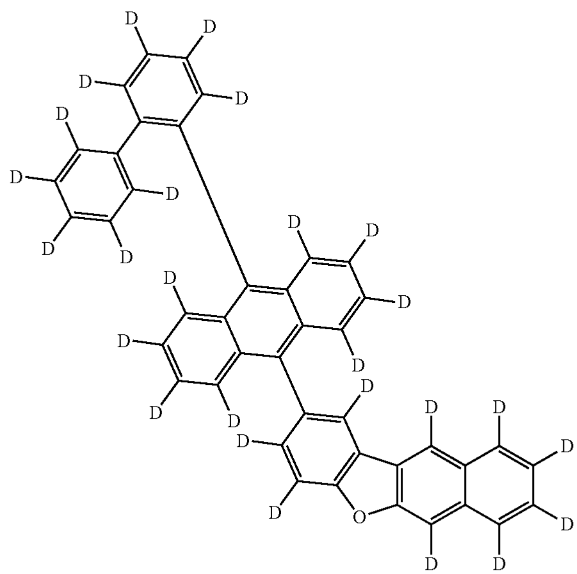
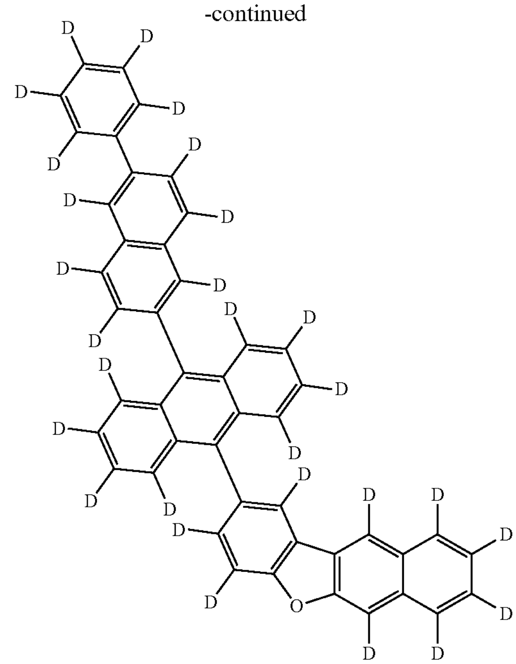
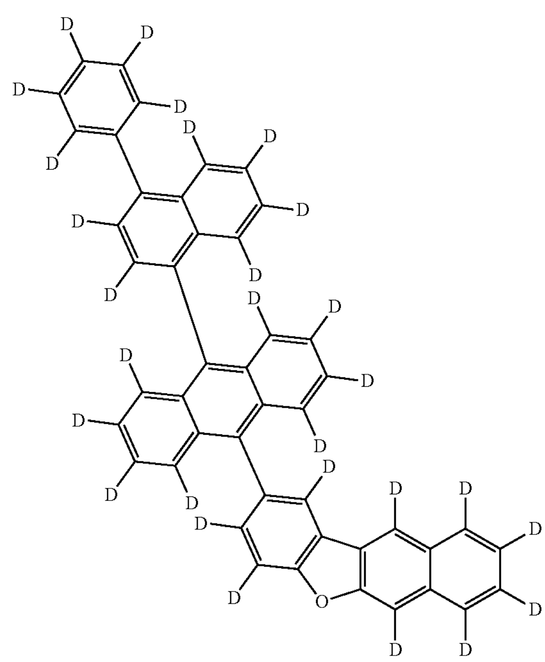
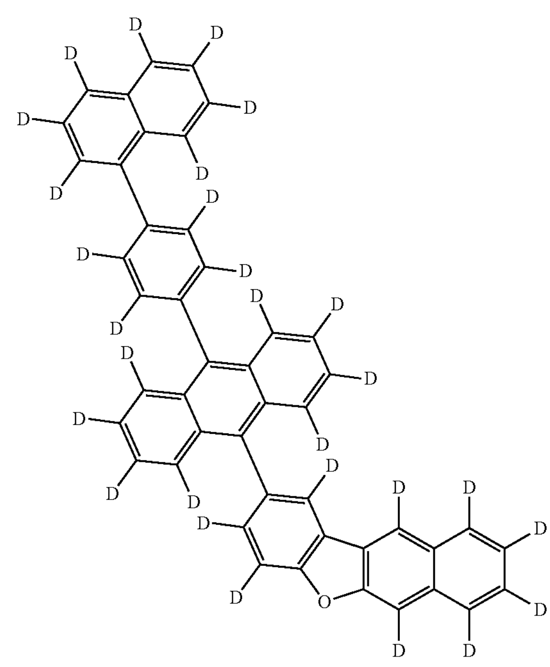

-continued
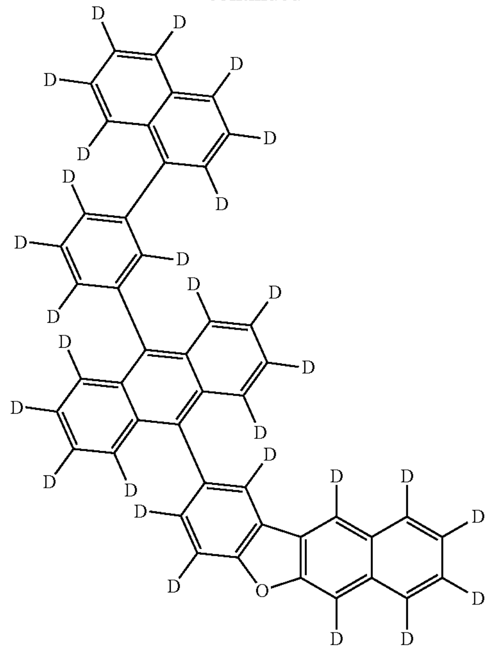
-continued
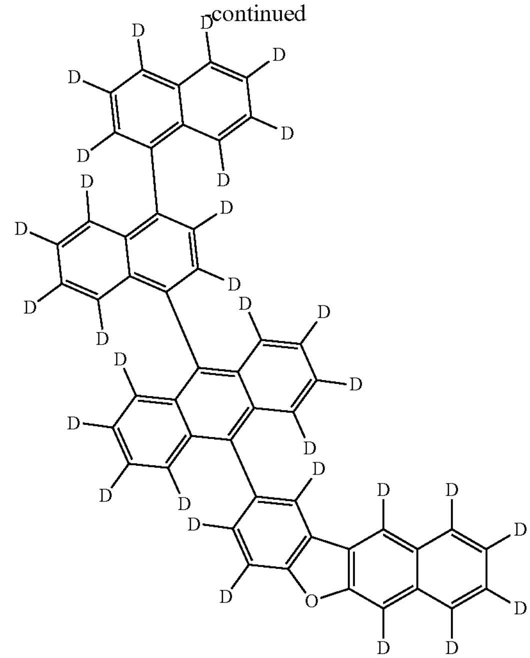
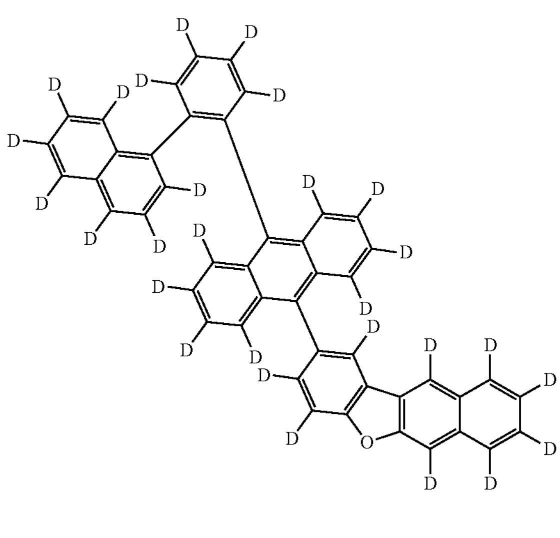
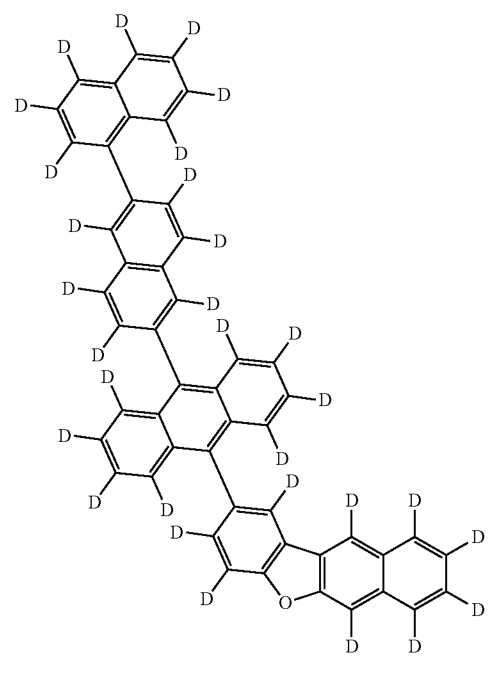

-continued
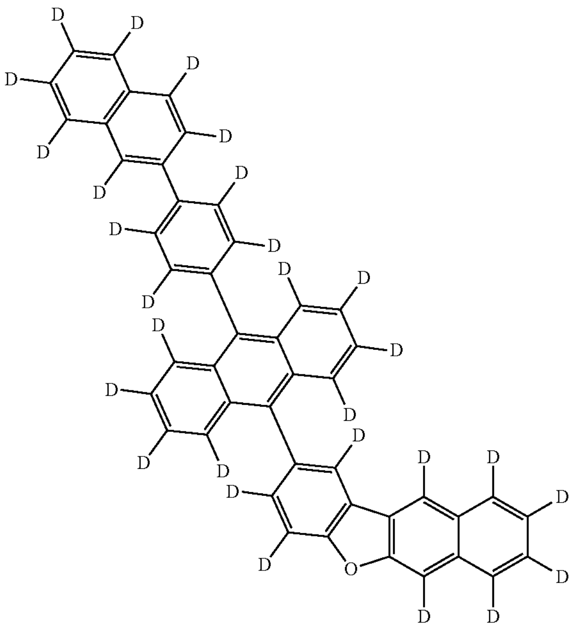
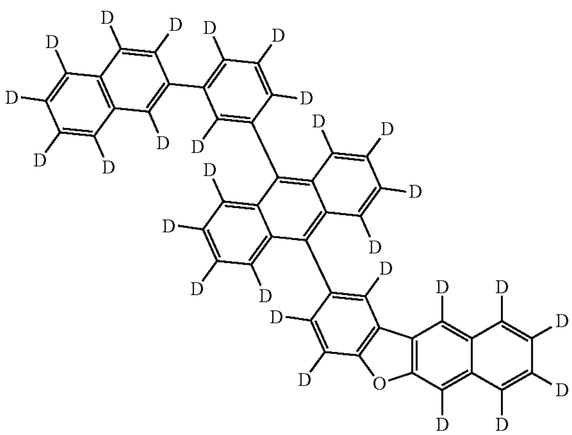
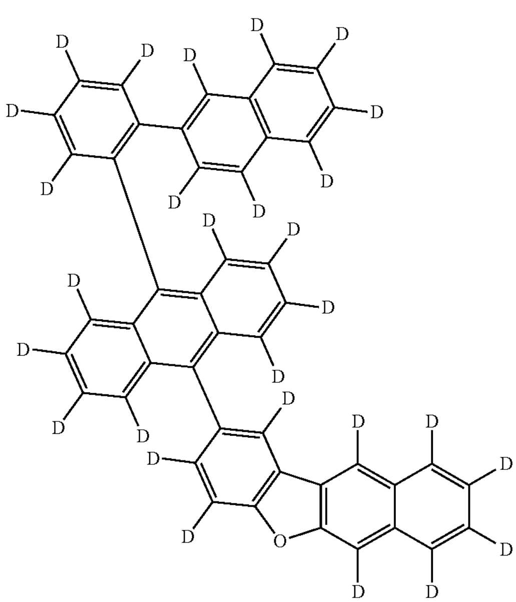
-continued
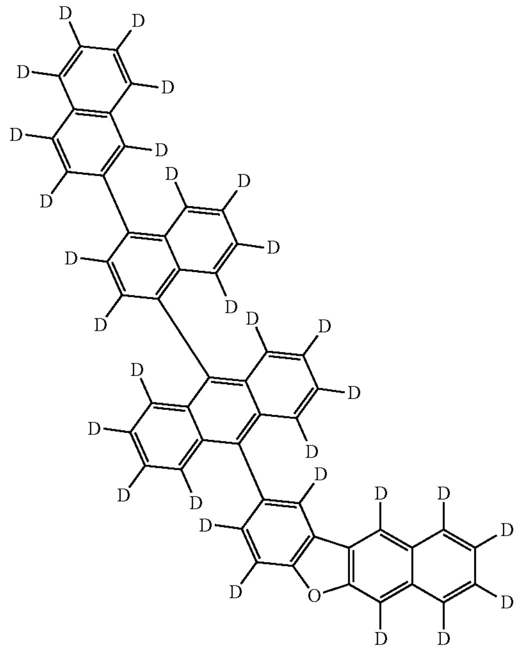
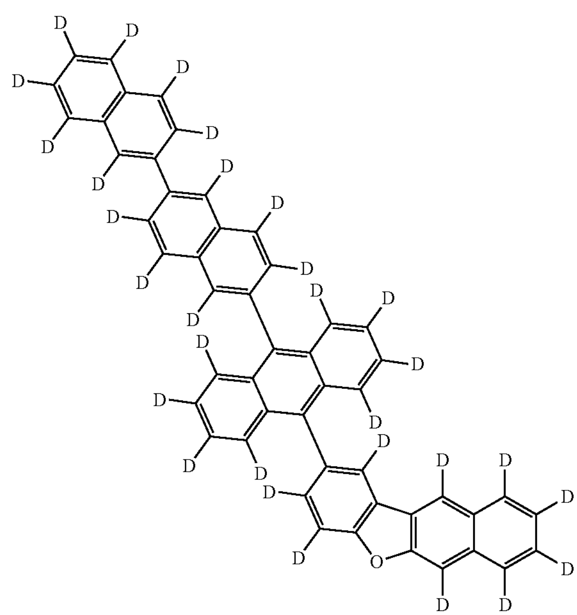

-continued
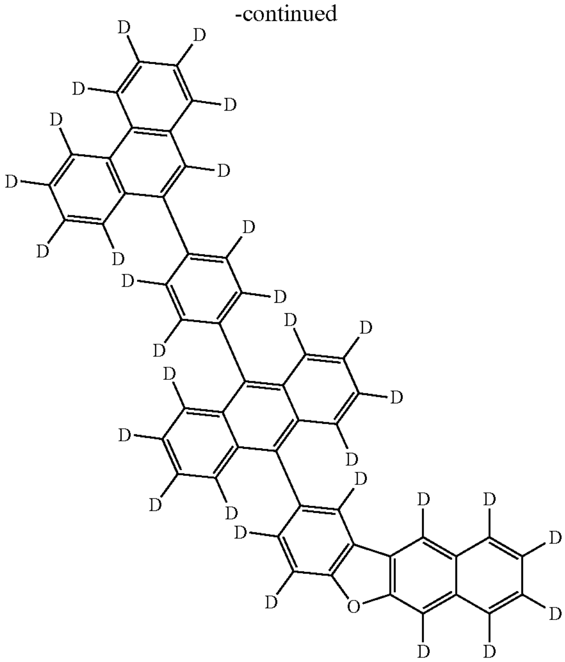
-continued
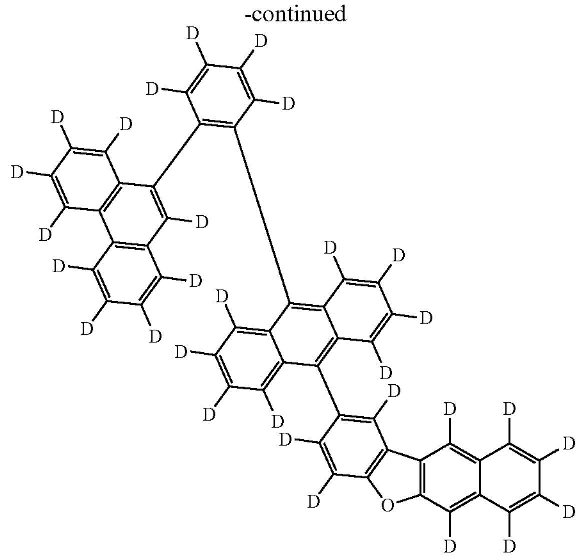
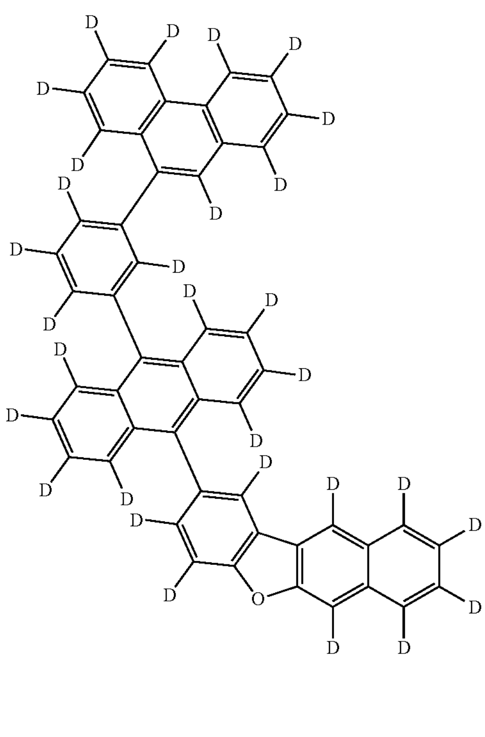
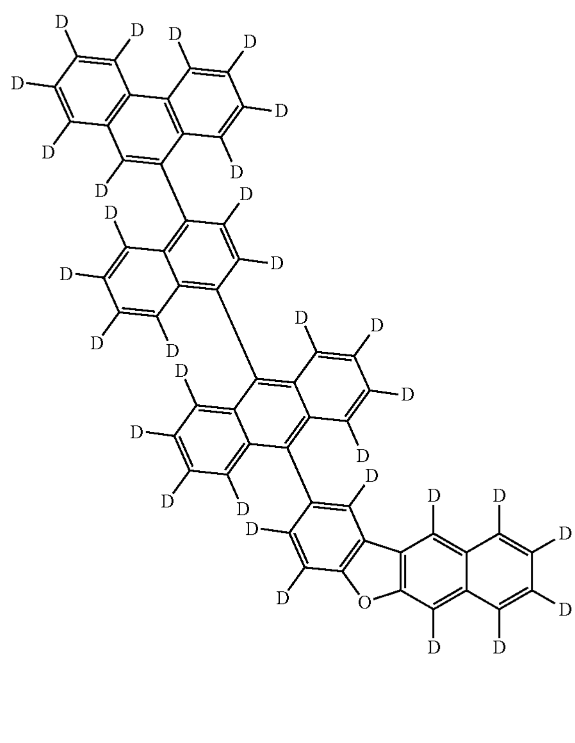

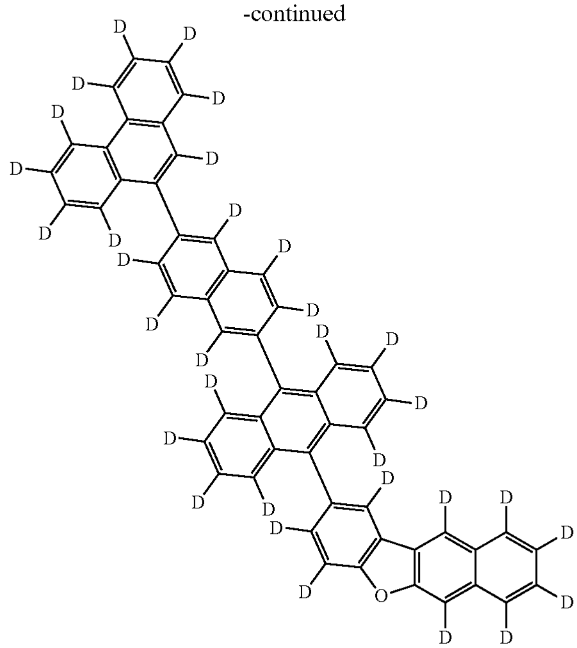
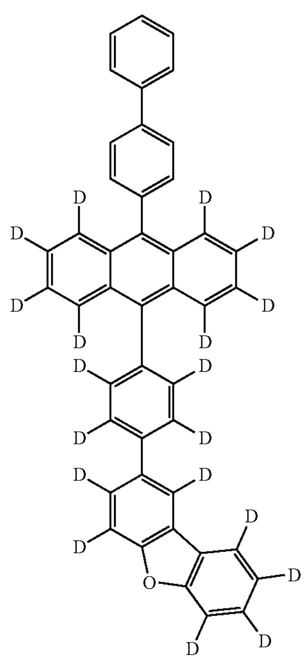
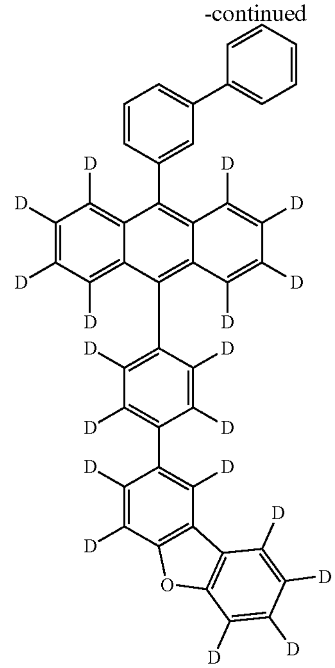
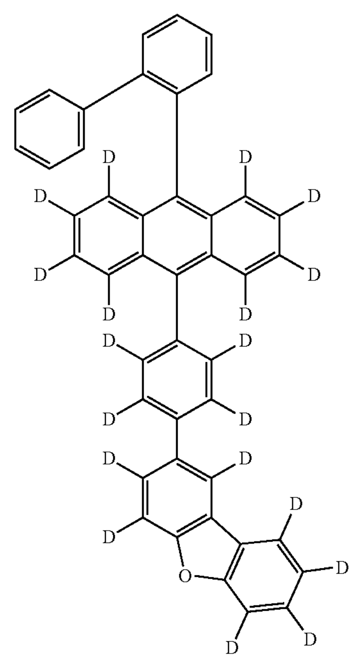

-continued
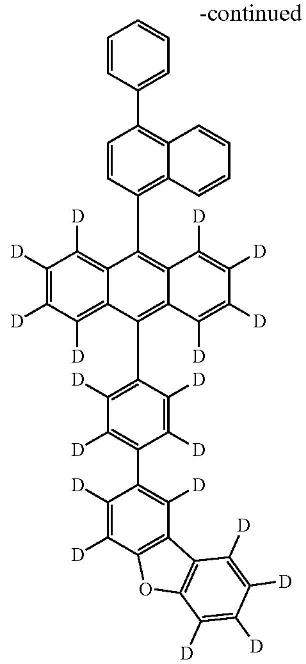
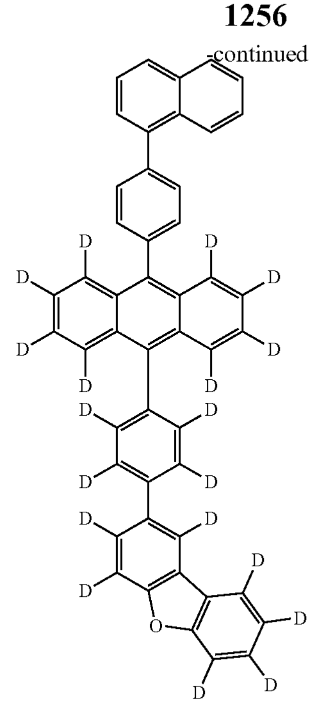
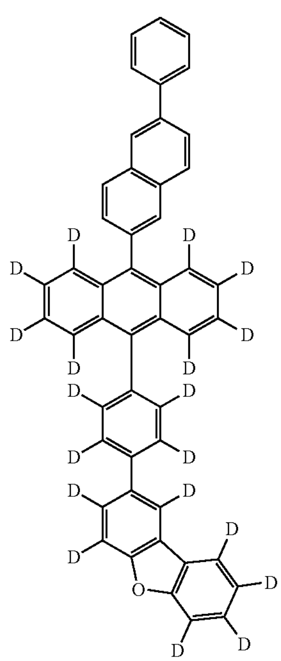
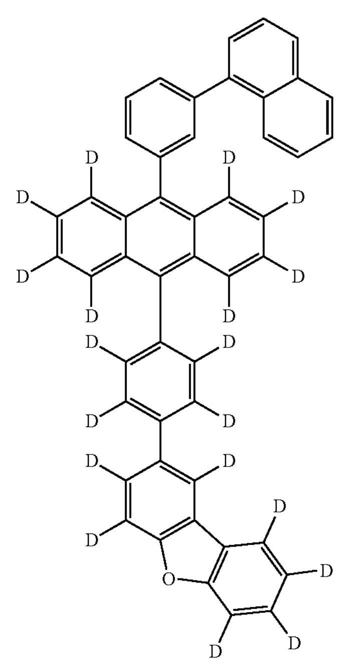

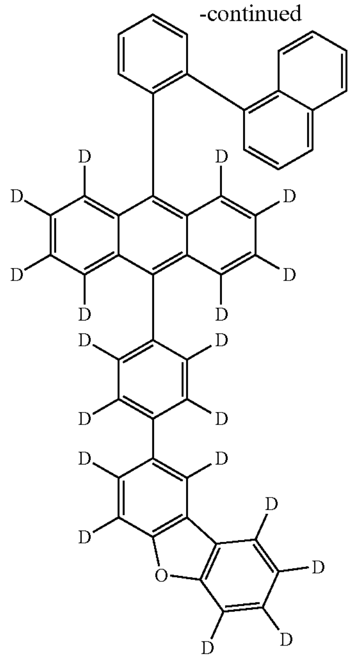
D
D
D
D
D
D
D
D
D
D
D
D
D
D
D
D
D
D
D
O
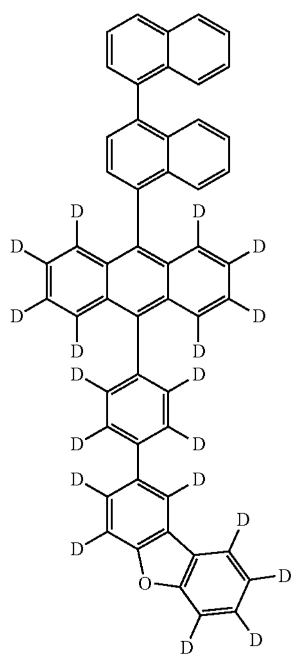
D
D
D
D
D
D
D
D
D
D
D
D
D
D
D
D
D
D
D
O
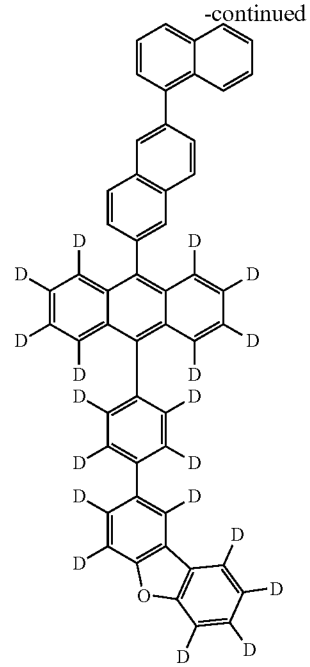
D
D
D
D
D
D
D
D
D
D
D
D
D
D
D
D
D
D
D
O
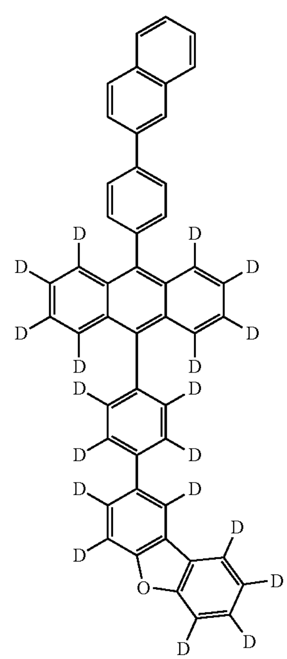
D
D
D
D
D
D
D
D
D
D
D
D
D
D
D
D
D
D
D
O

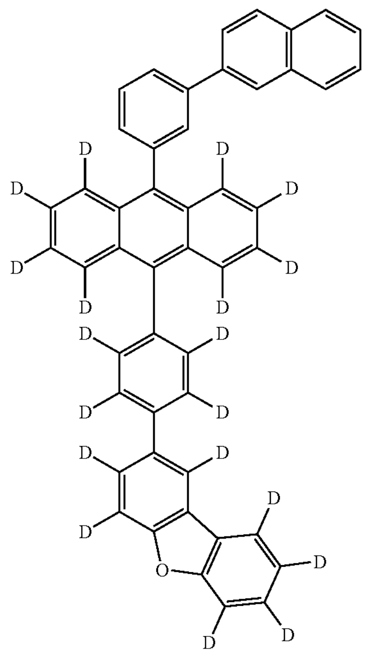
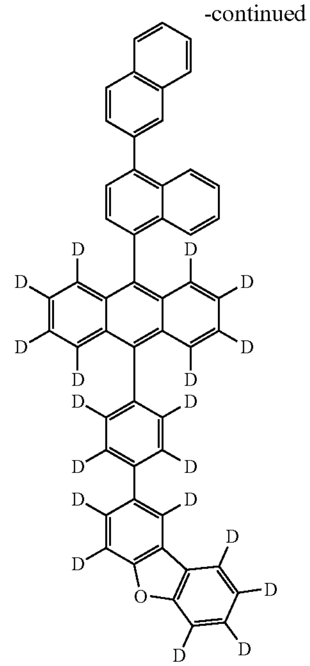
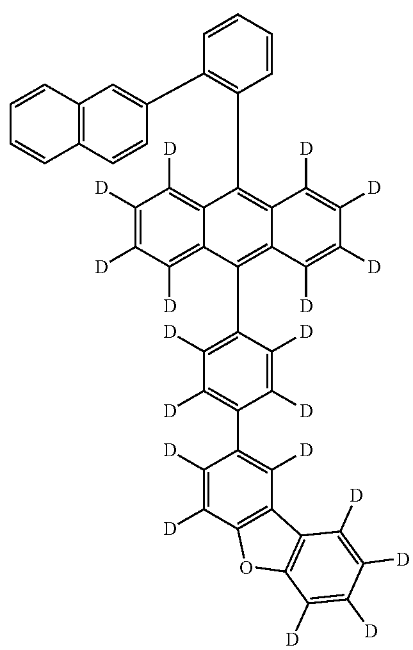
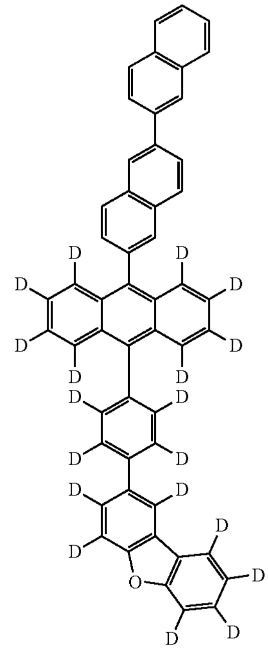

-continued
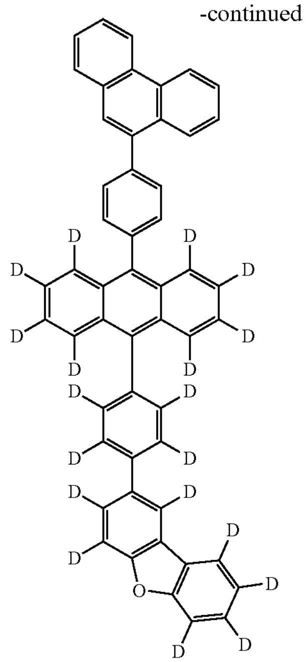
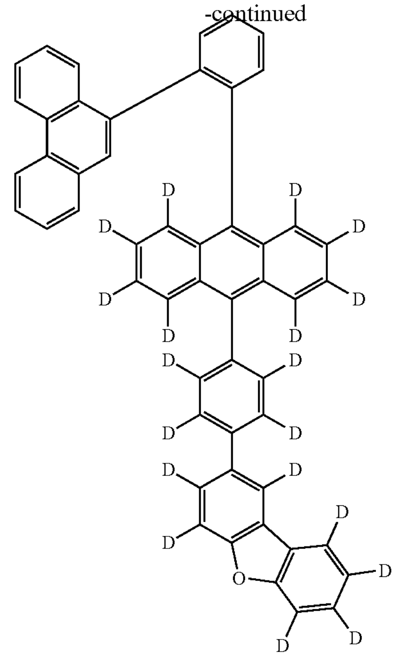
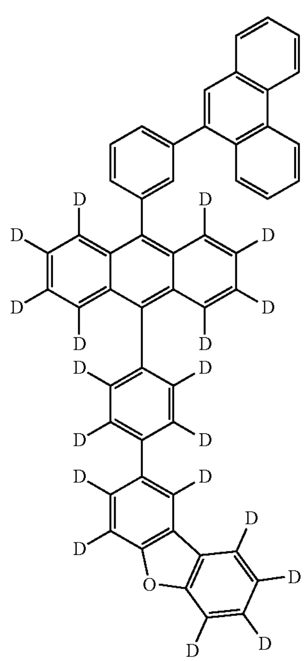
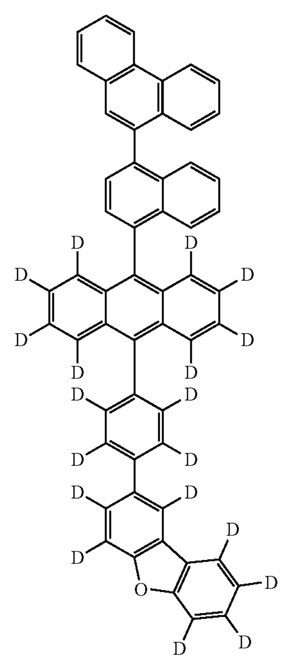

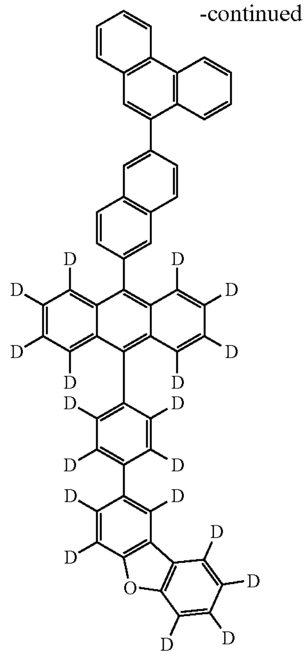
D
D
D
D
D
D
D
D
D
D
D
D
D
D
D
D
O
D
D
D
D
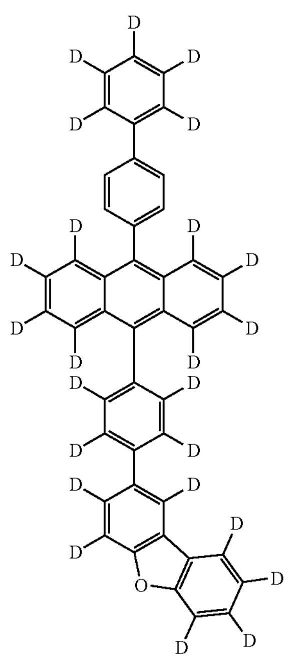
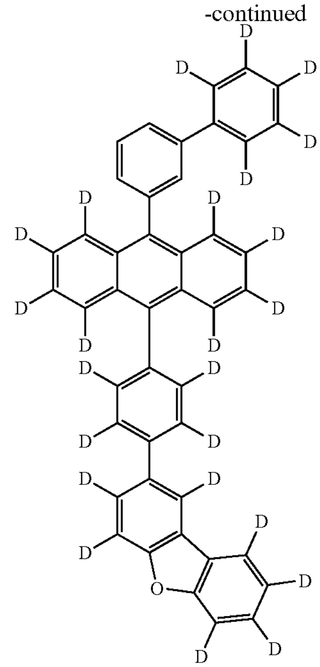
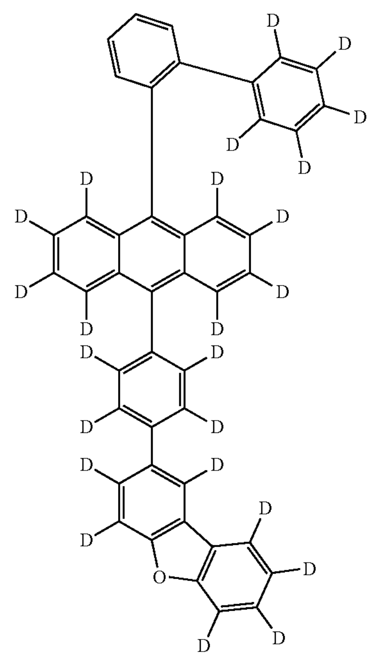

-continued
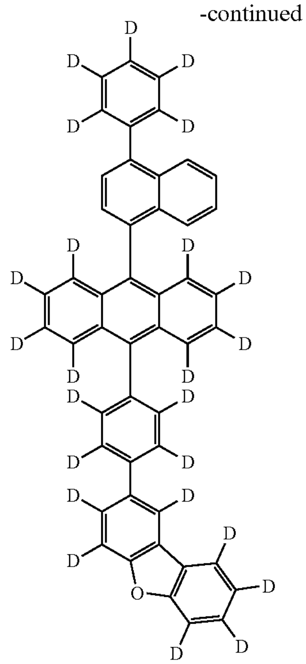
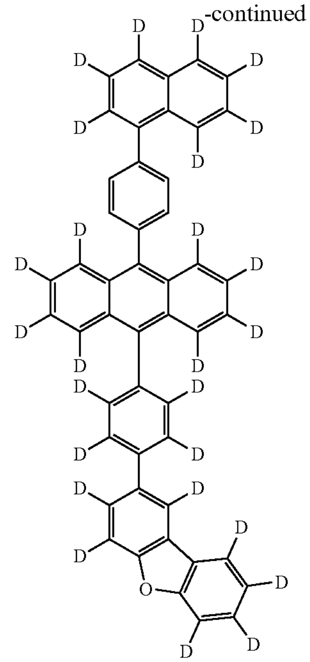
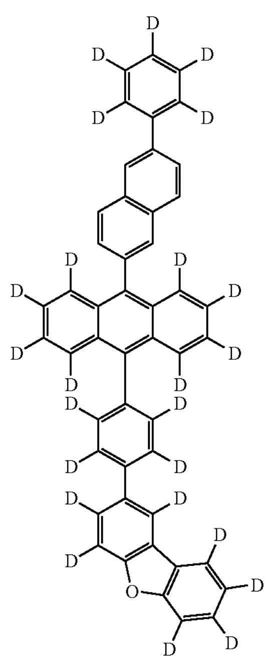
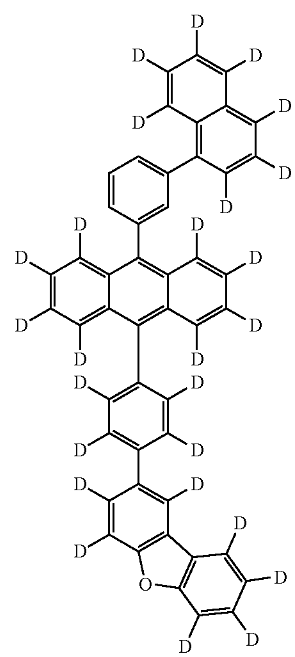

-continued
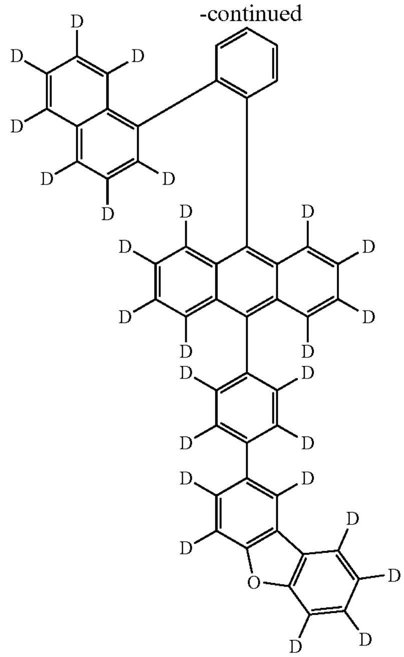
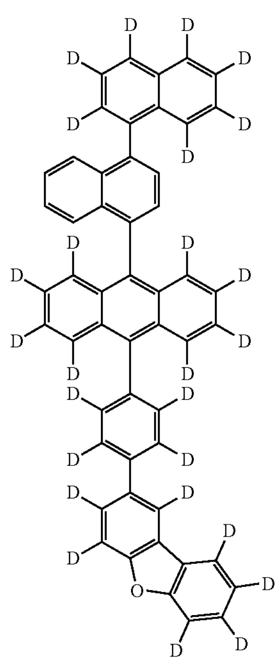
-continued
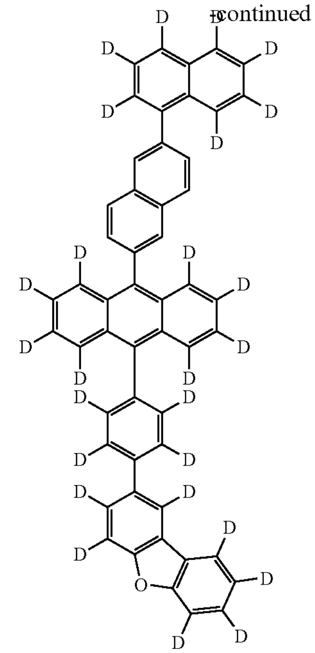
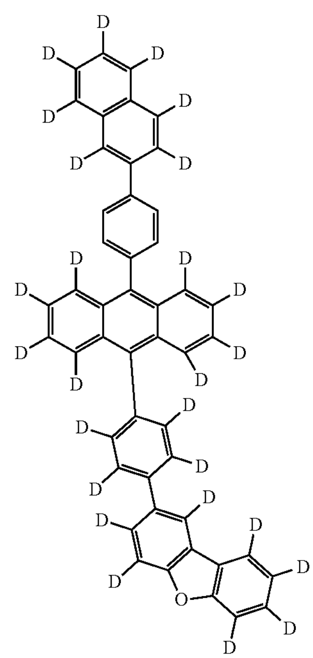

-continued
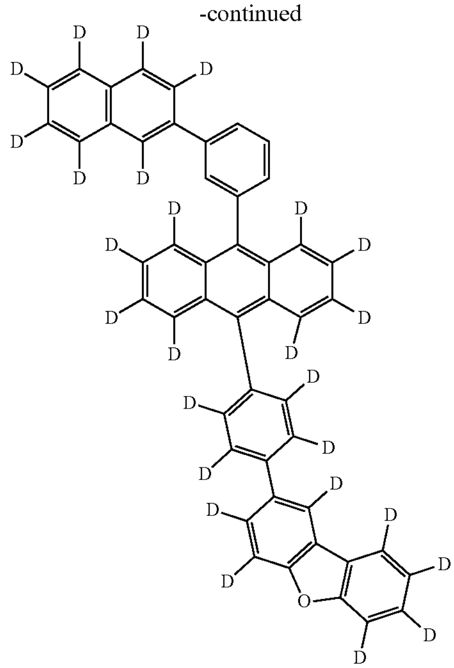
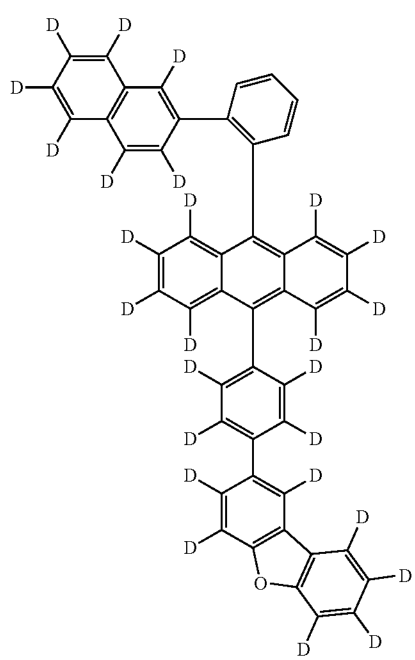
-continued
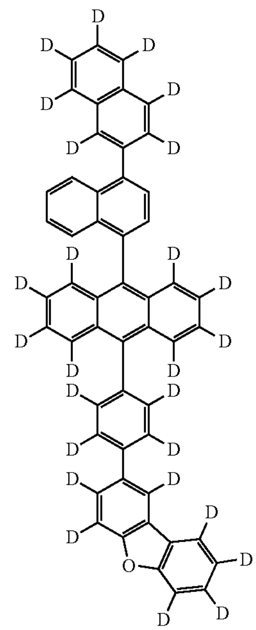
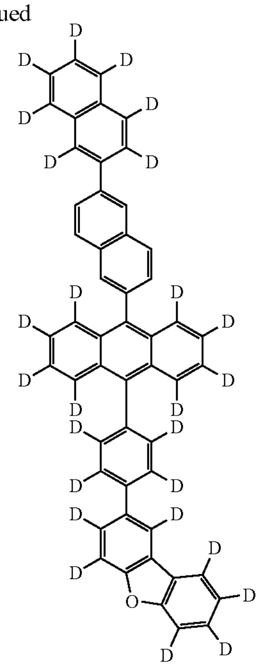
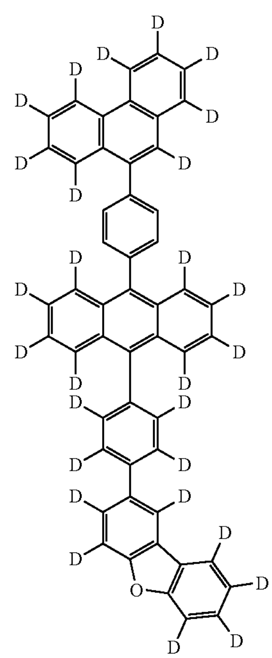

-continued
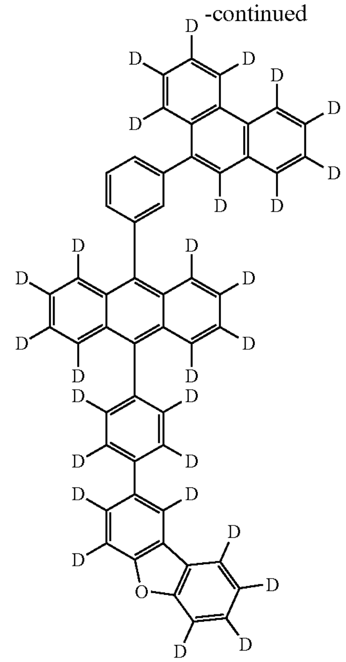
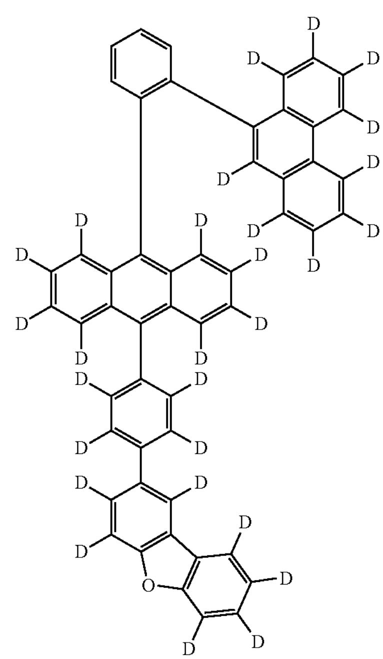
-continued
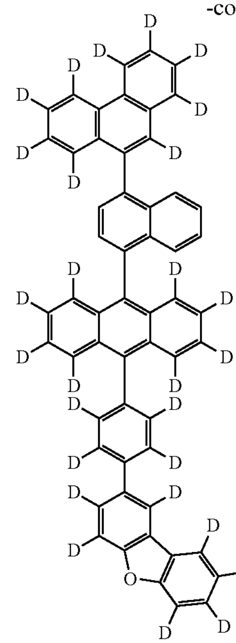
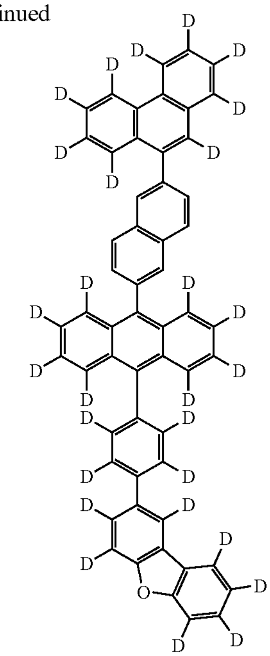
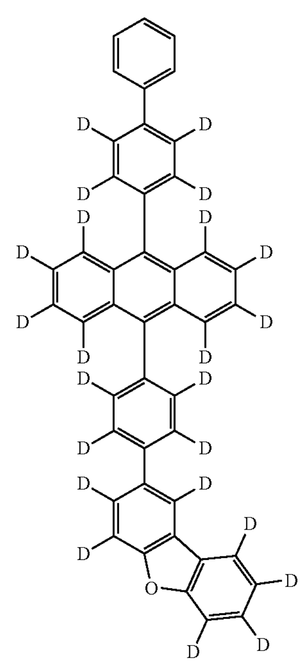

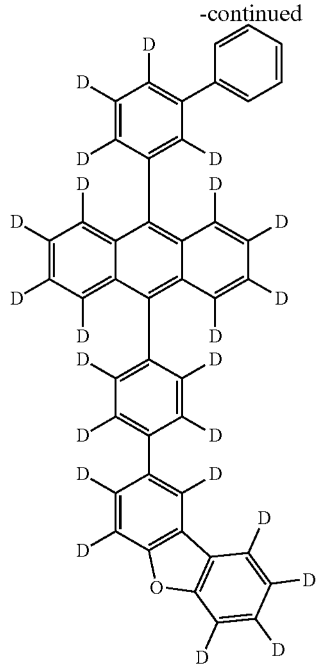
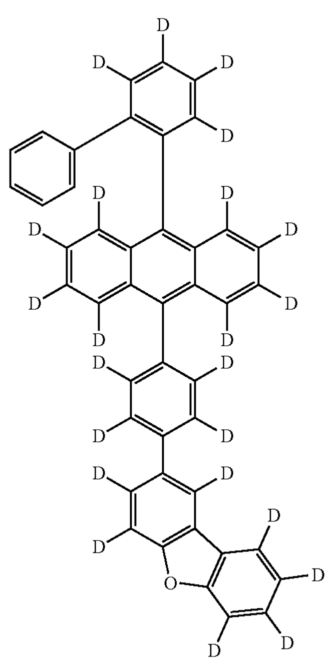
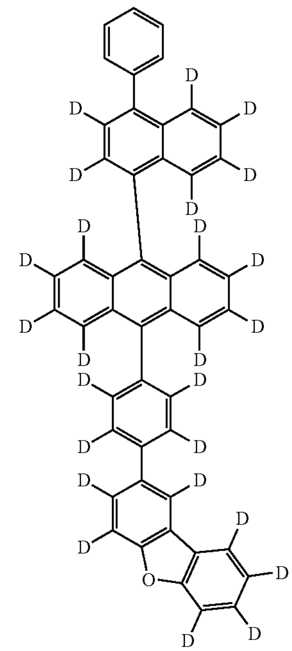
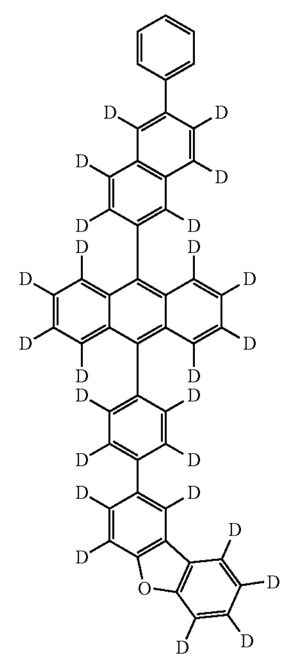

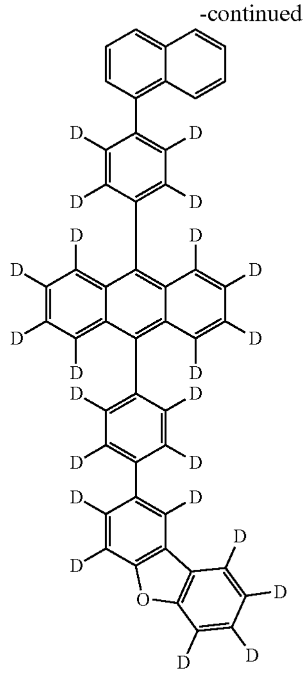
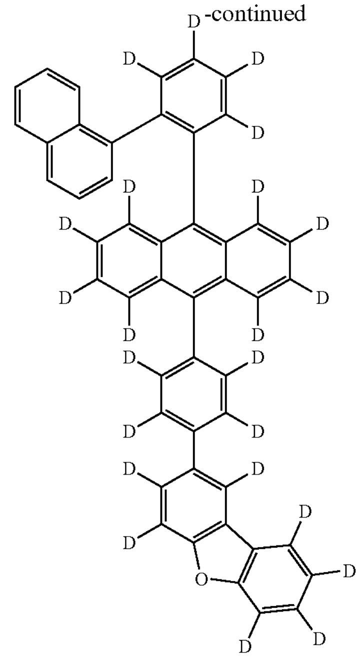
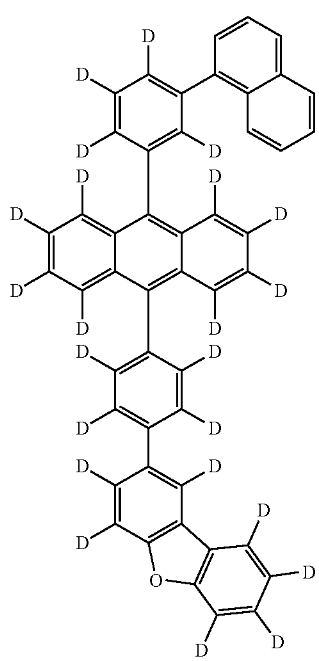
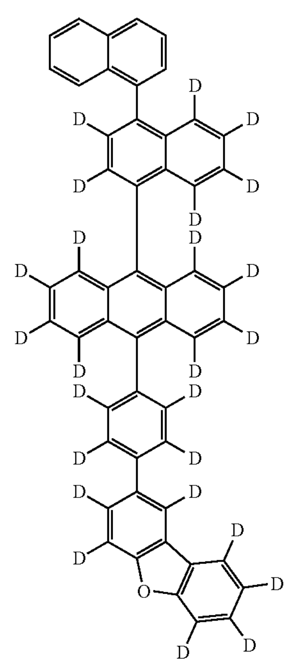

-continued
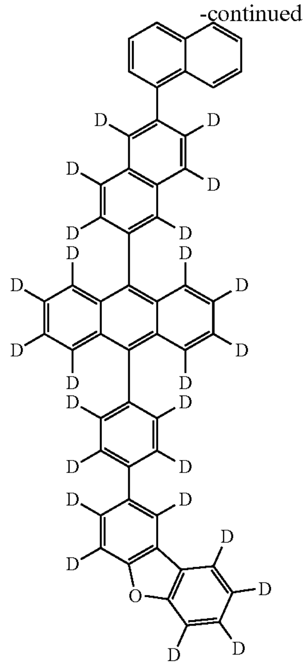
-continued
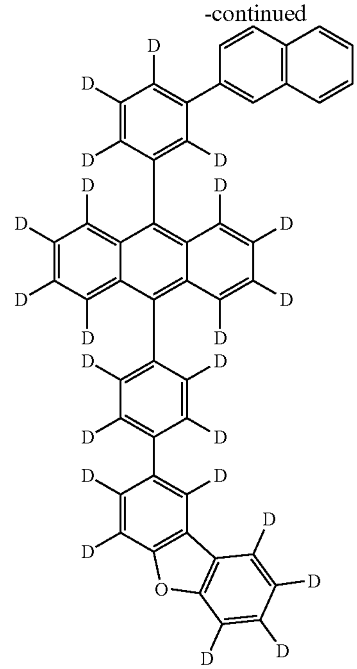
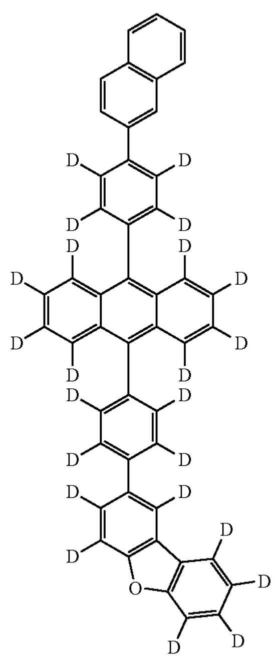
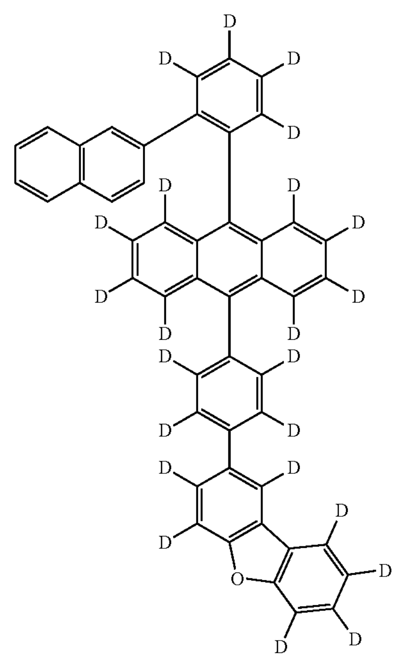

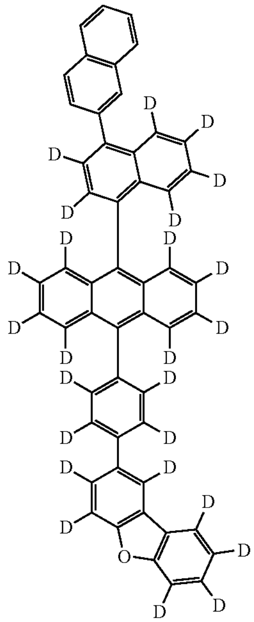
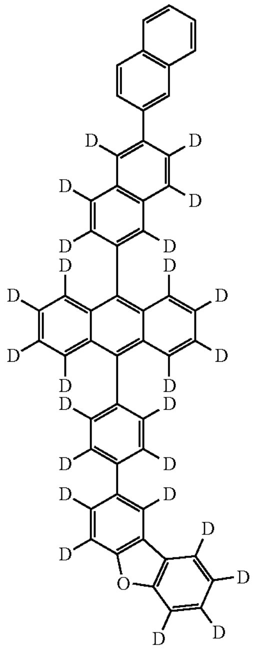
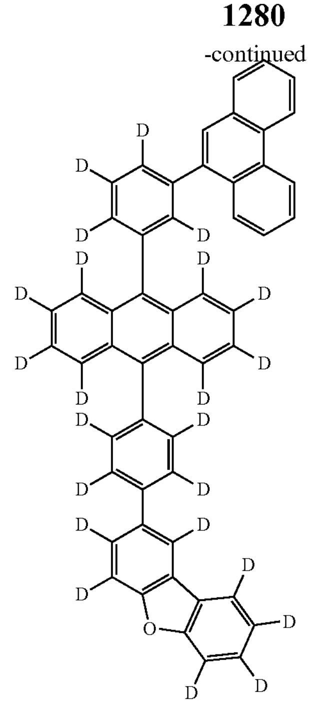
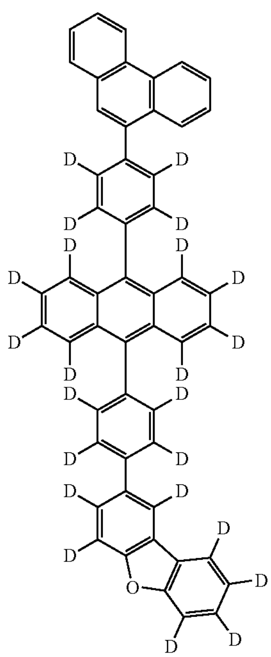
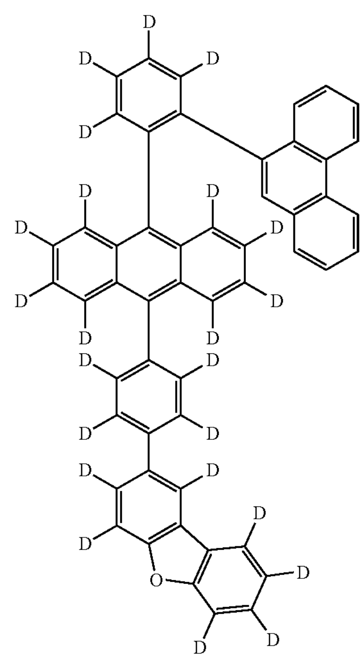

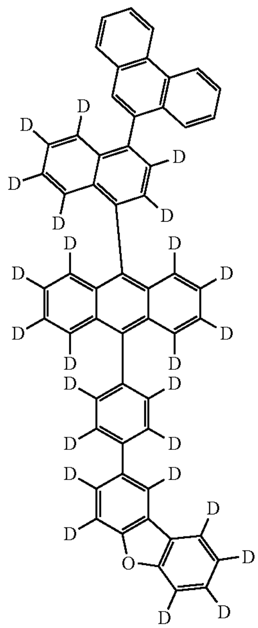
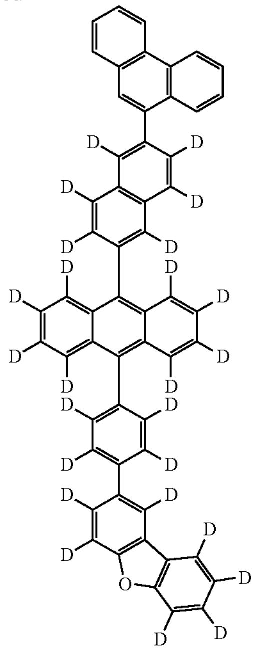
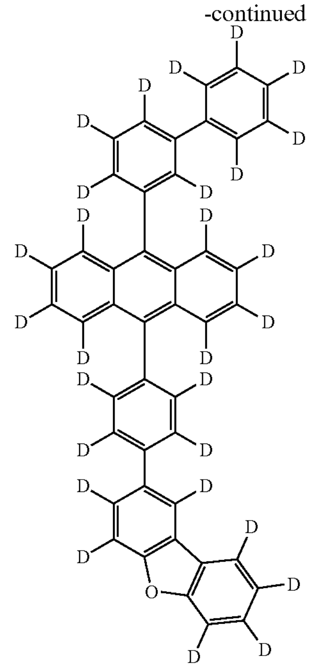
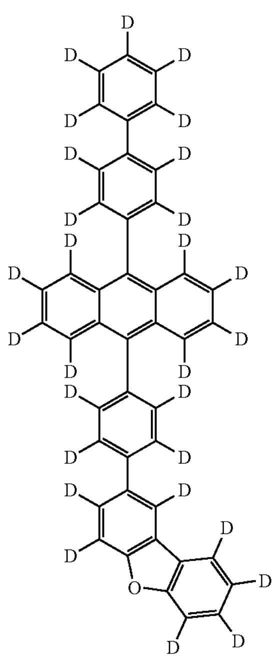
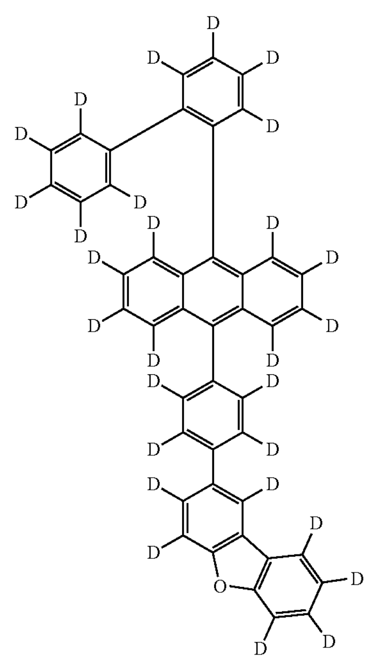

-continued
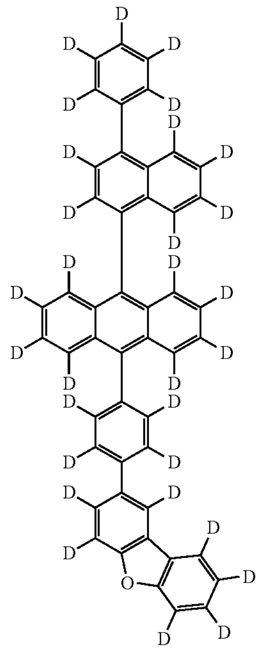
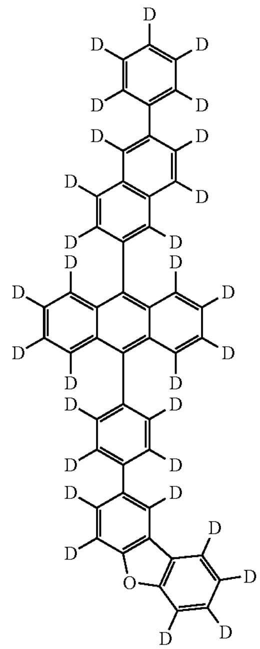
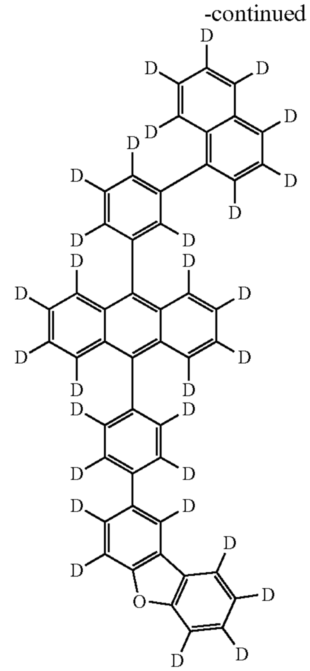
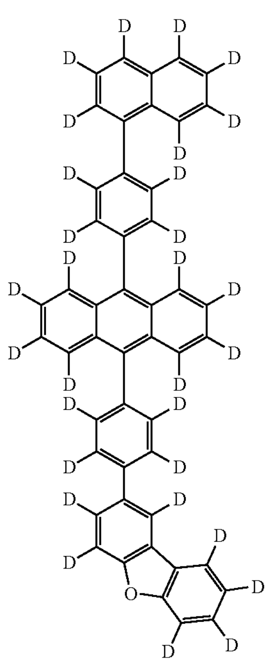
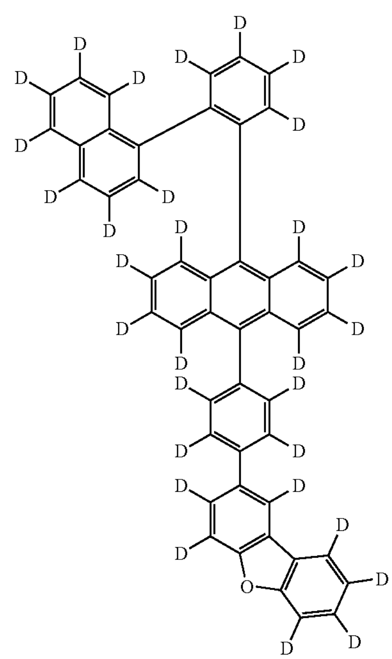

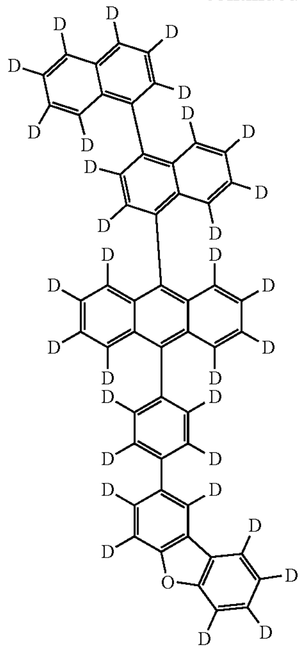
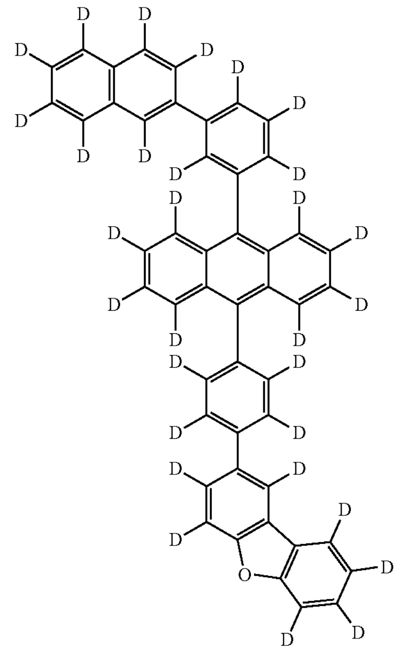
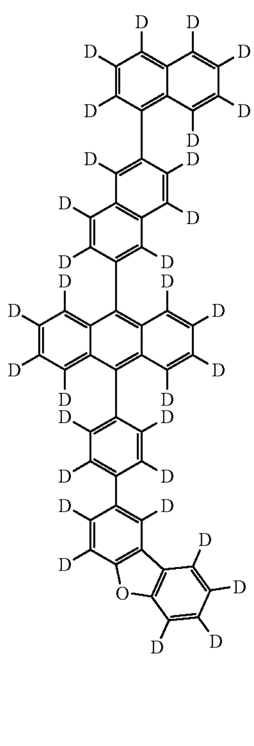
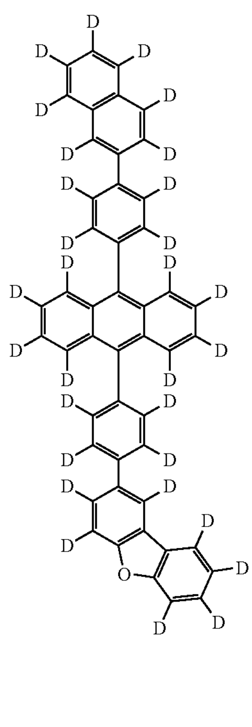
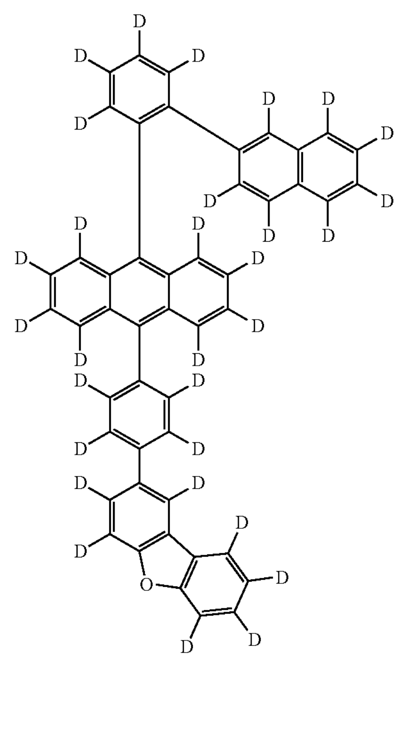

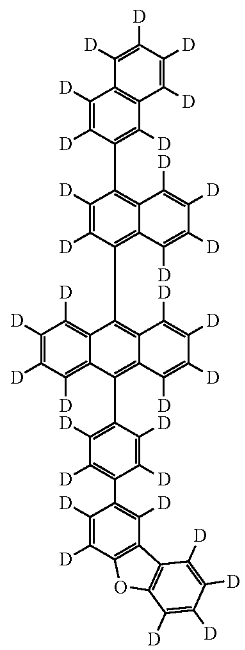
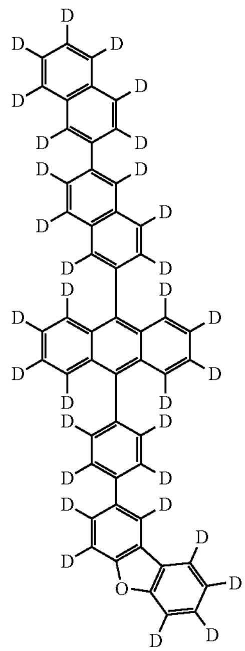
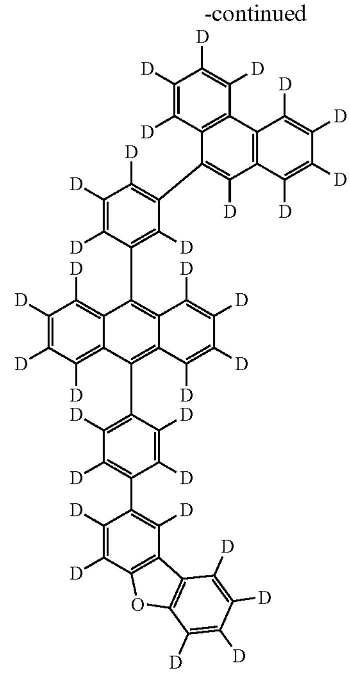
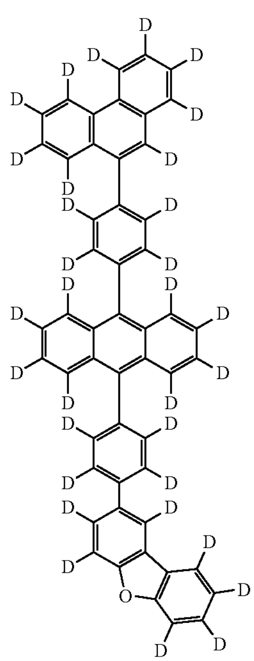
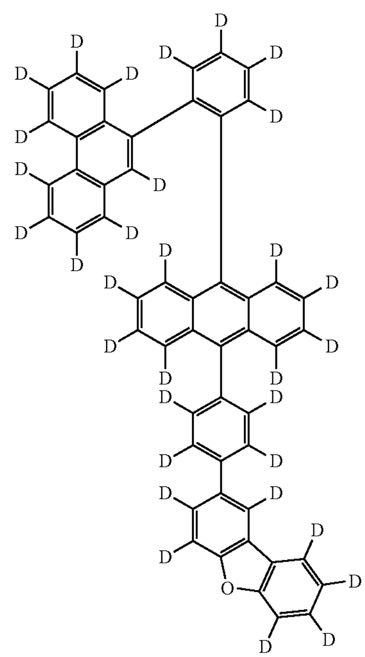

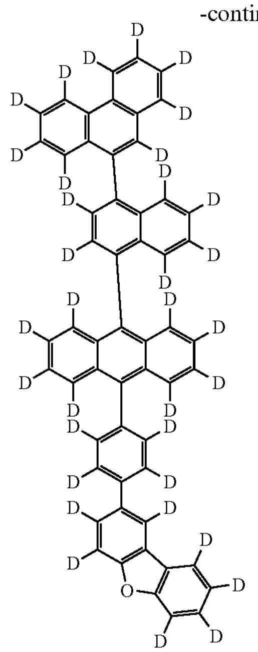
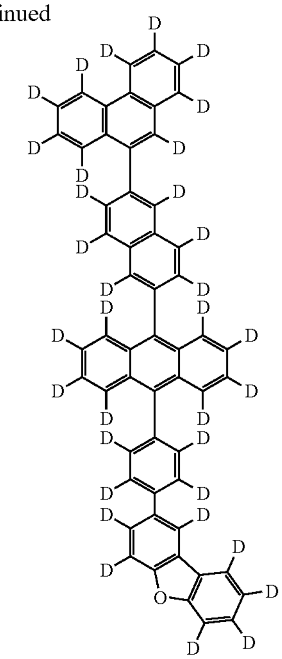
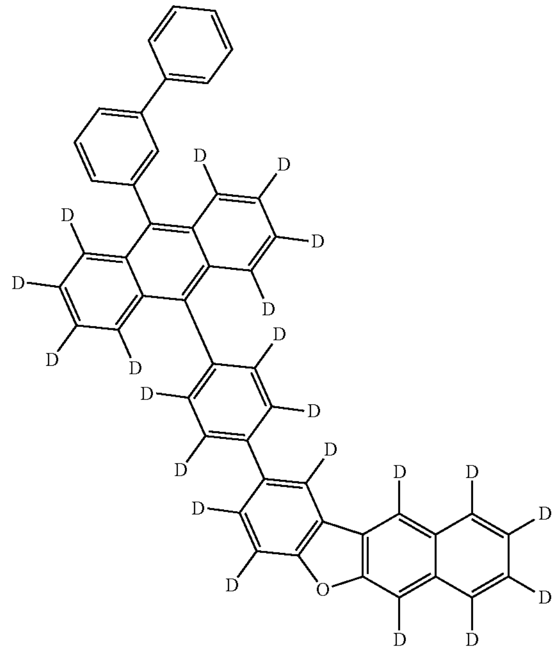
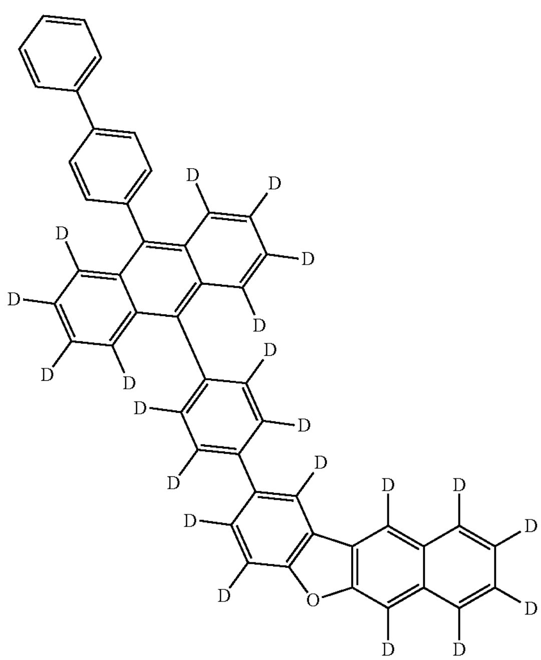
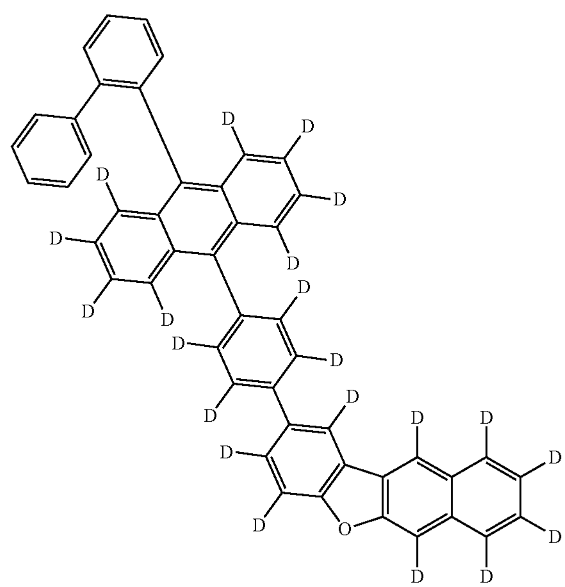

-continued
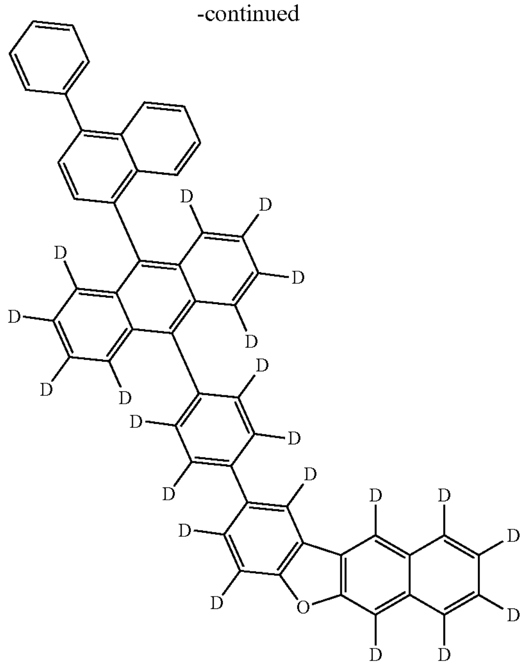
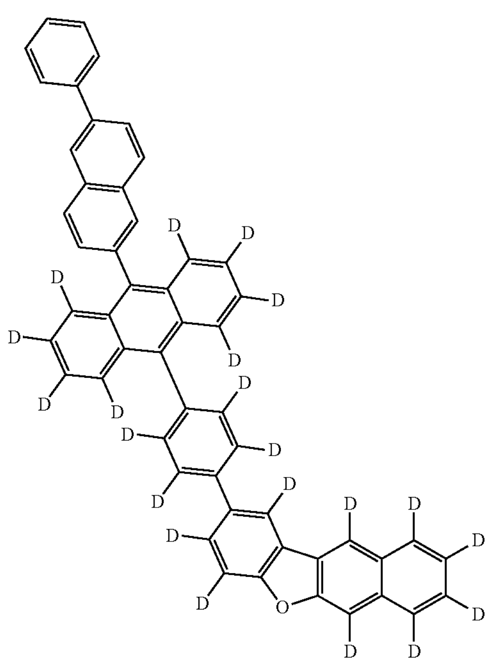
-continued
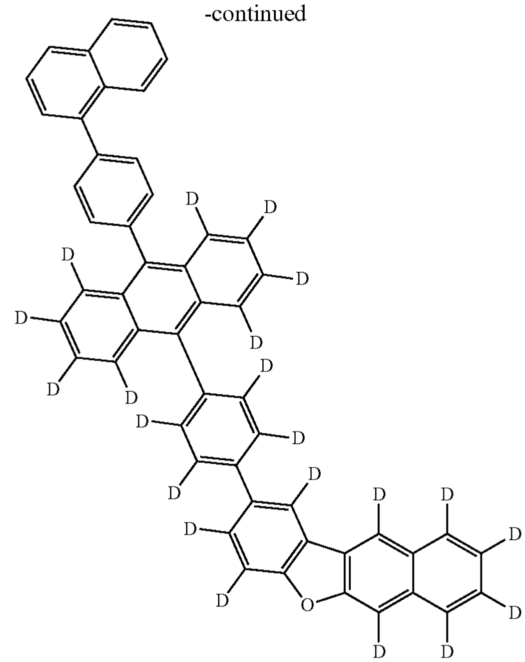
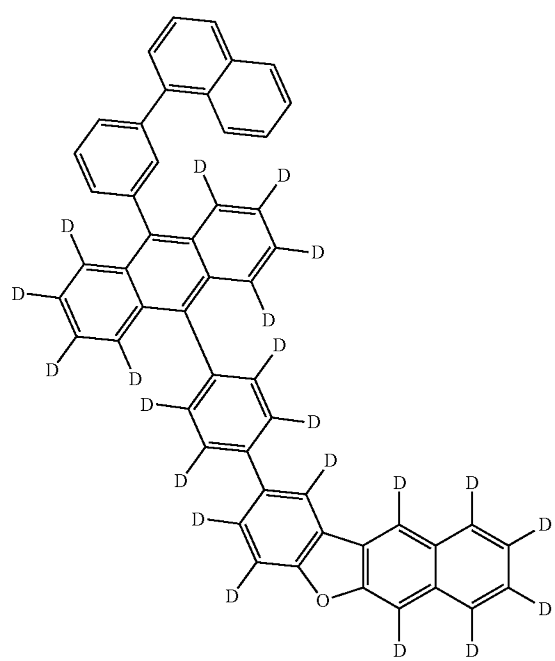

-continued
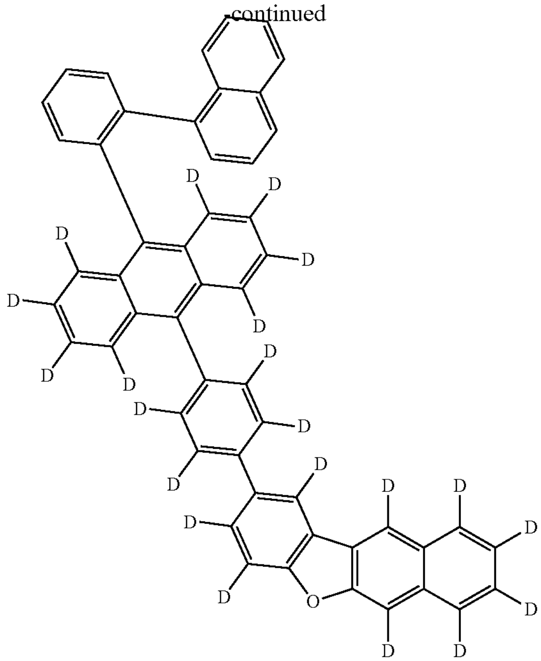
-continued
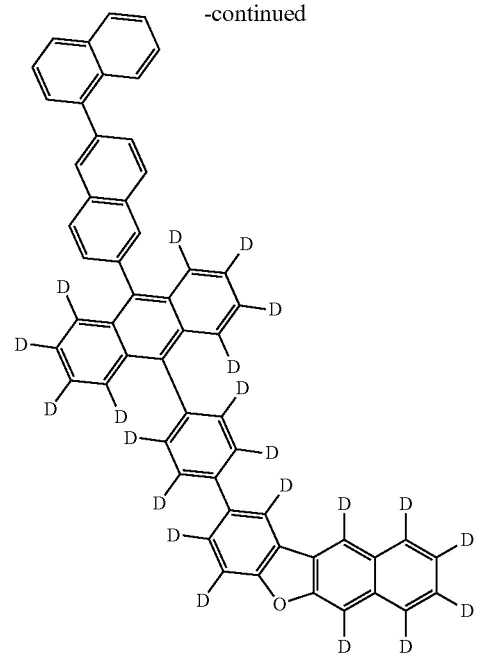
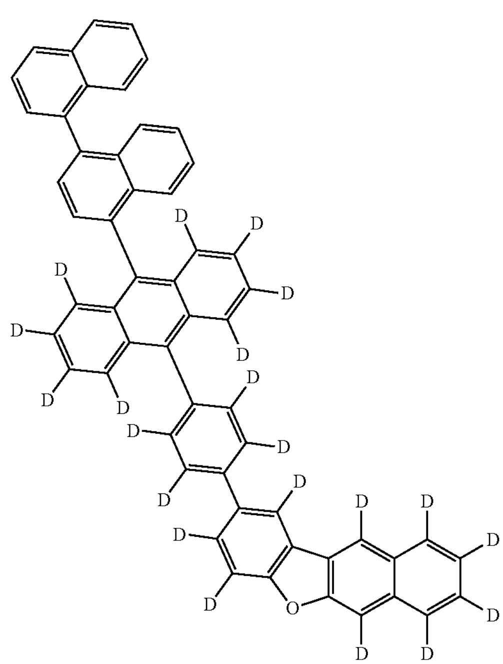
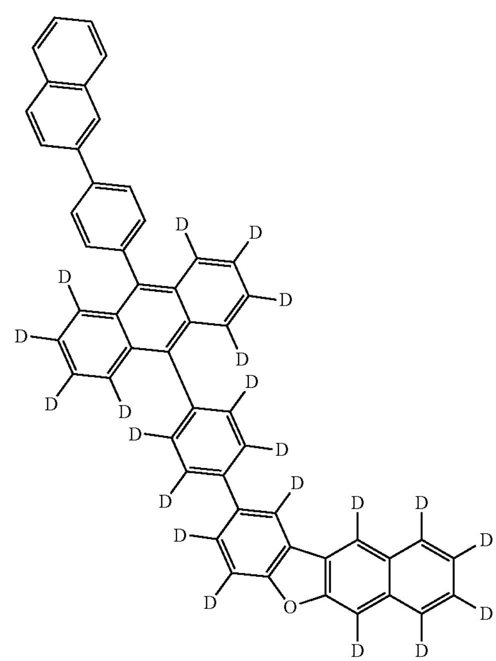

-continued
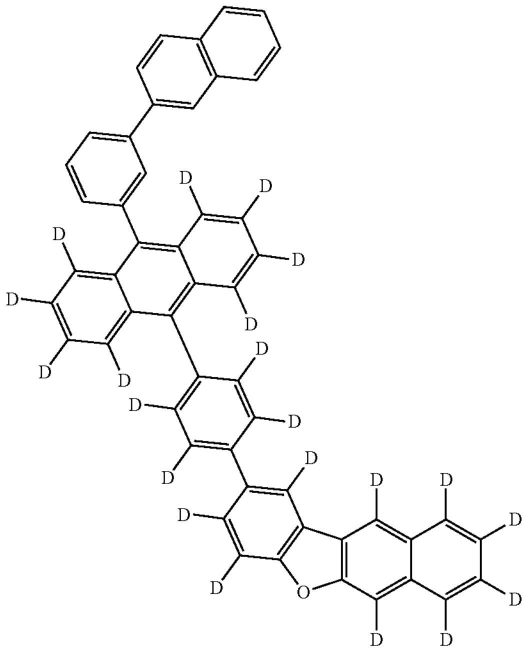
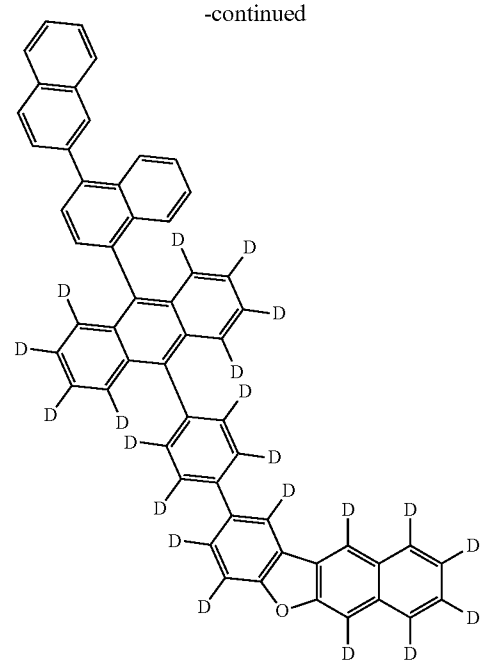
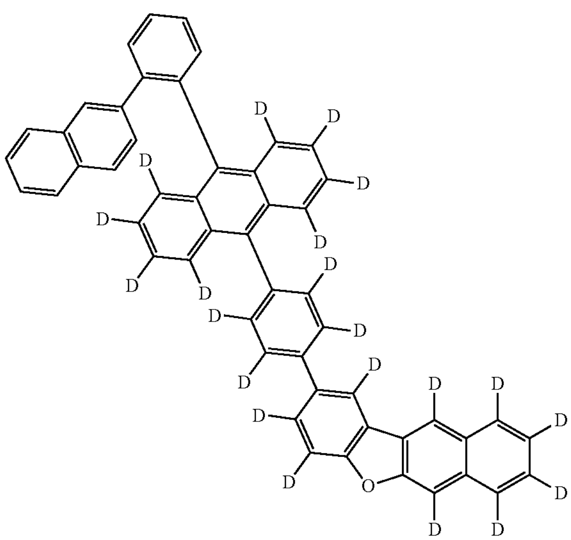
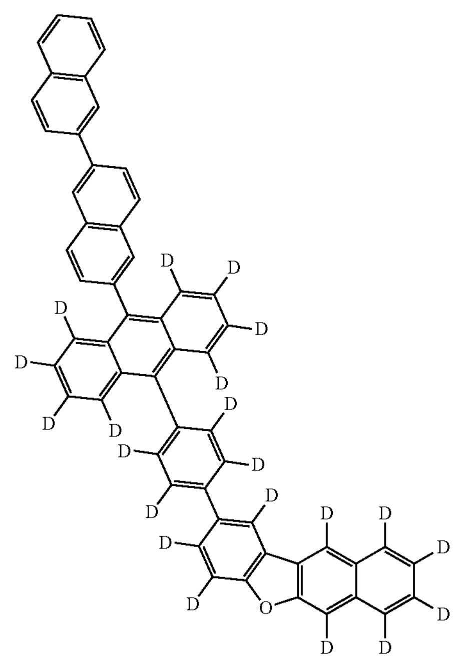

-continued
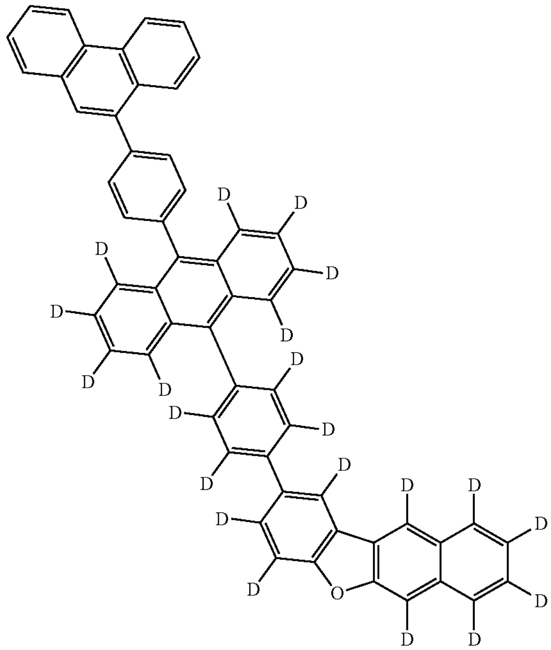
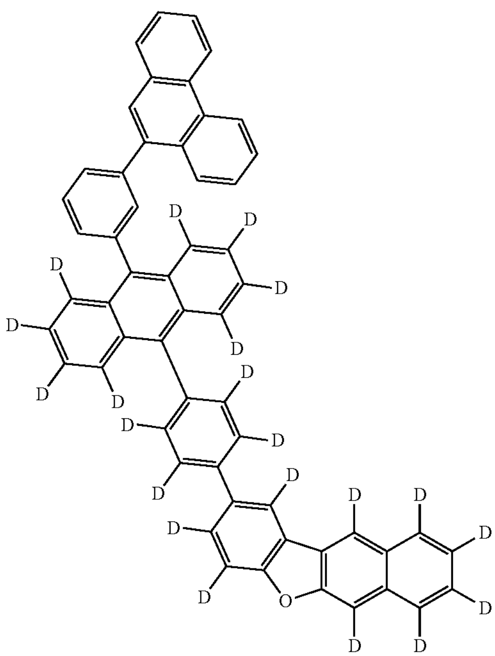
-continued
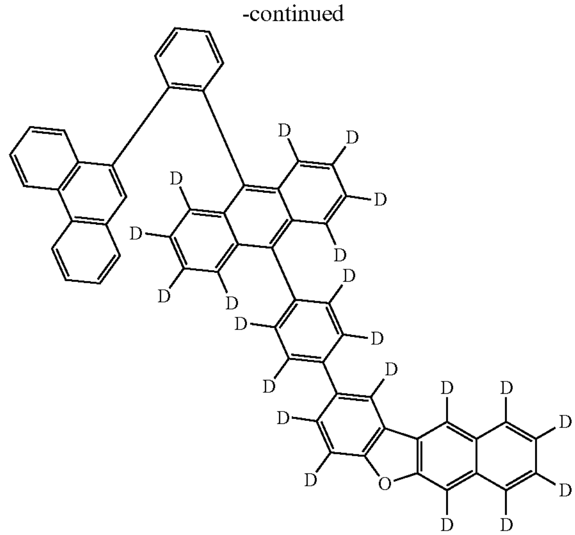
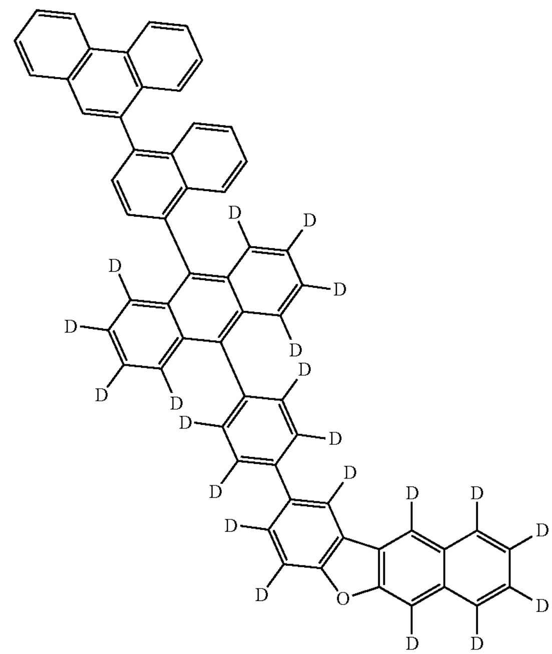

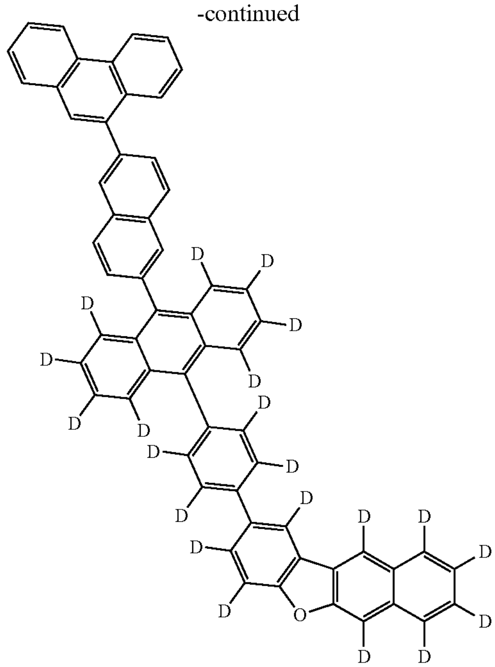
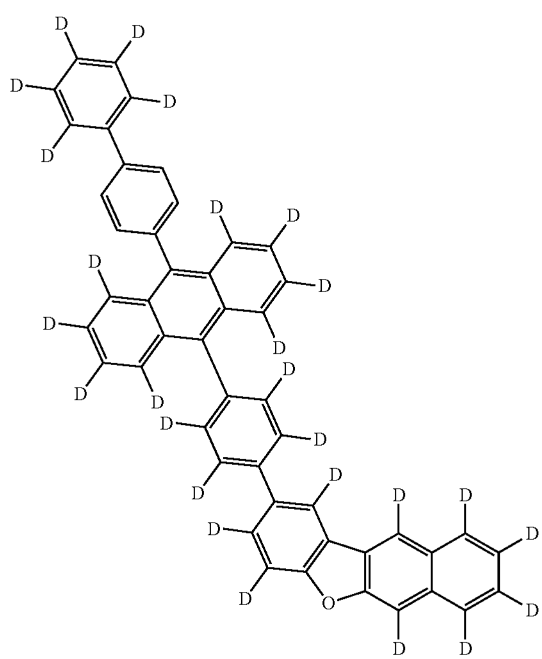
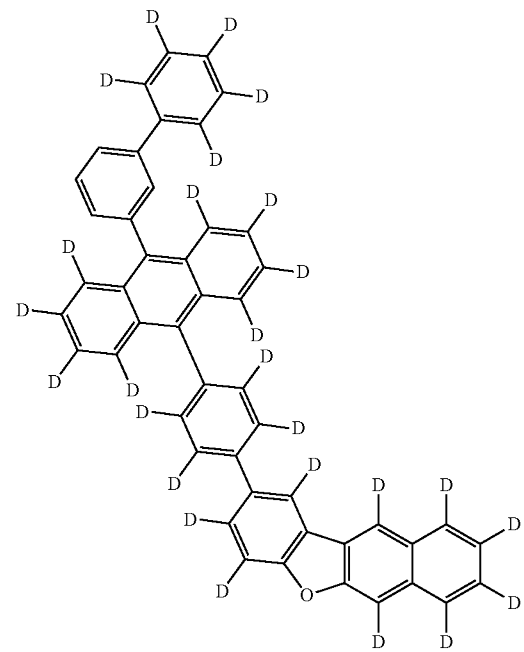
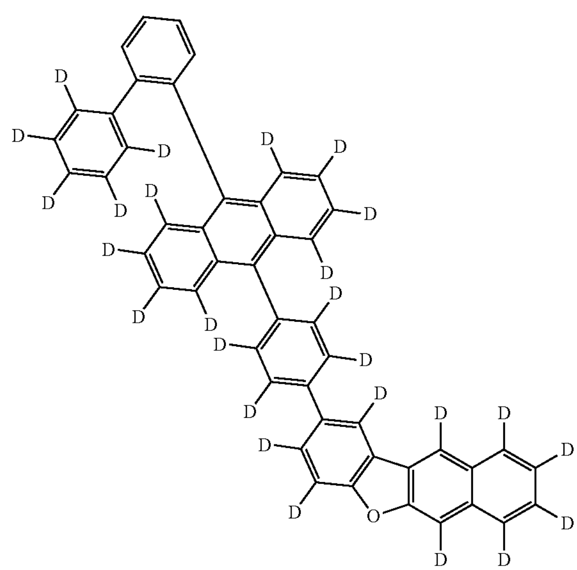

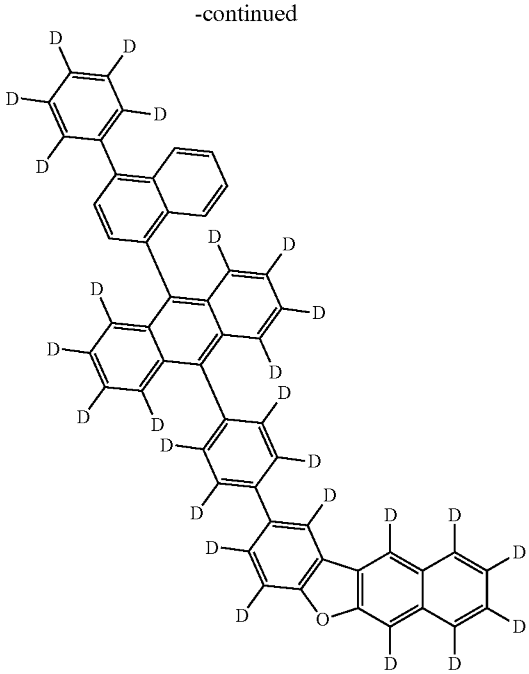
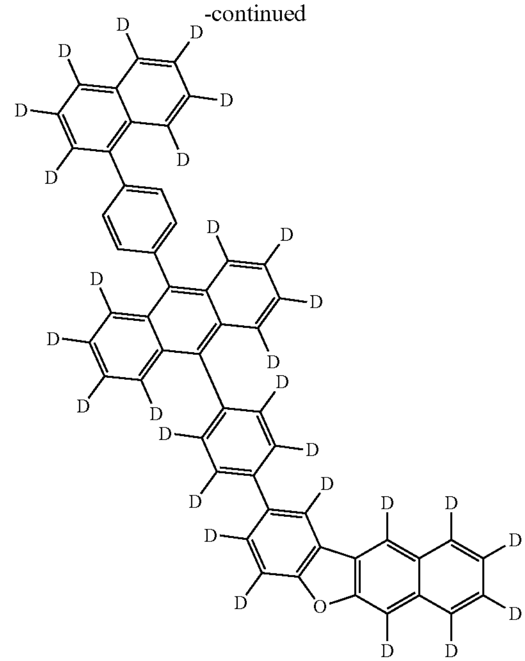
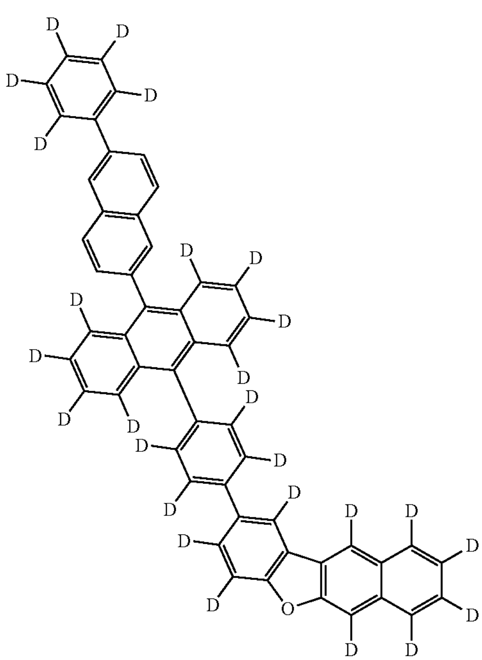
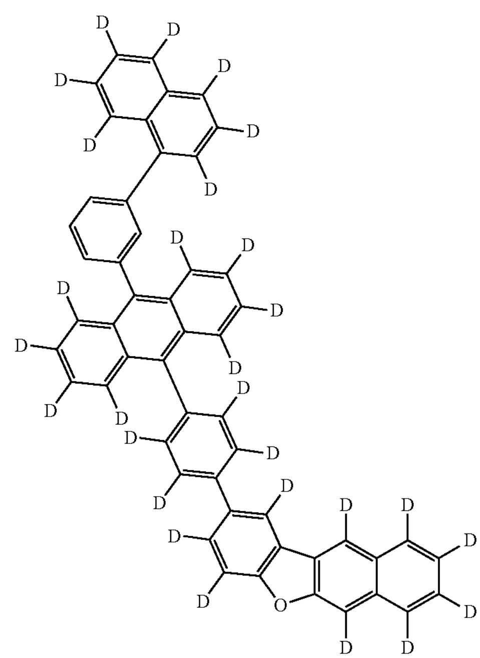

-continued
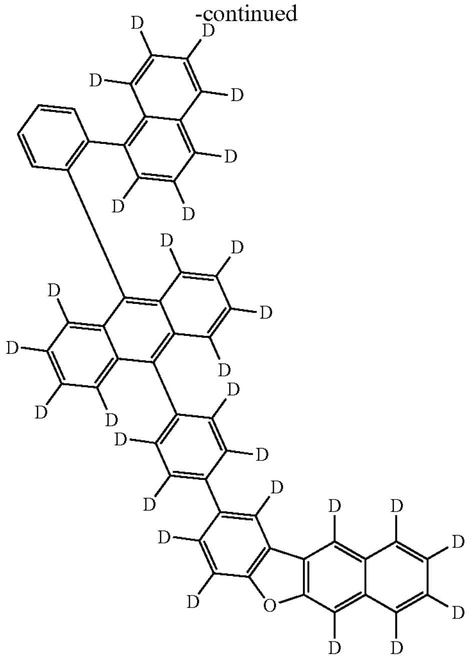
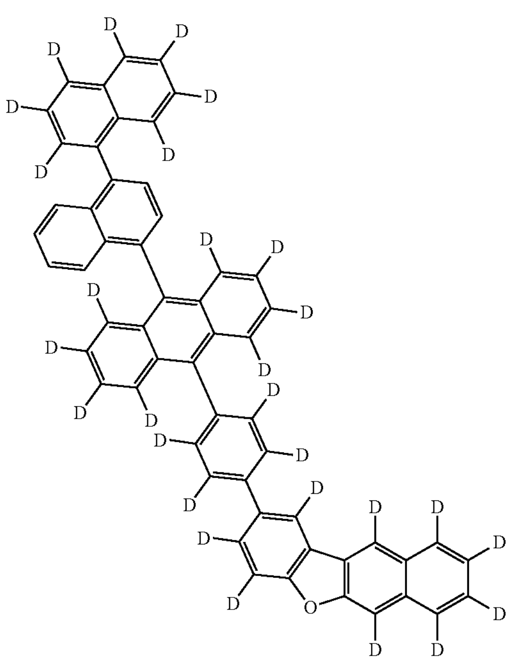
-continued
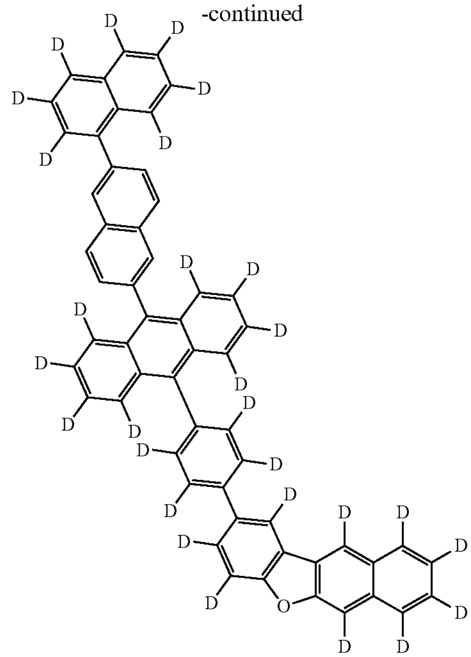
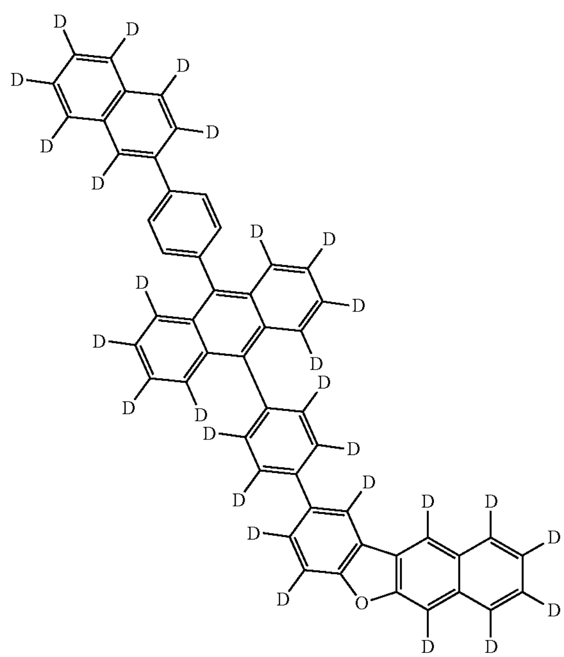

-continued
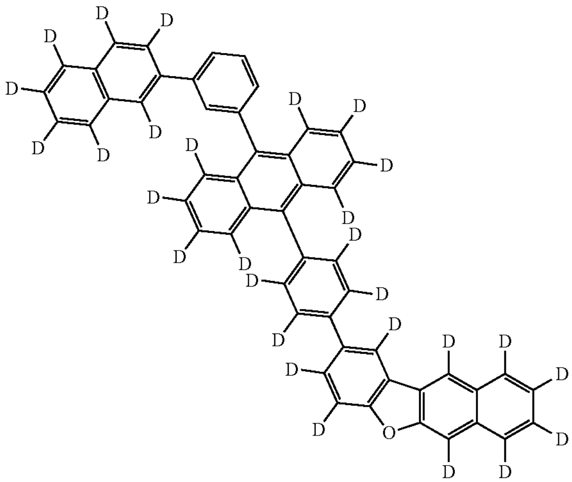
-continued
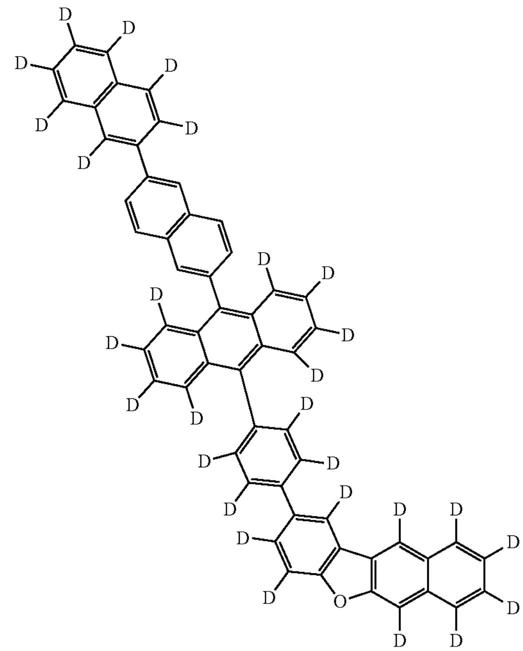
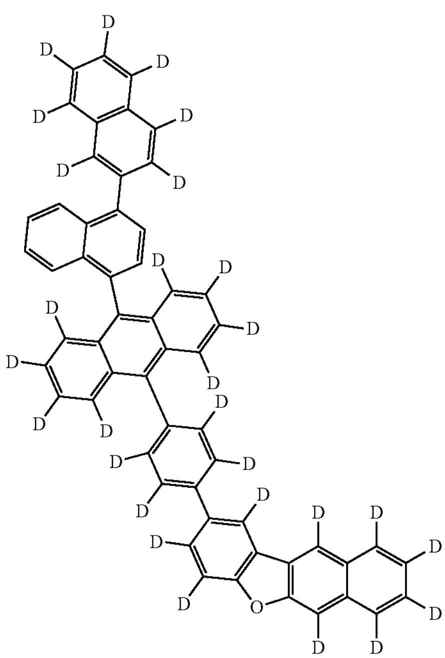
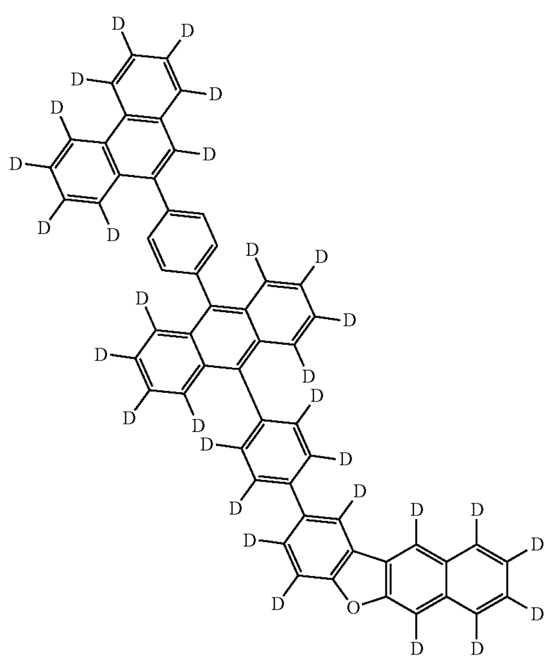

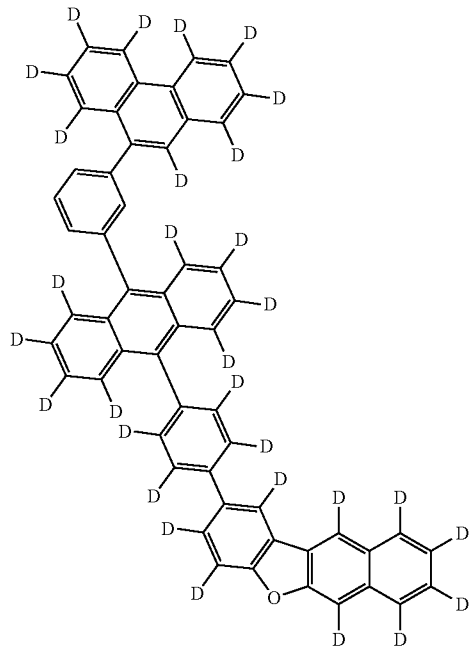
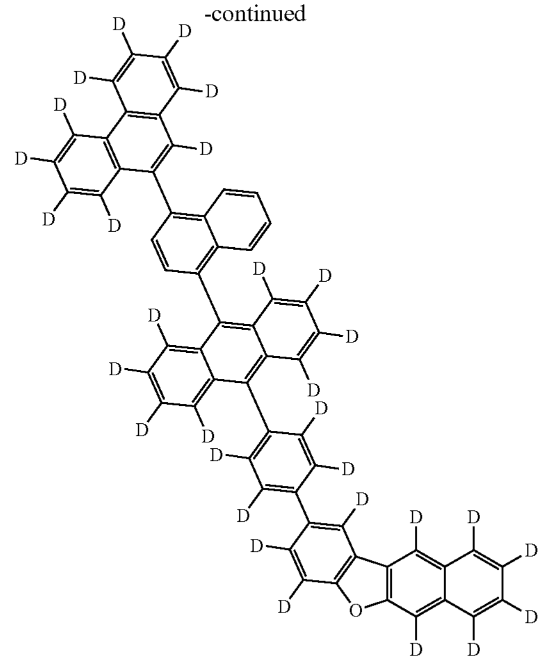
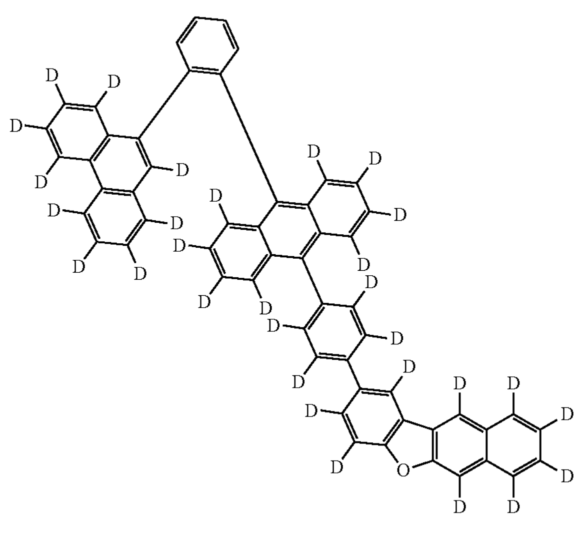
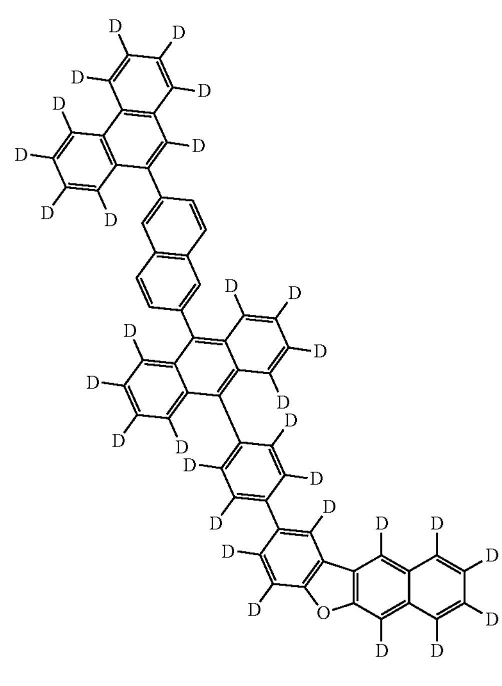

-continued
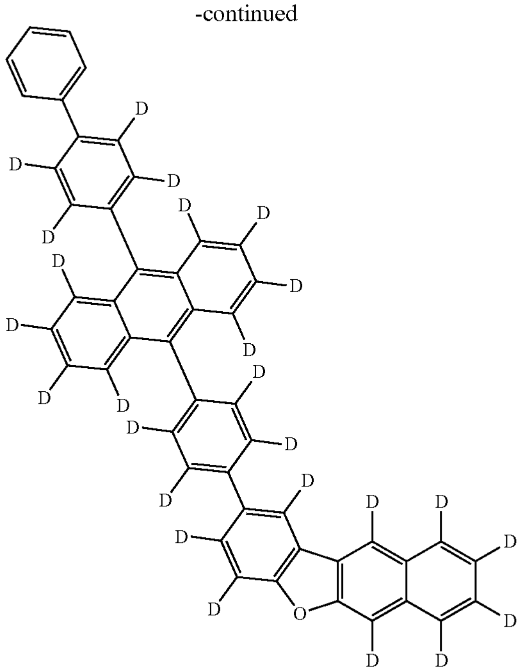
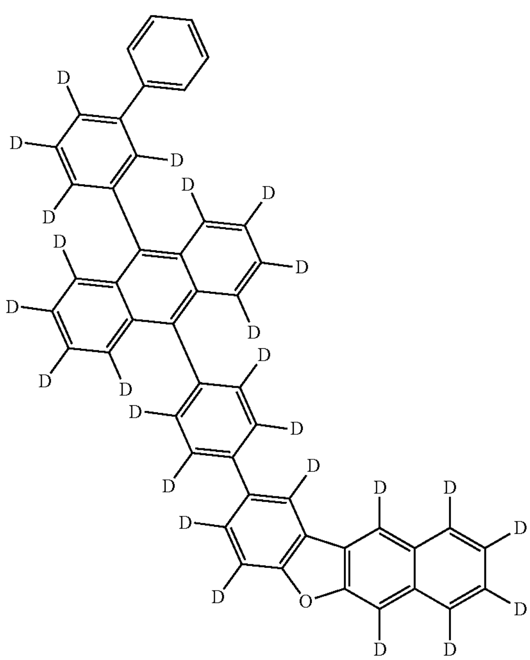
-continued
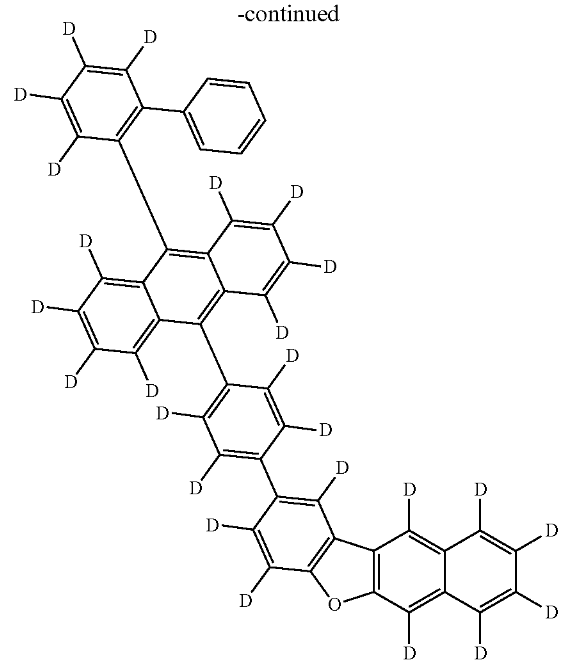
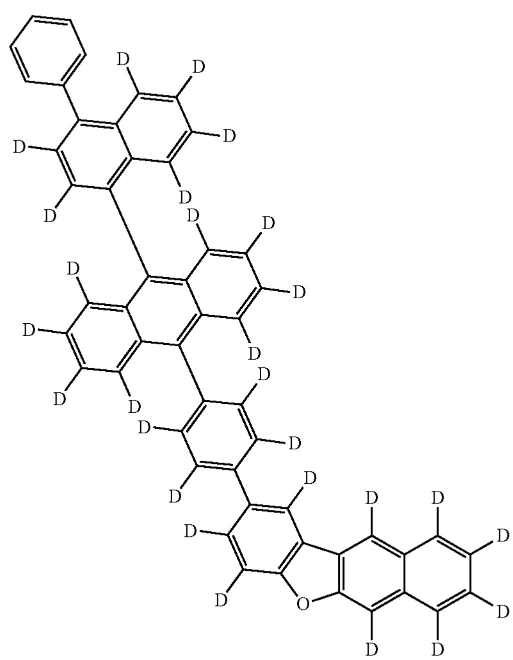

-continued
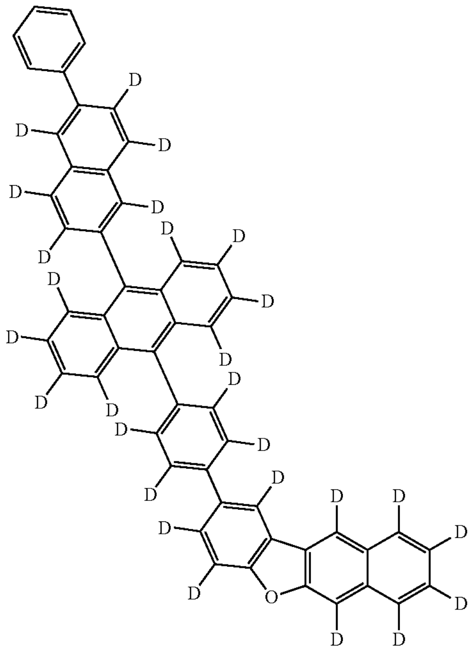
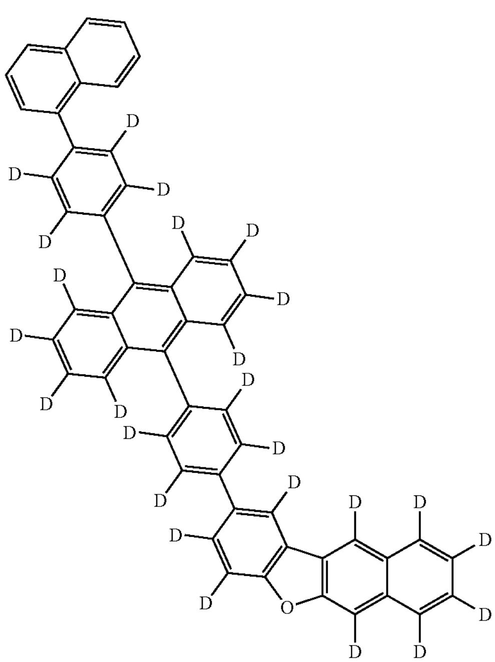
-continued
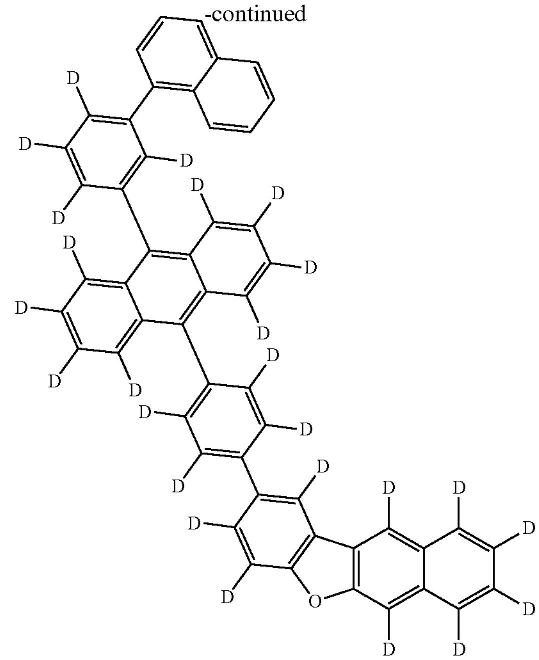
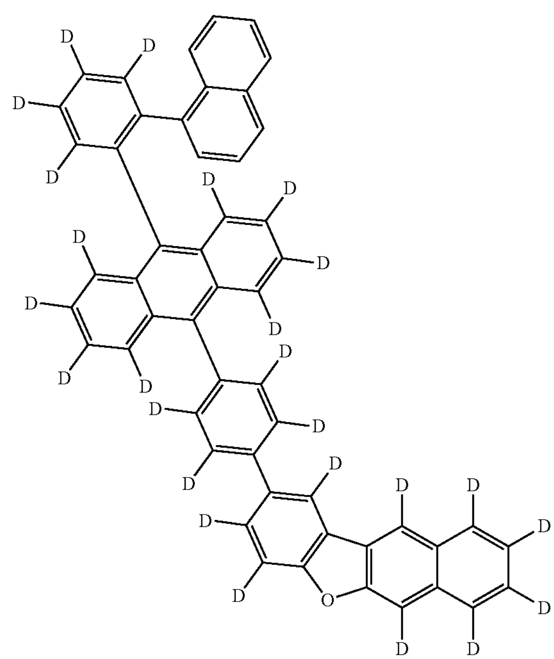

-continued
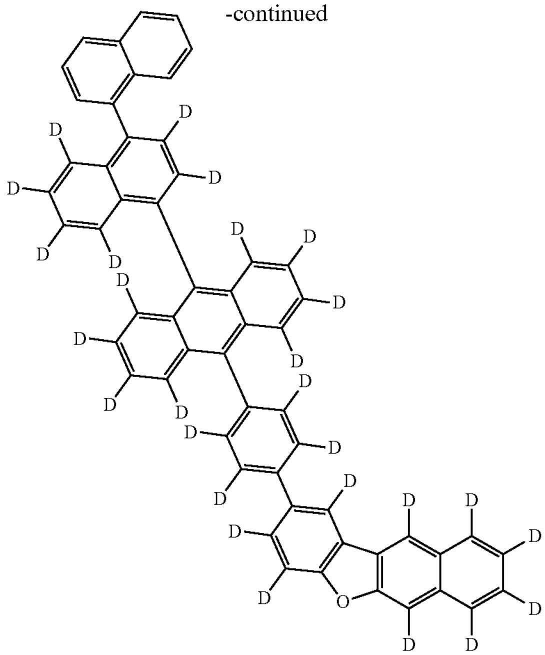
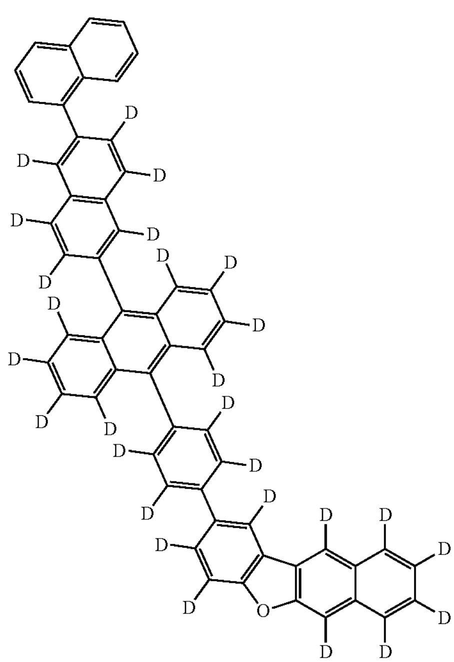
-continued
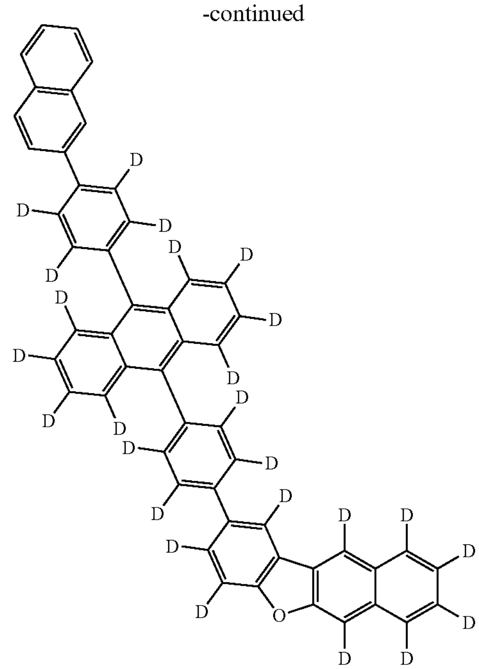
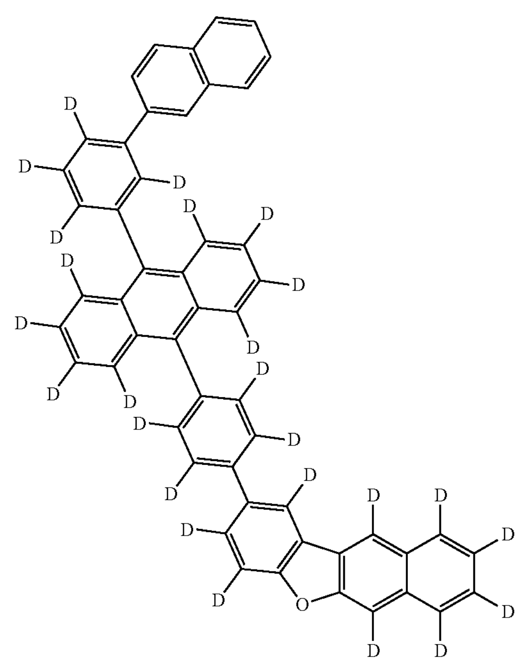

-continued
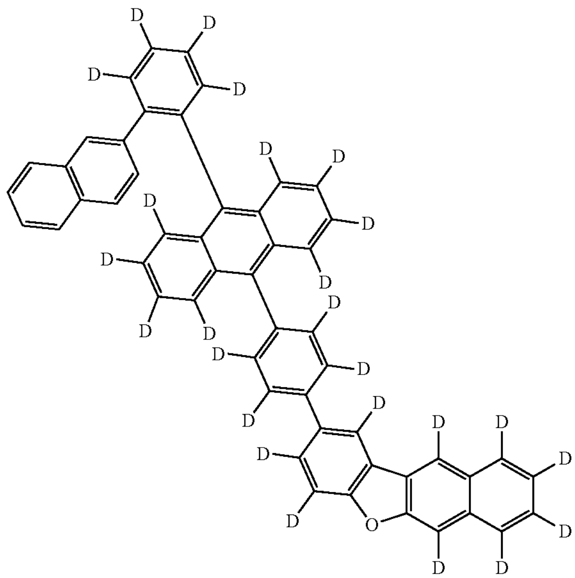
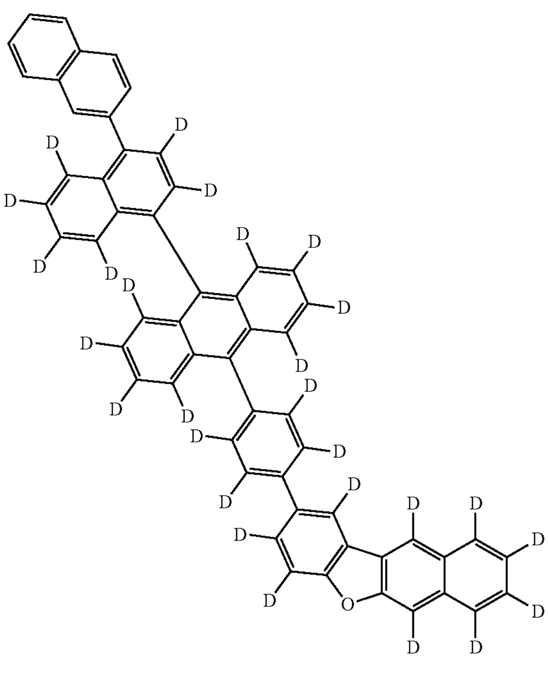
-continued
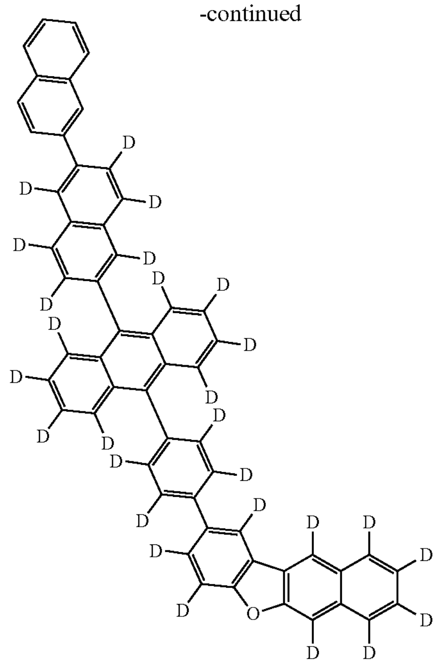
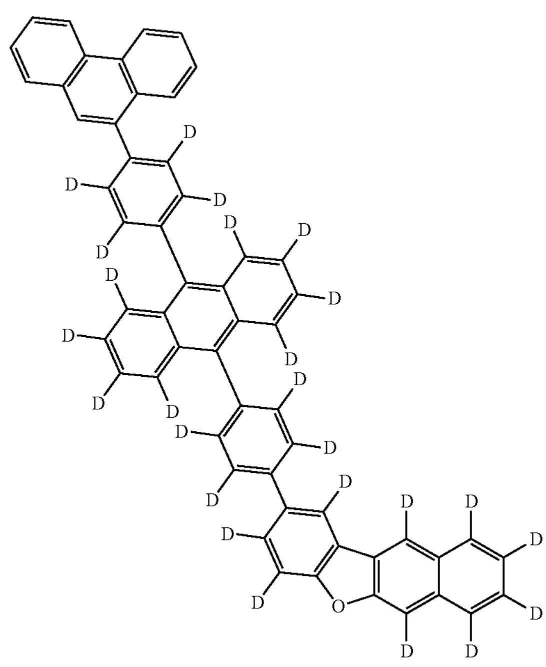

-continued
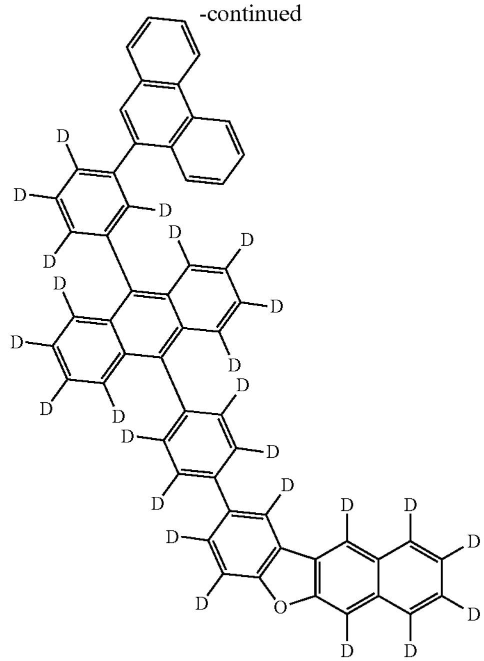
-continued
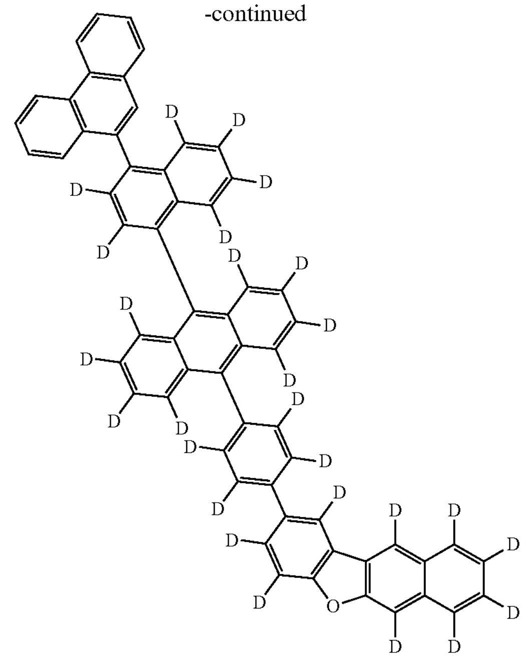
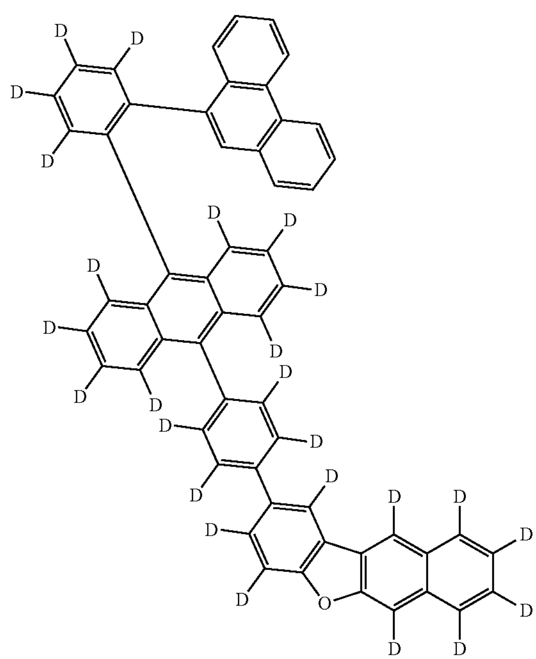
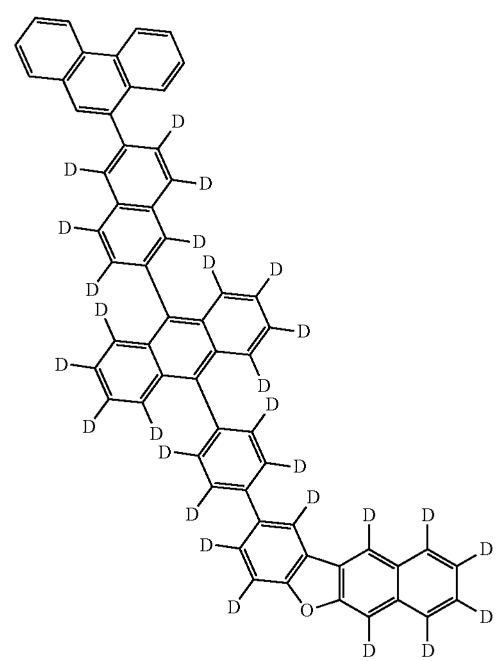

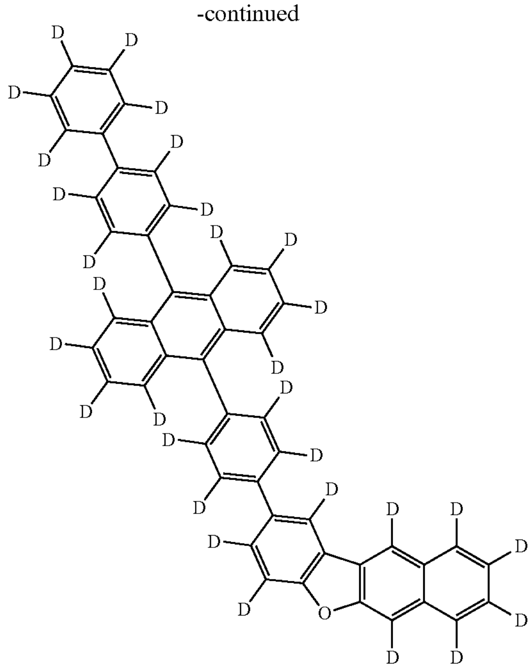
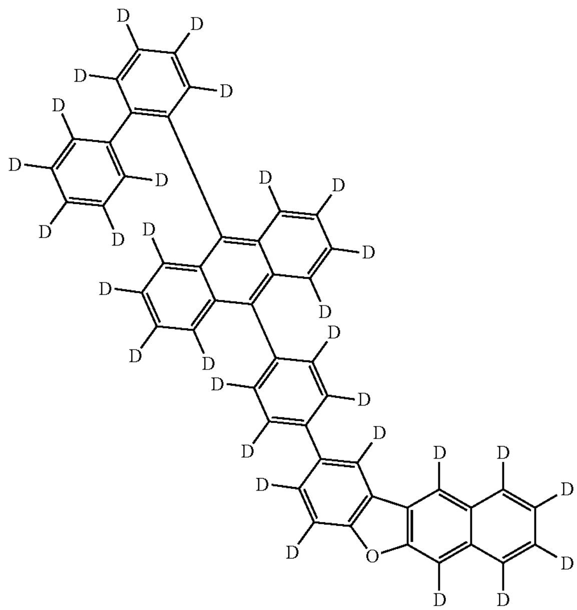
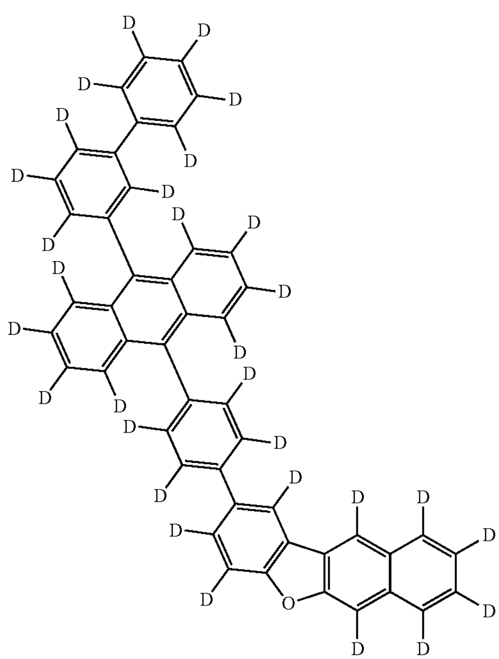
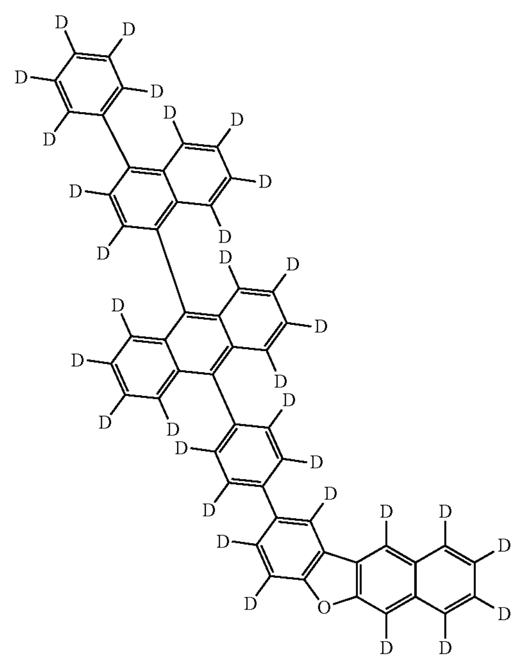

-continued
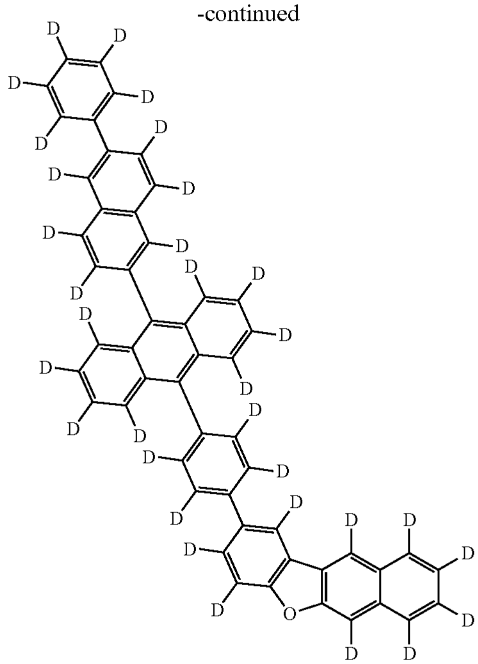
-continued
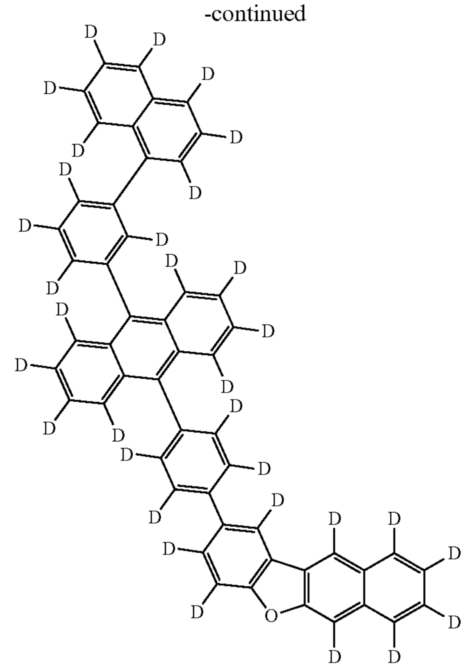
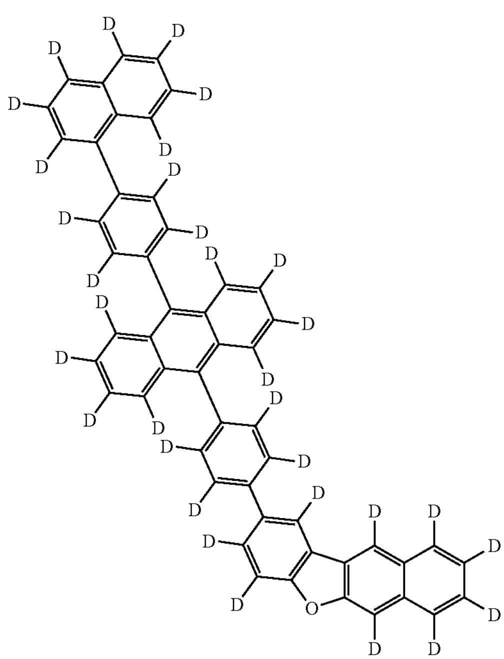
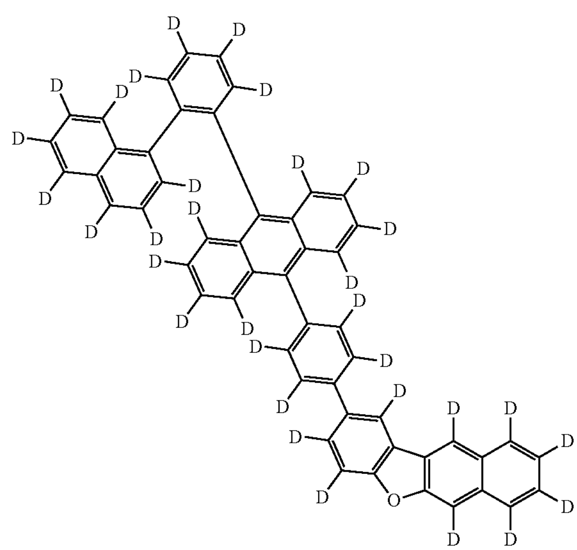

-continued
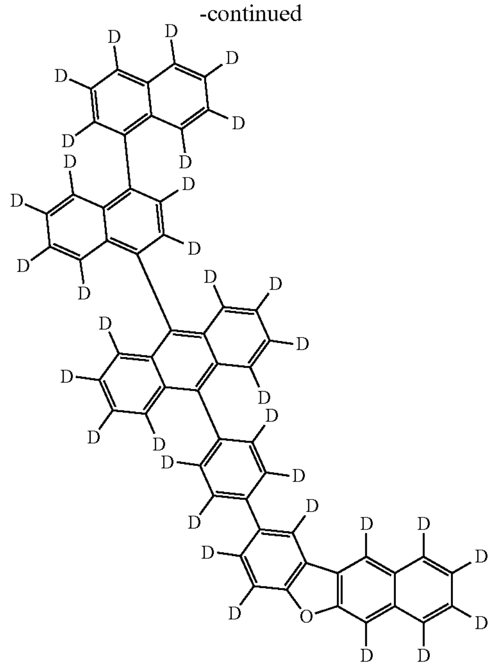
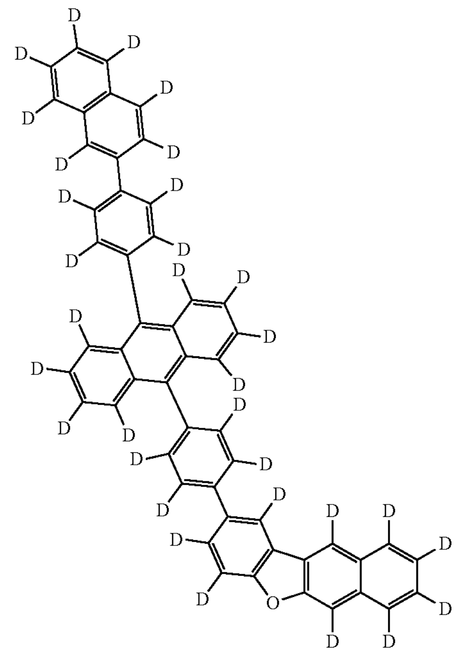
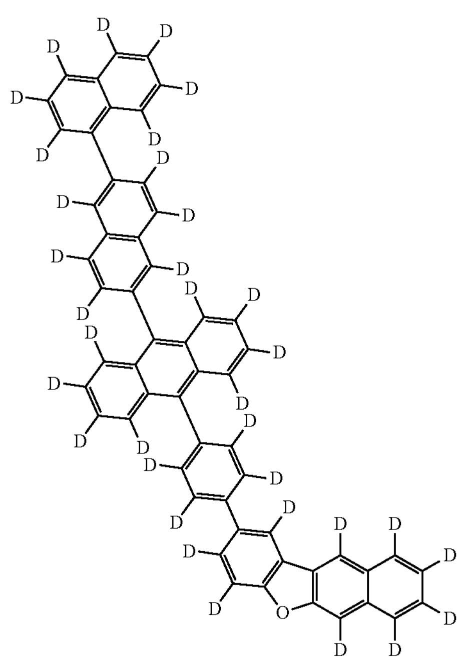
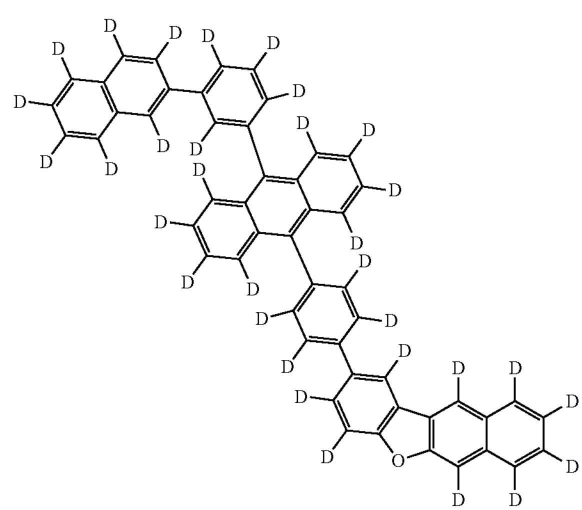

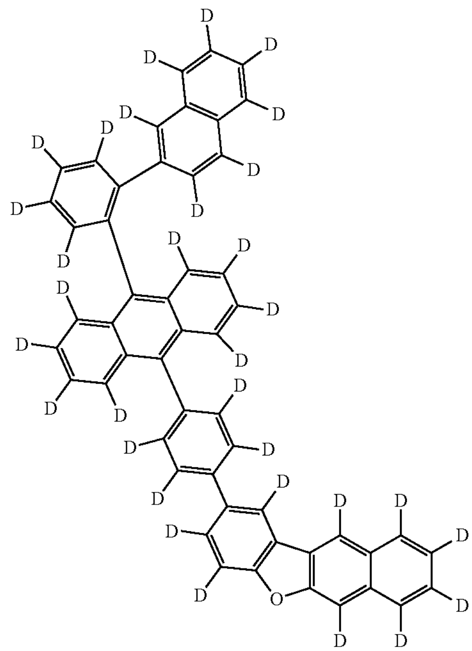
O
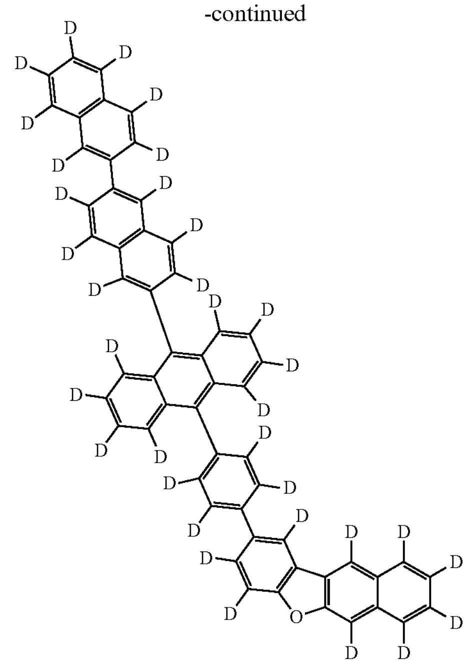
O
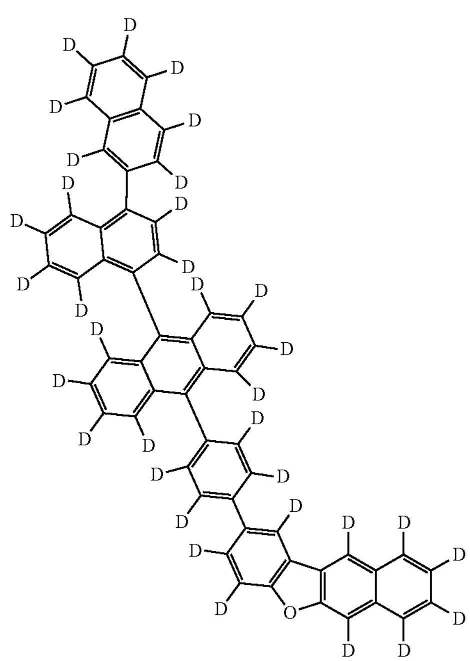
O
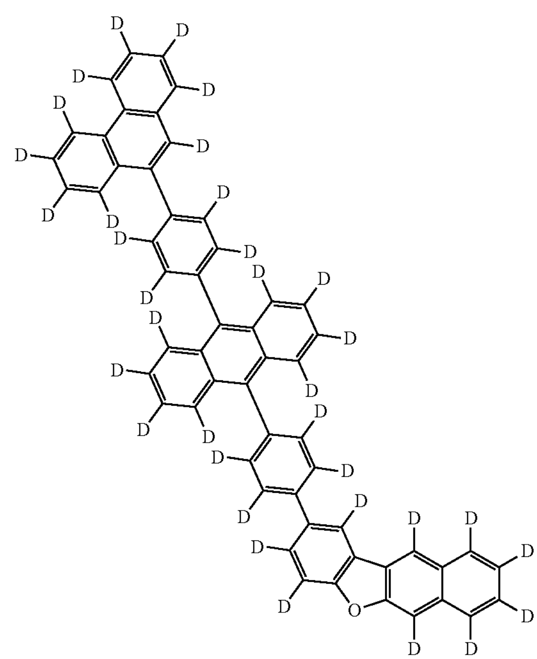
O

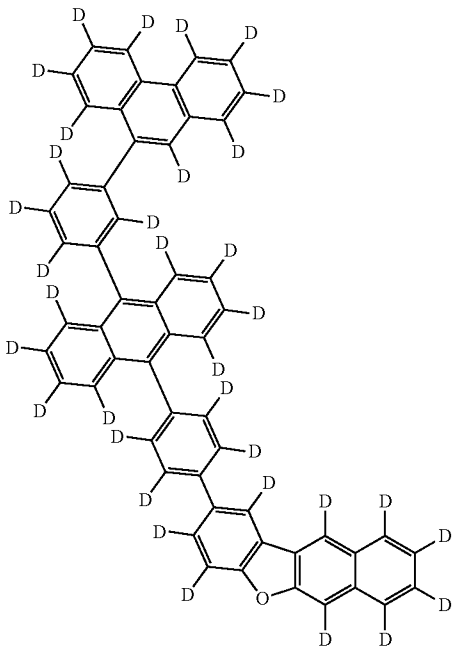
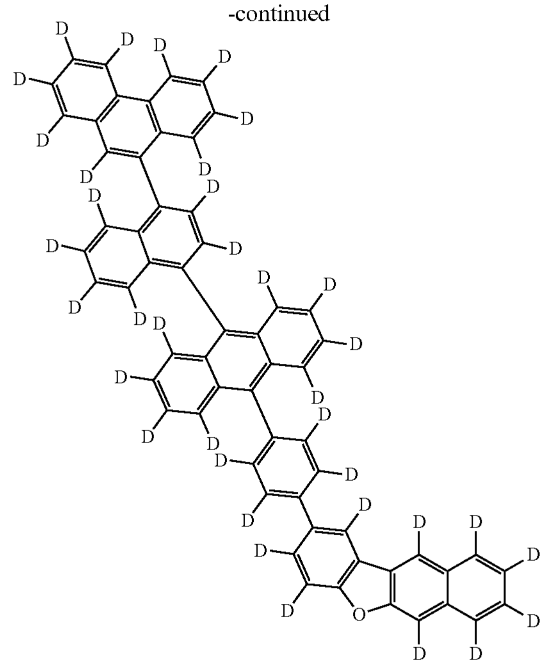
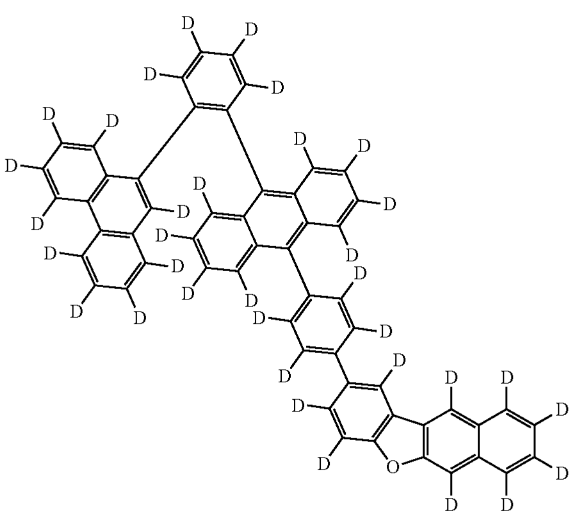
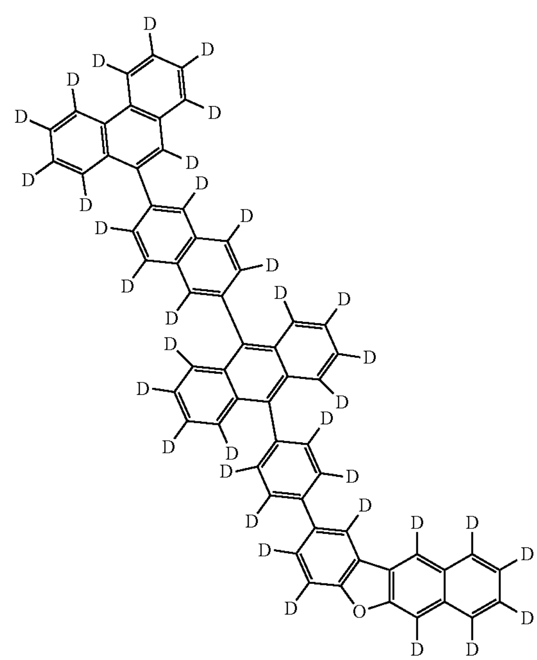

-continued
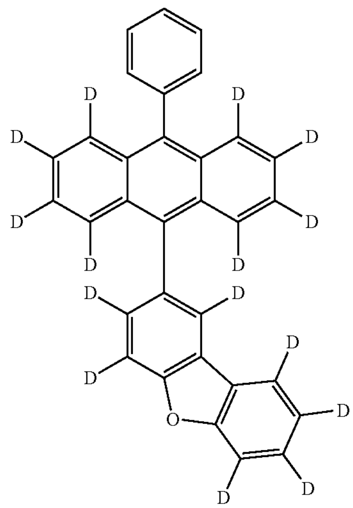
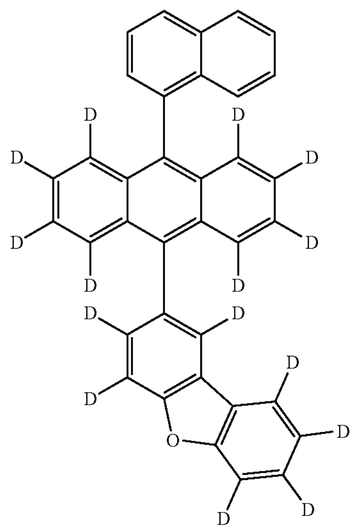
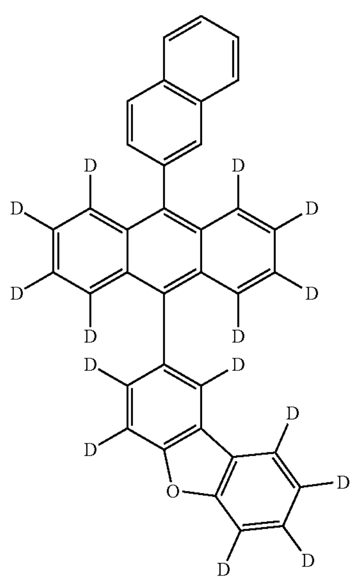
-continued
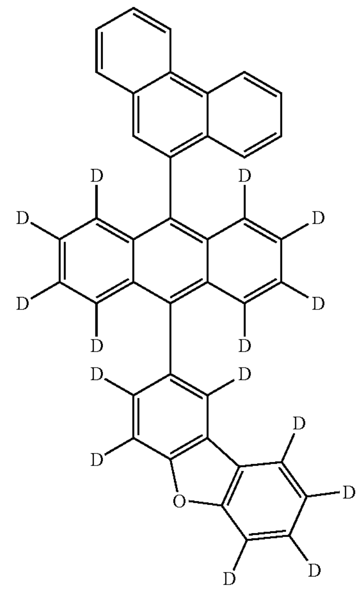
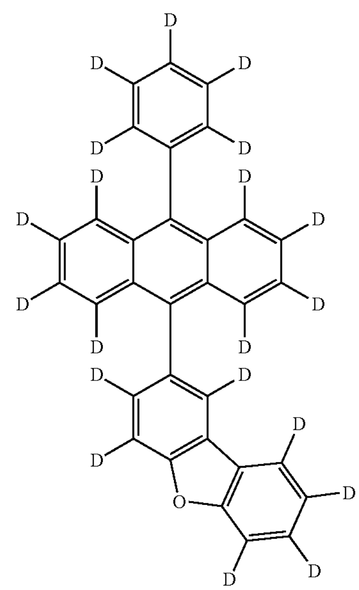
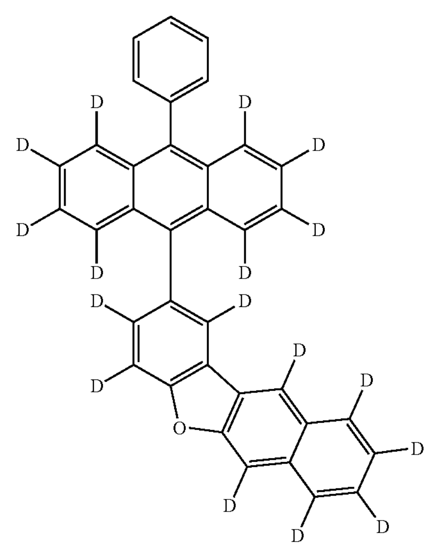

-continued
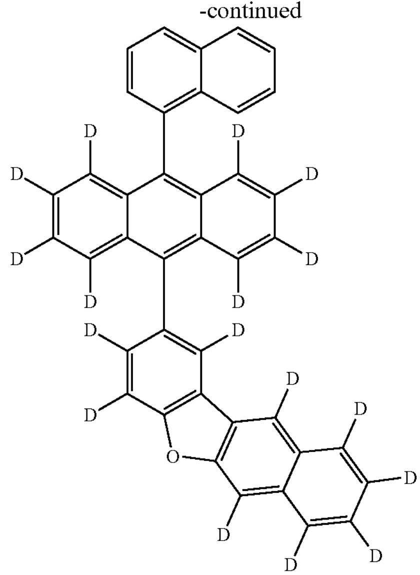
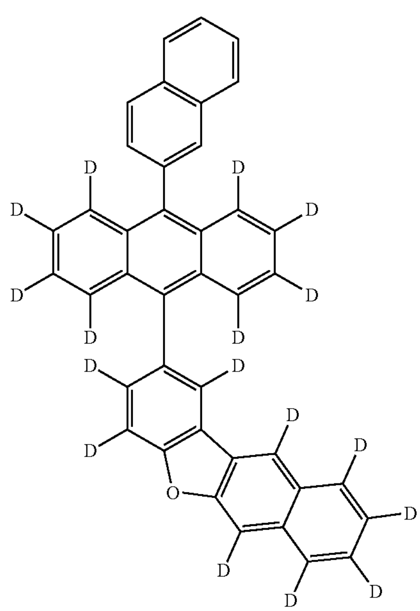
-continued
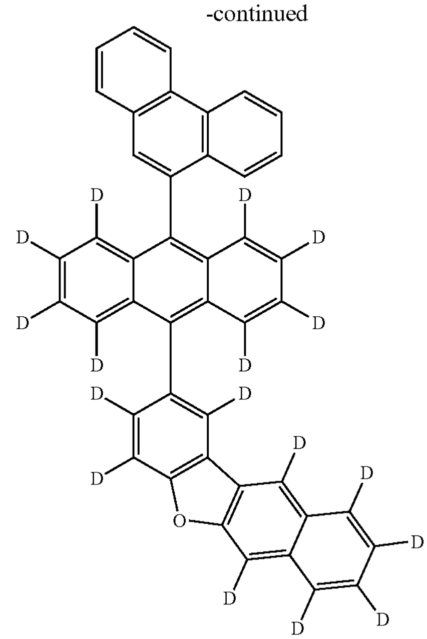
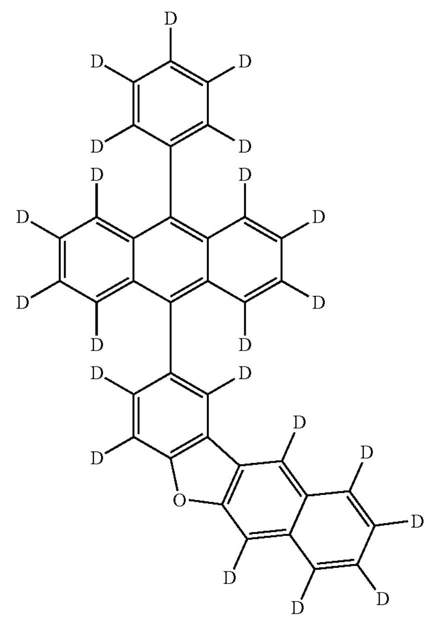
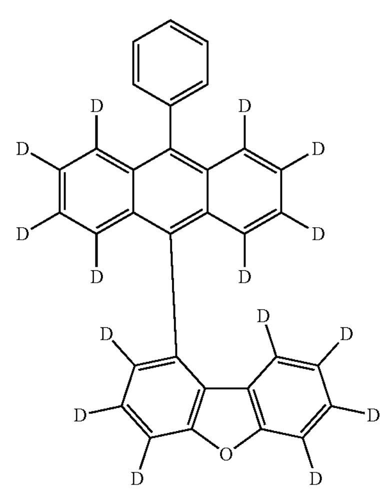

-continued
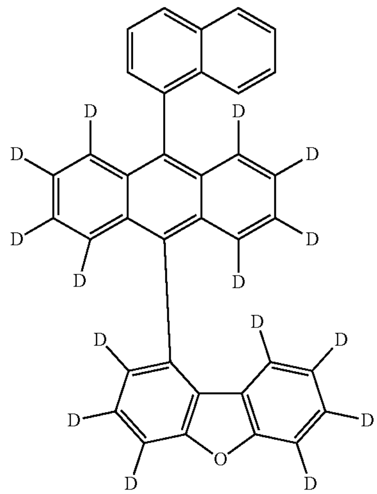
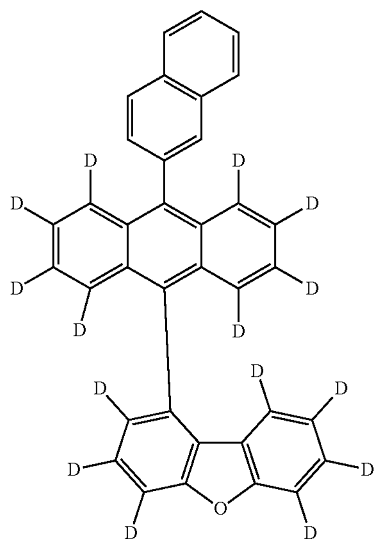
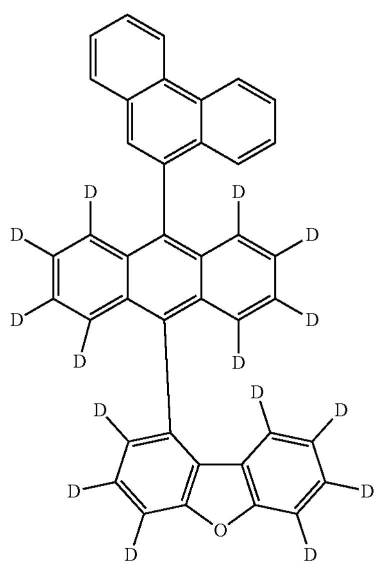
-continued
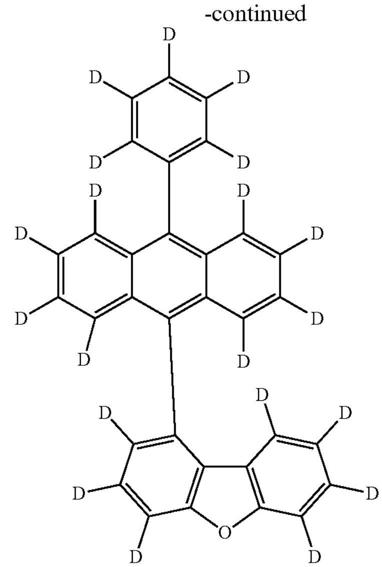
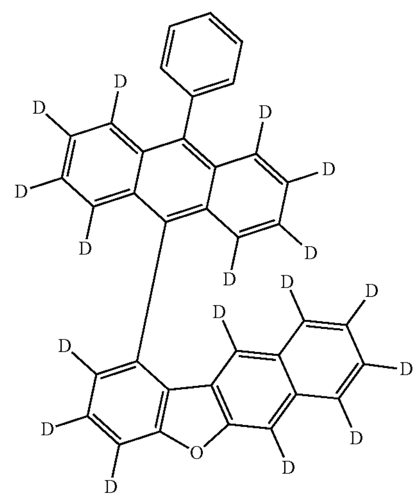
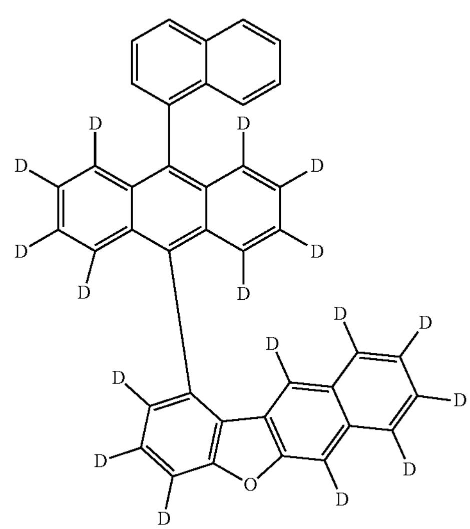

-continued
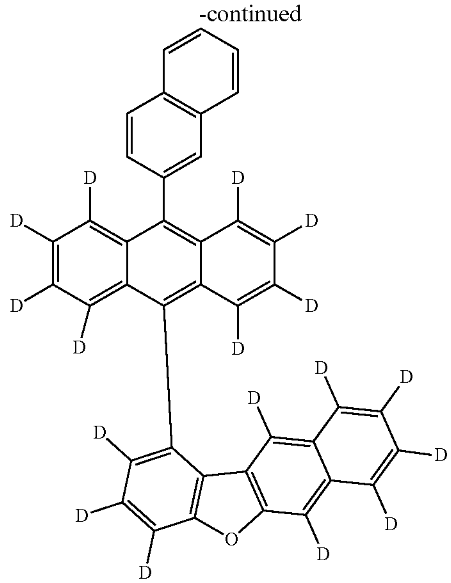
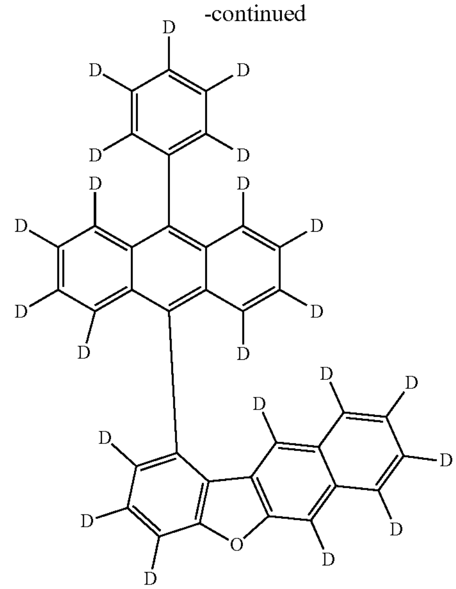
-continued
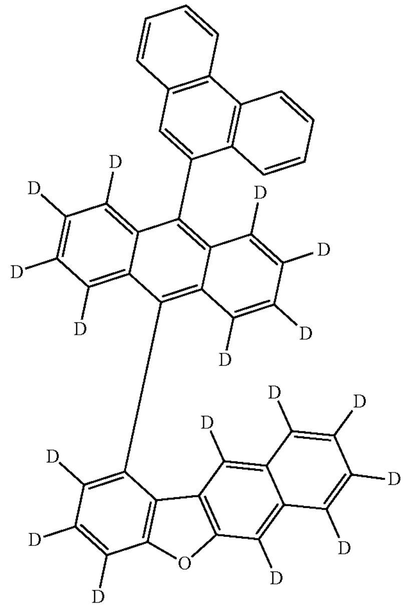
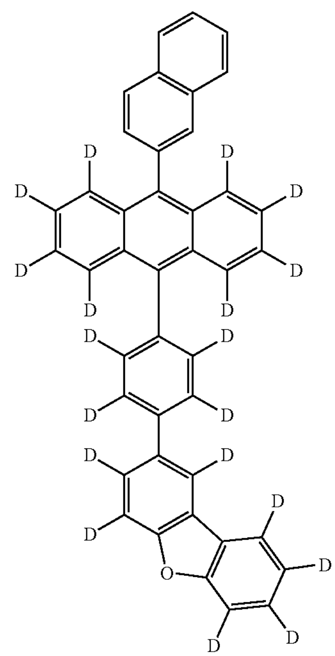

-continued
-continued
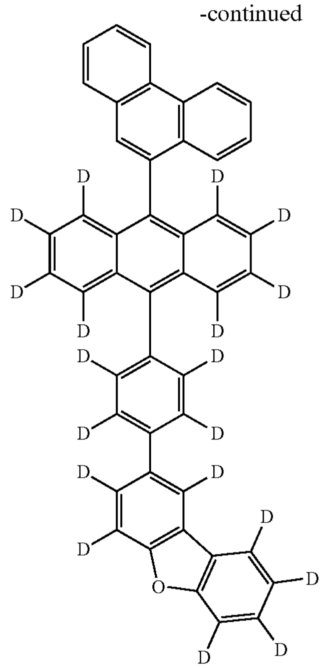
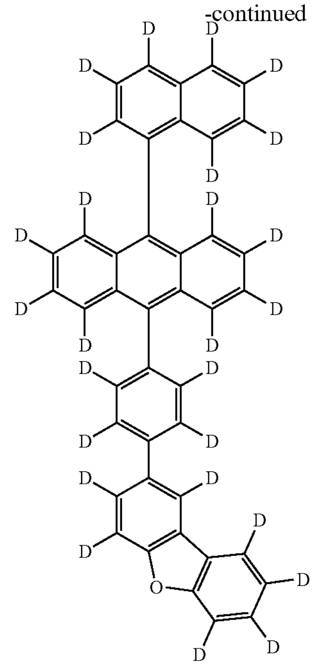
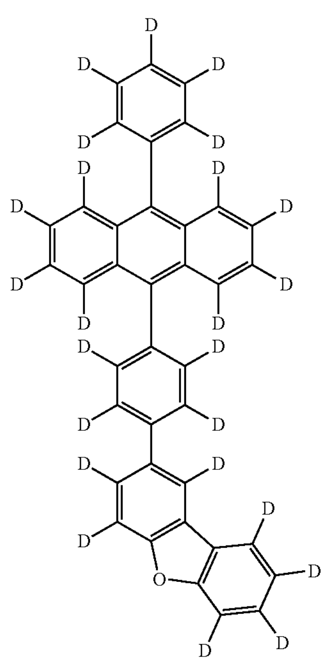
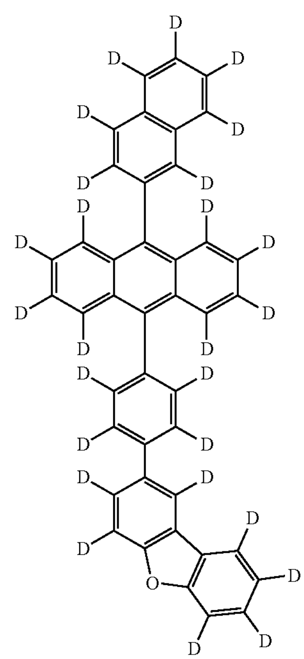

-continued
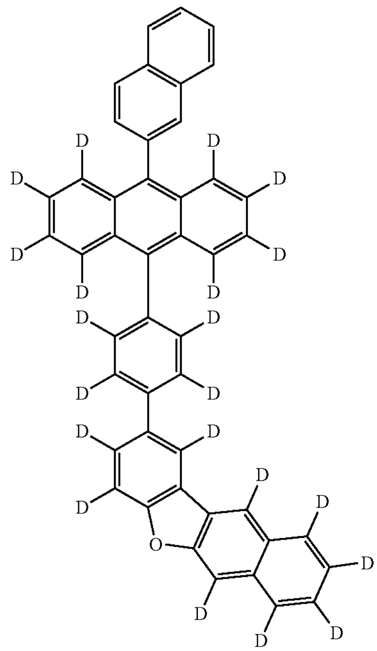
-continued
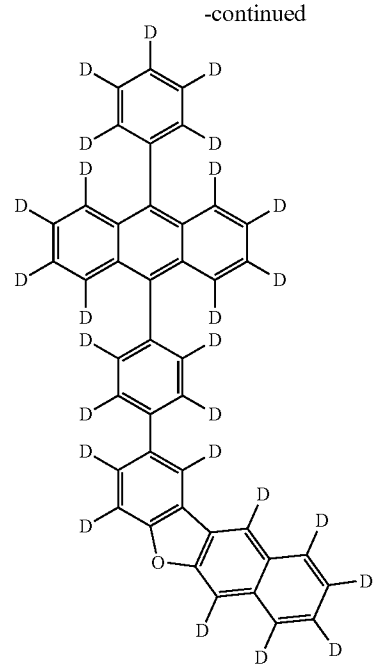
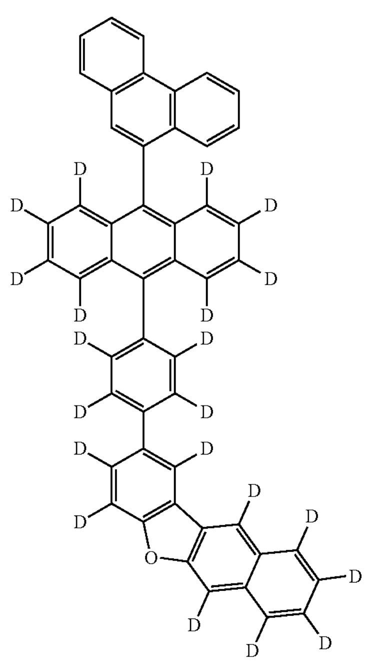
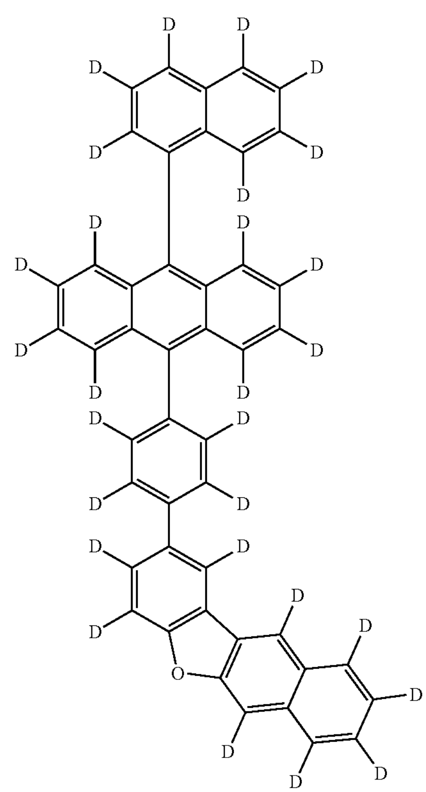

-continued
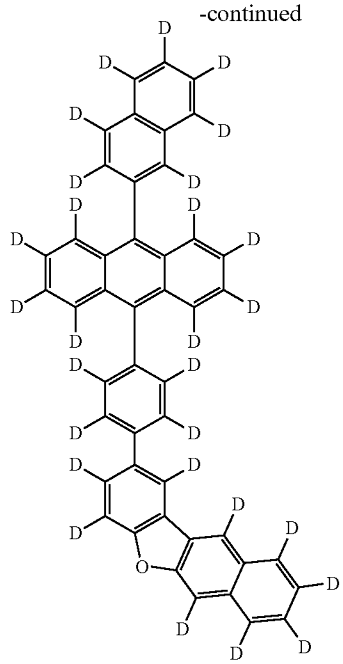
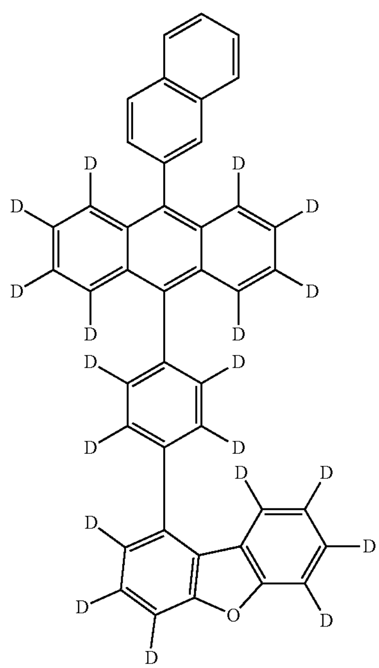
-continued
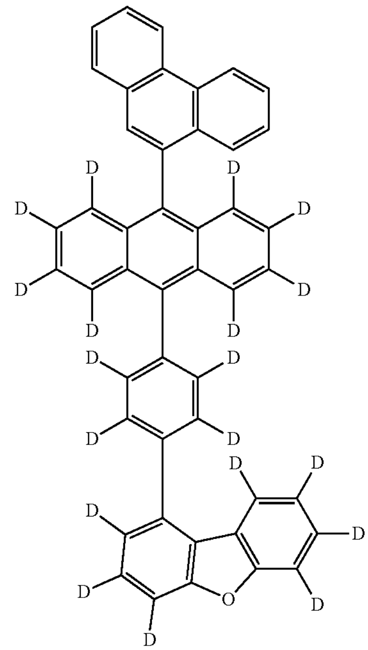
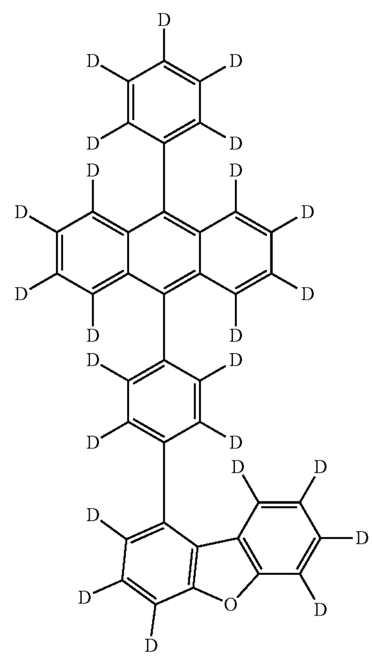

-continued
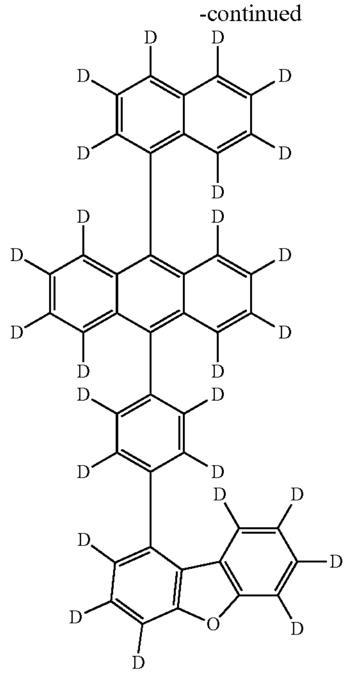
-continued
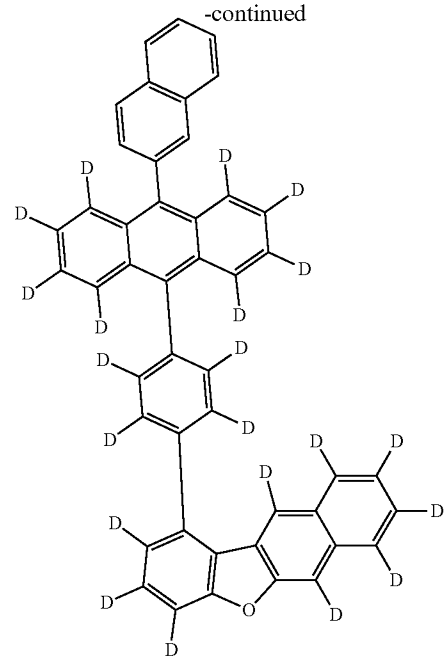
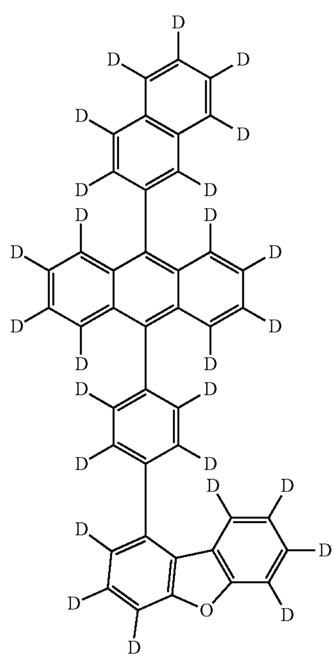
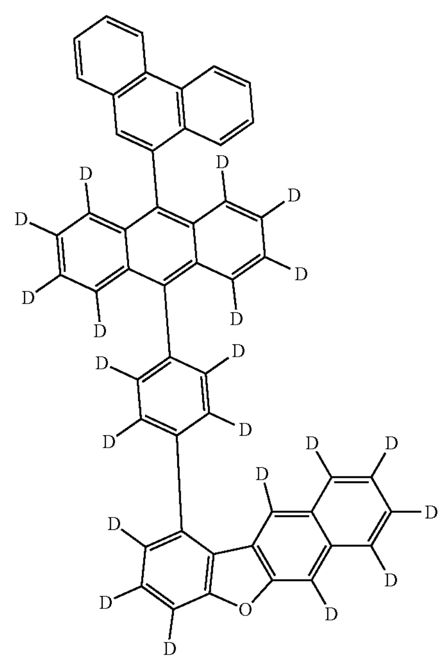

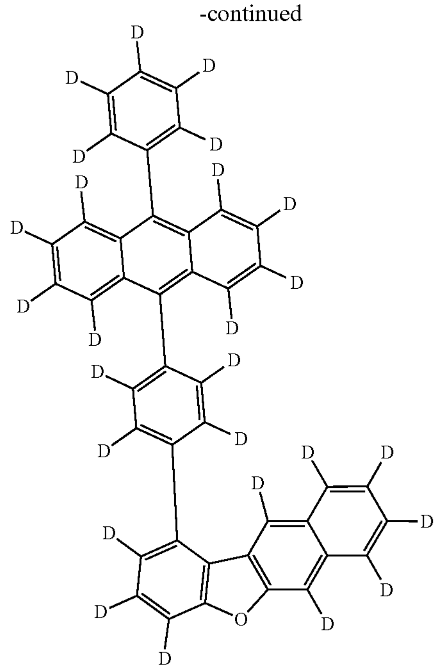
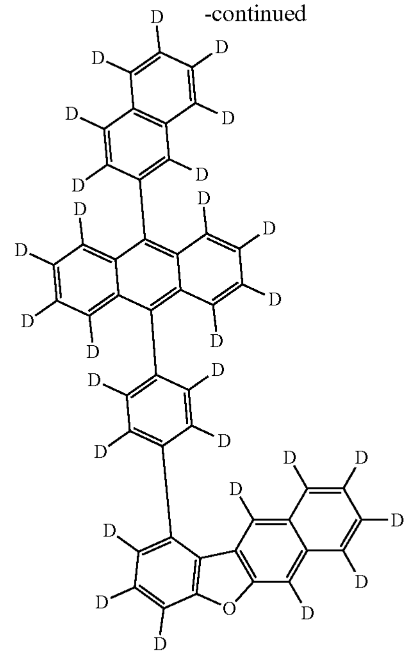
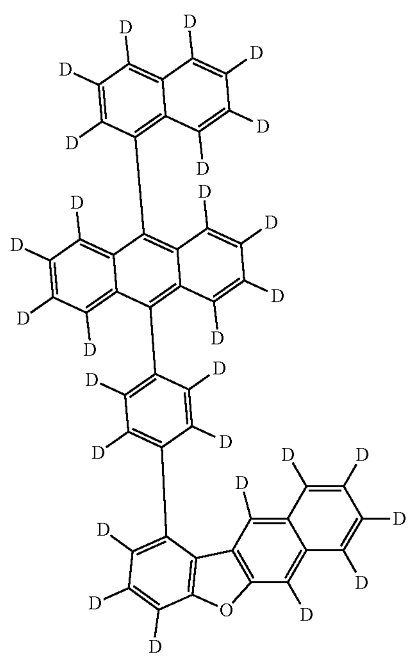
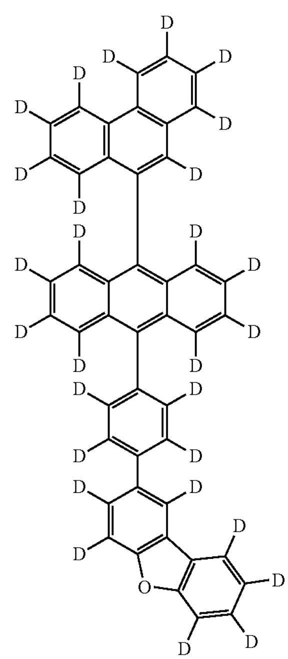

-continued
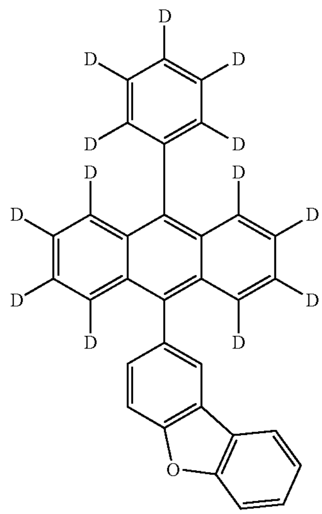
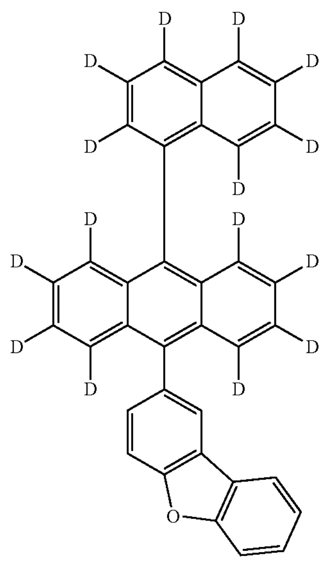
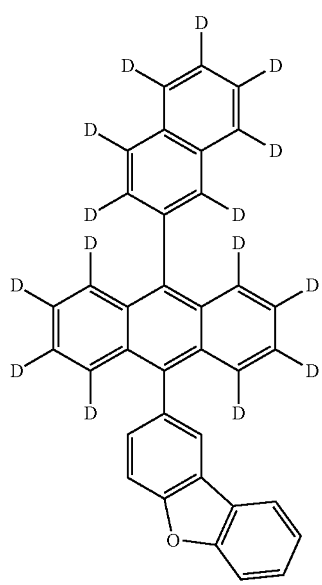
-continued
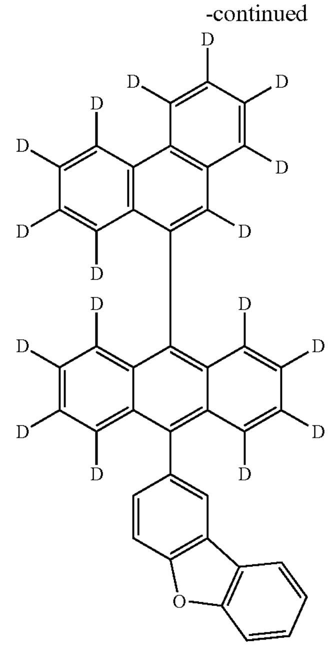
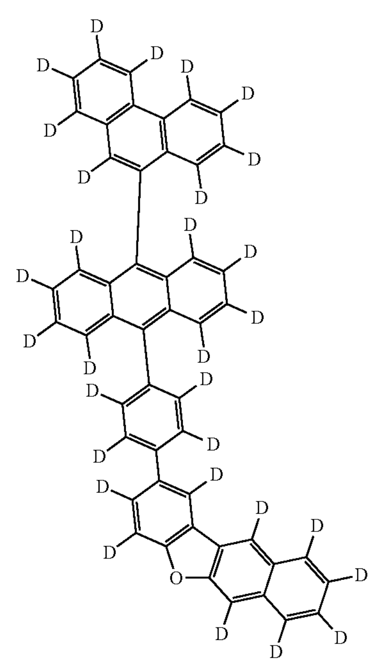

-continued
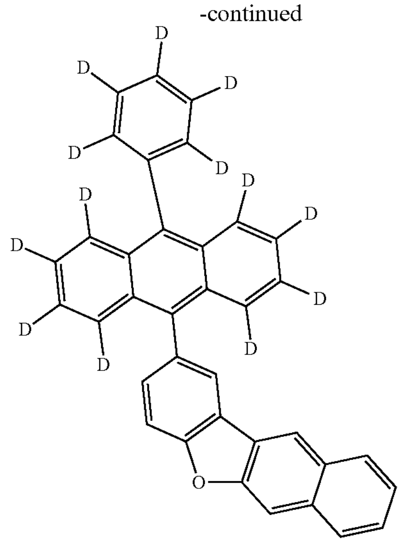
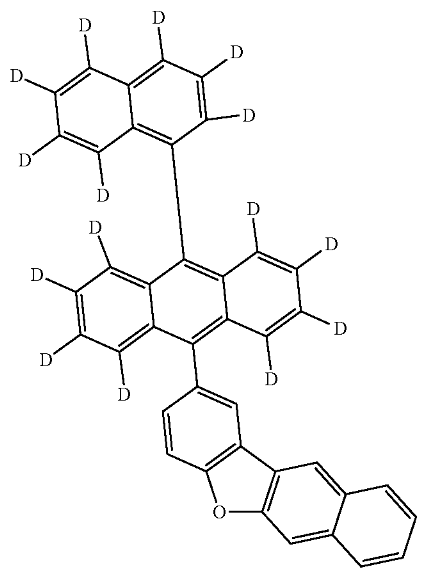
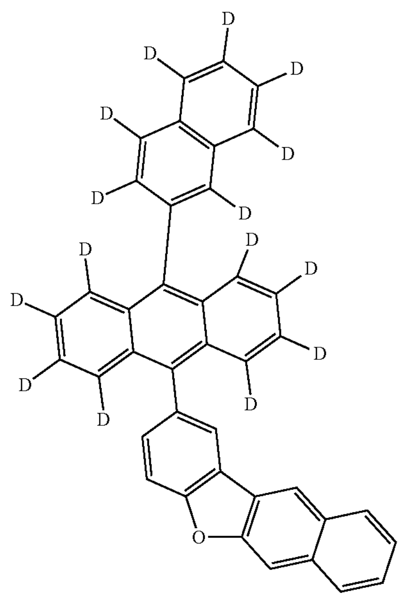
-continued
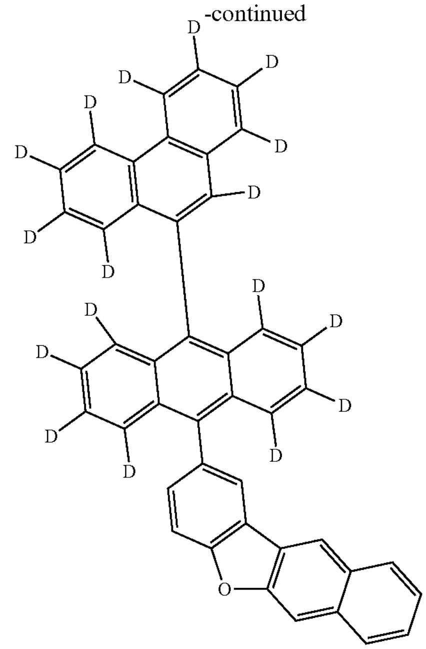
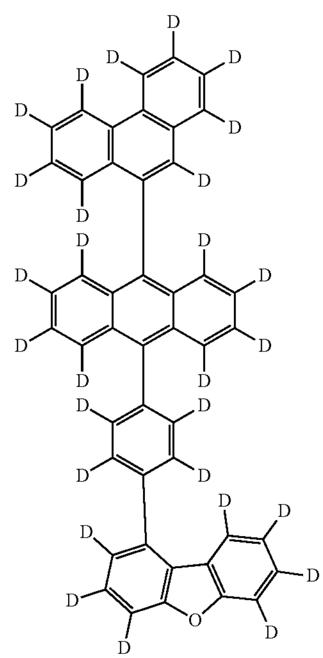

-continued
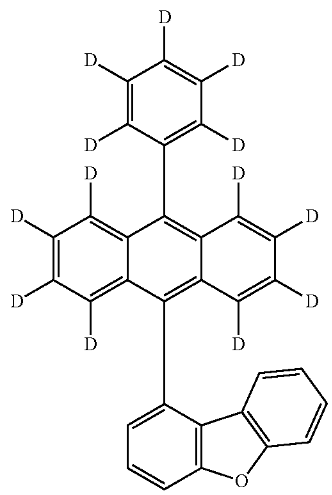
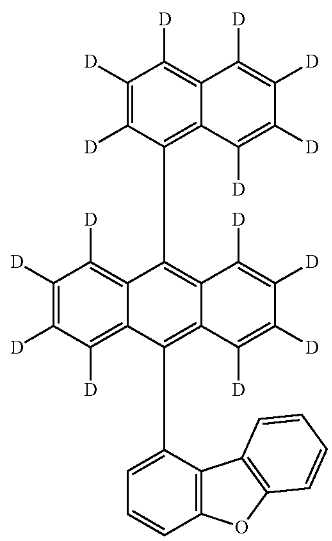
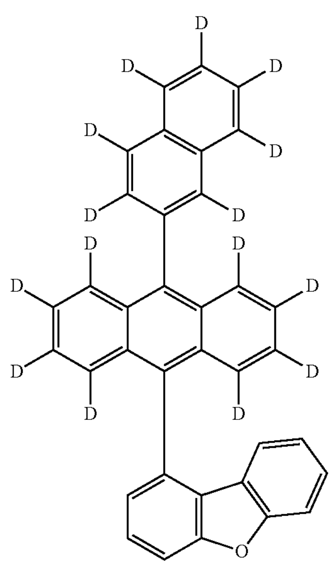
-continued
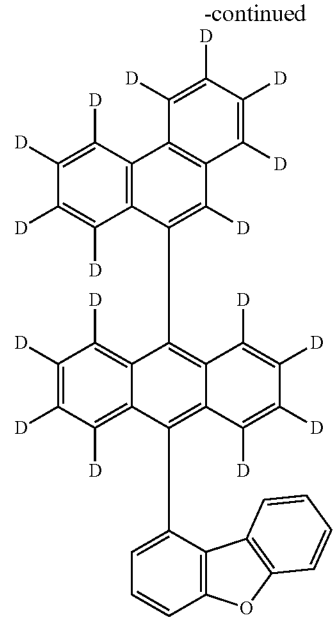
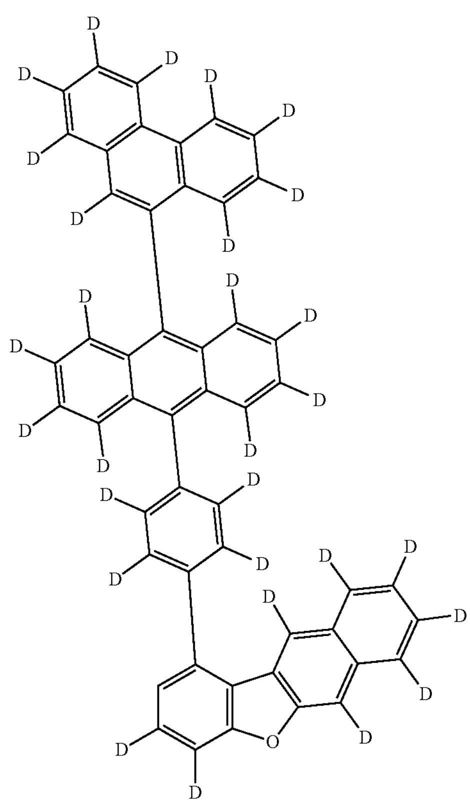

-continued
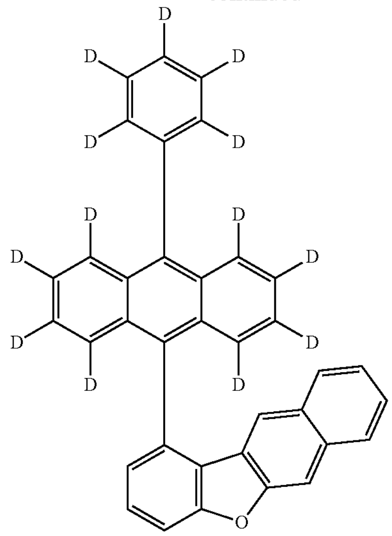
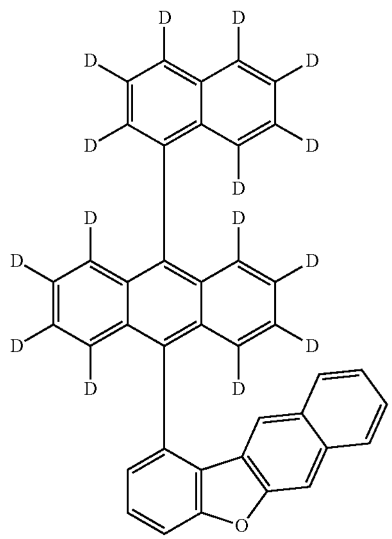
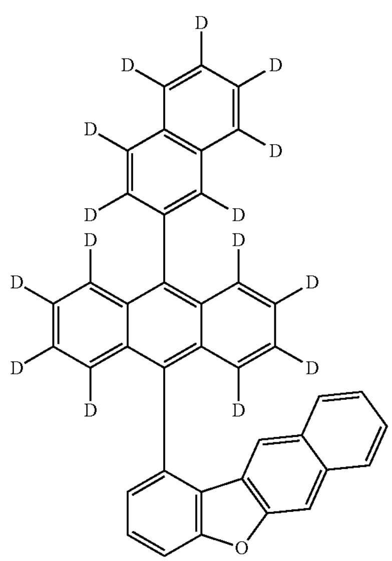
-continued
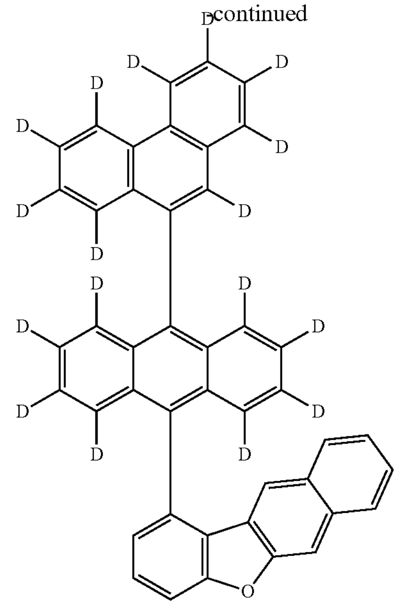
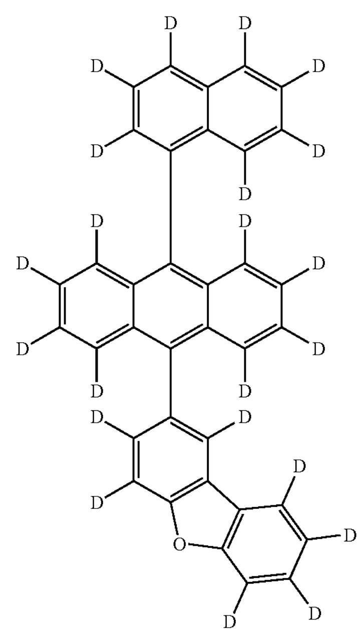

-continued
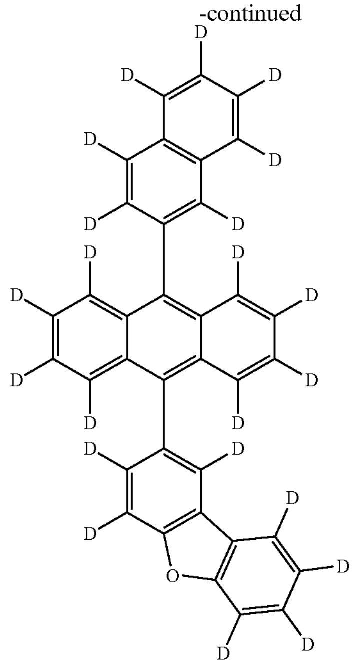
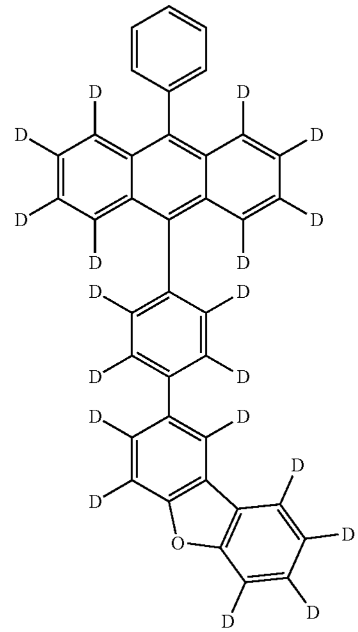
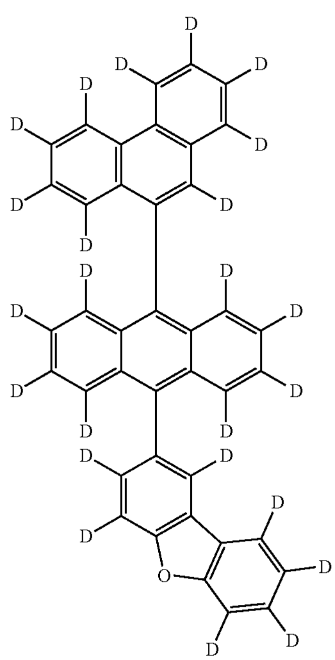
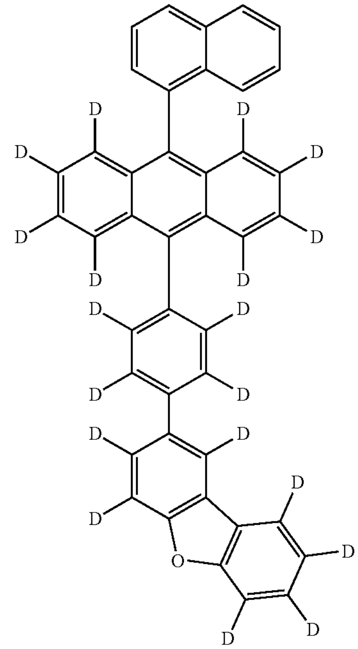

-continued
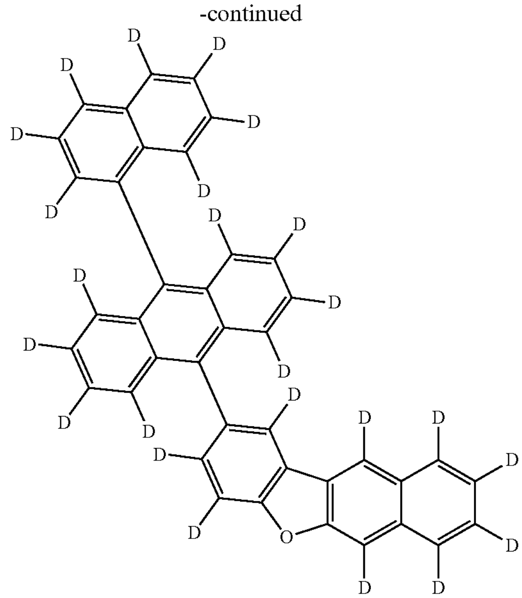
-continued
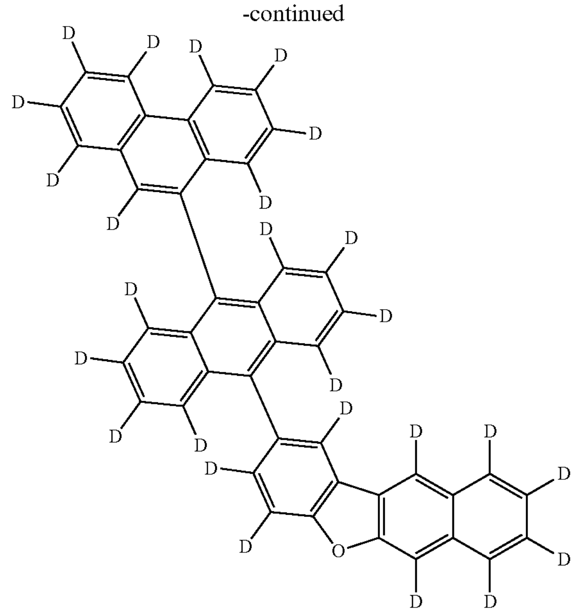
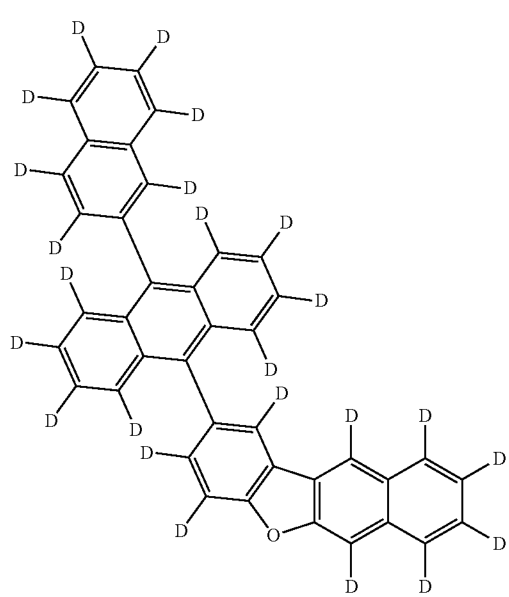
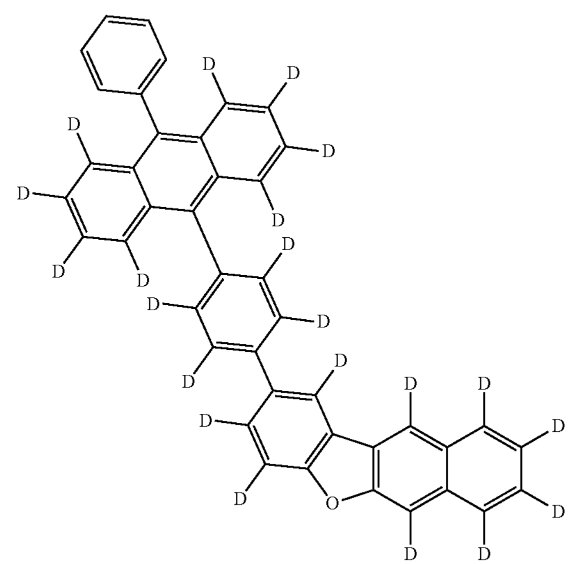

-continued
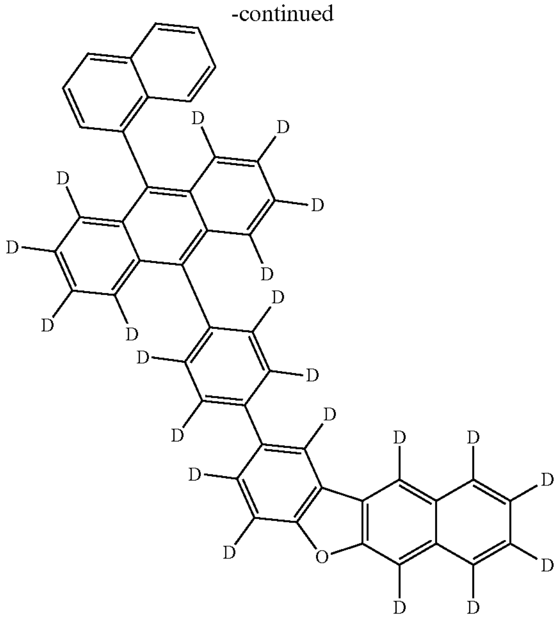
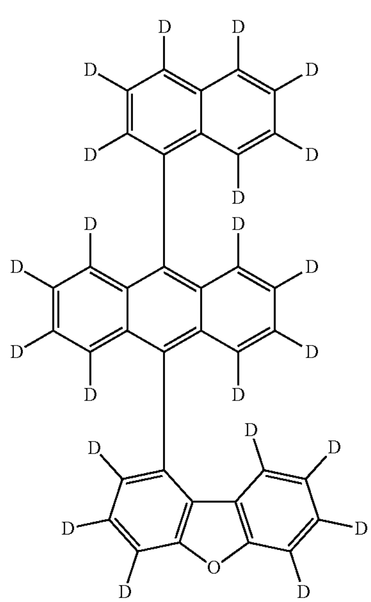
-continued
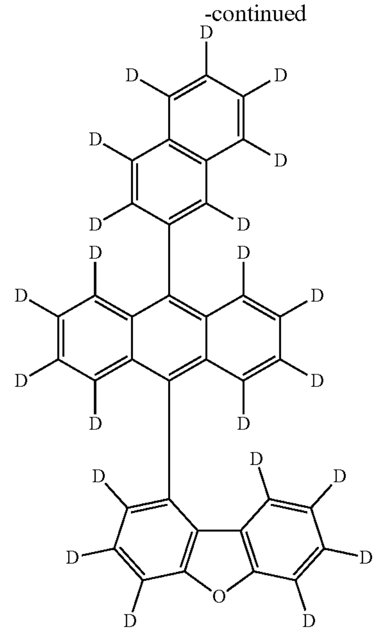
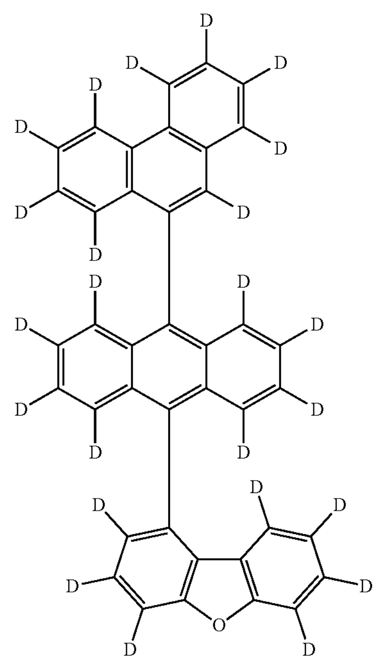

-continued
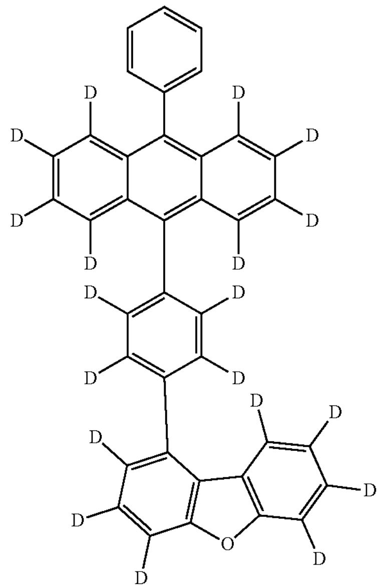
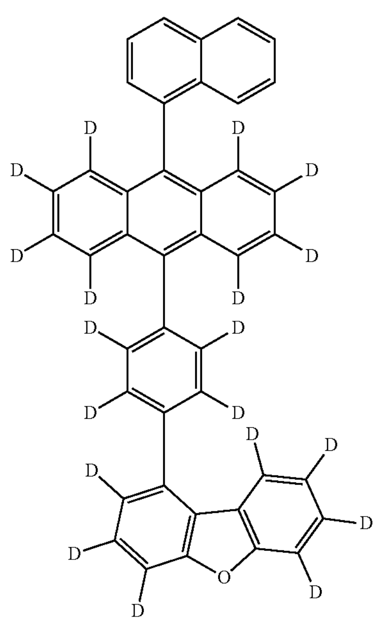
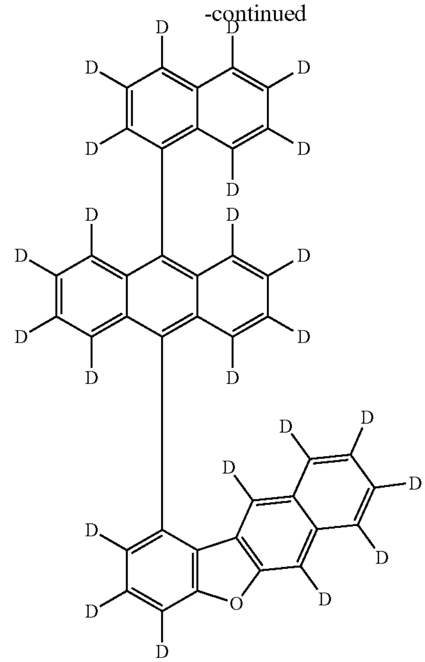
-continued
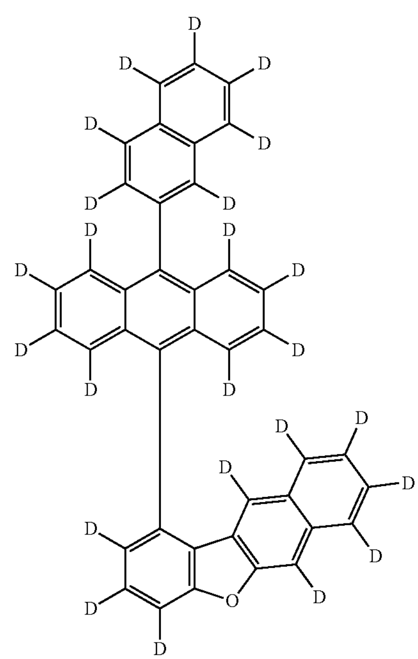

-continued
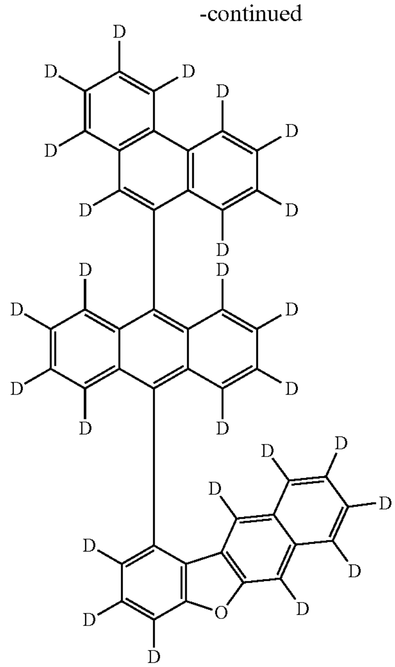
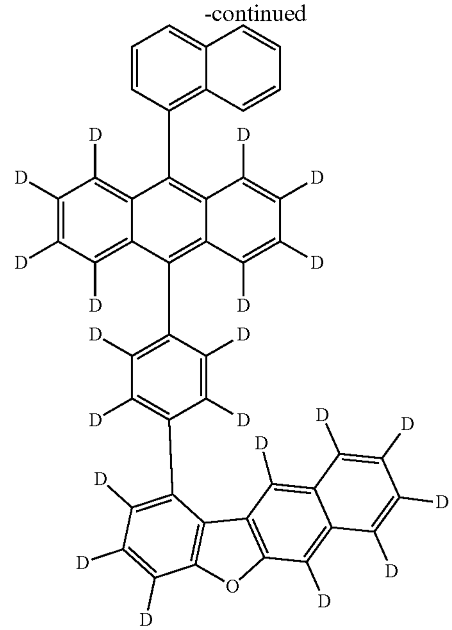
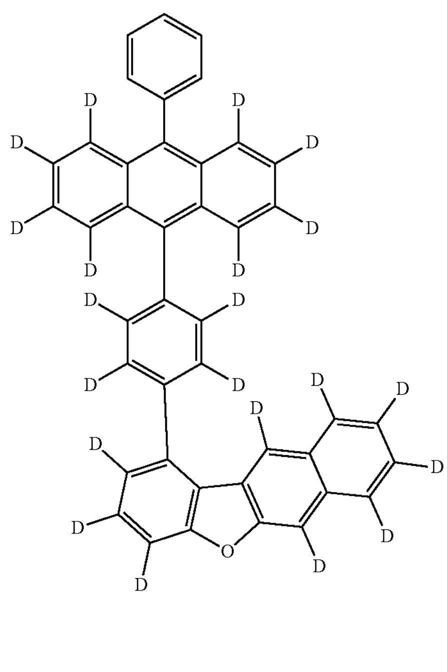
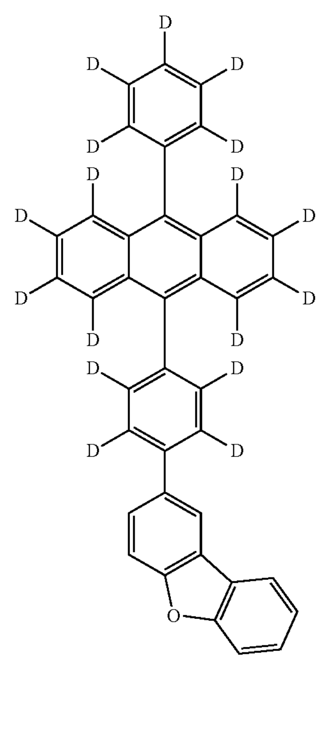

-continued
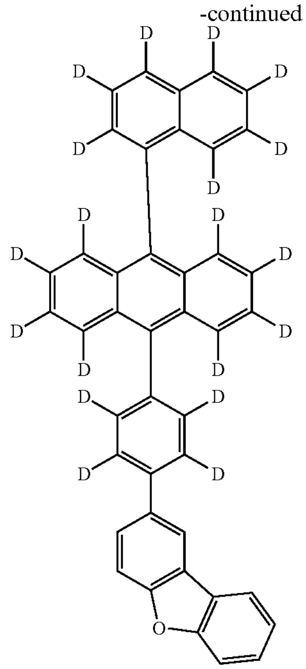
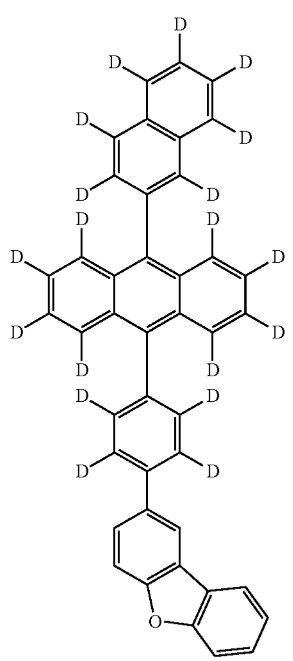
-continued
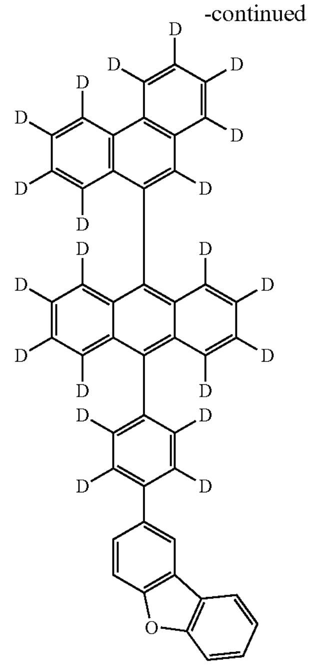
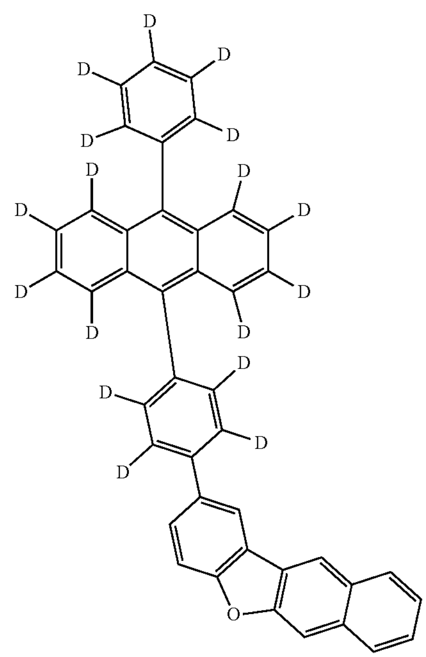

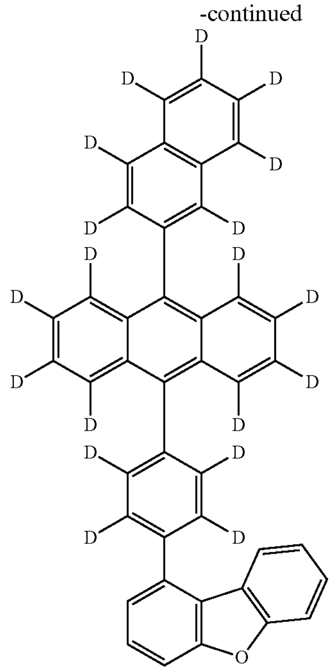
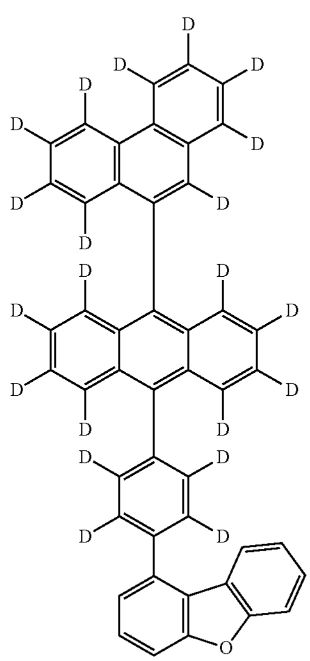
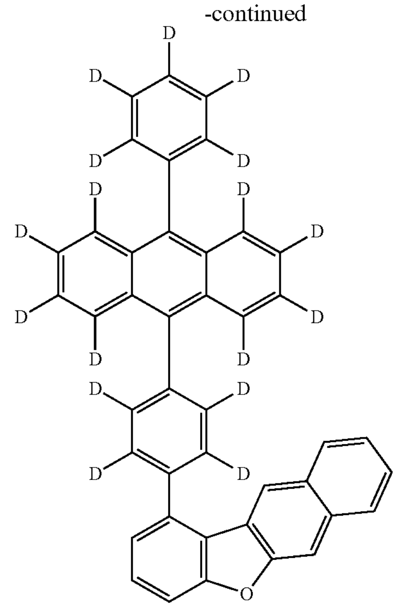
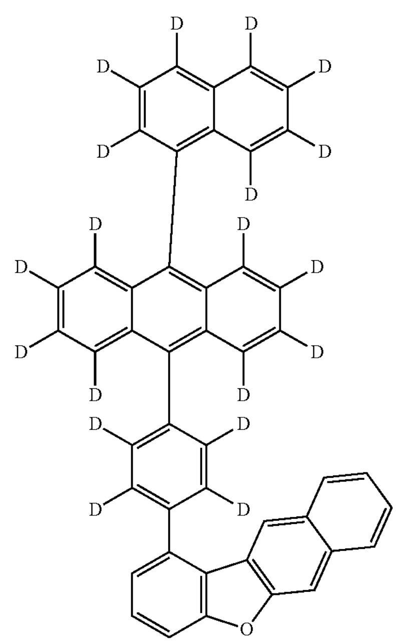

-continued
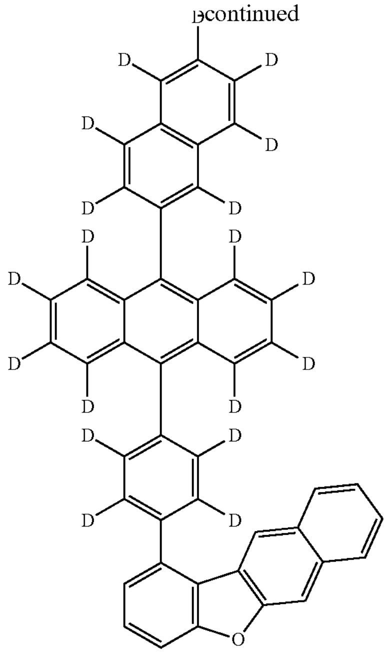
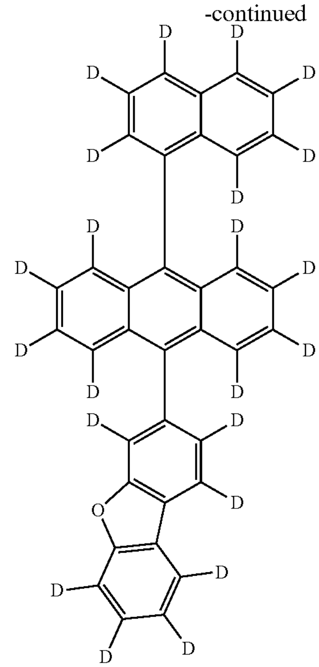
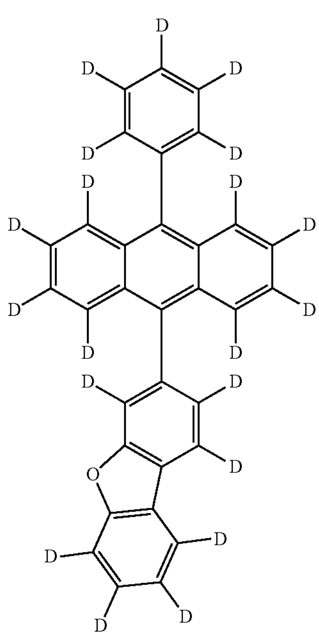
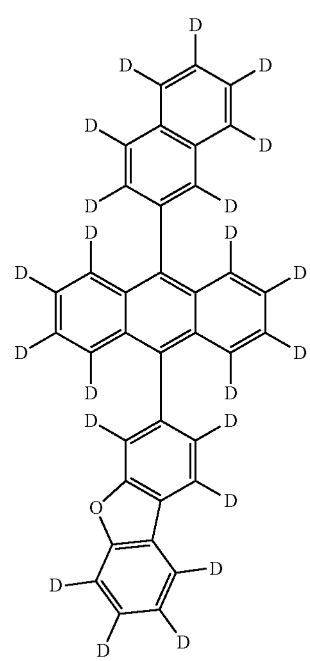

-continued
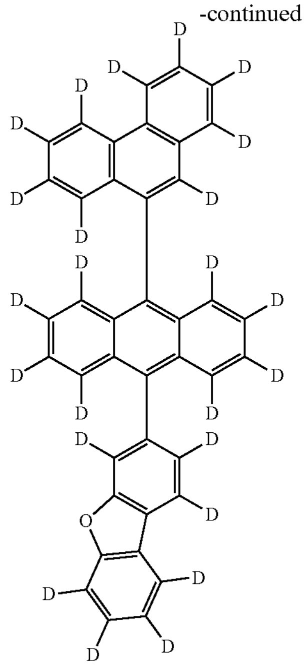
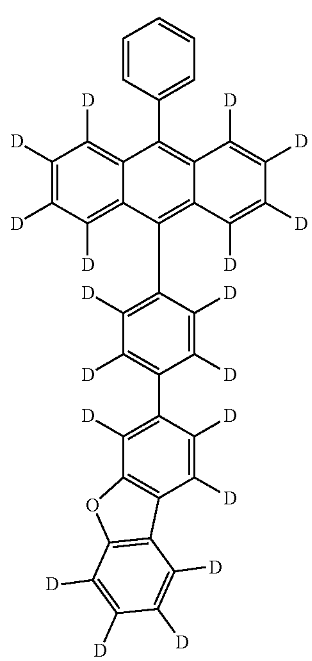
-continued
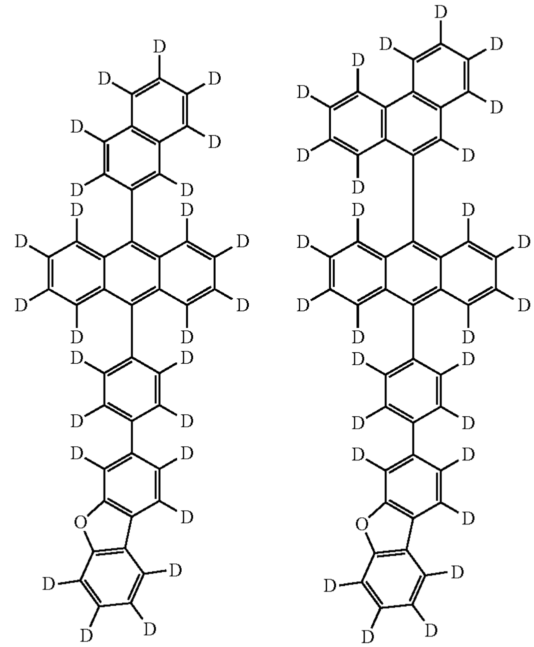
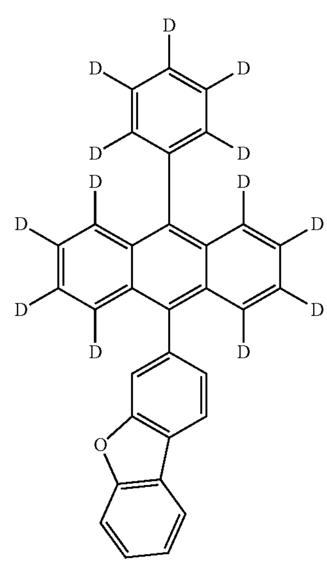

-continued
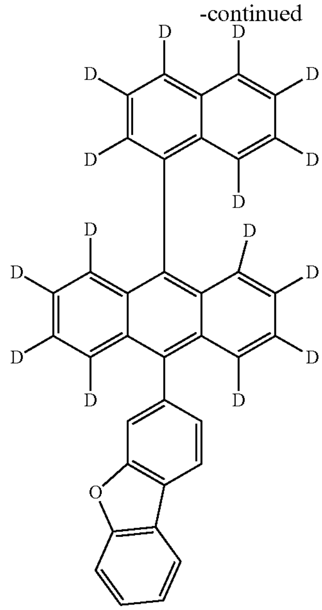
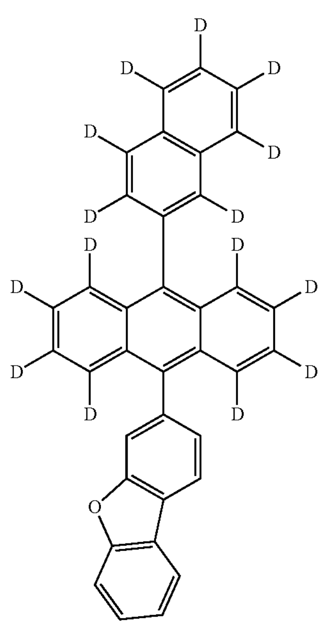
-continued
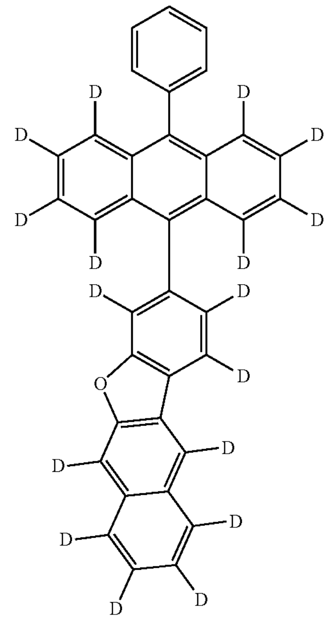
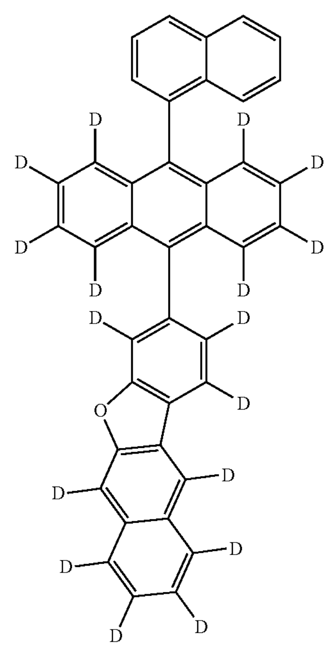

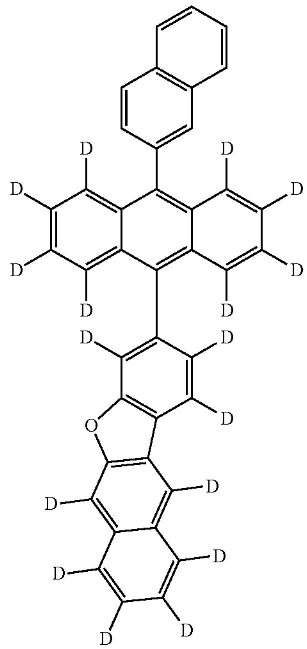
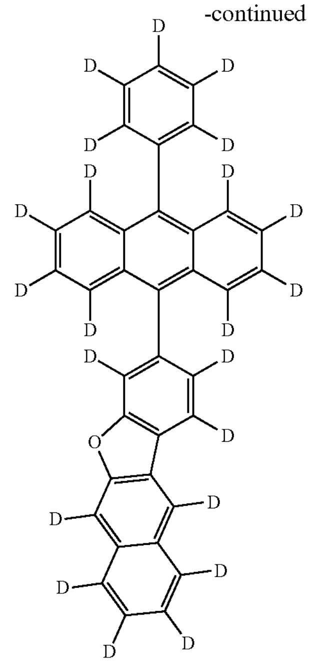
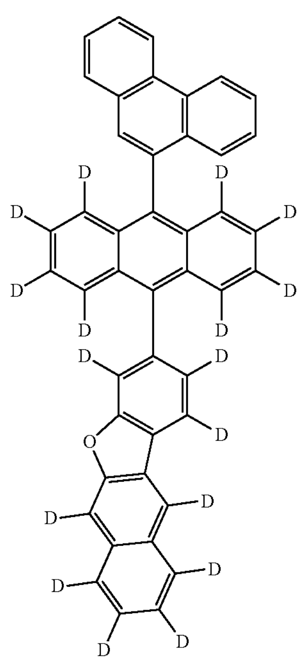
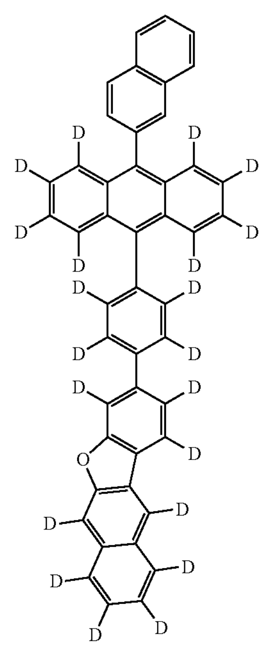
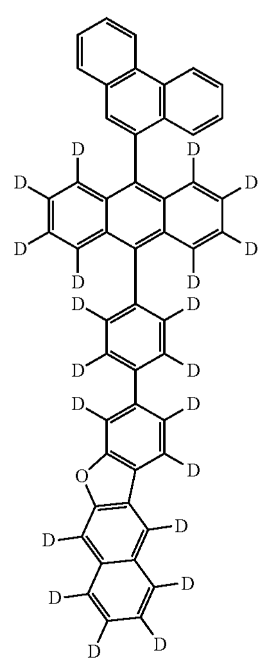

-continued
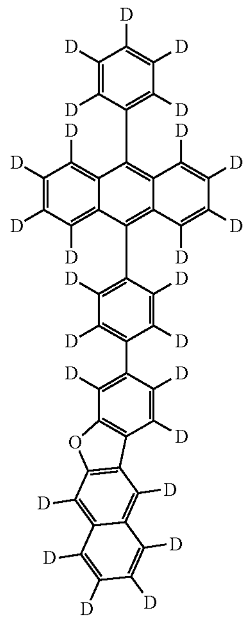
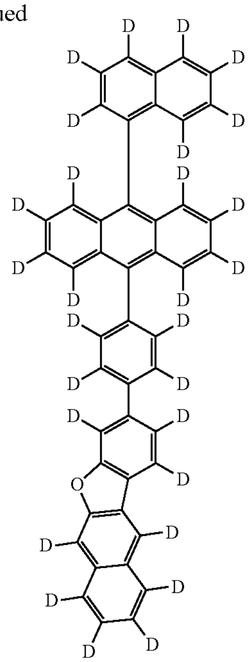
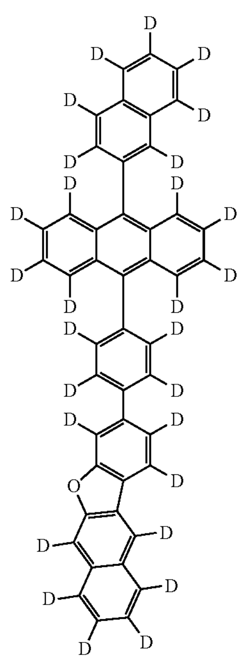
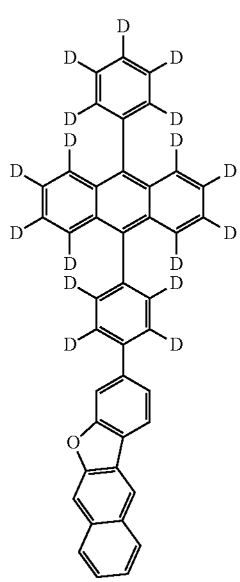
-continued
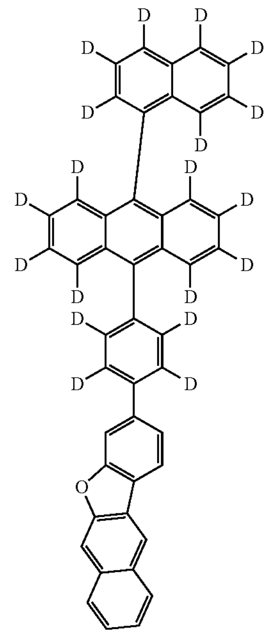
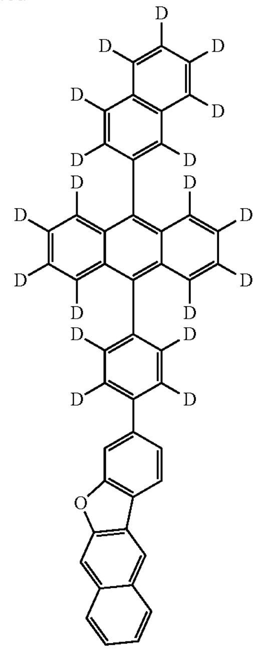
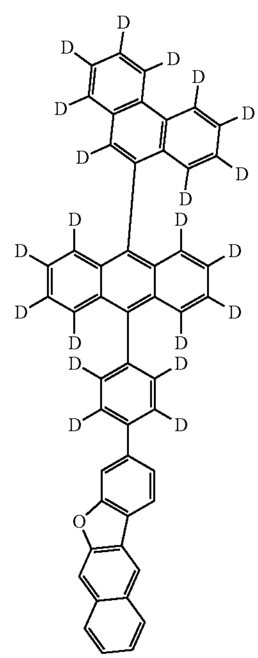

-continued
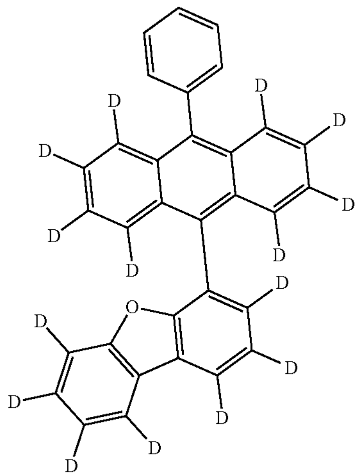
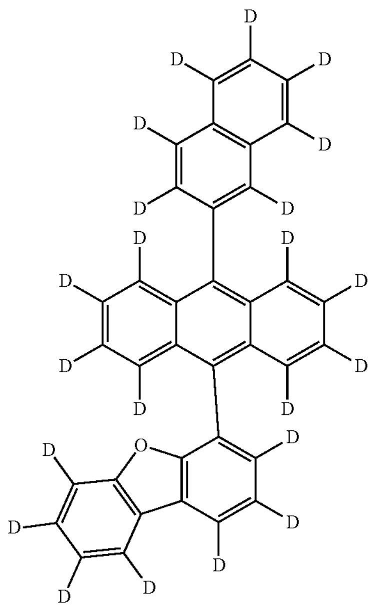
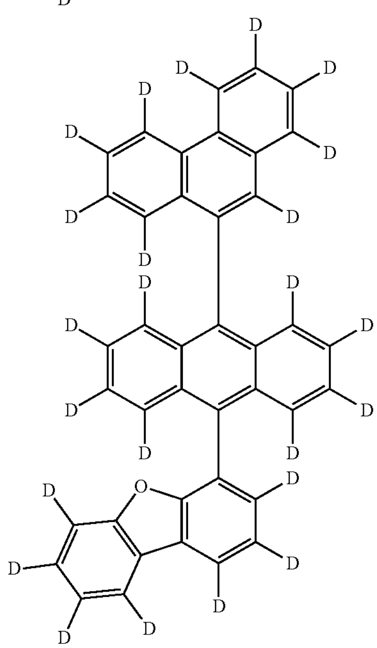
-continued
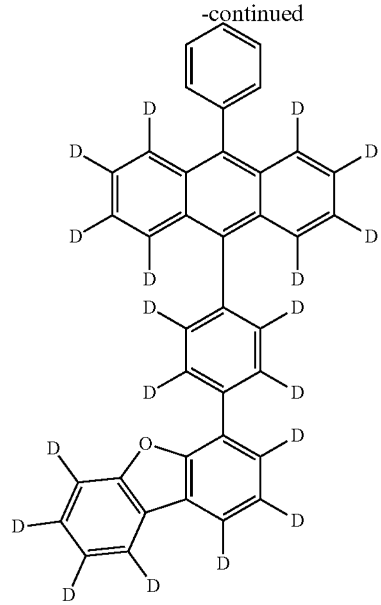
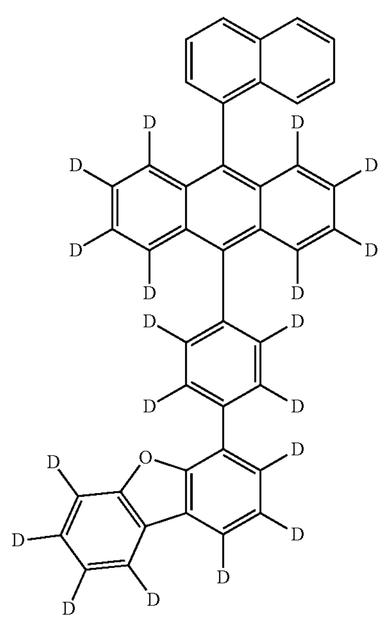

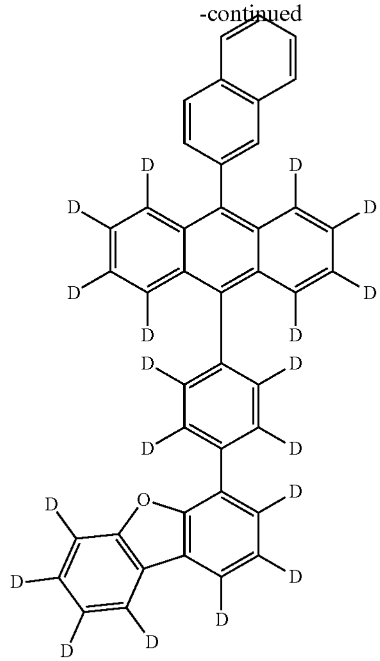
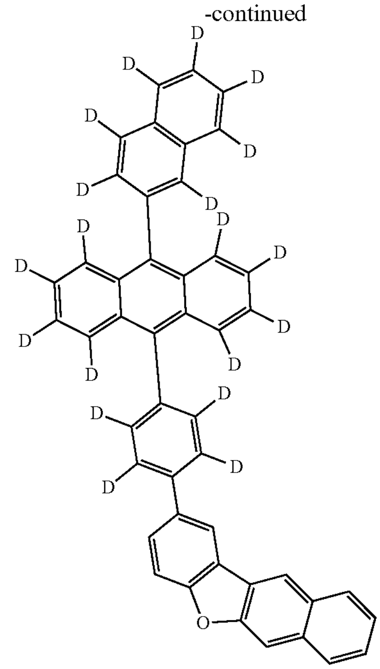
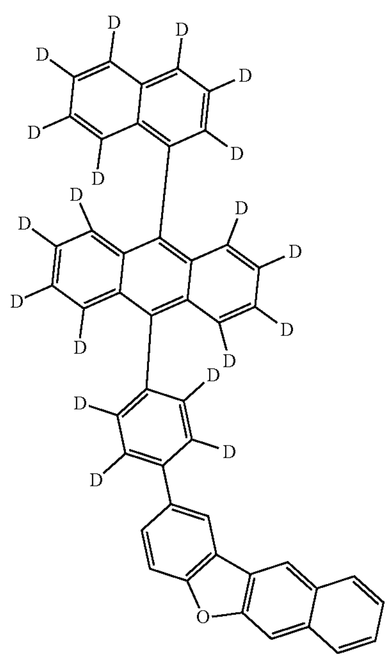
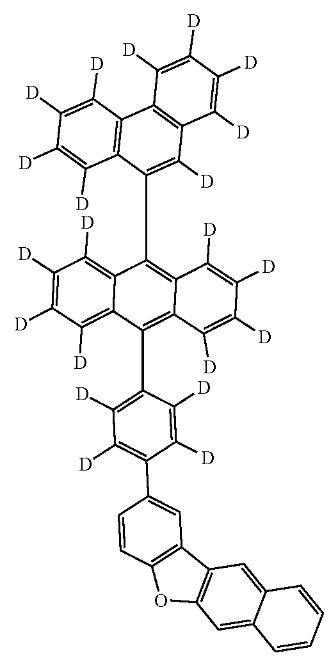

-continued
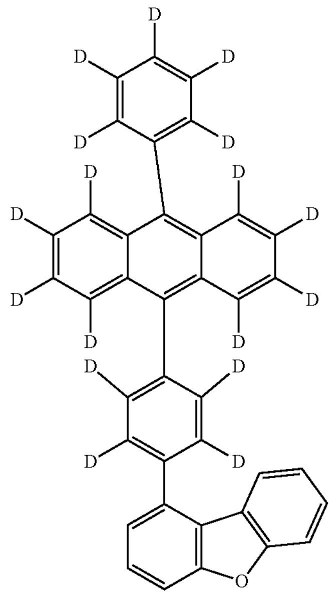
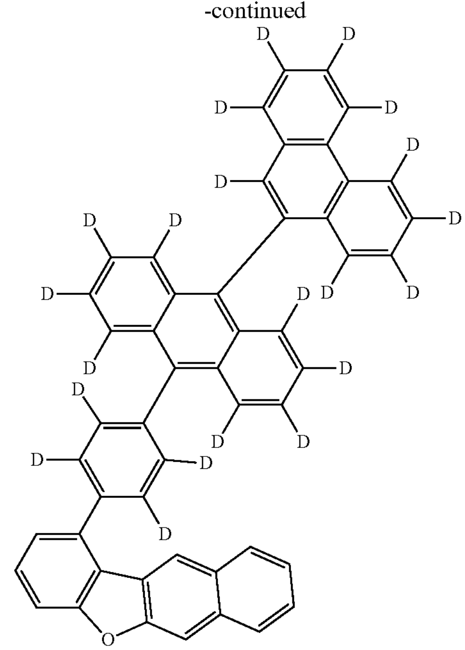
-continued
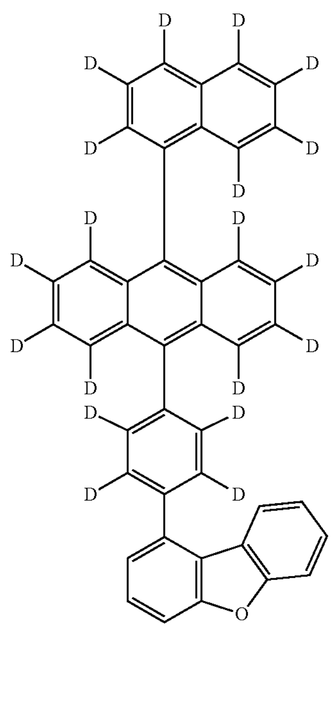
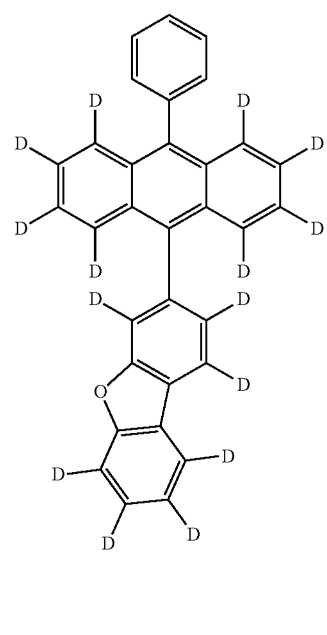

-continued
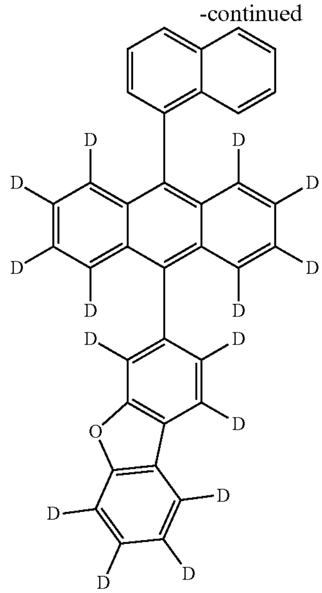
-continued
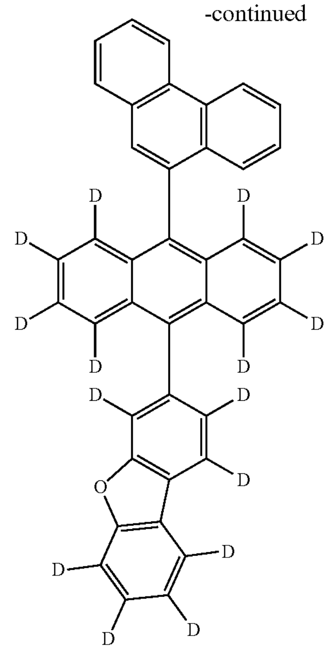
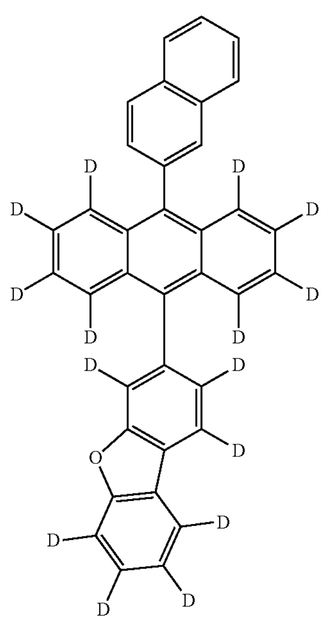
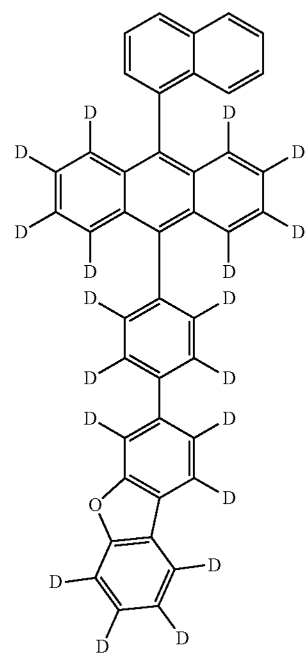

-continued
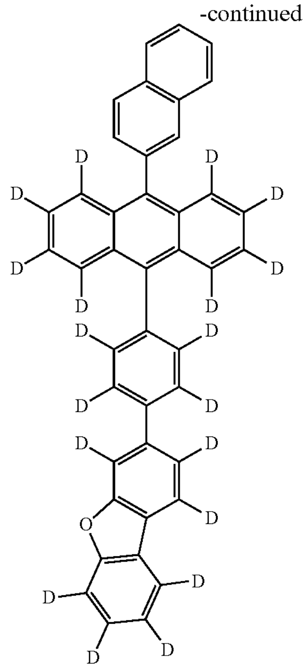
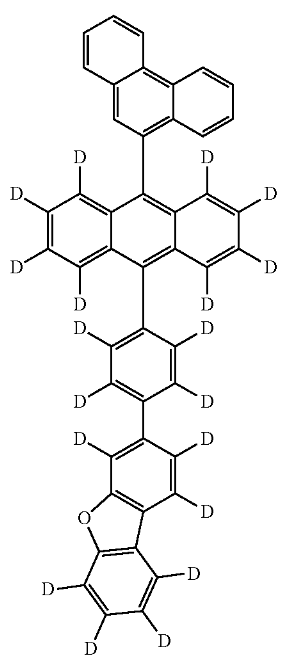
-continued
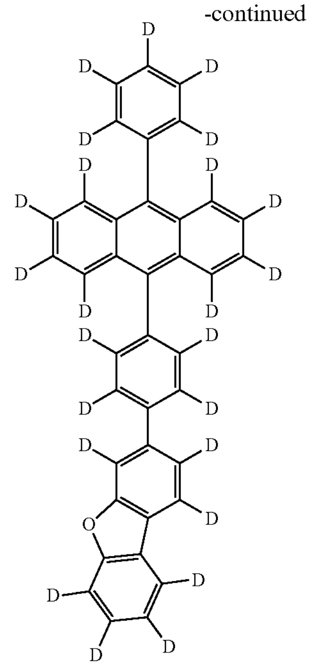
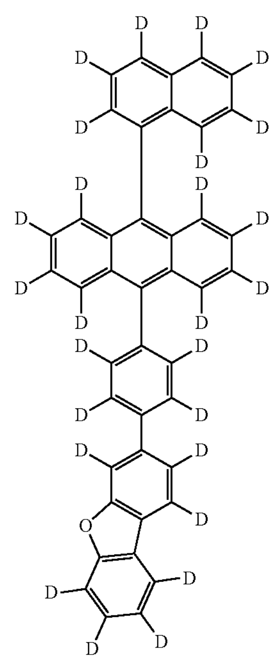

-continued
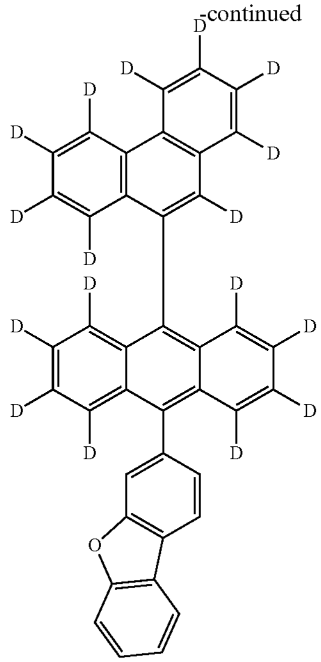
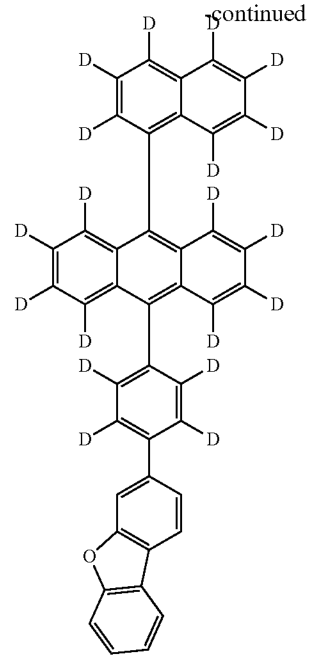
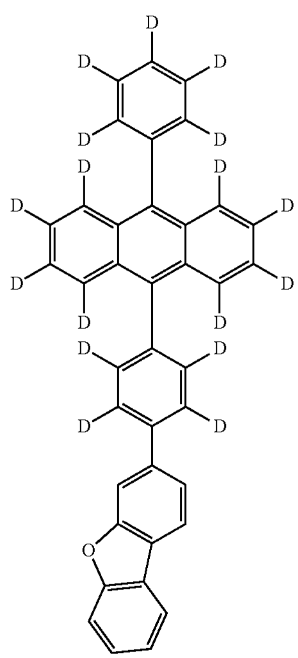
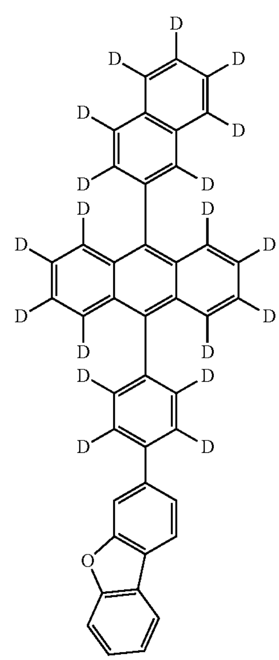

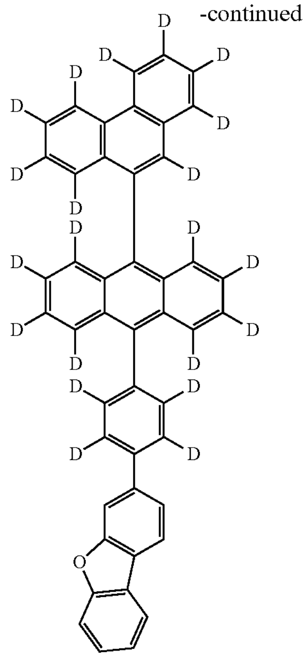
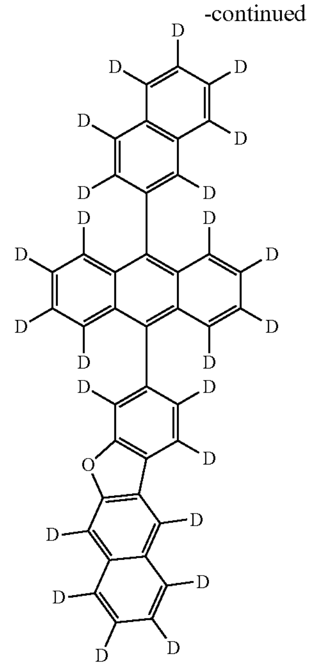
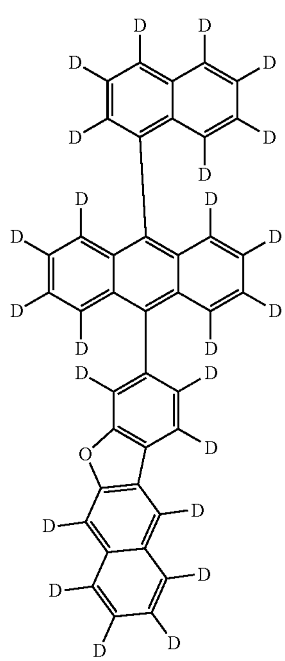
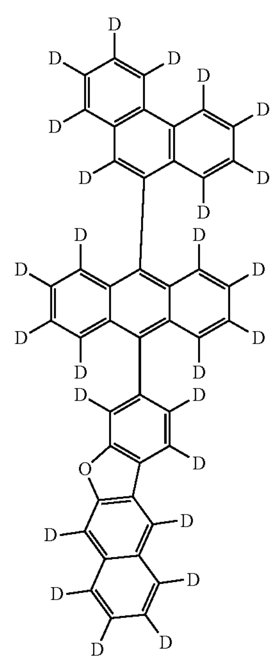

-continued
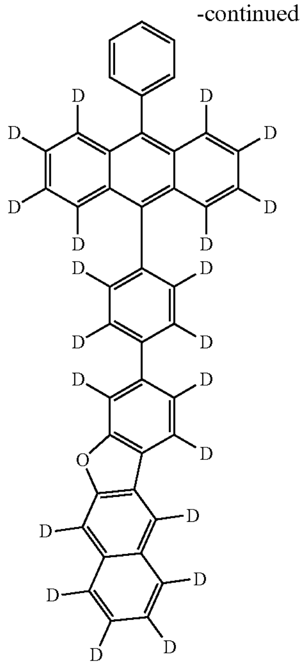
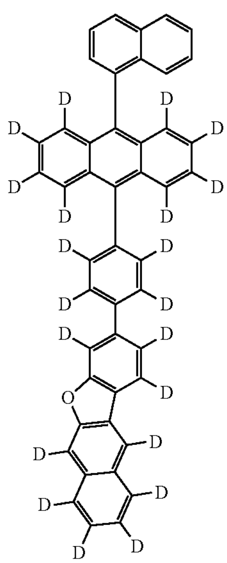
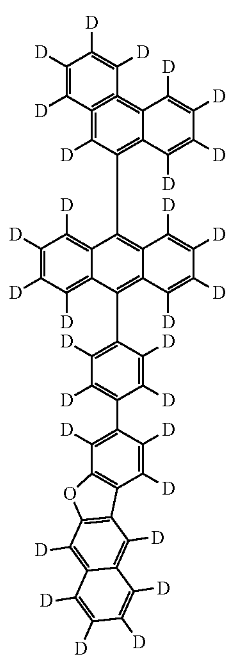
-continued
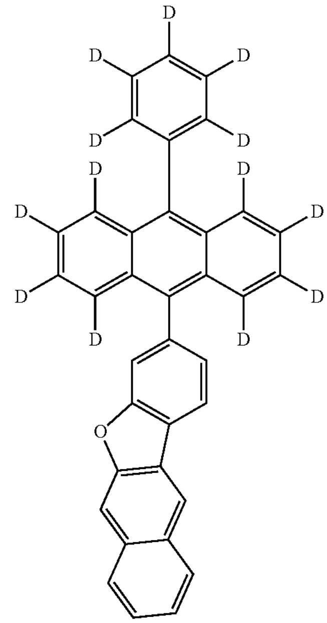
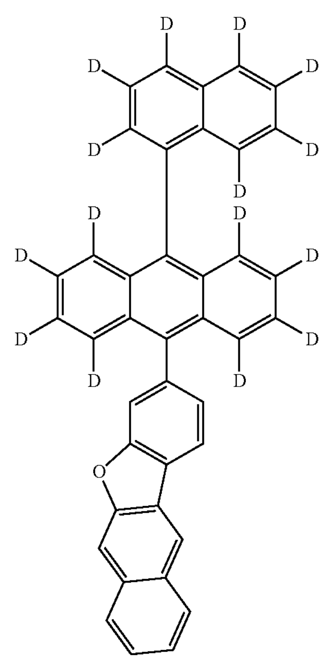

-continued
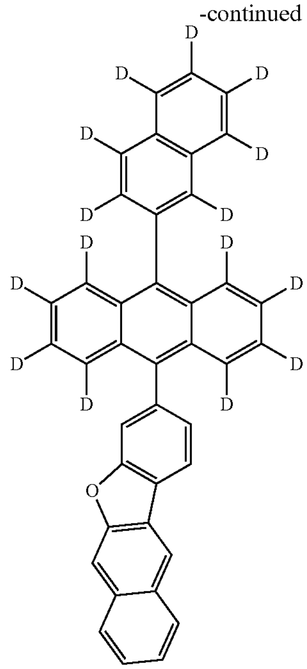
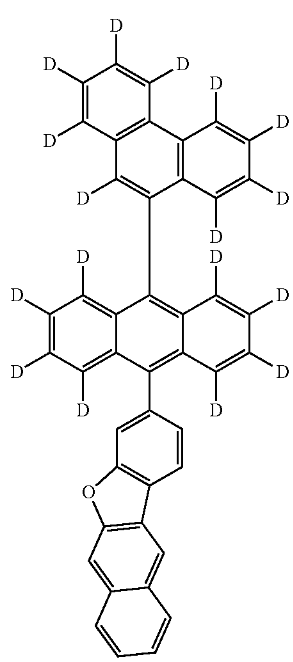
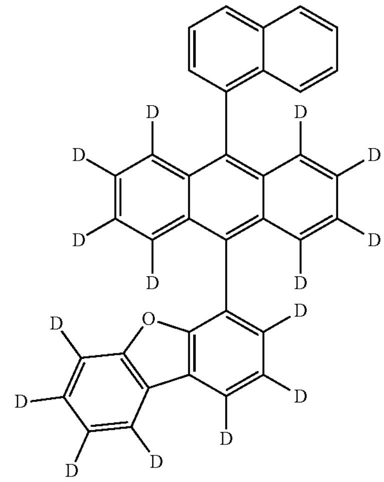
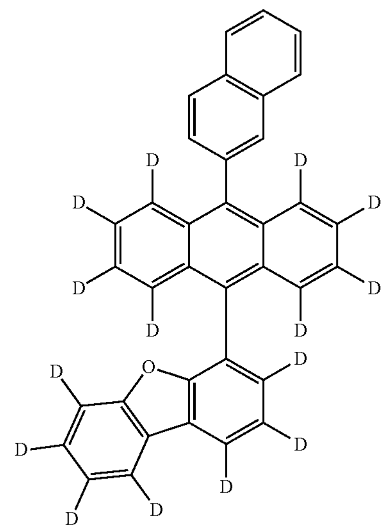
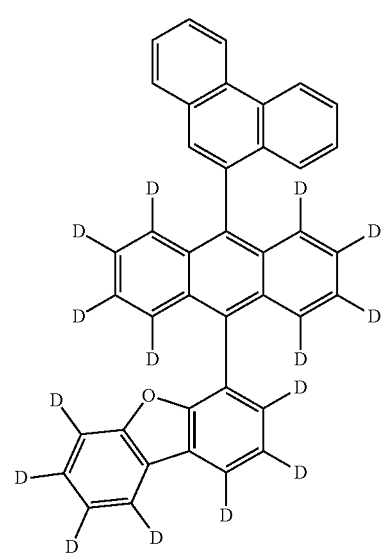

-continued
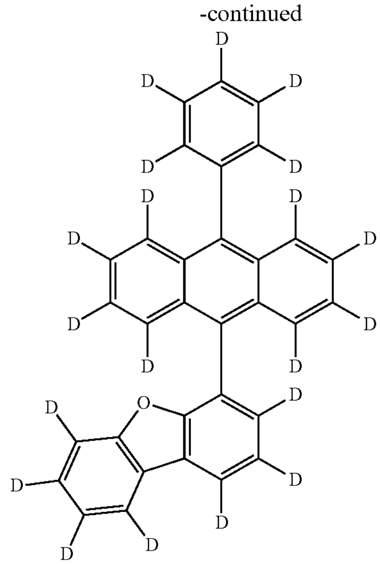
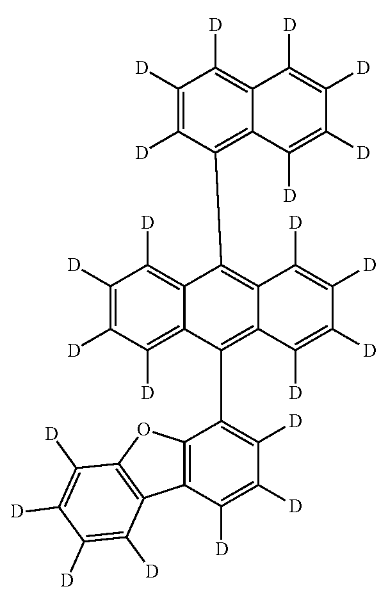
-continued
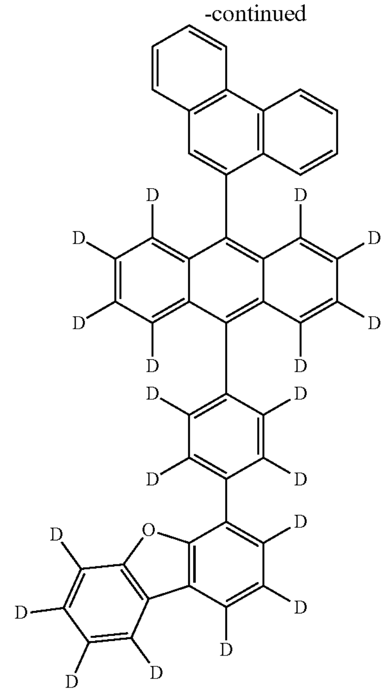
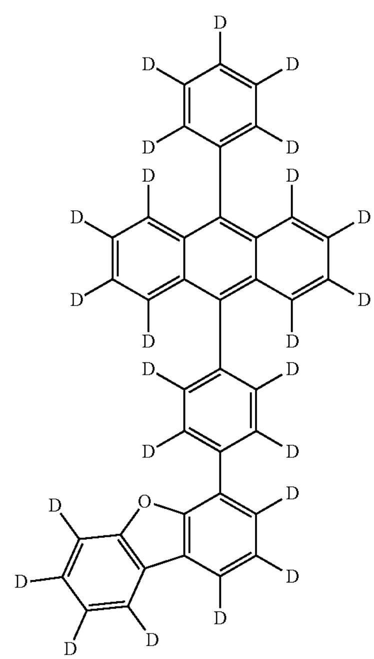

-continued
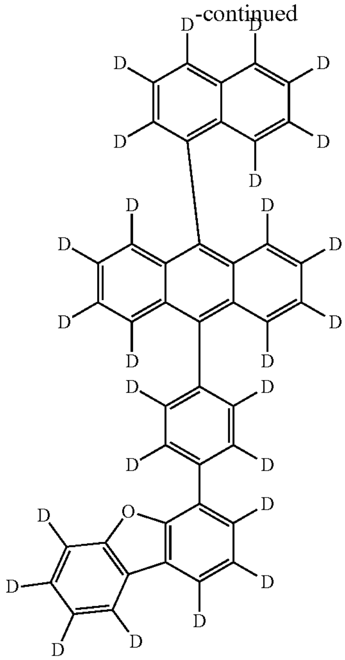
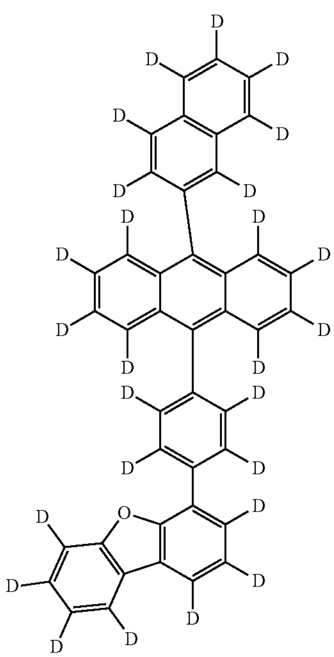
-continued
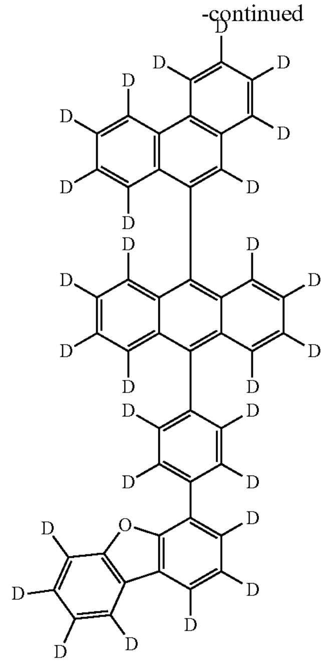
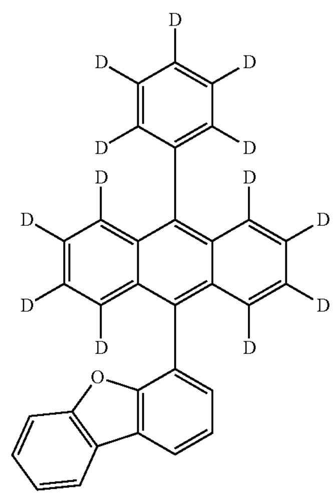
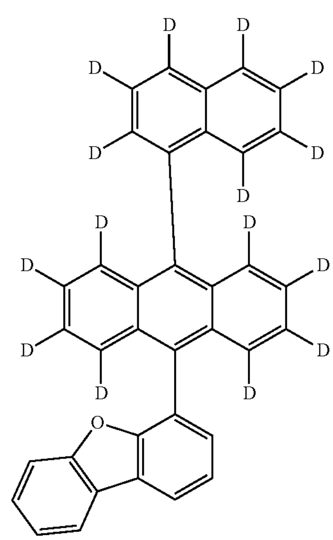

-continued
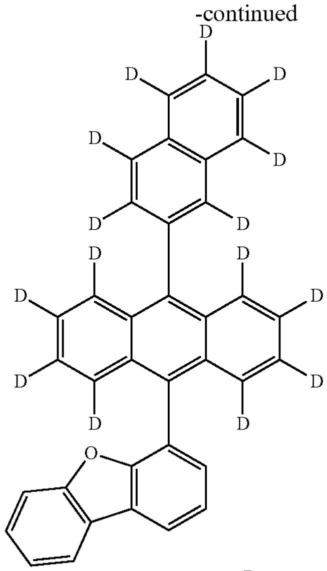
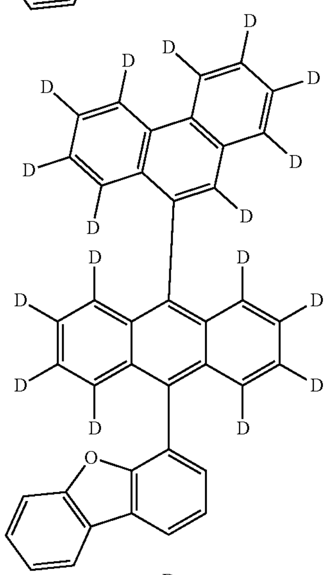
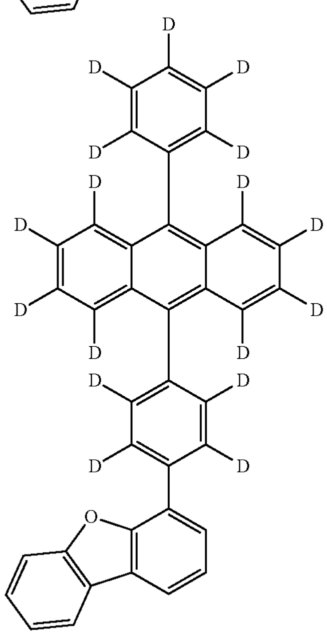
-continued
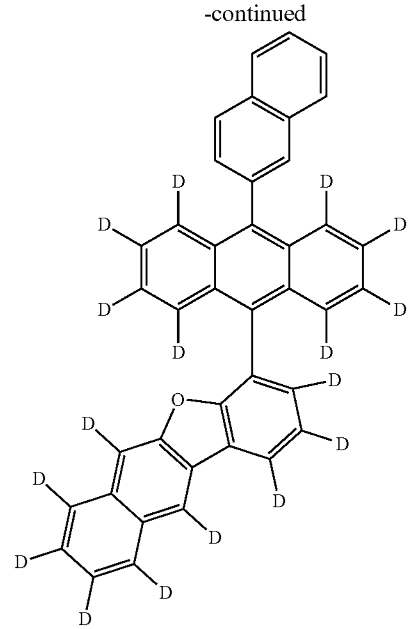
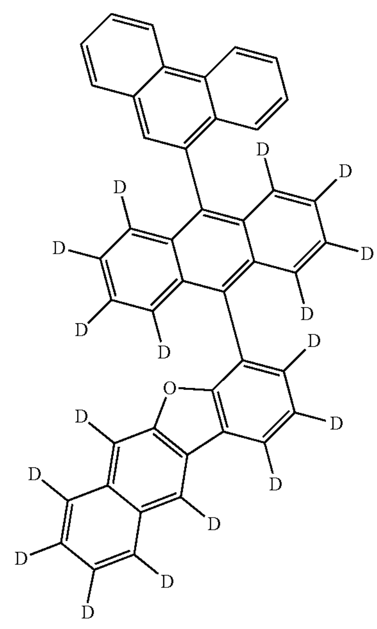

-continued
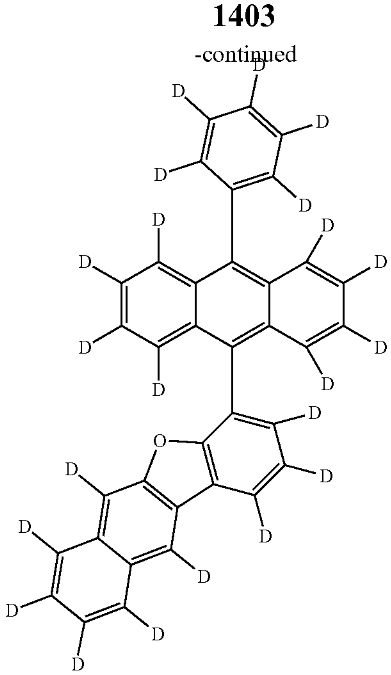
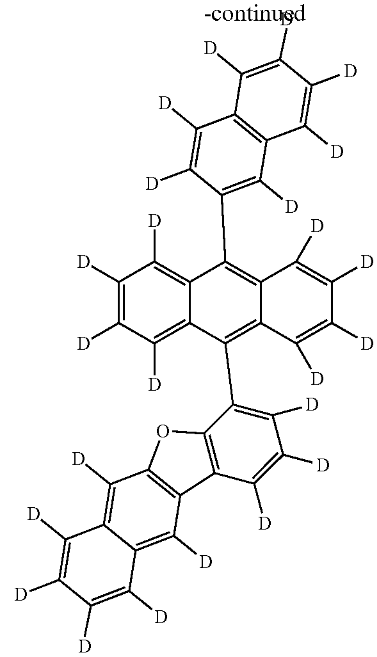
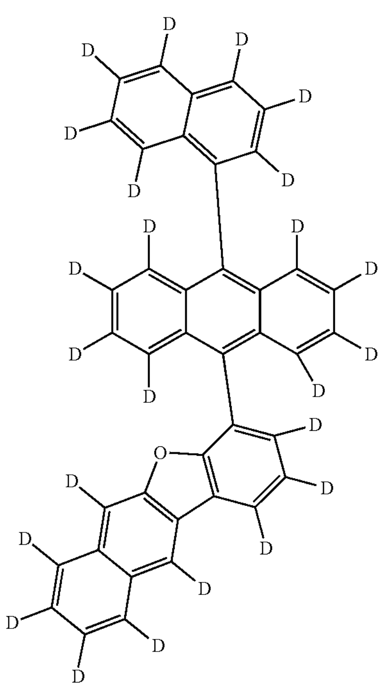
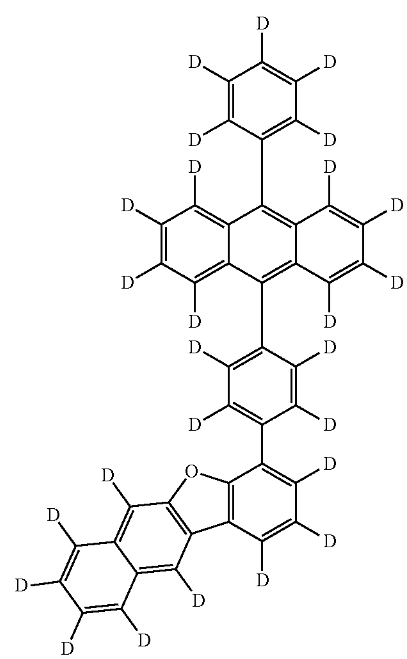

-continued
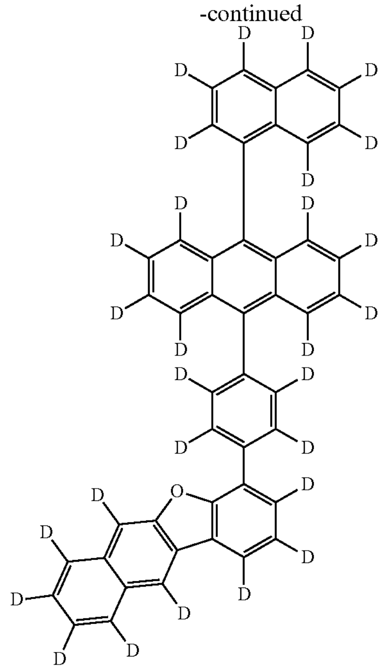
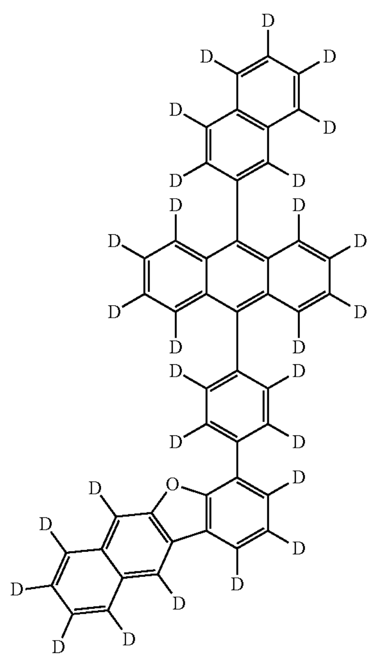
-continued
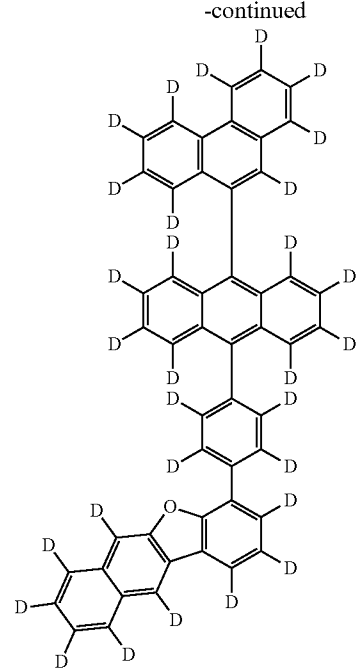
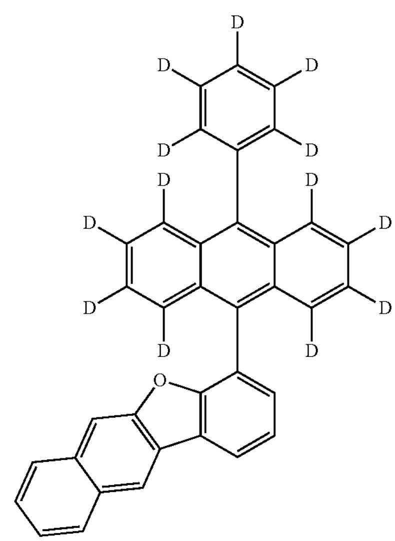

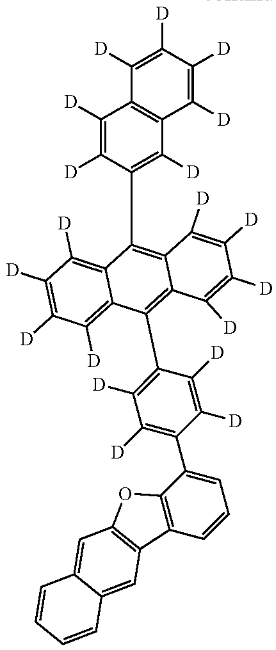
D
O
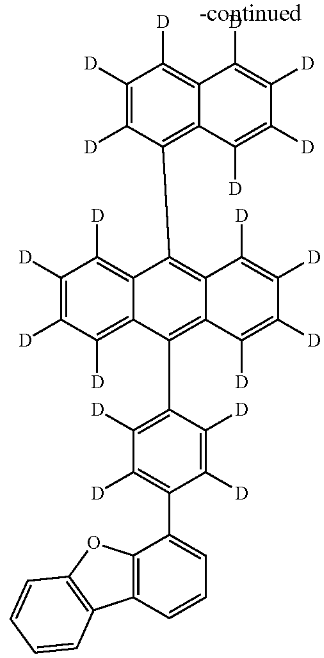
D
O
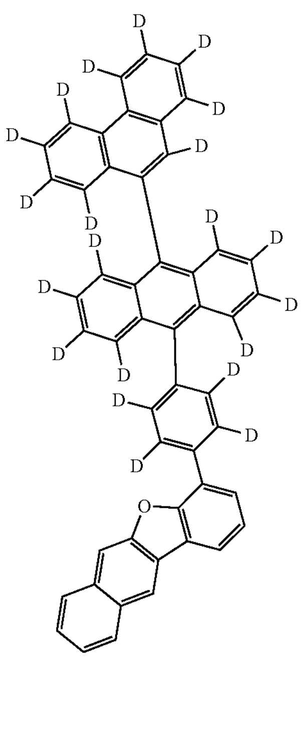
D
O
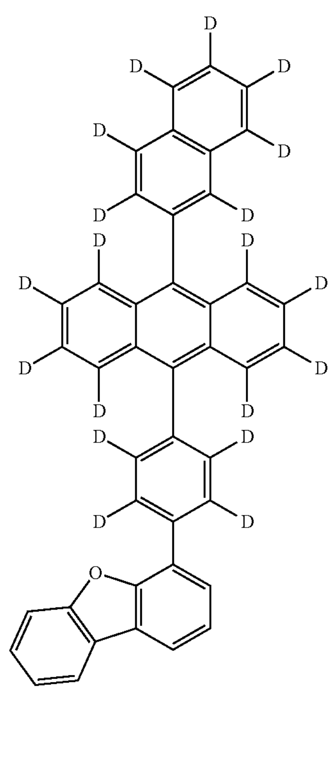
D
O

-continued
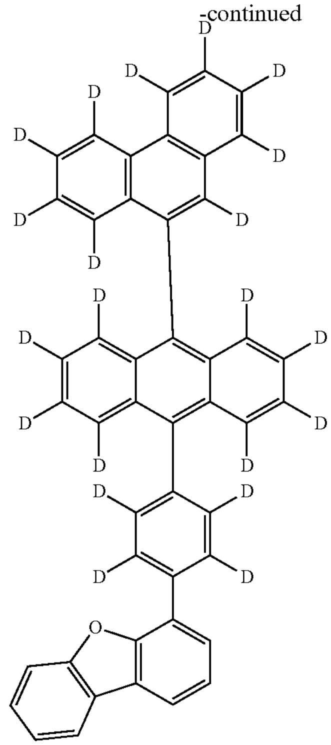
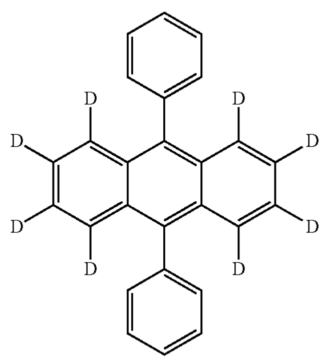
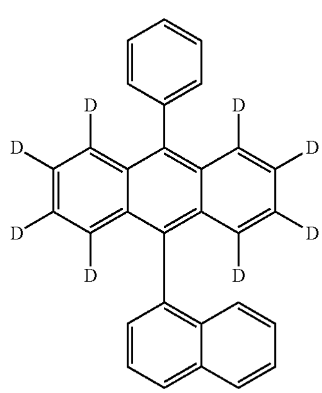
-continued
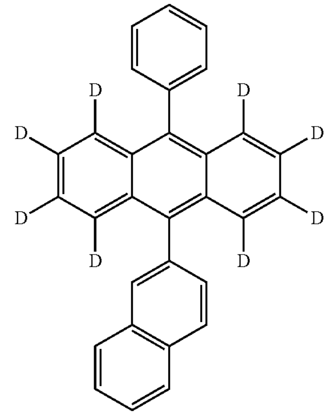
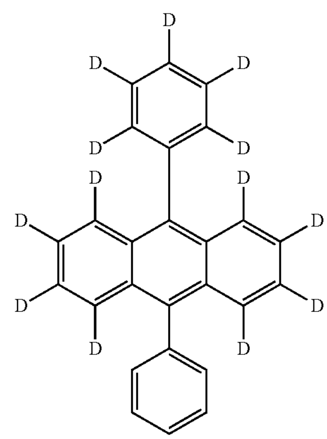
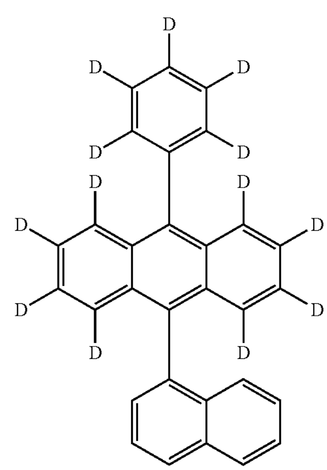

-continued
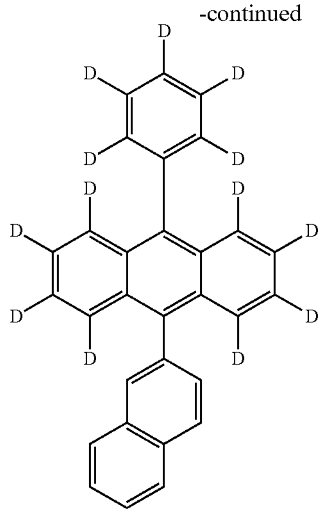
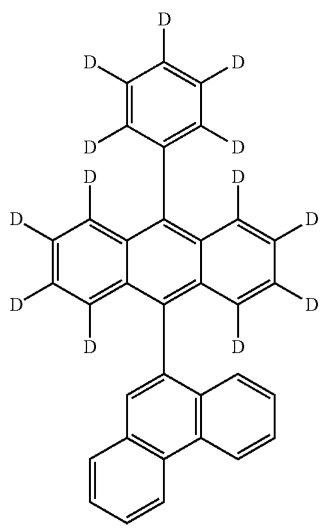
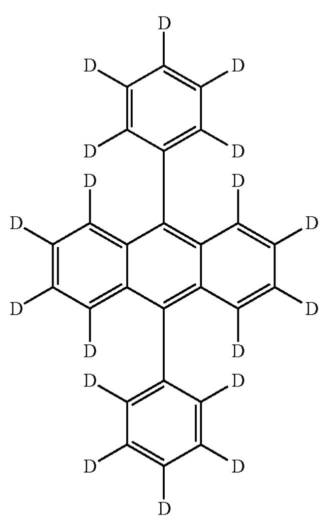
-continued
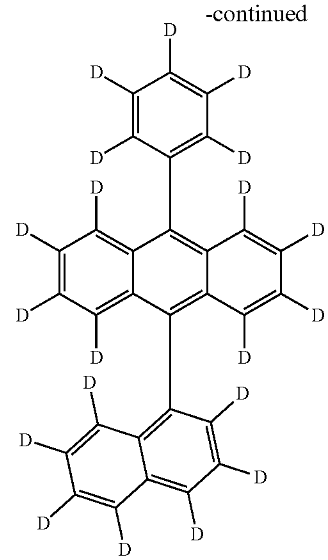
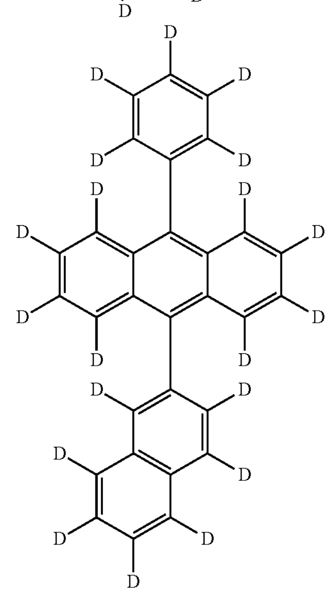
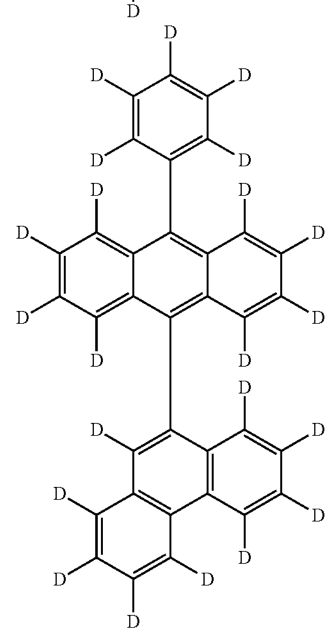

-continued
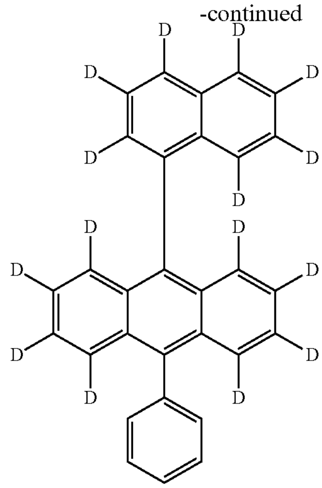
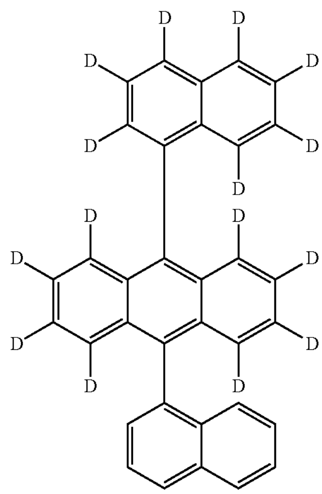
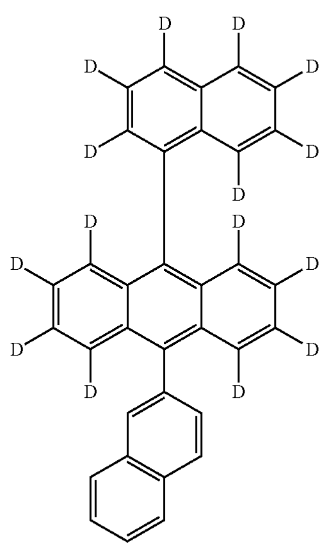
-continued
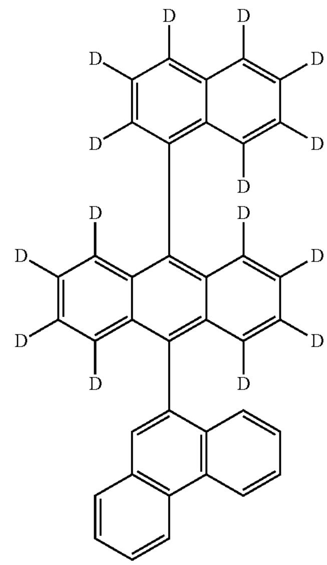
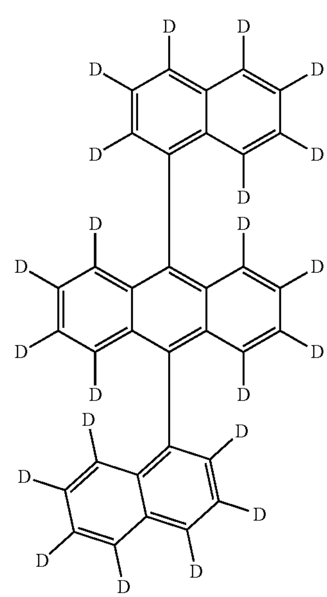

-continued
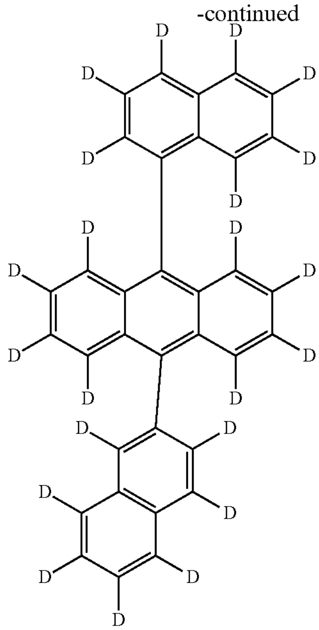
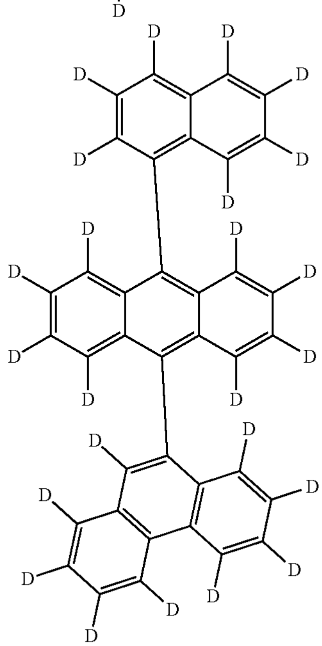
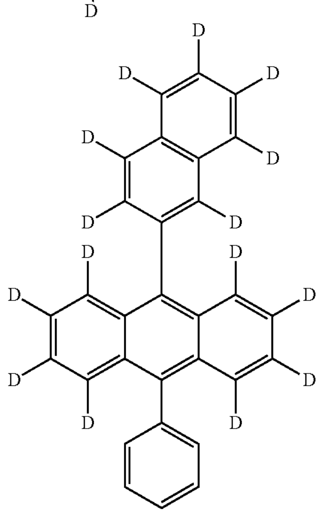
-continued
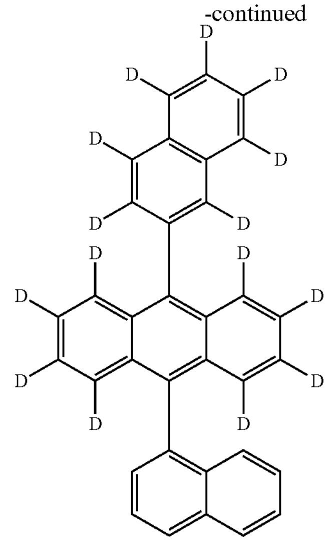
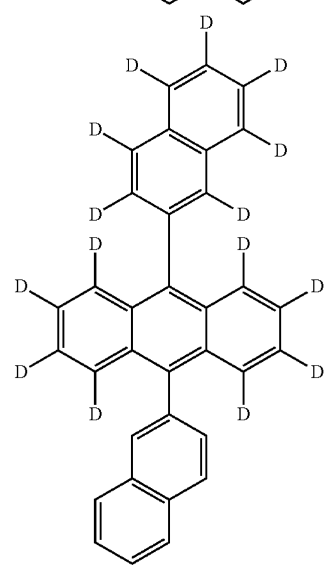
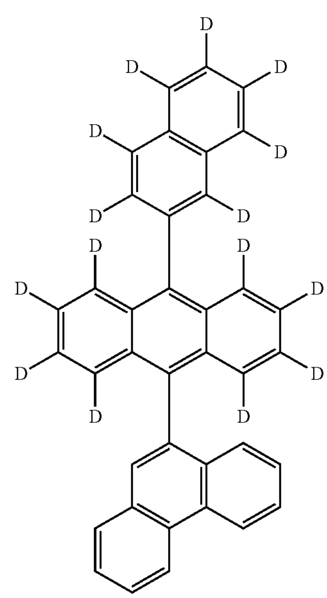

-continued
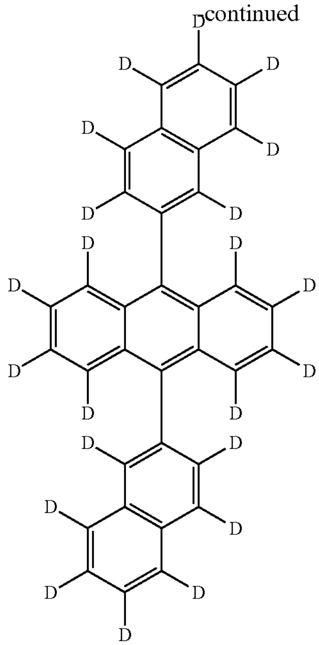
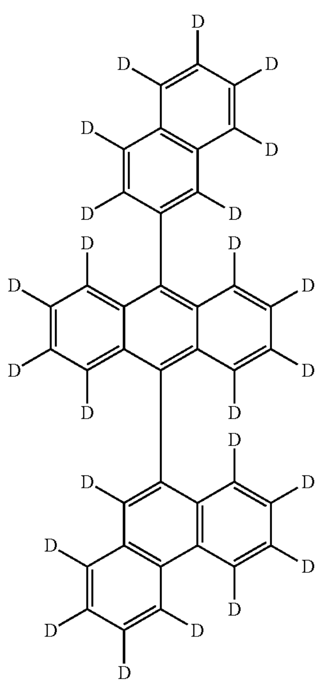
-continued
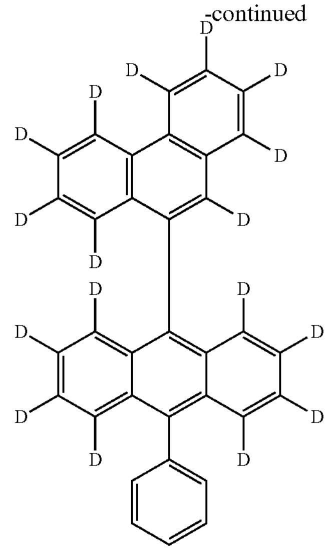
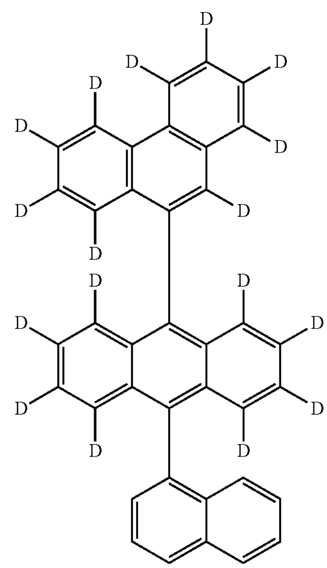
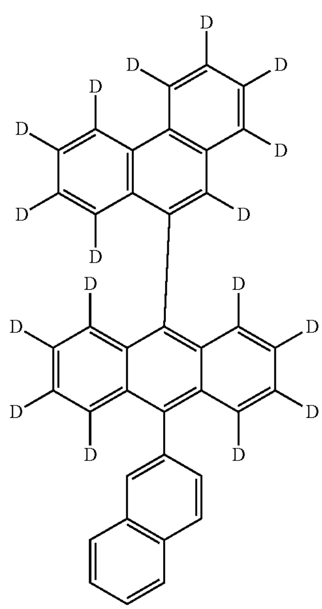

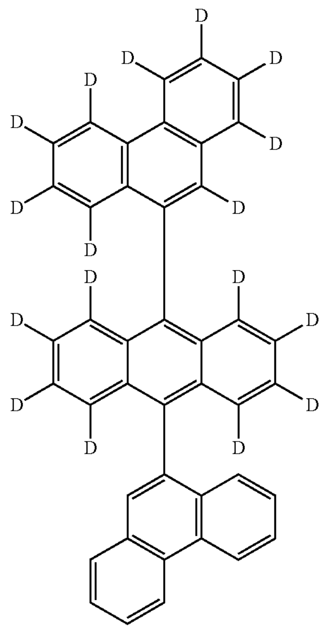
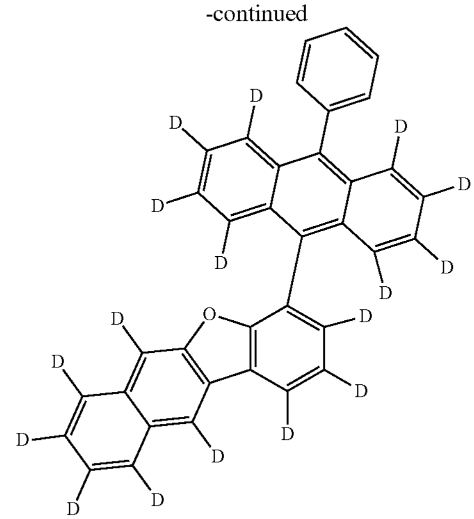
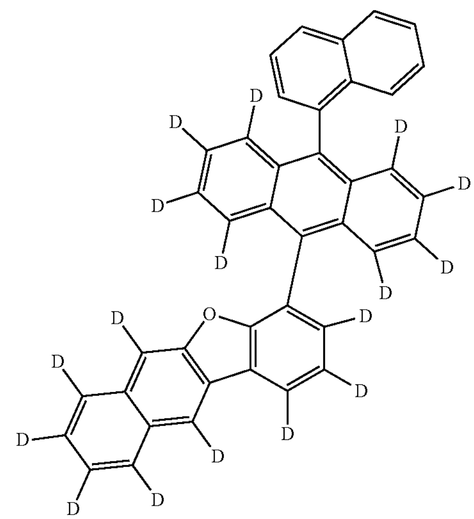
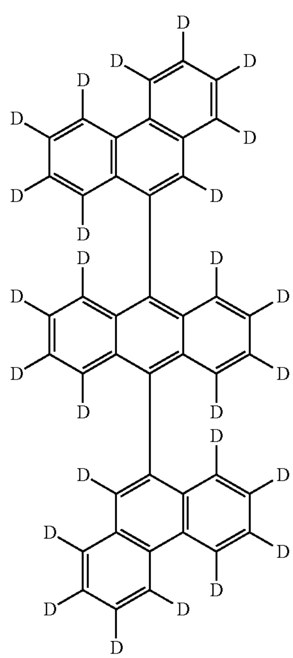
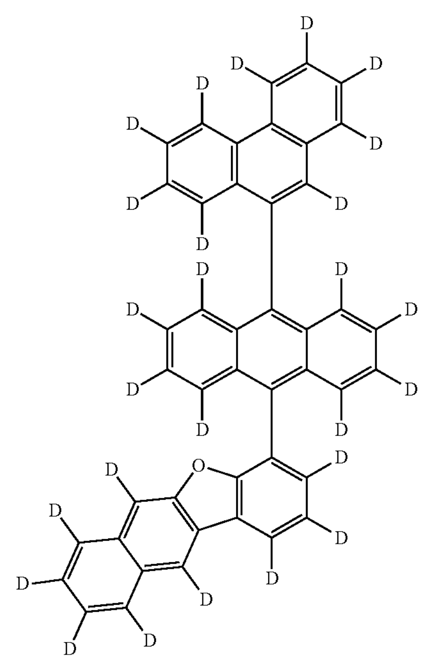

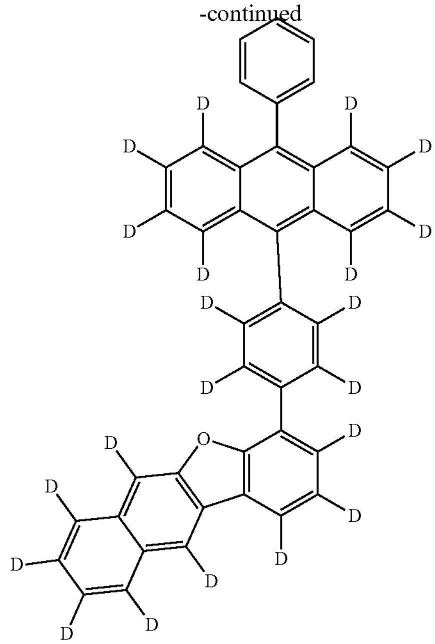
O
D
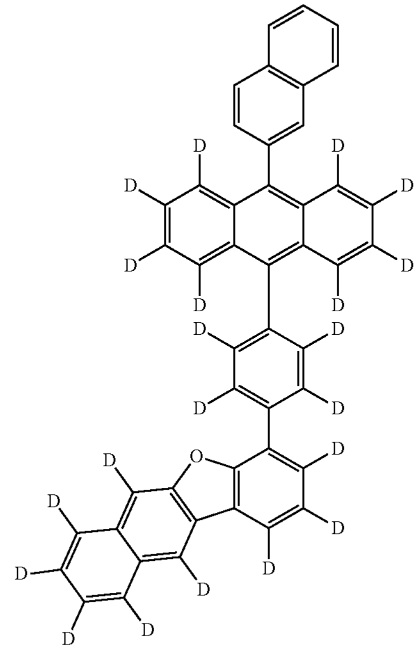
O
D
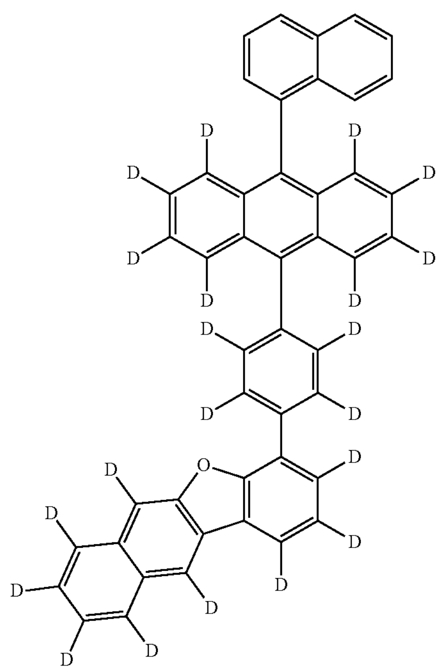
O
D
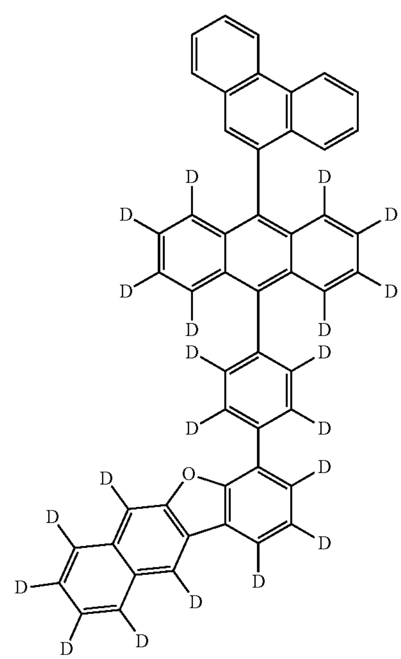
O
D

-continued
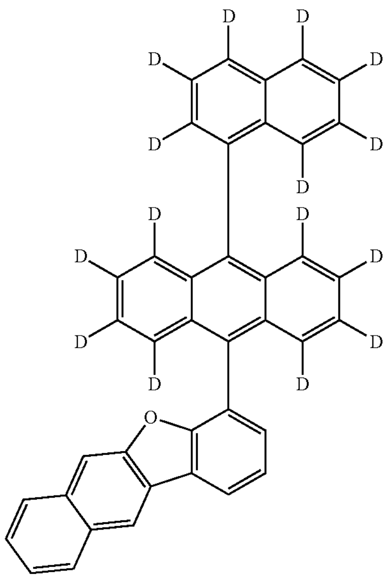
-continued
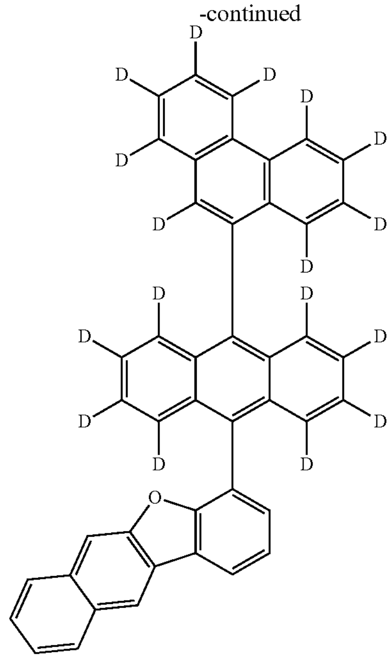
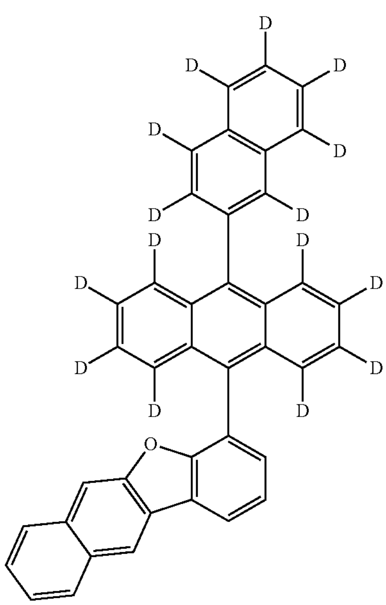
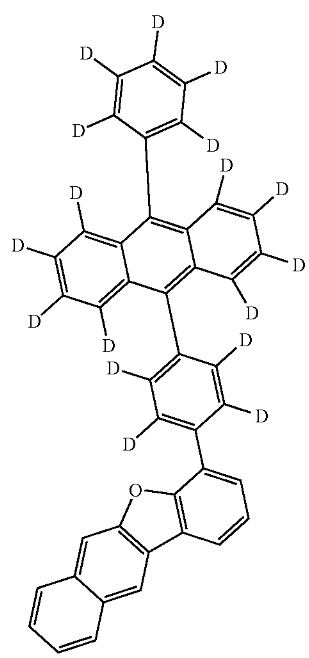

-continued
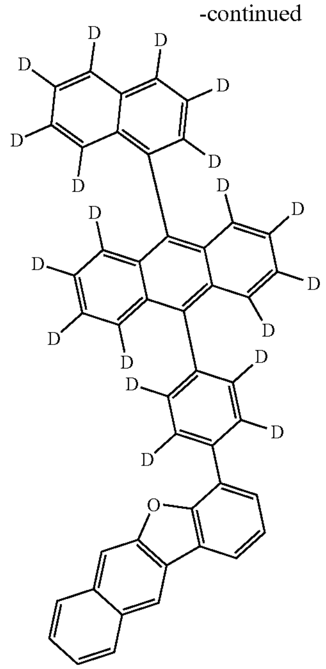
-continued
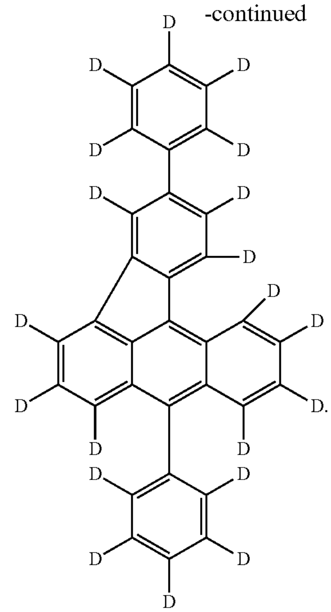
10. The organic light emitting device of claim 1, wherein the compound of Formula 2 is any one compound selected from the following compounds:
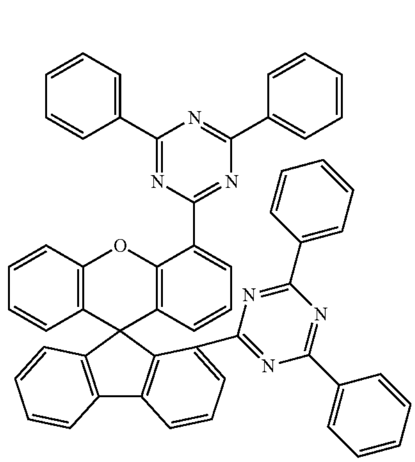
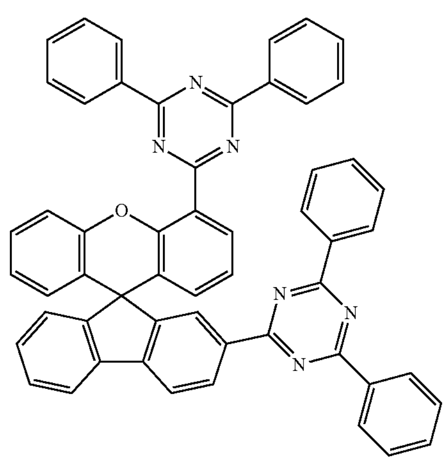

-continued
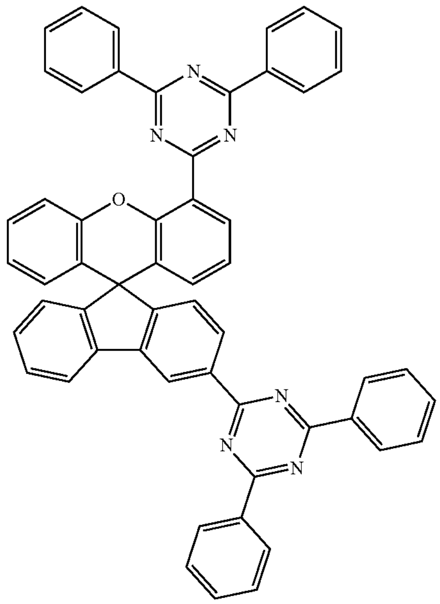
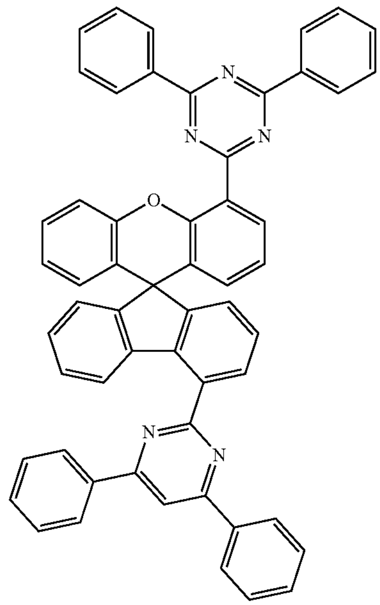
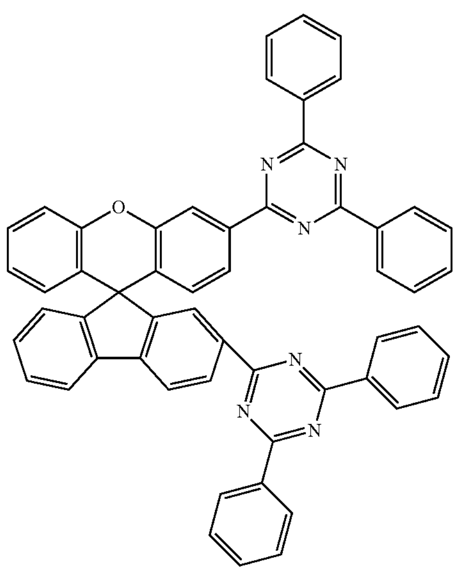
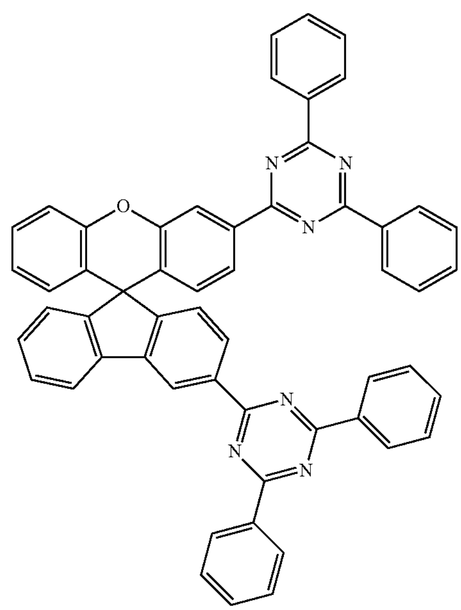

-continued
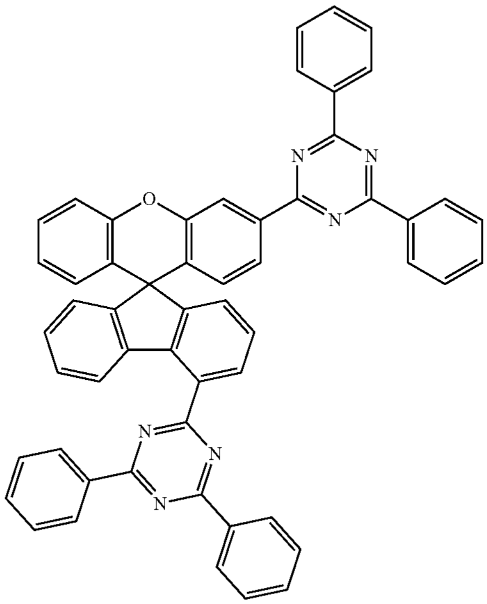
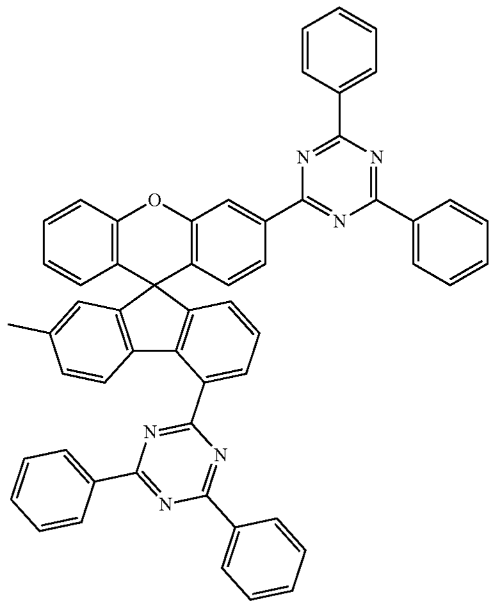
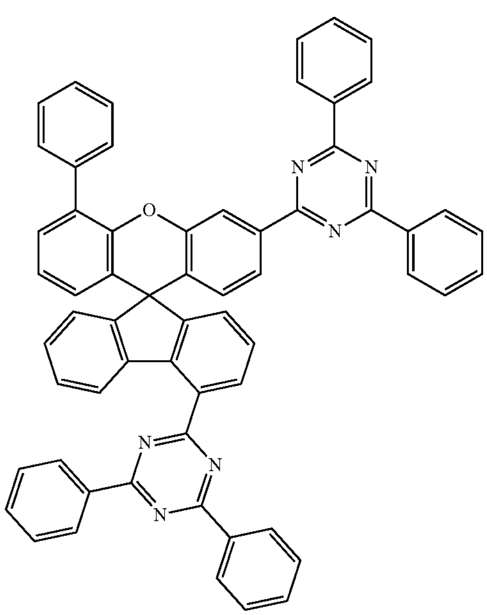
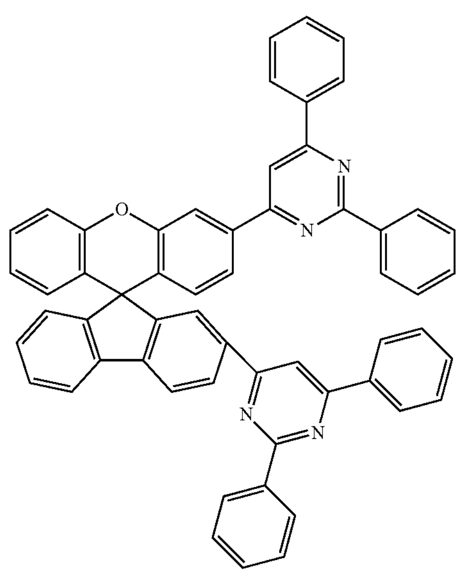

-continued
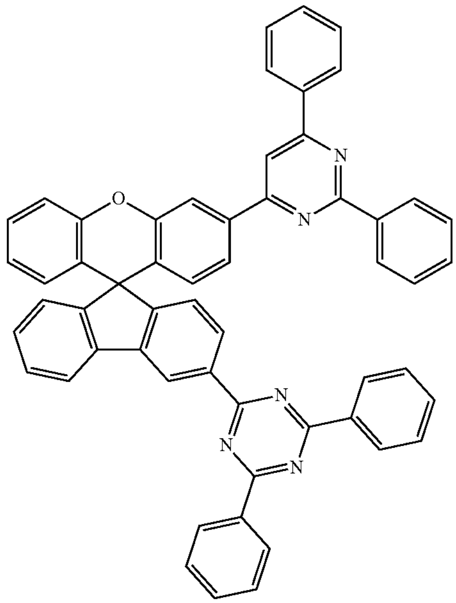
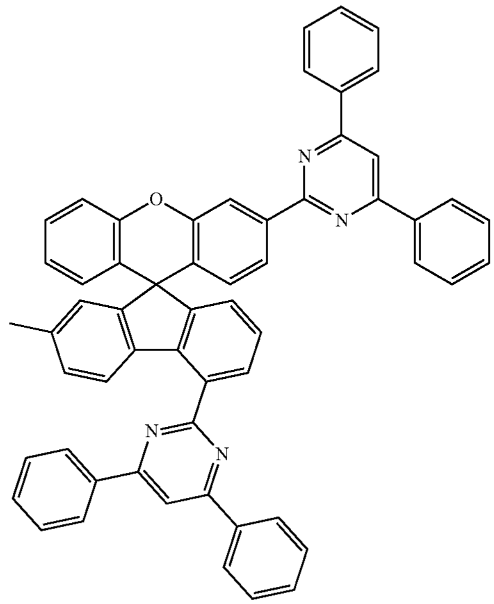
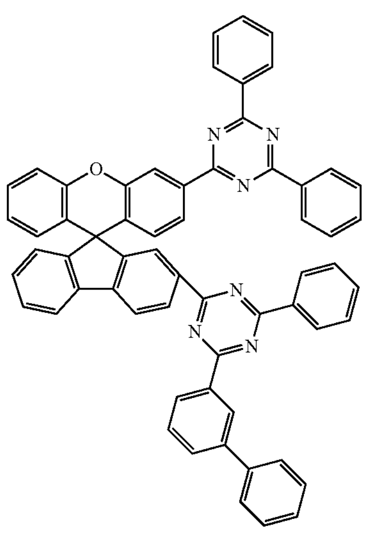
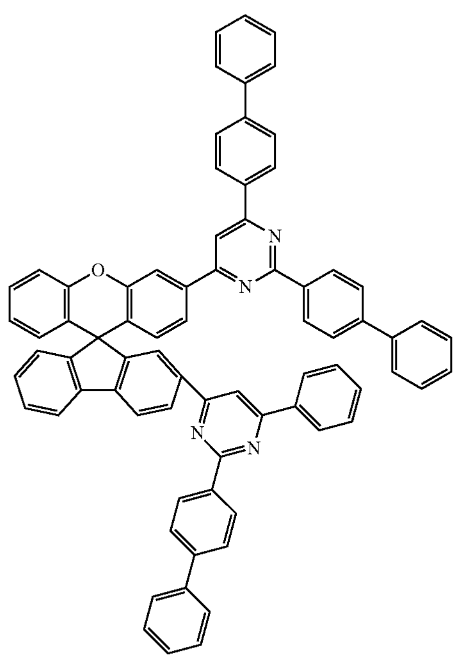

-continued
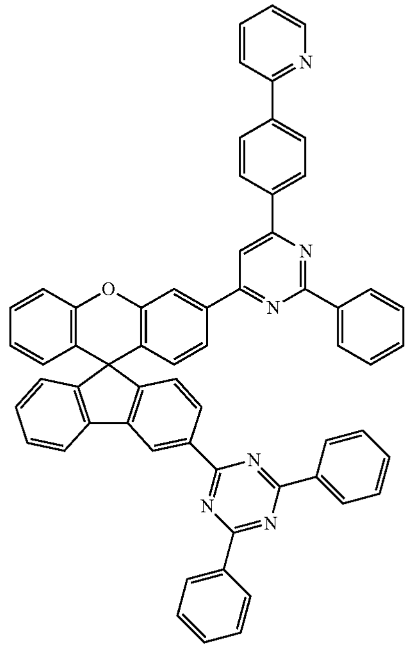
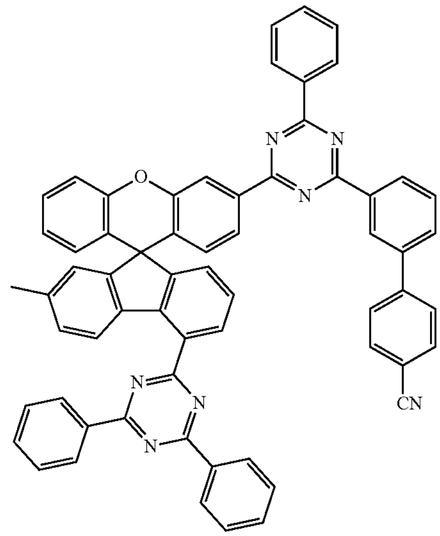
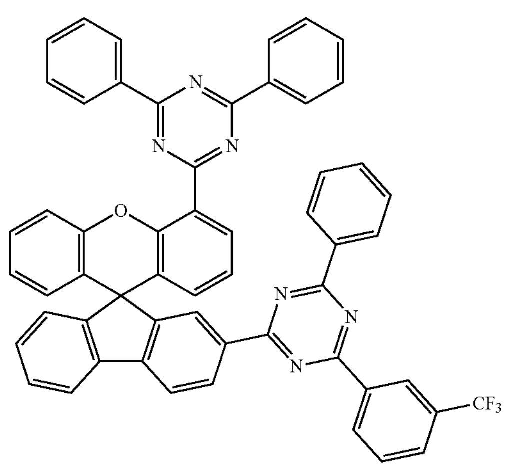
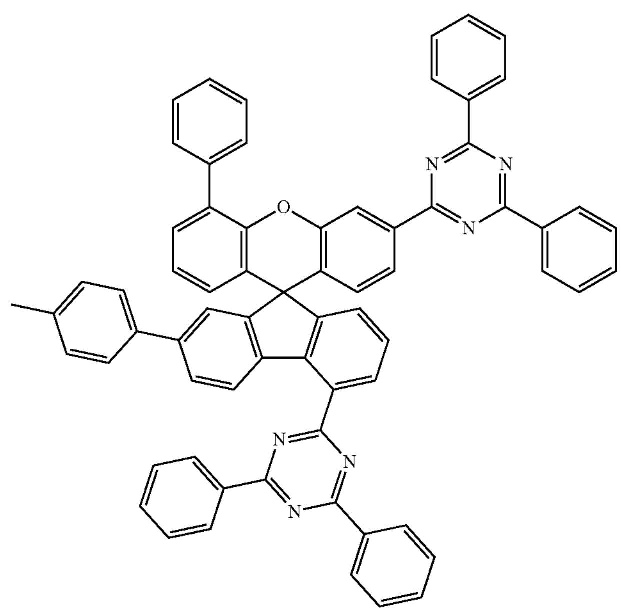

-continued
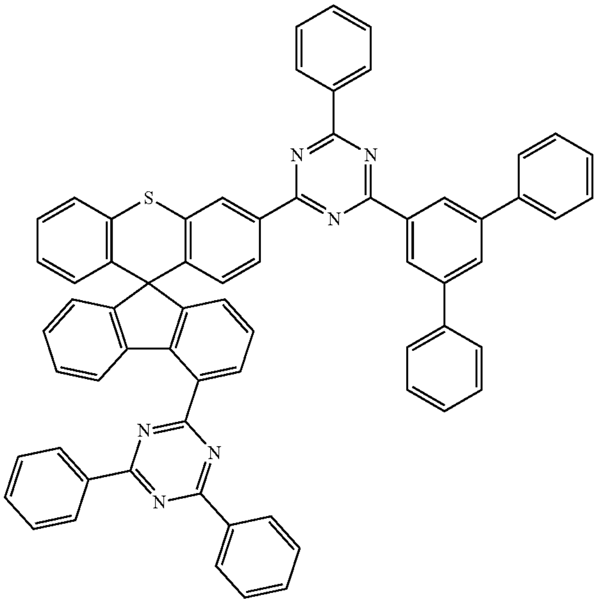
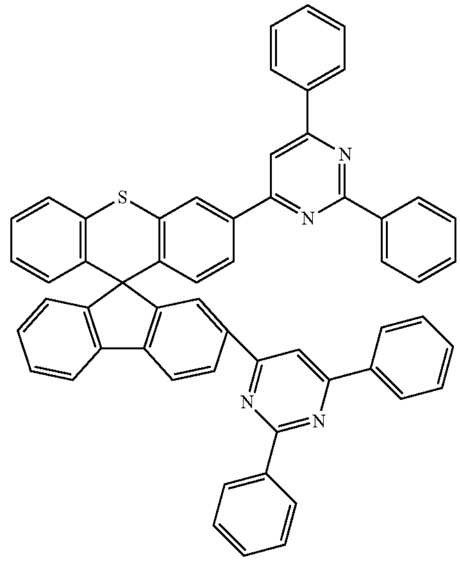
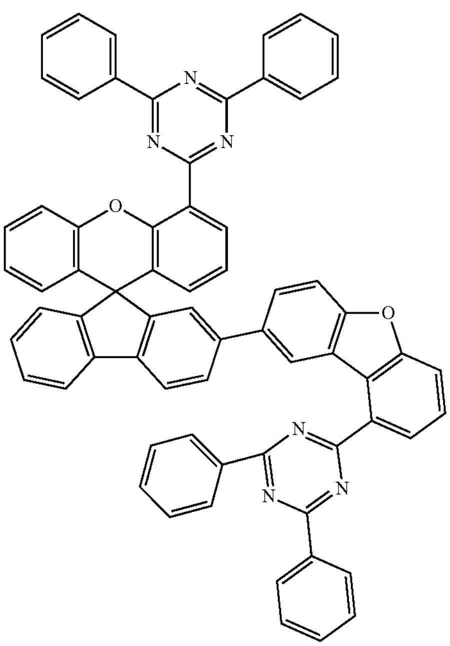
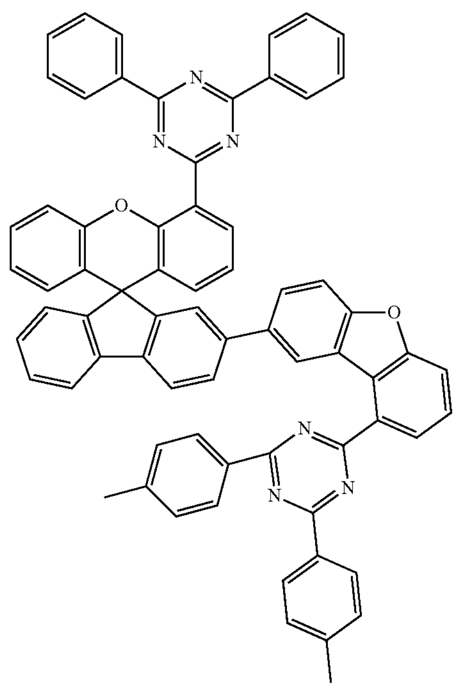

-continued
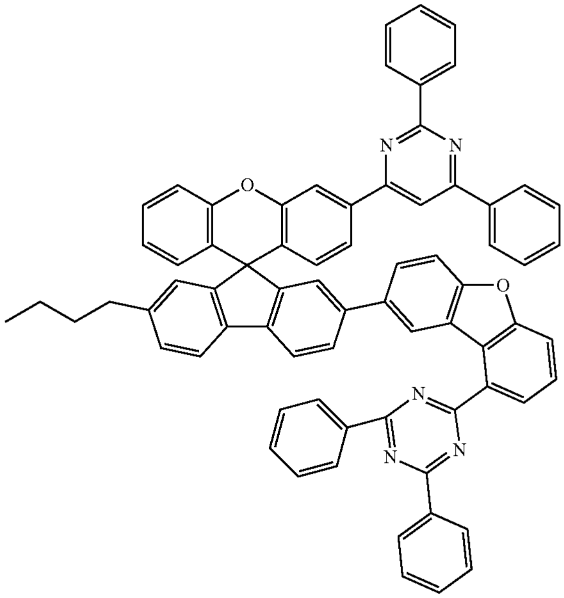
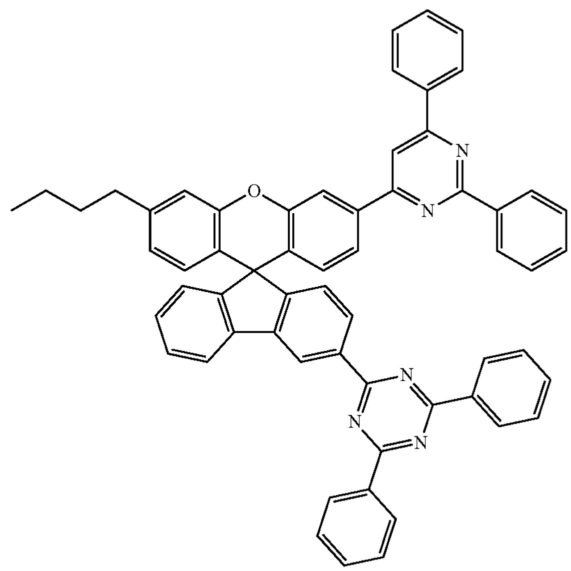
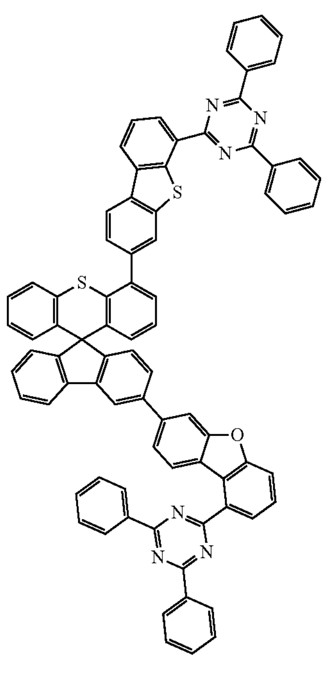
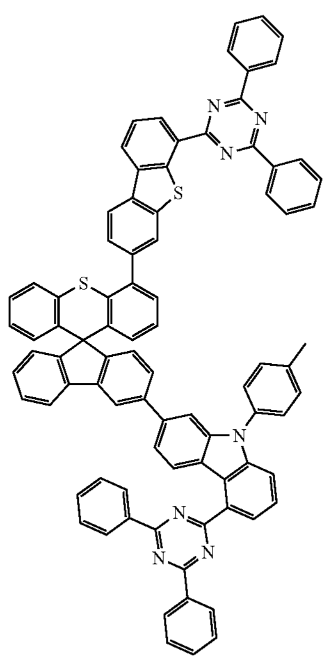

-continued
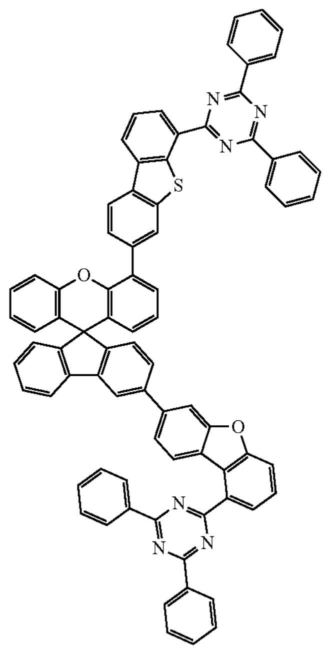
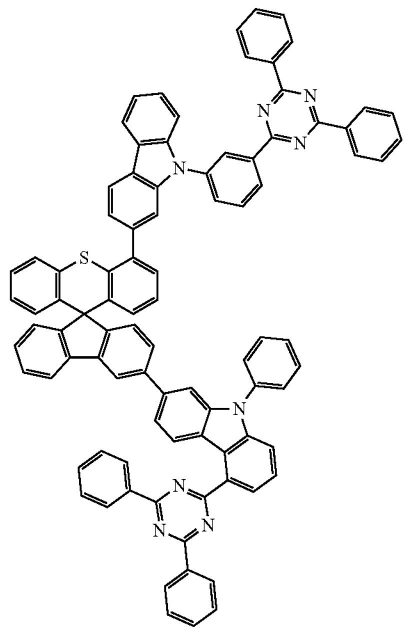
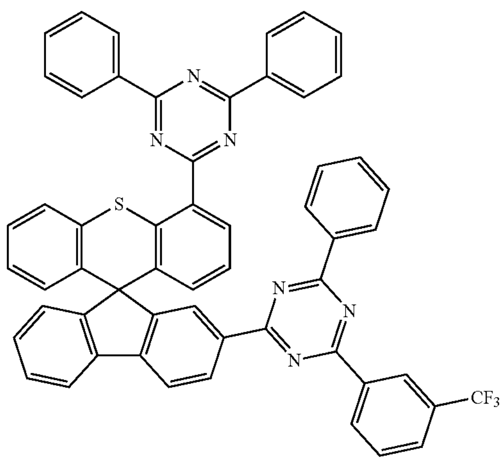
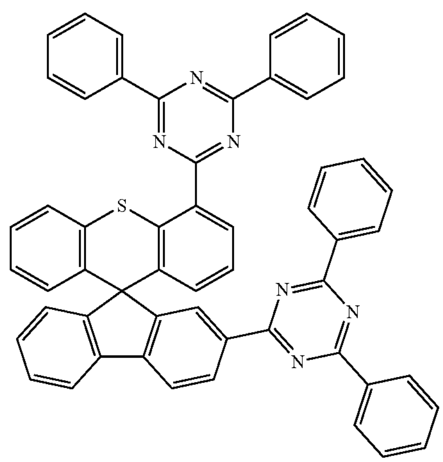
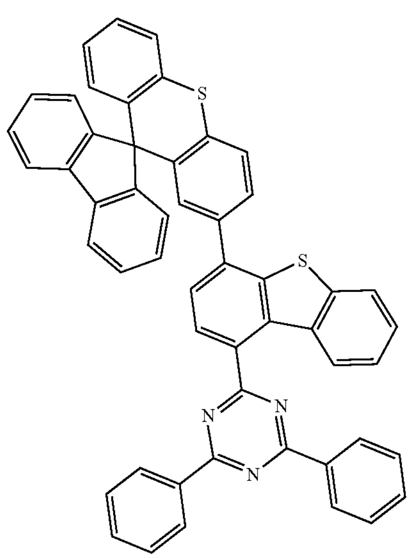
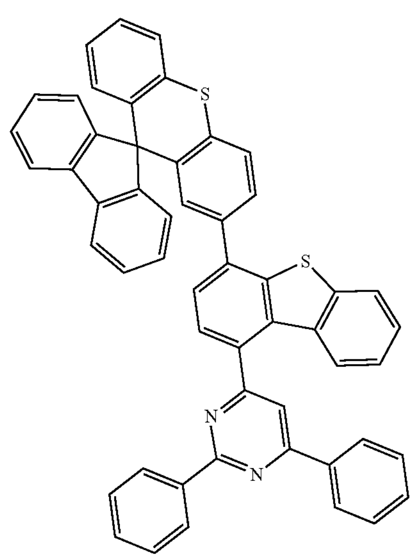

-continued
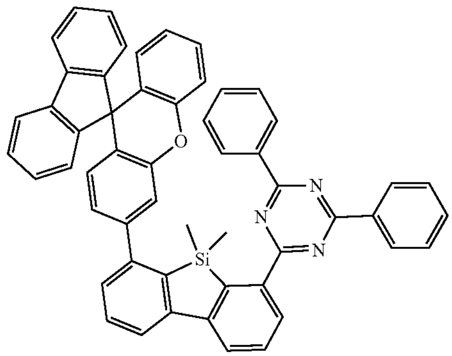
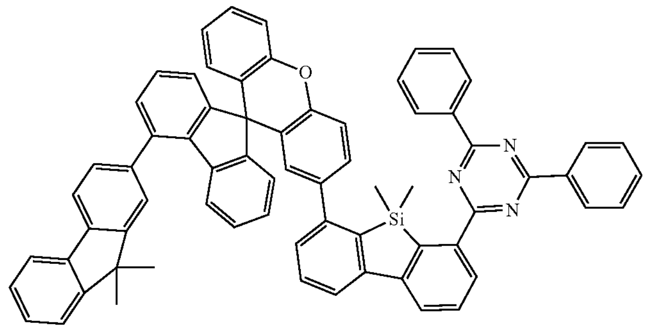
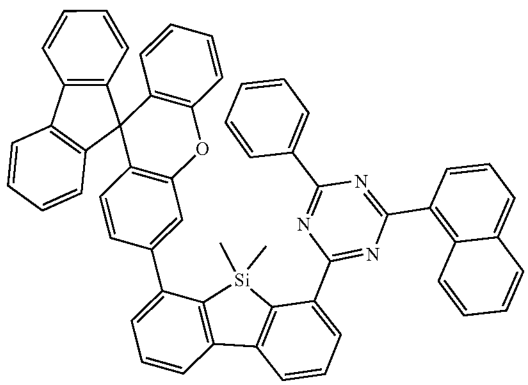
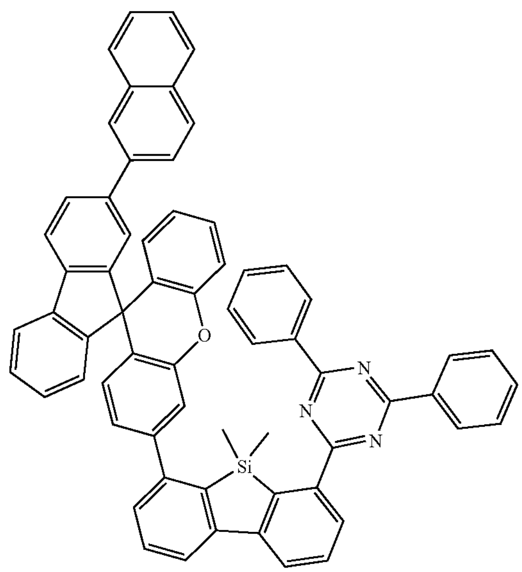
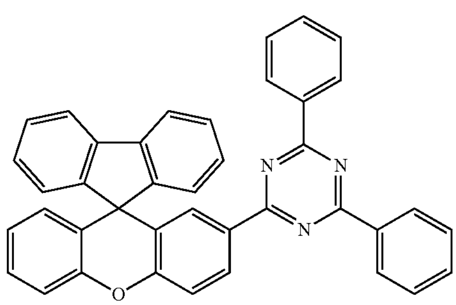
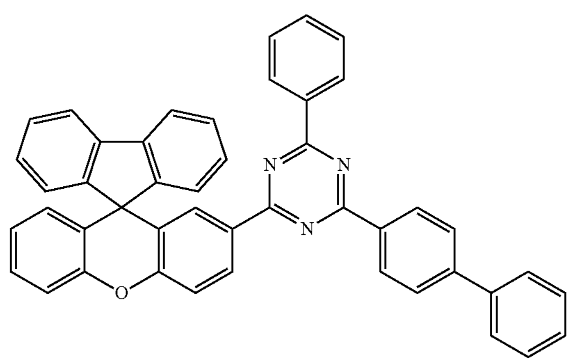

-continued
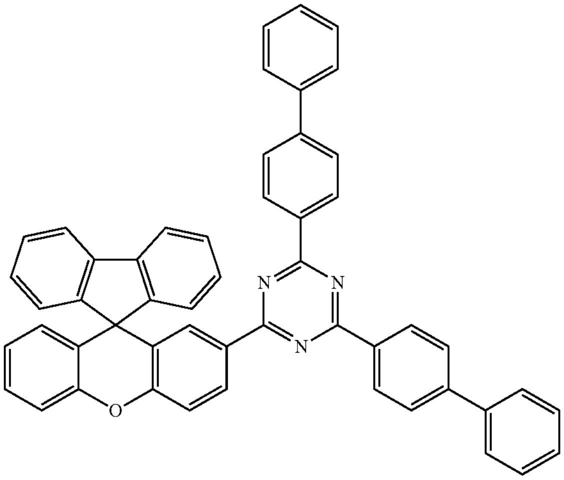
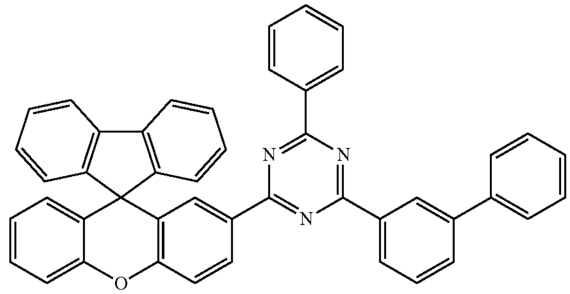
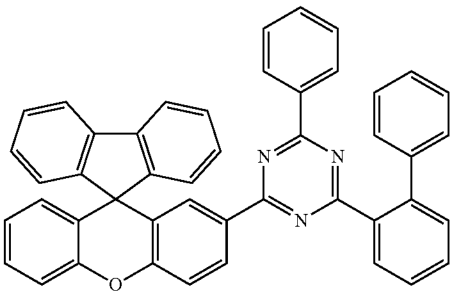
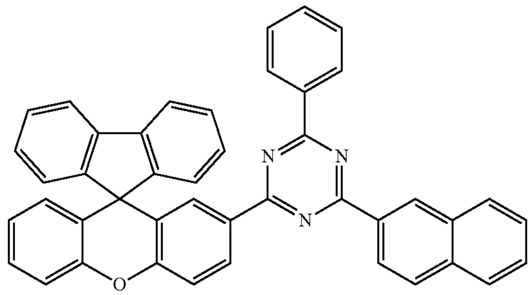
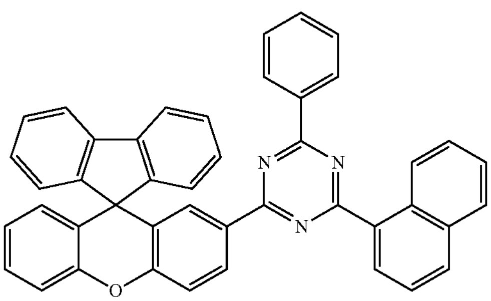
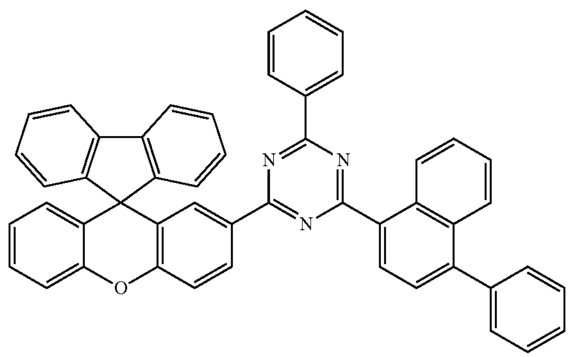
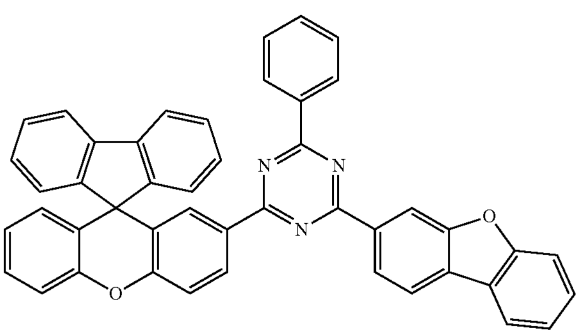
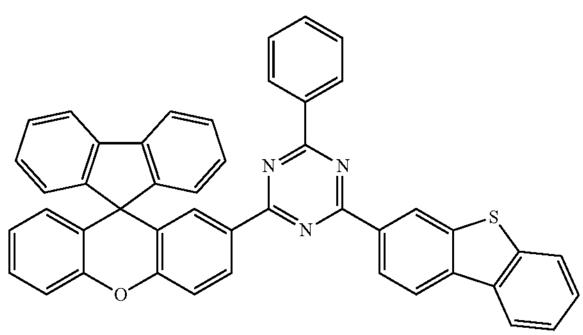

-continued
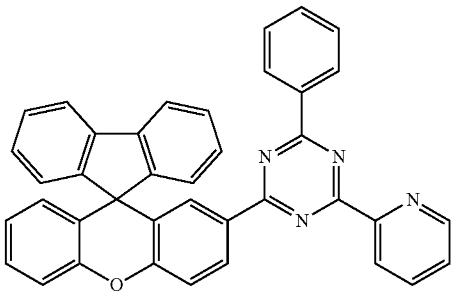
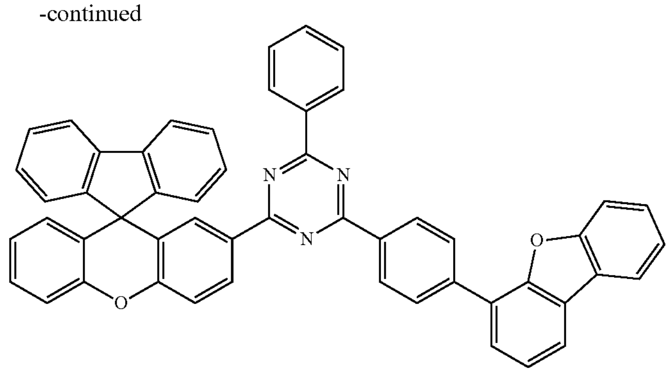
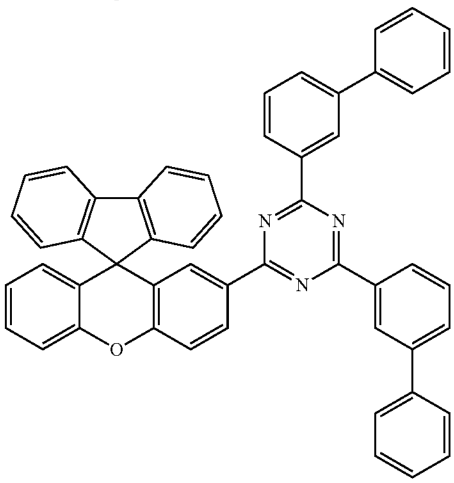
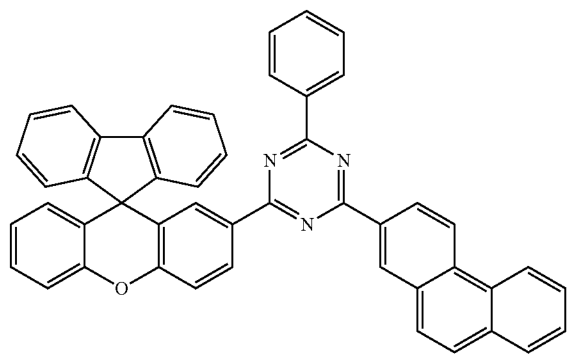
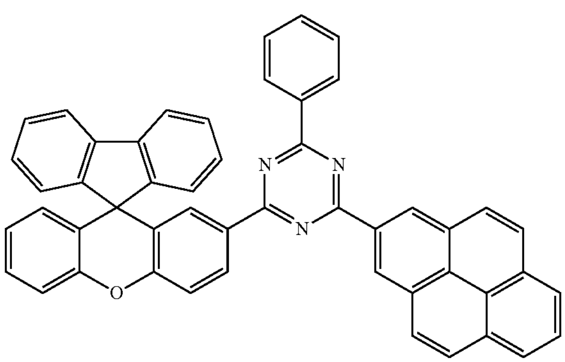
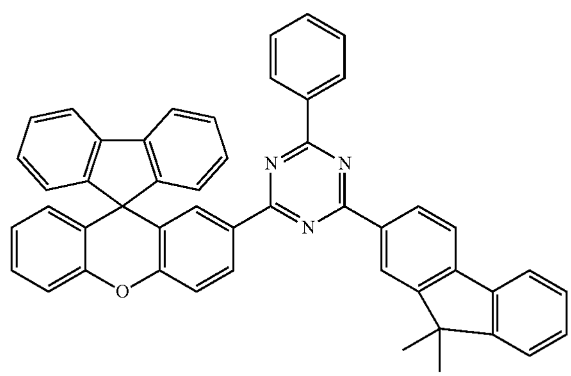
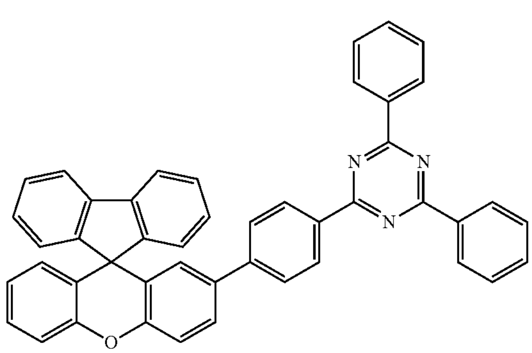
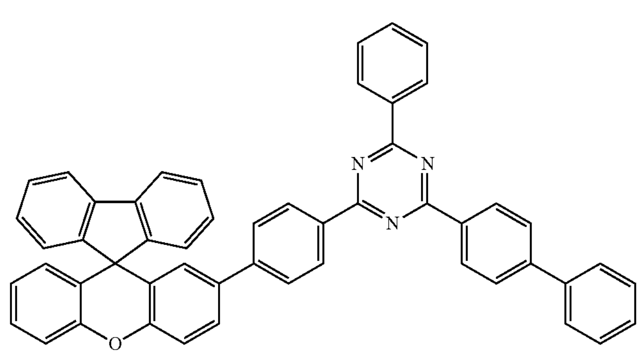

-continued
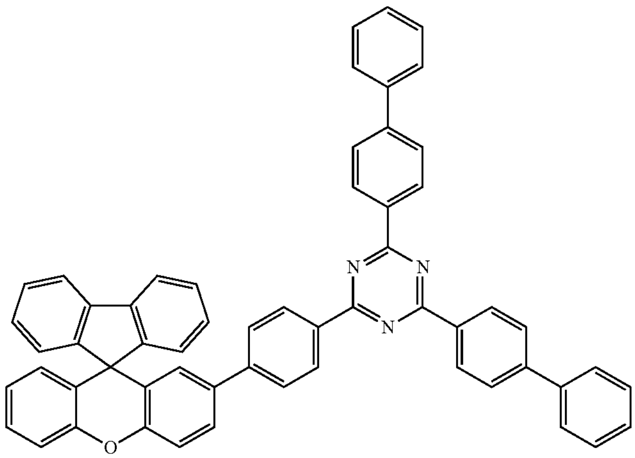
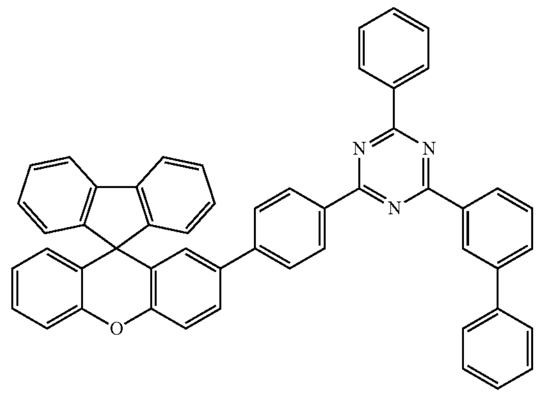
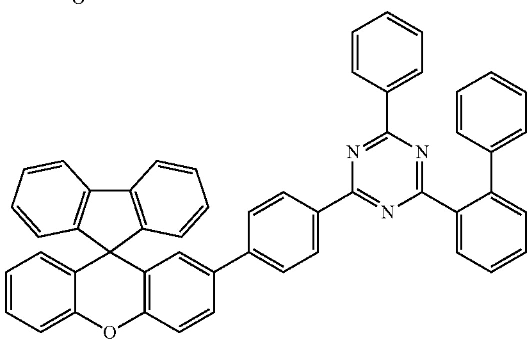
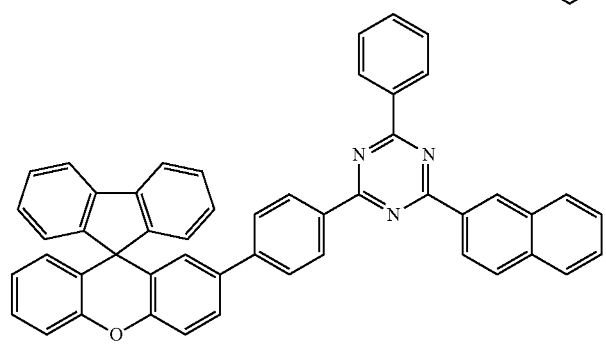
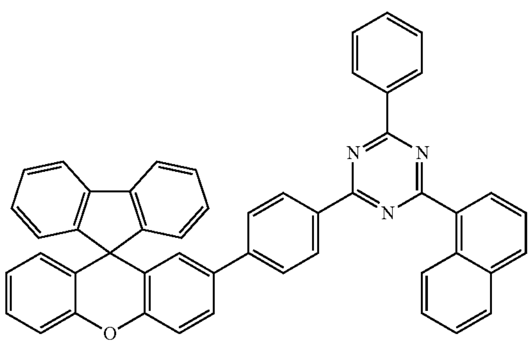
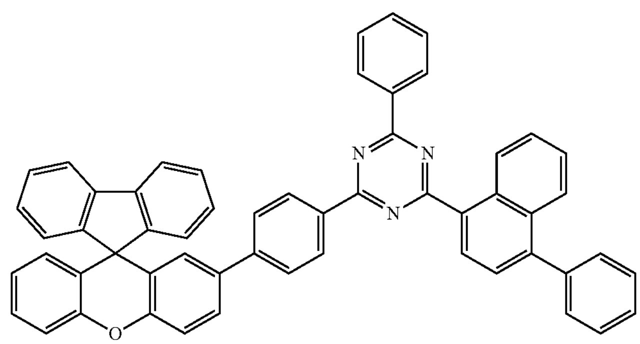
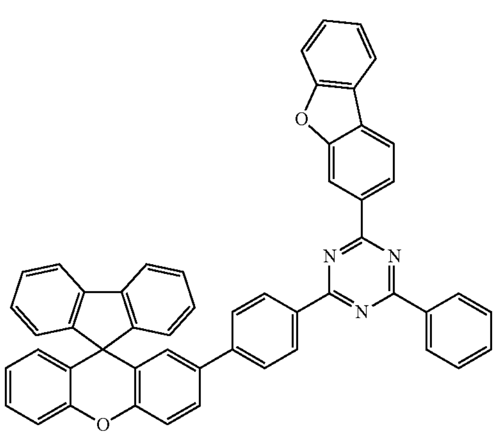
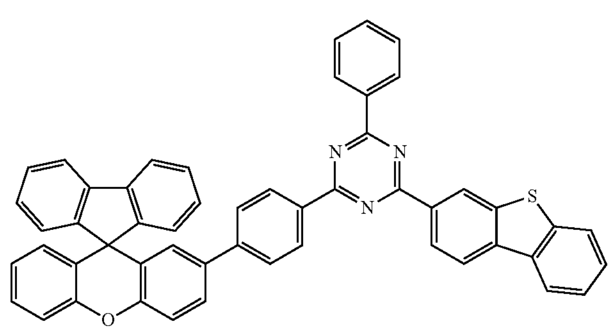

-continued
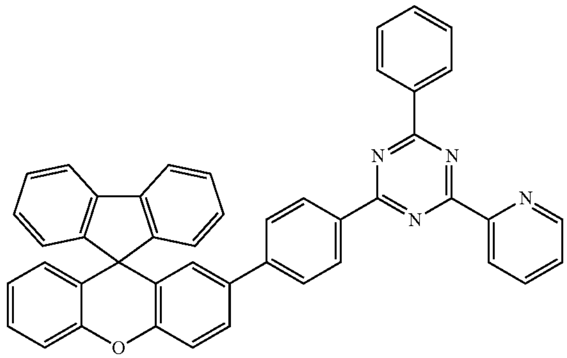
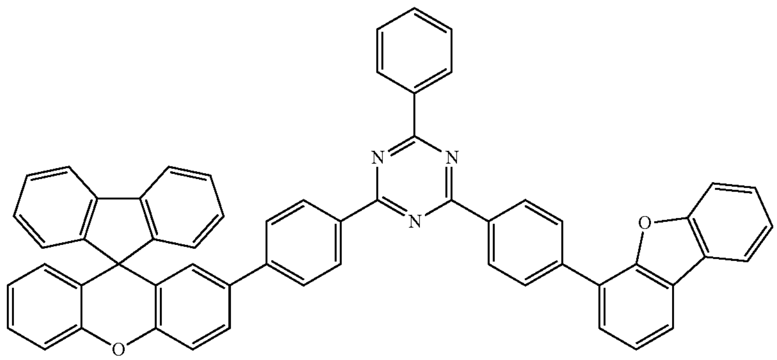
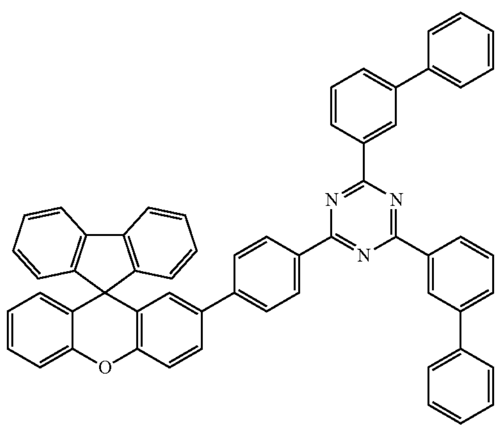
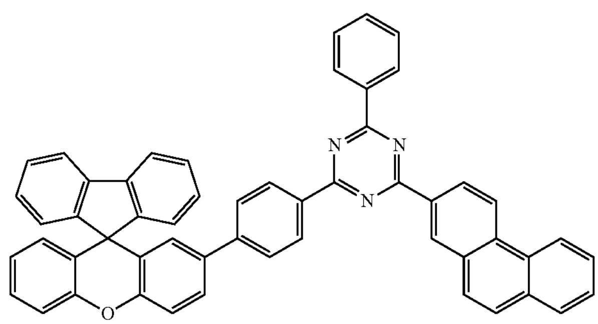
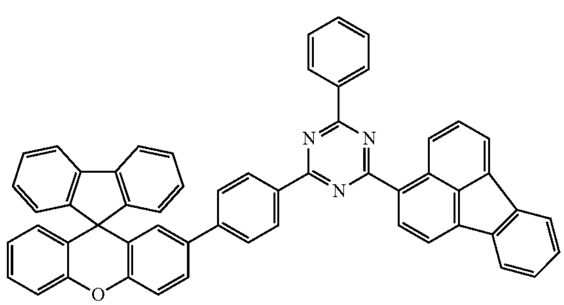
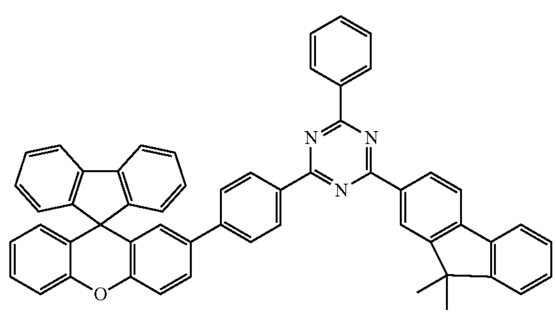

-continued
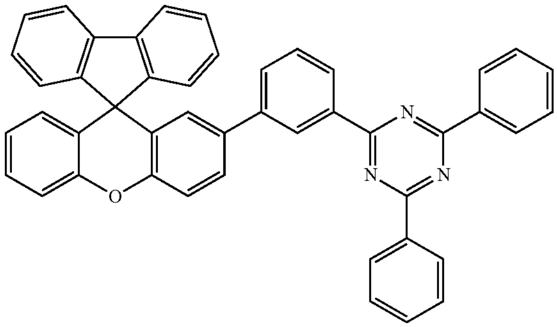
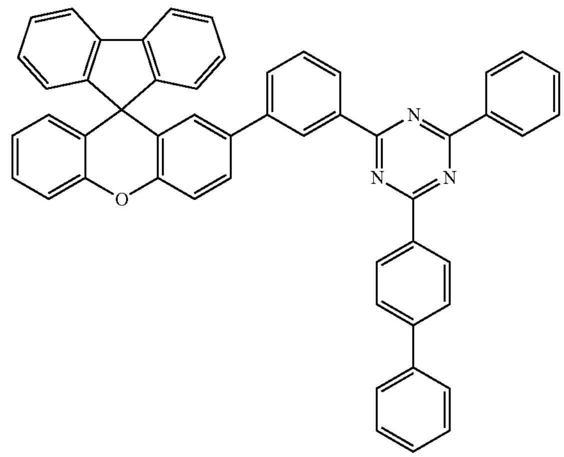
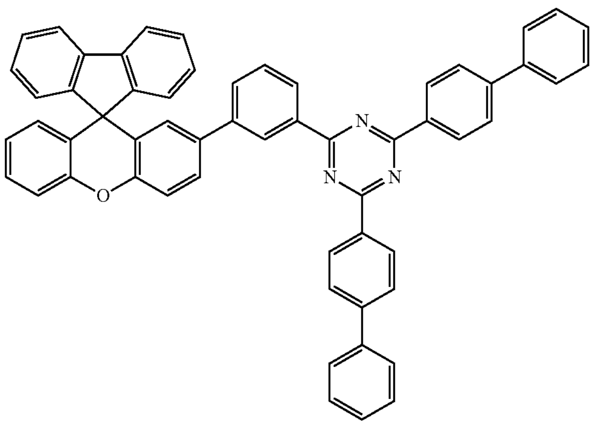
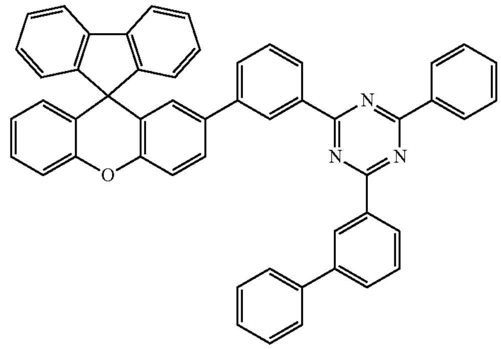
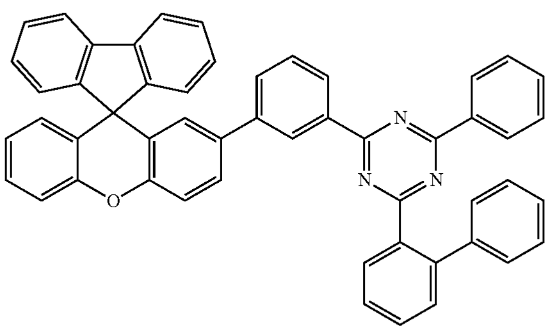
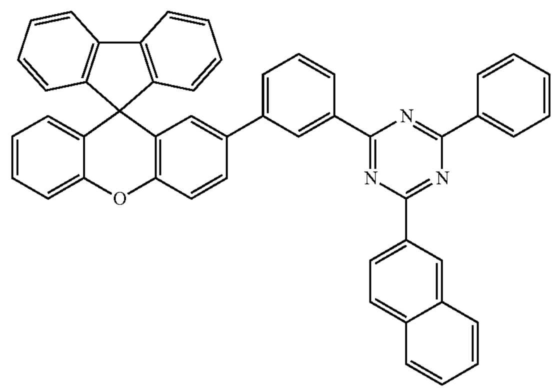
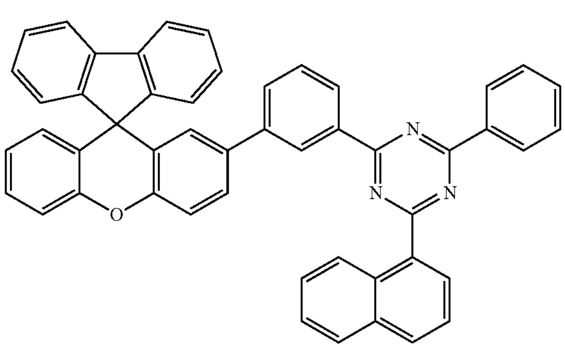
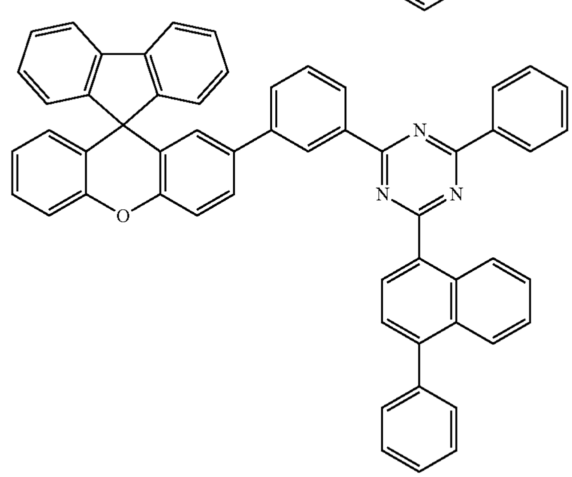

-continued
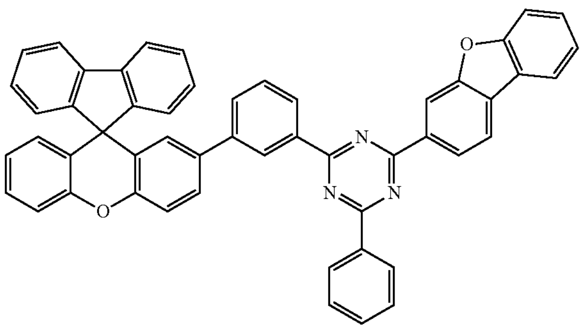
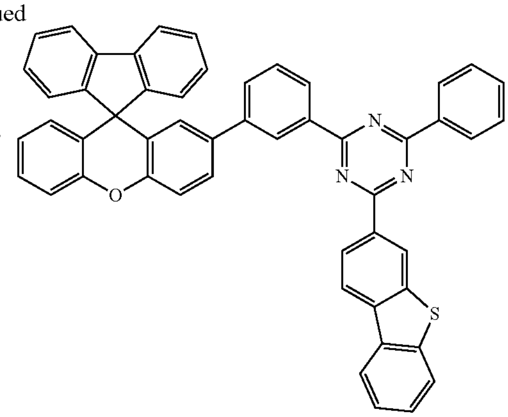
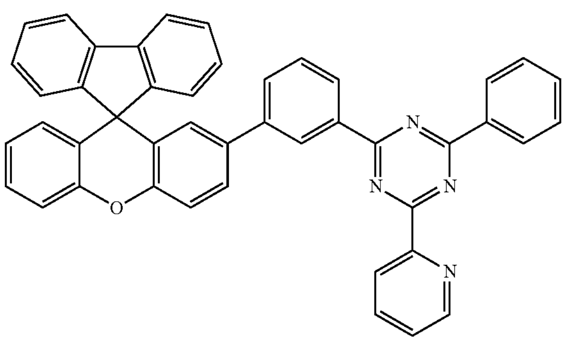
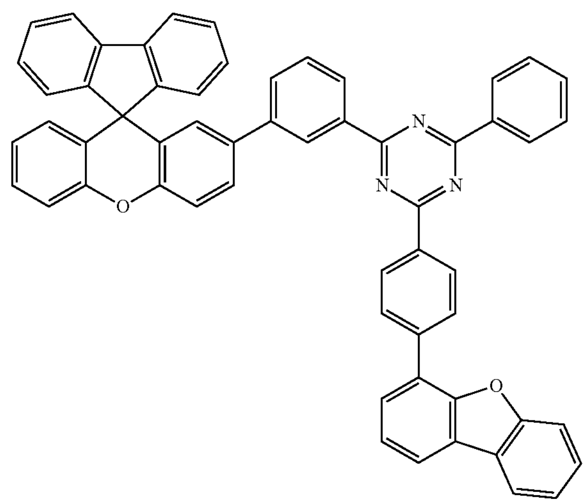
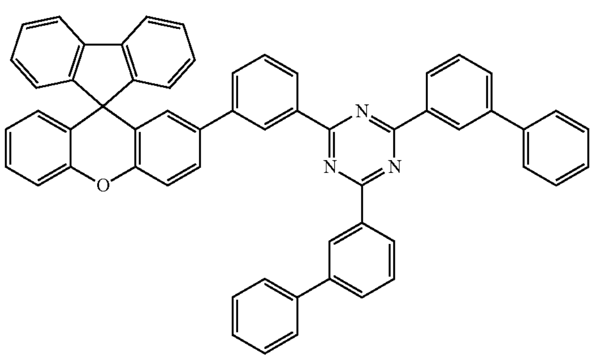
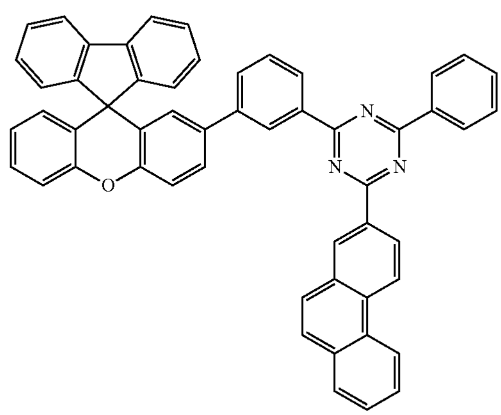

-continued
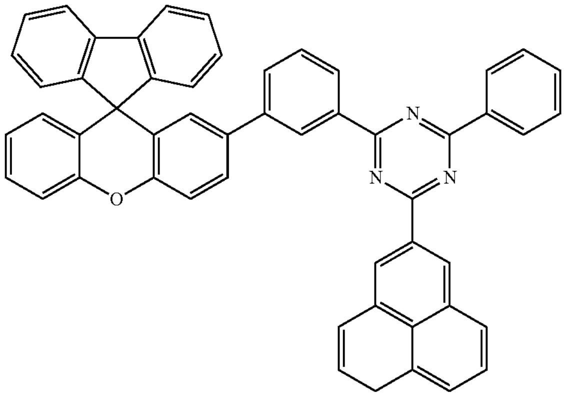
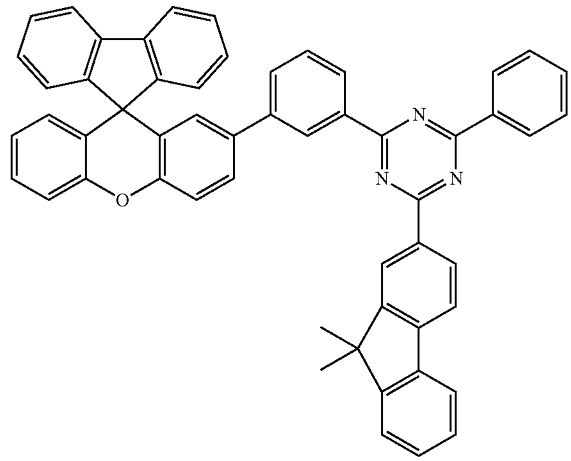
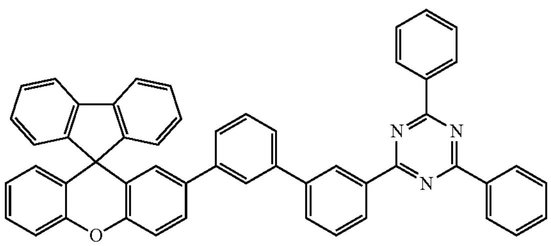
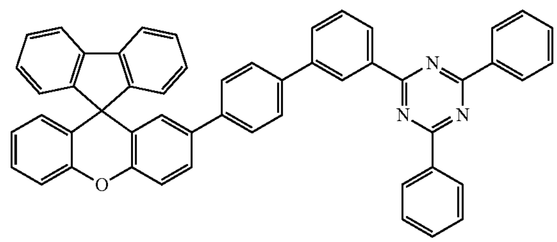
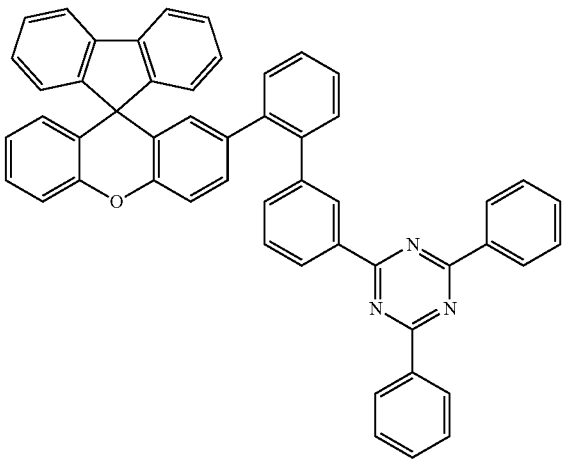
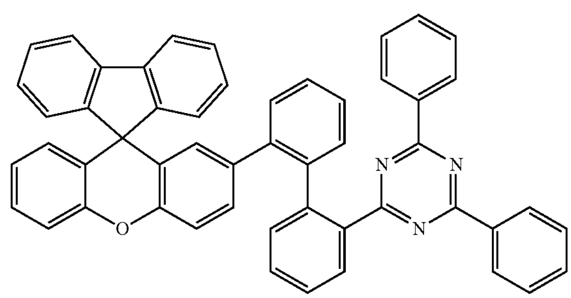
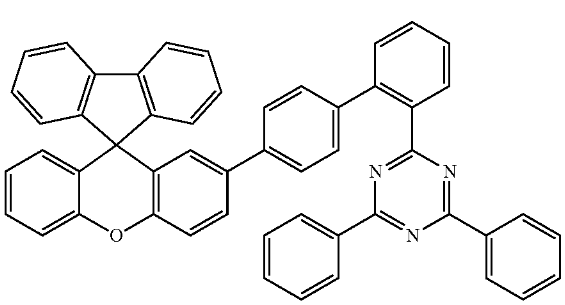
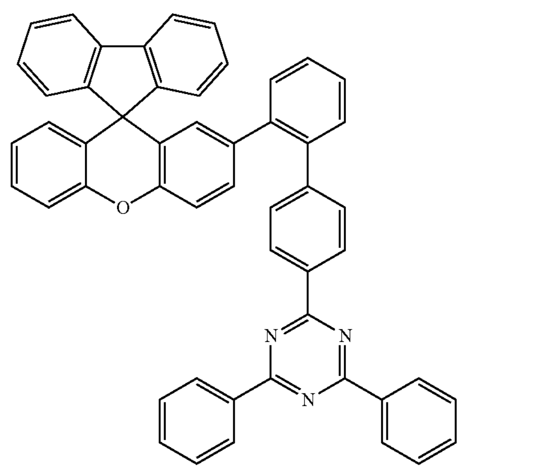

-continued
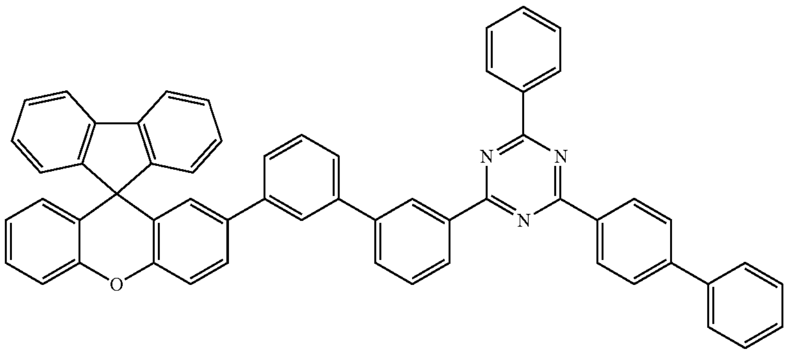
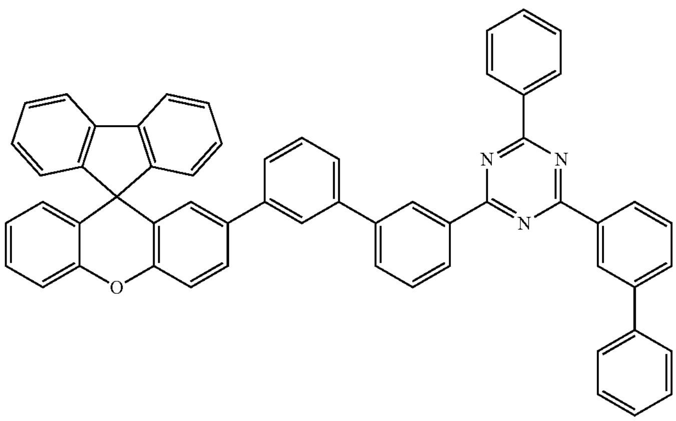
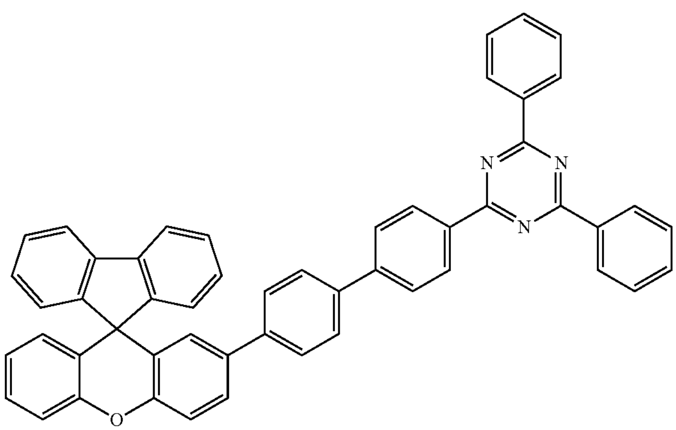
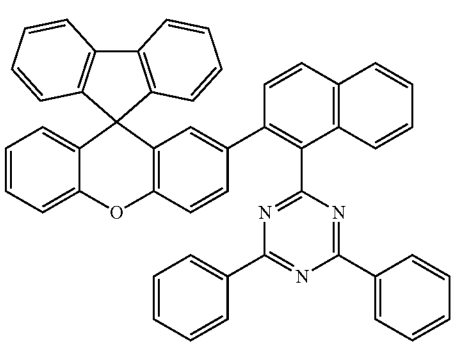
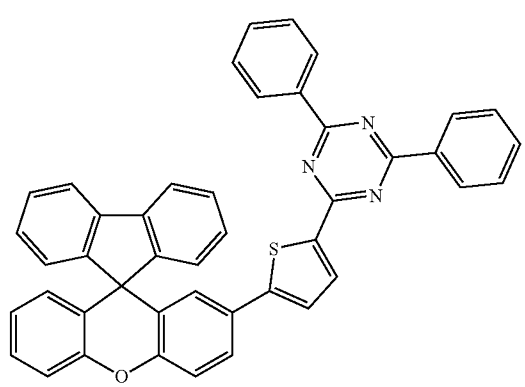

-continued
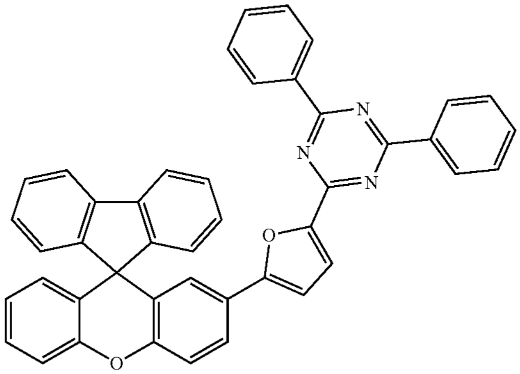
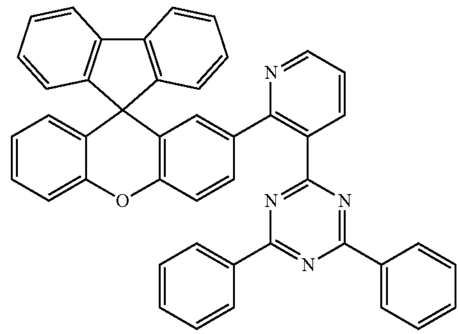
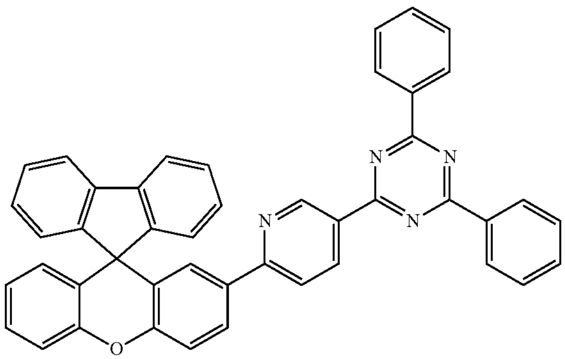
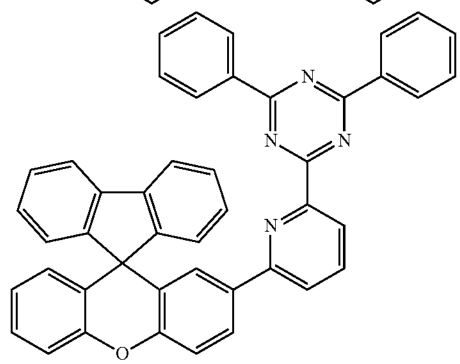
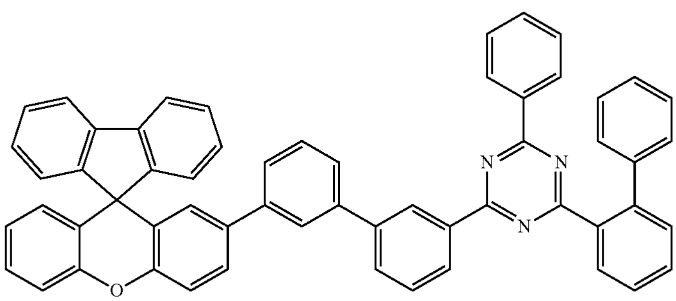
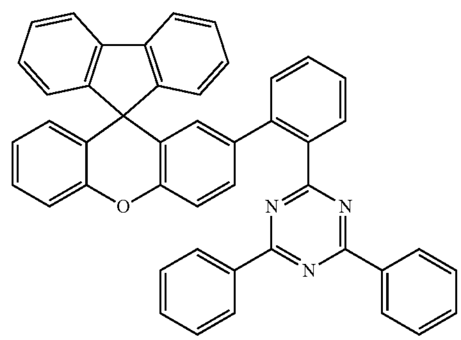
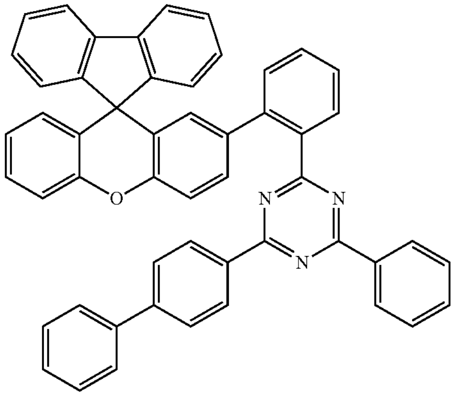
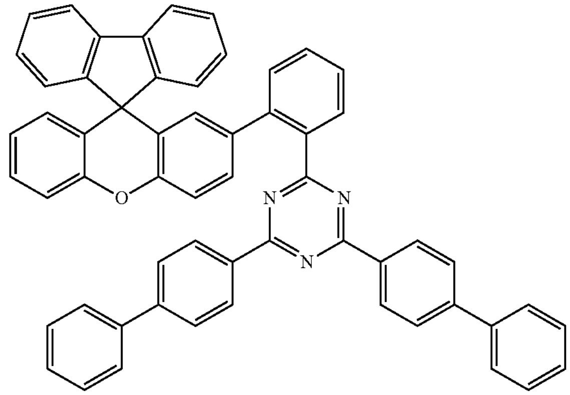

-continued
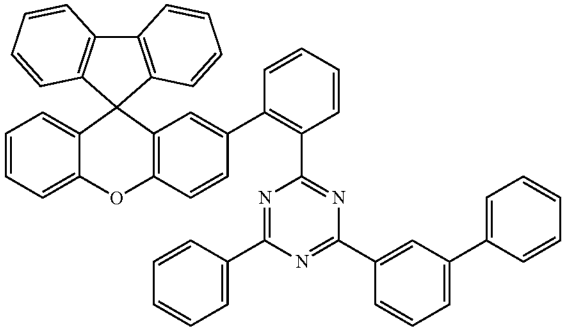
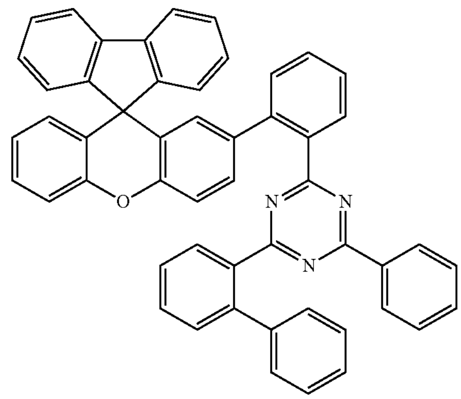
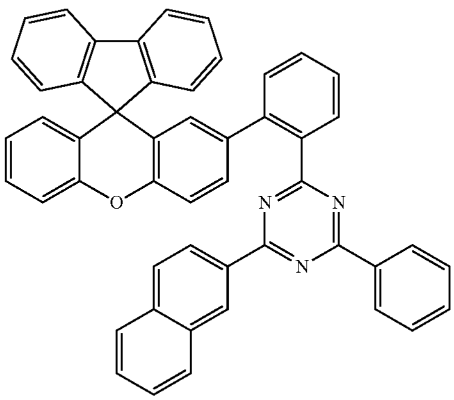
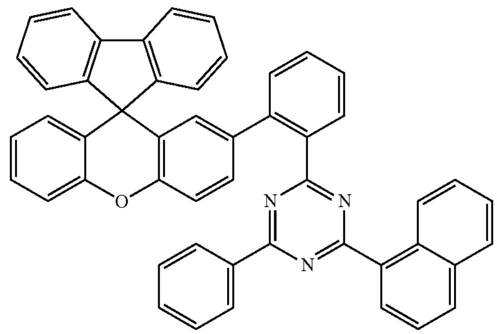
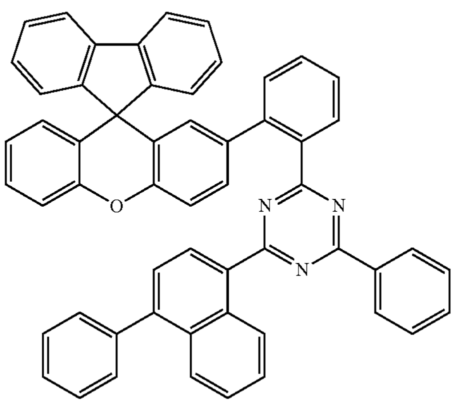
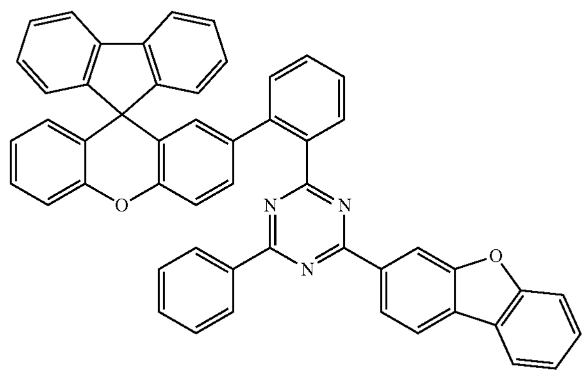
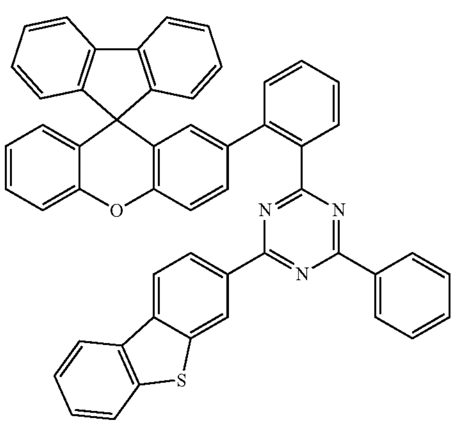
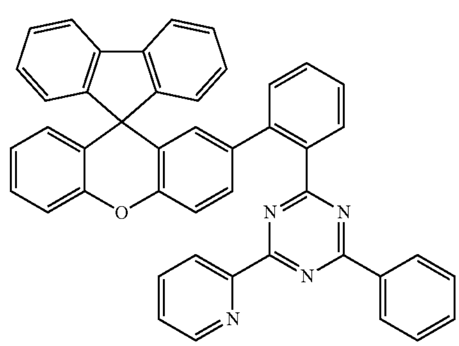

-continued
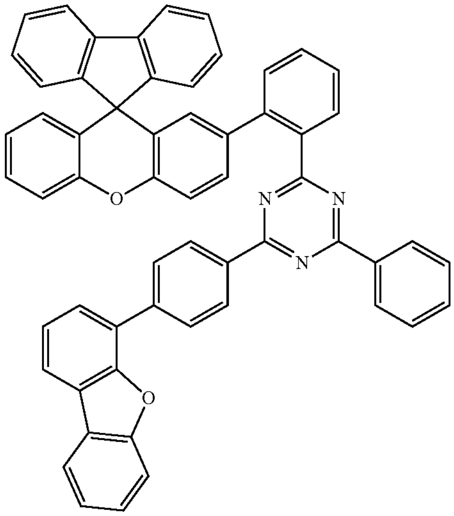
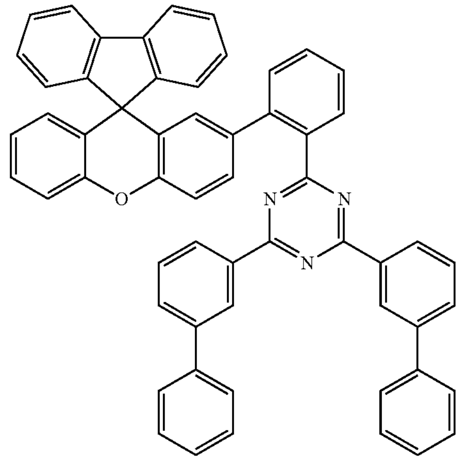
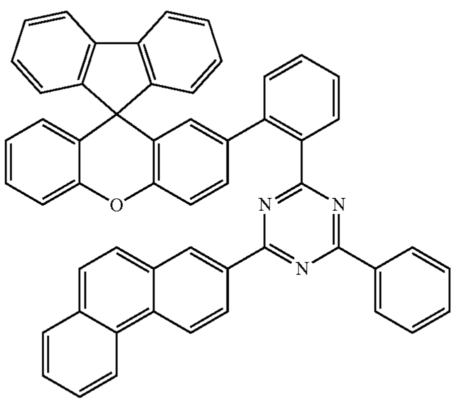
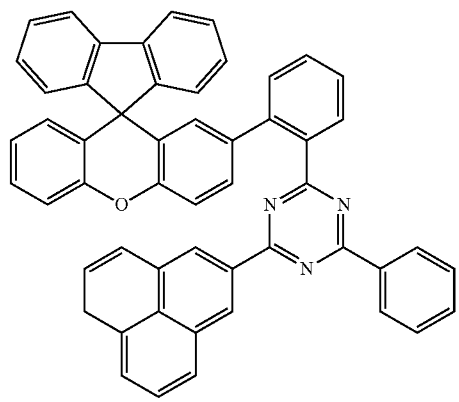
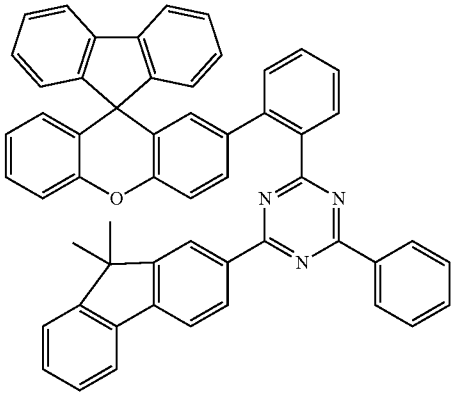
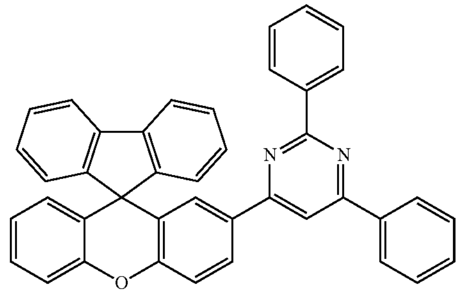

-continued
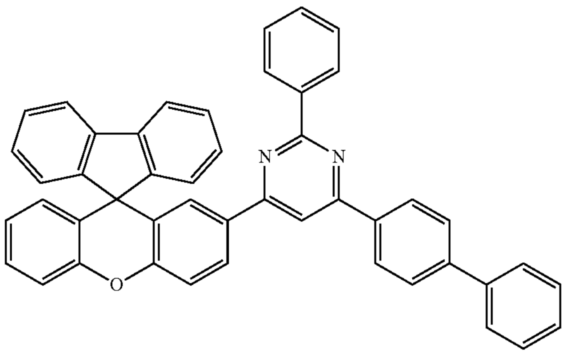
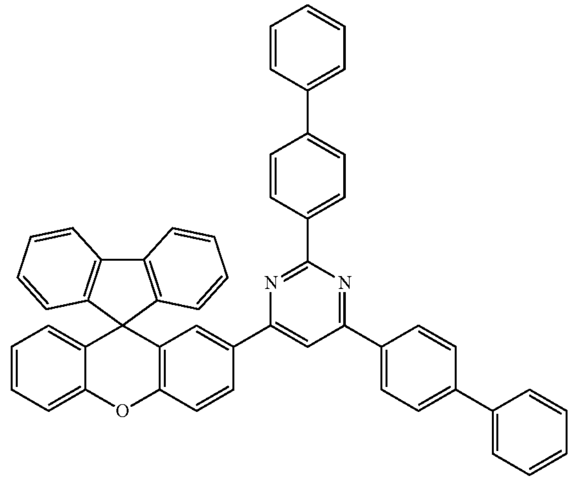
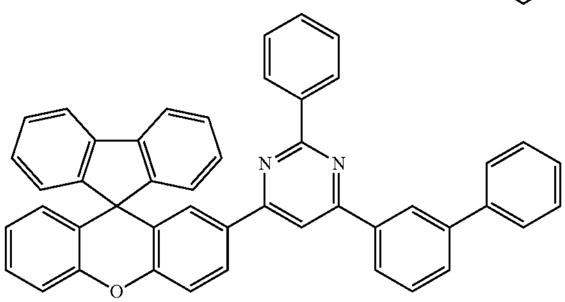
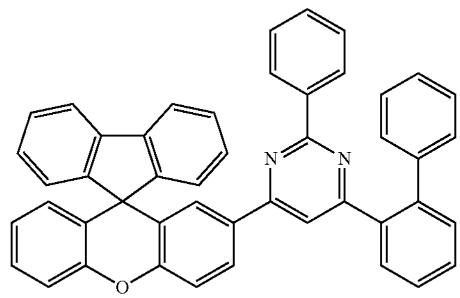
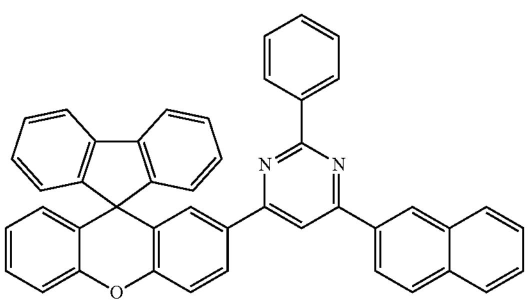
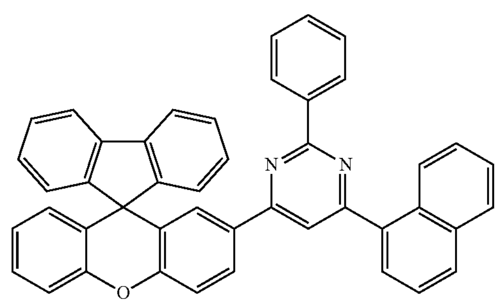
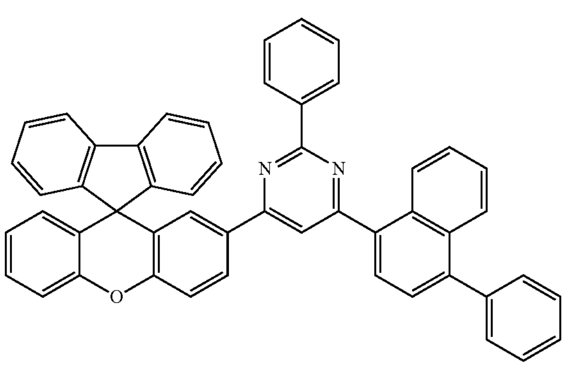
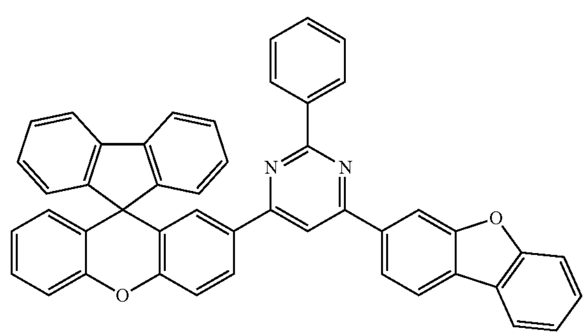

-continued
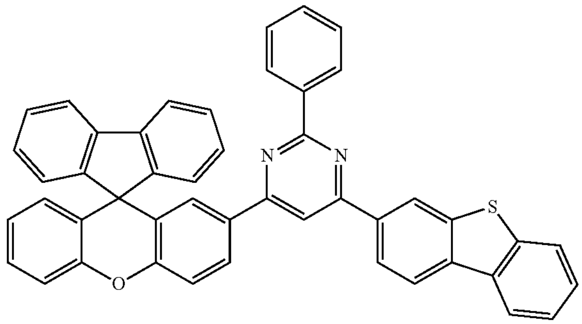
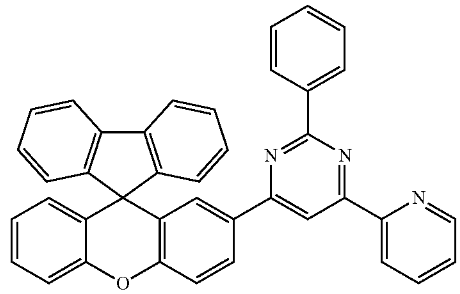
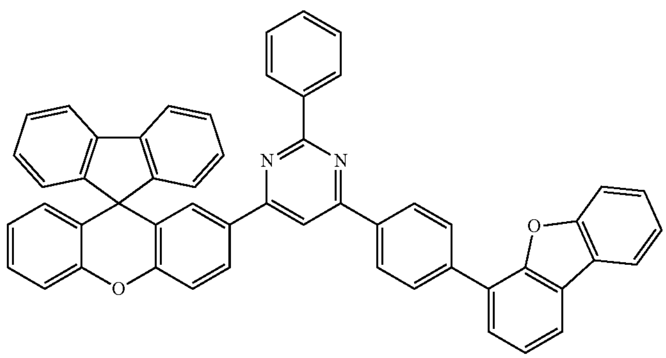
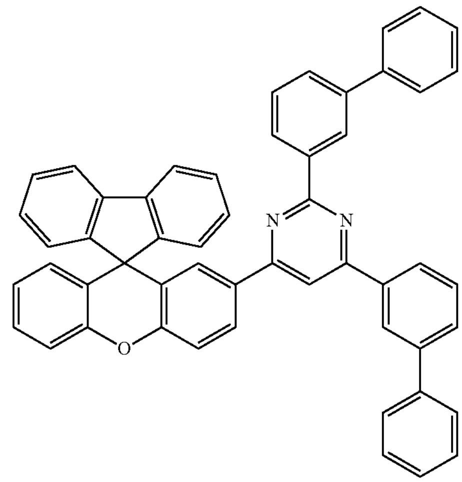
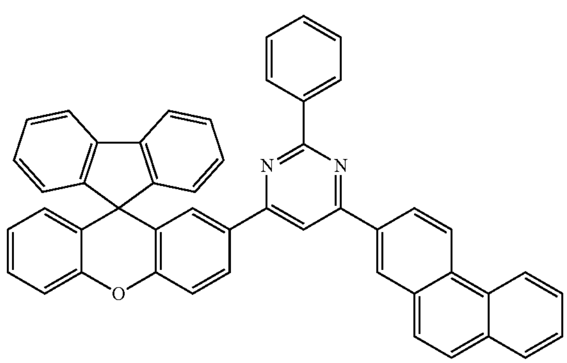
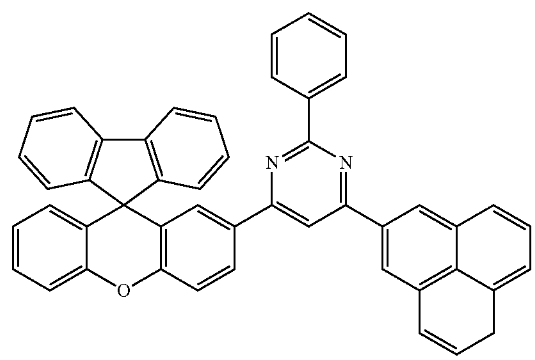
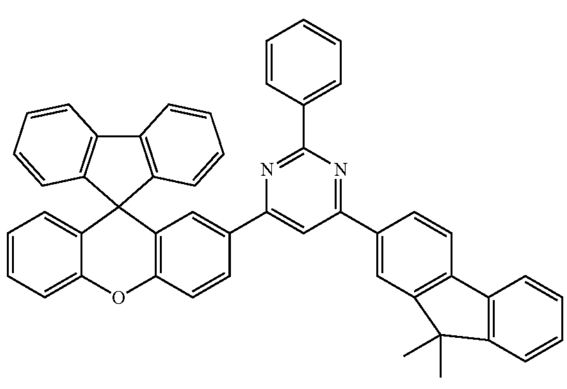
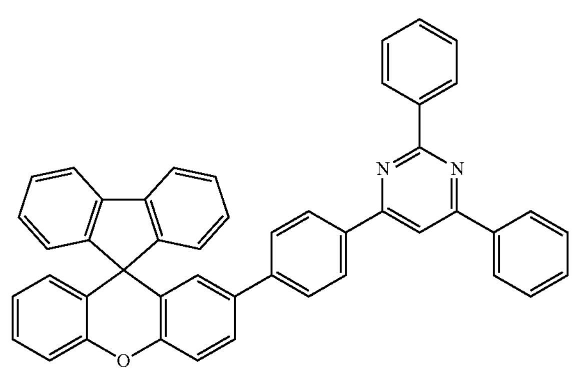

-continued
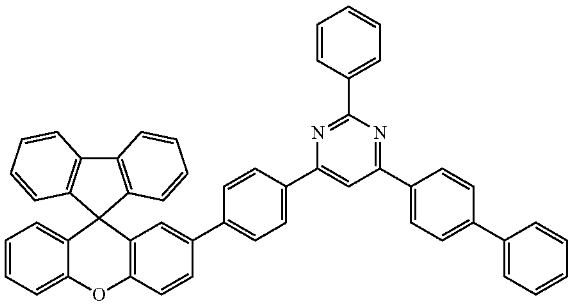
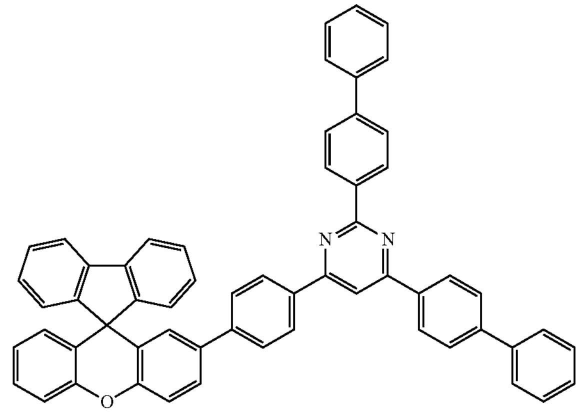
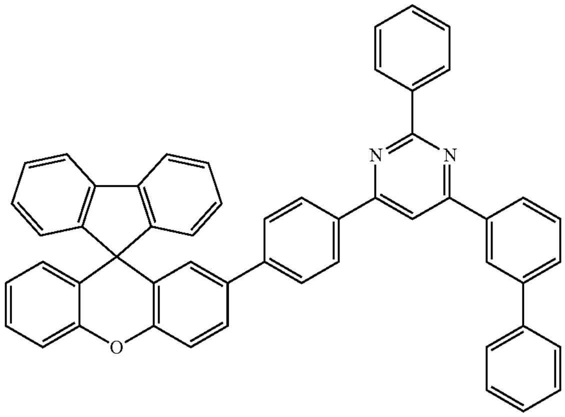
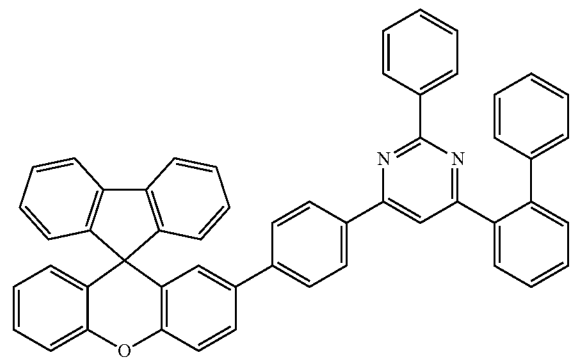
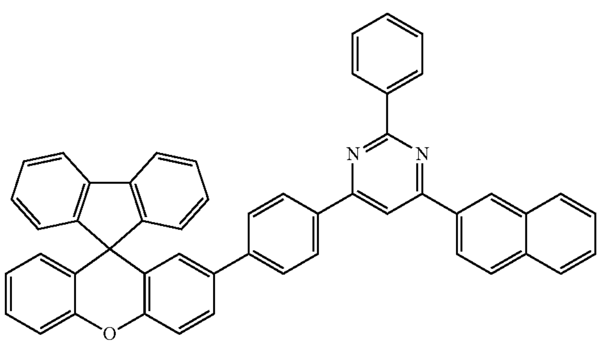
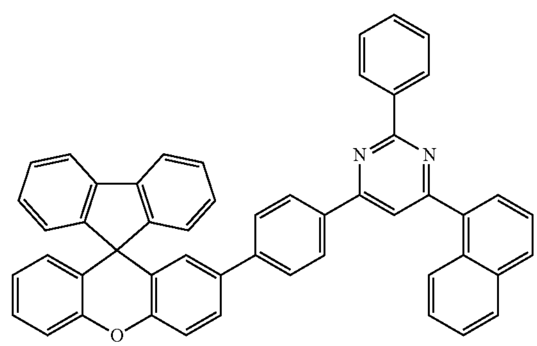
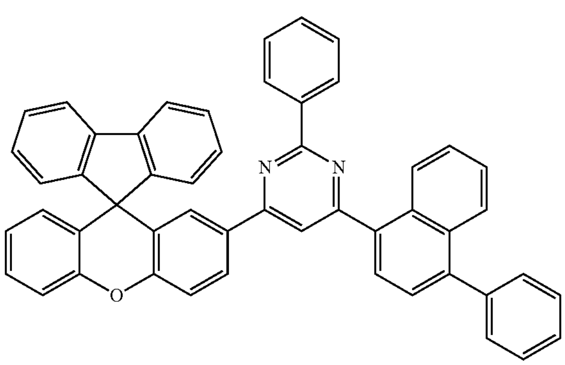
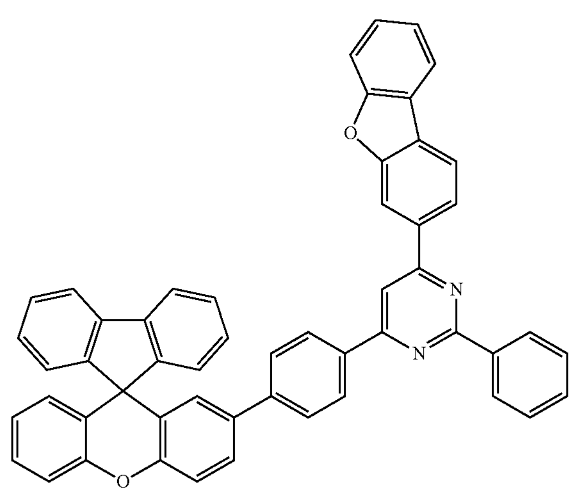

-continued
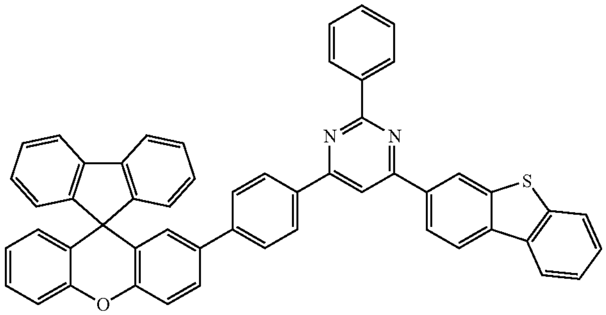
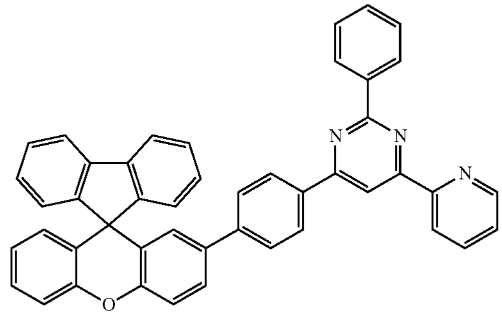
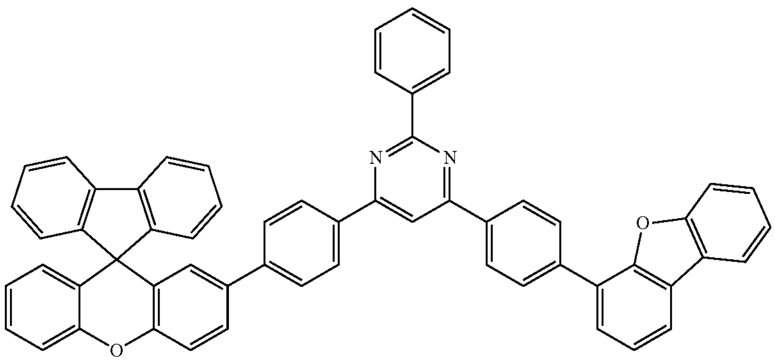
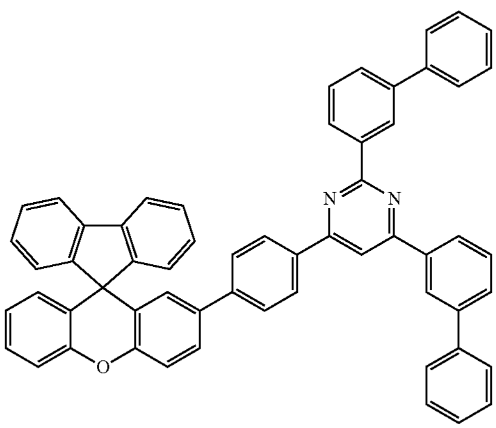
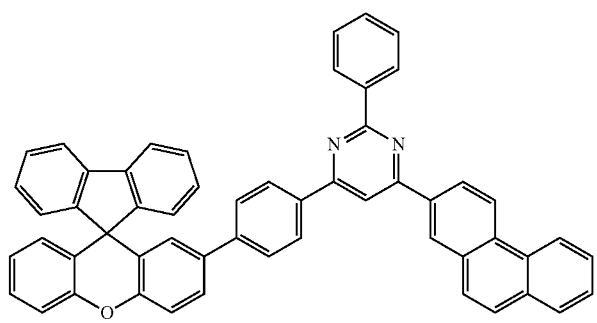
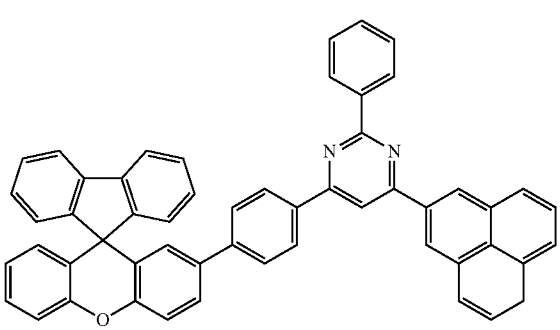
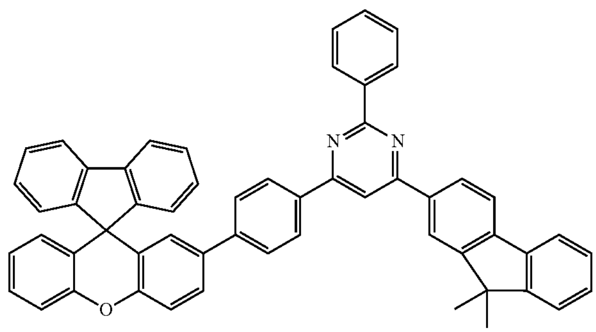

-continued
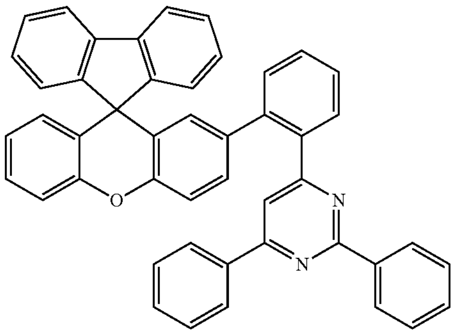
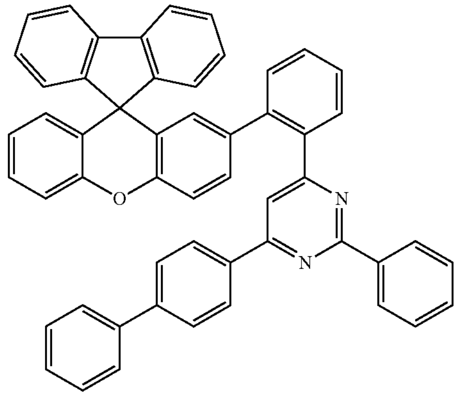
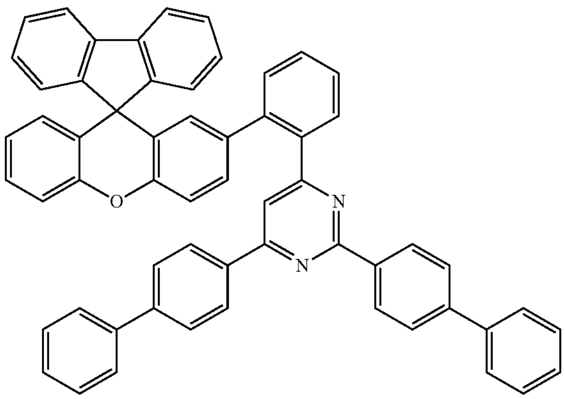
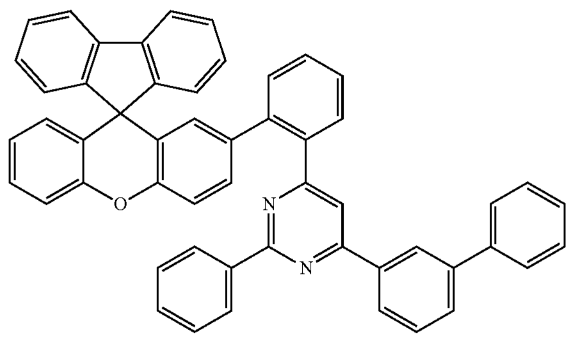
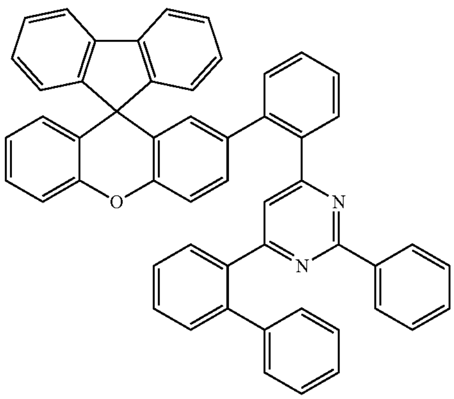
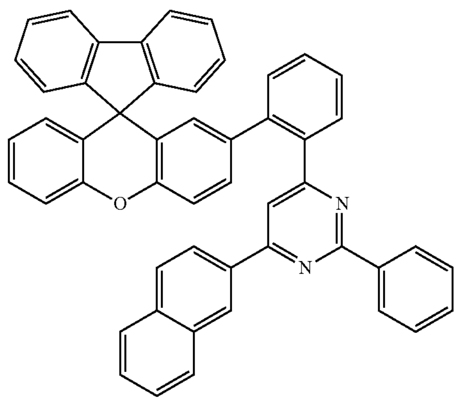
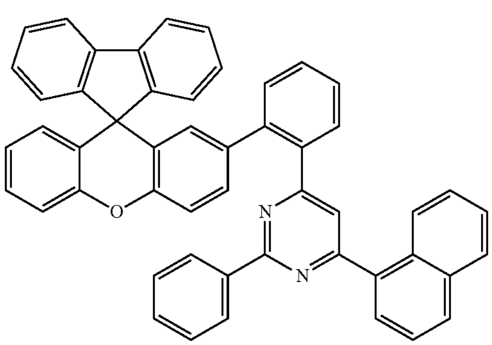
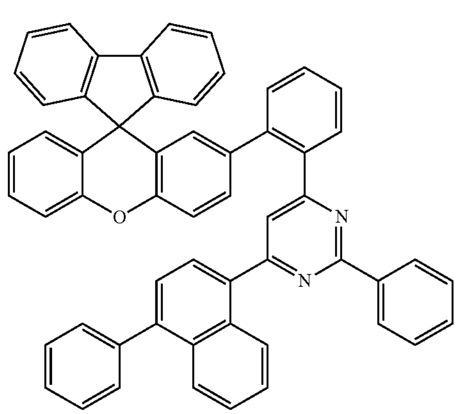

-continued
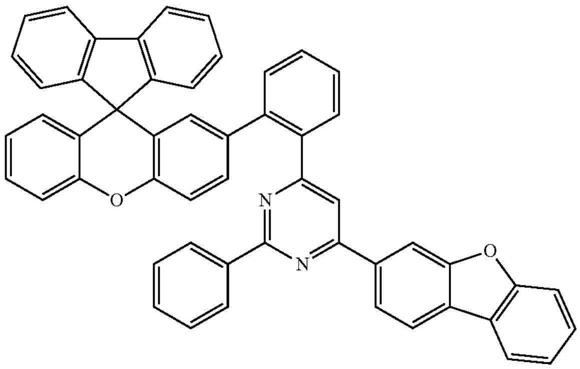
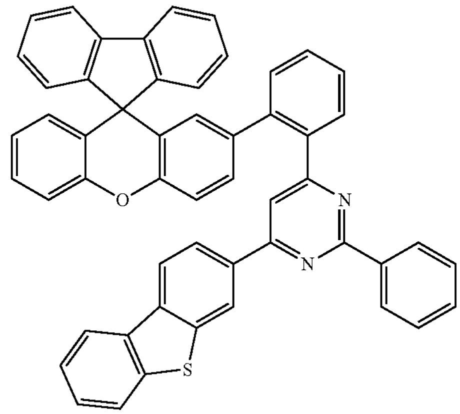
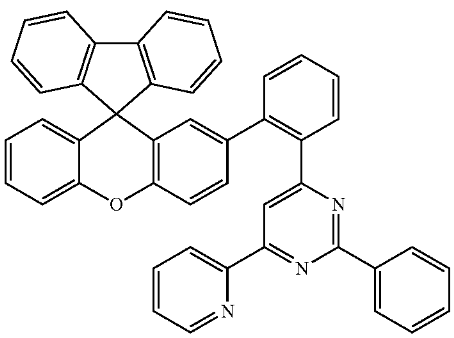
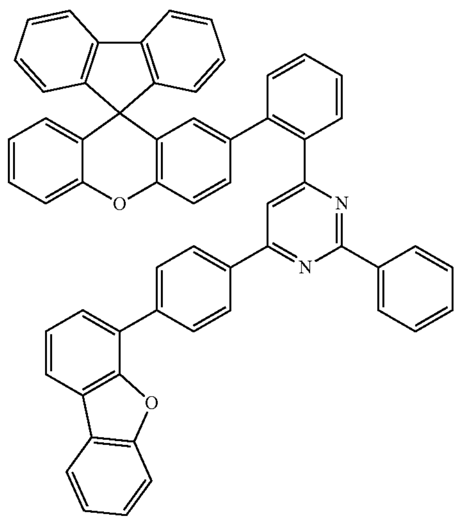
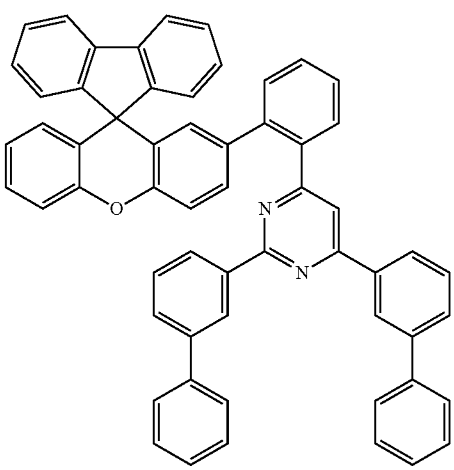
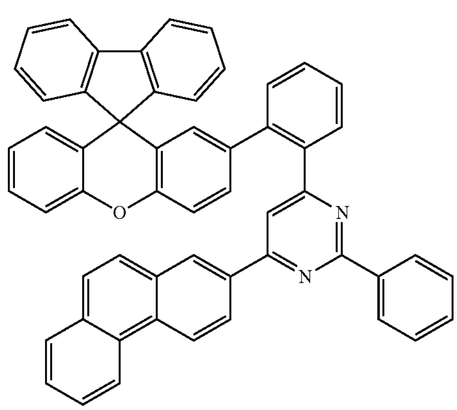

-continued
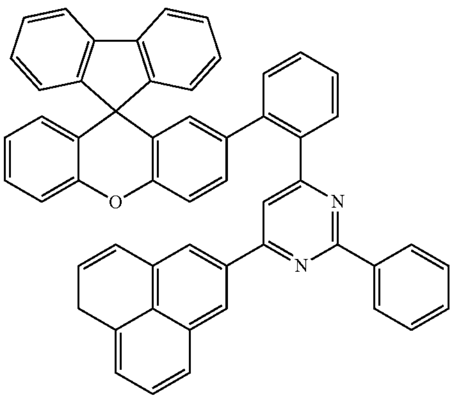
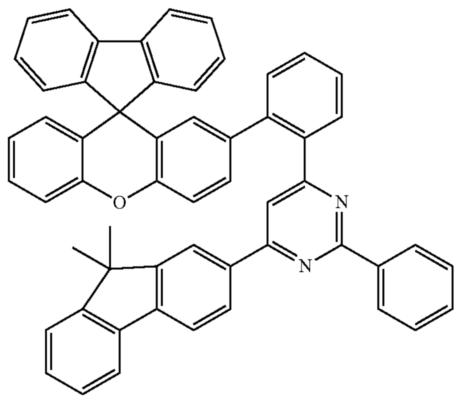
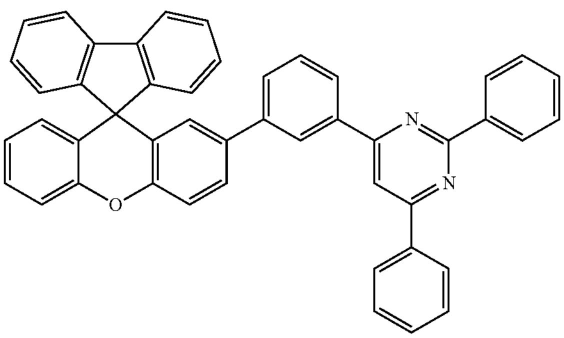
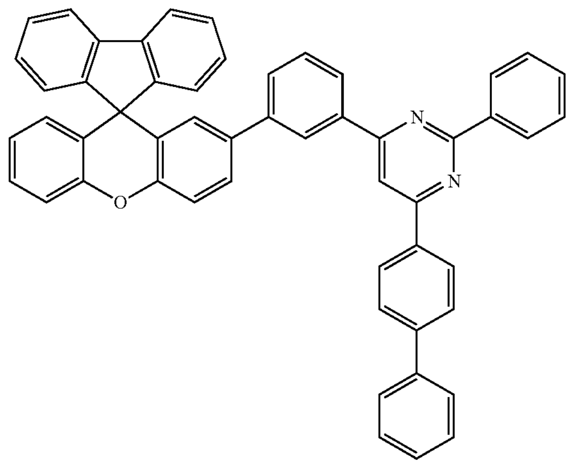
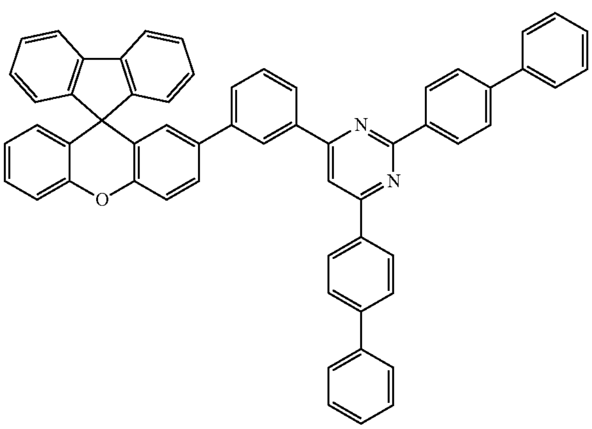
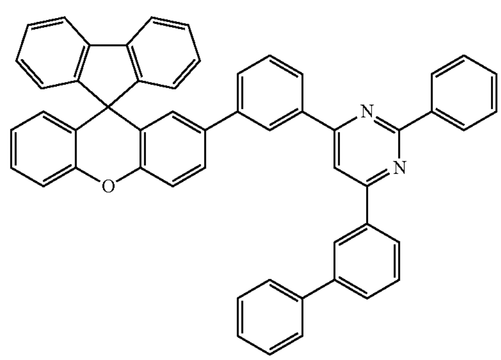
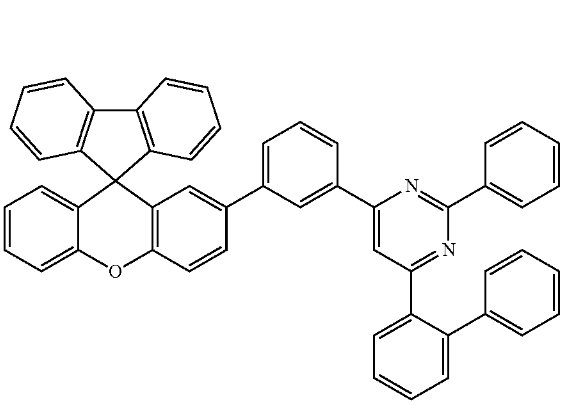
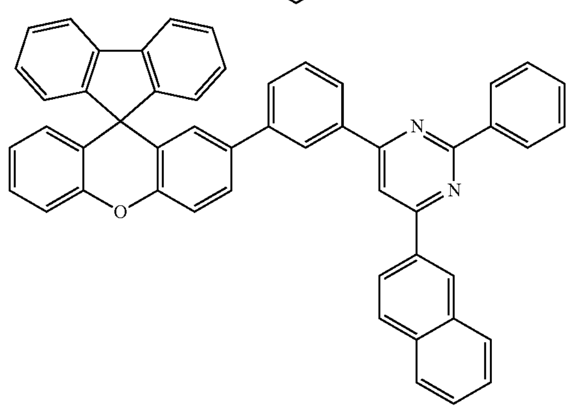

-continued
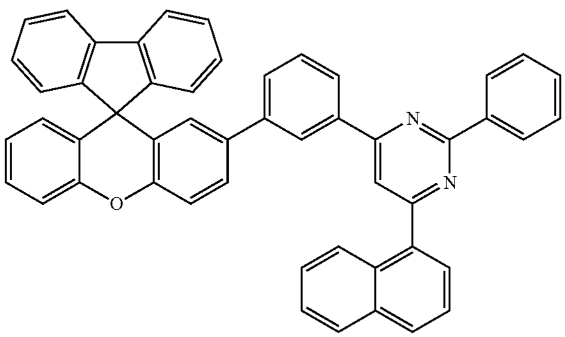
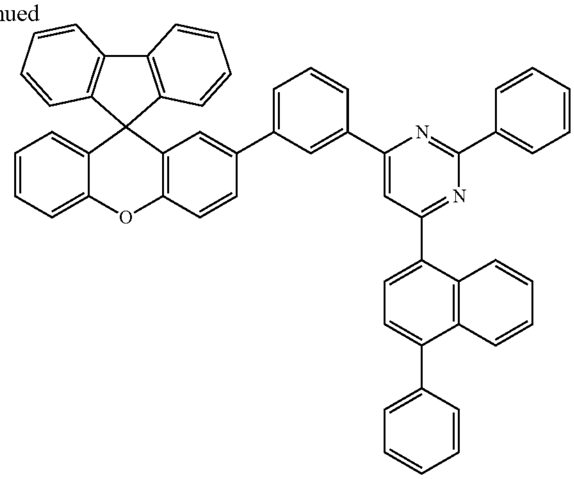
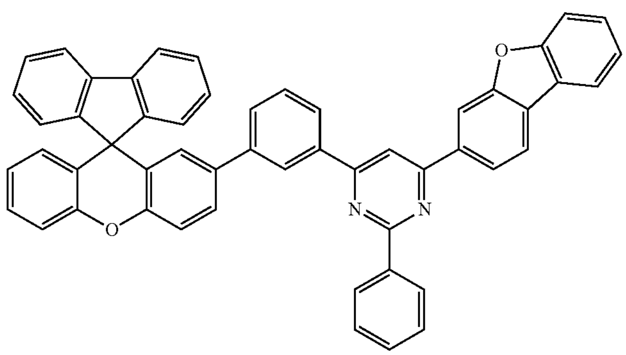
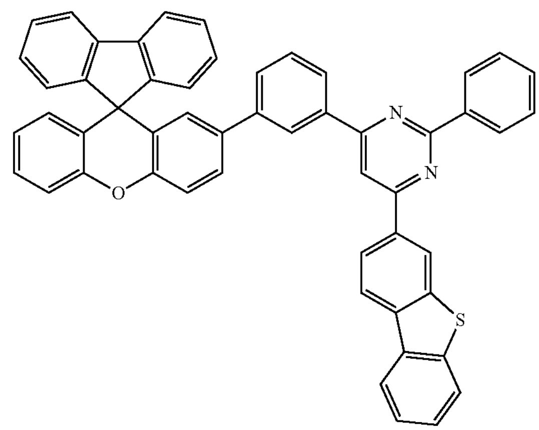
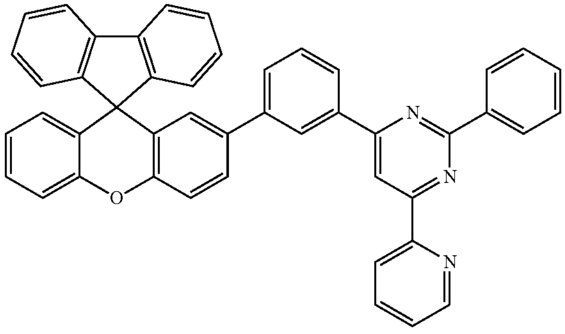
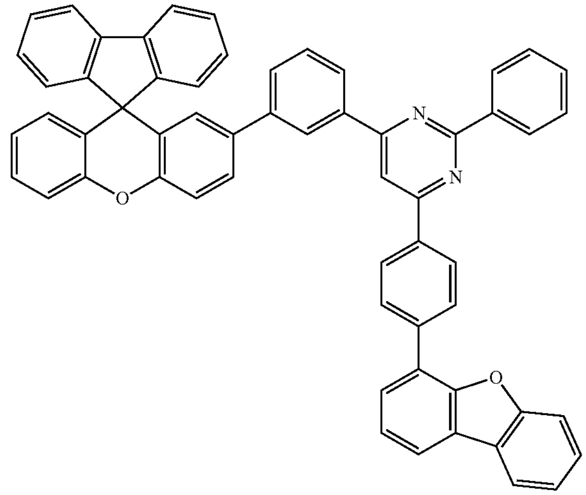

-continued
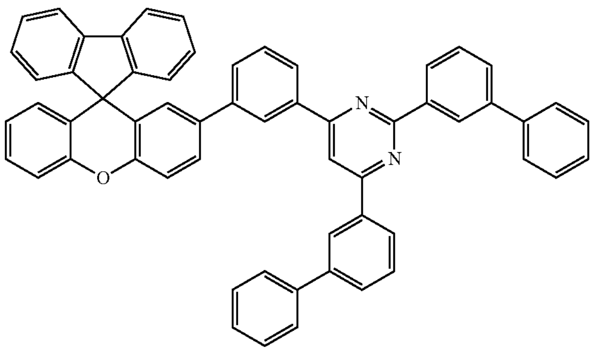
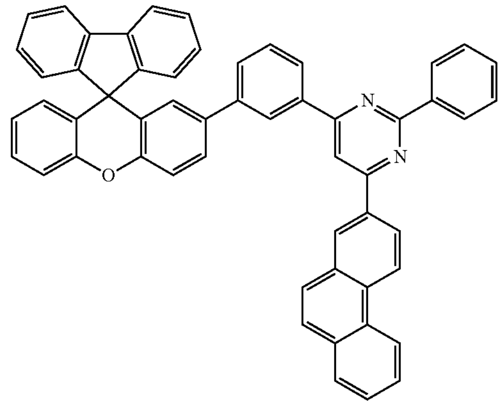
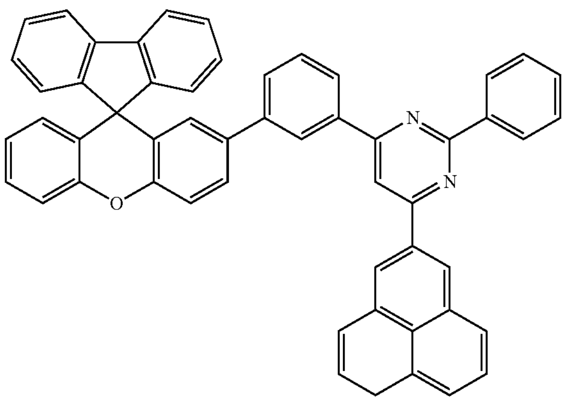
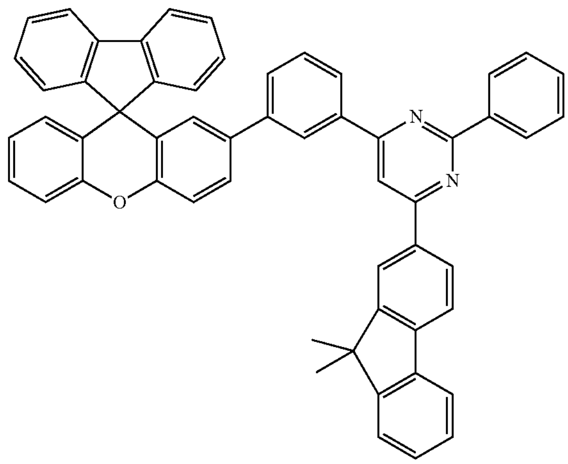
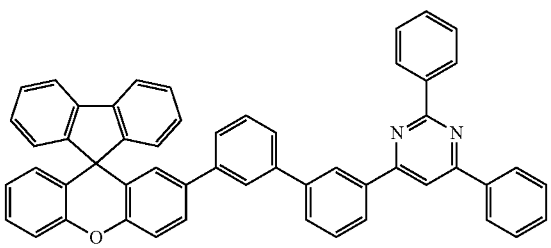
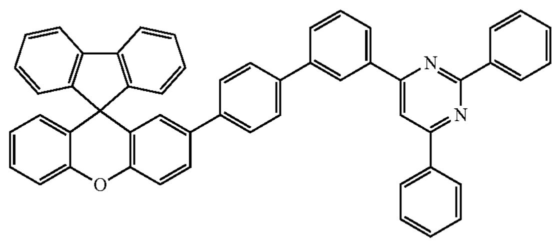
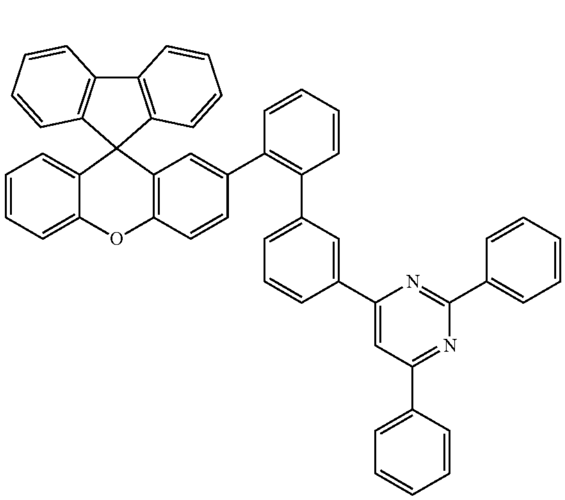
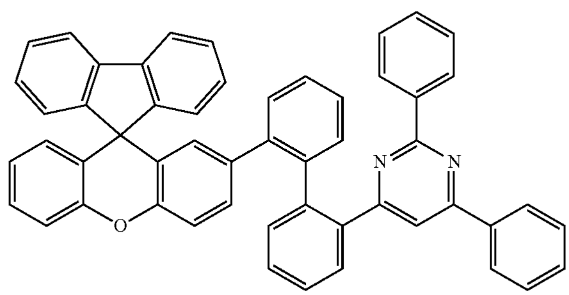

-continued
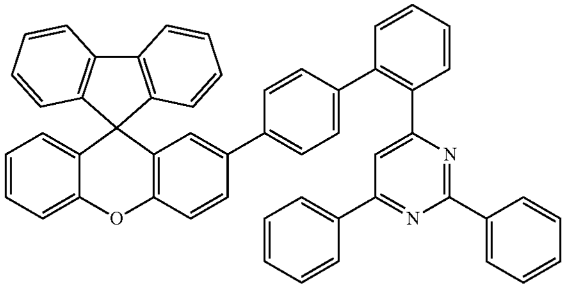
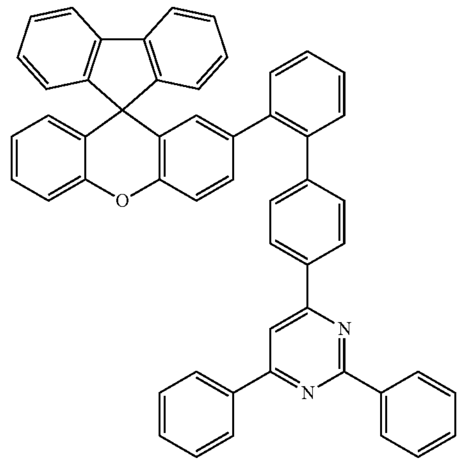
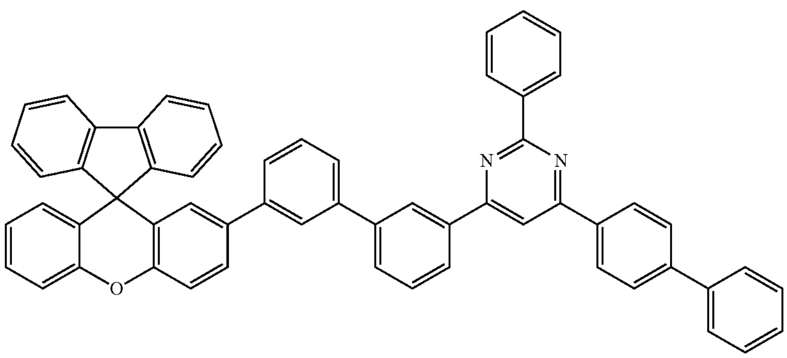
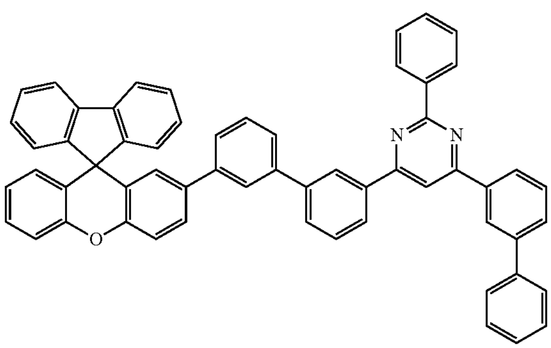
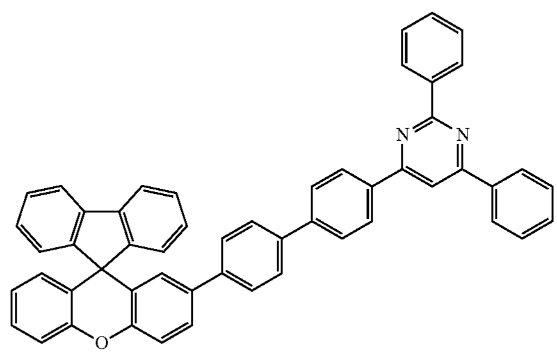
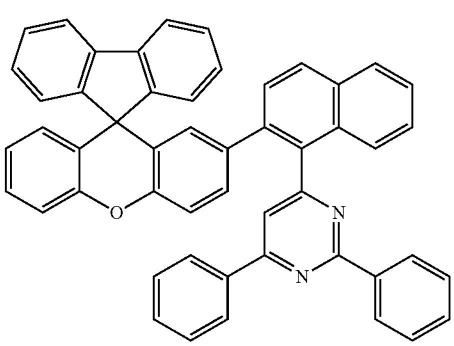
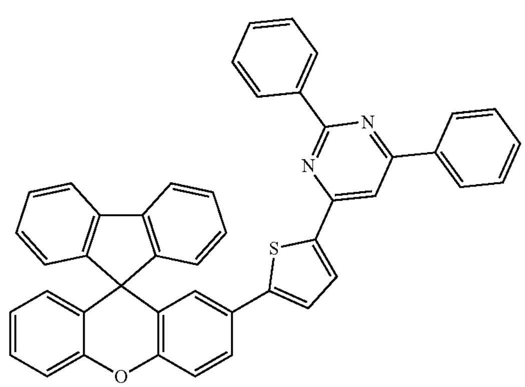

-continued
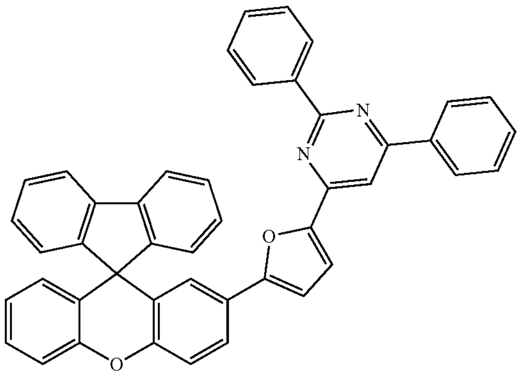
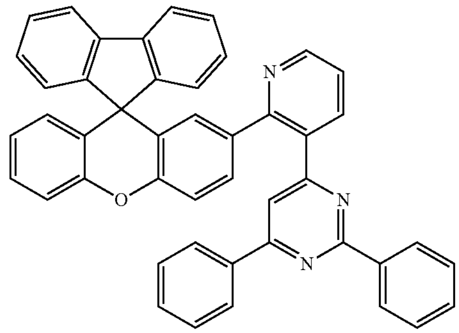
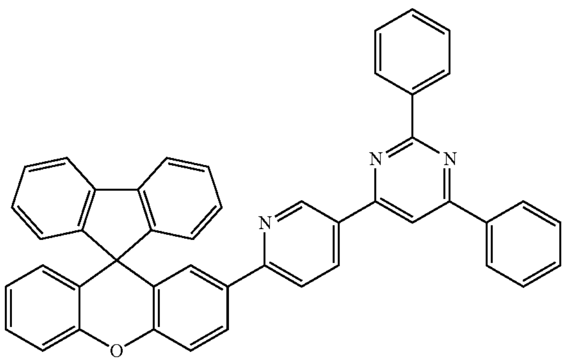
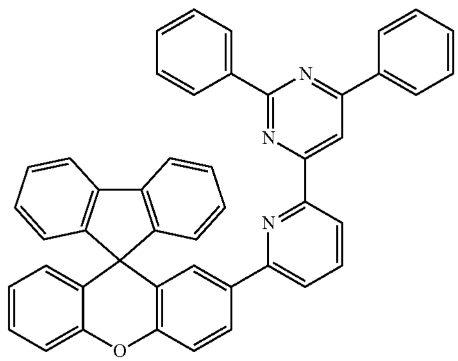
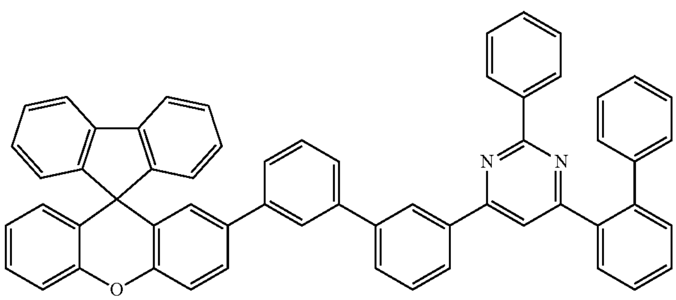
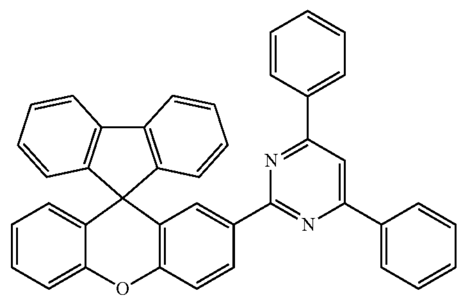
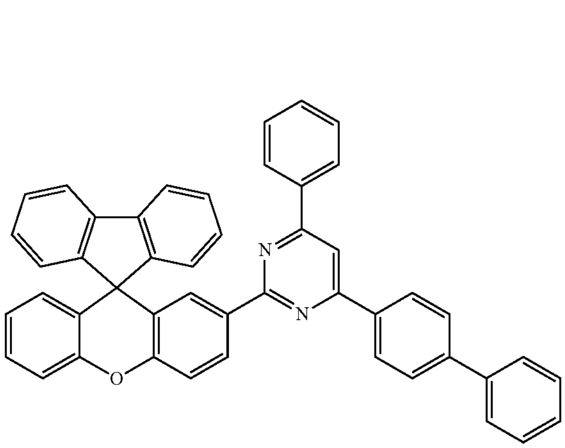
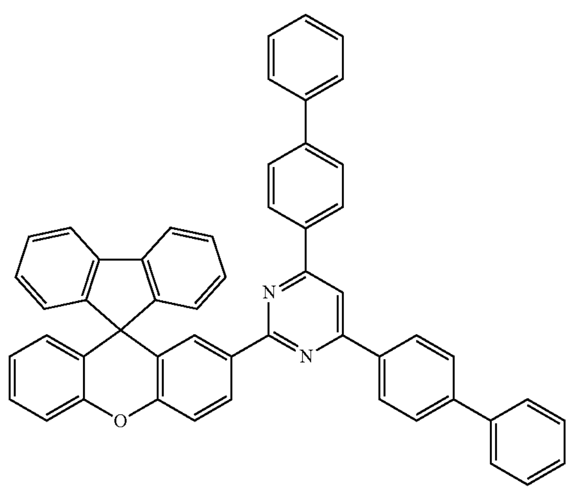

-continued
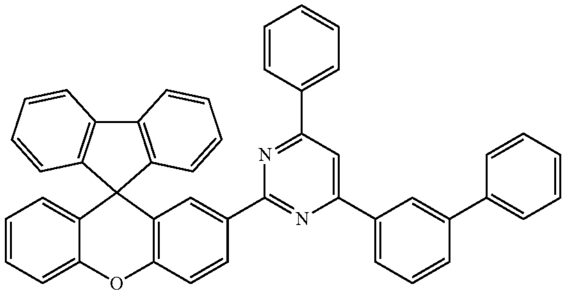
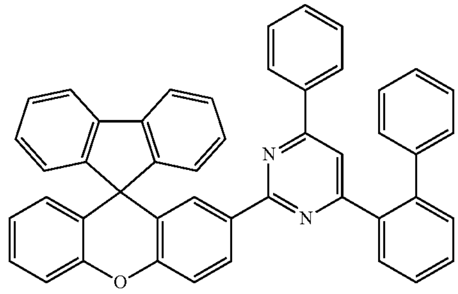
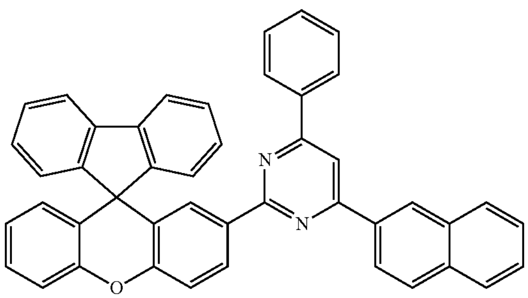
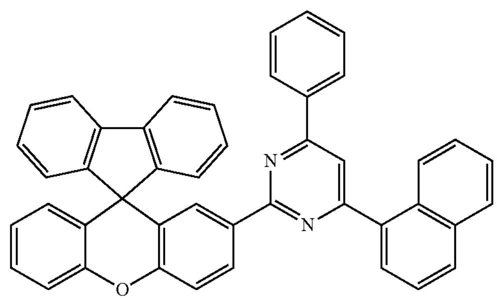
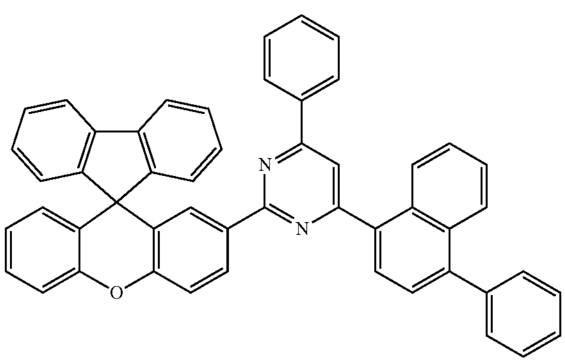
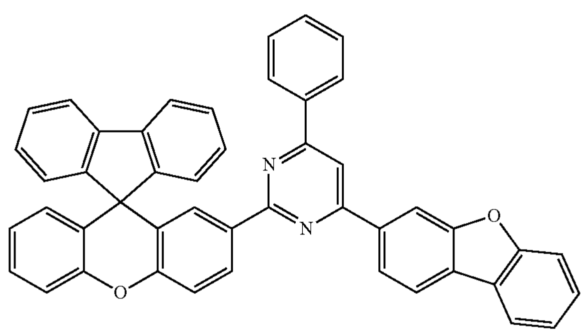
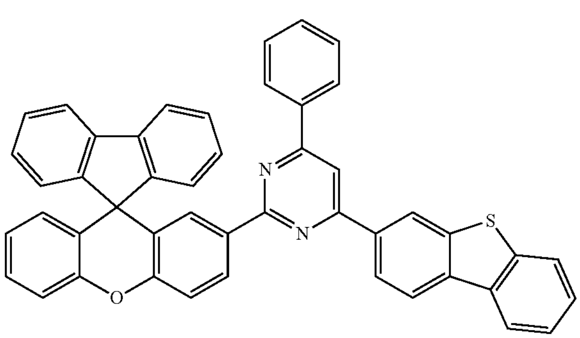
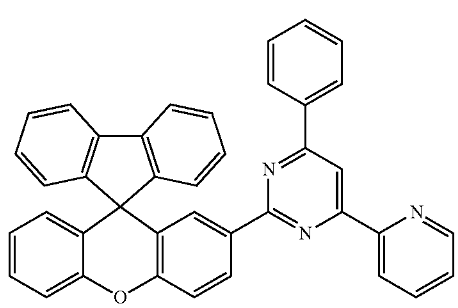

-continued
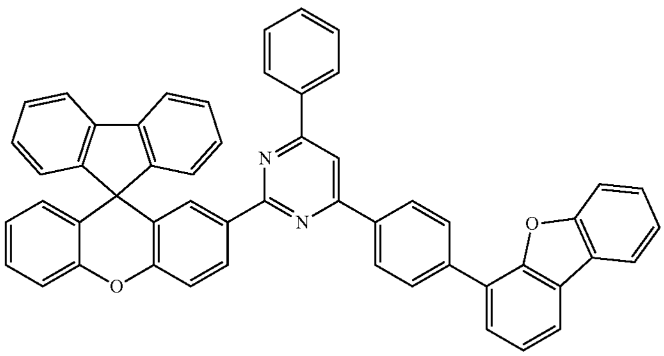
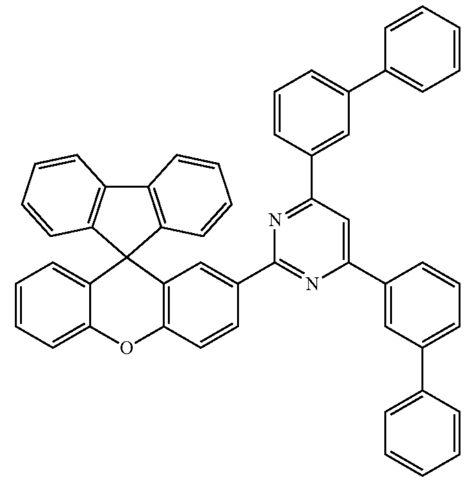
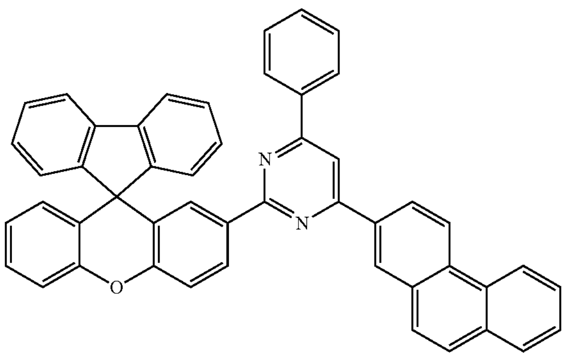
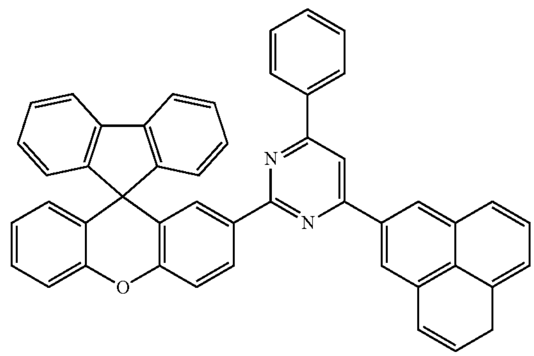
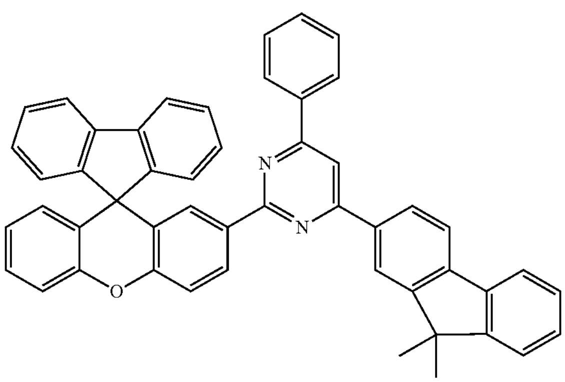
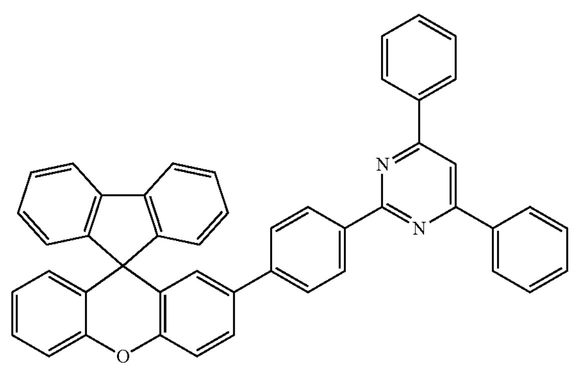
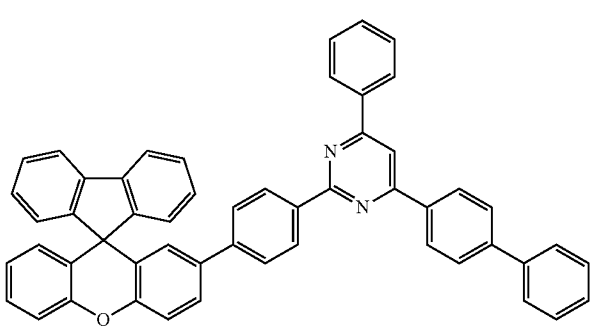
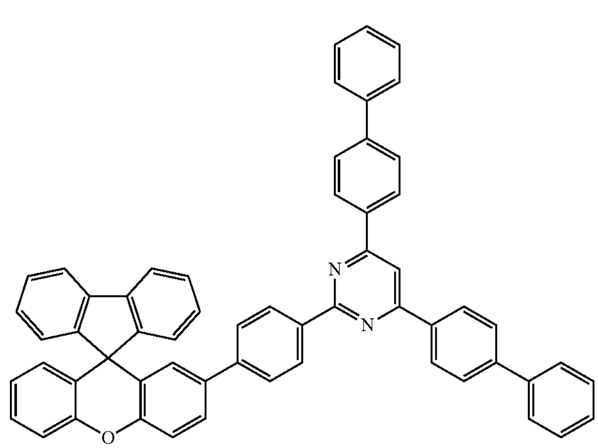

-continued
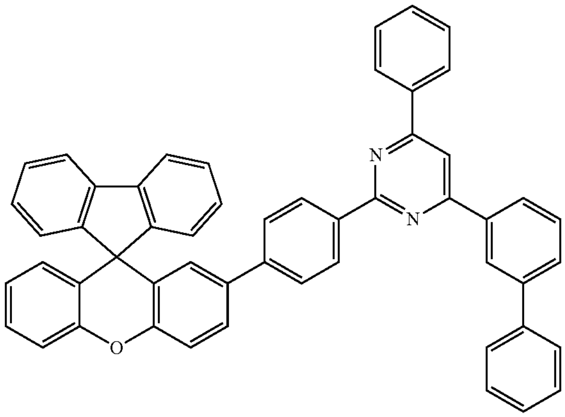
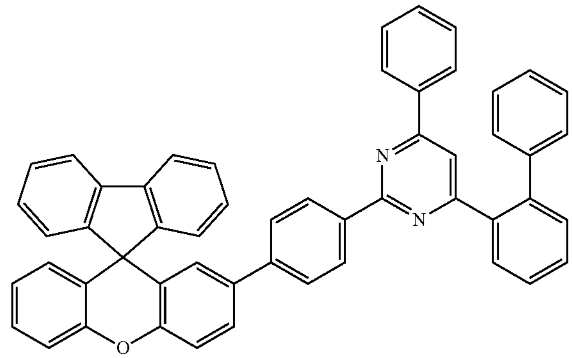
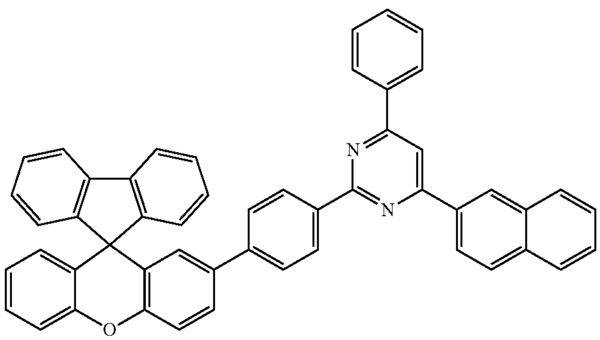
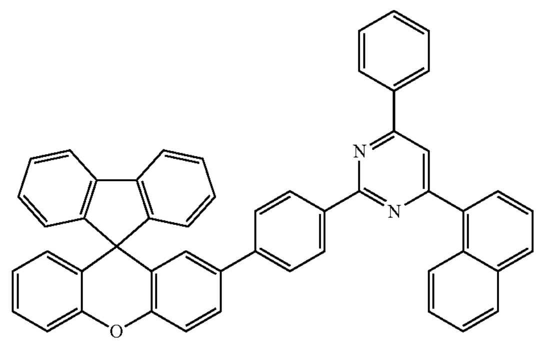
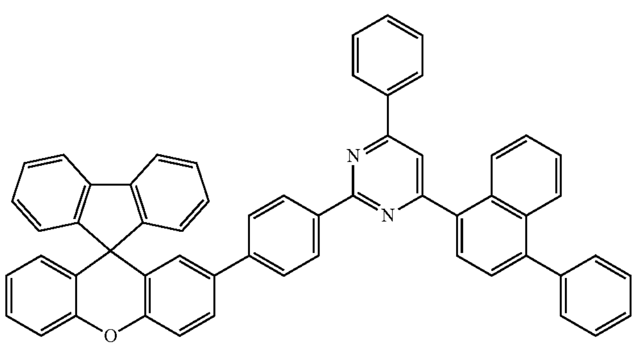
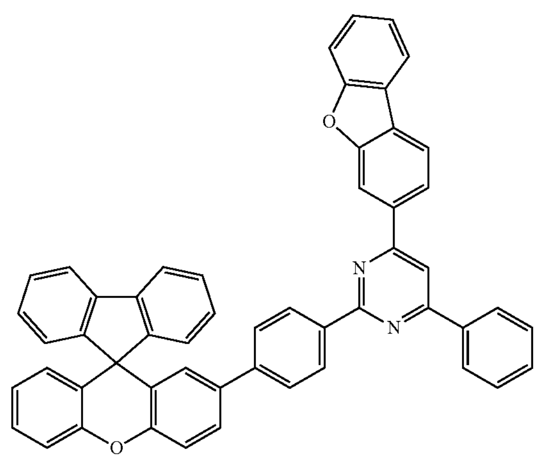
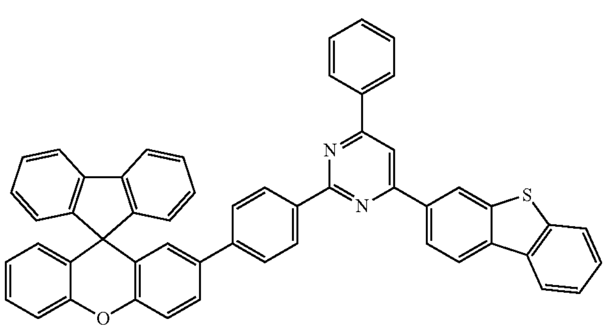
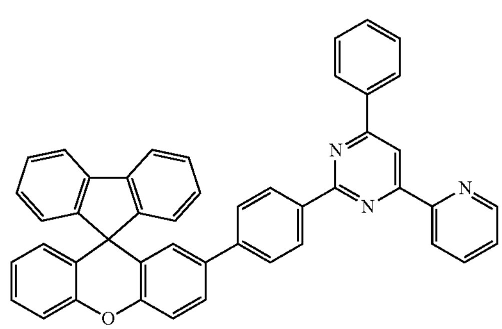

-continued
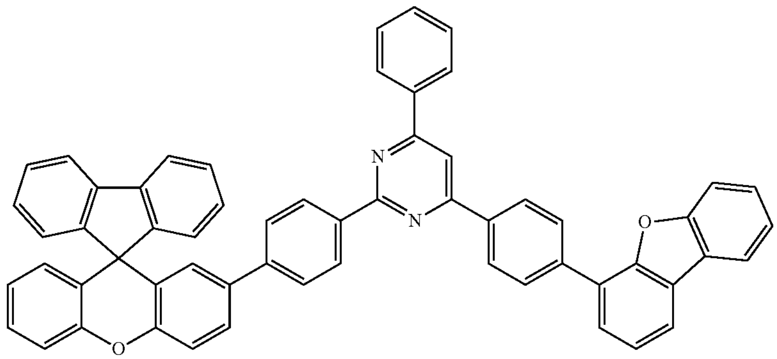
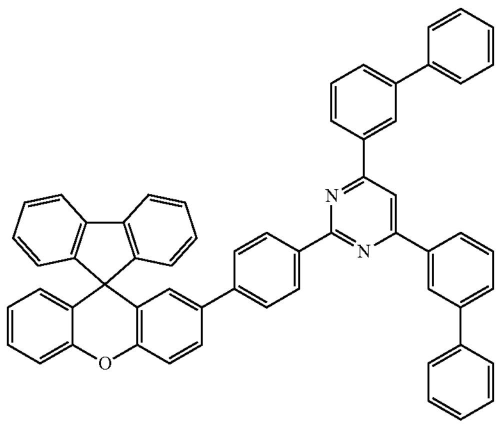
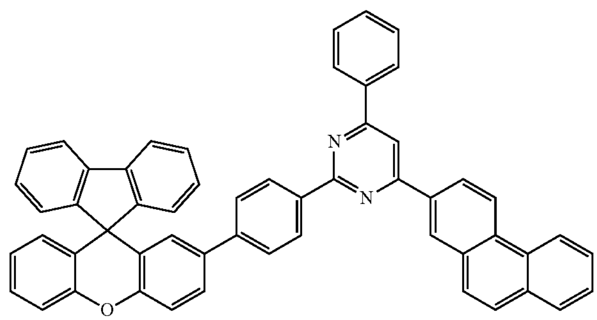
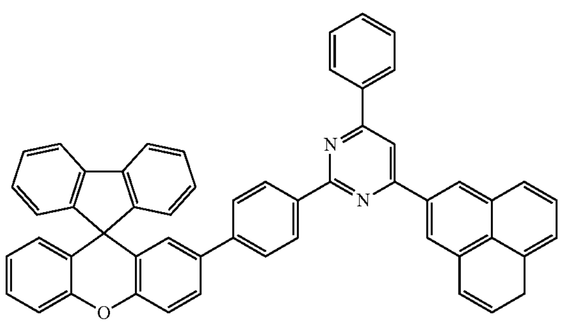
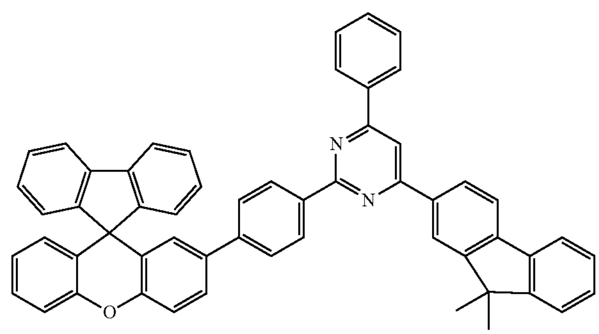
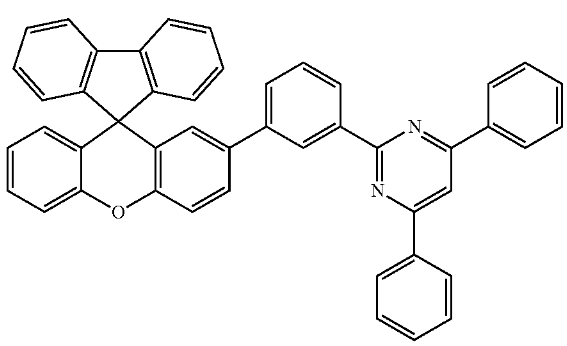
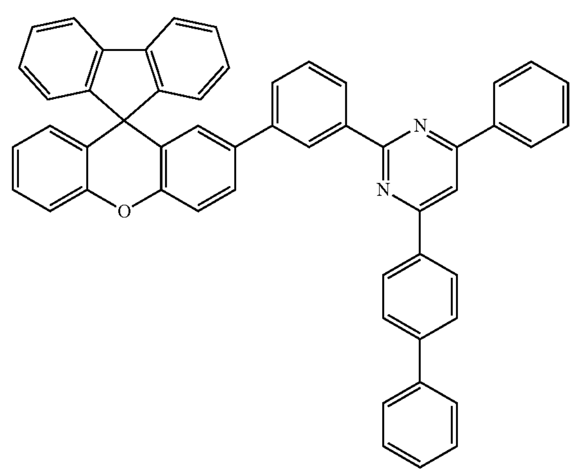

-continued
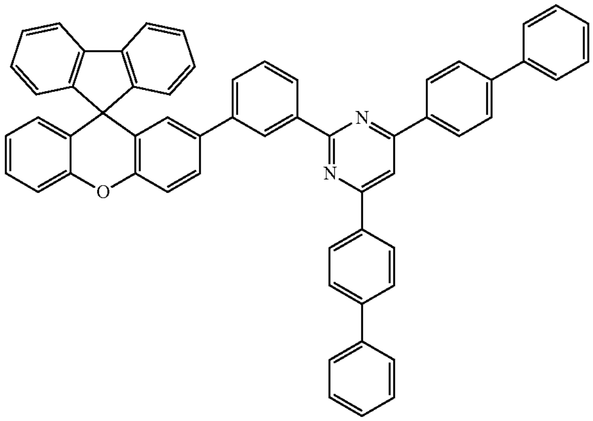
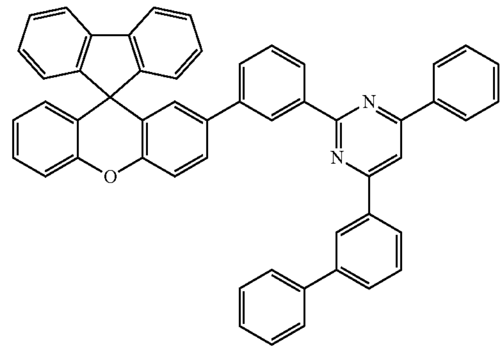
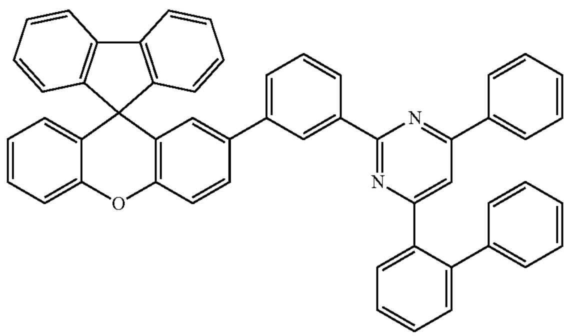
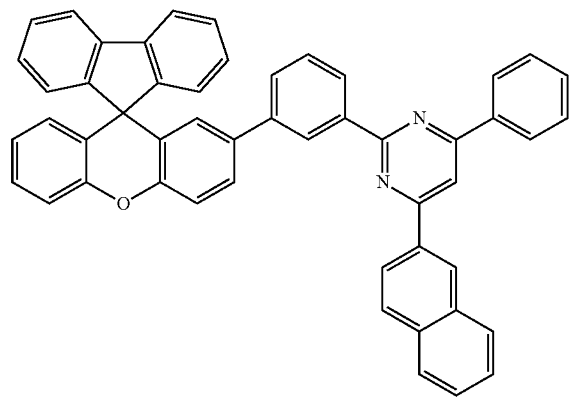
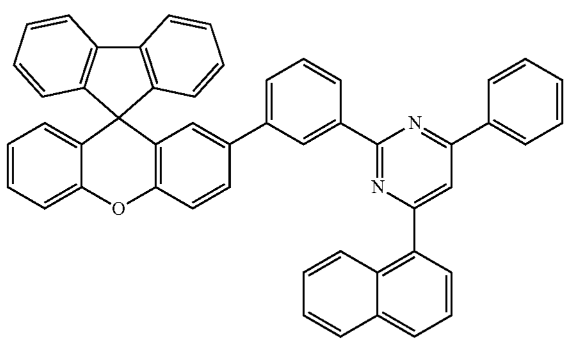
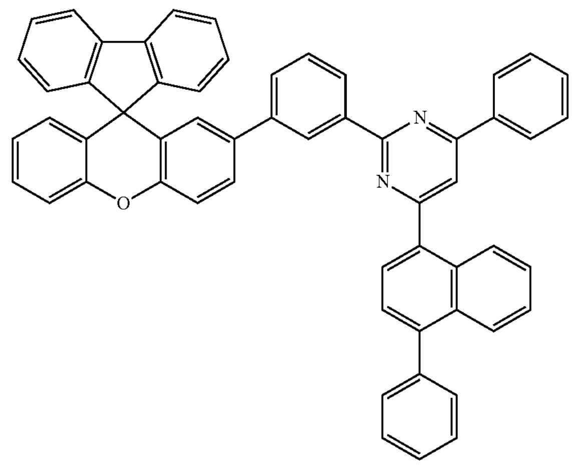
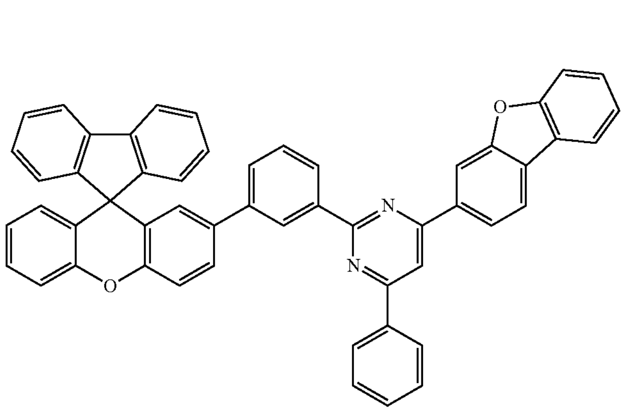
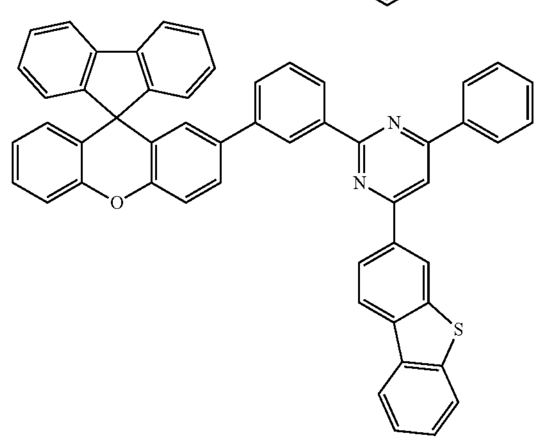

-continued
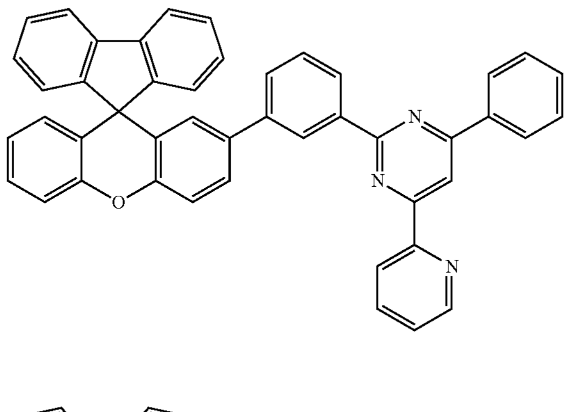
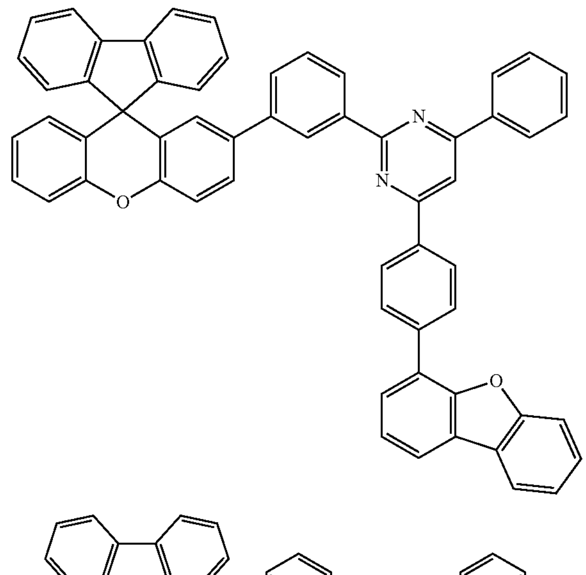
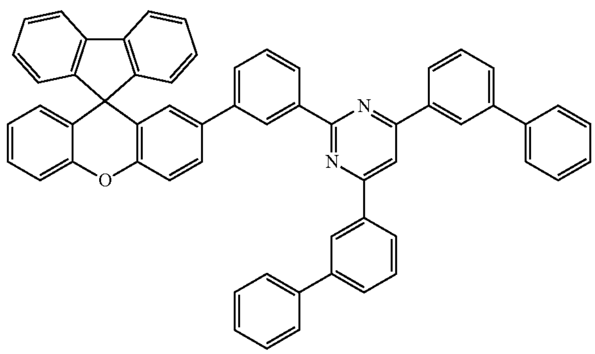
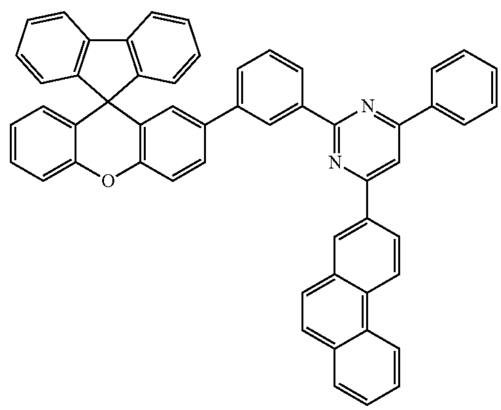
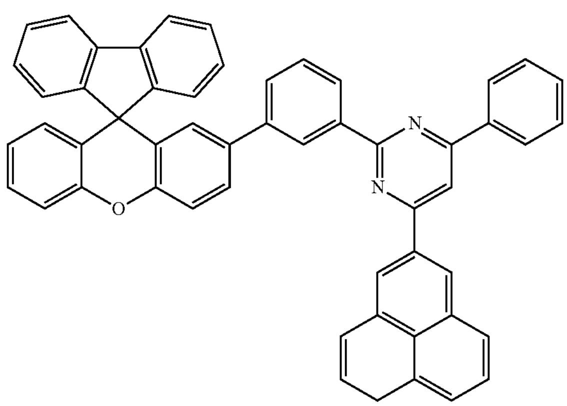
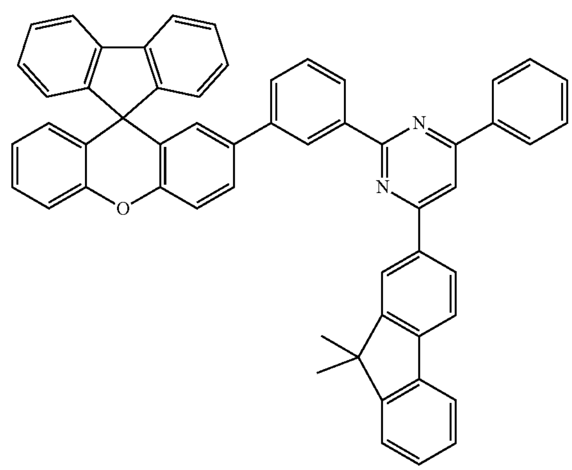
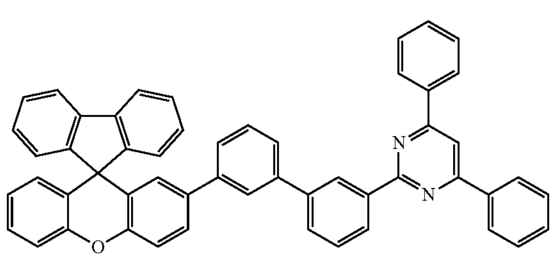
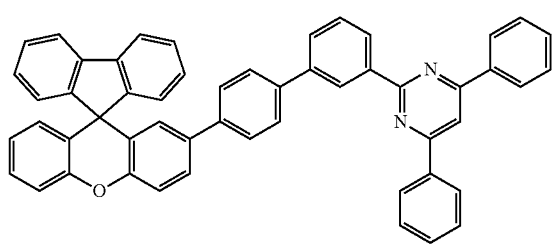

-continued
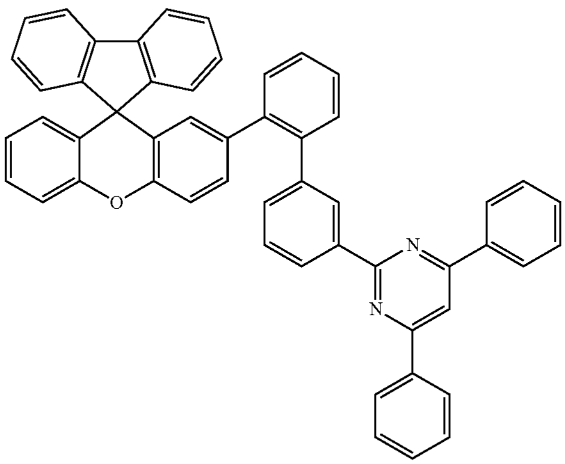
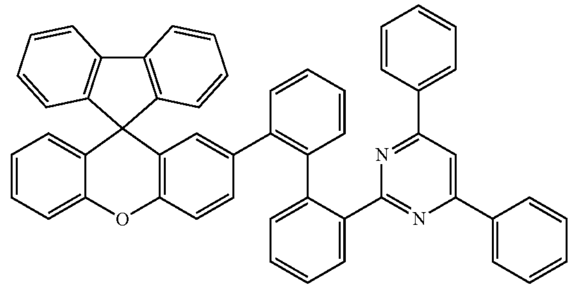
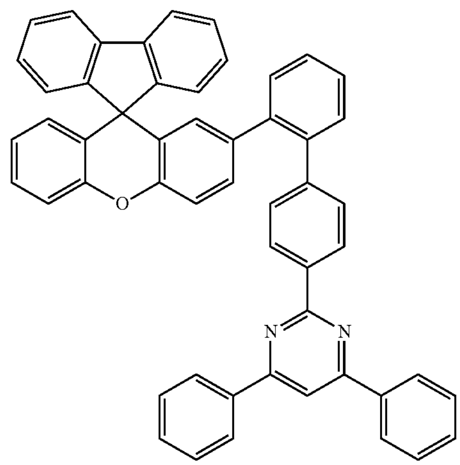
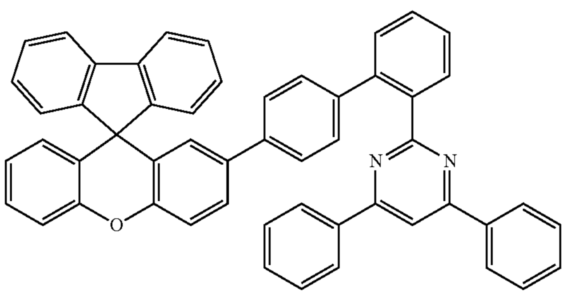
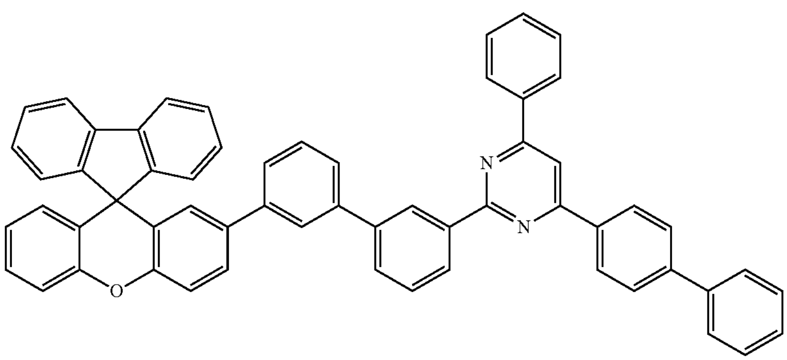
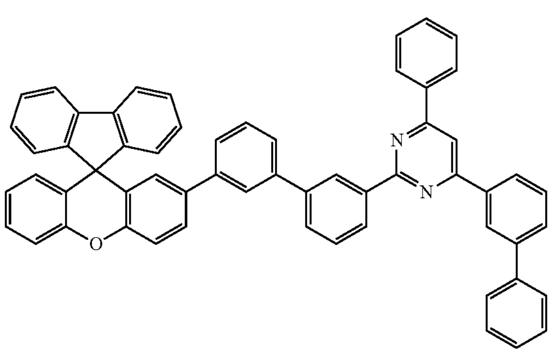
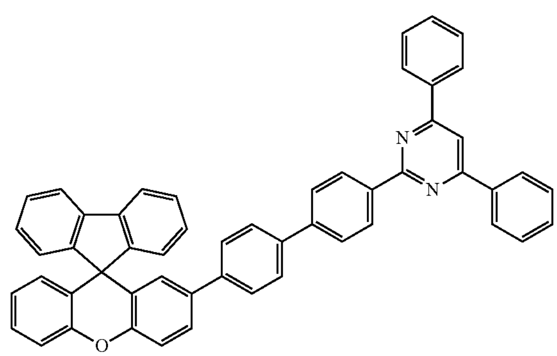

-continued
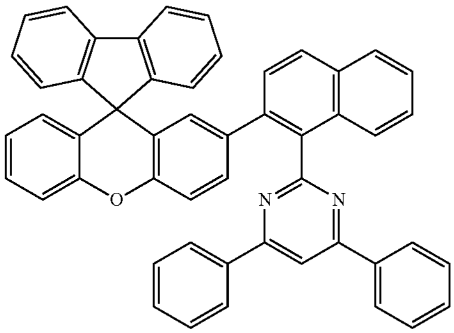
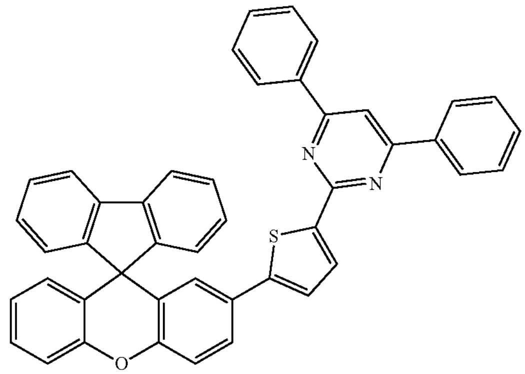
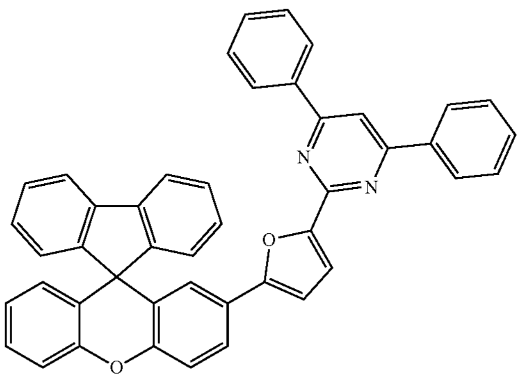
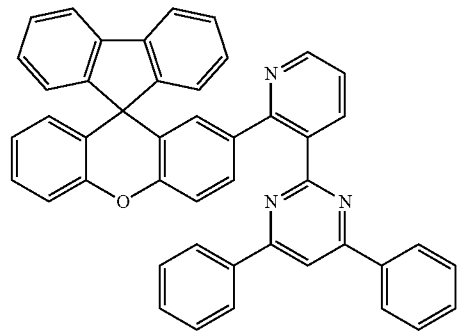
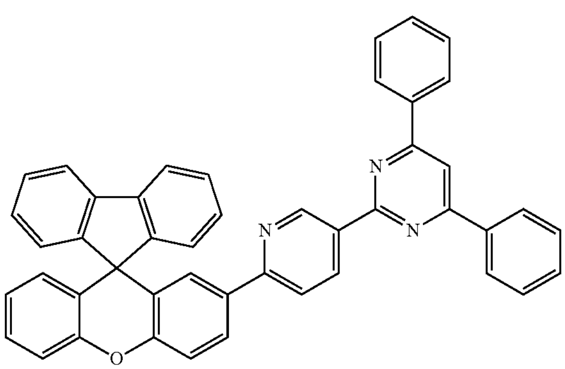
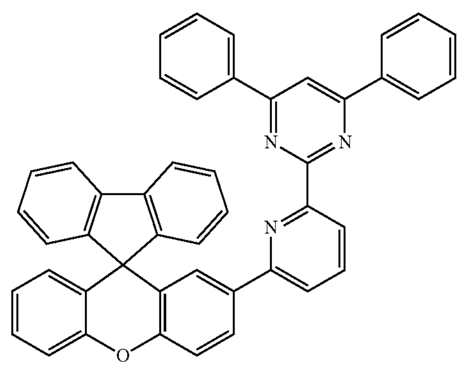
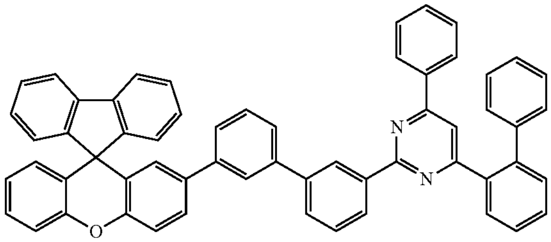
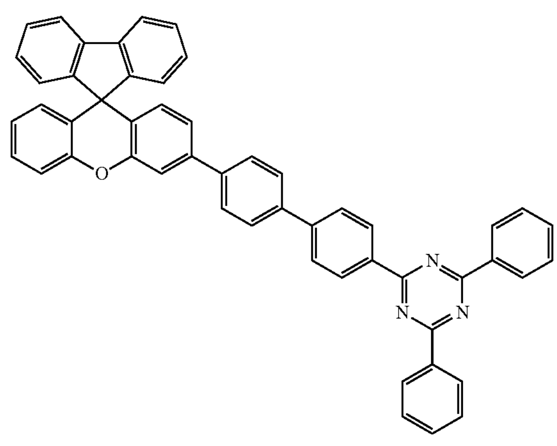

-continued
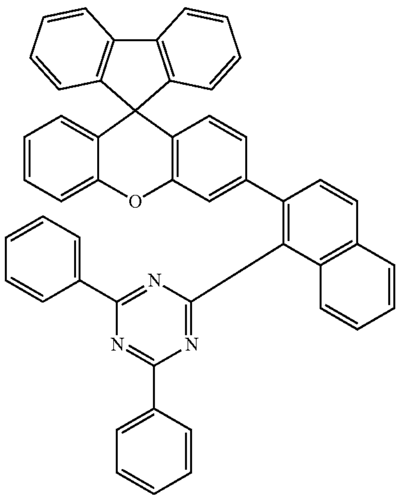
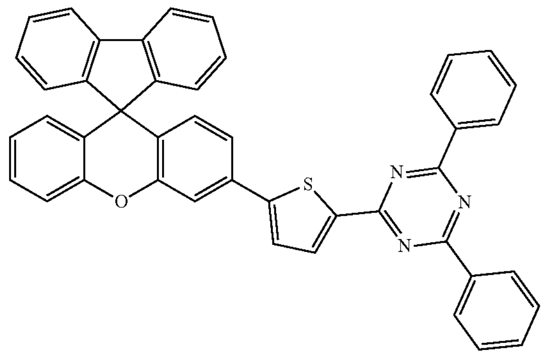
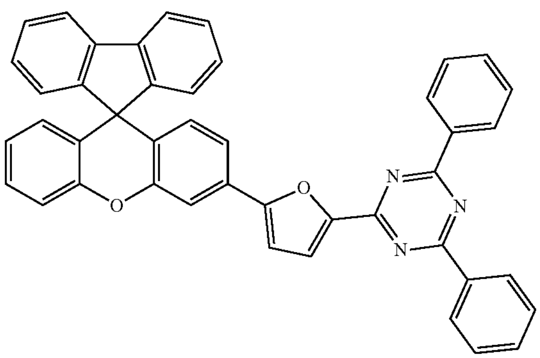
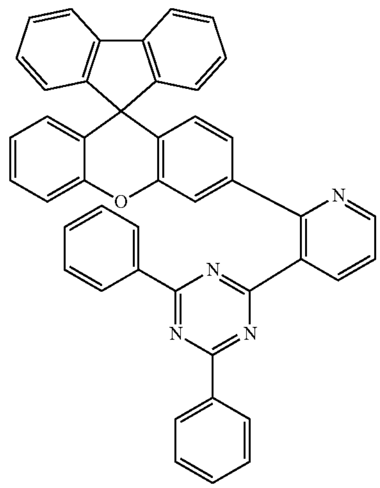
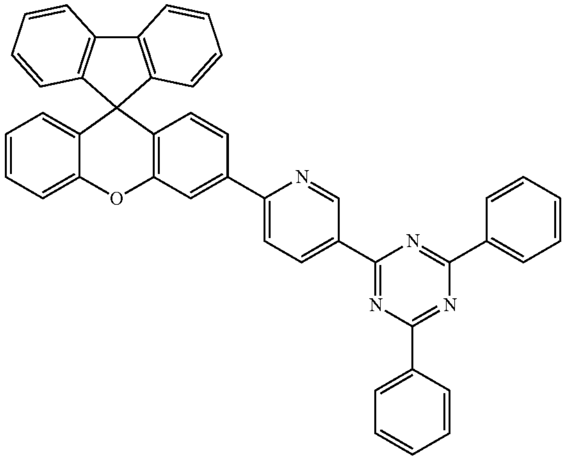
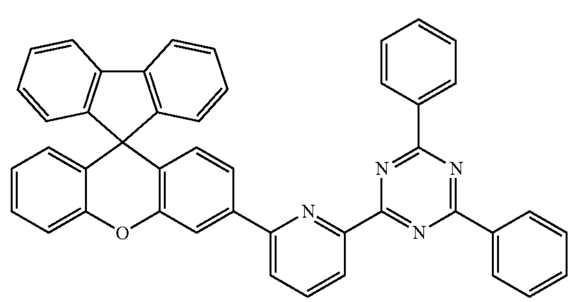

-continued
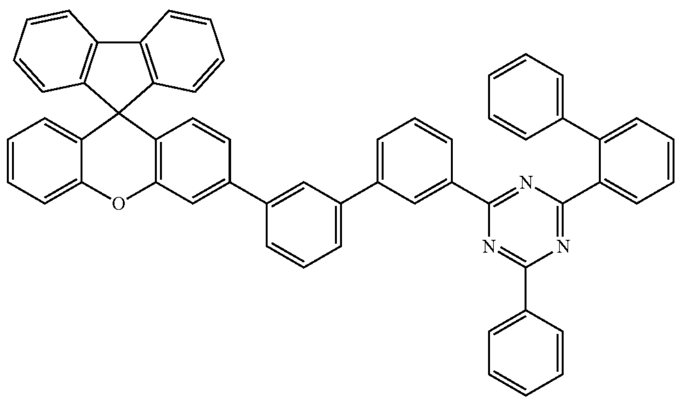
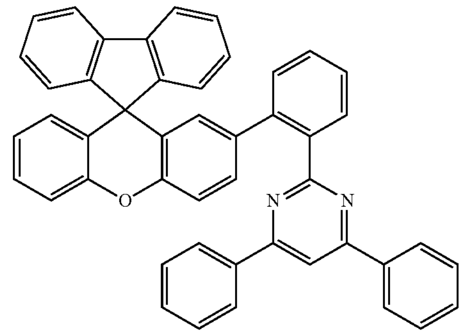
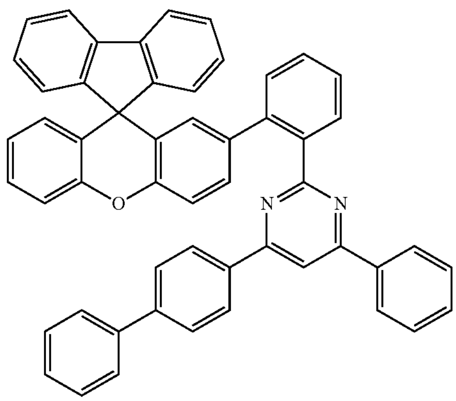
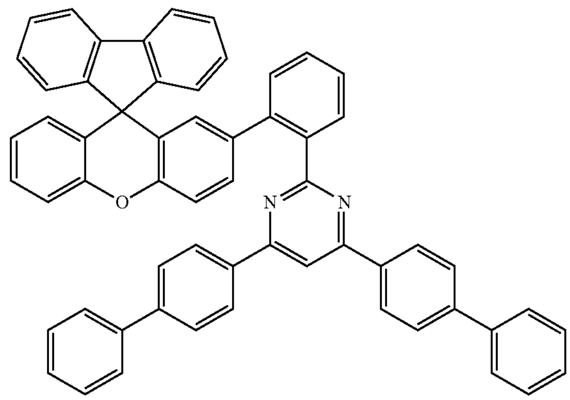
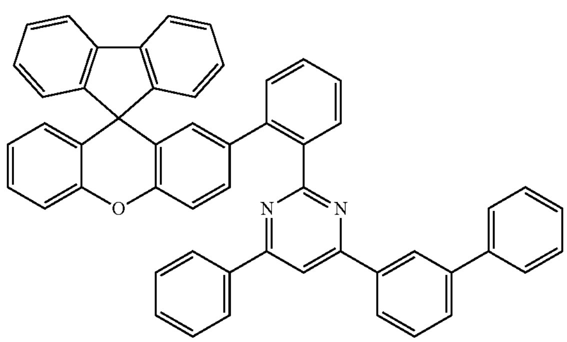
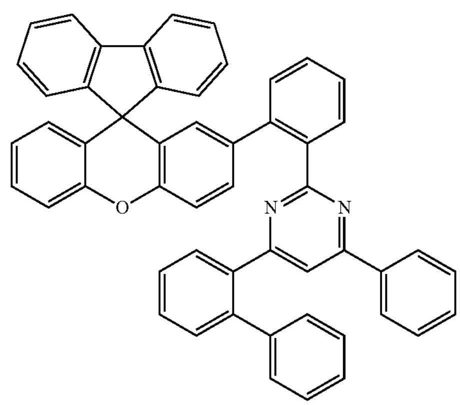
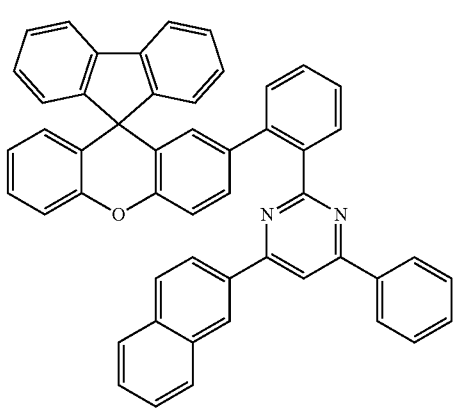
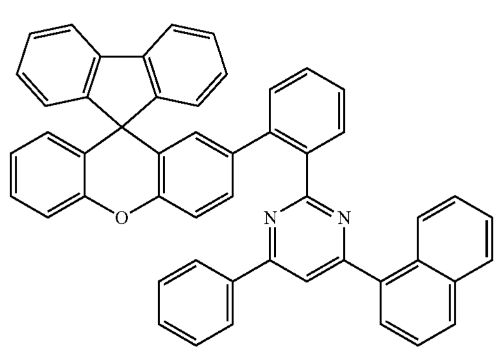

-continued
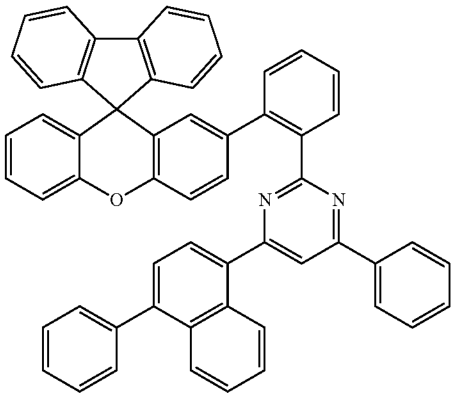
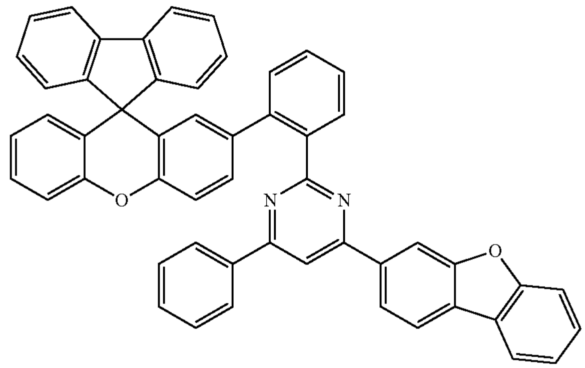
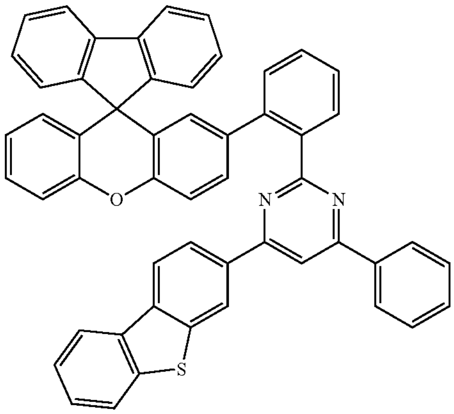
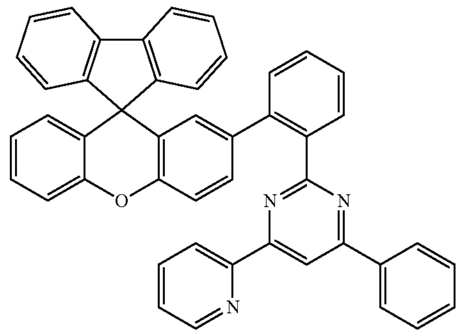
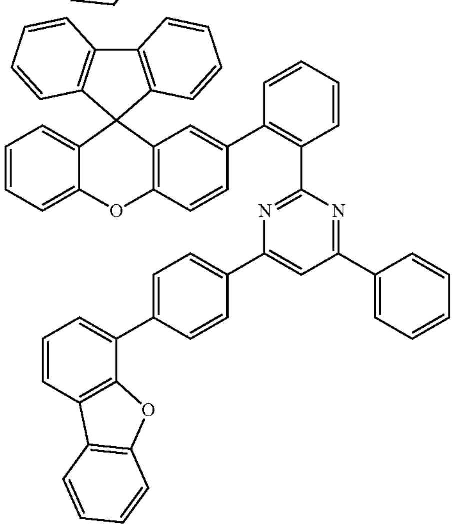
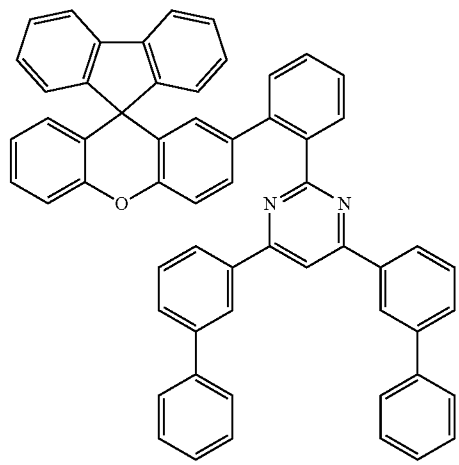
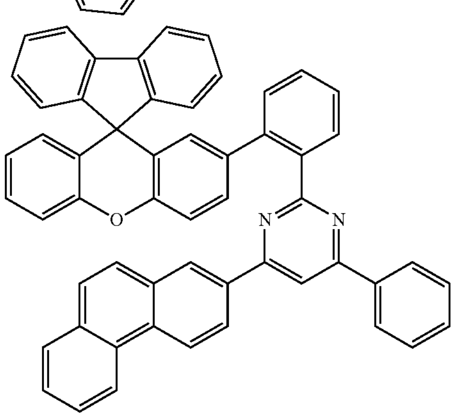
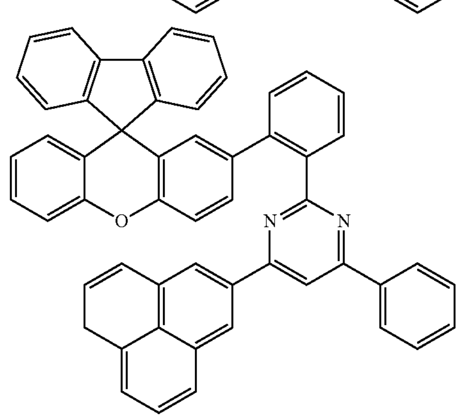

-continued
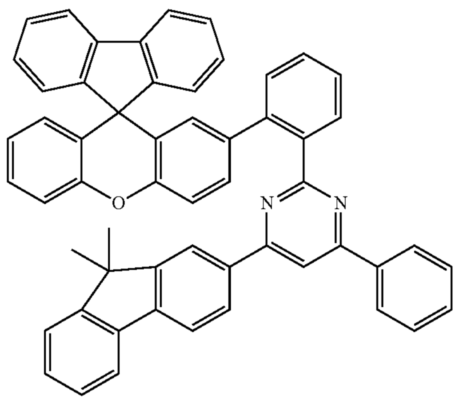
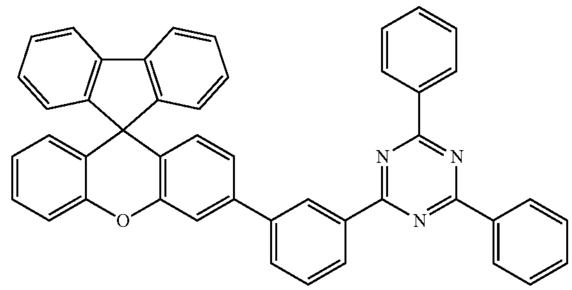
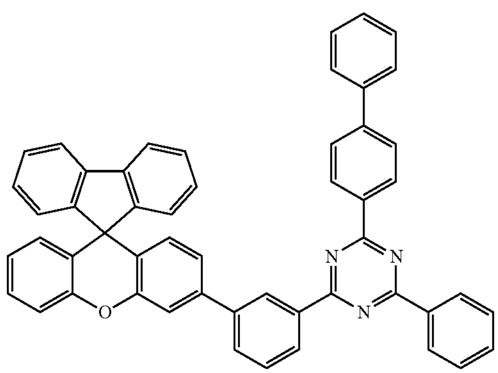
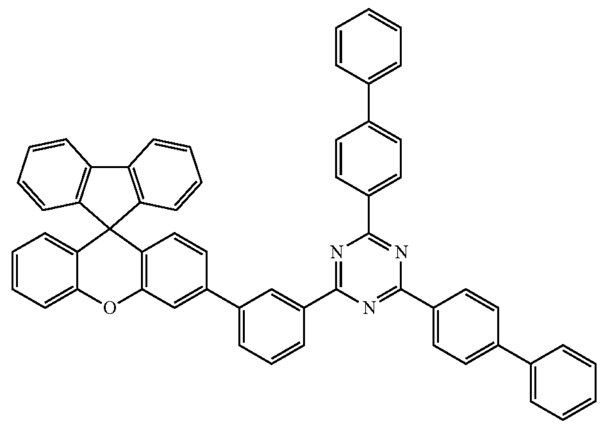
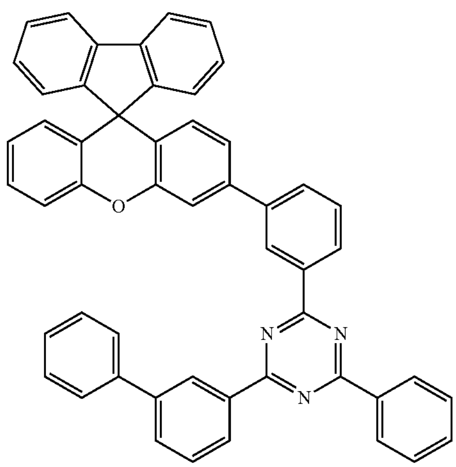
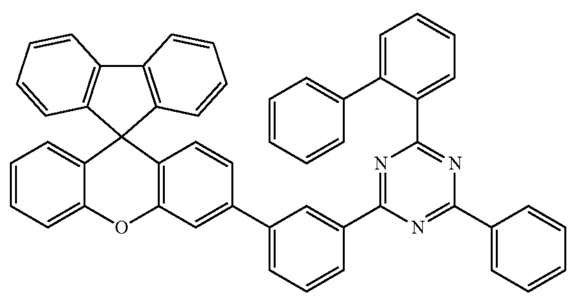
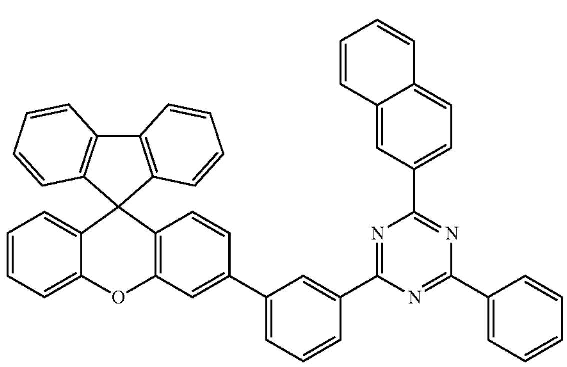
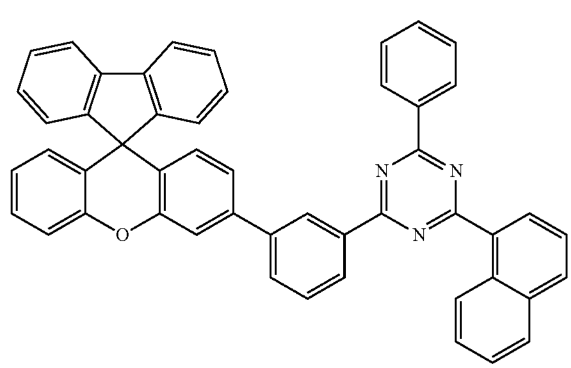

-continued
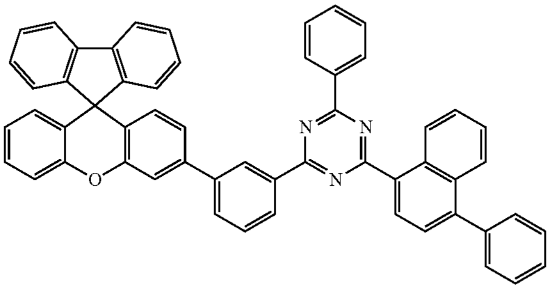
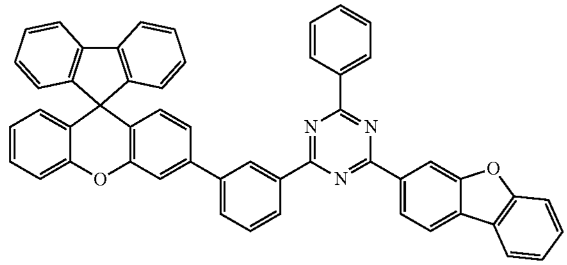
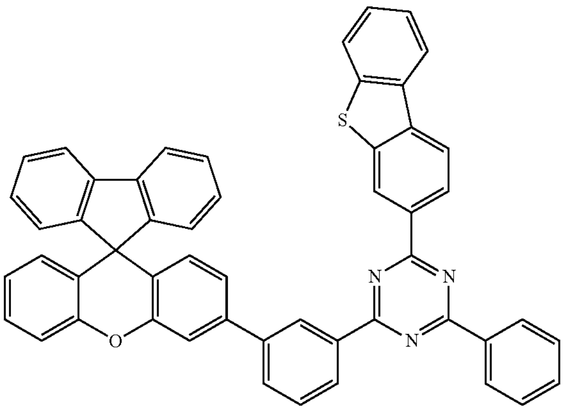
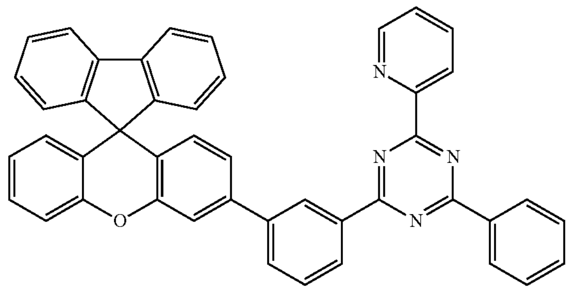
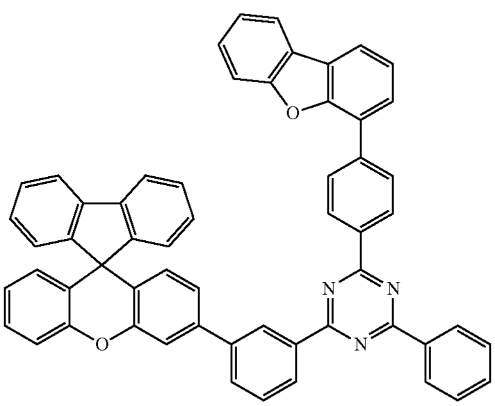
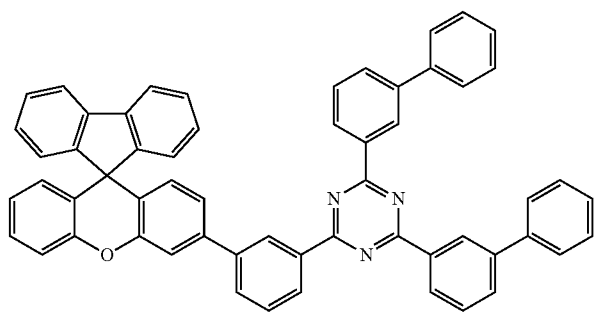
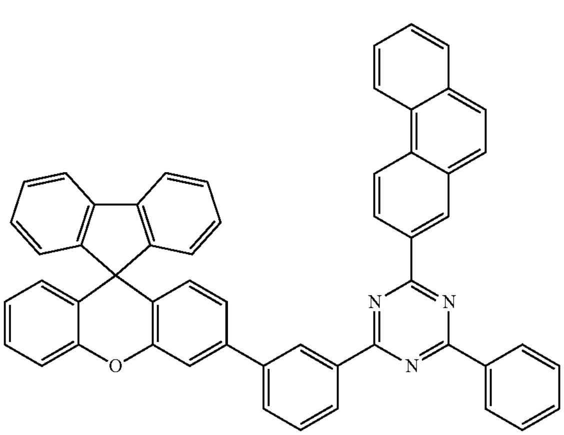
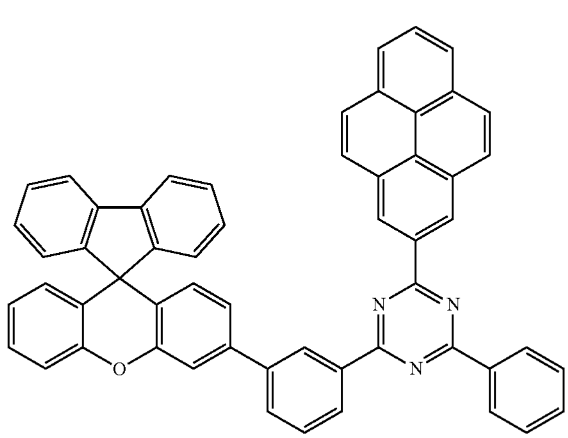

-continued
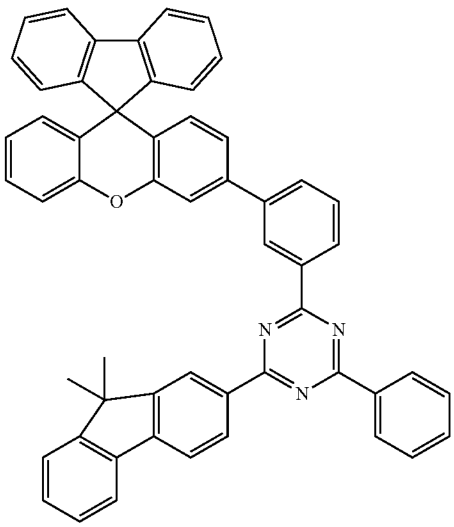
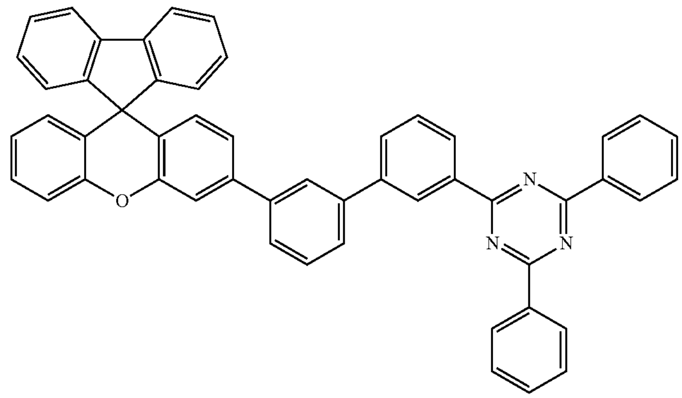
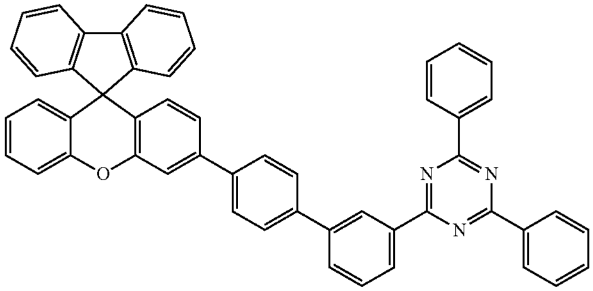
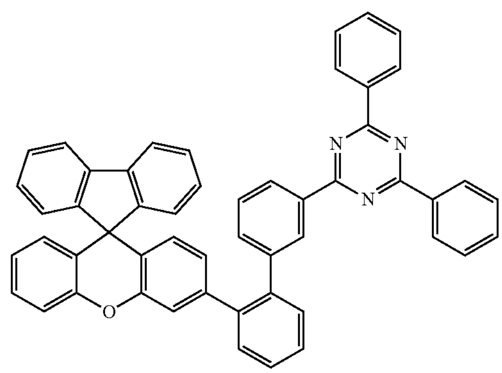
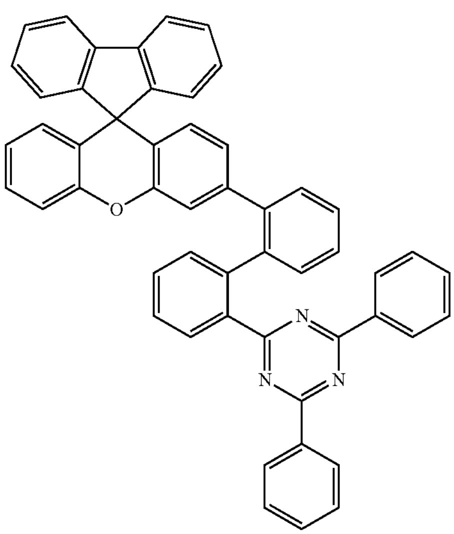
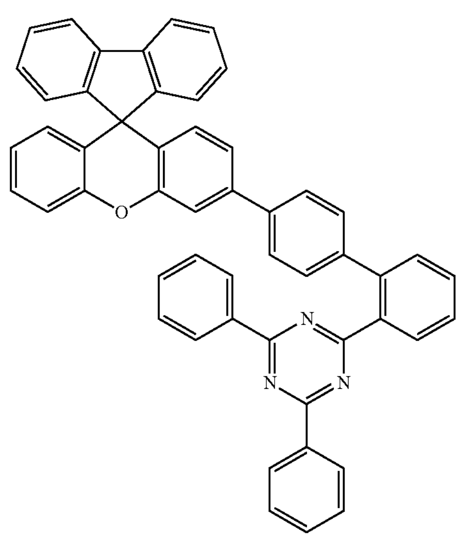

-continued
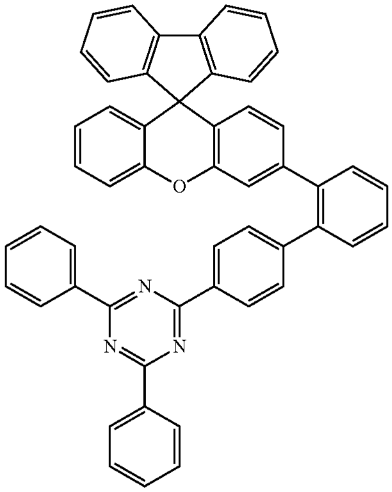
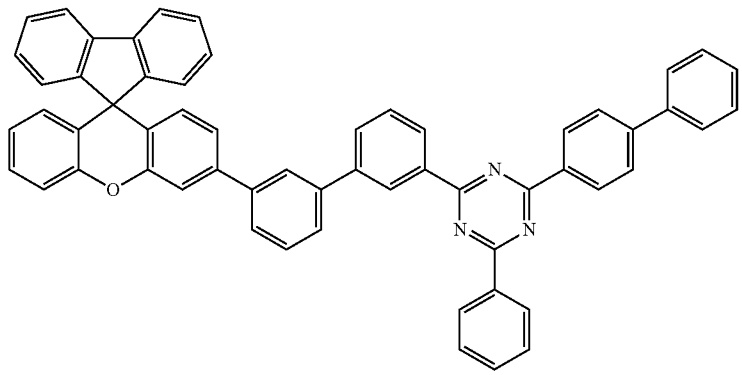
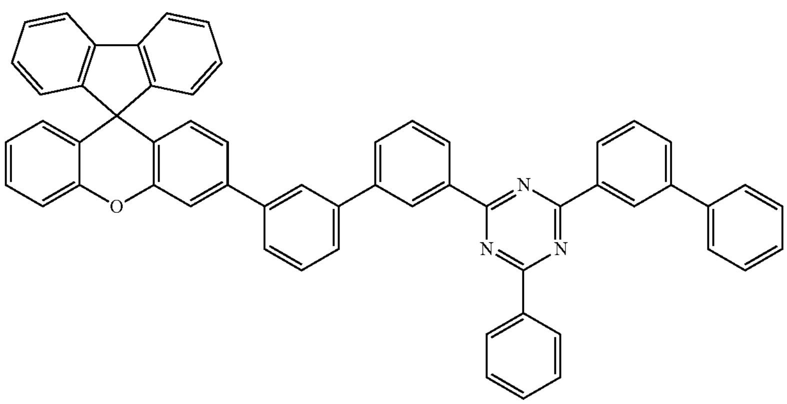
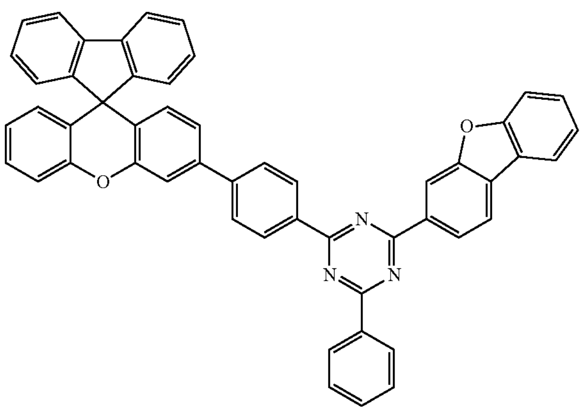
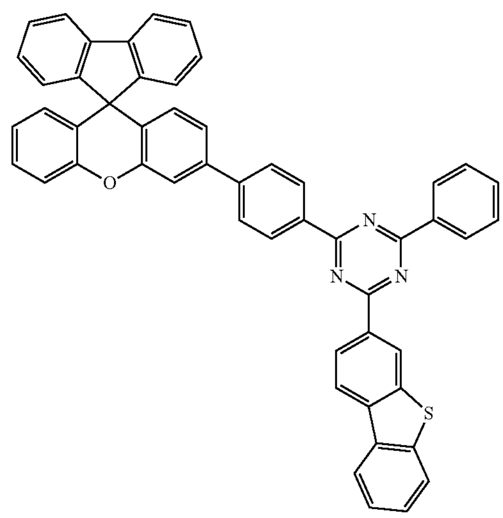

-continued
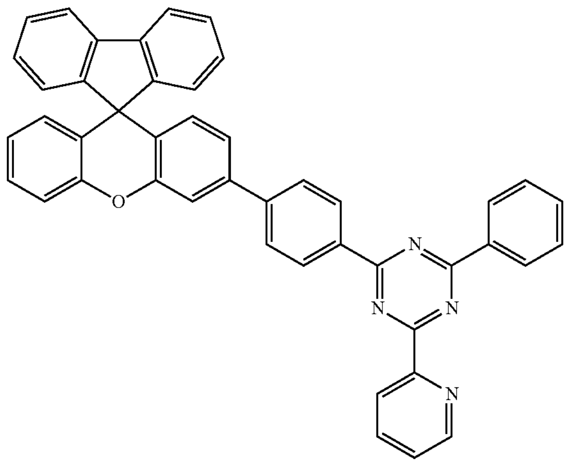
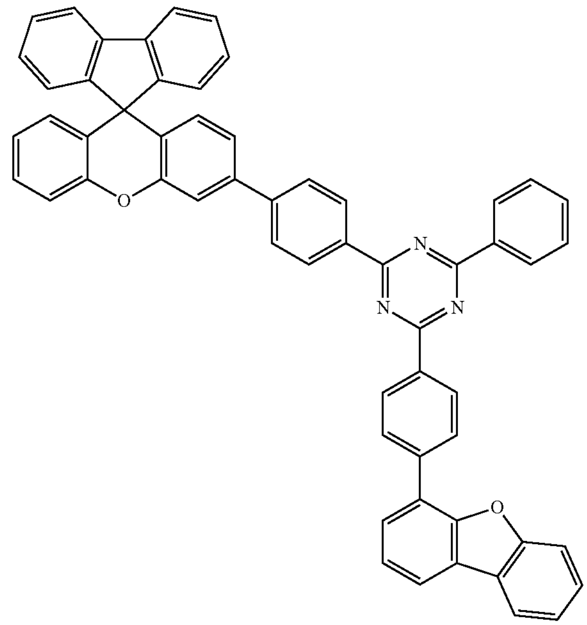
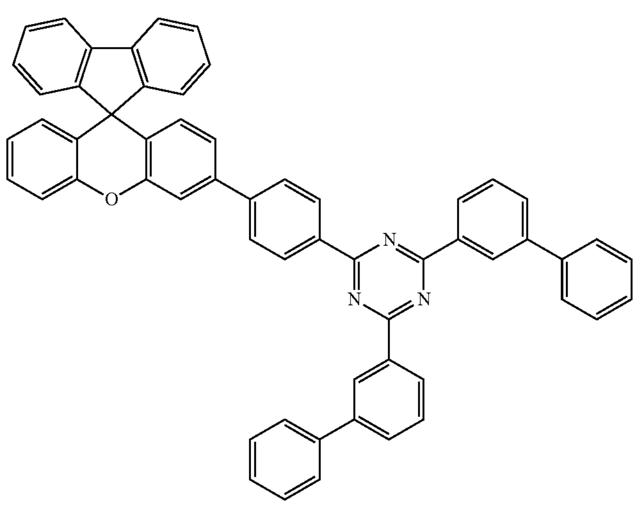
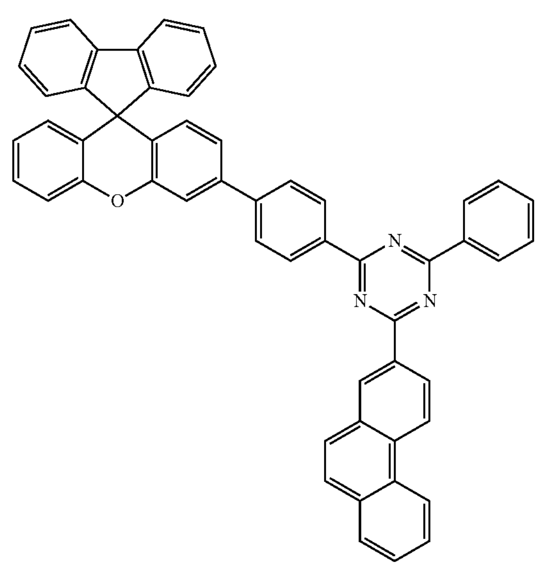

-continued
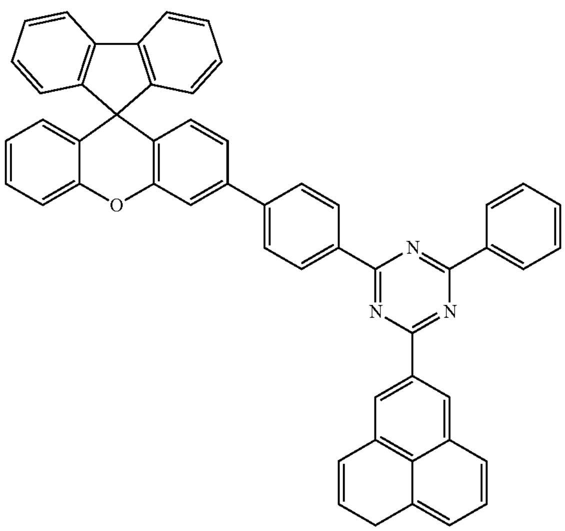
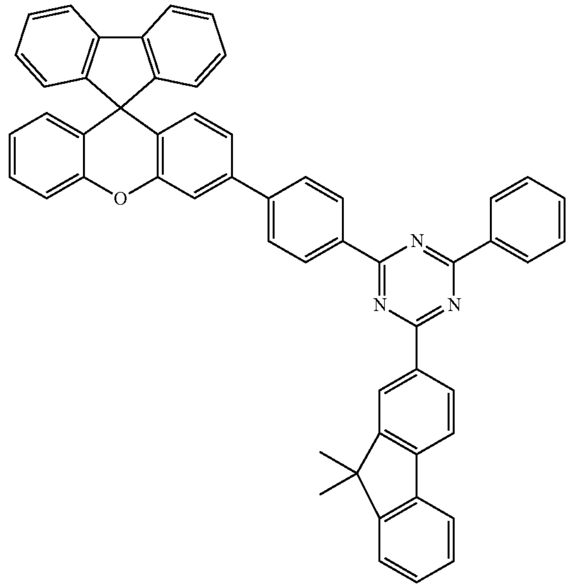
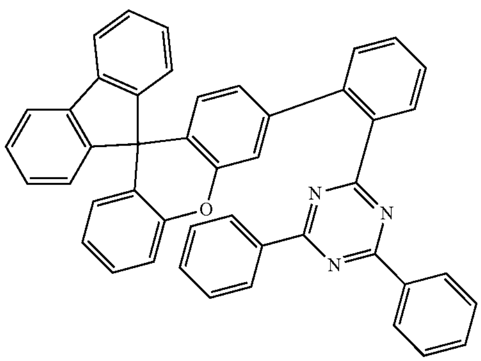
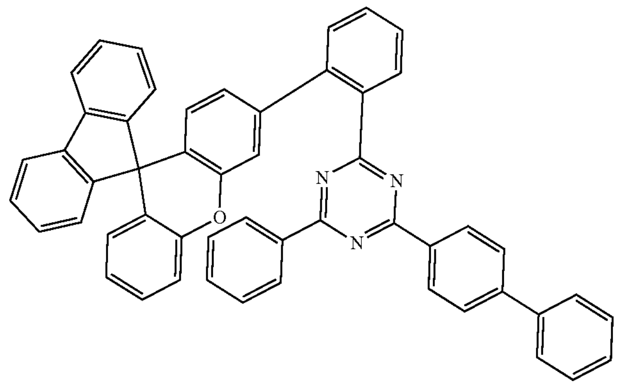
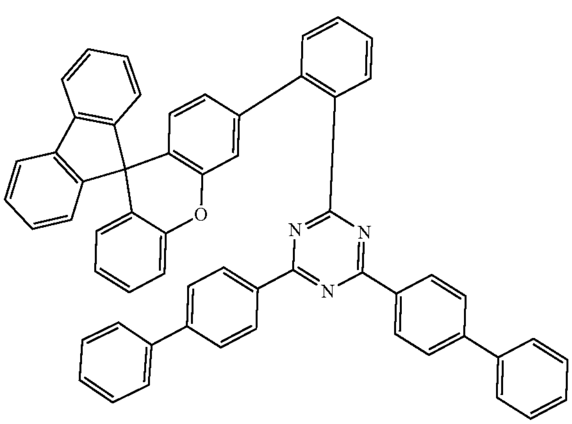
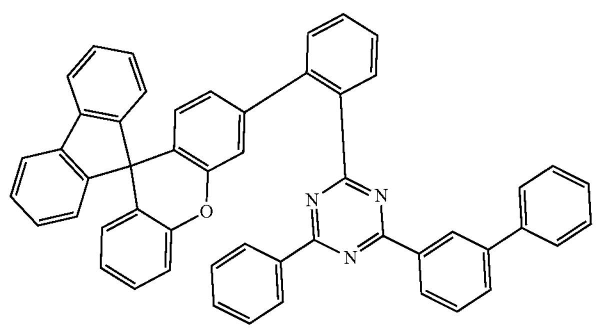

-continued
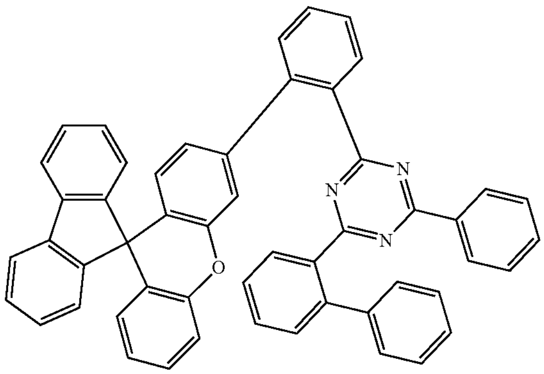
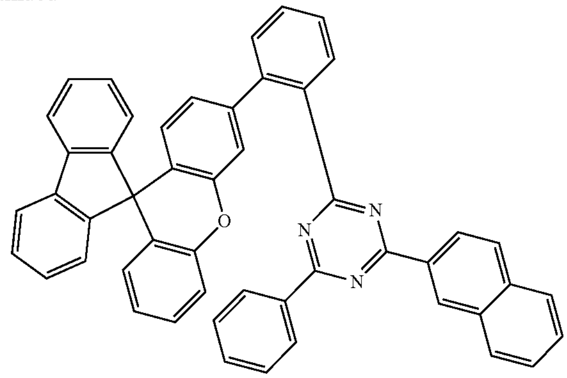
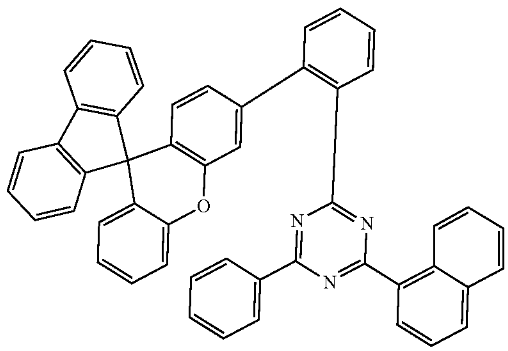
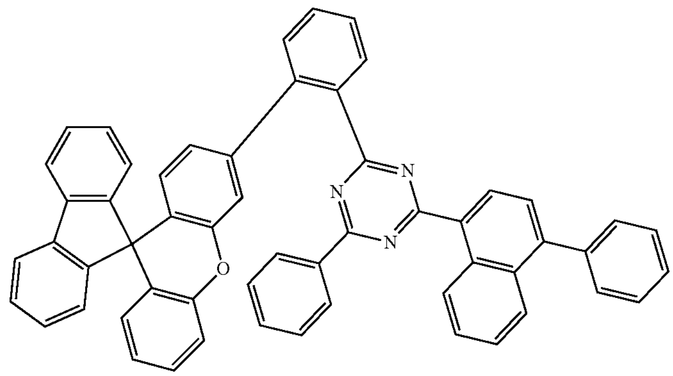
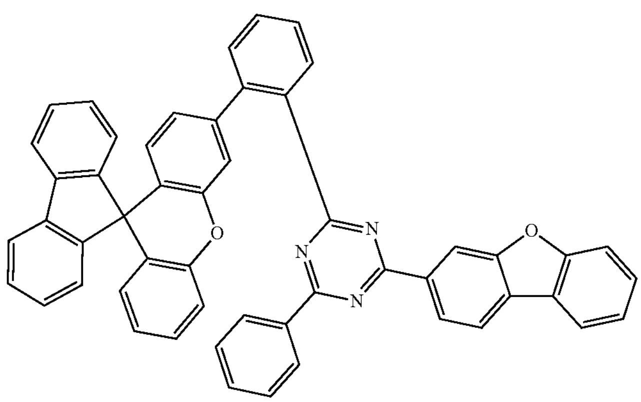
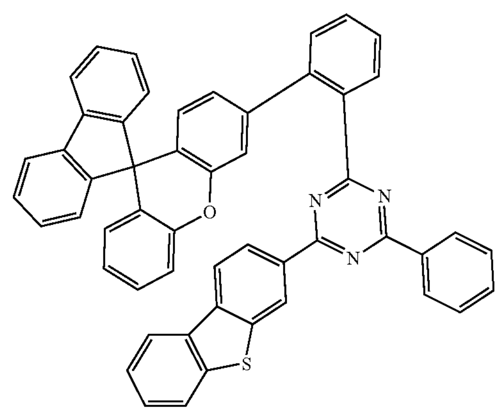
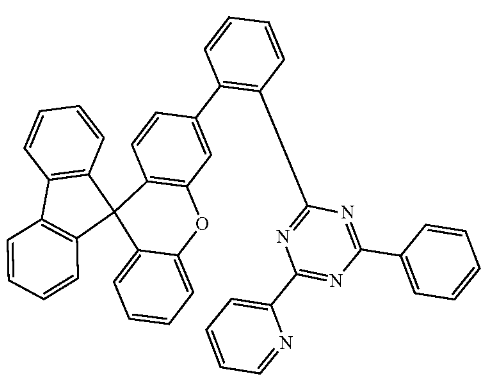
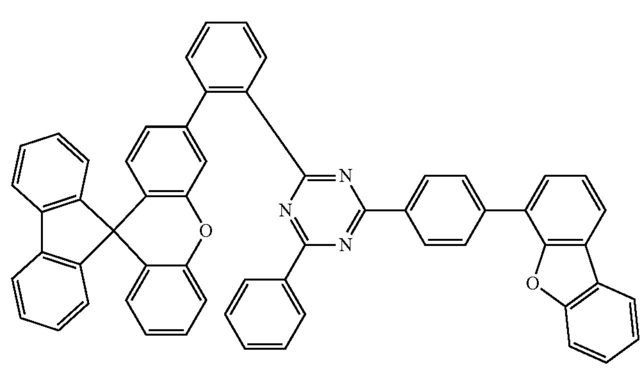

-continued
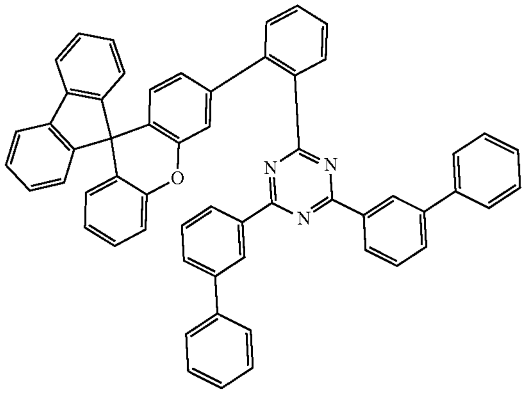
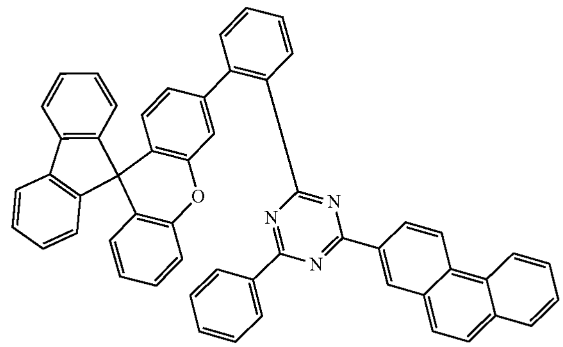
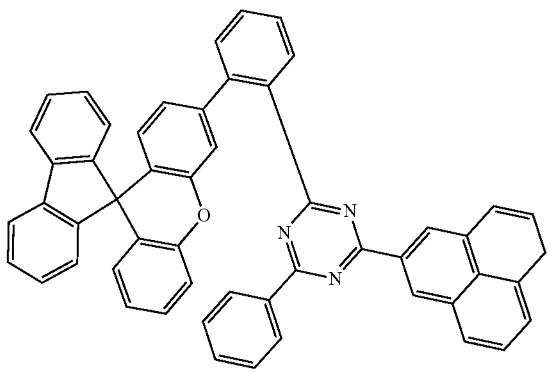
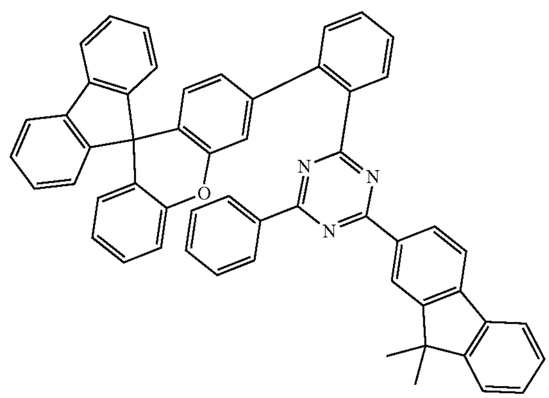
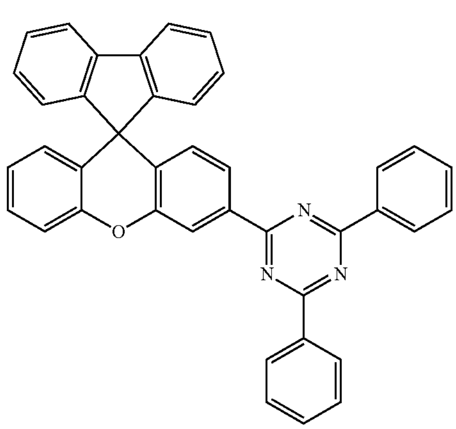
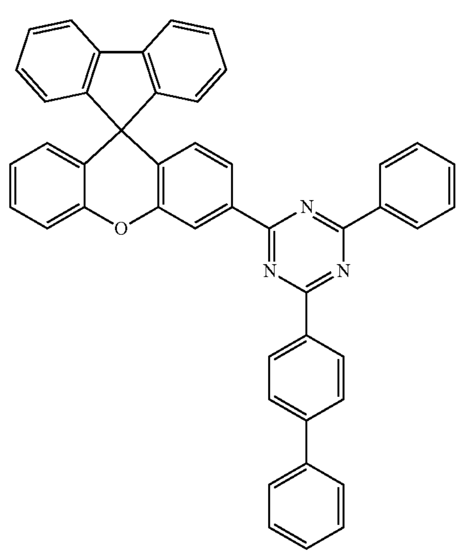

-continued
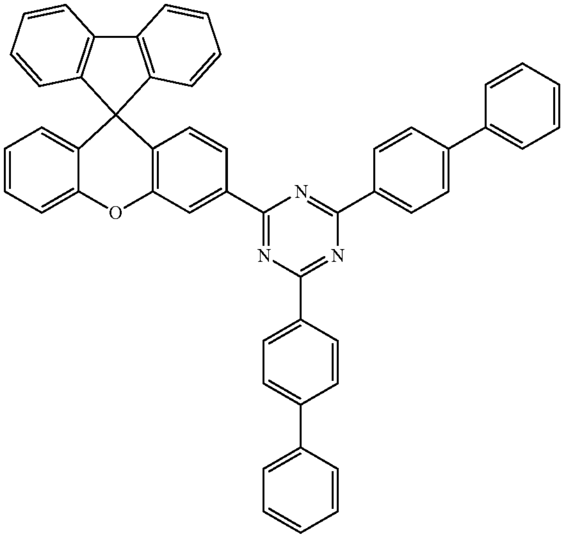
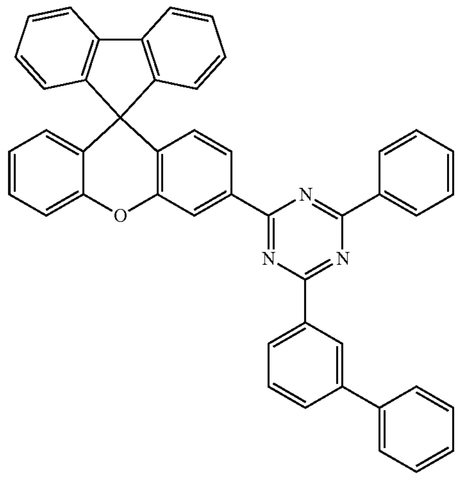
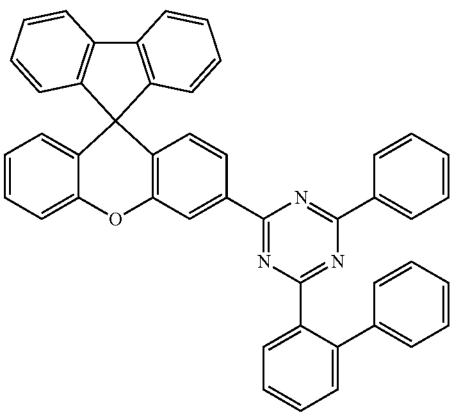
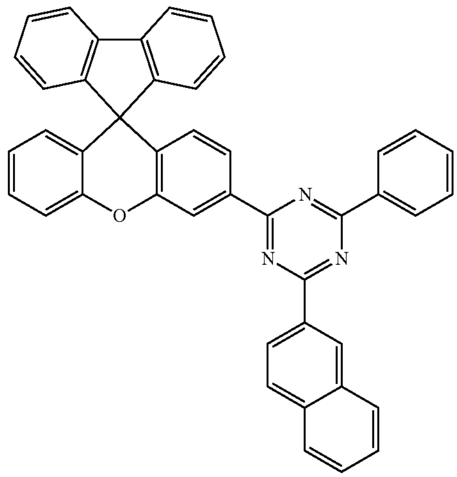
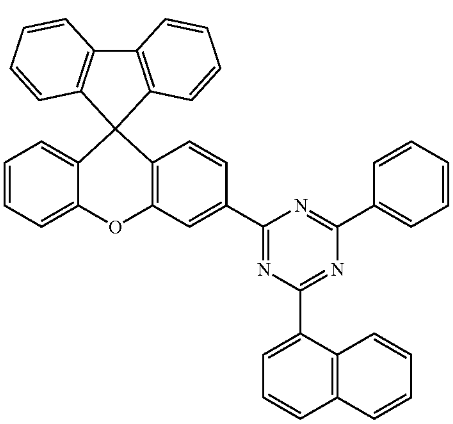
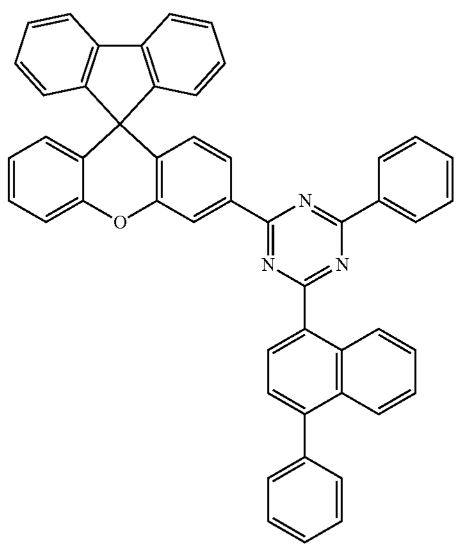

-continued
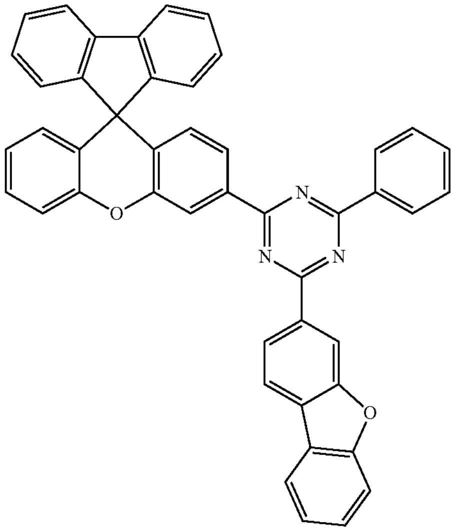
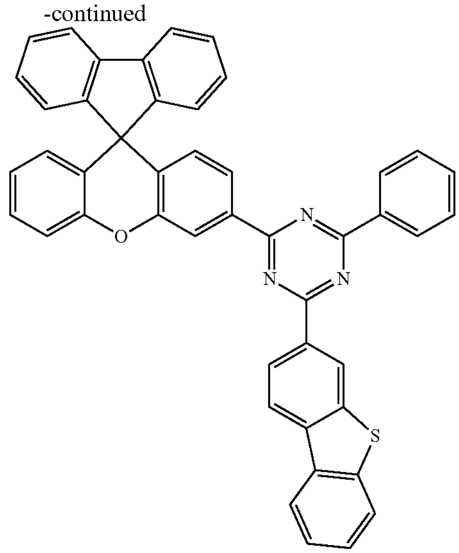
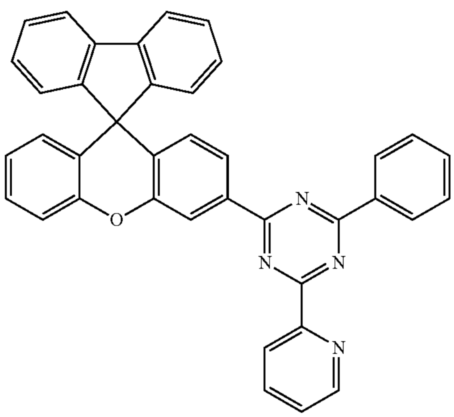
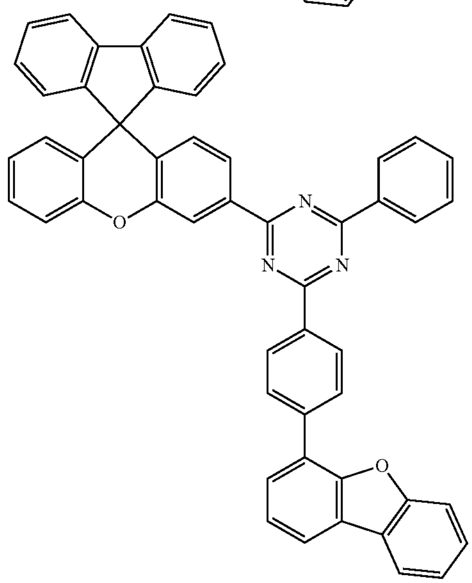
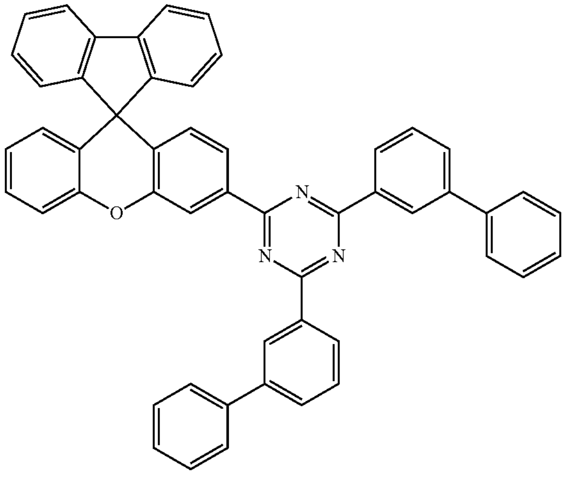
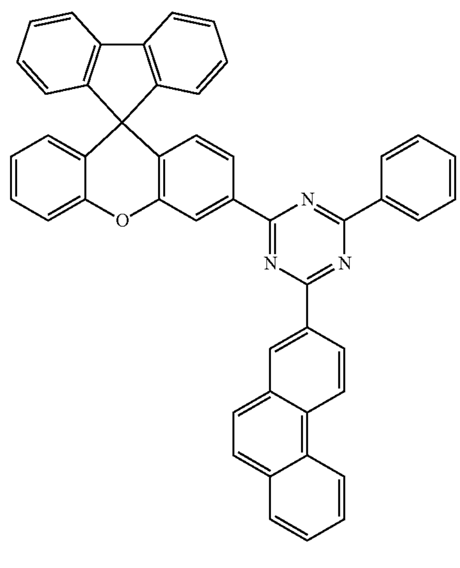

-continued
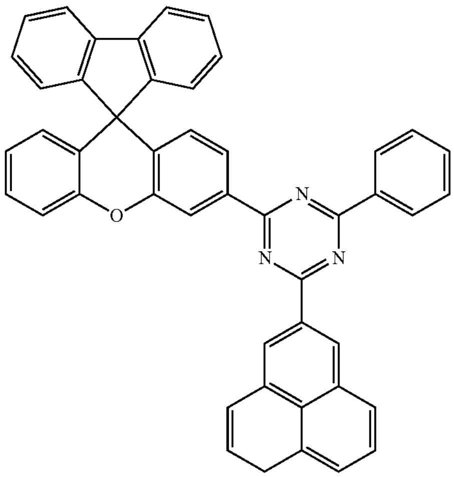
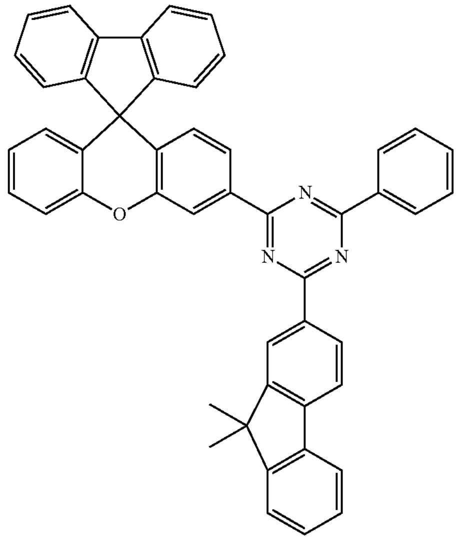
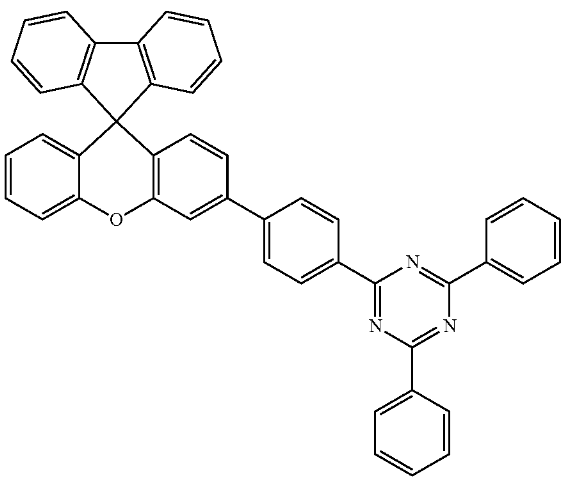
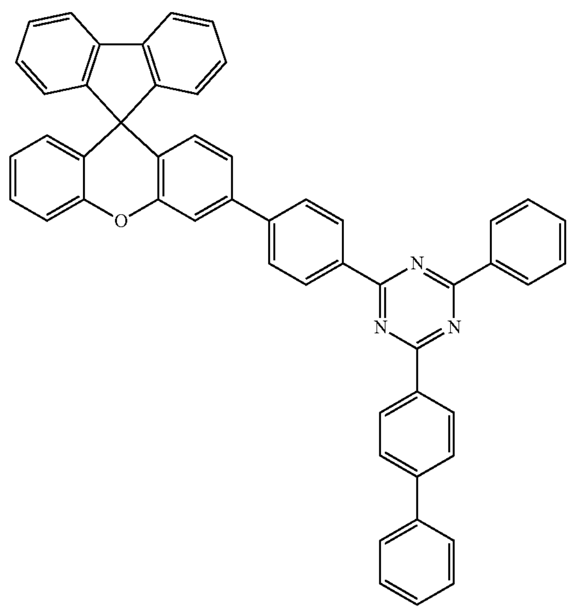
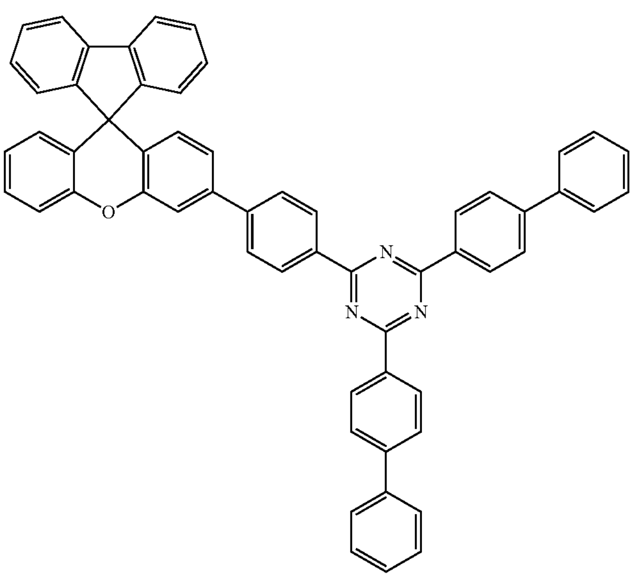
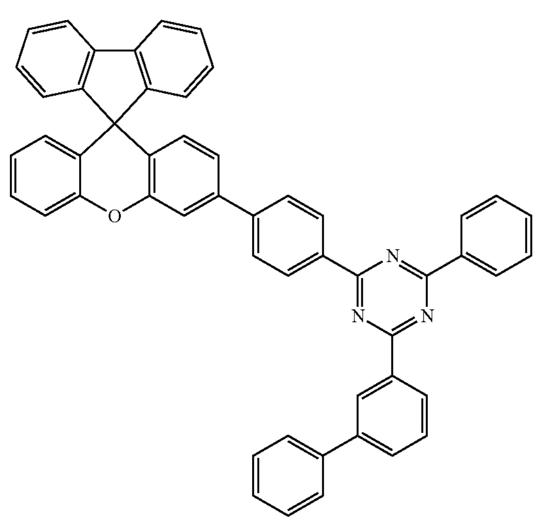

-continued
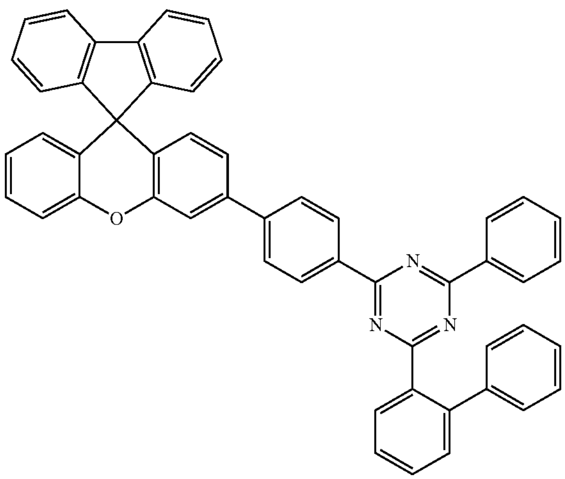
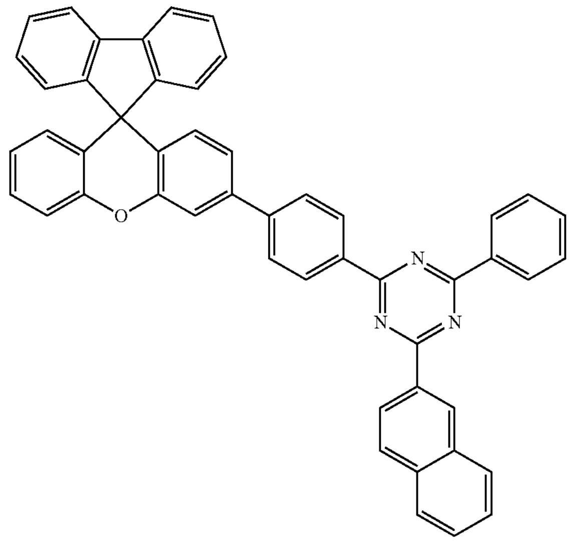
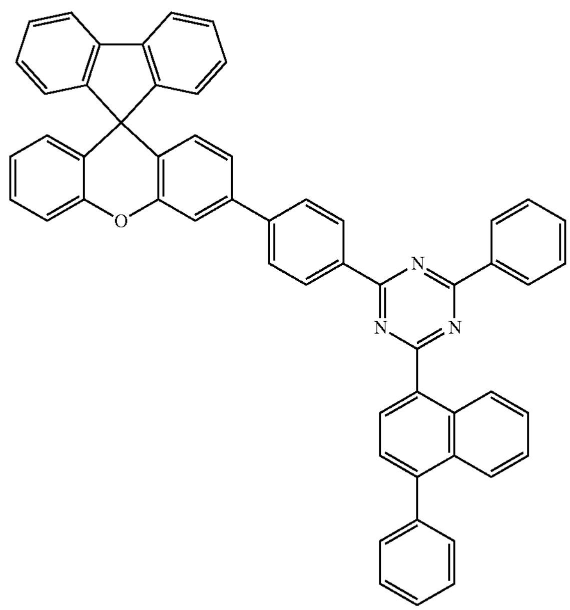
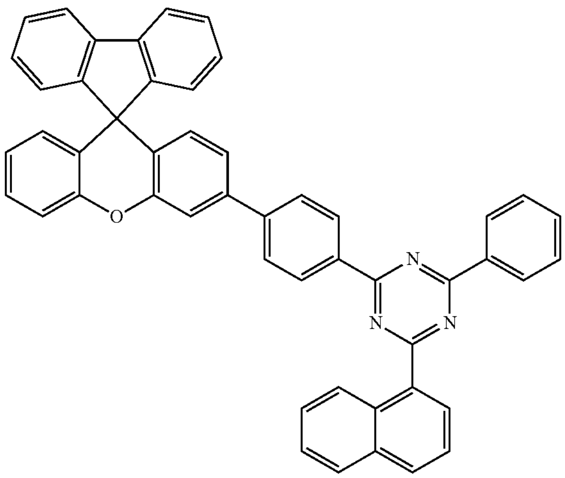
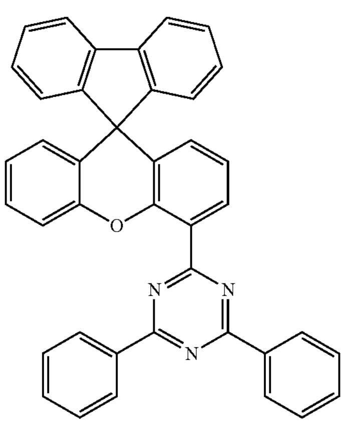
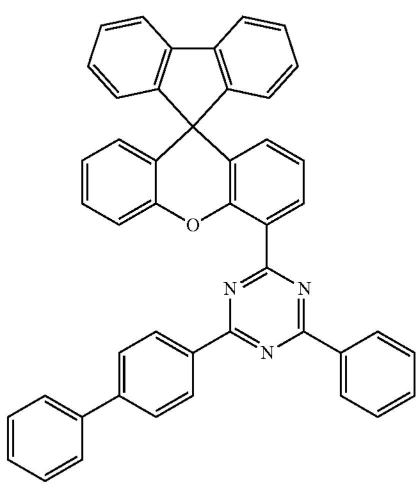

-continued
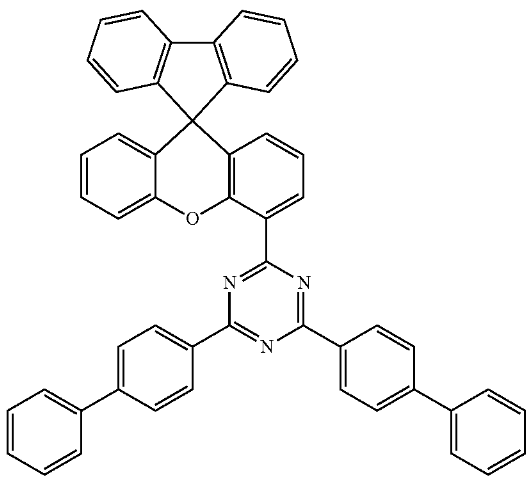
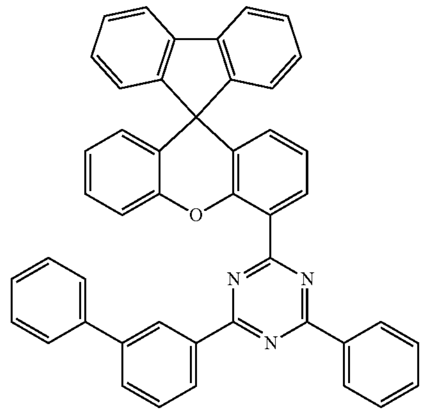
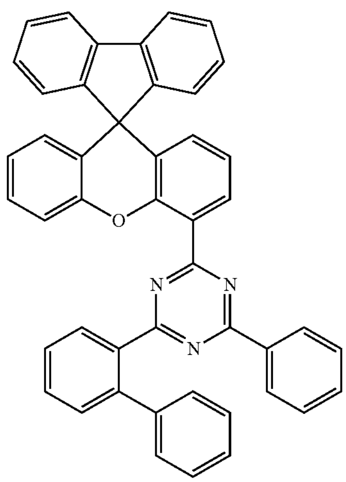
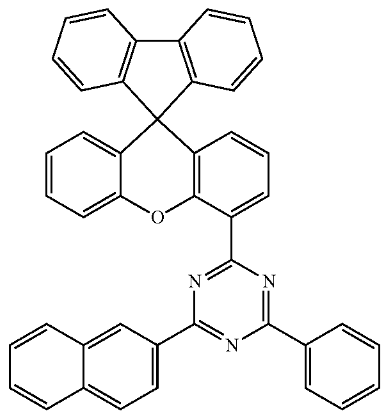
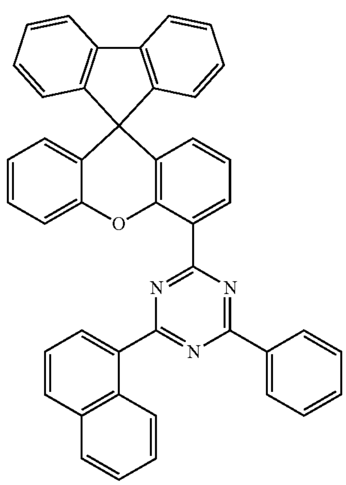
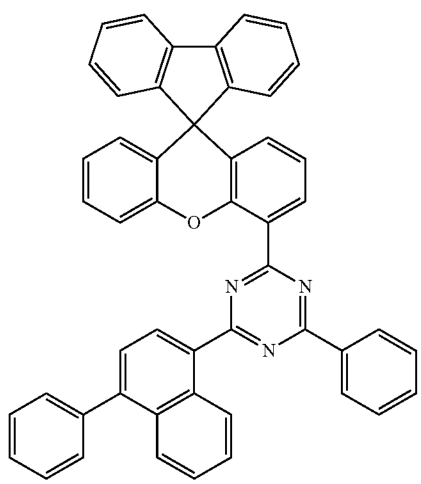

-continued
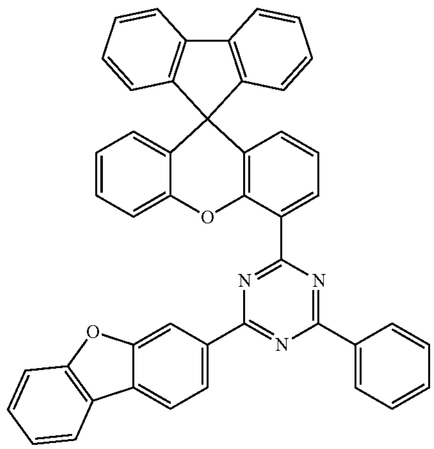
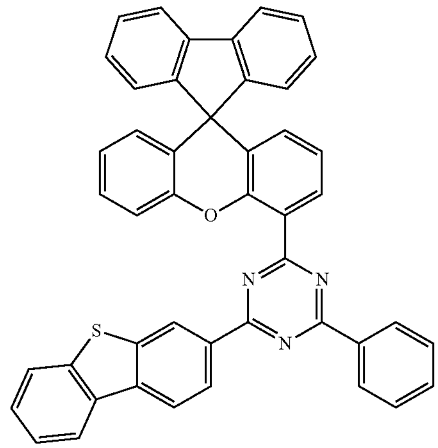
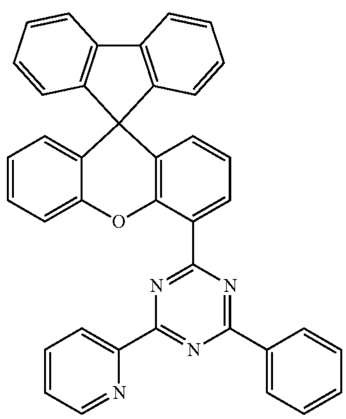
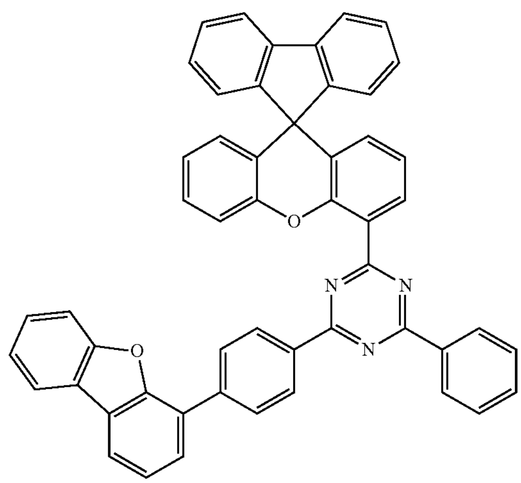
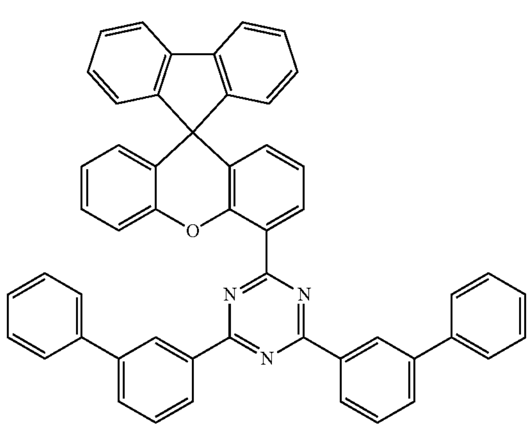
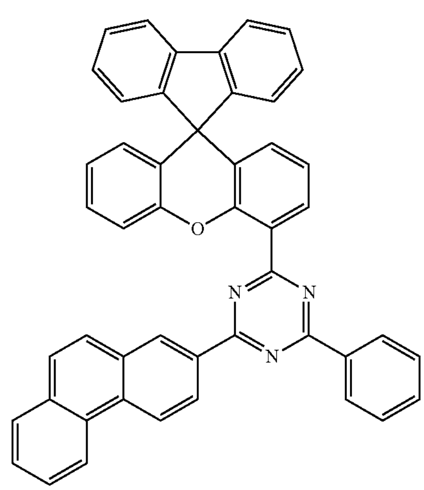

-continued
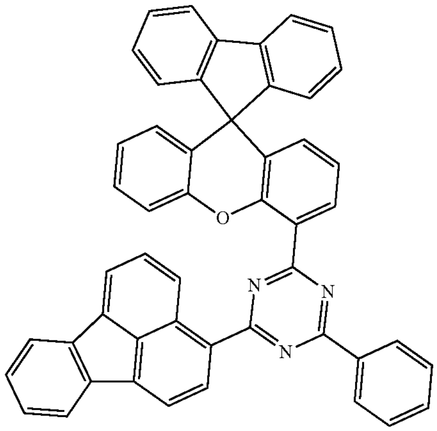
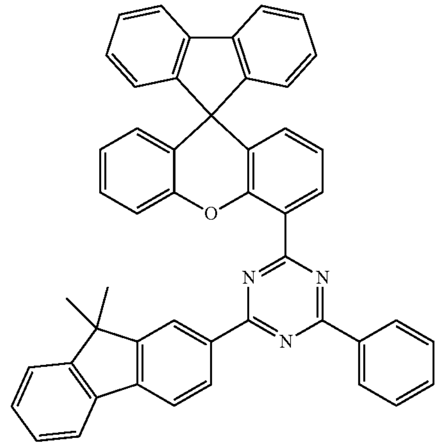
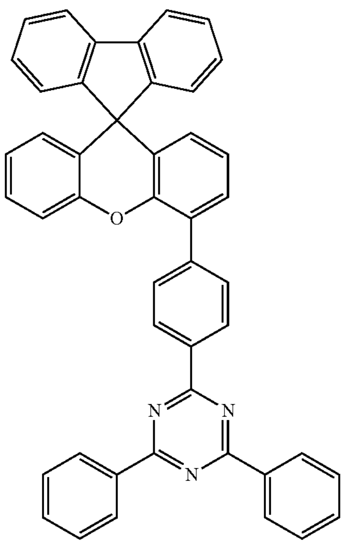
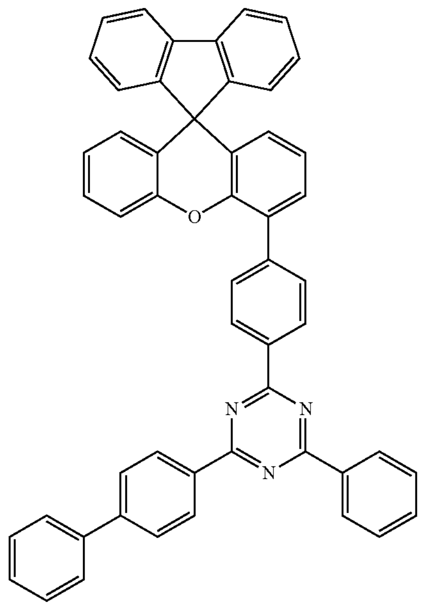
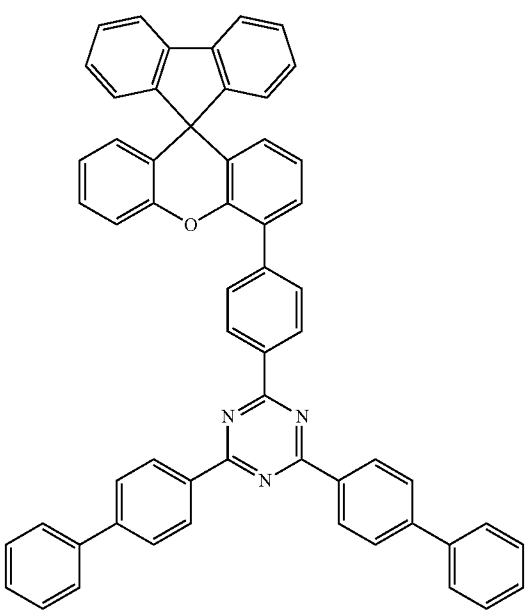
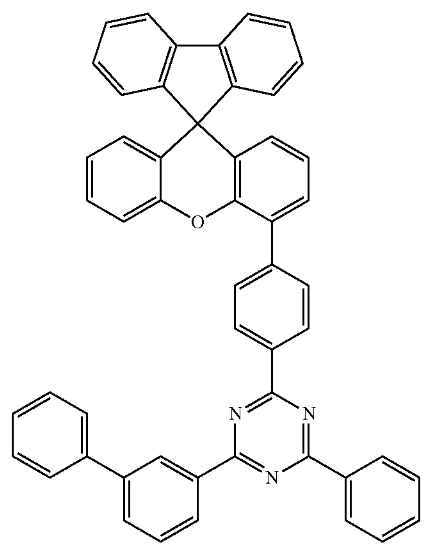

-continued
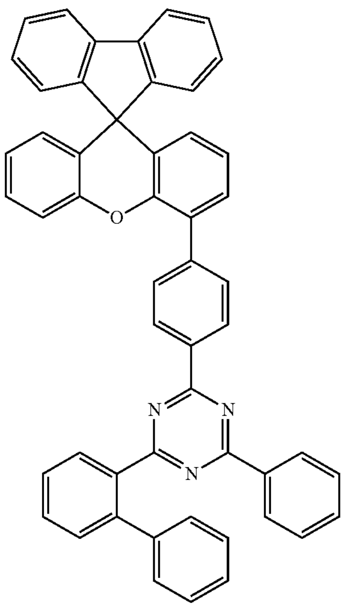
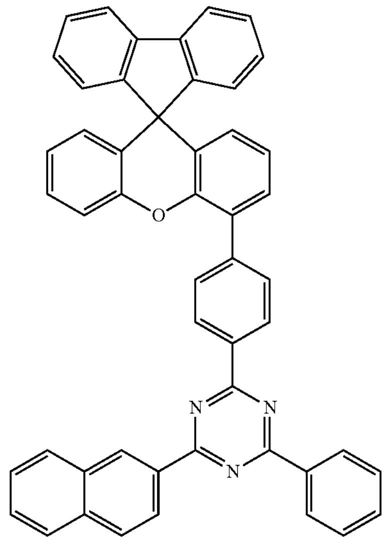
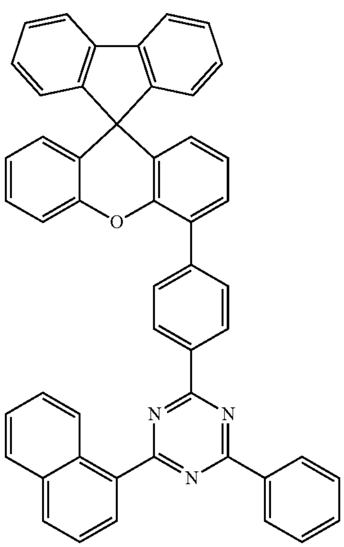
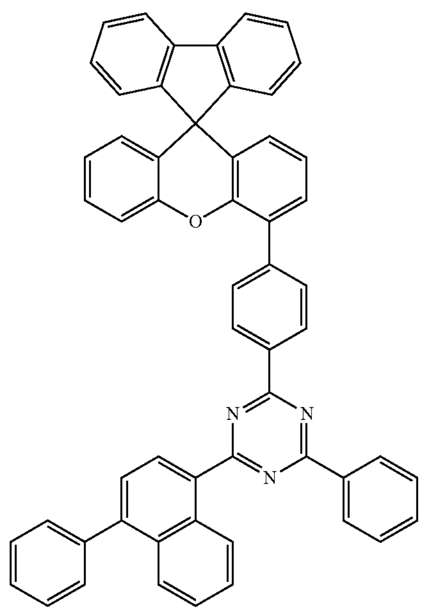
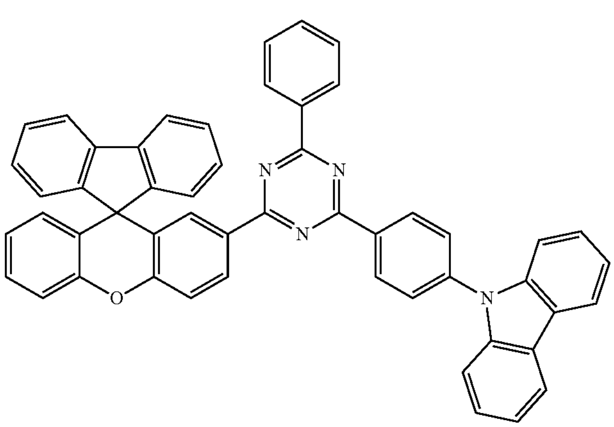

-continued
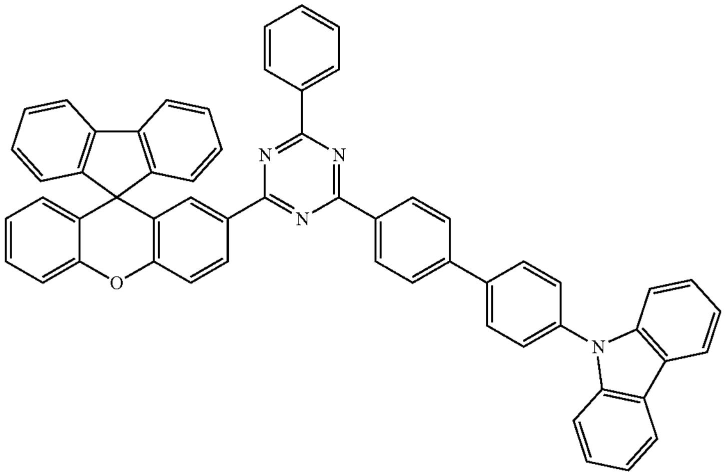
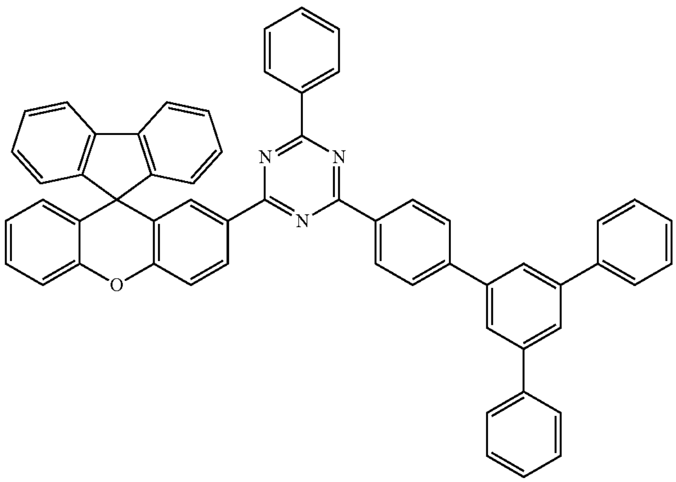
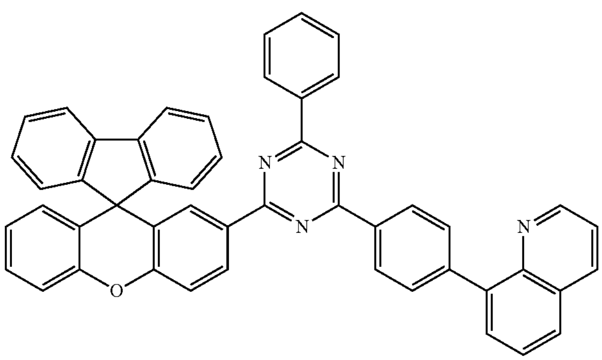
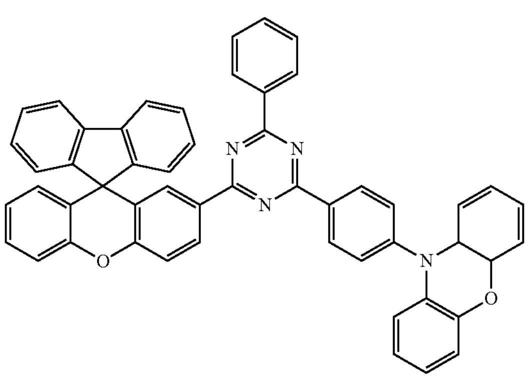
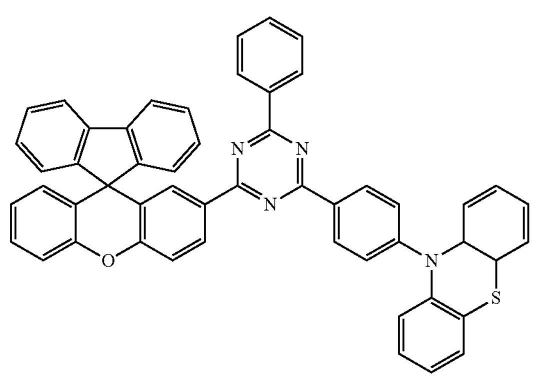

-continued
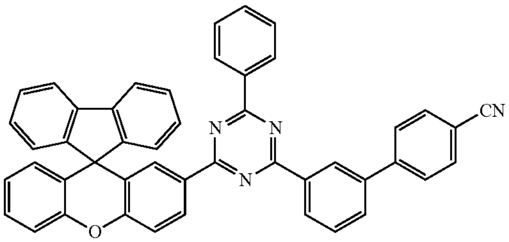
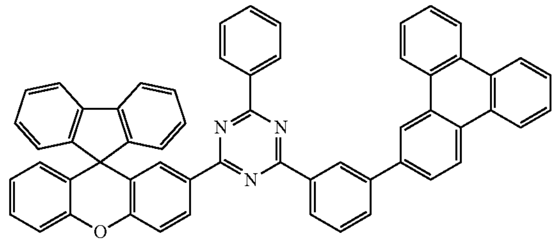
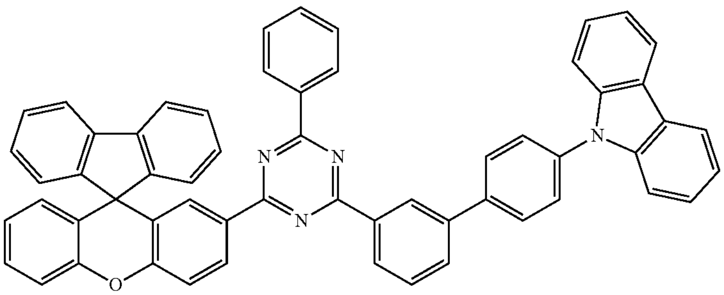
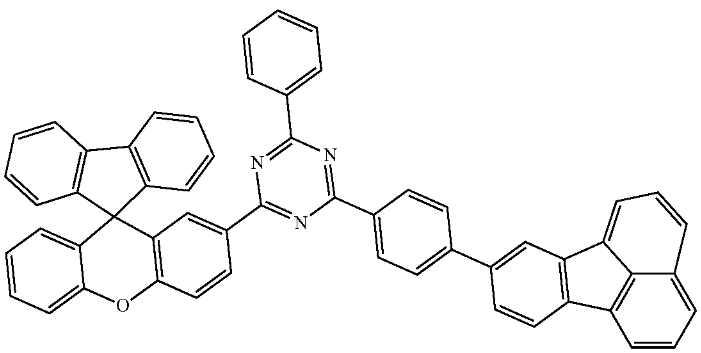
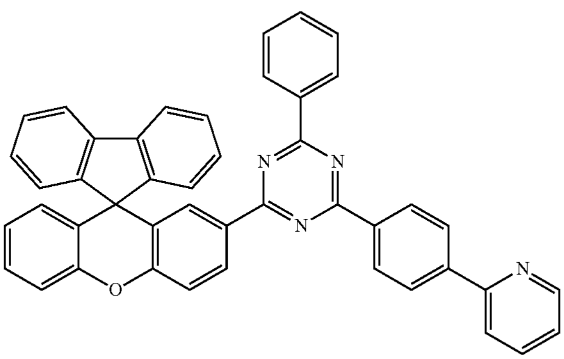
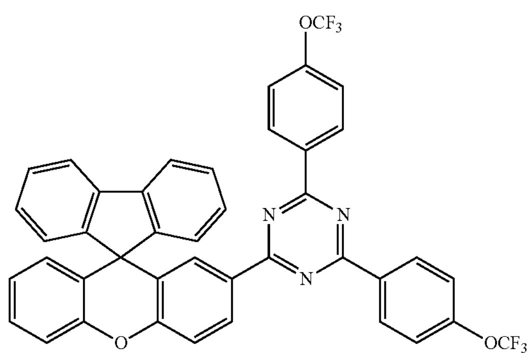
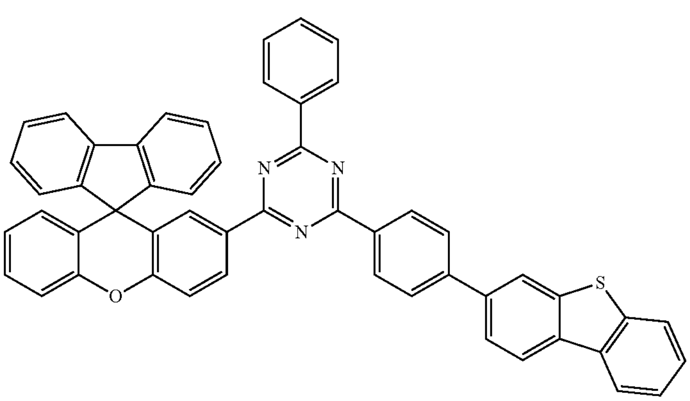

-continued
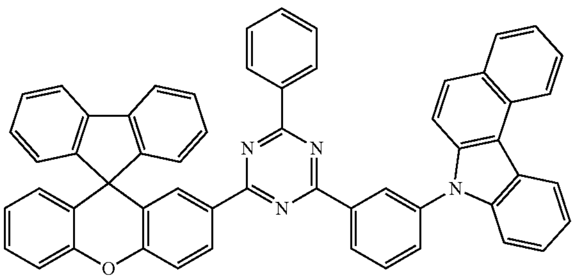
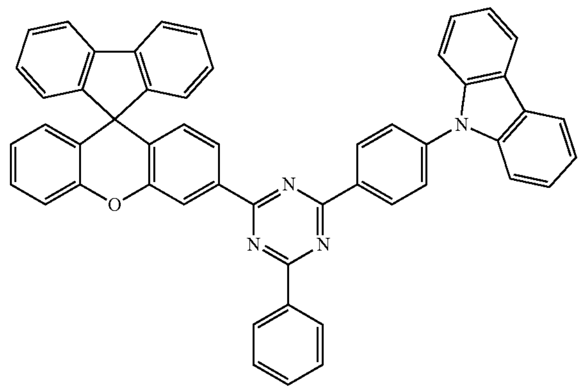
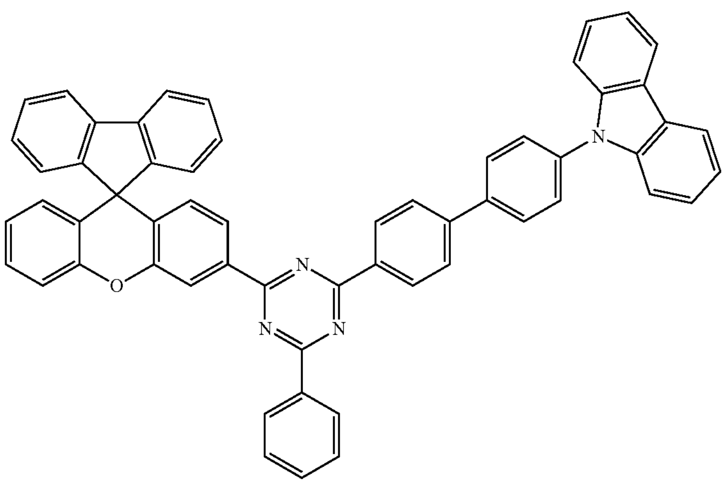
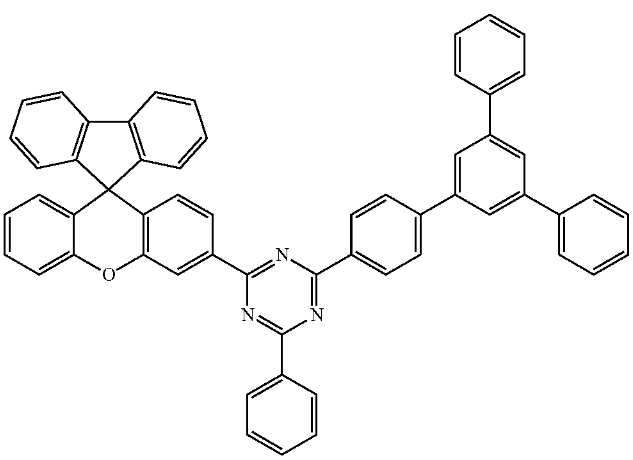
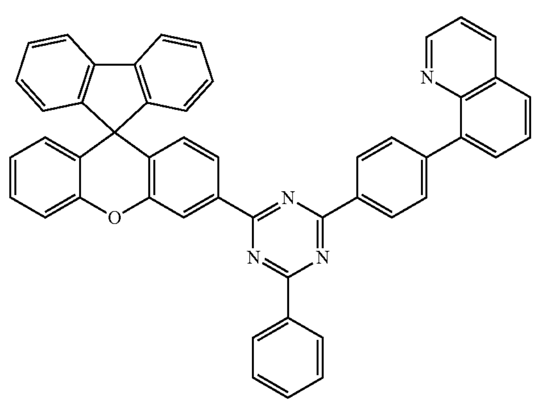

-continued
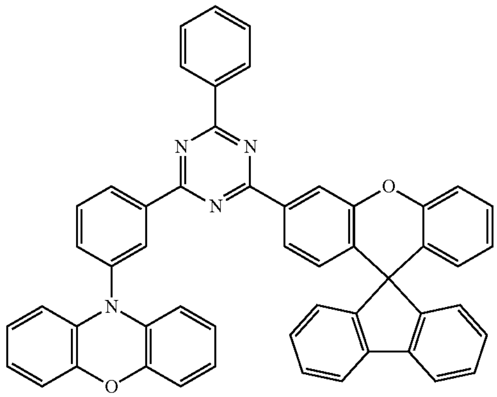
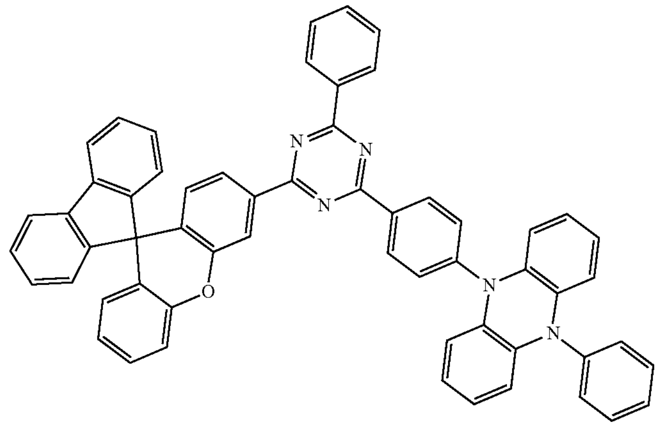
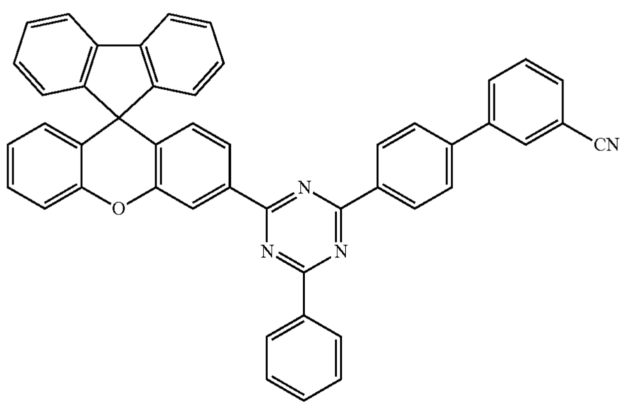
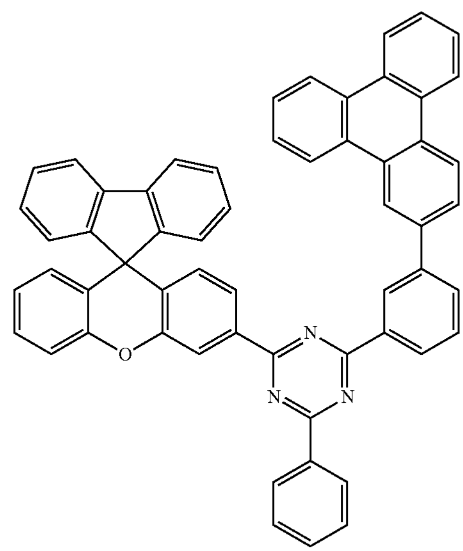
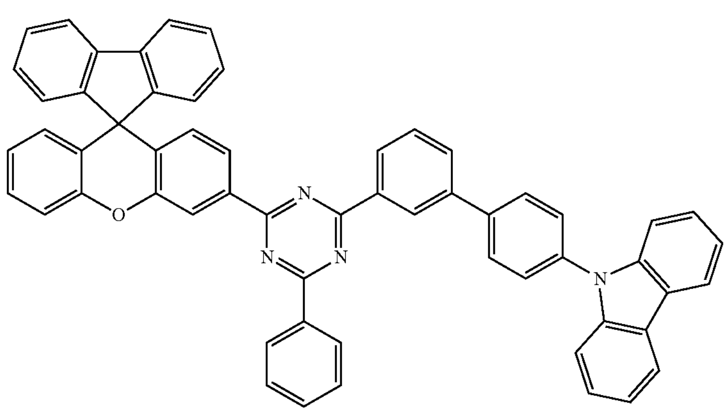

-continued
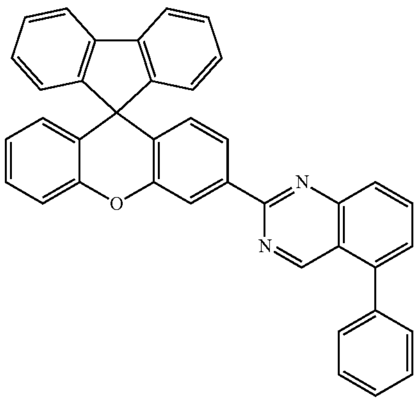
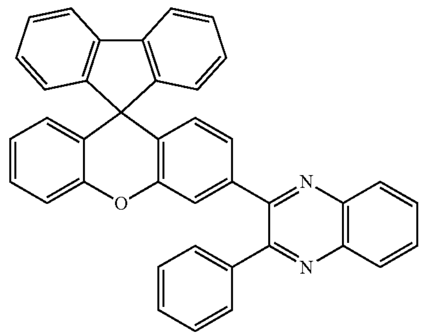
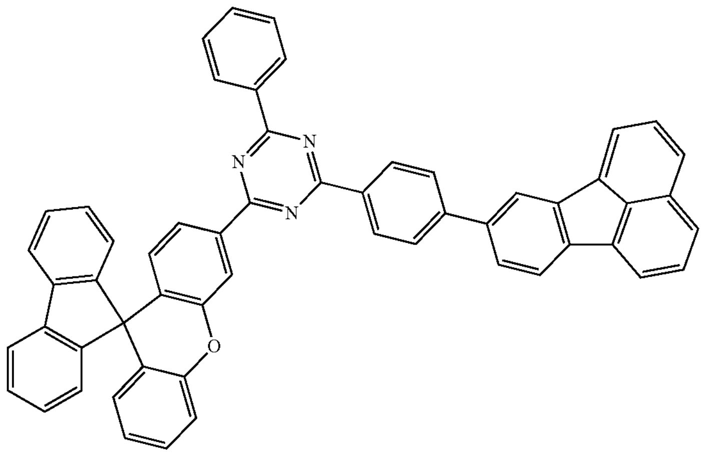
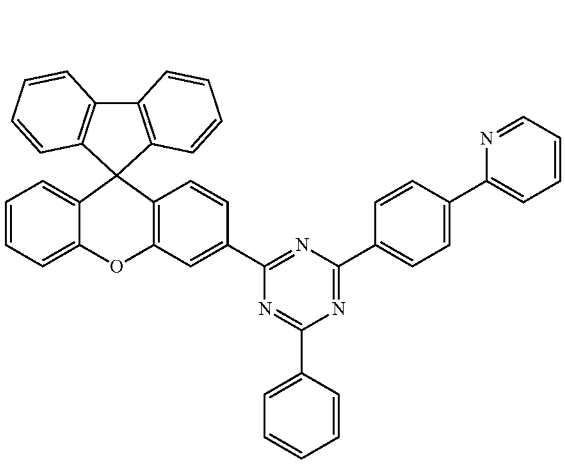
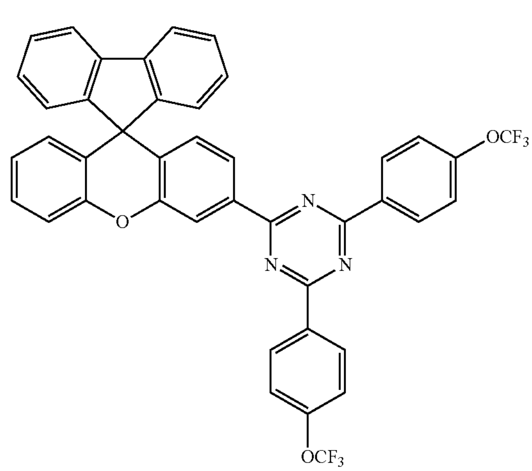

-continued
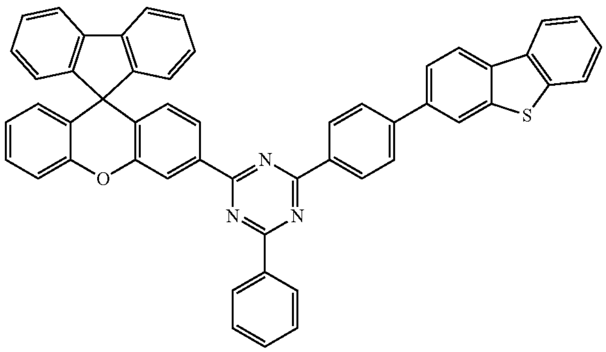
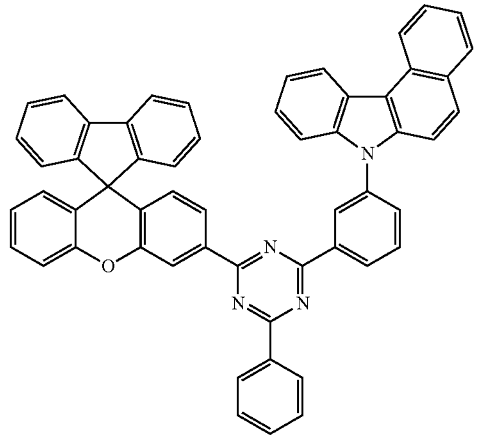
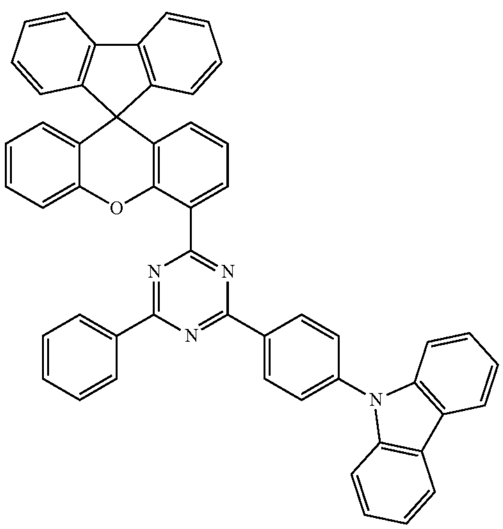
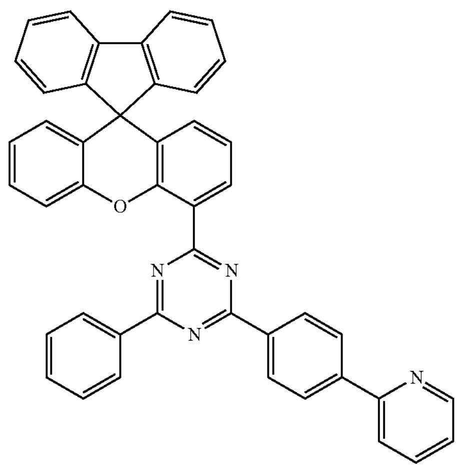
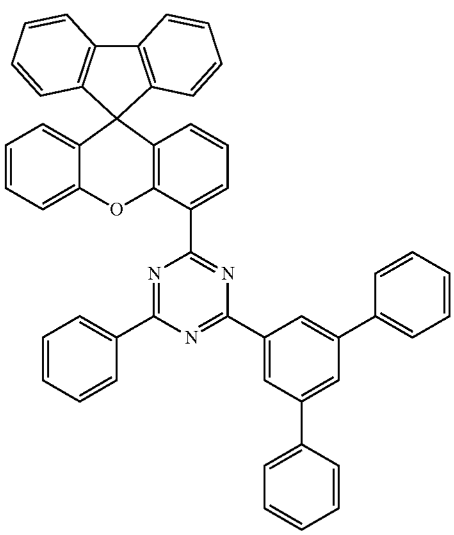
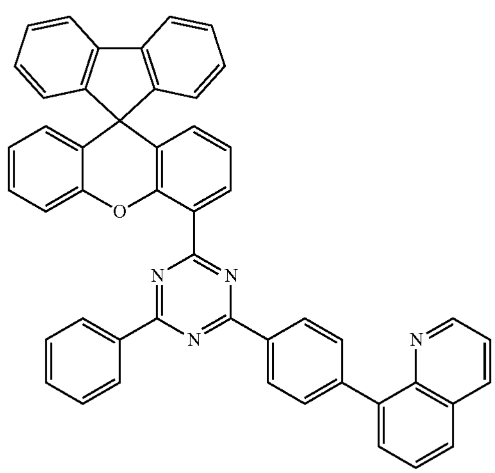

-continued
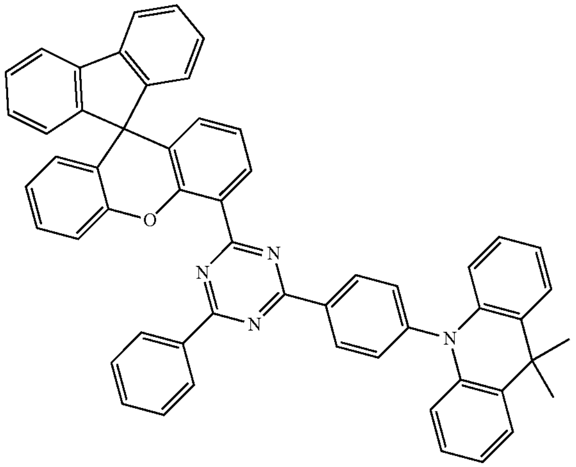
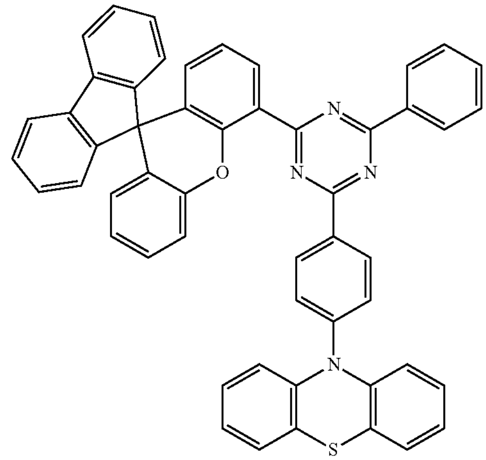
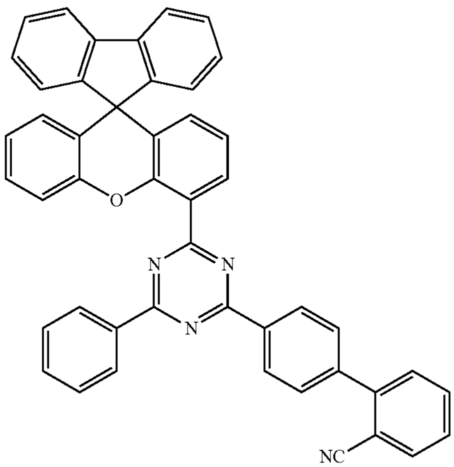
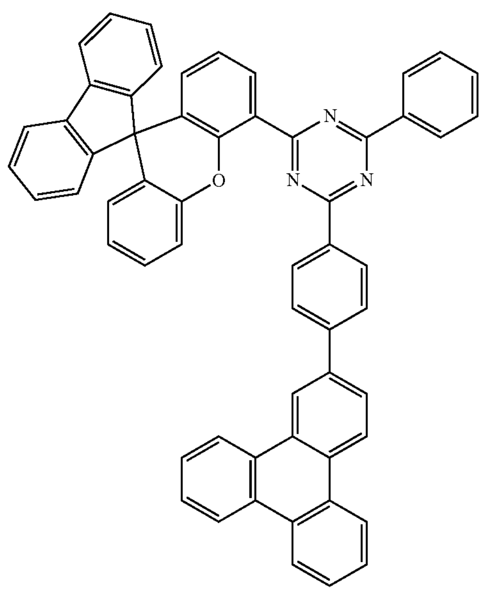
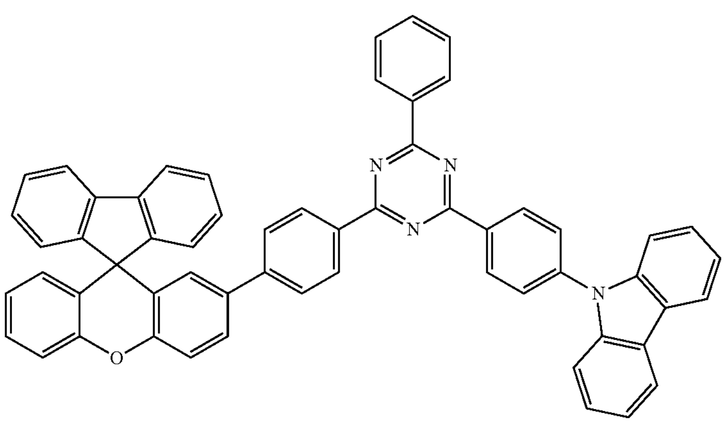

-continued
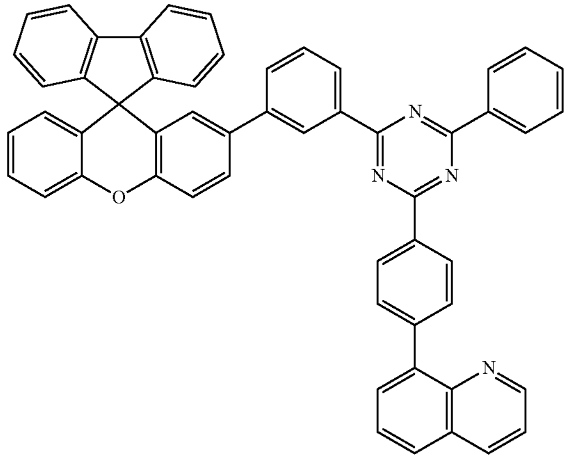
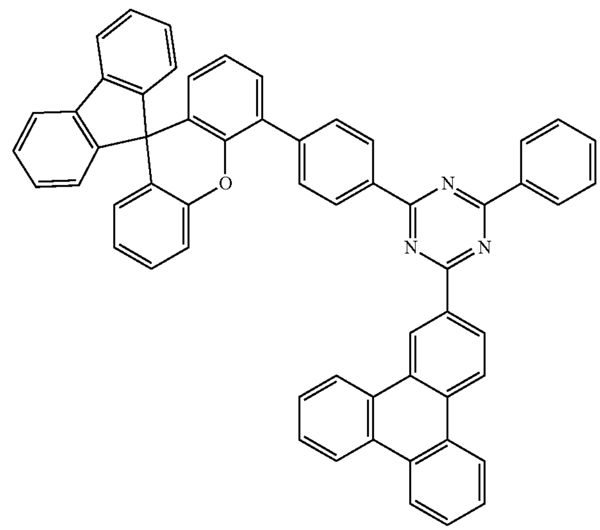
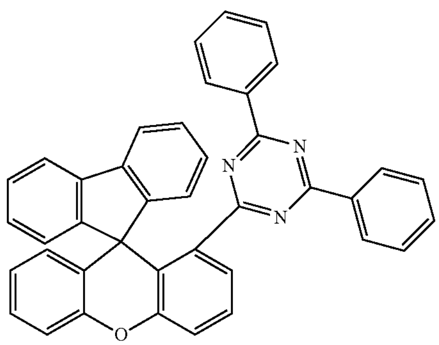
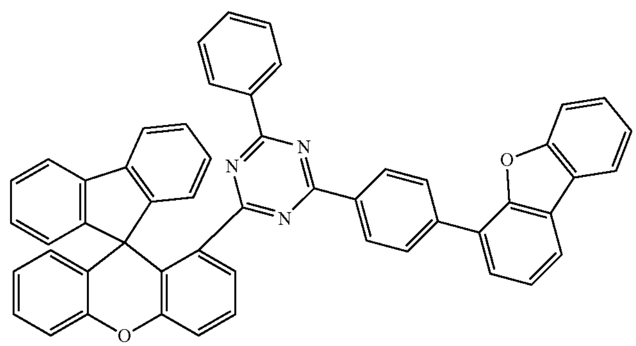
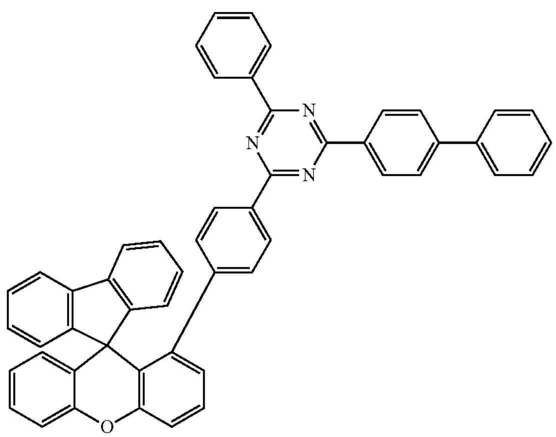
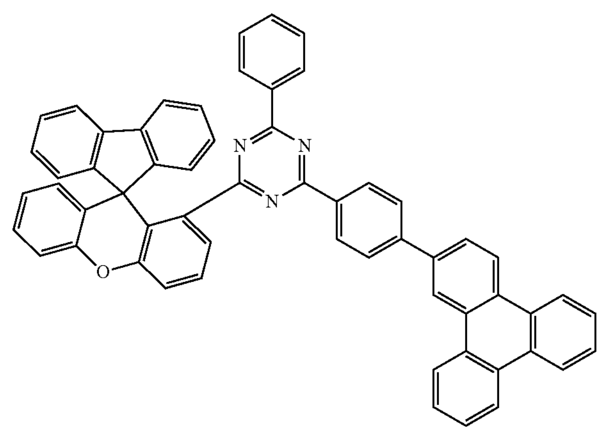
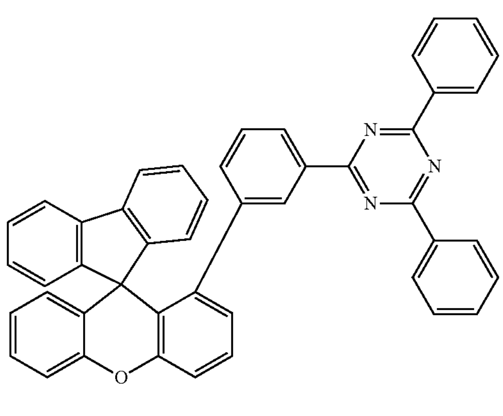
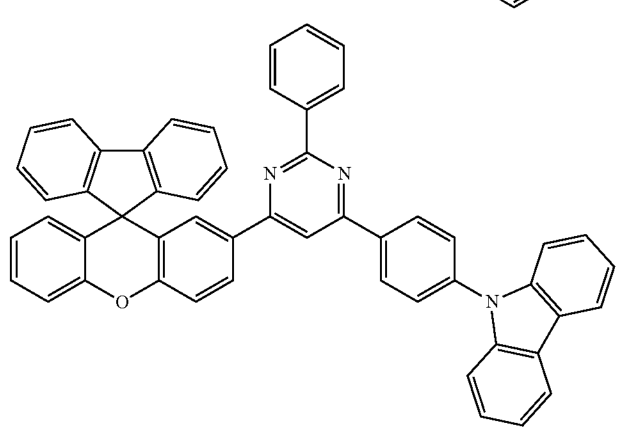

-continued
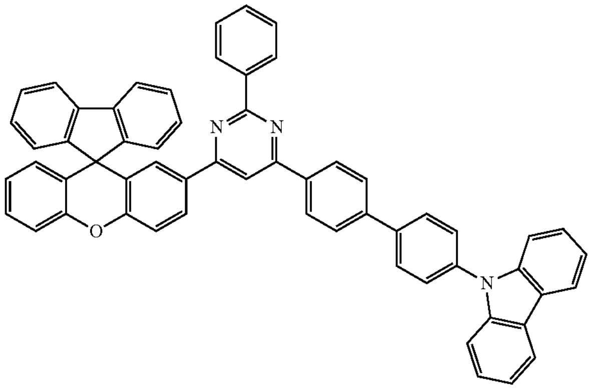
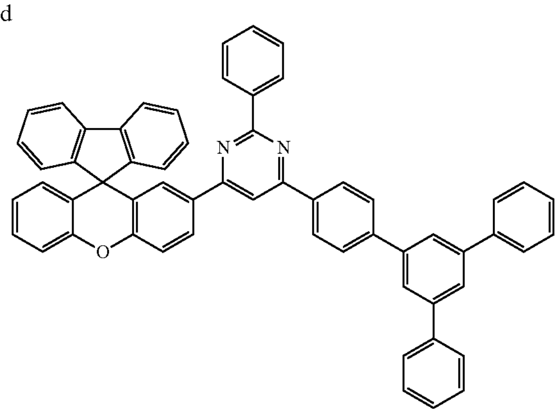
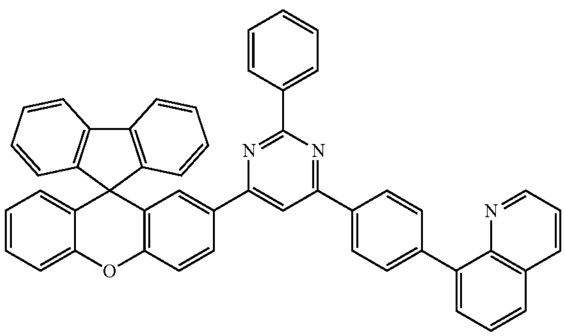
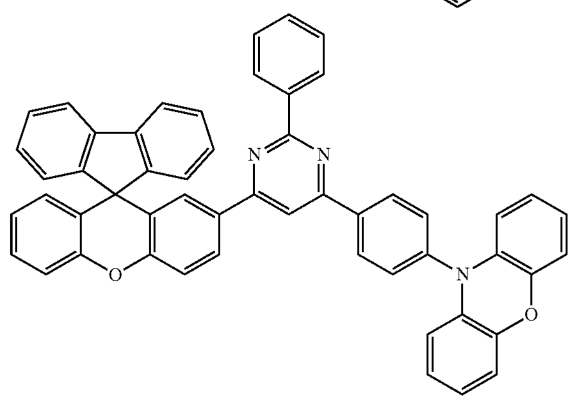
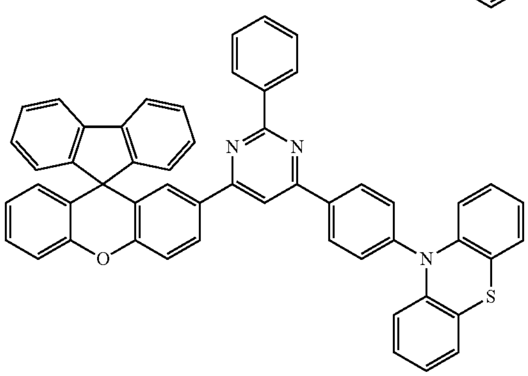
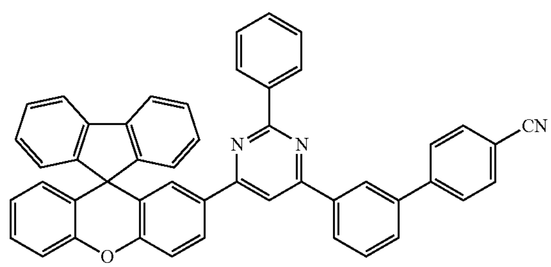
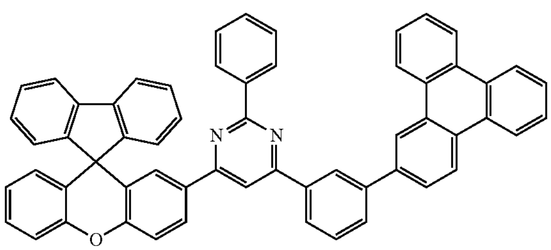
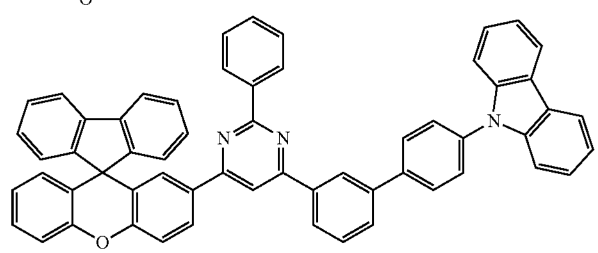
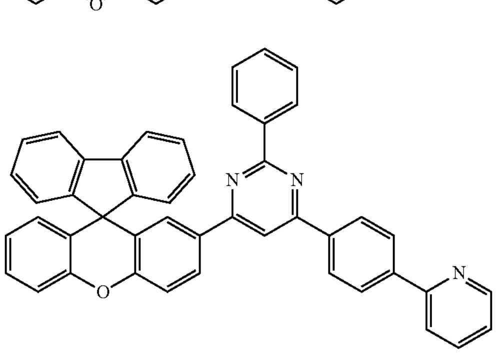
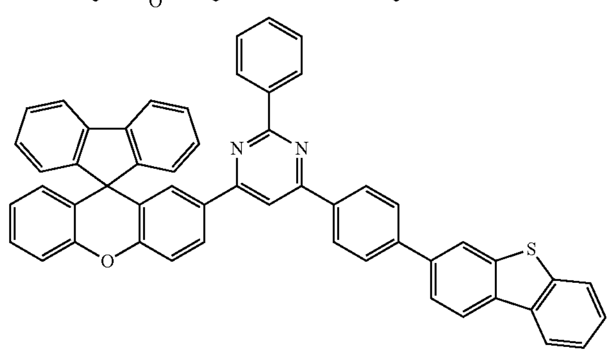

-continued
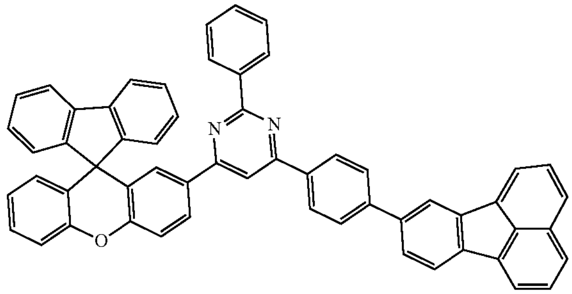
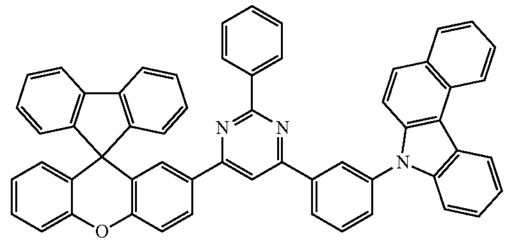
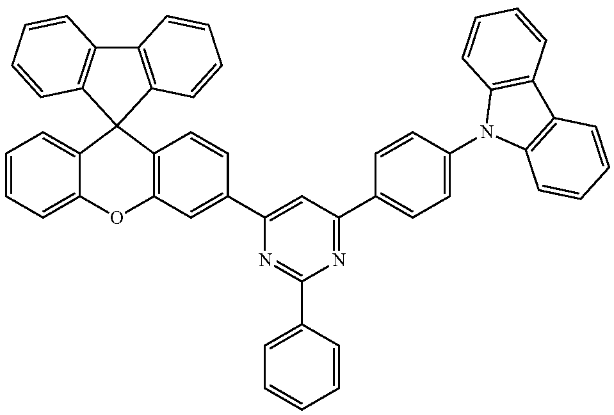
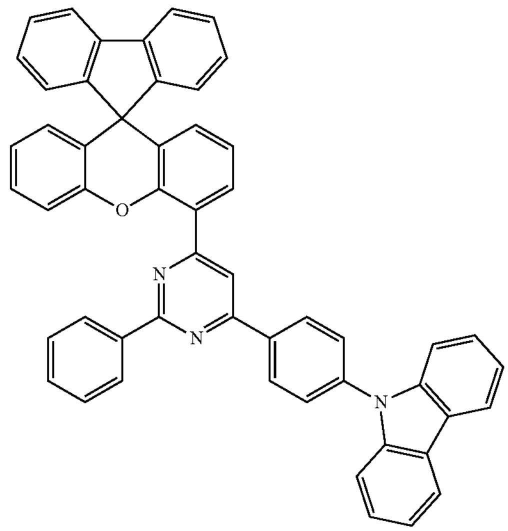
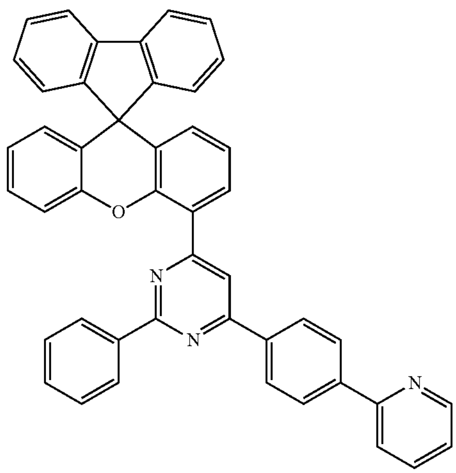
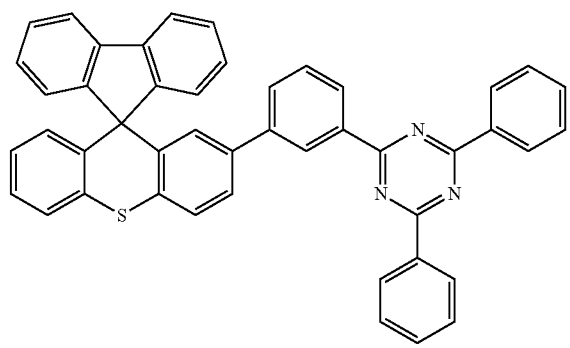
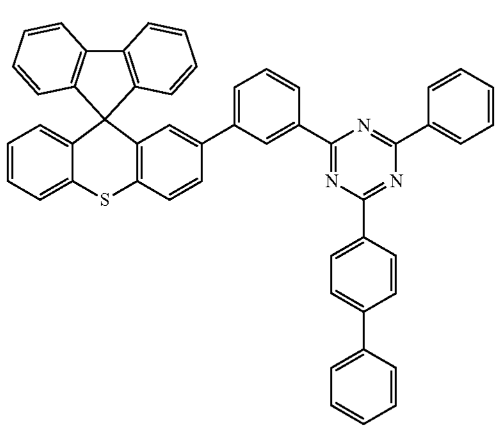
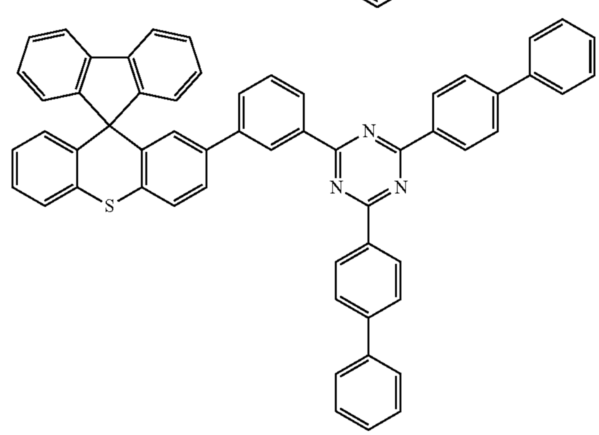

-continued
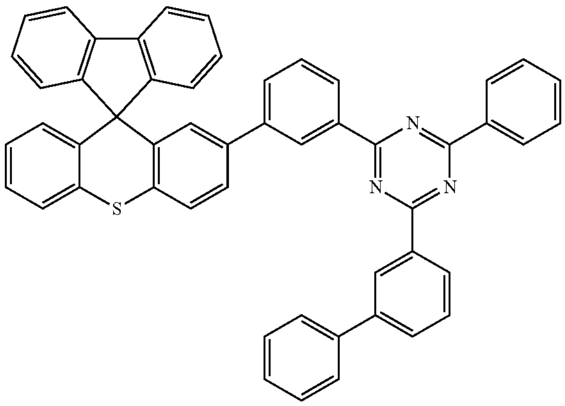
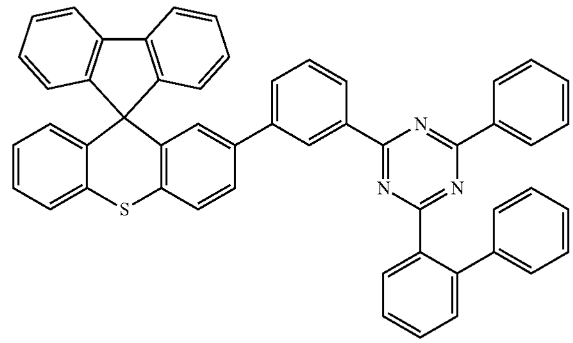
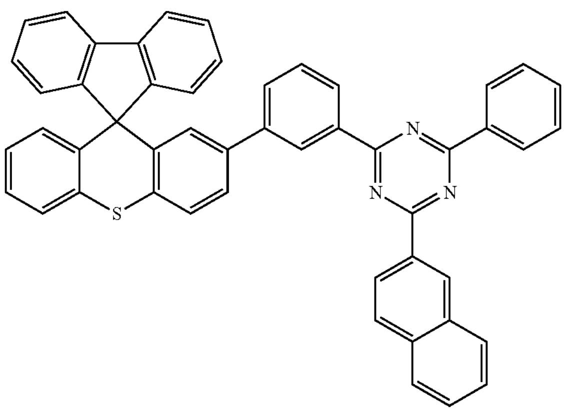
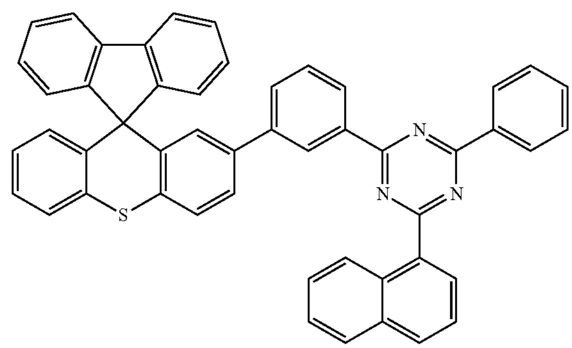
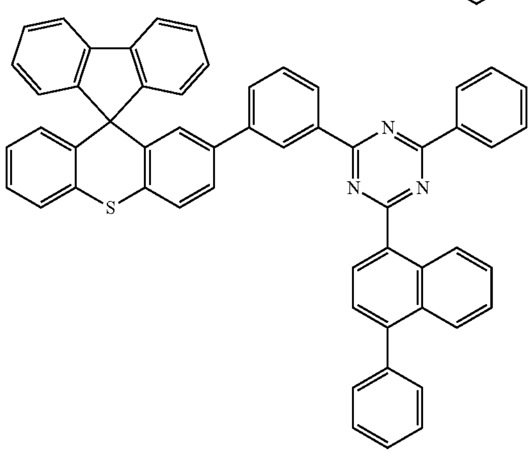
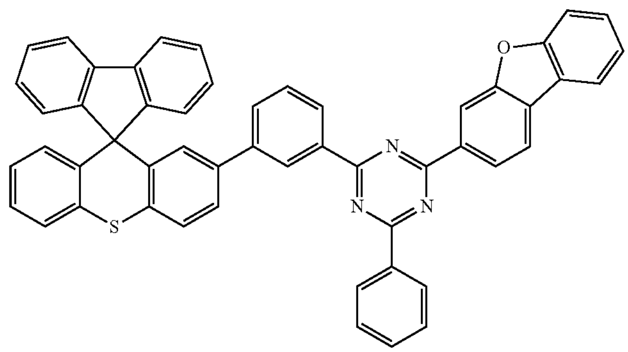
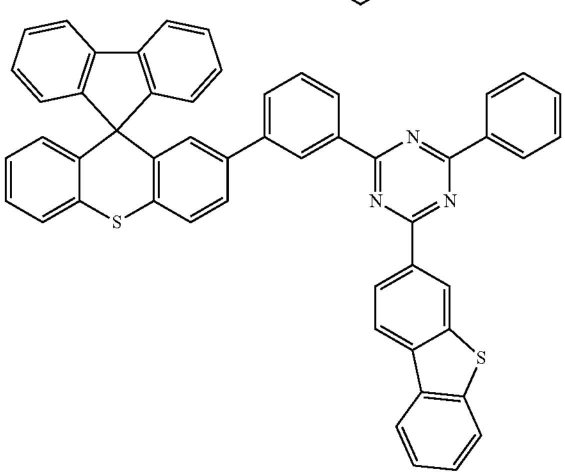
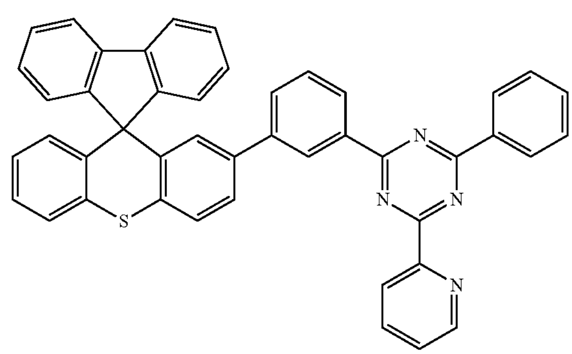

-continued
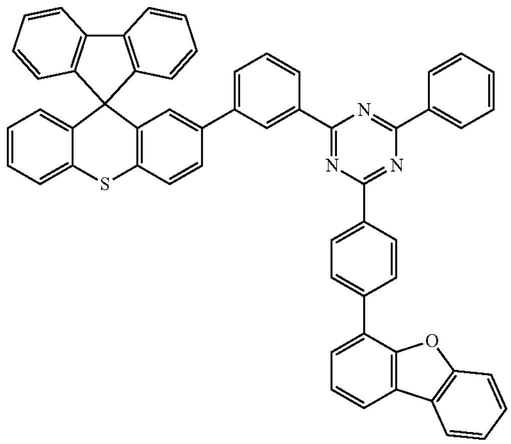
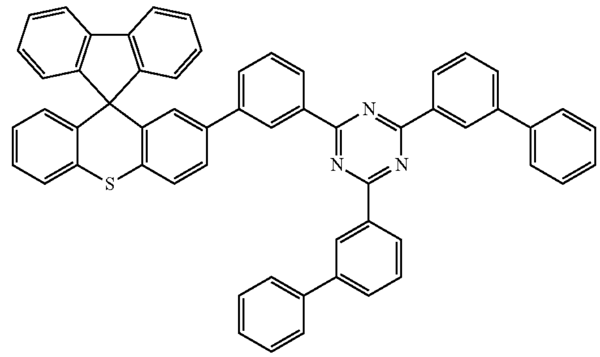
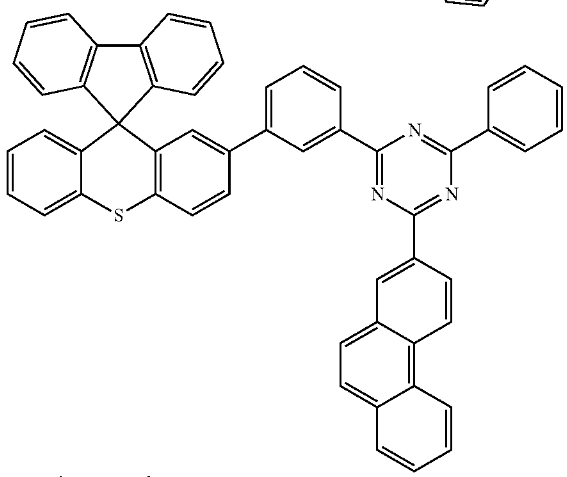
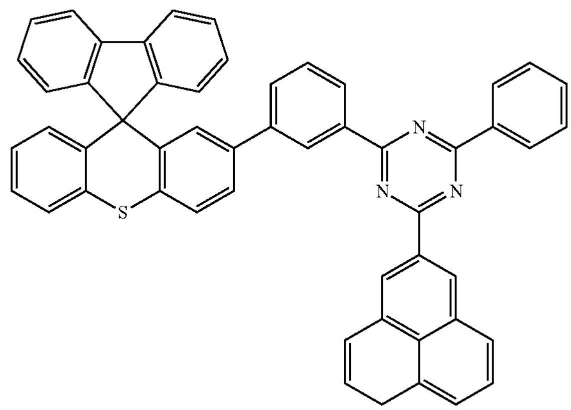
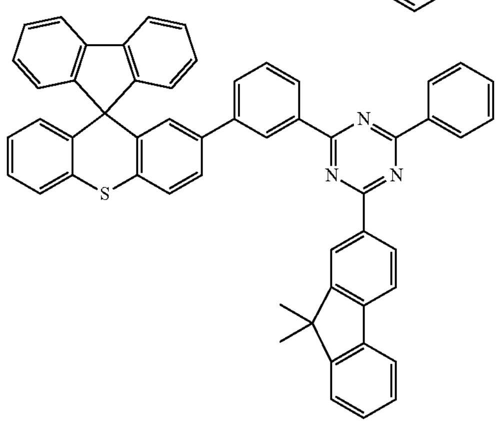
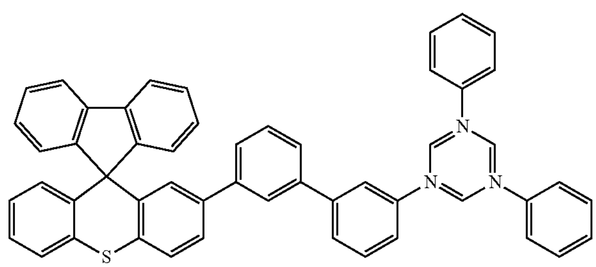
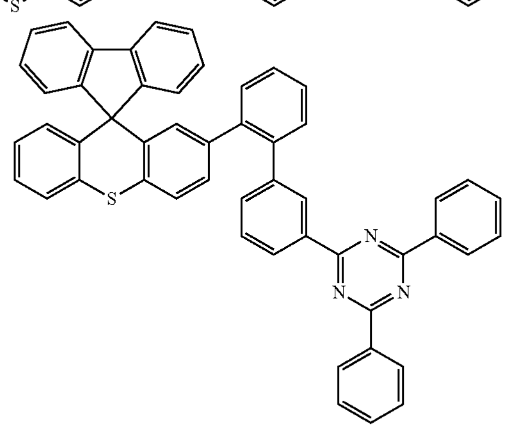
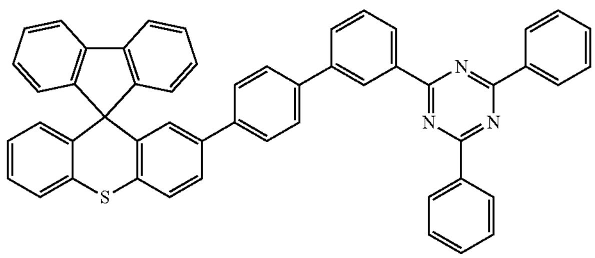

-continued
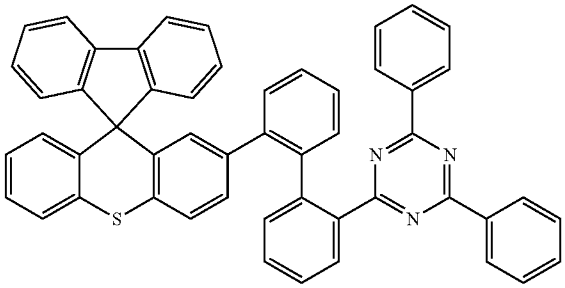
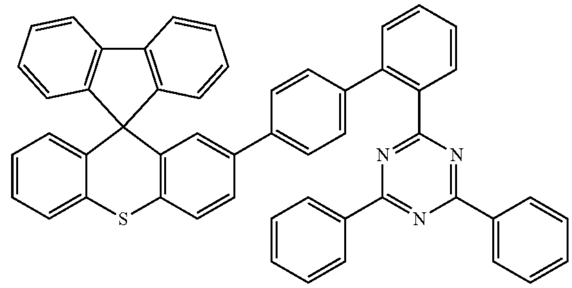
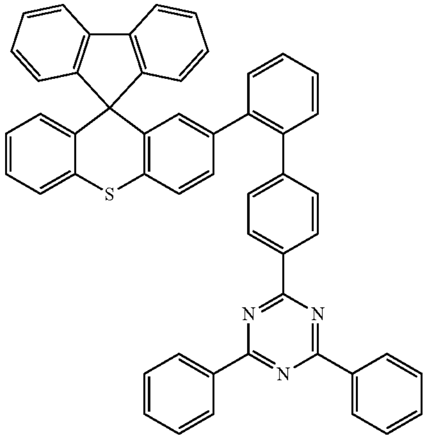
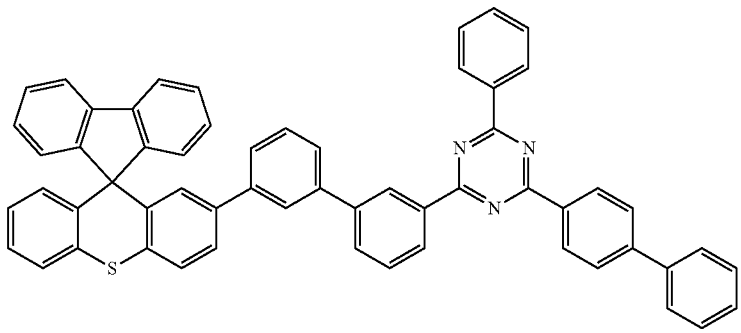
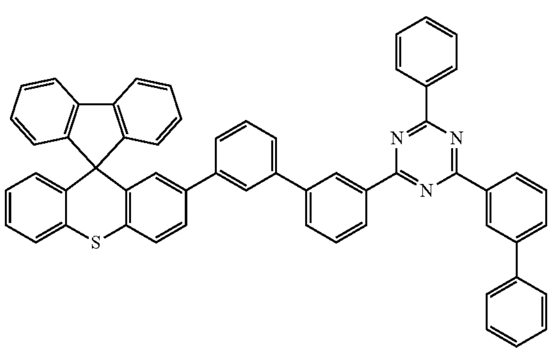
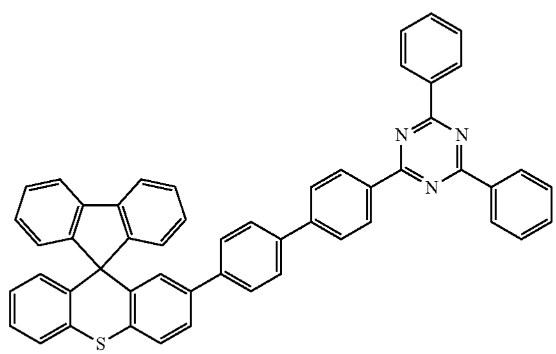
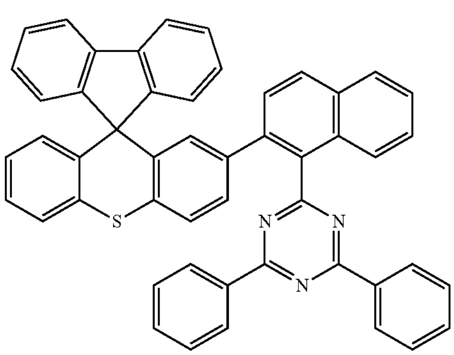
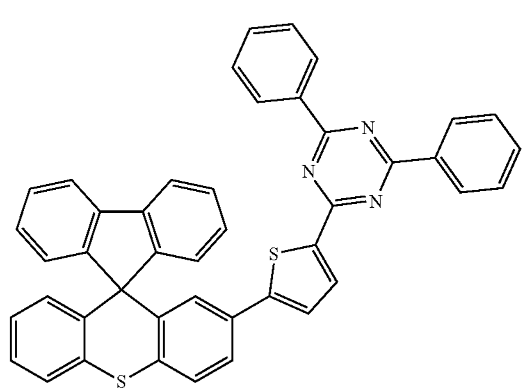

-continued
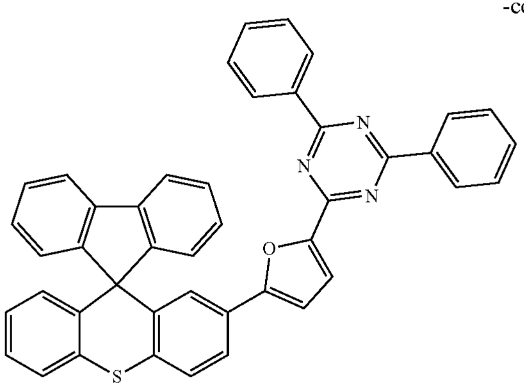
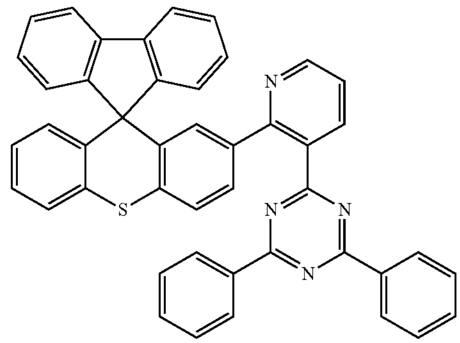
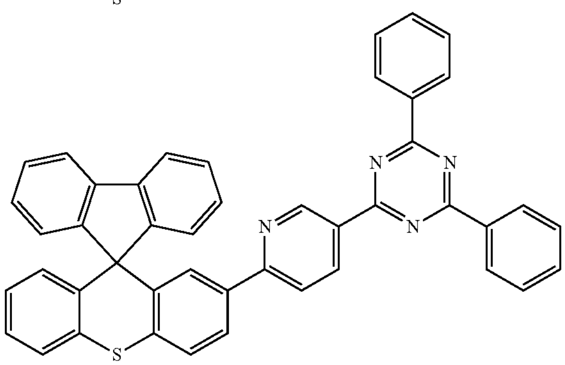
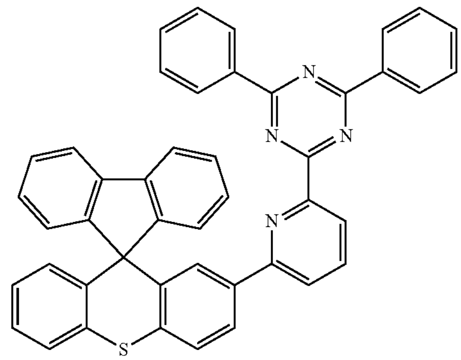
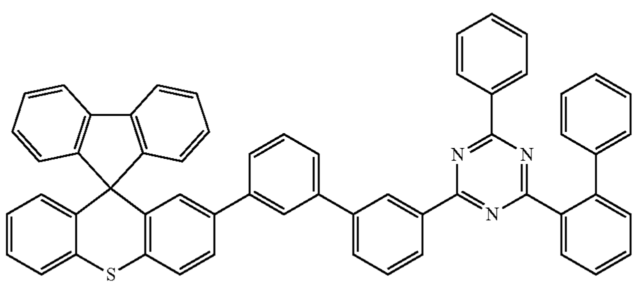
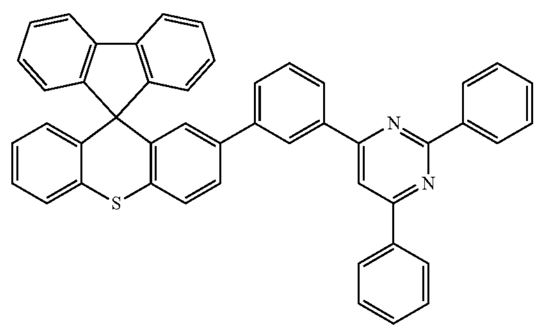
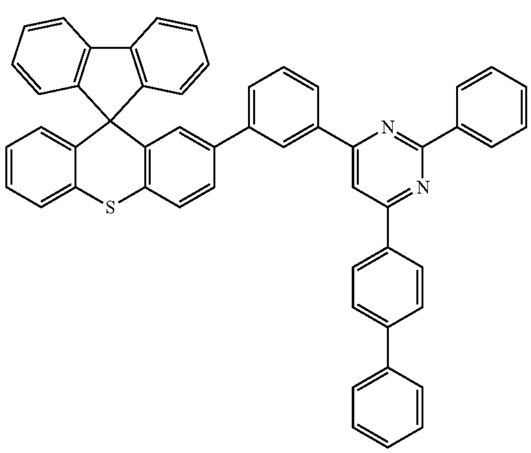
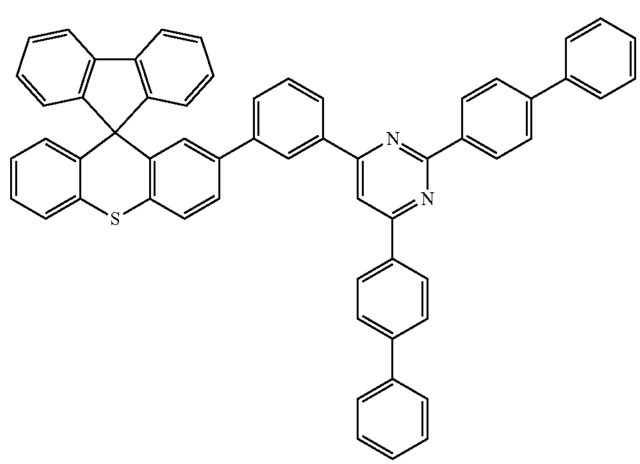

-continued
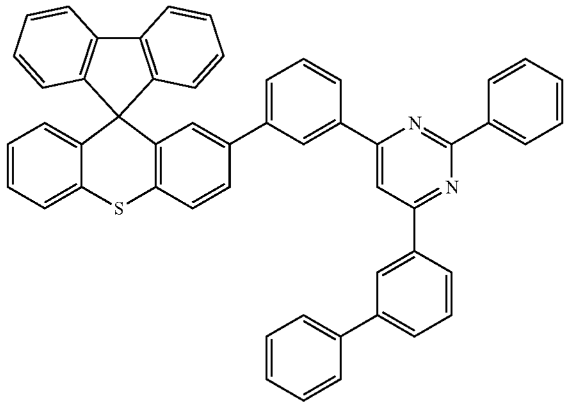
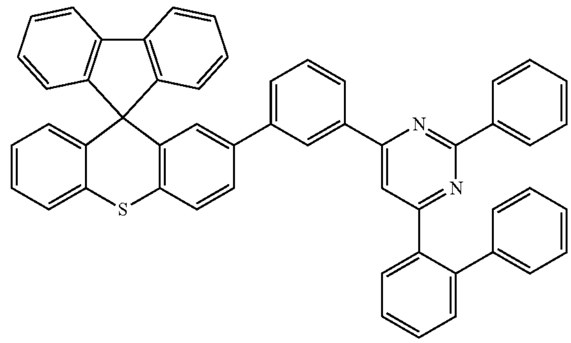
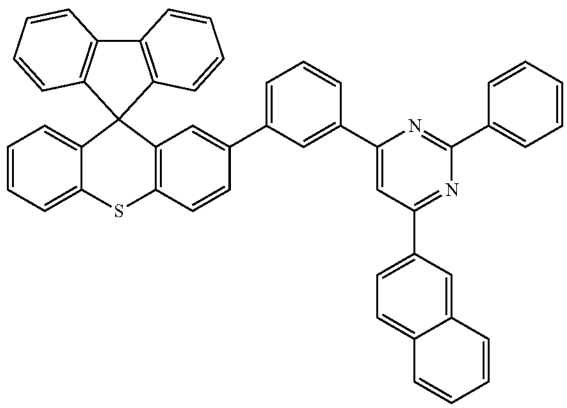
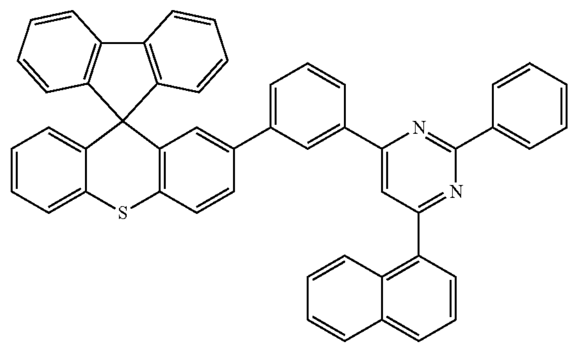
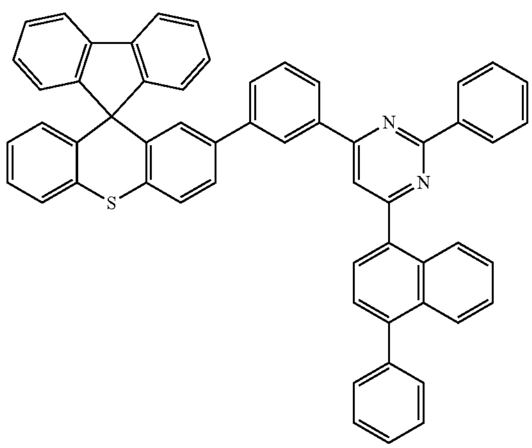
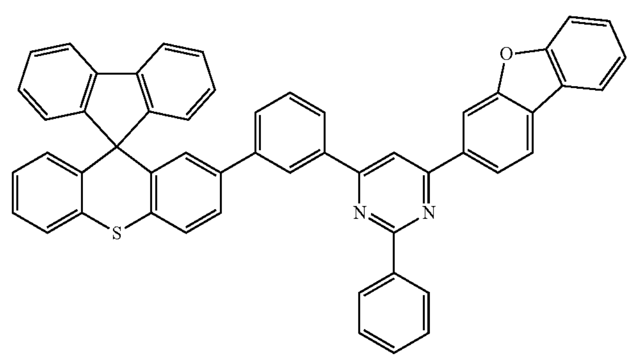
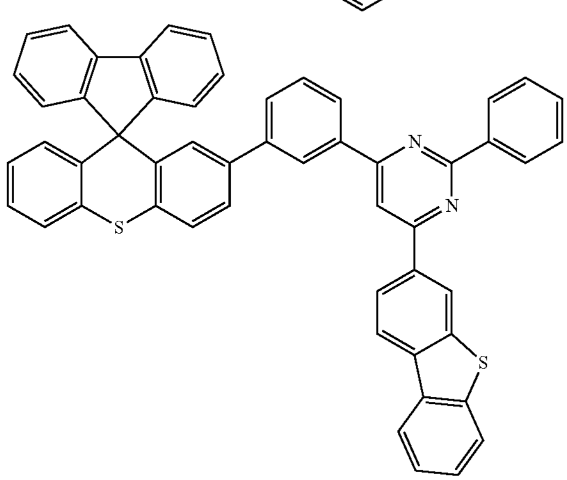
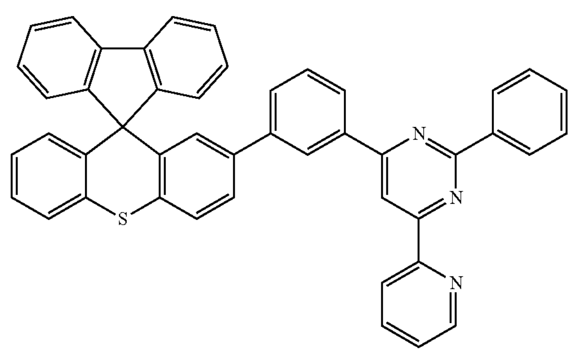

-continued
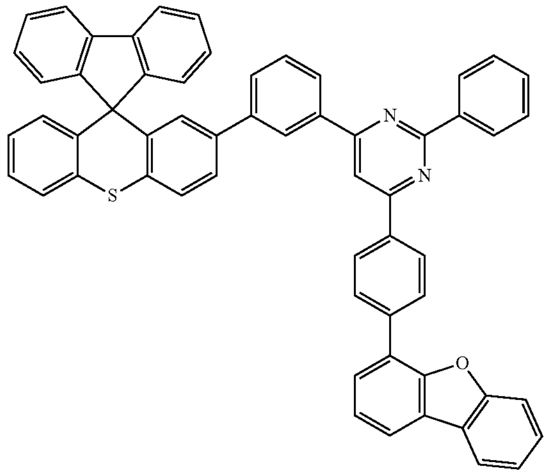
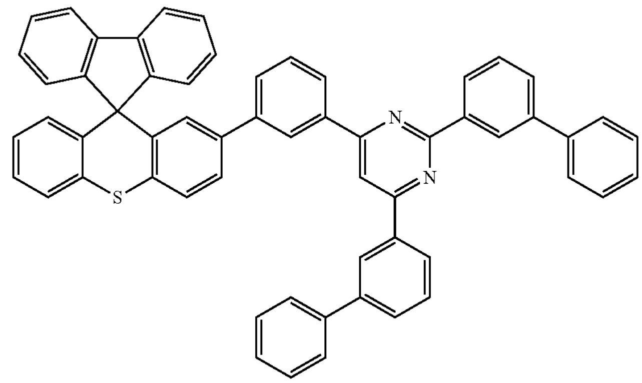
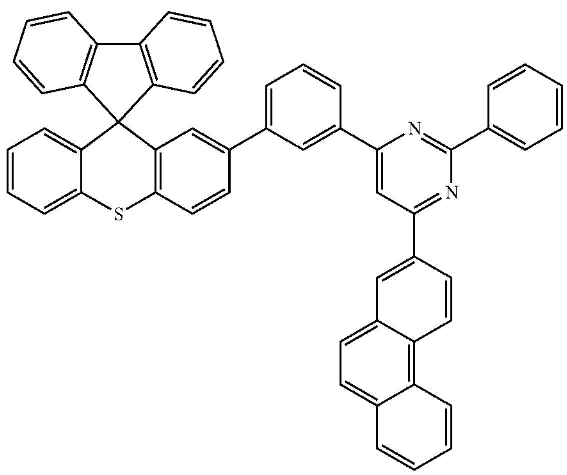
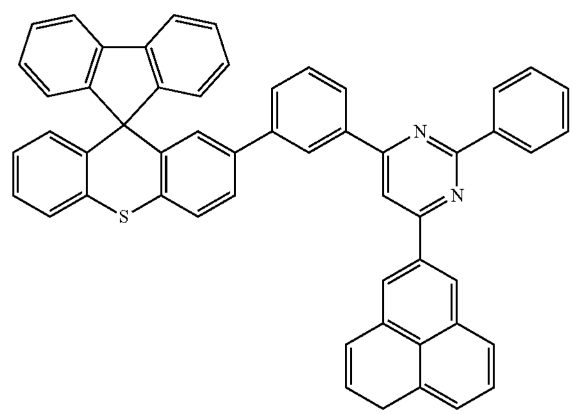
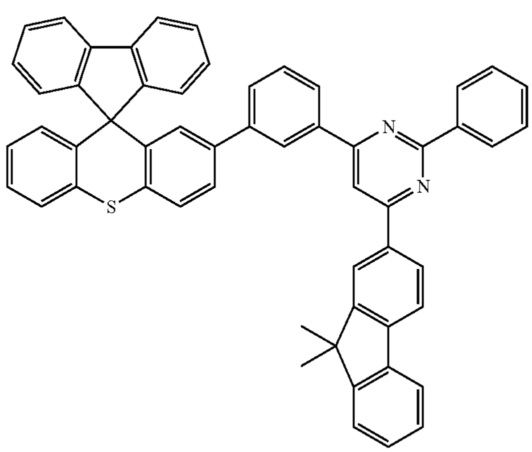
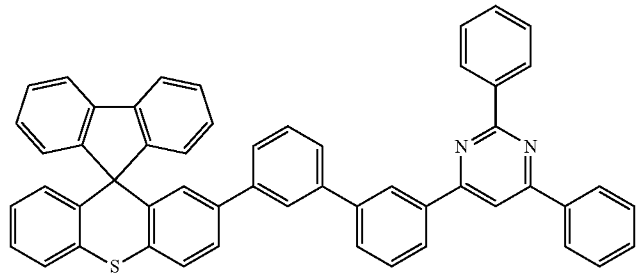

-continued
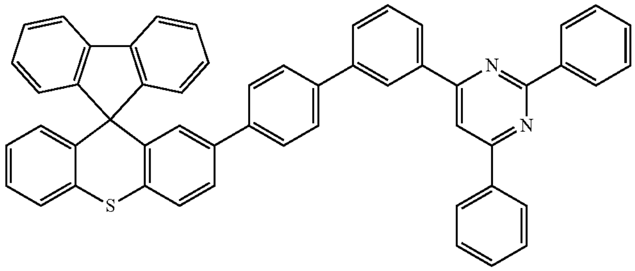
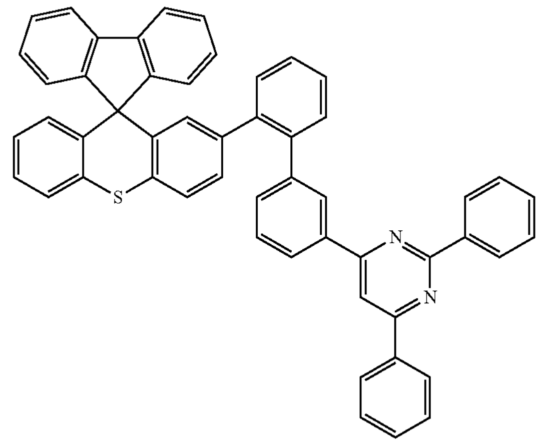
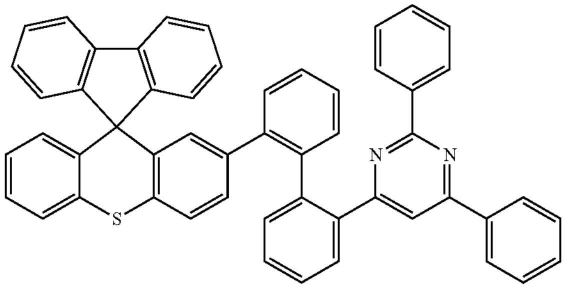
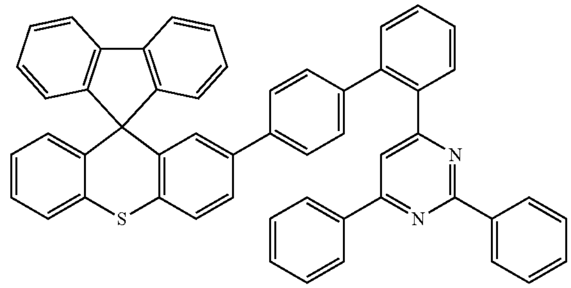
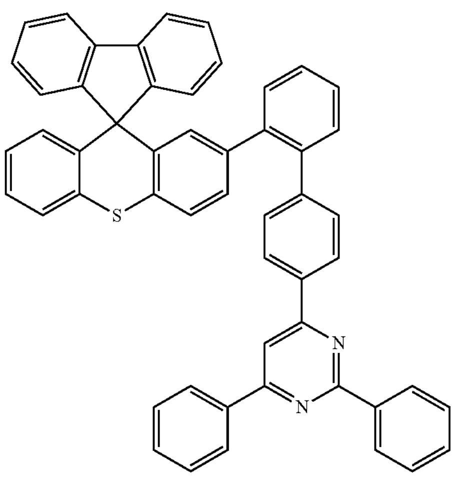
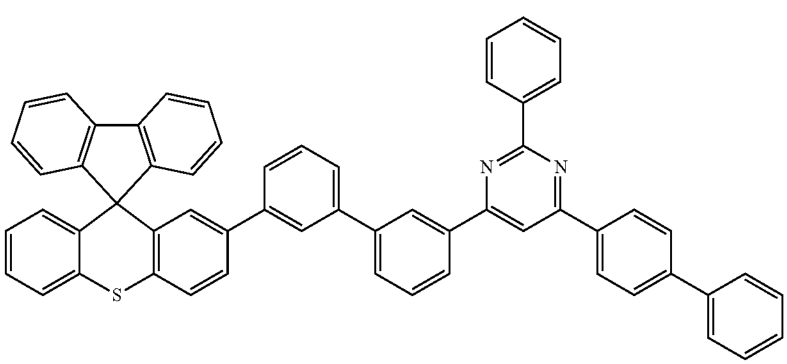

-continued
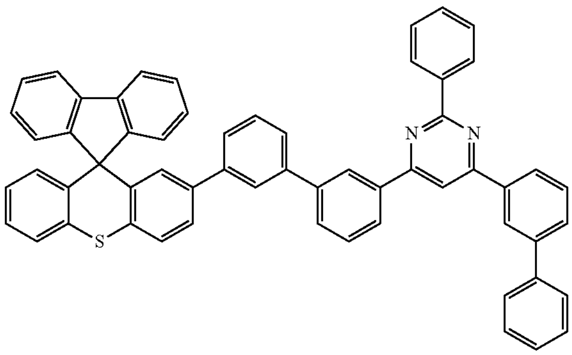
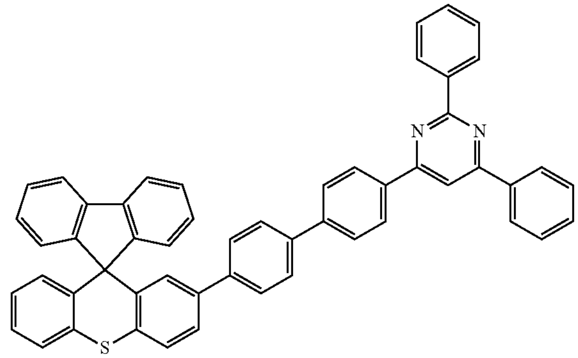
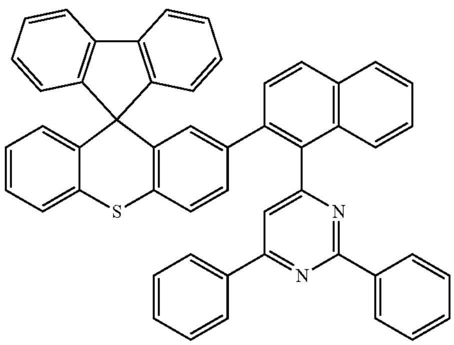
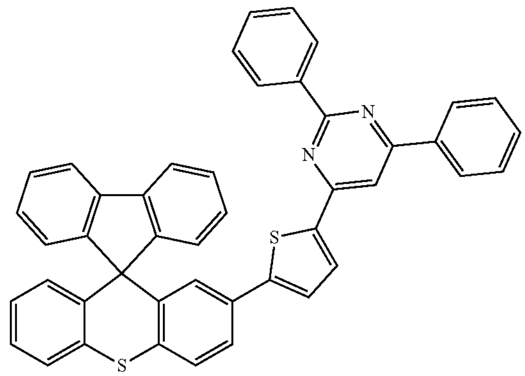
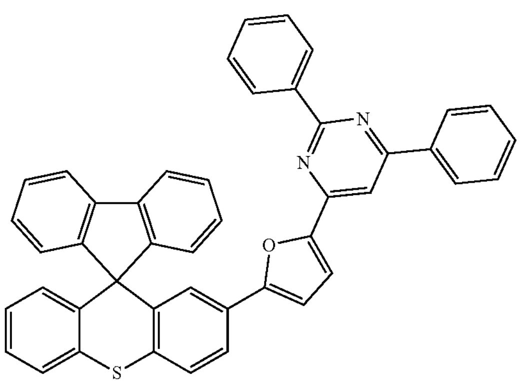
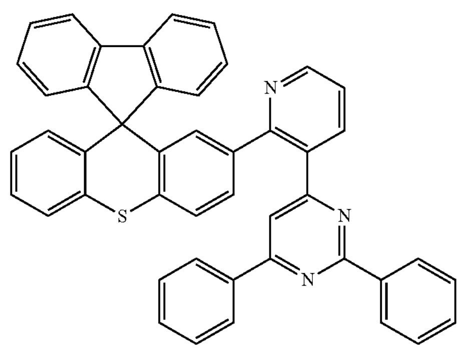
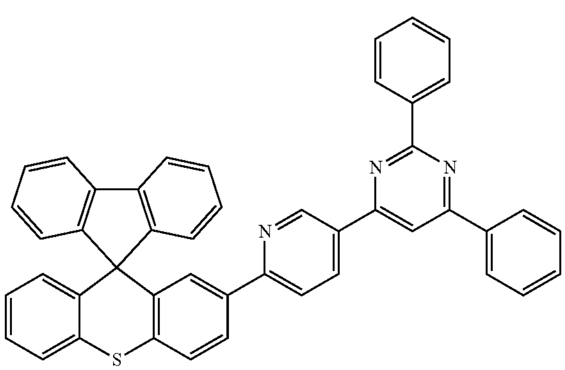
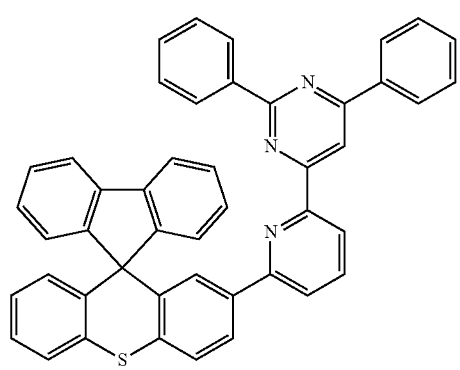

-continued
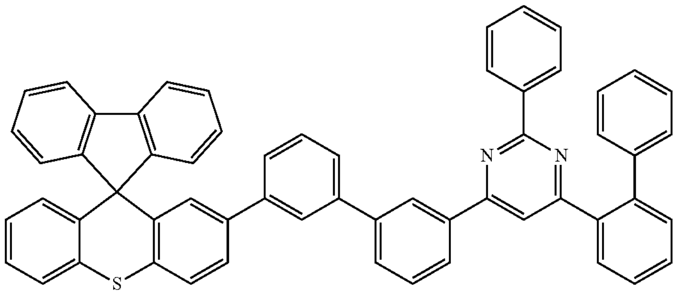
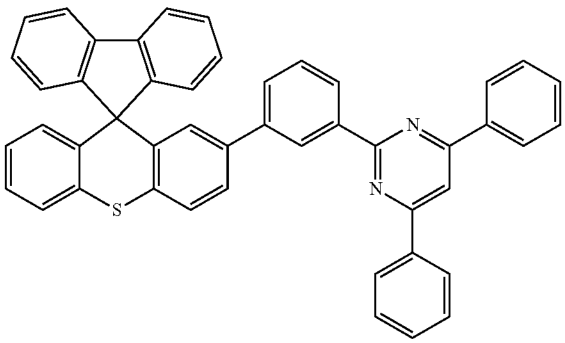
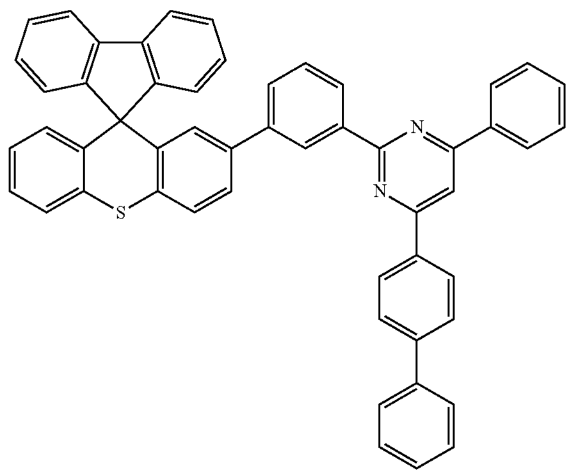
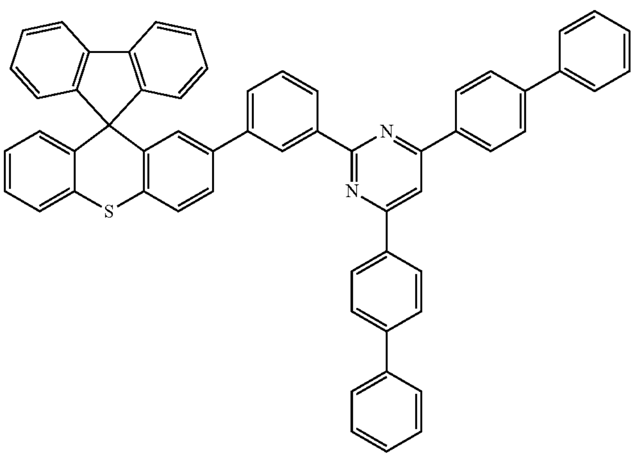
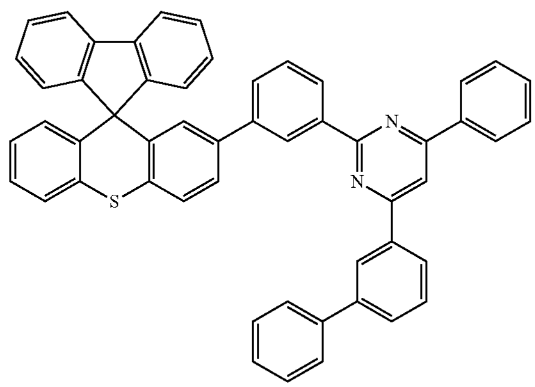
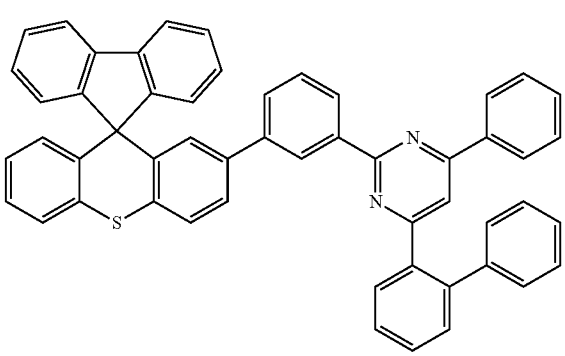
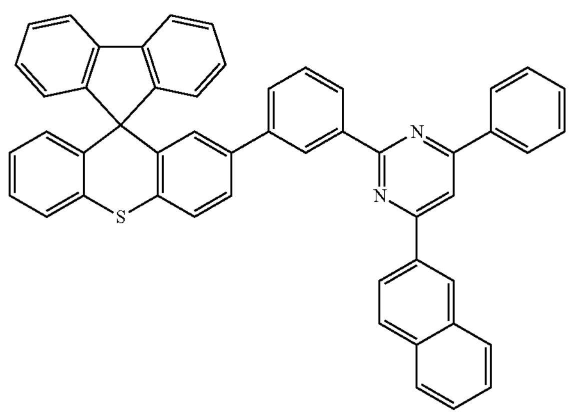

-continued
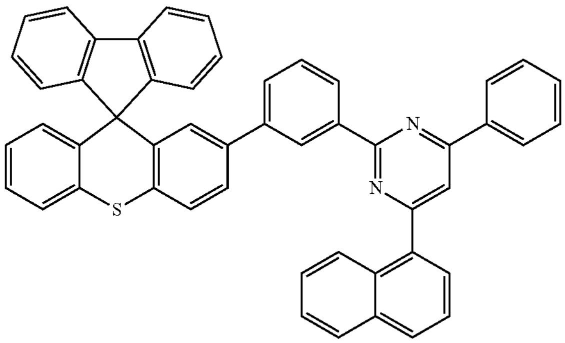
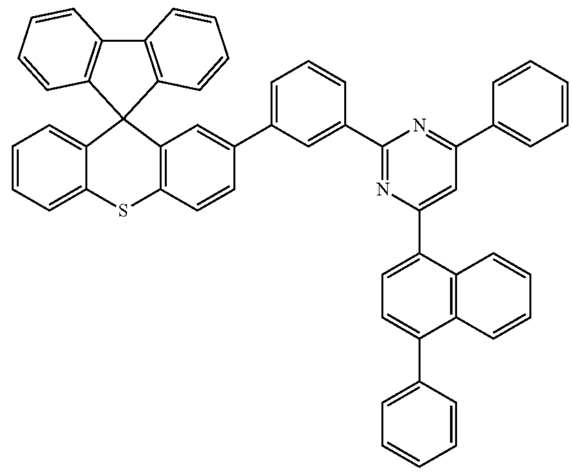
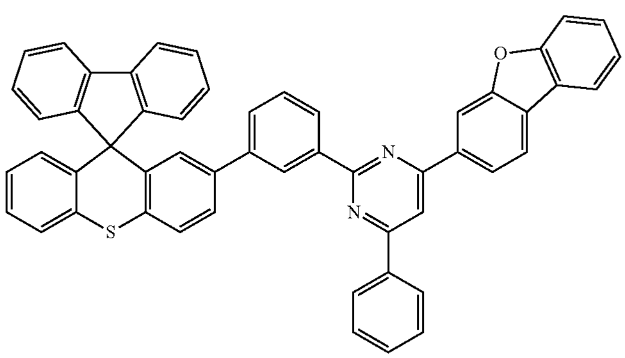
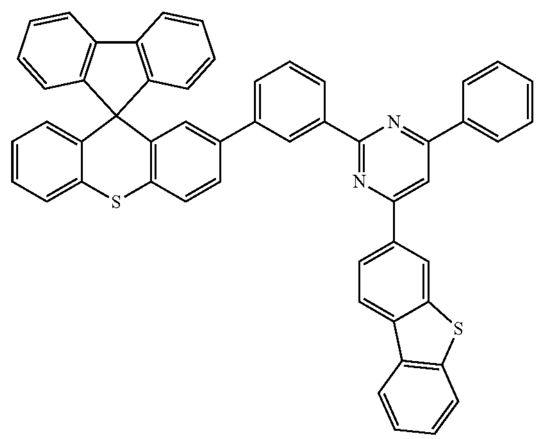
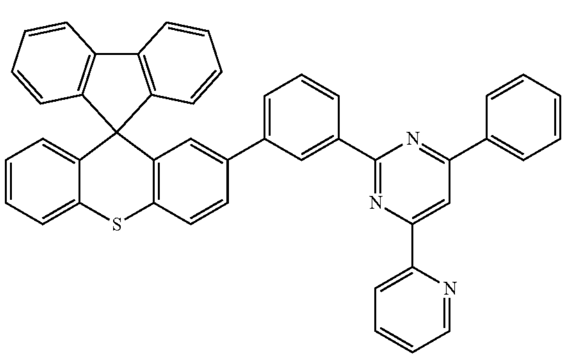
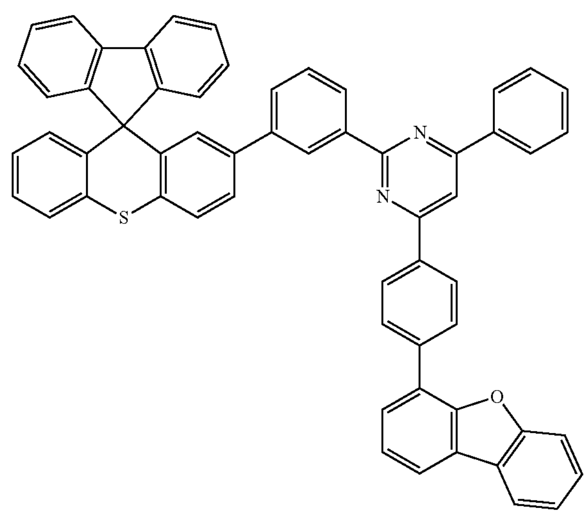

-continued
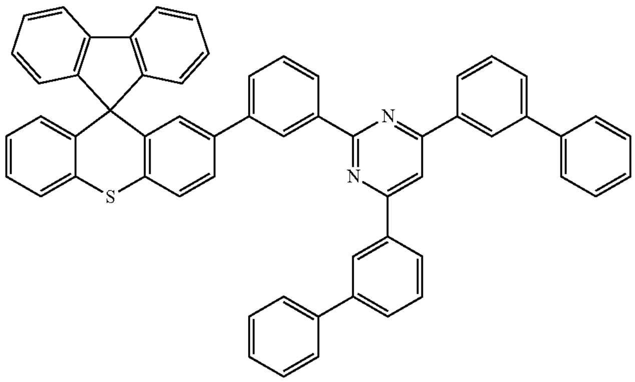
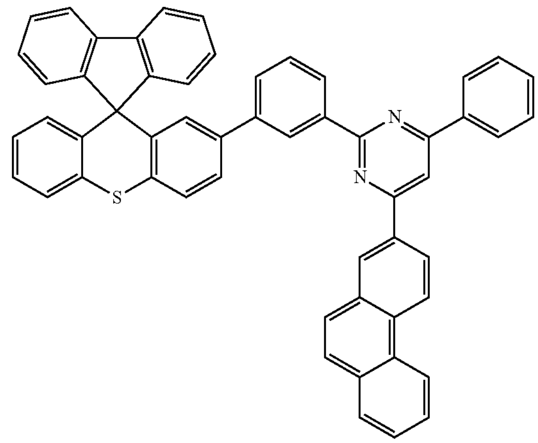
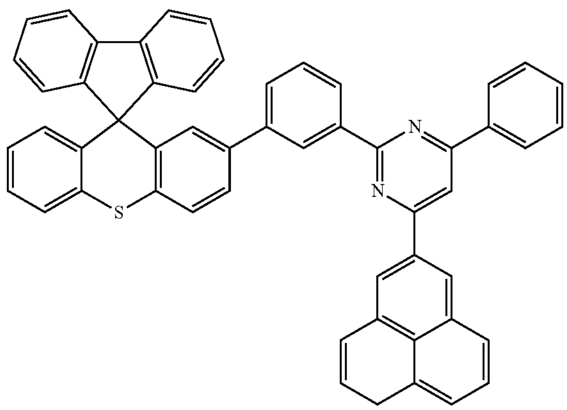
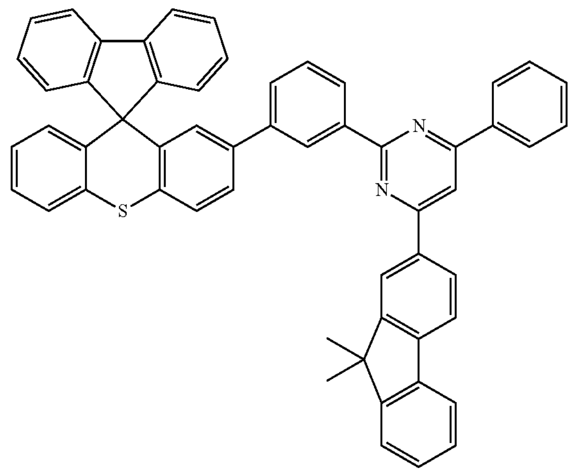
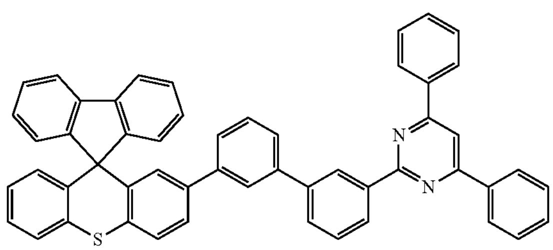
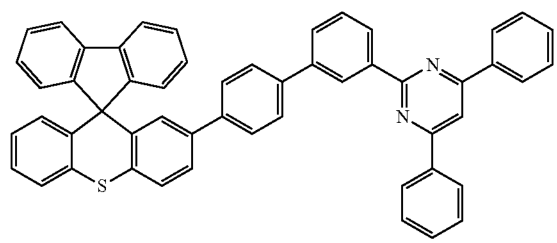
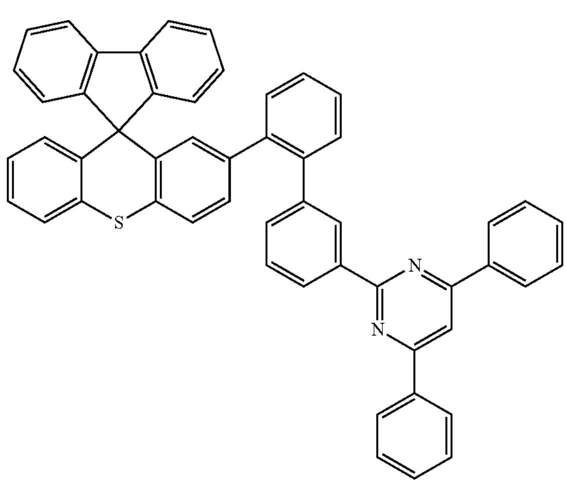
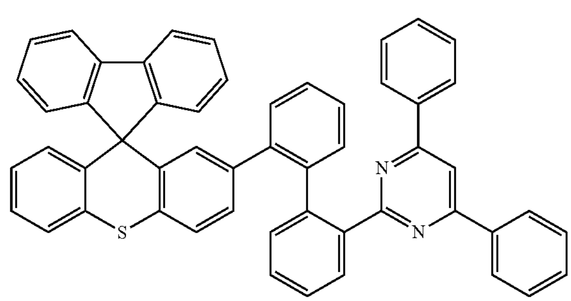

-continued
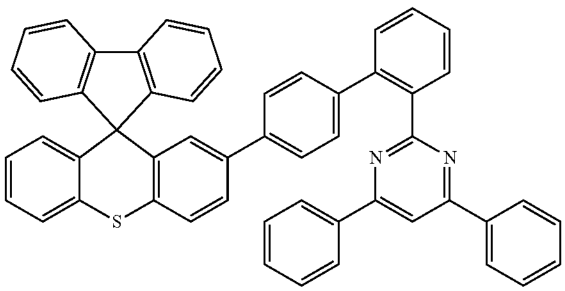
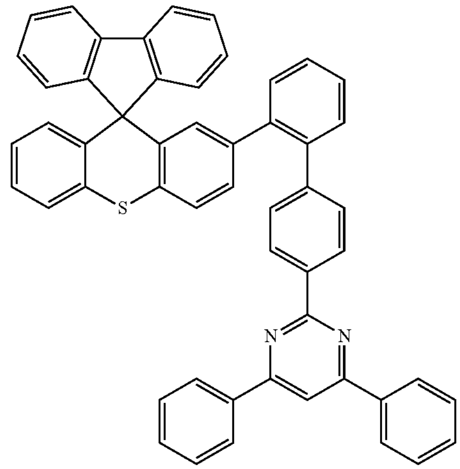
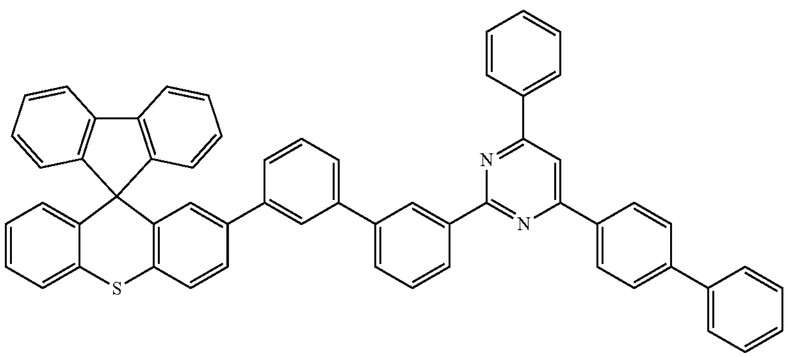
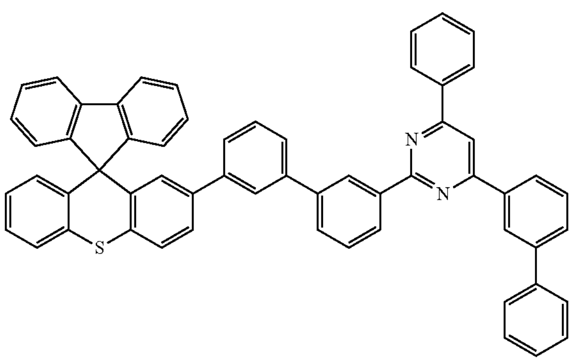
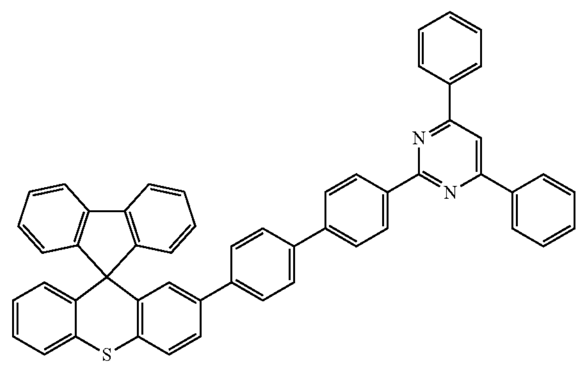
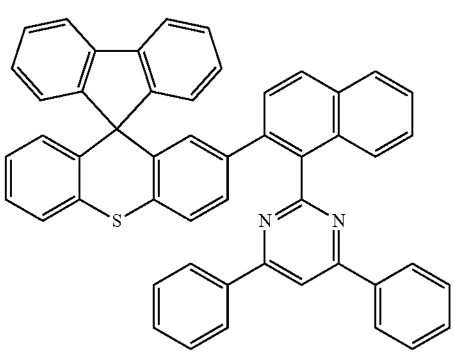
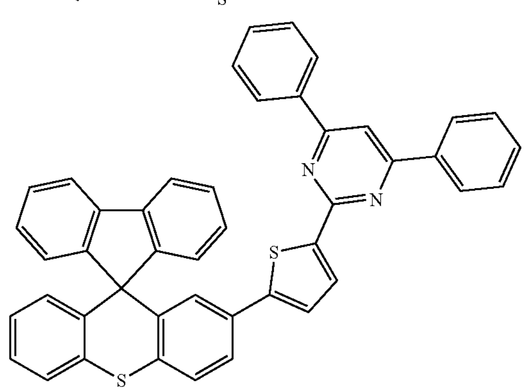

-continued
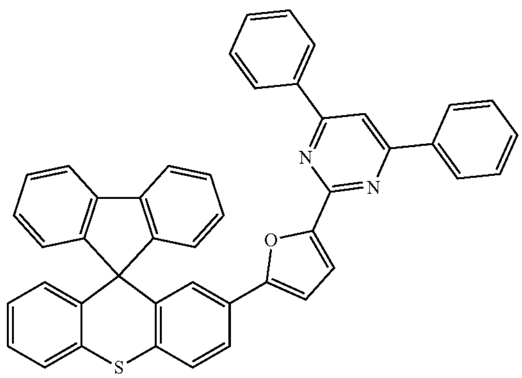
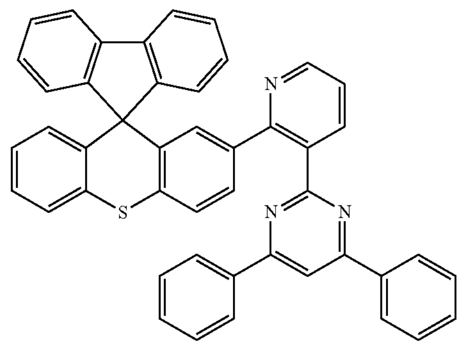
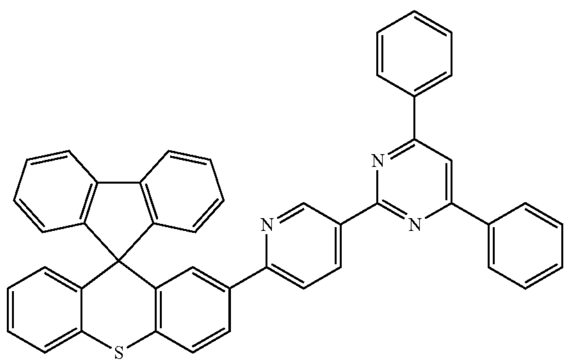
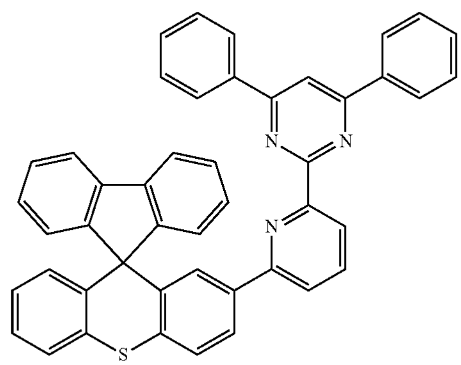
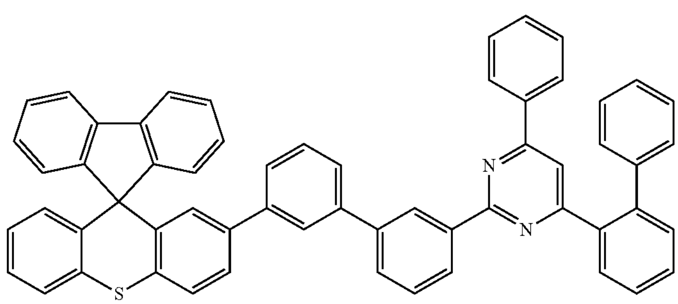
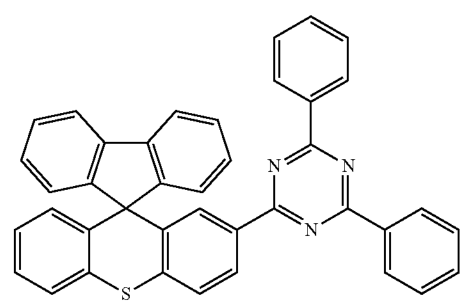
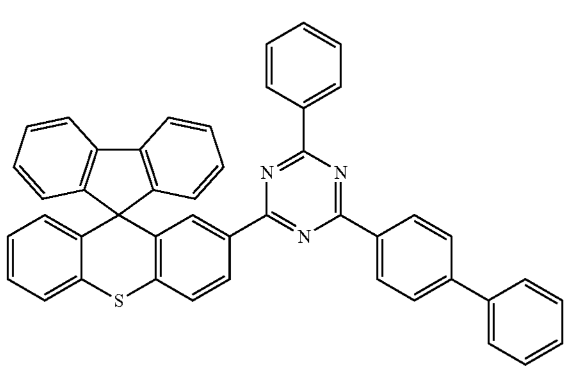
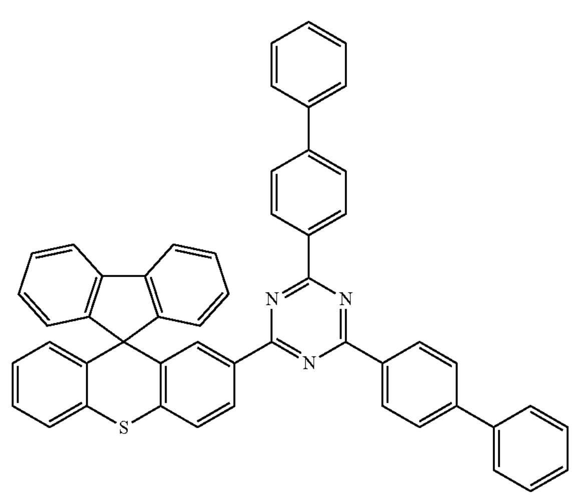

-continued
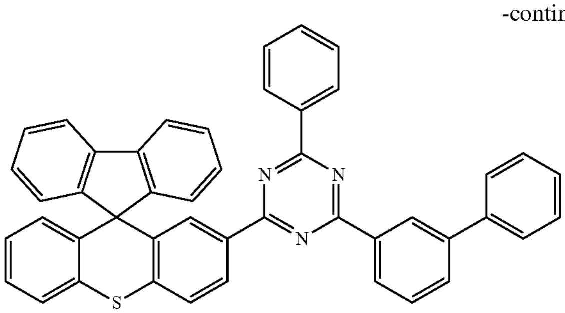
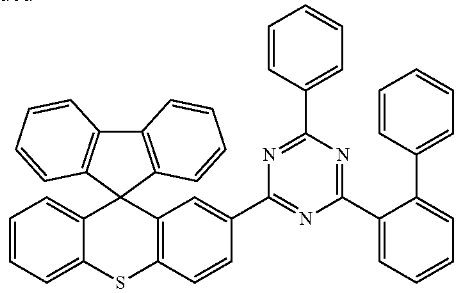
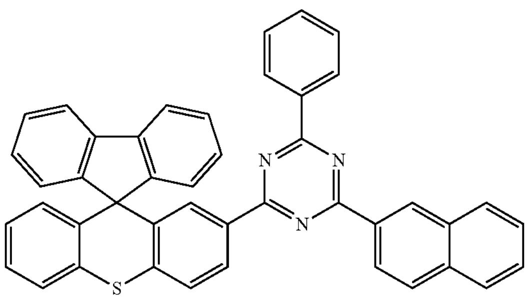
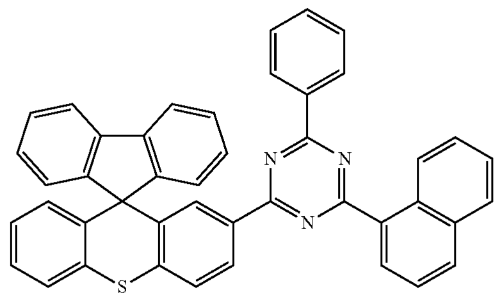
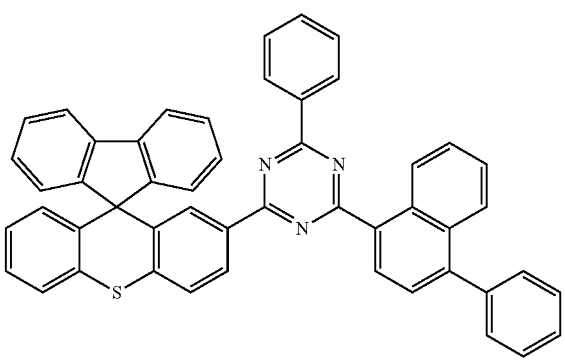
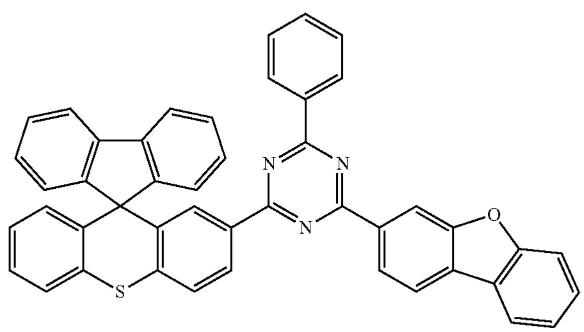
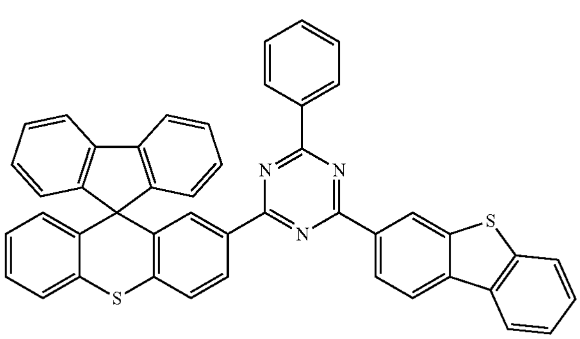
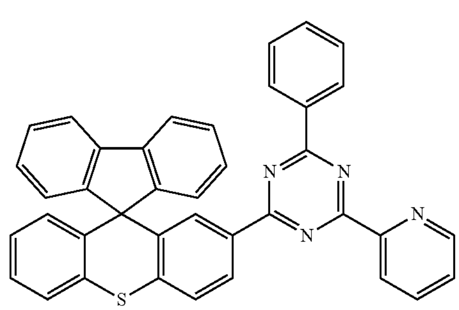

-continued
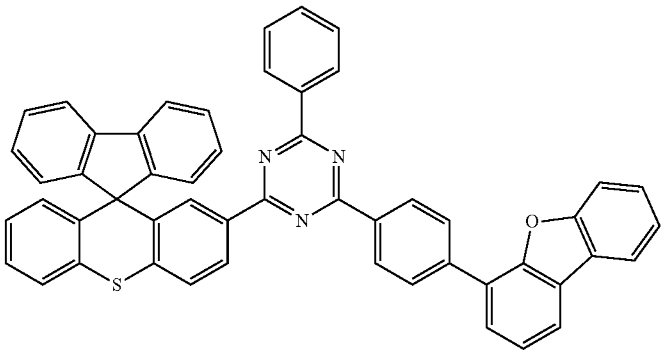
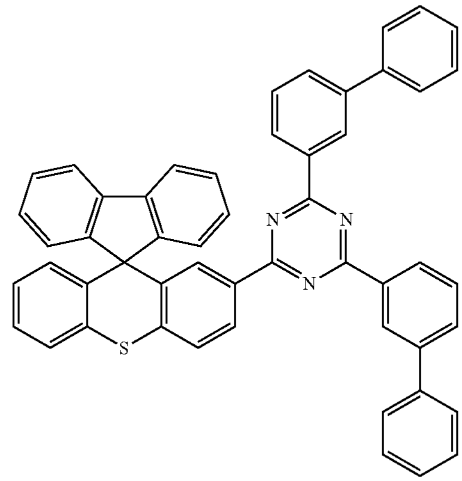
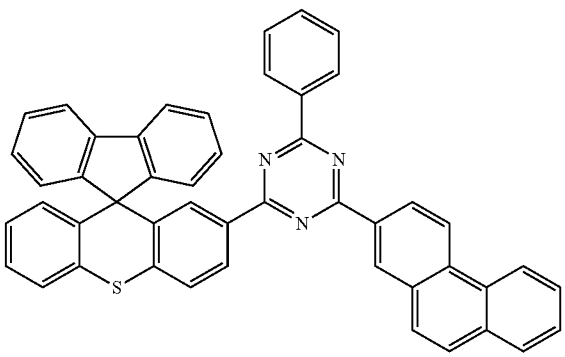
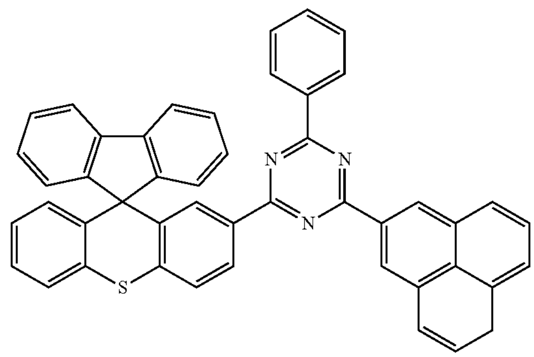
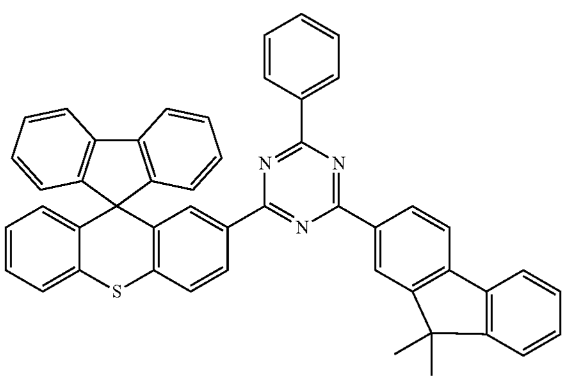
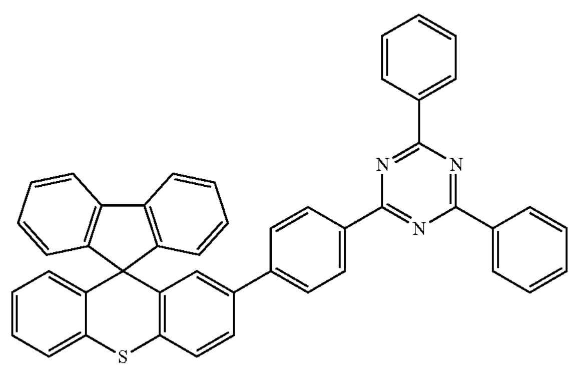
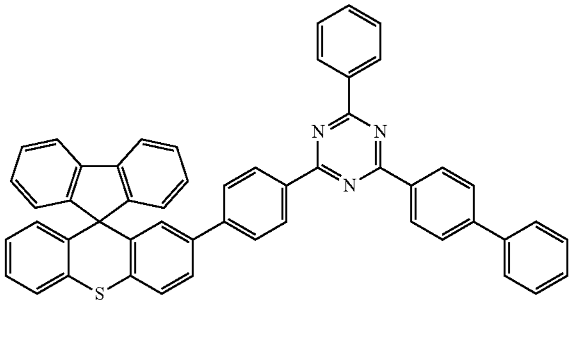
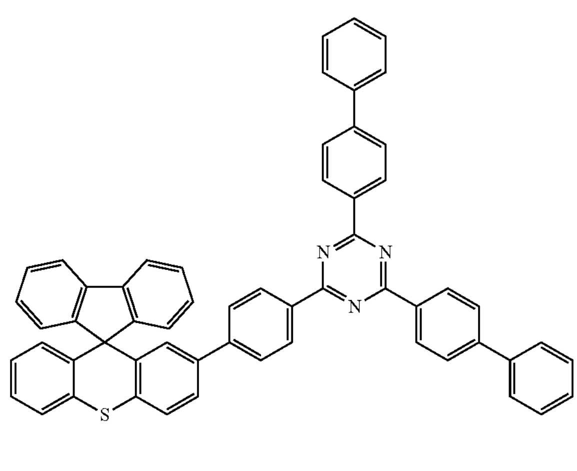

-continued
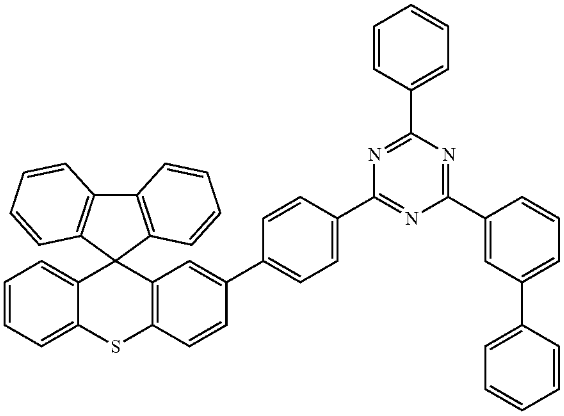
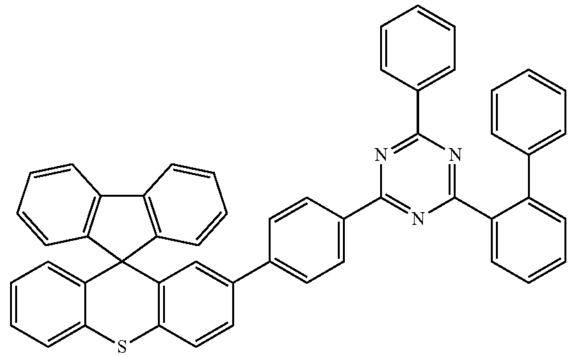
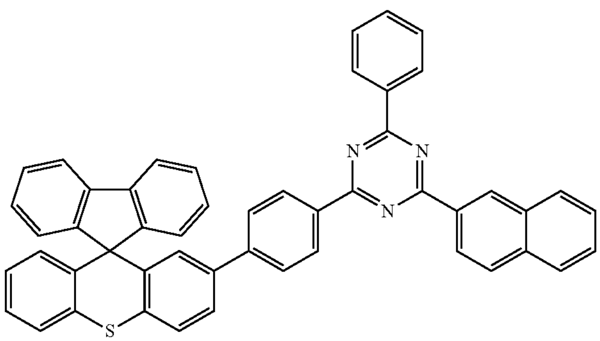
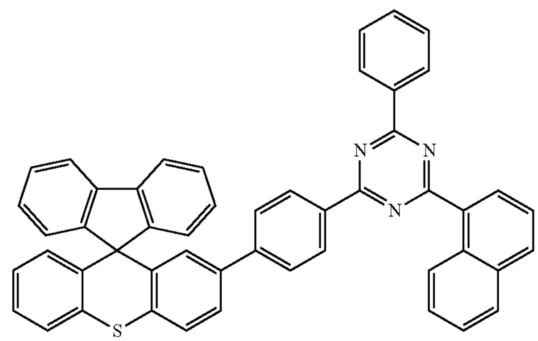
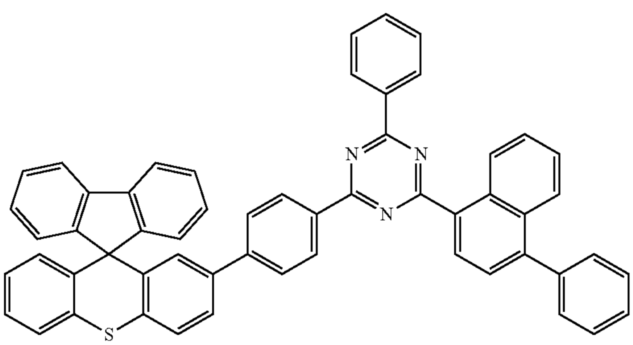
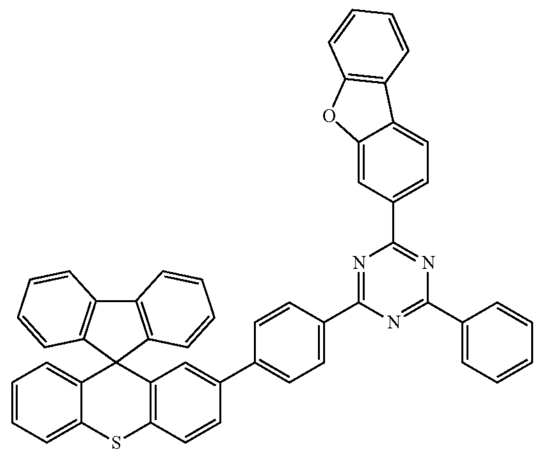
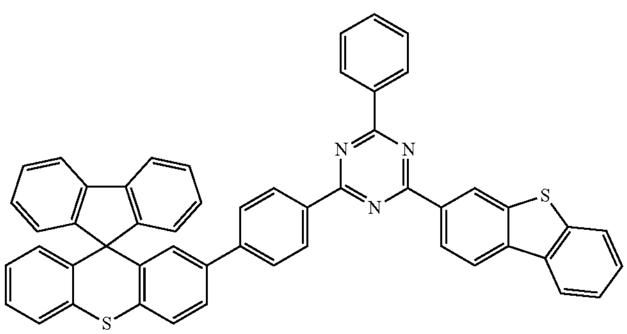
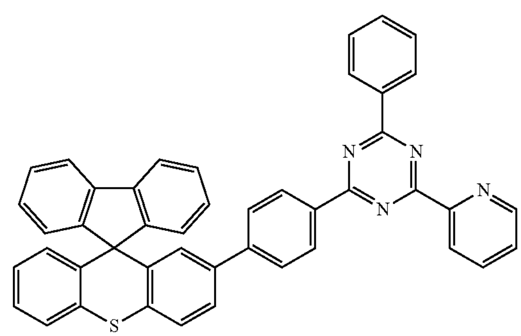

-continued
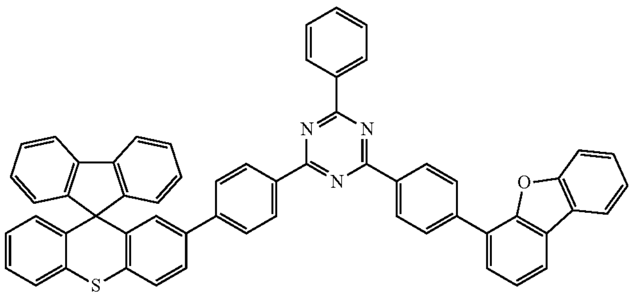
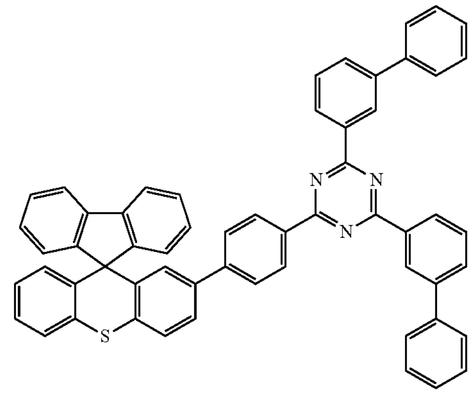
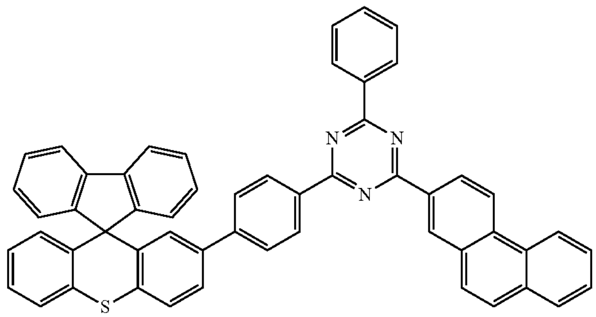
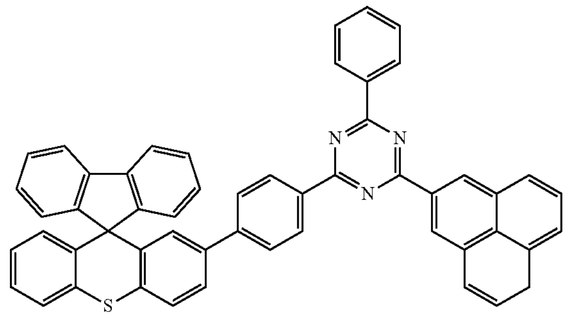
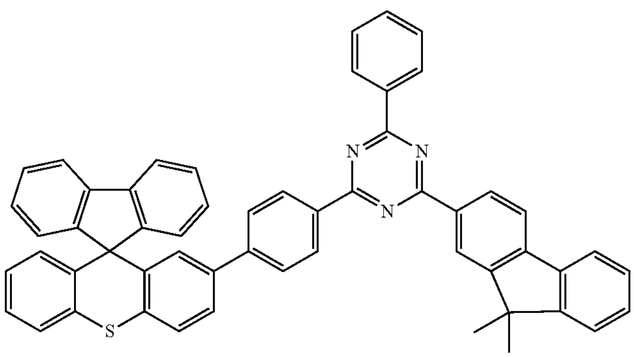
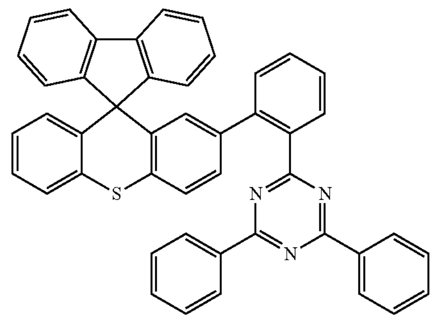
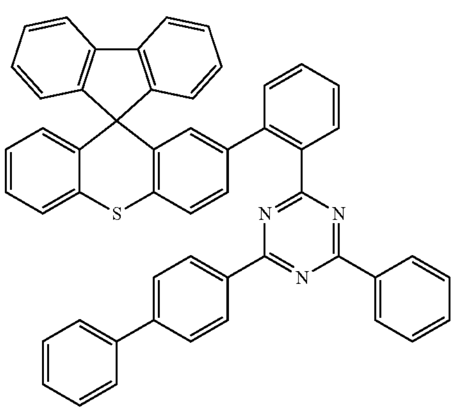
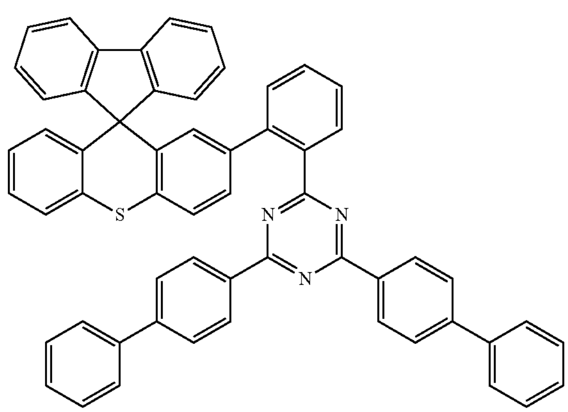

-continued
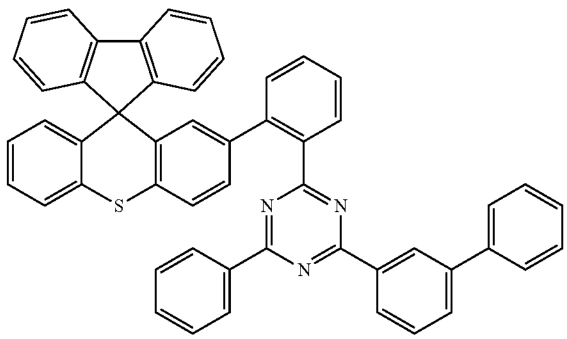
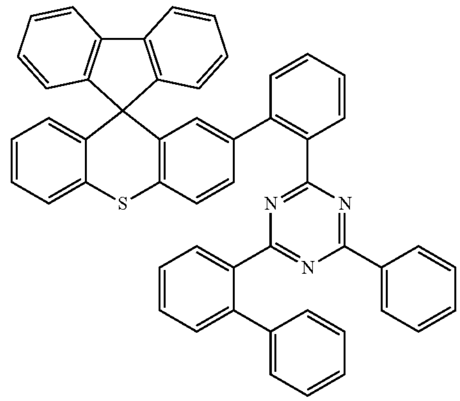
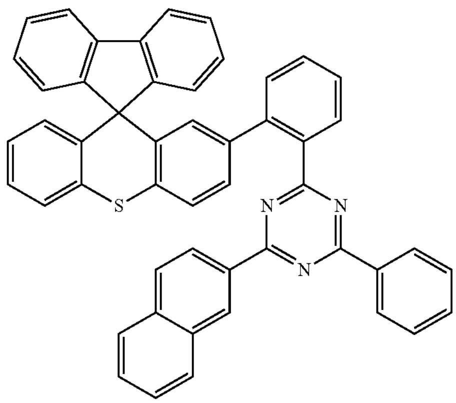
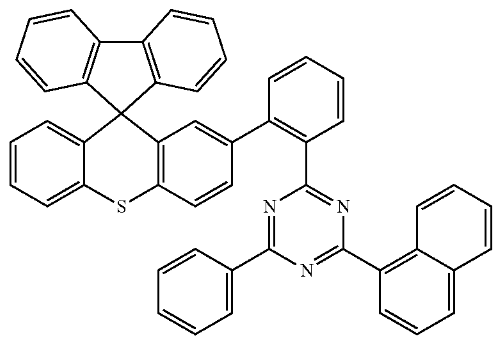
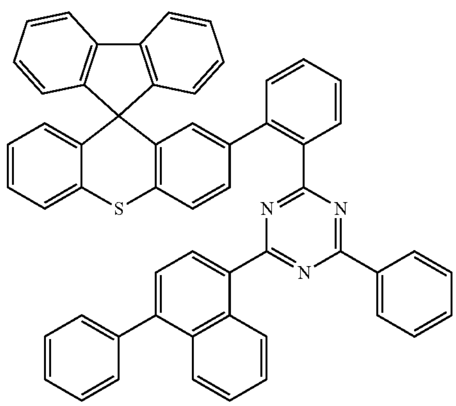
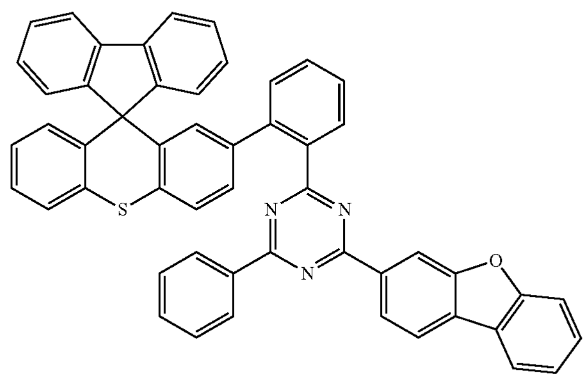
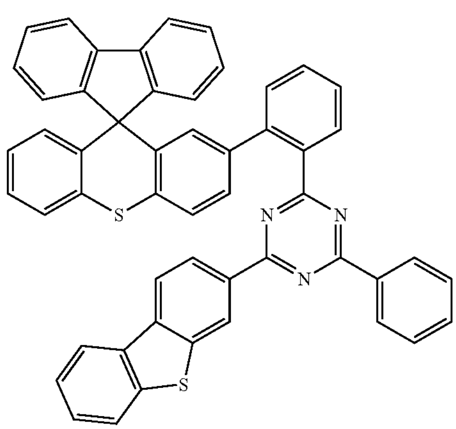
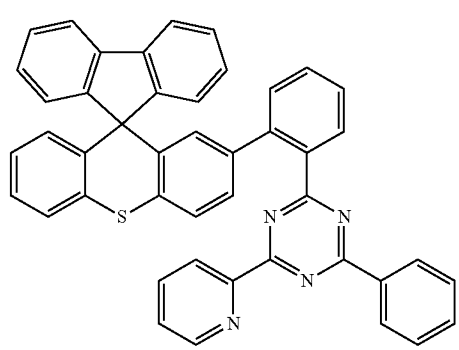

-continued
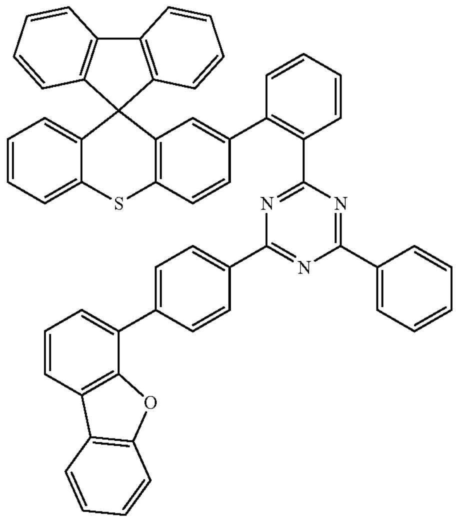
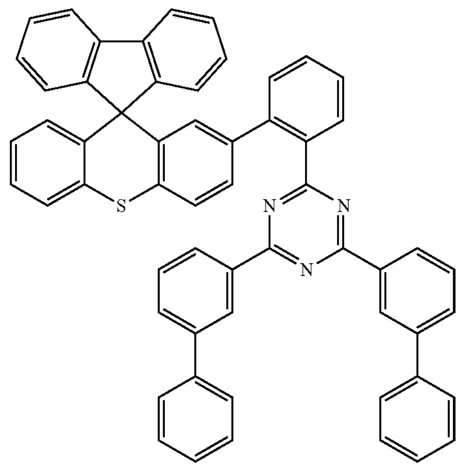
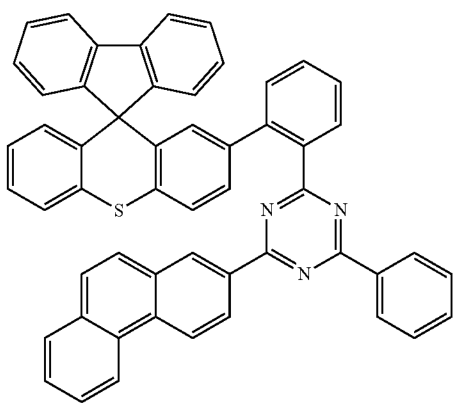
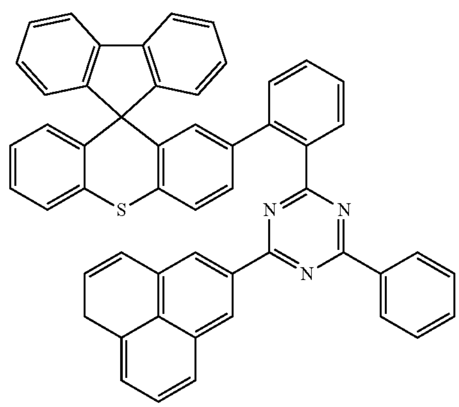
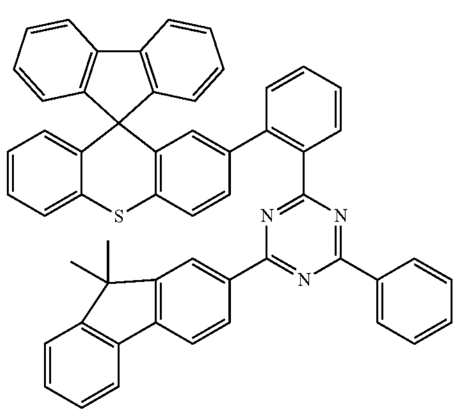
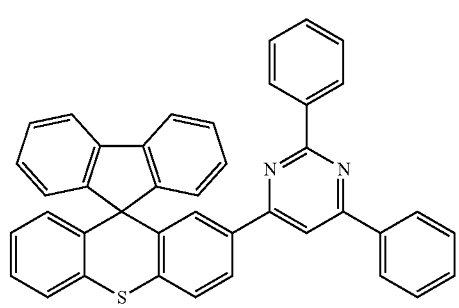

-continued
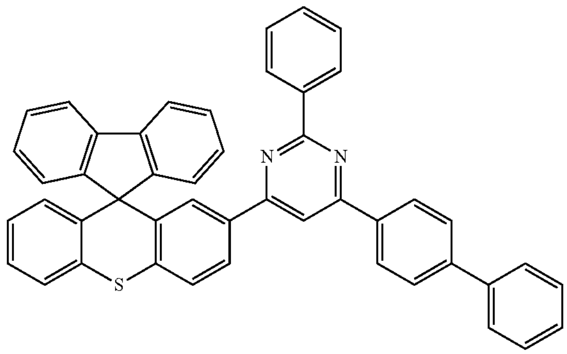
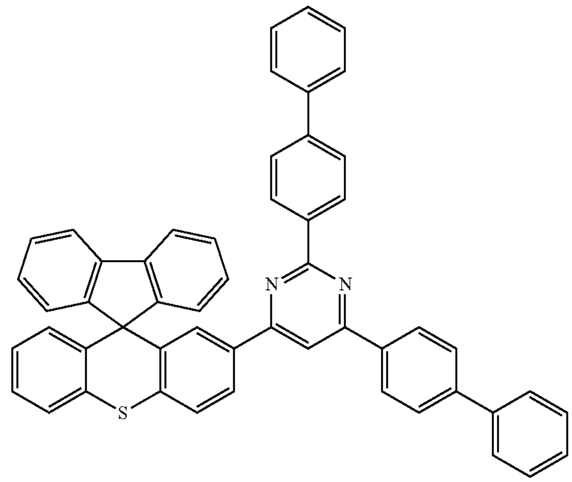
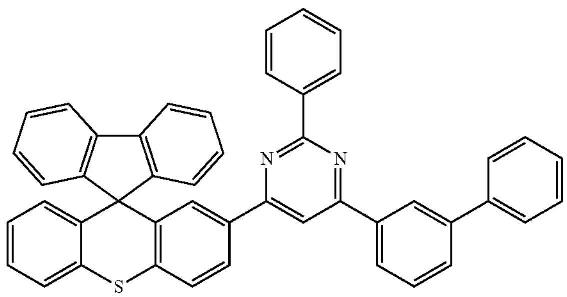
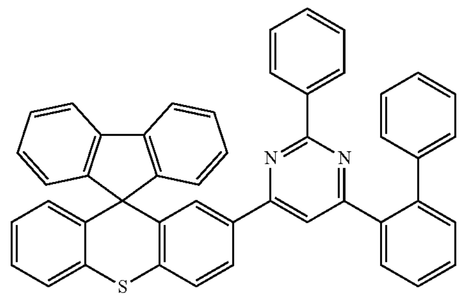
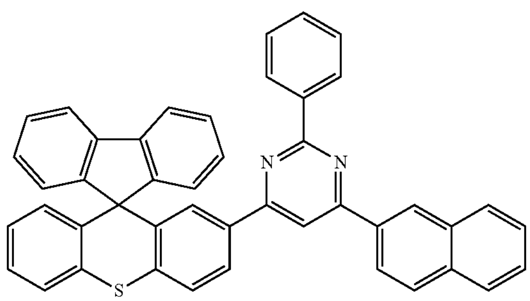
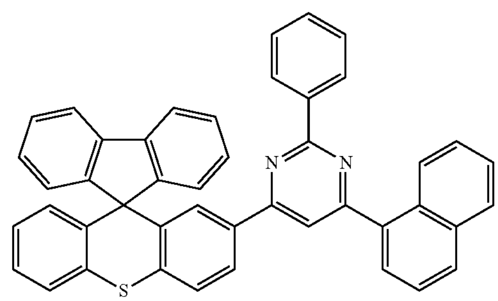
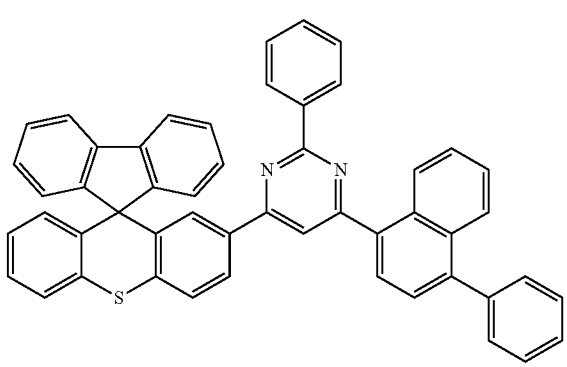
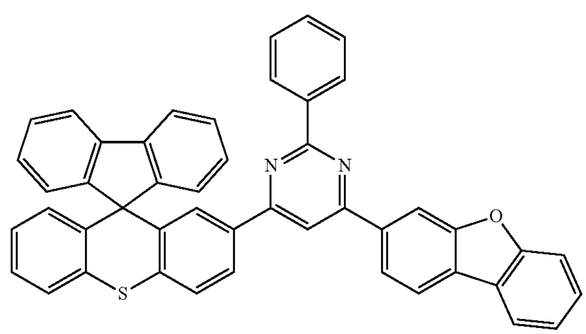

-continued
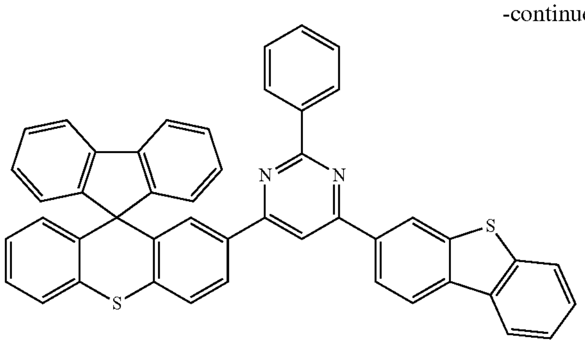
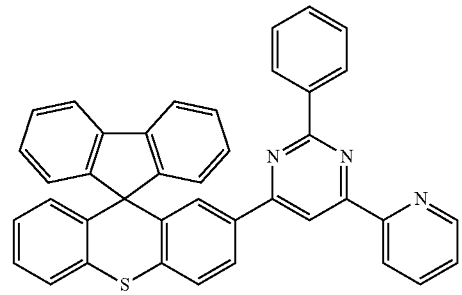
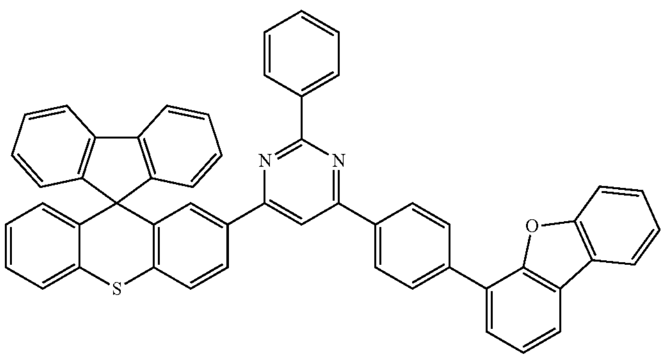
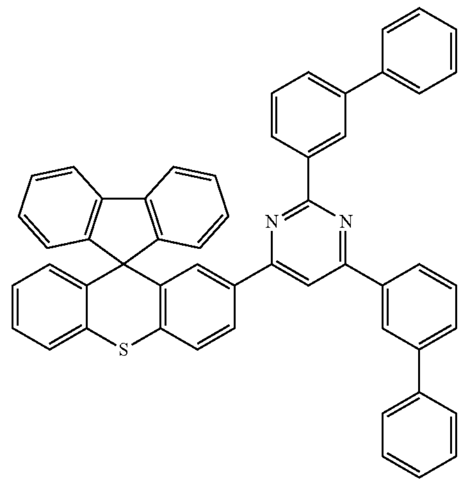
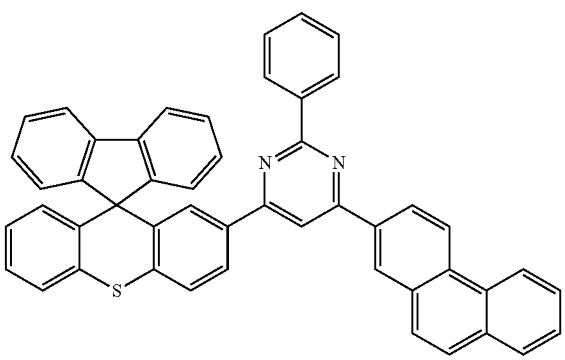
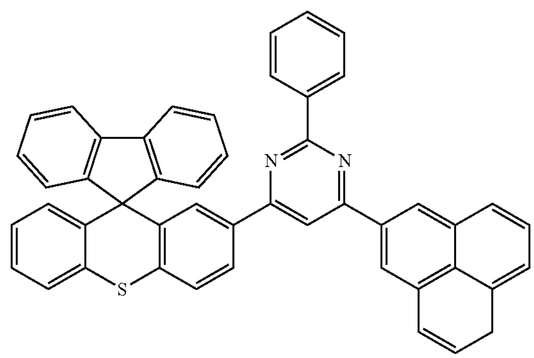
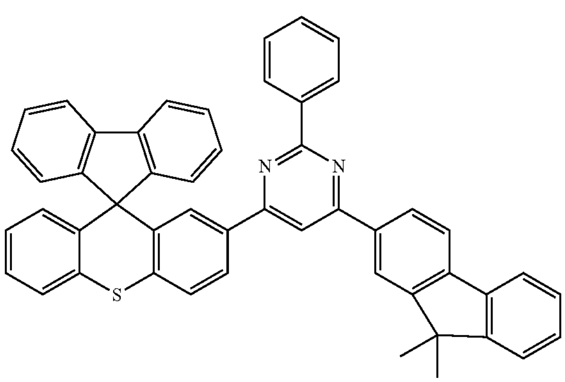
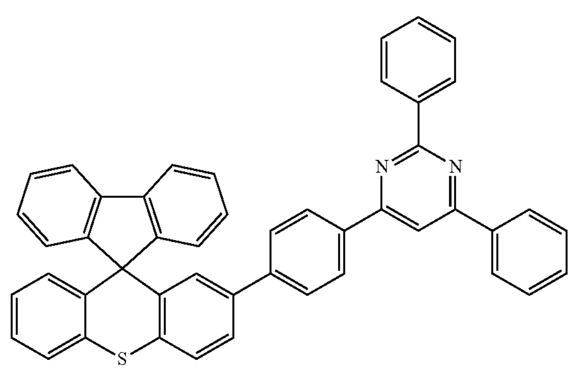

-continued
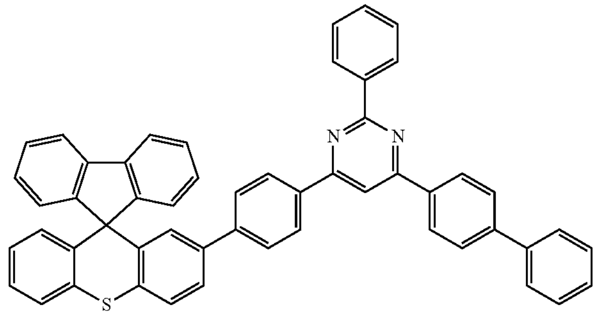
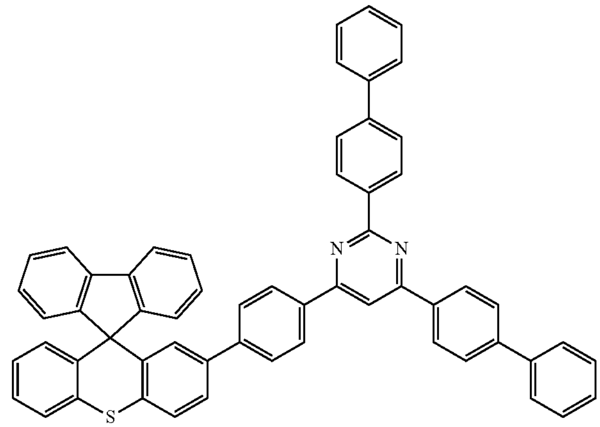
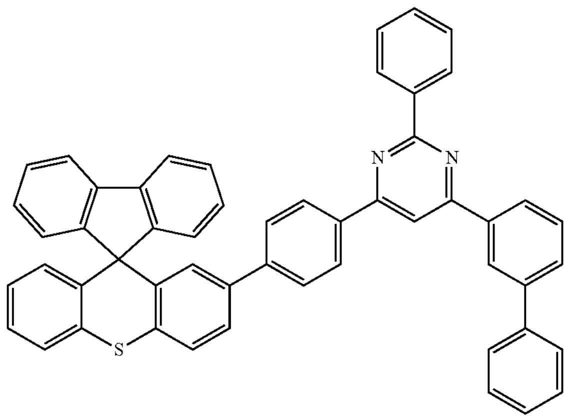
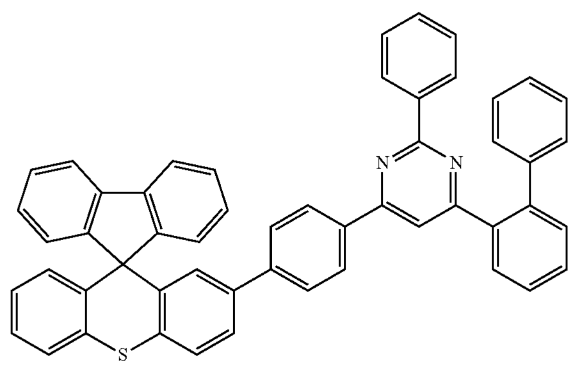
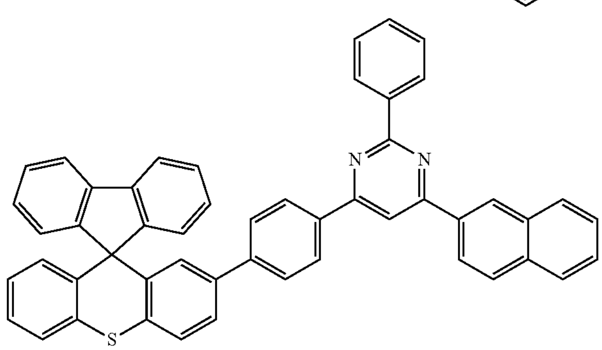
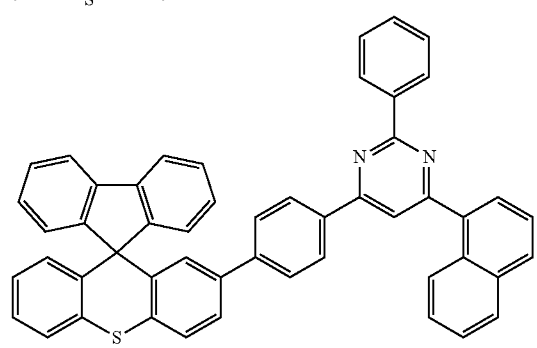
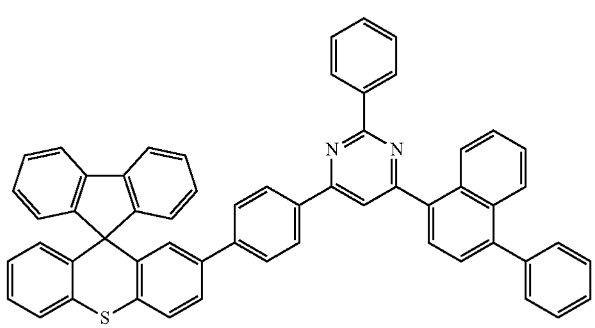
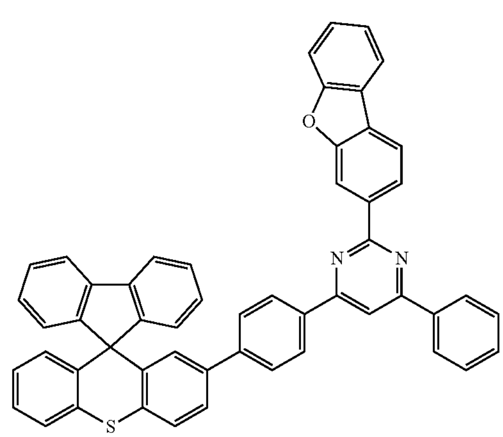

-continued
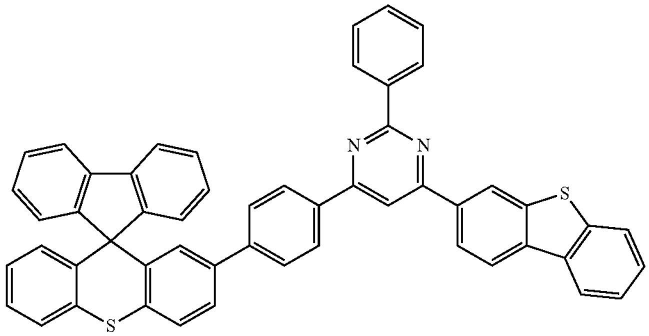
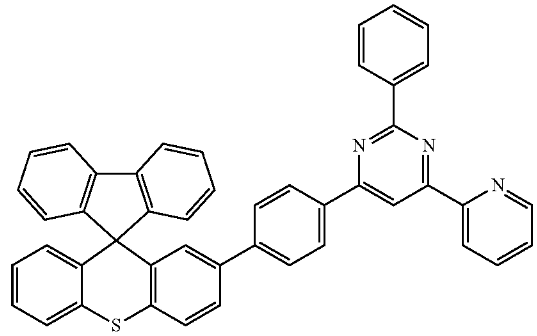
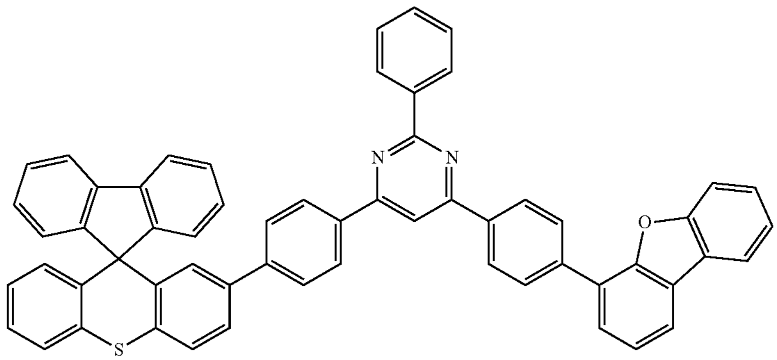
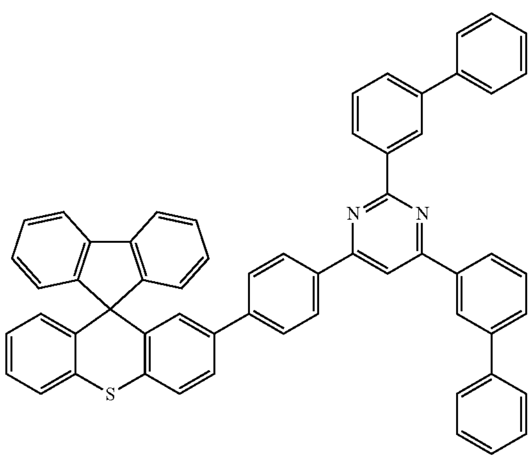
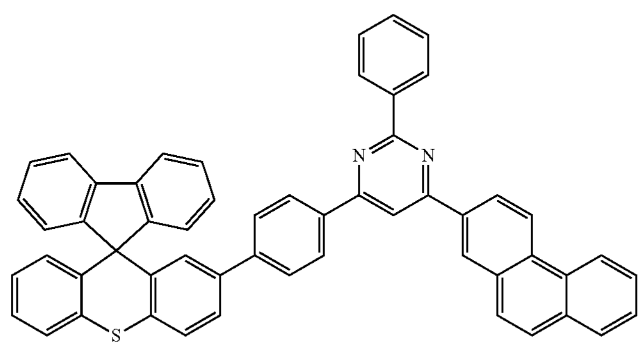
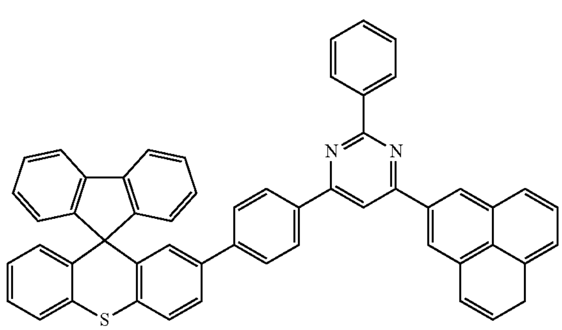
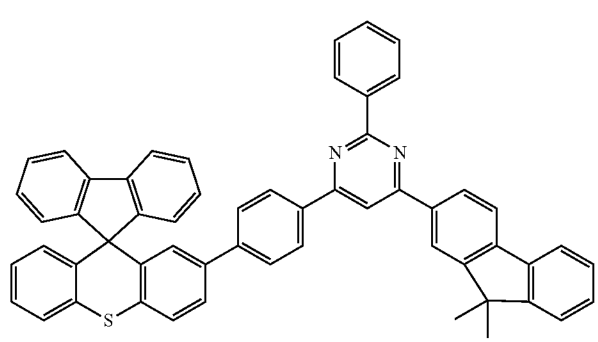

-continued
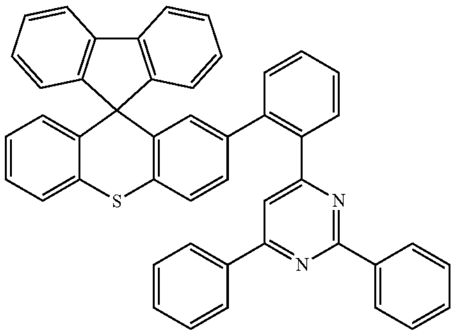
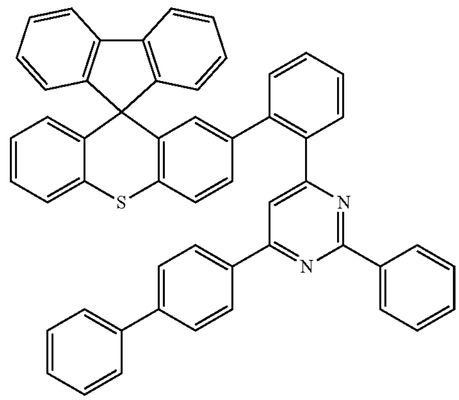
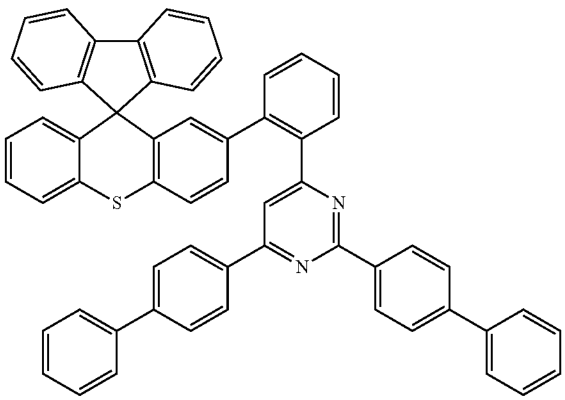
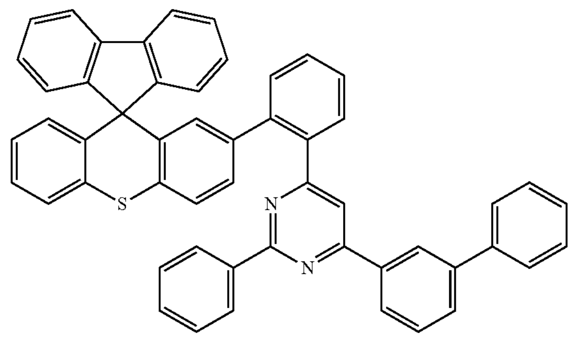
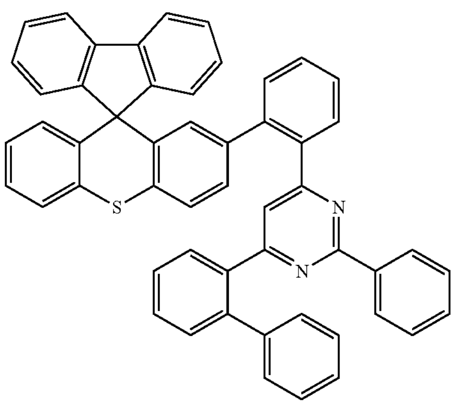
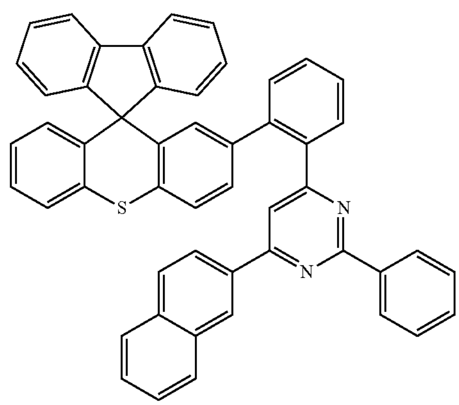
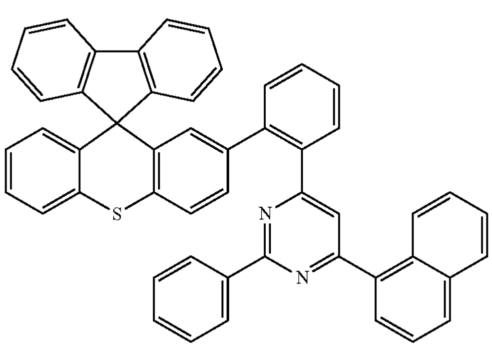
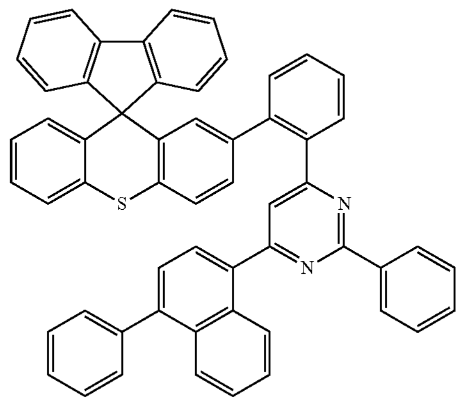

-continued
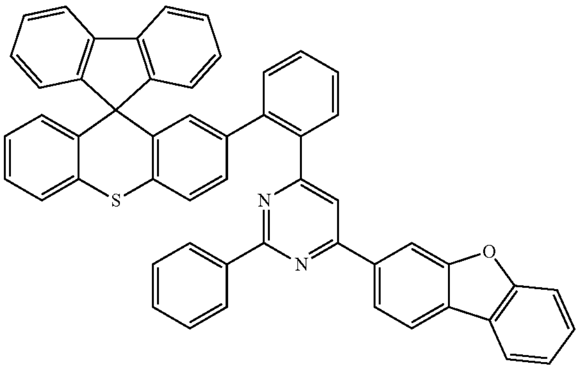
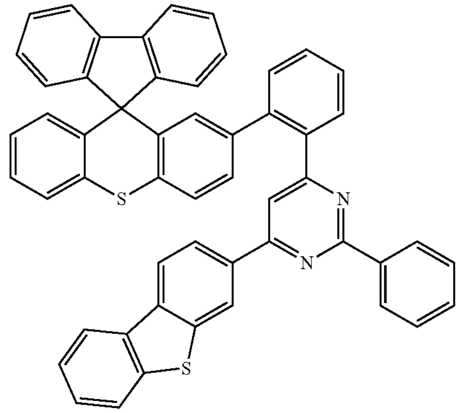
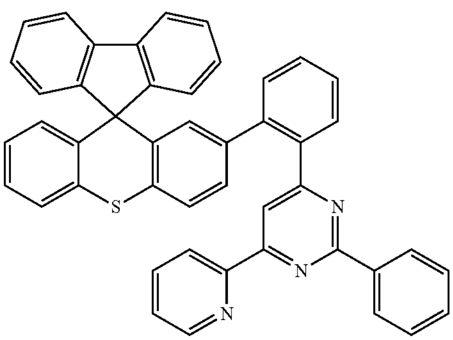
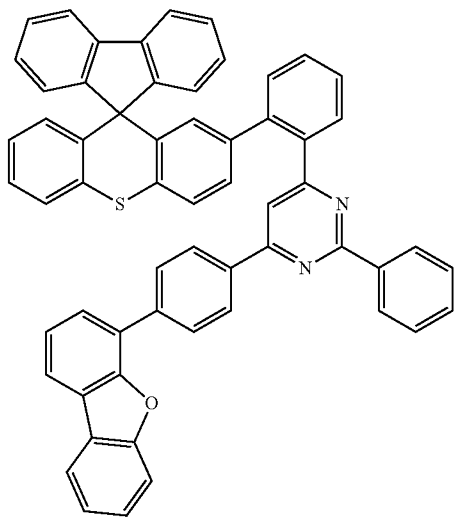
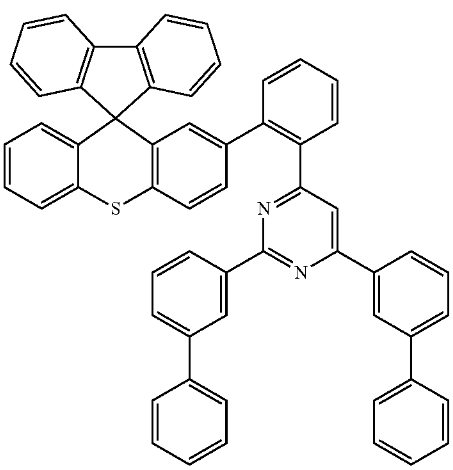
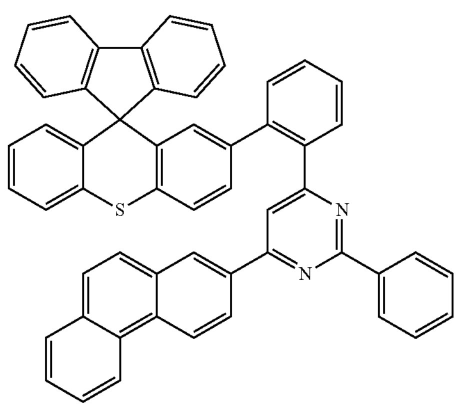

-continued
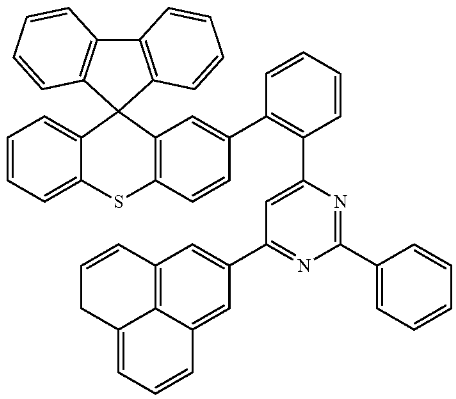
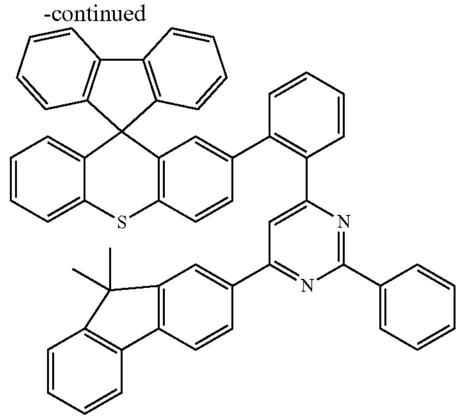
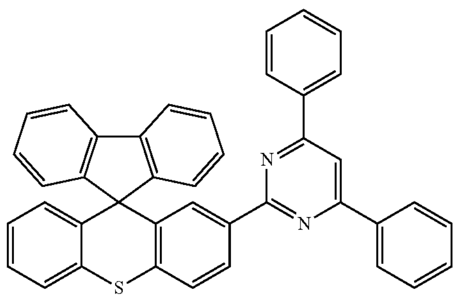
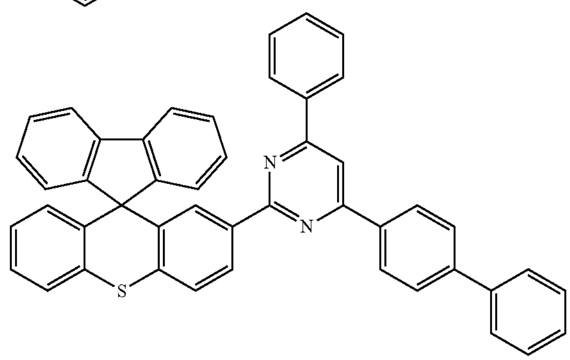
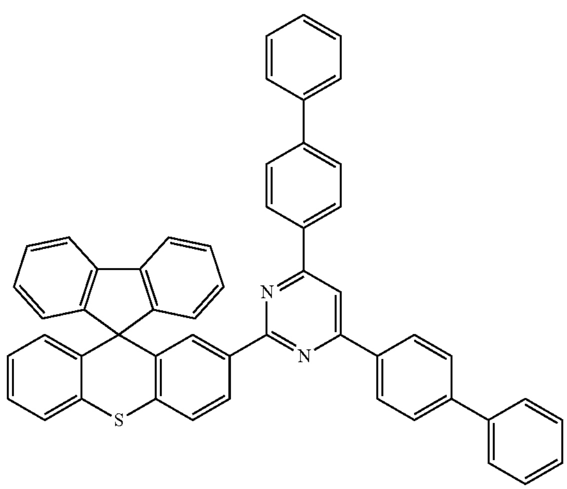
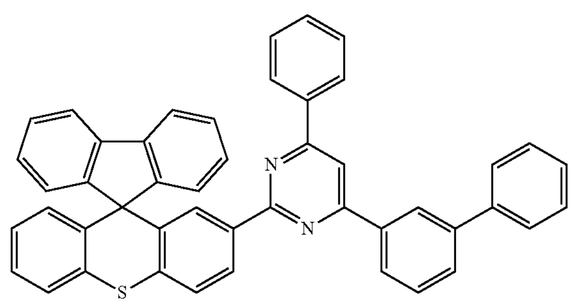
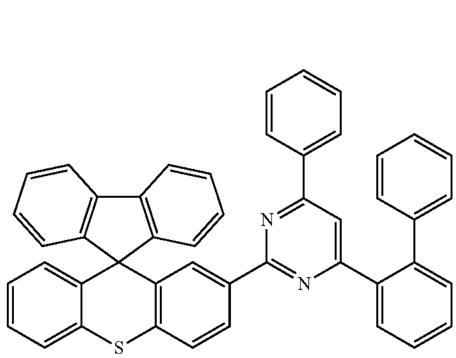
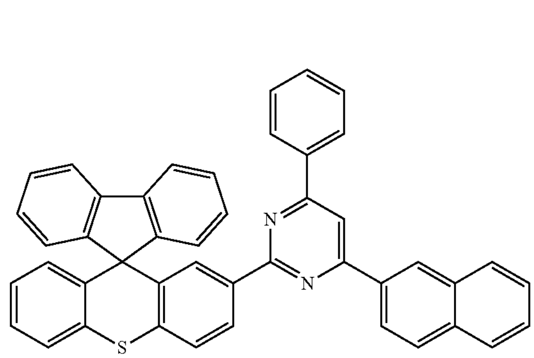

-continued
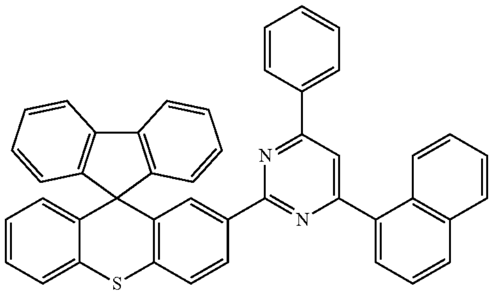
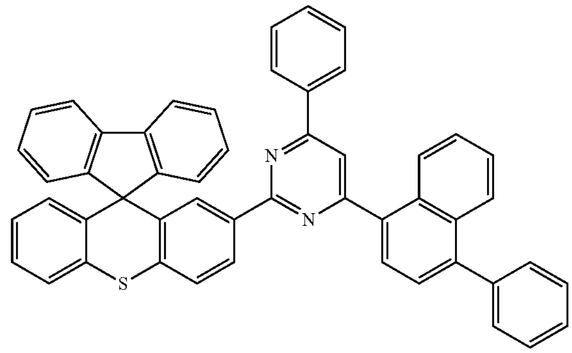
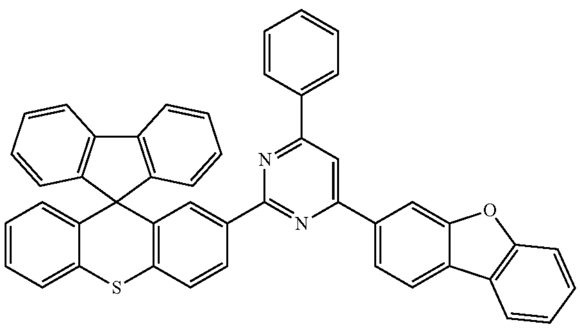
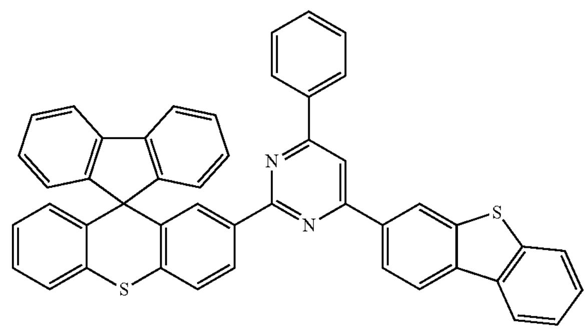
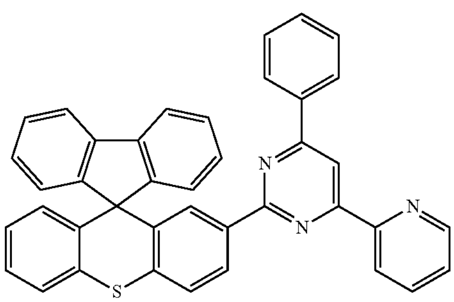
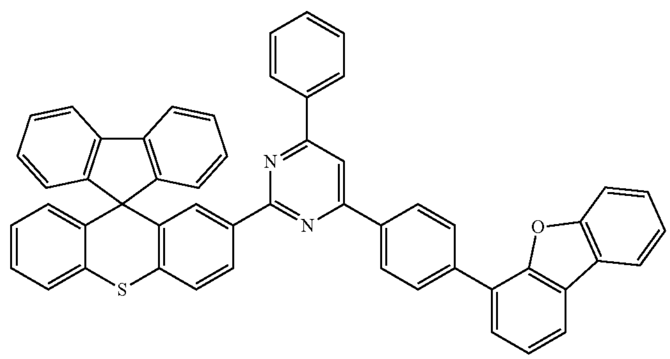
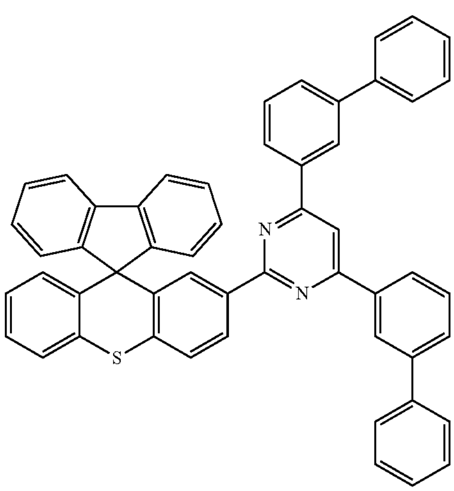
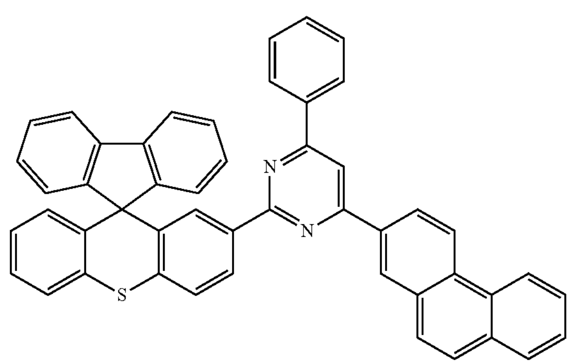

-continued
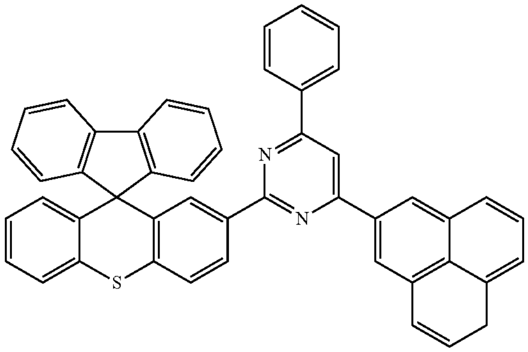
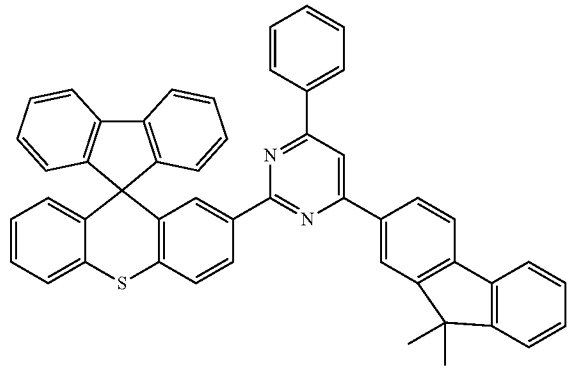
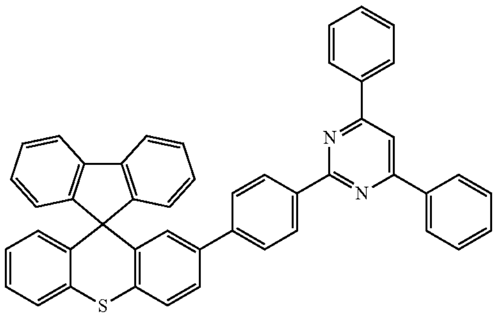
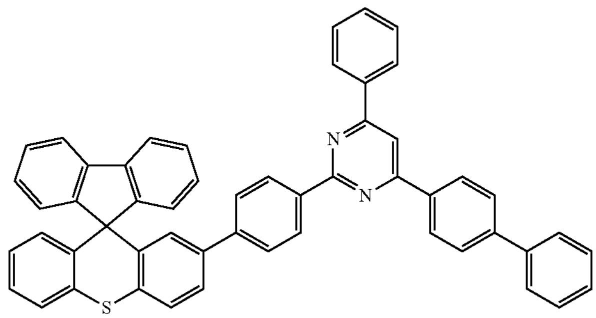
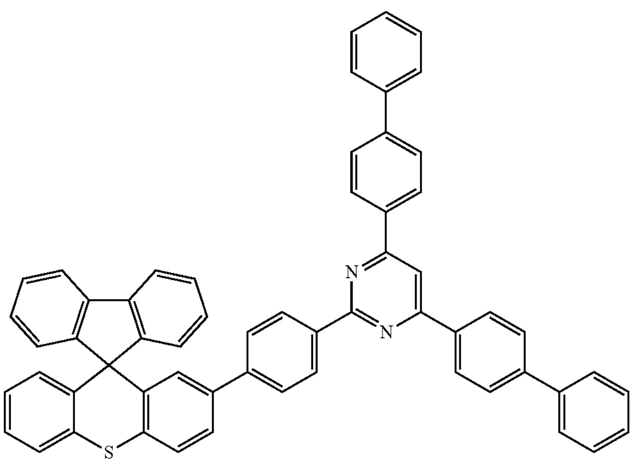
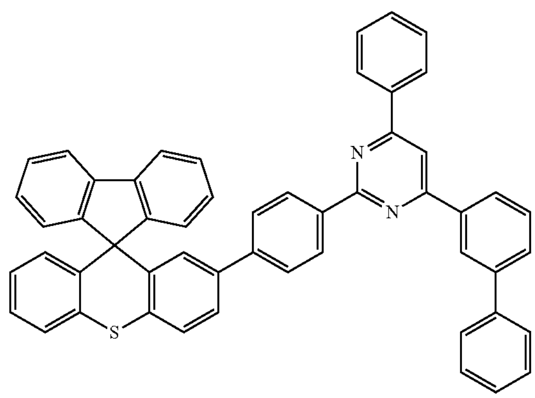
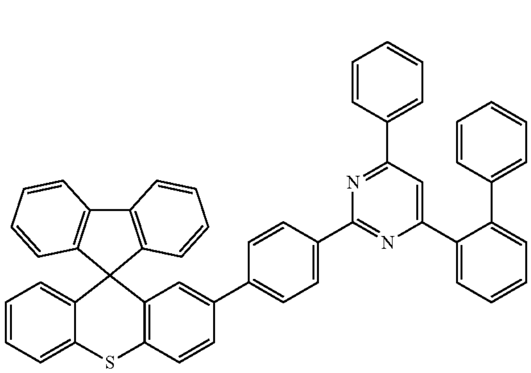
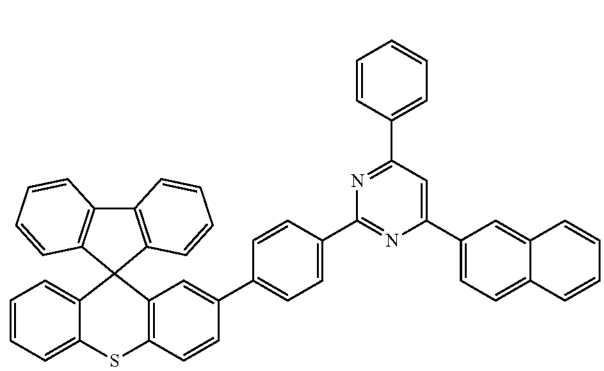

-continued
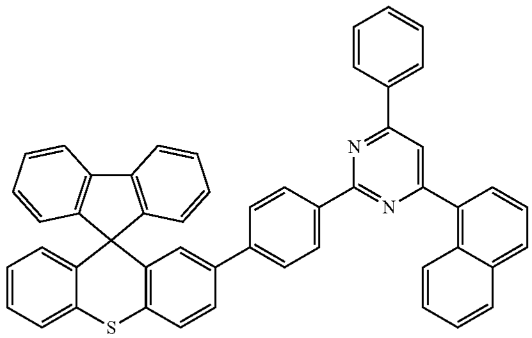
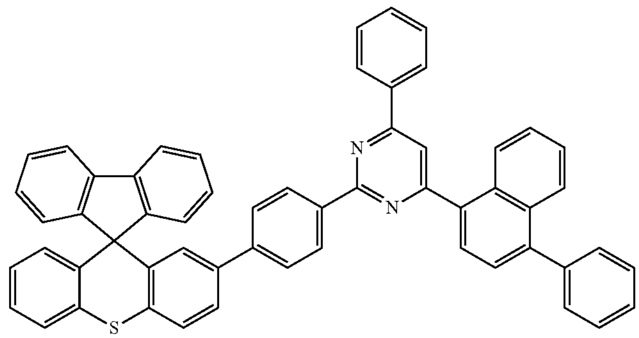
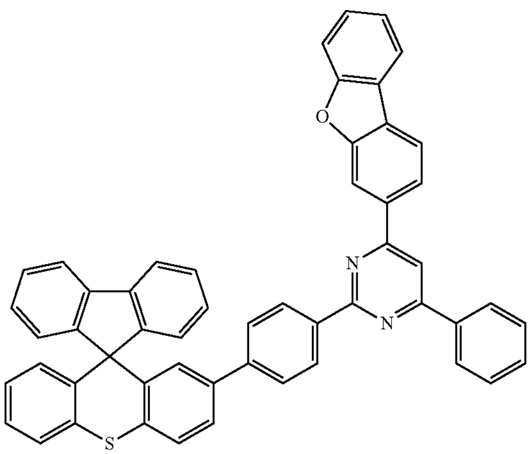
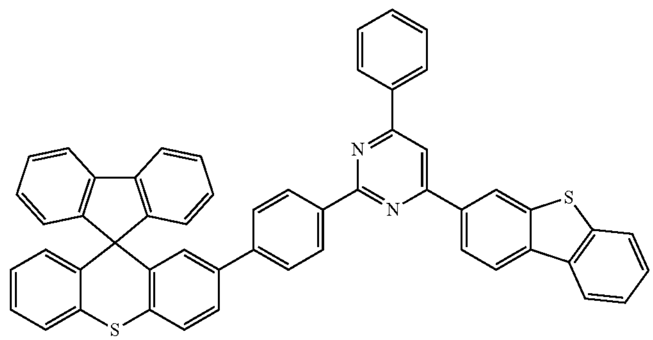
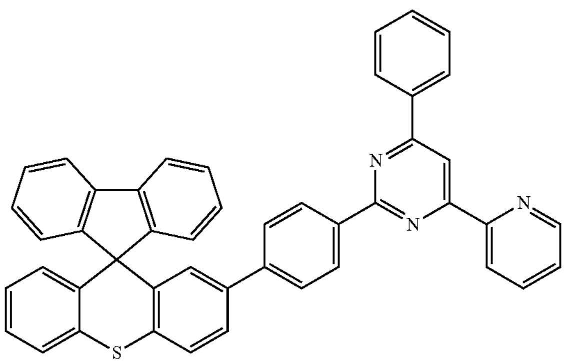
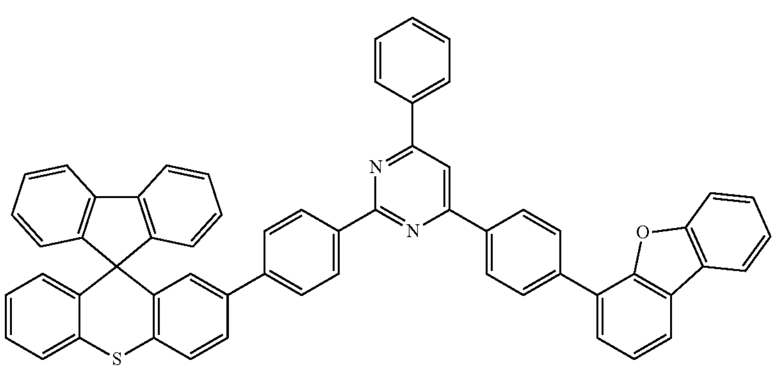

-continued
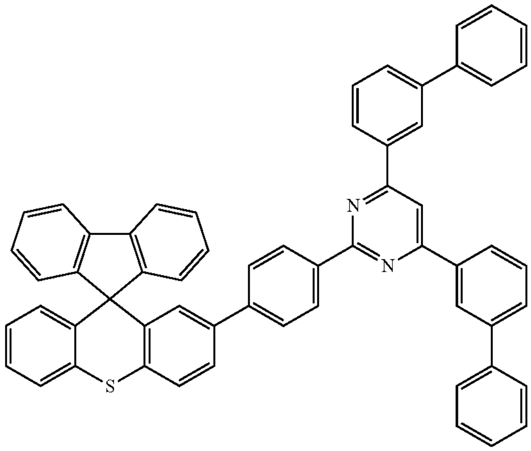
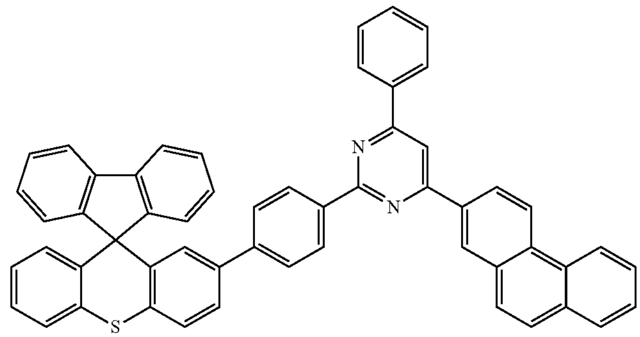
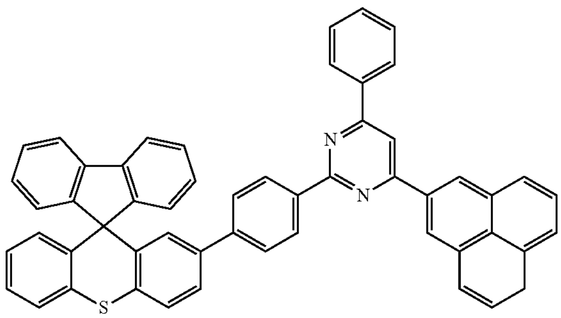
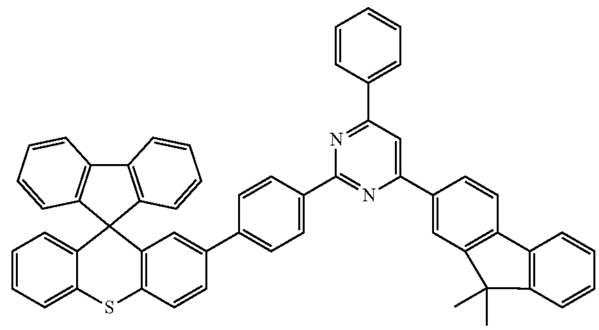
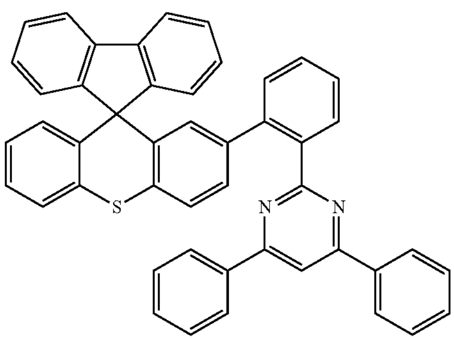
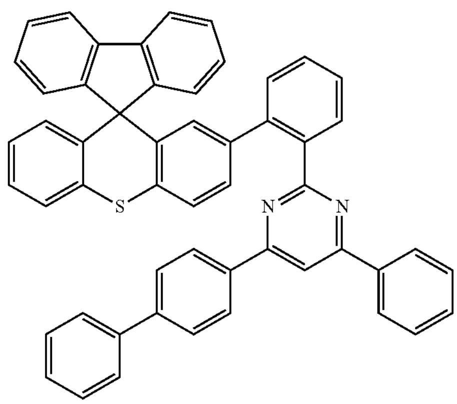
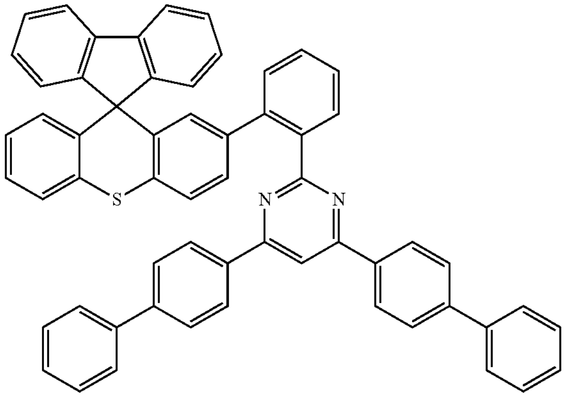
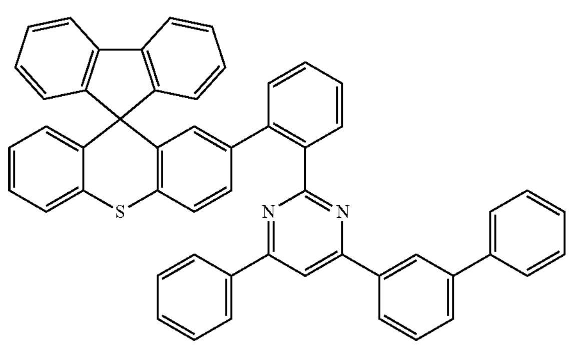

-continued
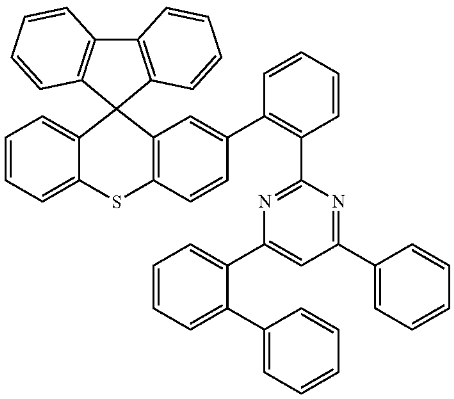
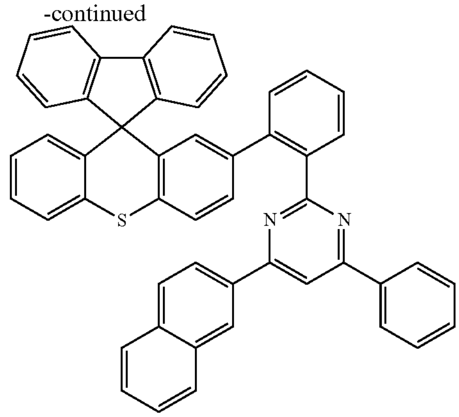
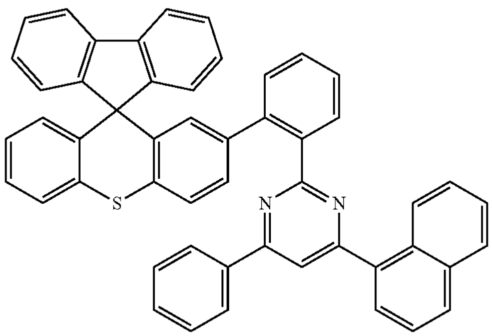
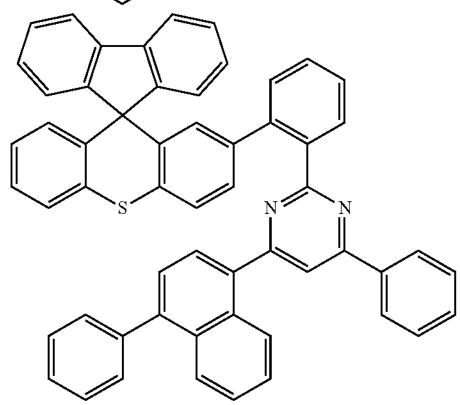
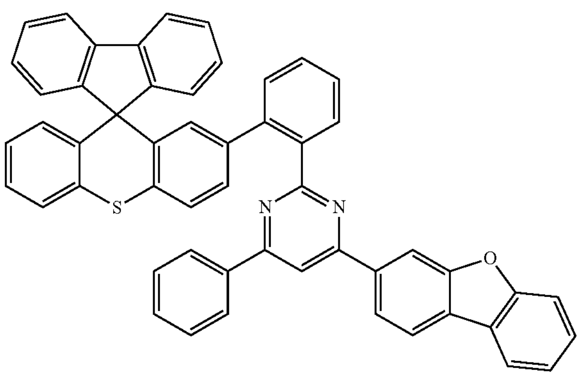
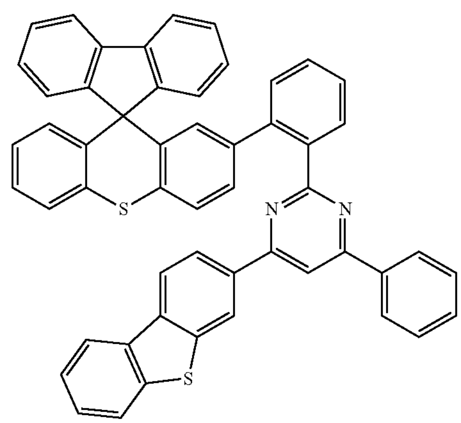
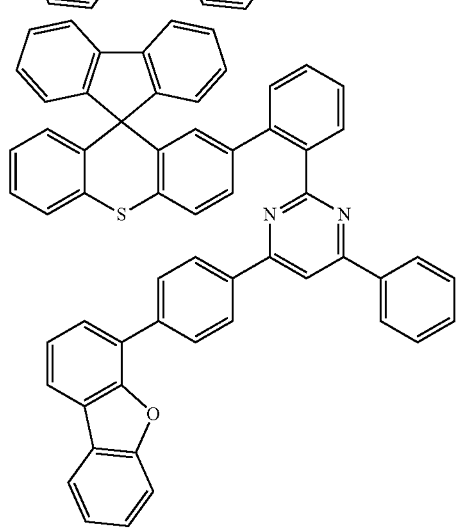
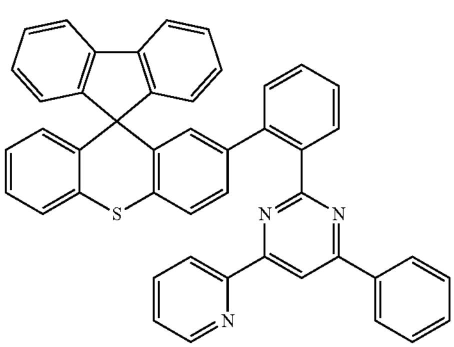

-continued
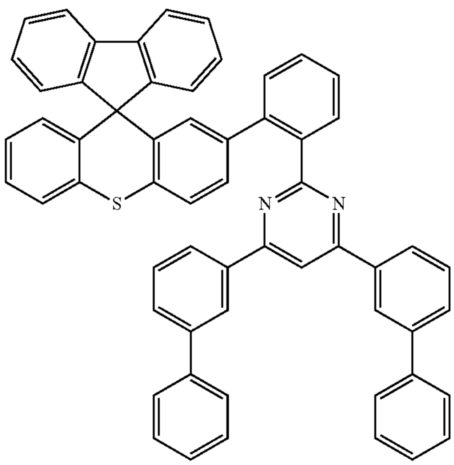
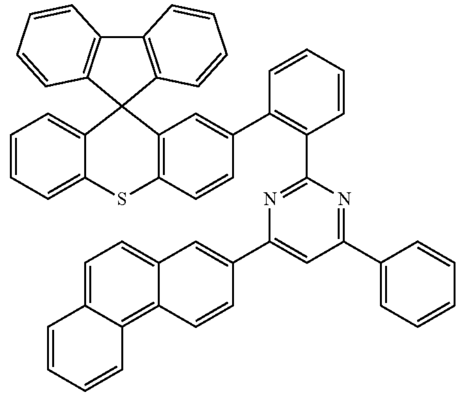
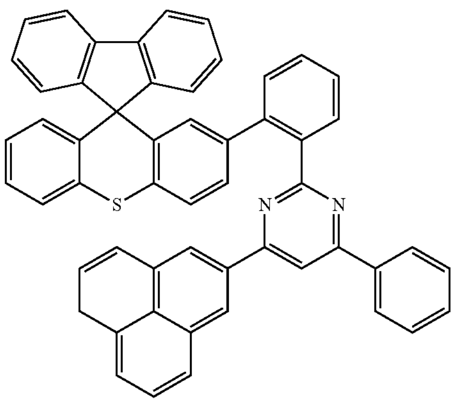
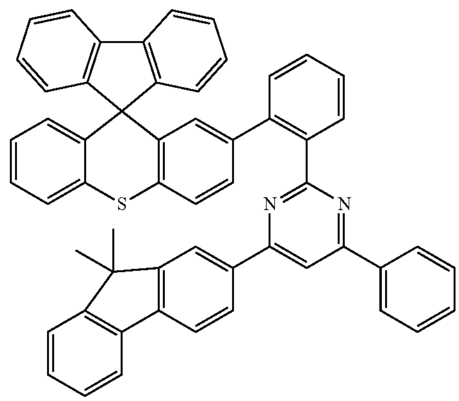
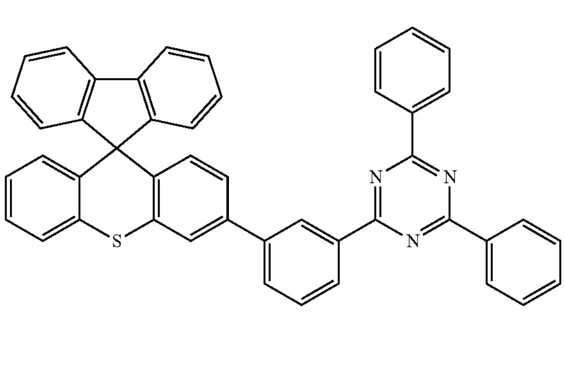
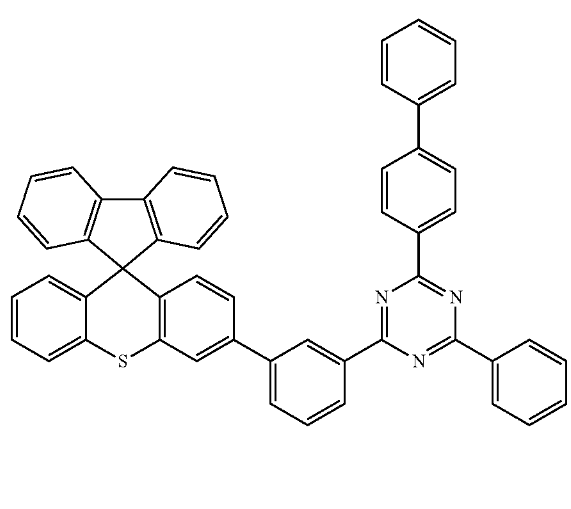

-continued
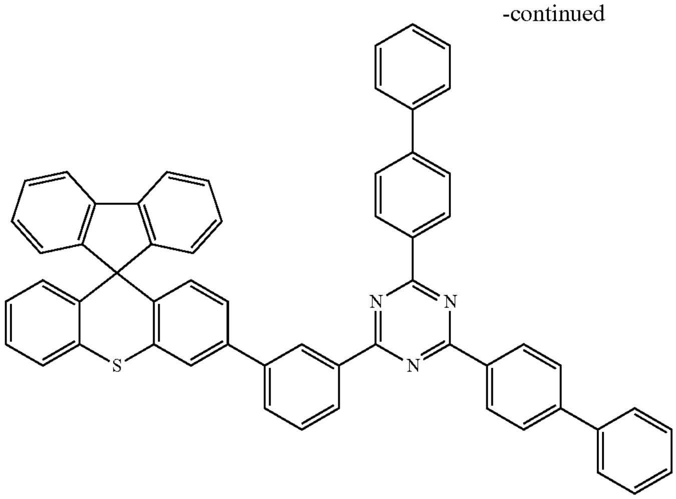
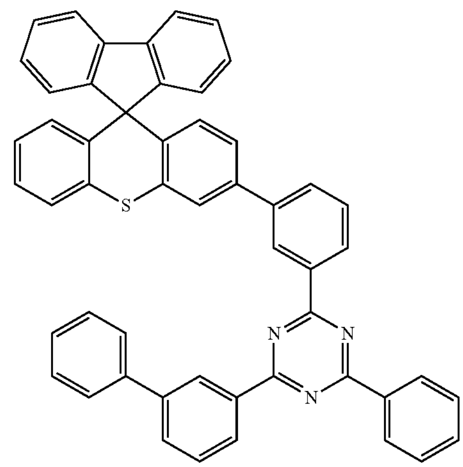
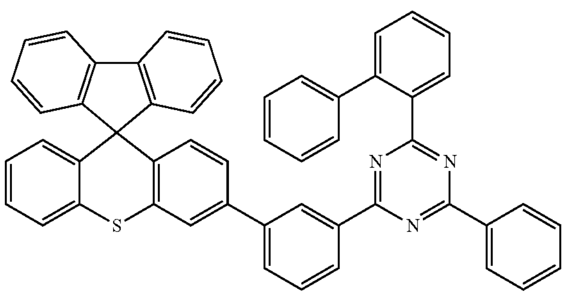
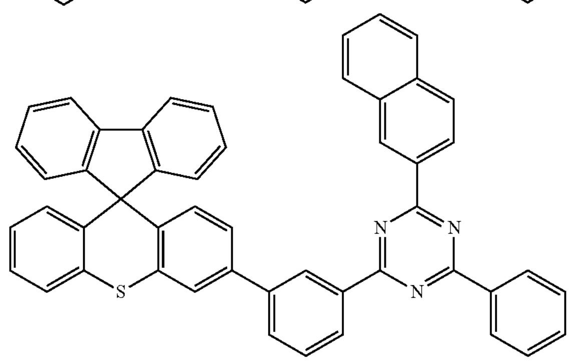
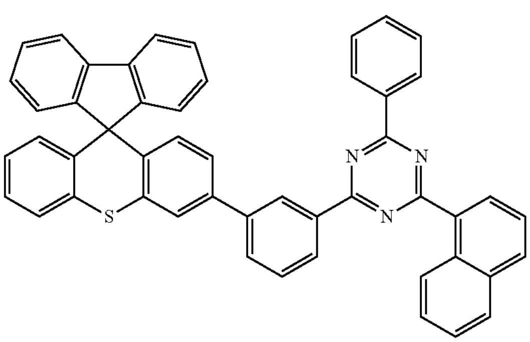
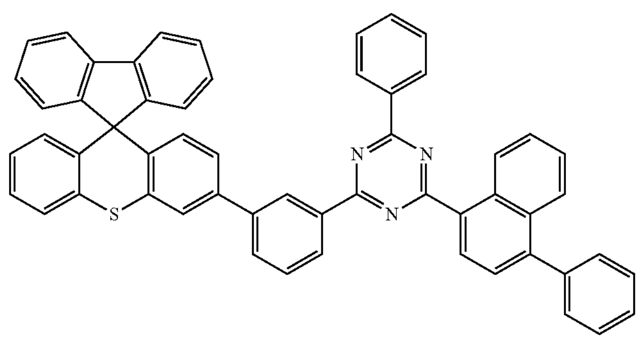
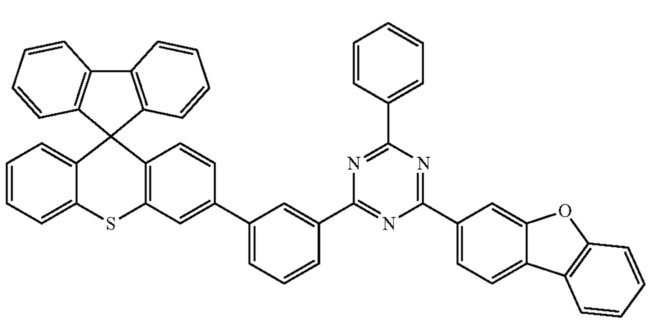
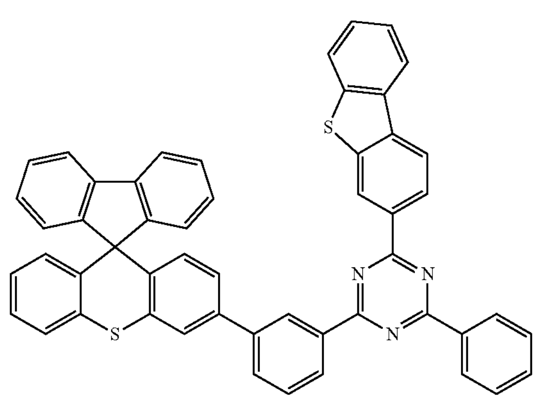

-continued
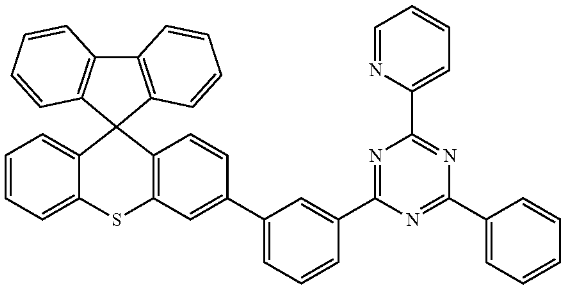
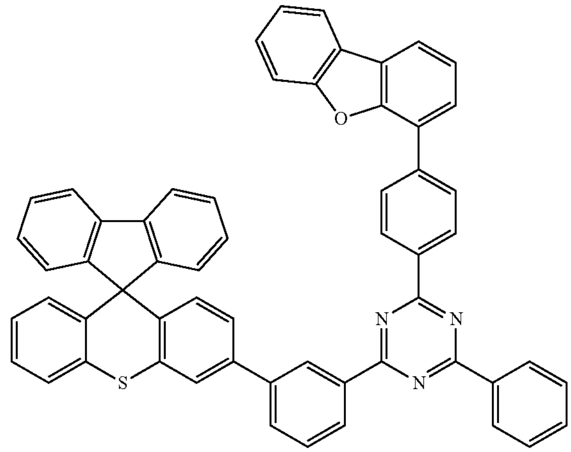
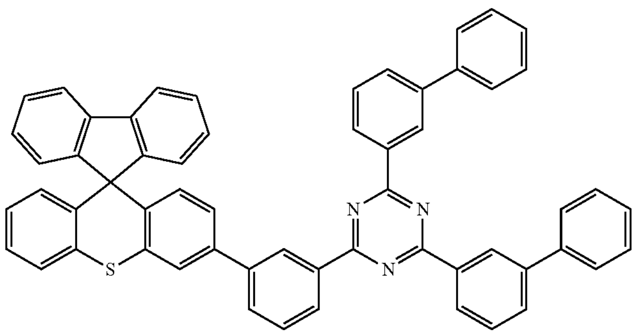
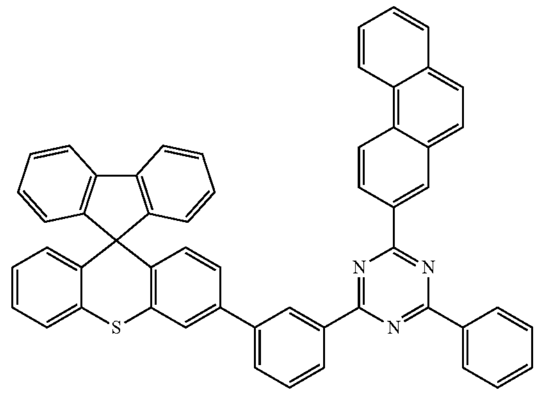
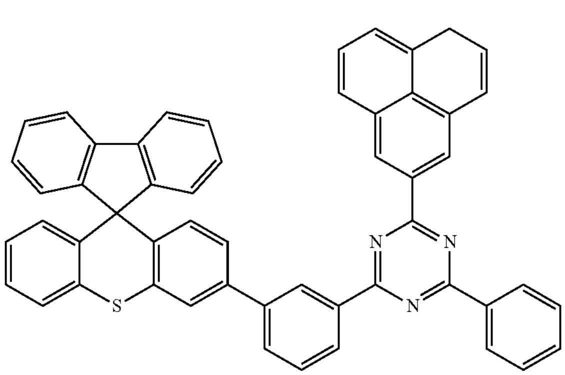
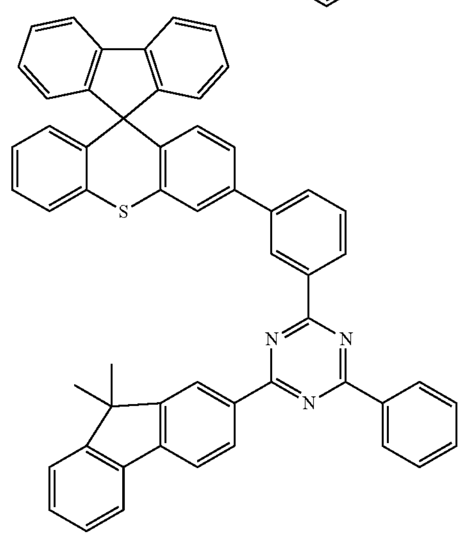
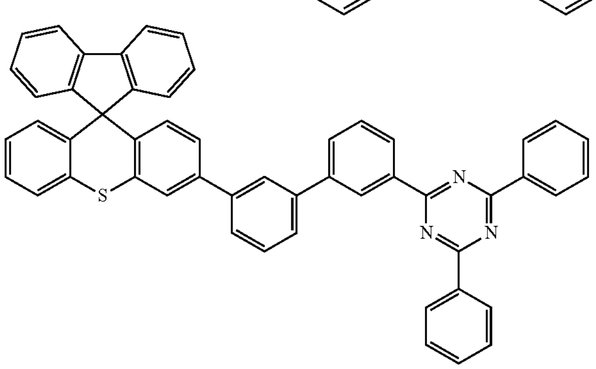
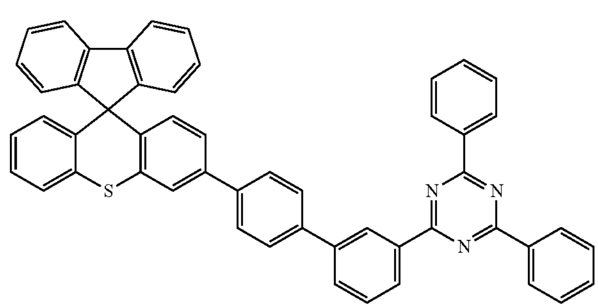

-continued
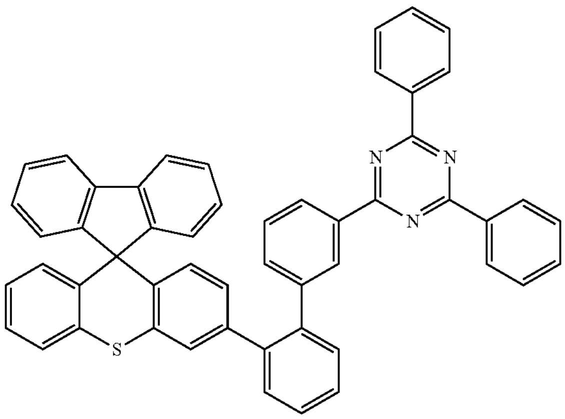
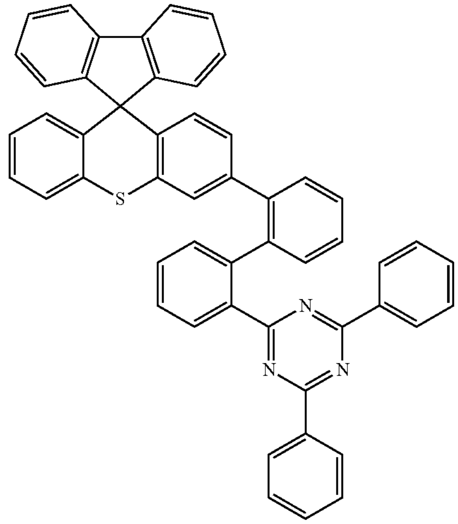
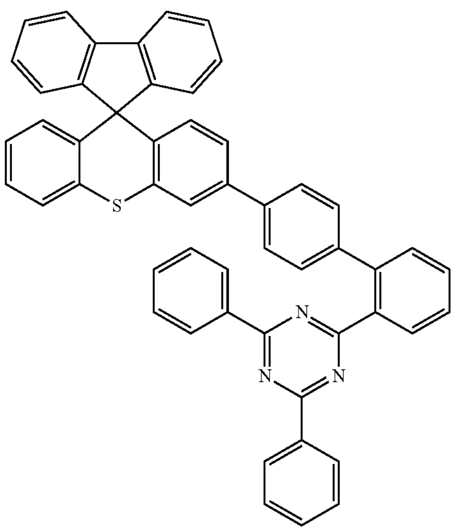
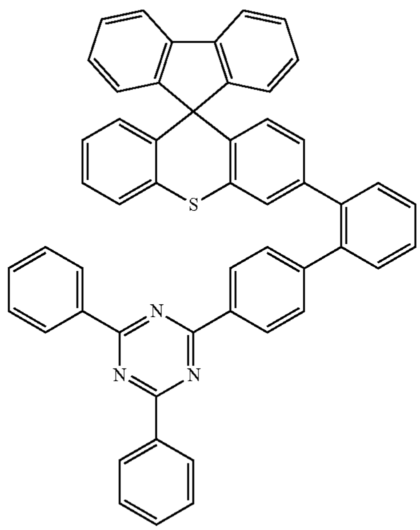
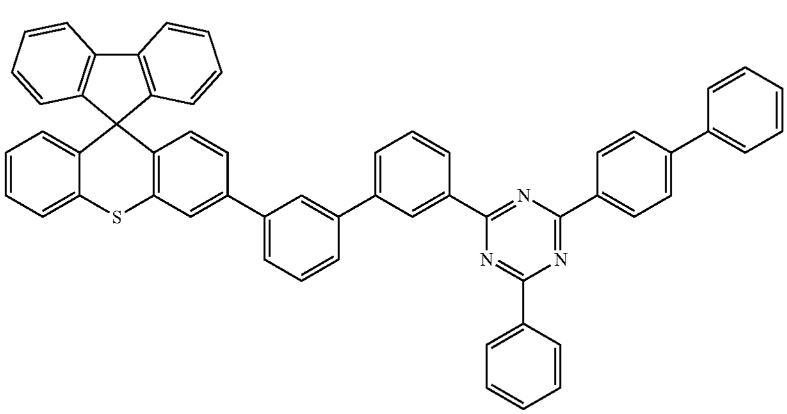

-continued
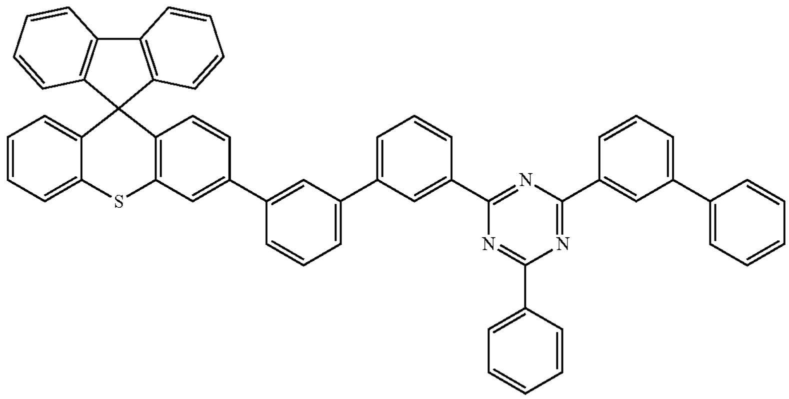
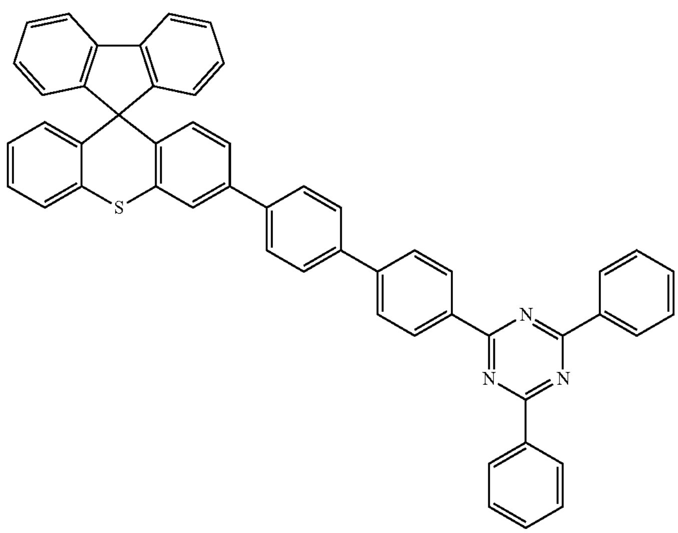
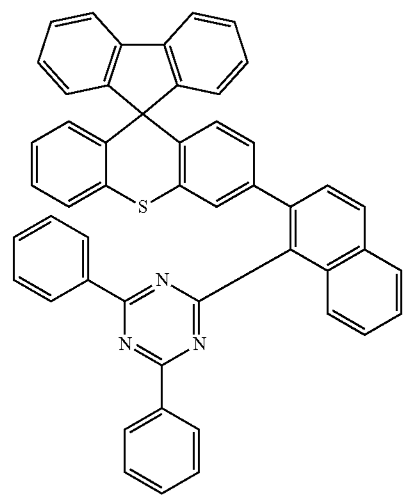
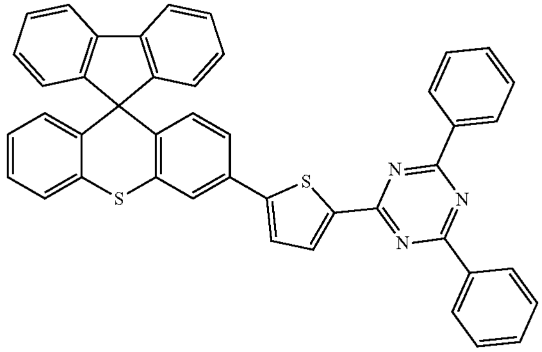
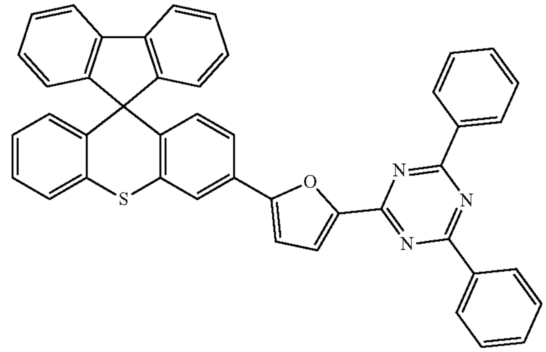

-continued
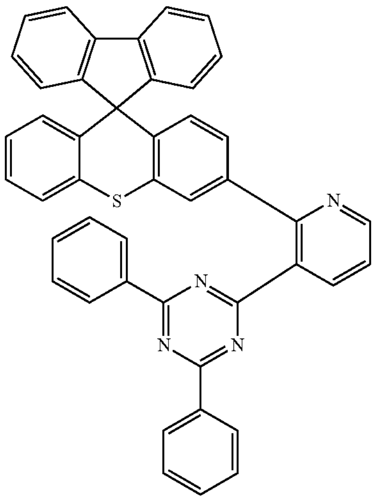
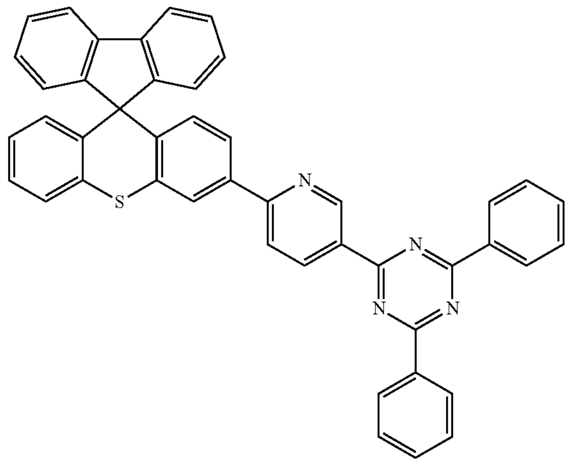
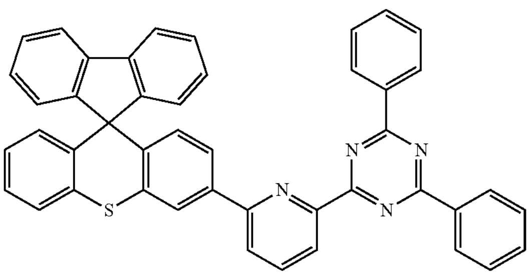
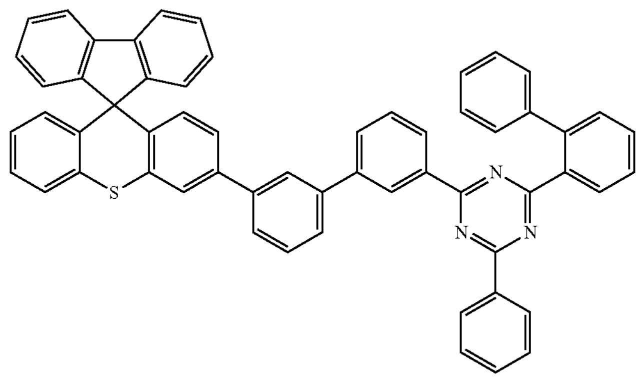
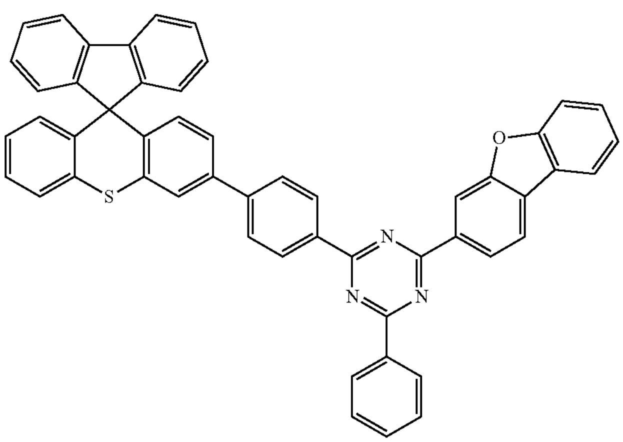
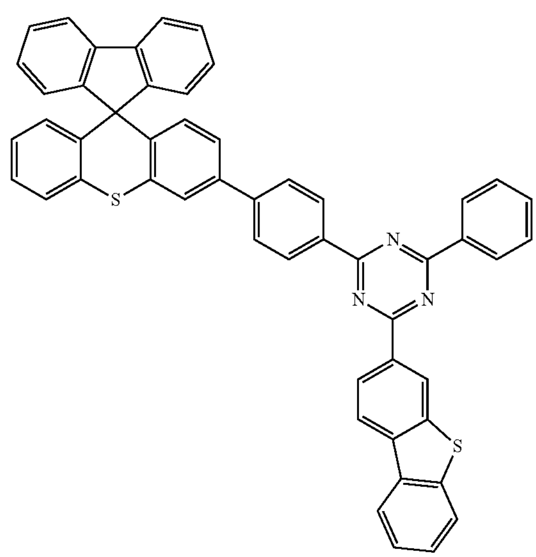

-continued
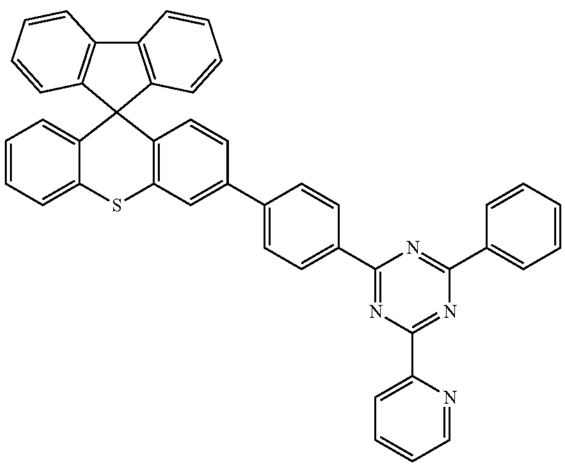
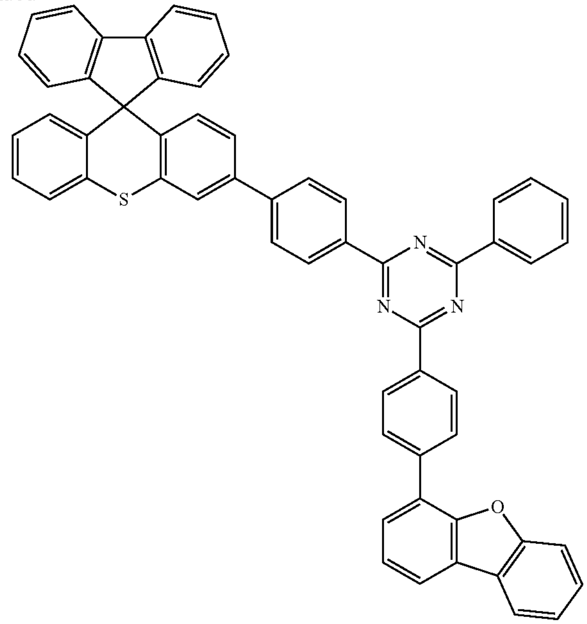
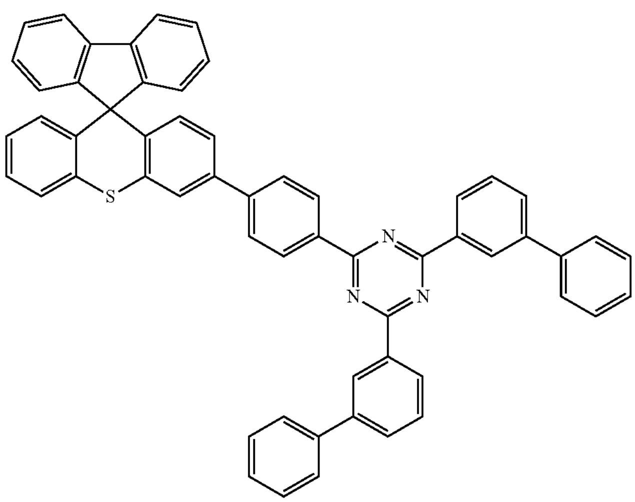
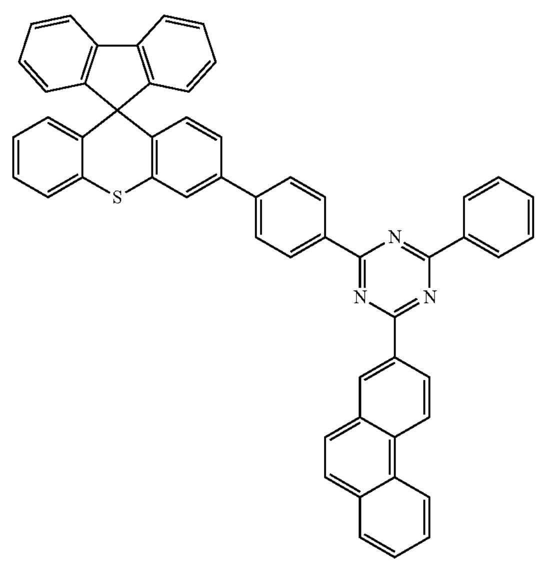

-continued
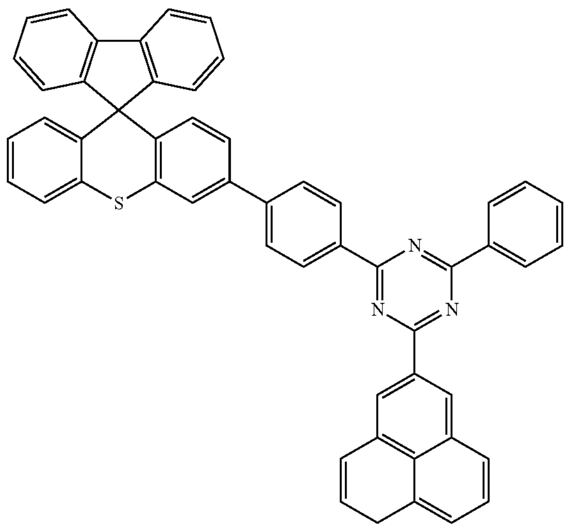
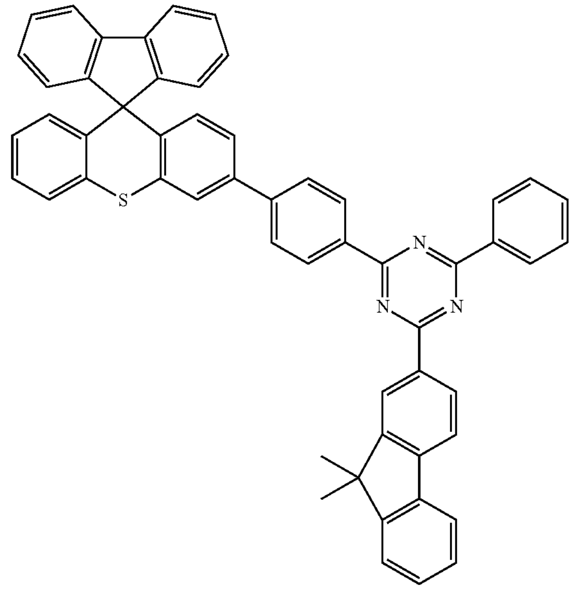
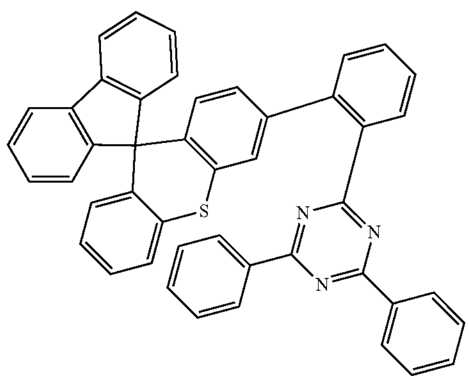
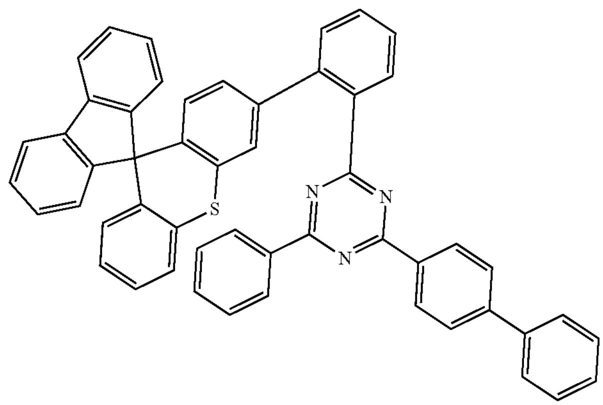
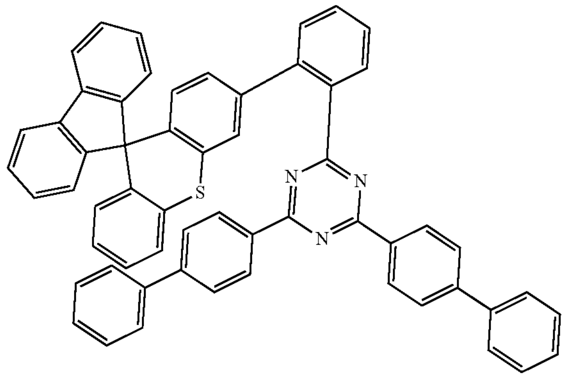
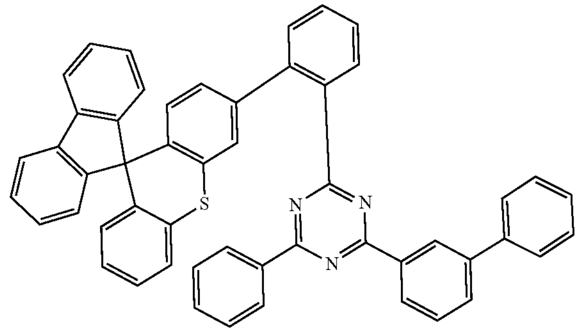

-continued
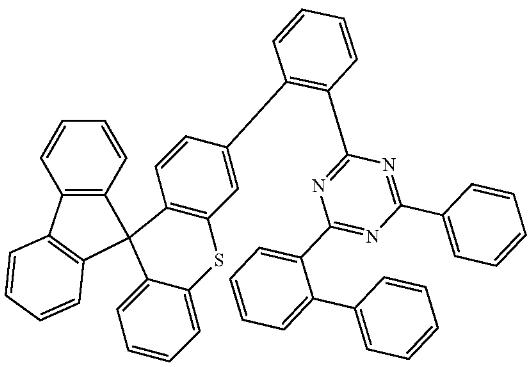
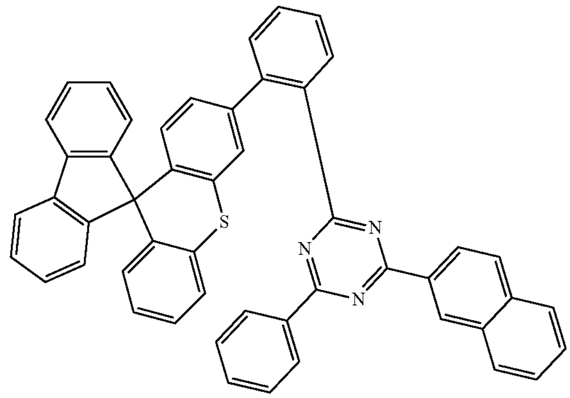
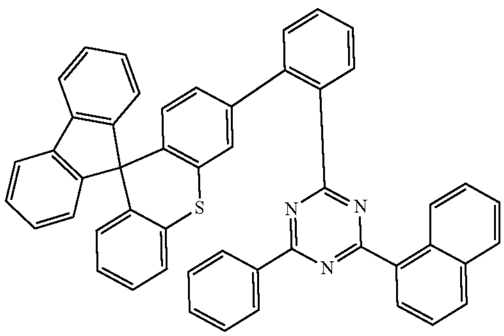
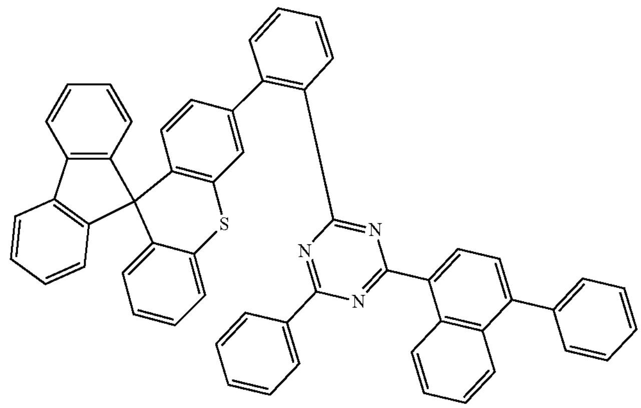
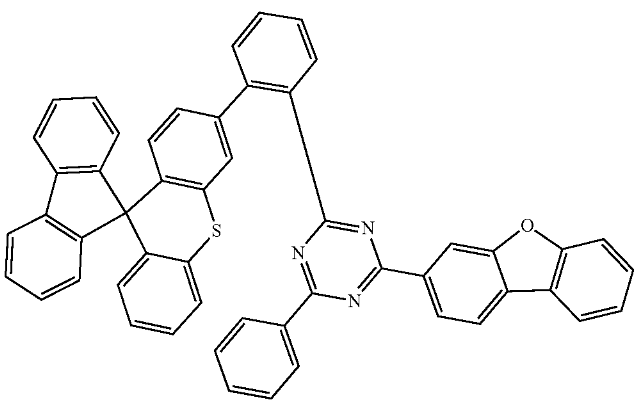
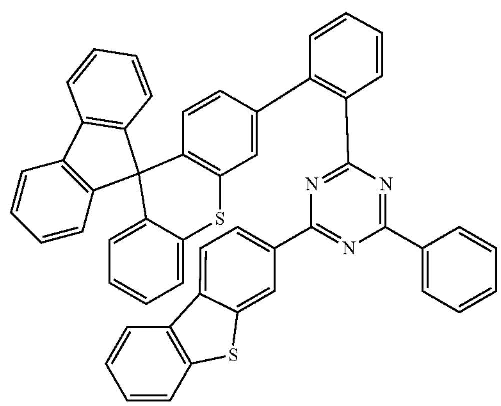
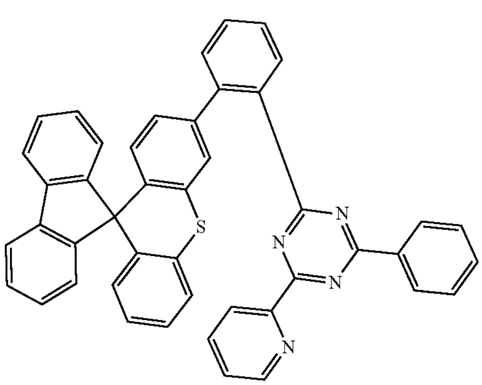
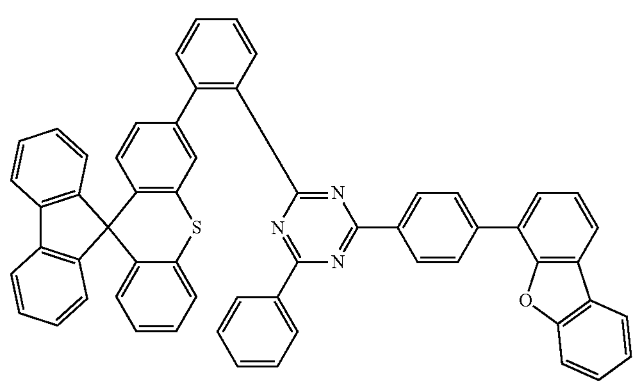

-continued
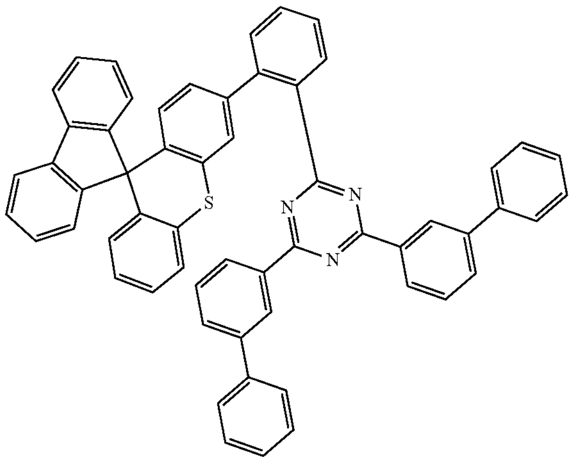
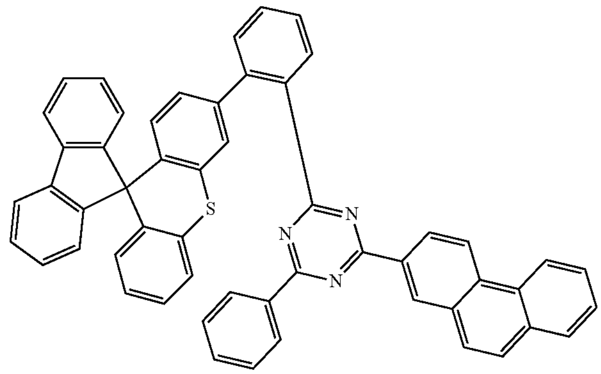
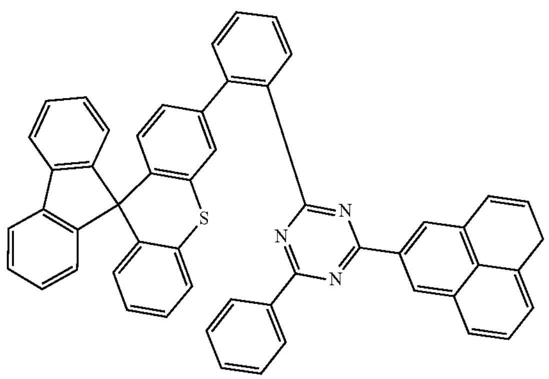
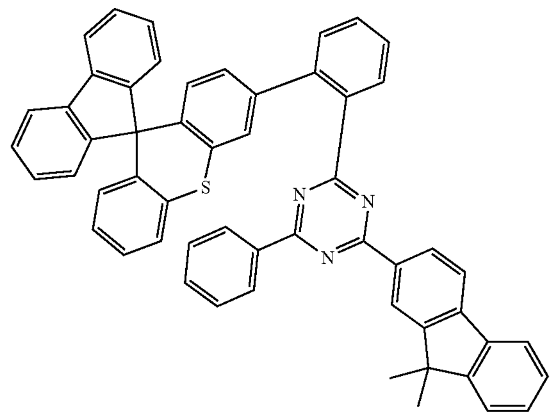
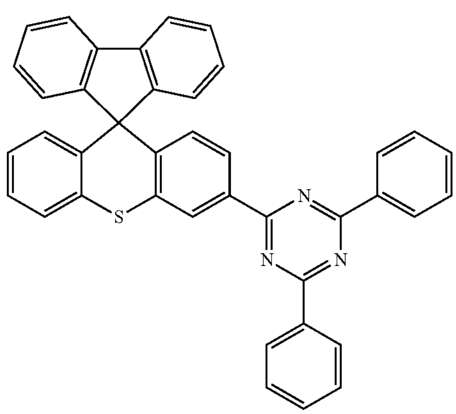
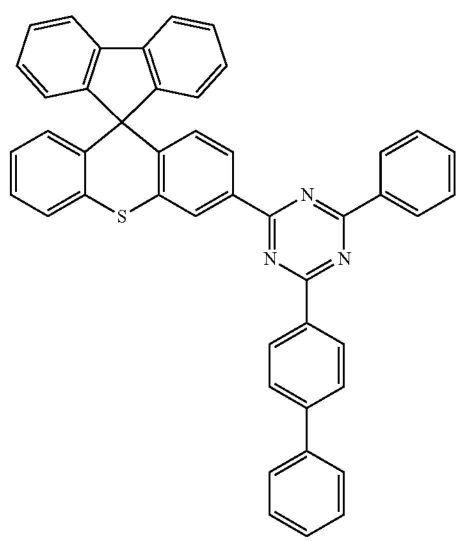

-continued
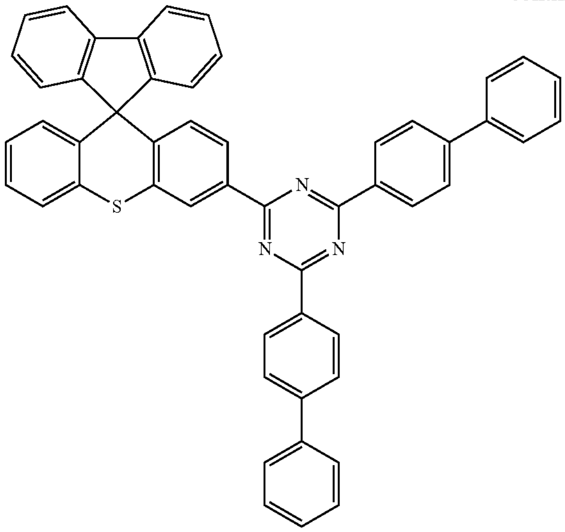
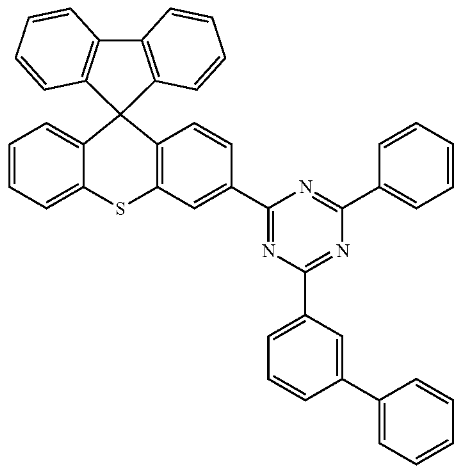
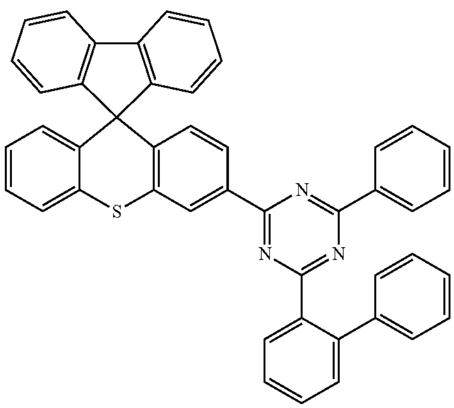
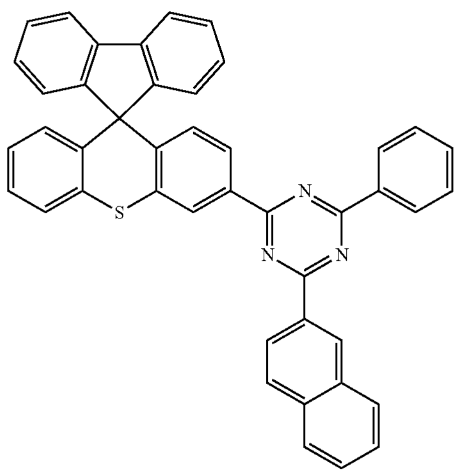
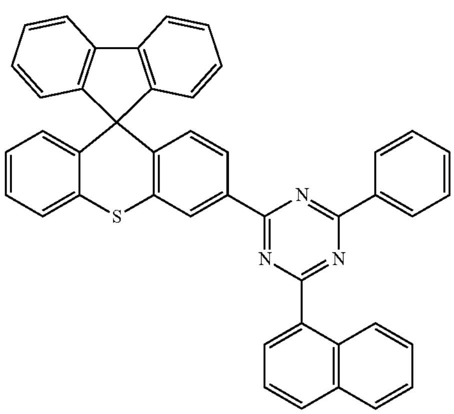
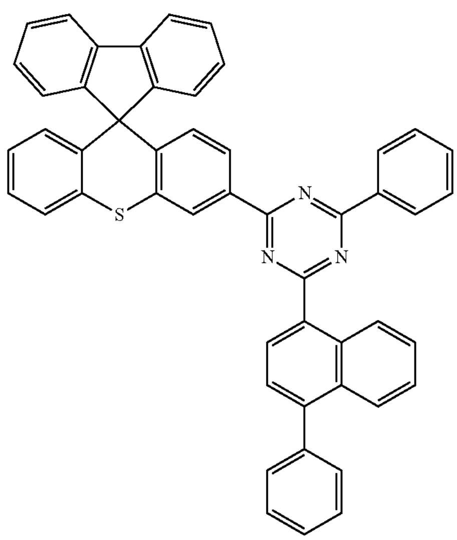

-continued
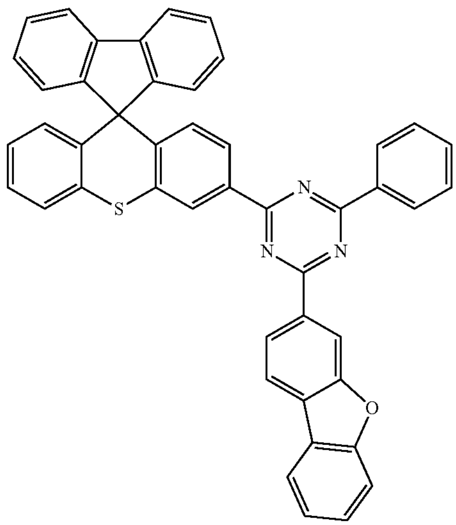
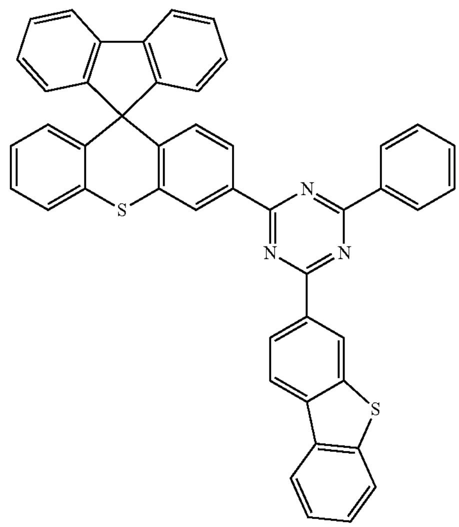
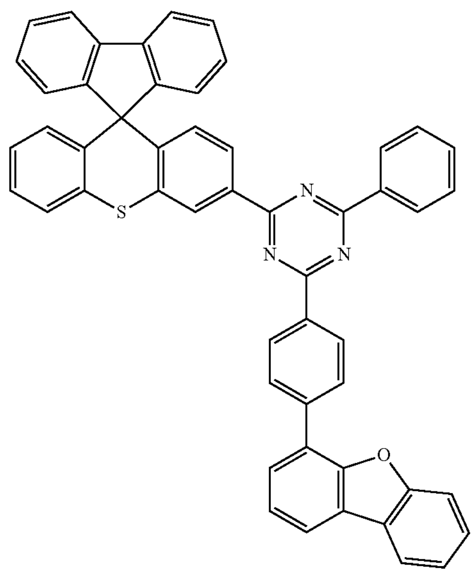
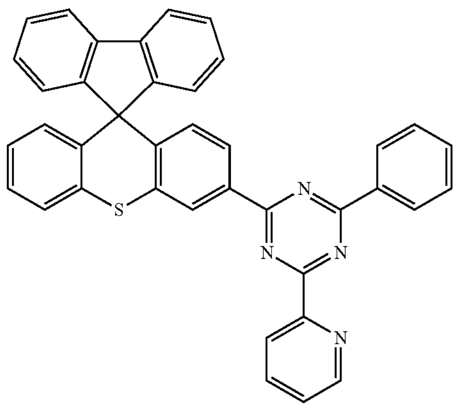
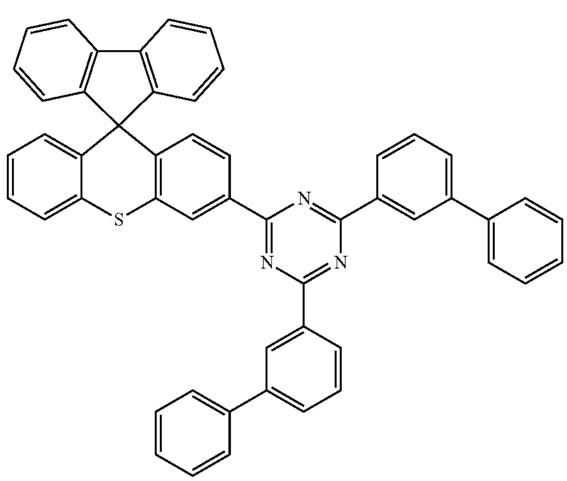
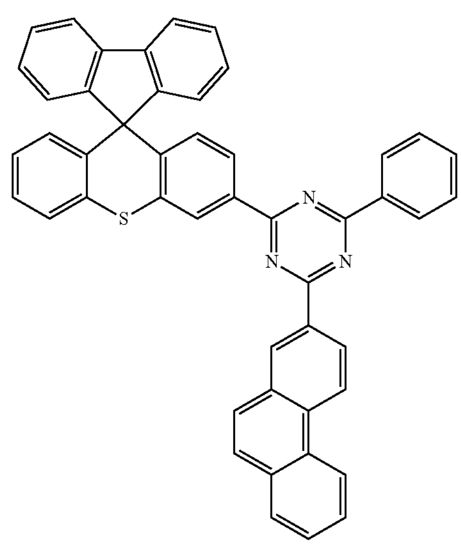

-continued
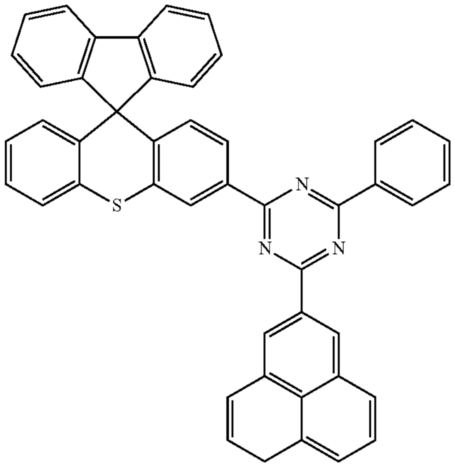
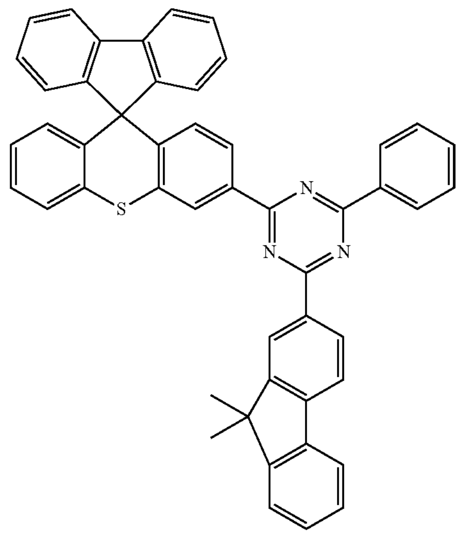
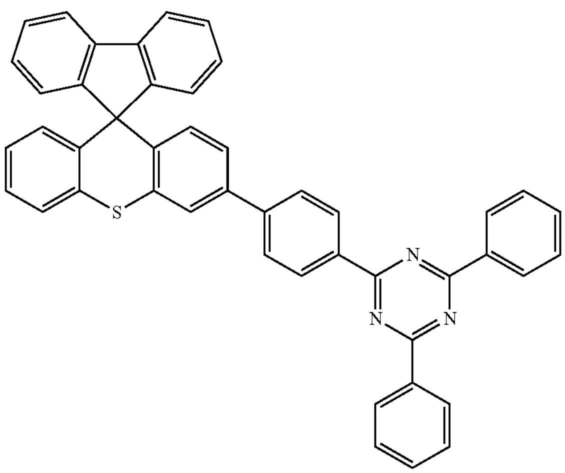
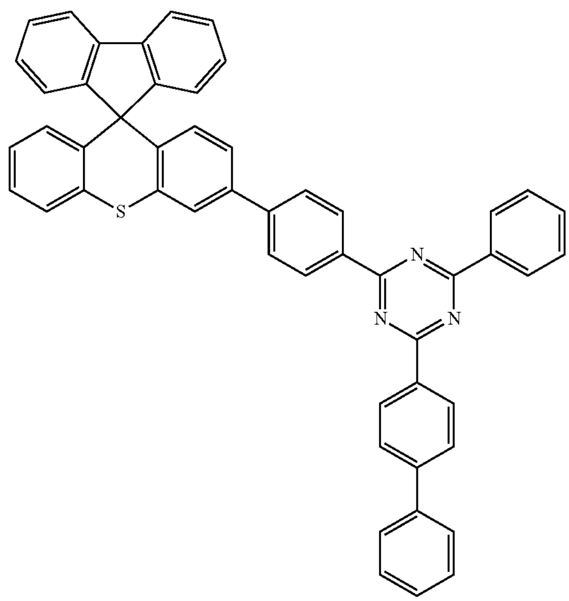
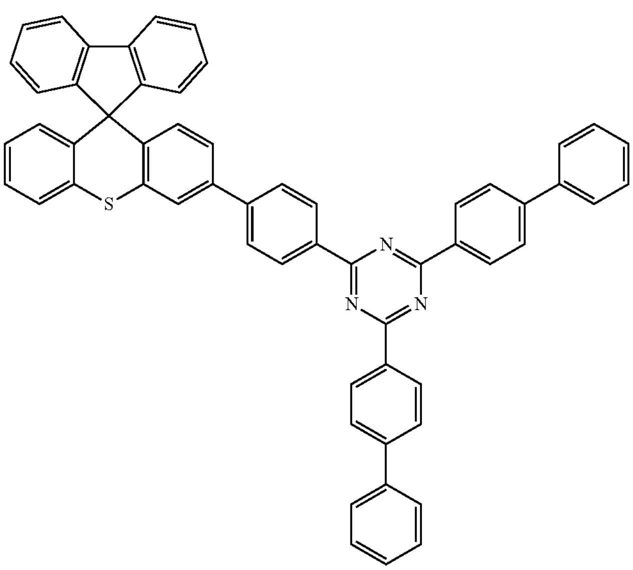
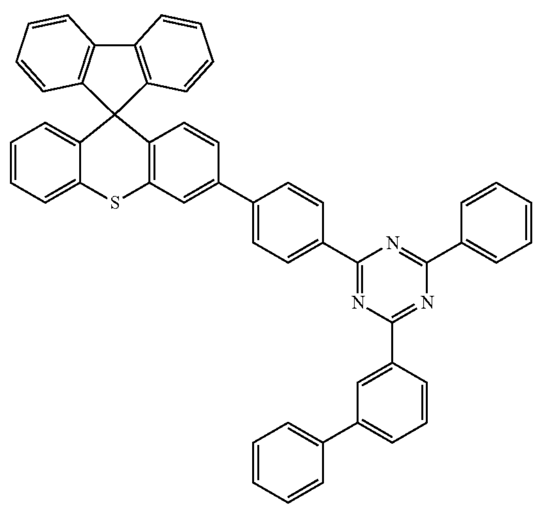

-continued
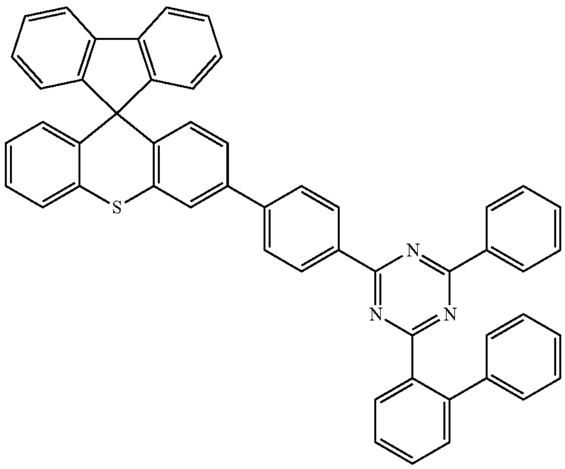
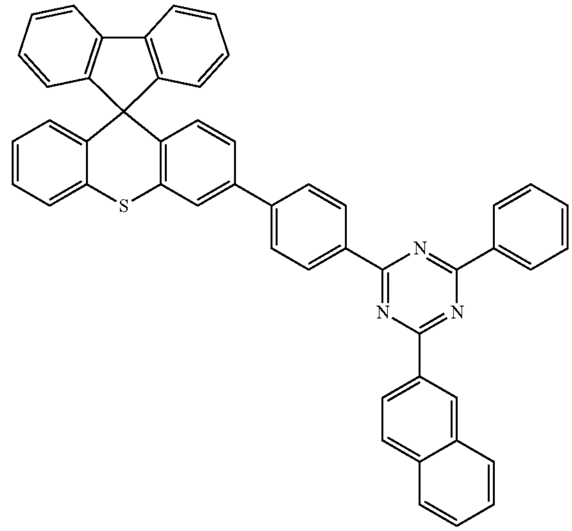
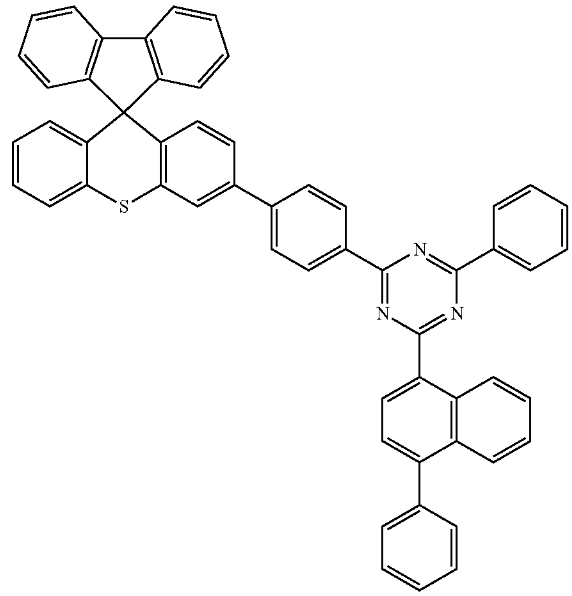
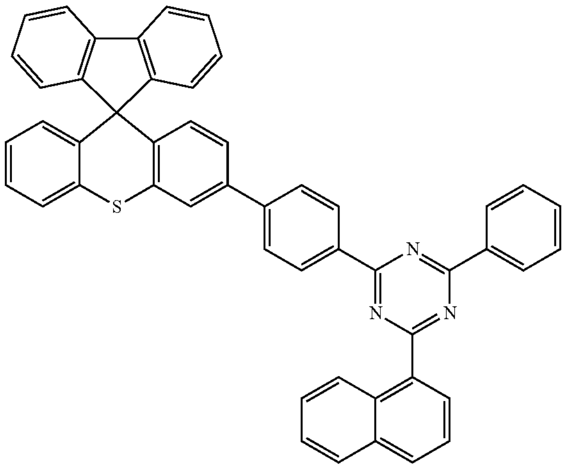
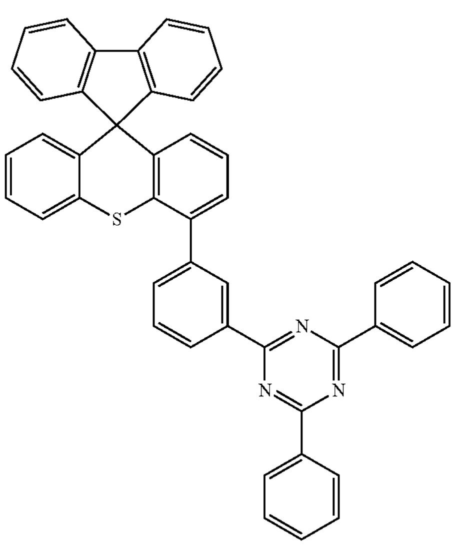
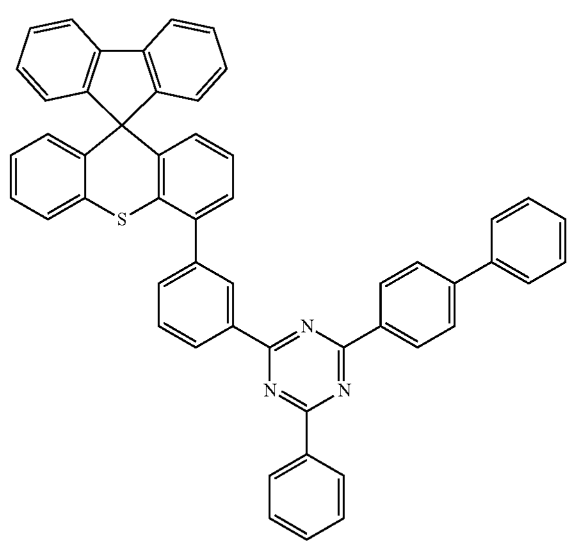

-continued
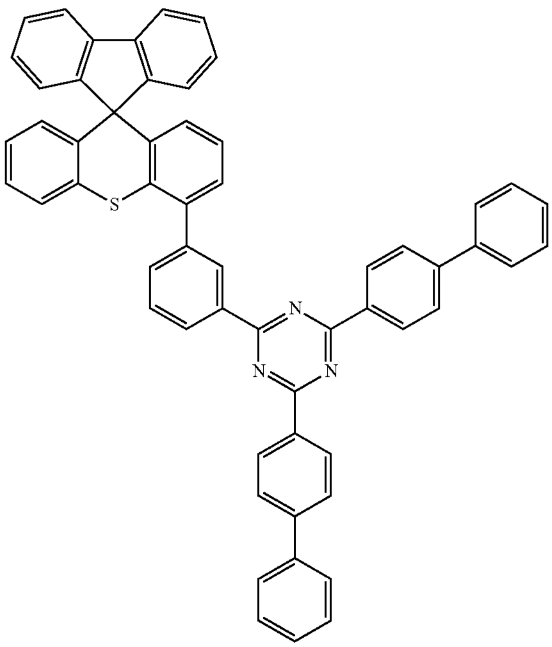
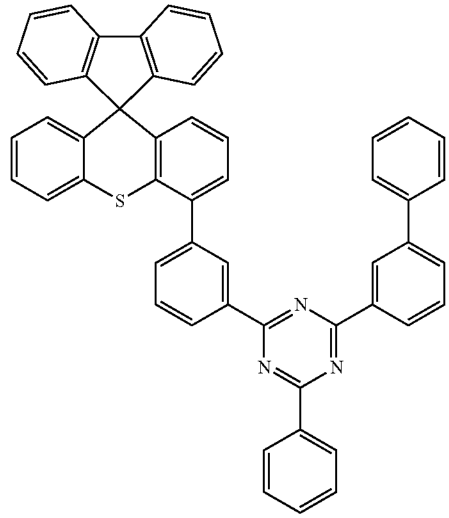
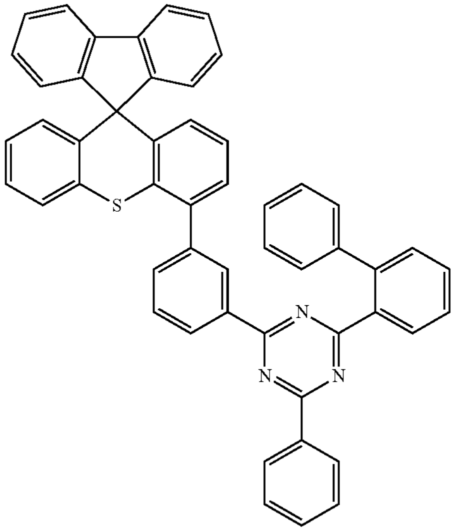
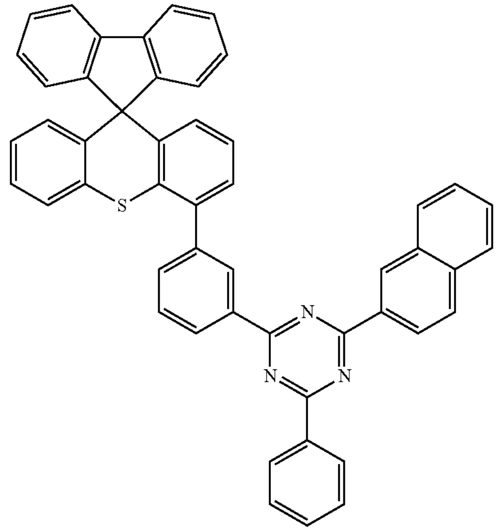

-continued
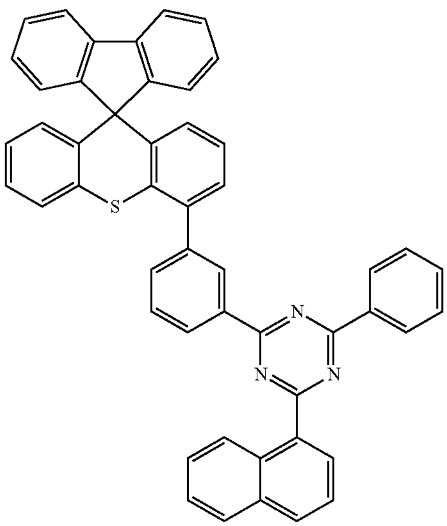
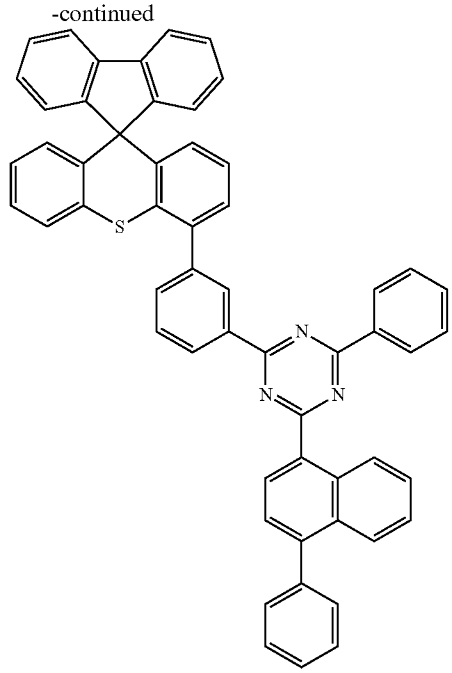
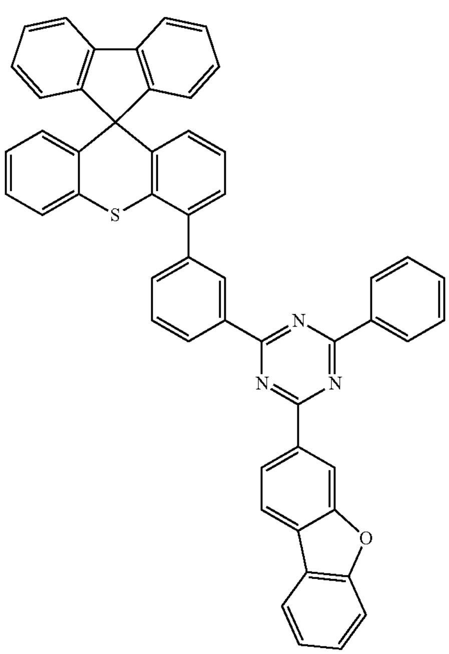
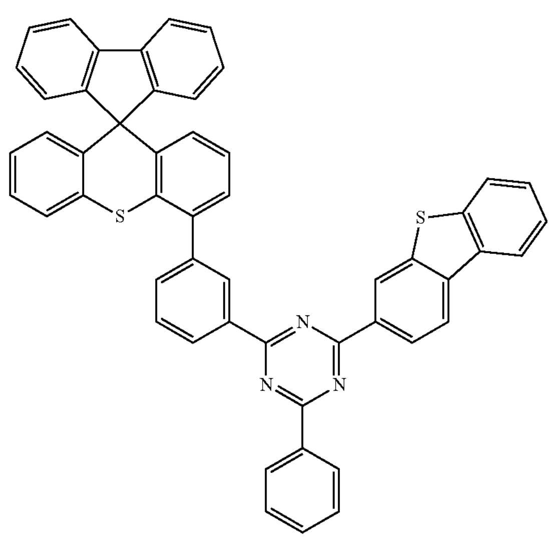

-continued
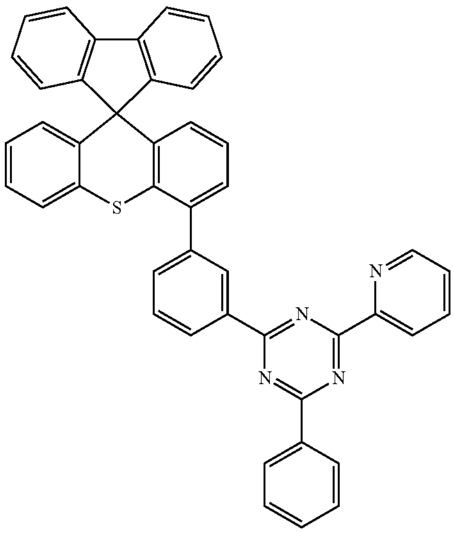
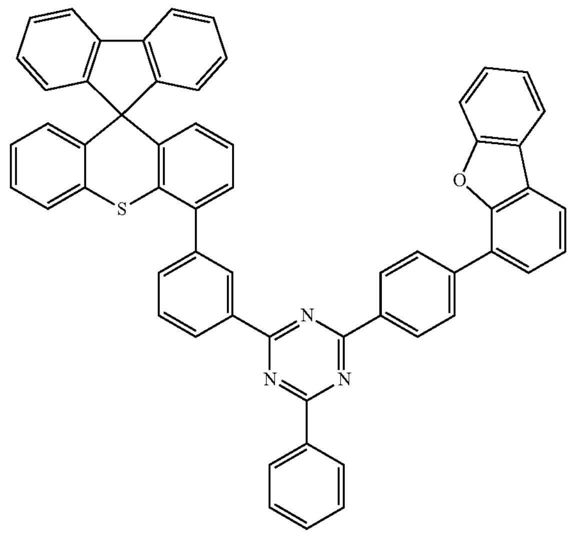
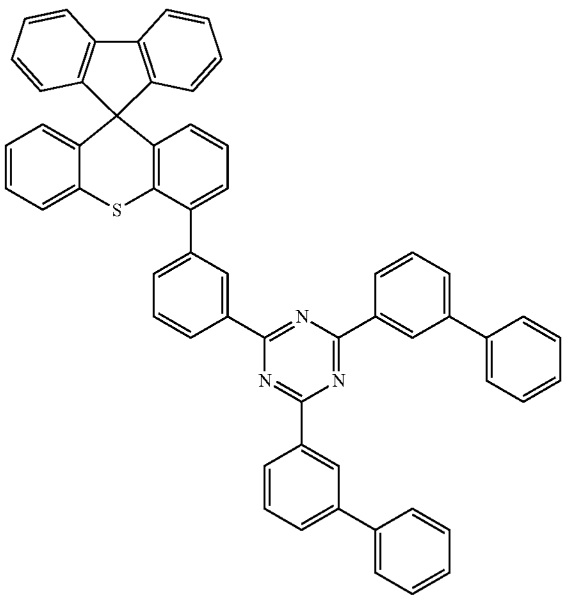
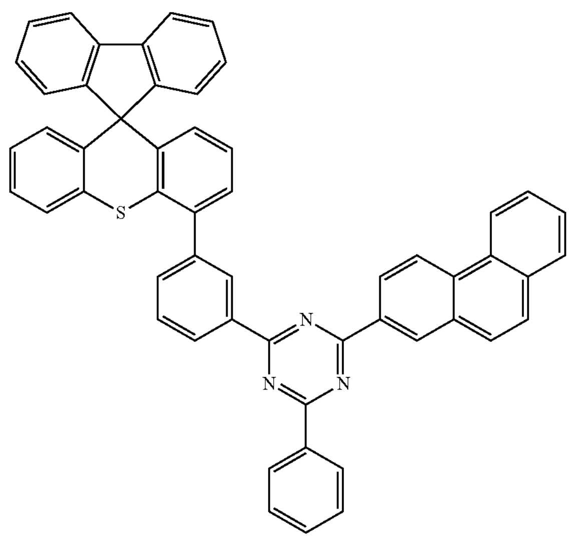
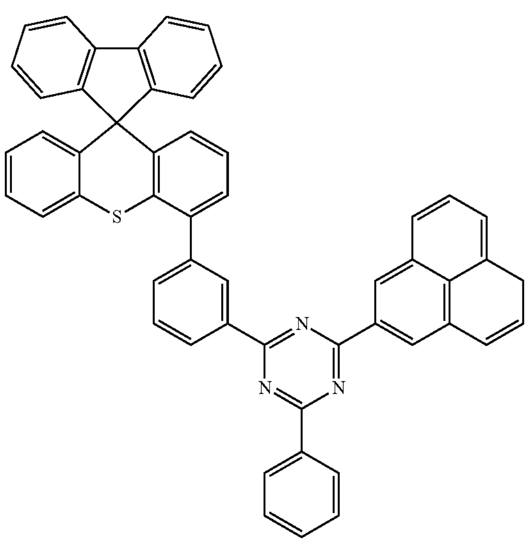
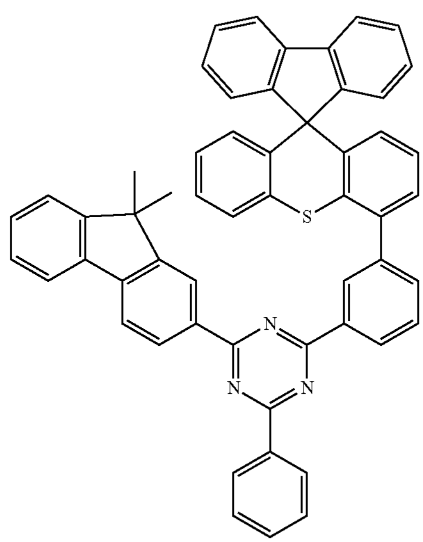

-continued
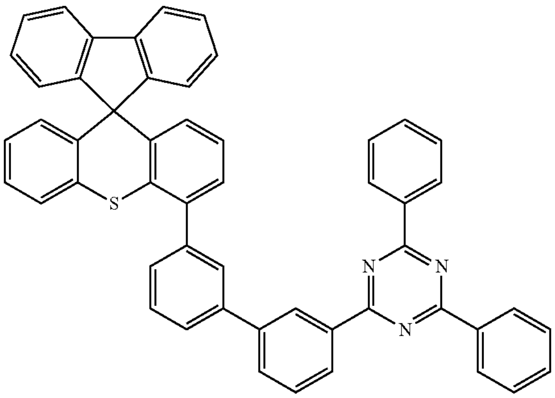
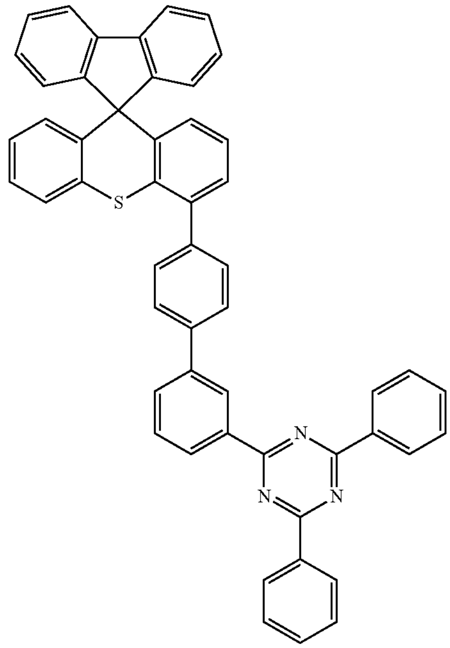
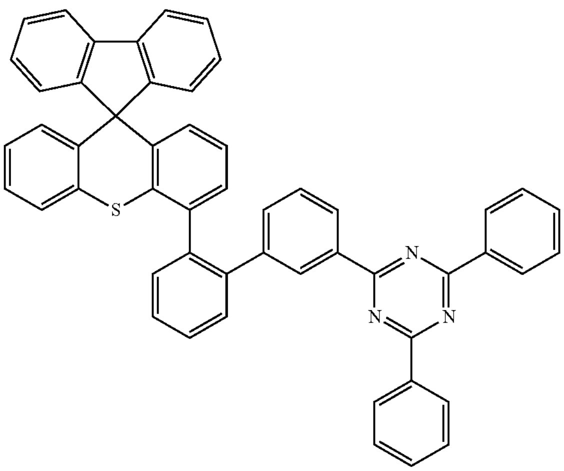
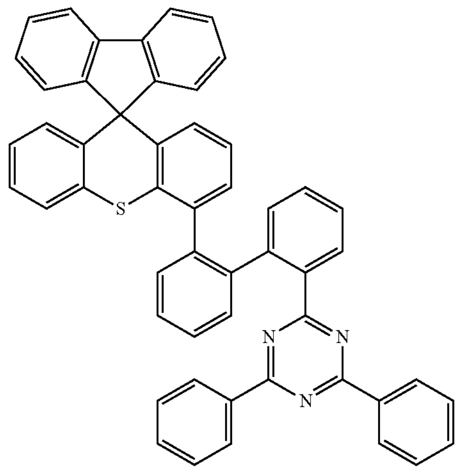
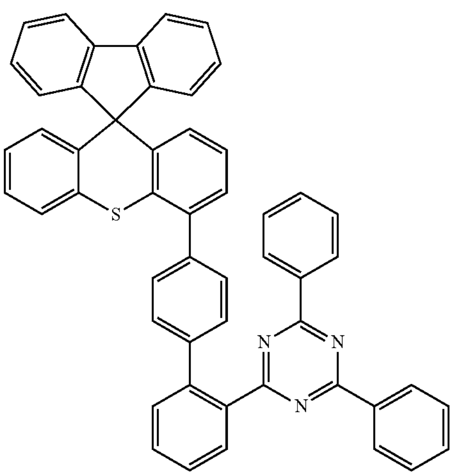
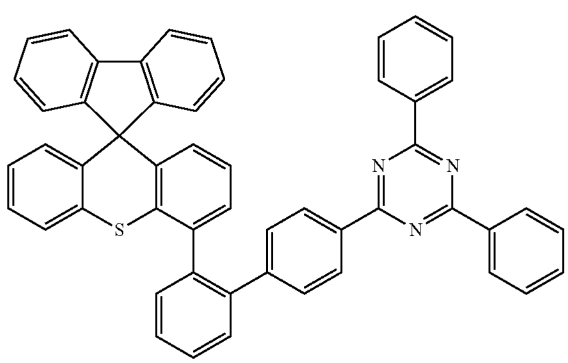

-continued
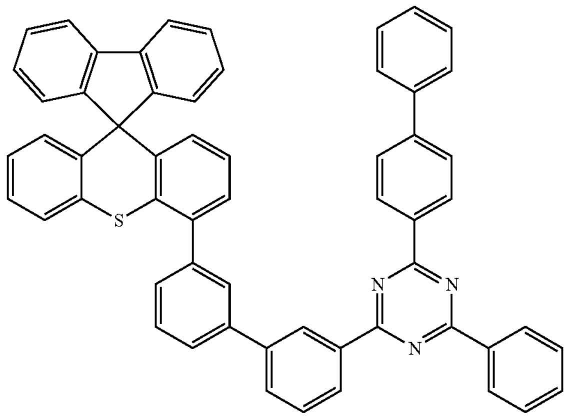
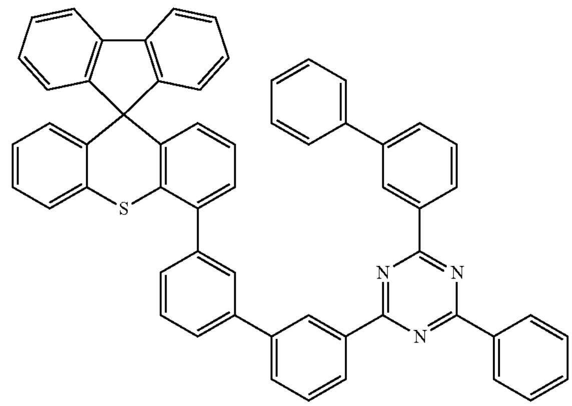
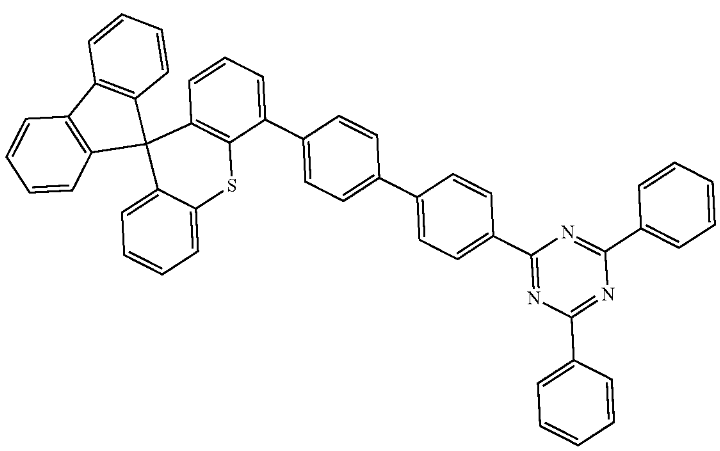
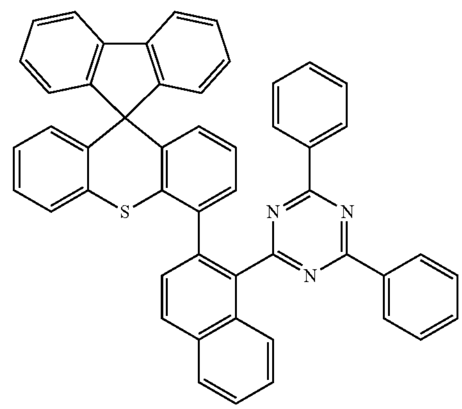
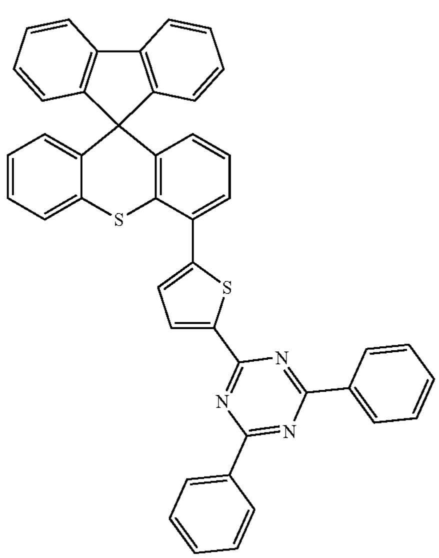
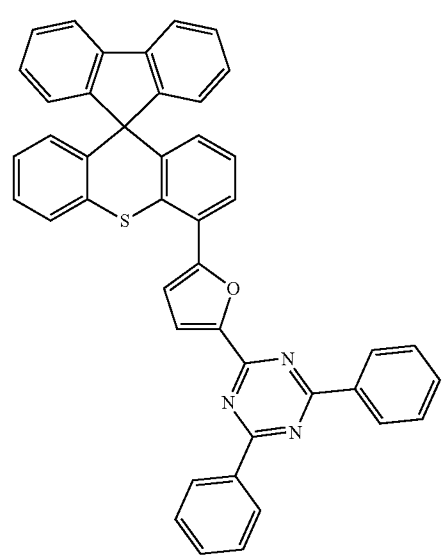

-continued
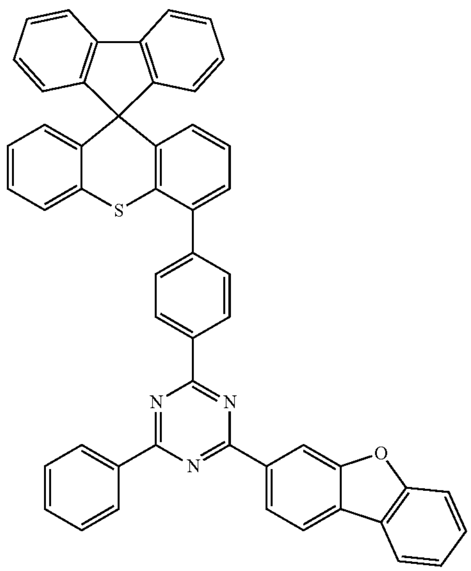
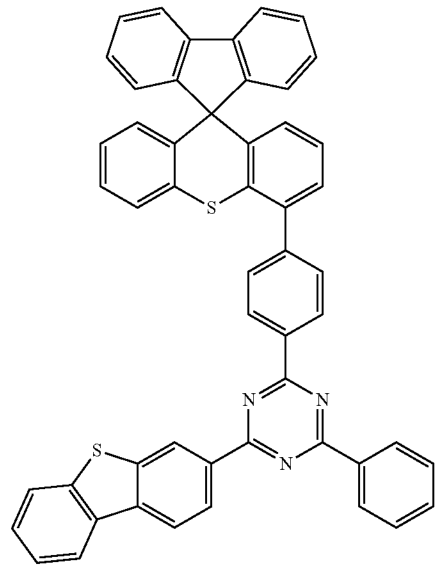
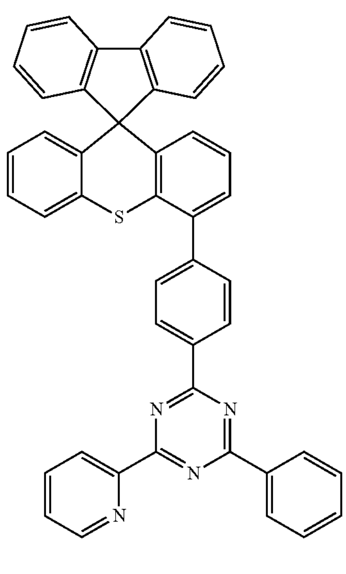
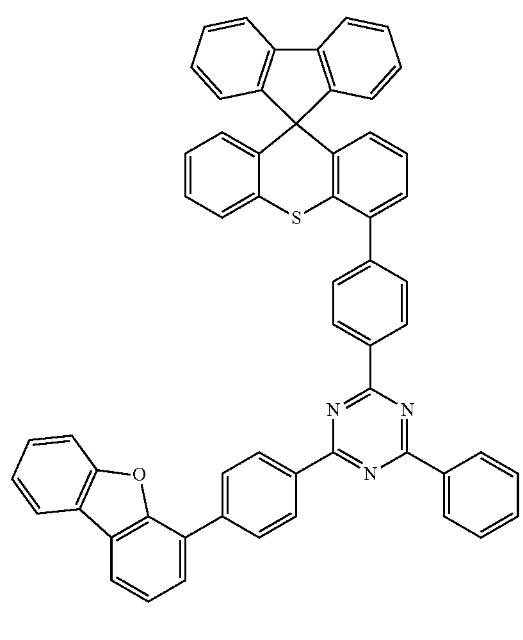

-continued
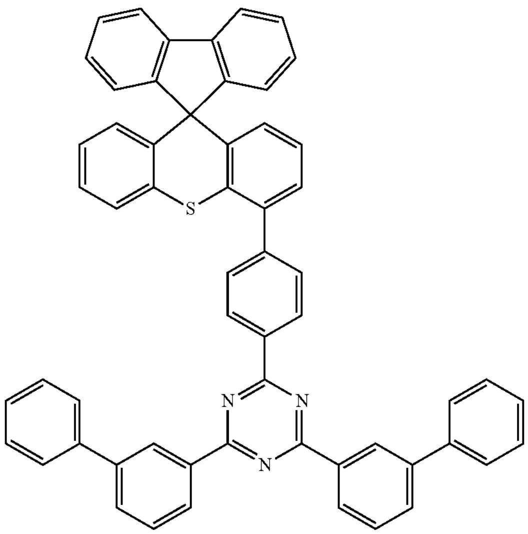
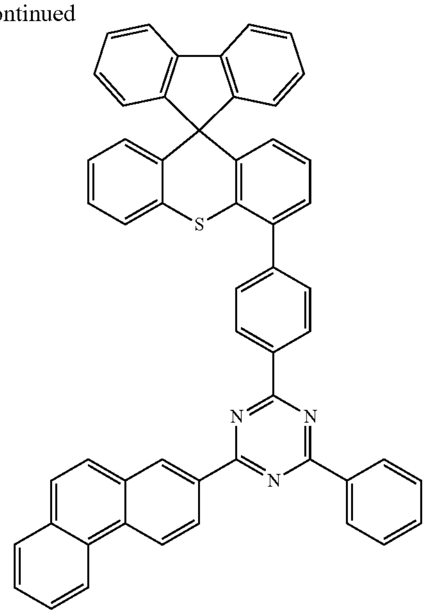
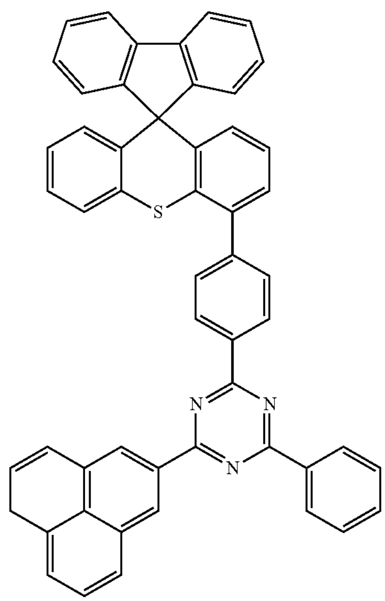
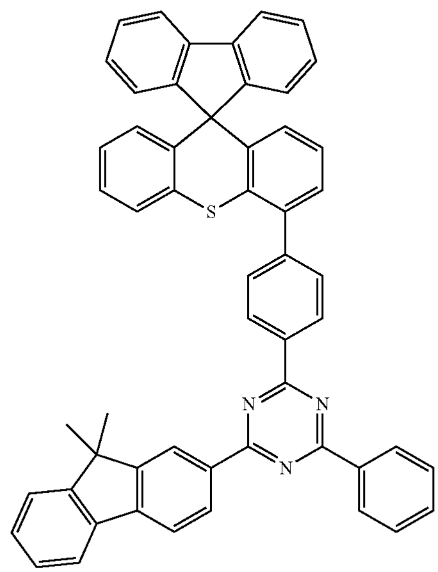
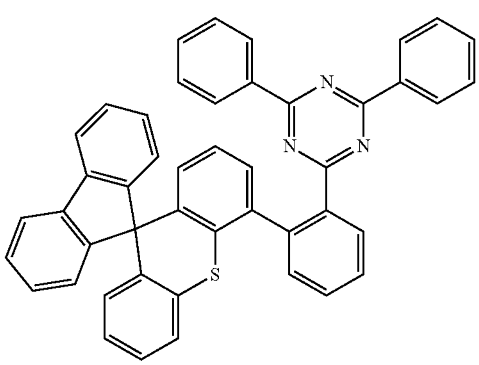
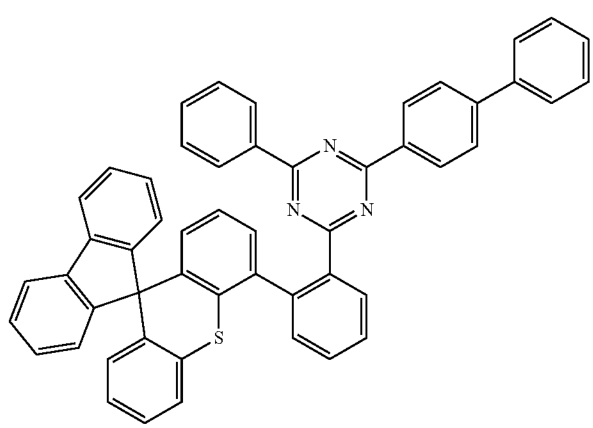

-continued
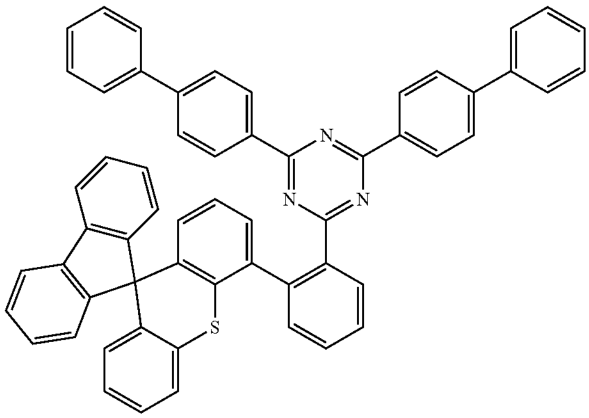
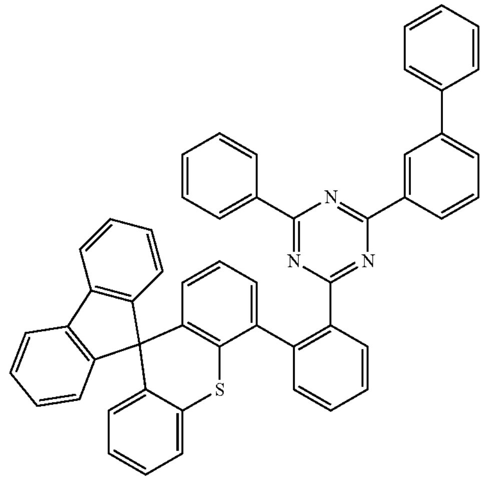
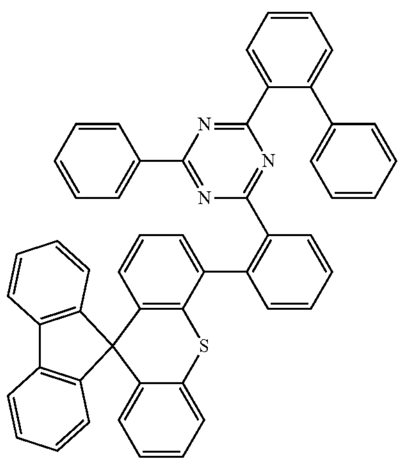
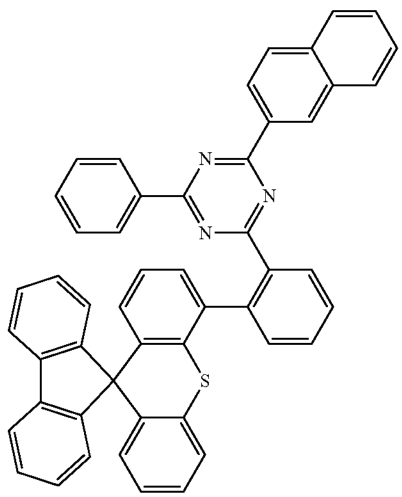
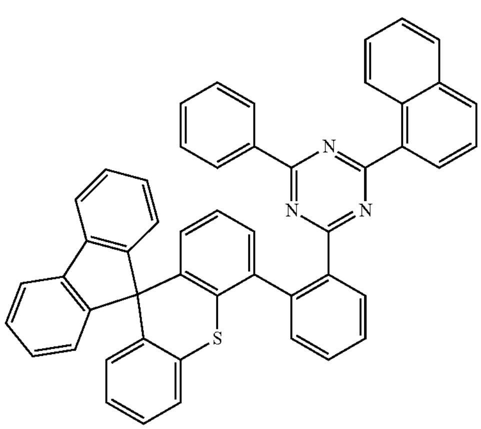
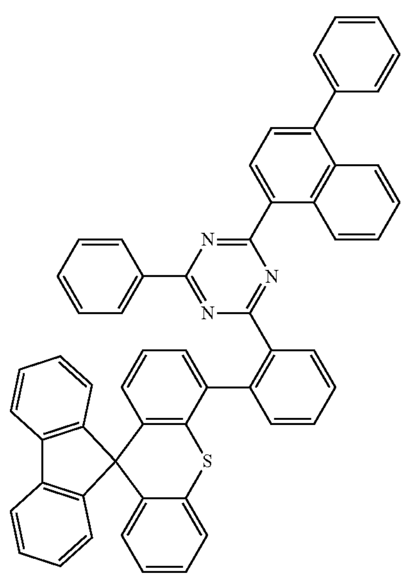

-continued
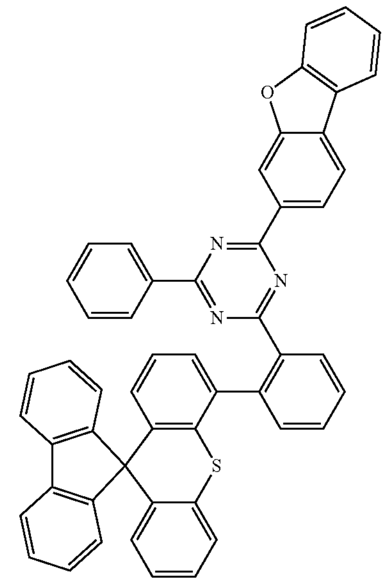
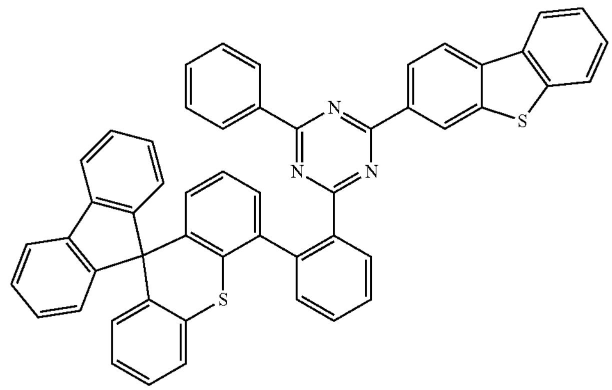
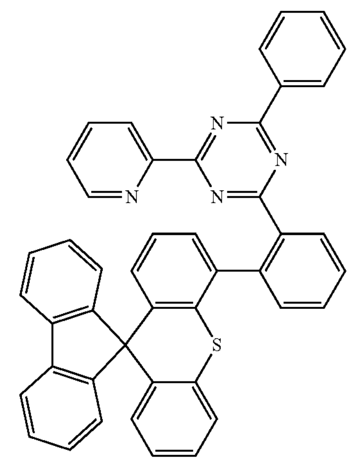
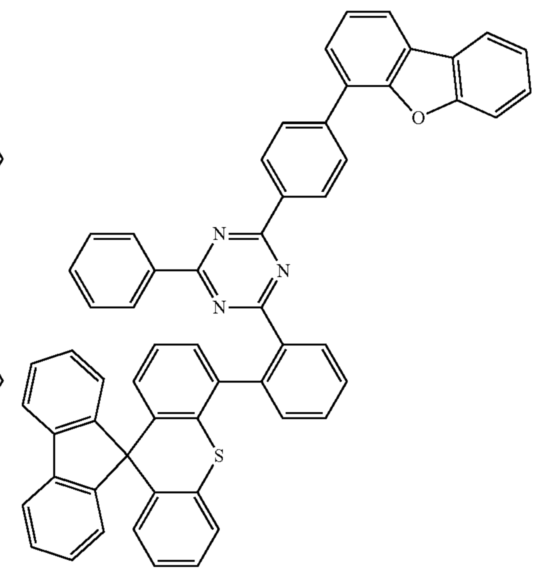
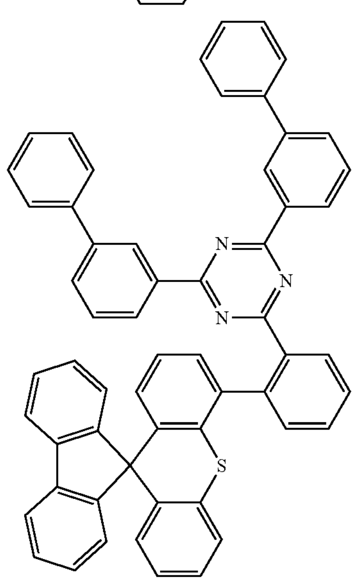
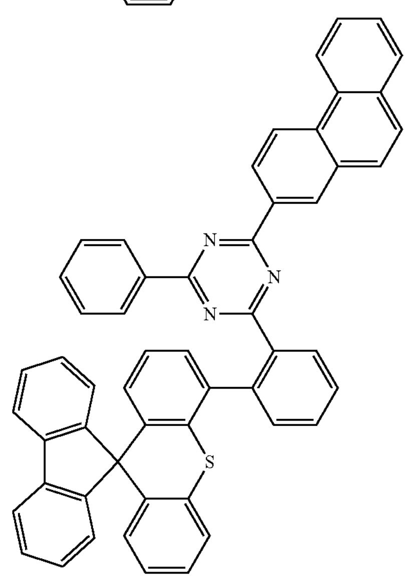

-continued
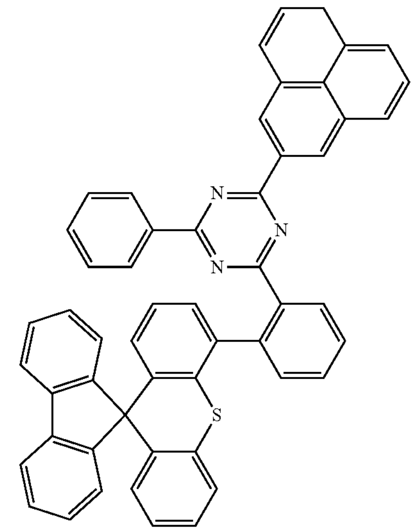
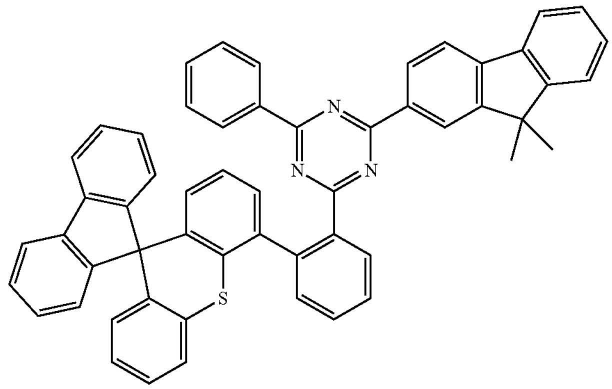
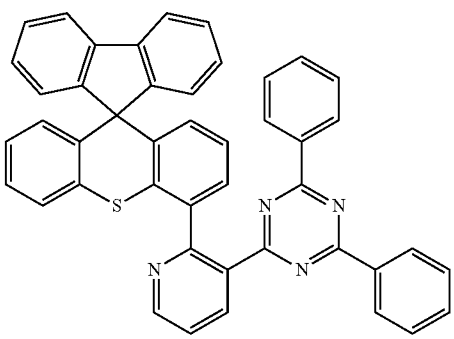
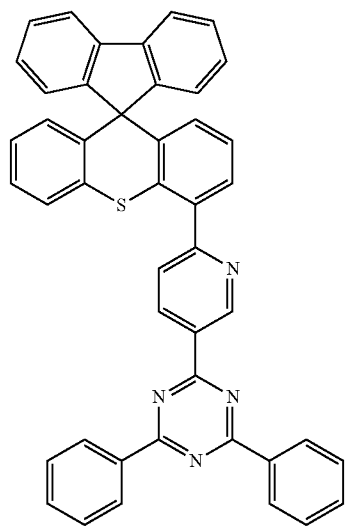
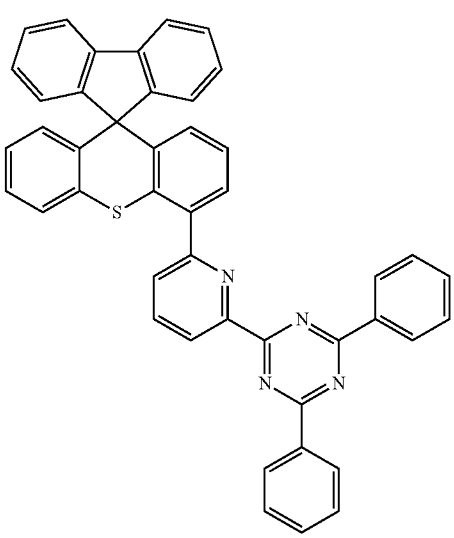
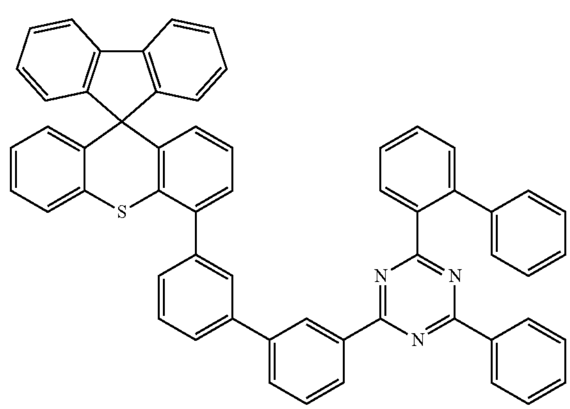

-continued
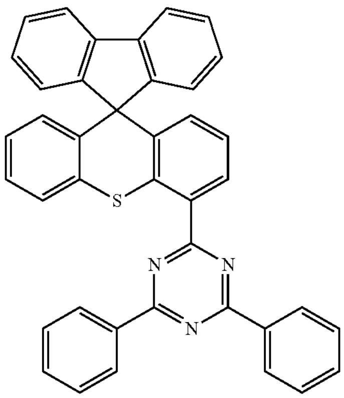
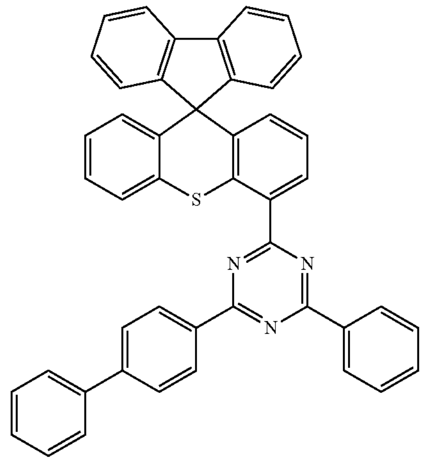
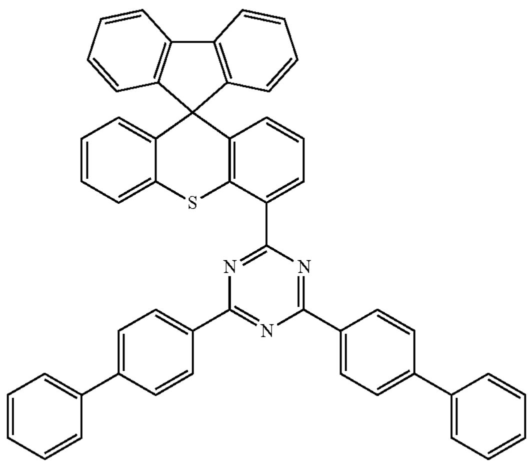
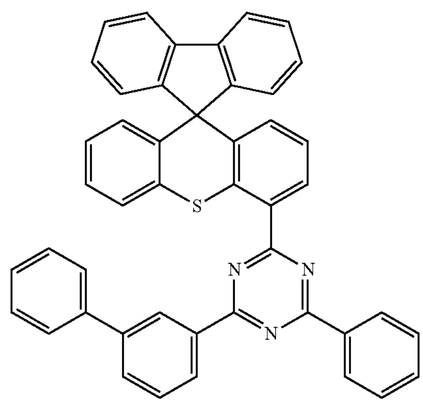
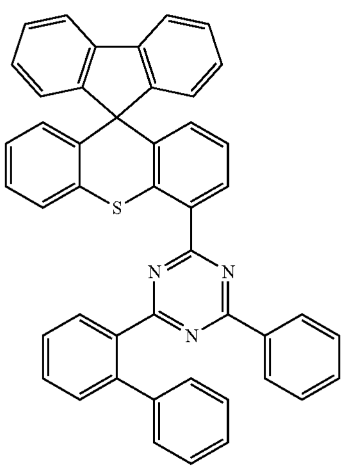
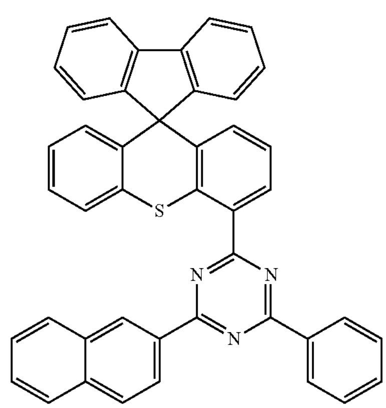

-continued
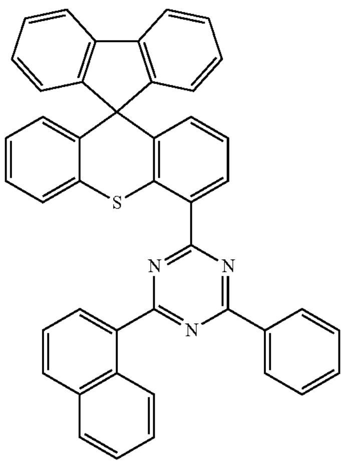
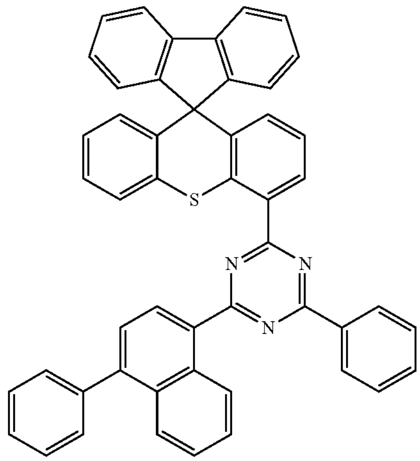
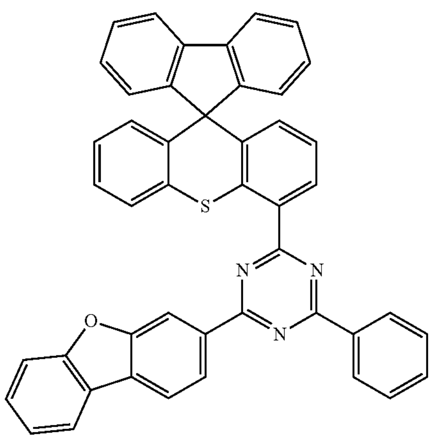
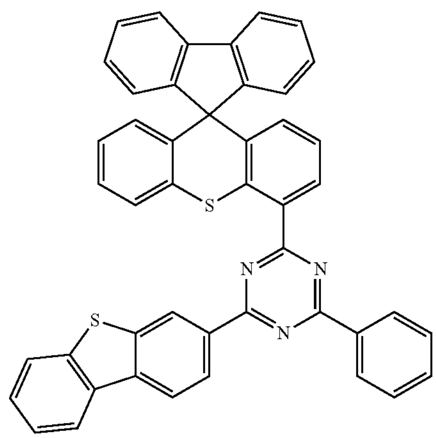
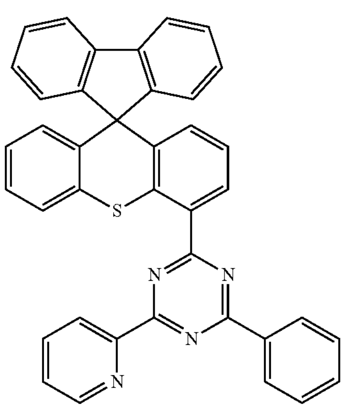
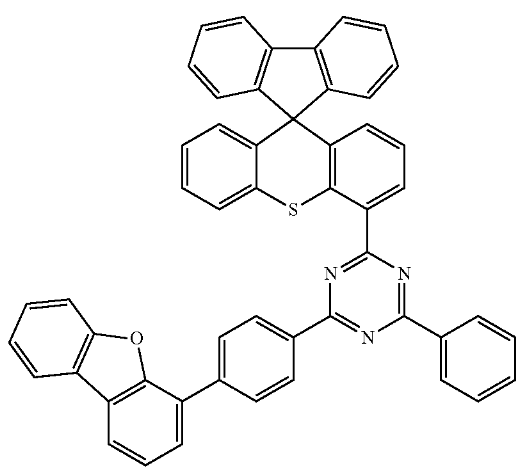

-continued
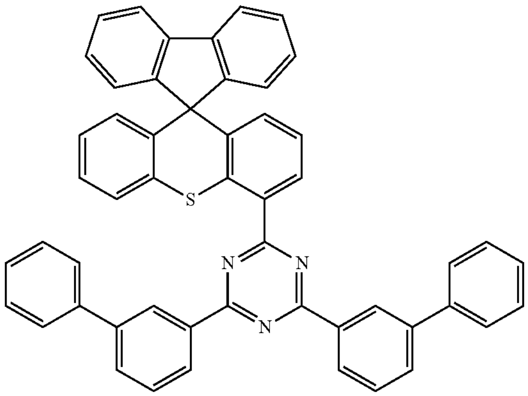
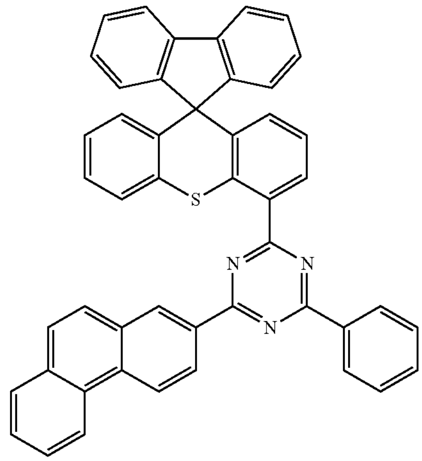
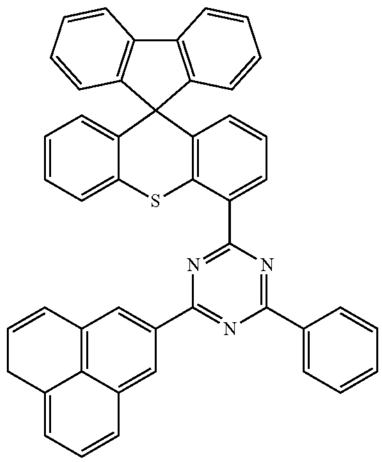
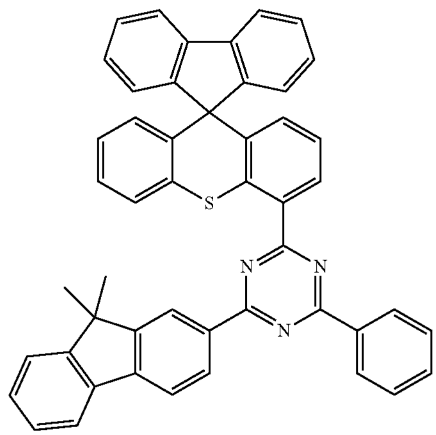
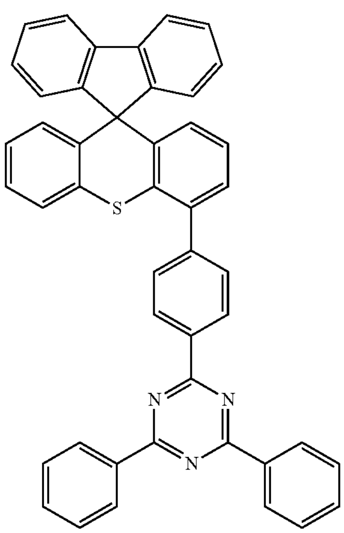
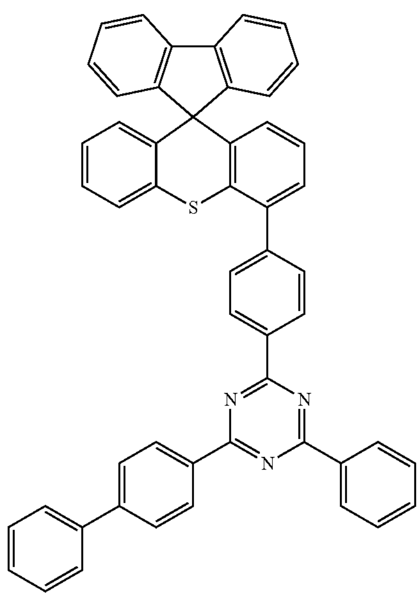

-continued
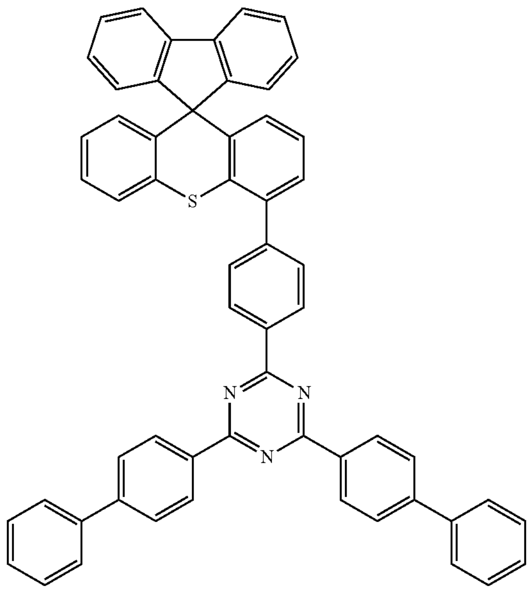
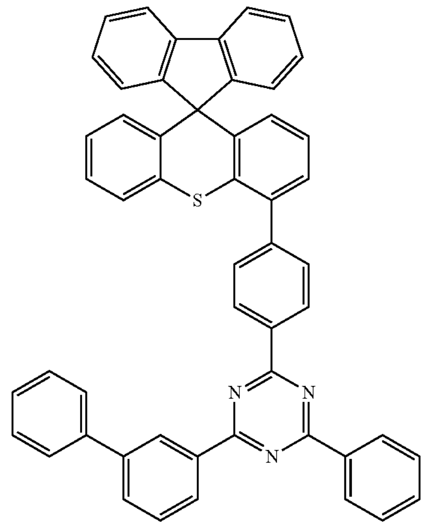
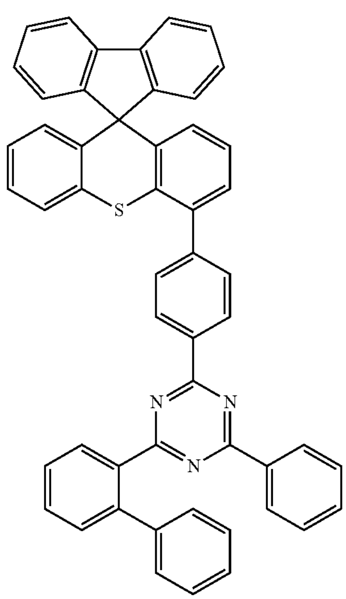
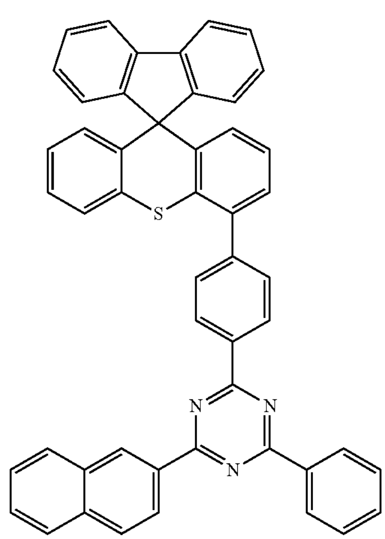

-continued
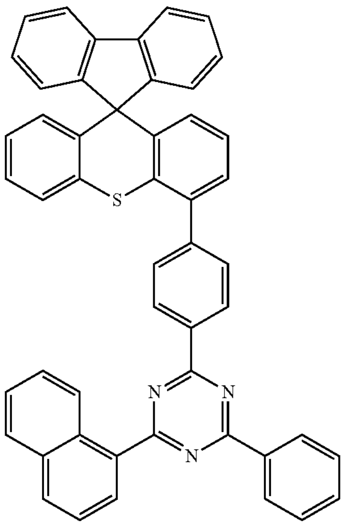
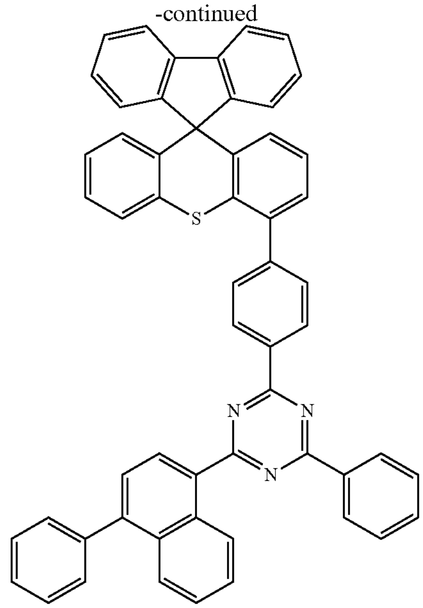
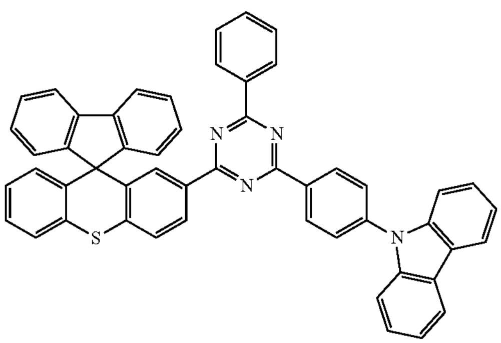
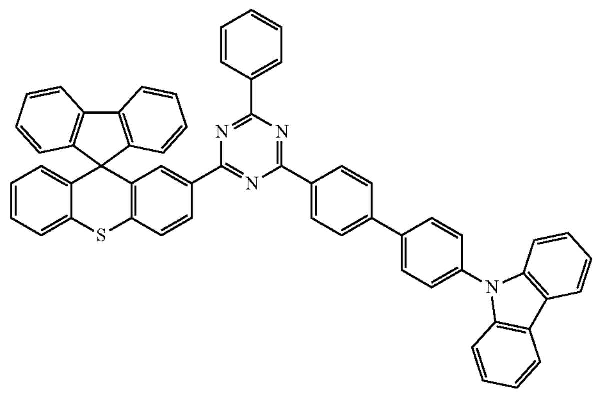
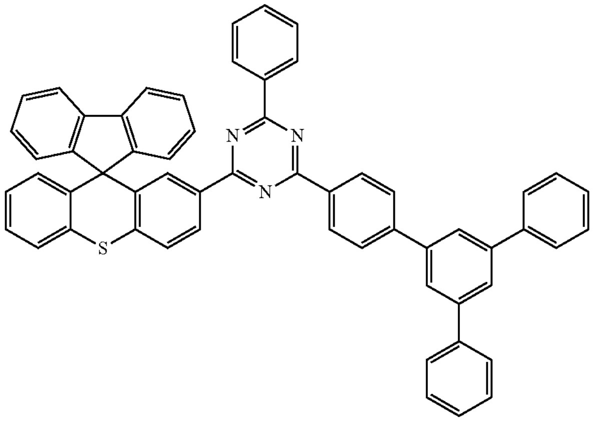
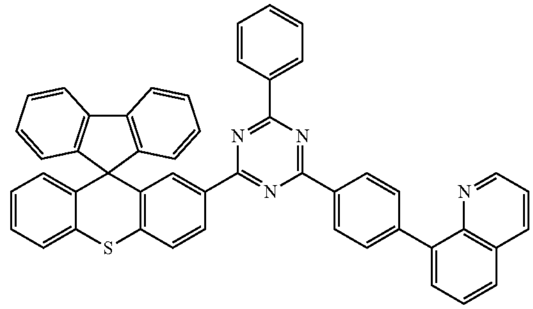

-continued
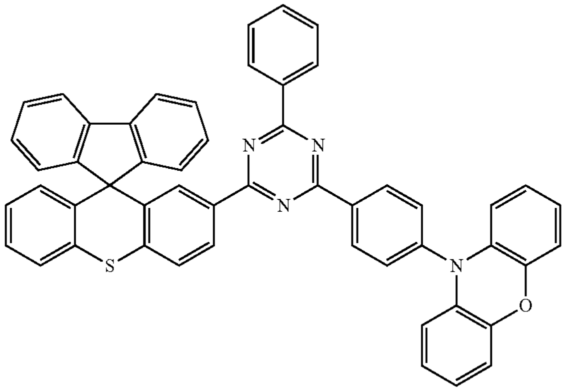
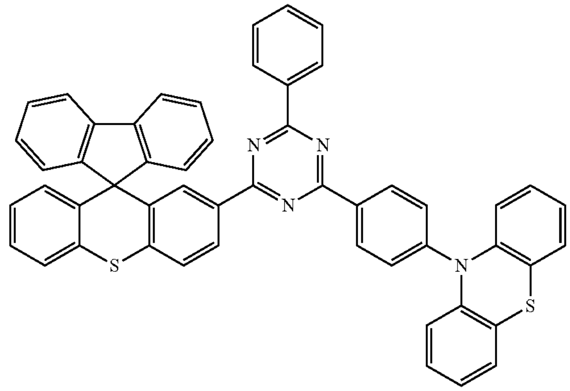
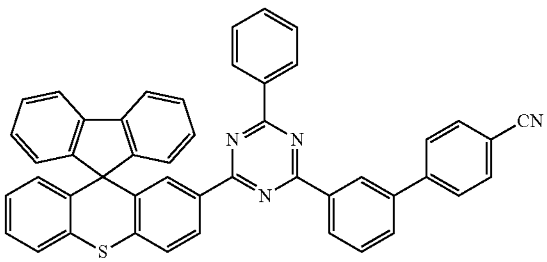
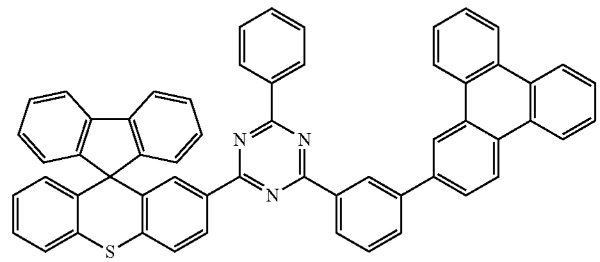
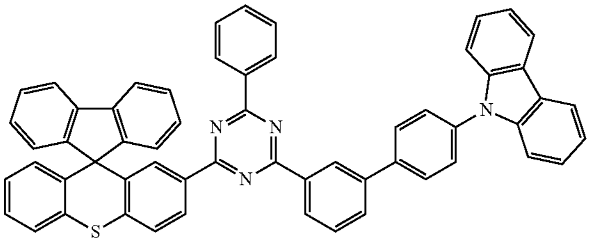
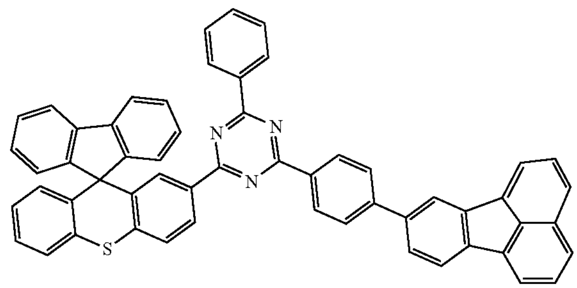
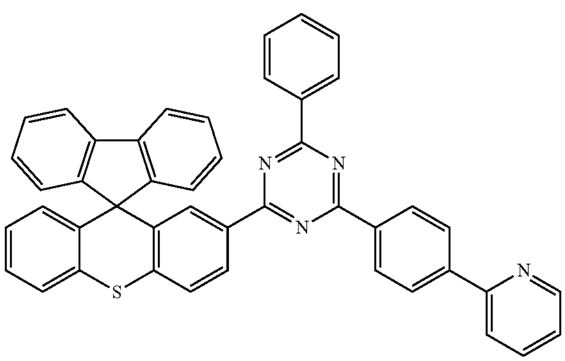
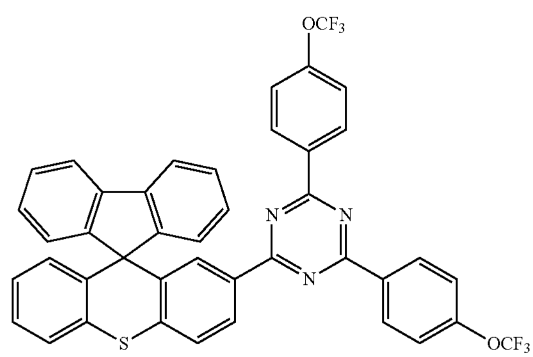
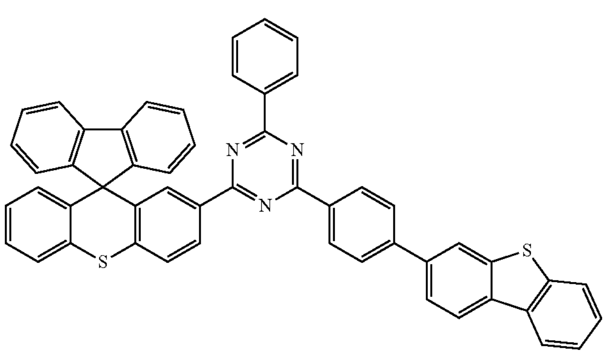
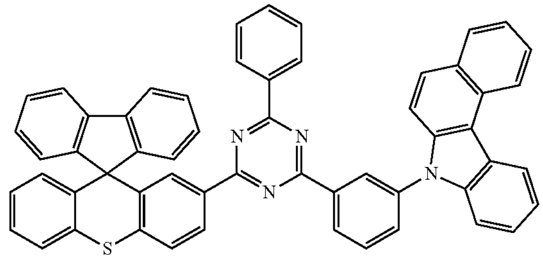

-continued
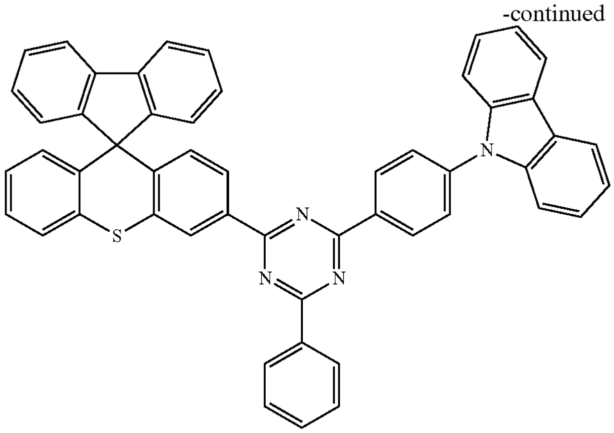
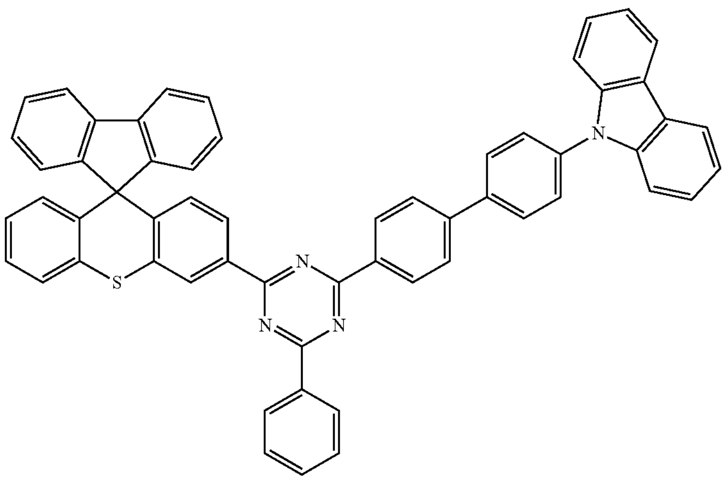
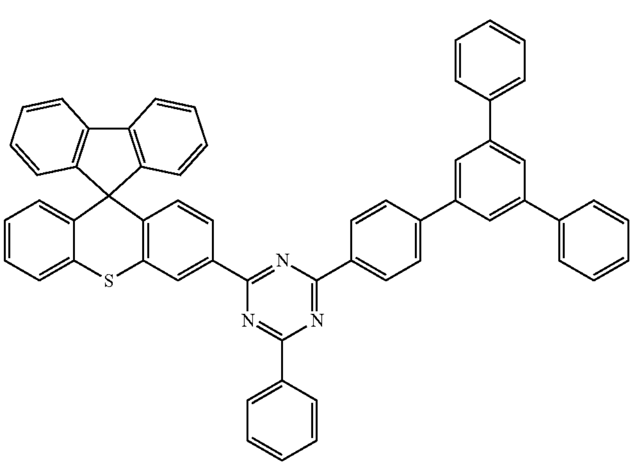
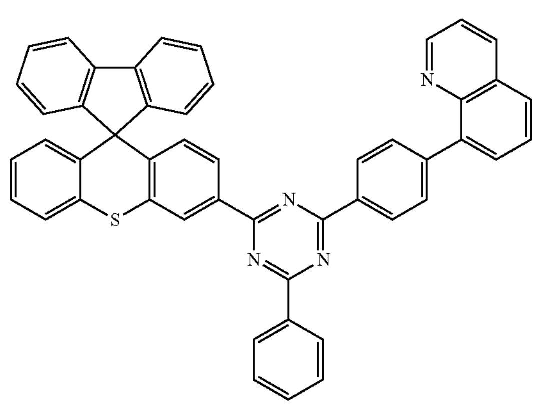

-continued
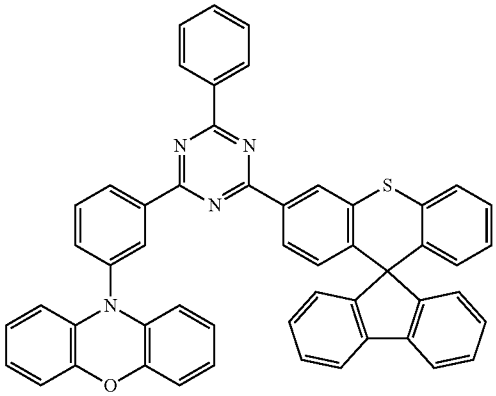
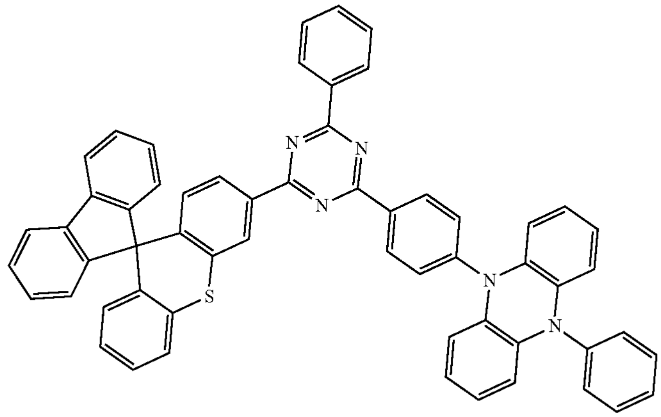
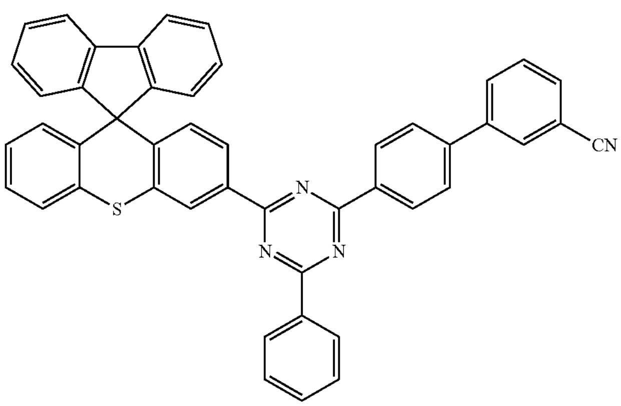
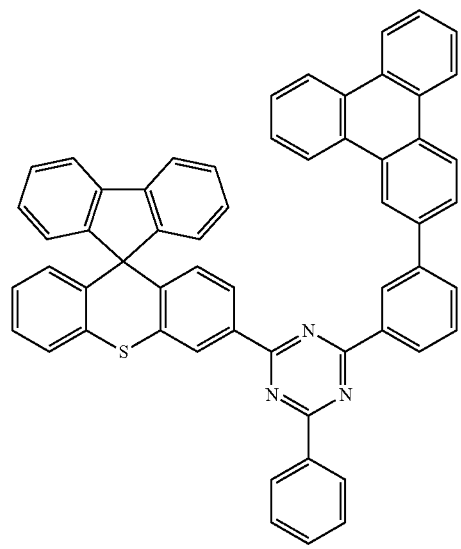
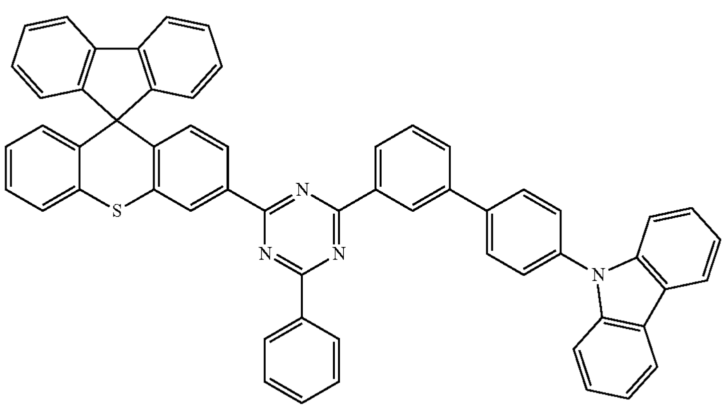
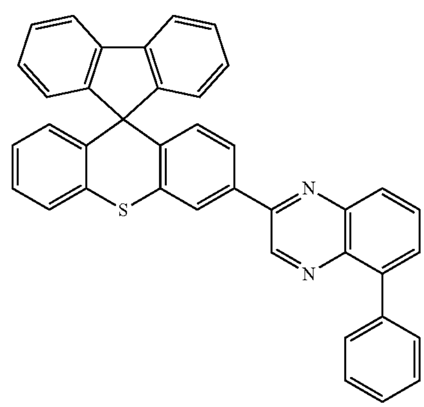

-continued
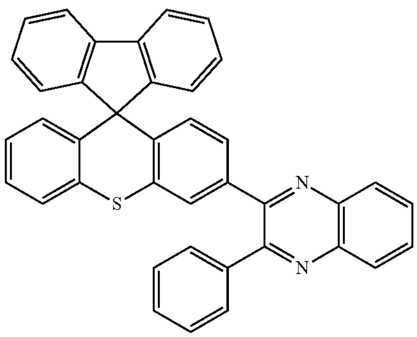
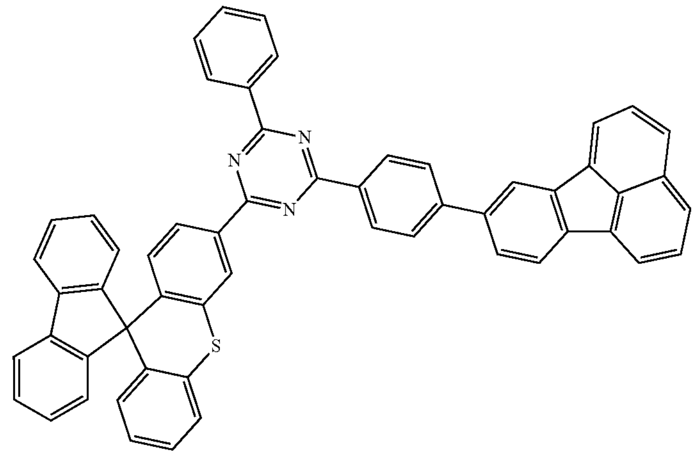
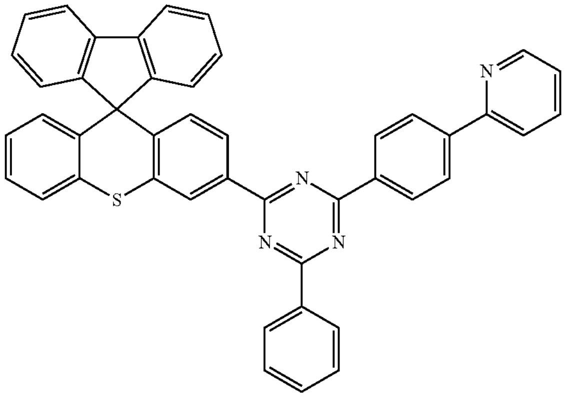
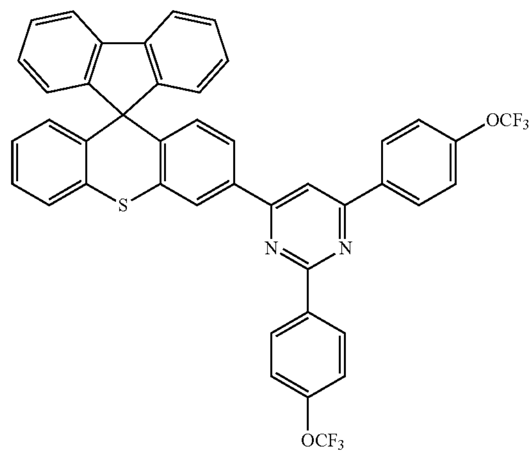
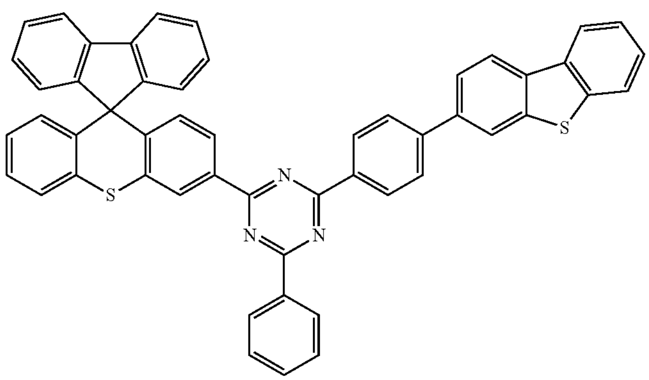
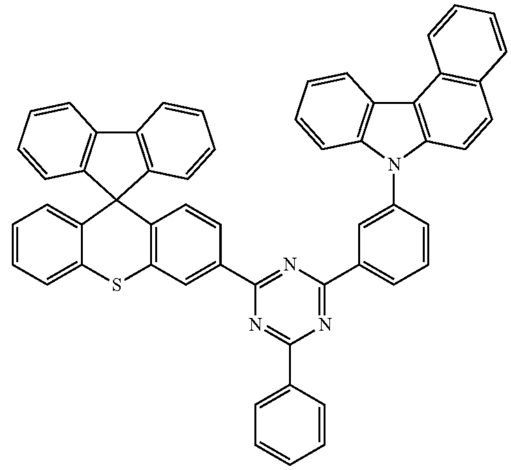

-continued
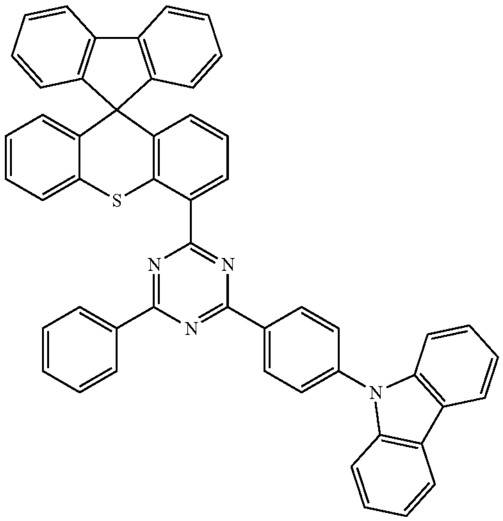
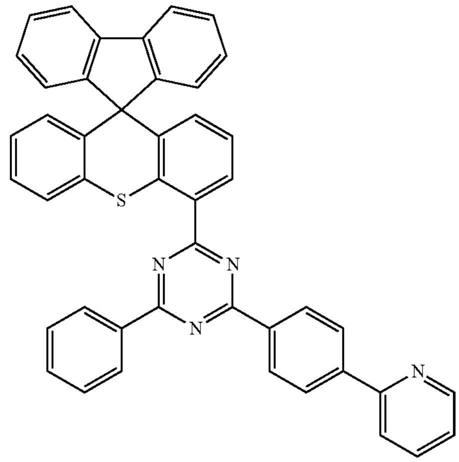
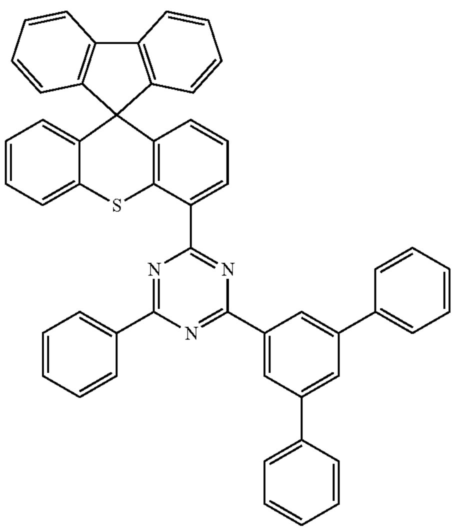
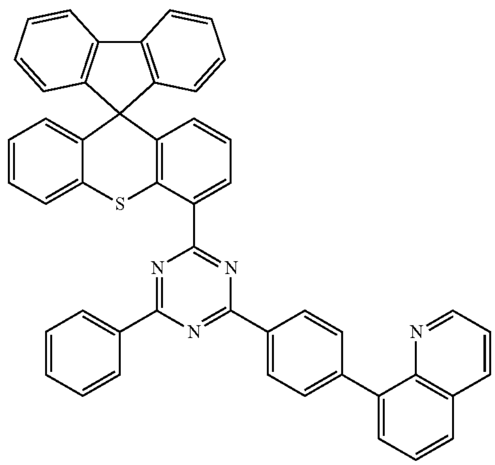
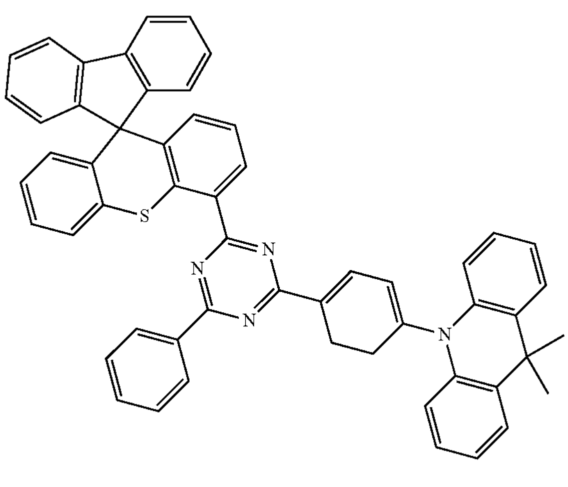
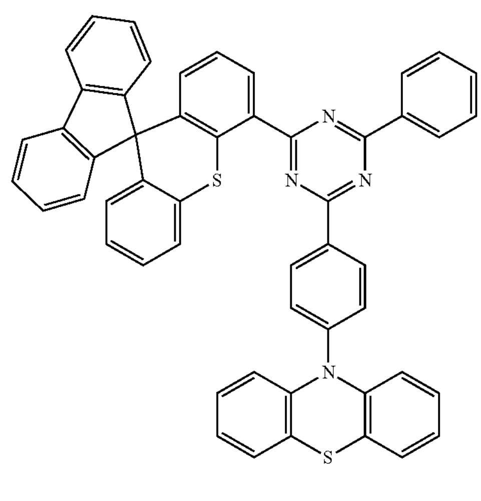

-continued
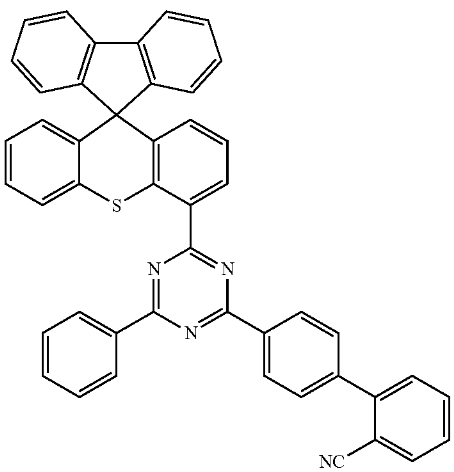
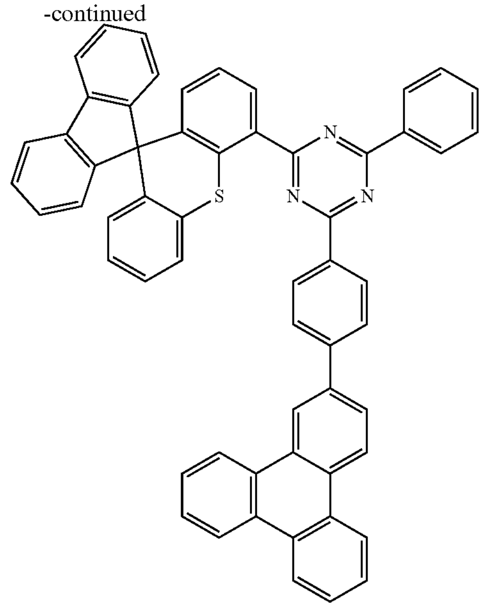
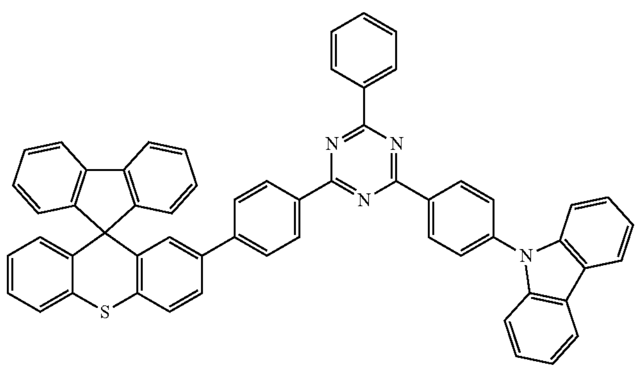
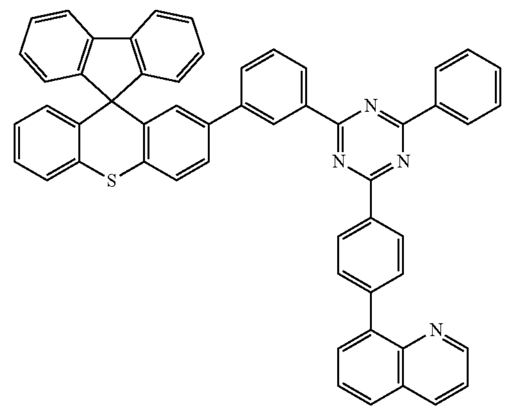
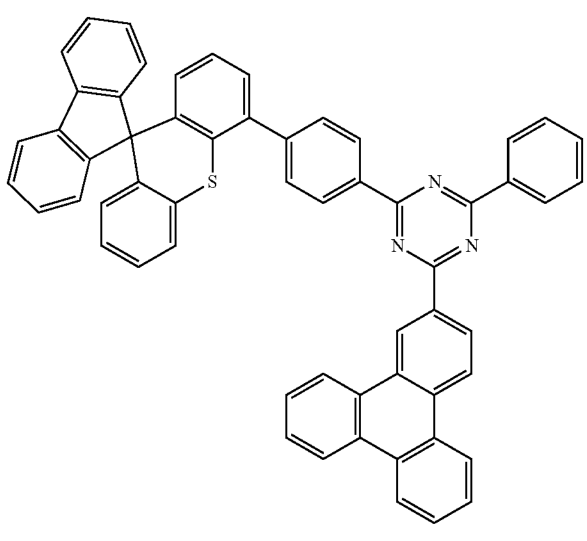
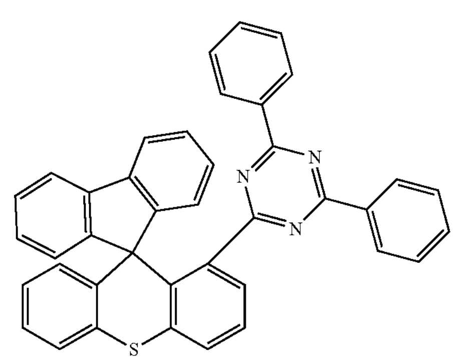

-continued
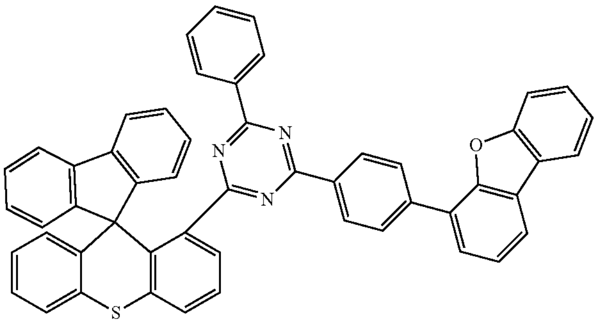
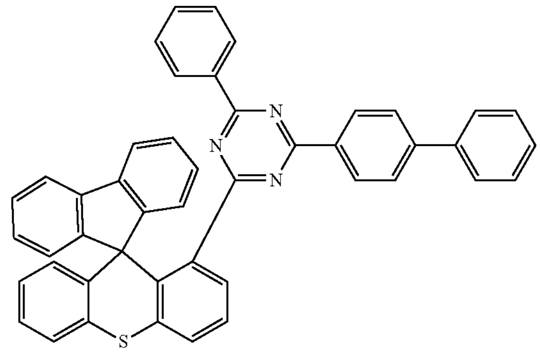
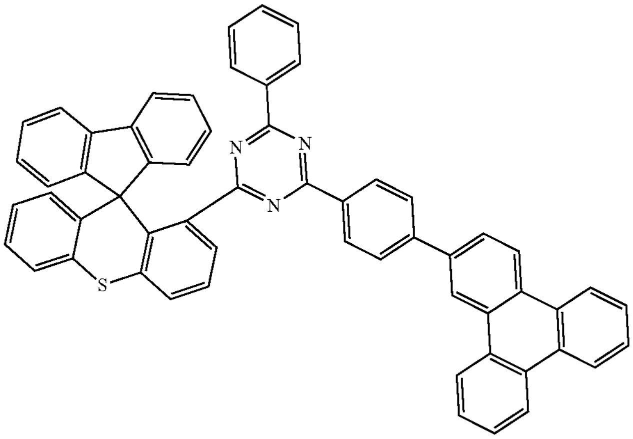
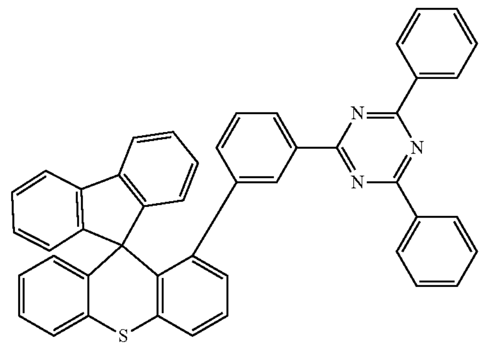
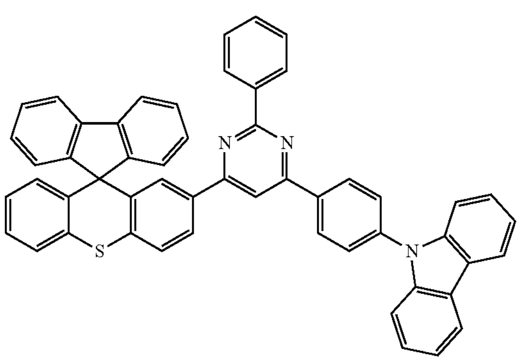
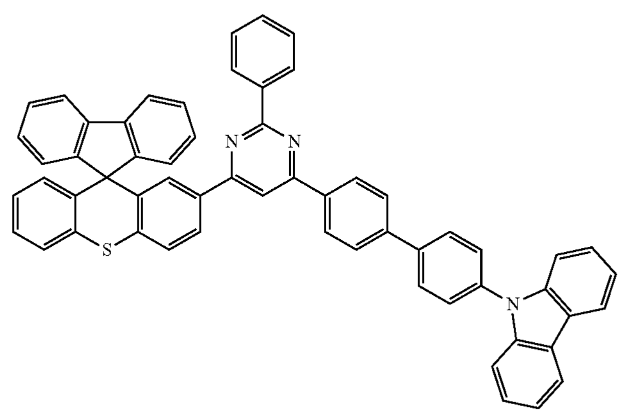
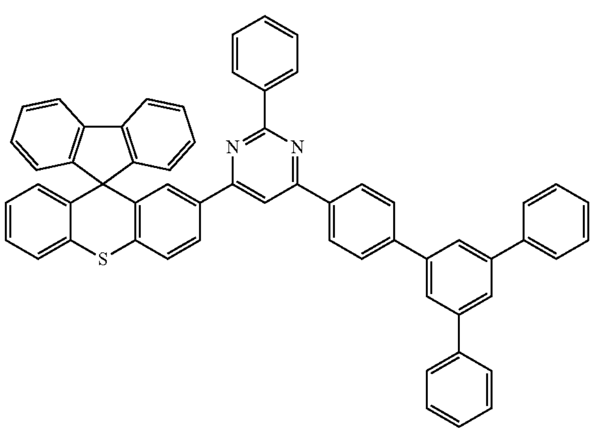
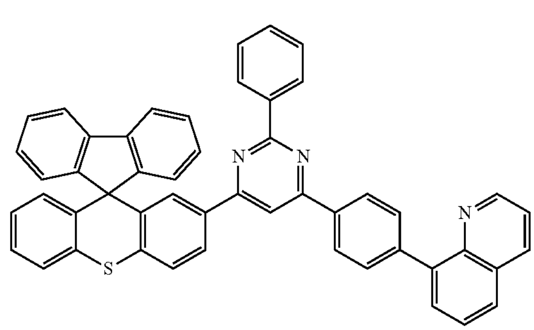

-continued
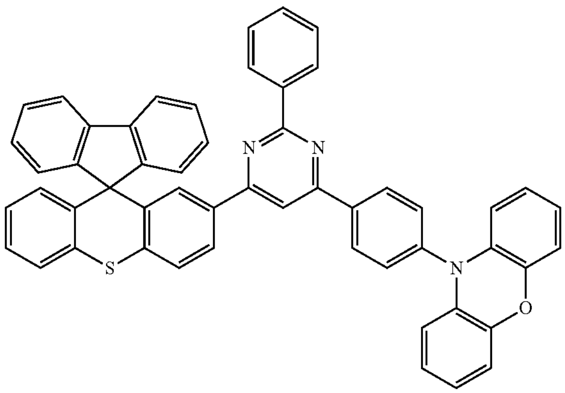
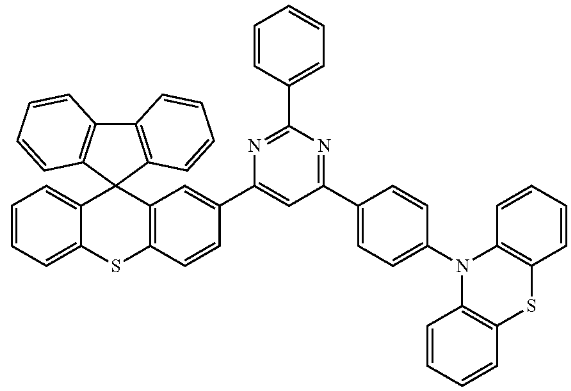
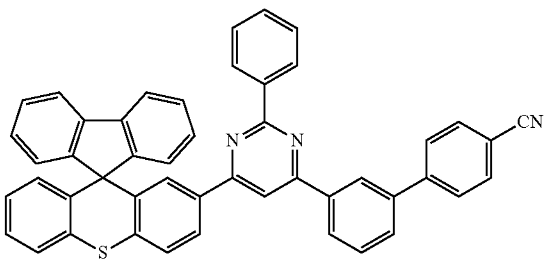
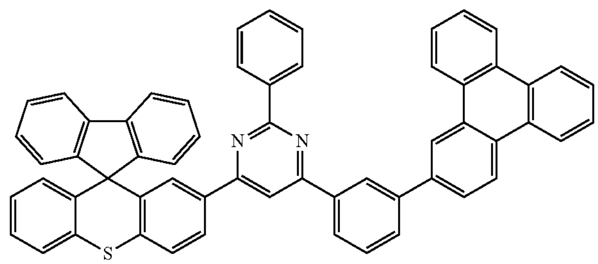
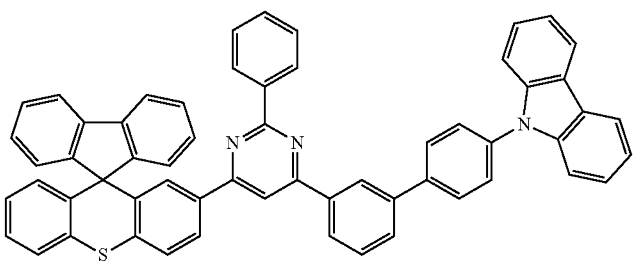
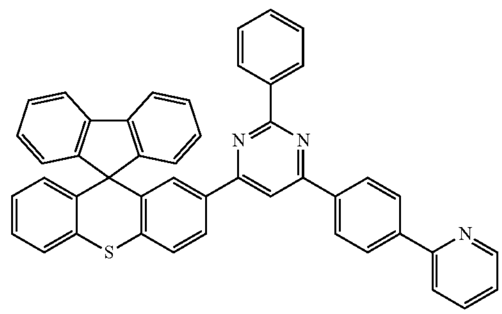
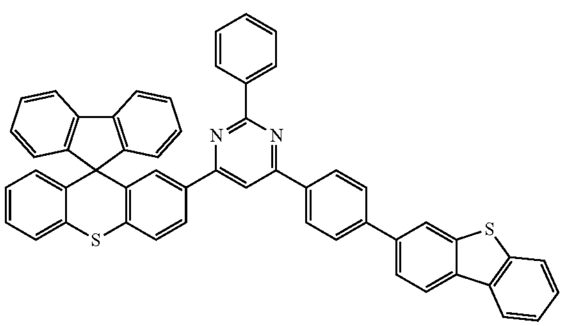
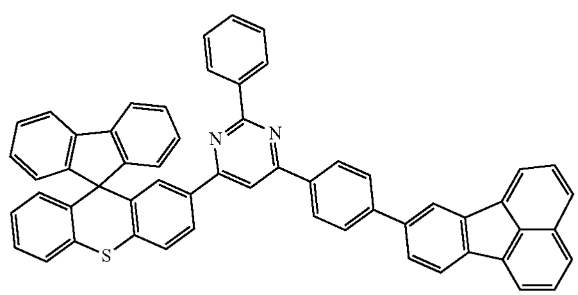
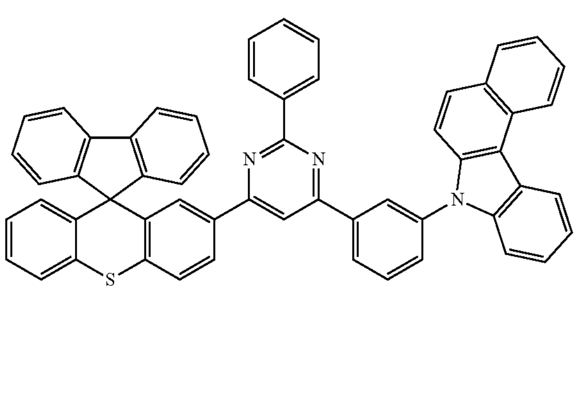
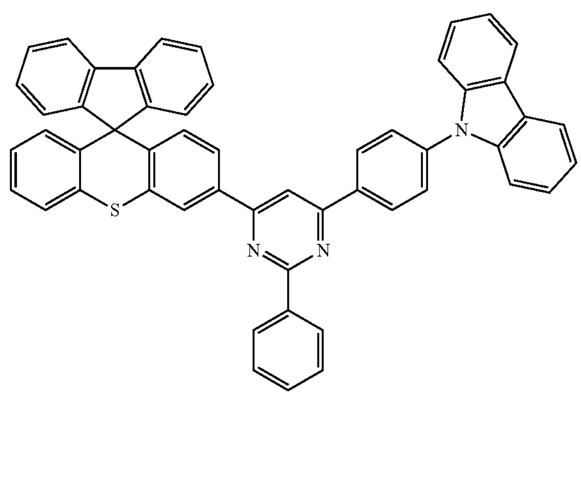

-continued
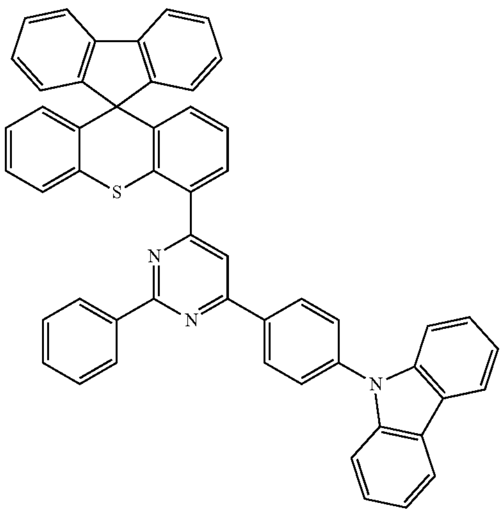
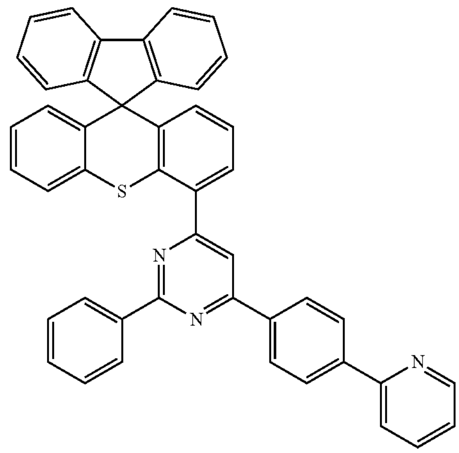
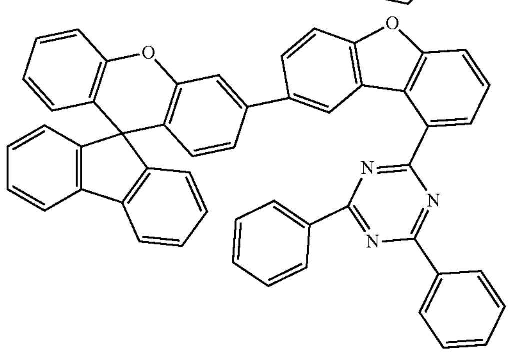
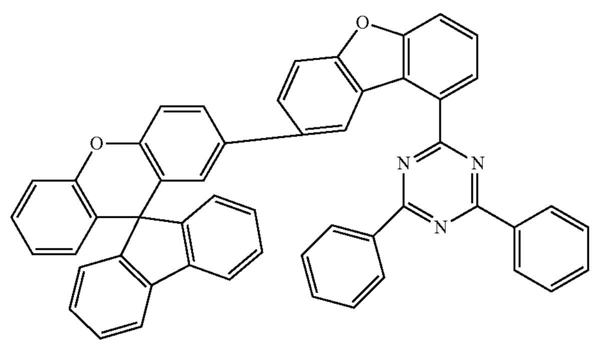
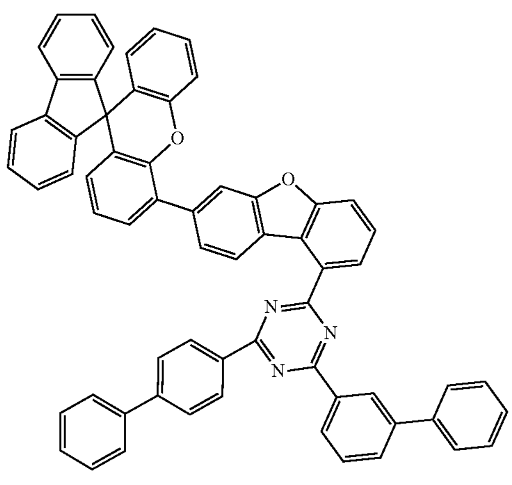
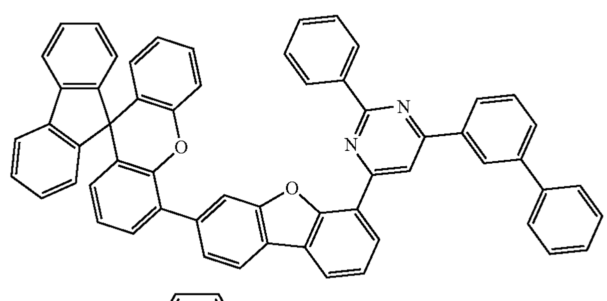
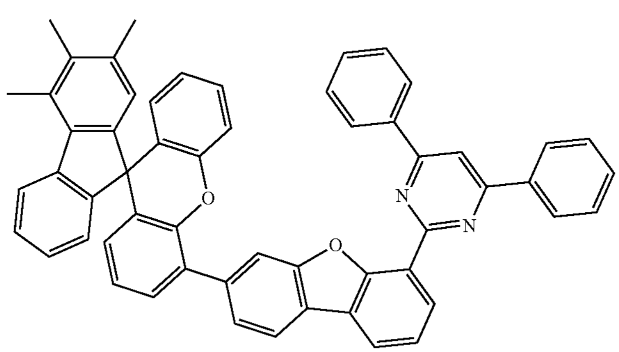
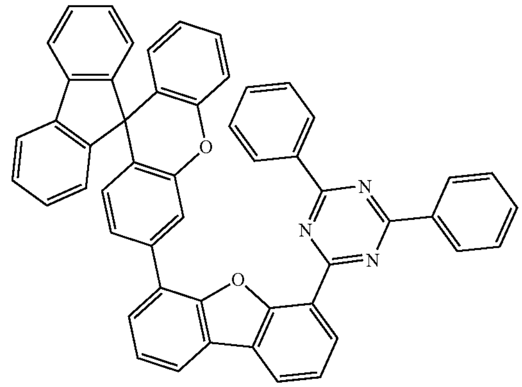

-continued
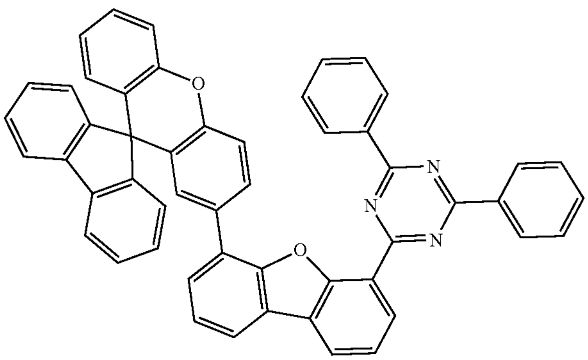
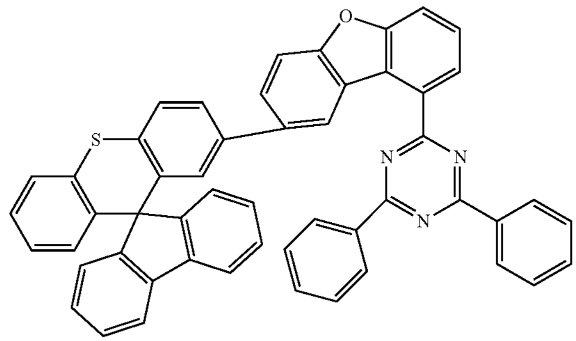
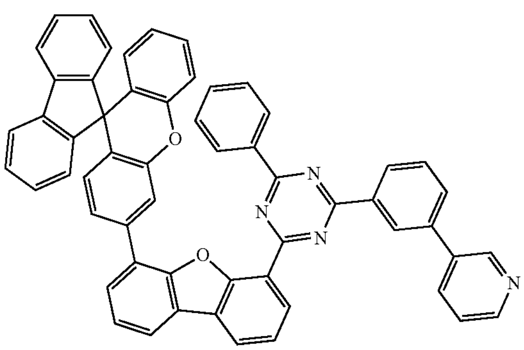
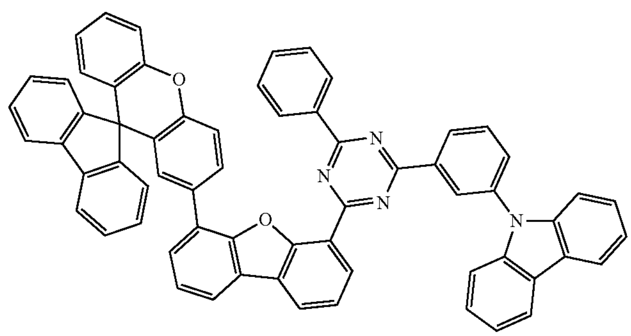
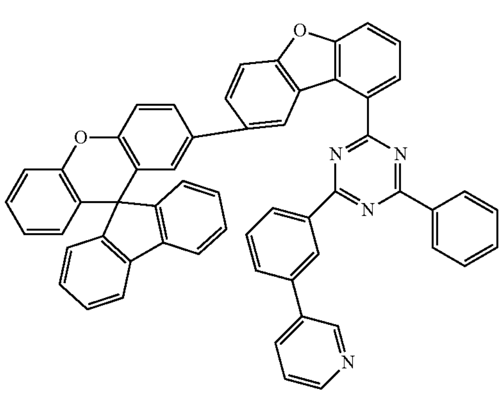
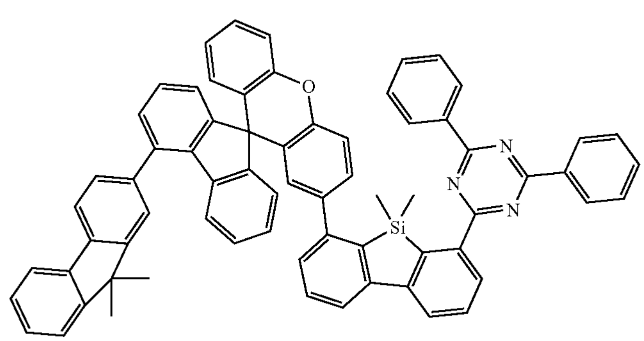

-continued
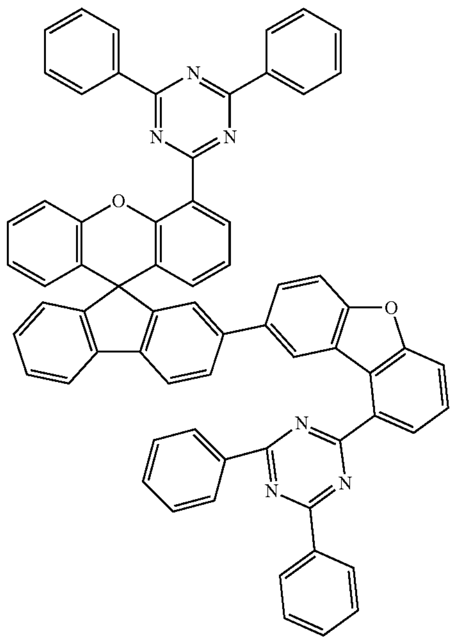
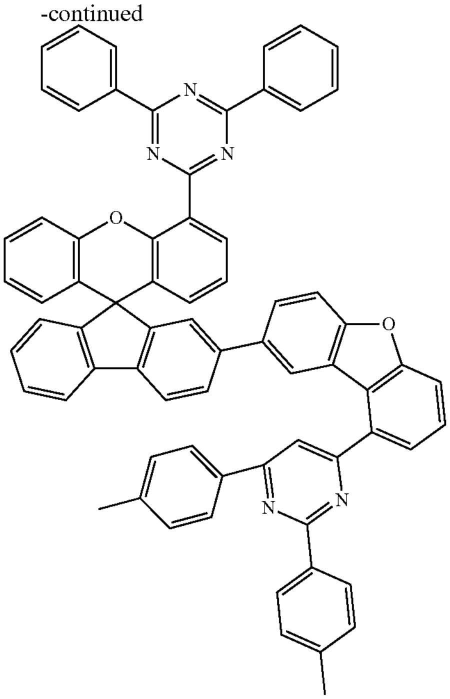
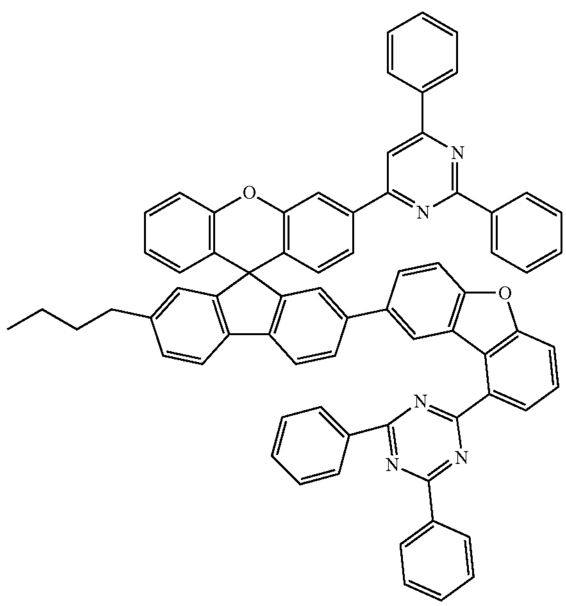
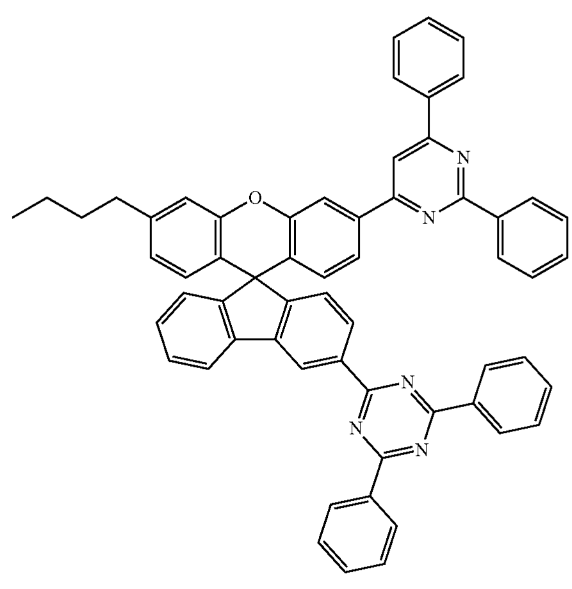

-continued
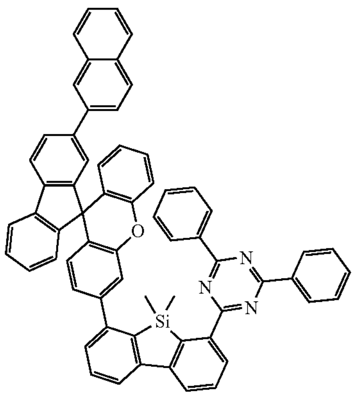
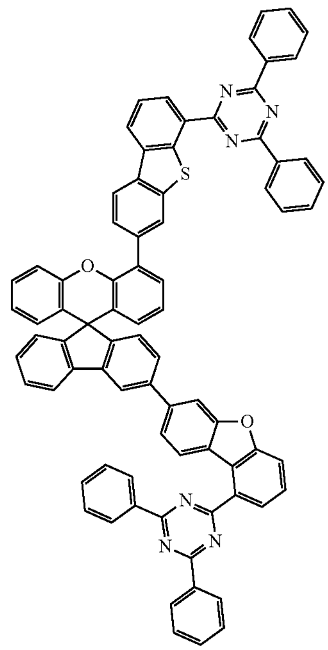
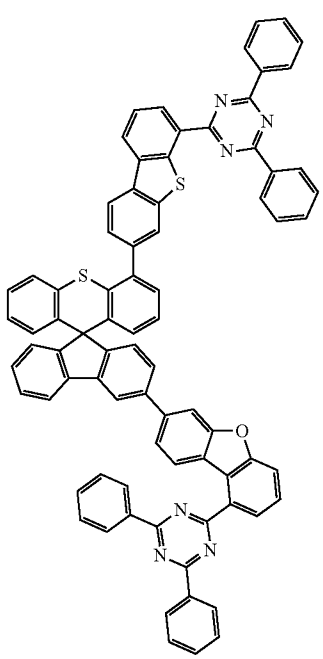
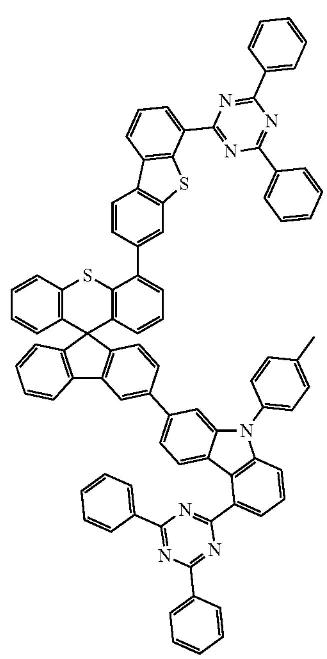

-continued
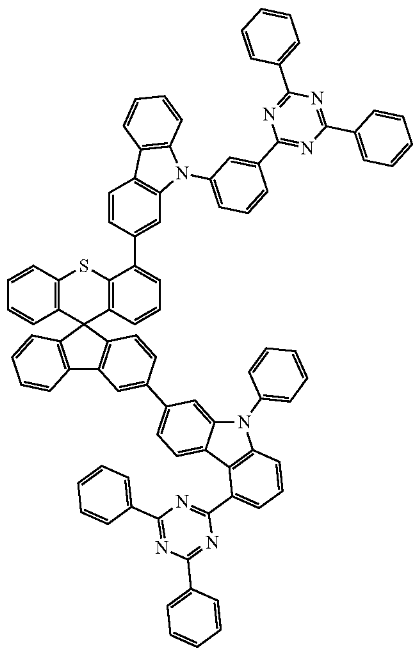
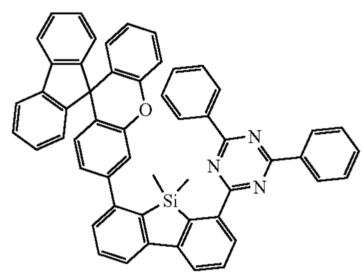
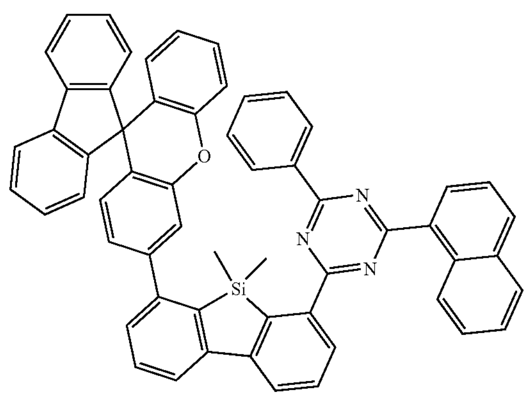
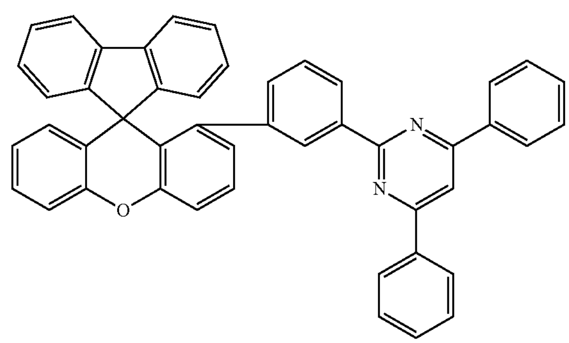
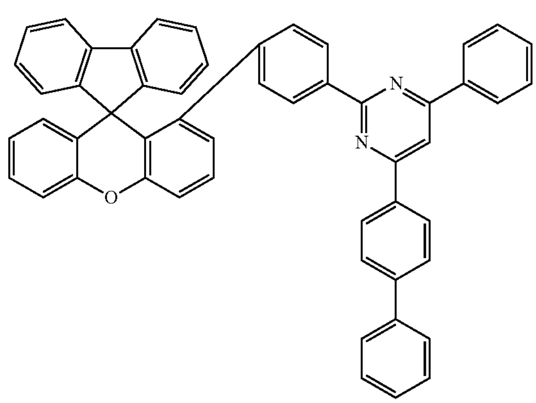
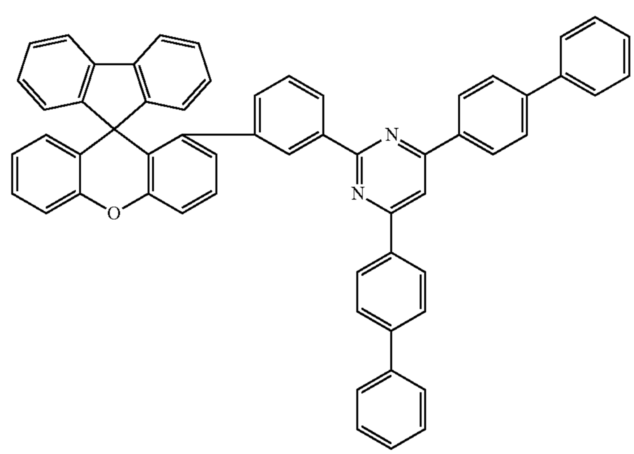

-continued
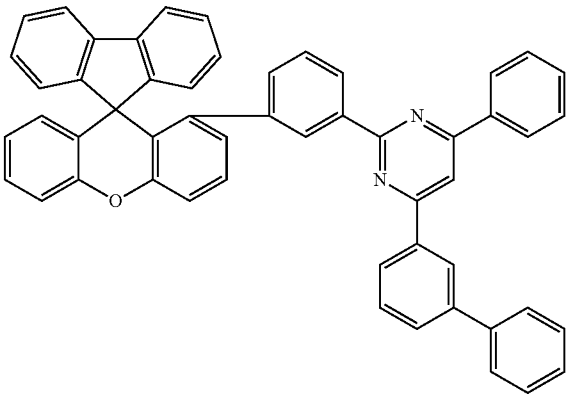
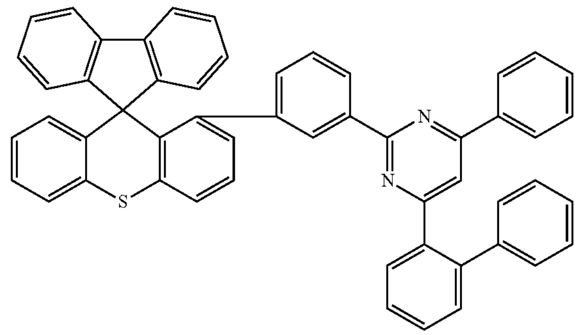
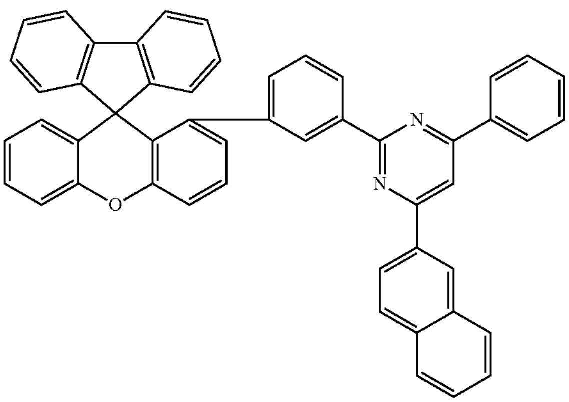
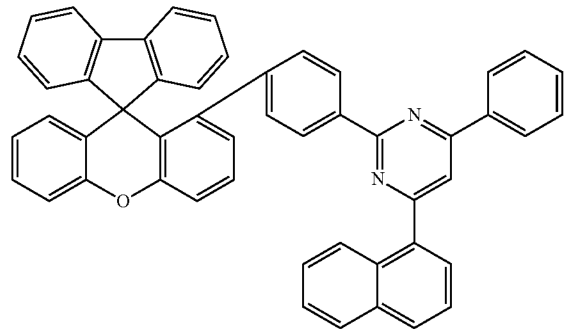
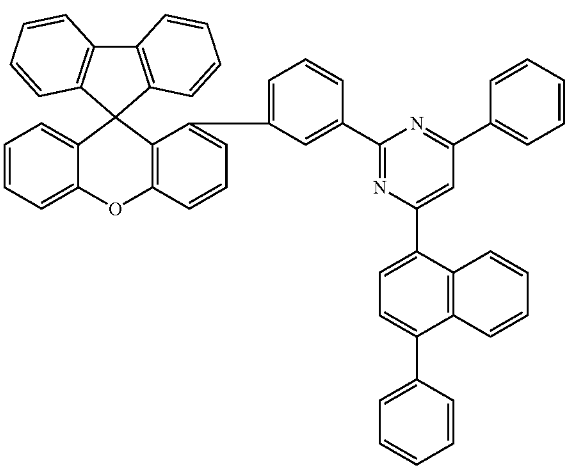
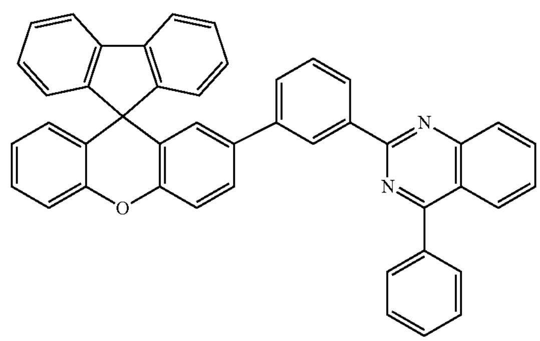
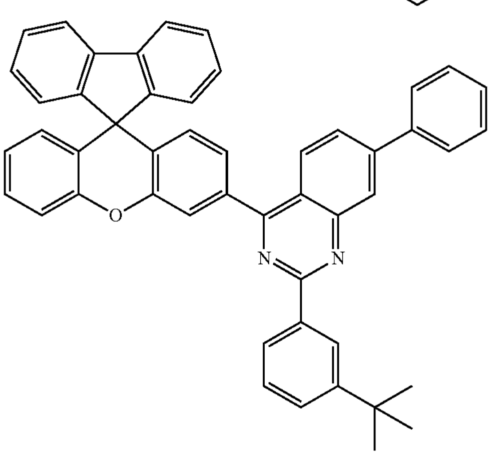
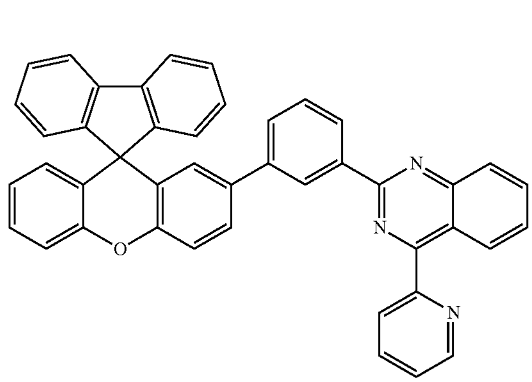

-continued
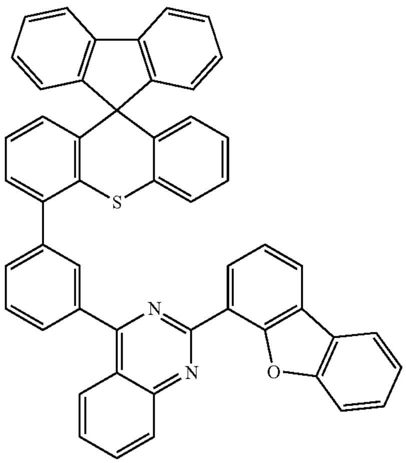
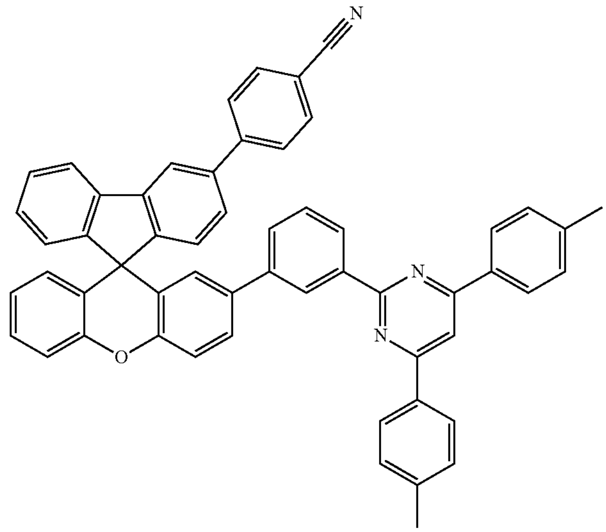
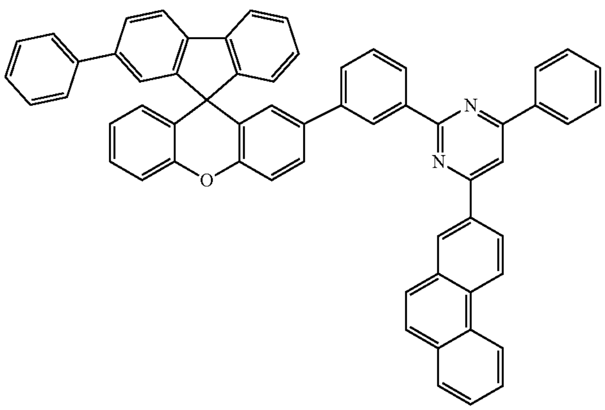
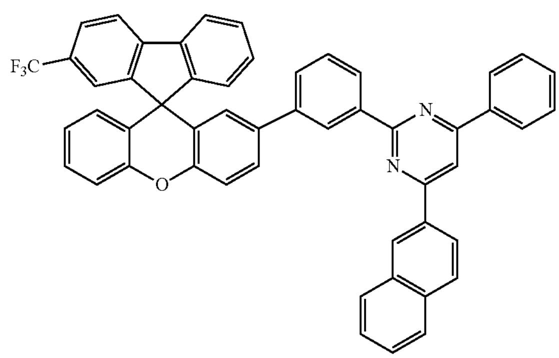
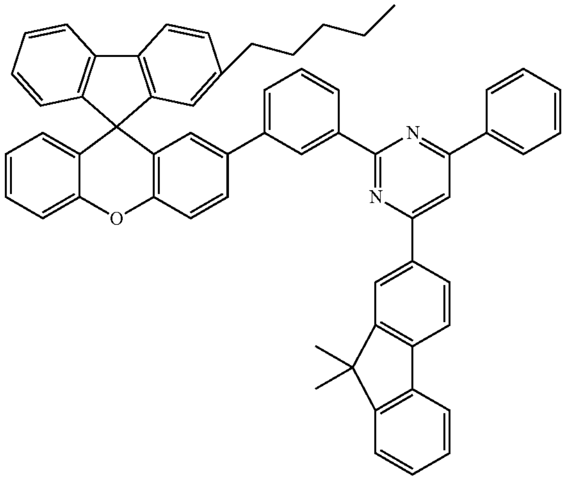
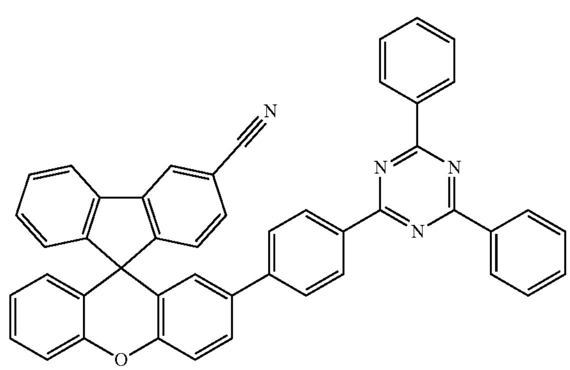

-continued
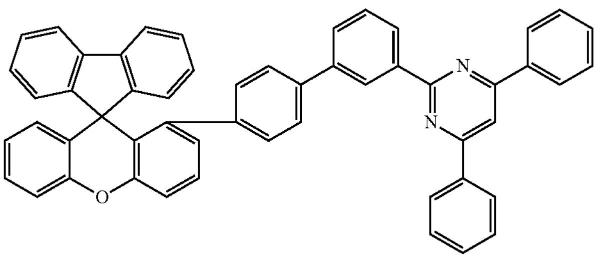
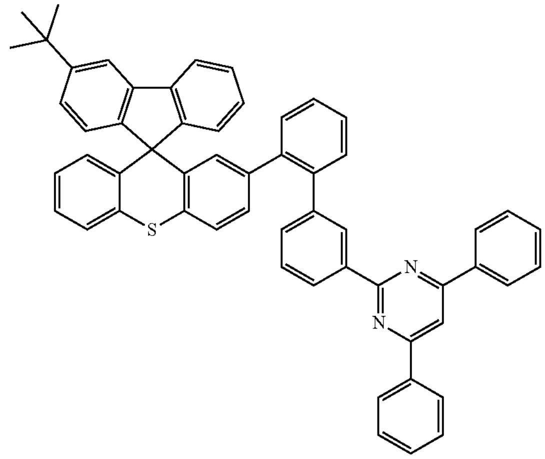
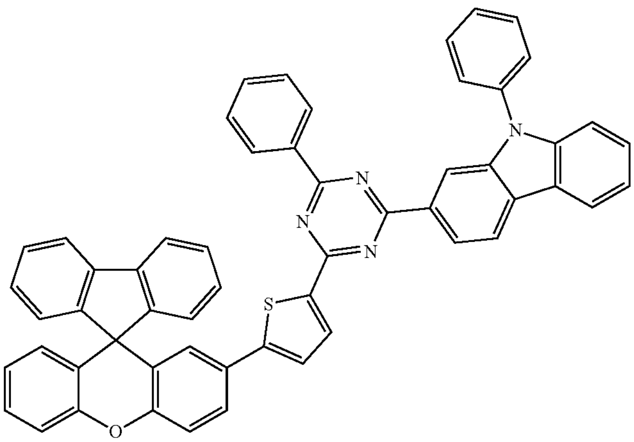
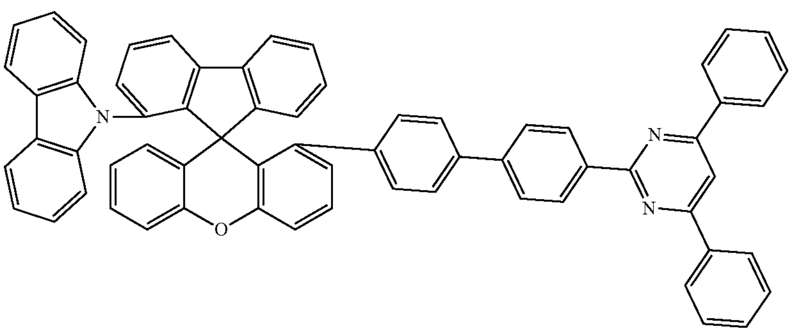
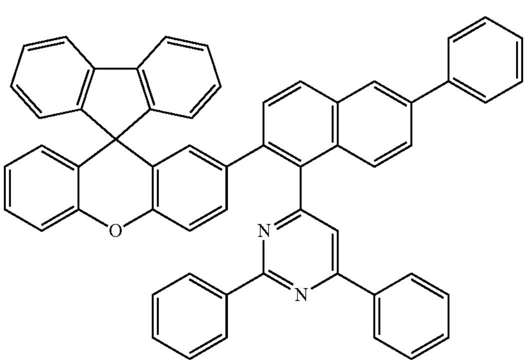
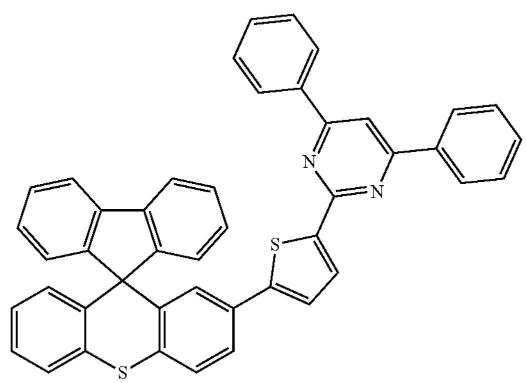

-continued
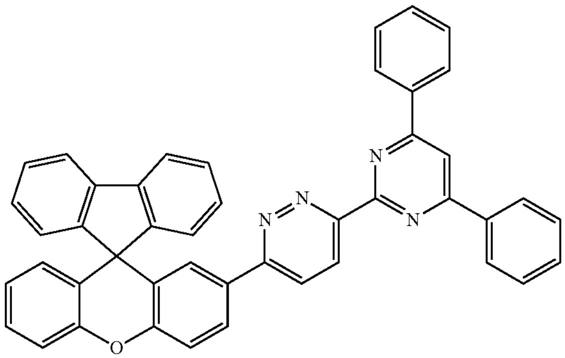
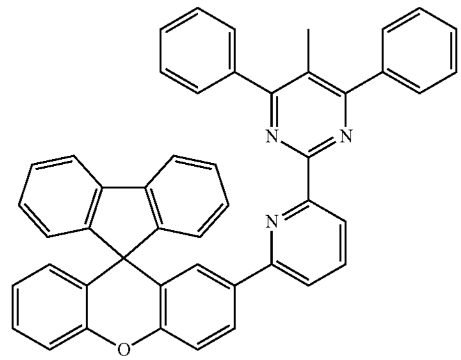
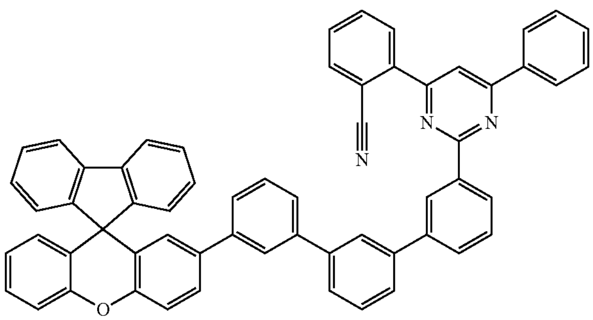
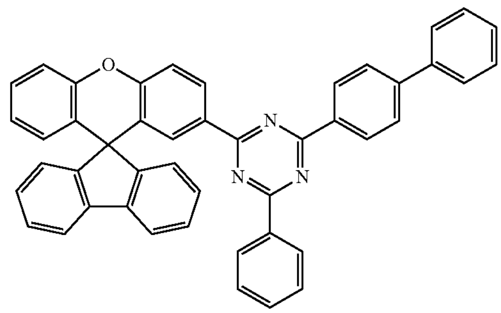
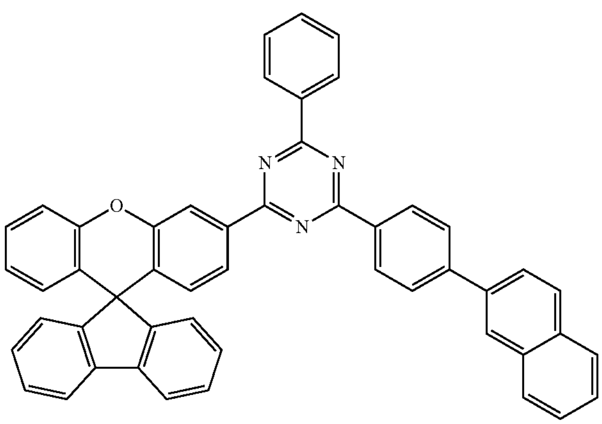
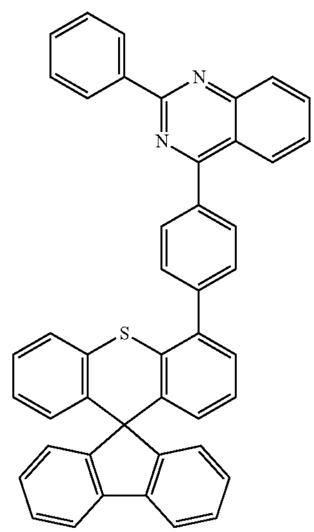
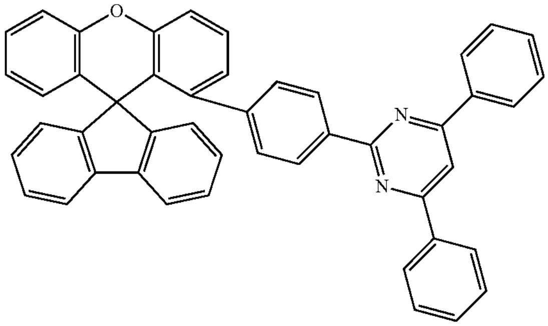
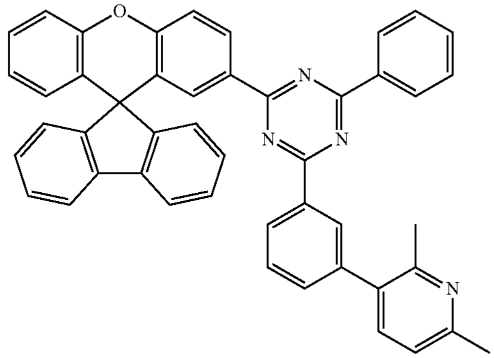

-continued
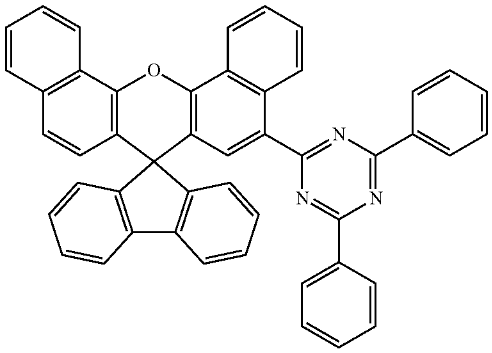
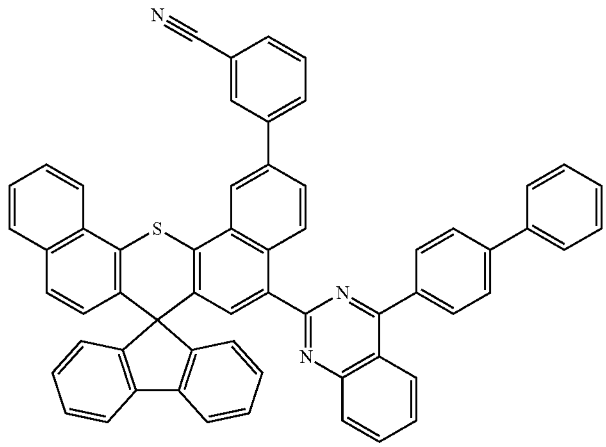
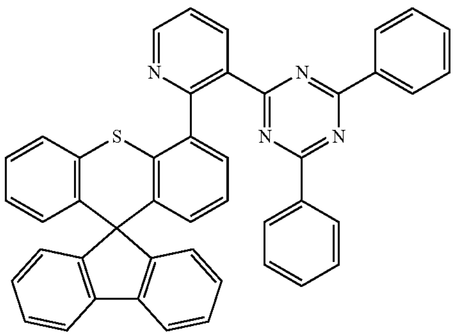
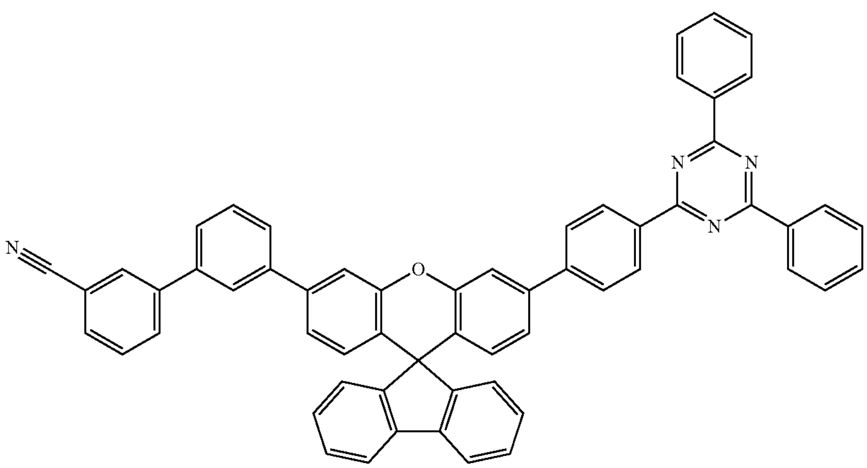
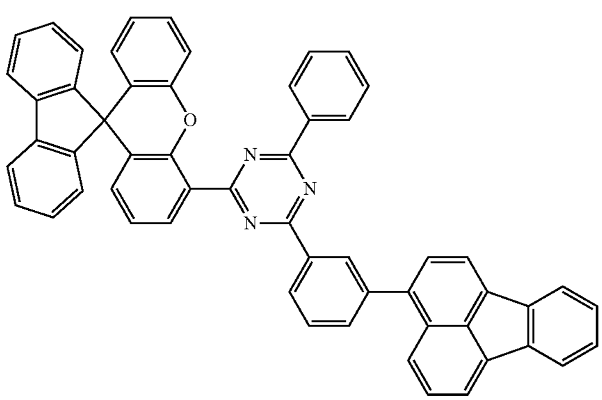
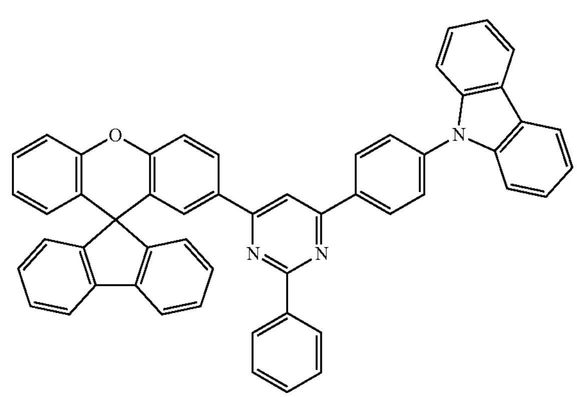

-continued
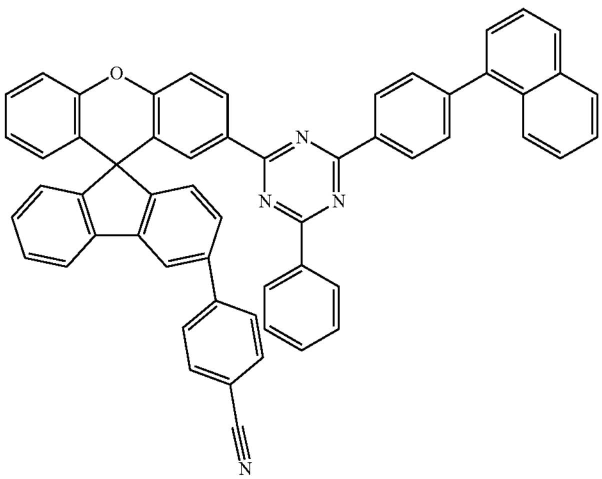
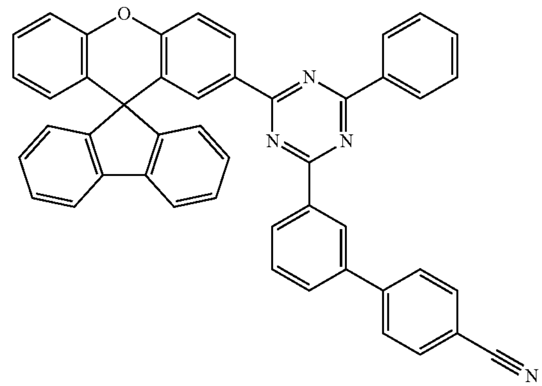
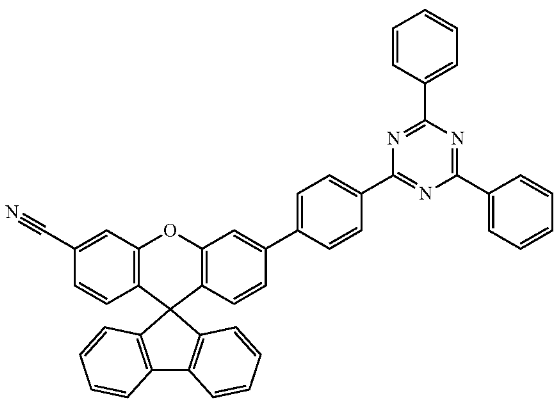
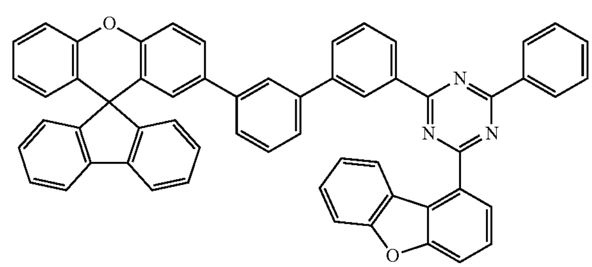
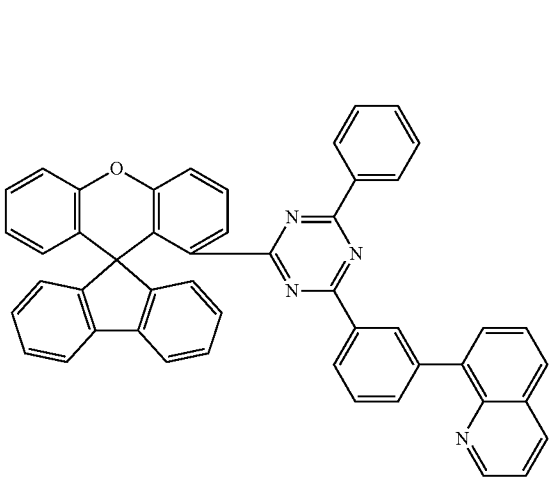
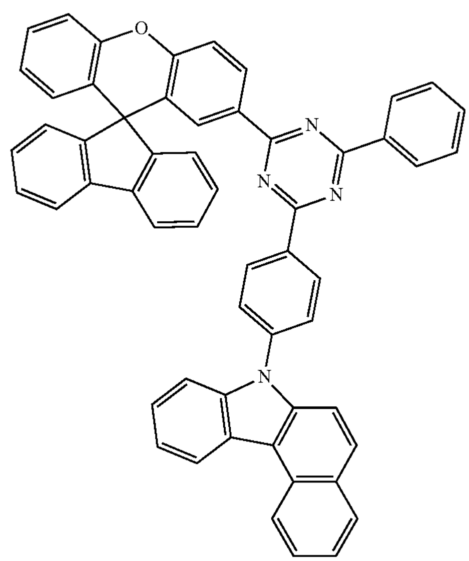

-continued
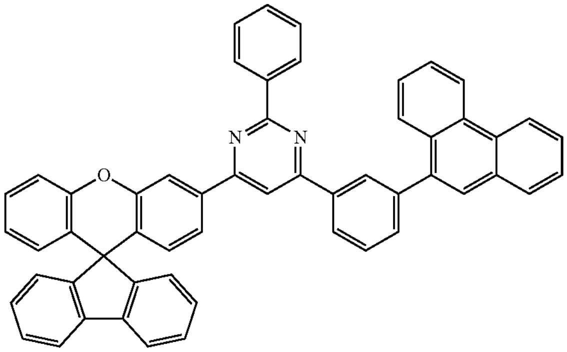
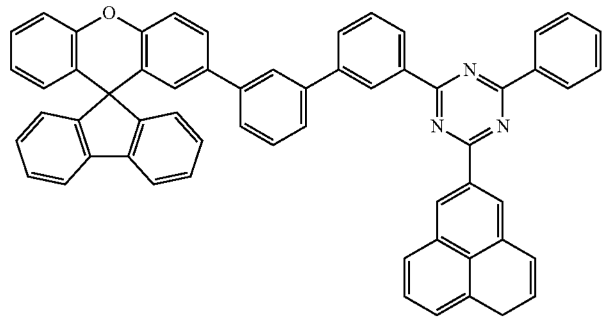
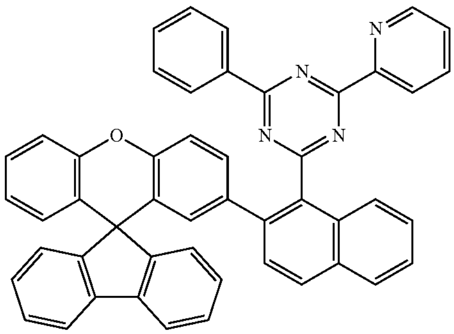
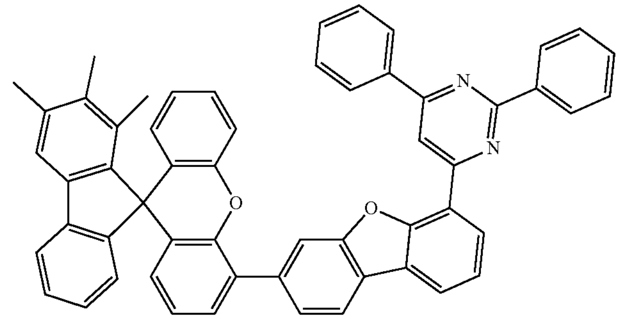
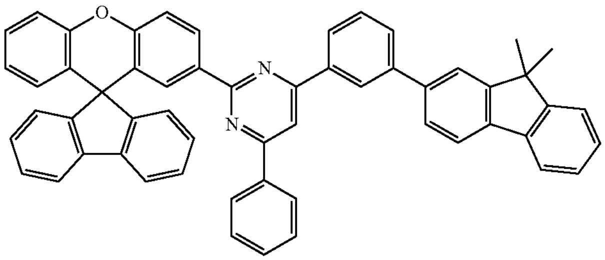
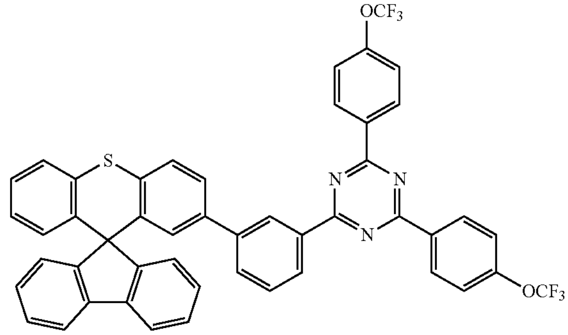
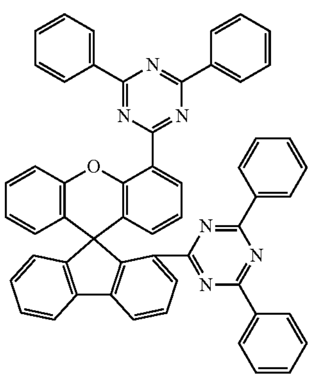
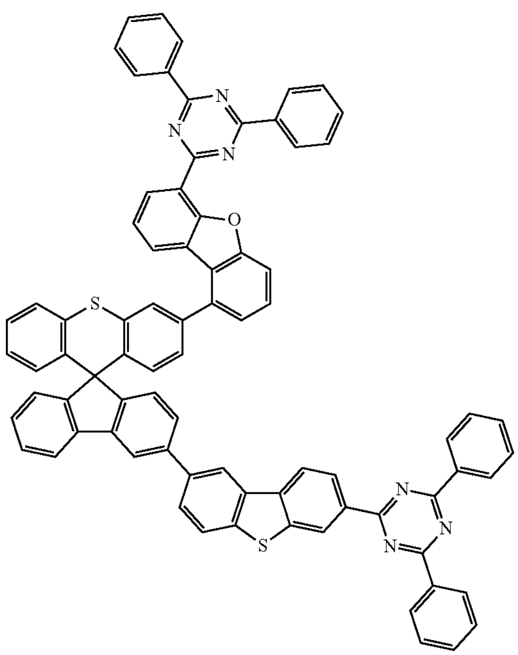

-continued

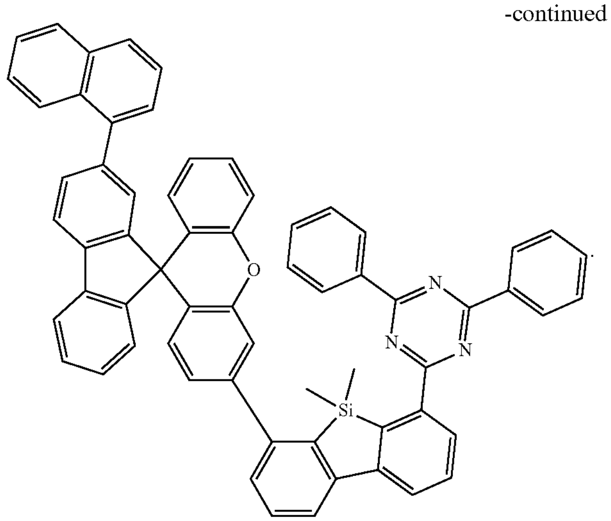

11. The organic light emitting device of claim 1, wherein the first organic material layer is a light emitting layer.

12. The organic light emitting device of claim 1, wherein the first organic material layer is a light emitting layer, the light emitting layer comprises a host material, and the host material comprises the compound of Formula 1.

13. The organic light emitting device of claim 11, wherein the organic light emitting device further comprises one or more additional light emitting layers.

14. The organic light emitting device of claim 11, wherein the organic light emitting device further comprises one or more additional light emitting layers in which the maximum light emission peak appears in a wavelength band different from a wavelength band in which the maximum light emission peak of the light emitting layer comprising one or more of the compound of Formula 1 appears.

15. The organic light emitting device of claim 11, wherein the light emitting layer comprising the compound of Formula 1 further comprises a fluorescent dopant.

16. The organic light emitting device of claim 14, wherein one or more light emitting layers in which the maximum light emission peak appears in a wavelength band different from a wavelength band in which the maximum light emission peak of the light emitting layer comprising one or more of the compound of Formula 1 appears comprise a phosphorescent dopant.

17. The organic light emitting device of claim 1, wherein Ar101 and Ar102 are the same as or different from each other, and are each independently a substituted or unsubstituted phenyl group, a substituted or unsubstituted biphenyl group, a substituted or unsubstituted terphenyl group, a substituted or unsubstituted naphthyl group, a substituted or unsubstituted fluorenyl group, a substituted or unsubstituted anthracenyl group, a substituted or unsubstituted phenanthrenyl group, a substituted or unsubstituted fluoranthenyl group, a substituted or unsubstituted carbazole group, a substituted or unsubstituted naphthobenzofuran group, a substituted or unsubstituted naphthobenzothiophene group, a substituted or unsubstituted benzocarbazole group, a substituted or unsubstituted indole group, a substituted or unsubstituted furan group, a substituted or unsubstituted thiophene group, a substituted or unsubstituted quinoline group, a substituted or unsubstituted pyridine group, a substituted or unsubstituted pyrimidine group, or a substituted or unsubstituted triazine group.

* * * * *